US012428436B2

(12) United States Patent
Hwang et al.

(10) Patent No.: US 12,428,436 B2
(45) **Date of Patent: *Sep. 30, 2025**

(54) ORGANOMETALLIC COMPOUND, ORGANIC LIGHT- EMITTING DEVICE INCLUDING THE SAME, AND ELECTRONIC APPARATUS INCLUDING THE ORGANIC LIGHT- EMITTING DEVICE

(71) Applicant: Samsung Electronics Co., Ltd., Suwon-si (KR)

(72) Inventors: Kyuyoung Hwang, Anyang-si (KR); Juhee Moon, Hwaseong-si (KR); Sukekazu Aratani, Hwaseong-si (KR); Kum Hee Lee, Suwon-si (KR); Banglin Lee, Suwon-si (KR); Jeoungin Yi, Seoul (KR); Byoungki Choi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 991 days.

This patent is subject to a terminal disclaimer.

(21) Appl. No.: 17/199,666

(22) Filed: Mar. 12, 2021

(65) Prior Publication Data

US 2022/0037599 A1 Feb. 3, 2022

(30) Foreign Application Priority Data

Jul. 20, 2020 (KR) ........................ 10-2020-0089868

(51) Int. Cl.

| | |
|---|---|
| ***C07F 15/00*** | (2006.01) |
| ***C09K 11/06*** | (2006.01) |
| ***H10K 50/11*** | (2023.01) |
| ***H10K 50/15*** | (2023.01) |
| ***H10K 50/16*** | (2023.01) |
| ***H10K 50/17*** | (2023.01) |
| ***H10K 50/18*** | (2023.01) |
| ***H10K 85/30*** | (2023.01) |
| ***H10K 85/40*** | (2023.01) |

(52) U.S. Cl.

CPC .......... *C07F 15/0033* (2013.01); *C09K 11/06* (2013.01); *H10K 85/342* (2023.02); *H10K 85/40* (2023.02); *C09K 2211/1029* (2013.01); *C09K 2211/1088* (2013.01); *C09K 2211/185* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02)

(58) Field of Classification Search

None

See application file for complete search history.

(56) References Cited

U.S. PATENT DOCUMENTS

| | | | | |
|---|---|---|---|---|
| 11,011,709 B2 | | 5/2021 | Tsai et al. | |
| 11,731,994 B2 | * | 8/2023 | Hwang ............... | C07F 15/0033 428/690 |
| 2009/0315454 A1 | | 12/2009 | Igarashi | |
| 2014/0008617 A1 | | 1/2014 | Beers et al. | |
| 2015/0243913 A1 | | 8/2015 | Takizawa et al. | |
| 2020/0066999 A1 | | 2/2020 | Beers et al. | |
| 2020/0181184 A1 | | 6/2020 | Hwang et al. | |
| 2021/0057666 A1 | | 2/2021 | Watanabe et al. | |
| 2021/0193940 A1 | | 6/2021 | Hwang et al. | |
| 2021/0403496 A1 | * | 12/2021 | Cai .................... | C07F 15/0033 |

FOREIGN PATENT DOCUMENTS

| | | | | | |
|---|---|---|---|---|---|
| CN | 110330531 A | * | 10/2019 | .......... | C07F 15/0033 |
| EP | 2084171 B1 | | 4/2013 | | |
| EP | 2730583 A1 | | 5/2014 | | |
| EP | 3010067 A1 | | 4/2016 | | |
| EP | 3026056 A1 | | 6/2016 | | |
| EP | 3305796 A1 | | 4/2018 | | |
| EP | 3912983 A1 | | 11/2021 | | |
| KR | 1020100116411 A | | 11/2010 | | |
| KR | 1020180020878 A | | 2/2018 | | |
| WO | 2008056799 A1 | | 5/2008 | | |
| WO | 2013047517 A1 | | 4/2013 | | |

OTHER PUBLICATIONS

Machine translation of CN 110330531 A (publication date: Oct. 15, 2019). (Year: 2019).*

Li, J., Zhang, Q., He, H., Wang, L., & Zhang, J. (2015). Tuning the electronic and phosphorescence properties of blue-emitting iridium (III) complexes through different cyclometalated ligand substituents: a theoretical investigation. Dalton Transactions, 44(18), 8577-8589. (Year: 2015).*

Jung, S. O., Zhao, Q., Park, J. W., Kim, S. O., Kim, Y. H., Oh, H. Y., . . . & Kang, Y. (2009). A green emitting iridium (III) complex with narrow emission band and its application to phosphorescence organic light-emitting diodes (OLEDs). Organic Electronics, 10(6), 1066-1073. (Year: 2009).*

Translation by Patentscope for CN 110330531 (publication date Oct. 2019). (Year: 2019).*

Extended European Search Report issued Jan. 10, 2022, for Patent Application No. EP 21186314.7.

(Continued)

*Primary Examiner* — Dawn L Garrett

(74) *Attorney, Agent, or Firm* — CANTOR COLBURN LLP

(57) ABSTRACT

An organometallic compound represented by Formula 1:

$$M(L_1)_{n1}(L_2)_{n2} \quad \text{Formula 1}$$

wherein M is a transition metal, $L_1$ is a ligand represented by Formula 2 as provided herein, n1 is 1, 2, or 3, wherein, when n1 is 2, two $L_1$ groups are identical to or different from each other, and when n1 is 3, two or more of three $L_1$ groups are different from each other, $L_2$ is a monodentate ligand, a bidentate ligand, a tridentate ligand, or a tetradentate ligand, and n2 is 0, 1, 2, 3, or 4, wherein, when n2 is 2 or greater, two or more $L_2$ groups are identical to or different from each other, and $L_1$ and $L_2$ are different from each other.

20 Claims, 1 Drawing Sheet

(56) References Cited

OTHER PUBLICATIONS

Graham B.Caygill et al. "Cyclometallated compounds VI. Cyclopalladation of 2-phenylpyrimidines with pendant byrazole donors," Journal of Organometallic Chemistry, Oct. 2, 1990, vol. 395, Issue 3, pp. 375-381.
J. Pérez-Miqueo et al., "Photoswitchable Azobenzene-Appended Iridium(iii) Complexes," Dalton Transactions, Jul. 19, 2016, vol. 45, pp. 13726-1374.
J. Pérez-Miqueo et al., Supporting Information for "Photoswitchable Azobenzene-Appended Iridium(III) Complexes," Dalton Transactions, Jul. 19, 2016, vol. 45, pp. S1-S64.
Jordan L. Appleton et al., "A New Phenanthroline Ligand and the Spontaneous Resolution of its Homoleptic Copper(I) Complex," European Journal of Organic Chemistry, Sep. 11, 2020, vol. 2020, Issue 47, pp. 7320-7326.
Werner Bauer et al., "Organometallic Complexes of Iridium, Palladium, Chromium and Iron from 2-Phenyl-5(4H)-oxazolones—Organometallic Labelled Dipeptides," Metal Complexes of Biologically Important Ligands, European Journal of Inorganic Chemistry, 1998, vol. 1998, Issue 4, pp. 485-493.
Office Action dated Jul. 5, 2024, issued in corresponding EP Patent Application No. 21186314.7, 17 pp.

* cited by examiner

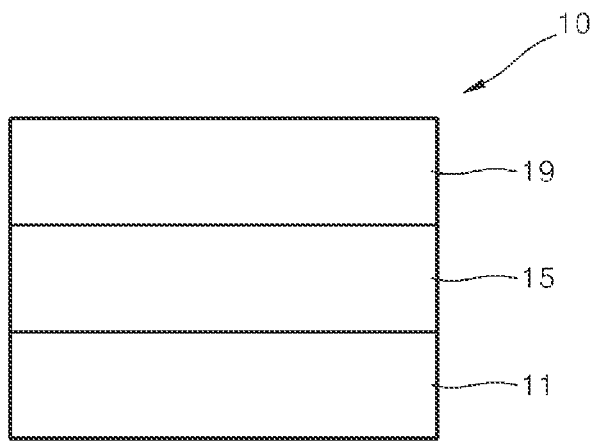
10
19
15
11

ORGANOMETALLIC COMPOUND, ORGANIC LIGHT- EMITTING DEVICE INCLUDING THE SAME, AND ELECTRONIC APPARATUS INCLUDING THE ORGANIC LIGHT- EMITTING DEVICE

CROSS-REFERENCE TO RELATED APPLICATION

This application claims priority to and the benefit of Korean Patent Application No. 10-2020-0089868, filed on Jul. 20, 2020, in the Korean Intellectual Property Office, and all the benefits accruing therefrom under 35 U.S.C. § 119, the content of which is incorporated by reference herein in its entirety.

BACKGROUND

1. Field

The present disclosure relates to organometallic compounds, organic light-emitting devices including the same, and electronic apparatuses including the organic light-emitting devices.

2. Description of Related Art

Organic light-emitting devices are self-emission devices, which have improved characteristics in terms of viewing angles, response time, brightness, driving voltage, and response speed, and produce full-color images.

In an example, an organic light-emitting device includes an anode, a cathode, and an organic layer arranged between the anode and the cathode, wherein the organic layer includes an emission layer. A hole transport region may be arranged between the anode and the emission layer, and an electron transport region may be arranged between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transition from an excited state to a ground state to thereby generate light.

SUMMARY

Provided are organometallic compounds, organic light-emitting devices including the same, and electronic apparatuses including the organic light-emitting devices.

Additional aspects will be set forth in part in the description which follows and, in part, will be apparent from the description, or may be learned by practice of the presented embodiments of the disclosure.

According to one aspect of one or more embodiments, there is provided an organometallic compound represented by Formula 1:

$$M(L_1)_{n1}(L_2)_{n2} \qquad \text{Formula 1}$$

wherein, in Formula 1,

M is a transition metal, $L_1$ is a ligand represented by Formula 2, n1 is 1, 2, or 3, wherein, when n1 is 2, two $L_1$ groups are identical to or different from each other, and when n1 is 3, two or more of three $L_1$ groups are different from each other, $L_2$ is a monodentate ligand, a bidentate ligand, a tridentate ligand, or a tetradentate ligand, n2 is 0, 1, 2, 3, or 4, wherein, when n2 is 2 or greater, two or more of $L_2$ groups are identical to or different from each other, $L_1$ and $L_2$ are different from each other, Formula 2

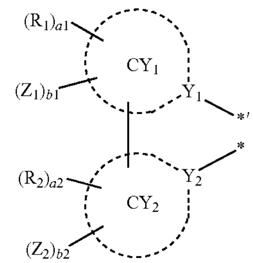

wherein, in Formula 2, $Y_1$ and $Y_2$ are each independently N or C, ring $CY_1$ and ring $CY_2$ are each independently a $C_5$-$C_{30}$ carbocyclic group or a $C_1$-$C_{30}$ heterocyclic group, $R_1$ and $R_2$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_0$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, a1 and a2 are each independently an integer from 0 to 20, b1 and b2 are each independently an integer from 0 to 20, and the sum of b1 and b2 is 1 or greater, $Z_1$ and $Z_2$ in Formula 2 are each independently a group represented by Formula 3, Formula 3

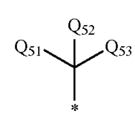

wherein, in Formula 3, $Q_{51}$ and $Q_{52}$ are each independently hydrogen, deuterium, —F, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, $Q_{53}$ is a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, two or more of a plurality of $R_1$ groups are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $R_2$ groups are optionally linked together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ is the same as described in connection with $R_1$, provided that $R_{10a}$ is not hydrogen,

* and *' in Formula 2 each indicate a binding site to M in Formula 1,

* in Formula 3 indicates a binding site to a neighboring atom, in Formula 2 and Formula 3, substituents of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group are each independently:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—Ge(Q_{13})(Q_{14})(Q_{15})$, $—B(Q_{16})(Q_{17})$, $—P(=O)(Q_{18})(Q_{19})$, $—P(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—Ge(Q_{23})(Q_{24})(Q_{25})$, $—B(Q_{26})(Q_{27})$, $—P(=O)(Q_{28})(Q_{29})$, $—P(Q_{28})(Q_{29})$, or a combination thereof;

$—N(Q_{31})(Q_{32})$, $—Si(Q_{33})(Q_{34})(Q_{35})$, $—Ge(Q_{33})(Q_{34})(Q_{35})$, $—B(Q_{36})(Q_{37})$, $—P(=O)(Q_{38})(Q_{39})$, or $—P(Q_{38})(Q_{39})$; or a combination thereof, and $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; $—C_1$; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, —F, a cyano group, a $C_1$-$C_{60}$ alkyl group, a $C_6$-$C_{60}$ aryl group, a deuterated $C_6$-$C_{60}$ aryl group, a fluorinated $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group or a $C_1$-$C_{60}$ heteroaryl group, each unsubstituted or substituted with deuterium, —F, a cyano group, a $C_1$-$C_{60}$ alkyl group, a deuterated $C_1$-$C_{60}$ alkyl group, a fluorinated $C_1$-$C_{60}$ alkyl group, a $C_6$-$C_{60}$ aryl group, a deuterated $C_6$-$C_{60}$ aryl group, a fluorinated $C_6$-$C_{60}$ aryl group, or a combination thereof; a $C_6$-$C_{60}$ aryloxy group; a $C_6$-$C_{60}$ arylthio group; a monovalent non-aromatic condensed polycyclic group; or a monovalent non-aromatic condensed heteropolycyclic group.

According to an aspect of another embodiment, there is provided an organic light-emitting device including: a first electrode; a second electrode; and an organic layer disposed between the first electrode and the second electrode and including an emission layer, wherein the organic layer includes at least one organometallic compound represented by Formula 1.

The at least one organometallic compound may be included in the emission layer of the organic layer, and the at least one organometallic compound included in the emission layer may function as a dopant.

According to an aspect of another embodiment, there is provided an electronic apparatus including the organic light-emitting device.

BRIEF DESCRIPTION OF THE DRAWINGS

The above and other aspects, features, and advantages of certain embodiments of the disclosure will be more apparent from the following description taken in conjunction with the accompanying drawings, in which:

FIGURE which shows a schematic cross-sectional view of an organic light-emitting device according to one or more embodiments.

DETAILED DESCRIPTION

Reference will now be made in detail to exemplary embodiments, examples of which are illustrated in the accompanying drawing, wherein like reference numerals refer to like elements throughout. In this regard, the present exemplary embodiments may have different forms and should not be construed as being limited to the descriptions set forth herein. Accordingly, the exemplary embodiments are merely described below, by referring to the FIGURE, to explain aspects. As used herein, the term “and/or” includes any and all combinations of one or more of the associated listed items. Expressions such as “at least one of,” when preceding a list of elements, modify the entire list of elements and do not modify the individual elements of the list.

It will be understood that when an element is referred to as being “on” another element, it can be directly in contact with the other element or intervening elements may be present therebetween. In contrast, when an element is referred to as being “directly on” another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms “a,” “an,” and “the” are intended to include the plural forms as well, unless the context clearly indicates otherwise.

The term “or” means “and/or.” It will be further understood that the terms “comprises” and/or “comprising,” or “includes” and/or “including” when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to a cross section illustration that is a schematic illustration of one or more idealized embodiments. As such, variations from the shapes of the illustration as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the FIGURE are schematic in nature and their shapes are not intended to illustrate the precise shape of a region and are not intended to limit the scope of the present claims.

“About” or “approximately” as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” can mean within one or more standard deviations, or within +30%, 20%, 10%, 5% of the stated value.

An aspect of the present disclosure provides an organometallic compound represented by Formula 1:

$$M(L_1)_{n1}(L_2)_{n2} \qquad \text{Formula 1}$$

wherein M in Formula 1 is a transition metal.

In one or more embodiments, M may be a Period 1 transition metal, a Period 2 transition metal, or a Period 3 transition metal in the Periodic Table of Elements.

In one or more embodiments, M may be iridium (Ir), platinum (Pt), osmium (Os), titanium (Ti), zirconium (Zr), hafnium (Hf), europium (Eu), terbium (Tb), thulium (Tm), or rhodium (Rh).

In one or more embodiments, M may be Ir, Pt, Os, or Rh.

In one or more embodiments, M may be Ir.

In Formula 1, $L_1$ may be a ligand represented by Formula 2:

Formula 2

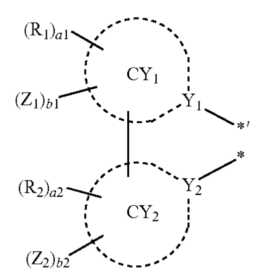

wherein Formula 2 is the same as described in the present specification.

In Formula 1, n1 indicates the number of $L_1$ groups, and may be 1, 2, or 3. When n1 is 2, two $L_1$ groups may be identical to or different from each other. When n1 is 3, two or more of three $L_1$ groups may be different from each other.

In Formula 1, $L_2$ may be a monodentate ligand, a bidentate ligand, a tridentate ligand, or a tetradentate ligand.

In Formula 1, n2 indicates the number of $L_2$ groups, and may be 0, 1, 2, 3, or 4. When n2 is 2 or greater, two or more of $L_2$ groups may be identical to or different from each other. For example, n2 may be 1 or 2.

In one or more embodiments, in Formula 1, i) M may be Ir, and the sum of n1 and n2 may be 3, for example, a) n1 may be 1 and n2 may be 2, or b) n1 may be 2 and n2 may be 1; or ii) M may be Pt, and the sum of n1 and n2 may be 2, for example, n1 and n2 each may be 1.

In Formula 1, $L_1$ and $L_2$ may be different from each other.

In Formula 1, when n1 is 3, two or more of three $L_1$ groups may be different from each other, and $L_1$ and $L_2$ may be different from each other. In this regard, the organometallic compound represented by Formula 1 may be a heteroleptic complex.

In Formula 2, $Y_1$ and $Y_2$ may each independently be C or N. For example, $Y_1$ may be N, and $Y_2$ may be C.

In Formula 2, ring $CY_1$ and ring $CY_2$ may each independently a $C_5$-$C_{30}$ carbocyclic group or a $C_1$-$C_{30}$ heterocyclic group.

In one or more embodiments, ring $CY_1$ and ring $CY_2$ may each independently selected from, i) a first ring, ii) a second ring, iii) a condensed ring in which two or more first rings are condensed with each other, iv) a condensed ring in which two or more second rings are condensed with each other, or v) a condensed ring in which one or more first rings and one or more second rings are condensed with each other,

- wherein the first ring may be a cyclopentane group, a cyclopentene group, a furan group, a thiophene group, a pyrrole group, a silole group, a germole group, a phosphole group, a selenophene group, a borole group, an oxazole group, an oxadiazole group, an oxatriazole group, a thiazole group, a thiadiazole group, a thiatriazole group, a pyrazole group, an imidazole group, a triazole group, a tetrazole group, an azasilole group, an azagermole group, an azaphosphole group, an azaselenophene group, or an azaborole group, and
- the second ring may be an adamantane group, a norbornane group, a norbornene group, a cyclohexane group, a cyclohexene group, a benzene group, a pyridine group, a pyrimidine group, a pyrazine group, a pyridazine group, or a triazine group.

In one or more embodiments, ring $CY_1$ and ring $CY_2$ in Formula 2 may each independently be a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a pyrrole group, a furan group, a thiophene group, a silole group, a borole group, a phosphole group, a germole group, a selenophene group, an indene group, an indole group, a benzofuran group, a benzothiophene group, a benzosilole group, a benzoborole group, a benzophosphole group, a benzogermole group, a benzoselenophene group, a fluorene group, a carbazole group, a dibenzofuran group, a dibenzothiophene group, a dibenzosilole group, a dibenzoborole group, a dibenzophosphole group, a dibenzogermole group, a dibenzoselenophene group, a benzofluorene group, a benzocarbazole group, a naphthobenzofuran group, a naphthobenzothiophene group, a naphthobenzosilole group, a naphthobenzoborole group, a naphthobenzophosphole group, a naphthobenzogermole group, a naphthobenzoselenophene group, a dibenzofluorene group, a dibenzocarbazole group, a dinaphthofuran group, a dinaphthothiophene group, a dinaphthosilole group, a dinaphthoborole group, a dinaphthophosphole group, a dinaphthogermole group, a dinaphthoselenophene group, an indenophenanthrene group, an indolophenanthrene group, a phenanthrobenzofuran group, a phenanthrobenzothiophene group, a phenanthrobenzosilole group, a phenanthrobenzoborole group, a phenanthrobenzophosphole group, a phenanthrobenzogermole group, a phenanthrobenzoselenophene group, a dibenzothiophene 5-oxide group, a 9H-fluorene-9-one group, a dibenzothiophene 5,5-dioxide group, an azaindene group, an azaindole group, an azabenzofuran group, an azabenzothiophene group, an azabenzosilole group, an azabenzoborole group, an azabenzophosphole group, an azabenzogermole group, an azabenzoselenophene group, an azafluorene group, an azacarbazole group, an azadibenzofuran group, an azadibenzothiophene group, an azadibenzosilole group, an azadibenzoborole group, an azadibenzophosphole group, an azadibenzogermole group, an azadibenzoselenophene group, an azabenzofluorene group, an azabenzocarbazole group, an azanaphthobenzofuran group, an azanaphthobenzothiophene group, an azanaphthobenzosilole group, an azanaphthobenzoborole group, an azanaphthobenzophosphole group, an azanaphthobenzogermole group, an azanaphthobenzoselenophene group, an azadibenzofluorene group, an azadibenzocarbazole group, an azadinaphthofuran group, an azadinaphthothiophene group, an azadinaphthosilole group, an azadinaphthoborole group, an azadinaphthophosphole group, an azadinaphthogermole group, an azadinaphthoselenophene group, an azaindenophenanthrene group, an azaindolophenanthrene group, an azaphenanthrobenzofuran group, an azaphenanthrobenzothiophene group, an azaphenanthrobenzosilole group, an azaphenanthrobenzoborole group, an azaphenanthrobenzophosphole group, an azaphenanthrobenzogermole group, an azaphenanthrobenzoselenophene group, an azadibenzothiophene 5-oxide group, an aza9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a benzoquinoline group, a benzoisoquinoline group, a benzoquinoxaline group, a benzoquinazoline group, a phenanthroline group, a phenanthridine group, a pyrrole group, a pyrazole group, an imidazole group, a triazole group, an oxazole group, an isooxazole group, a thiazole group, an isothiazole group, an oxadiazole group, a thiadiazole group, an azasilole group, an azaborole group, an azaphosphole group, an azagermole group, an azaselenophene group, a benzopyrrole group, a benzopyrazole group, a benzimidazole group, a benzoxazole group, a benzisoxazole group, a benzothiazole group, a benzisothiazole group, a benzoxadiazole group, a benzothiadiazole group, a 5,6,7,8-tetrahydroisoquinoline group, a 5,6,7,8-tetrahydroquinoline group, an adamantane group, a norbornane group, a norbornene group, a benzene group condensed with a cyclohexane group, or a benzene group condensed with a norbornane group.

In one or more embodiments, ring $CY_1$ in Formula 2 may be a pyridine group, a pyrimidine group, a pyrazine group, a pyridazine group, a triazine group, a quinoline group, an isoquinoline group, a quinoxaline group, a quinazoline group, a benzoquinoline group, a benzoisoquinoline group, a benzoquinoxaline group, a benzoquinazoline group, a phenanthroline group, a phenanthridine group, a 5,6,7,8- tetrahydroisoquinoline group, a 5,6,7,8-tetrahydroquinoline group, an azafluorene group, an azacarbazole group, an azadibenzofuran group, an azadibenzothiophene group, or an azadibenzosilole group.

In one or more embodiments, ring $CY_2$ in Formula 2 may be a benzene group, a naphthalene group, an anthracene group, a phenanthrene group, a triphenylene group, a pyrene group, a chrysene group, a 1,2,3,4-tetrahydronaphthalene group, or a group represented by Formula 2B:

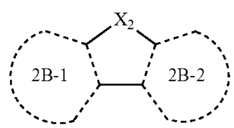

2B wherein, in Formula 2B, $X_2$ may be O, S, Se, or a moiety including N, C, or Si, and ring 2B-1 and ring 2B-2 may each independently be a benzene group, a naphthalene group, an anthracene group, a phenanthrene group, a triphenylene group, a pyrene group, a chrysene group, a 1,2,3,4-tetrahydronaphthalene group, a pyridine group, a pyrimidine group, a pyrazine group, a pyridazine group, a triazine group, a quinoline group, an isoquinoline group, a quinoxaline group, a quinazoline group, a benzoquinoline group, a benzoisoquinoline group, a benzoquinoxaline group, a benzoquinazoline group, a phenanthroline group, a phenanthridine group, a 5,6,7,8-tetrahydroisoquinoline group, a 5,6,7,8-tetrahydroquinoline group, an indene group, an indole group, a benzofuran group, a benzothiophene group, a benzosilole group, a fluorene group, a carbazole group, a dibenzofuran group, a dibenzothiophene group, a dibenzosilole group, an azaindene group, an azaindole group, an azabenzofuran group, an azabenzothiophene group, an azabenzosilole group, an azafluorene group, an azacarbazole group, an azadibenzofuran group, an azadibenzothiophene group, or an azadibenzosilole group.

In Formula 2, $R_1$ and $R_2$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, and $Q_1$ to $Q_9$ may each be the same as described in the present specification.

In Formula 2, a1 and a2 indicate the number of $R_1$ groups and the number of $R_2$ groups, respectively, and may each independently be an integer from 0 to 20. When a1 is 2 or greater, two or more of $R_1$ groups may be identical to or different from each other, and when a2 is 2 or greater, two or more of $R_2$ groups may be identical to or different from each other. For example, a1 and a2 may each independently be 0, 1, 2, 3, 4, 5, or 6.

In one or more embodiments, $R_1$ and $R_2$ in Formula 2 may each independently be:

hydrogen, deuterium, —F, or a cyano group;

a $C_1$-$C_{20}$ alkyl group unsubstituted or substituted with deuterium, —F, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, or a combination thereof;

a $C_3$-$C_{10}$ cycloalkyl group, a $C_1$-$C_{10}$ heterocycloalkyl group, a phenyl group, a biphenyl group, a naphthyl group, or a pyridinyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_1$-$C_{20}$ alkoxy group, a deuterated $C_1$-$C_{20}$ alkoxy group, a fluorinated $C_1$-$C_{20}$ alkoxy group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a naphthyl group, a deuterated naphthyl group, a fluorinated naphthyl group, a ($C_1$-$C_{20}$ alkyl)naphthyl group, a pyridinyl group, a deuterated pyridinyl group, a fluorinated pyridinyl group, a ($C_1$-$C_{20}$ alkyl)pyridinyl group, or a combination thereof; or —$Si(Q_3)(Q_4)(Q_5)$ or —$Ge(Q_3)(Q_4)(Q_5)$, and $Q_3$ to $Q_5$ may each independently be:

deuterium;

a $C_1$-$C_{60}$ alkyl group unsubstituted or substituted with deuterium, —F, a cyano group, a $C_1$-$C_{60}$ alkyl group, a $C_6$-$C_{60}$ aryl group, a deuterated $C_6$-$C_{60}$ aryl group, a fluorinated $C_6$-$C_{60}$ aryl group, or a combination thereof; or a $C_6$-$C_{60}$ aryl group or a $C_1$-$C_{60}$ heteroaryl group, each unsubstituted or substituted with deuterium, —F, a cyano group, a $C_1$-$C_{60}$ alkyl group, a deuterated $C_1$-$C_{60}$ alkyl group, a fluorinated $C_1$-$C_{60}$ alkyl group, a $C_6$-$C_{60}$ aryl group, a deuterated $C_6$-$C_{60}$ aryl group, a fluorinated $C_6$-$C_{60}$ aryl group, or a combination thereof.

In one or more embodiments, at least one $R_1$ group in the number of a1 in Formula 2 may be: deuterium; —F; a $C_1$-$C_{20}$ alkyl group or a $C_3$-$C_{10}$ cycloalkyl group, each unsubstituted or substituted with deuterium, —F, $C_1$-$C_{10}$ alkyl group, or a combination thereof; a group represented by —$Si(Q_3a)(Q_4a)(Q_5a)$; or a group represented by —$Ge(Q_3a)(Q_4a)(Q_5a)$, wherein $Q_3a$ to $Q_5a$ are as defined herein for $Q_3$ to $Q_5$, respectively.

In one or more embodiments, at least one $R_2$ group in the number of a2 in Formula 2 may be: deuterium; —F; or a $C_1$-$C_{20}$ alkyl group or a $C_3$-$C_{10}$ cycloalkyl group, each unsubstituted or substituted with deuterium, —F, a $C_1$-$C_{10}$ alkyl group, or a combination thereof.

In one or more embodiments, $R_1$ and $R_2$ in Formula 2 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, $C_1$-$C_{20}$ alkyl group, a $C_2$-$C_{20}$ alkenyl group, a $C_1$-$C_{20}$ alkoxy group, or a $C_1$-$C_{20}$ alkylthio group;

a $C_1$-$C_{20}$ alkyl group, a $C_2$-$C_{20}$ alkenyl group, a $C_1$-$C_{20}$ alkoxy group, or a $C_1$-$C_{20}$ alkylthio group, each substituted with deuterium, —F, —CI, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or a combination thereof, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group or azadibenzothiophenyl group, each unsubstituted or substituted with deuterium, —F, —CI, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_2$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or a combination thereof; or —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, and $Q_1$ to $Q_9$ may each independently be:

deuterium, —F, a cyano group, —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, —$CD_2CDH_2$, —$CF_3$, —$CF_2H$, —$CFH_2$, —$CH_2CF_3$, —$CH_2CF_2H$, —$CH_2CFH_2$, —$CHFCH_3$, —$CHFCF_2H$, —$CHFCFH_2$, —$CHFCF_3$, —$CF_2CF_3$, —$CF_2CF_2H$, or —$CF_2CFH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a naphthyl group, or a pyridinyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, or a combination thereof.

In Formula 2, $Z_1$ and $Z_2$ may each independently be a group represented by Formula 3:

Formula 3

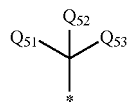

wherein Formula 3 is the same as described above.

In Formula 2, b1 and b2 indicate the number of $Z_1$ groups and the number of $Z_2$ groups, respectively, and may each independently be an integer from 0 to 20. When b1 is 2 or greater, two or more of $Z_1$ groups may be identical to or different from each other, and when b2 is 2 or greater, two or more of $Z_2$ groups may be identical to or different from each other.

In Formula 2, the sum of b1 and b2 may be 1 or greater (for example, 1, 2, 3, or 4). That is, the group represented by Formula 2 may include at least one of $Z_1$ and $Z_2$.

For example, b1 and b2 may each independently be 0, 1, 2, or 3.

In one or more embodiments, in Formula 2, i) b1 may be 1 or 2, and b2 may be 0;

ii) b1 may be 0, and b2 may be 1 or 2; or iii) b1 and b2 may each be 1.

In Formula 3, $Q_{51}$ and $Q_{52}$ may each independently be hydrogen, deuterium, —F, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, and $Q_{53}$ may be a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

In one or more embodiments, at least one of $Q_{51}$ and $Q_{52}$ (for example, both $Q_{51}$ and $Q_{52}$) in Formula 3 may each independently be deuterium, a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

In one or more embodiments, $Q_{51}$ and $Q_{52}$ in Formula 3 may each independently be:

hydrogen, deuterium, —F, or a cyano group;

a $C_1$-$C_{20}$ alkyl group unsubstituted or substituted with deuterium, —F, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, or a combination thereof; or a $C_3$-$C_{10}$ cycloalkyl group, a $C_1$-$C_{10}$ heterocycloalkyl group, a phenyl group, a biphenyl group, a naphthyl group, or a pyridinyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_1$-$C_{20}$ alkoxy group, a deuterated $C_1$-$C_{20}$ alkoxy group, a fluorinated $C_1$-$C_{20}$ alkoxy group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a naphthyl group, a deuterated naphthyl group, a fluorinated naphthyl group, a ($C_1$-$C_{20}$ alkyl)naphthyl group, a pyridinyl group, a deuterated pyridinyl group, a fluorinated pyridinyl group, a ($C_1$-$C_{20}$ alkyl)pyridinyl group, or a combination thereof.

In one or more embodiments, each of $Q_{51}$ and $Q_{52}$ in Formula 3 may not be hydrogen.

In one or more embodiments, at least one of $Q_{51}$ and $Q_{52}$ (for example, both $Q_{51}$ and $Q_{52}$) in Formula 3 may each independently be:

deuterium; or a $C_1$-$C_{20}$ alkyl group unsubstituted or substituted with deuterium, —F, or a combination thereof.

In one or more embodiments, $Q_{53}$ in Formula 3 may be a $C_3$-$C_{10}$ cycloalkyl group, a $C_1$-$C_{10}$ heterocycloalkyl group, a phenyl group, a biphenyl group, a naphthyl group, or a pyridinyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_1$-$C_{20}$ alkoxy group, a deuterated $C_1$-$C_{20}$ alkoxy group, a fluorinated $C_1$-$C_{20}$ alkoxy group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a naphthyl group, a deuterated naphthyl group, a fluorinated naphthyl group, a ($C_1$-$C_{20}$ alkyl)naphthyl group, a pyridinyl group, a deuterated pyridinyl group, a fluorinated pyridinyl group, a ($C_1$-$C_{20}$ alkyl)pyridinyl group, or a combination thereof.

In Formula 2, i) two or more of a plurality of $R_1$ groups may optionally be linked together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, or ii) two or more of a plurality of $R_2$ groups may optionally be linked together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$.

Here, $R_{10a}$ is the same as described in connection with $R_1$, provided that $R_{10a}$ is not hydrogen.

In Formula 2, * and *' each indicate a binding site to M in Formula 1.

In Formula 3, * indicates a binding site to a neighboring atom.

In one or more embodiments, a group represented by

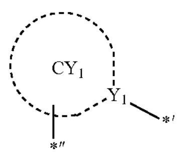

in Formula 2 may be a group represented by one of Formulae CY1-1 to CY1-42:

CY1-1

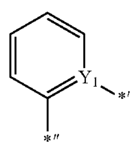

CY1-2

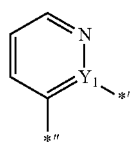

CY1-3

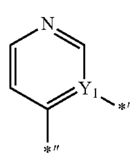

CY1-4

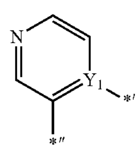

CY1-5

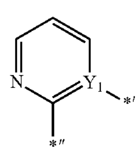

CY1-6

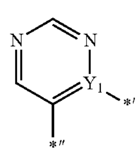

CY1-7

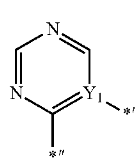

-continued

CY1-8

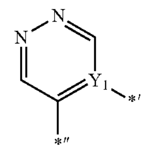

CY1-9

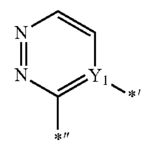

CY1-10

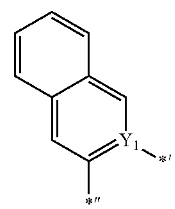

CY1-11

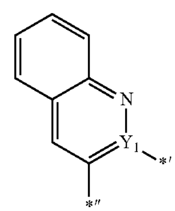

CY1-12

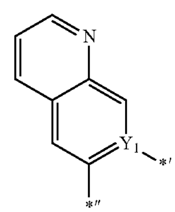

CY1-13

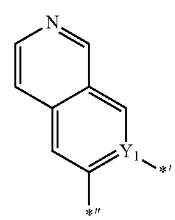

CY1-14

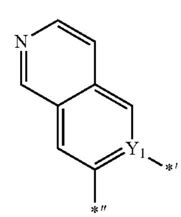

CY1-15

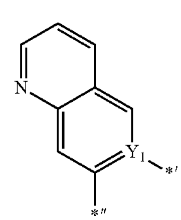

-continued
CY1-16
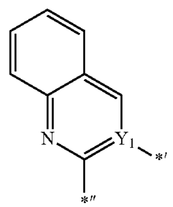
CY1-17
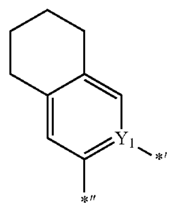
CY1-18
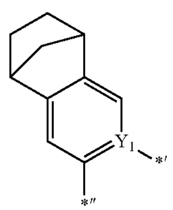
CY1-19
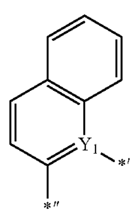
CY1-20
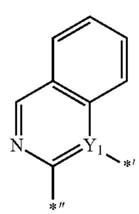
CY1-21
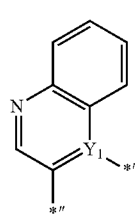
CY1-22
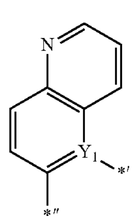
-continued
CY1-23
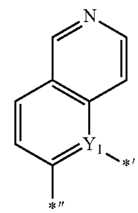
CY1-24
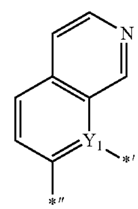
CY1-25
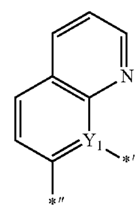
CY1-26
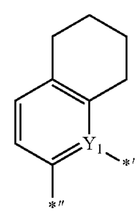
CY1-27
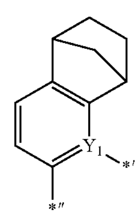
CY1-28
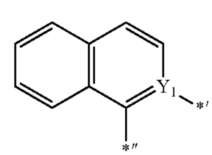
CY1-29
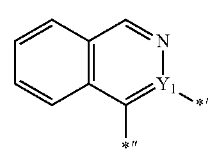
CY1-30
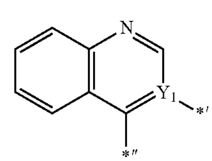

-continued

CY1-31

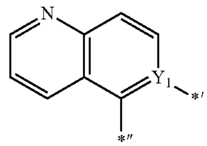

CY1-32

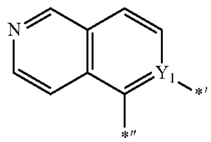

CY1-33

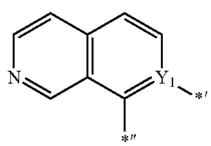

CY1-34

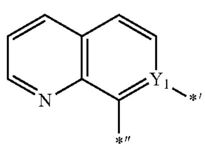

CY1-35

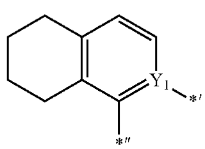

CY1-36

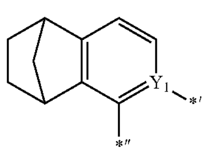

CY1-37

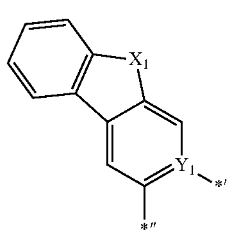

CY1-38

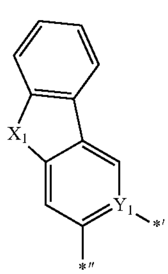

-continued

CY1-39

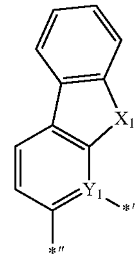

CY1-40

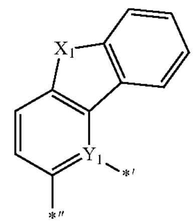

CY1-41

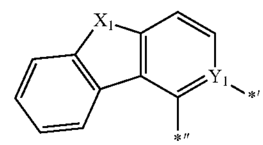

CY1-42

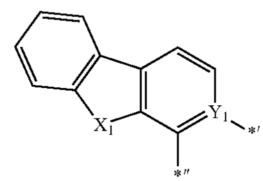

wherein, in Formulae CY1-1 to CY1-42, $Y_1$ may be the same as described in the present specification, $X_1$ may be O, S, Se, or a moiety including N, C, or Si,

*' indicates a binding site to M in Formula 1, and

*" indicates a binding site to ring $CY_2$ in Formula 2.

In one or more embodiments, a group represented by

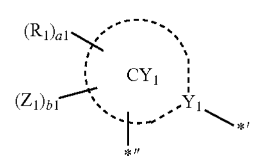

in Formula 2 may be a group represented by one of Formulae CY1-10 to CY1-42.

In one or more embodiments, a group represented by

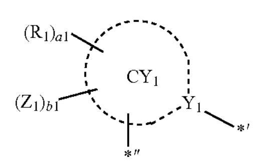

in Formula 2 may be a group represented by one of Formulae CY1(1) to CY1(16) or CY1(1)Z to CY1(38)Z:

CY1(1)
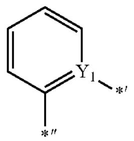
CY1(2)
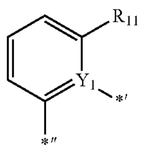
CY1(3)
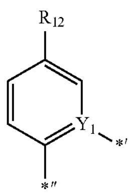
CY1(4)
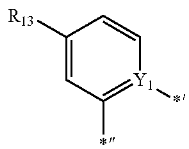
CY1(5)
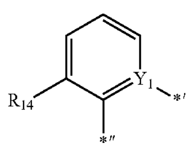
CY1(6)
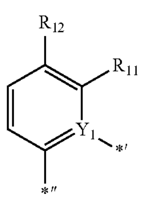
CY1(7)
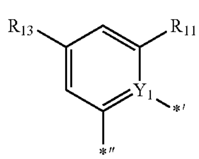
CY1(8)
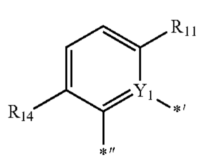
CY1(9)
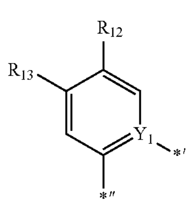
-continued
CY1(10)
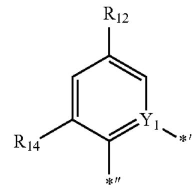
CY1(11)
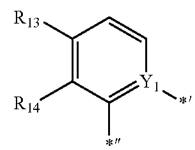
CY1(12)
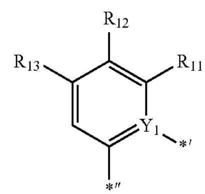
CY1(13)
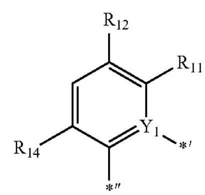
CY1(14)
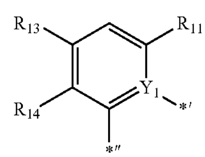
CY1(15)
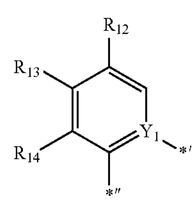
CY1(16)
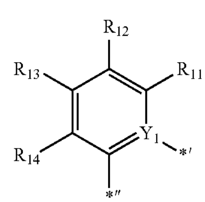
CY1(1)Z
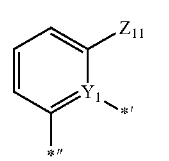

-continued
CY1(2)Z
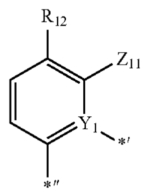
CY1(3)Z
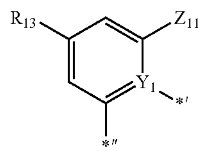
CY1(4)Z
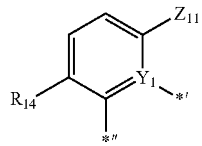
CY1(5)Z
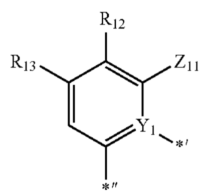
CY1(6)Z
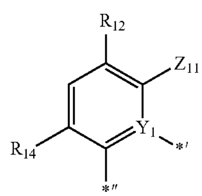
CY1(7)Z
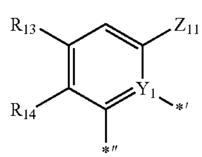
CY1(8)Z
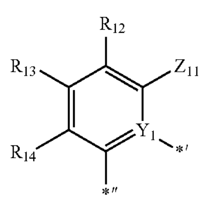
CY1(9)Z
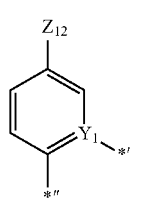
-continued
CY1(10)Z
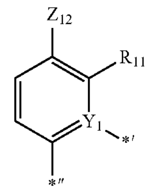
CY1(11)Z
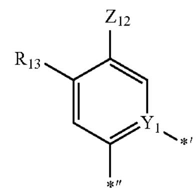
CY1(12)Z
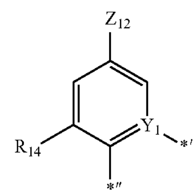
CY1(13)Z
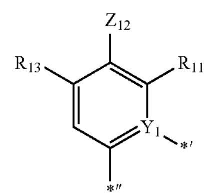
CY1(14)Z
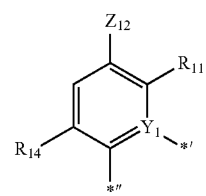
CY1(15)Z
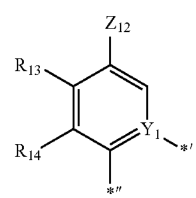
CY1(16)Z
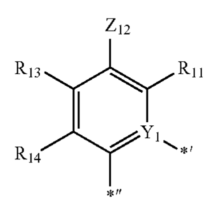
CY1(17)Z
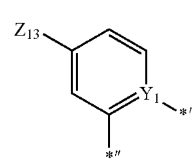

-continued
CY1(18)Z
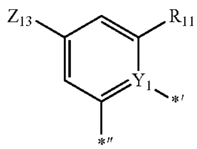
CY1(19)Z
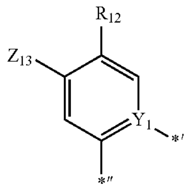
CY1(20)Z
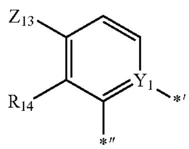
CY1(21)Z
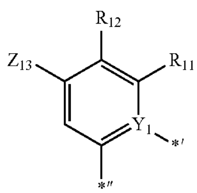
CY1(22)Z
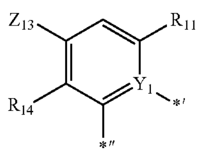
CY1(23)Z
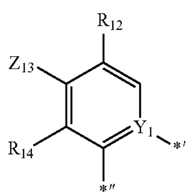
CY1(24)Z
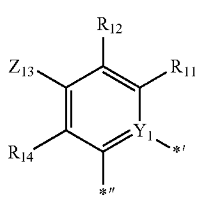
CY1(25)Z
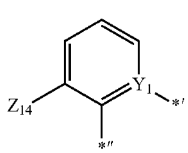
CY1(26)Z
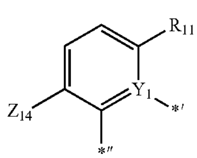
-continued
CY1(27)Z
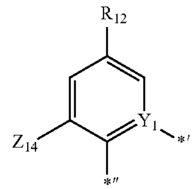
CY1(28)Z
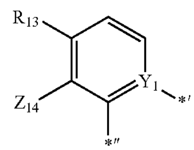
CY1(29)Z
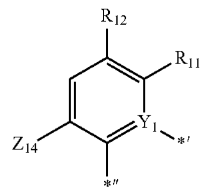
CY1(30)Z
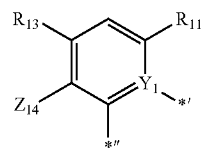
CY1(31)Z
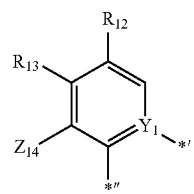
CY1(32)Z
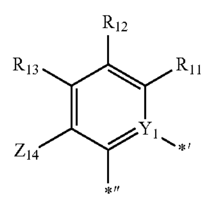
CY1(33)Z
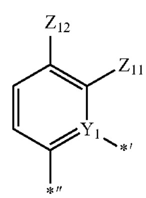
CY1(34)Z
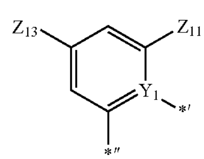
CY1(35)Z
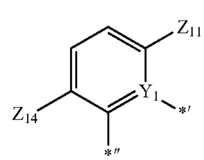

-continued

CY1(36)Z

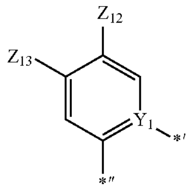

CY1(37)Z

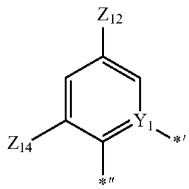

CY1(38)Z

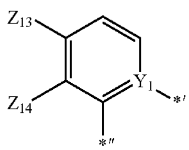

wherein, in Formulae CY1(1) to CY1(16) and CY1(1)Z to CY1(38)Z, $Y_1$ may be the same as described in the present specification, $R_{11}$ to $R_{14}$ may each be the same as described in connection with $R_1$, provided that each of $R_{11}$ to $R_{14}$ may not be hydrogen, $Z_1$ to $Z_{14}$ may each be the same as described in connection with $Z_1$,

*' indicates a binding site to M in Formula 1, and

*" indicates a binding site to ring $CY_2$ in Formula 2.

For example, Formulae CY1(1) to CY1(16) and CY1(1)Z to CY1(38)Z may satisfy:

i) one of Condition 1-1-1 and Condition 1-1-2, ii) Condition 1-2, or iii) one of Condition 1-1-1 and Condition 1-1-2, and Condition 1-2:

Condition 1-1-1

$R_{12}$ is hydrogen;

Condition 1-1-2

$R_{12}$ is: deuterium; —F; a $C_1$-$C_{20}$ alkyl group or a $C_3$-$C_{10}$ cycloalkyl group, each unsubstituted or substituted with deuterium, —F, a $C_1$-$C_{10}$ alkyl group, or a combination thereof; a group represented by —Si($Q_3$)($Q_4$)($Q_5$); or a group represented by —Ge($Q_3$)($Q_4$)($Q_5$);

Condition 1-2

$R_{13}$ includes two or more carbon atoms (for example, $R_{13}$ is a $C_2$-$C_{20}$ alkyl group, a $C_3$-$C_{10}$ cycloalkyl group, a phenyl group, or a biphenyl group, each unsubstituted or substituted with deuterium, —F, a $C_1$-$C_{10}$ alkyl group, or a combination thereof).

In one or more embodiments, a group represented by

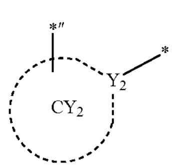

in Formula 2 may be a group represented by one of Formulae CY2-1 to CY2-64:

CY2-1

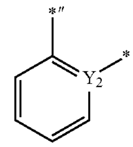

CY2-2

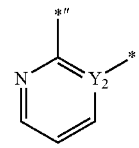

CY2-3

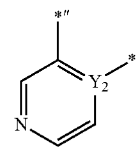

CY2-4

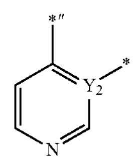

CY2-5

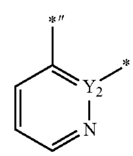

CY2-6

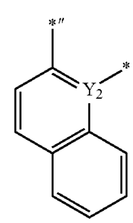

CY2-7

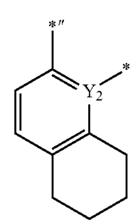

CY2-8

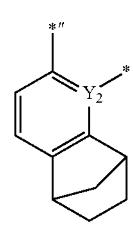

-continued
CY2-9
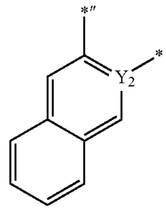
CY2-10
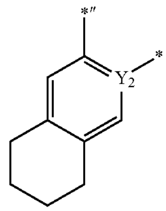
CY2-11
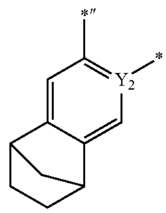
CY2-12
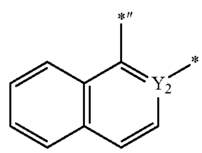
CY2-13
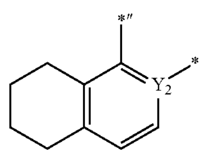
CY2-14
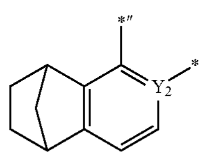
CY2-15
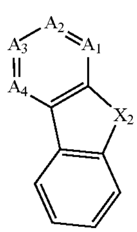
CY2-16
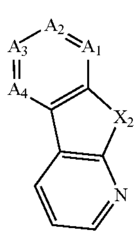
-continued
CY2-17
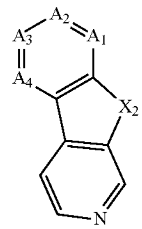
CY2-18
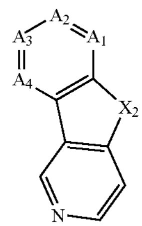
CY2-19
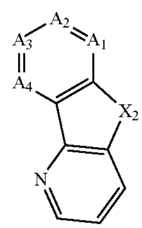
CY2-20
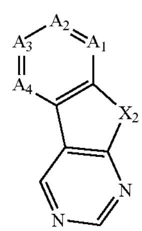
CY2-21
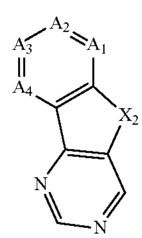
CY2-22
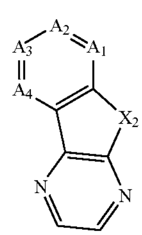

CY2-23
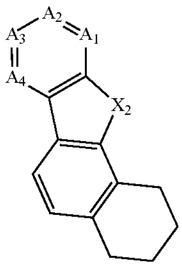
CY2-24
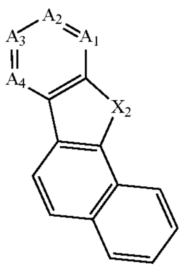
CY2-25
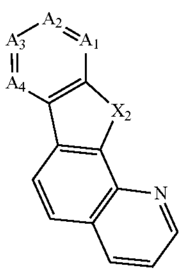
CY2-26
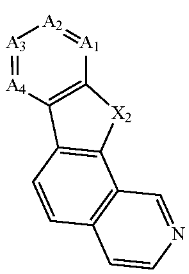
CY2-27
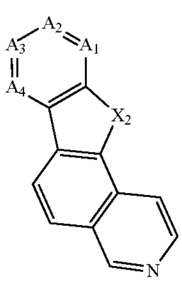
CY2-28
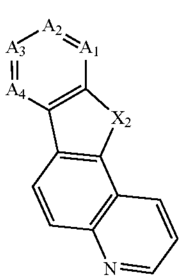
CY2-29
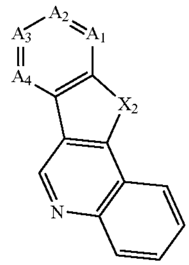
CY2-30
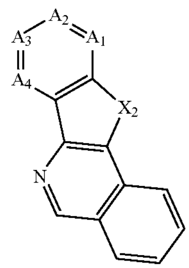
CY2-31
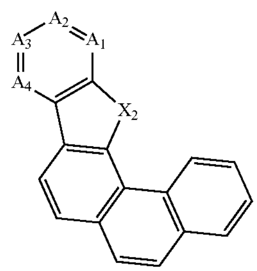
CY2-32
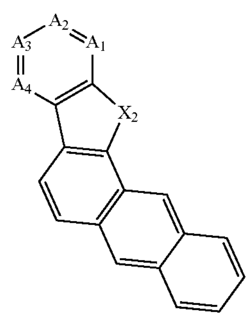
CY2-33
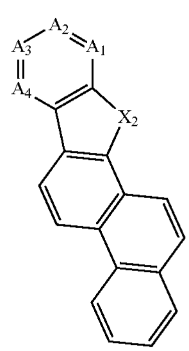

-continued
CY2-34
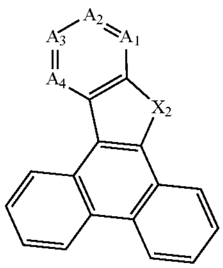
CY2-35
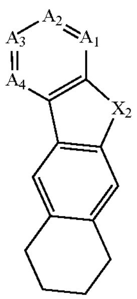
CY2-36
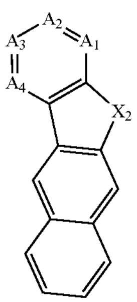
CY2-37
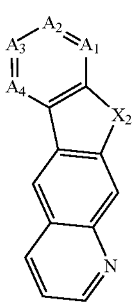
CY2-38
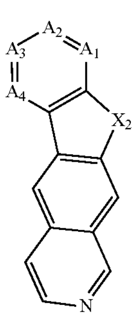
-continued
CY2-39
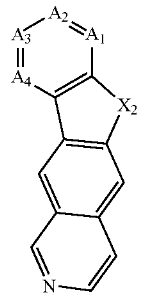
CY2-40
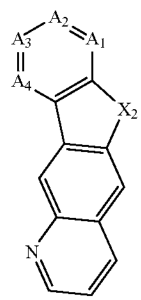
CY2-41
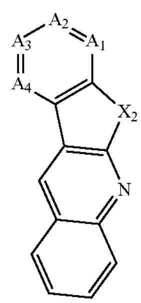
CY2-42
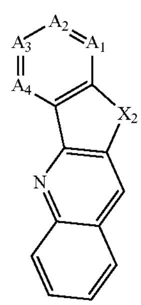
CY2-43
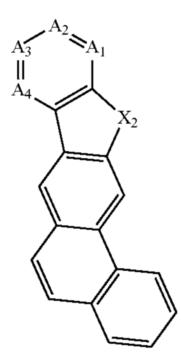

-continued
CY2-44
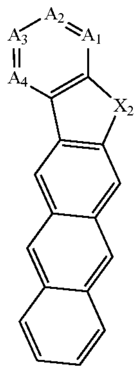
CY2-45
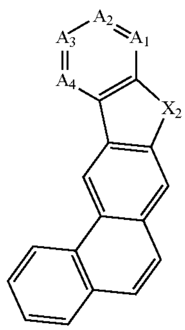
CY2-46
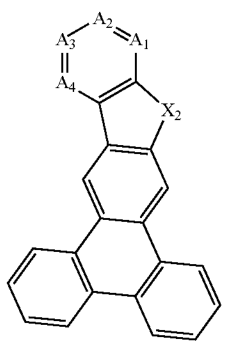
CY2-47
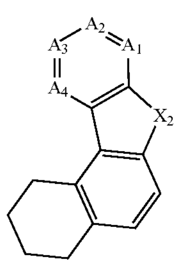
CY2-48
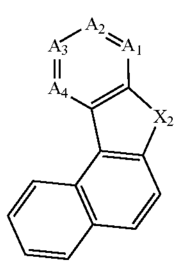
-continued
CY2-49
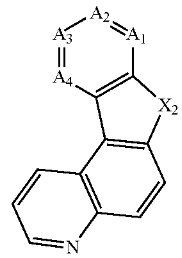
CY2-50
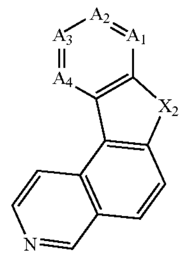
CY2-51
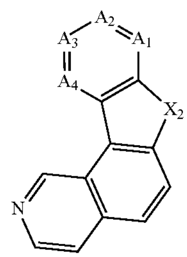
CY2-52
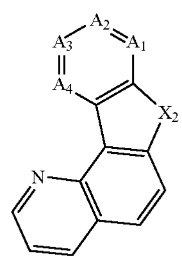
CY2-53
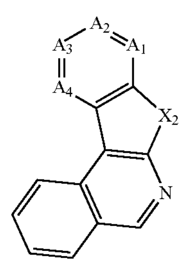
CY2-54
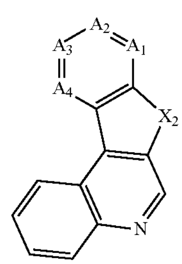

-continued
CY2-55
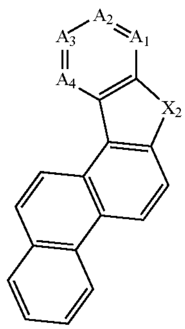
CY2-56
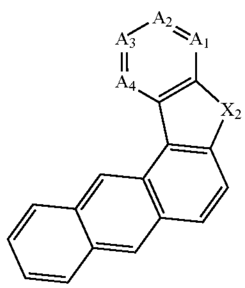
CY2-57
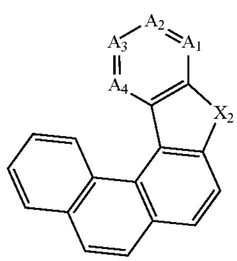
CY2-58
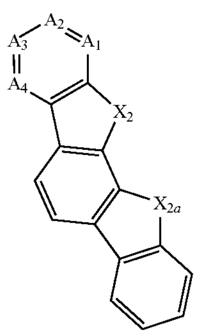
CY2-59
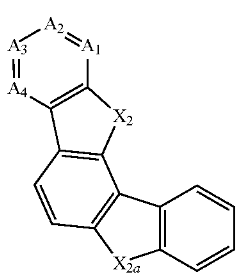
-continued
CY2-60
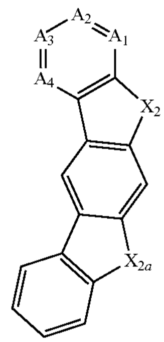
CY2-61
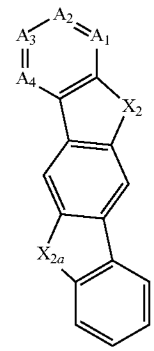
CY2-62
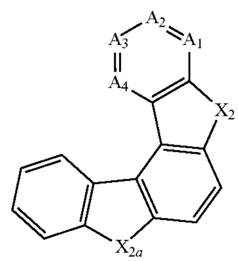
CY2-63
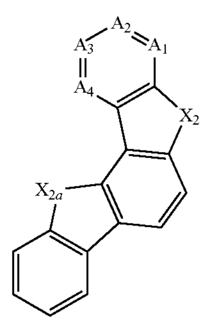
CY2-64
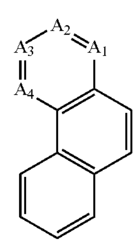
wherein, in Formulae CY2-1 to CY2-64,
$Y_2$ may be the same as described in the present specification,
$X_2$ and $X_{2a}$ may each independently be O, S, Se, or a moiety including N, C, or Si,

* in Formulae CY2-1 to CY2-14 indicates a binding site to M in Formula 1,

*" in Formulae CY2-1 to CY2-14 indicates a binding site to ring $CY_1$ in Formula 2, and Formulae CY2-15 to CY2-64 may satisfy one of Condition 2-1 to Condition 2-6:

Condition 2-1:

$A_1$ is $Y_2$, $A_2$ indicates a binding site to ring $CY_1$ in Formula 2, and $A_3$ and $A_4$ are each independently N or C;

Condition 2-2:

$A_2$ is $Y_2$, $A_3$ indicates a binding site to ring $CY_1$ in Formula 2, and $A_1$ and $A_4$ are each independently N or C;

Condition 2-3:

$A_3$ is $Y_2$, $A_4$ indicates a binding site to ring $CY_1$ in Formula 2, and $A_1$ and $A_2$ are each independently N or C;

Condition 2-4:

$A_4$ is $Y_2$, $A_3$ indicates a binding site to ring $CY_1$ in Formula 2, and $A_1$ and $A_2$ are each independently N or C;

Condition 2-5:

$A_3$ is $Y_2$, $A_2$ indicates a binding site to ring $CY_1$ in Formula 2, and $A_1$ and $A_4$ are each independently N or C;

Condition 2-6:

$A_2$ is $Y_2$, $A_1$ indicates a binding site to ring $CY_1$ in Formula 2, and $A_3$ and $A_4$ are each independently N or C.

In one or more embodiments, a group represented by

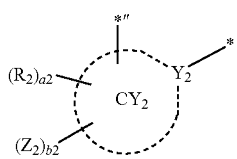

in Formula 2 may be a group represented by one of Formulae CY2-6 to CY2-14 and CY2-23 to CY2-64.

In one or more embodiments, a group represented by

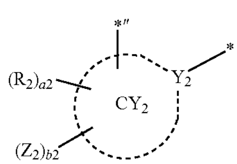

in Formula 2 may be a group represented by one of Formulae CY2(1) to CY2(96) and CY2(1)Z to CY2(54)Z:

CY2(1)

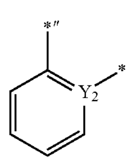

-continued

CY2(2)

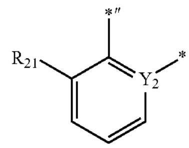

CY2(3)

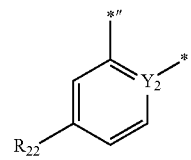

CY2(4)

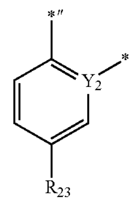

CY2(5)

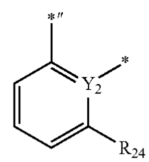

CY2(6)

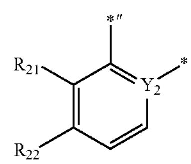

CY2(7)

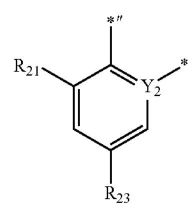

CY2(8)

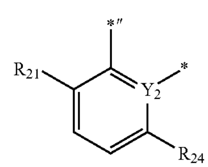

CY2(9)

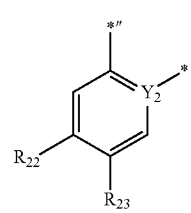

CY2(10)

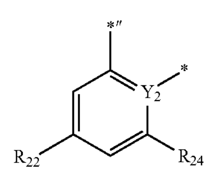

-continued
CY2(11)
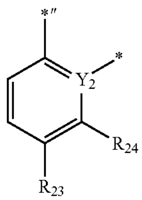
CY2(12)
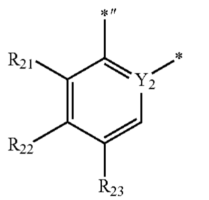
CY2(13)
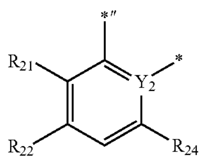
CY2(14)
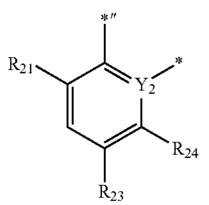
CY2(15)
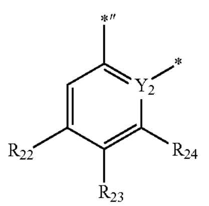
CY2(16)
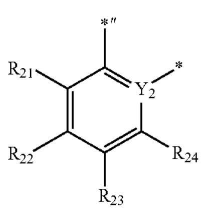
CY2(17)
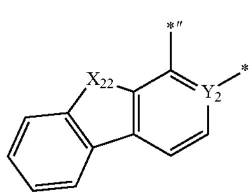
CY2(18)
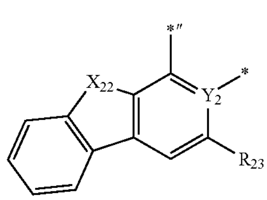
-continued
CY2(19)
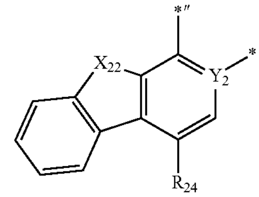
CY2(20)
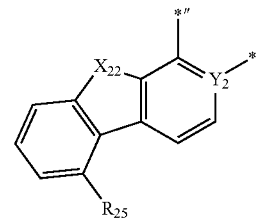
CY2(21)
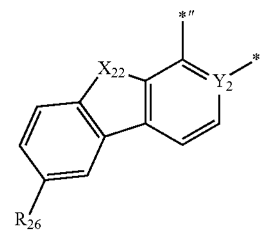
CY2(22)
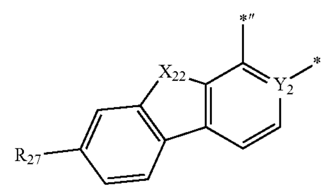
CY2(23)
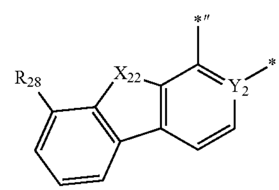
CY2(24)
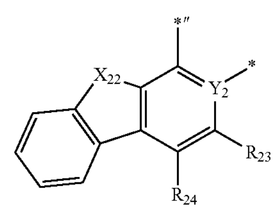
CY2(25)
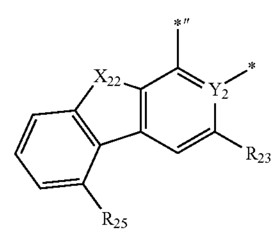

-continued
CY2(26)
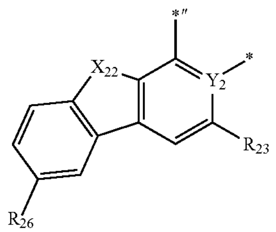
CY2(27)
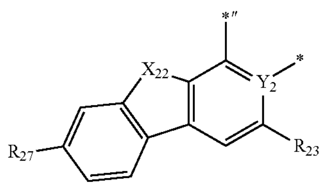
CY2(28)
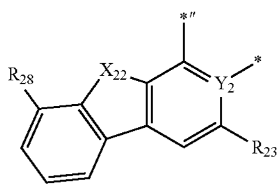
CY2(29)
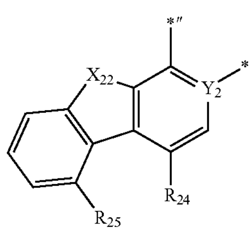
CY2(30)
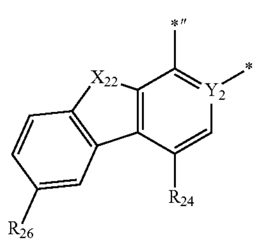
CY2(31)
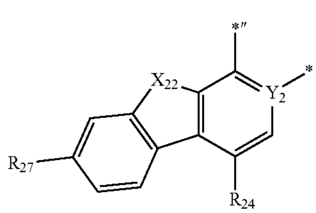
CY2(32)
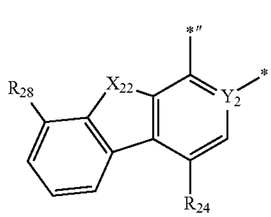
-continued
CY2(33)
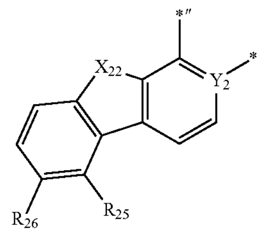
CY2(34)
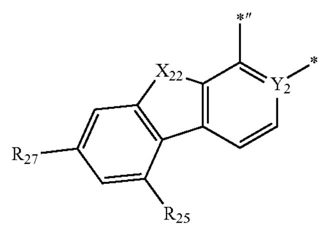
CY2(35)
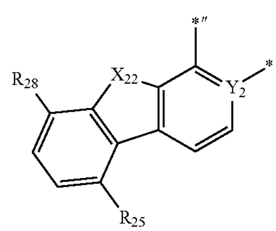
CY2(36)
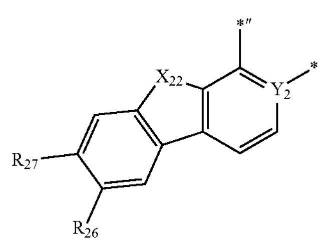
CY2(37)
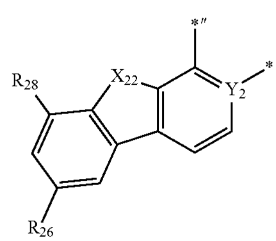
CY2(38)
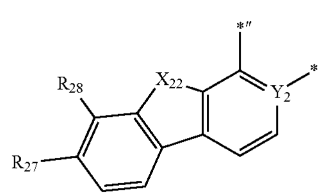
CY2(39)
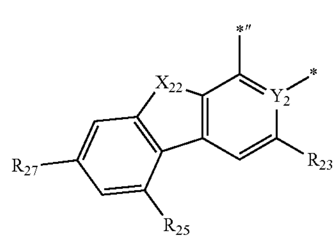

-continued
CY2(40)
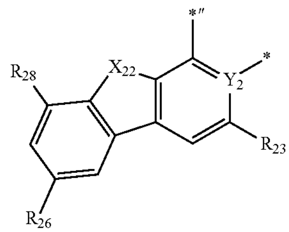
CY2(41)
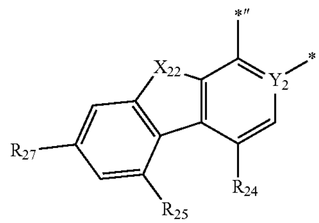
CY2(42)
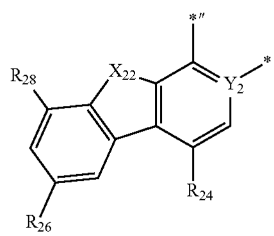
CY2(43)
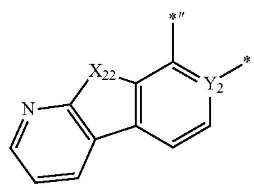
CY2(44)
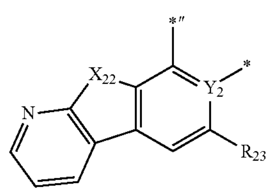
CY2(45)
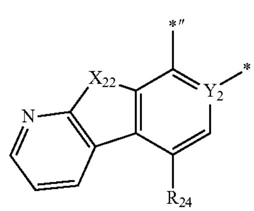
CY2(46)
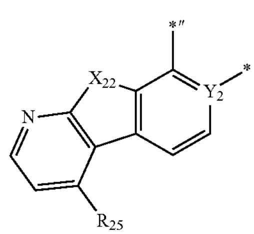
-continued
CY2(47)
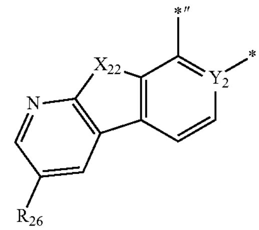
CY2(48)
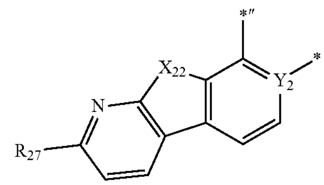
CY2(49)
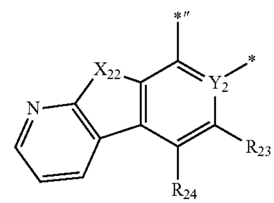
CY2(50)
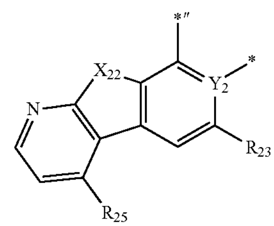
CY2(51)
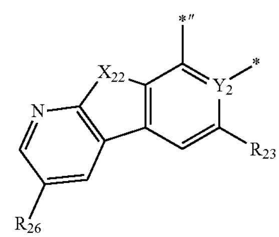
CY2(52)
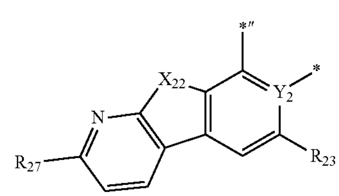
CY2(53)
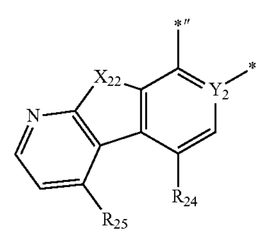

-continued
CY2(54)
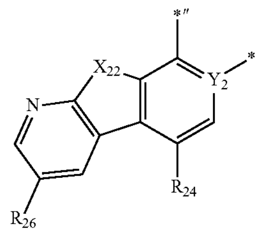
CY2(55)
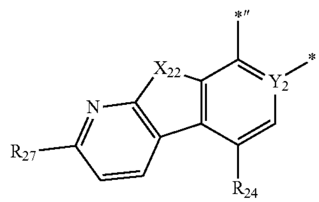
CY2(56)
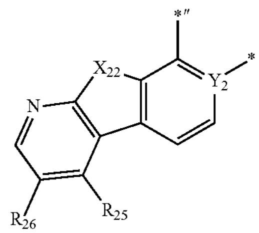
CY2(57)
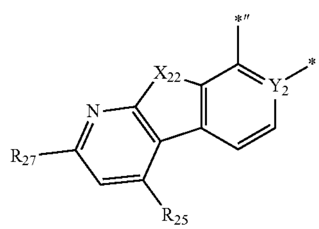
CY2(58)
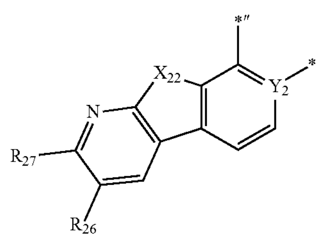
CY2(59)
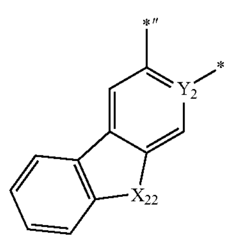
CY2(60)
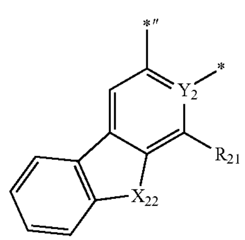
-continued
CY2(61)
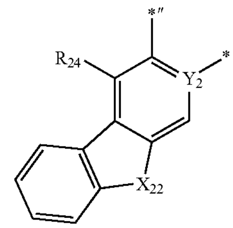
CY2(62)
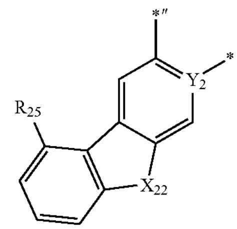
CY2(63)
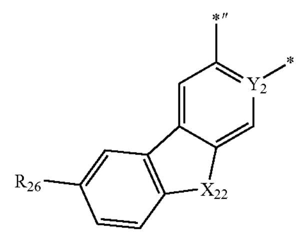
CY2(64)
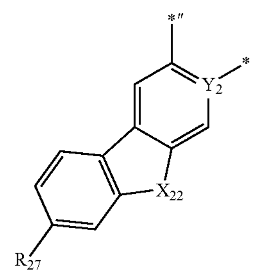
CY2(65)
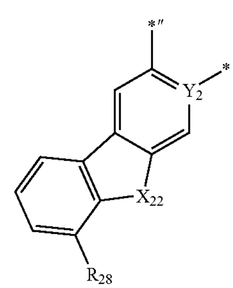
CY2(66)
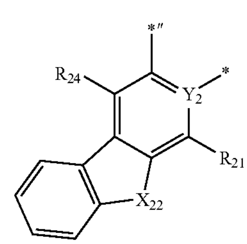

-continued
CY2(67)
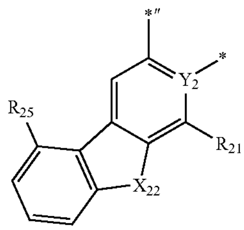
CY2(68)
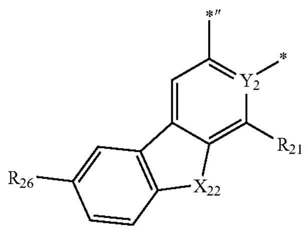
CY2(69)
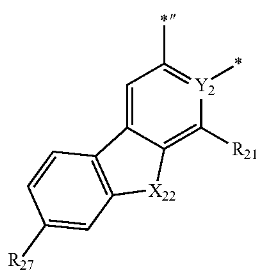
CY2(70)
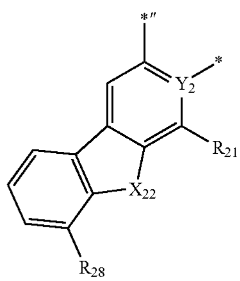
CY2(71)
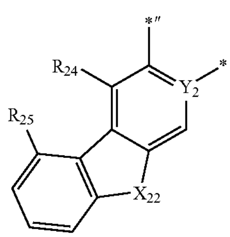
CY2(72)
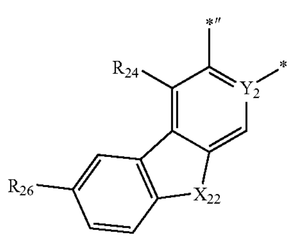
-continued
CY2(73)
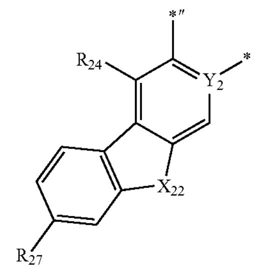
CY2(74)
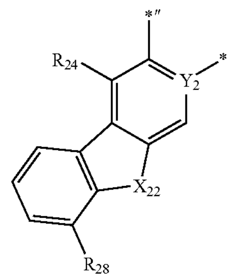
CY2(75)
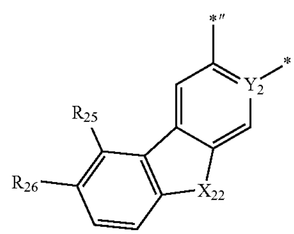
CY2(76)
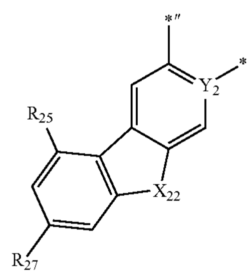
CY2(77)
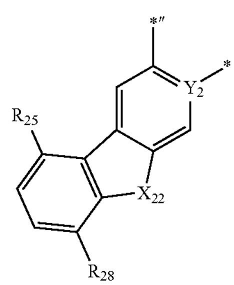
CY2(78)
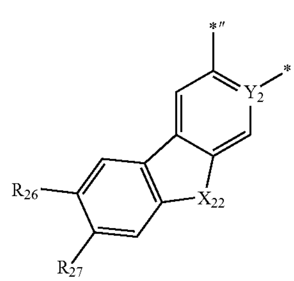

-continued
CY2(79)
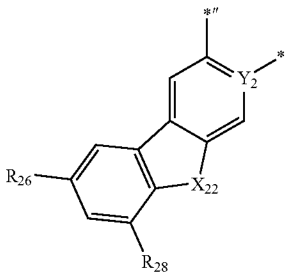
CY2(80)
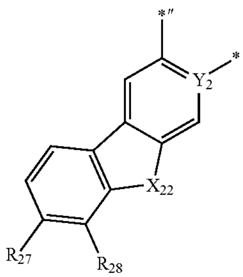
CY2(81)
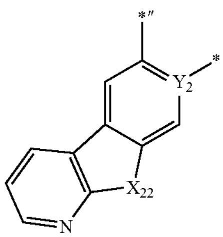
CY2(82)
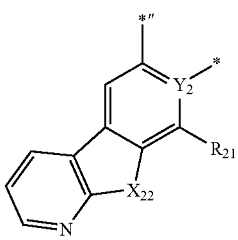
CY2(83)
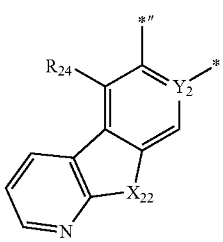
CY2(84)
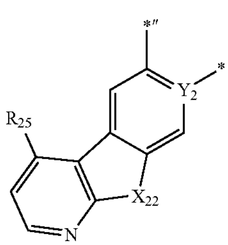
-continued
CY2(85)
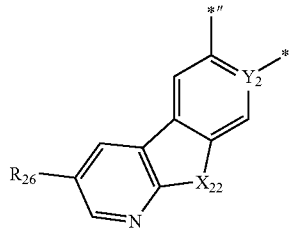
CY2(86)
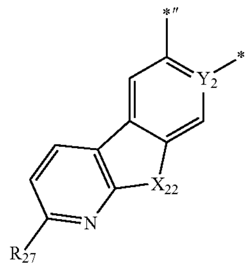
CY2(87)
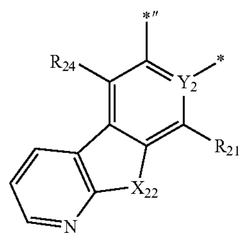
CY2(88)
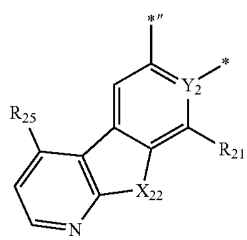
CY2(89)
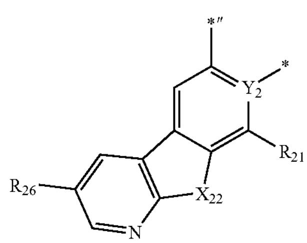
CY2(90)
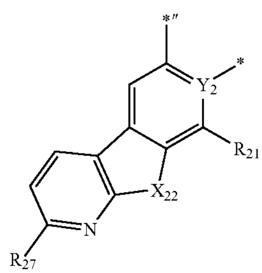

-continued
CY2(91)
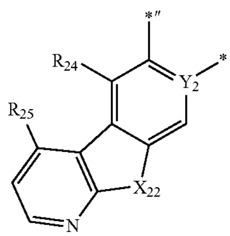
CY2(92)
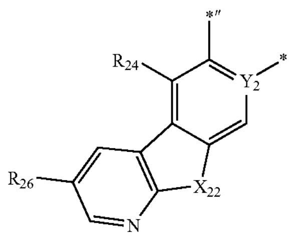
CY2(93)
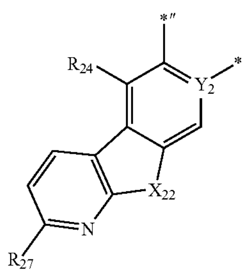
CY2(94)
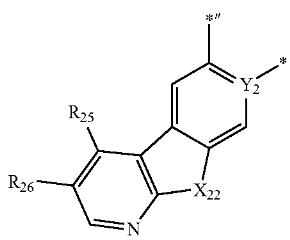
CY2(95)
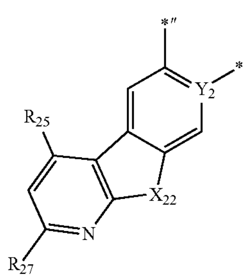
CY2(96)
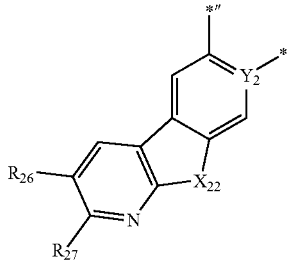
-continued
CY2(1)Z
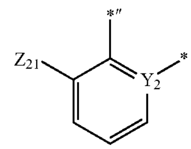
CY2(2)Z
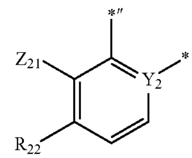
CY2(3)Z
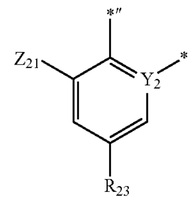
CY2(4)Z
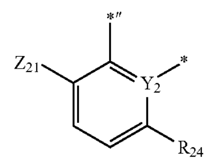
CY2(5)Z
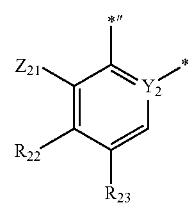
CY2(6)Z
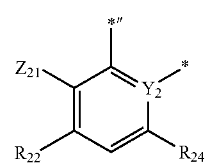
CY2(7)Z
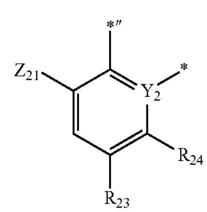
CY2(8)Z
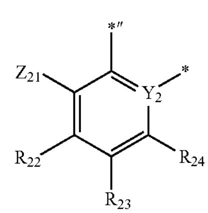

-continued
CY2(9)Z
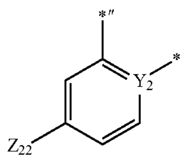
CY2(10)Z
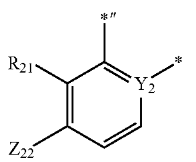
CY2(11)Z
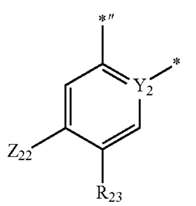
CY2(12)Z
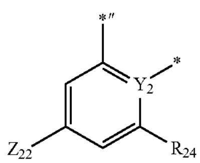
CY2(13)Z
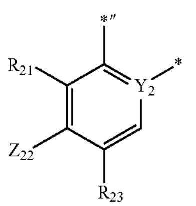
CY2(14)Z
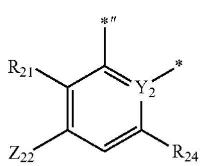
CY2(15)Z
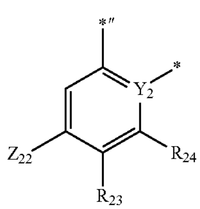
CY2(16)Z
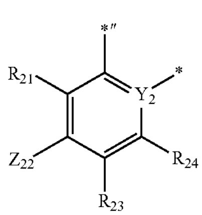
-continued
CY2(17)Z
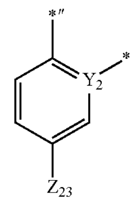
CY2(18)Z
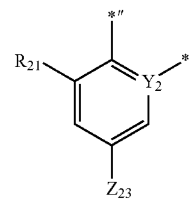
CY2(19)Z
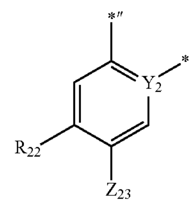
CY2(20)Z
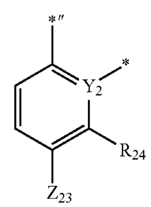
CY2(21)Z
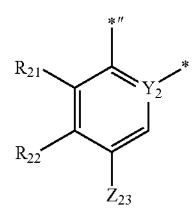
CY2(22)Z
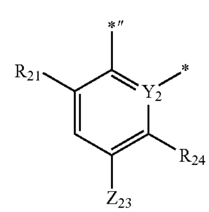
CY2(23)Z
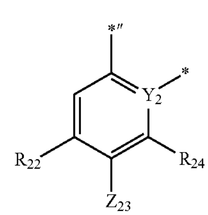

CY2(24)Z
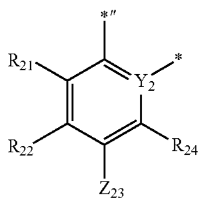
CY2(25)Z
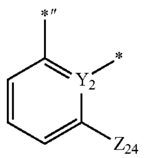
CY2(26)Z
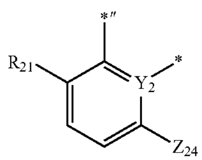
CY2(27)Z
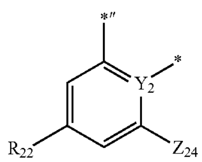
CY2(28)Z
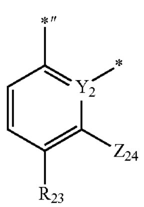
CY2(29)Z
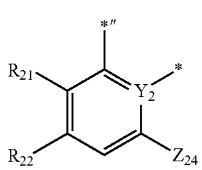
CY2(30)Z
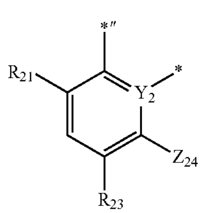
CY2(31)Z
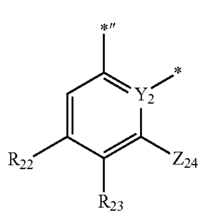
CY2(32)Z
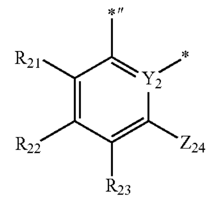
CY2(33)Z
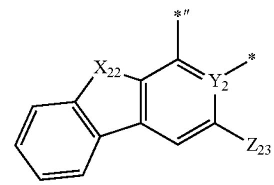
CY2(34)Z
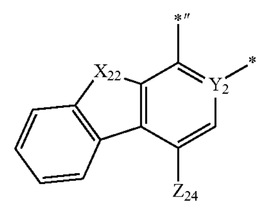
CY2(35)Z
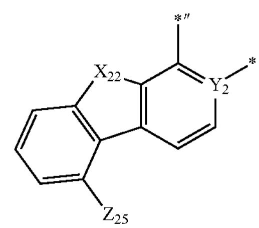
CY2(36)Z
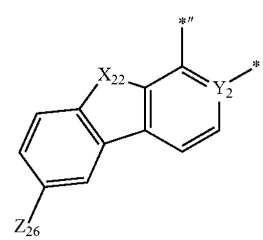
CY2(37)Z
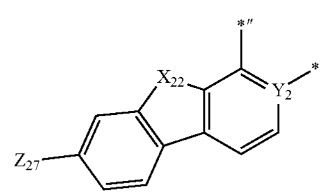
CY2(38)Z
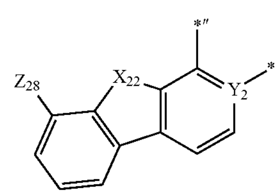
CY2(39)Z
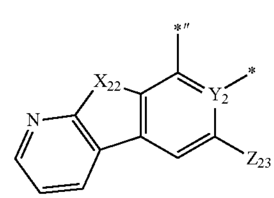

CY2(40)Z
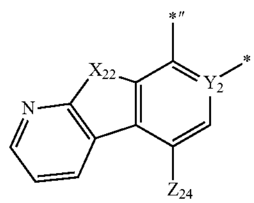
CY2(41)Z
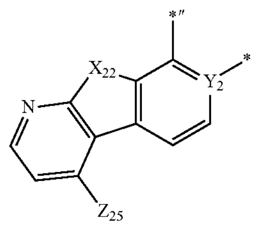
CY2(42)Z
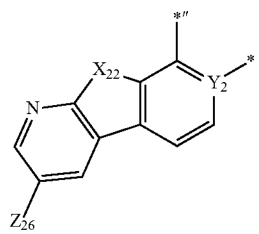
CY2(43)Z
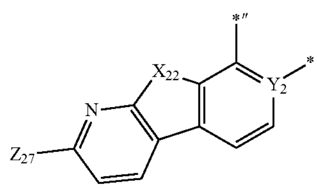
CY2(44)Z
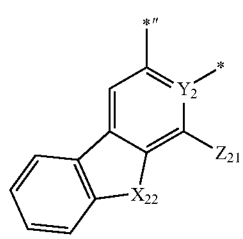
CY2(45)Z
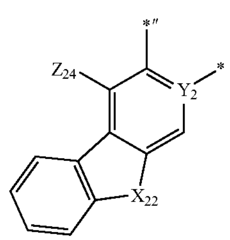
CY2(46)Z
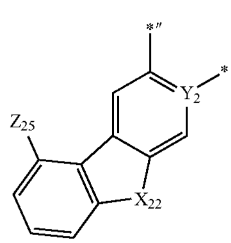
CY2(47)Z
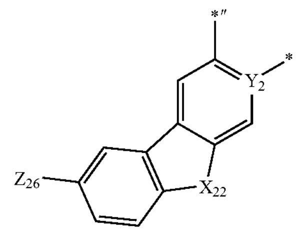
CY2(48)Z
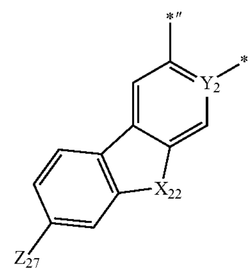
CY2(49)Z
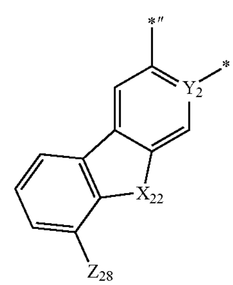
CY2(50)Z
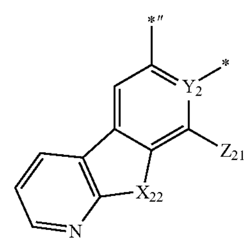
CY2(51)Z
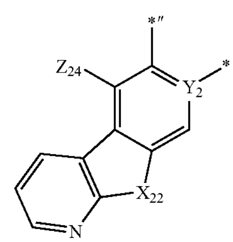
CY2(52)Z
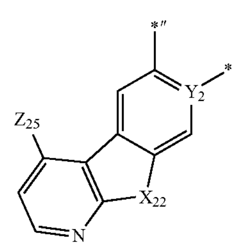

-continued

CY2(53)Z

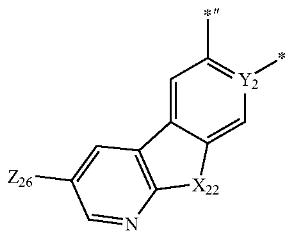

CY2(54)Z

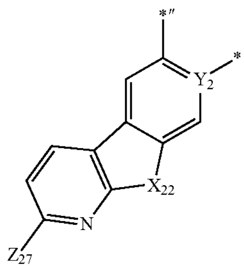

wherein, in Formulae CY2(1) to CY2(96) and CY2(1)Z to CY2(54)Z, $Y_2$ may be the same as described in the present specification, $X_{22}$ may be $C(R_{29a})(R_{29b})$, $N(R_{29a})$, O, S, Se, or $Si(R_{29a})(R_{29b})$, $R_{21}$ to $R_{28}$, $R_{29a}$, and $R_{29b}$ may each be the same as described in connection with $R_2$, and each of $R_{21}$ to $R_{28}$ may not be hydrogen, $Z_{21}$ to $Z_{28}$ may each be the same as described in connection with $Z_2$,

* indicates a binding site to M in Formula 1, and

*" indicates a binding site to ring CY1 in Formula 2.

In one or more embodiments, $L_1$ in Formula 1 may include deuterium, a fluoro group (—F), a group represented by $Si(Q_3)(Q_4)(Q_5)$, a group represented by $—Ge(Q_3)(Q_4)(Q_5)$, or a combination thereof.

In one or more embodiments, $L_2$ in Formula 1 may be a group represented by one of Formulae 4A to 4F:

4A

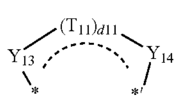

4B

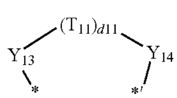

4C

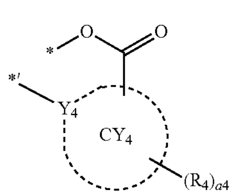

-continued

4D

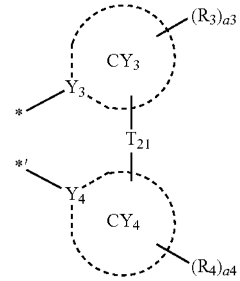

4E $*—C≡C—R_3$

4F

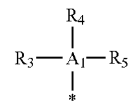

wherein, in Formulae 4A to 4F, $Y_{13}$ may be O, N, $N(R_3)$, $P(R_3)(R_4)$, or $As(R_3)(R_4)$, $Y_{14}$ may be O, N, $N(R_5)$, $P(R_5)(R_6)$, or $As(R_5)(R_6)$, $T_{11}$ may be a single bond, a double bond, $*—C(R_{31})(R_{32})—*'$, $*—C(R_{31})=C(R_{32})—*'$, $*=C(R_{31})—*'$, $*—C(R_{31})=*'$, $*=C(R_{31})—C(R_{32})=C(R_{33})—*'$, $*—C(R_{31})=C(R_{32})—C(R_{33})=*'$, $*—N(R_{31})—*'$, or a $C_5$-$C_{30}$ carbocyclic group unsubstituted or substituted with at least one $R_{31}$, $d_{11}$ may be an integer from 1 to 10, wherein, when $d_{11}$ is 2 or greater, two or more of $T_{11}$ groups may be identical to or different from each other, $Y_3$ and $Y_4$ may each independently be C or N, $T_{21}$ may be a single bond, a double bond, O, S, Se, $C(R_5)(R_6)$, $Si(R_5)(R_6)$, or $N(R_5)$, ring $CY_3$ and ring $CY_4$ may each independently be a $C_5$-$C_{30}$ carbocyclic group or a $C_1$-$C_{30}$ heterocyclic group, $A_1$ may be P or As, $R_3$ to $R_6$ and $R_{31}$ to $R_{33}$ may each be the same as described in connection with $R_1$, a3 and a4 may each independently be an integer from 0 to 20, and

* and *' each indicate a binding site to M in Formula 1.

For example, $L_2$ in Formula 1 may be a group represented by Formula 4D.

In one or more embodiments, $Y_3$, $Y_4$, ring $CY_3$, ring $CY_4$, $R_3$, $R_4$, a3, and a4 in Formulae 4C and/or 4D may each be the same as described in connection with $Y_1$, $Y_2$, ring CY1, ring $CY_2$, $R_1$, $R_2$, a1, and a2 in Formula 2, respectively.

In one or more embodiments, in Formula 4D, $Y_3$ may be N, and $Y_4$ may be C.

In one or more embodiments, in Formula 4D, $T_{21}$ may be a single bond.

In one or more embodiments, at least one of $R_3$ groups in the number of a3 in Formula 4D may be: deuterium; —F; a $C_1$-$C_{20}$ alkyl group or a $C_3$-$C_{10}$ cycloalkyl group, each unsubstituted or substituted with deuterium, —F, $C_1$-$C_{10}$ alkyl group, or a combination thereof; a group represented by $—Si(Q_3)(Q_4)(Q_5)$; or a group represented by $—Ge(Q_3)(Q_4)(Q_5)$, wherein $Q_3$ to $Q_5$ are defined the same as $Q_3$ to $Q_5$ occurred in the definition of $R_1$ and $R_2$ in Formula 2.

In one or more embodiments, at least one of $R_4$ groups in the number of a4 in Formulae 4C and 4D may be: deuterium; —F; or a $C_1$-$C_{20}$ alkyl group or a $C_3$-$C_{10}$ cycloalkyl group, each unsubstituted or substituted with deuterium, —F, a $C_1$-$C_{10}$ alkyl group, or a combination thereof.
In one or more embodiments, a group represented by
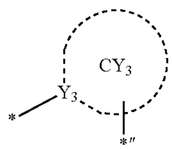
in Formula 4D may be a group represented by one of Formulae CY3-1 to CY3-42:
CY3-1
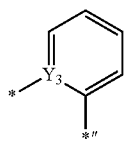
CY3-2
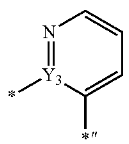
CY3-3
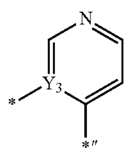
CY3-4
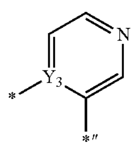
CY3-5
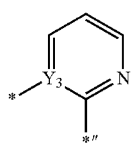
CY3-6
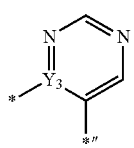
CY3-7
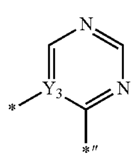
CY3-8
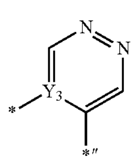
-continued
CY3-9
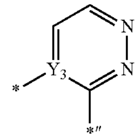
CY3-10
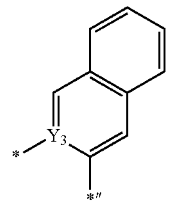
CY3-11
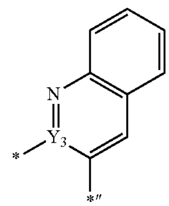
CY3-12
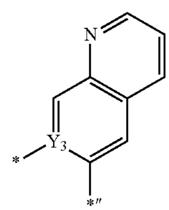
CY3-13
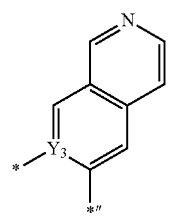
CY3-14
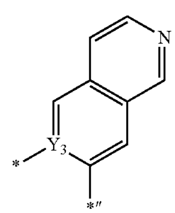
CY3-15
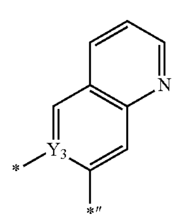

-continued
CY3-16
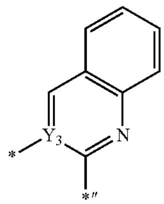
CY3-17
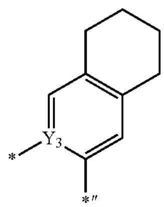
CY3-18
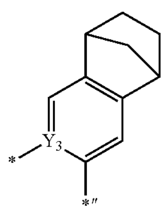
CY3-19
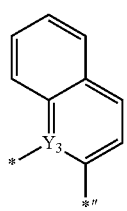
CY3-20
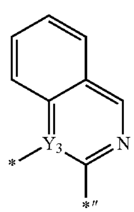
CY3-21
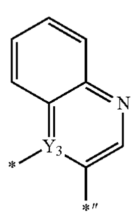
CY3-22
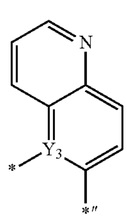
-continued
CY3-23
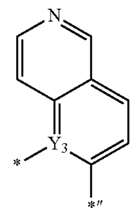
CY3-24
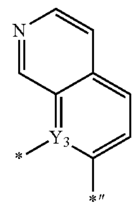
CY3-25
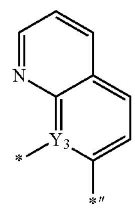
CY3-26
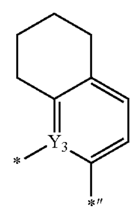
CY3-27
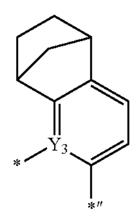
CY3-28
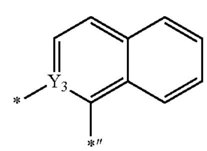
CY3-29
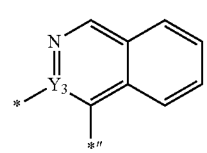
CY3-30
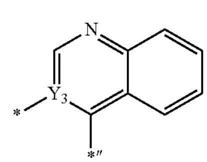

-continued

CY3-31

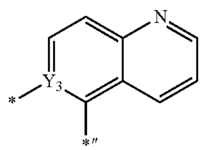

CY3-32

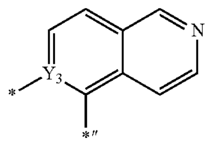

CY3-33

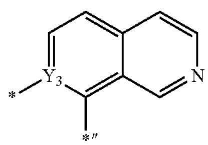

CY3-34

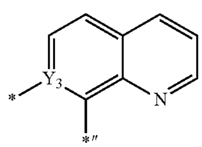

CY3-35

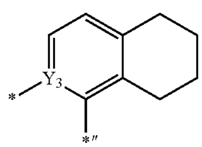

CY3-36

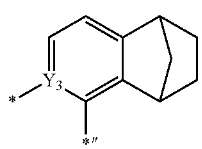

CY3-37

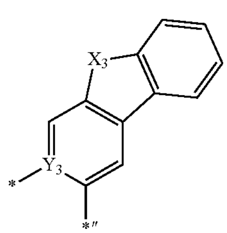

CY3-38

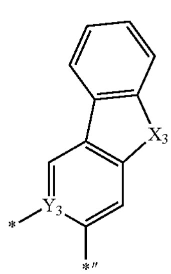

-continued

CY3-39

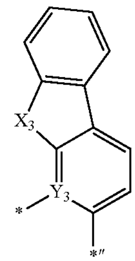

CY3-40

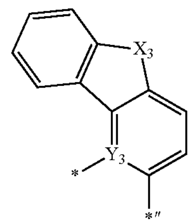

CY3-41

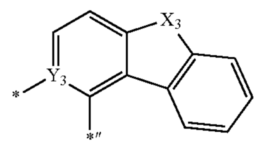

CY3-42

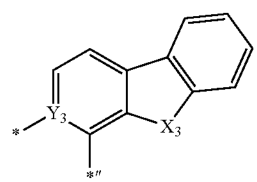

wherein, in Formulae CY3-1 to CY3-42, $Y_3$ may be the same as described in the present specification, $X_3$ may be O, S, Se, or a moiety including N, C, or Si,

* indicates a binding site to M in Formula 1, and

*" indicates a binding site to $T_{21}$ in Formula 4D.

In one or more embodiments, a group represented by

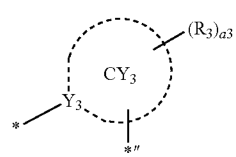

in Formula 4D may be a group represented by one of Formulae CY3-10 to CY3-42.

In one or more embodiments, a group represented by

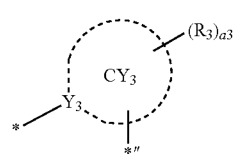

in Formula 4D may be a group represented by one of Formulae CY3(1) to CY3(16):

CY3(1)
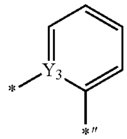

CY3(2)
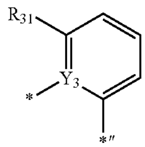

CY3(3)
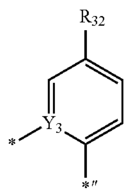

CY3(4)
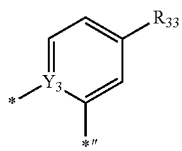

CY3(5)
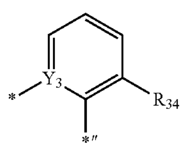

CY3(6)
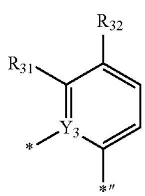

CY3(7)
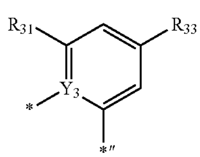

CY3(8)
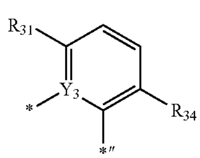

CY3(9)
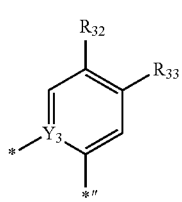

-continued

CY3(10)
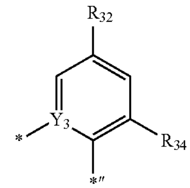

CY3(11)
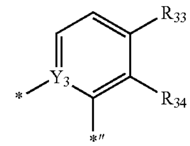

CY3(12)
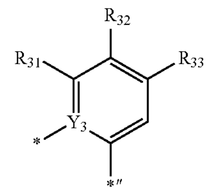

CY3(13)
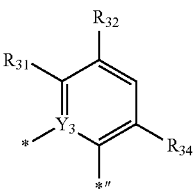

CY3(14)
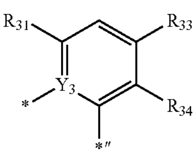

CY3(15)
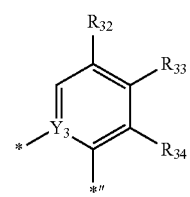

CY3(16)
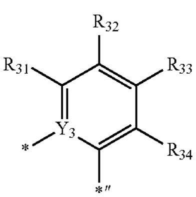

wherein, in Formulae CY3(1) to CY3(16), $Y_3$ may be the same as described in the present specification, $R_{31}$ to $R_{34}$ may each be the same as described in connection with $R_3$, provided that each of $R_{31}$ to $R_{34}$ may not be hydrogen,

* indicates a binding site to M in Formula 1, and

*" indicates a binding site to $T_{21}$ in Formula 4D.

For example, Formulae CY3(1) to CY3(16) may satisfy:

i) one of Condition 3-1-1 and Condition 3-1-2, ii) Condition 3-2, or iii) one of Condition 3-1-1 and Condition 3-1-2 as well as Condition 3-2:

Condition 3-1-1:

$R_{32}$ is hydrogen;

Condition 3-1-2:

$R_{32}$ is deuterium; —F; a $C_1$-$C_{20}$ alkyl group or a $C_3$-$C_{10}$ cycloalkyl group, each unsubstituted or substituted with deuterium, —F, a $C_1$-$C_{10}$ alkyl group, or a combination thereof; a group represented by —Si($Q_3$)($Q_4$)($Q_5$); or a group represented by —Ge($Q_3$)($Q_4$)($Q_5$), wherein $Q_3$ to $Q_5$ are defined the same as $Q_3$ to $Q_5$ occurred in the deficition of $R_3$;

Condition 3-2:

$R_{33}$ includes two or more carbon atoms (for example, $R_{33}$ is a $C_2$-$C_{20}$ alkyl group, a $C_3$-$C_{10}$ cycloalkyl group, a phenyl group, or a biphenyl group, each unsubstituted or substituted with deuterium, —F, a $C_1$-$C_{10}$ alkyl group, or a combination thereof).

In one or more embodiments, a group represented by

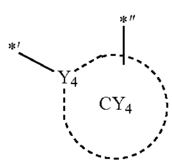

in Formulae 4C and 4D may be a group represented by one of Formulae CY4-1 to CY4-14, or may be a group represented by one of Formulae CY2-15 to CY2-64 that satisfy one of Condition 4-1 to Condition 4-6:

CY4-1

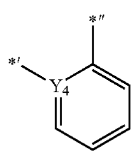

CY4-2

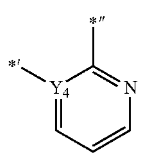

CY4-3

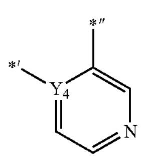

CY4-4

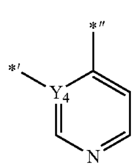

CY4-5

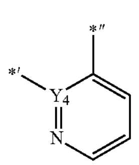

-continued

CY4-6

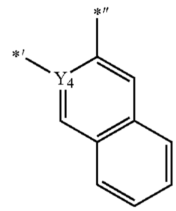

CY4-7

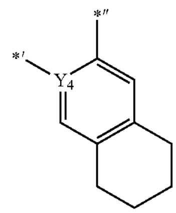

CY4-8

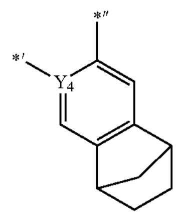

CY4-9

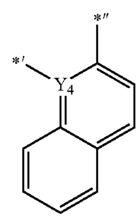

CY4-10

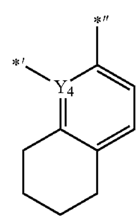

CY4-11

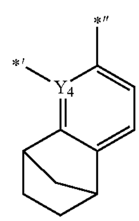

CY4-12

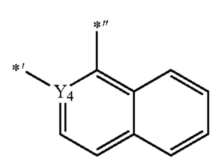

CY4-13

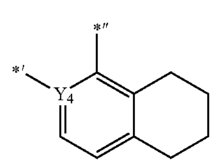

-continued

CY4-14

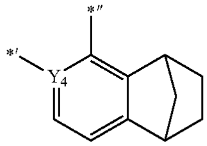

wherein, in Formulae CY4-1 to CY4-14, $Y_4$ may be the same as described in the present specification, $X_2$ and $X_{2a}$ may each independently be O, S, Se, or a moiety including N, C, or Si,

*' in Formulae CY4-1 to CY4-14 indicates a binding site to M in Formula 1,

*" in Formulae CY4-1 to CY4-14 indicates a binding site to a neighboring atom in Formula 4C or a binding site to $T_{21}$ in Formula 4D, and Condition 4-1 to Condition 4-6 are as follows:

Condition 4-1:

$A_1$ is $Y_4$, $A_2$ indicates a binding site to a neighboring atom in Formula 4C or a binding site to $T_{21}$ in Formula 4D, and $A_3$ and $A_4$ are each independently N or C;

Condition 4-2:

$A_2$ is $Y_4$, $A_3$ indicates a binding site to a neighboring atom in Formula 4C or a binding site to $T_{21}$ in Formula 4D, and $A_1$ and $A_4$ are each independently N or C Condition 4-3:

$A_3$ is $Y_4$, $A_4$ indicates a binding site to a neighboring atom in Formula 4C or a binding site to $T_{21}$ in Formula 4D, and $A_1$ and $A_2$ are each independently N or C;

Condition 4-4:

$A_4$ is $Y_4$, $A_3$ indicates a binding site to a neighboring atom in Formula 4C or a binding site to $T_{21}$ in Formula 4D, and $A_1$ and $A_2$ are each independently N or C;

Condition 4-5:

$A_3$ is $Y_4$, $A_2$ indicates a binding site to a neighboring atom in Formula 4C or a binding site to $T_{21}$ in Formula 4D, and $A_1$ and $A_4$ are each independently N or C;

Condition 4-6:

$A_2$ is $Y_4$, $A_1$ indicates a binding site to a neighboring atom in Formula 4C or a binding site to $T_{21}$ in Formula 4D, and $A_3$ and $A_4$ are each independently N or C.

In one or more embodiments, a group represented by

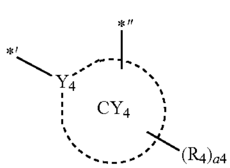

in Formulae 4C and 4D may be a group represented by one of Formulae CY4-6 to CY4-14, or may be a group represented by one of Formulae CY2-23 to CY2-64 that satisfy one of Condition 4-1 to Condition 4-6.

In one or more embodiments, a group represented by

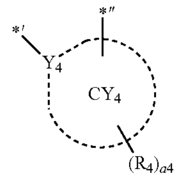

in Formula 4D may be a group represented by one of Formulae CY4(1) to CY4(96):

CY4(1)

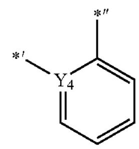

CY4(2)

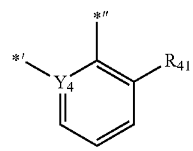

CY4(3)

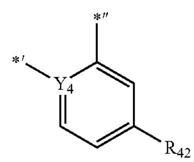

CY4(4)

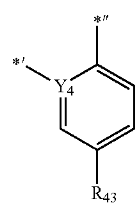

CY4(5)

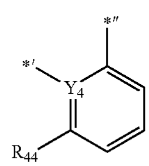

CY4(6)

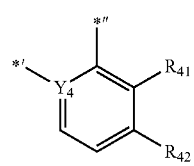

CY4(7)

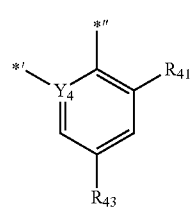

-continued
CY4(8)
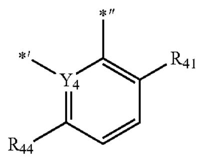
CY4(9)
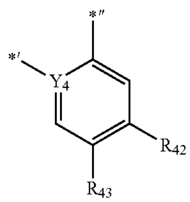
CY4(10)
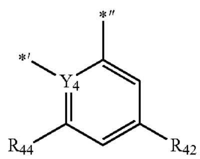
CY4(11)
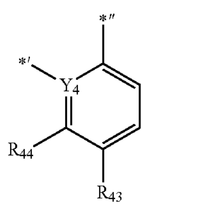
CY4(12)
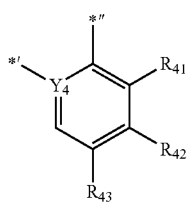
CY4(13)
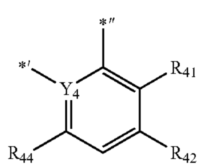
CY4(14)
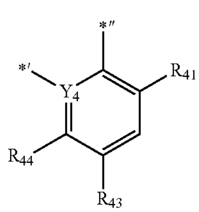
CY4(15)
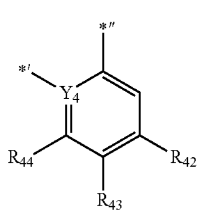
-continued
CY4(16)
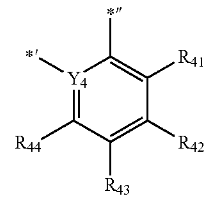
CY4(17)
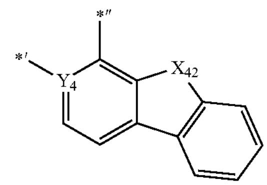
CY4(18)
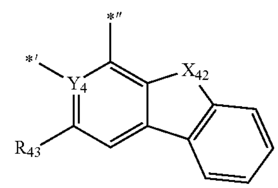
CY4(19)
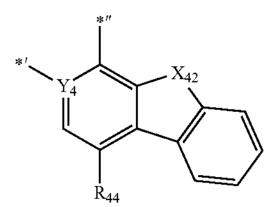
CY4(20)
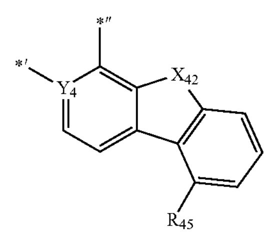
CY4(21)
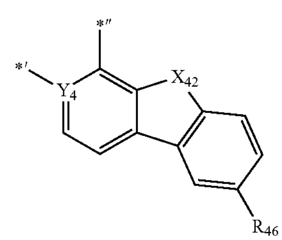
CY4(22)
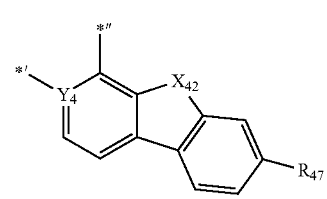

-continued
CY4(23)
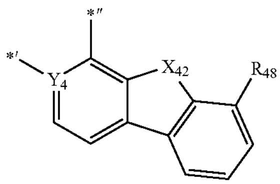
CY4(24)
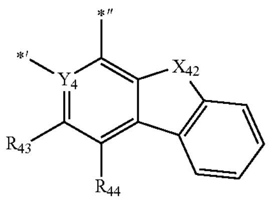
CY4(25)
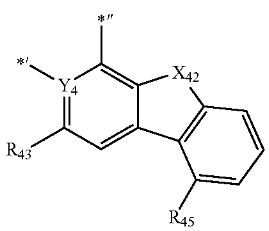
CY4(26)
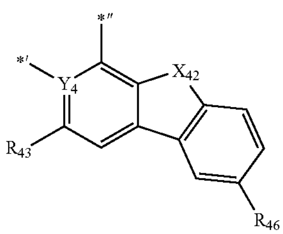
CY4(27)
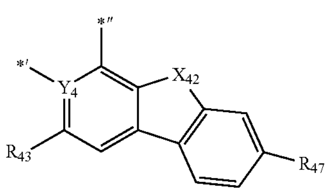
CY4(28)
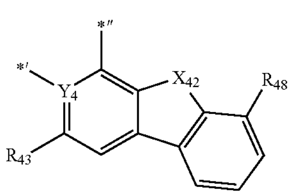
CY4(29)
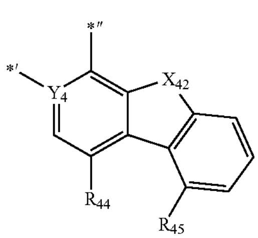
-continued
CY4(30)
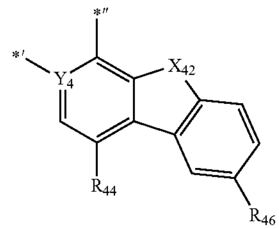
CY4(31)
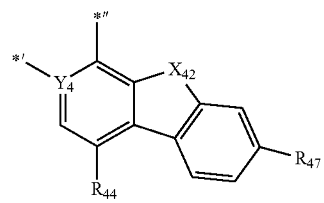
CY4(32)
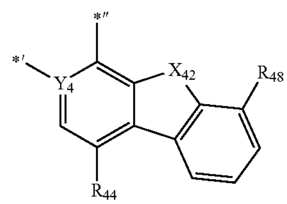
CY4(33)
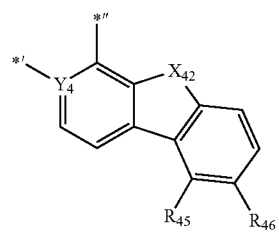
CY4(34)
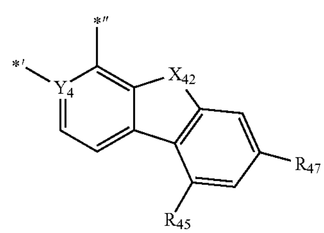
CY4(35)
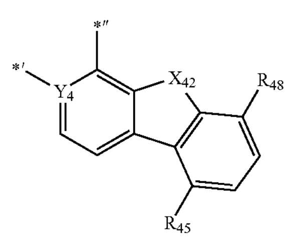
CY4(36)
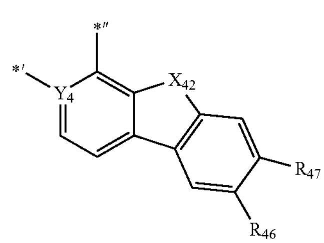

CY4(37)
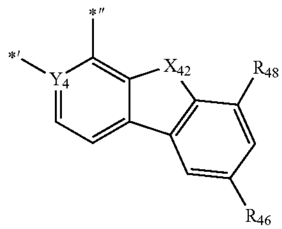
CY4(38)
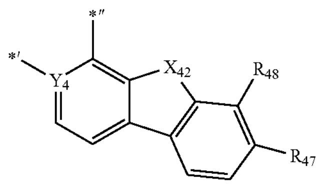
CY4(39)
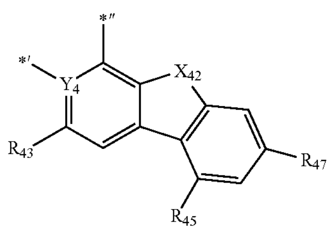
CY4(40)
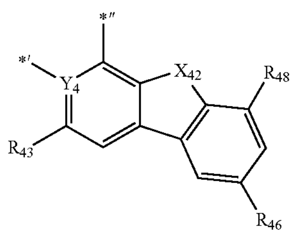
CY4(41)
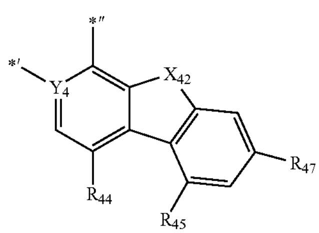
CY4(42)
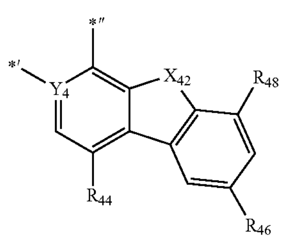
CY4(43)
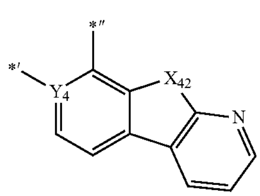
CY4(44)
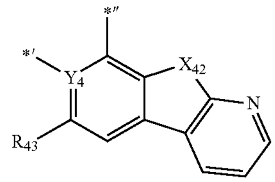
CY4(45)
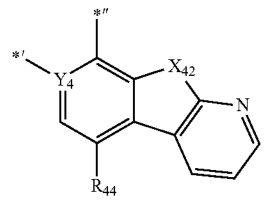
CY4(46)
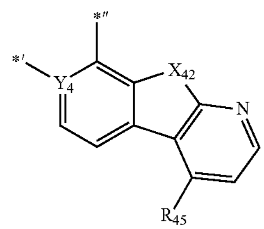
CY4(47)
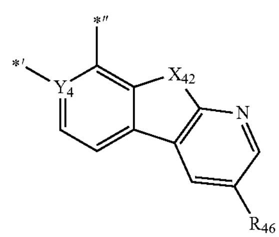
CY4(48)
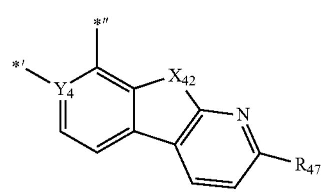
CY4(49)
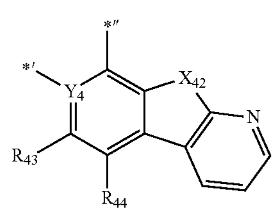
CY4(50)
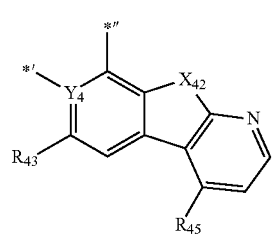

CY4(51)
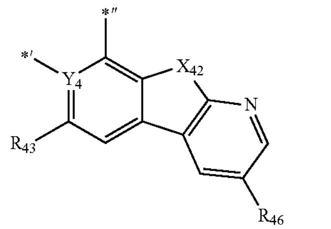
CY4(52)
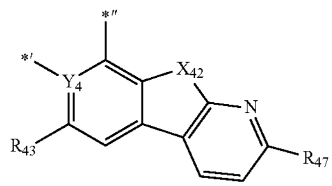
CY4(53)
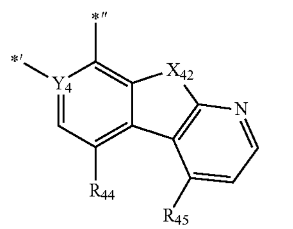
CY4(54)
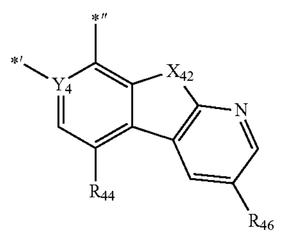
CY4(55)
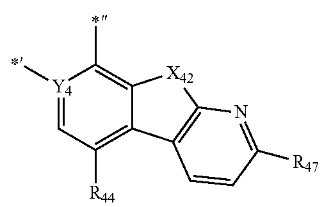
CY4(56)
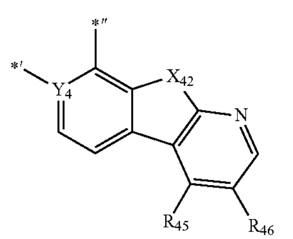
CY4(57)
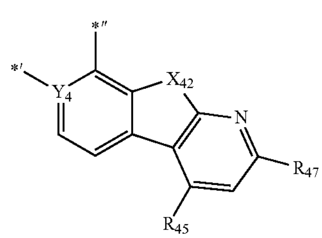
CY4(58)
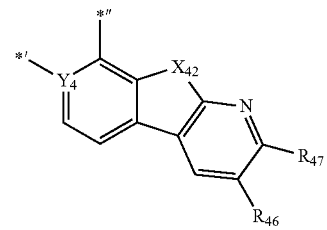
CY4(59)
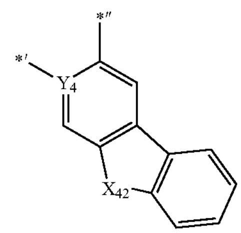
CY4(60)
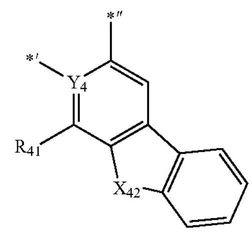
CY4(61)
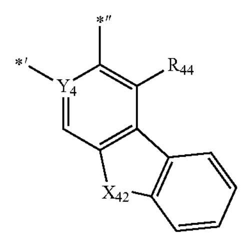
CY4(62)
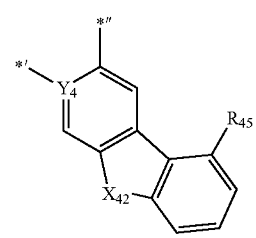
CY4(63)
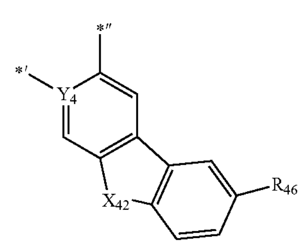

-continued
CY4(64)
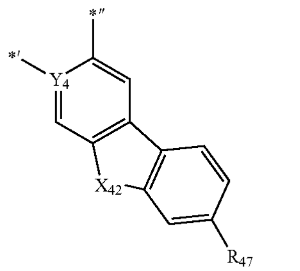
CY4(65)
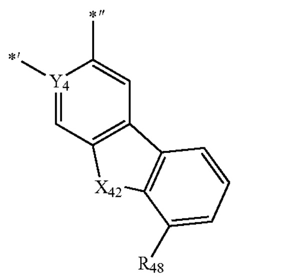
CY4(66)
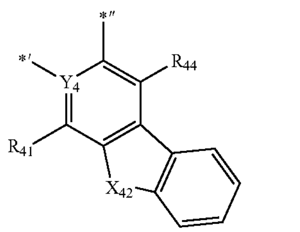
CY4(67)
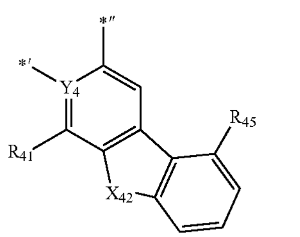
CY4(68)
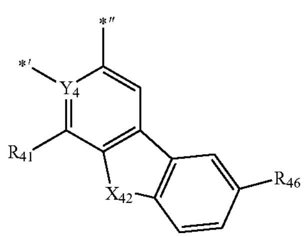
CY4(69)
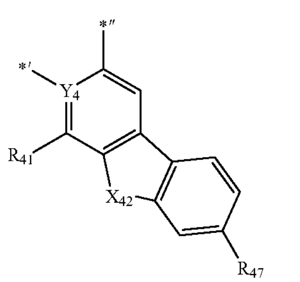
-continued
CY4(70)
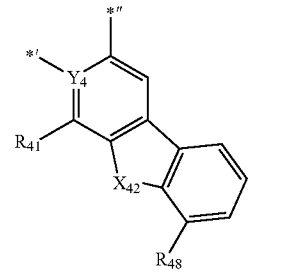
CY4(71)
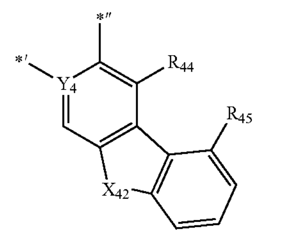
CY4(72)
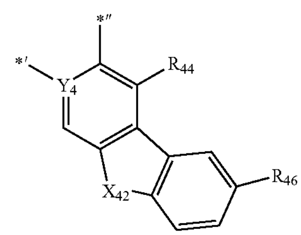
CY4(73)
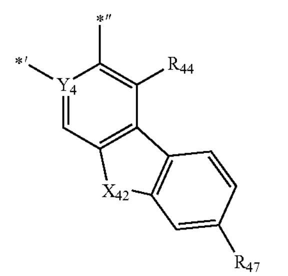
CY4(74)
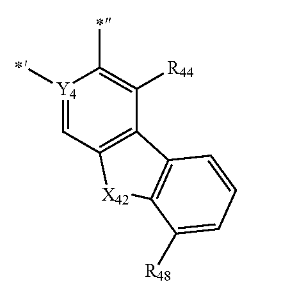
CY4(75)
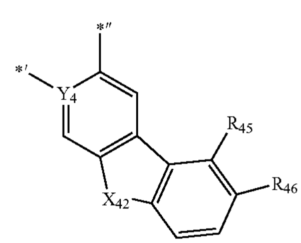

CY4(76)
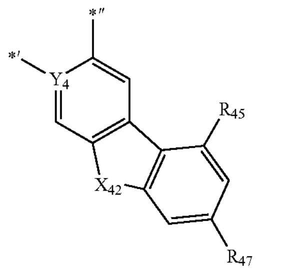
CY4(77)
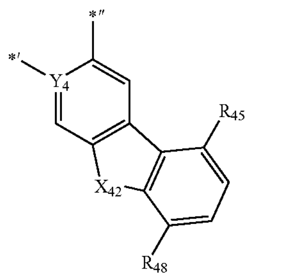
CY4(78)
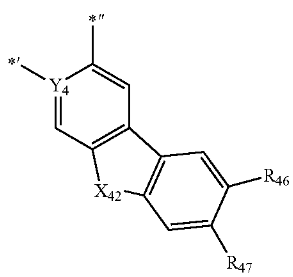
CY4(79)
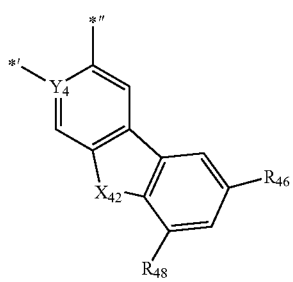
CY4(80)
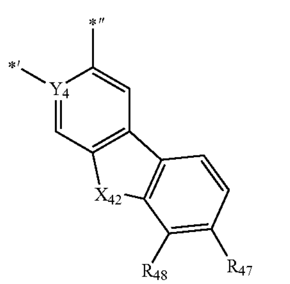
CY4(81)
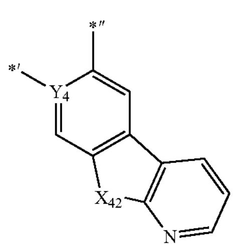
CY4(82)
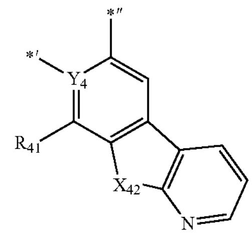
CY4(83)
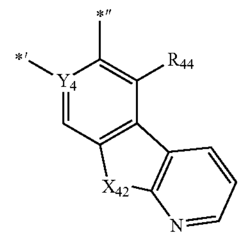
CY4(84)
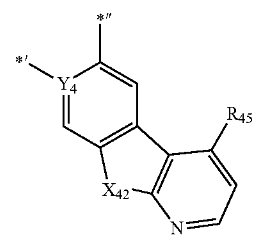
CY4(85)
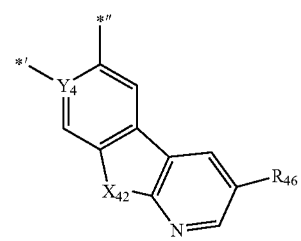
CY4(86)
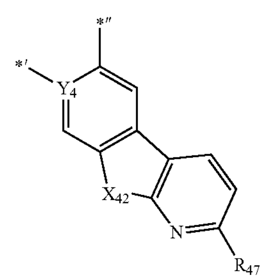
CY4(87)
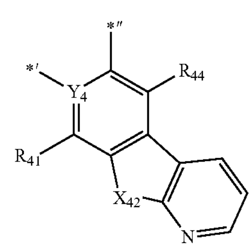

-continued

CY4(88)

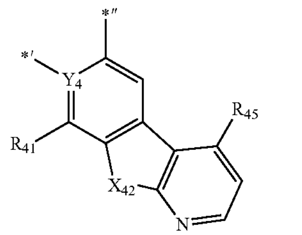

CY4(89)

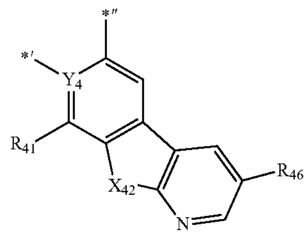

CY4(90)

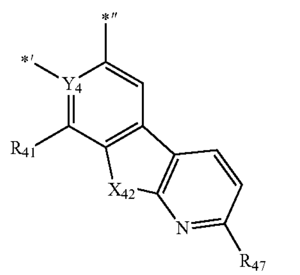

CY4(91)

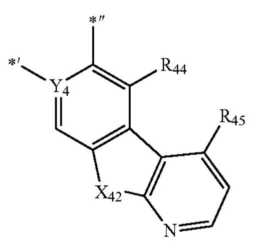

CY4(92)

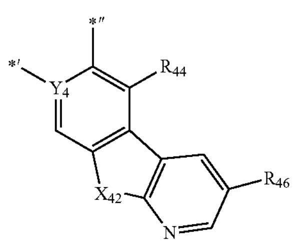

CY4(93)

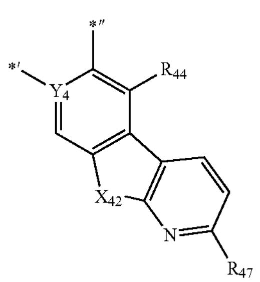

-continued

CY4(94)

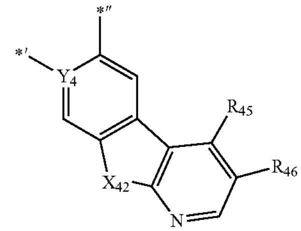

CY4(95)

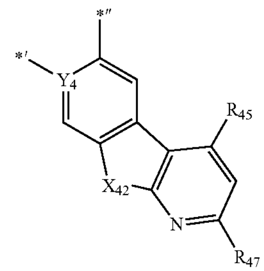

CY4(96)

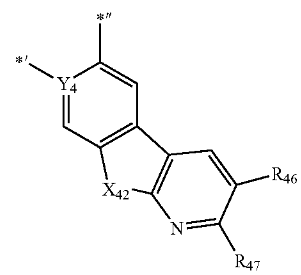

wherein, in Formulae CY4(1) to CY4(96), $Y_4$ may be the same as described in the present specification, $X_{42}$ may be $C(R_{49a})(R_{49b})$, $N(R_{49a})$, O, S, Se, or $Si(R_{49a})(R_{49b})$, $R_{41}$ to $R_{48}$, $R_{49a}$, and $R_{49b}$ are each the same as described in connection with $R_4$, and each of $R_{41}$ to $R_{48}$ may not be hydrogen,

*' indicates a binding site to M in Formula 1, and

*" indicates a binding site to a neighboring atom in Formula 4C or a binding site to $T_{21}$ in Formula 4D.

In one or more embodiments, $L_2$ in Formula 1 may include deuterium, a fluoro group (—F), a group represented by $—Si(Q_3)(Q_4)(Q_5)$, a group represented by $—Ge(Q_3)(Q_4)(Q_5)$, or a combination thereof.

In one or more embodiments, $R_1$ and $R_2$ in Formula 2 and $R_3$ to $R_6$ and $R_{31}$ to $R_{33}$ in Formulae 4A to 4F may each independently be hydrogen, deuterium, —F, a cyano group, a nitro group, $—SF_5$, $—CH_3$, $—CD_3$, $—CD_2H$, $—CDH_2$, $—CF_3$, $—CF_2H$, $—CFH_2$, $—OCH_3$, $—OCDH_2$, $—OCD_2H$, $—OCD_3$, $—SCH_3$, $—SCDH_2$, $—SCD_2H$, $—SCD_3$, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-233, a group represented by one of Formulae 9-201 to 9-233 in which at least one hydrogen is substituted with deuterium, a group represented by one of Formulae 9-201 to 9-233 in which at least one hydrogen is substituted with —F, a group represented by one of Formulae 10-1 to 10-132, a group represented by one of Formulae 10-1 to 10-132 in which at least one hydrogen is substituted with deuterium, a group represented by one of Formulae 10-1 to 10-132 in which at least one hydrogen is substituted with —F, a group represented by one of Formulae 10-201 to 10-353, a group represented by one of Formulae 10-201 to 10-353 in which at least one hydrogen is substituted with deuterium, a group represented by one of Formulae 10-201 to 10-353 in which at least one hydrogen is substituted with —F, —Si($Q_3$)($Q_4$)($Q_5$), or —Ge($Q_3$)($Q_4$)($Q_5$) (wherein $Q_1$ to $Q_5$ may each be the same as described in the present specification).

In one or more embodiments, $Q_{51}$ and $Q_{52}$ in Formula 3 may each independently be hydrogen, deuterium, —F—, a cyano group, —$CH_3$, —$CD_3$, —$CD_2H$, —$CDH_2$, —$CF_3$, —$CF_2H$, —$CFH_2$, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-233, a group represented by one of Formulae 9-201 to 9-233 in which at least one hydrogen is substituted with deuterium, a group represented by one of Formulae 9-201 to 9-233 in which at least one hydrogen is substituted with —F, a group represented by one of Formulae 10-1 to 10-132, a group represented by one of Formulae 10-1 to 10-132 in which at least one hydrogen is substituted with deuterium, a group represented by one of Formulae 10-1 to 10-132 in which at least one hydrogen is substituted with —F, a group represented by one of Formulae 10-201 to 10-353, a group represented by one of Formulae 10-201 to 10-353 in which at least one hydrogen is substituted with deuterium, or a group represented by one of Formulae 10-201 to 10-353 in which at least one hydrogen is substituted with —F.

In one or more embodiments, at least one of $Q_{51}$ and $Q_{52}$ (for example, both $Q_{51}$ and $Q_{52}$) in Formula 3 may each independently be deuterium, —F—, a cyano group, —$CH_3$, —$CD_3$, —$CD_2H$, —$CDH_2$, —$CF_3$, —$CF_2H$, —$CFH_2$, a group represented by one of Formulae 9-1 to 9-39, a group represented by one of Formulae 9-1 to 9-39 in which at least one hydrogen is substituted with deuterium, or a group represented by one of Formulae 9-1 to 9-39 in which at least one hydrogen is substituted with —F.

In one or more embodiments, $Q_{53}$ in Formula 3 may be a group represented by one of Formulae 10-12 to 10-132, a group represented by one of Formulae 10-12 to 10-132 in which at least one hydrogen is substituted with deuterium, a group represented by one of Formulae 10-12 to 10-132 in which at least one hydrogen is substituted with —F, a group represented by one of Formulae 10-201 to 10-353, a group represented by one of Formulae 10-201 to 10-353 in which at least one hydrogen is substituted with deuterium, or a group represented by one of Formulae 10-201 to 10-353 in which at least one hydrogen is substituted with —F:

9-1

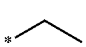

9-2

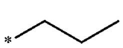

9-3

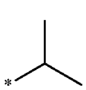

9-4

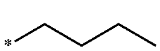

-continued 9-5

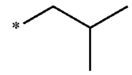

9-6

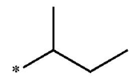

9-7

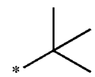

9-8

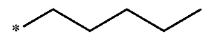

9-9

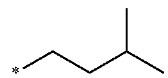

9-10

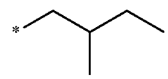

9-11

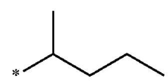

9-12

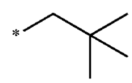

9-13

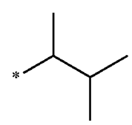

9-14

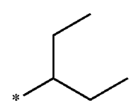

9-15

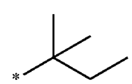

9-16

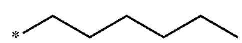

9-17

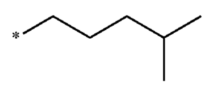

9-18

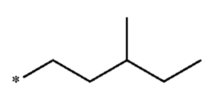

9-19

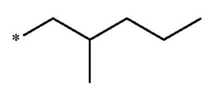

9-20

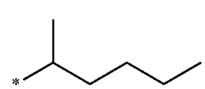

9-21

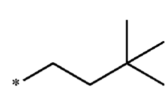

9-22

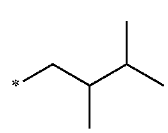

-continued
9-23
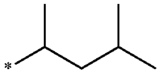
9-24
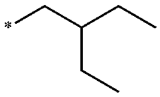
9-25
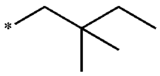
9-26
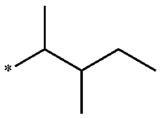
9-27
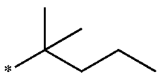
9-28
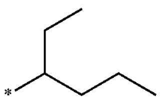
9-29
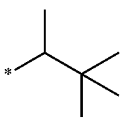
9-30
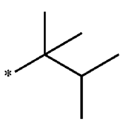
9-31
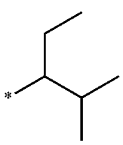
9-32
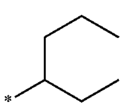
9-33
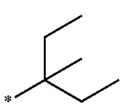
9-34
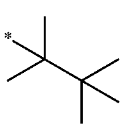
9-35
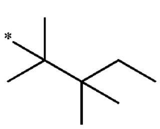
-continued
9-36
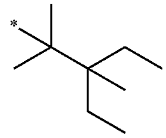
9-37
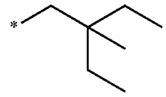
9-38
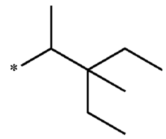
9-39
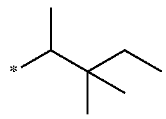
9-201
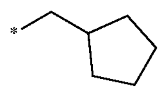
9-202
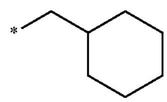
9-203
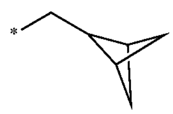
9-204
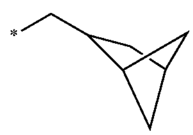
9-205
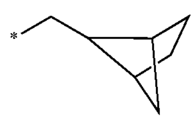
9-206
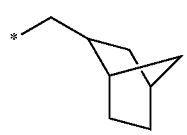
9-207
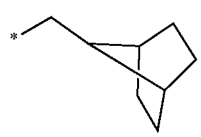
9-208
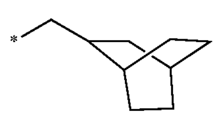

-continued
9-209
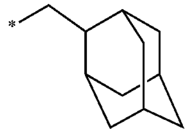
9-210
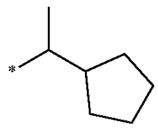
9-211
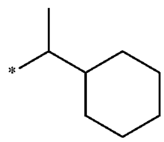
9-212
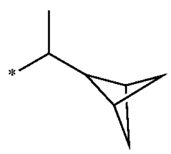
9-213
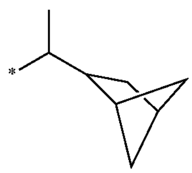
9-214
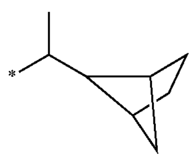
9-215
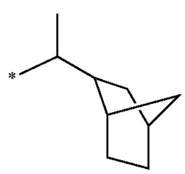
9-216
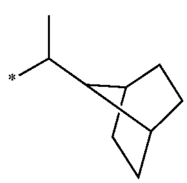
9-217
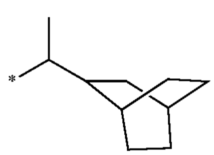
9-218
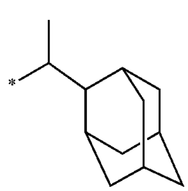
-continued
9-219
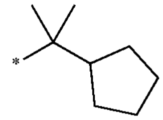
9-220
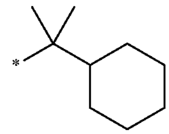
9-221
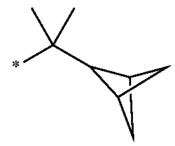
9-222
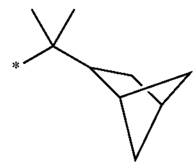
9-223
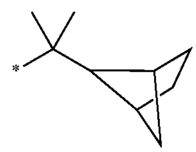
9-224
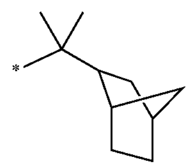
9-225
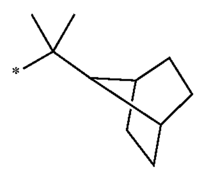
9-226
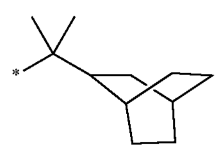
9-227
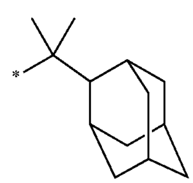
9-228
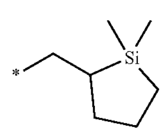

-continued
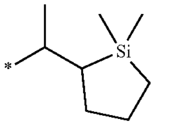
9-229
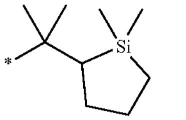
9-230
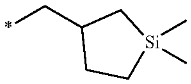
9-231
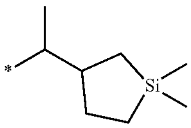
9-232
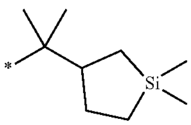
9-233
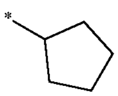
10-1
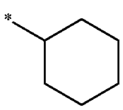
10-2
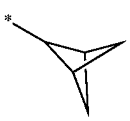
10-3
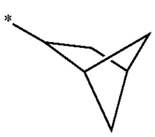
10-4
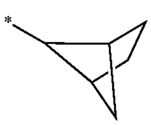
10-5
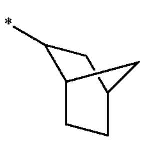
10-6
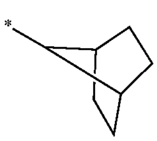
10-7
-continued
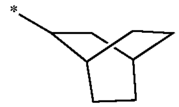
10-8
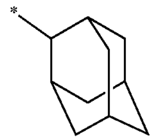
10-9
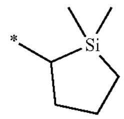
10-10
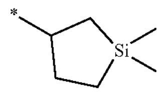
10-11
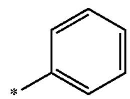
10-12
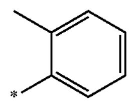
10-13
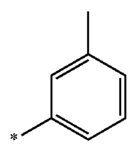
10-14
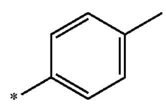
10-15
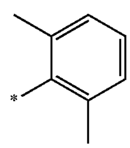
10-16
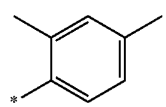
10-17
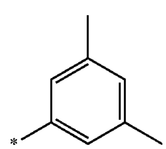
10-18
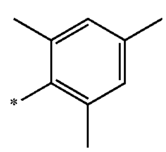
10-19

-continued
10-20
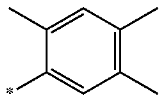
10-21
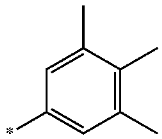
10-22
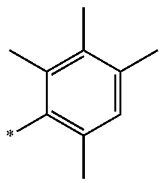
10-23
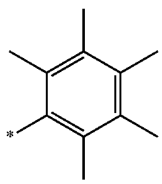
10-24
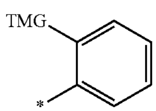
10-25
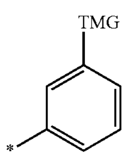
10-26
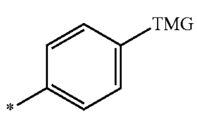
10-27
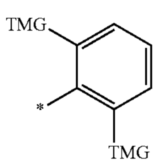
10-28
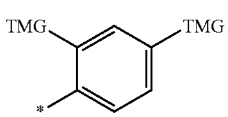
10-29
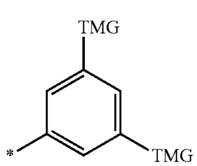
10-30
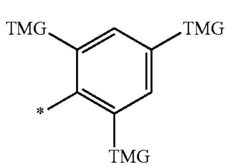
-continued
10-31
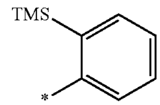
10-32
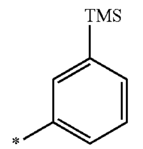
10-33
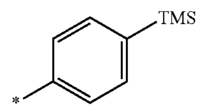
10-34
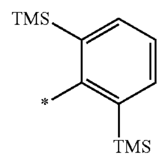
10-35
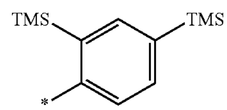
10-36
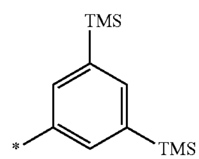
10-37
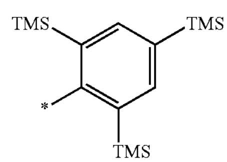
10-38
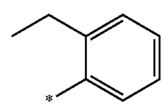
10-39
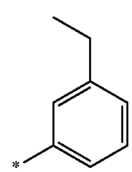
10-40
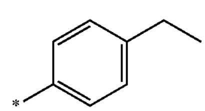
10-41
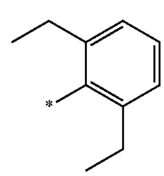

-continued
10-42
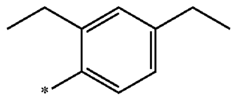
10-43
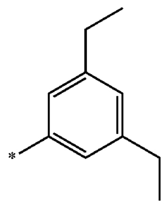
10-44
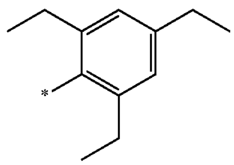
10-45
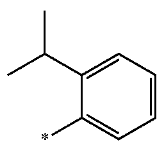
10-46
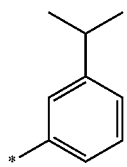
10-47
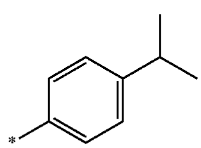
10-48
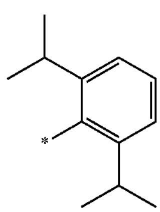
10-49
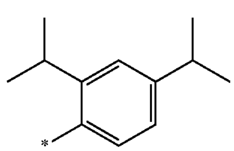
10-50
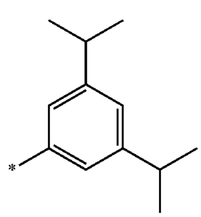
-continued
10-51
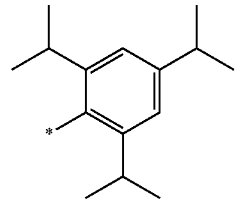
10-52
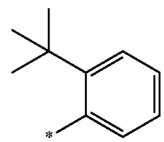
10-53
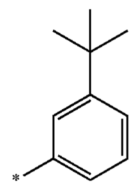
10-54
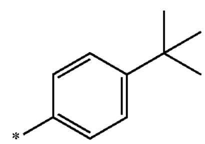
10-55
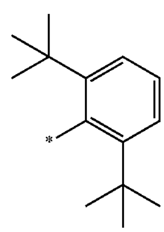
10-56
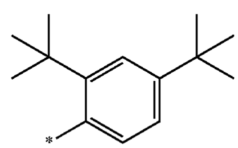
10-57
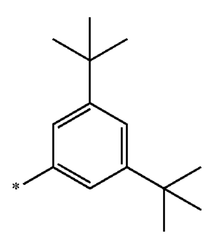
10-58
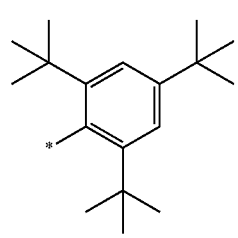

-continued
10-59
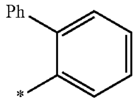
10-60
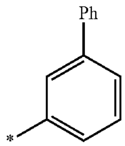
10-61
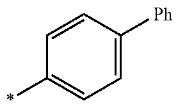
10-62
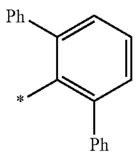
10-63
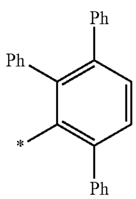
10-64
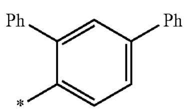
10-65
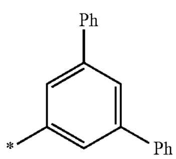
10-66
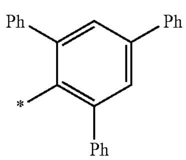
10-67
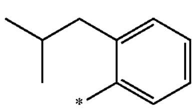
10-68
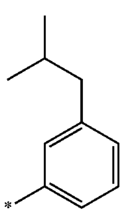
10-69
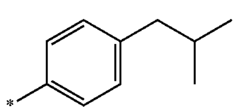
-continued
10-70
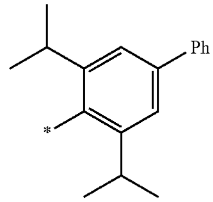
10-71
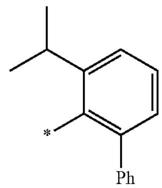
10-72
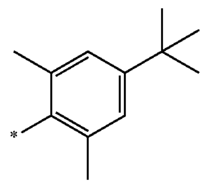
10-73
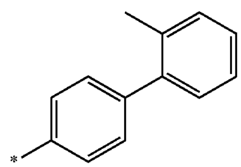
10-74
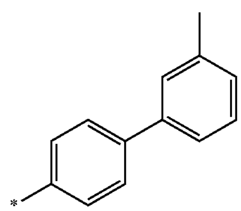
10-75
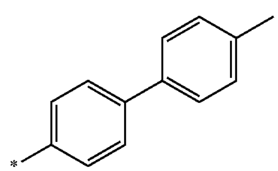
10-76
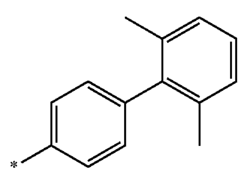
10-77
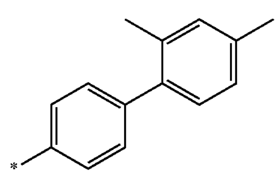

10-78
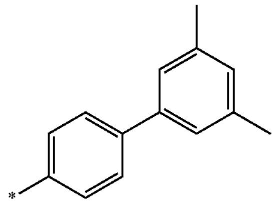
10-79
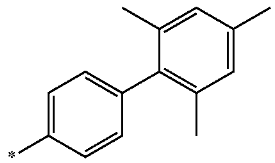
10-80
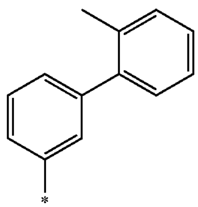
10-81
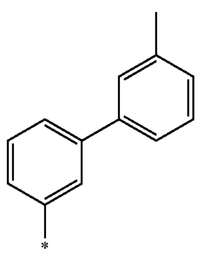
10-82
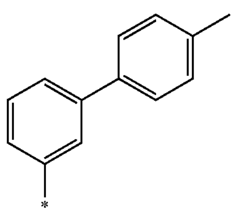
10-83
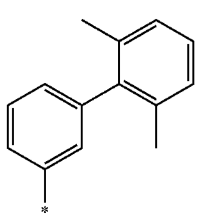
10-84
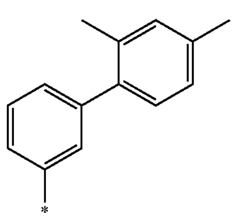
10-85
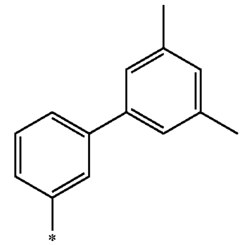
10-86
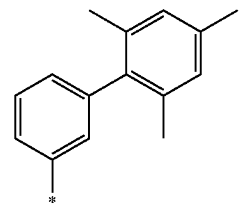
10-87
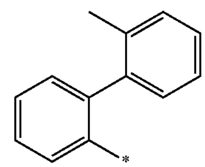
10-88
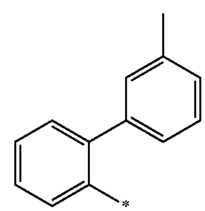
10-89
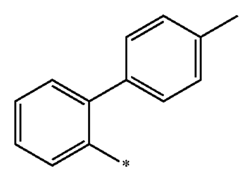
10-90
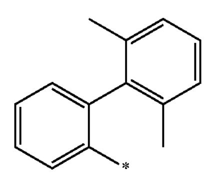
10-91
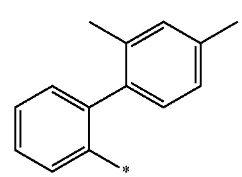
10-92
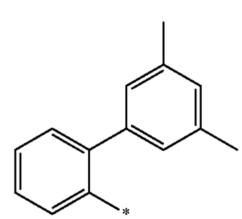

-continued
10-93
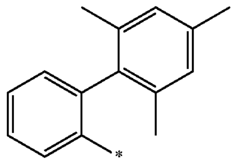
10-94
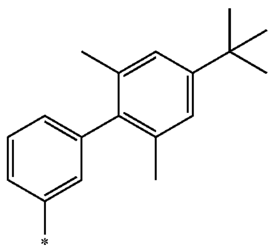
10-95
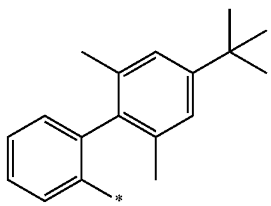
10-96
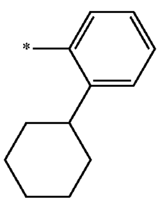
10-97
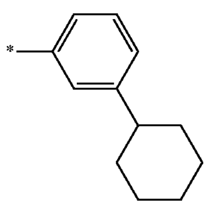
10-98
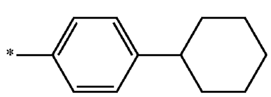
10-99
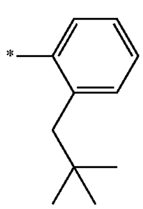
10-100
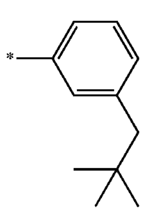
-continued
10-101
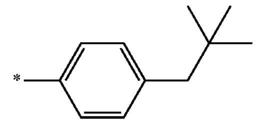
10-102
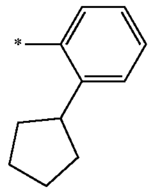
10-103
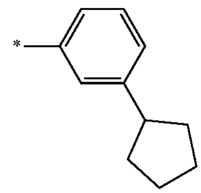
10-104
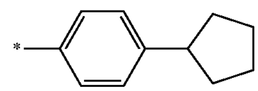
10-105
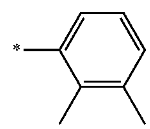
10-106
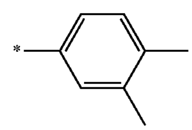
10-107
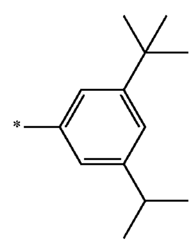
10-108
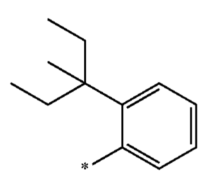
10-109
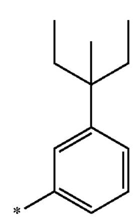

-continued
10-110
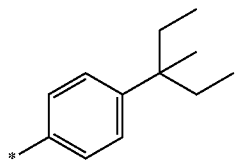
10-111
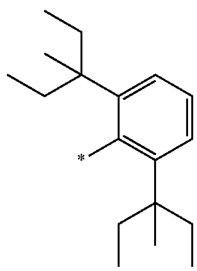
10-112
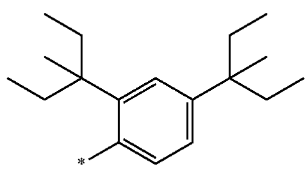
10-113
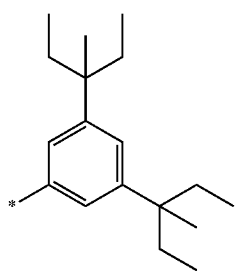
10-114
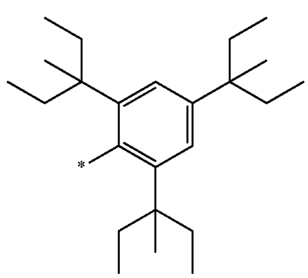
10-115
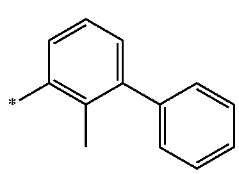
10-116
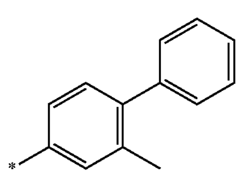
-continued
10-117
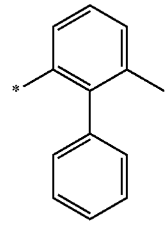
10-118
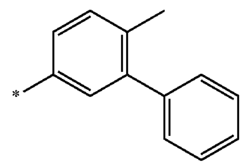
10-119
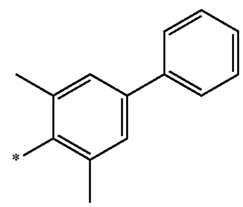
10-120
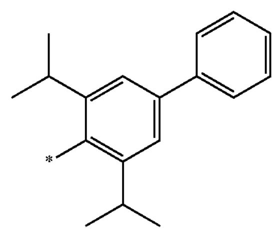
10-121
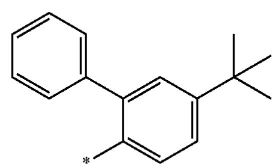
10-122
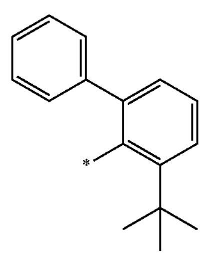
10-123
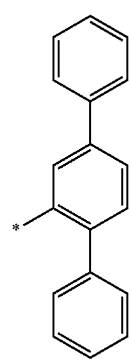

-continued
10-124
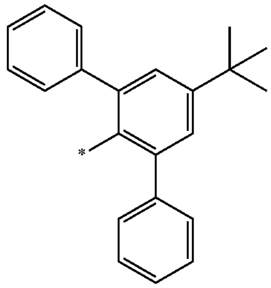
10-125
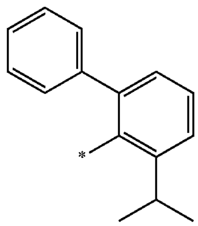
10-126
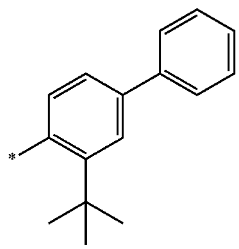
10-127
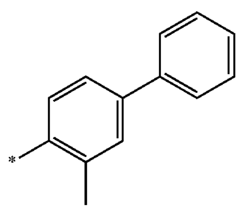
10-128
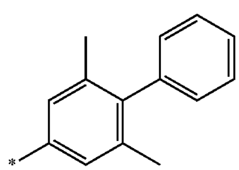
10-129
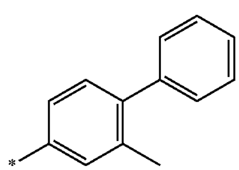
10-130
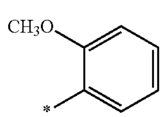
10-131
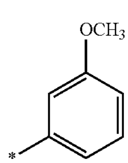
-continued
10-132
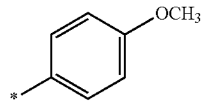
10-201
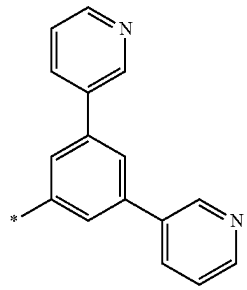
10-202
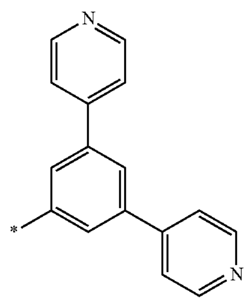
10-203
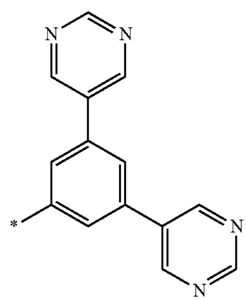
10-204
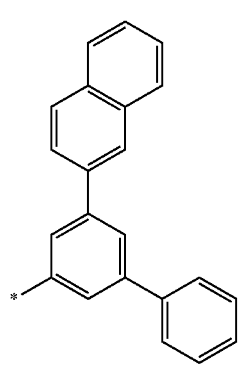

-continued
10-205
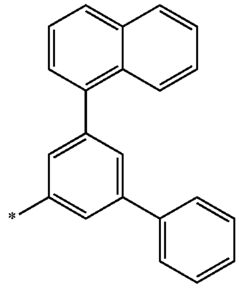
10-206
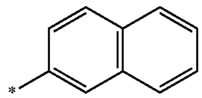
10-207
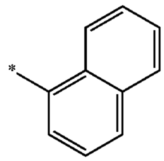
10-208
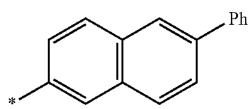
10-209
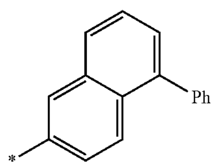
10-210
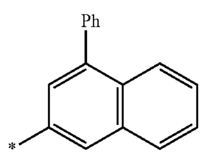
10-211
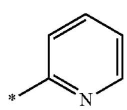
10-212
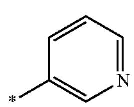
10-213
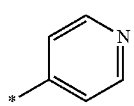
10-214
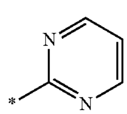
10-215
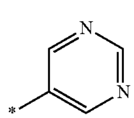
-continued
10-216
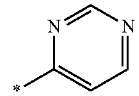
10-217
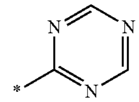
10-218
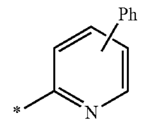
10-219
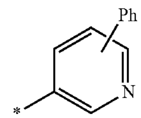
10-220
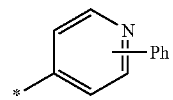
10-221
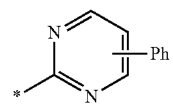
10-222
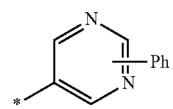
10-223
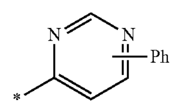
10-224
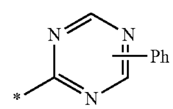
10-225
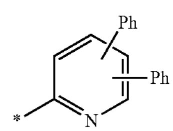
10-226
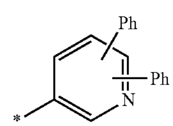
10-227
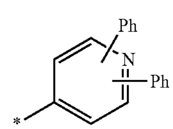
10-228
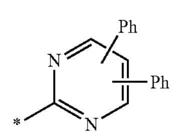

-continued
10-229
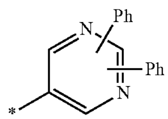
10-230
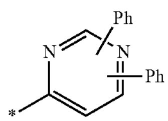
10-231
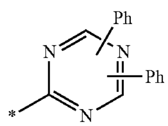
10-232
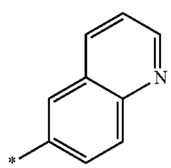
10-233
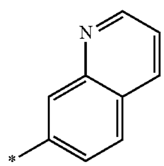
10-234
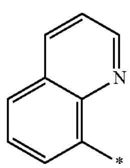
10-235
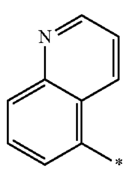
10-236
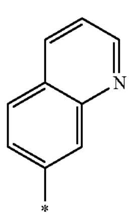
10-237
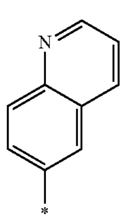
-continued
10-238
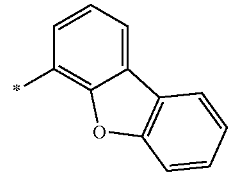
10-239
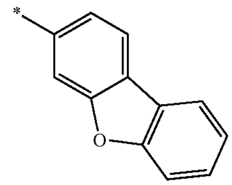
10-240
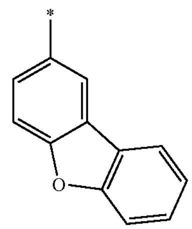
10-241
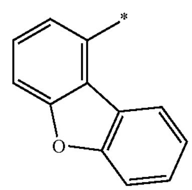
10-242
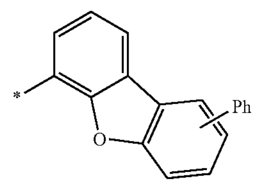
10-243
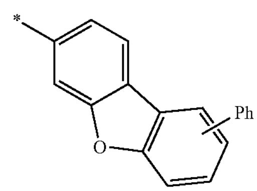
10-244
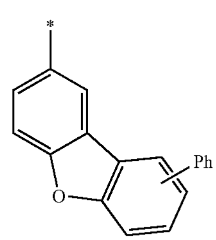
10-245
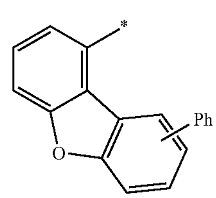

-continued
10-246
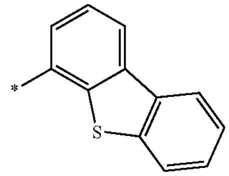
10-247
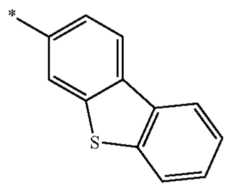
10-248
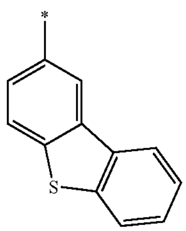
10-249
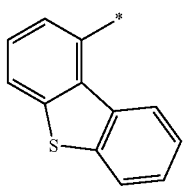
10-250
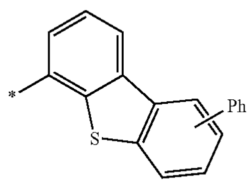
10-251
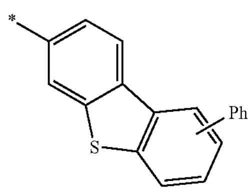
10-252
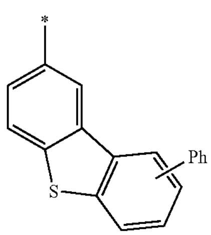
10-253
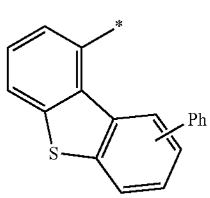
-continued
10-254
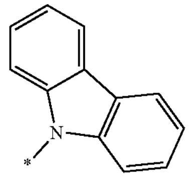
10-255
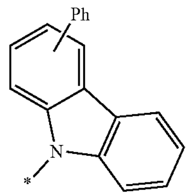
10-256
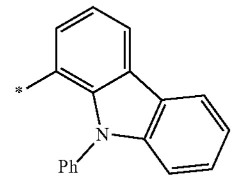
10-257
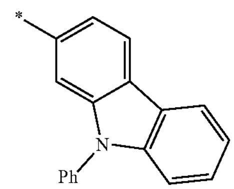
10-258
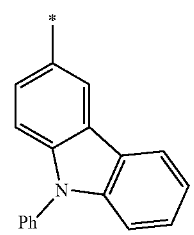
10-259
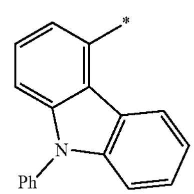
10-260
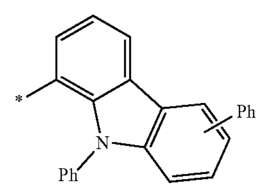
10-261
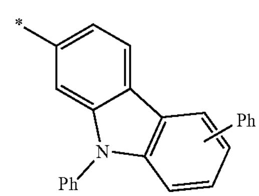

-continued
10-262
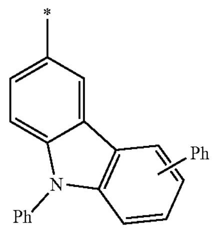
10-263
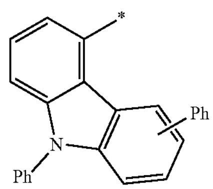
10-264
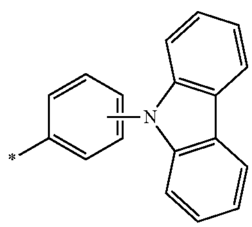
10-265
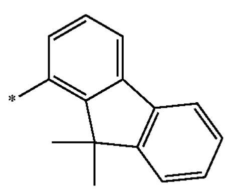
10-266
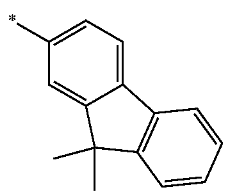
10-267
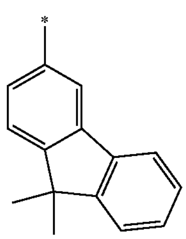
10-268
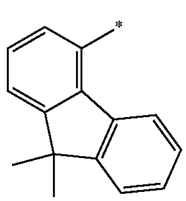
-continued
10-269
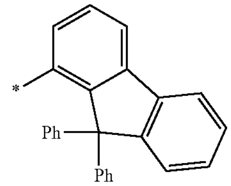
10-270
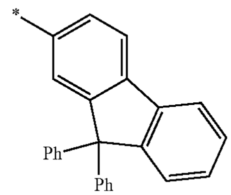
10-271
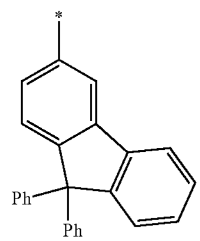
10-272
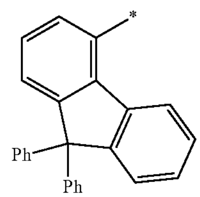
10-273
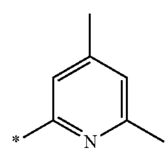
10-274
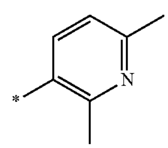
10-275
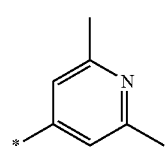
10-276
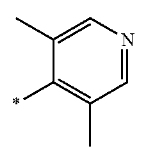
10-277
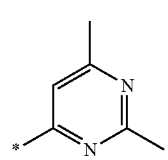

-continued
10-278
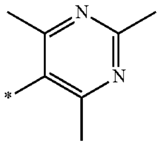
10-279
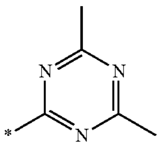
10-280
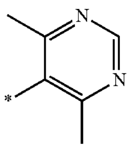
10-281
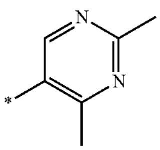
10-282
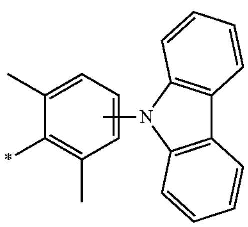
10-283
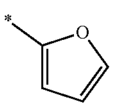
10-284
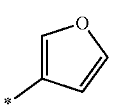
10-285
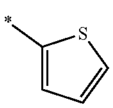
10-286
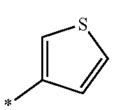
10-287
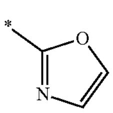
10-288
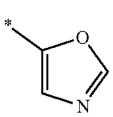
10-289
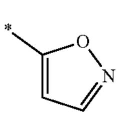
-continued
10-290
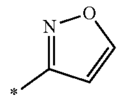
10-291
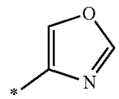
10-292
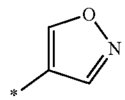
10-293
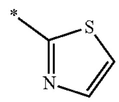
10-294
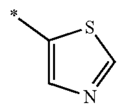
10-295
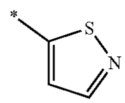
10-296
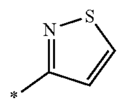
10-297
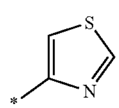
10-298
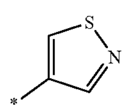
10-299
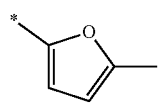
10-300
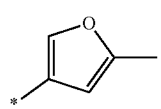
10-301
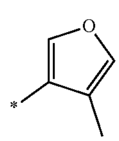
10-302
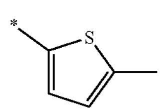
10-303
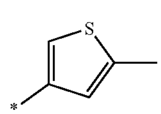

-continued
10-304
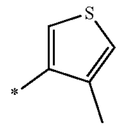
10-305
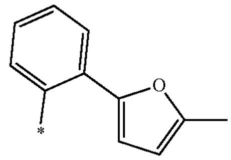
10-306
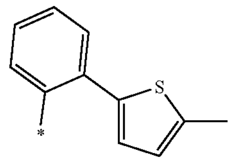
10-307
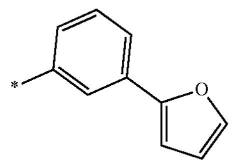
10-308
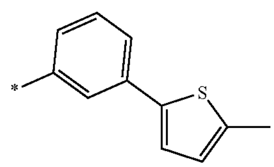
10-309
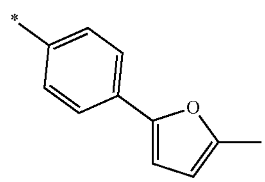
10-310
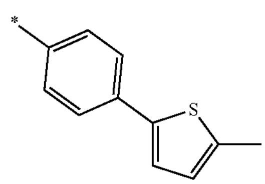
10-311
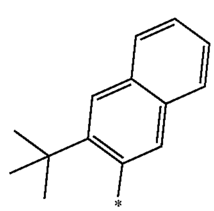
10-312
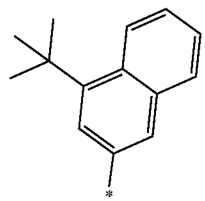
-continued
10-313
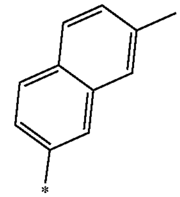
10-314
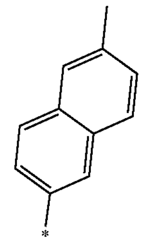
10-315
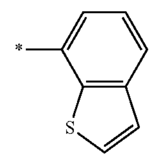
10-316
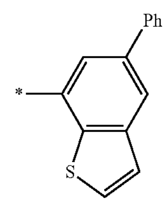
10-317
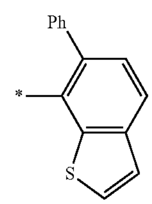
10-318
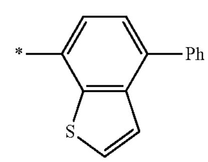
10-319
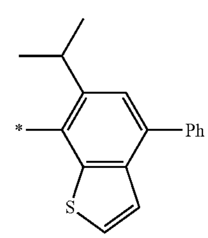

-continued
10-320
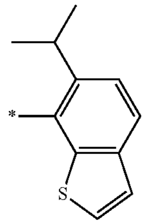
10-321
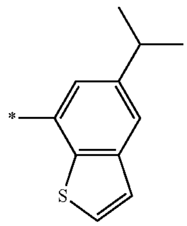
10-322
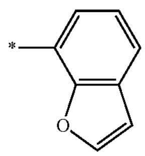
10-323
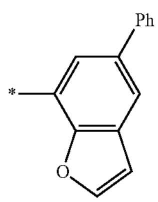
10-324
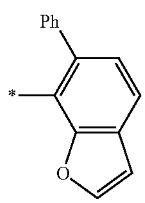
10-325
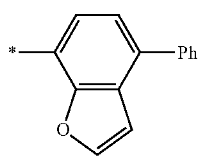
10-326
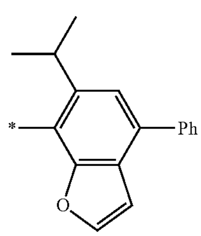
-continued
10-327
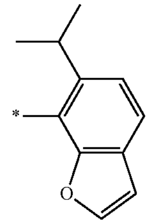
10-328
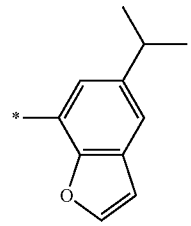
10-329
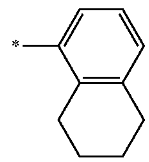
10-330
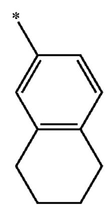
10-331
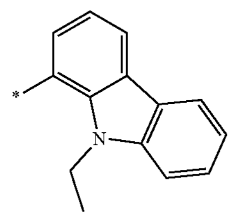
10-332
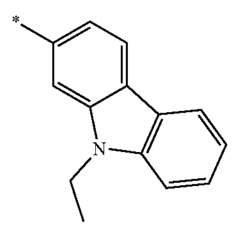
10-333
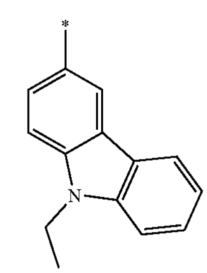

-continued
10-334
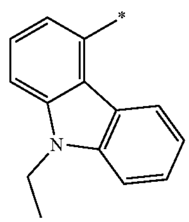
10-335
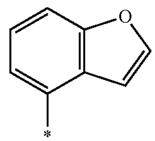
10-336
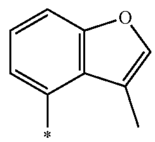
10-337
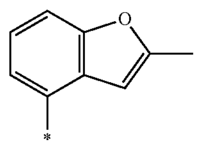
10-338
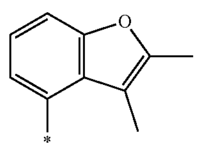
10-339
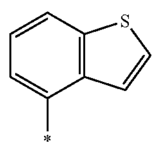
10-340
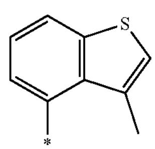
10-341
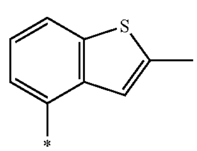
10-342
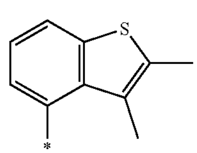
-continued
10-343
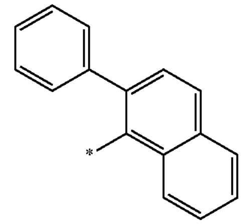
10-344
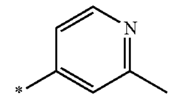
10-345
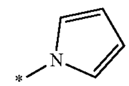
10-346
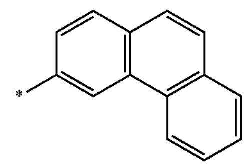
10-347
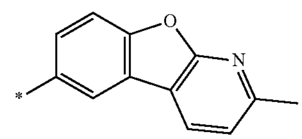
10-348
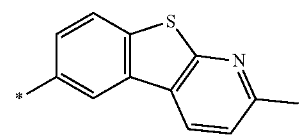
10-349
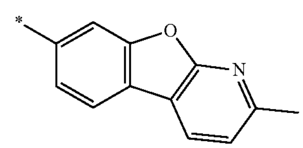
10-350
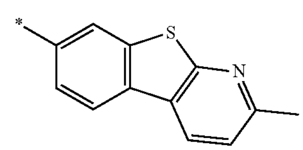
10-351
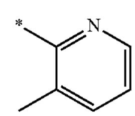
10-352
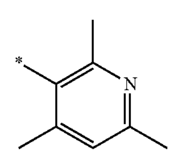

-continued 10-353

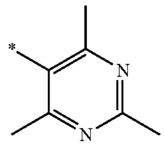

wherein, in Formulae 9-1 to 9-39, 9-201 to 9-233, 10-1 to 10-132, and 10-201 to 10-353, * indicates a binding site to a neighboring atom, Ph is a phenyl group, TMS is a trimethylsilyl group, and TMG is a trimethylgermyl group.

The "group represented by one of Formulae 9-1 to 9-39 in which at least one hydrogen is substituted with deuterium" and the "group represented by one of Formulae 9-201 to 9-233 in which at least one hydrogen is substituted with deuterium" may be, for example, a group represented by one of Formulae 9-501 to 9-514 and 9-601 to 9-635:

9-501

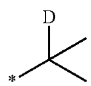

9-502

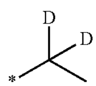

9-503

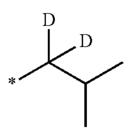

9-504

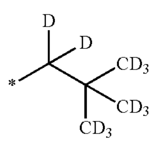

9-505

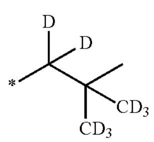

9-506

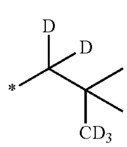

9-507

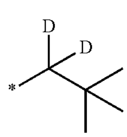

9-508

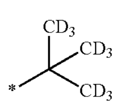

9-509

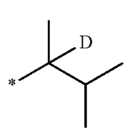

-continued 9-510

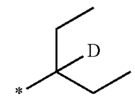

9-5111

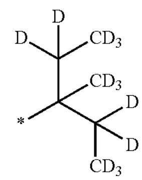

9-512

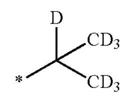

9-513

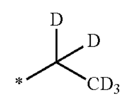

9-514

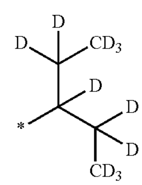

9-601

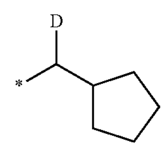

9-602

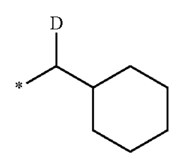

9-603

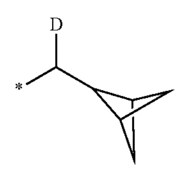

9-604

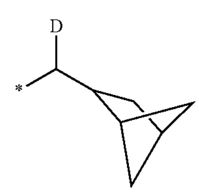

9-605

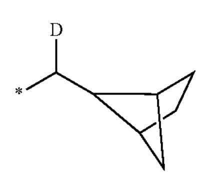

-continued
9-606
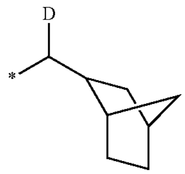
9-607
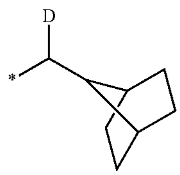
9-608
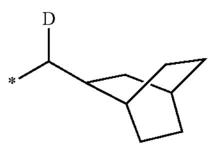
9-609
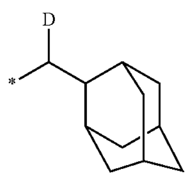
9-610
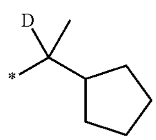
9-611
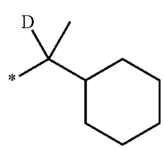
9-612
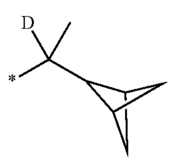
9-613
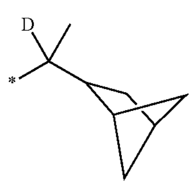
9-614
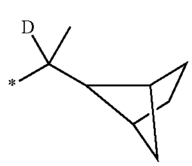
-continued
9-615
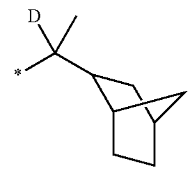
9-616
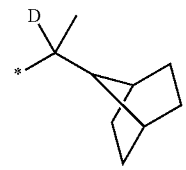
9-617
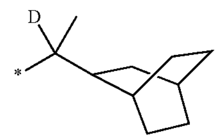
9-618
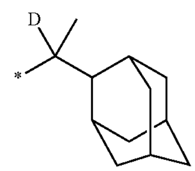
9-619
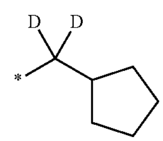
9-620
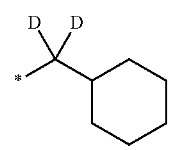
9-621
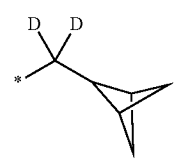
9-622
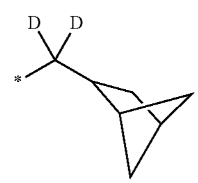
9-623
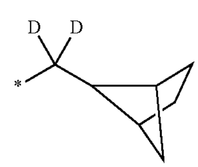

-continued 9-624

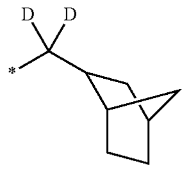

9-625

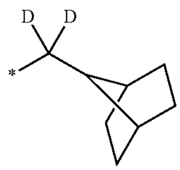

9-626

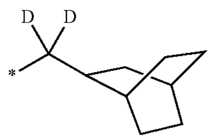

9-627

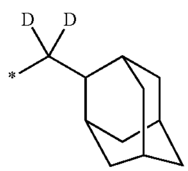

9-628

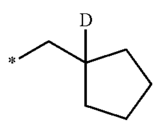

9-629

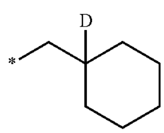

9-630

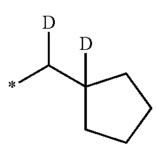

9-631

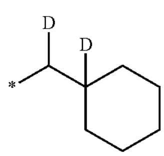

9-632

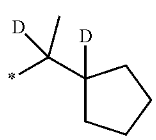

9-633

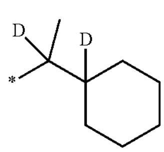

-continued 9-634

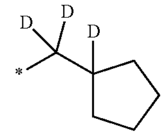

9-635

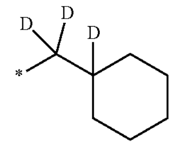

The "group represented by one of Formulae 9-1 to 9-39 in which at least one hydrogen is substituted with —F" and the "group represented by one of Formulae 9-201 to 9-233 in which at least one hydrogen is substituted with —F" may be, for example, a group represented by one of Formulae 9-701 to 9-710:

9-701

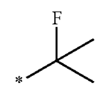

9-702

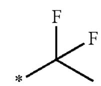

9-703

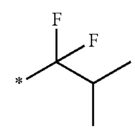

9-704

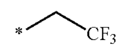

9-705

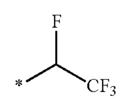

9-706

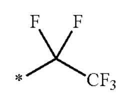

9-707

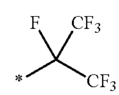

9-708

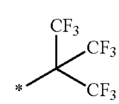

9-709

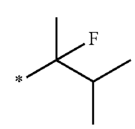

9-710

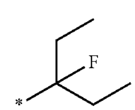

The "group represented by one of Formulae 10-1 to 10-132 in which at least one hydrogen is substituted with deuterium" and the "group represented by one of Formulae 10-201 to 10-353 in which at least one hydrogen is substituted with deuterium" may be, for example, a group represented by one of Formulae 10-501 to 10-553:
10-501
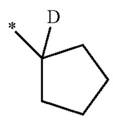
10-502
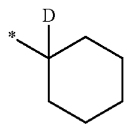
10-503
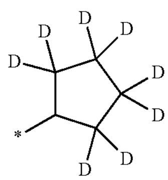
10-504
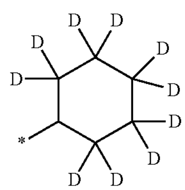
10-505
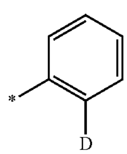
10-506
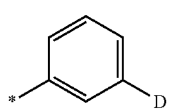
10-507
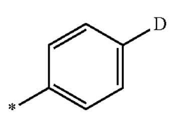
10-508
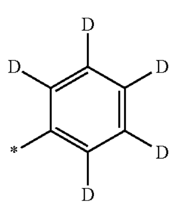
10-509
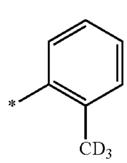
10-510
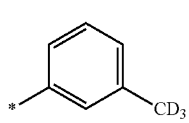
-continued
10-511
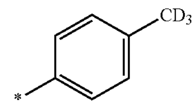
10-512
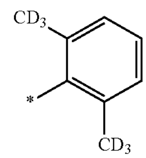
10-513
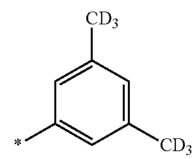
10-514
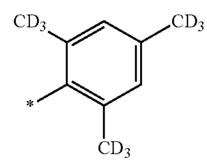
10-515
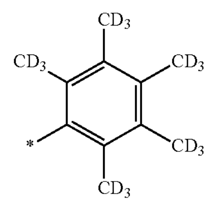
10-516
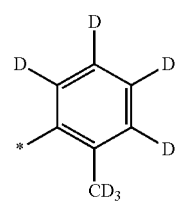
10-517
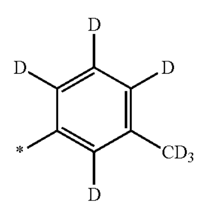
10-518
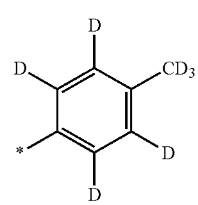
10-519
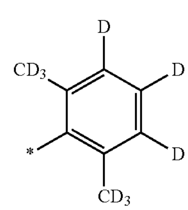

-continued
10-520
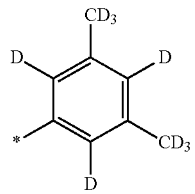
10-521
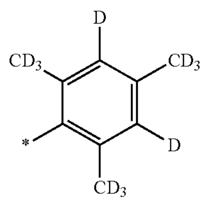
10-522
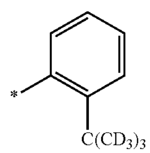
10-523
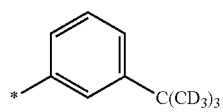
10-524
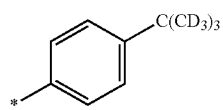
10-525
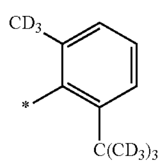
10-526
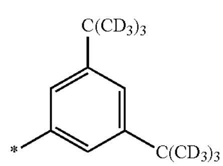
10-527
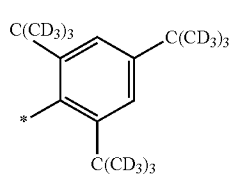
10-528
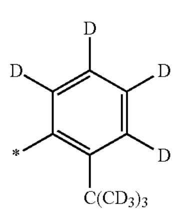
-continued
10-529
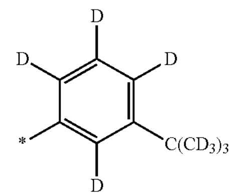
10-530
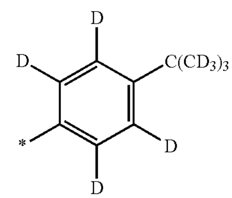
10-531
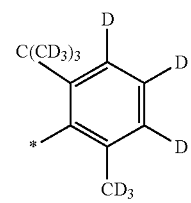
10-532
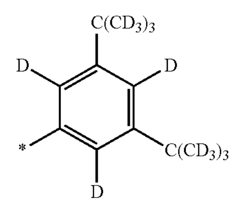
10-533
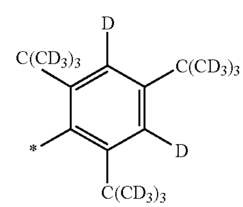
10-534
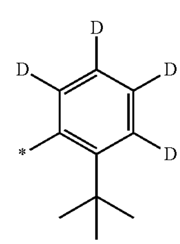
10-535
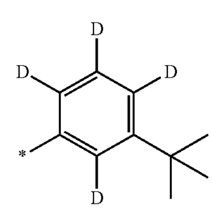

-continued
10-536
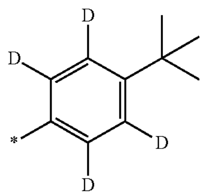
10-537
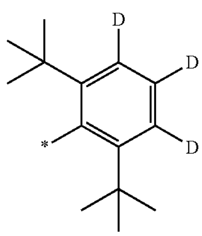
10-538
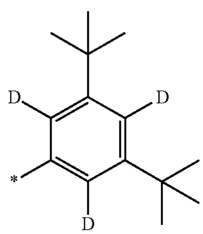
10-540
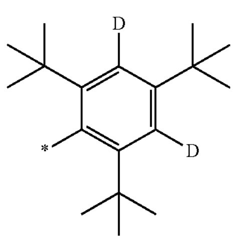
10-541
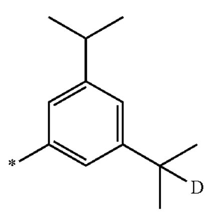
10-542
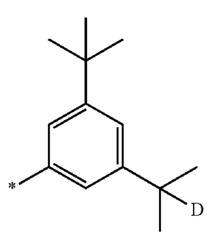
10-543
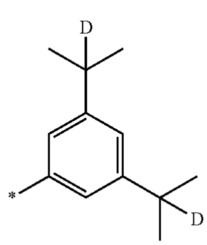
-continued
10-544
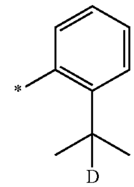
10-545
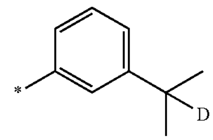
10-546
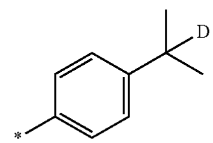
10-547
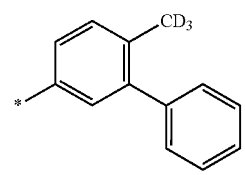
10-548
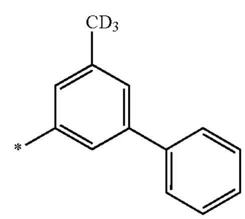
10-549
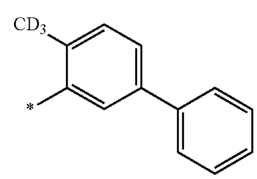
10-550
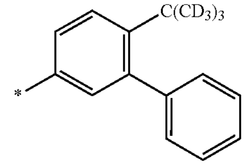
10-551
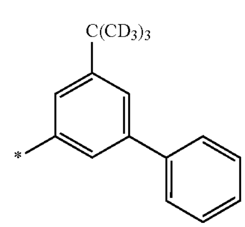

10-552
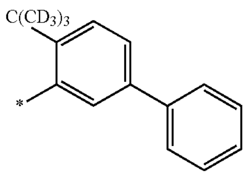
10-553
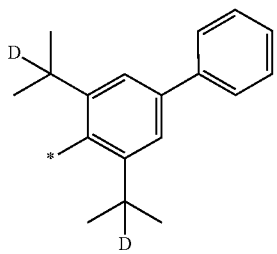
The "group represented by one of Formulae 10-1 to 10-132 in which at least one hydrogen is substituted with —F" and the "group represented by one of Formulae 10-201 to 10-353 in which at least one hydrogen is substituted with —F" may be, for example, a group represented by one of Formulae 10-601 to 10-620:
10-601
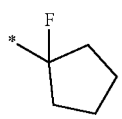
10-602
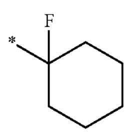
10-603
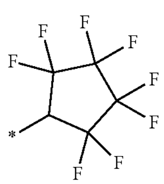
10-604
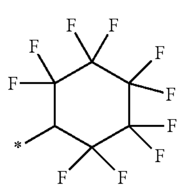
10-605
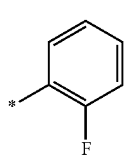
10-606
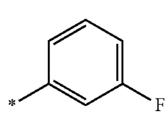
10-607
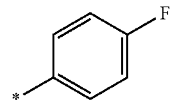
10-608
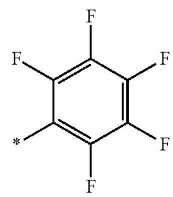
10-609
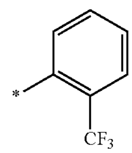
10-610
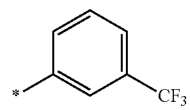
10-611
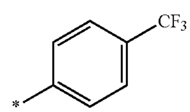
10-612
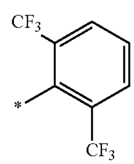
10-613
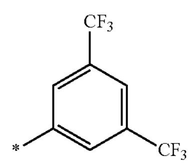
10-614
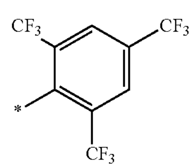
10-615
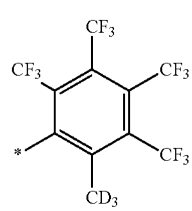
10-616
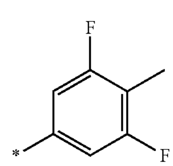

-continued
10-617
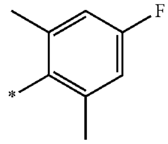
10-618
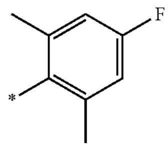
10-619
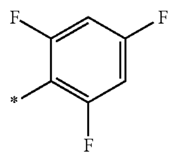
10-620
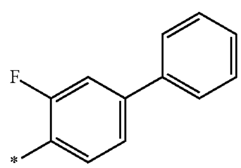
In one or more embodiments, the organometallic compound represented by Formula 1 may be one of Compounds 1 to 2560:
1
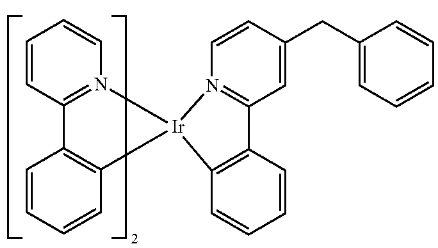
2
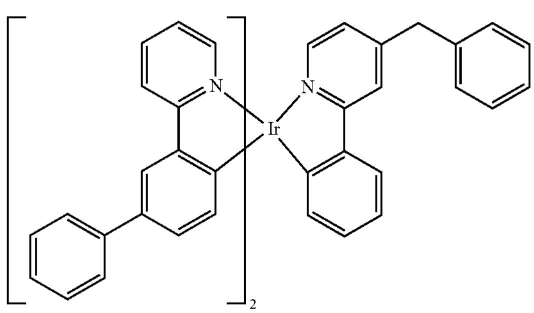
-continued
3
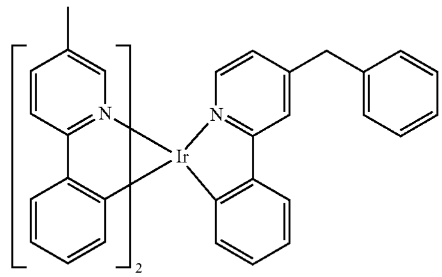
4
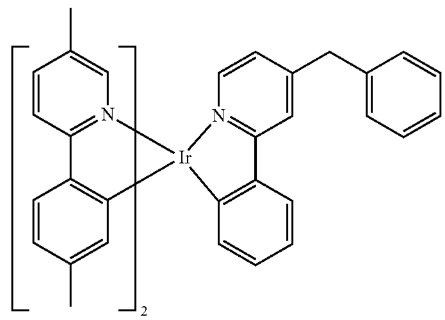
5
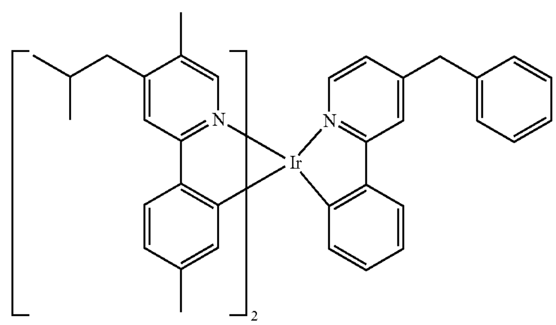
6
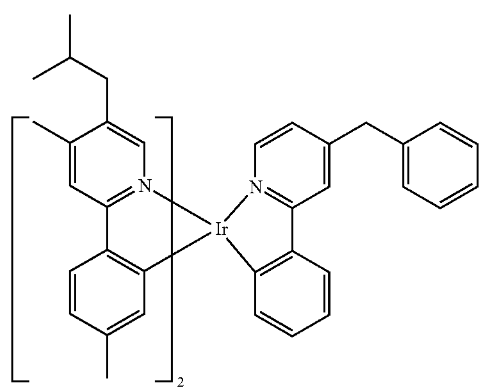
7
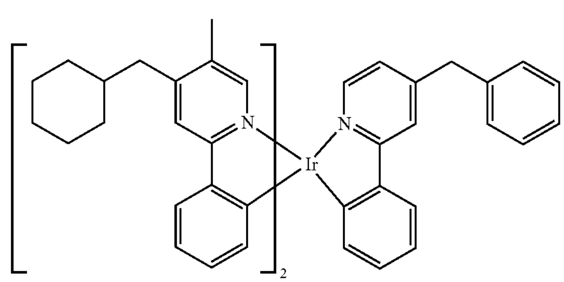

8
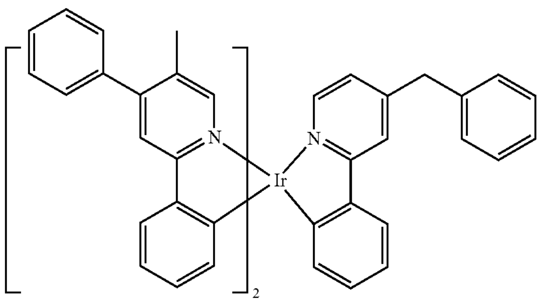
9
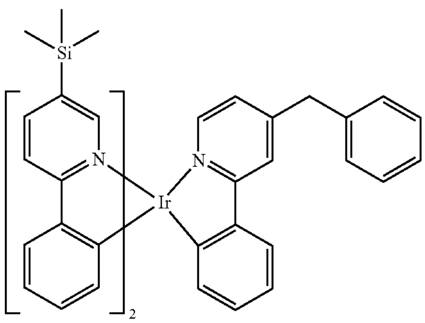
10
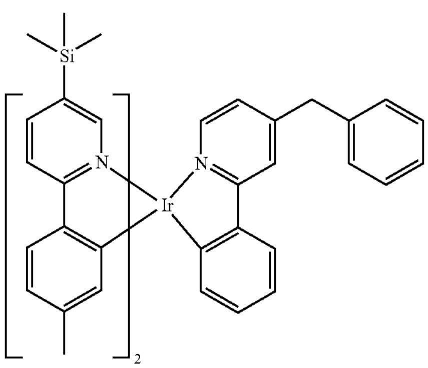
11
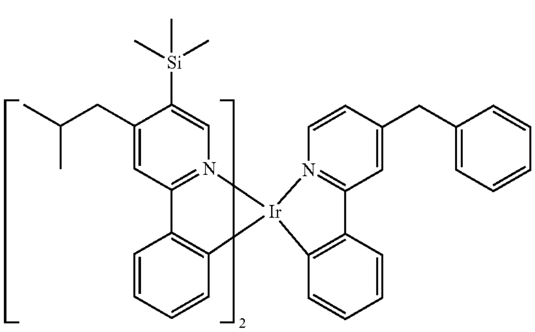
12
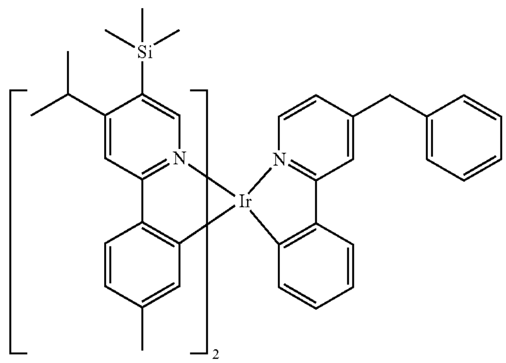
13
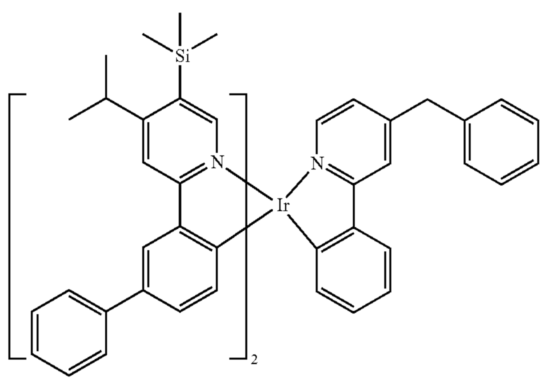
14
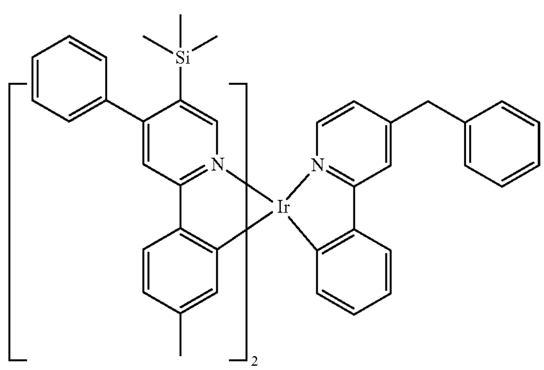
15
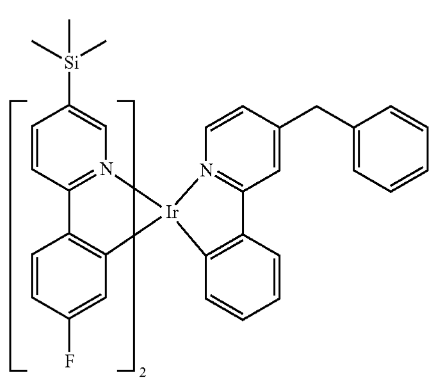

-continued
16
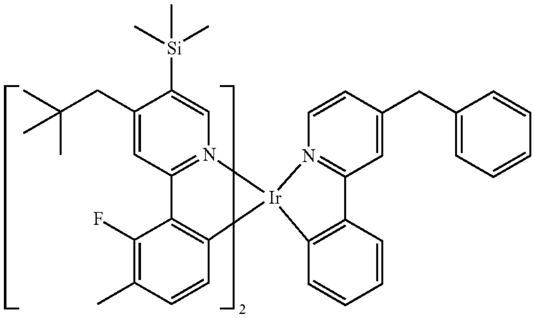
17
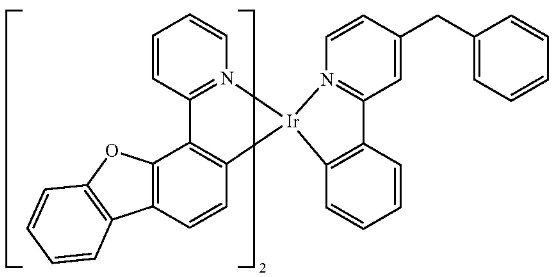
18
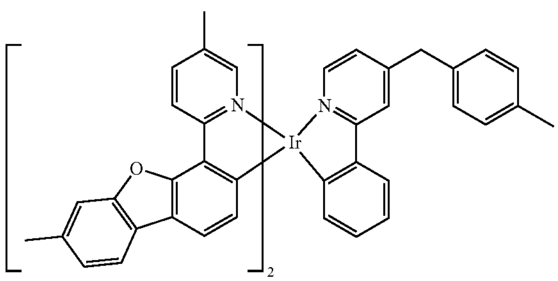
19
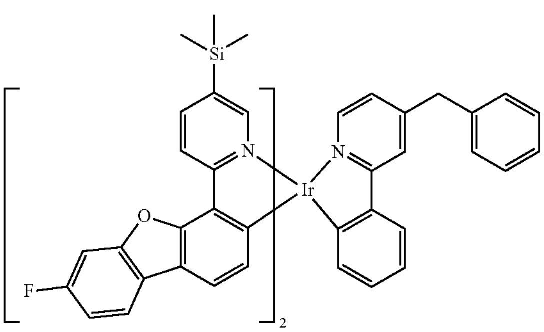
-continued
20
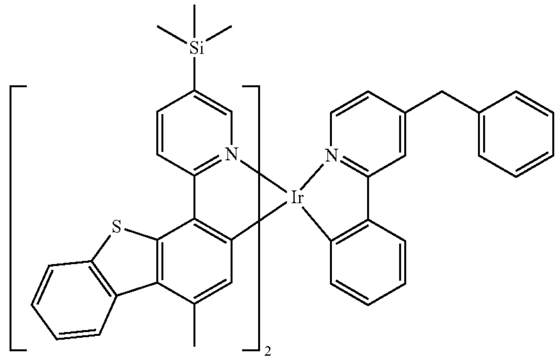
21
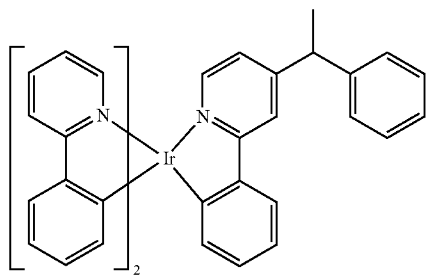
22
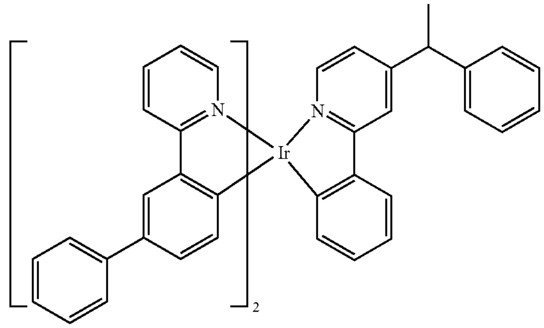
23
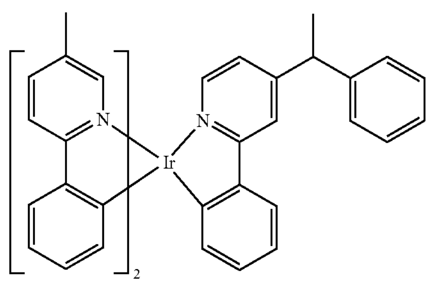
24
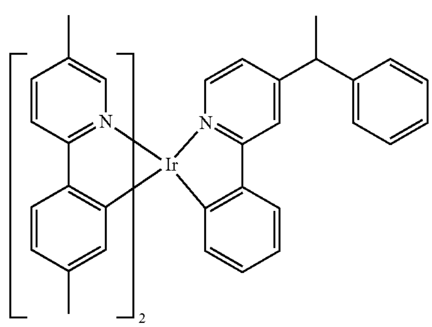

25
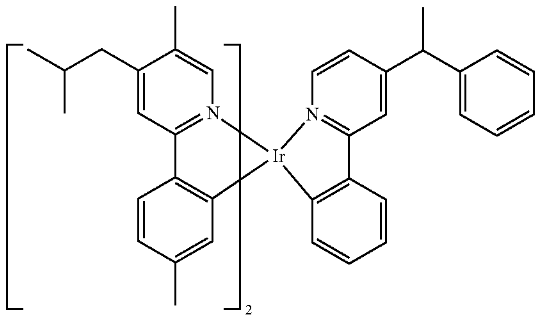
26
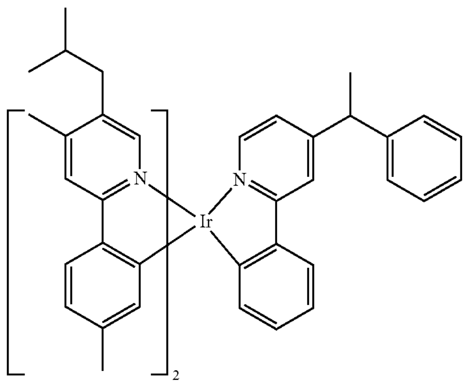
27
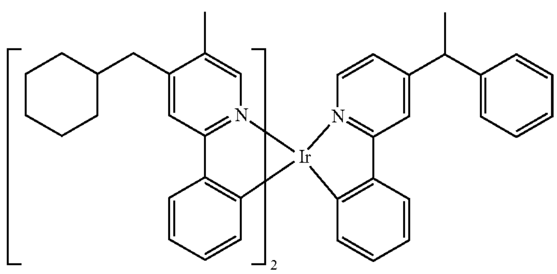
28
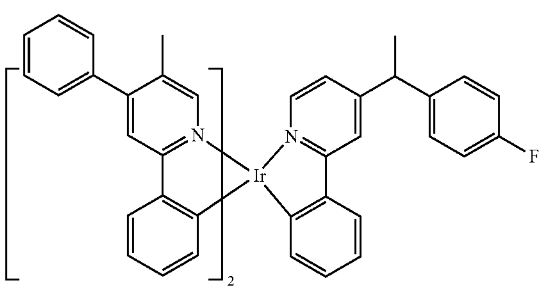
29
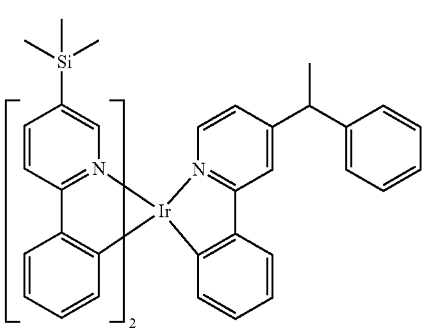
30
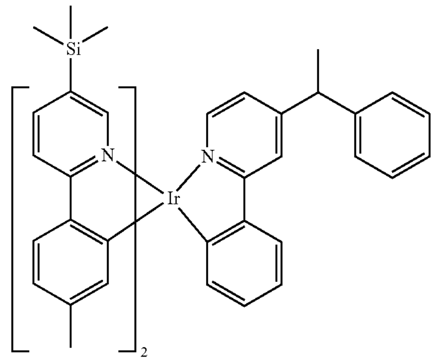
31
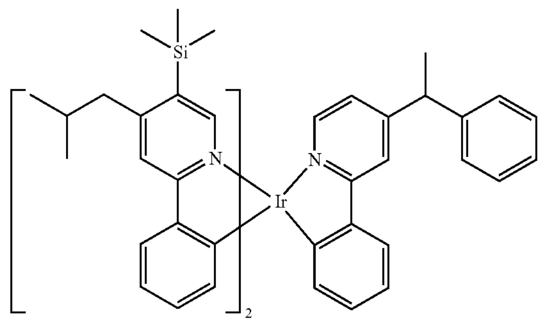
32
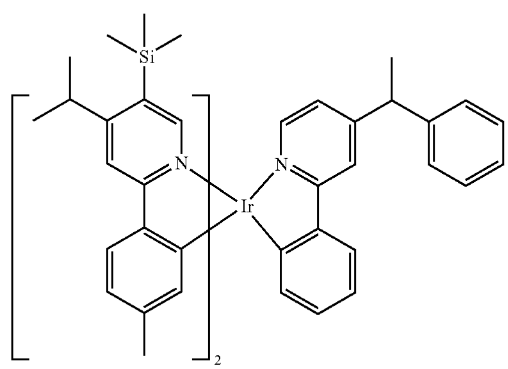
33
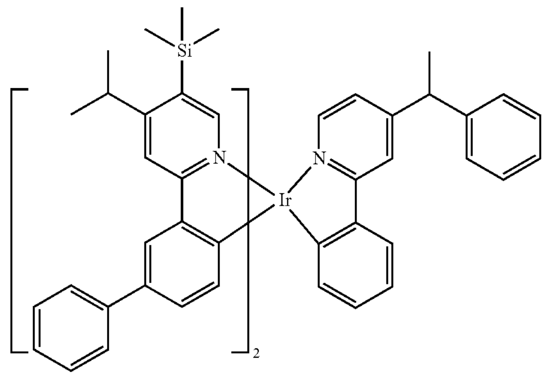

-continued
34
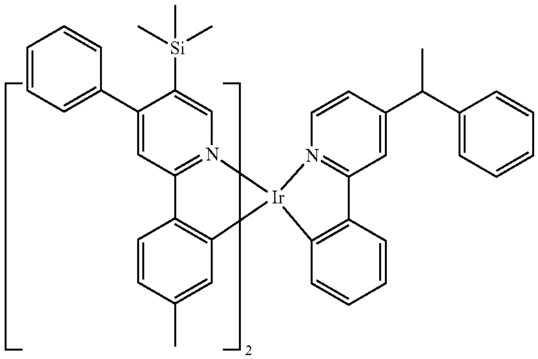
35
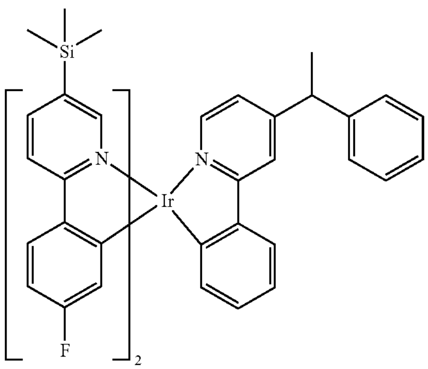
36
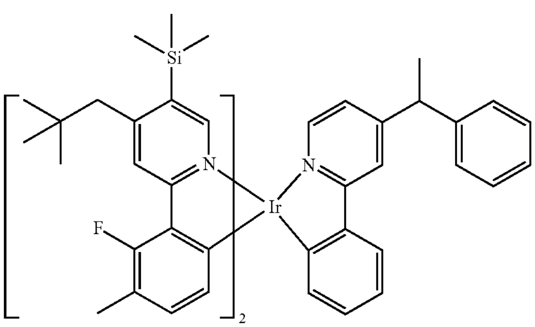
37
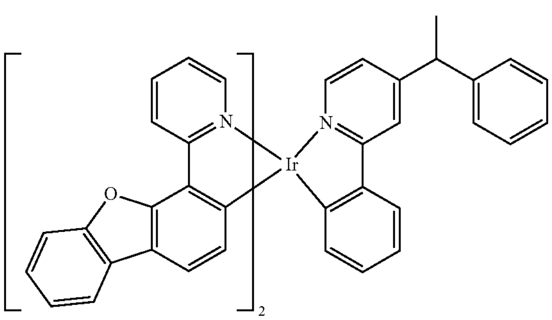
-continued
38
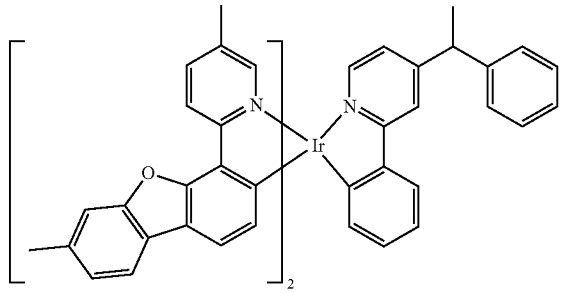
39
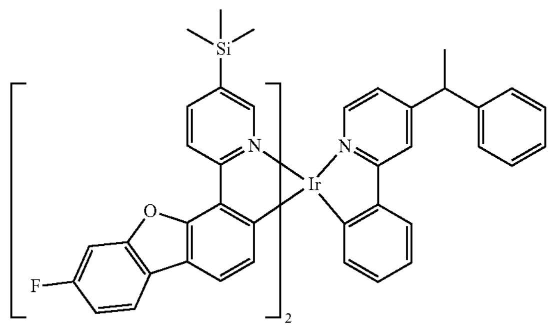
40
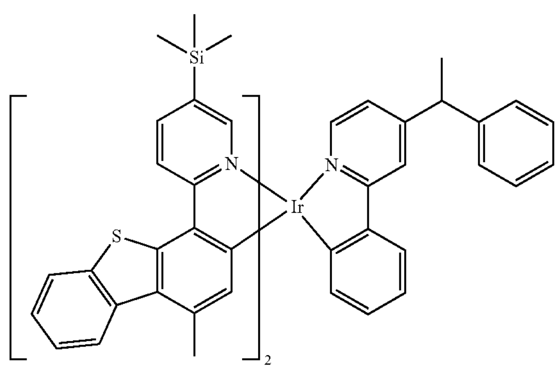
41
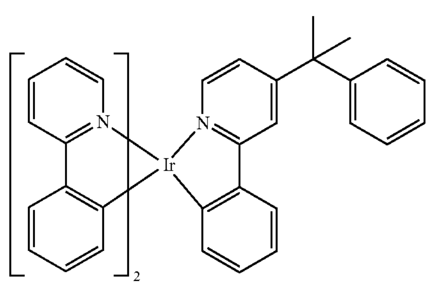

-continued
42
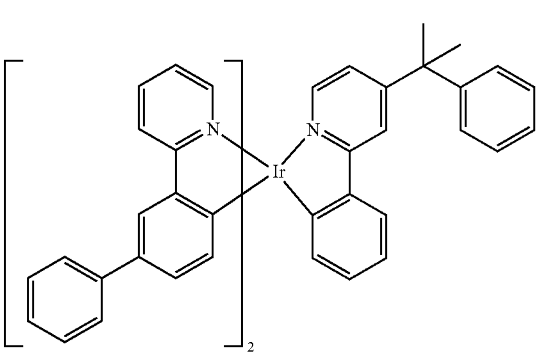
43
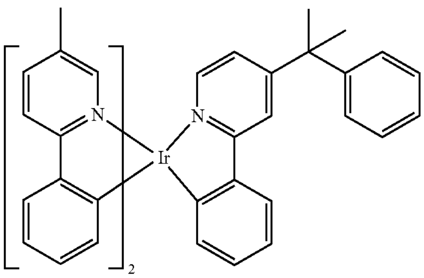
44
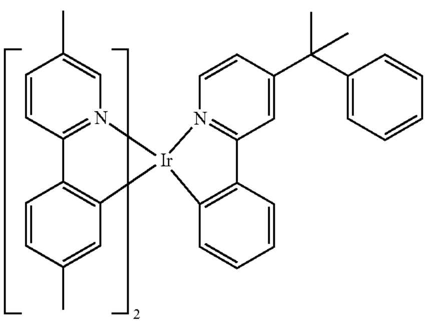
45
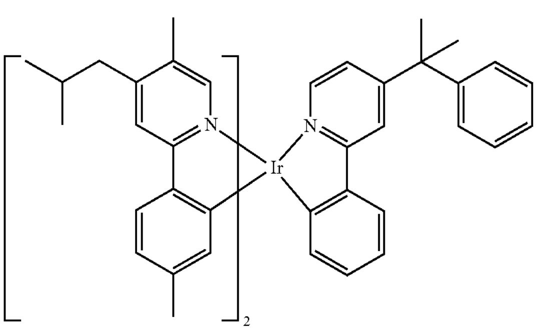
-continued
46
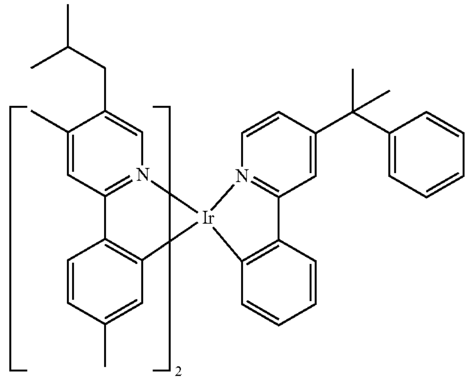
47
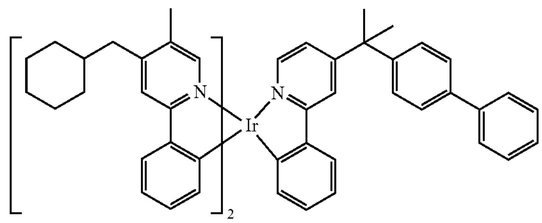
48
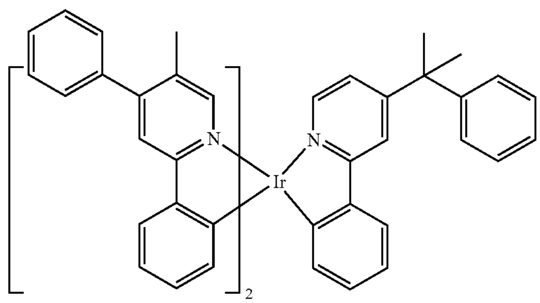
49
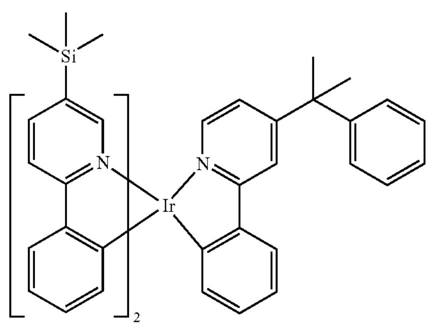
50
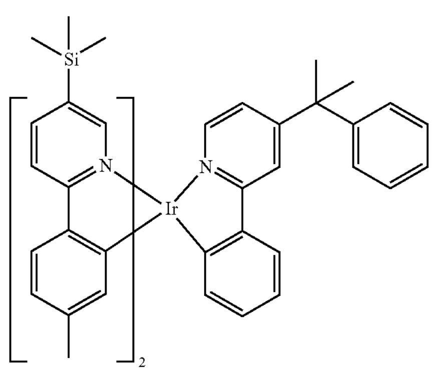

-continued
51
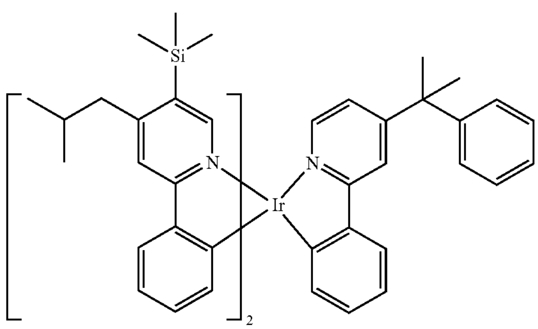
52
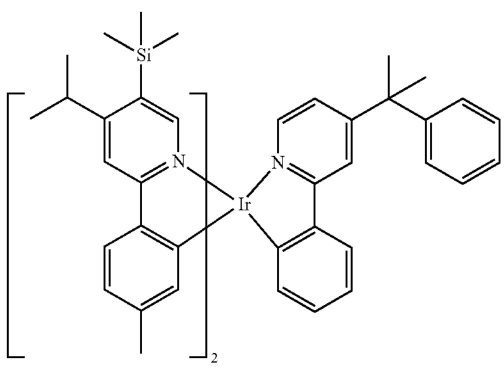
53
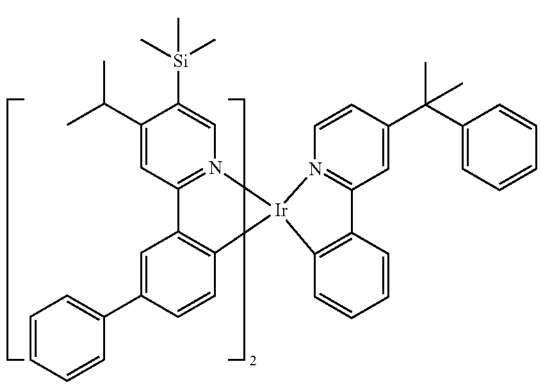
54
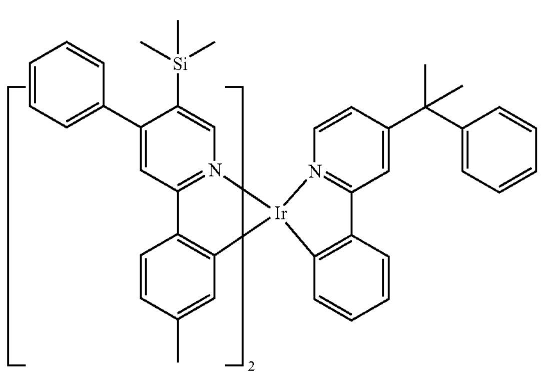
-continued
55
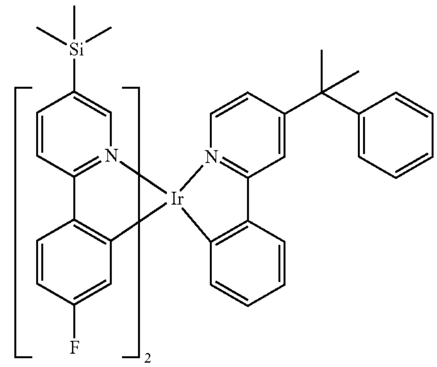
56
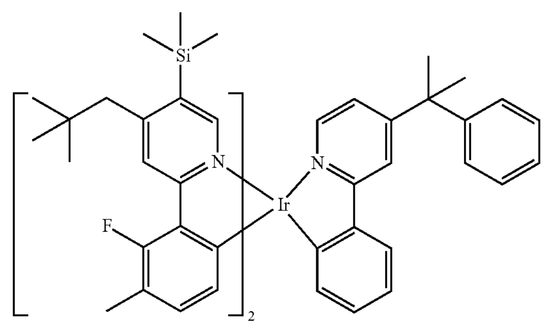
57
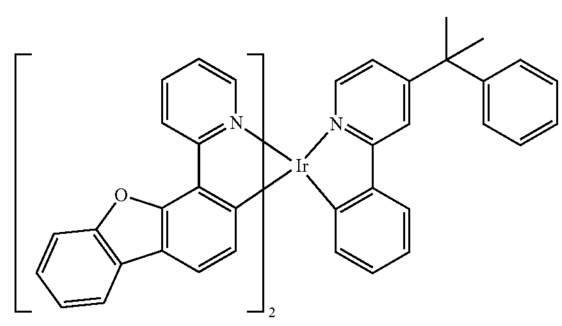
58
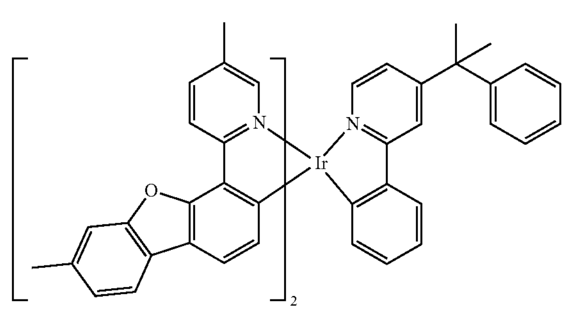

59
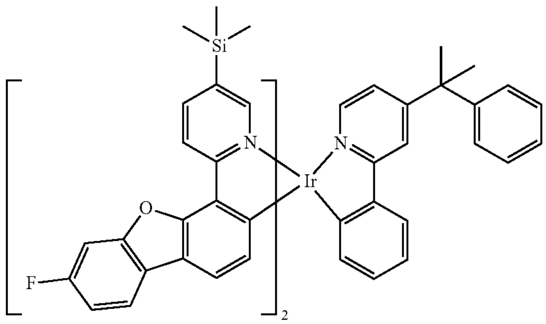
60
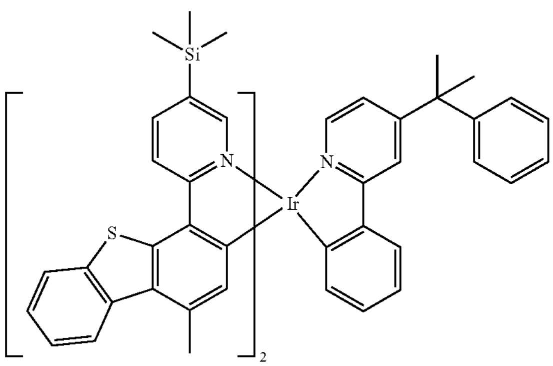
61
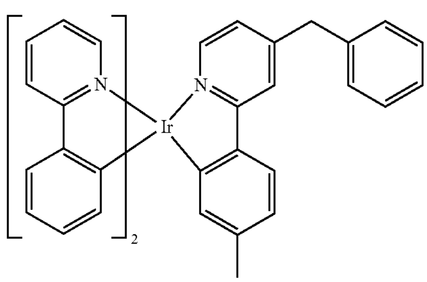
62
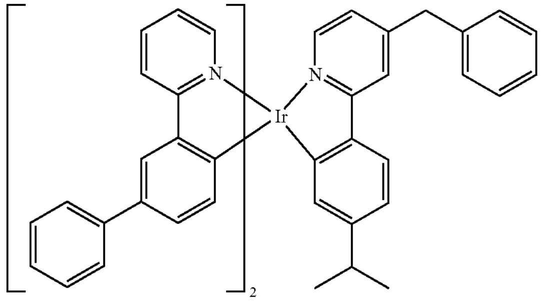
63
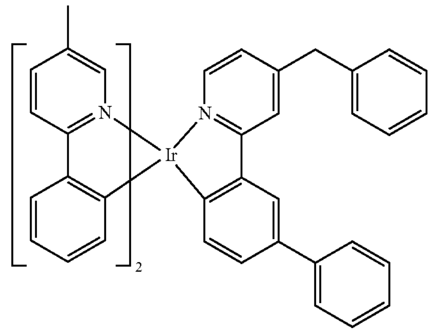
64
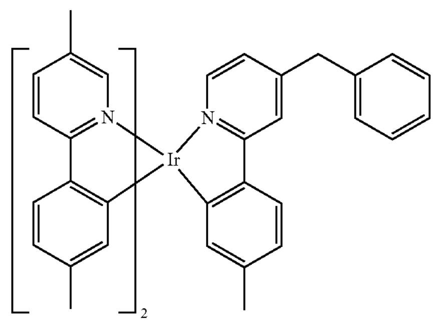
65
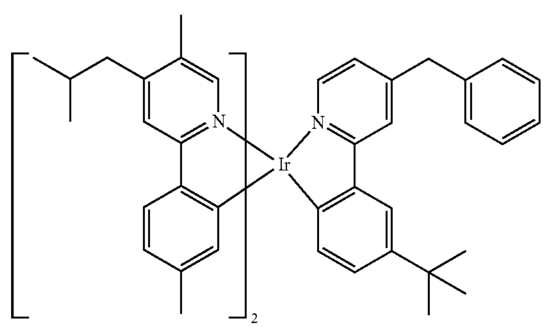
66
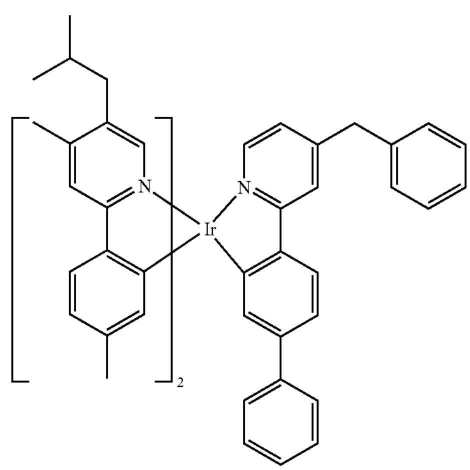

-continued
67
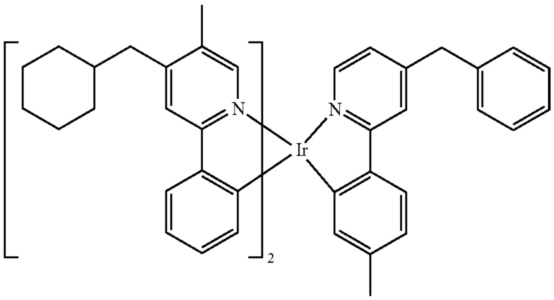
68
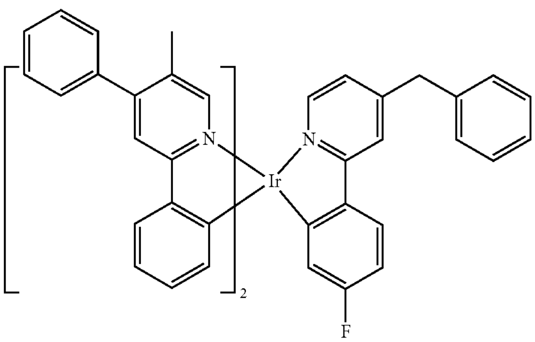
69
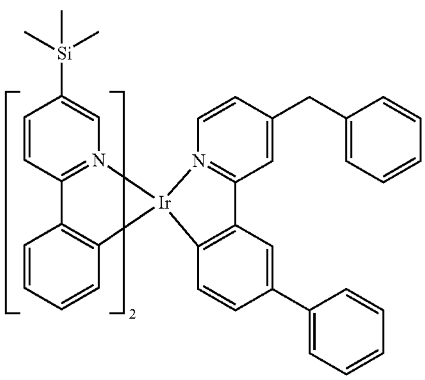
70
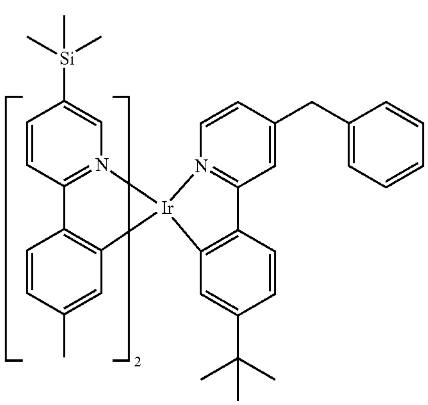
-continued
71
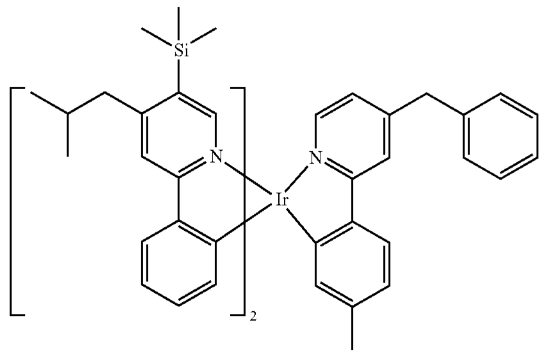
72
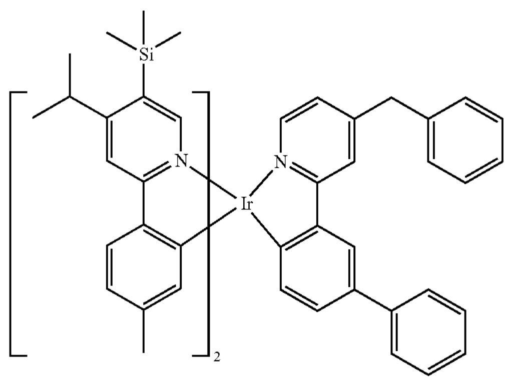
73
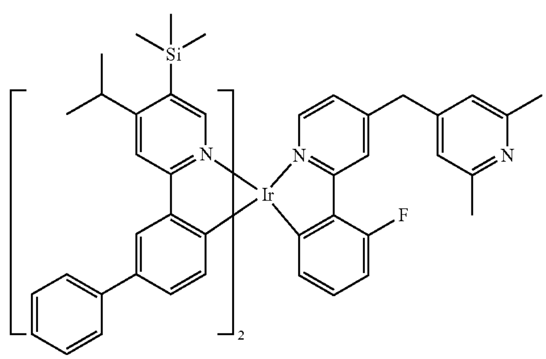
74
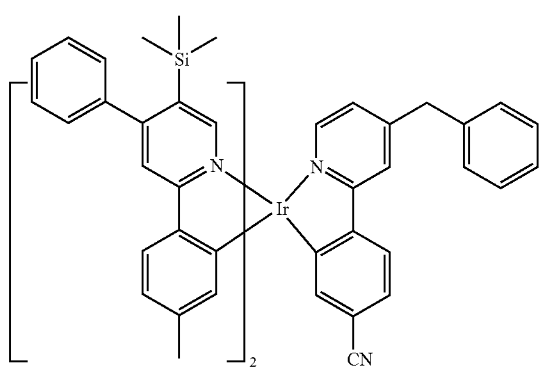

-continued
75
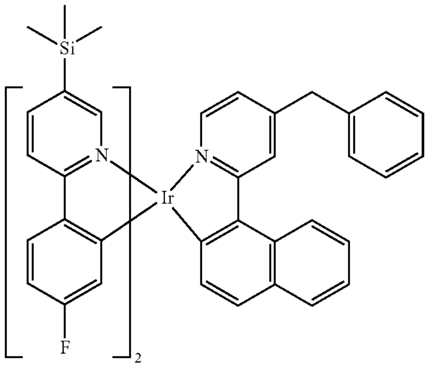
76
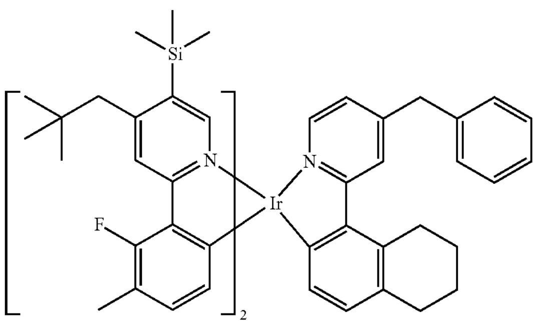
77
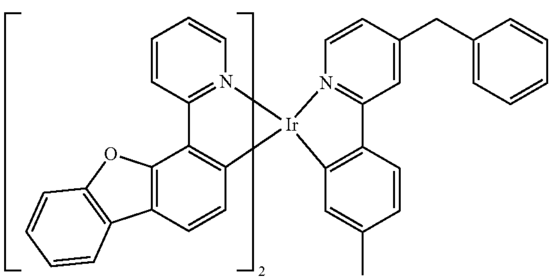
78
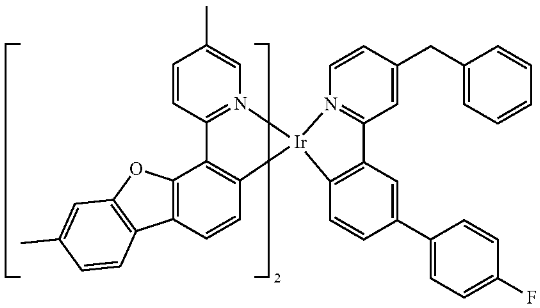
-continued
79
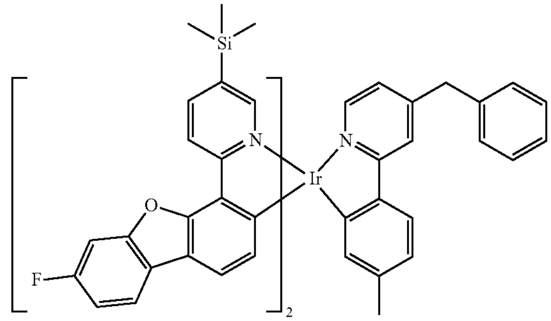
80
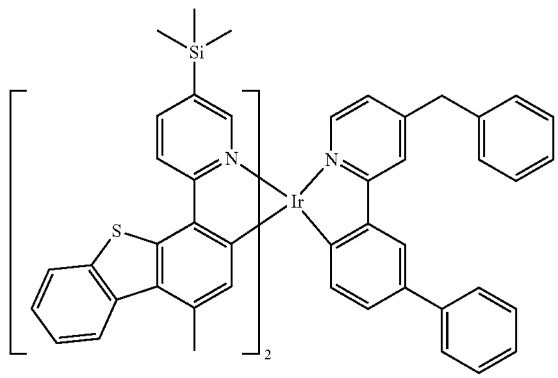
81
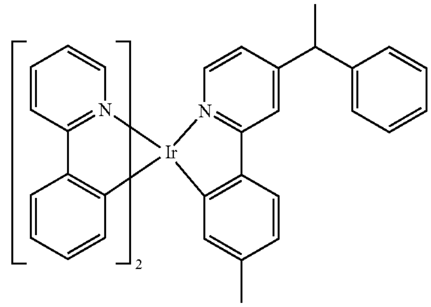
82
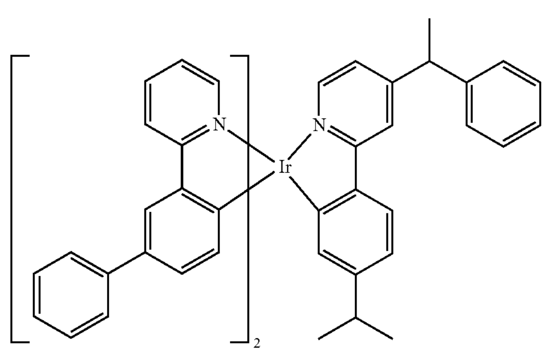

83
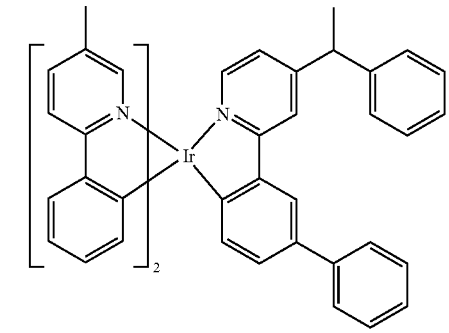
84
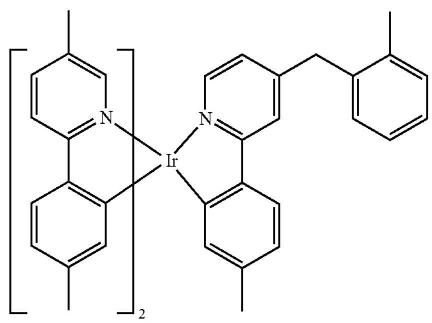
85
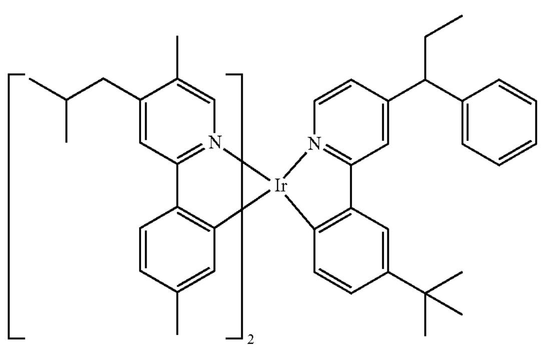
86
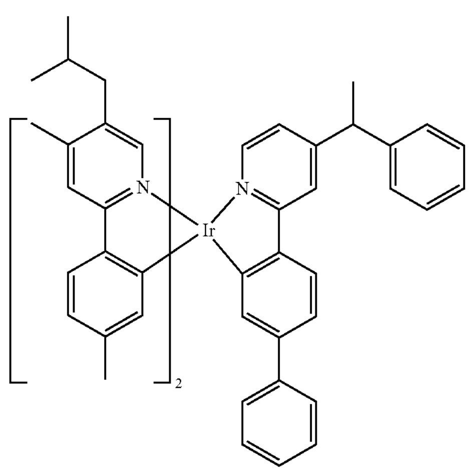
87
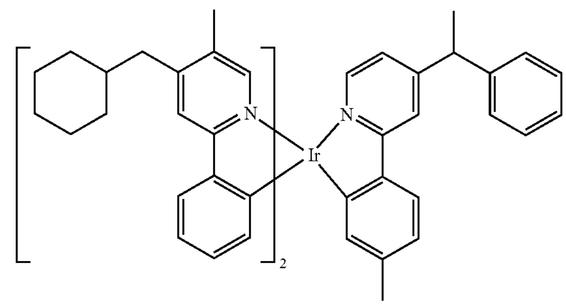
88
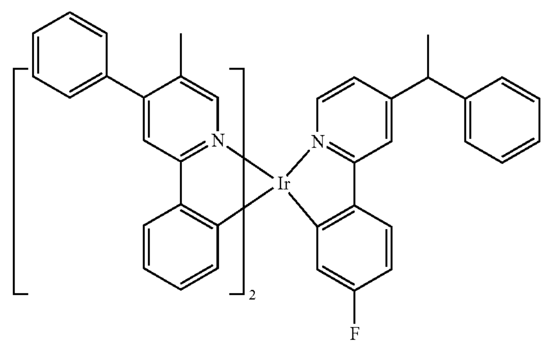
89
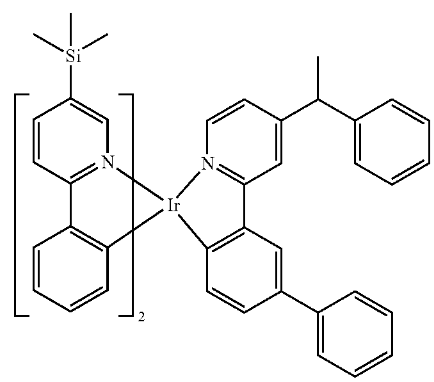
90
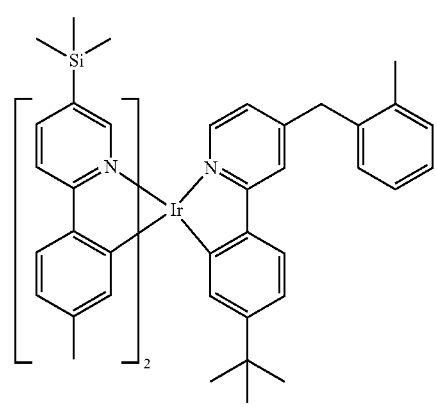

-continued
91
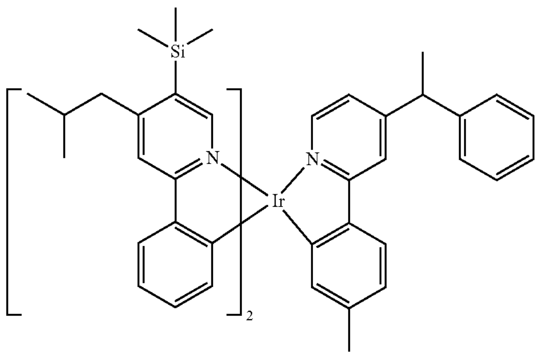
92
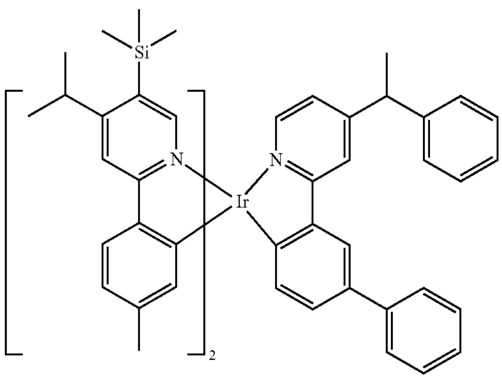
93
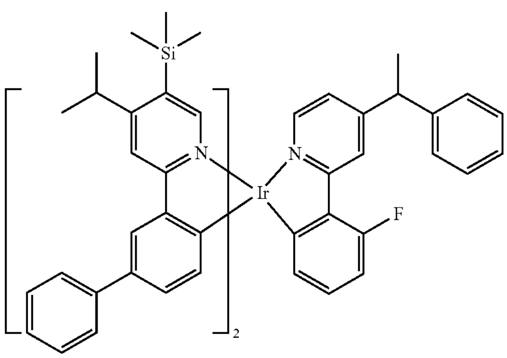
94
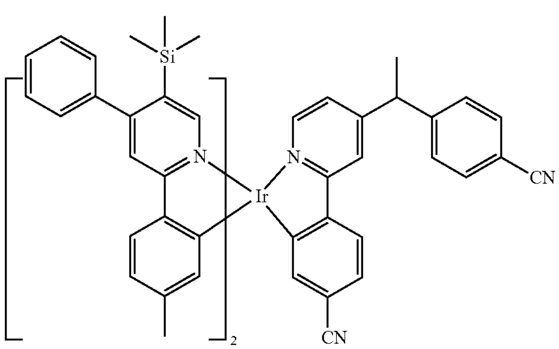
-continued
95
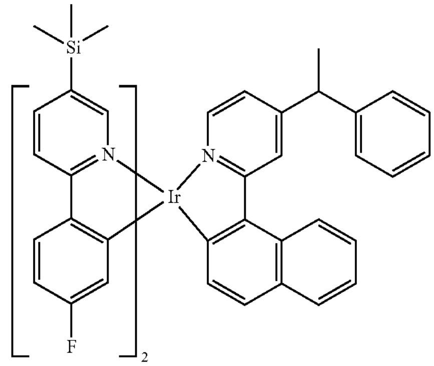
96
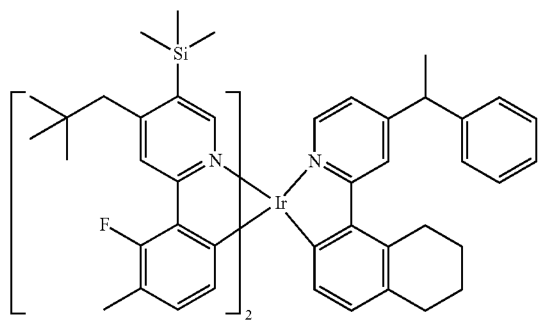
97
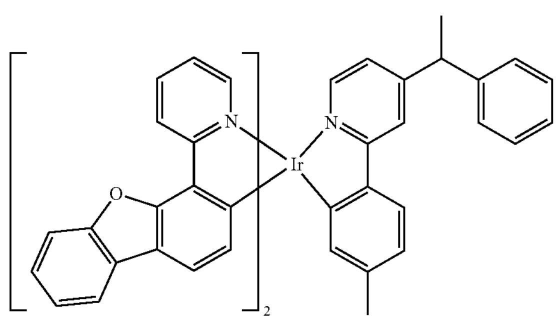
98
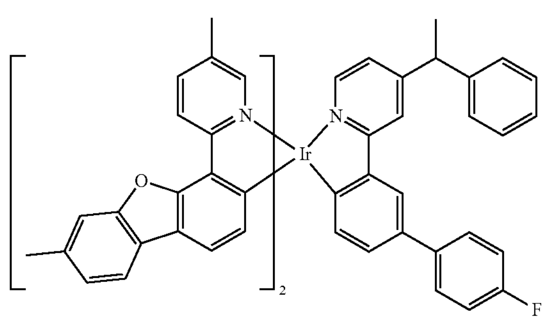

-continued
99
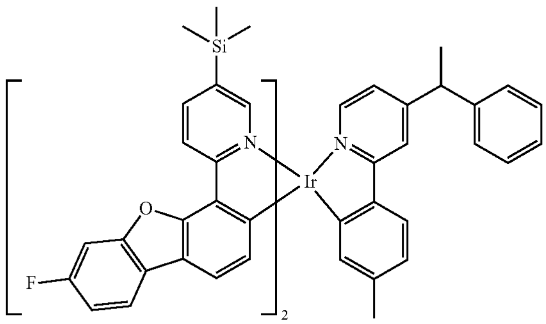
100
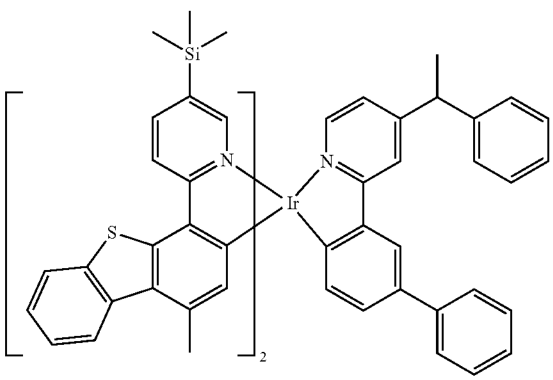
101
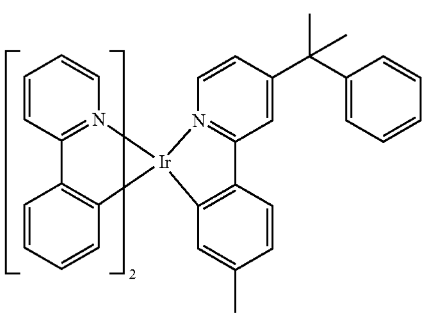
102
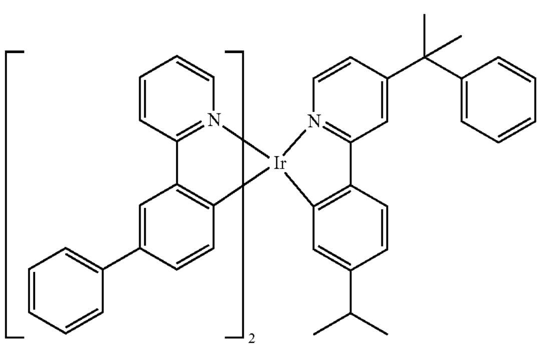
-continued
103
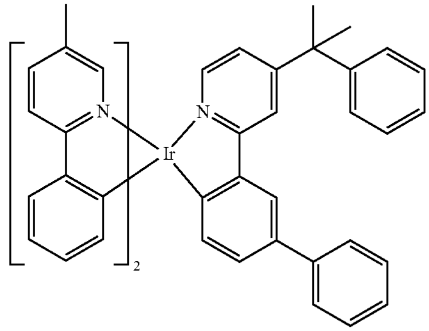
104
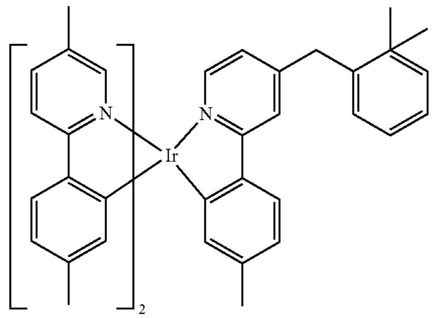
105
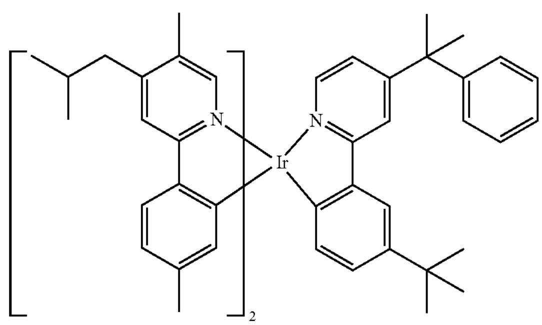
106
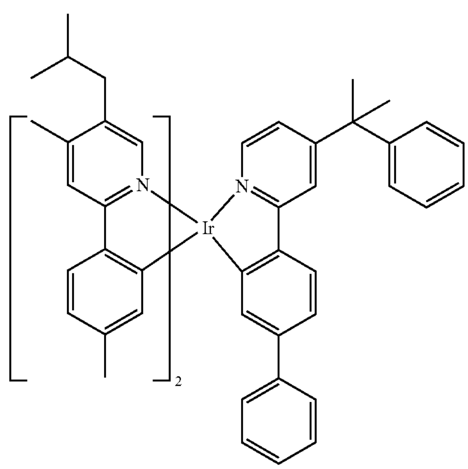

-continued
107
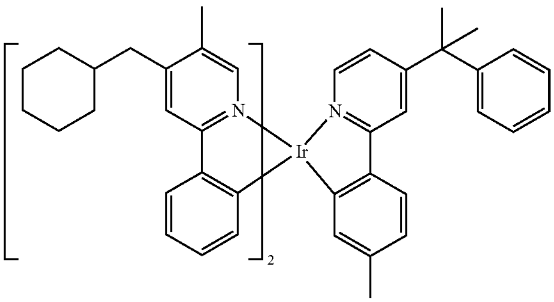
108
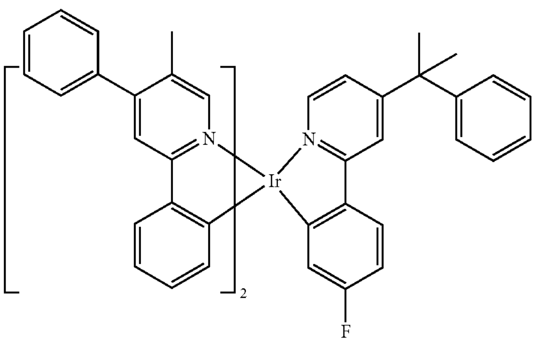
109
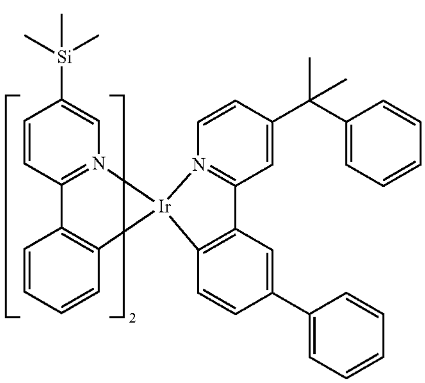
110
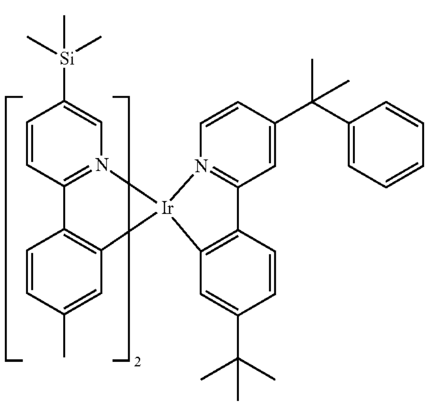
-continued
111
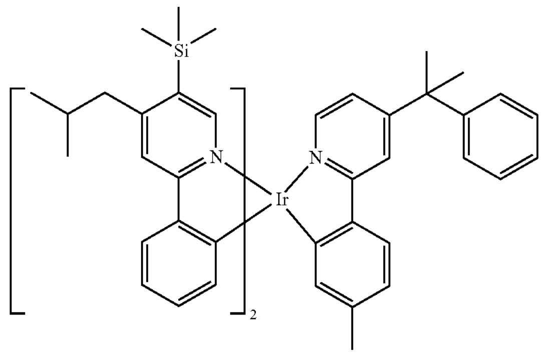
112
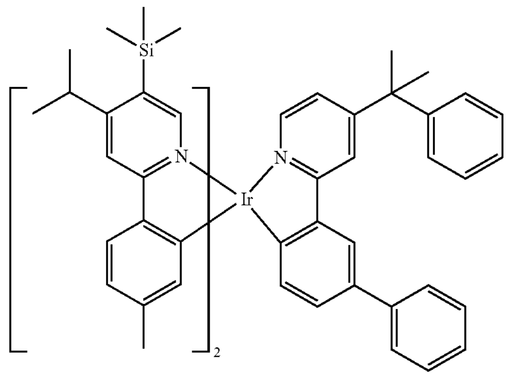
113
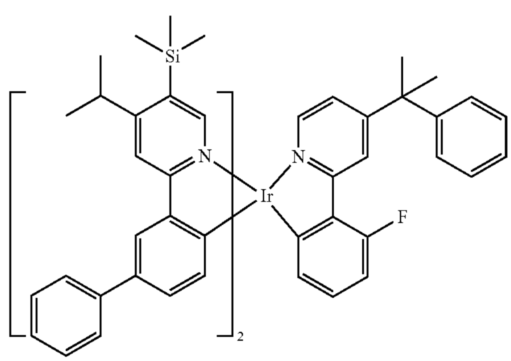
114
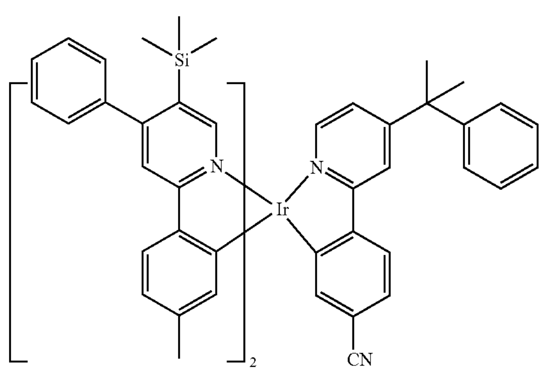

115
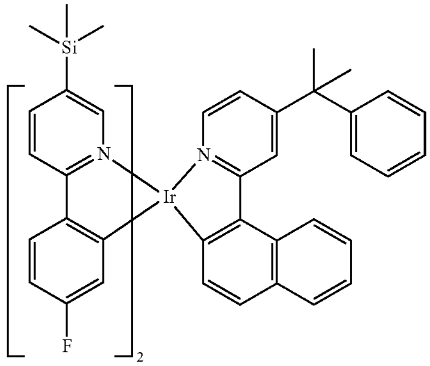
116
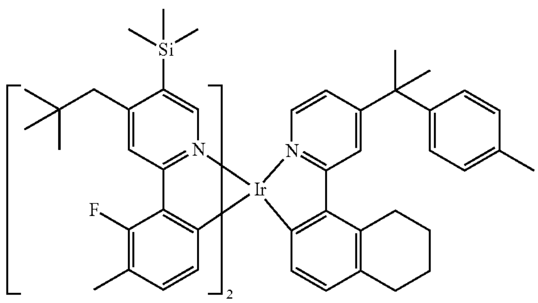
117
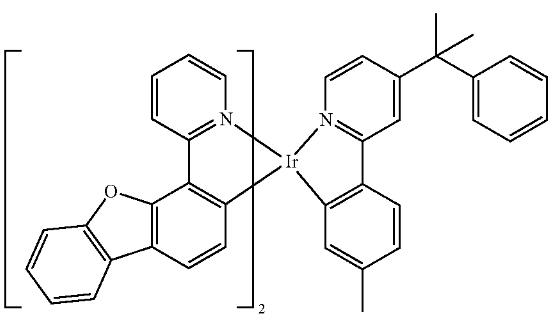
118
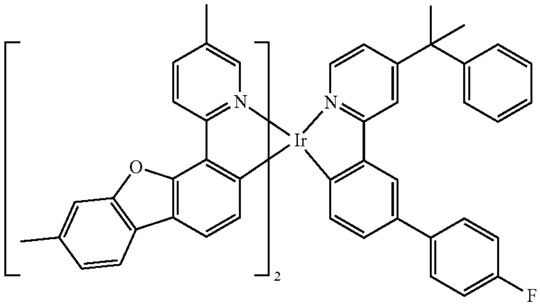
119
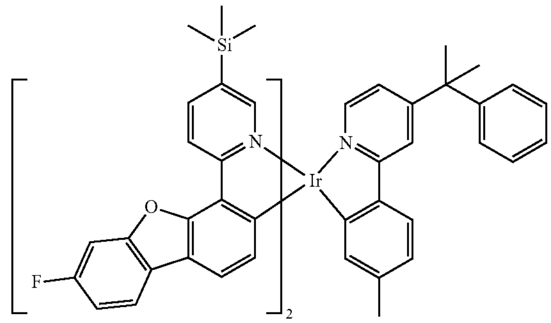
120
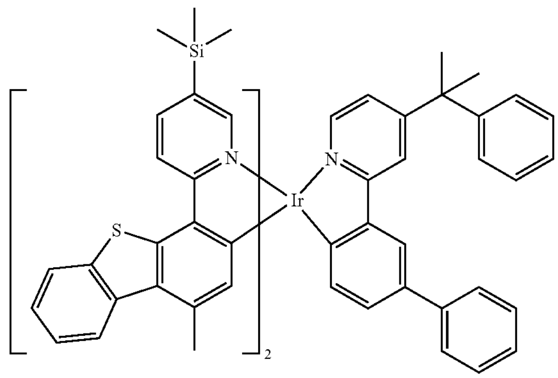
121
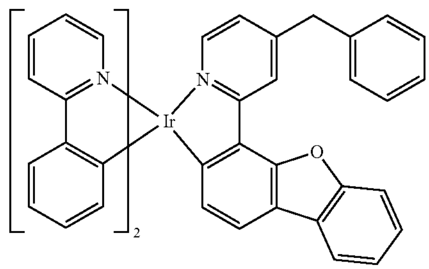
122
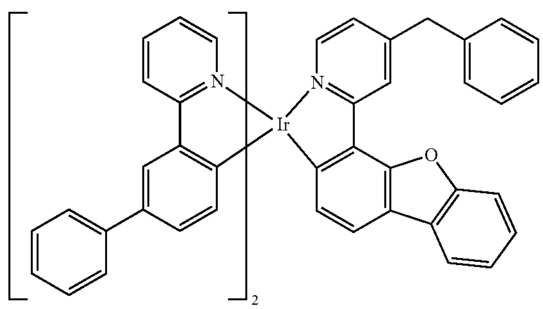
123
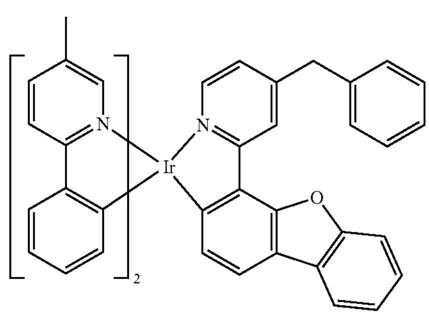

124
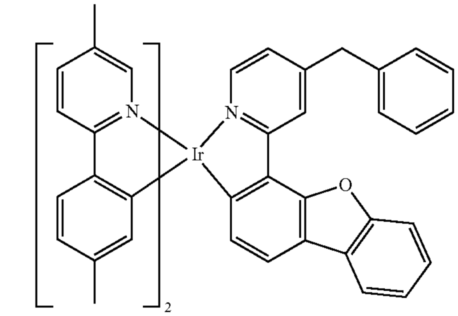
125
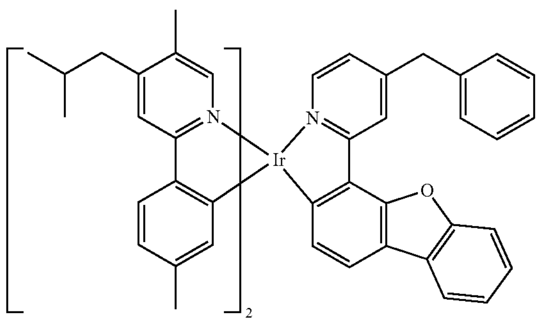
126
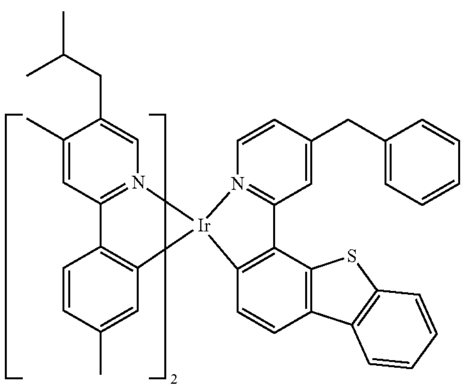
127
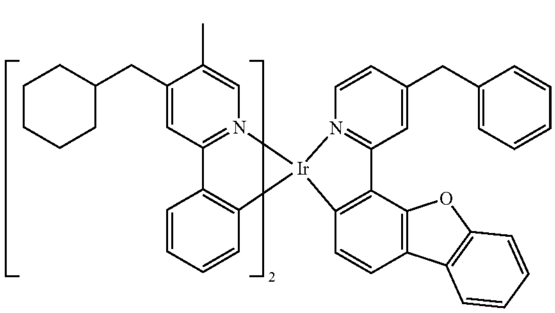
128
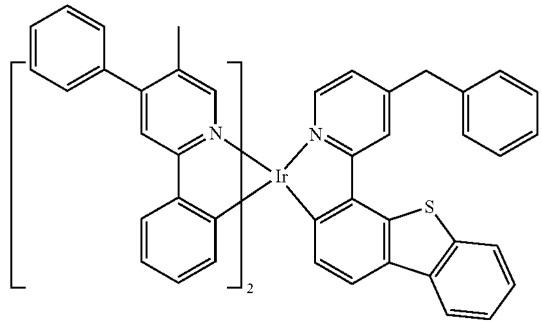
129
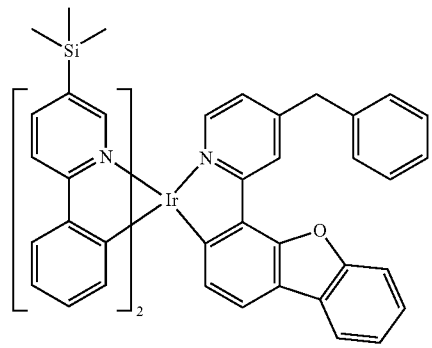
130
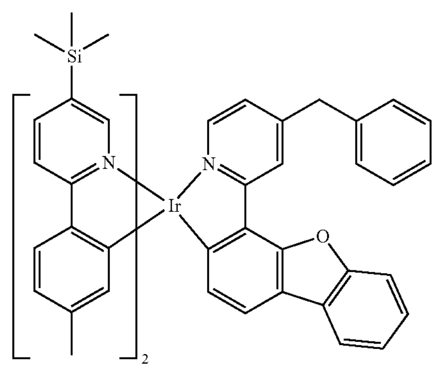
131
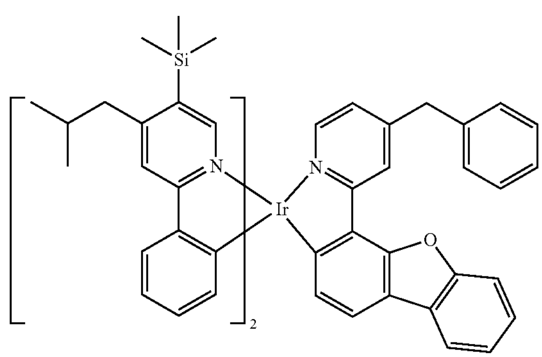

-continued
132
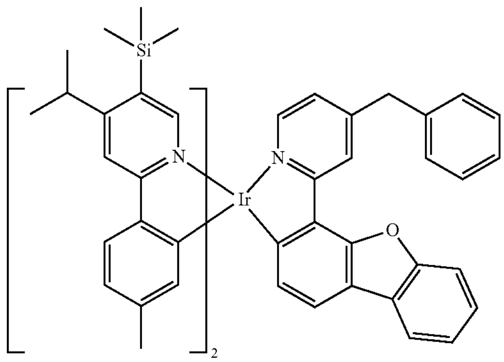
133
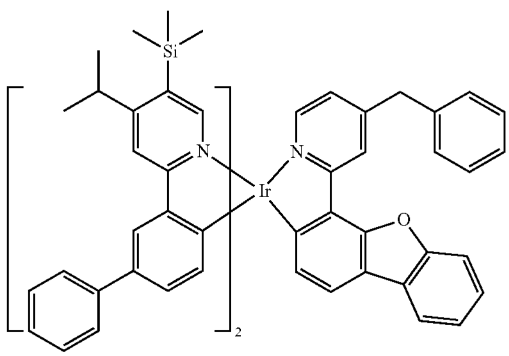
134
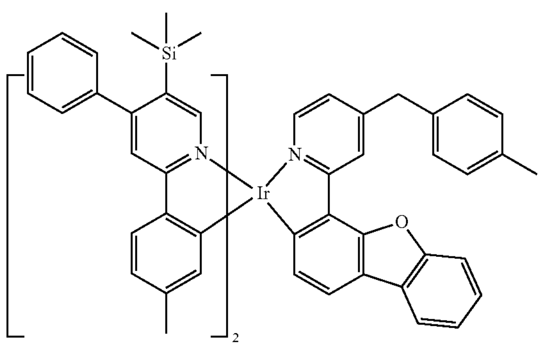
135
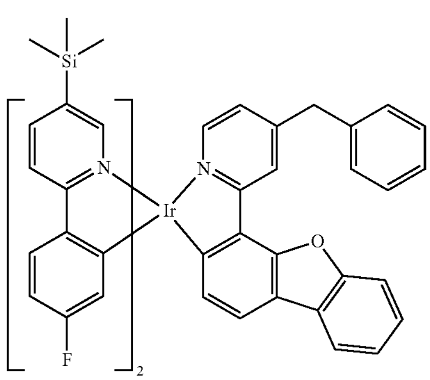
-continued
136
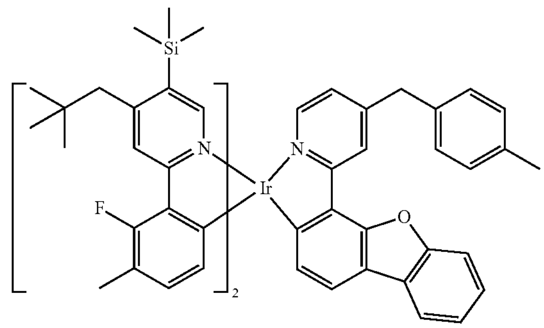
137
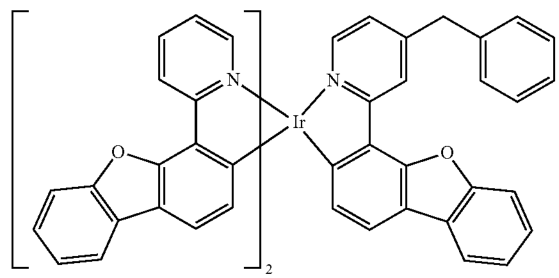
138
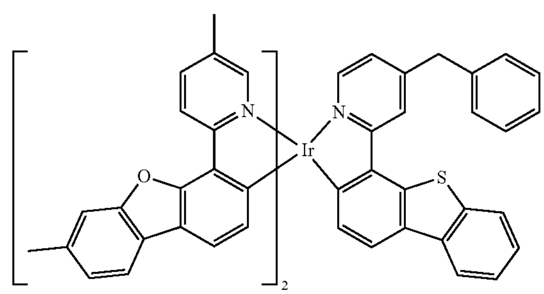
139
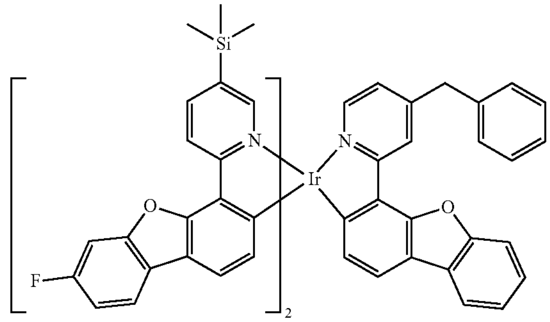

140
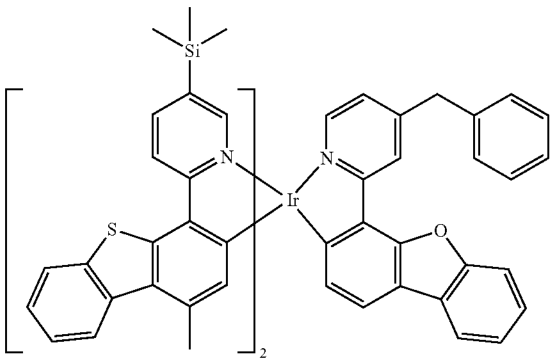
141
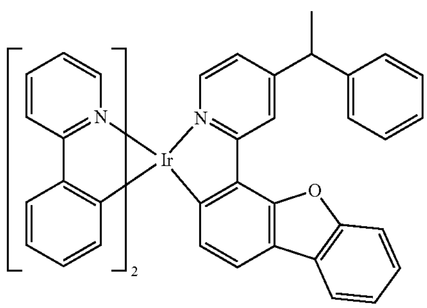
142
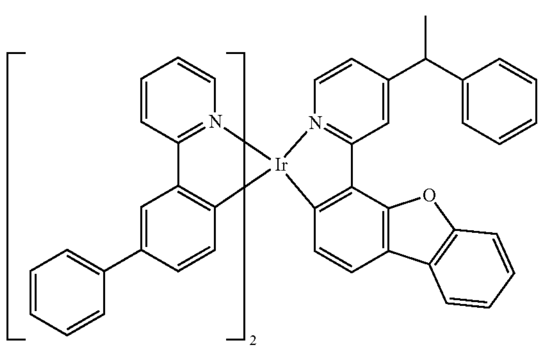
143
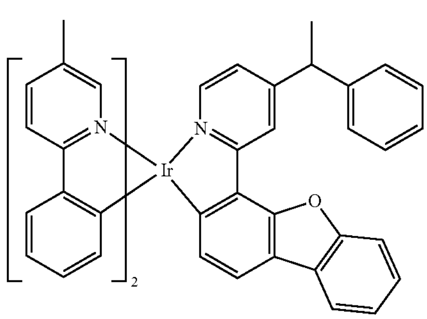
144
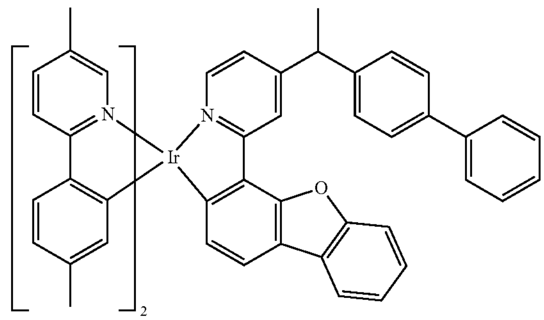
145
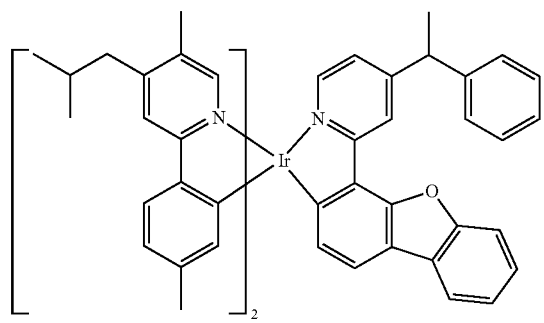
146
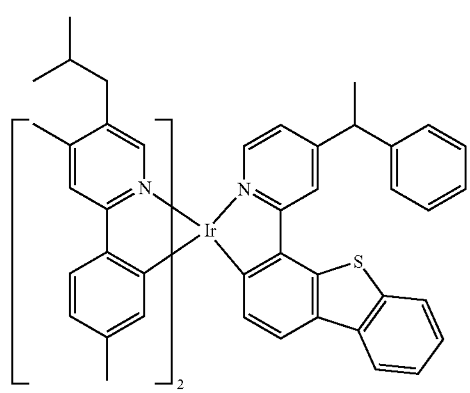
147
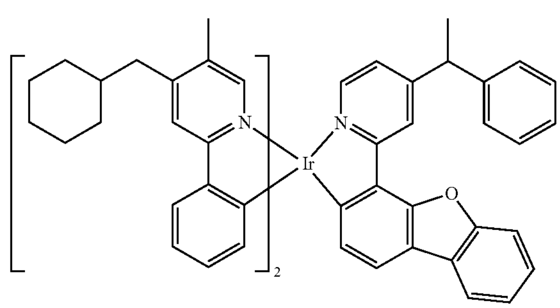

-continued
148
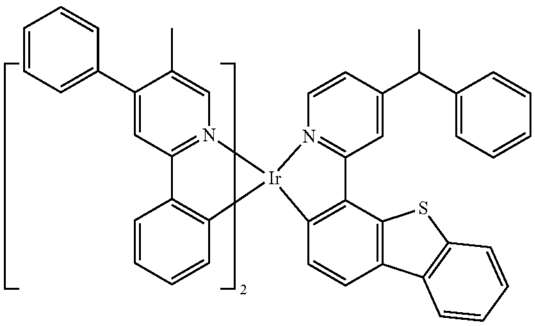
149
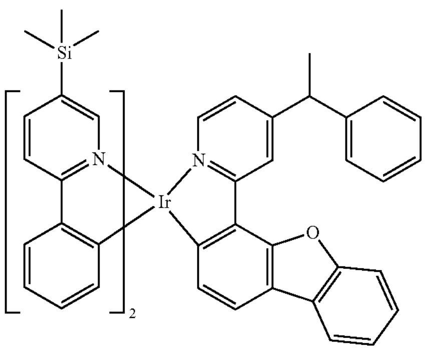
150
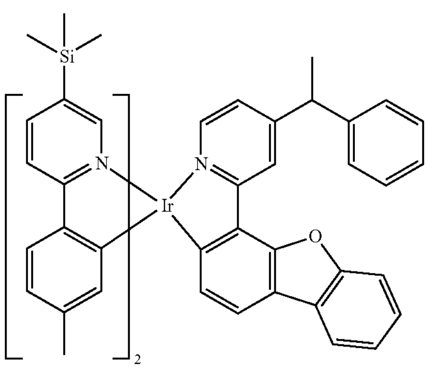
151
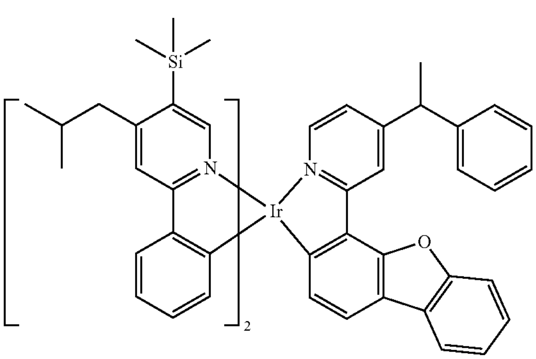
-continued
152
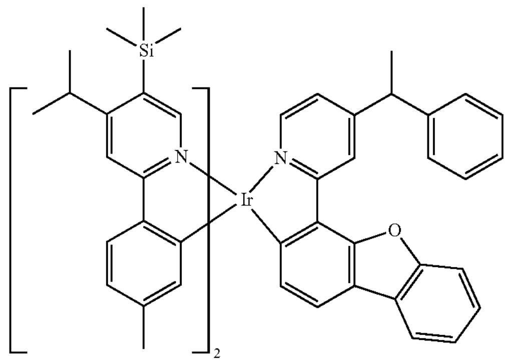
153
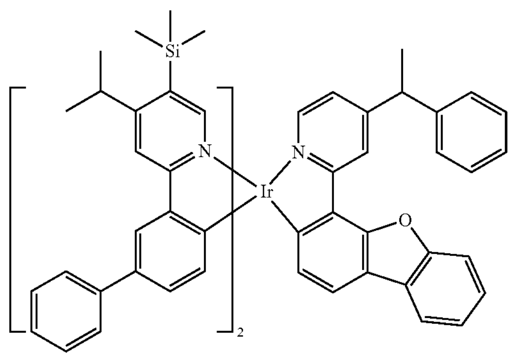
154
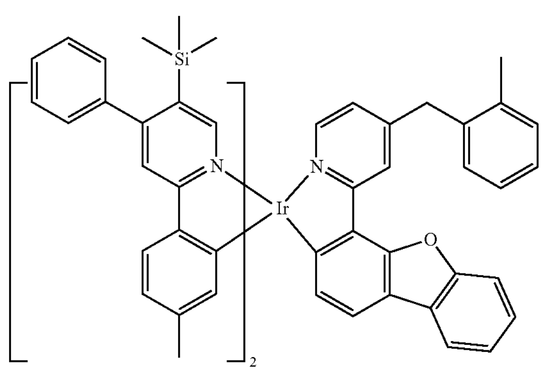
155
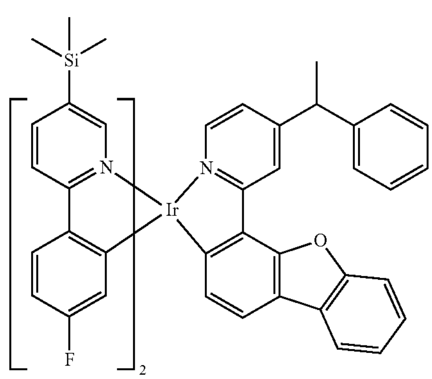

-continued
156
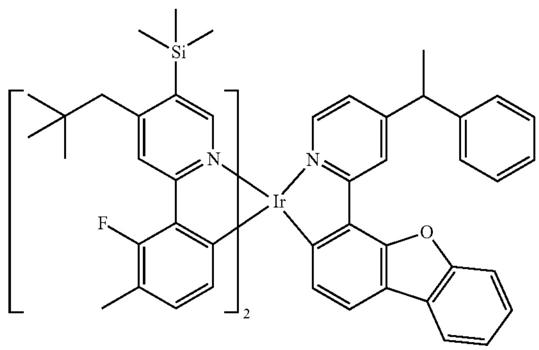
157
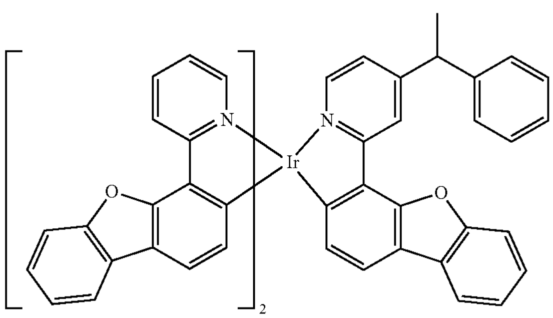
158
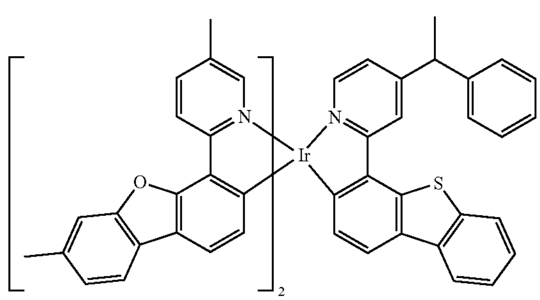
159
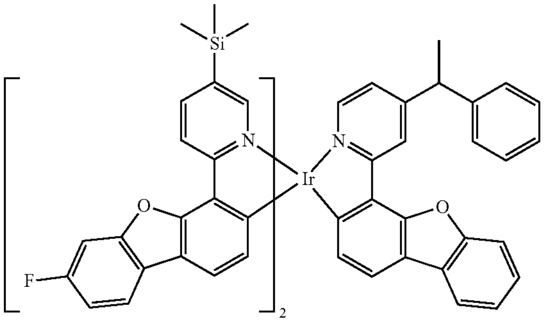
-continued
160
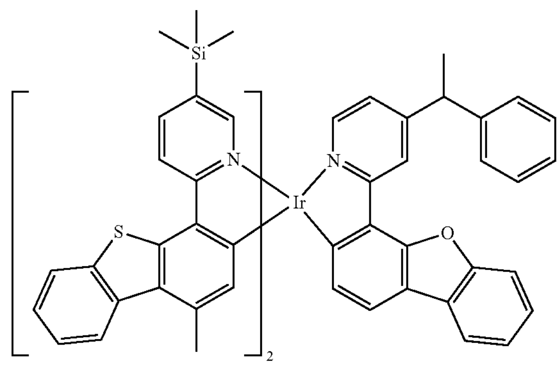
161
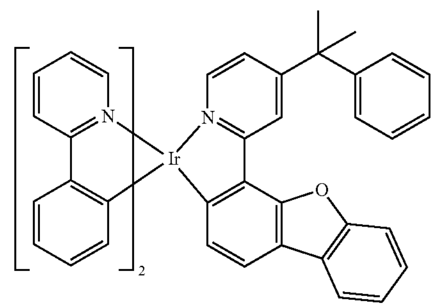
162
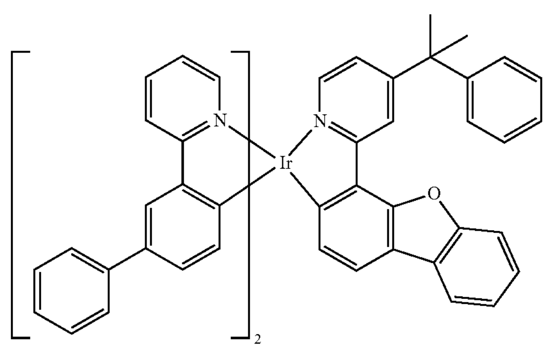
163
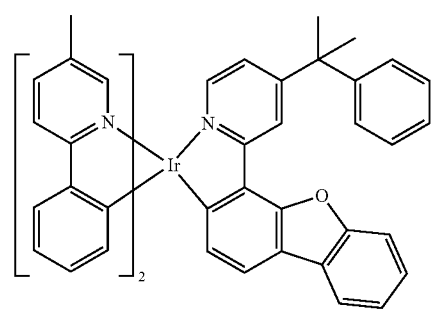

-continued
164
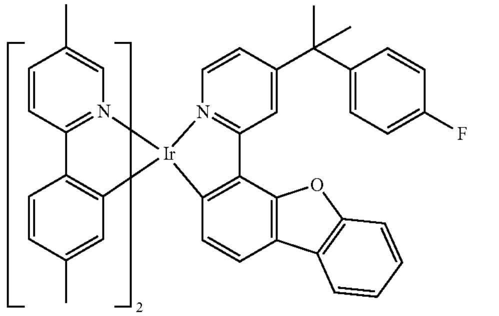
165
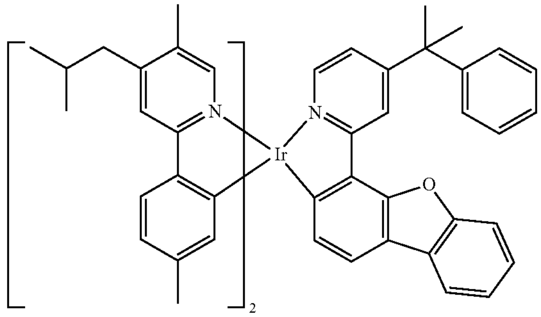
166
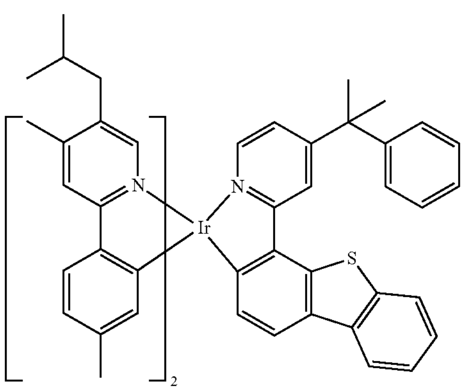
167
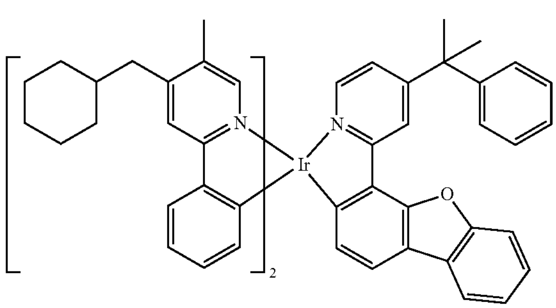
-continued
168
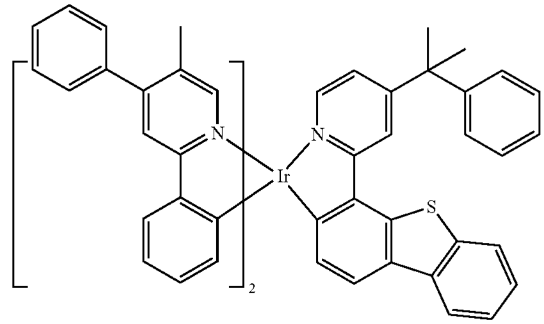
169
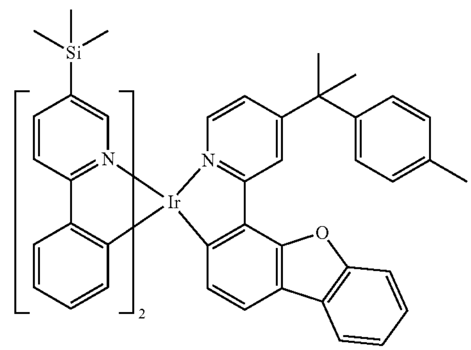
170
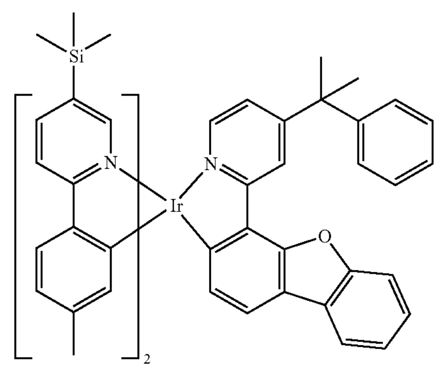
171
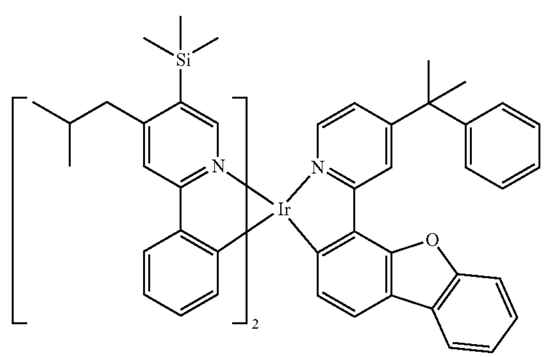

-continued
172
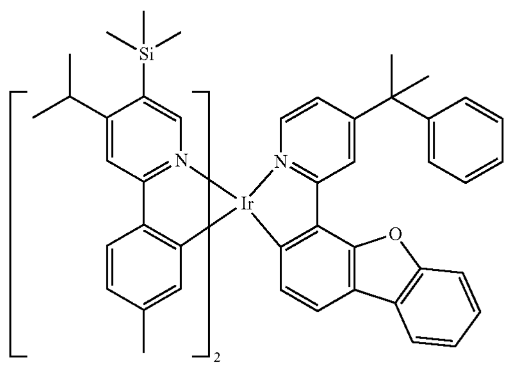
173
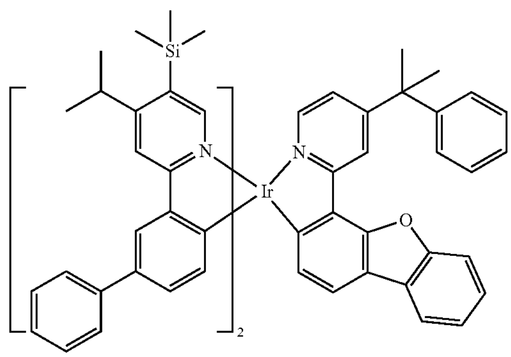
174
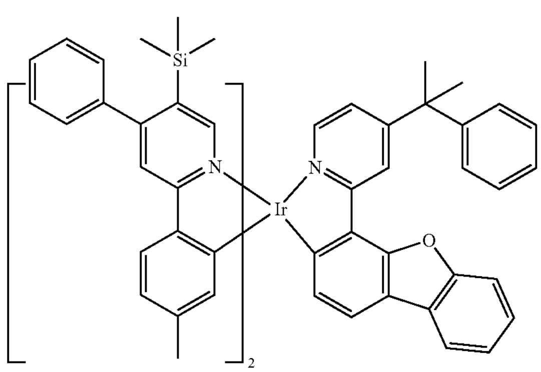
175
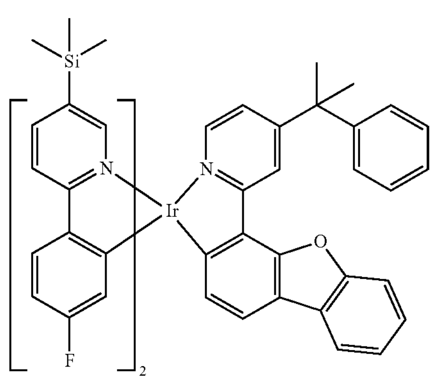
-continued
176
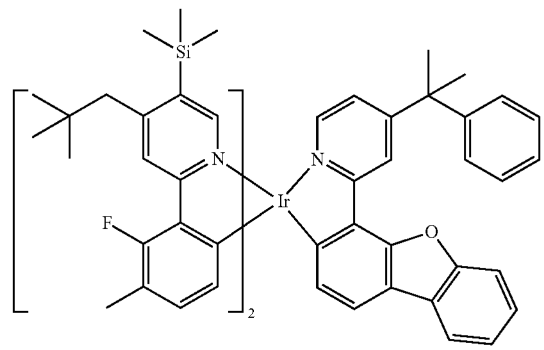
177
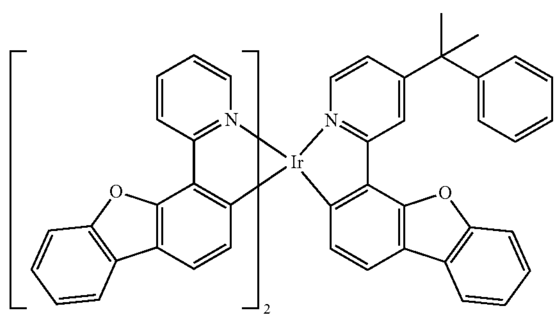
178
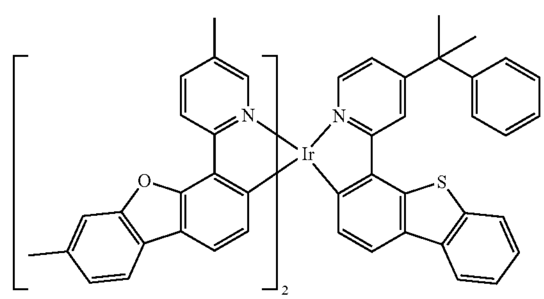
179
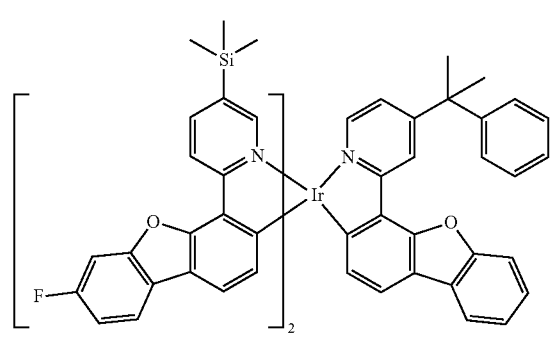

180
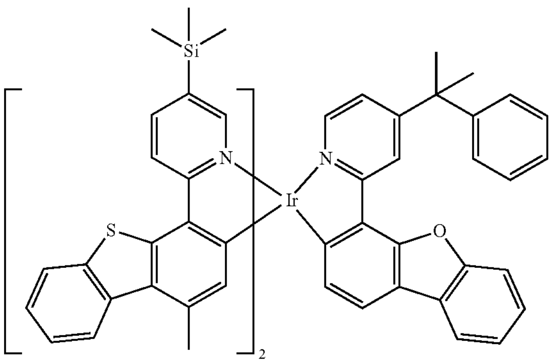
181
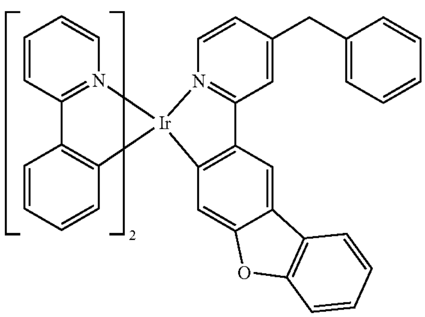
182
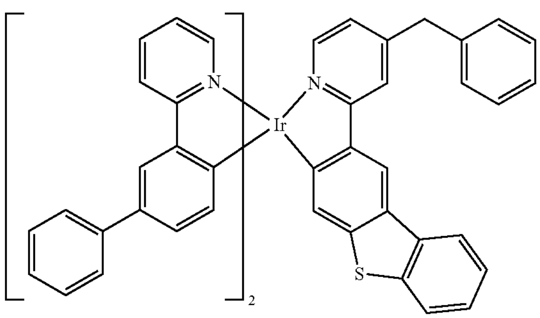
183
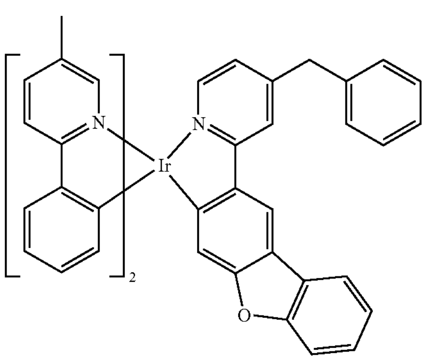
184
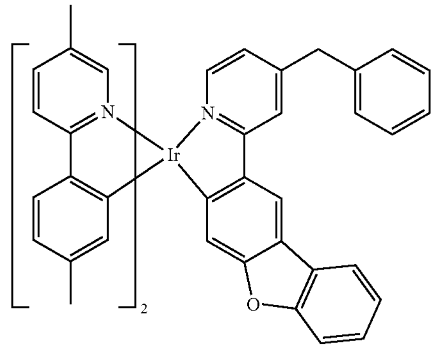
185
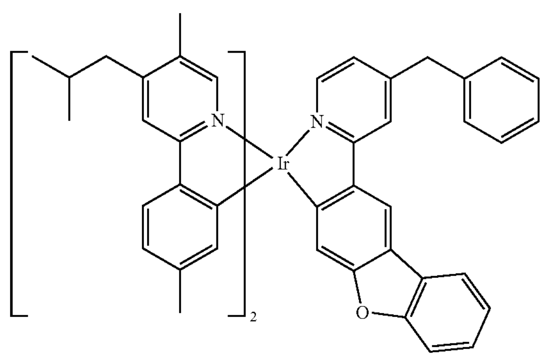
186
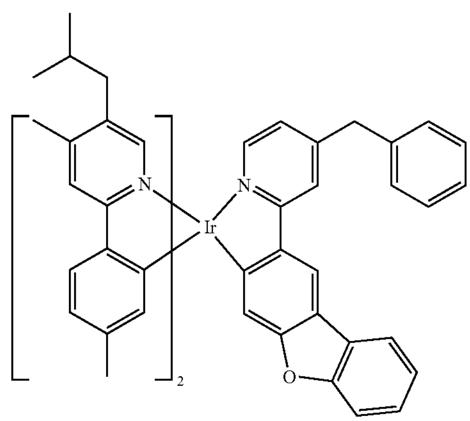
187
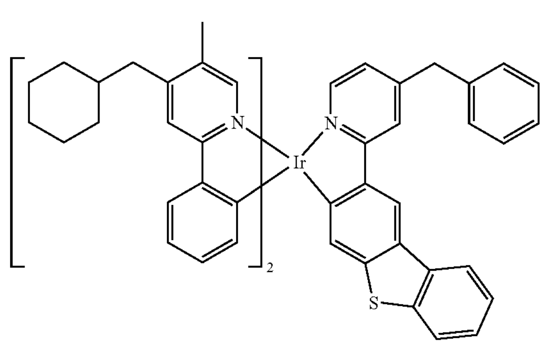

188
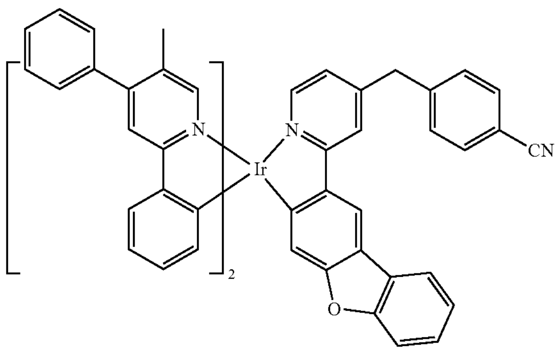
189
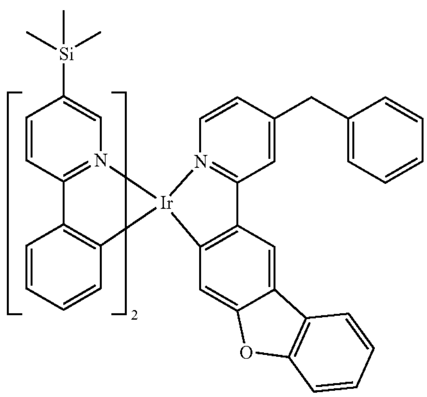
190
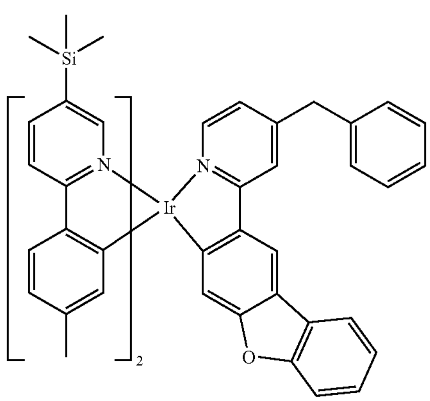
191
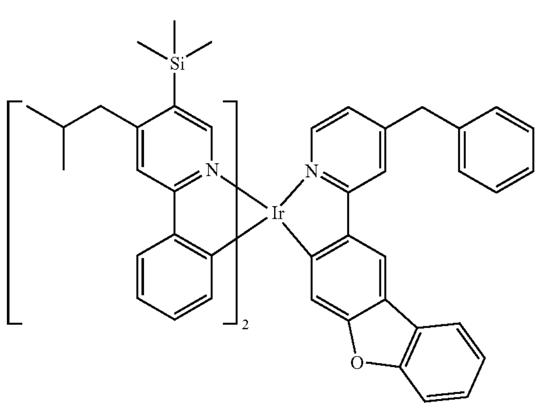
192
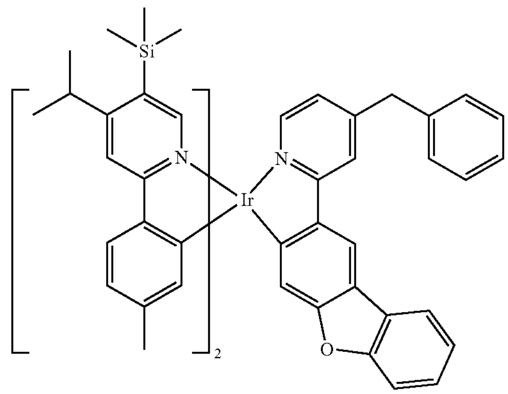
193
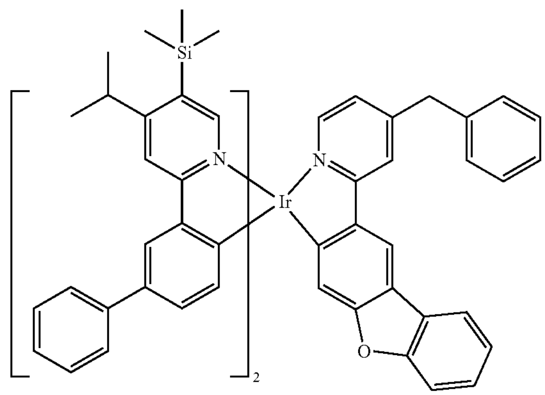
194
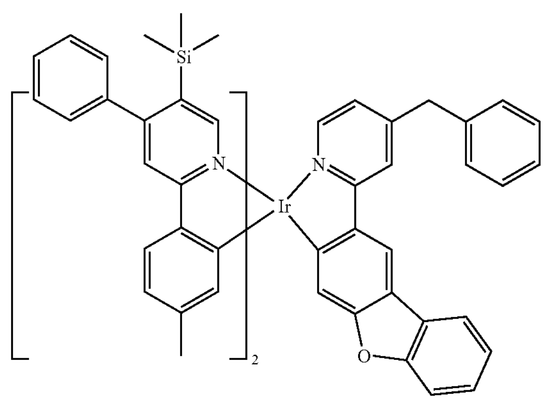
195
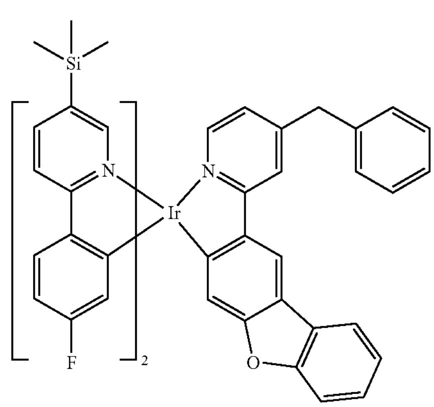

-continued
196
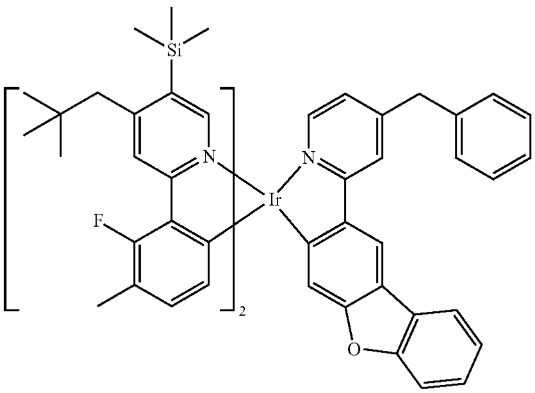
197
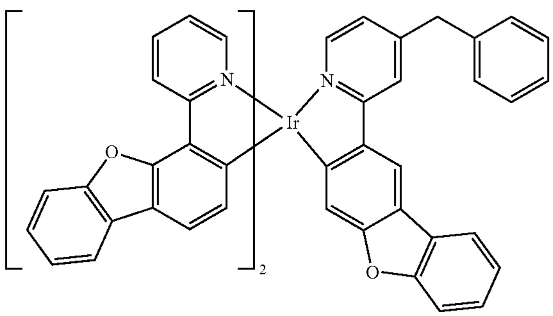
198
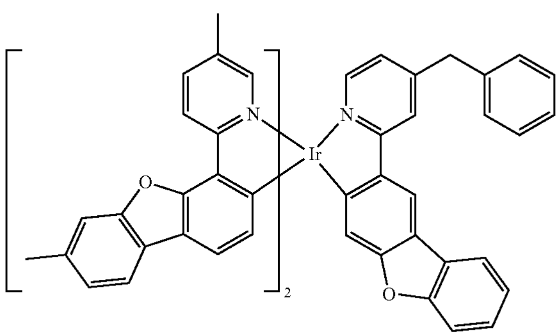
199
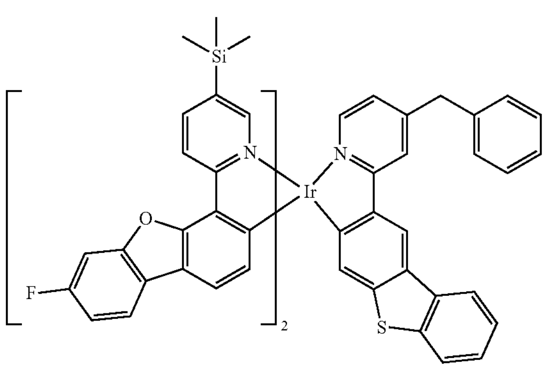
-continued
200
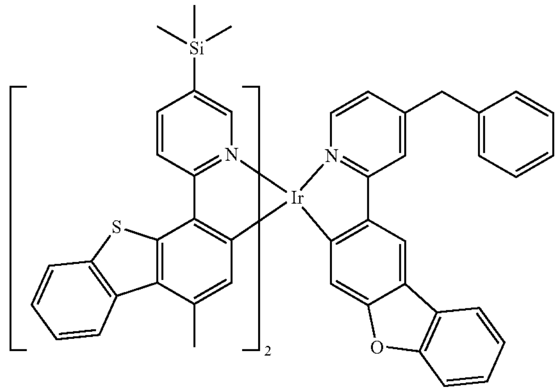
201
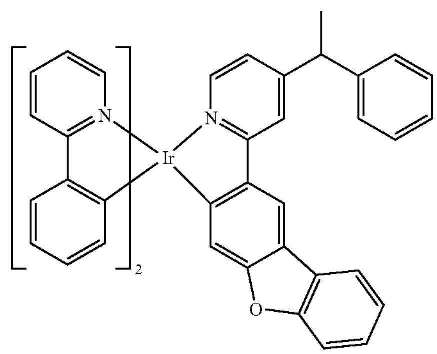
202
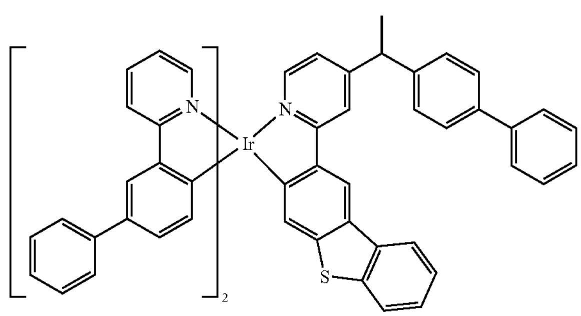
203
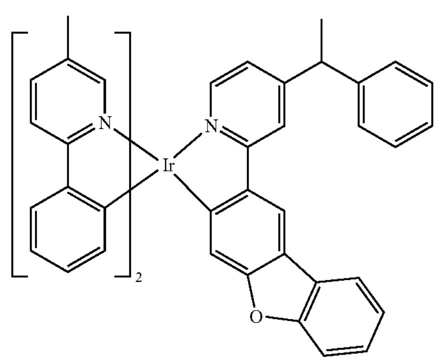

-continued
204
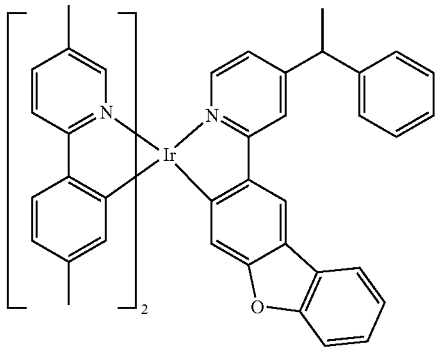
205
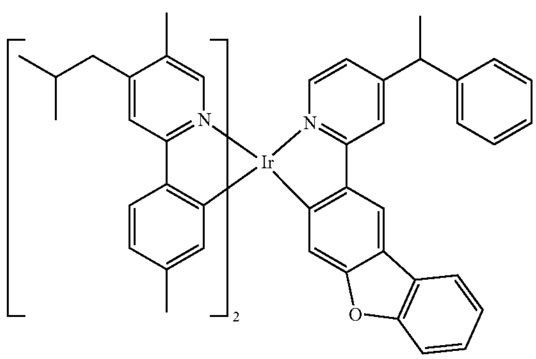
206
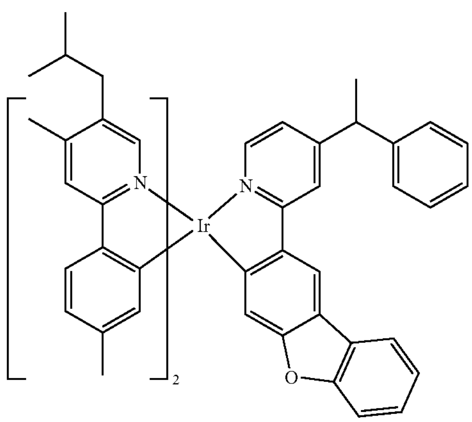
207
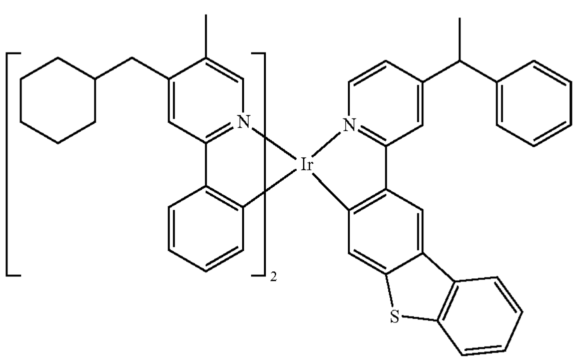
-continued
208
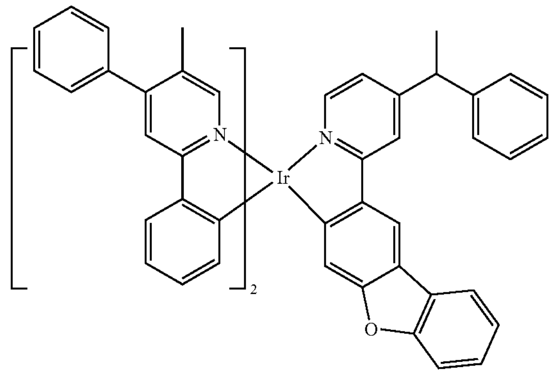
209
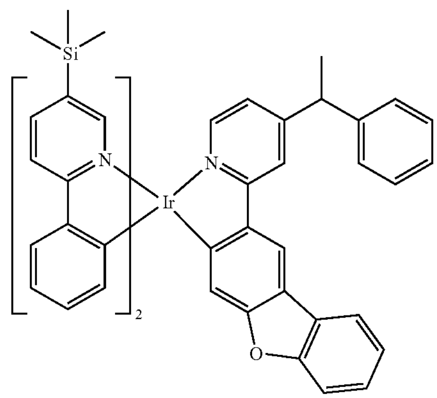
210
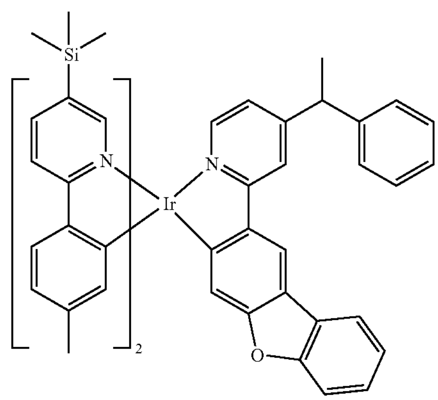
211
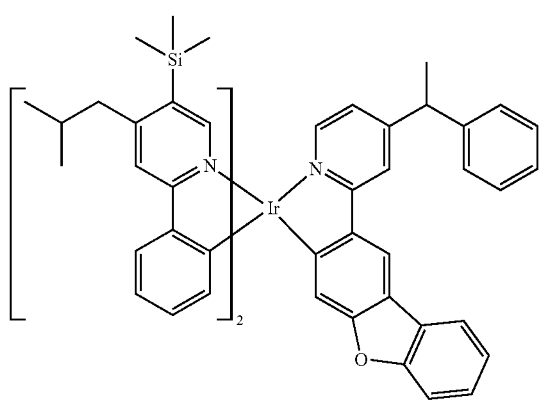

-continued
212
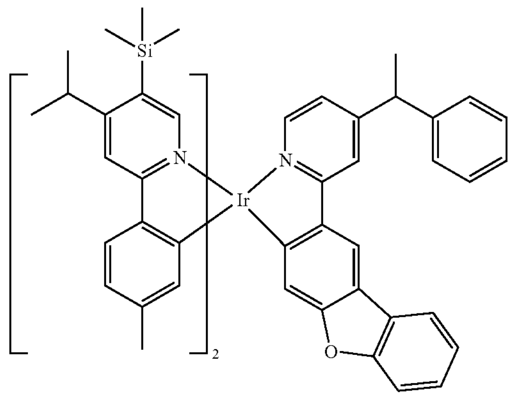
213
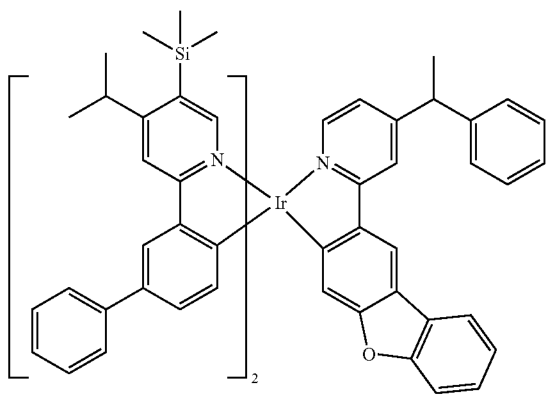
214
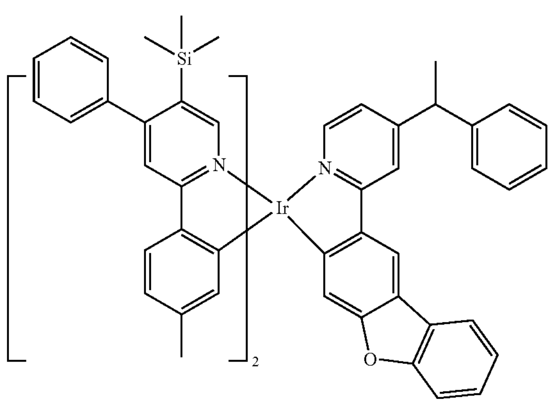
215
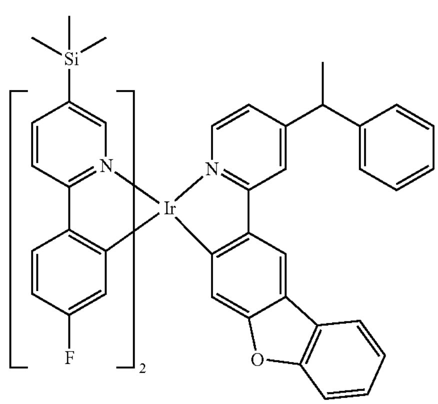
-continued
216
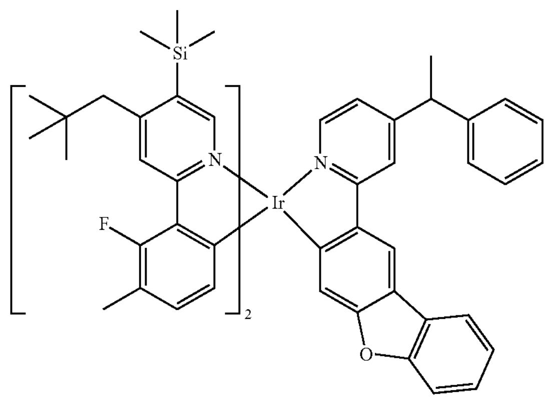
217
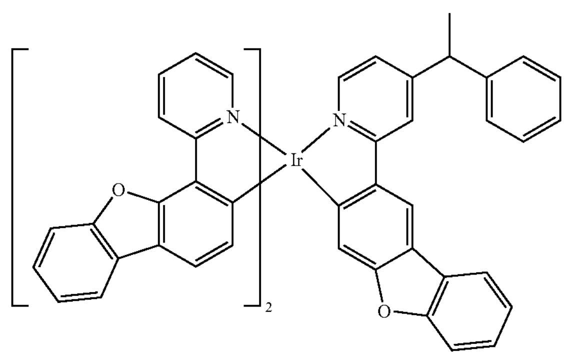
218
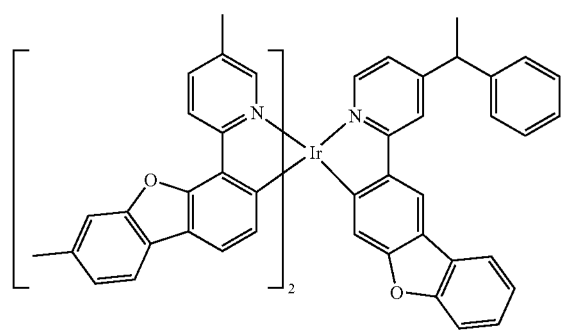
219
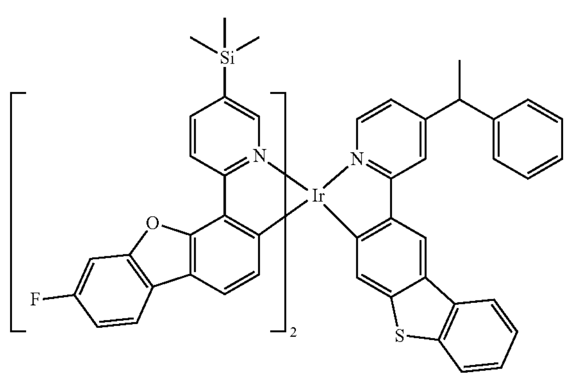

-continued
220
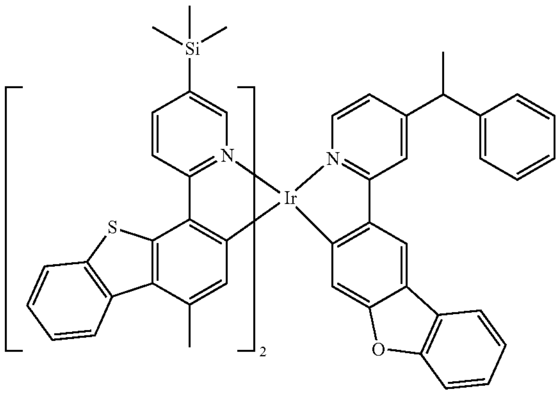
221
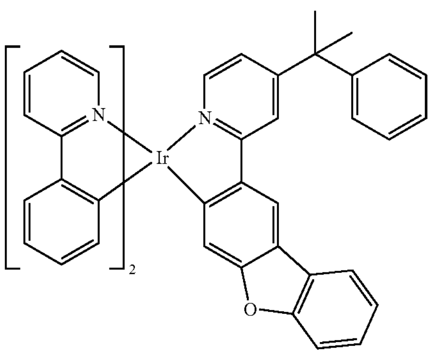
222
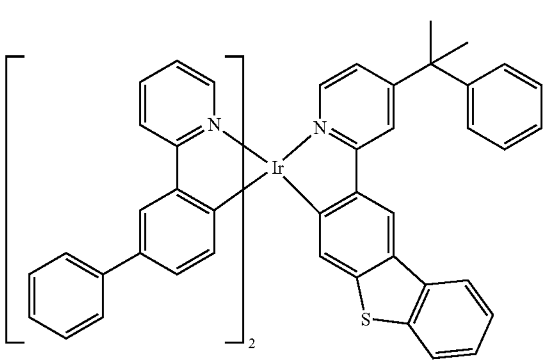
223
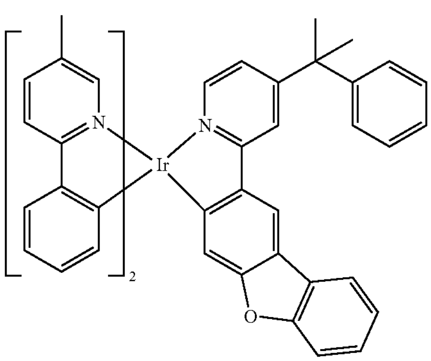
-continued
224
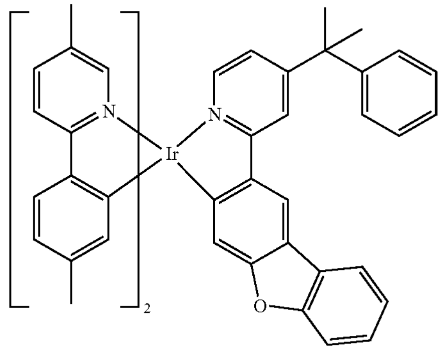
225
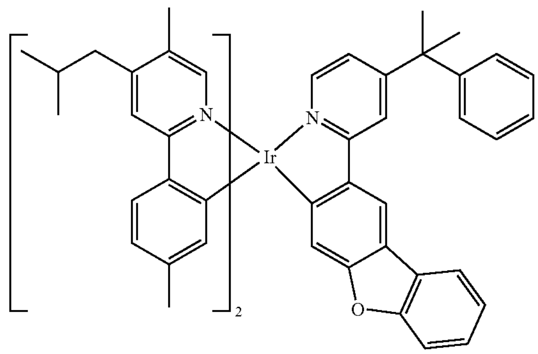
226
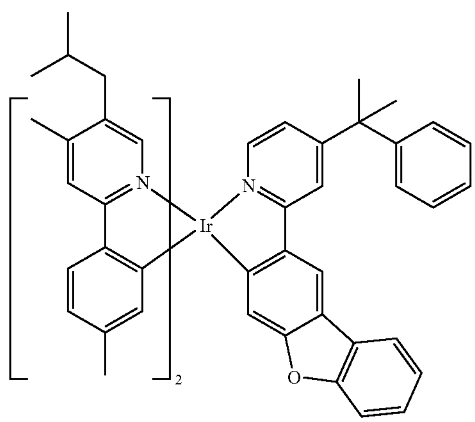
227
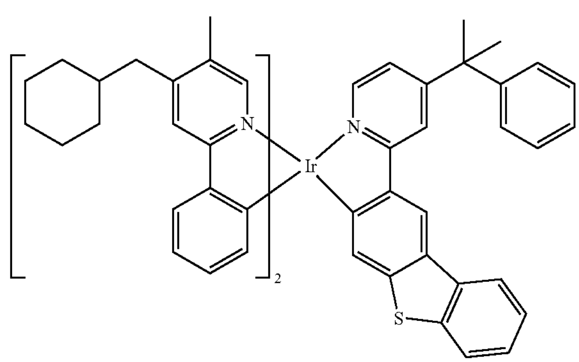

-continued
228
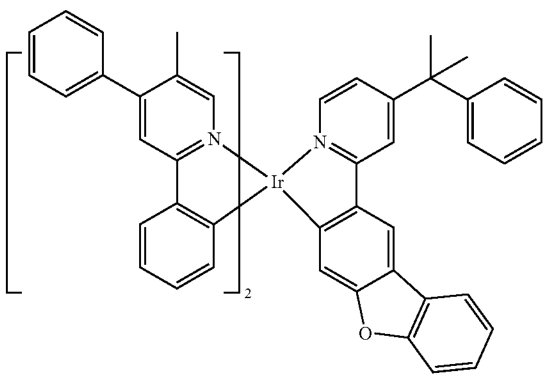
229
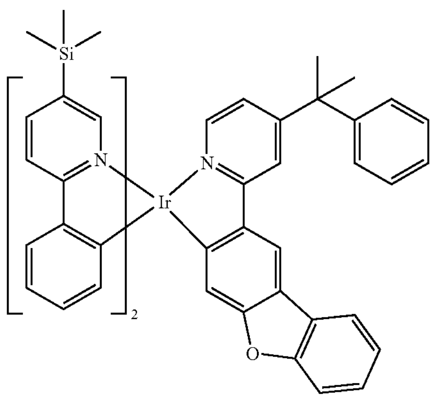
230
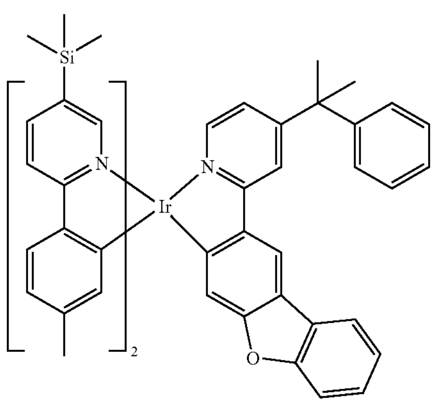
231
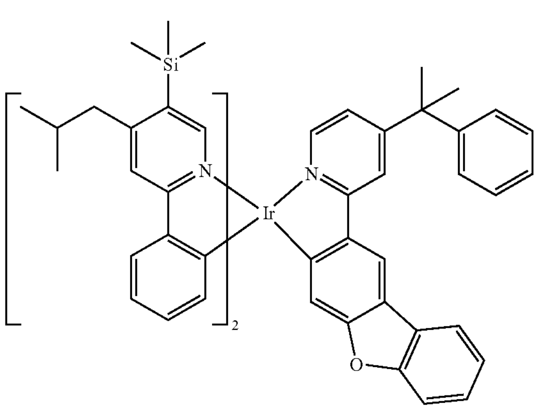
-continued
232
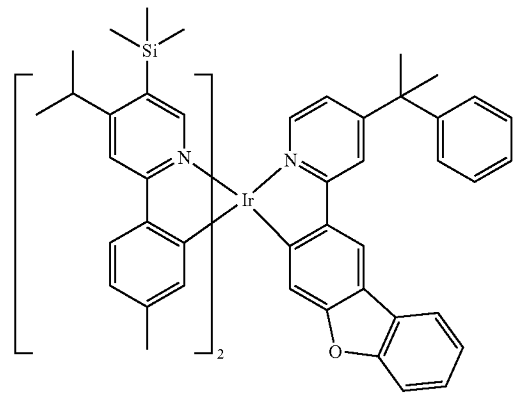
233
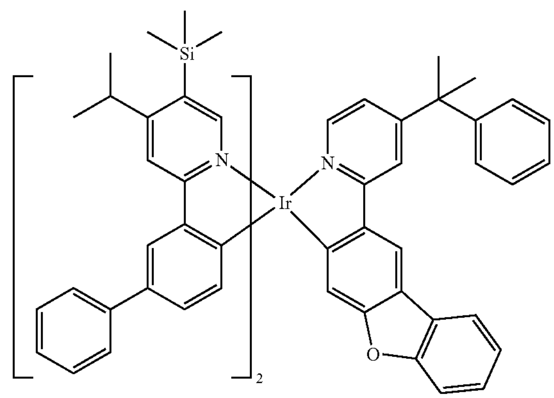
234
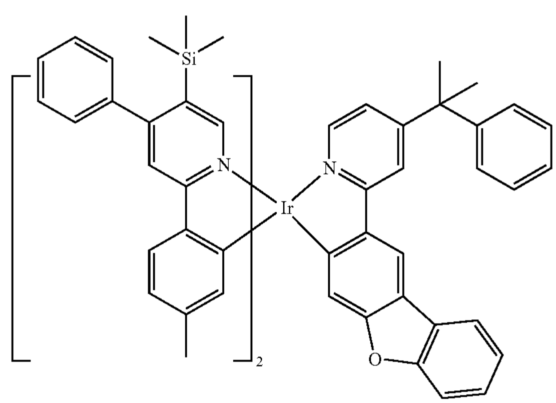
235
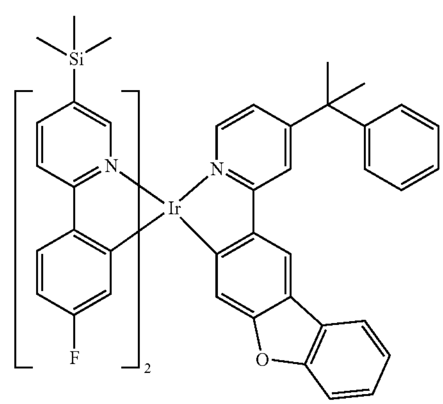

-continued
236
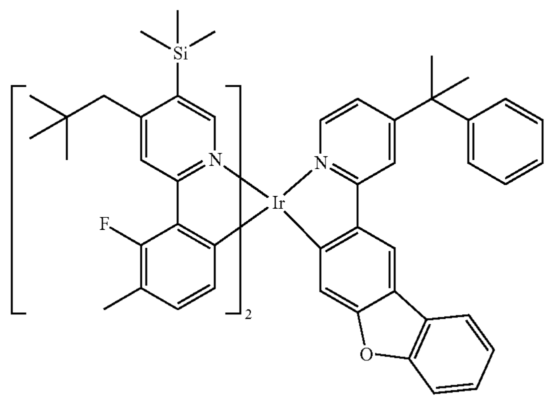
237
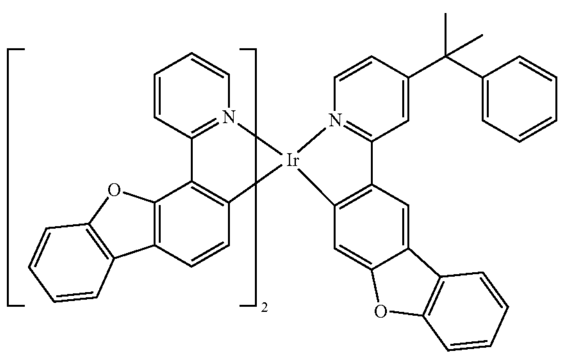
238
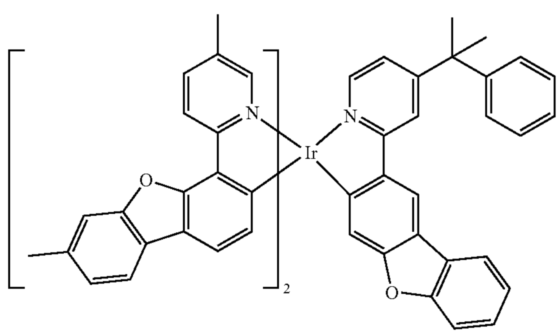
239
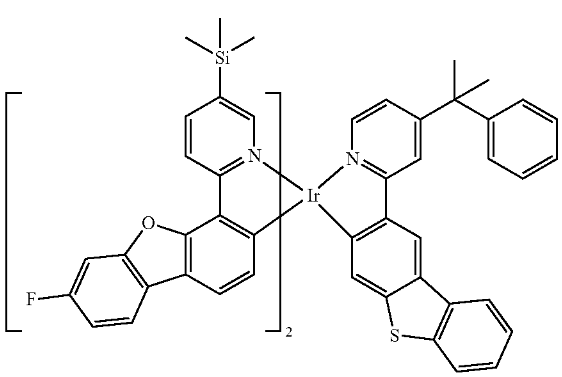
-continued
240
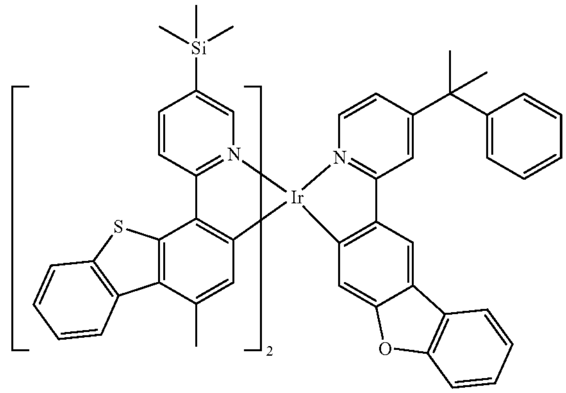
241
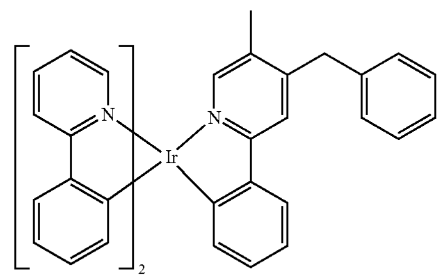
242
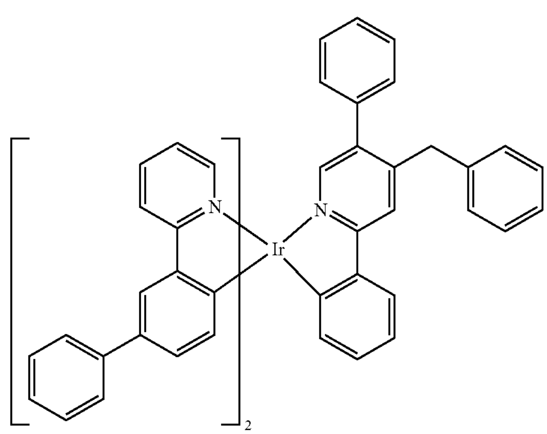
243
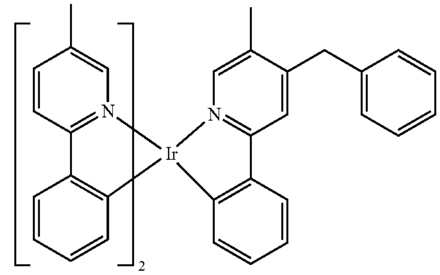

-continued
244
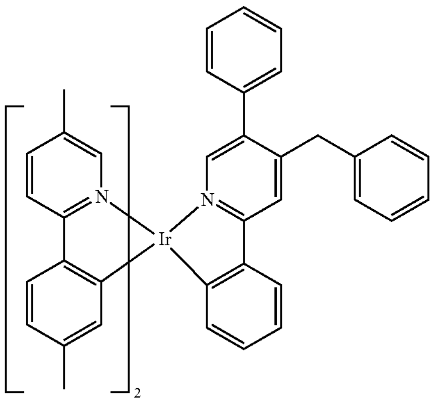
245
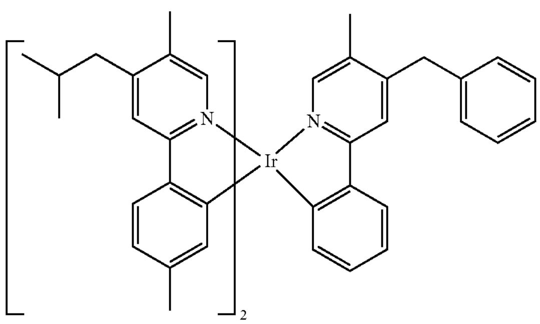
246
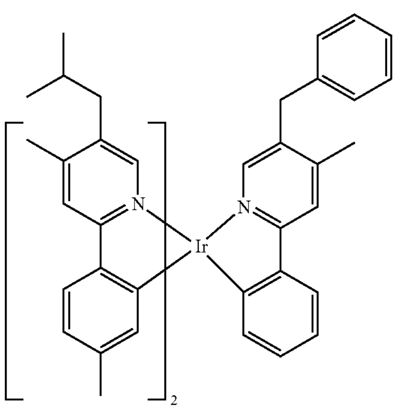
247
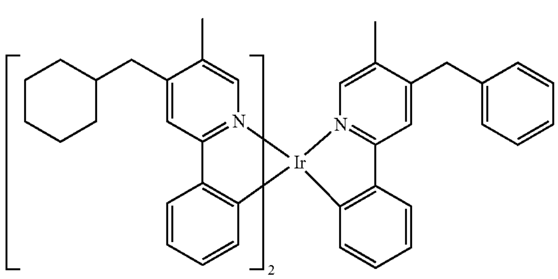
-continued
248
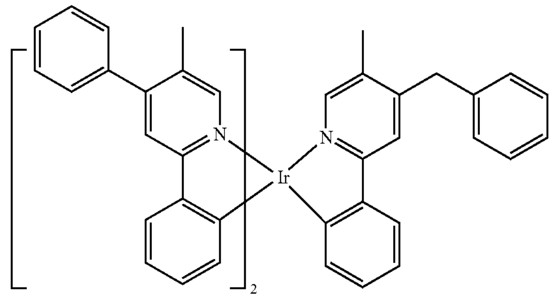
249
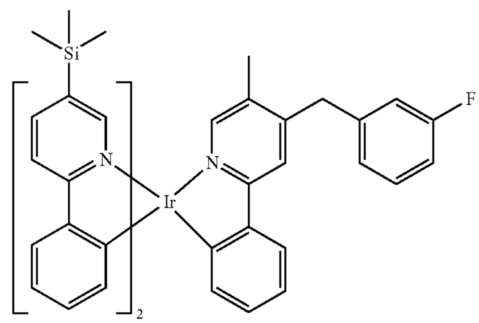
250
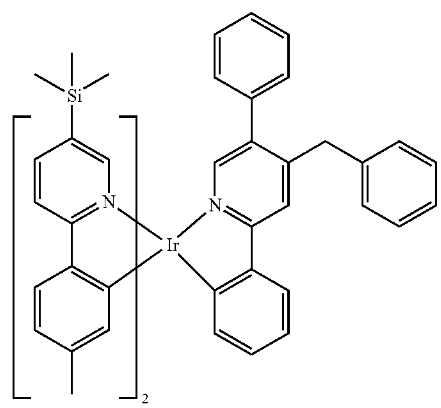
251
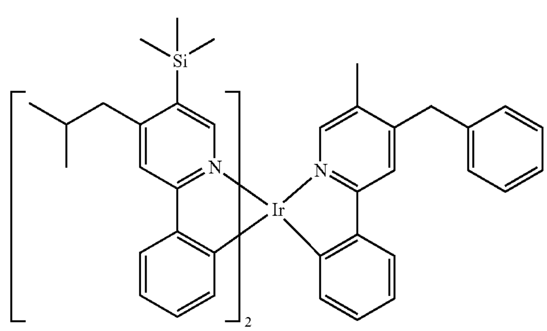

-continued
252
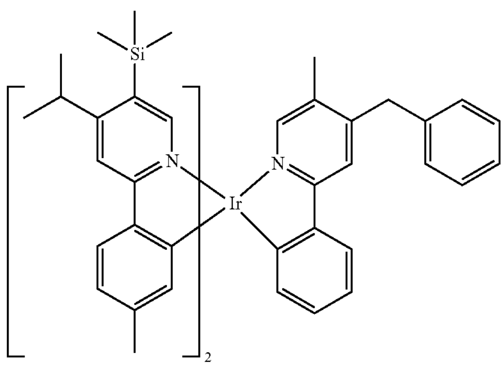
253
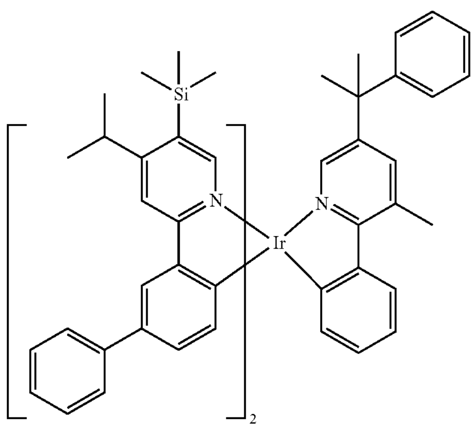
254
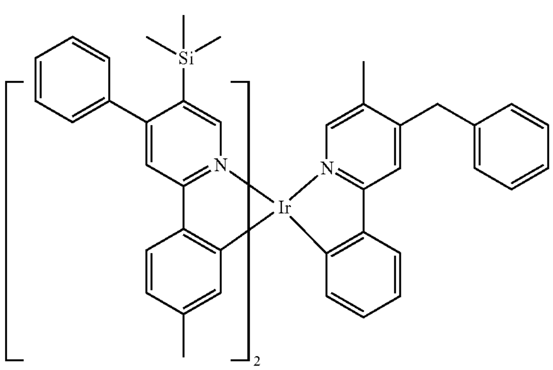
255
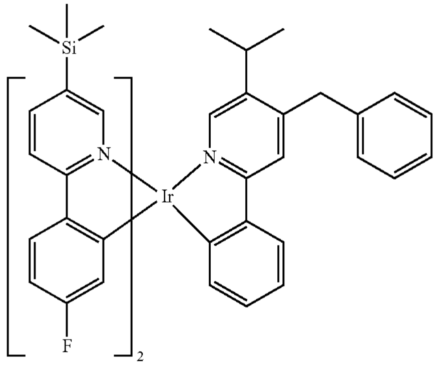
-continued
256
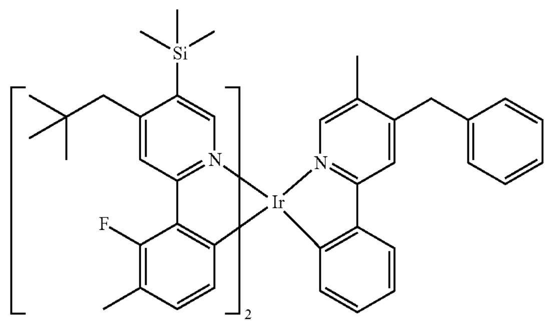
257
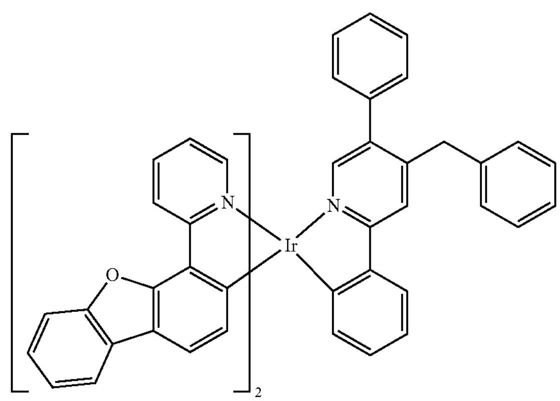
258
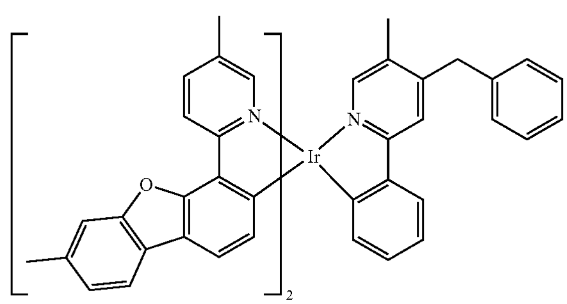
259
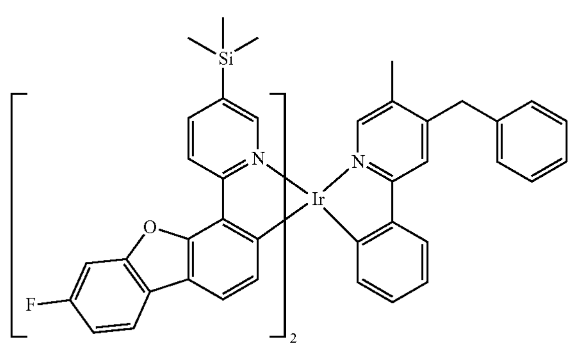

-continued
260
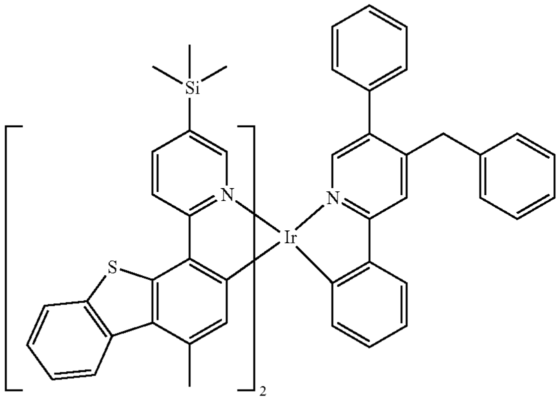
261
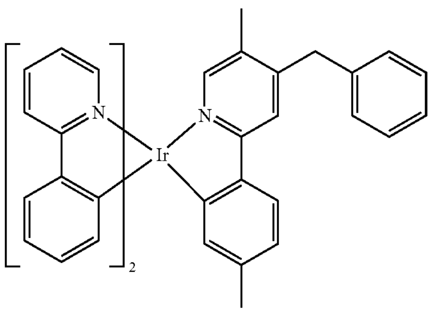
262
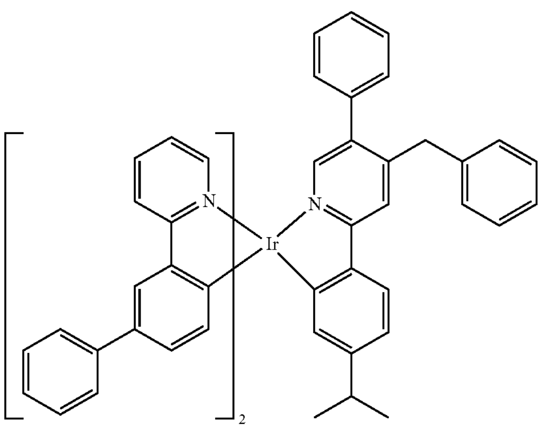
263
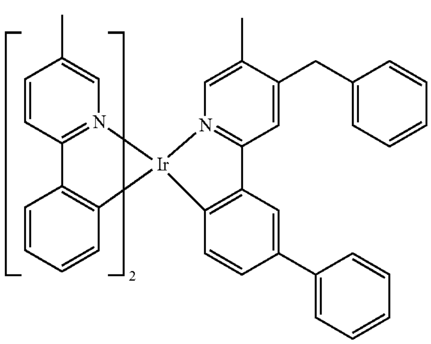
-continued
264
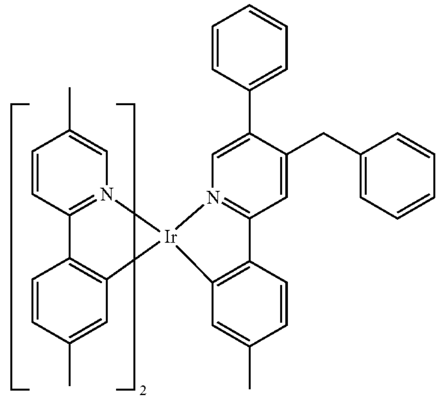
265
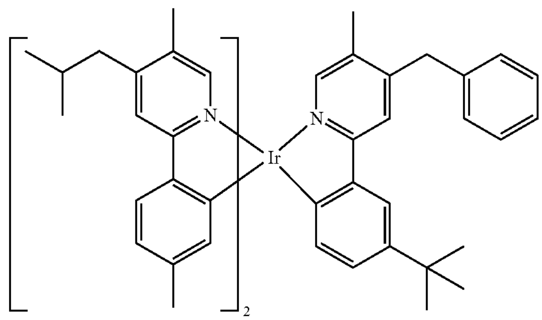
266
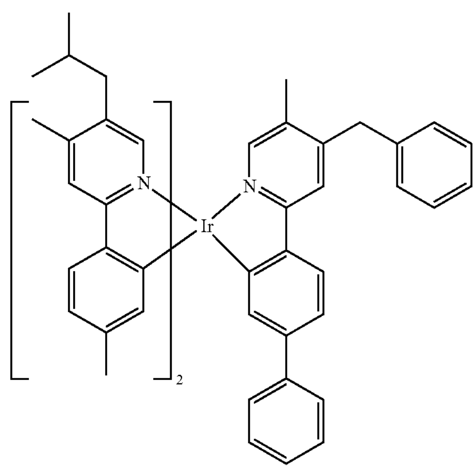
267
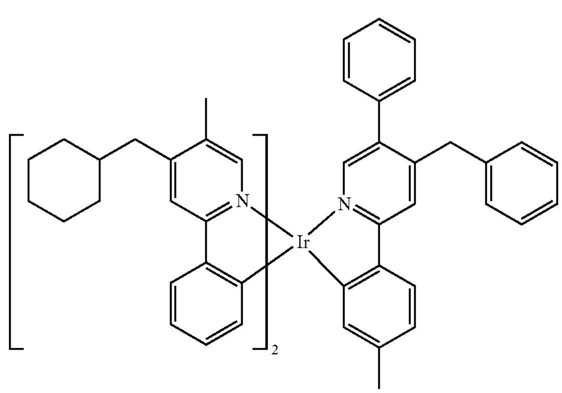

-continued
268
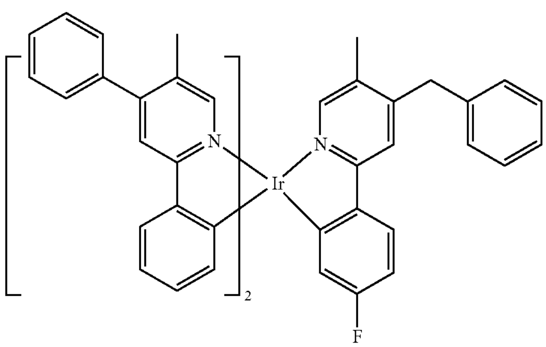
269
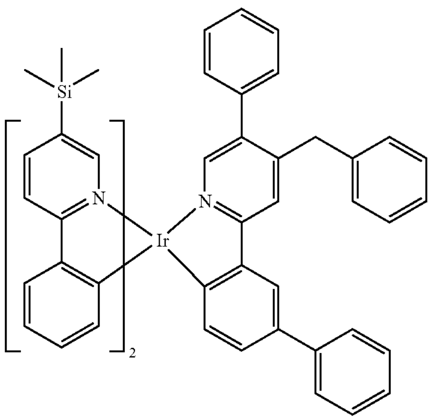
270
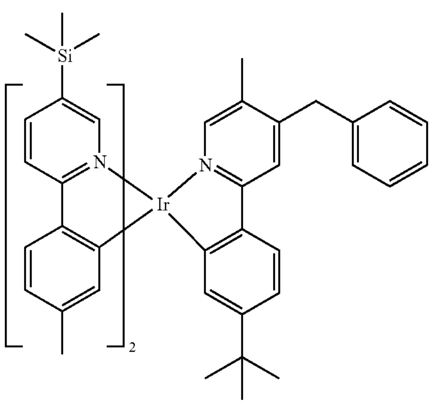
271
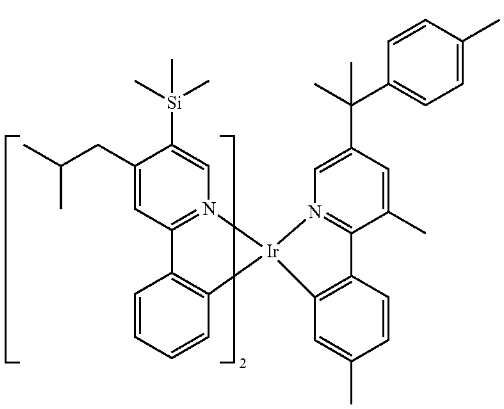
-continued
272
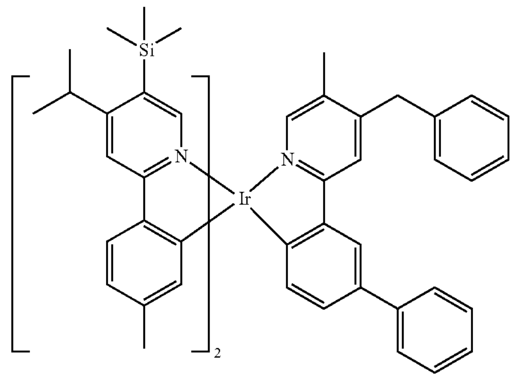
273
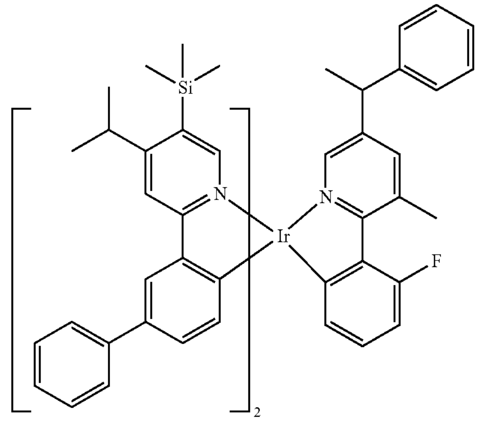
274
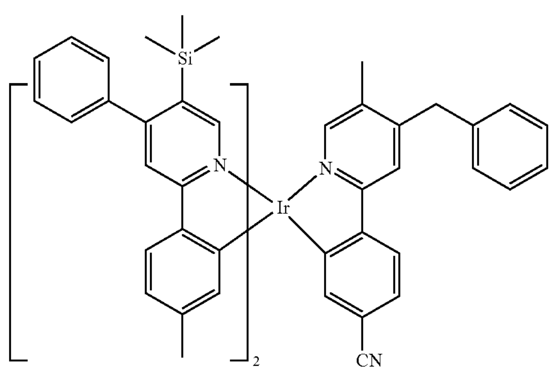
275
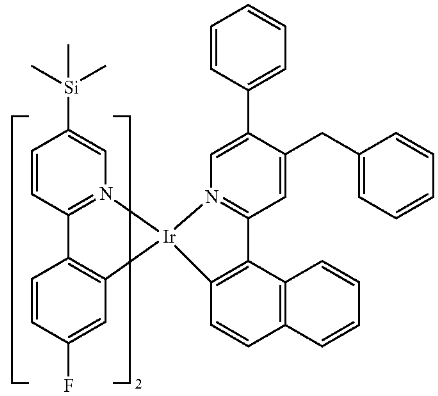

-continued
276
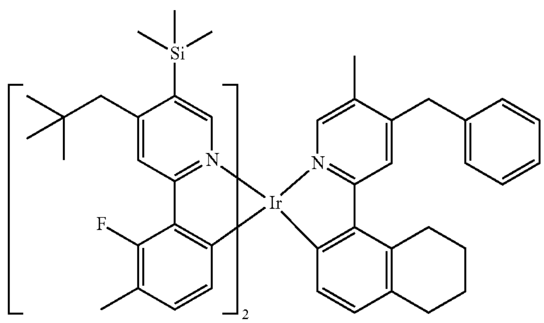
277
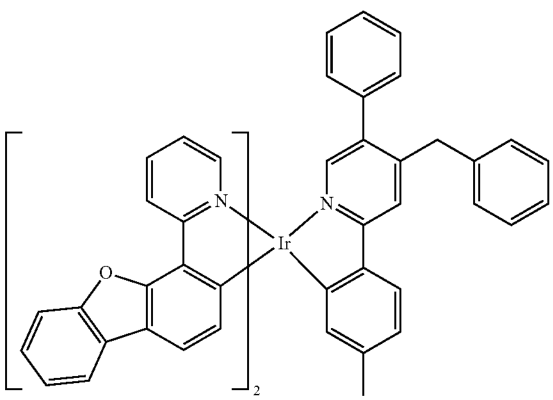
278
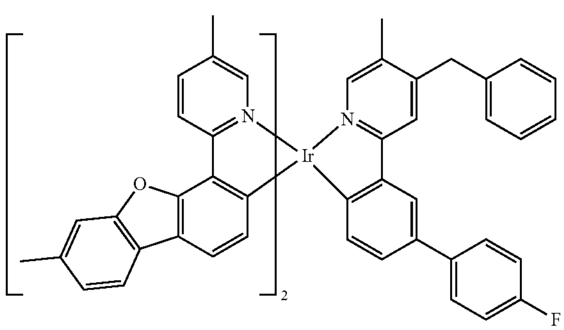
279
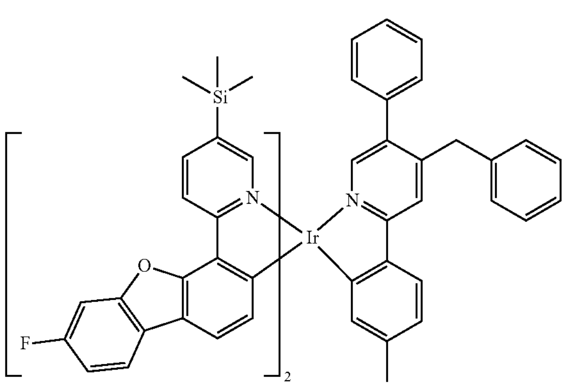
-continued
280
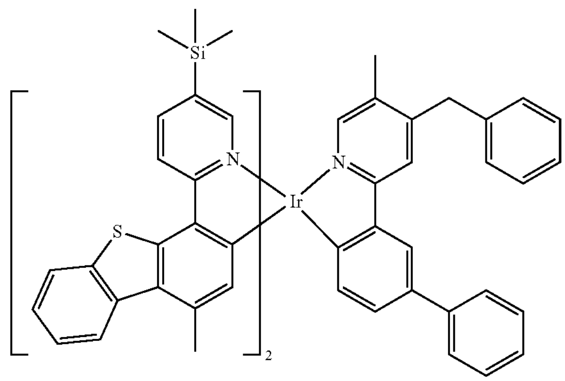
281
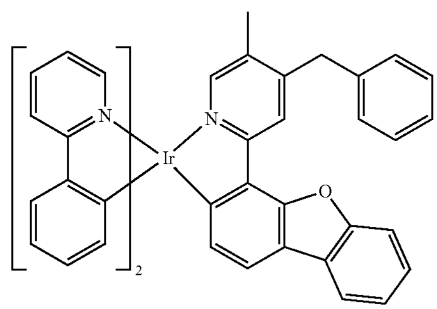
282
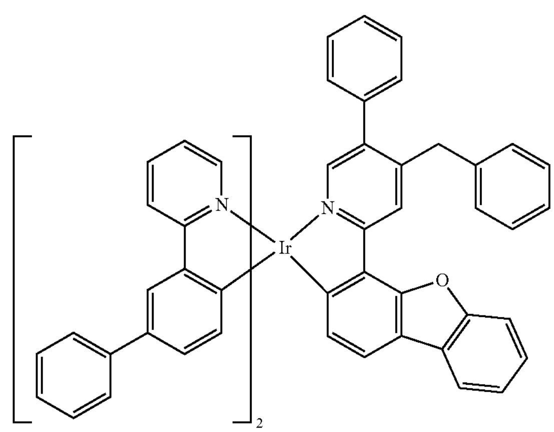
283
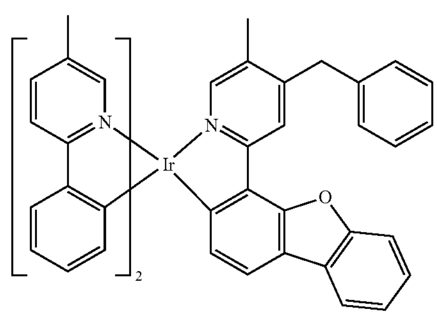

284
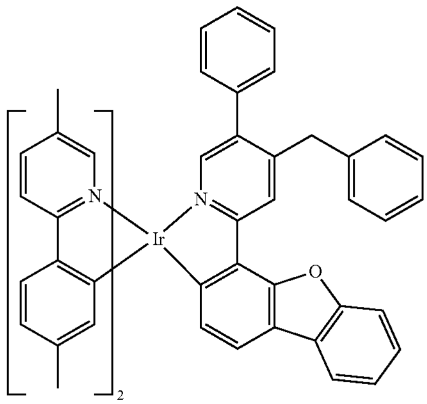
285
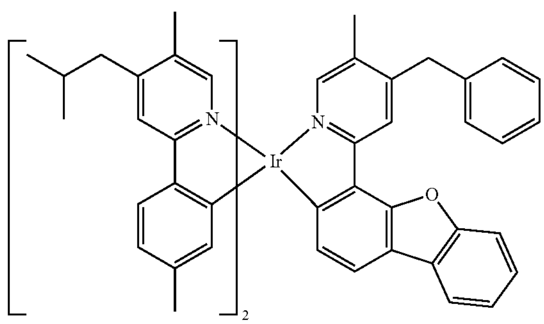
286
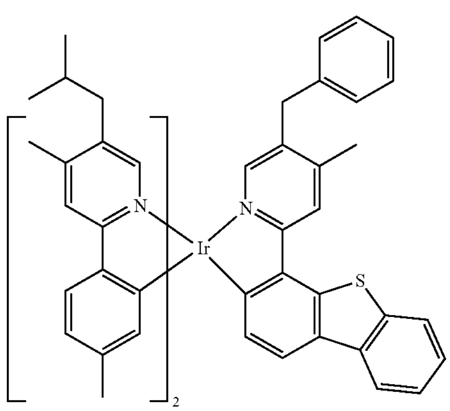
287
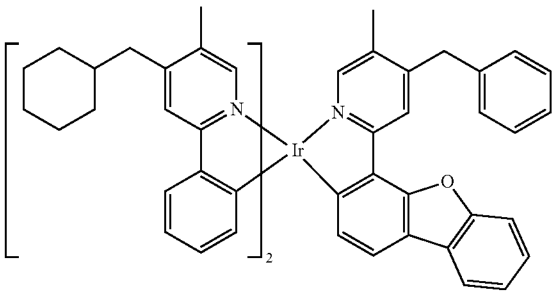
288
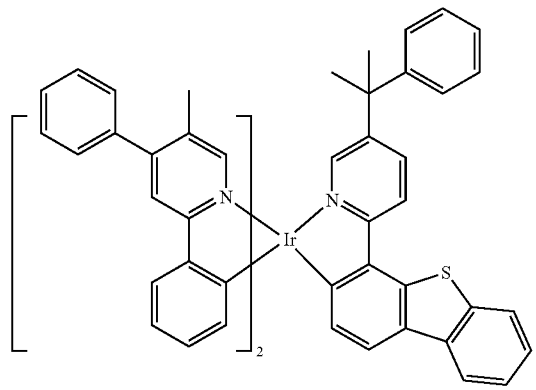
289
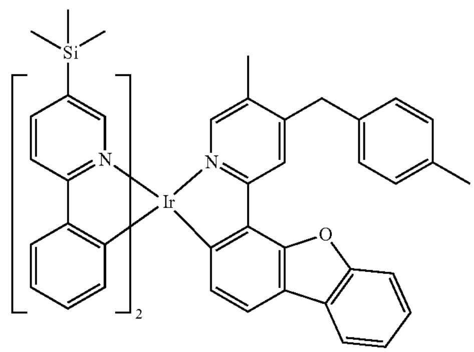
290
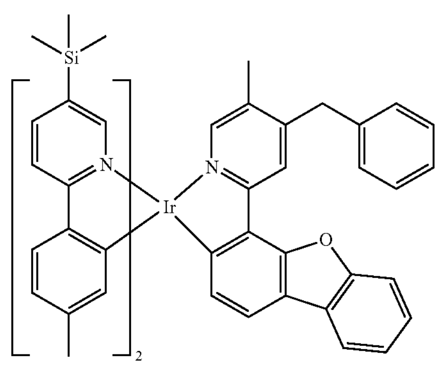
291
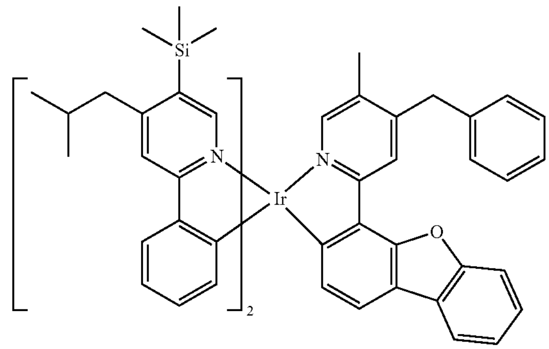

-continued
292
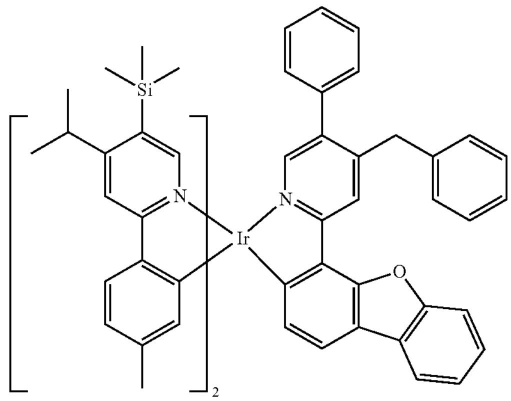
293
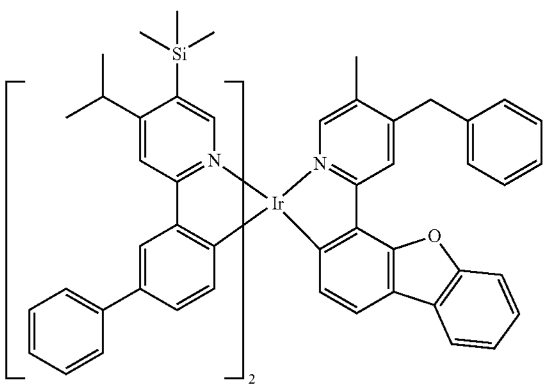
294
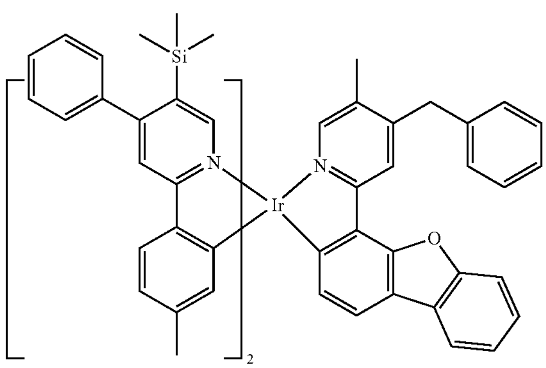
295
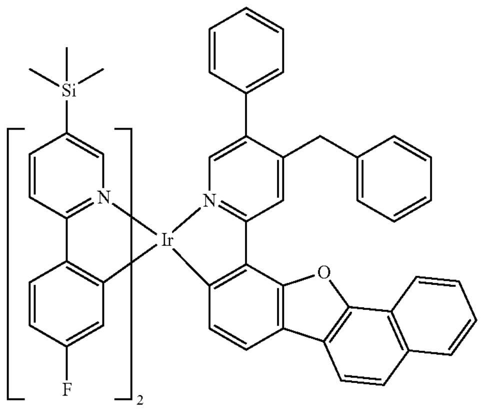
-continued
296
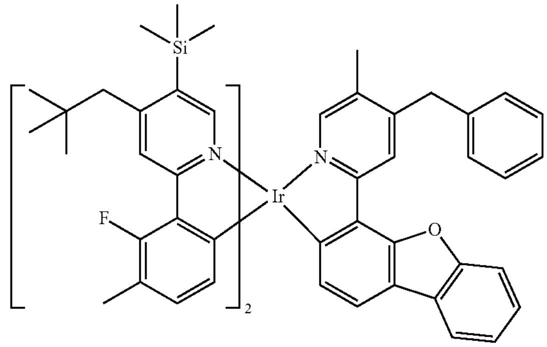
297
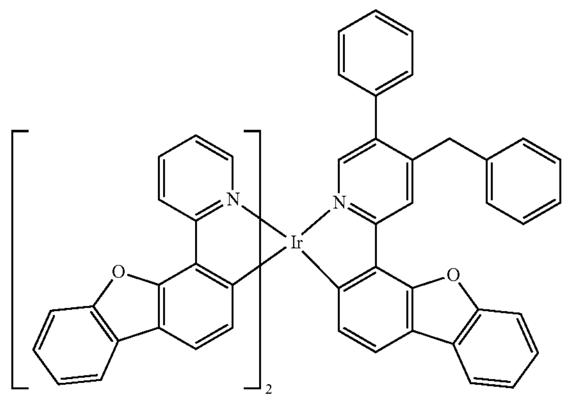
298
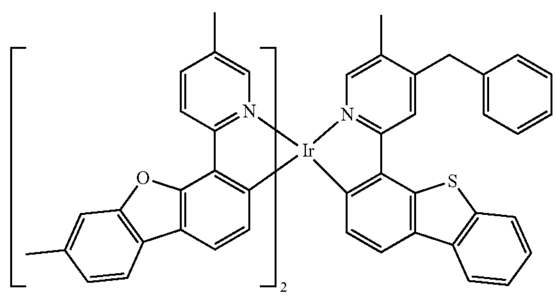
299
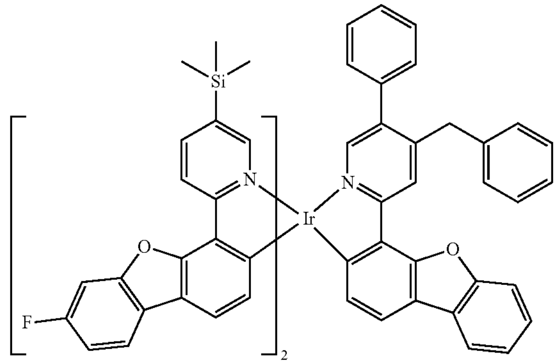

-continued
300
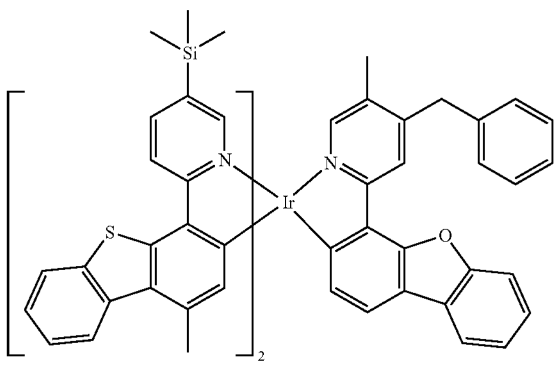
301
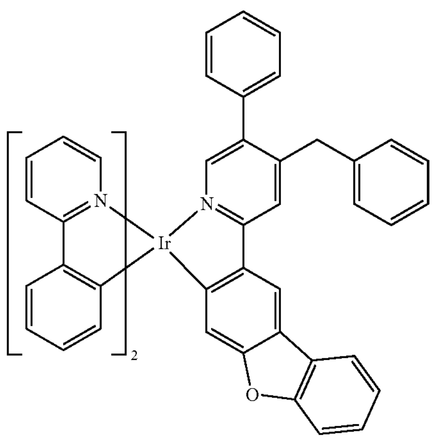
302
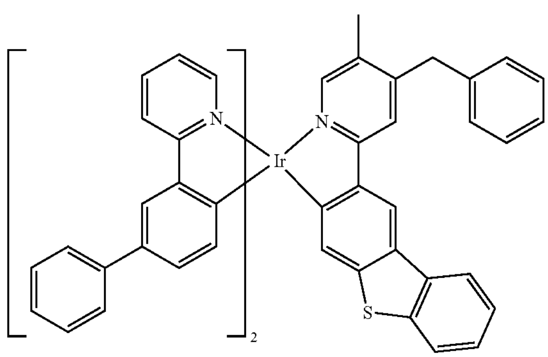
303
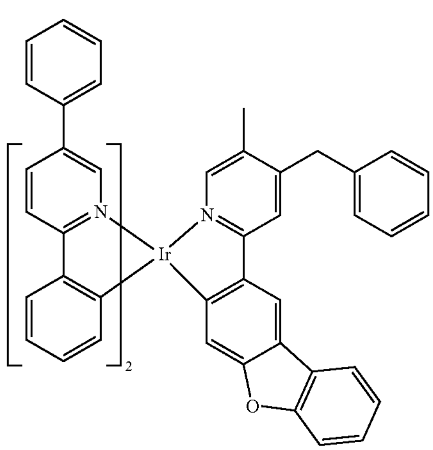
-continued
304
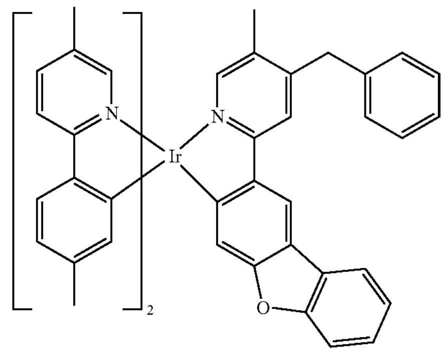
305
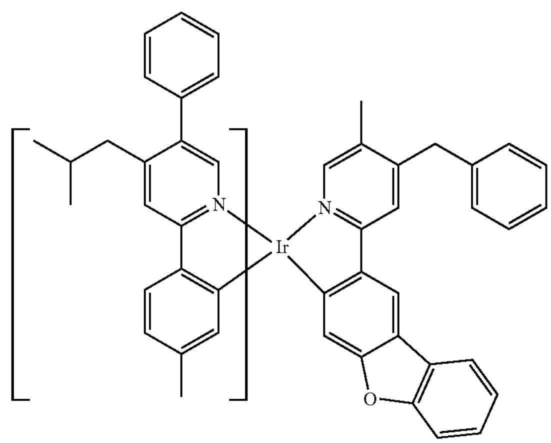
306
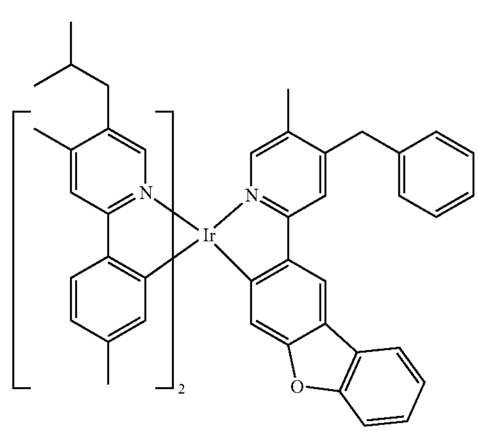

-continued
307
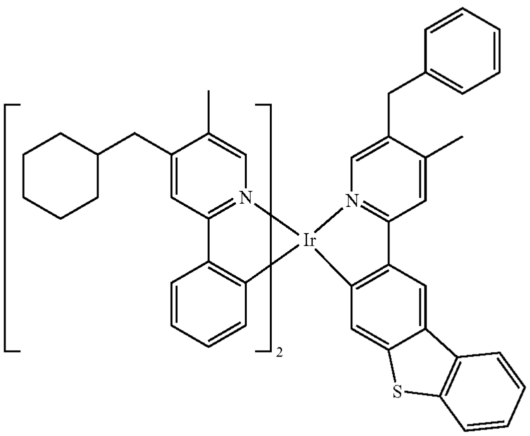
308
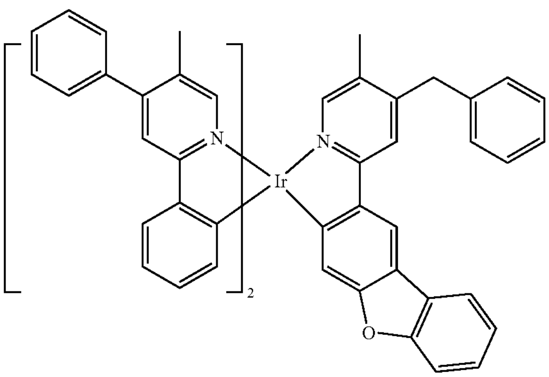
309
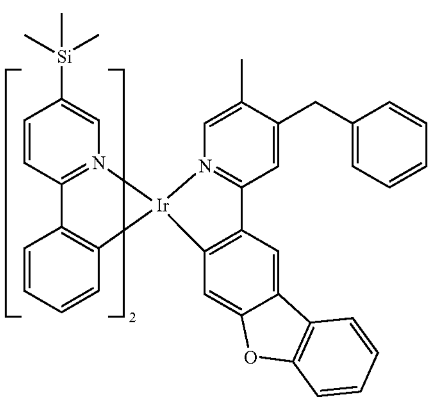
310
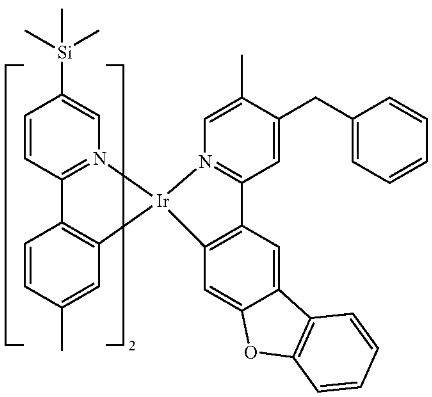
-continued
311
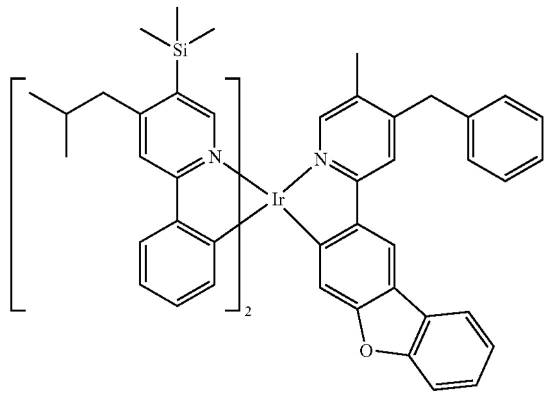
312
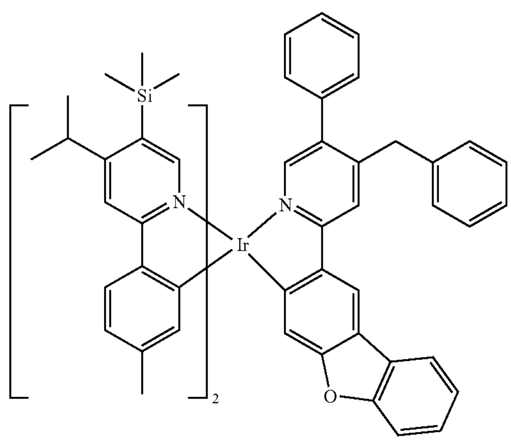
313
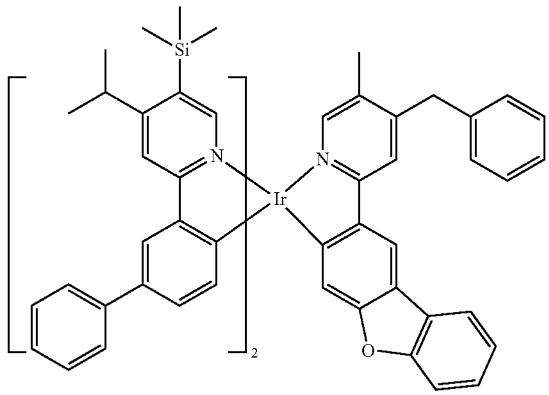

-continued
314
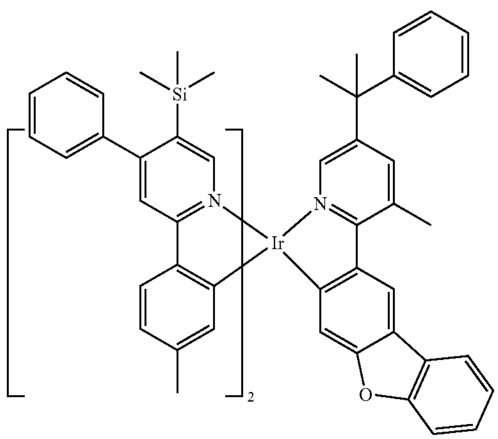
315
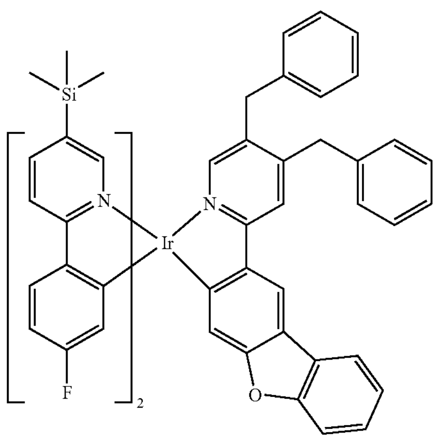
316
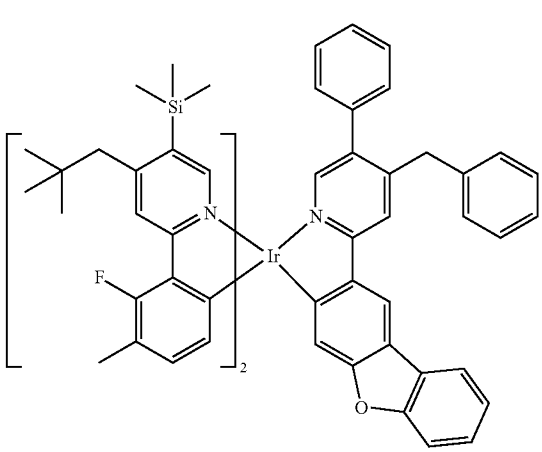
-continued
317
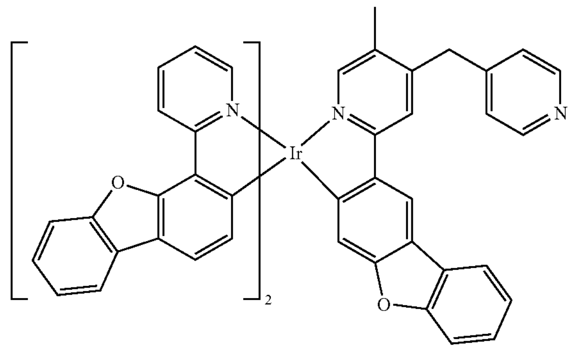
318
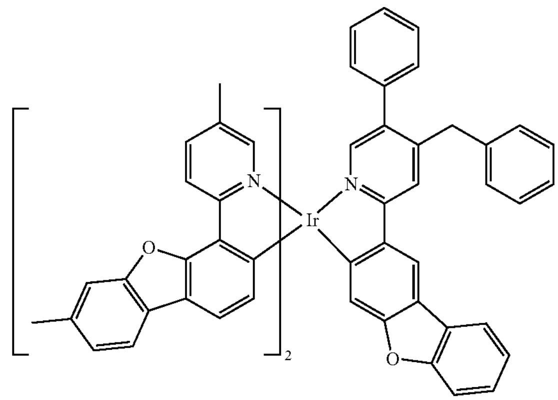
319
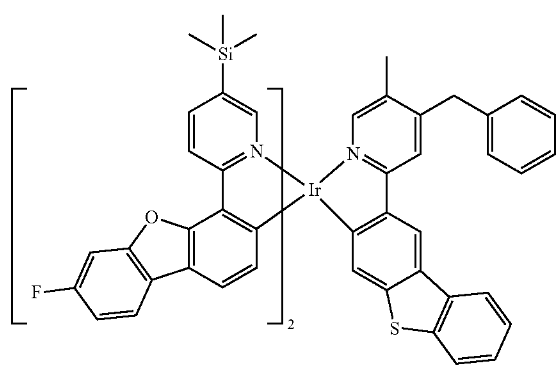
320
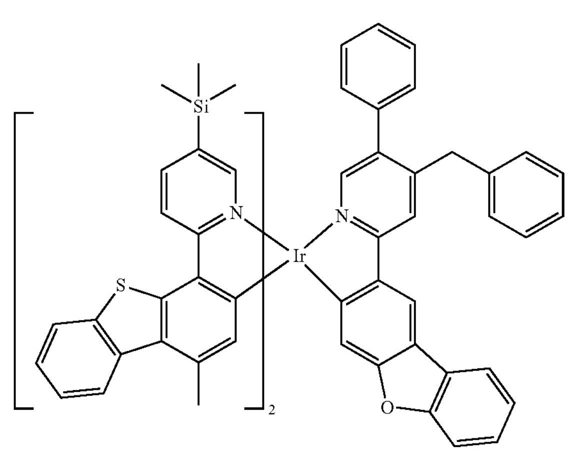

-continued
321
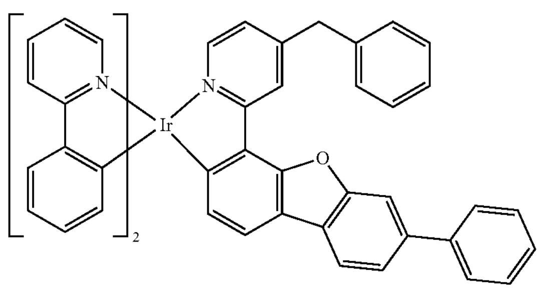
322
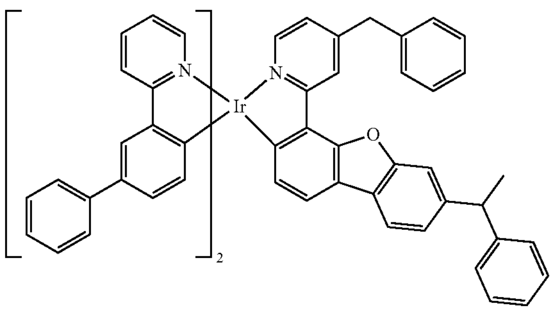
323
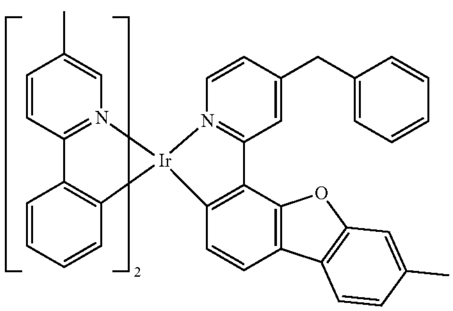
324
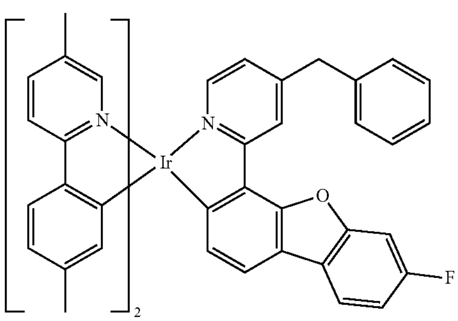
325
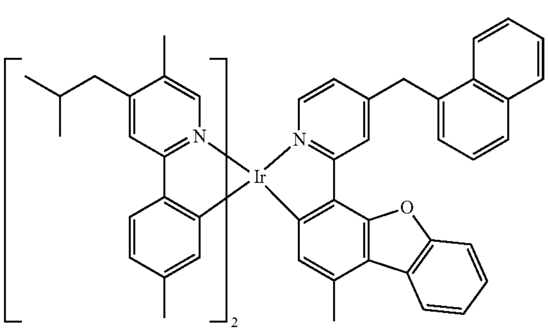
-continued
326
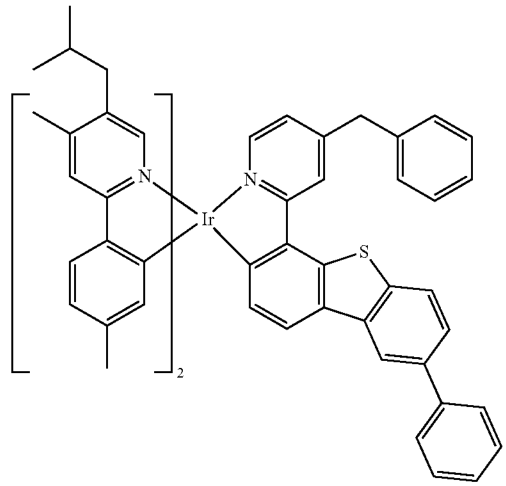
327
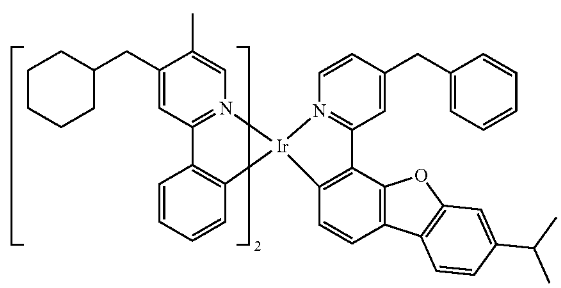
328
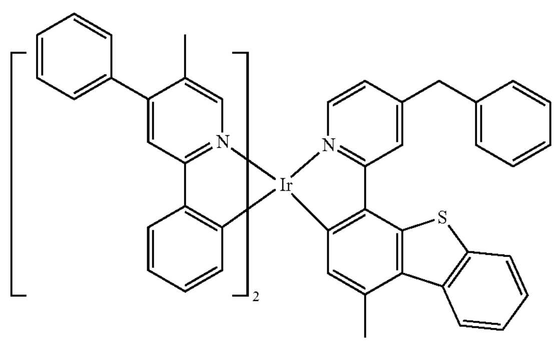
329
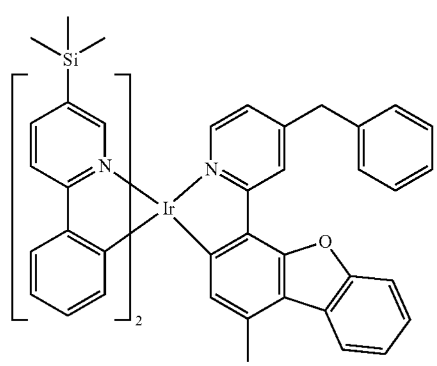

-continued
330
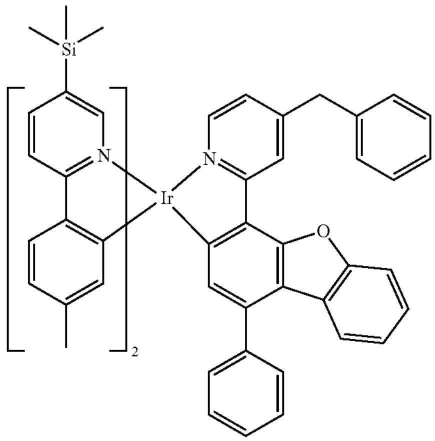
331
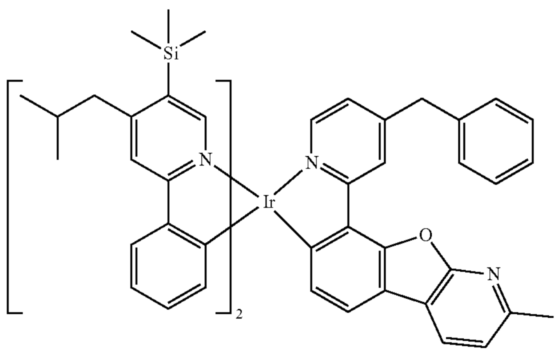
332
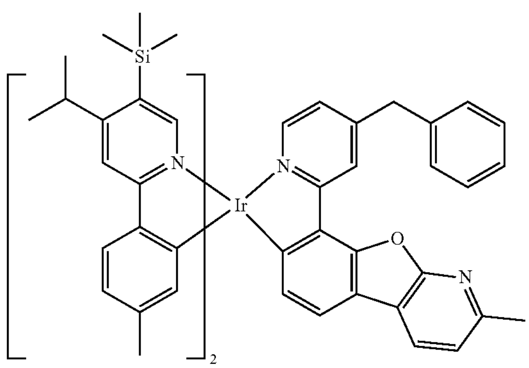
333
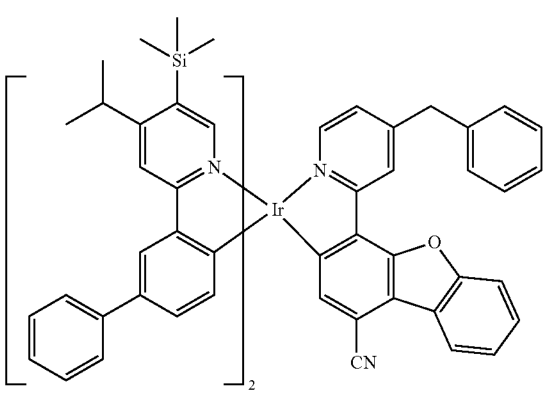
-continued
334
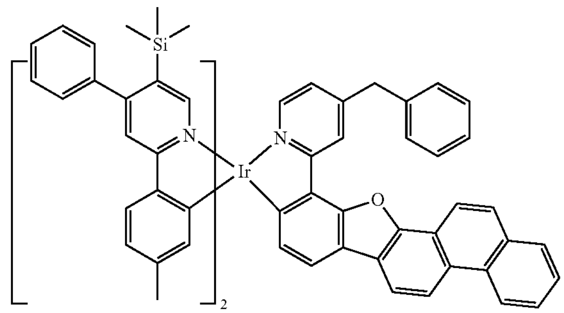
335
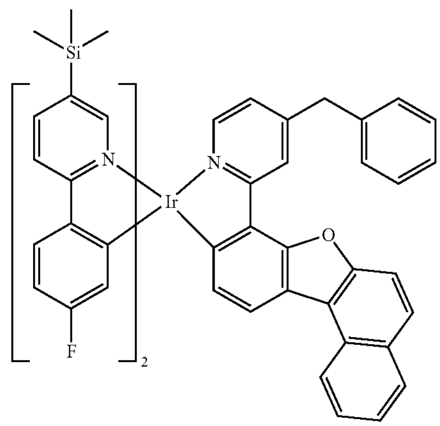
336
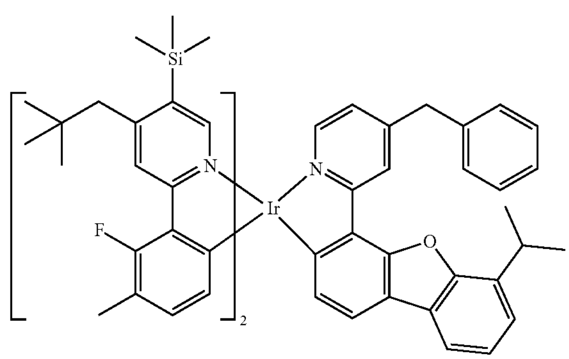
337
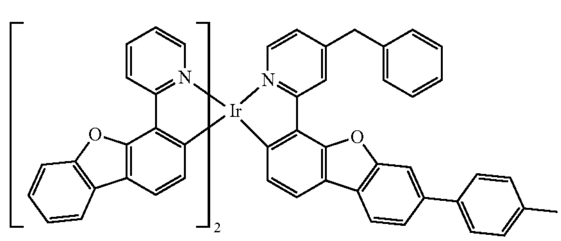

-continued
338
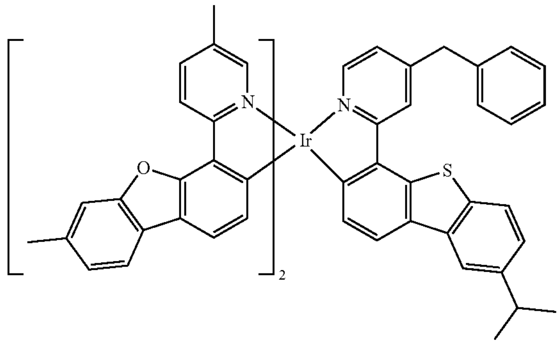
339
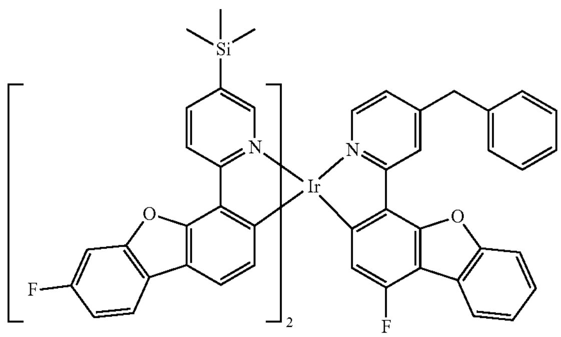
340
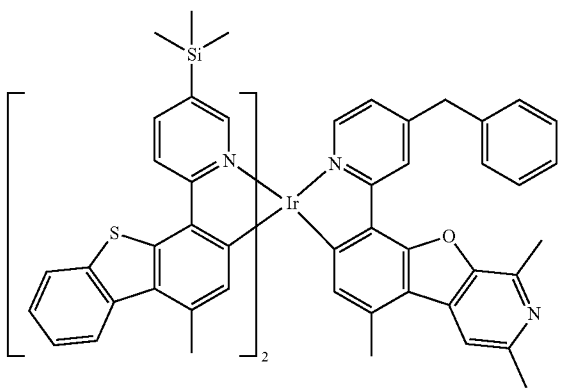
341
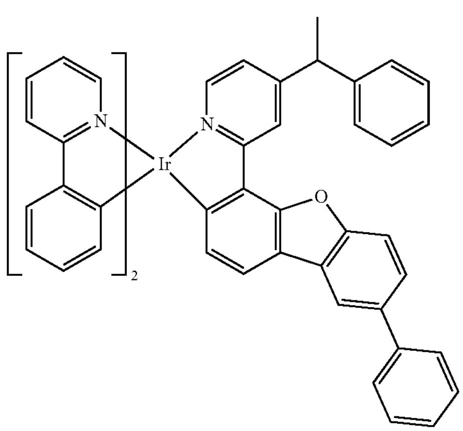
-continued
342
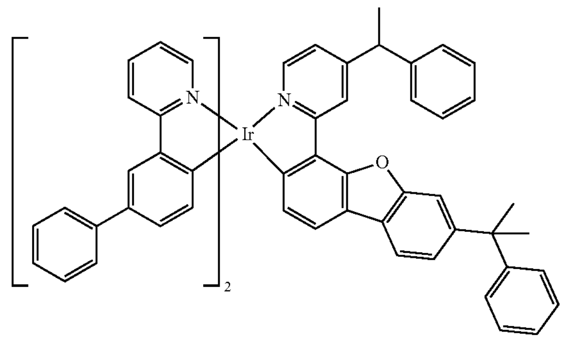
343
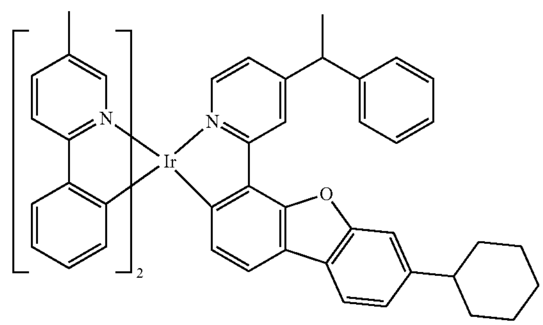
344
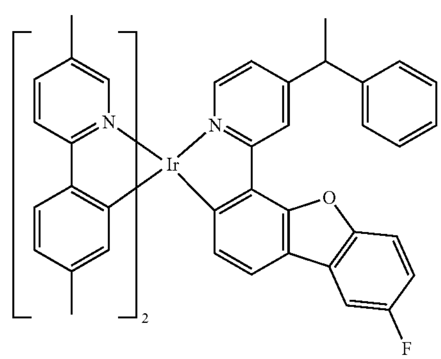
345
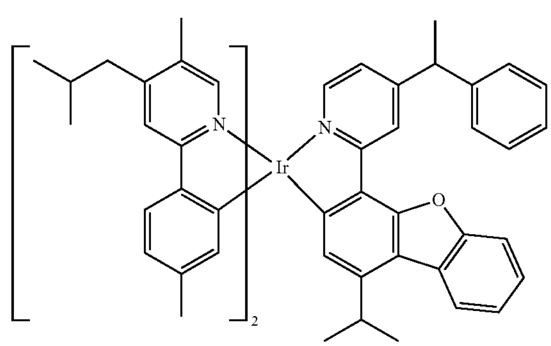

-continued
346
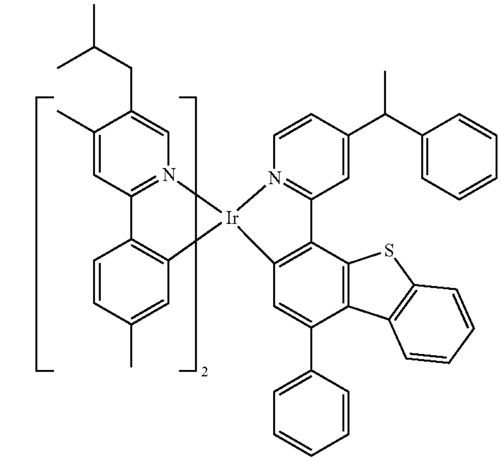
347
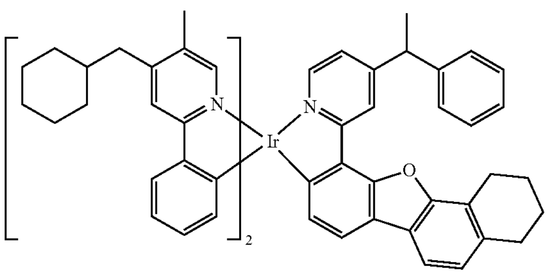
348
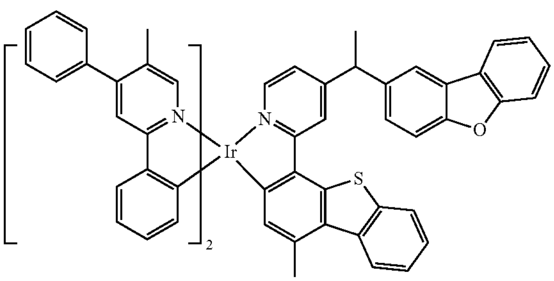
349
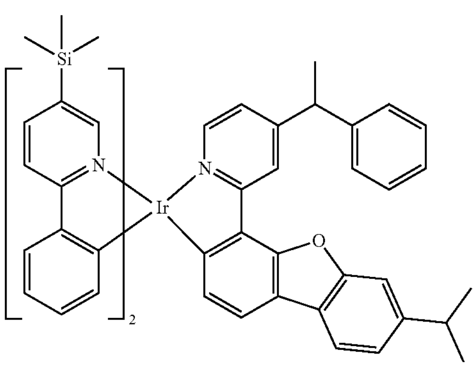
-continued
350
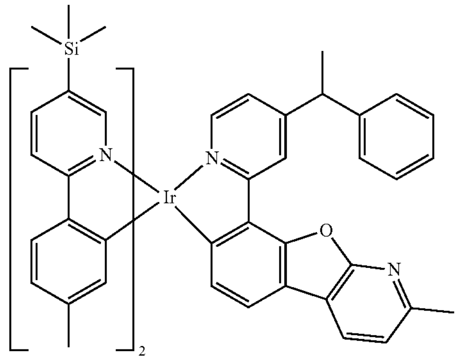
351
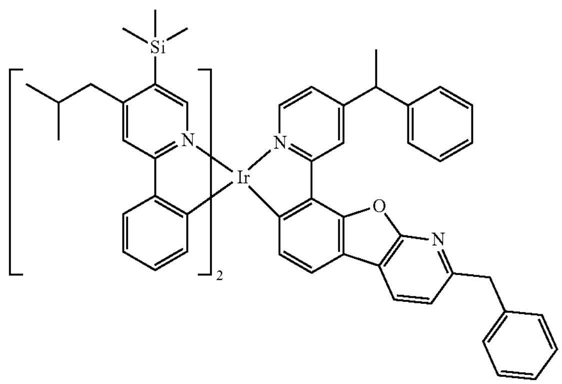
352
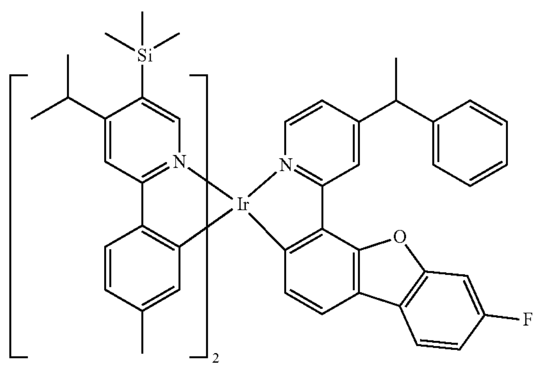
353
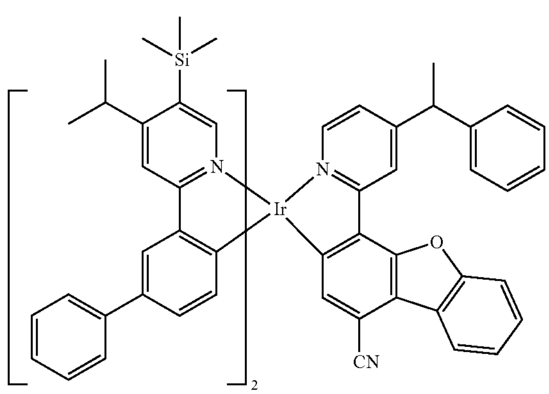

354
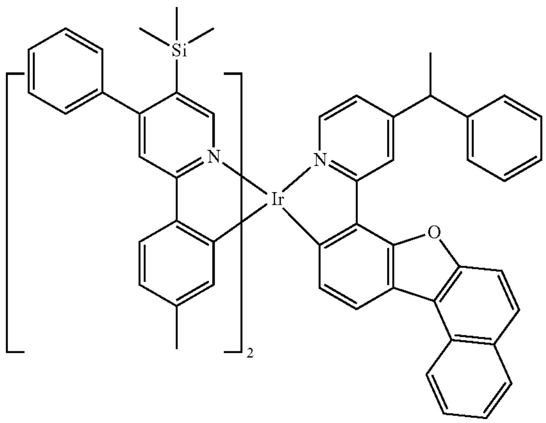
355
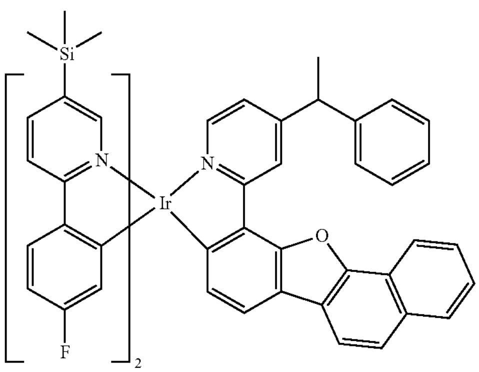
356
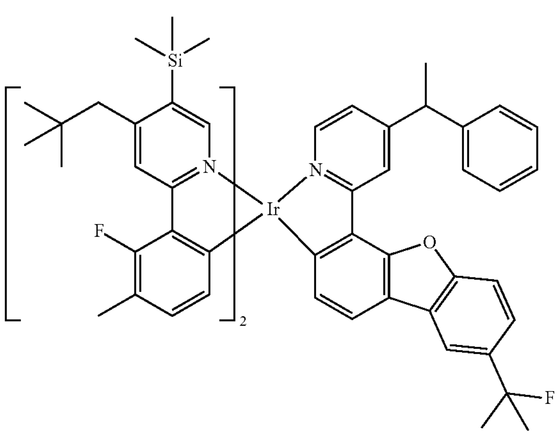
357
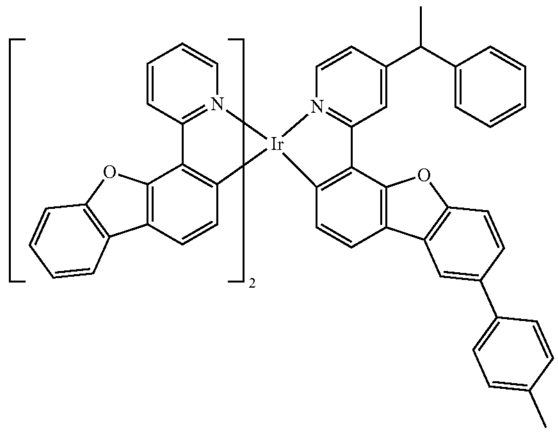
358
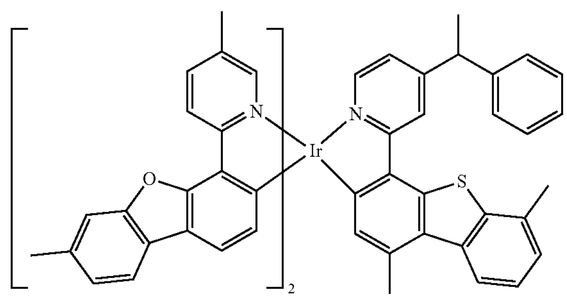
359
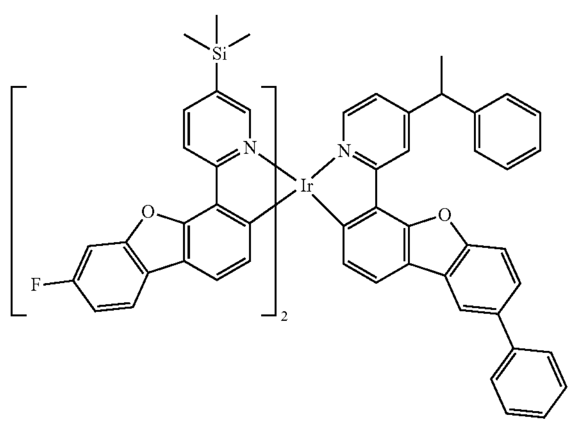
360
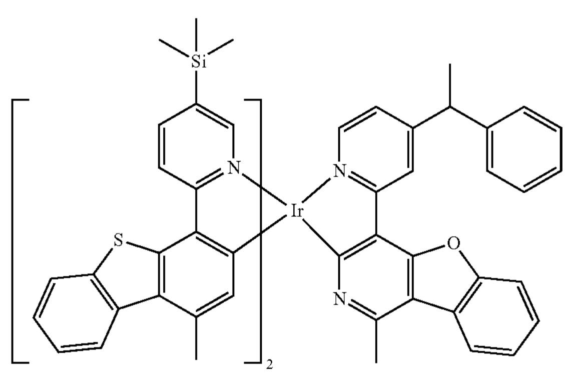

-continued
361
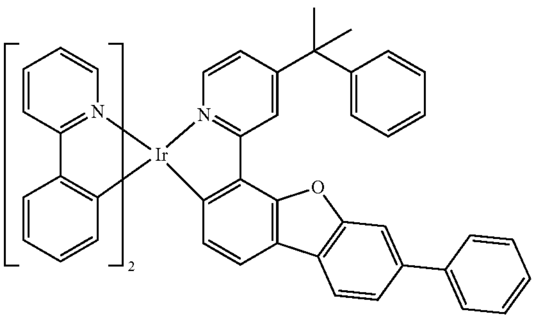
362
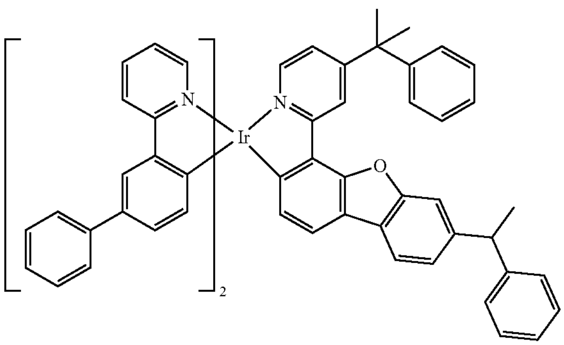
363
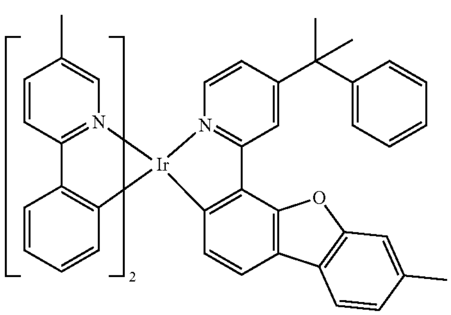
364
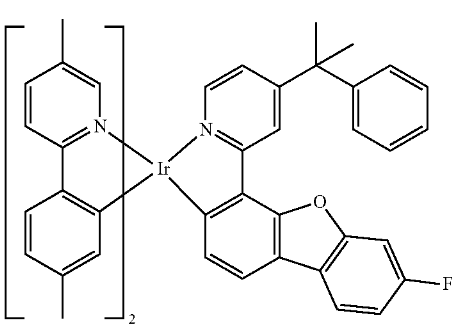
-continued
365
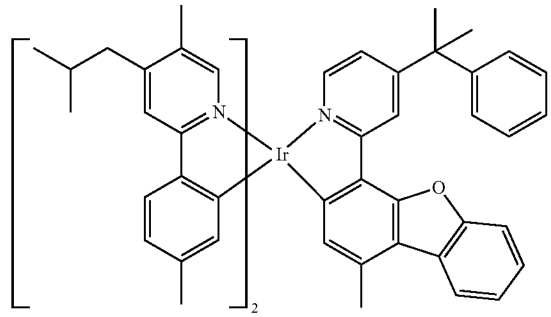
366
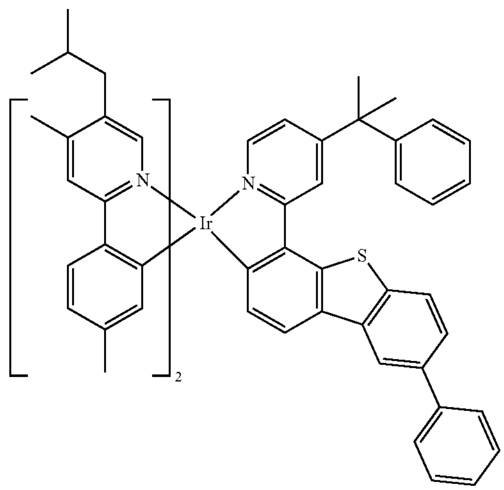
367
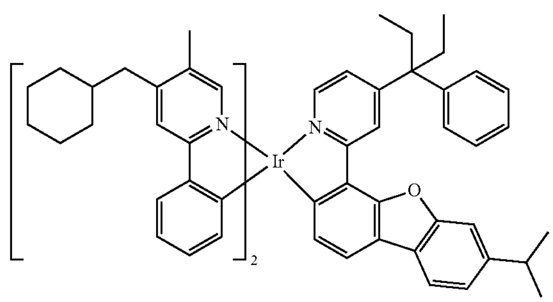
368
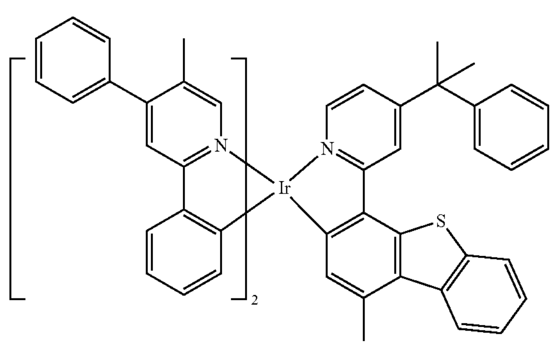

-continued
369
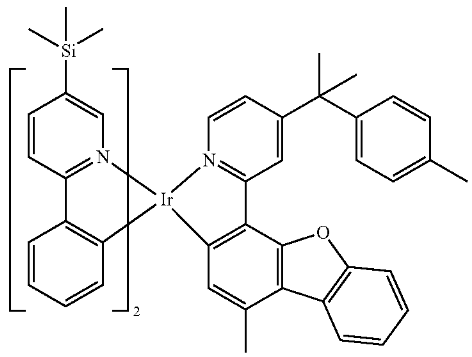
370
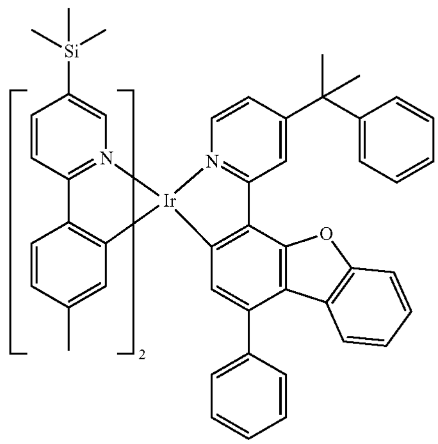
371
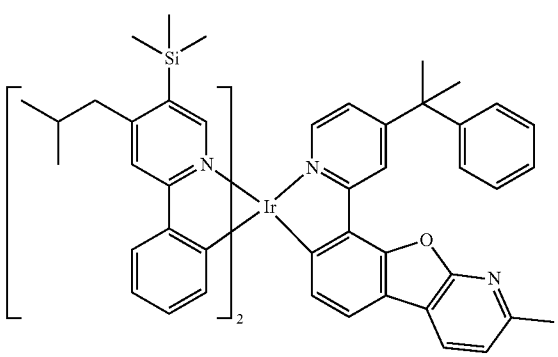
372
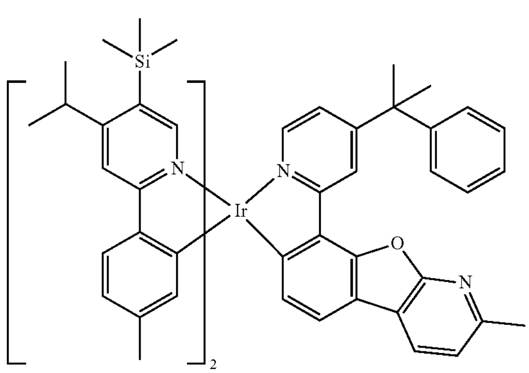
-continued
373
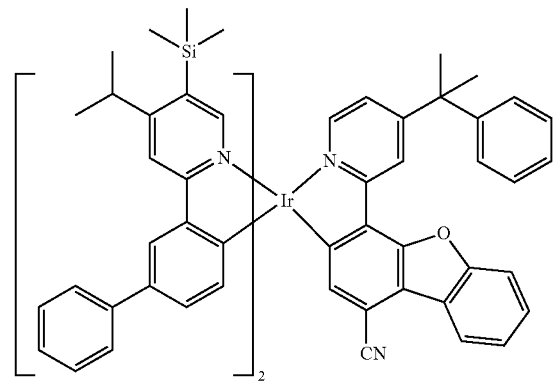
374
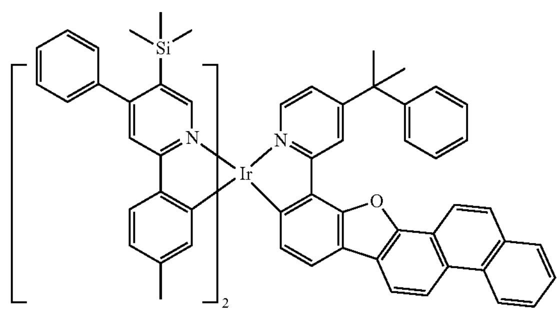
375
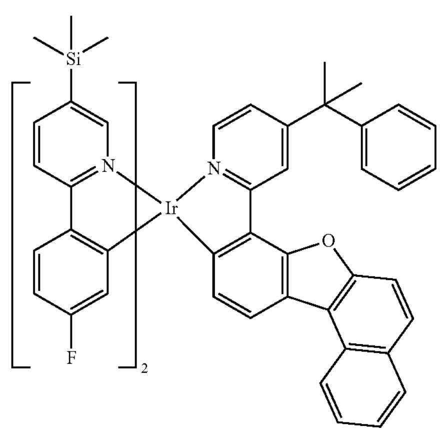
376
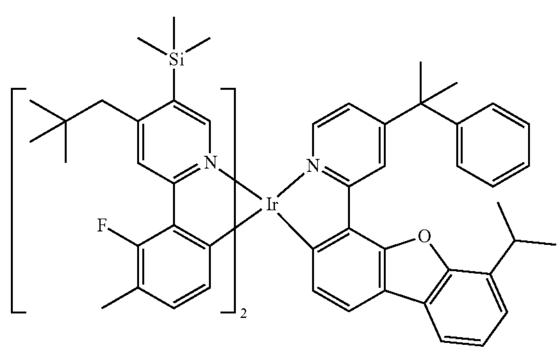

-continued
377
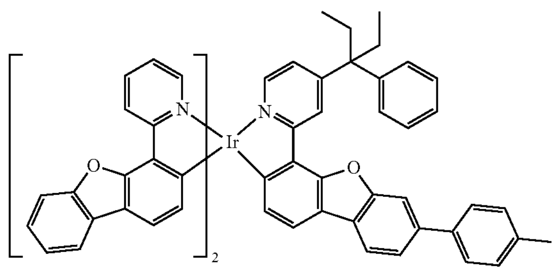
378
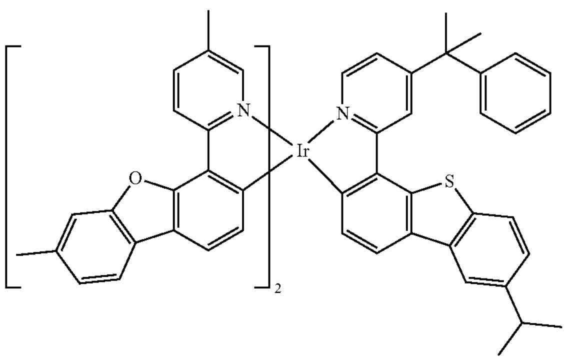
379
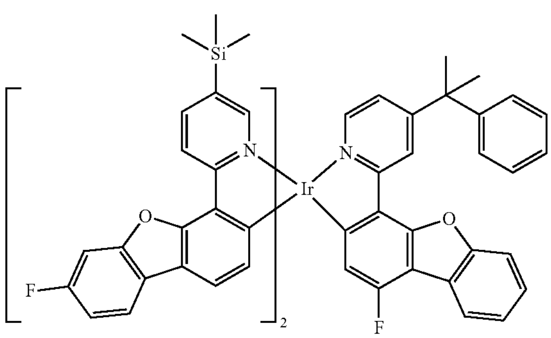
380
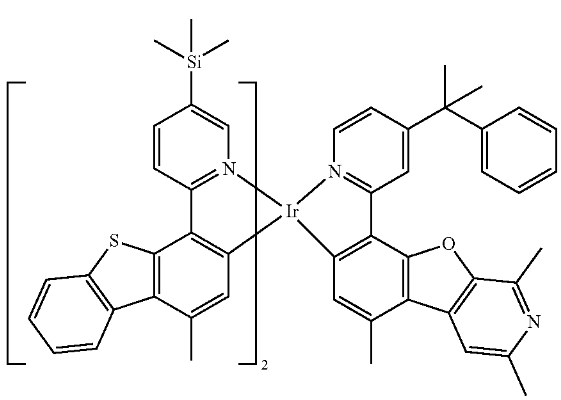
-continued
381
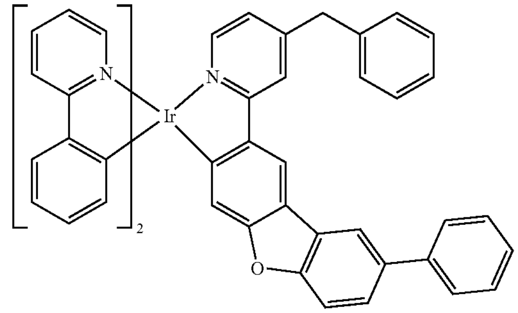
382
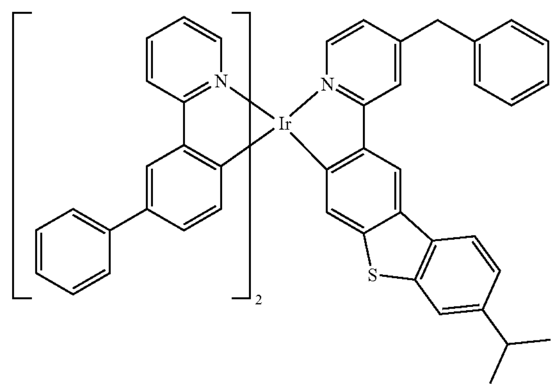
383
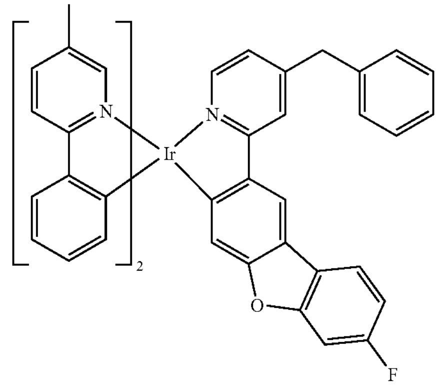
384
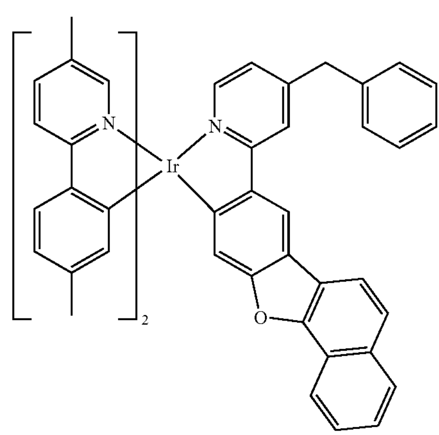

-continued
385
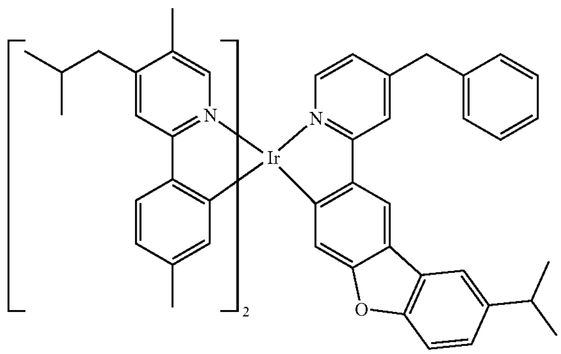
386
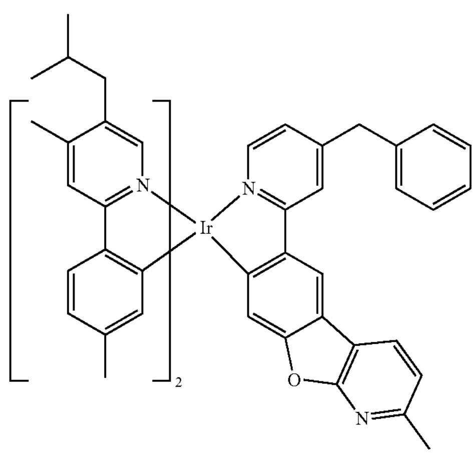
387
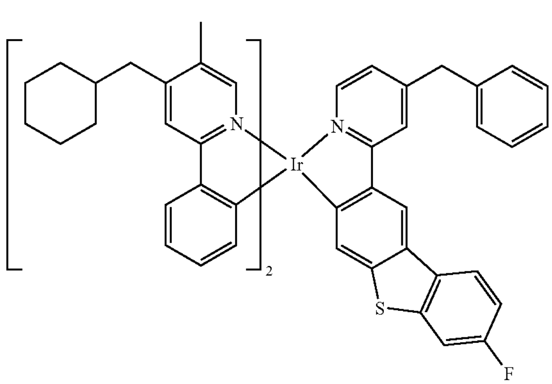
-continued
388
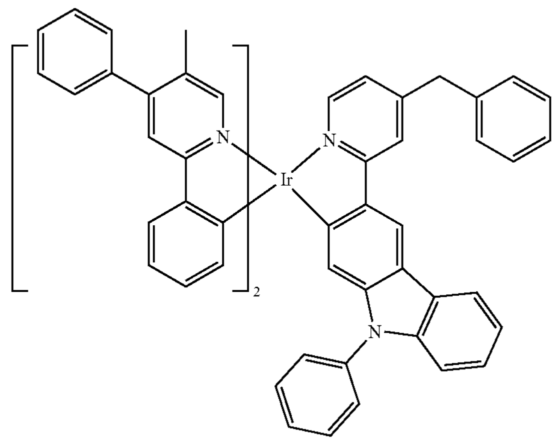
389
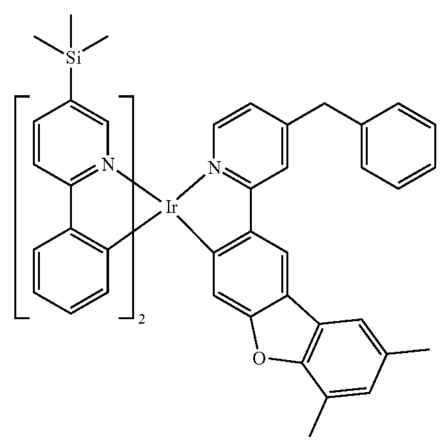
390
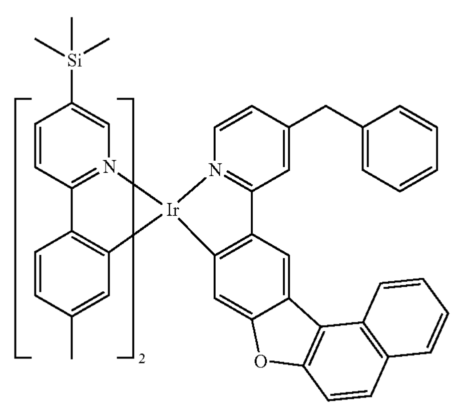

-continued
391
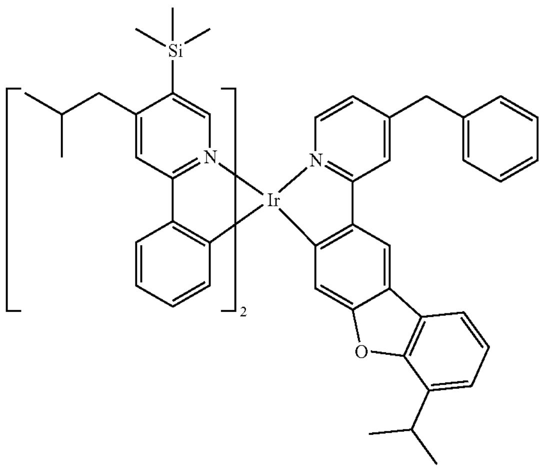
392
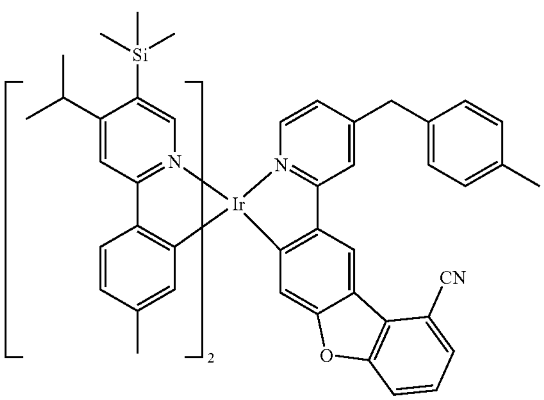
393
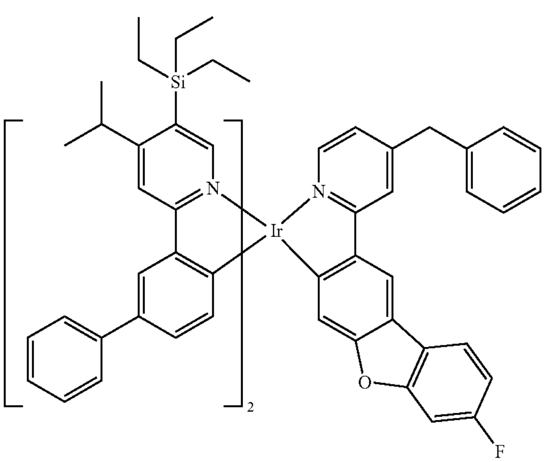
-continued
394
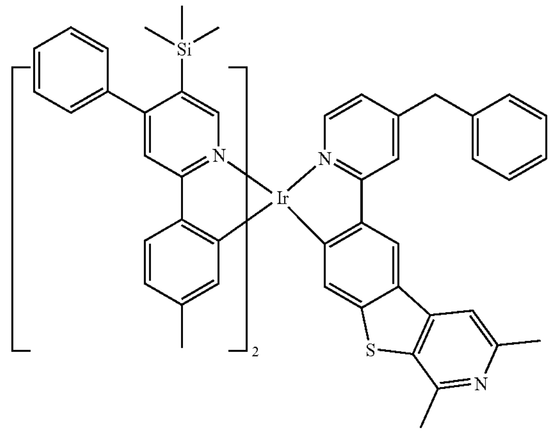
395
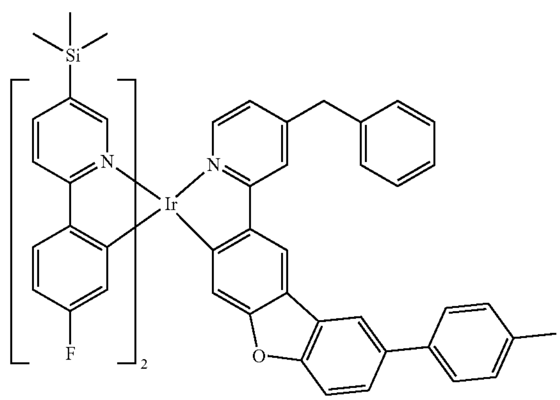
396
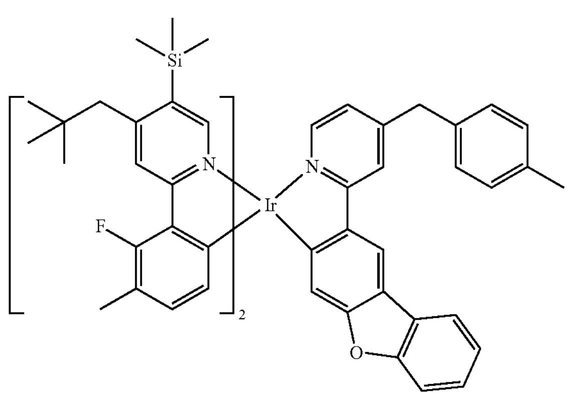

-continued
397
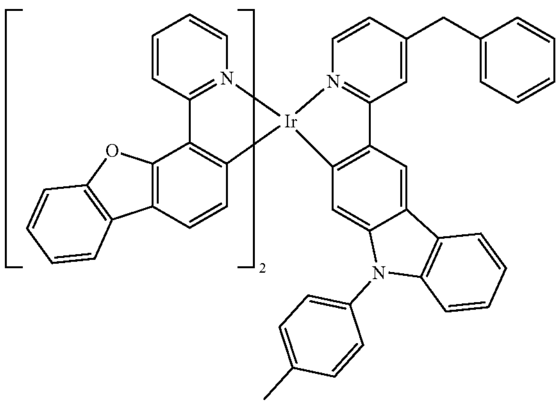
398
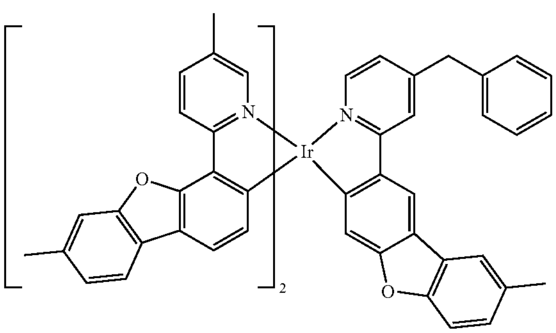
399
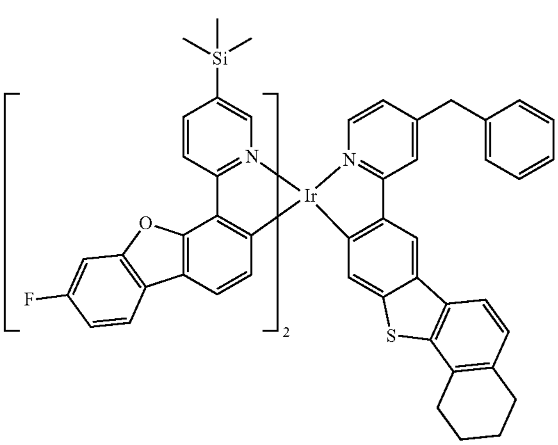
-continued
400
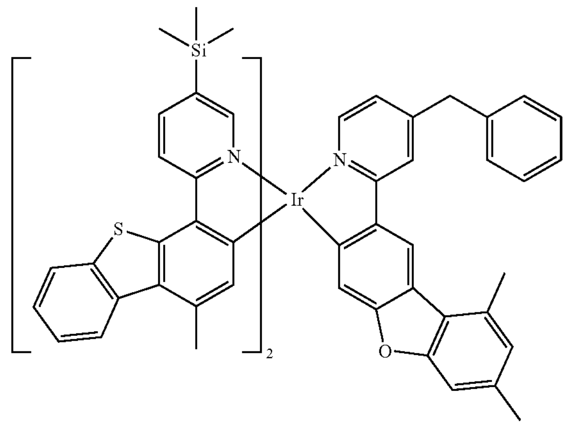
401
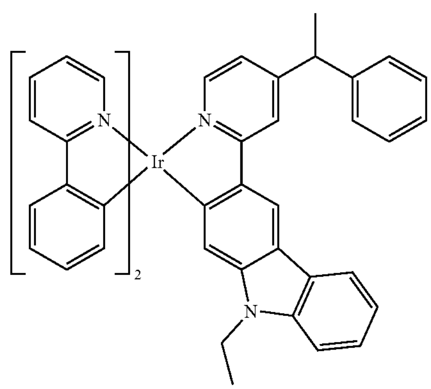
402
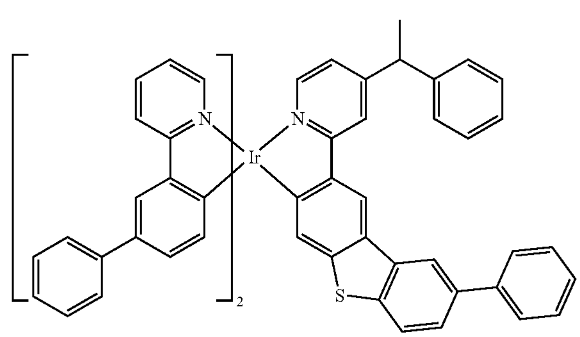

-continued
403
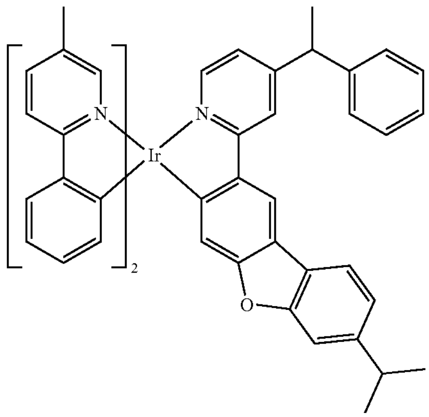
404
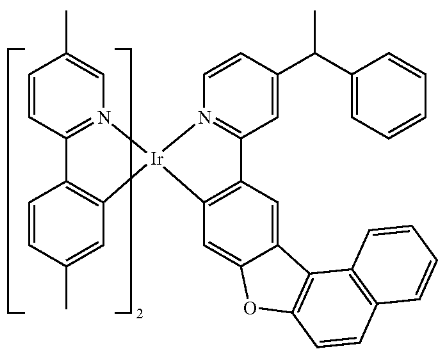
405
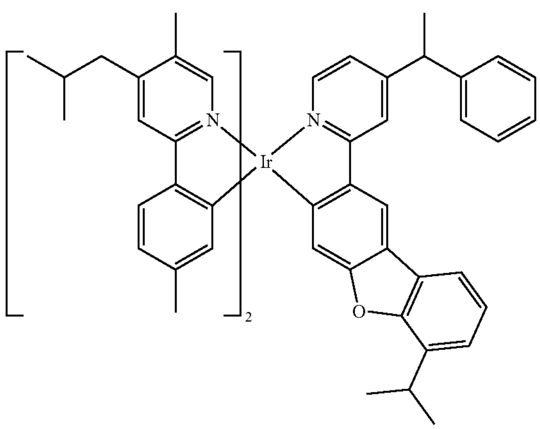
406
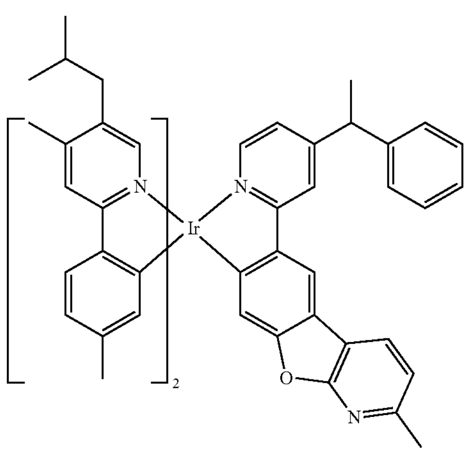
-continued
407
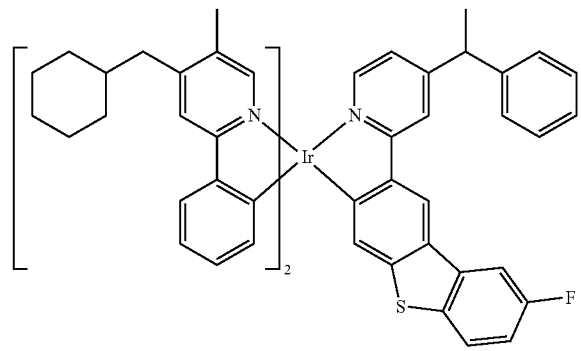
408
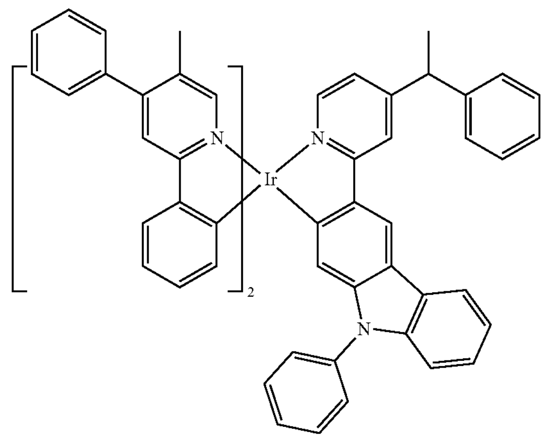
409
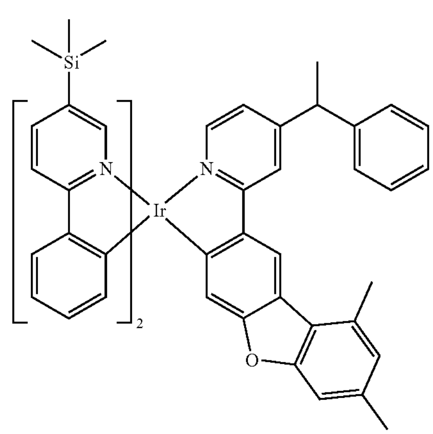

410
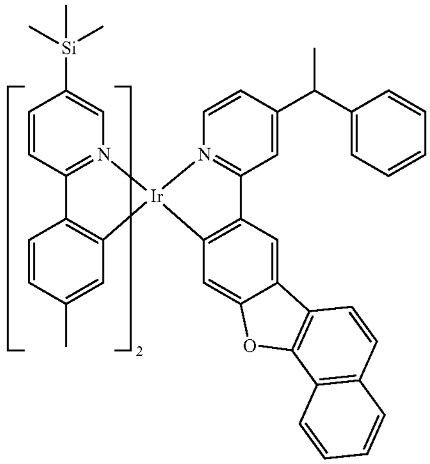
411
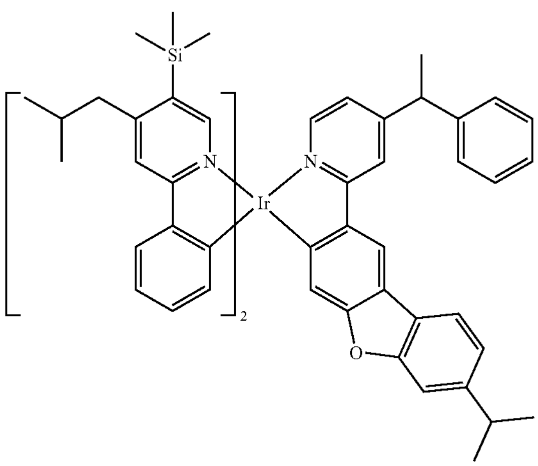
412
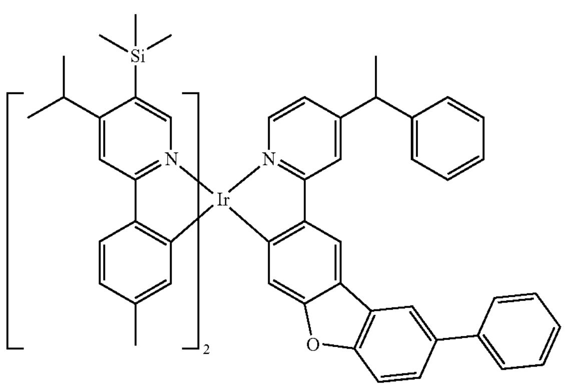
413
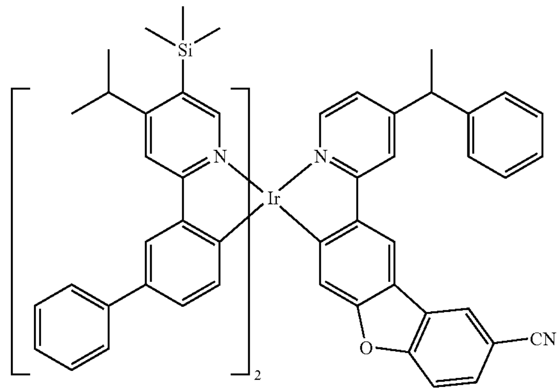
414
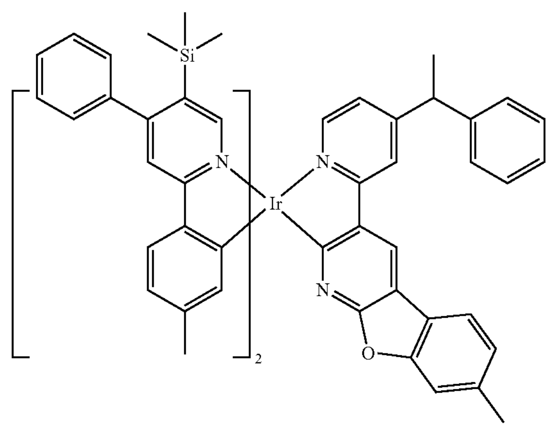
415
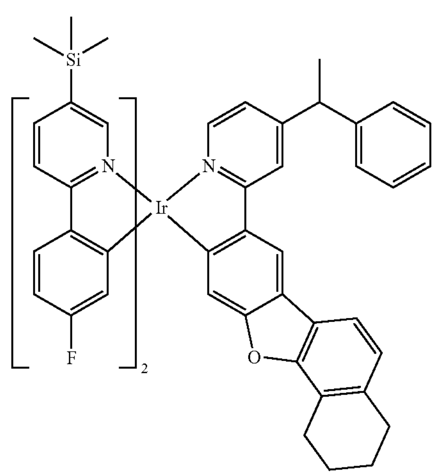

-continued
416
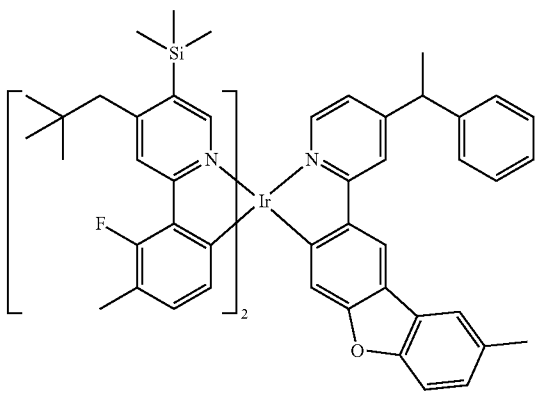
417
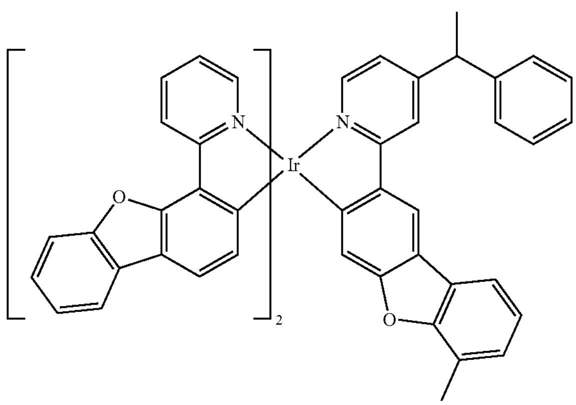
418
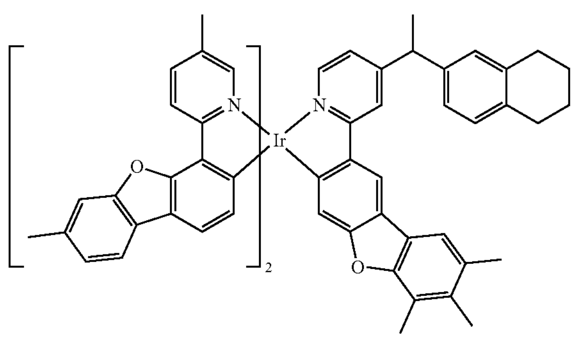
419
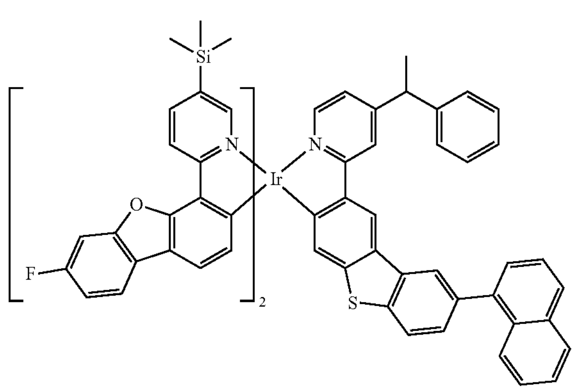
-continued
420
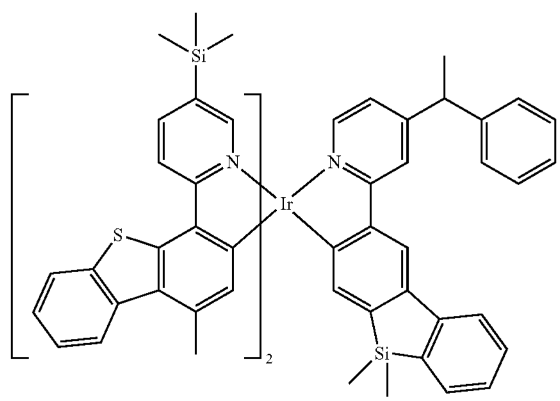
421
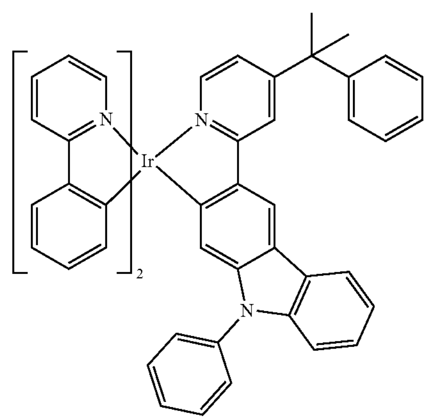
422
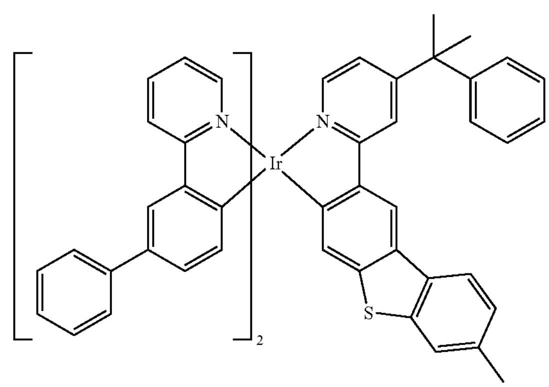
423
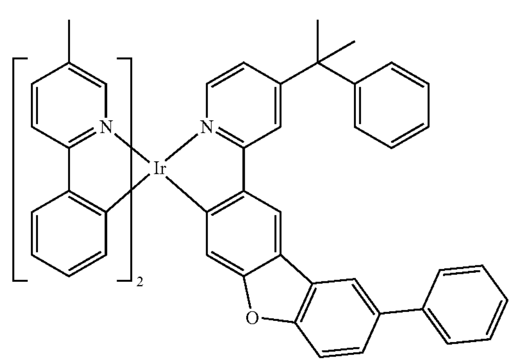

-continued
424
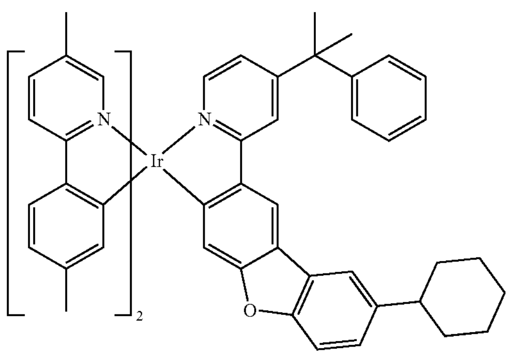
425
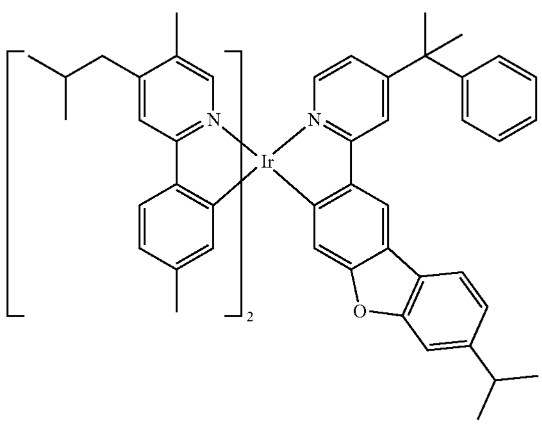
426
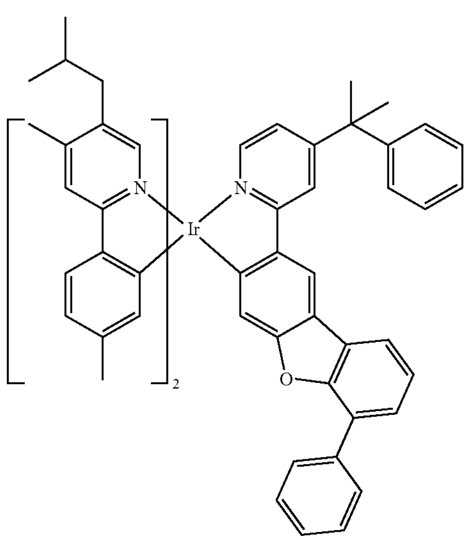
-continued
427
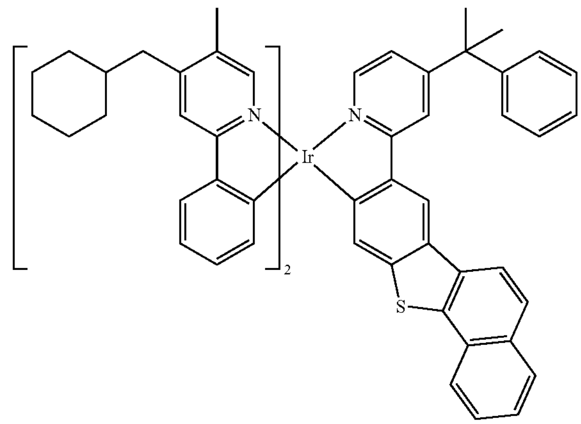
428
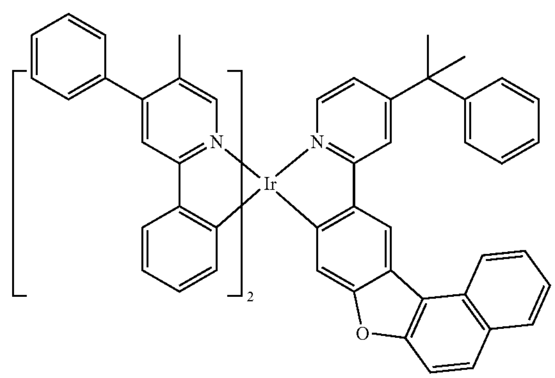
429
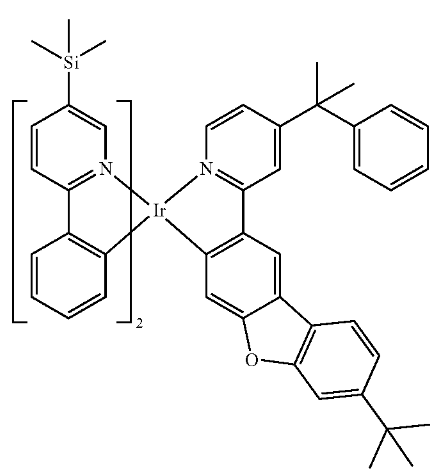

430
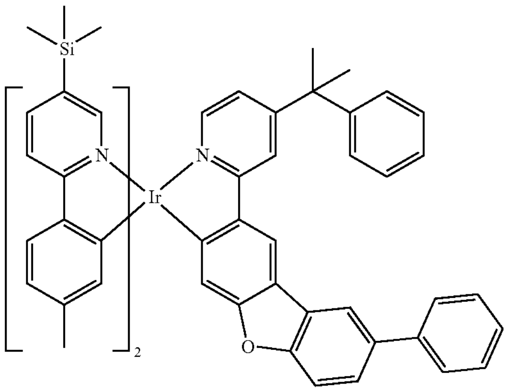
431
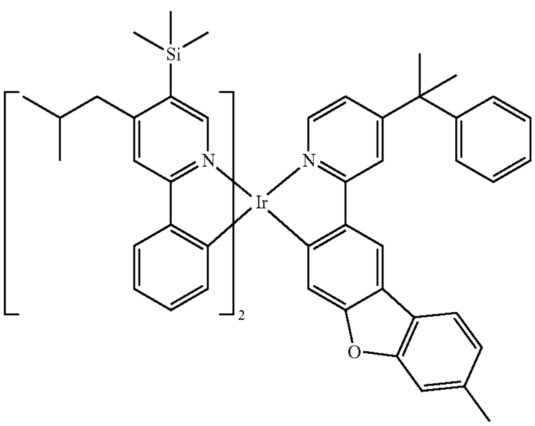
432
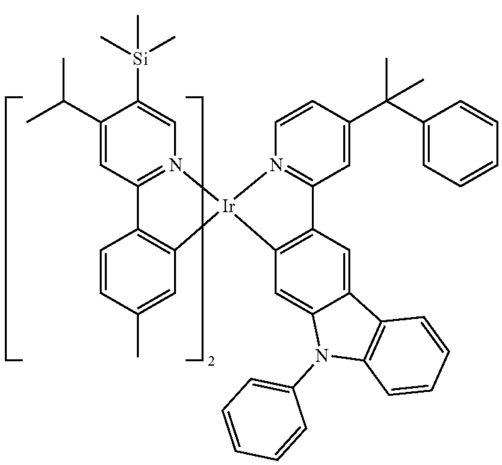
433
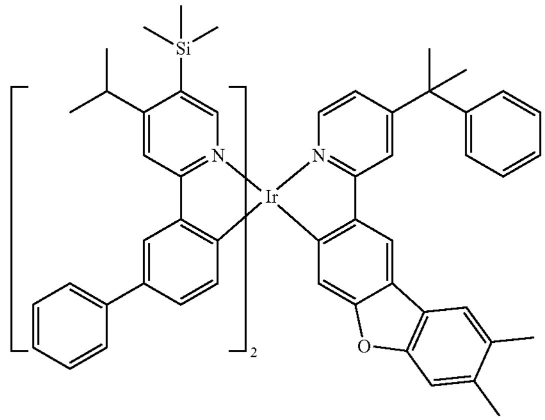
434
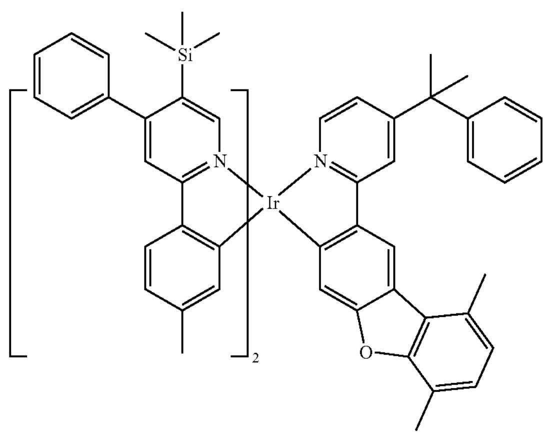
435
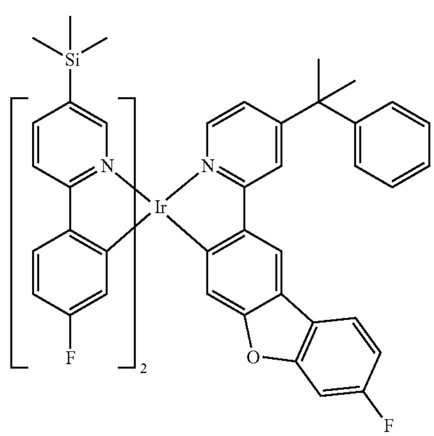

-continued
436
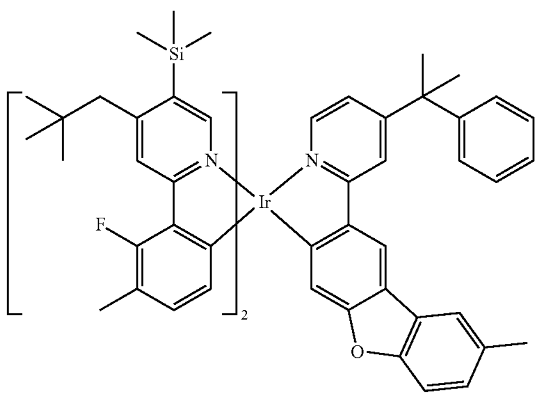
437
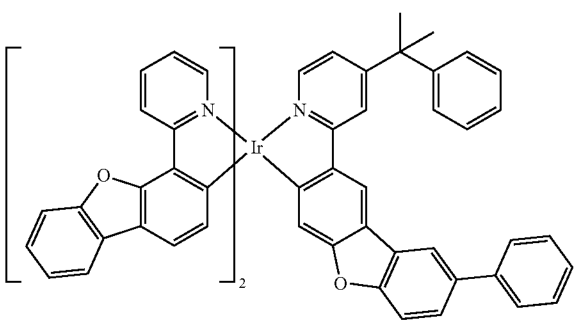
438
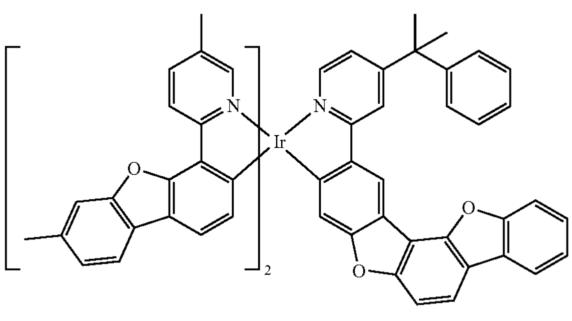
439
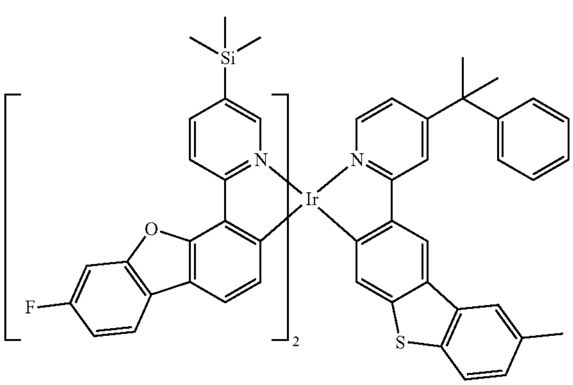
-continued
440
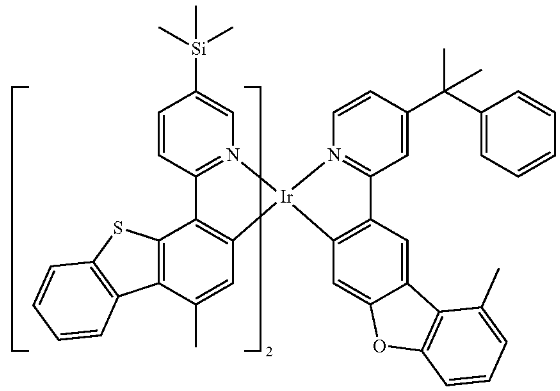
441
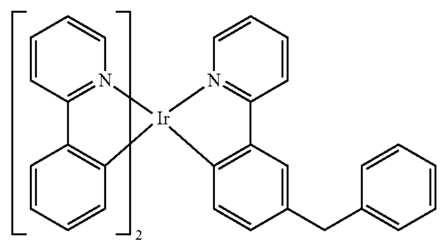
442
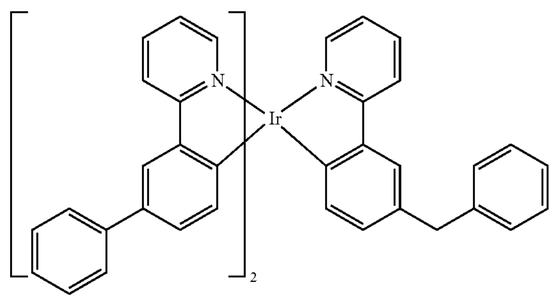
443
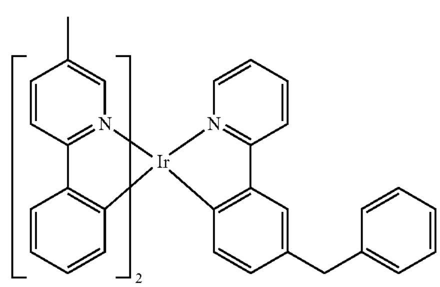
444
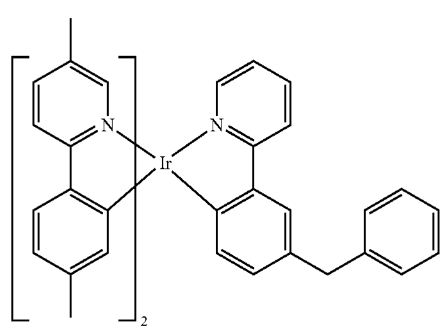

445
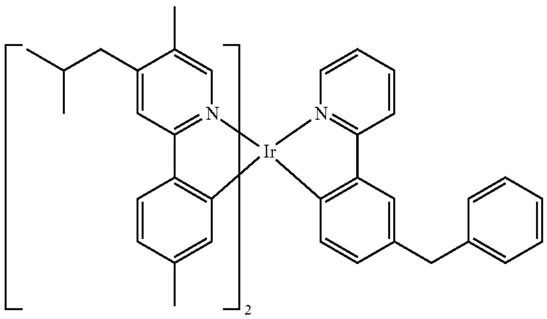
446
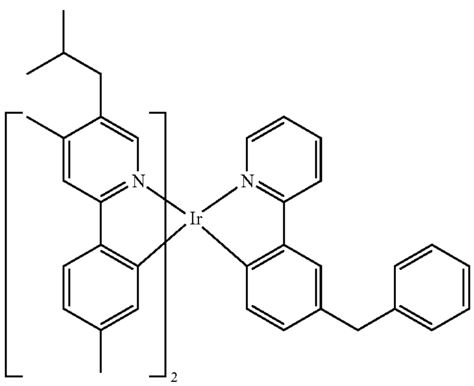
447
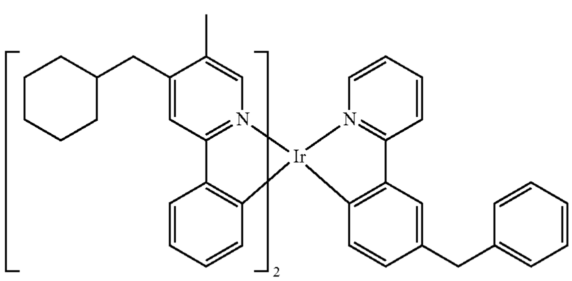
448
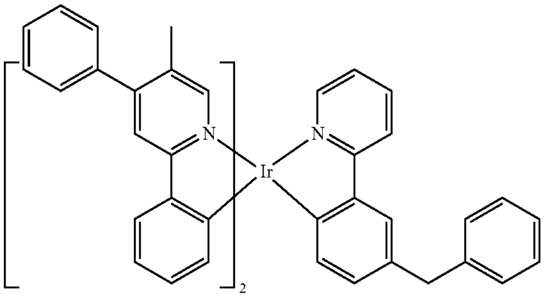
449
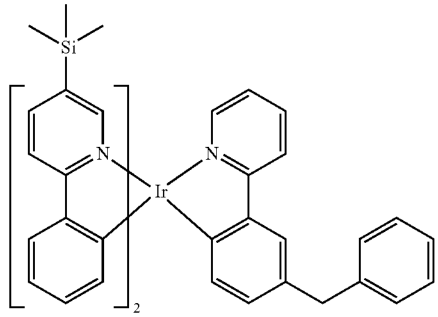
450
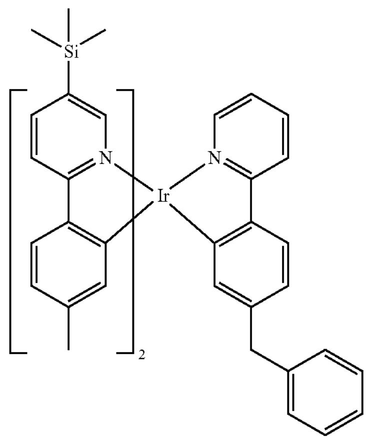
451
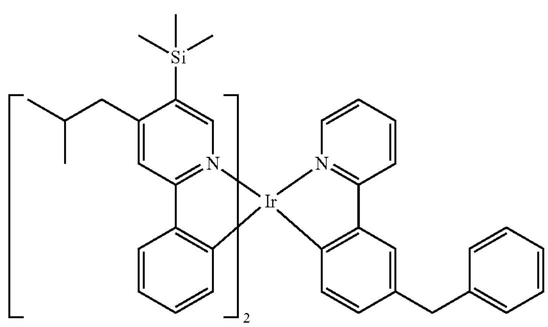
452
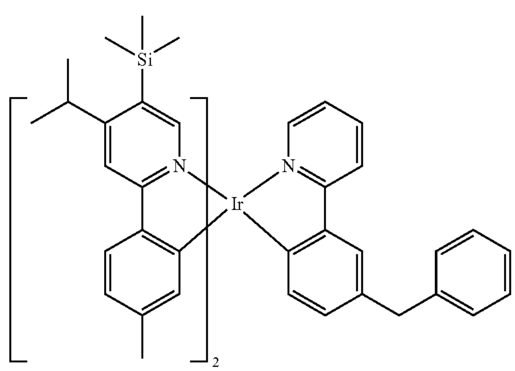

-continued
453
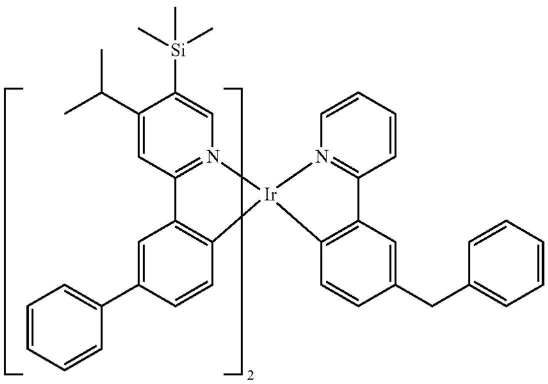
454
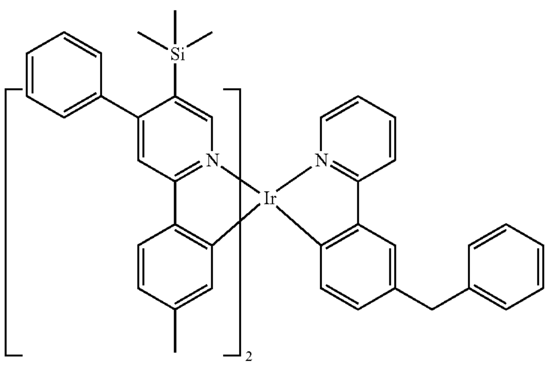
455
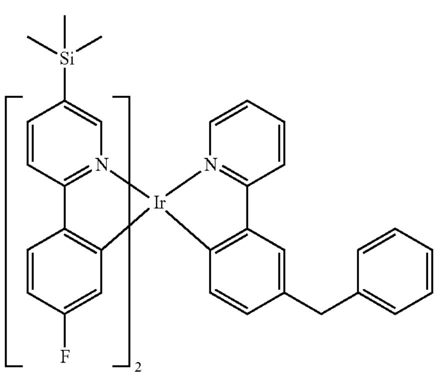
456
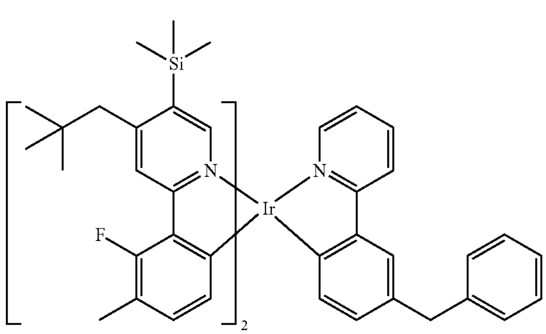
-continued
457
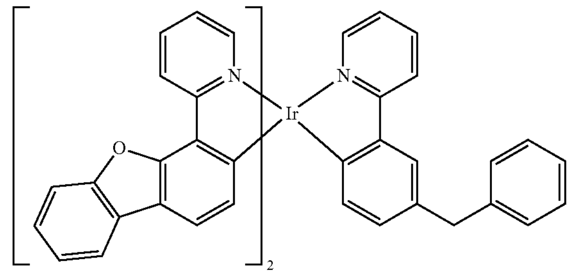
458
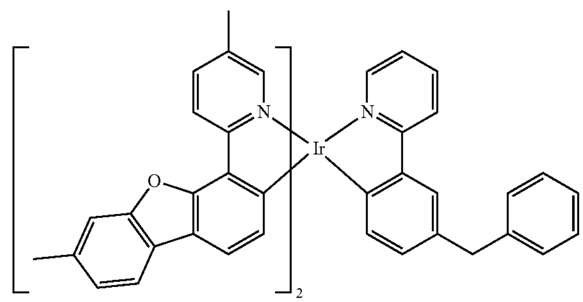
459
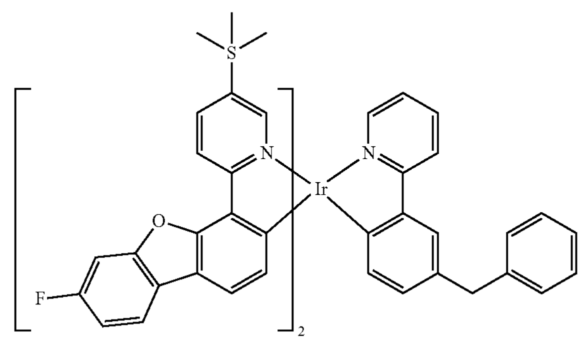
460
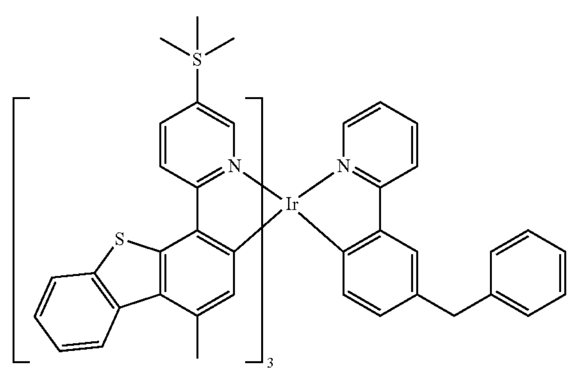
461
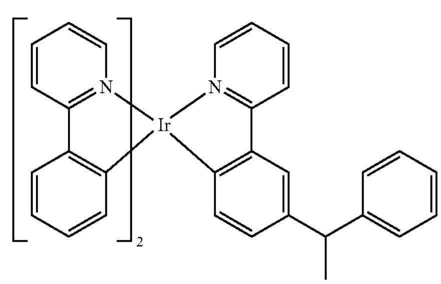

-continued
462
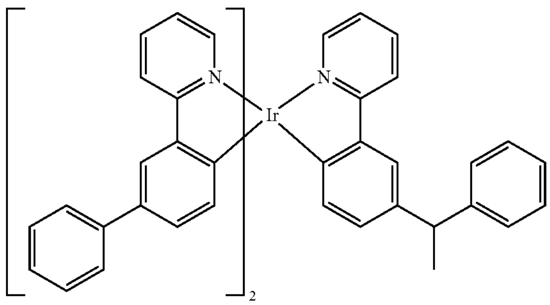
463
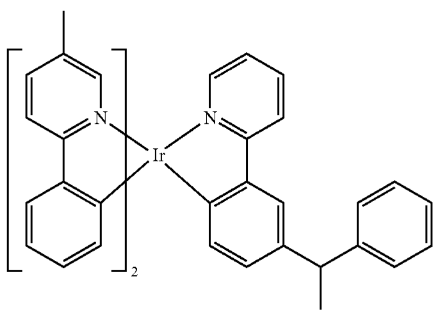
464
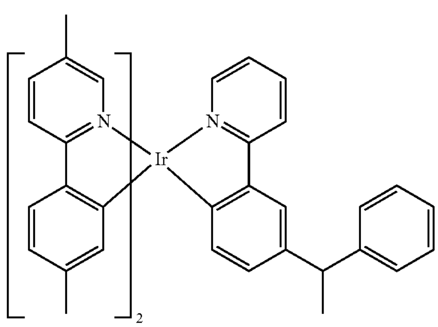
465
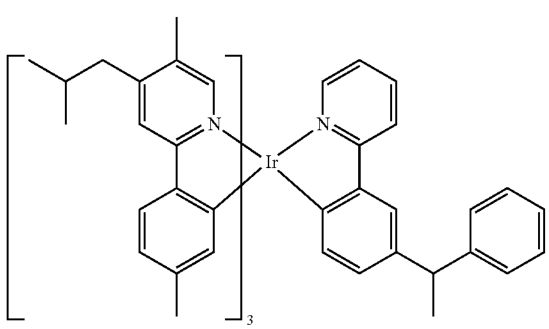
-continued
466
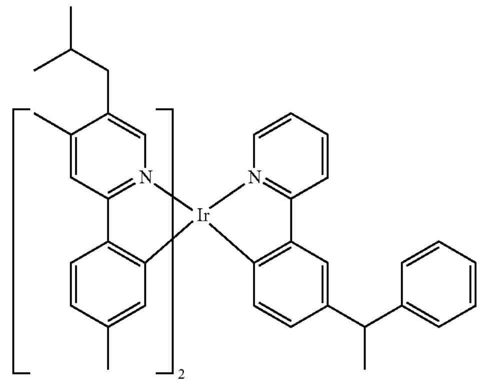
467
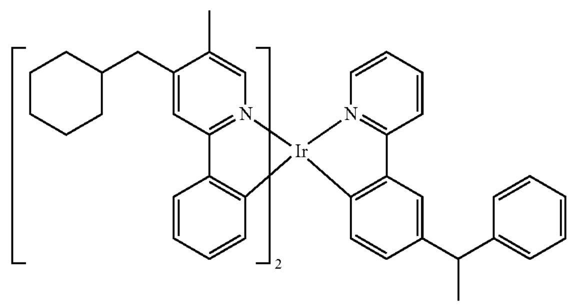
468
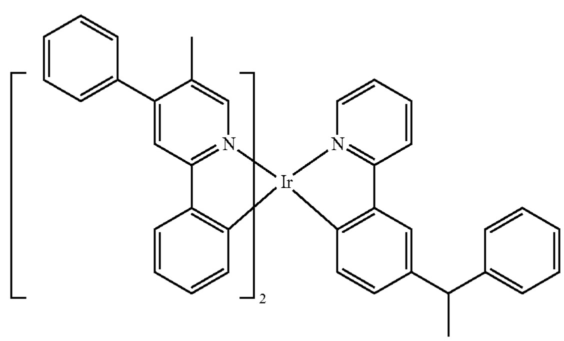
469
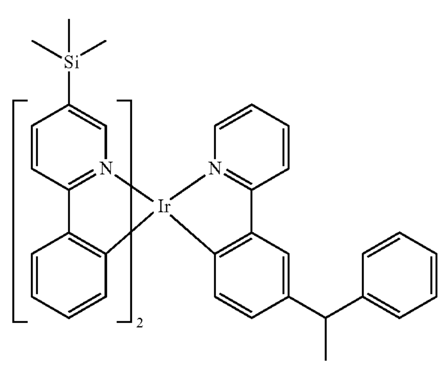

-continued
470
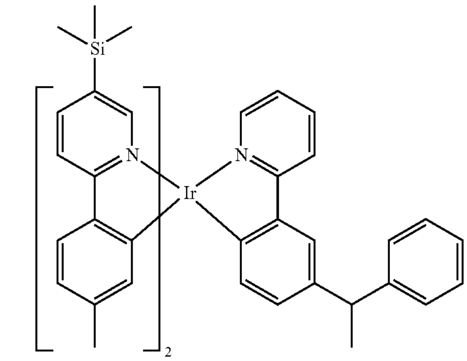
471
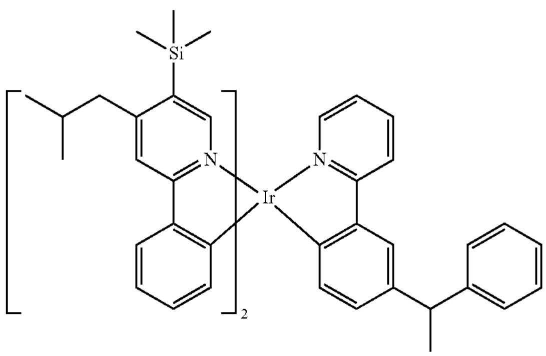
472
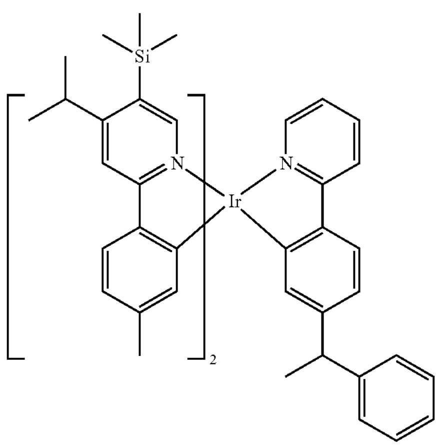
473
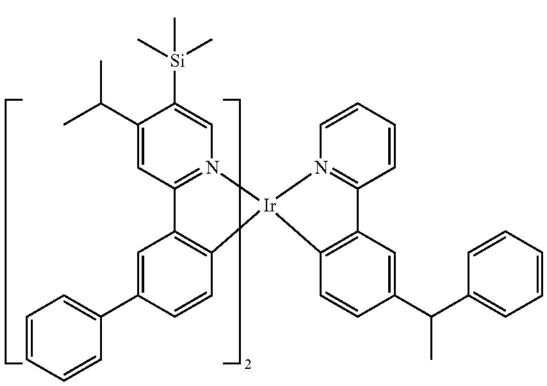
-continued
474
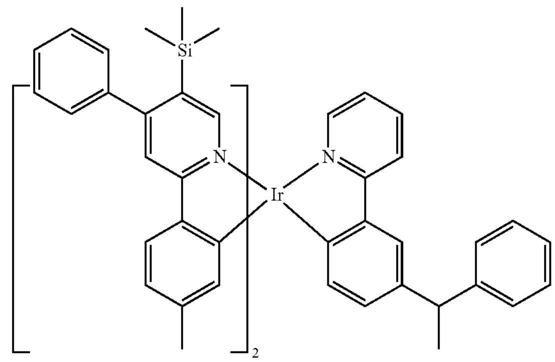
475
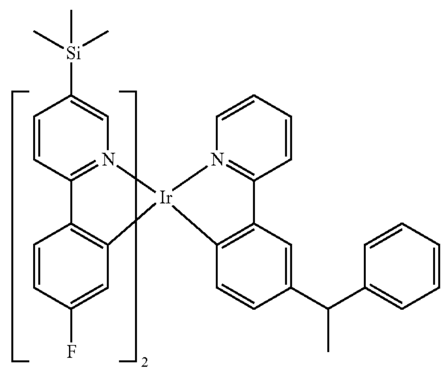
476
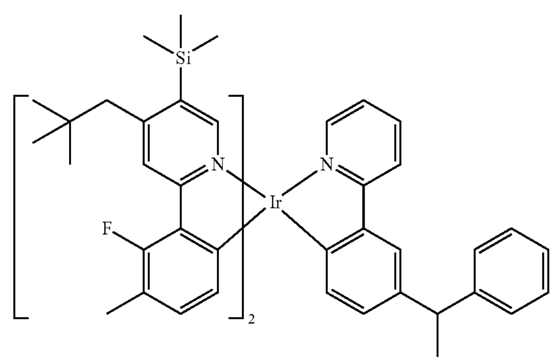
477
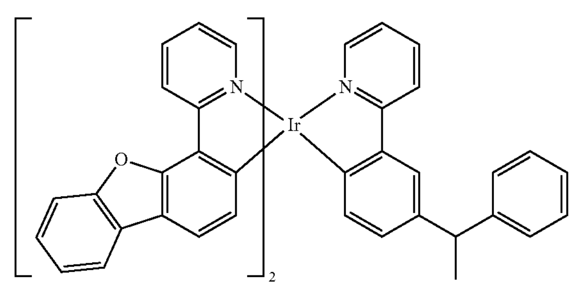

-continued
478
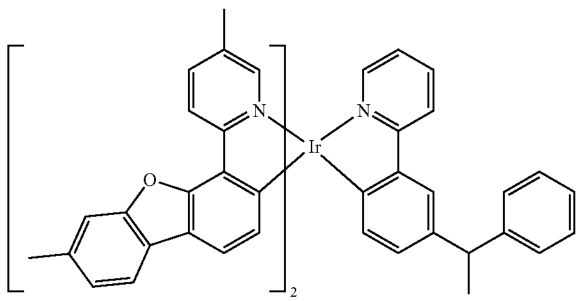
479
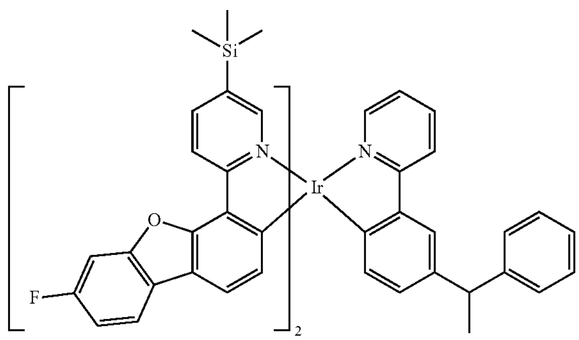
480
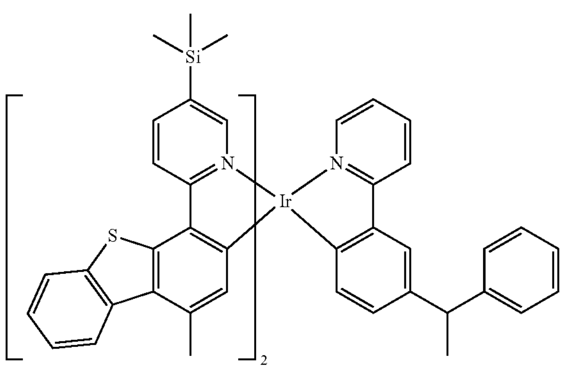
481
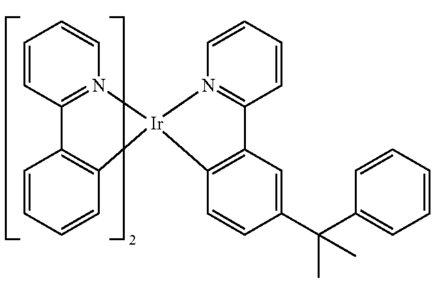
-continued
482
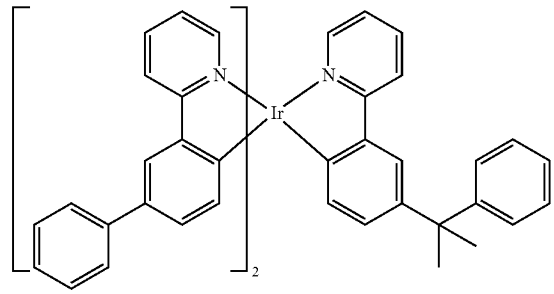
483
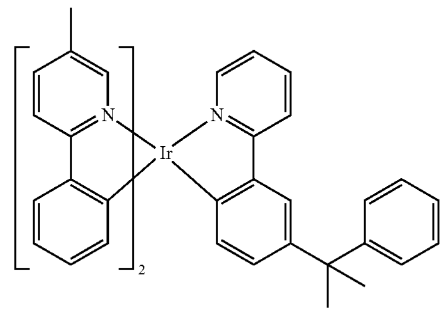
484
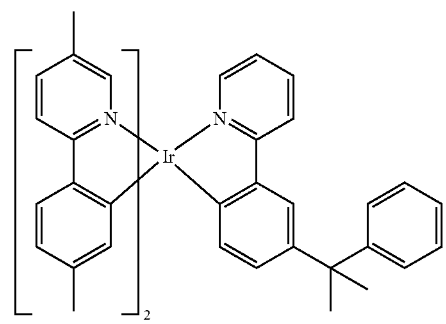
485
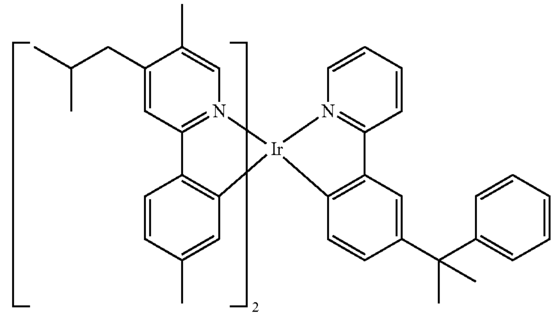

-continued
486
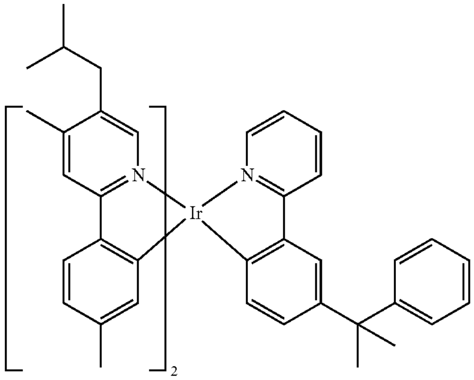
487
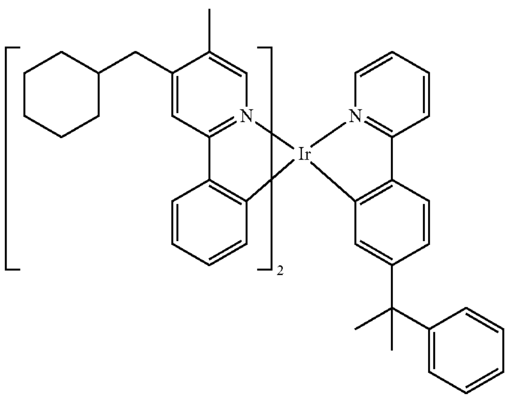
488
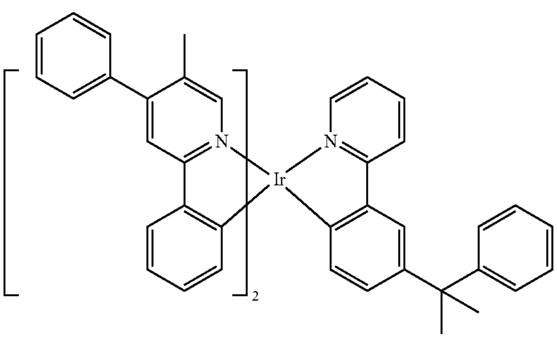
489
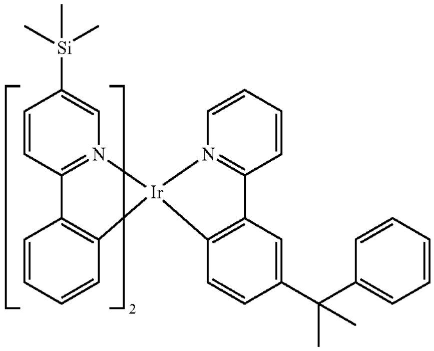
-continued
490
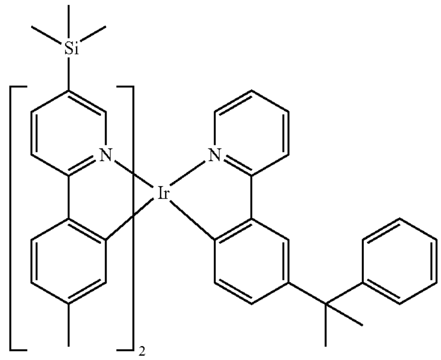
491
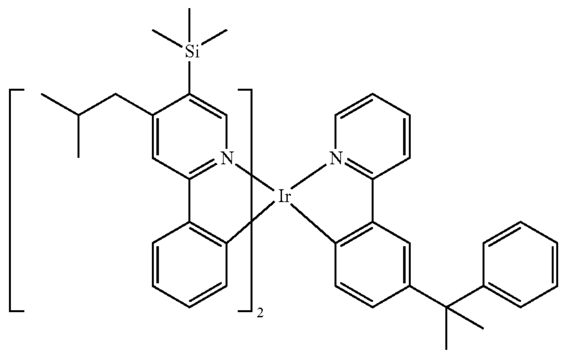
492
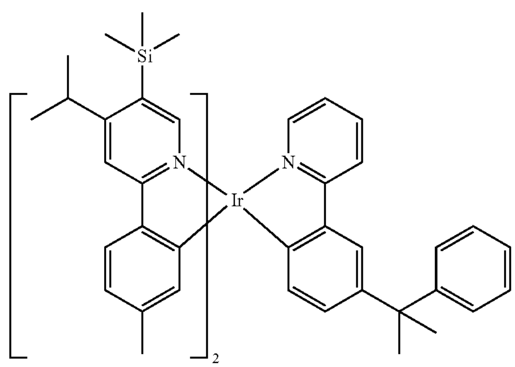
493
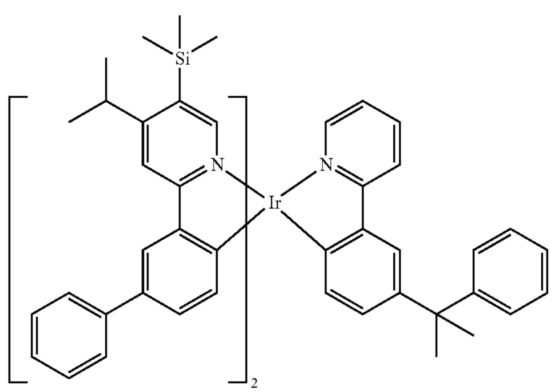

494
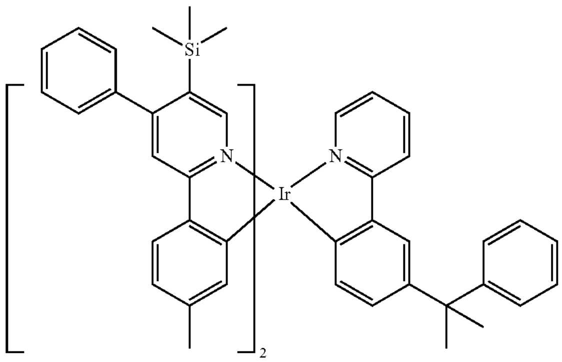
495
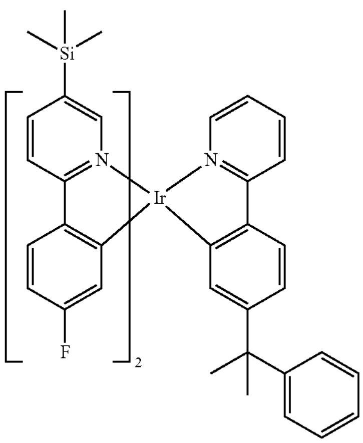
496
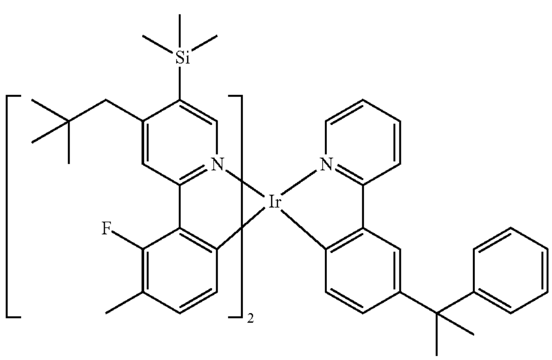
497
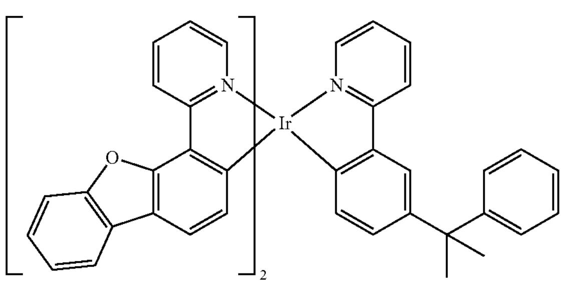
498
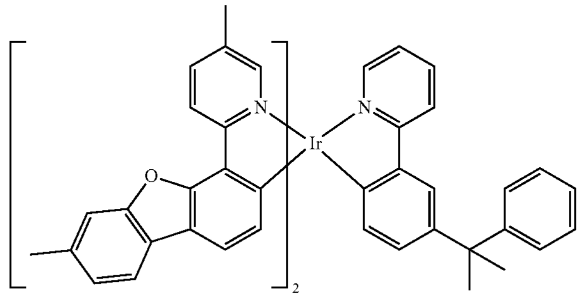
499
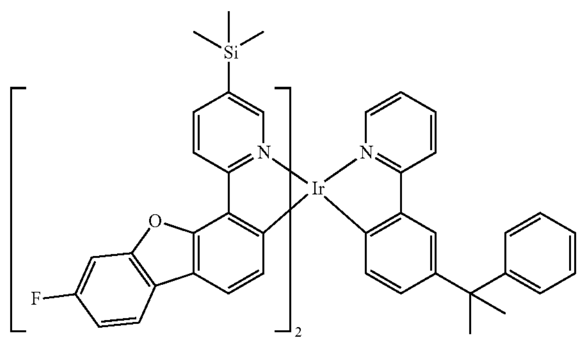
500
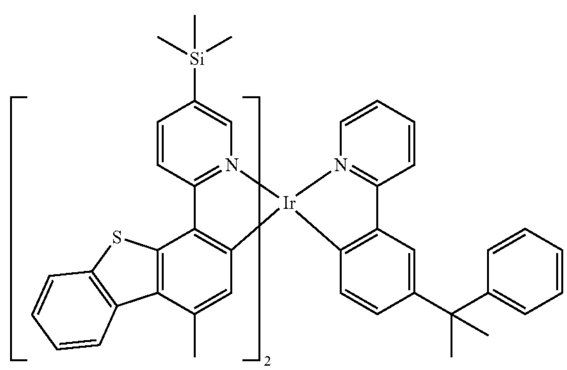
501
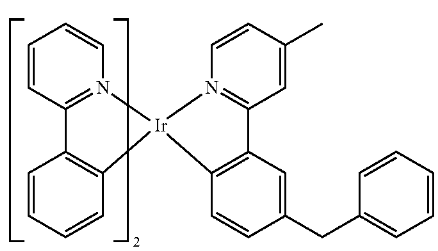

-continued
502
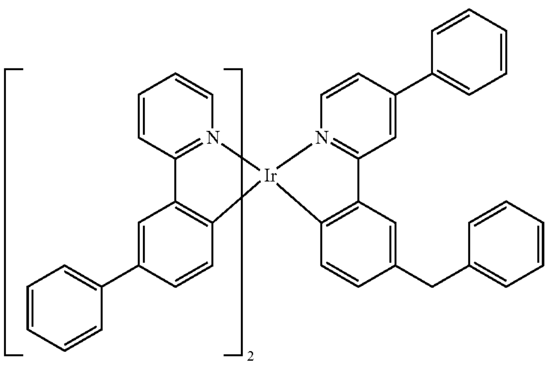
503
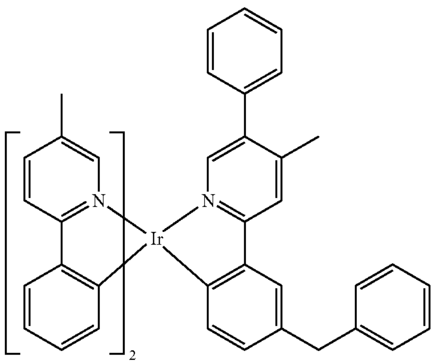
504
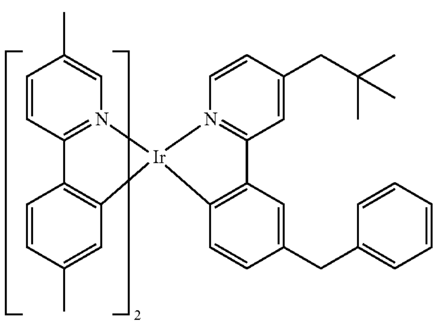
505
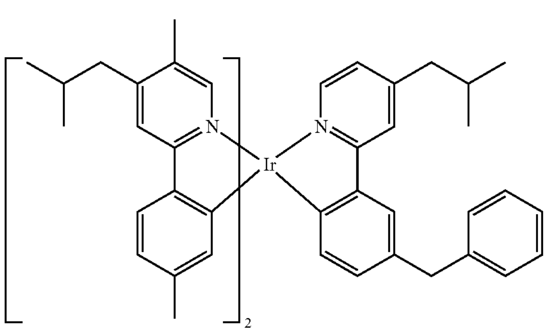
-continued
506
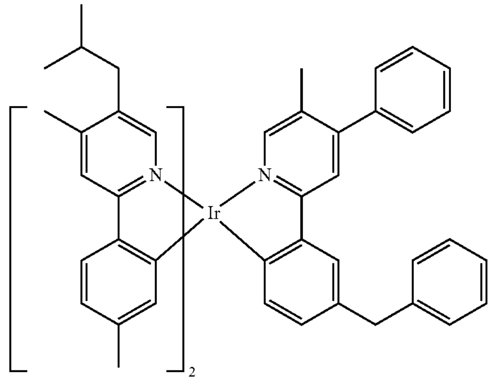
507
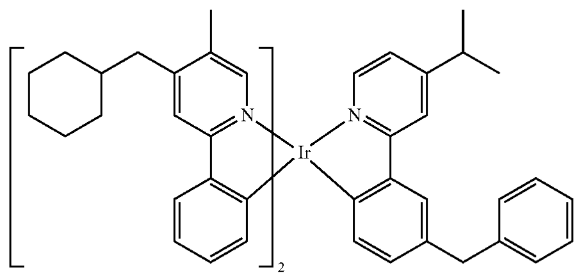
508
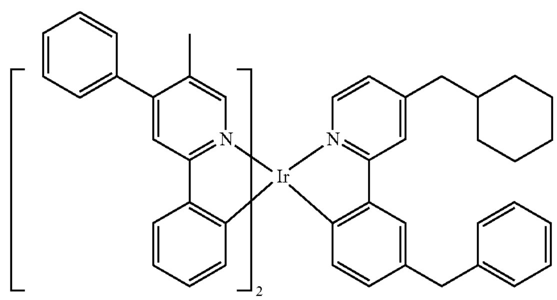
509
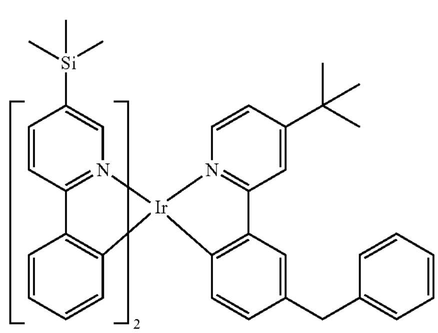

510
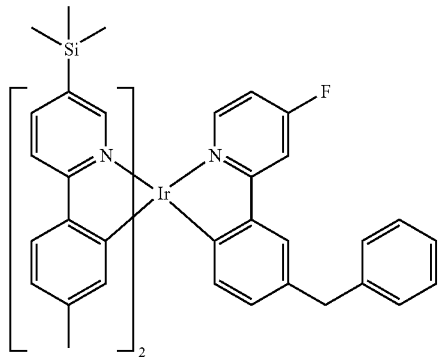
511
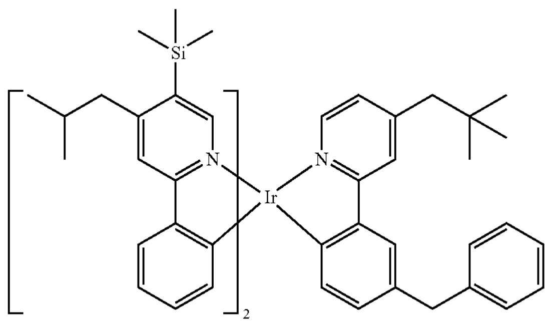
512
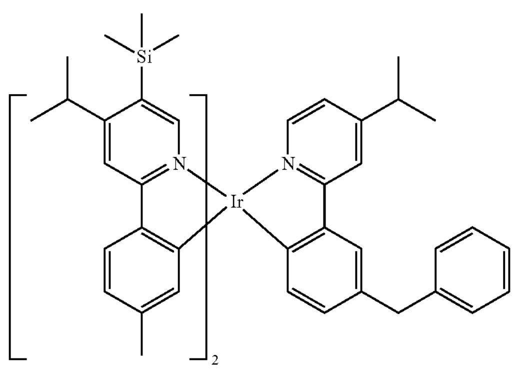
513
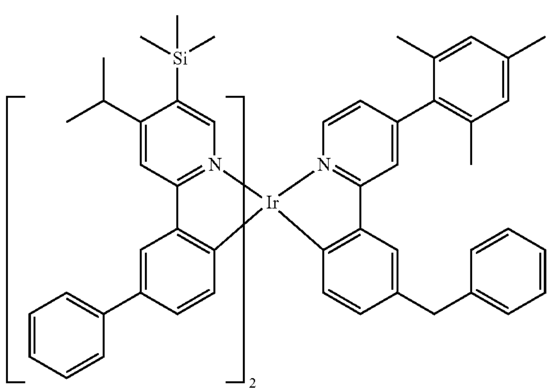
514
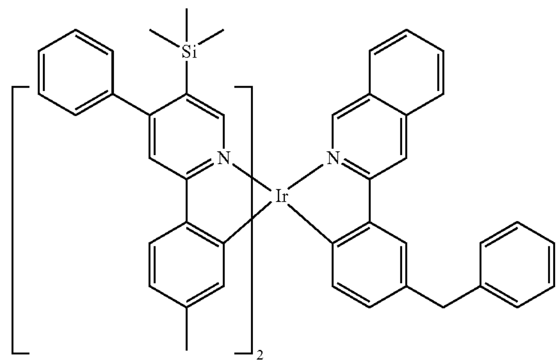
515
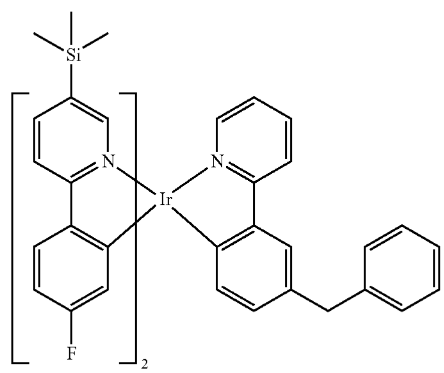
516
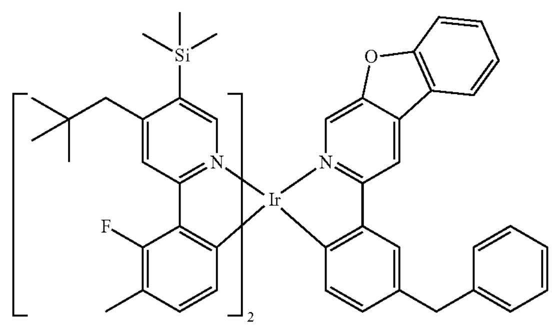
517
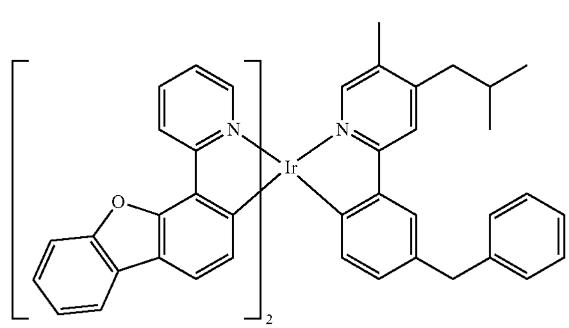

-continued
518
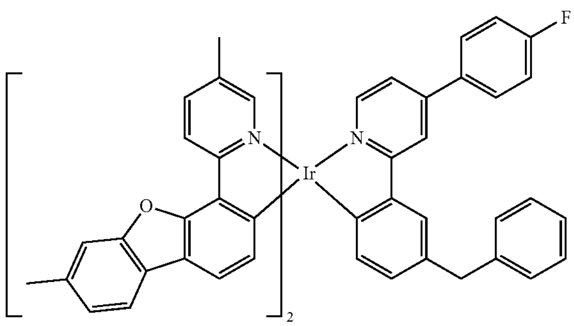
519
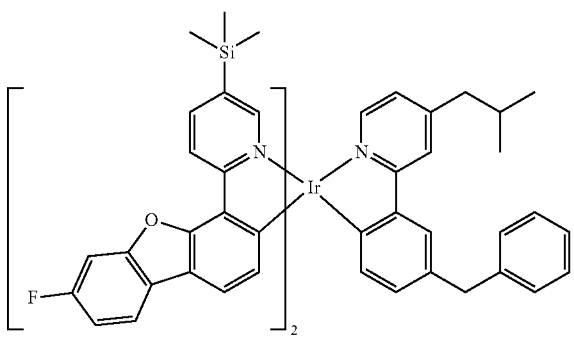
520
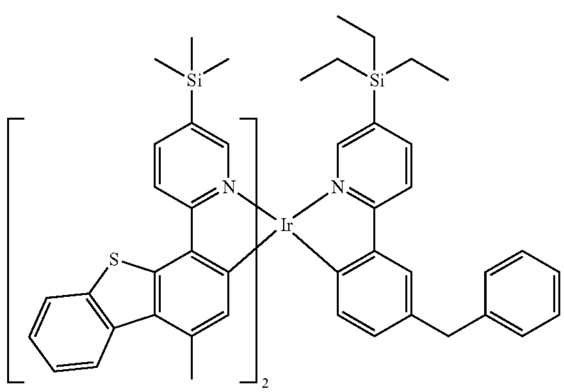
521
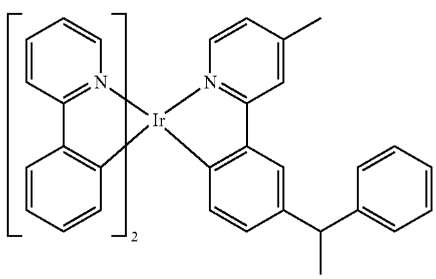
-continued
522
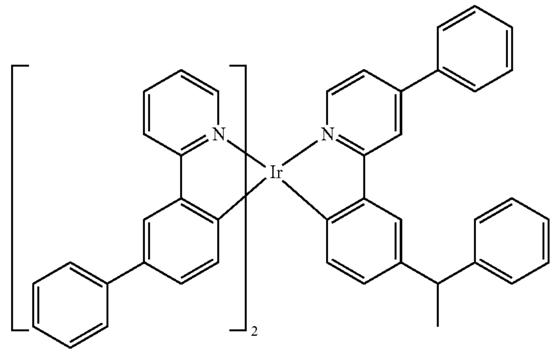
523
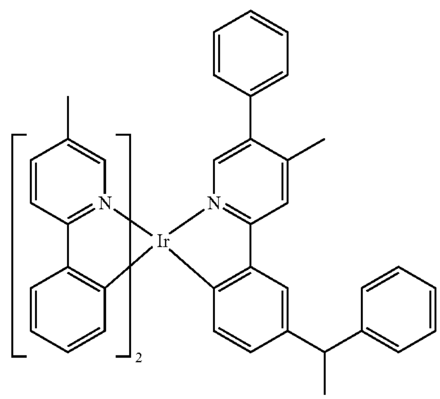
524
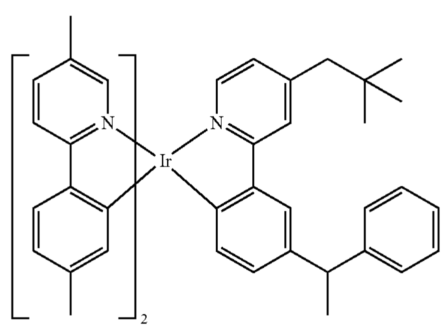
525
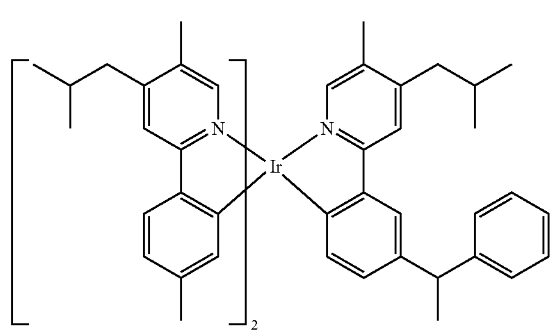

-continued
526
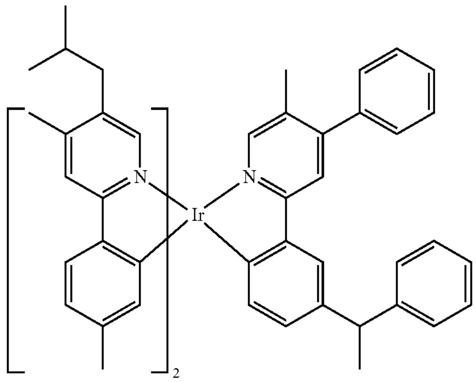
527
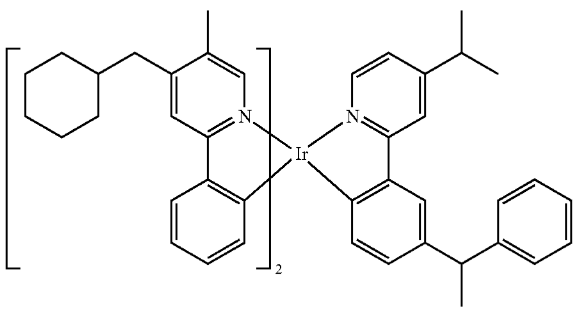
528
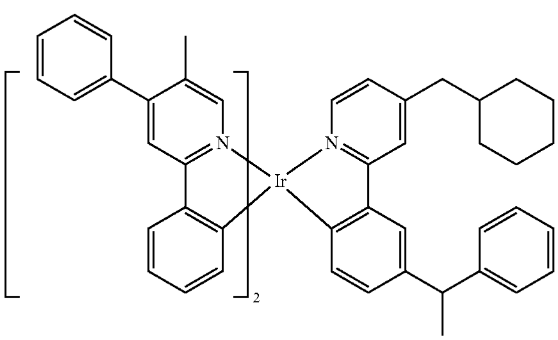
529
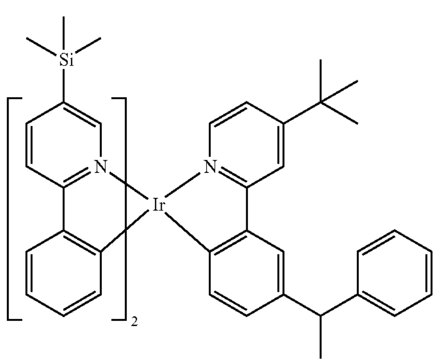
-continued
530
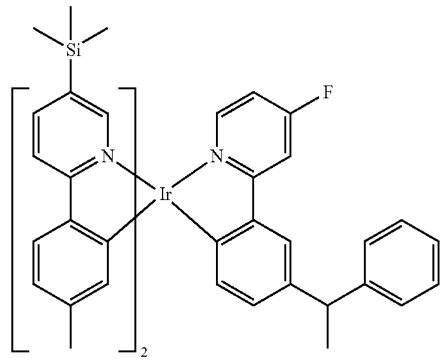
531
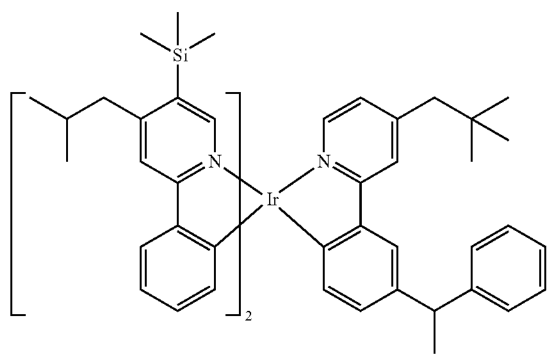
532
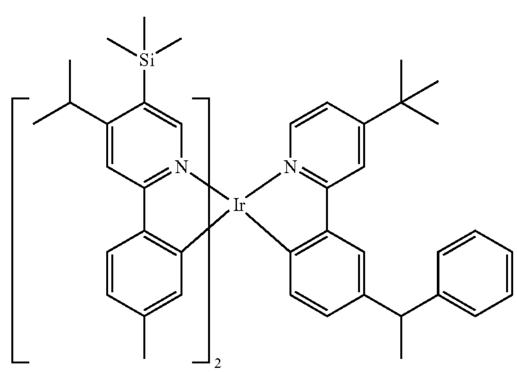
533
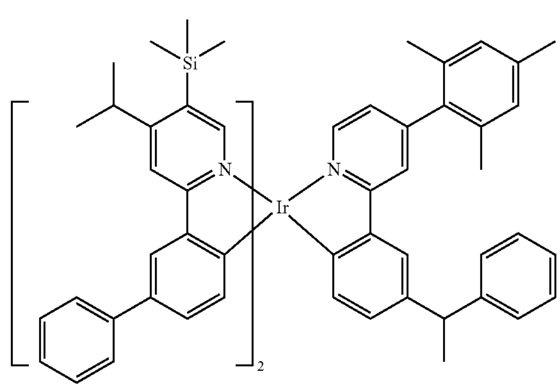

534
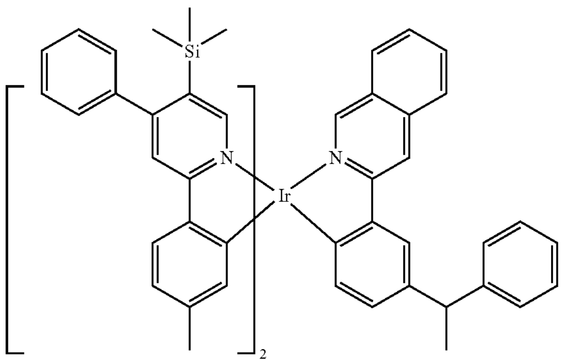
535
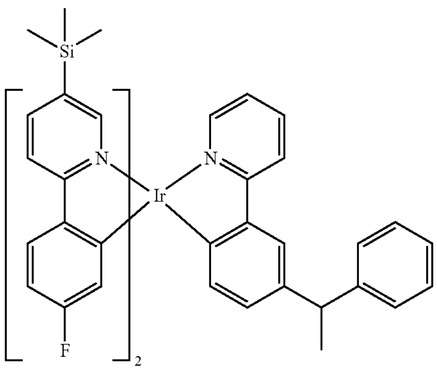
536
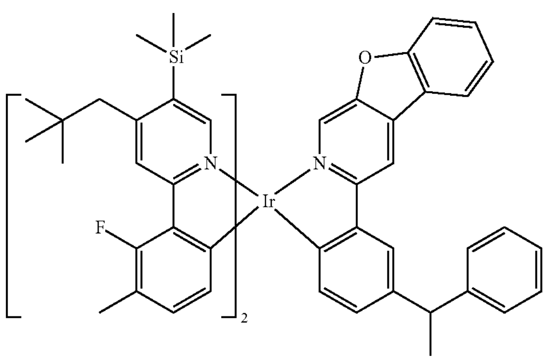
537
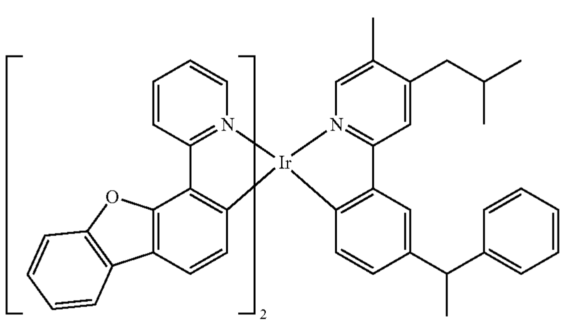
538
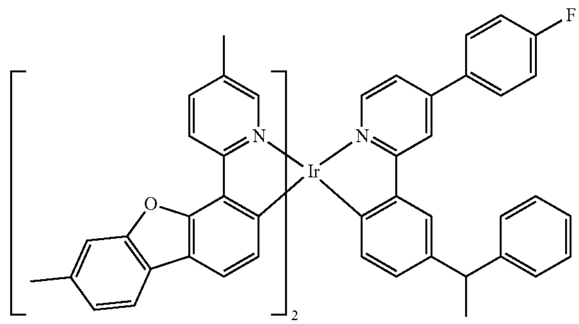
539
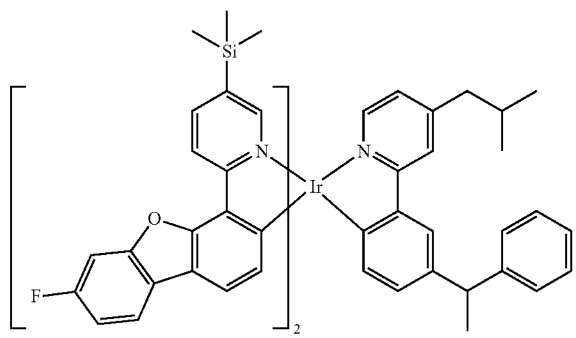
540
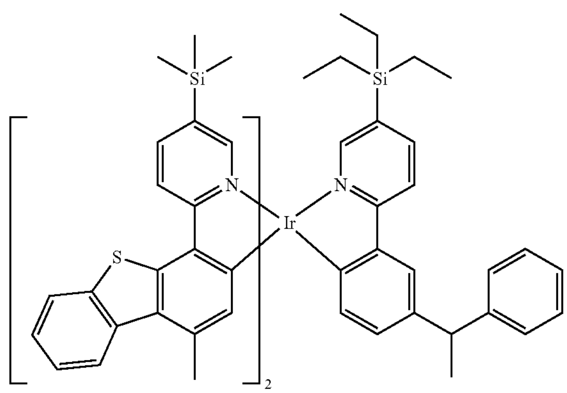
541
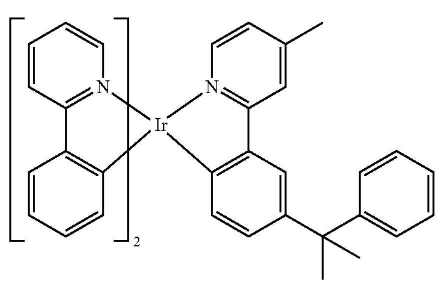

-continued
542
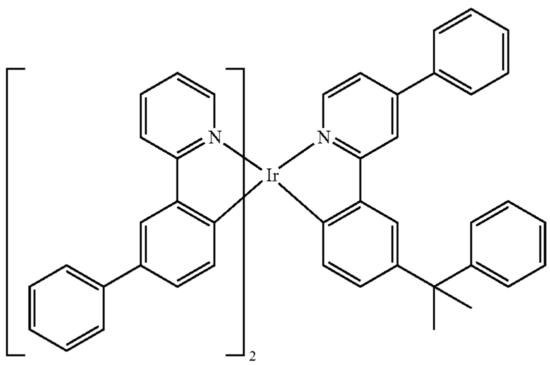
543
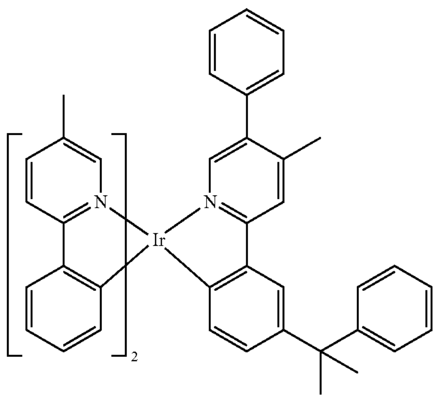
544
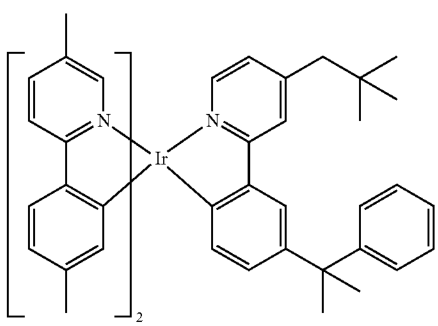
545
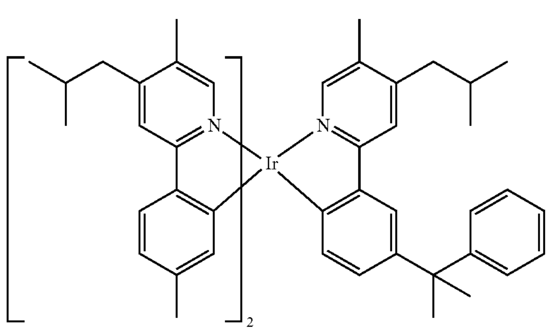
-continued
546
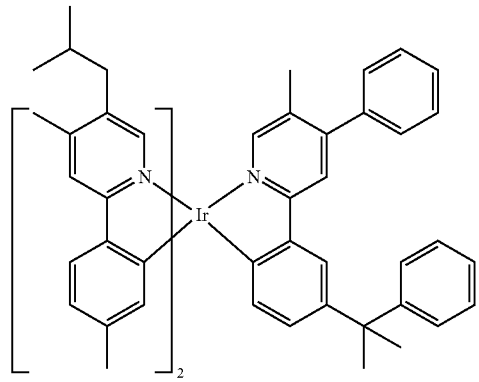
547
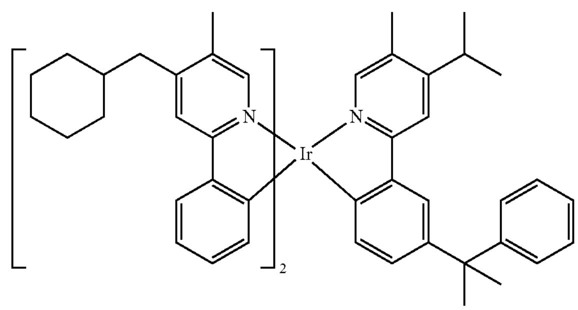
548
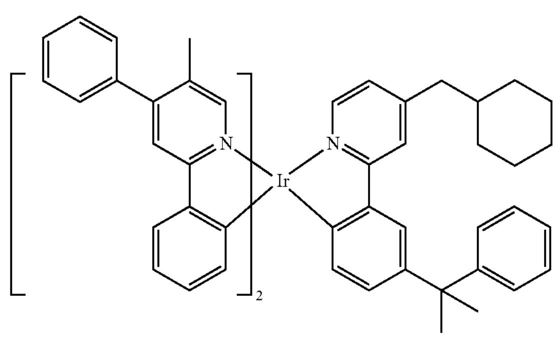
549
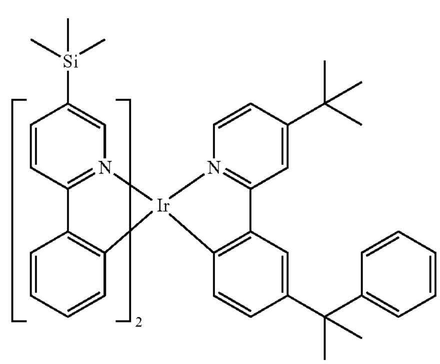

550
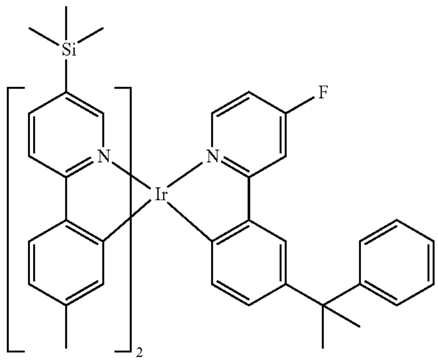
551
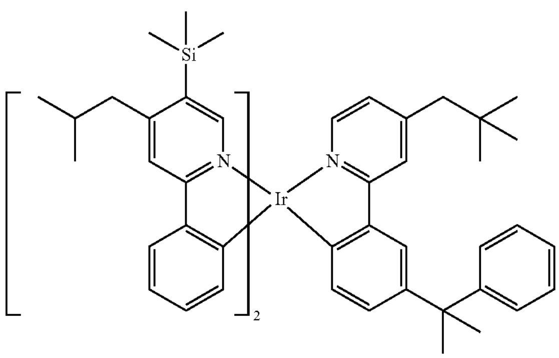
552
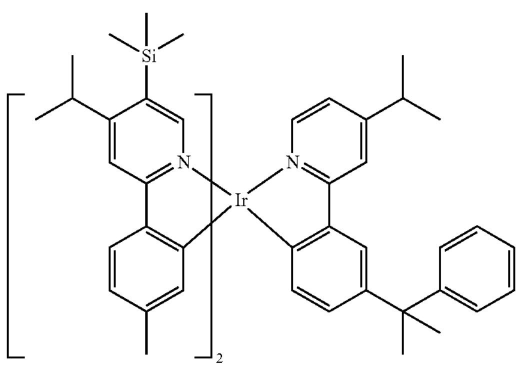
553
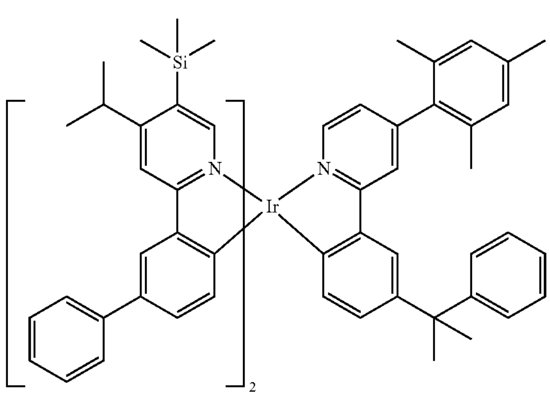
554
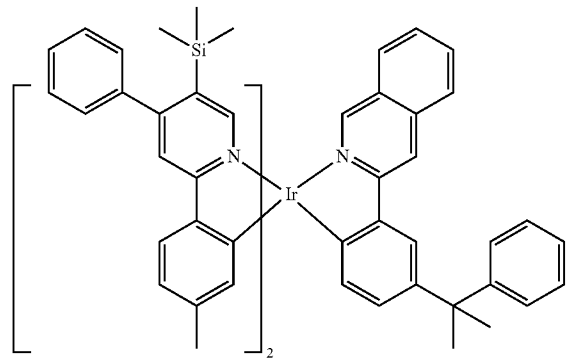
555
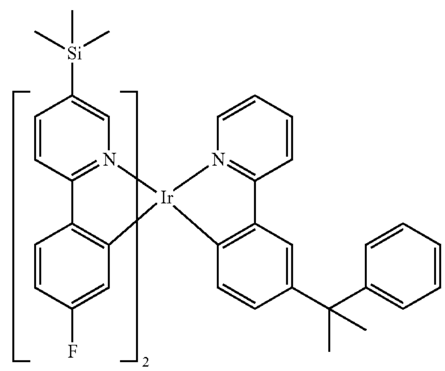
556
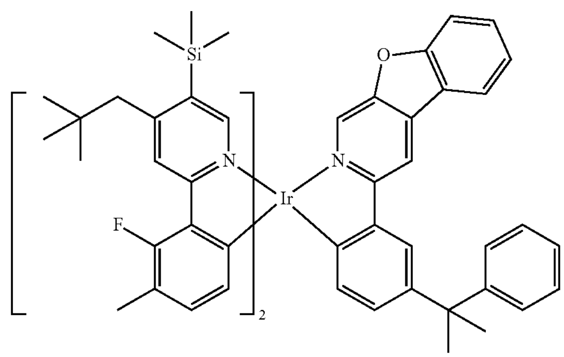
557
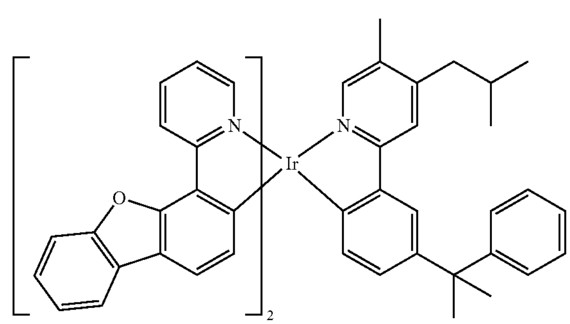

-continued
558
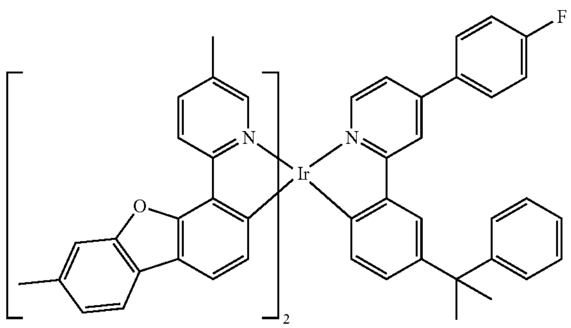
559
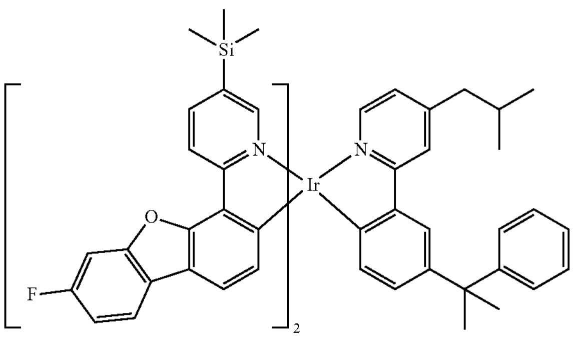
560
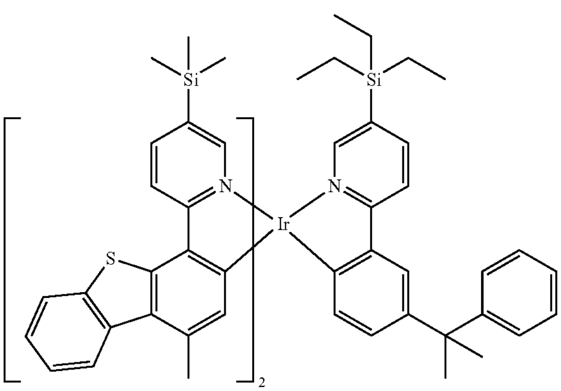
561
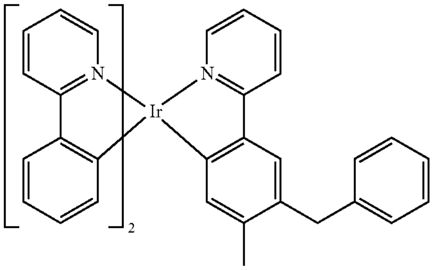
-continued
562
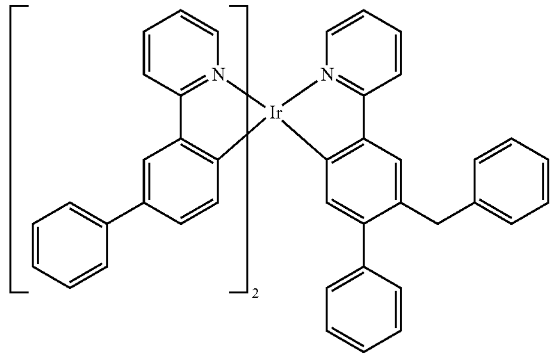
563
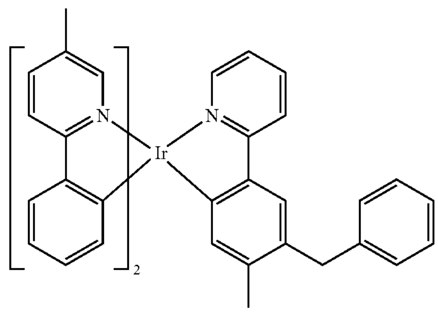
564
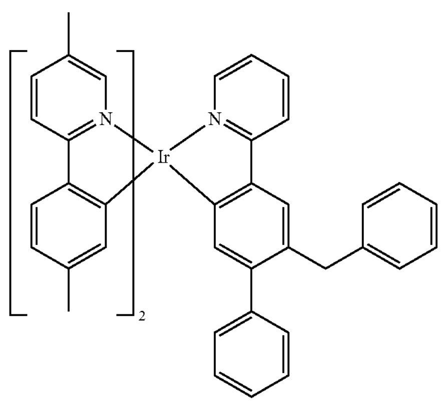
565
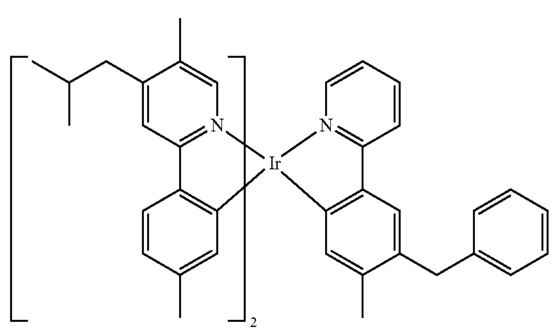

-continued
566
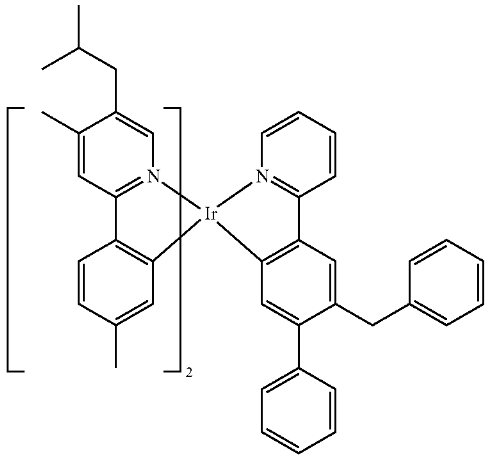
567
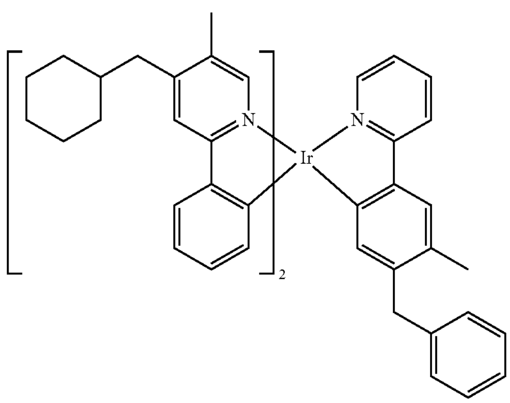
568
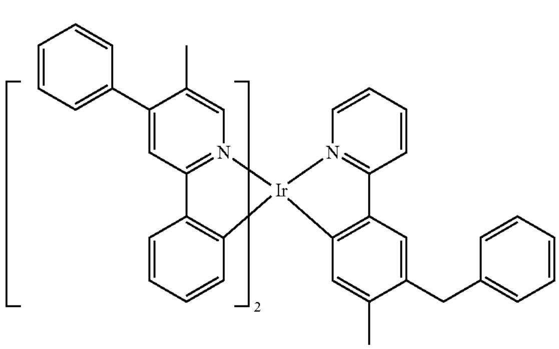
-continued
569
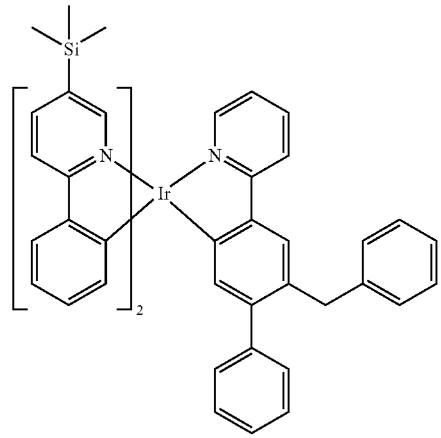
570
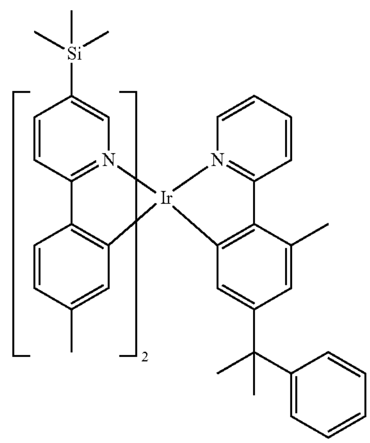
571
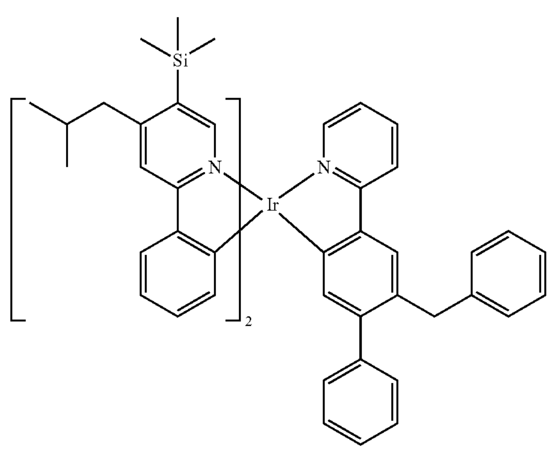

-continued
572
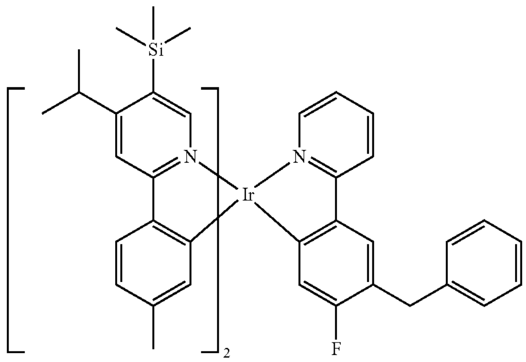
573
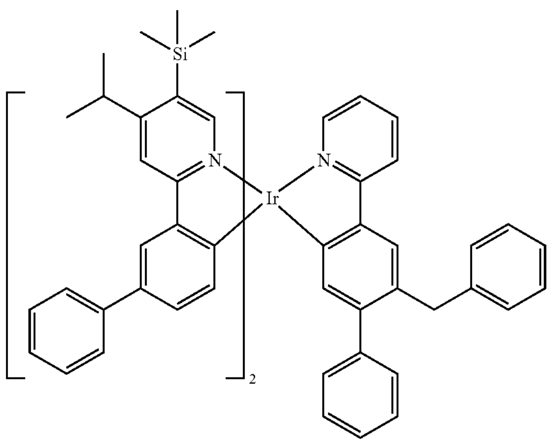
574
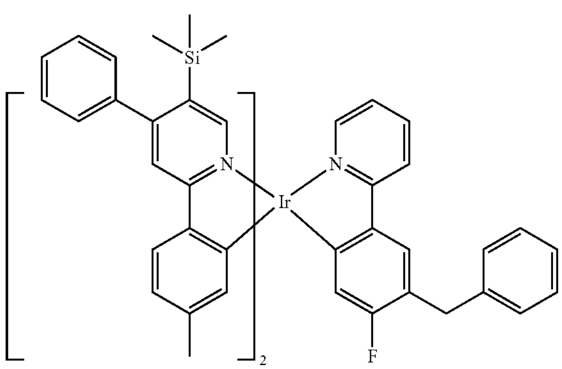
575
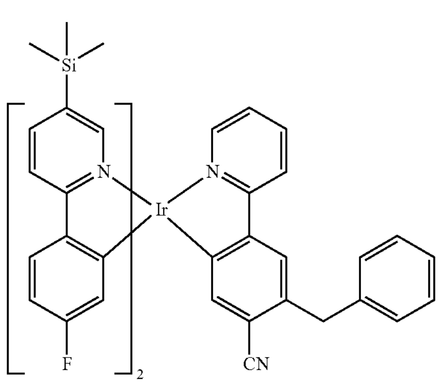
-continued
576
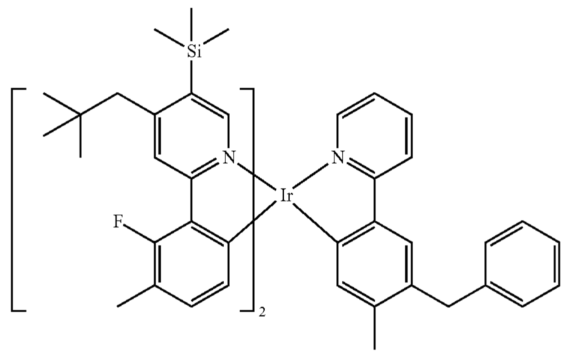
577
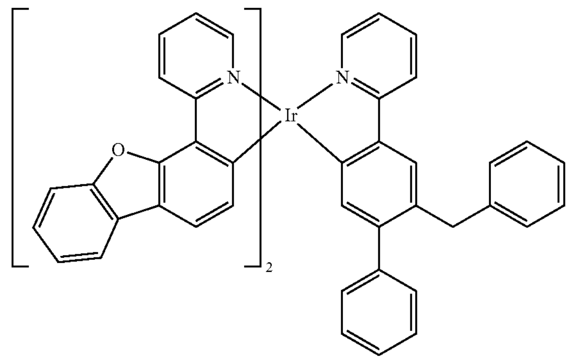
578
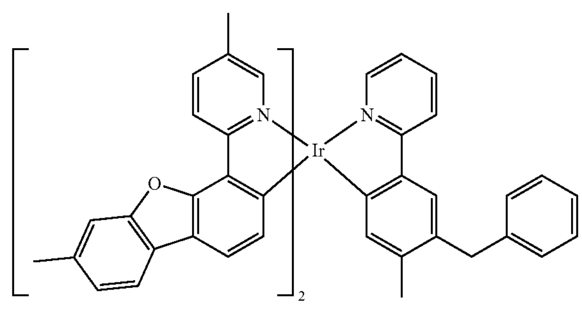
579
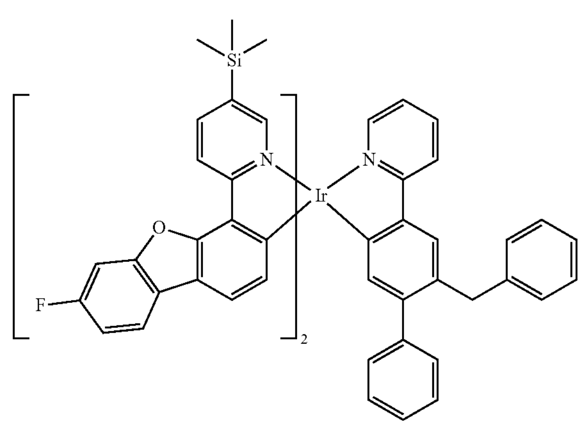

580
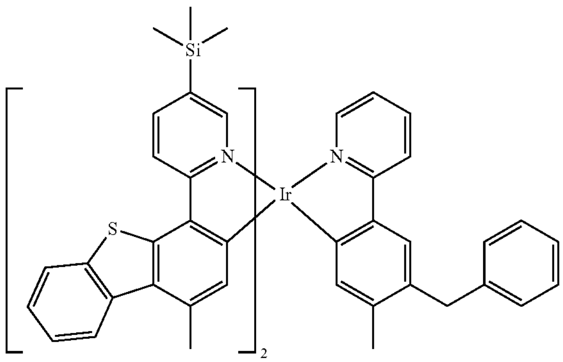
581
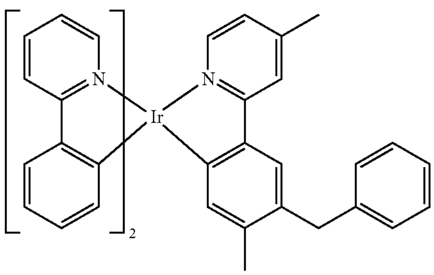
582
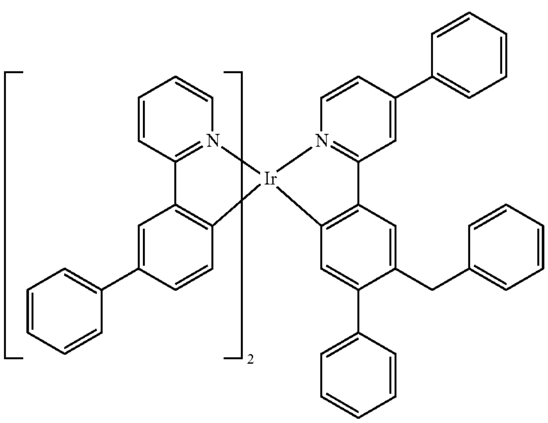
583
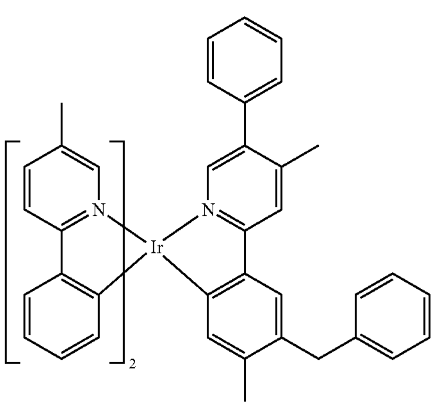
584
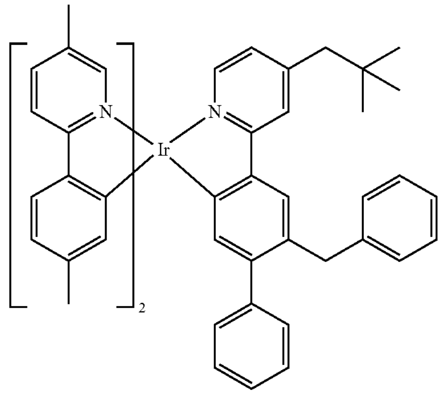
585
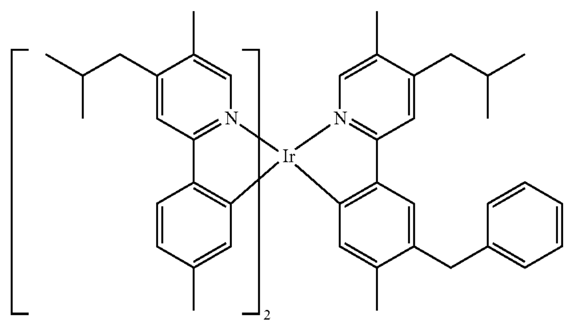
586
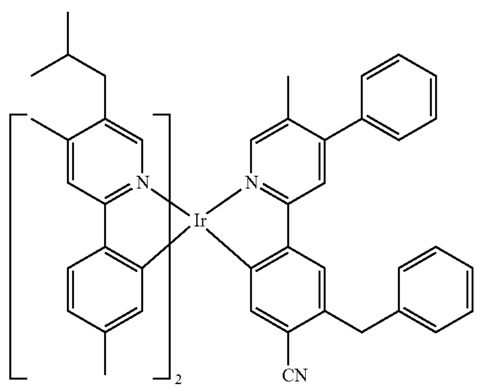
587
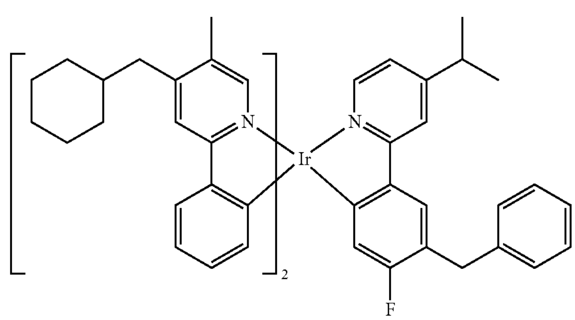

-continued
588
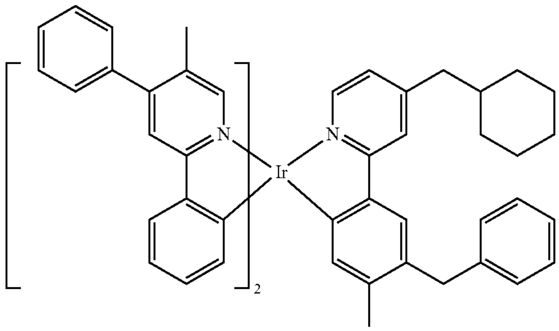
589
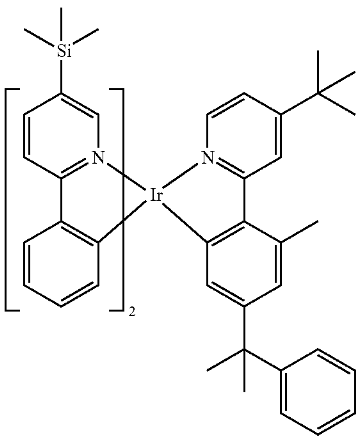
590
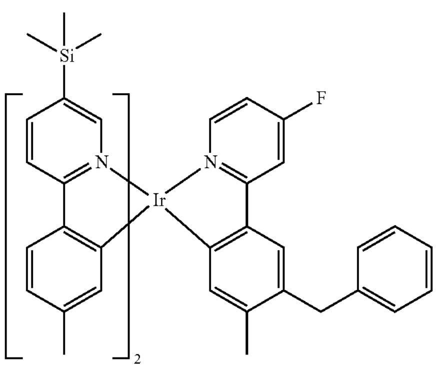
591
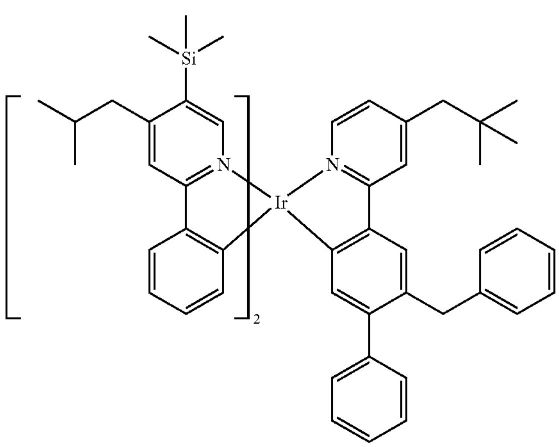
-continued
592
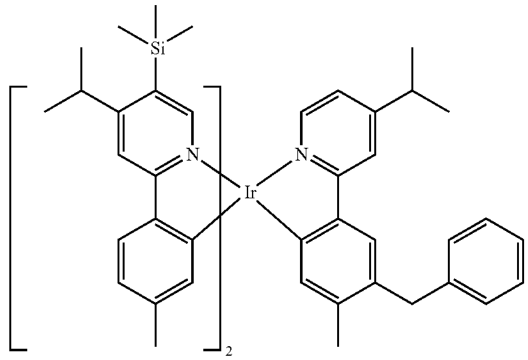
593
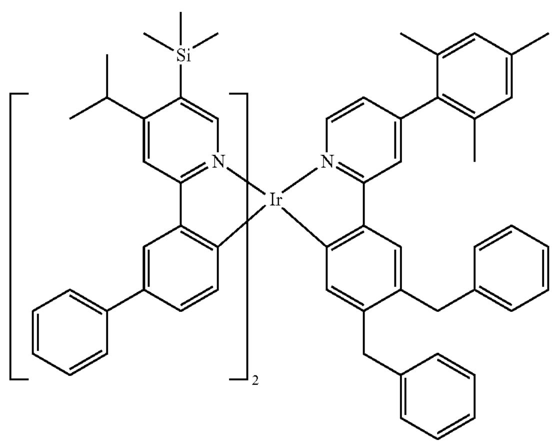
594
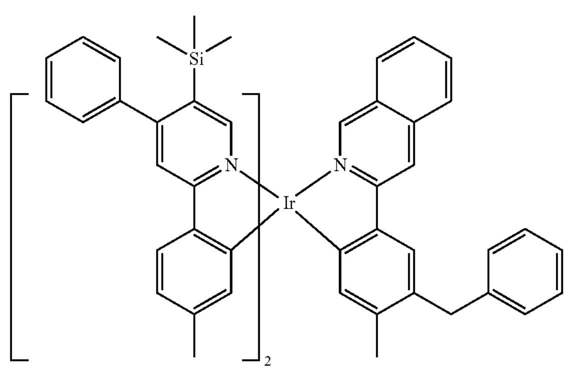

595
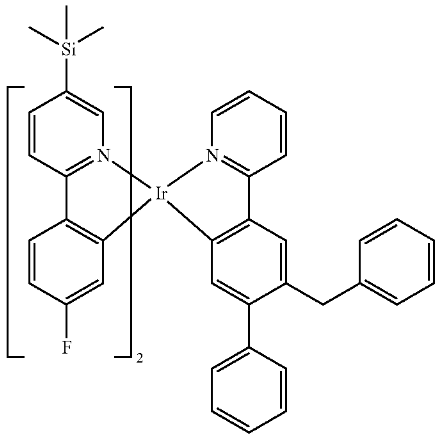
596
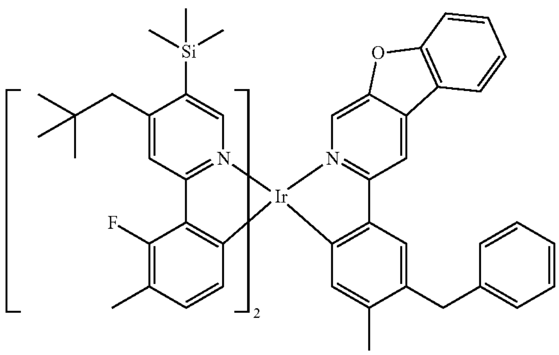
597
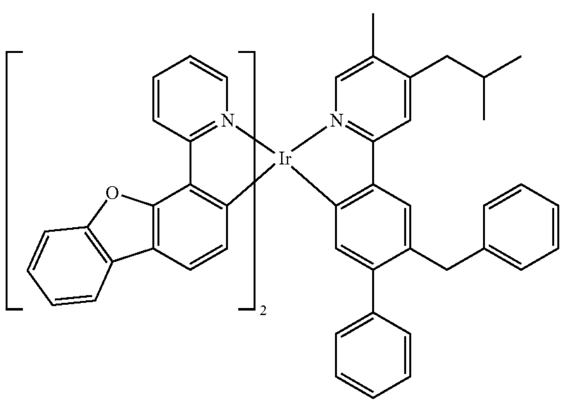
598
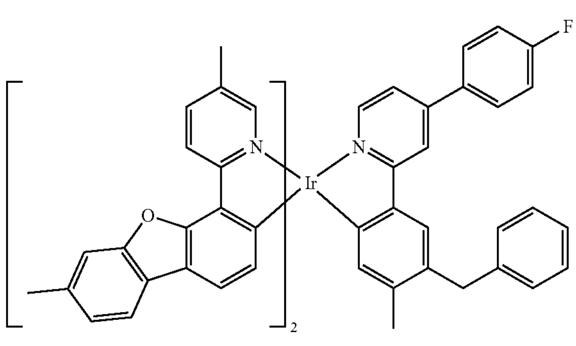
599
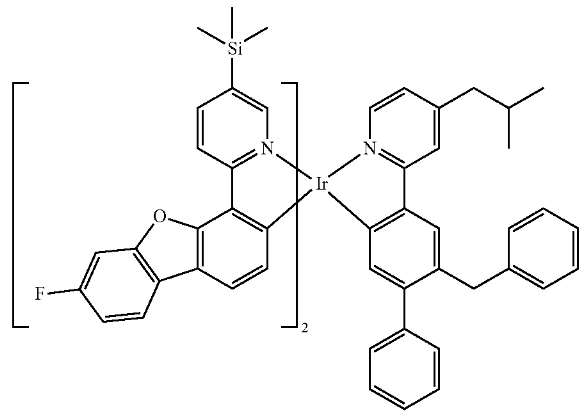
600
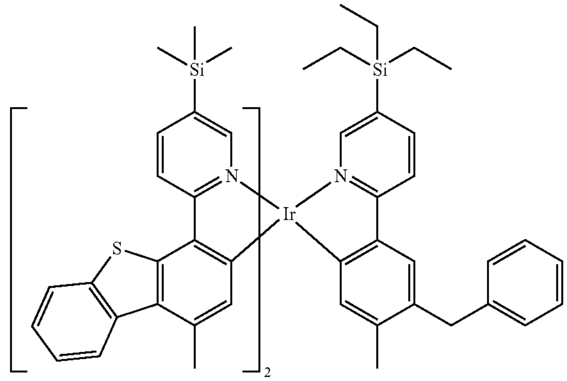
601
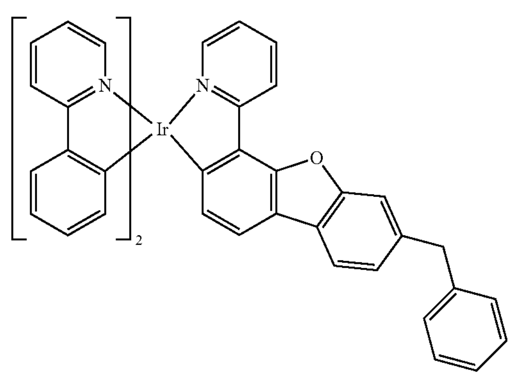

-continued
602
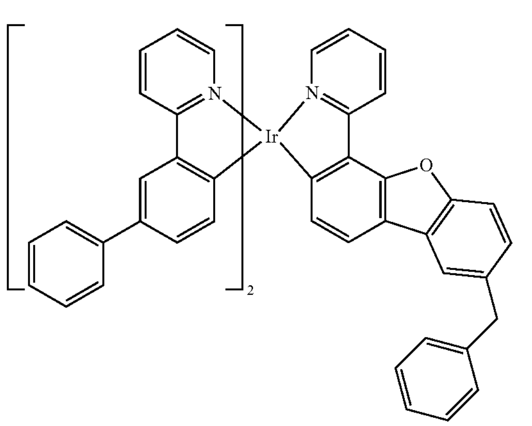
603
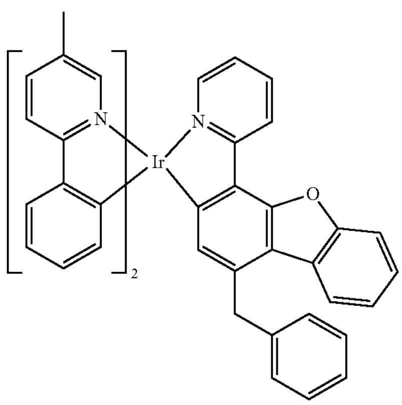
604
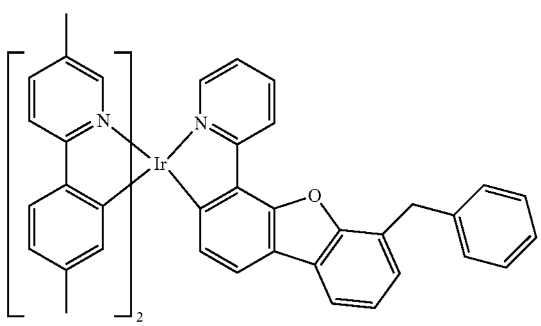
605
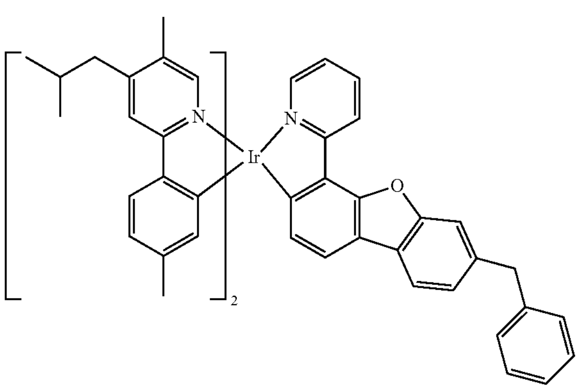
-continued
606
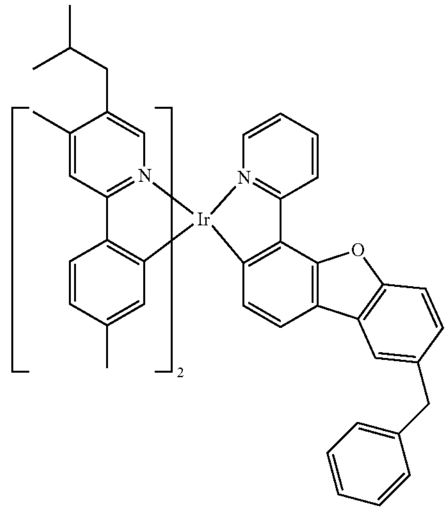
607
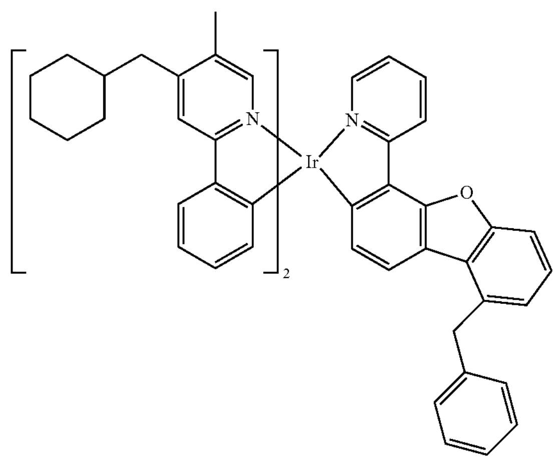
608
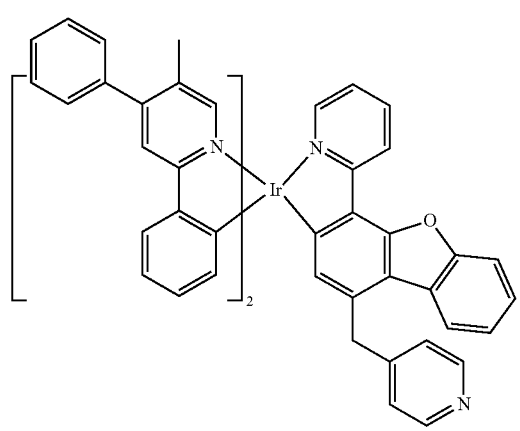

-continued
609
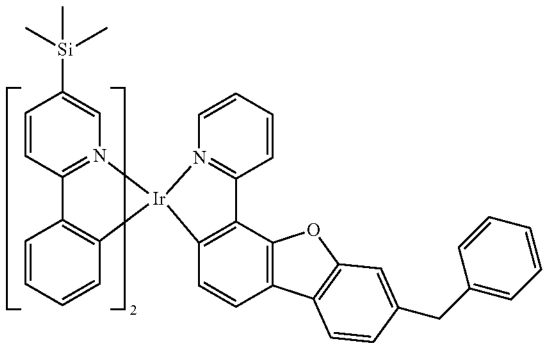
610
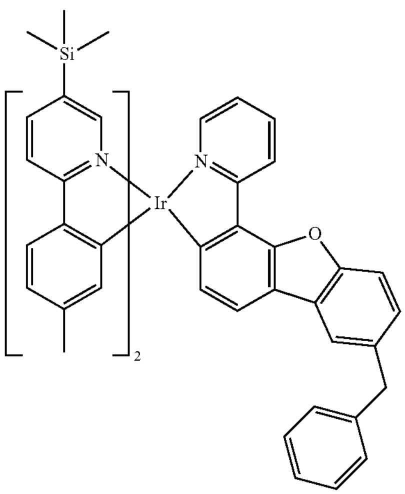
611
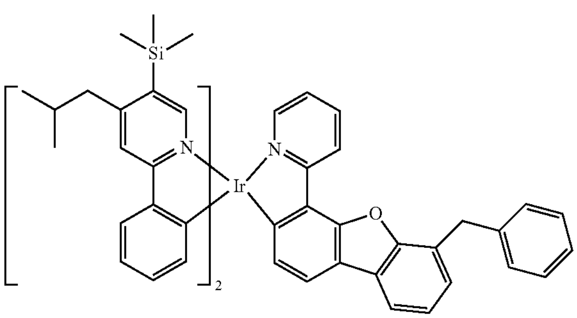
612
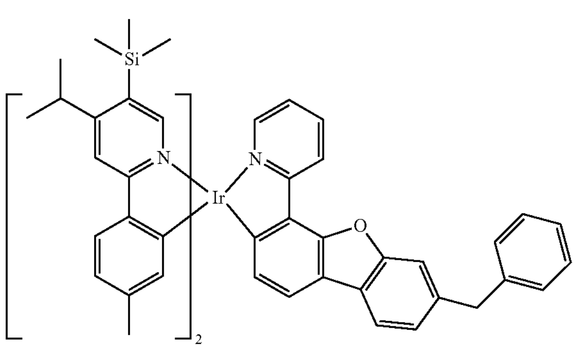
-continued
613
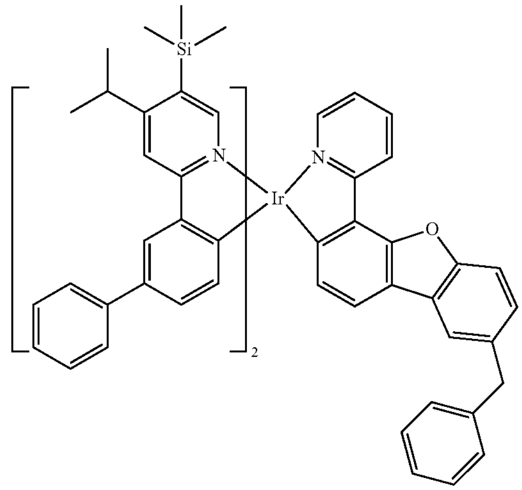
614
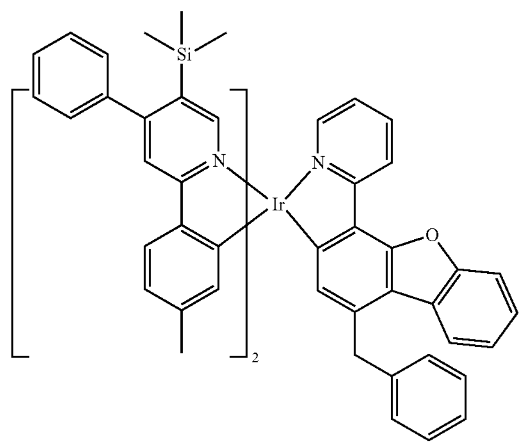
615
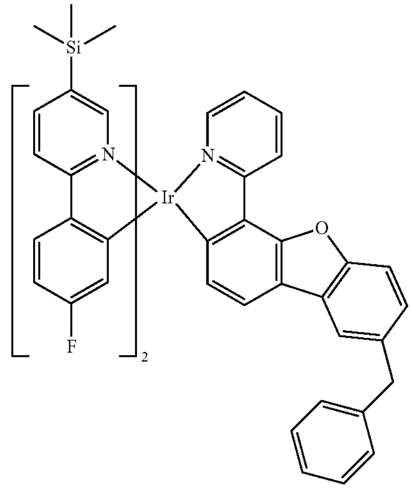

-continued
616
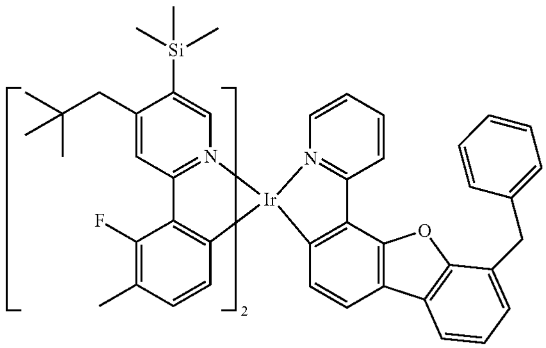
617
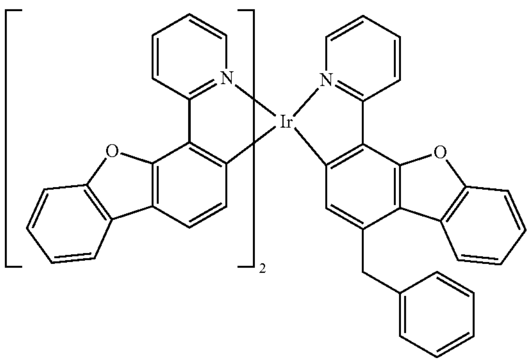
618
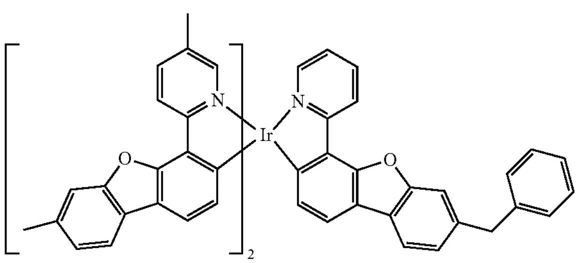
619
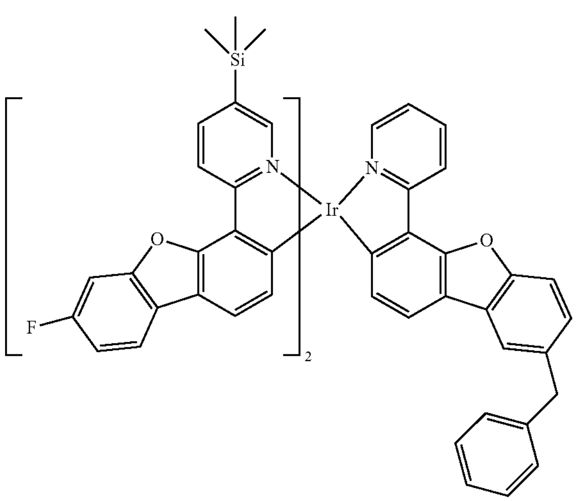
-continued
620
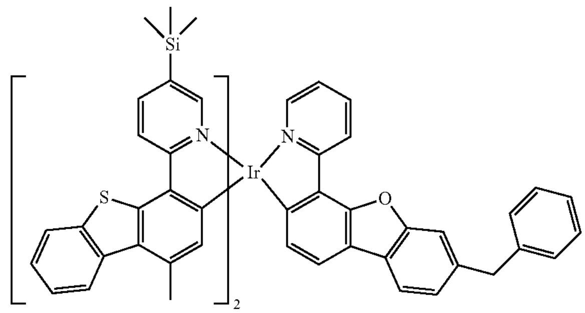
621
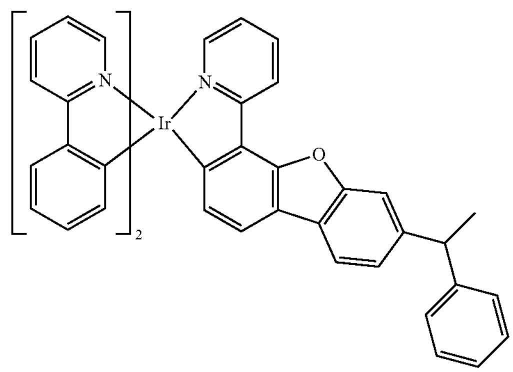
622
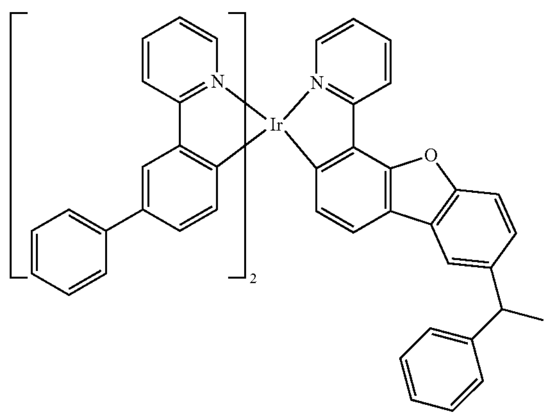
623
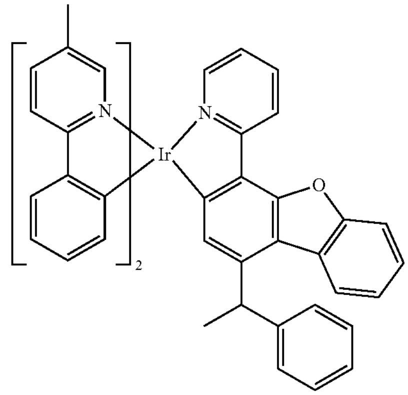

-continued
624
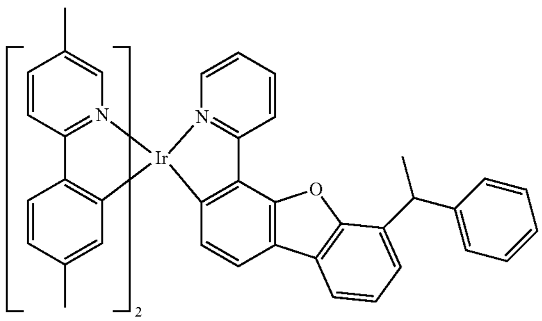
625
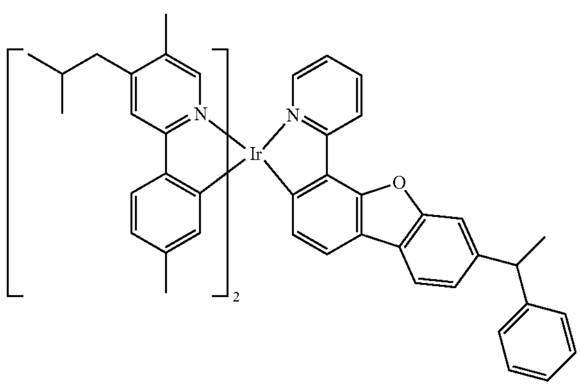
626
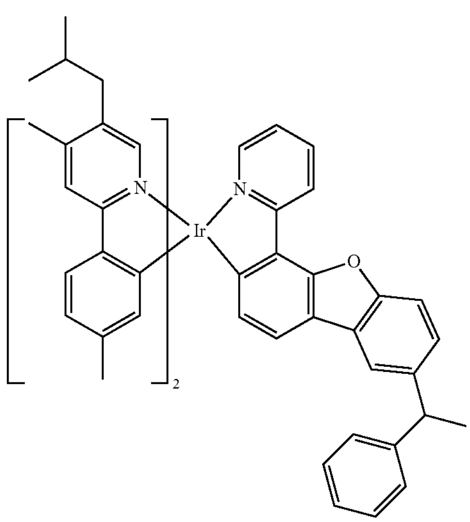
-continued
627
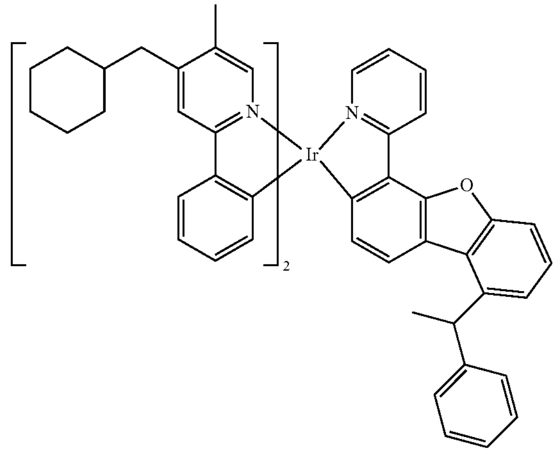
628
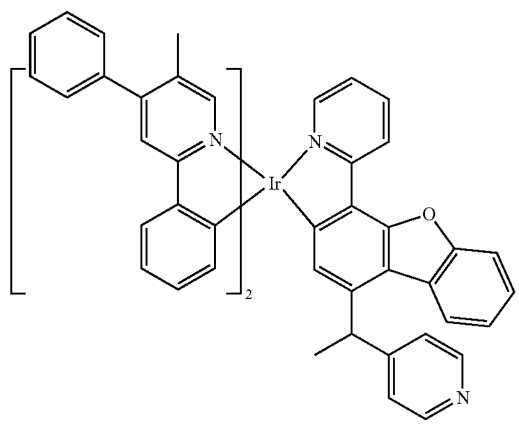
629
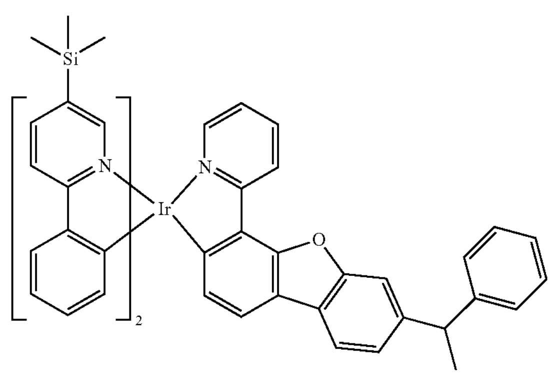

-continued
630
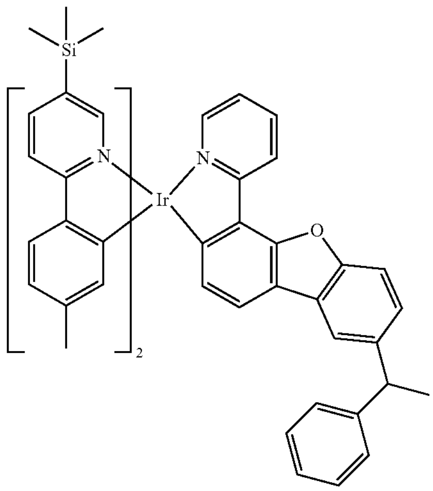
631
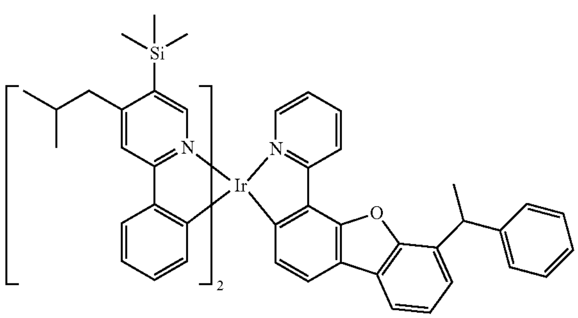
632
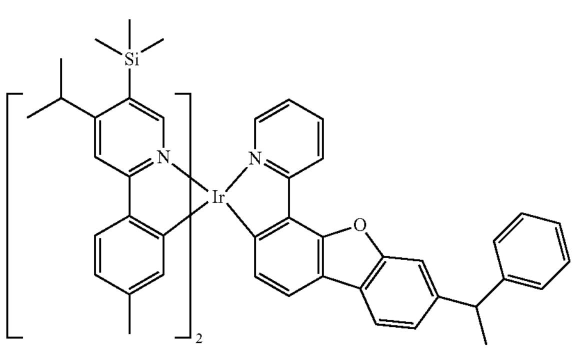
-continued
633
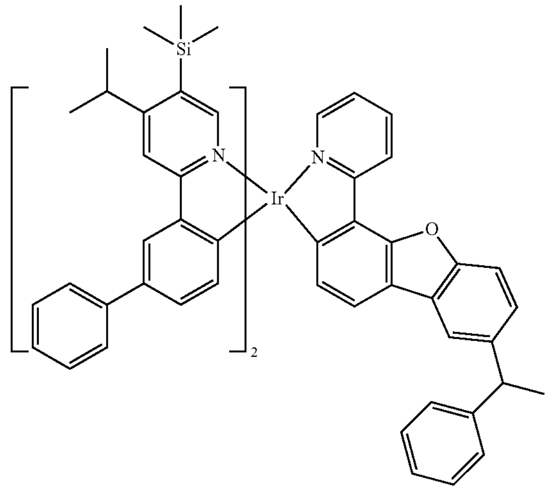
634
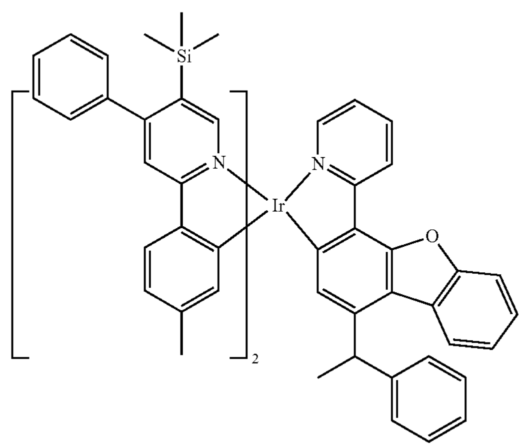
635
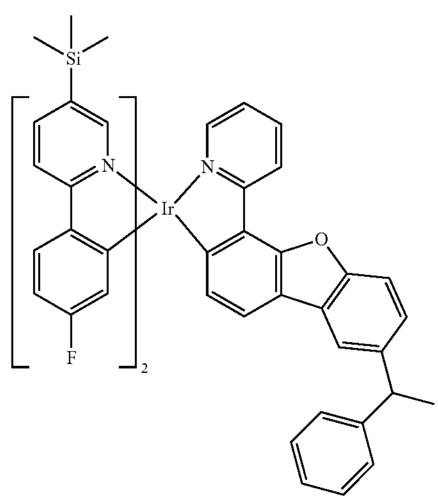

636
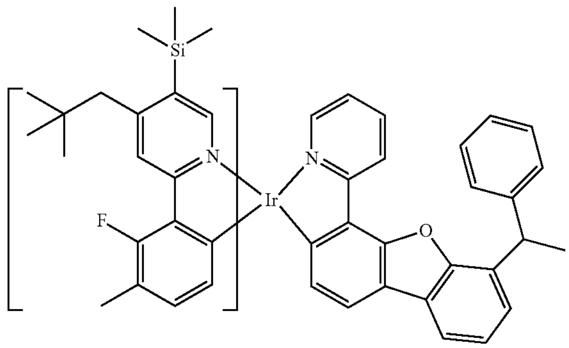
637
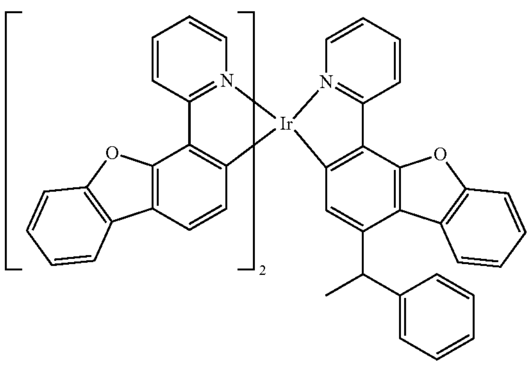
638
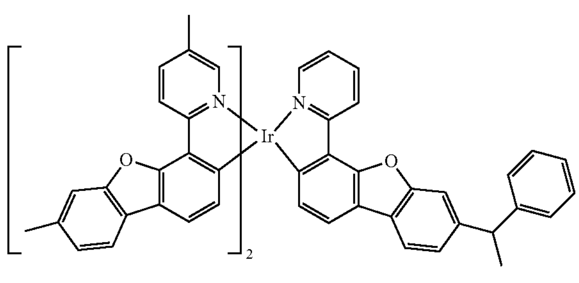
639
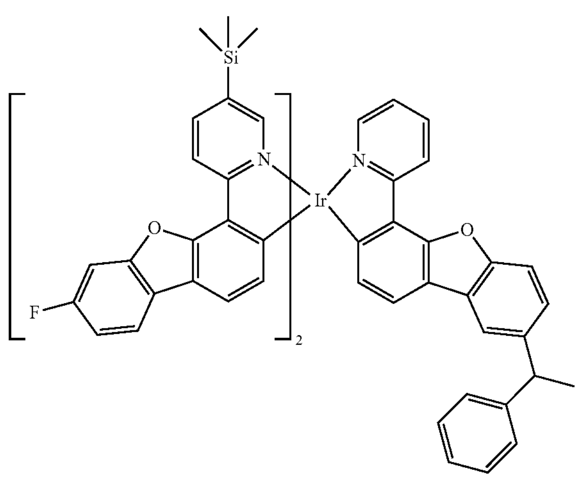
640
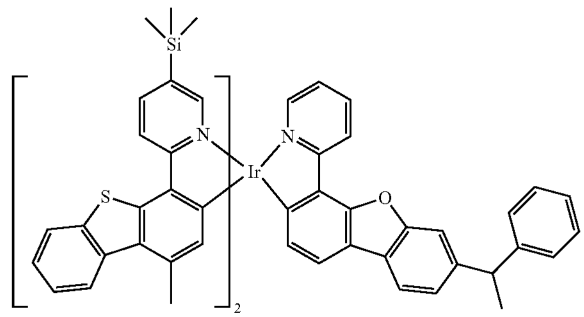
641
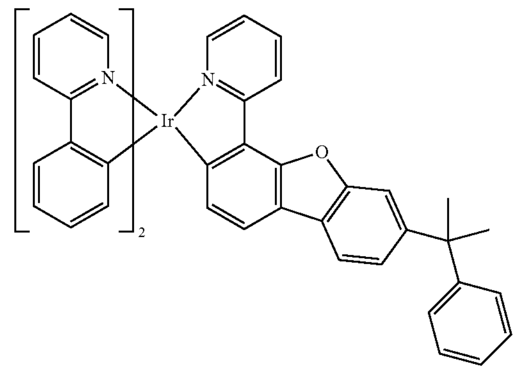
642
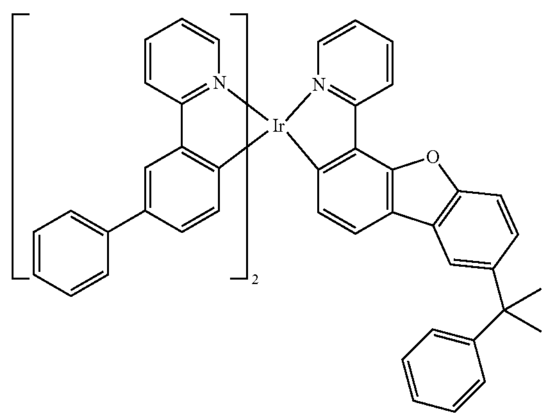
643
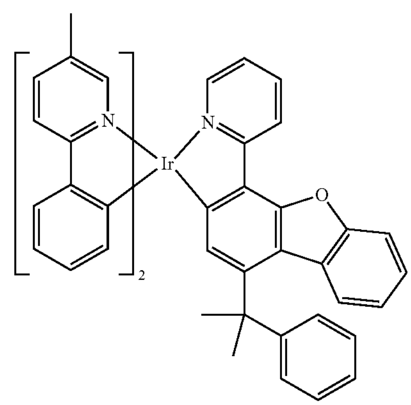

-continued
644
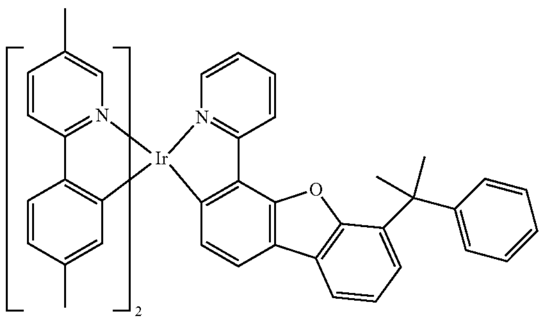
645
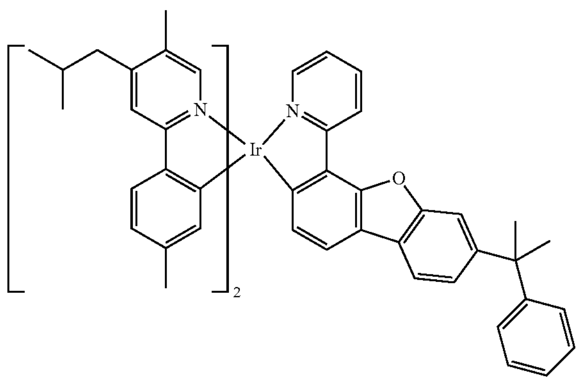
646
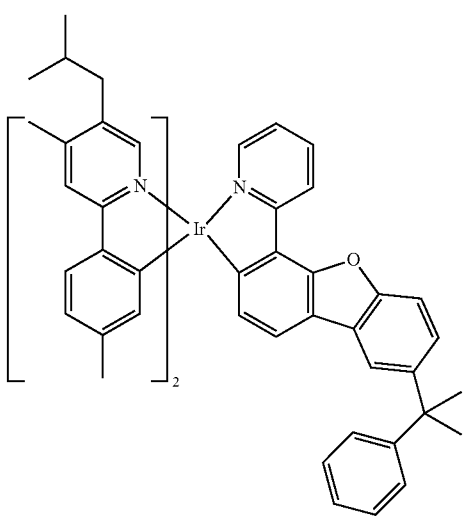
-continued
647
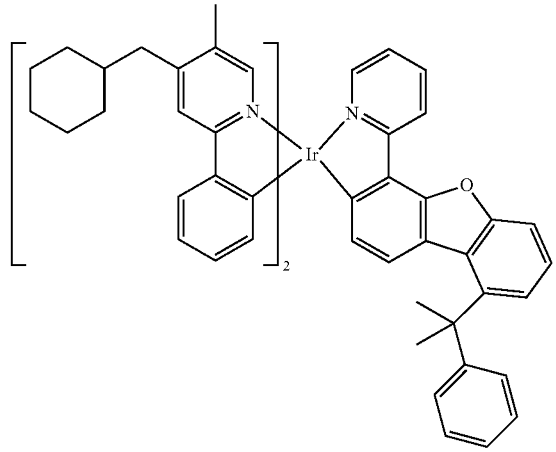
648
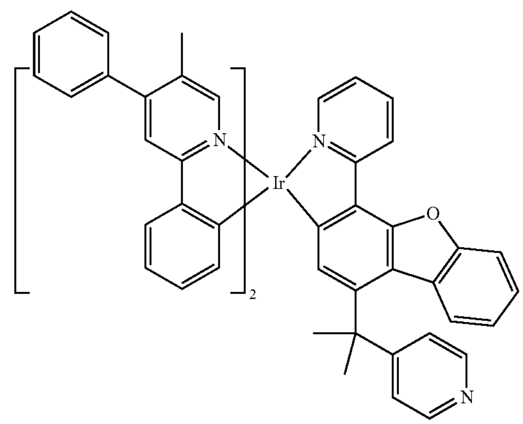
649
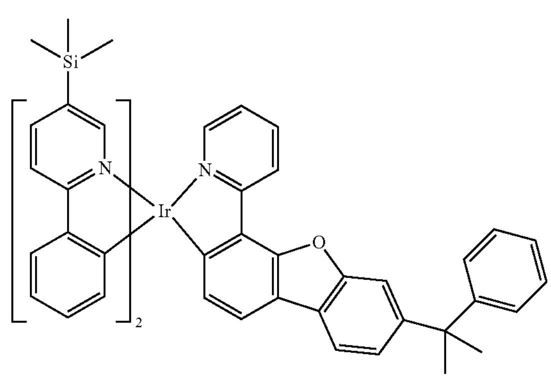

-continued
650
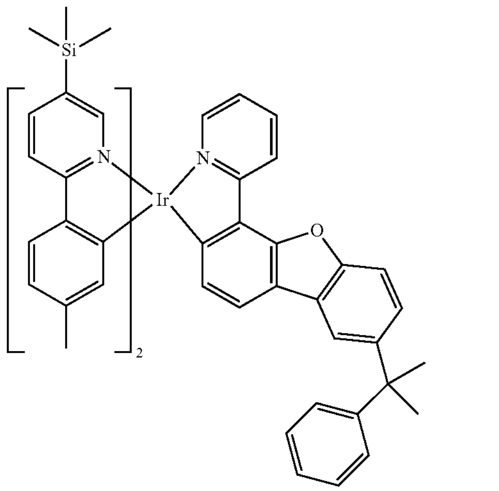
651
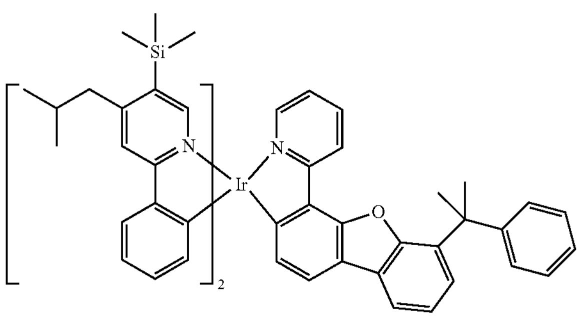
652
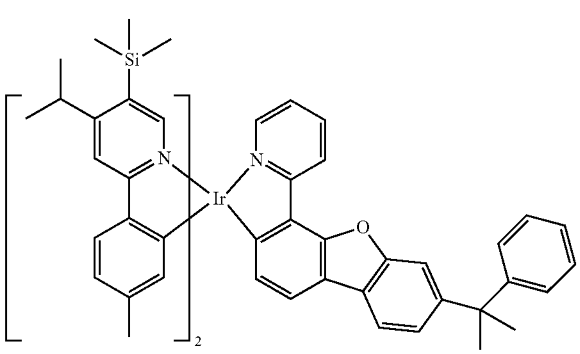
-continued
653
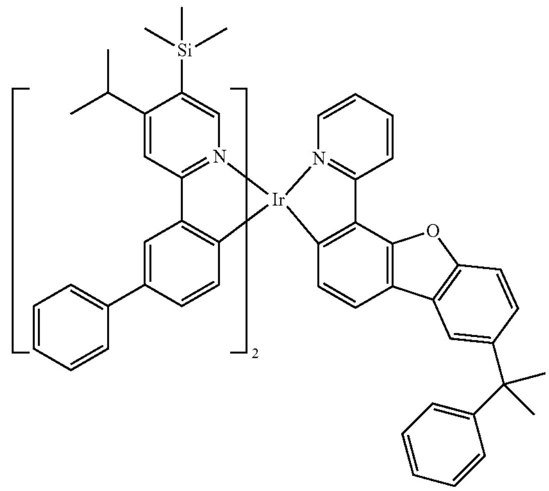
654
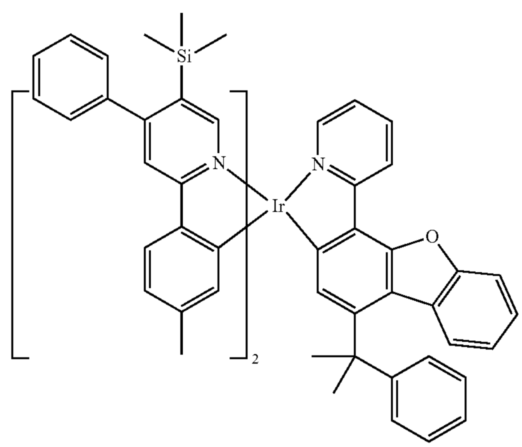
655
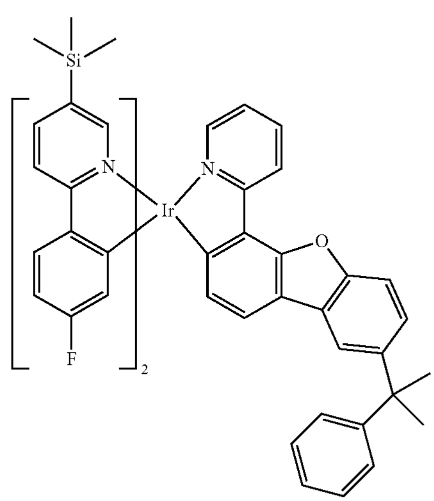

656
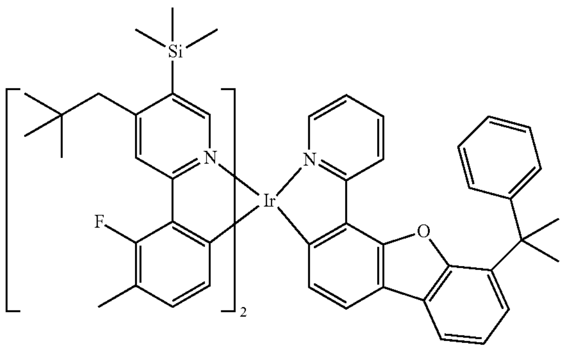
657
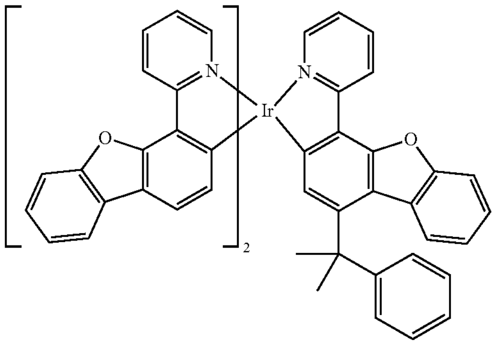
658
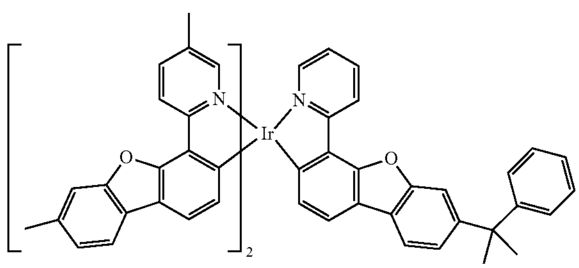
659
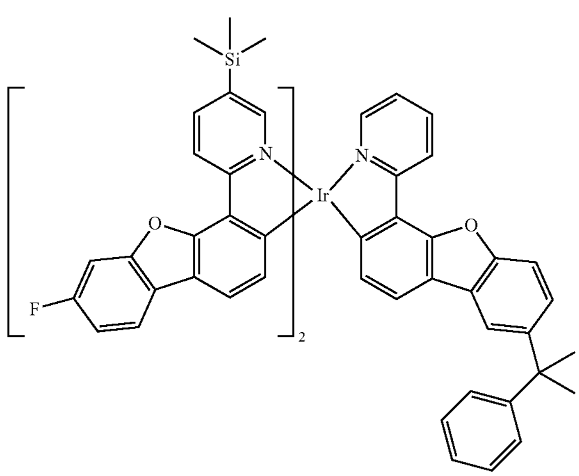
660
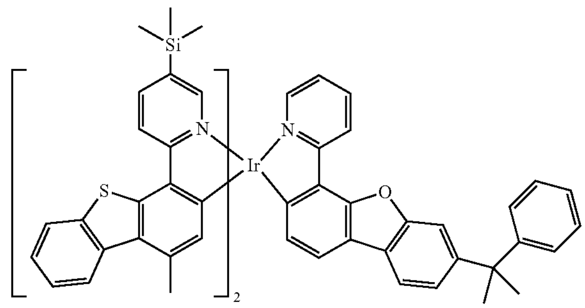
661
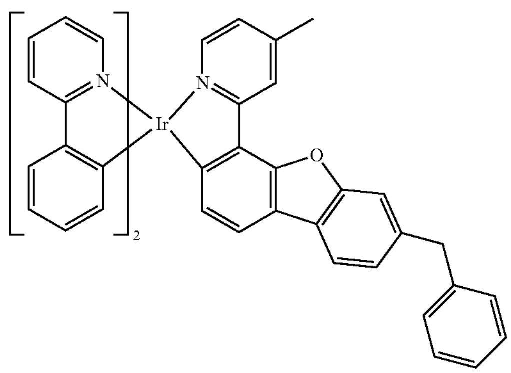
662
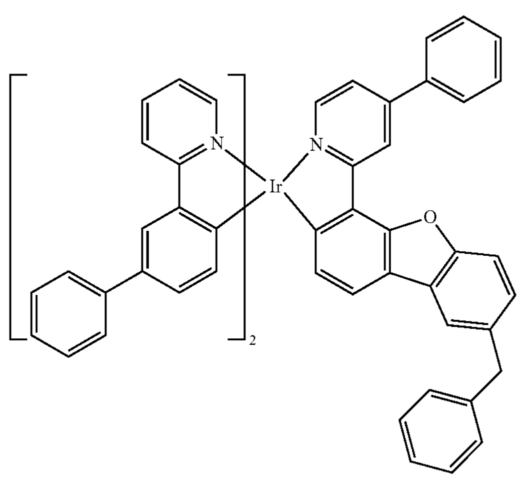

663
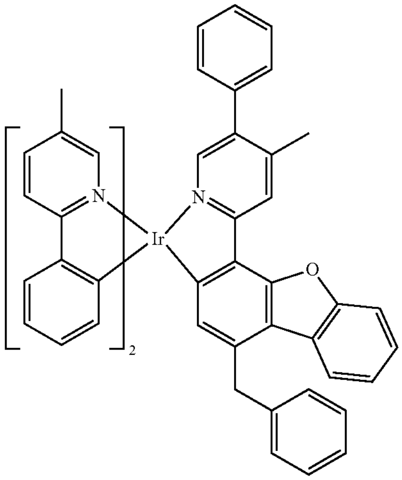
664
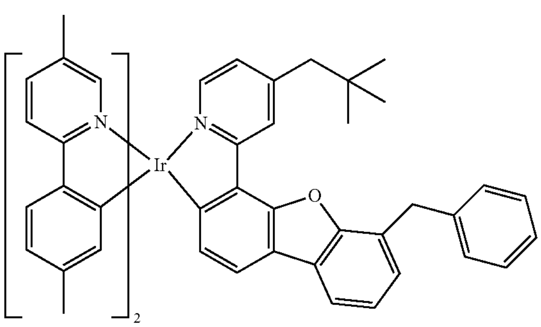
665
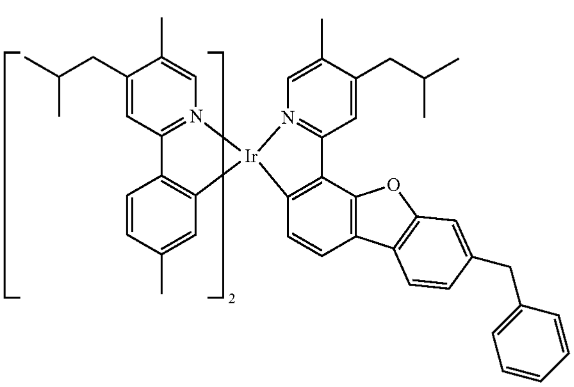
666
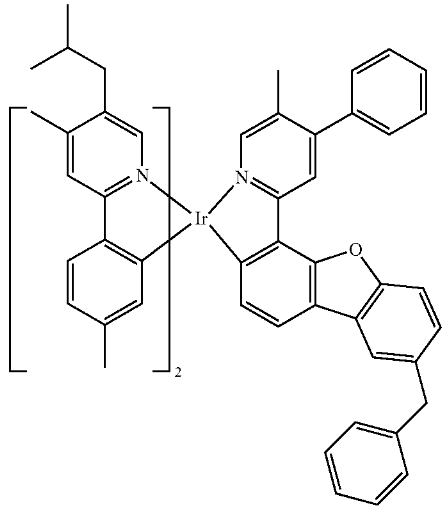
667
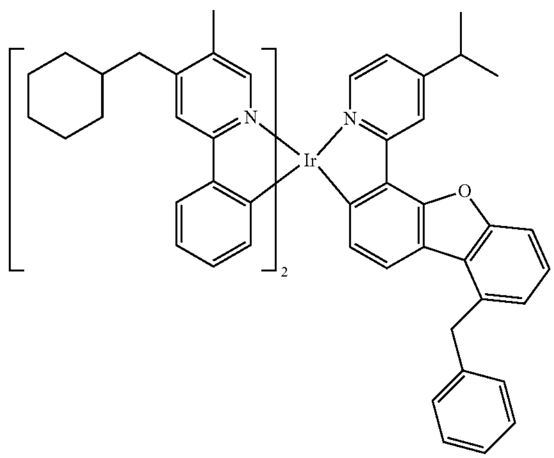
668
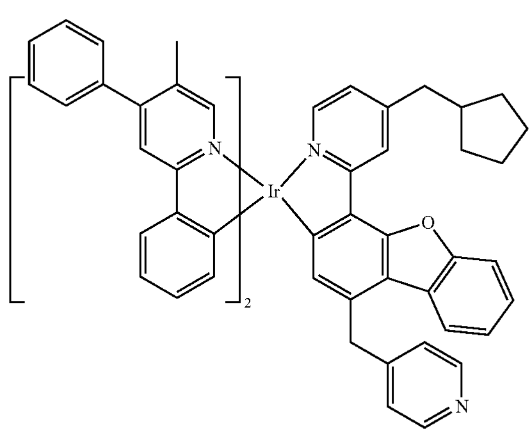

-continued
669
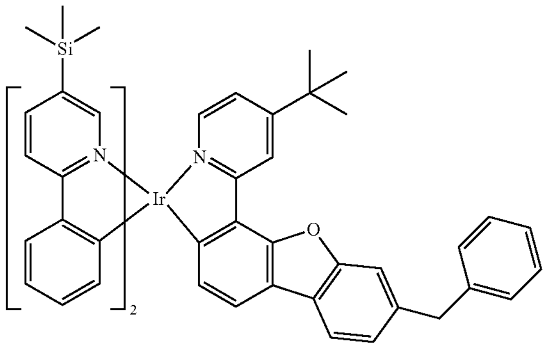
670
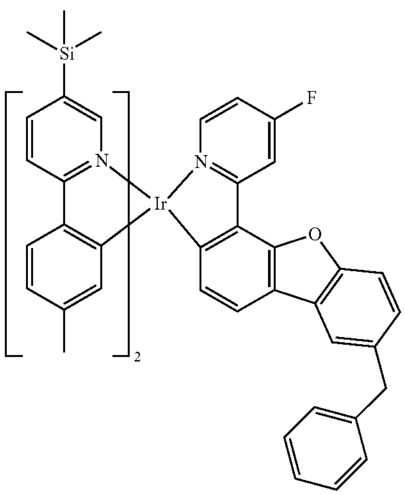
671
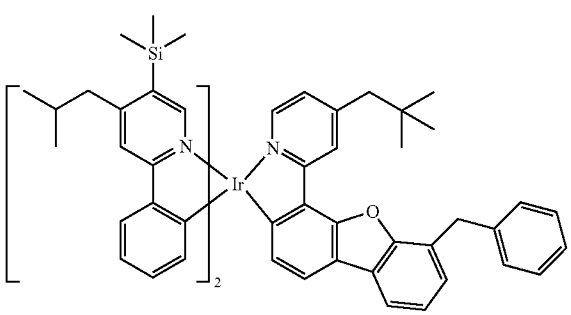
672
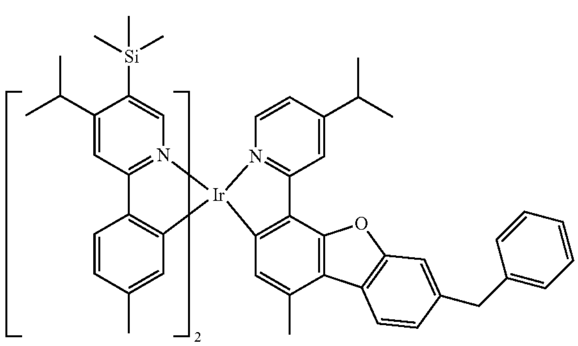
-continued
673
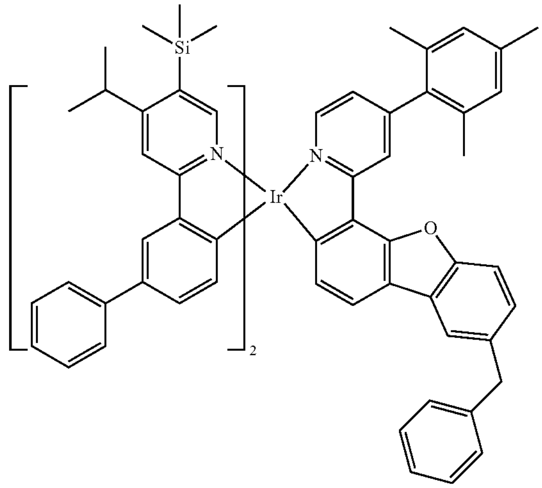
674
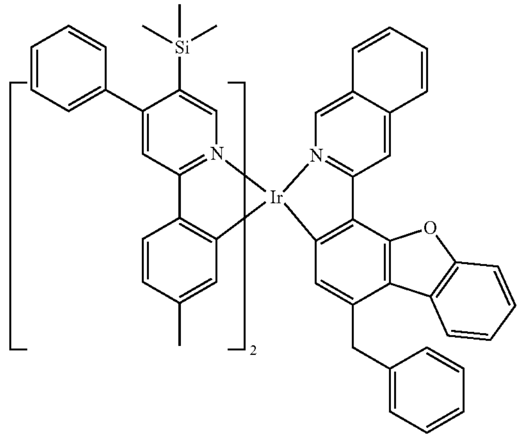
675
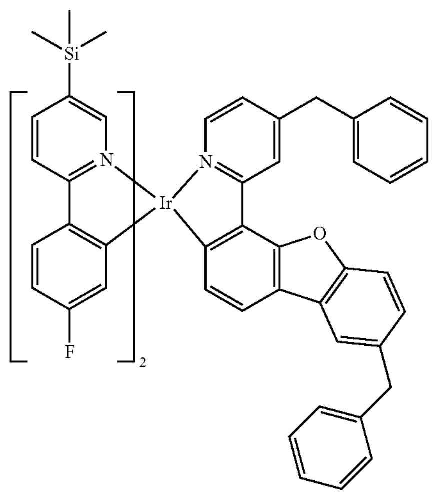

-continued
676
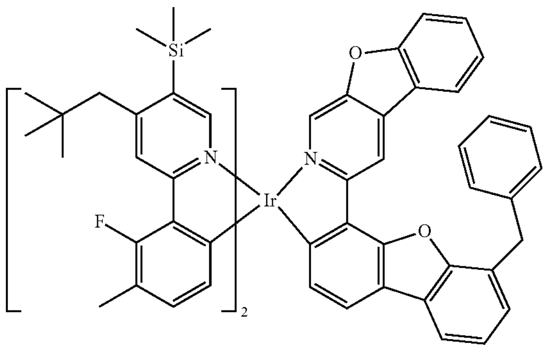
677
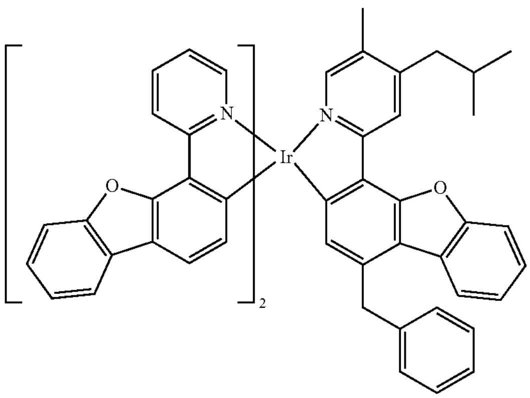
678
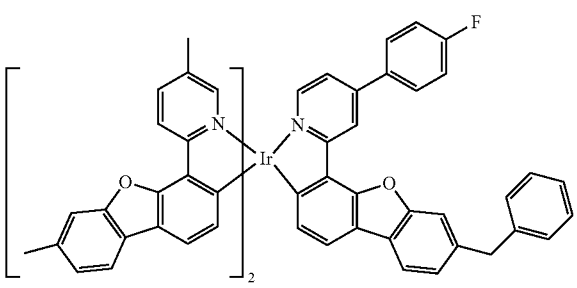
679
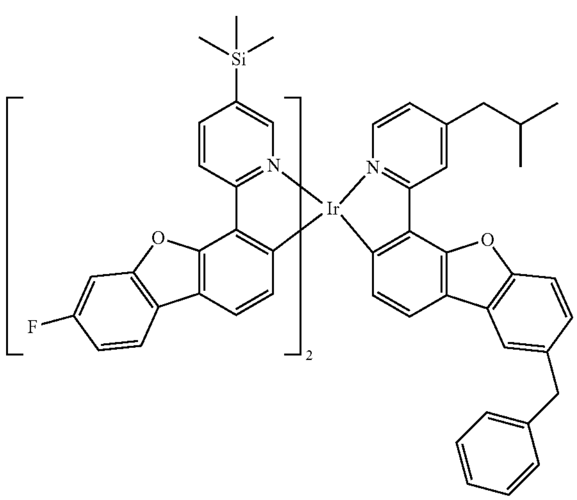
-continued
680
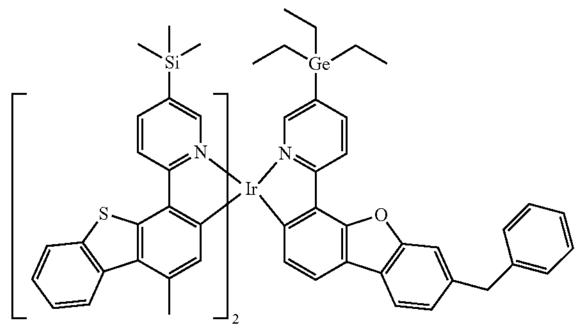
681
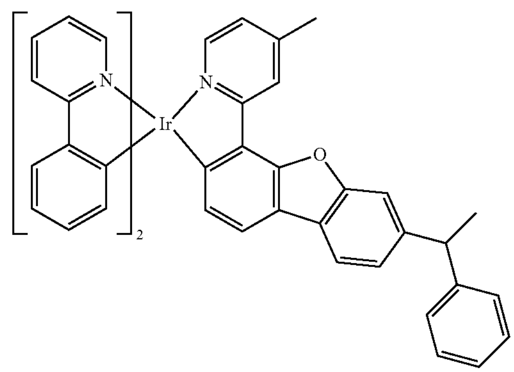
682
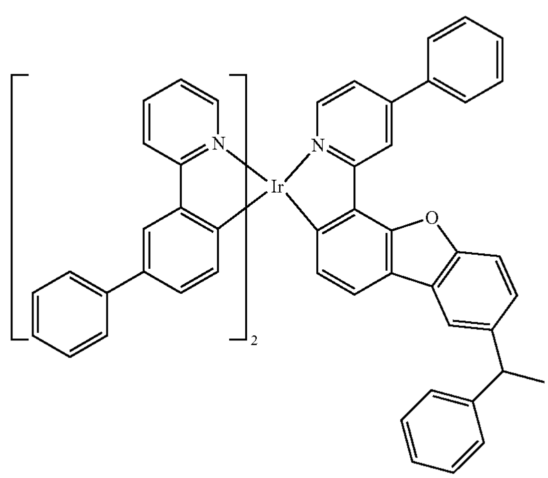

-continued
683
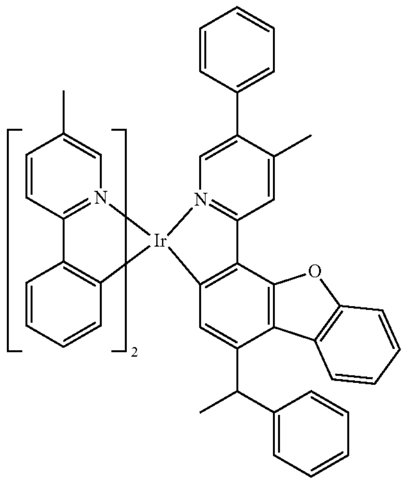
684
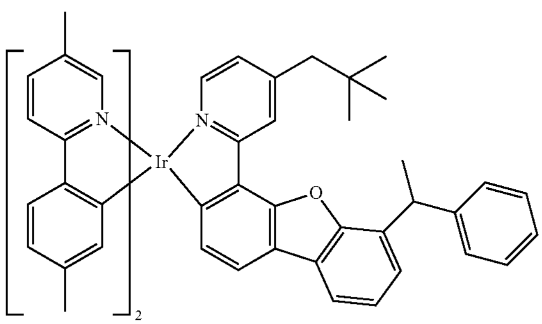
685
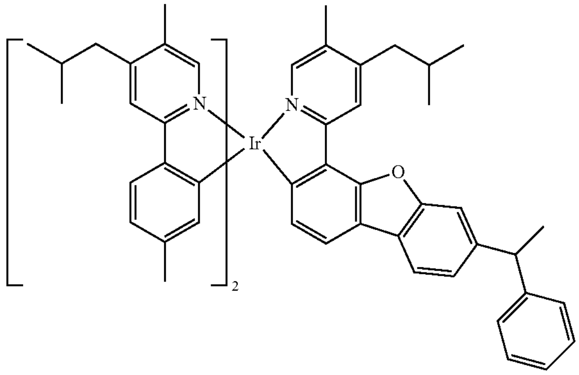
-continued
686
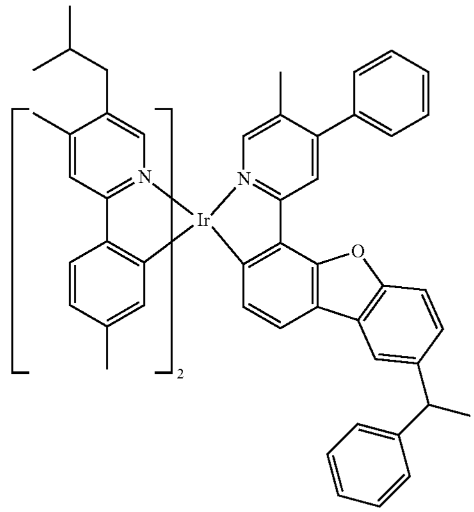
687
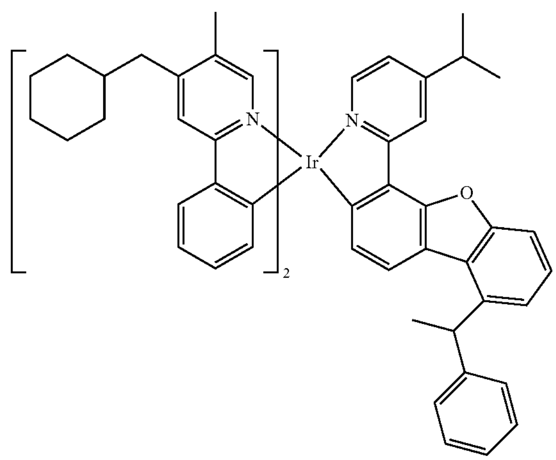
688
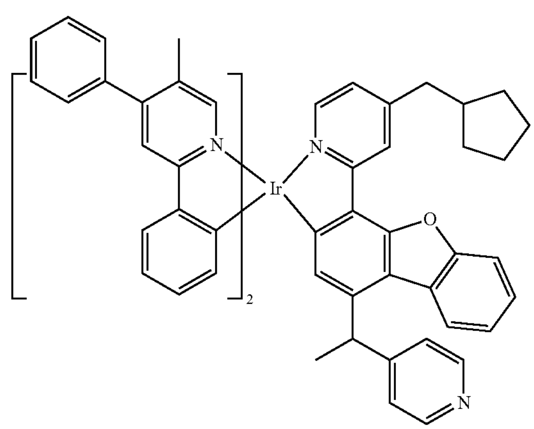

689
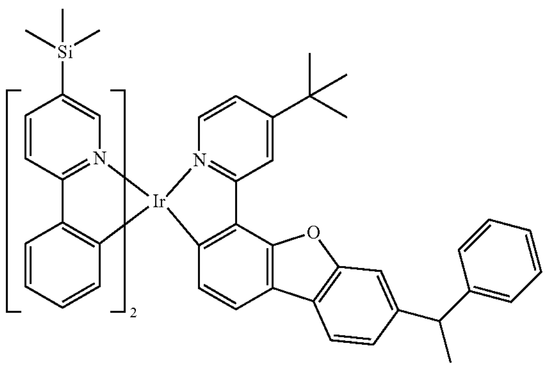
690
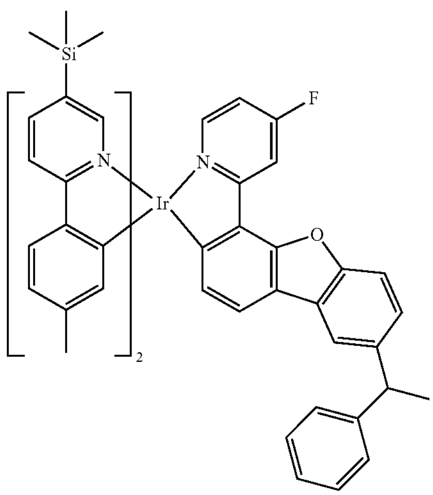
691
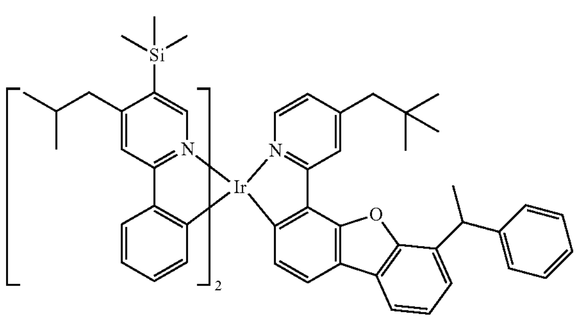
692
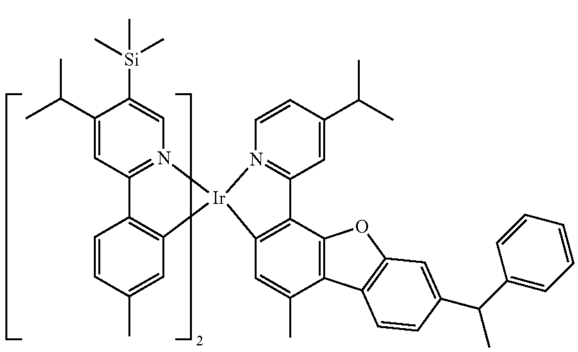
693
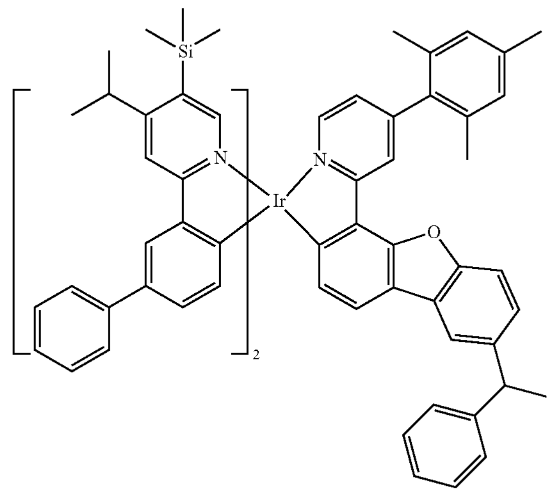
694
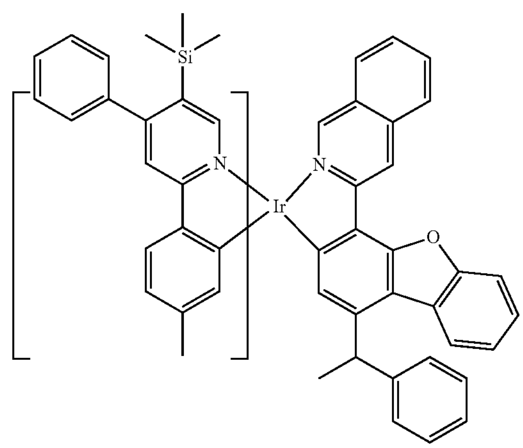
695
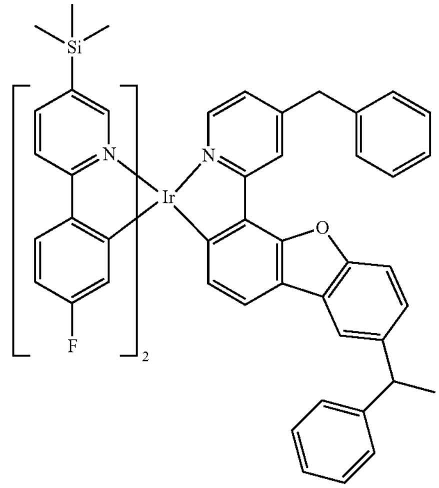

-continued
696
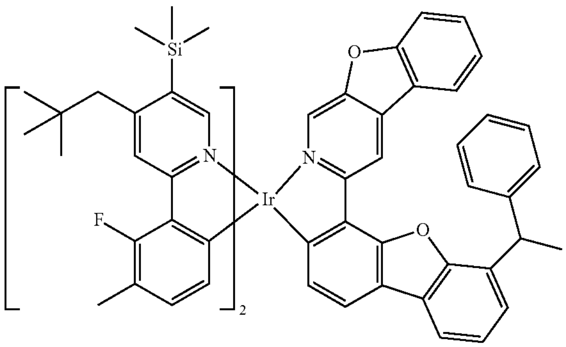
697
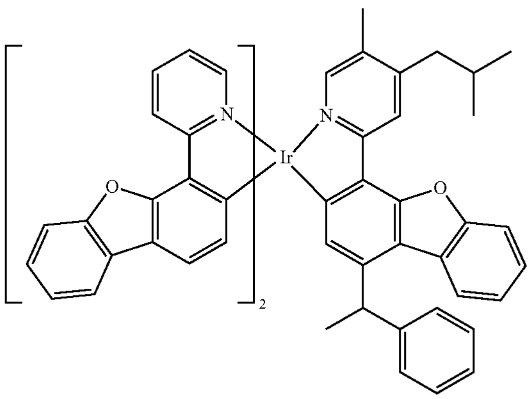
698
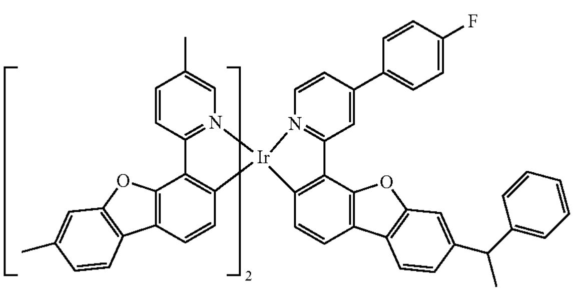
699
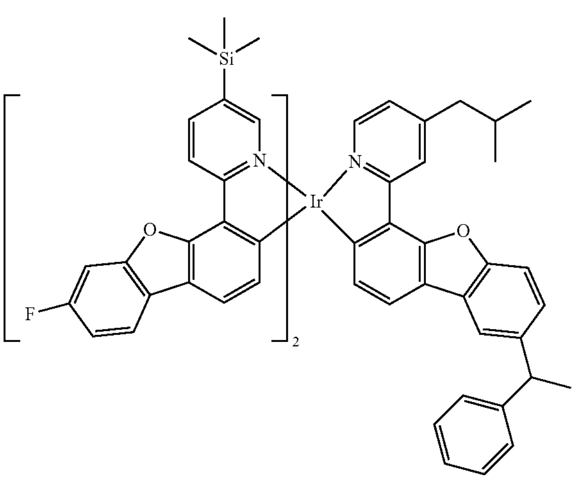
-continued
700
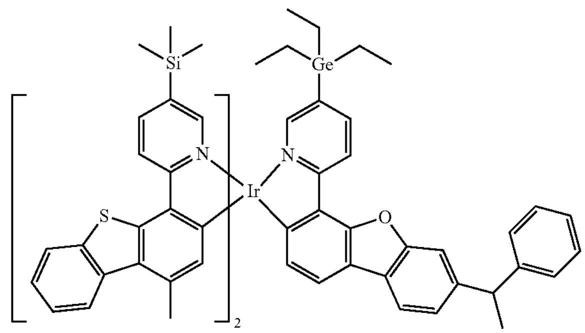
701
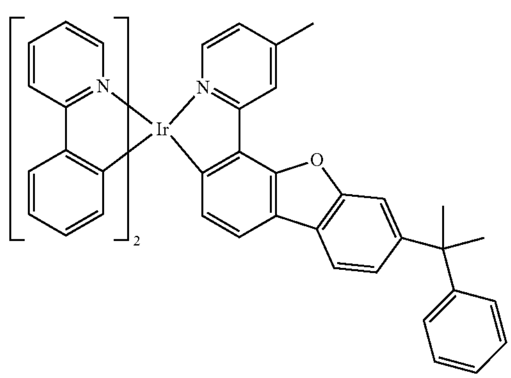
702
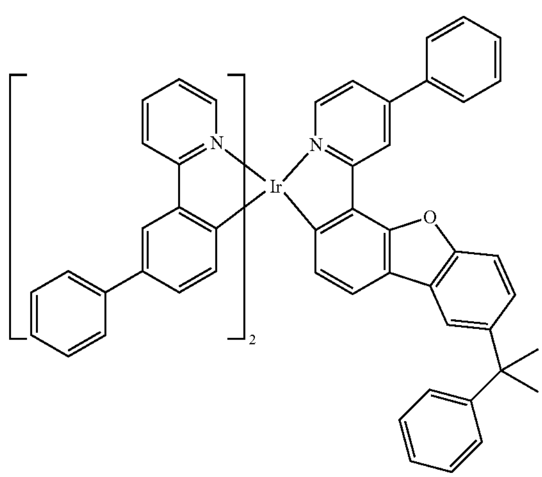

-continued
703
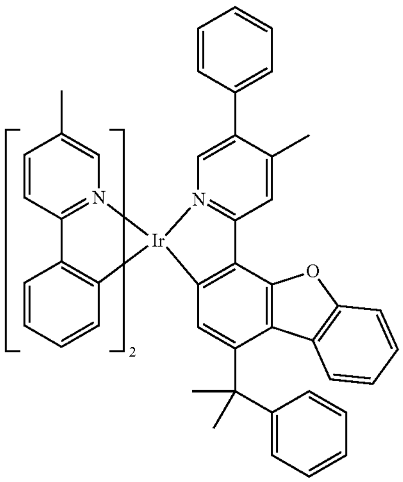
704
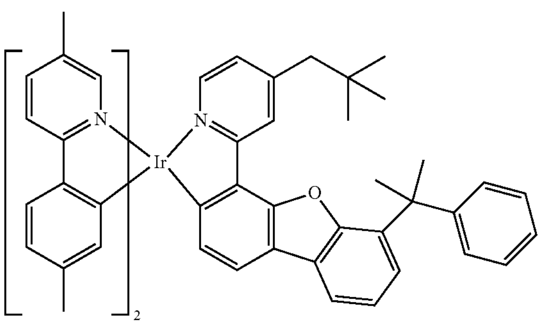
705
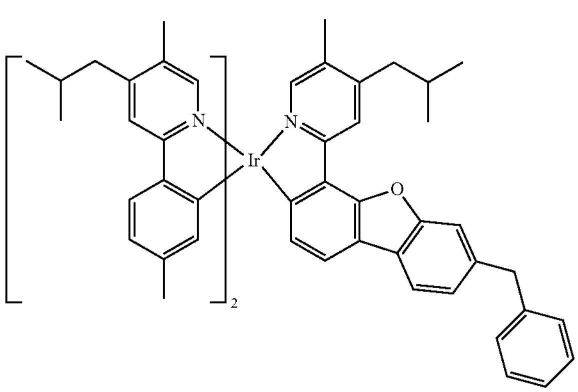
-continued
706
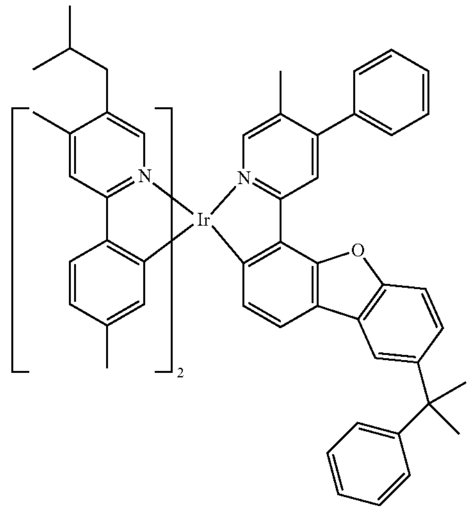
707
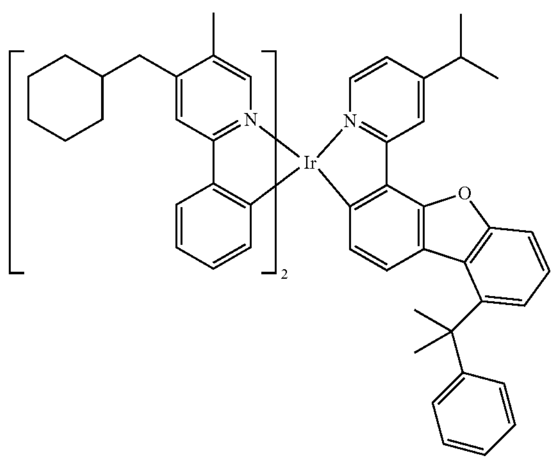
708
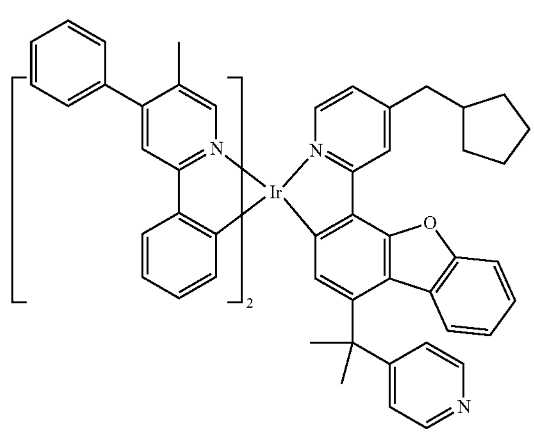

-continued
709
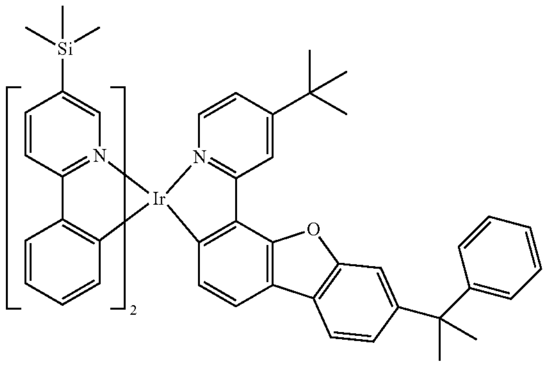
710
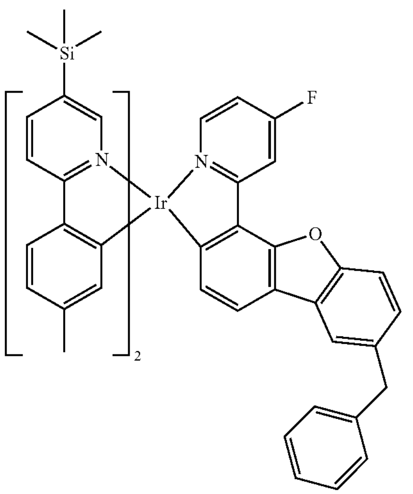
711
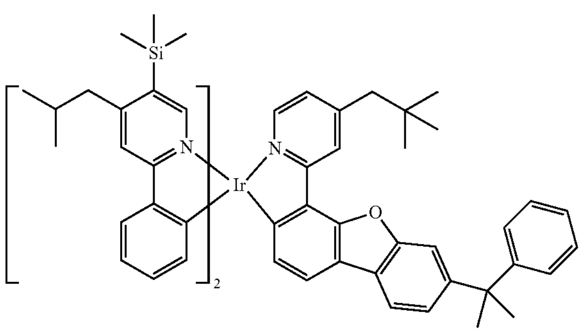
712
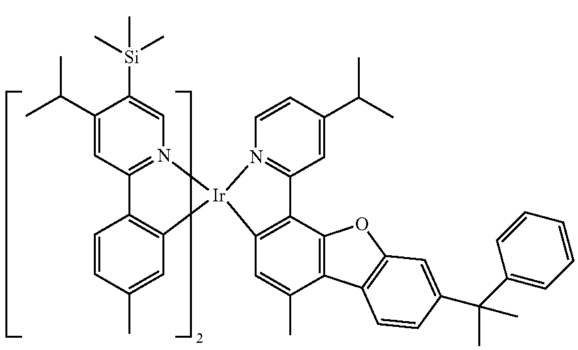
-continued
713
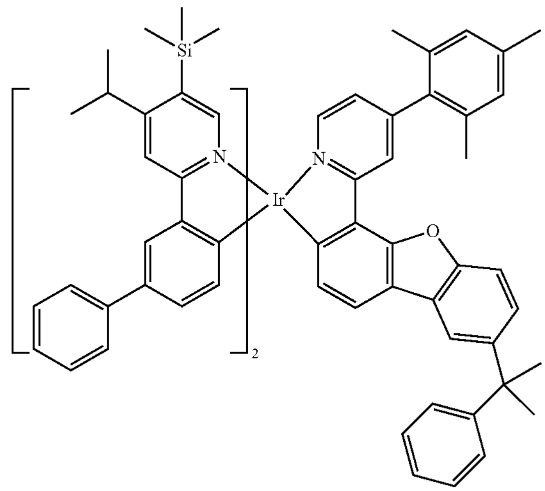
714
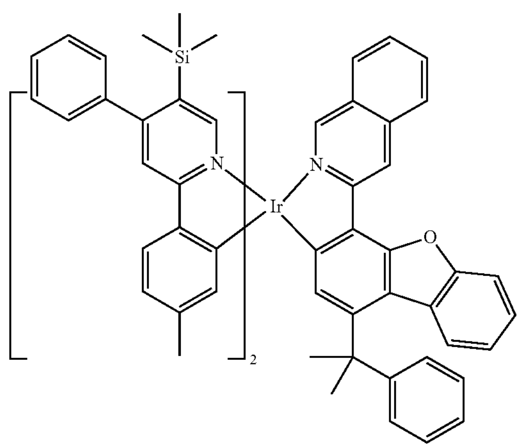
715
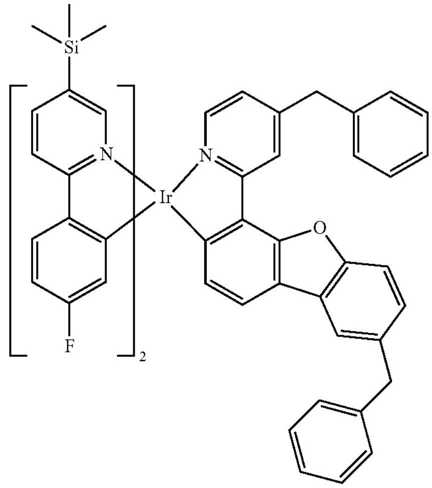

-continued
716
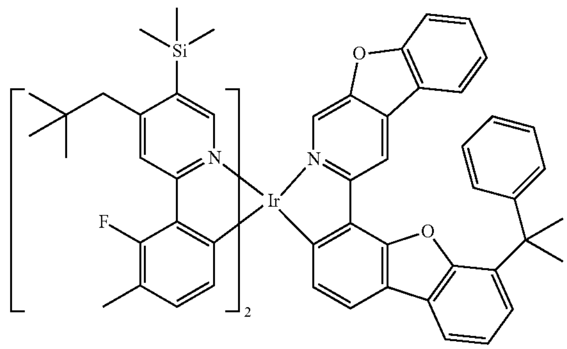
717
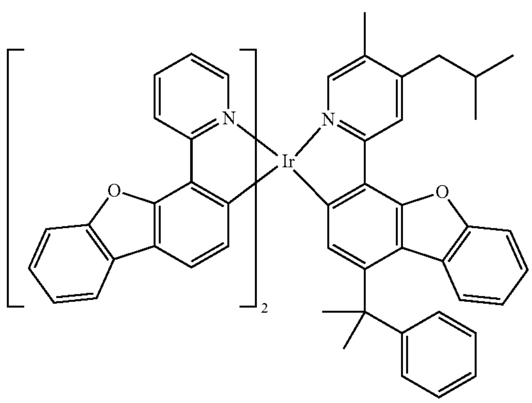
718
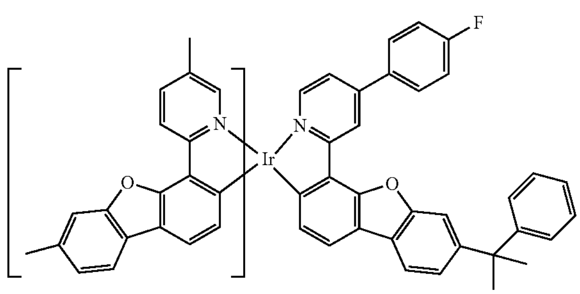
719
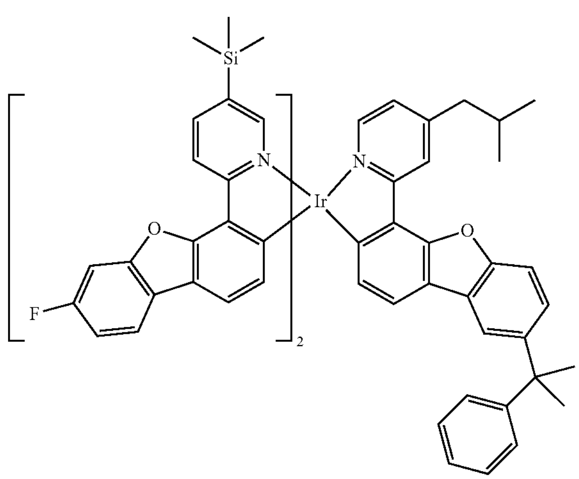
-continued
720
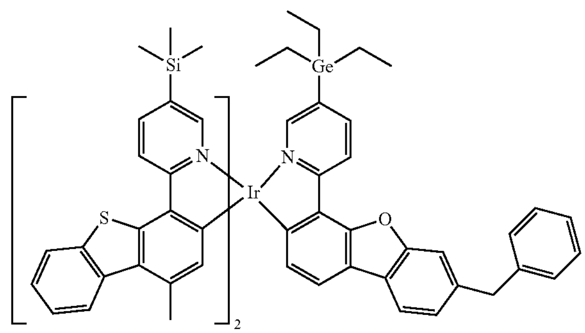
721
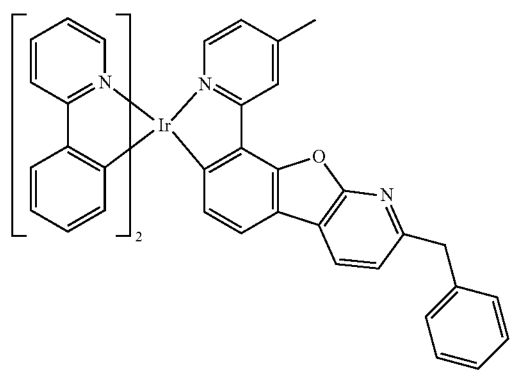
722
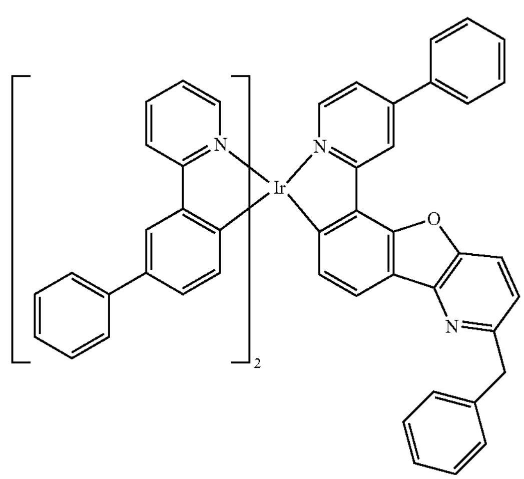

-continued
723
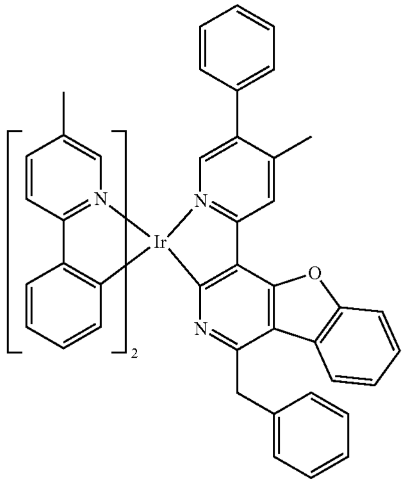
724
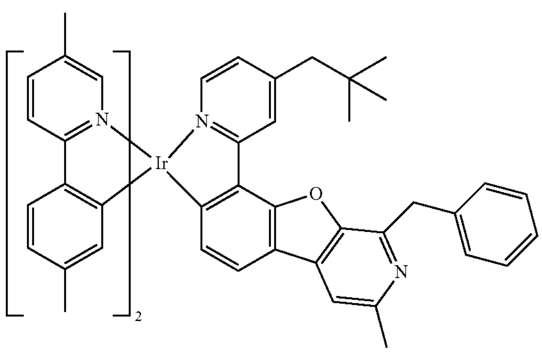
725
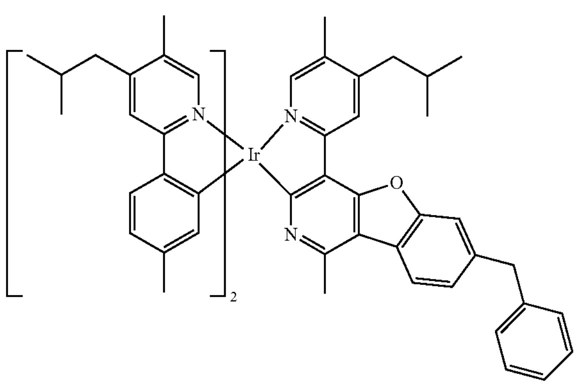
-continued
726
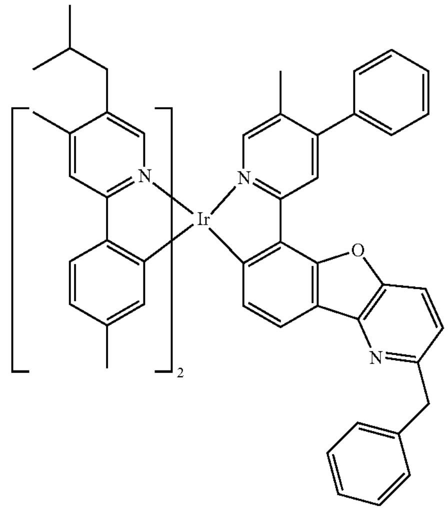
727
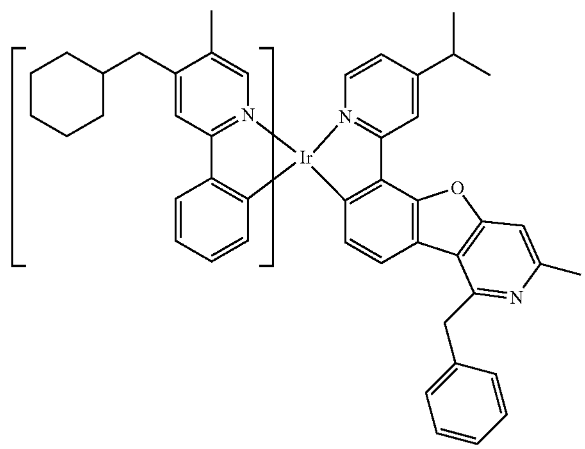
728
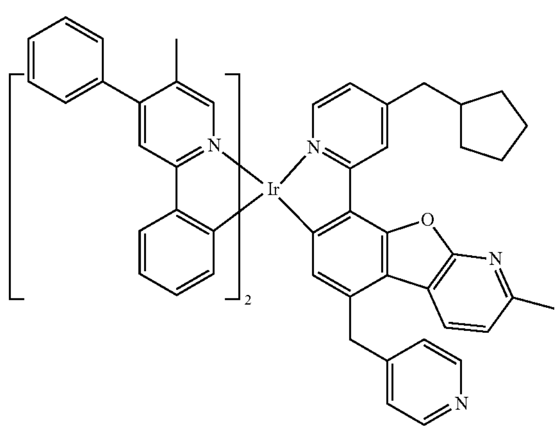

-continued
729
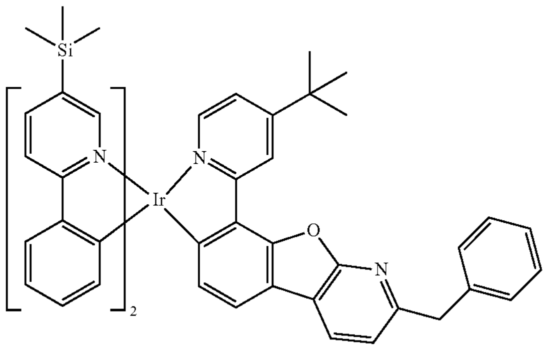
730
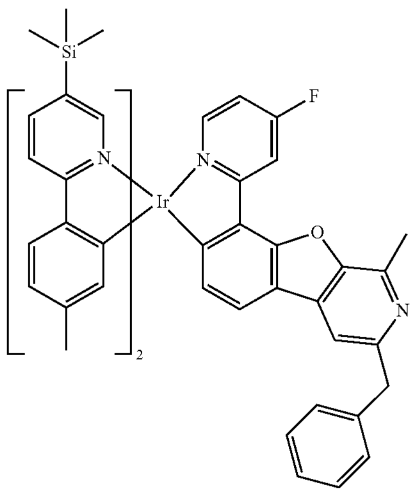
731
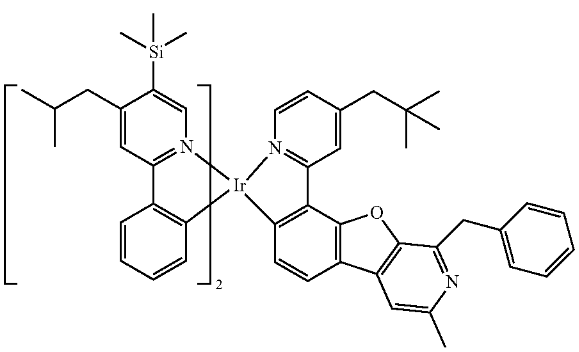
732
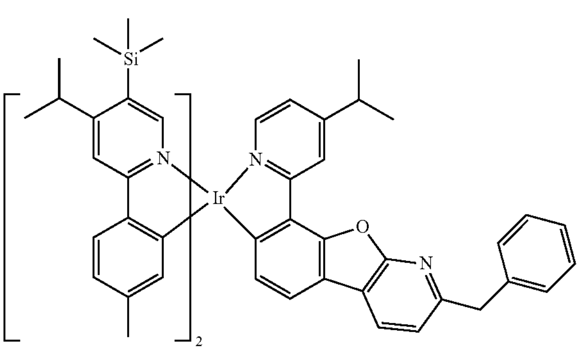
-continued
733
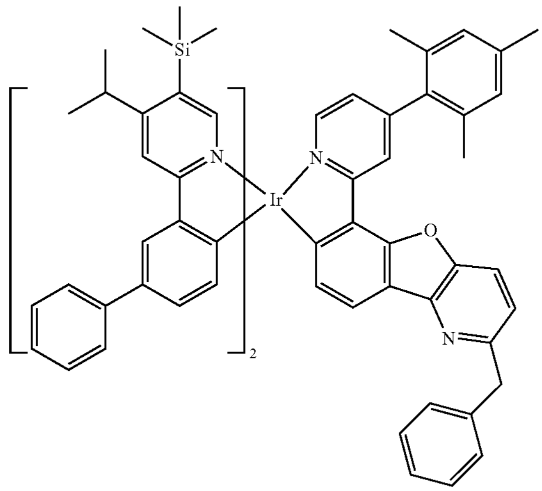
734
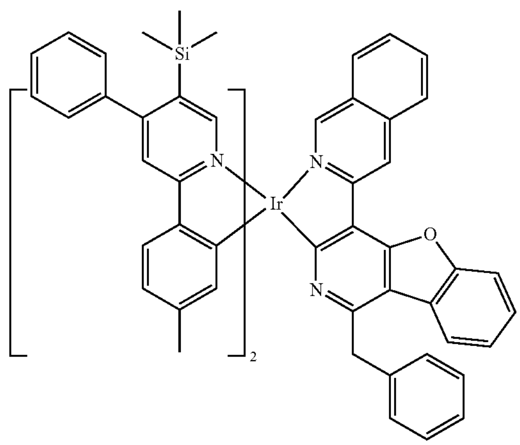
735
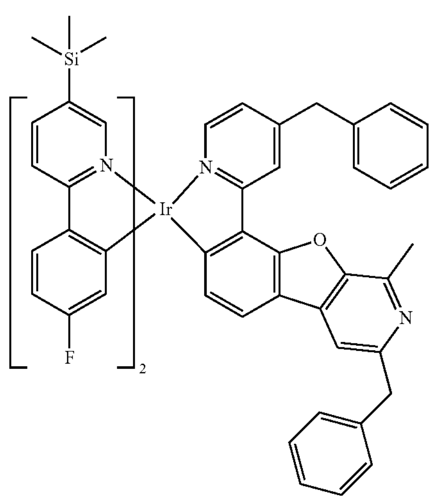

-continued
736
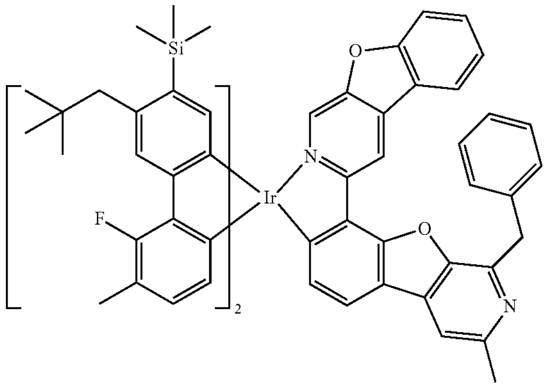
737
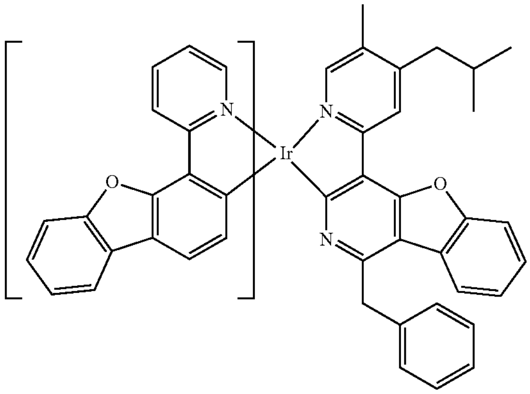
738
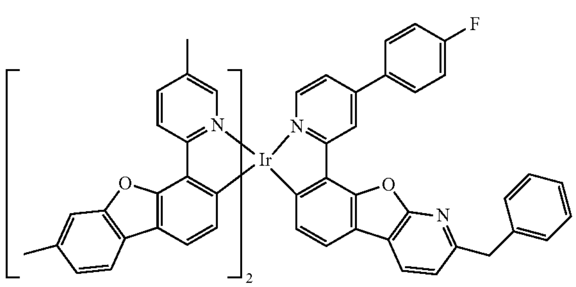
739
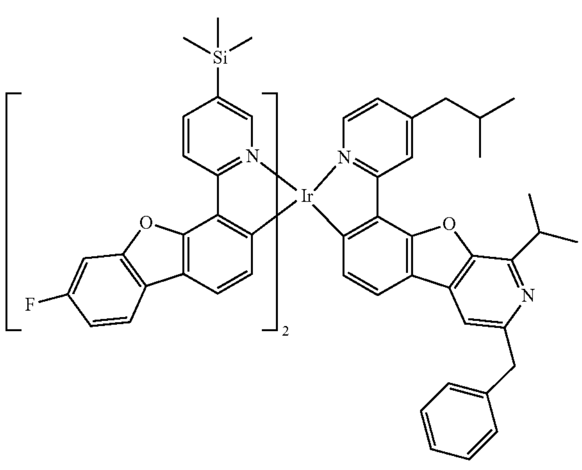
-continued
740
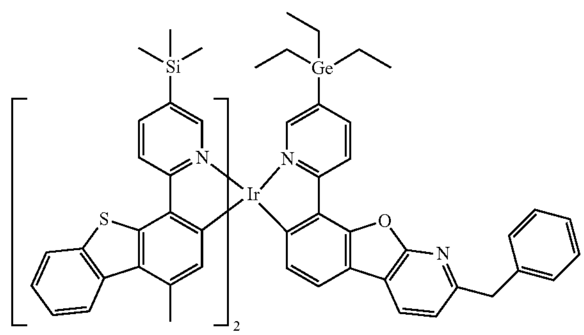
741
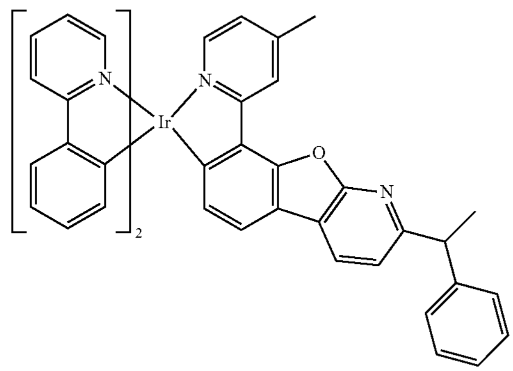
742
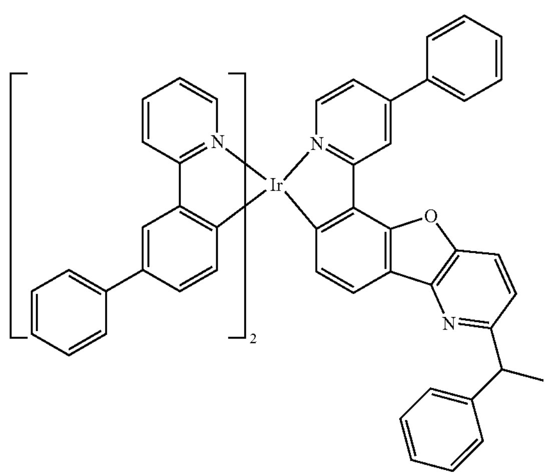

-continued
743
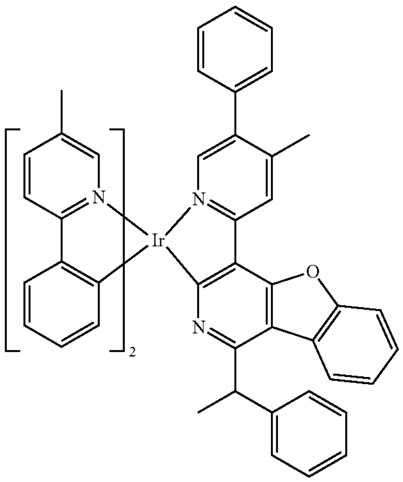
744
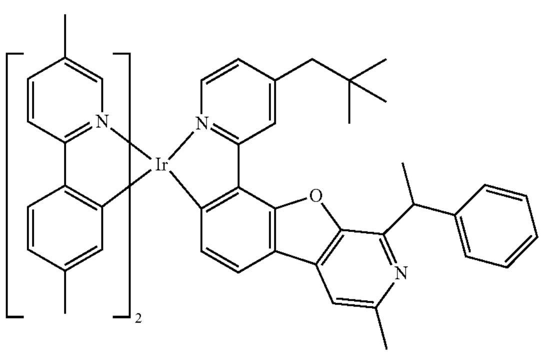
745
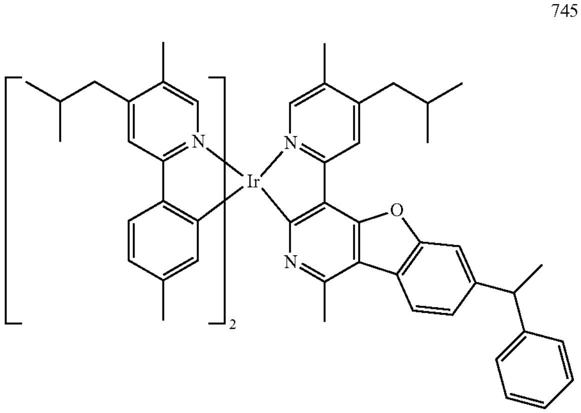
-continued
746
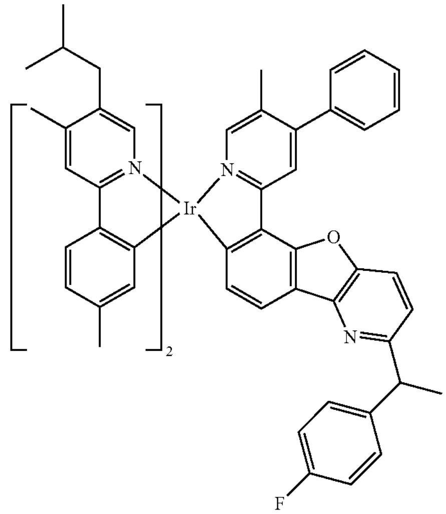
747
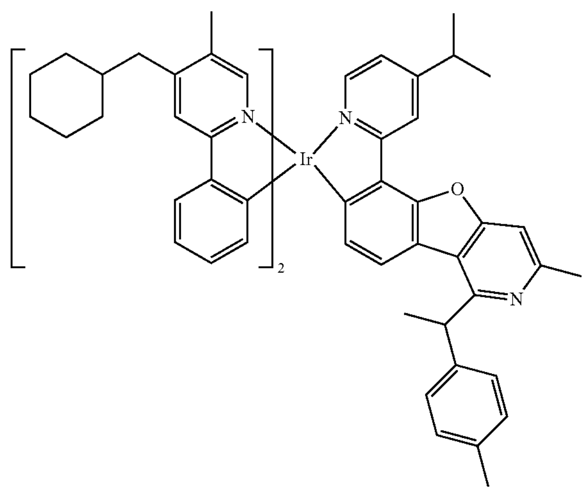
748
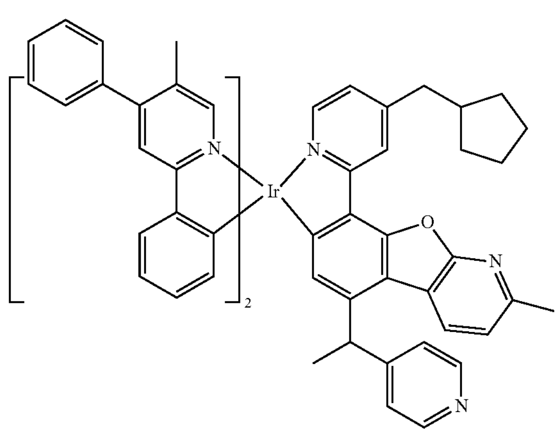

749
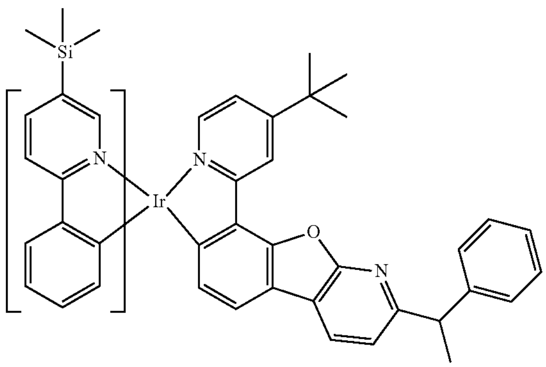
750
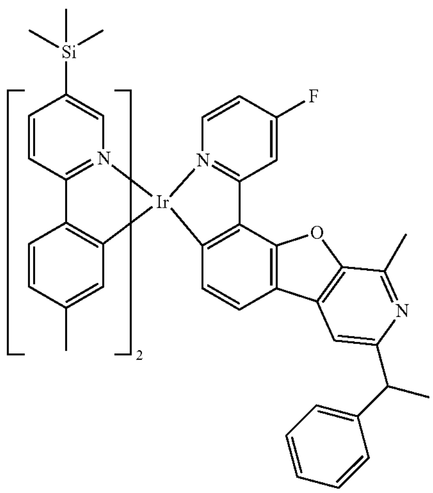
751
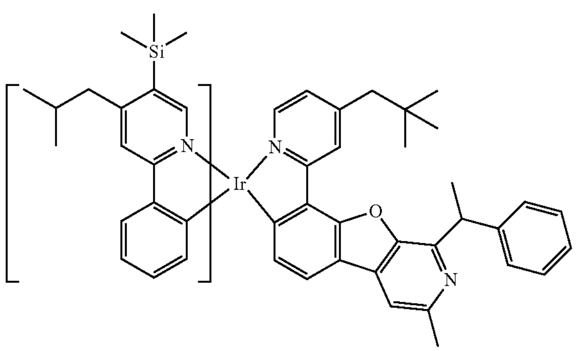
752
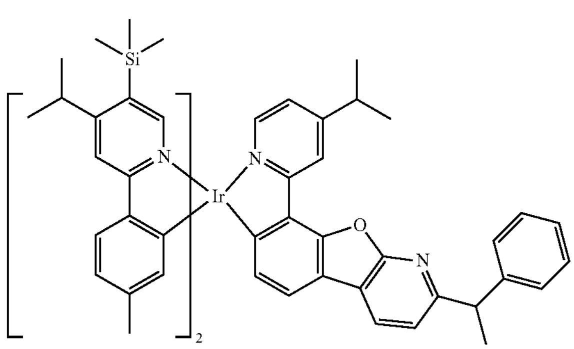
753
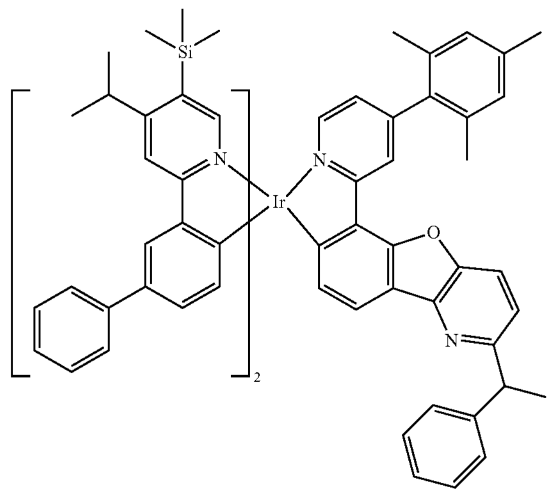
754
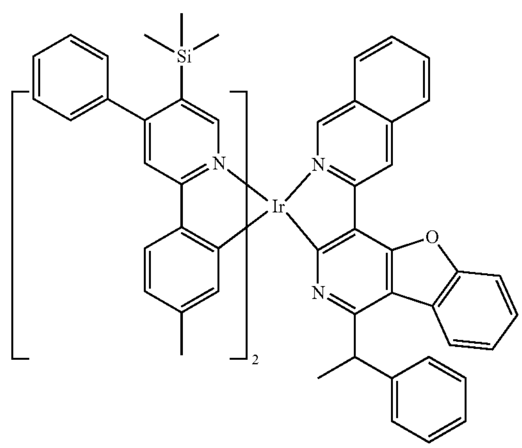
755
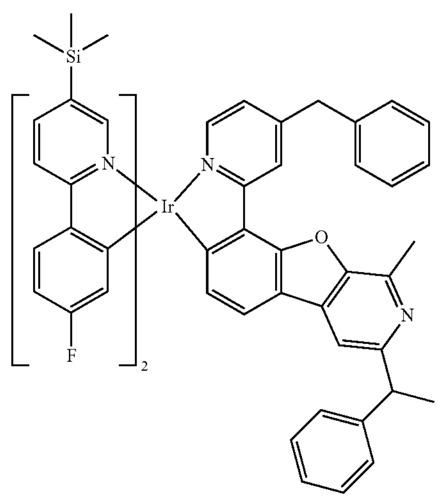

-continued
756
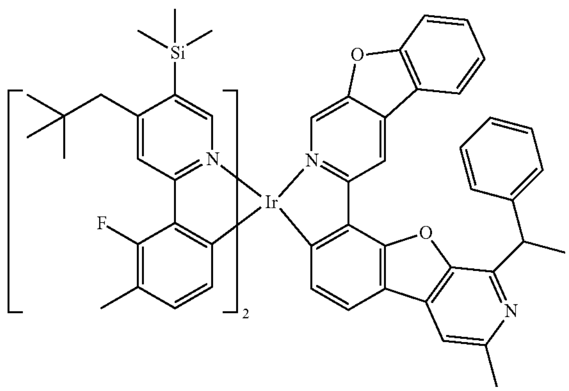
757
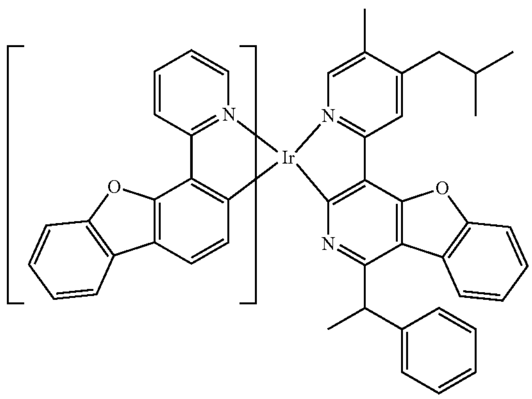
758
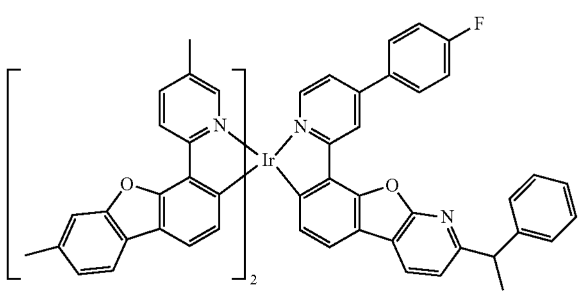
759
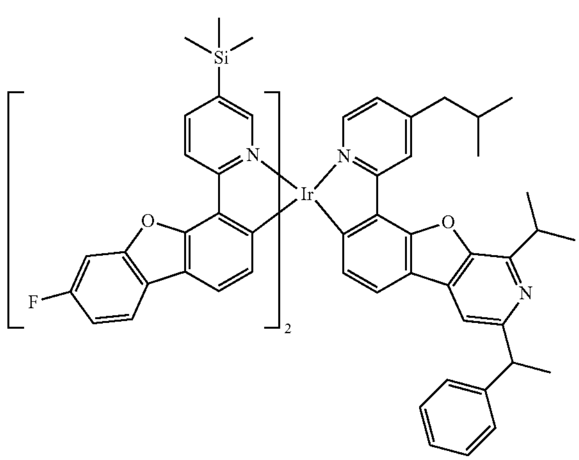
-continued
760
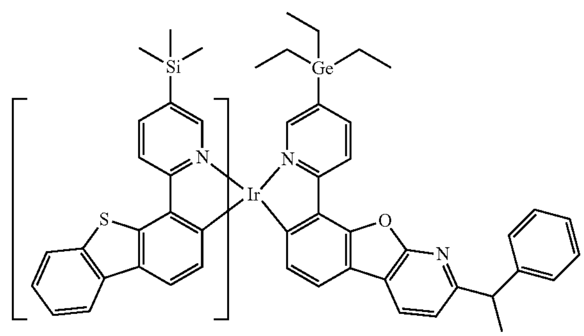
761
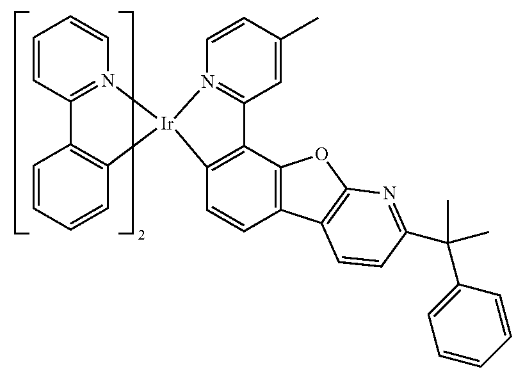
762
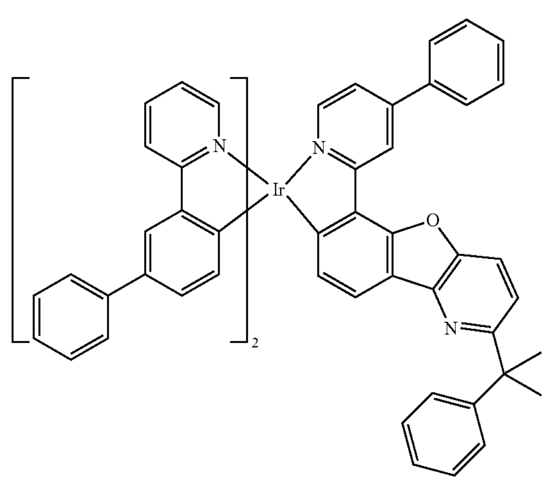

-continued
763
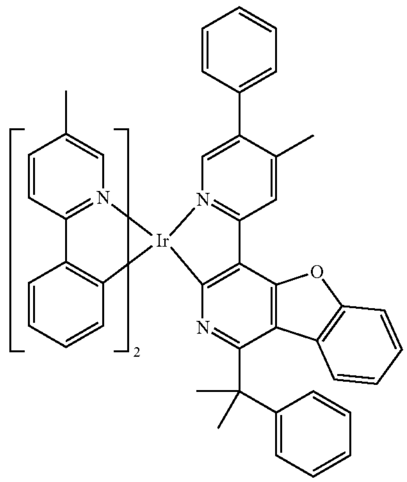
764
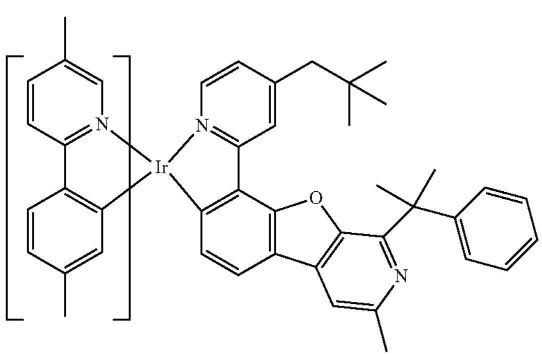
765
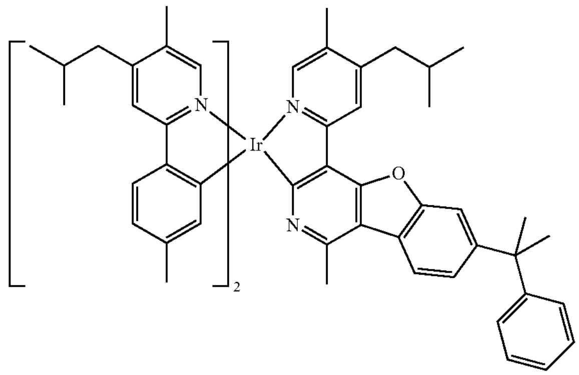
-continued
766
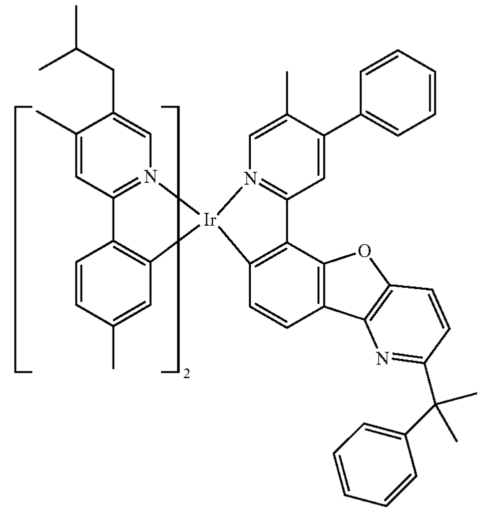
767
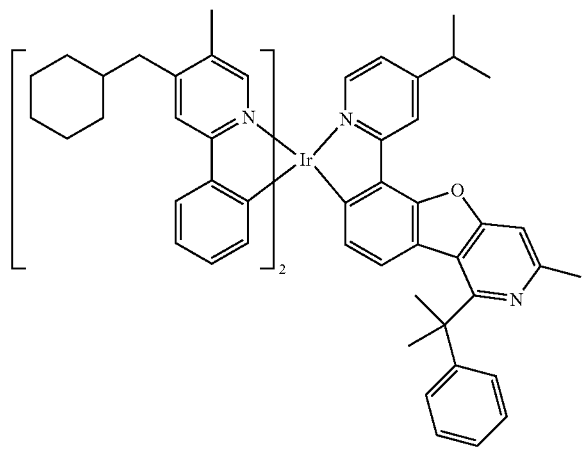
768
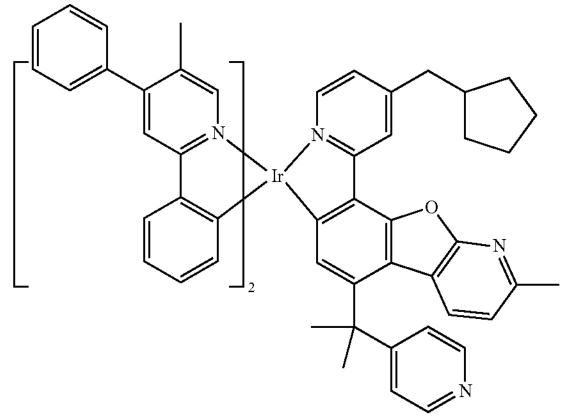

-continued
769
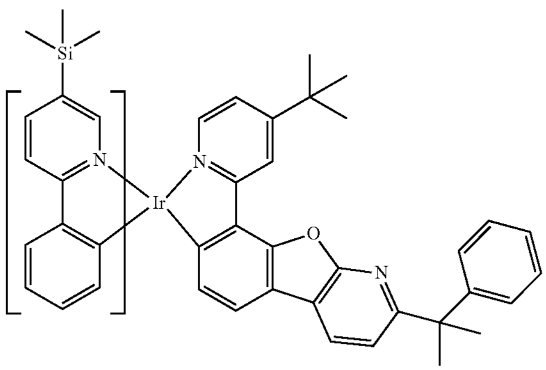
770
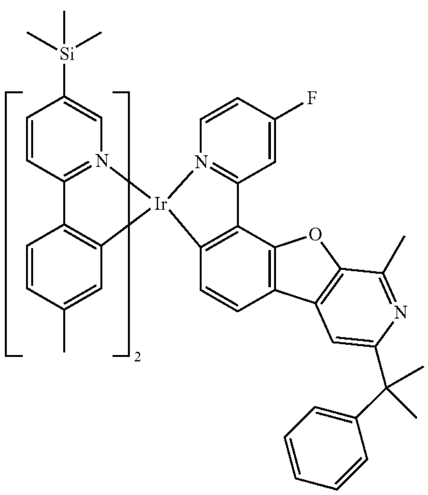
771
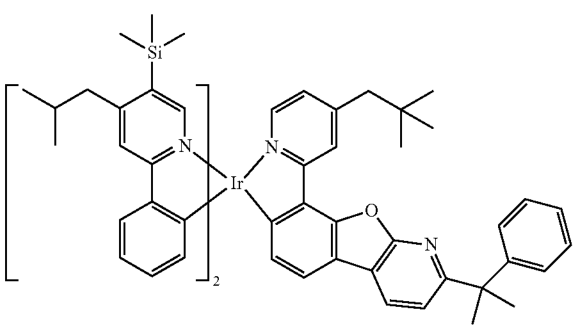
772
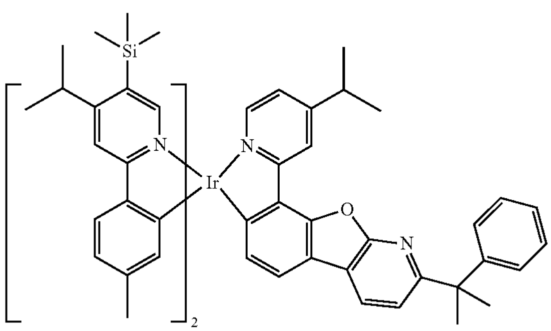
-continued
773
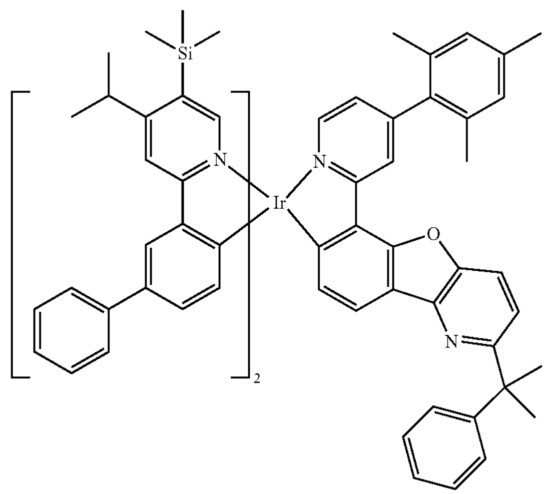
774
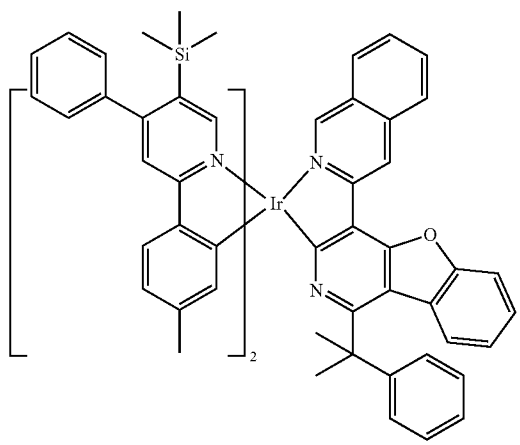
775
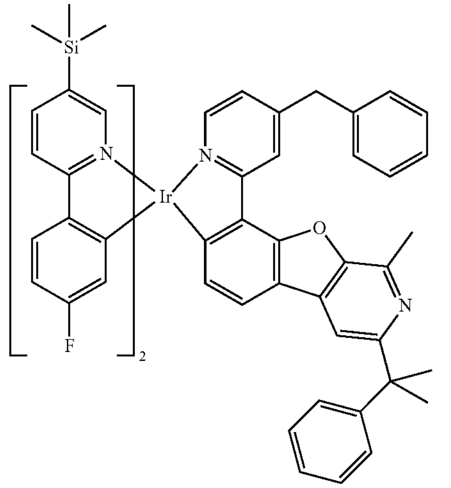

-continued
776
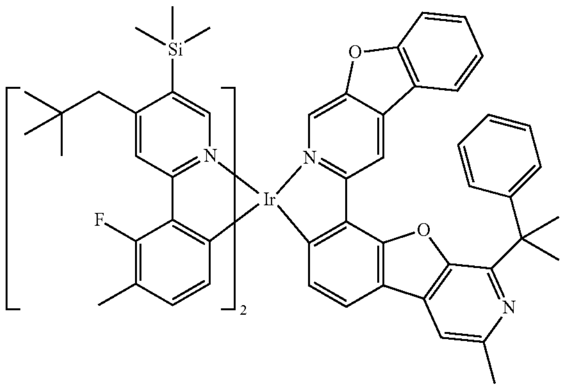
777
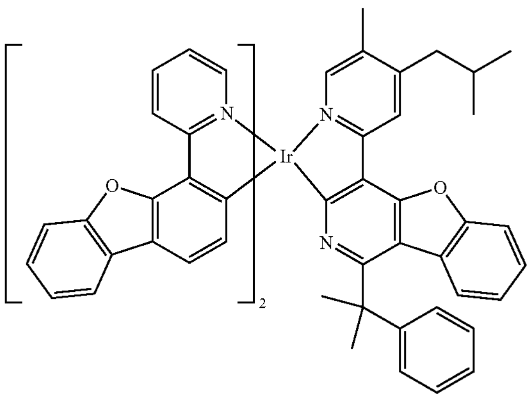
778
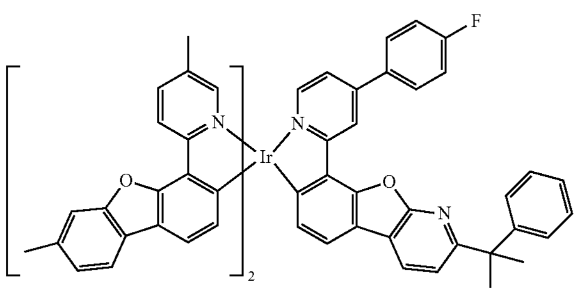
779
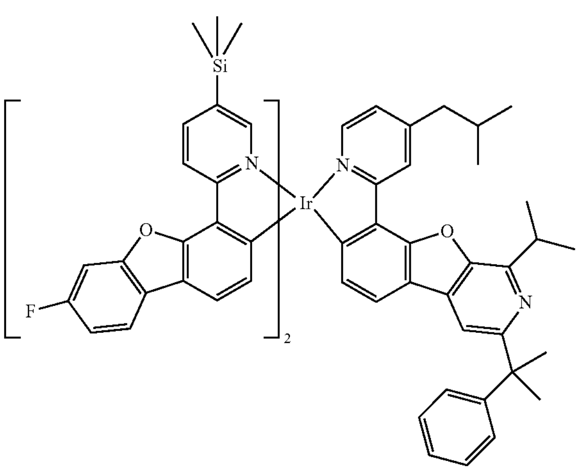
-continued
780
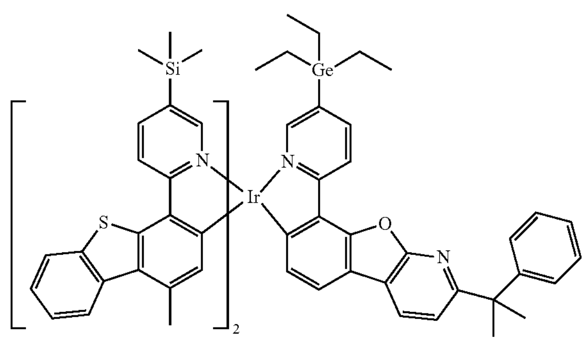
781
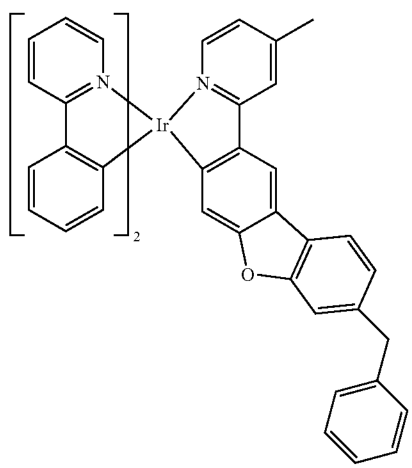
782
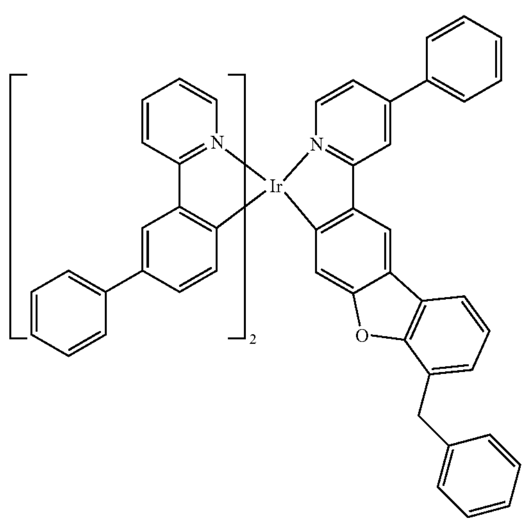

783
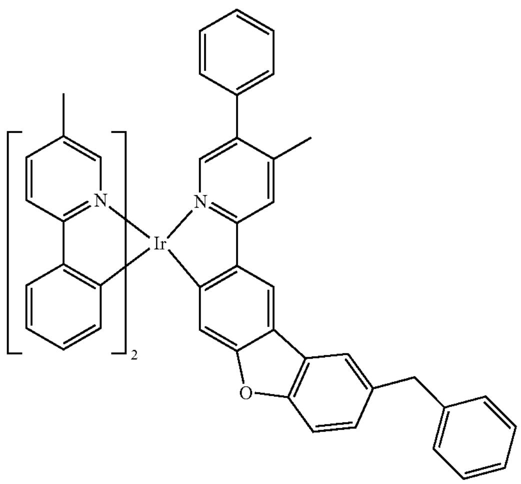
784
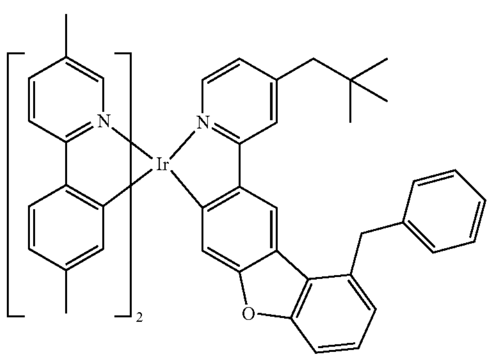
785
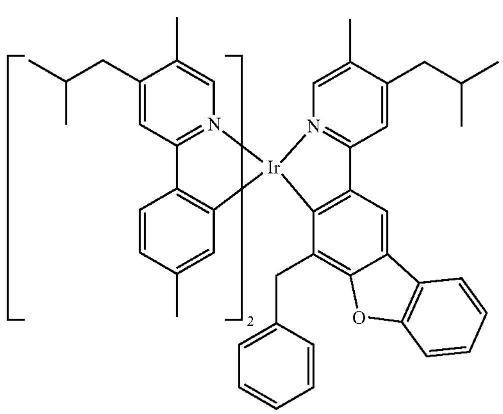
786
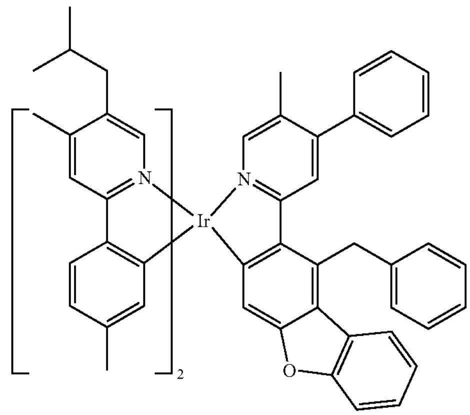
787
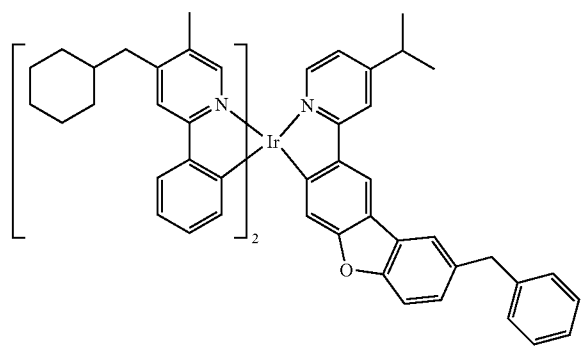
788
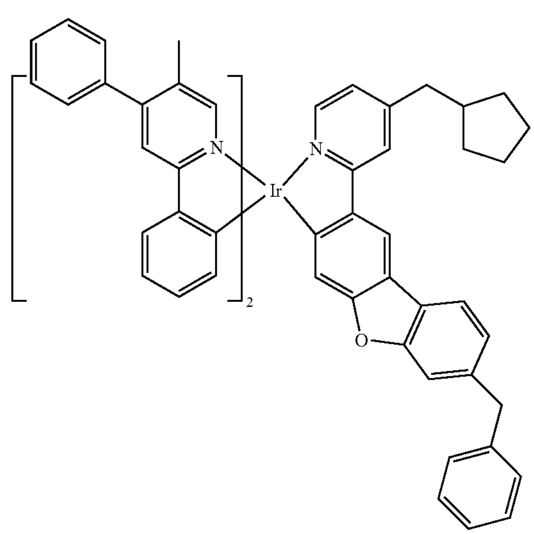

789
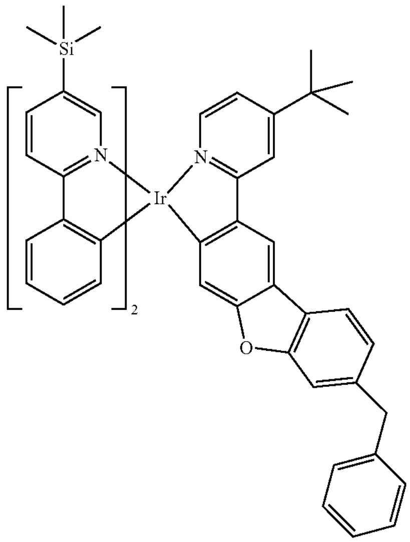
790
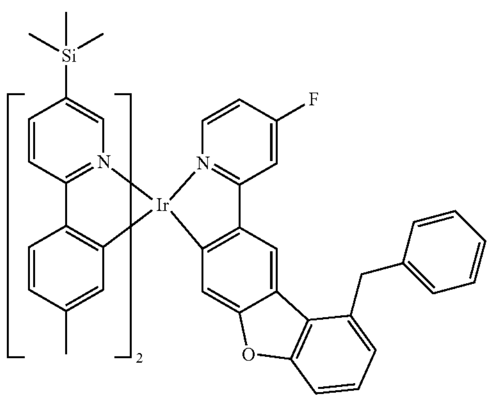
791
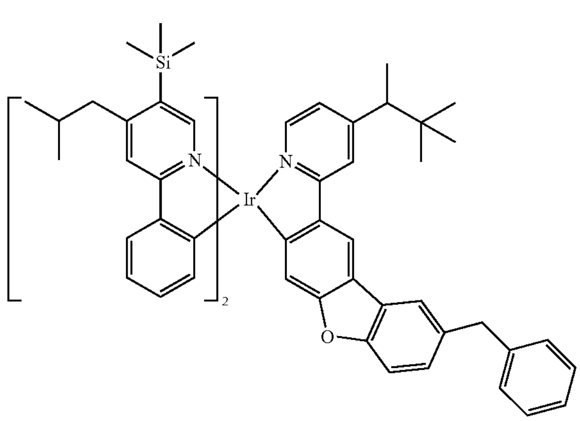
792
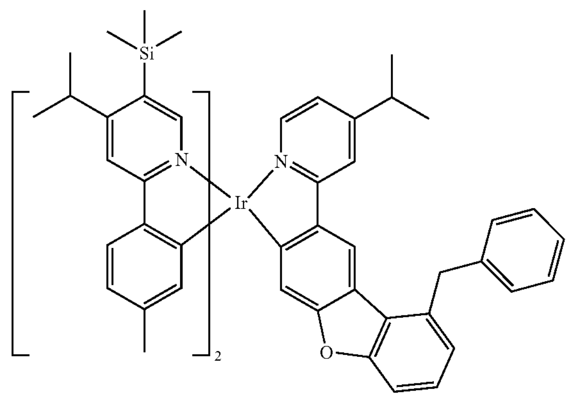
793
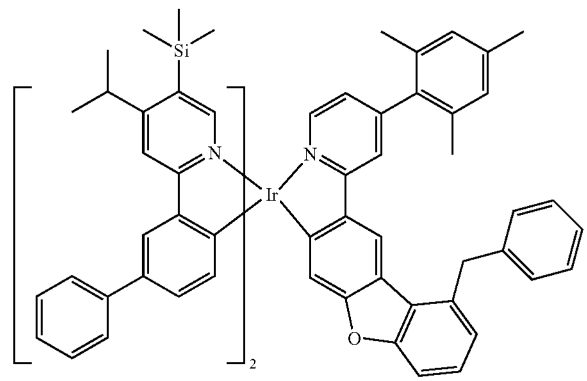
794
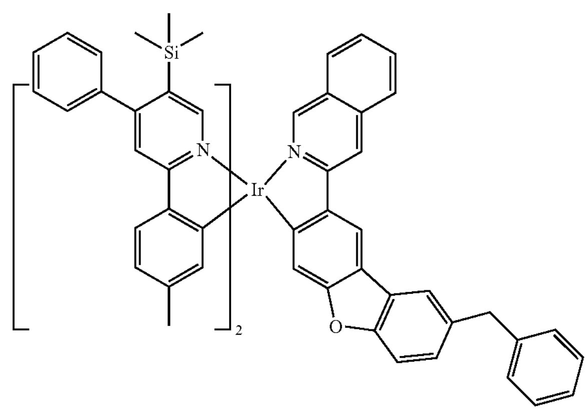
795
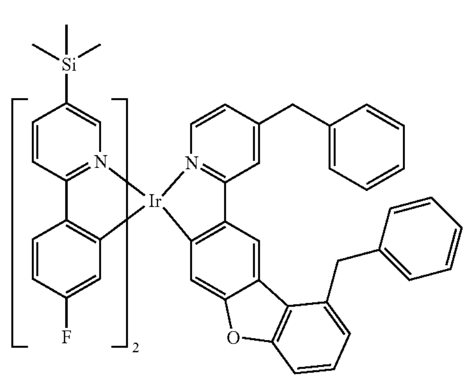

796
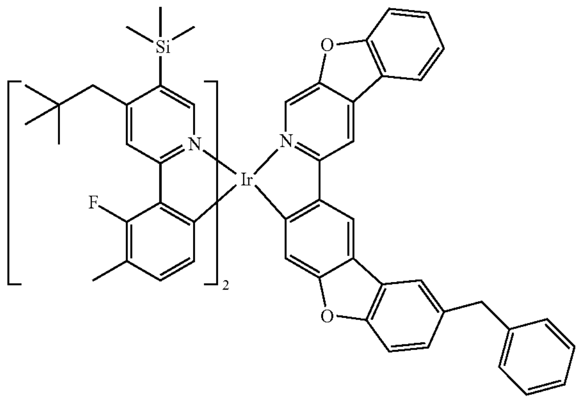
797
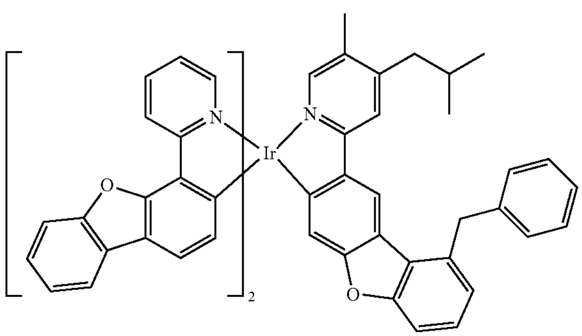
798
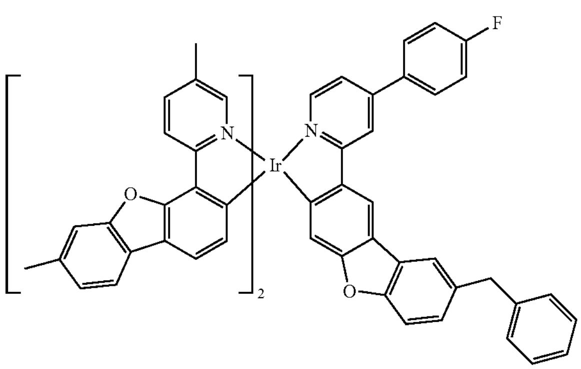
799
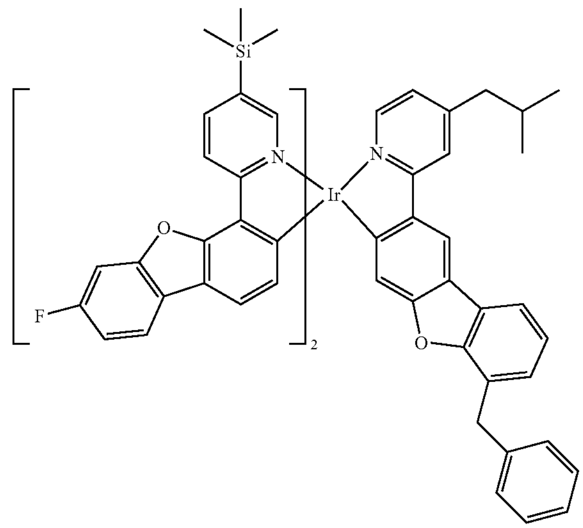
800
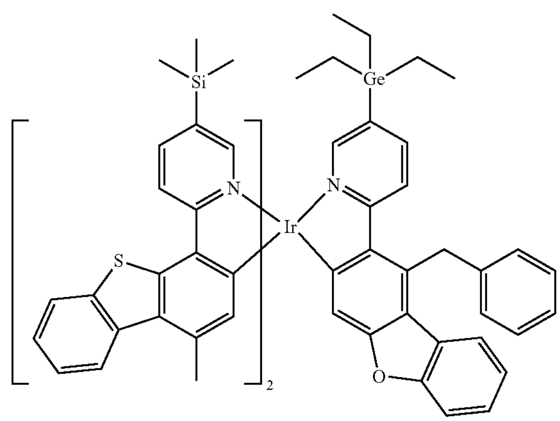
801
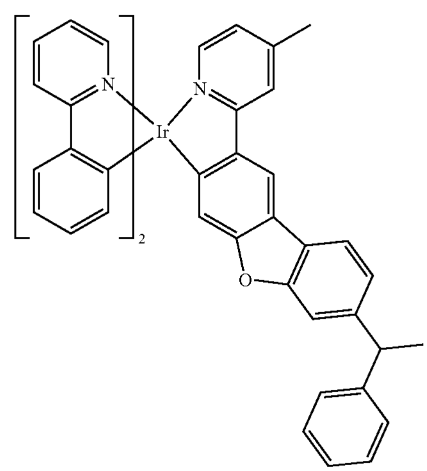

-continued
802
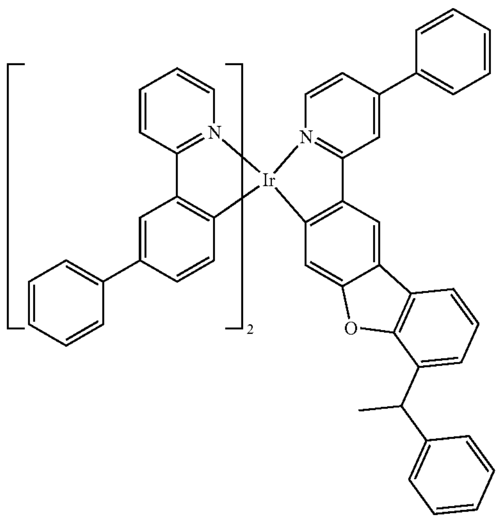
803
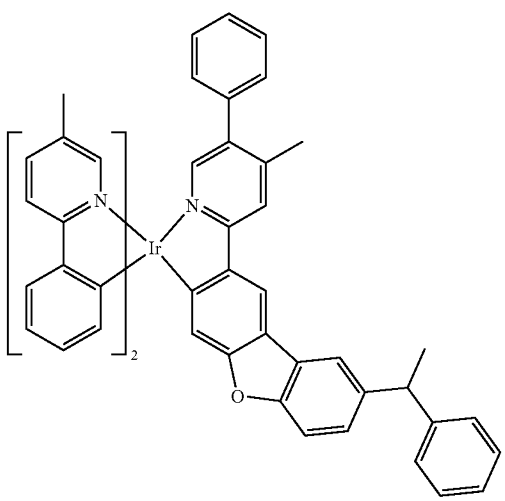
804
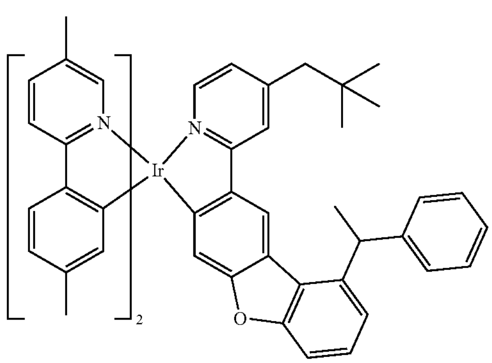
-continued
805
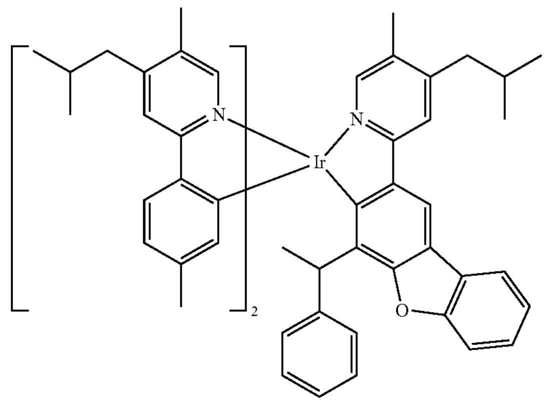
806
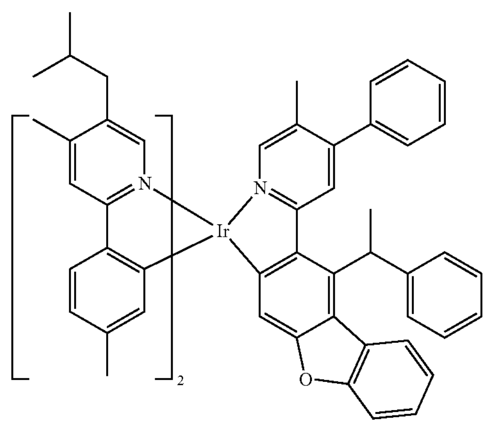
807
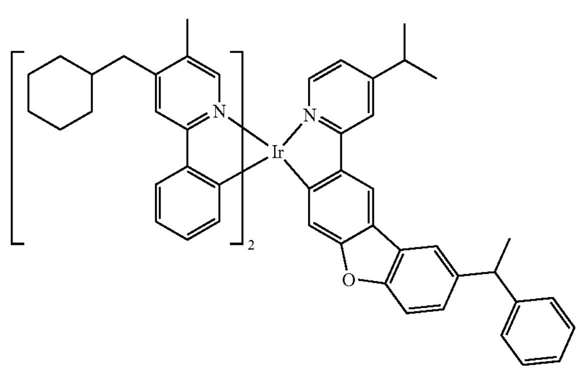

-continued
808
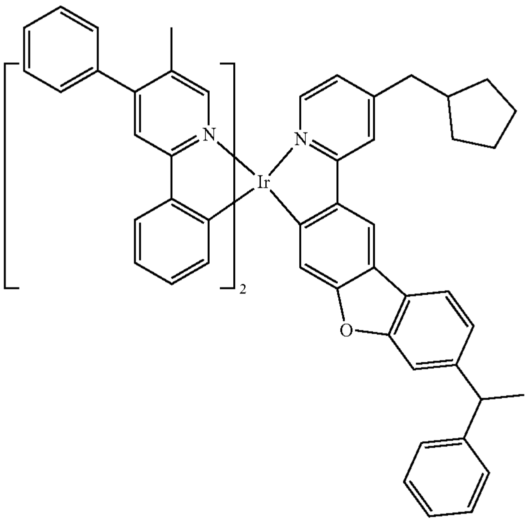
809
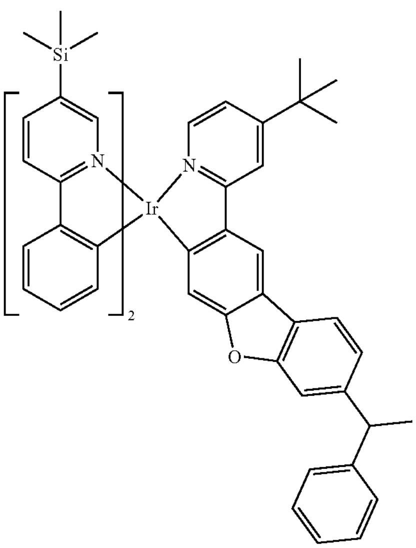
810
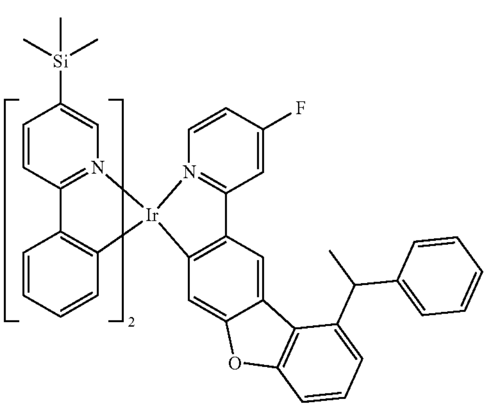
-continued
811
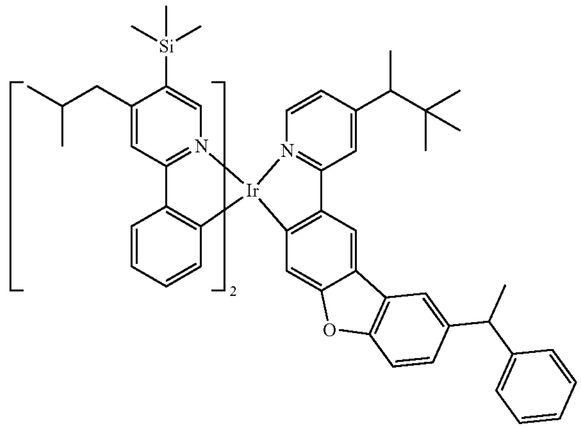
812
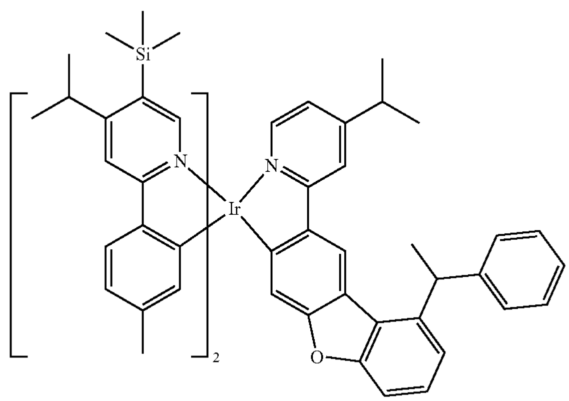
813
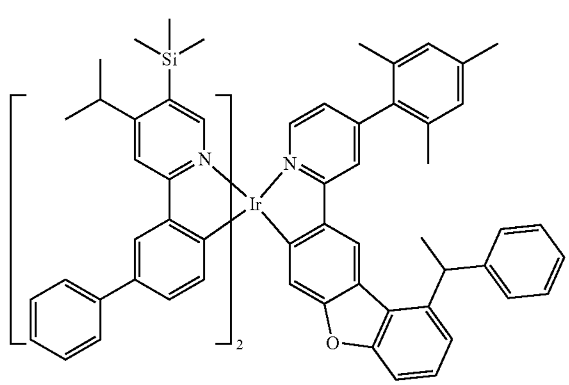

-continued
814
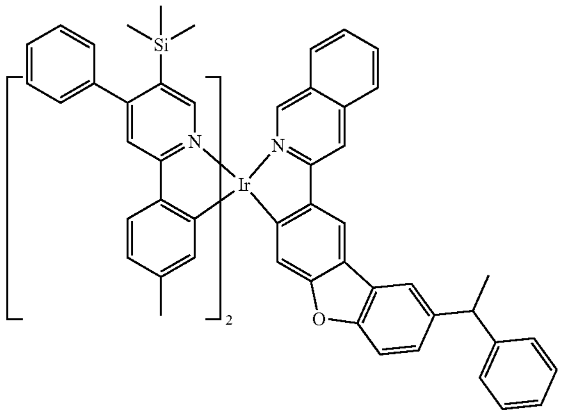
815
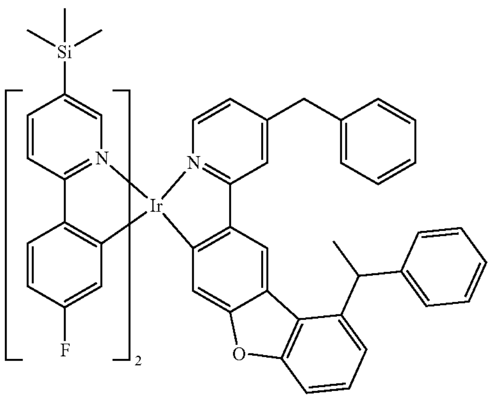
816
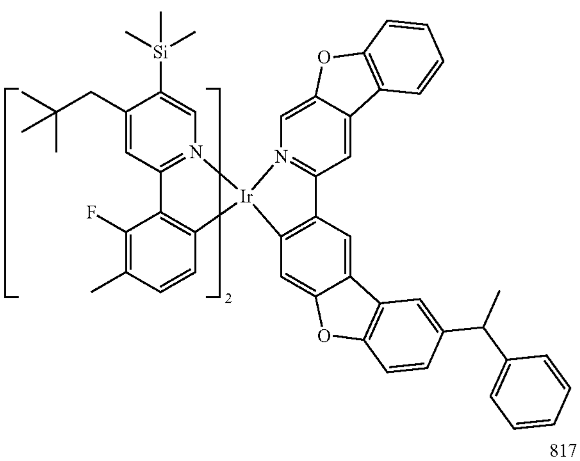
817
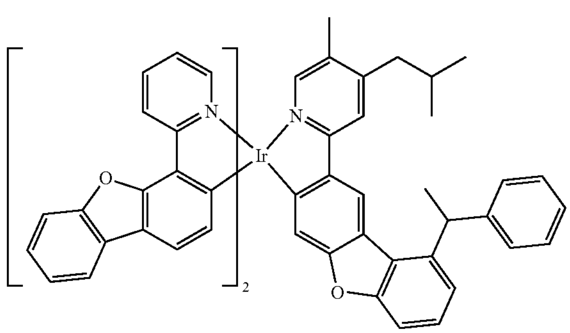
-continued
818
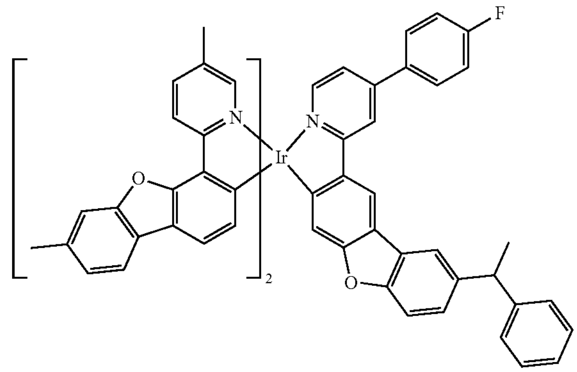
819
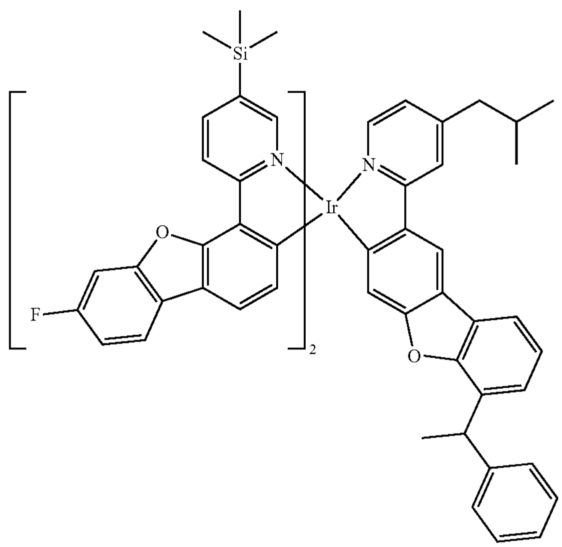
820
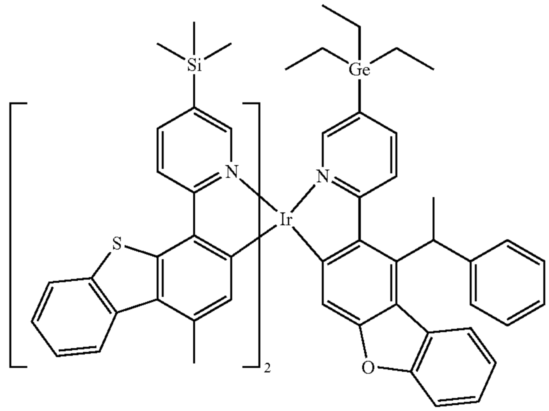

-continued
821
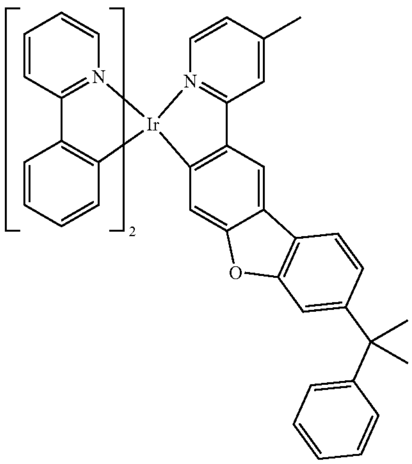
822
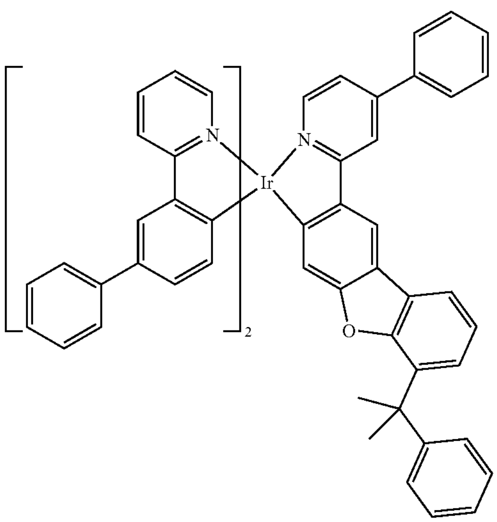
823
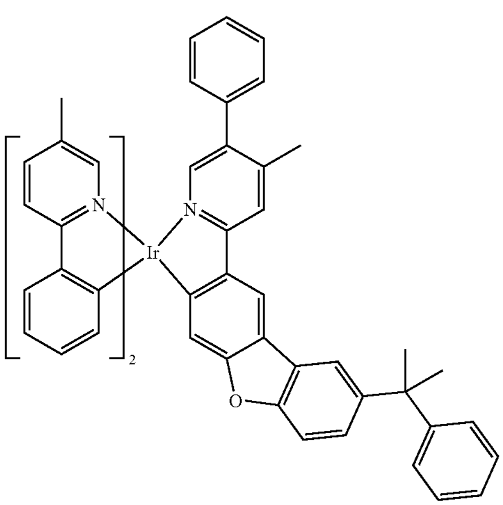
-continued
824
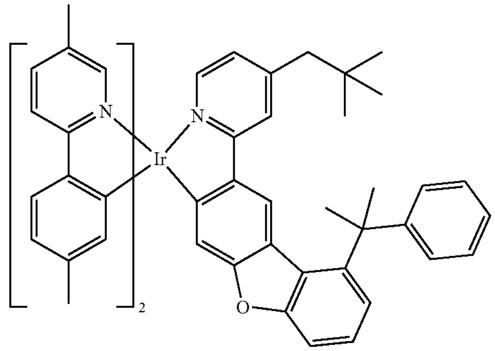
825
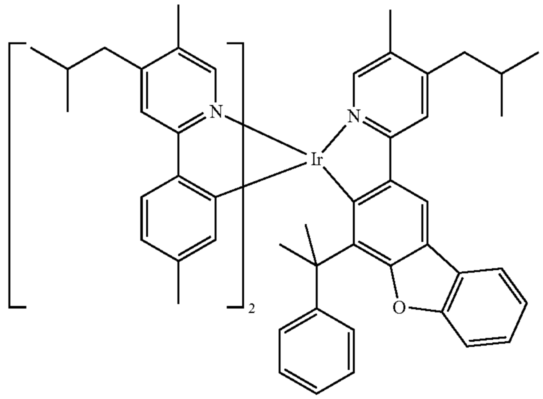
826
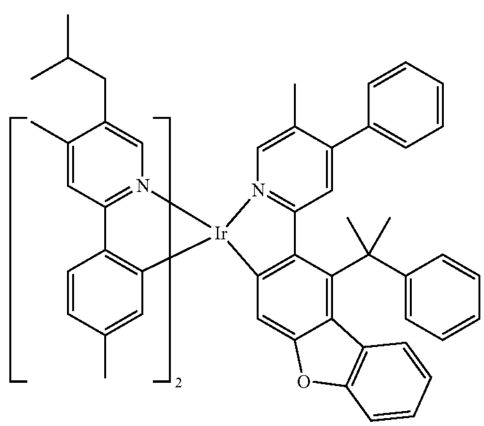
827
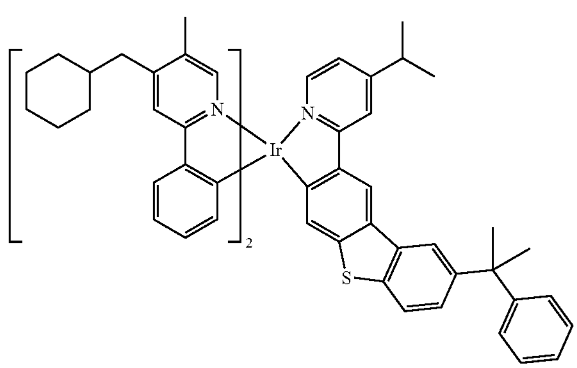

-continued
828
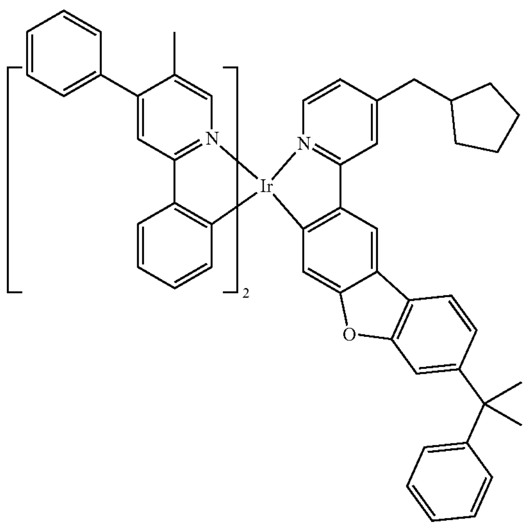
829
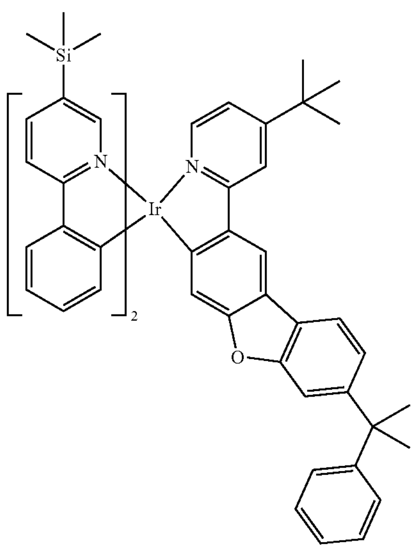
830
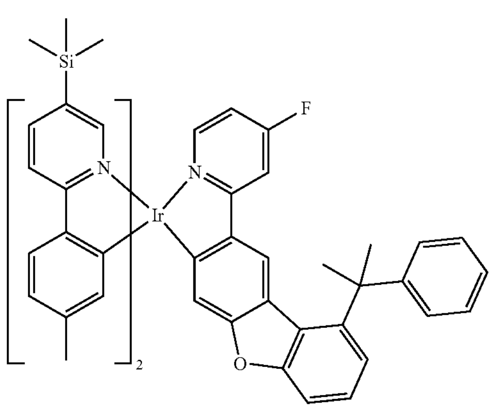
-continued
831
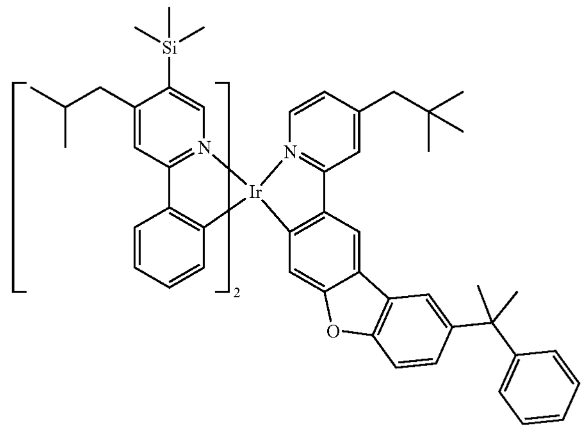
832
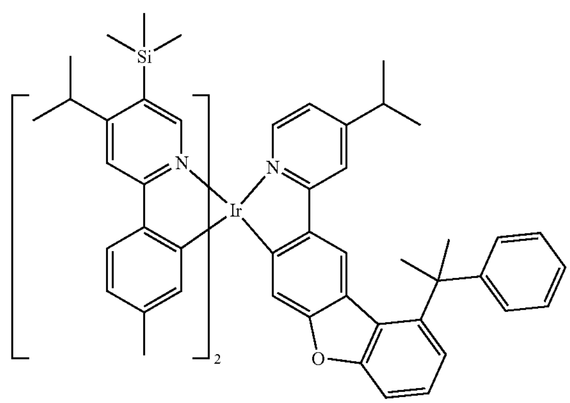
833
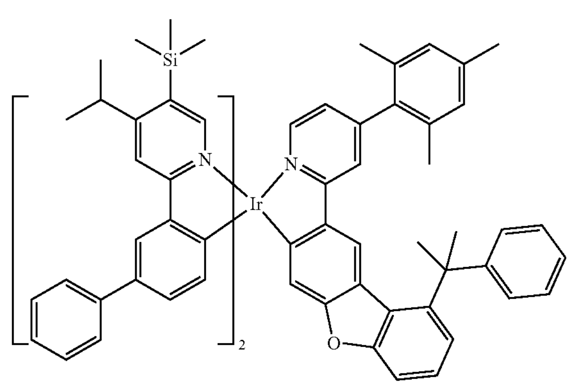

-continued
834
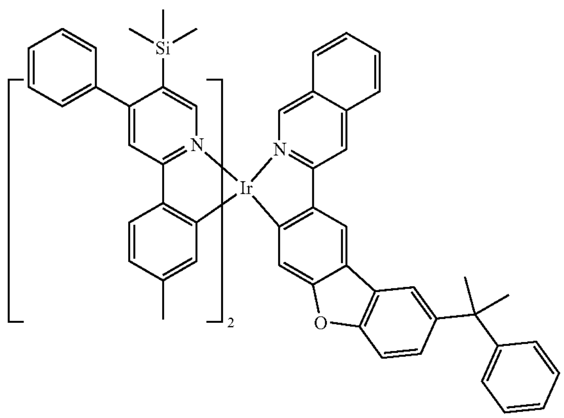
835
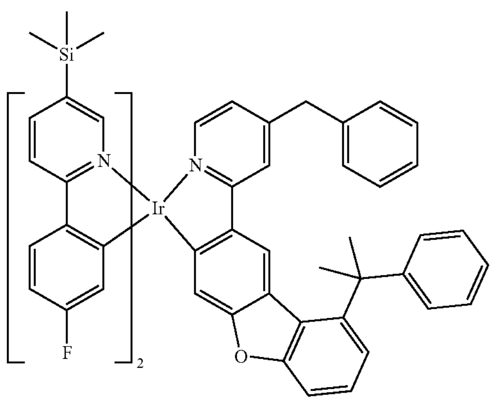
836
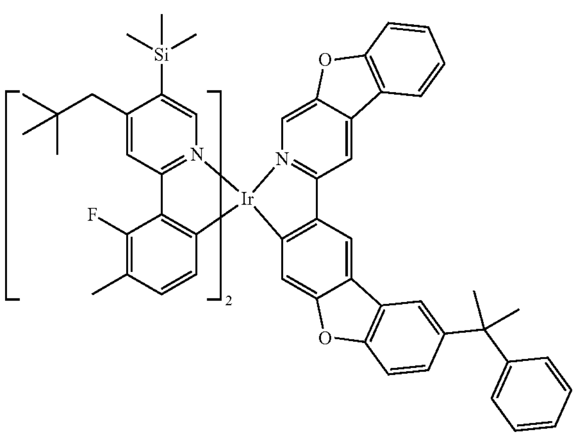
837
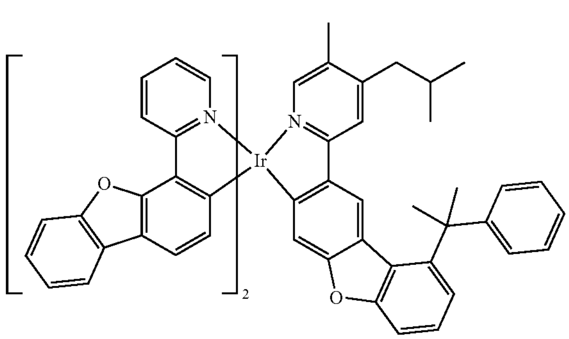
-continued
838
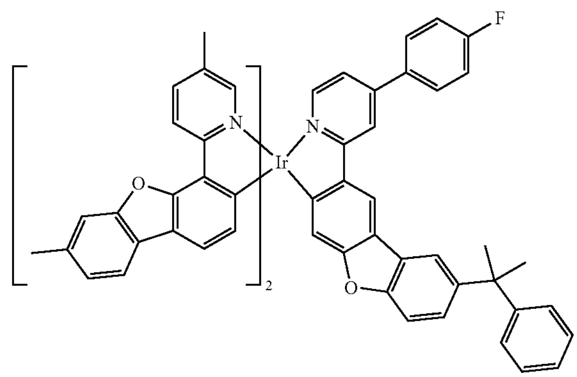
839
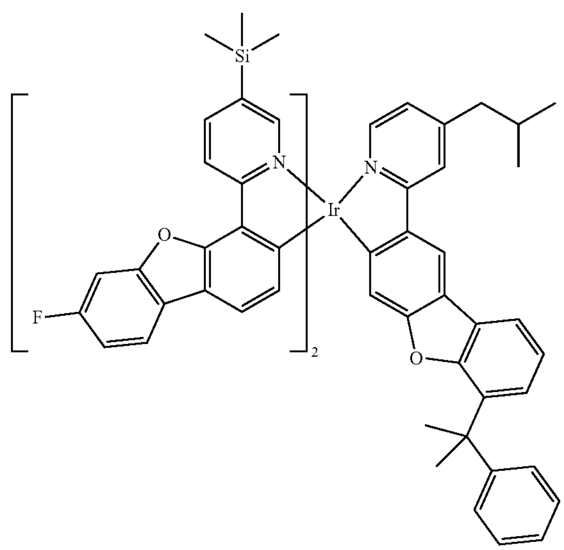
840
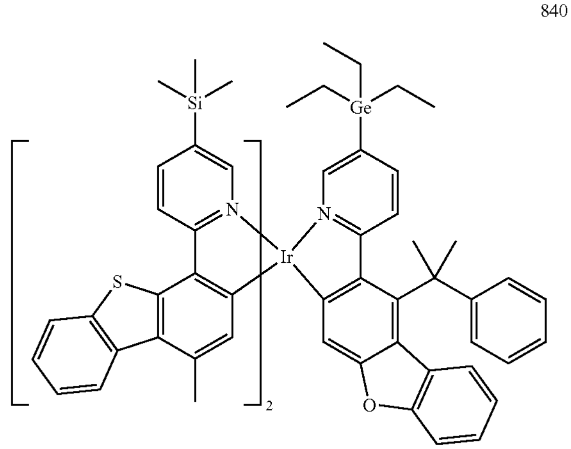

841
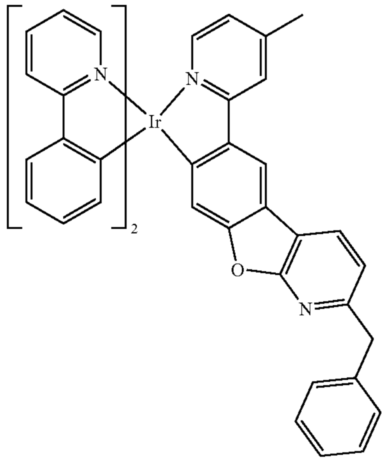
842
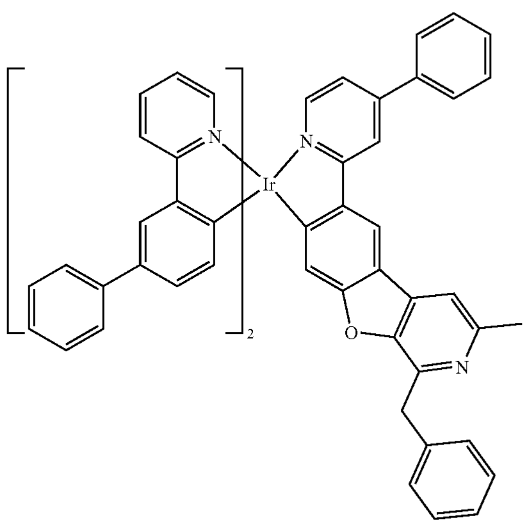
843
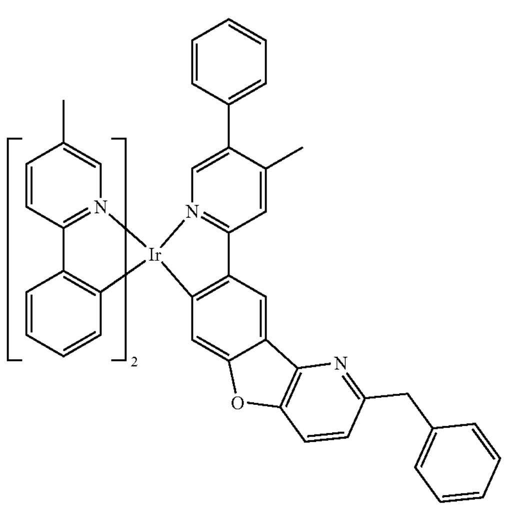
848
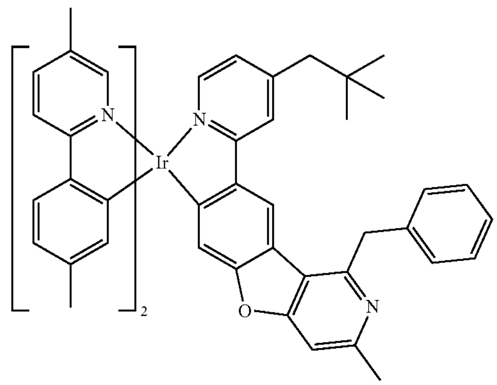
845
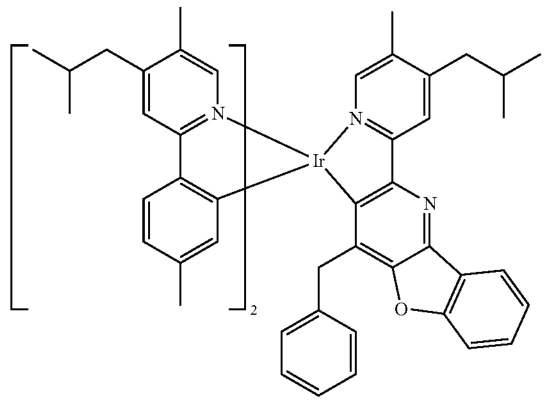
846
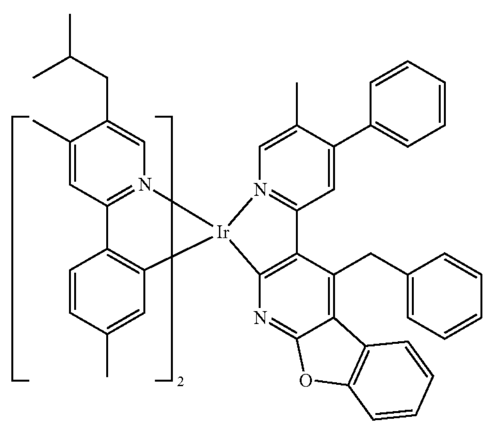
847
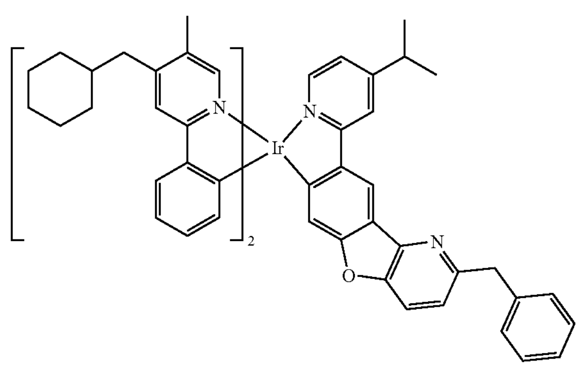

-continued
848
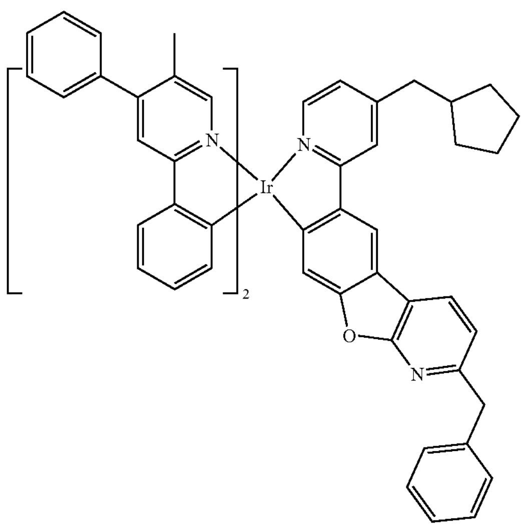
849
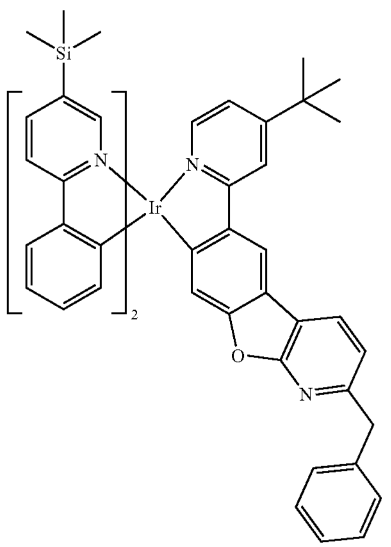
850
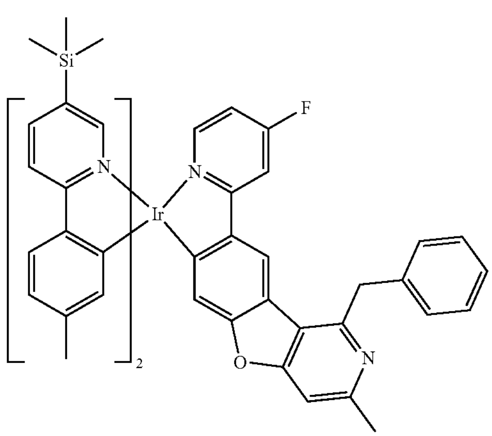
-continued
851
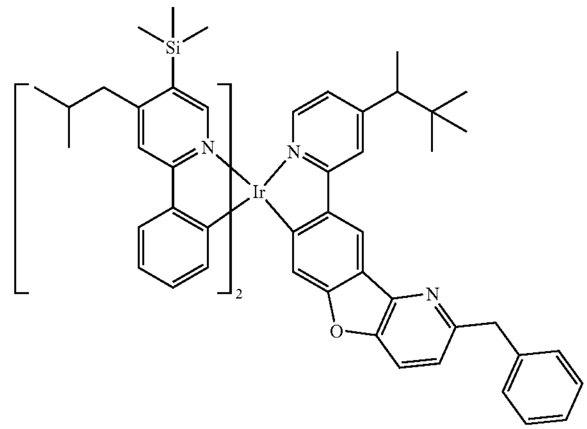
852
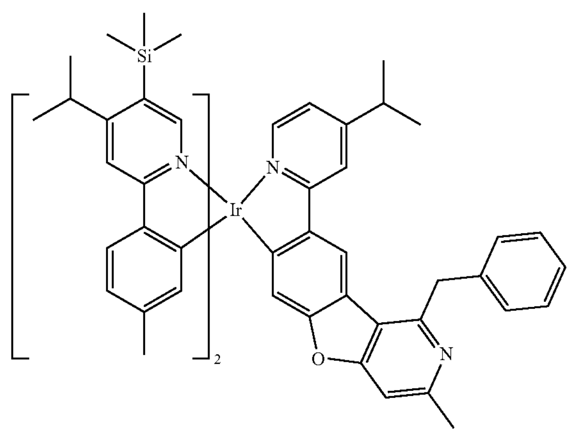
853
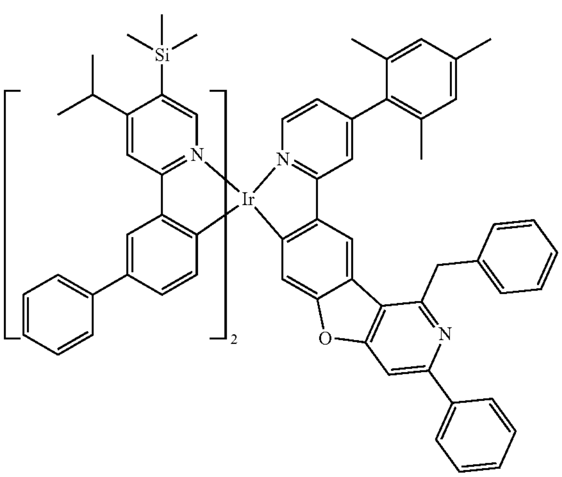

854
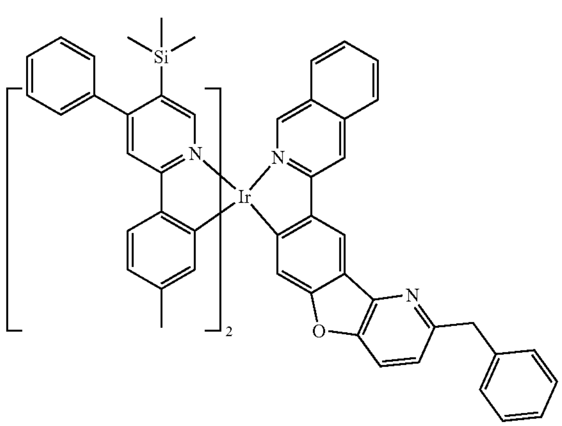
855
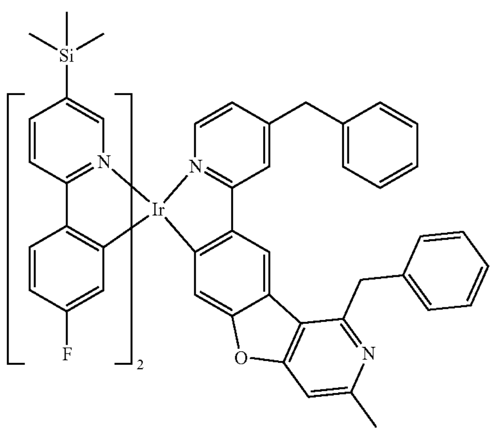
856
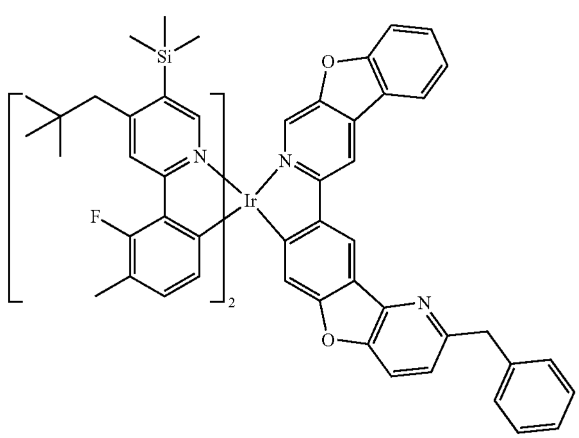
857
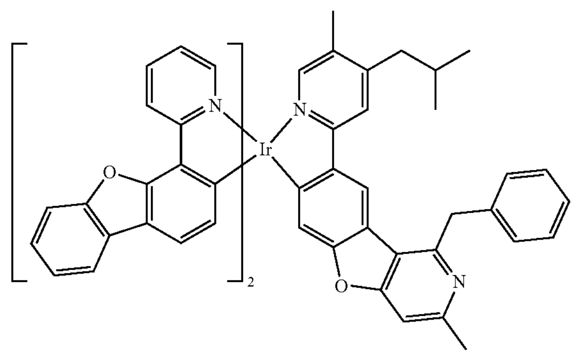
858
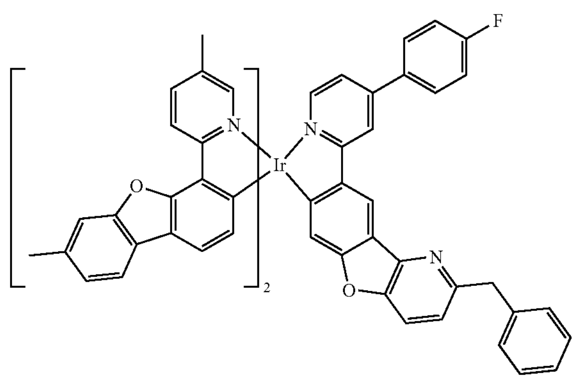
859
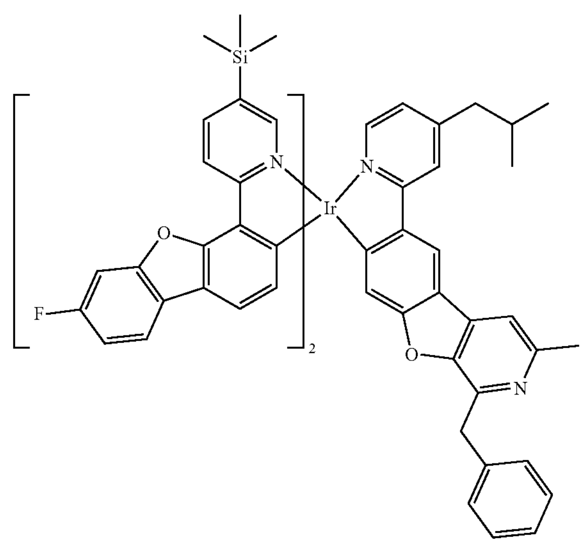

-continued
-continued
860
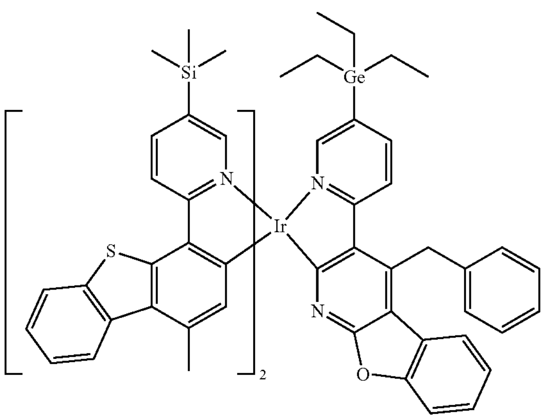
863
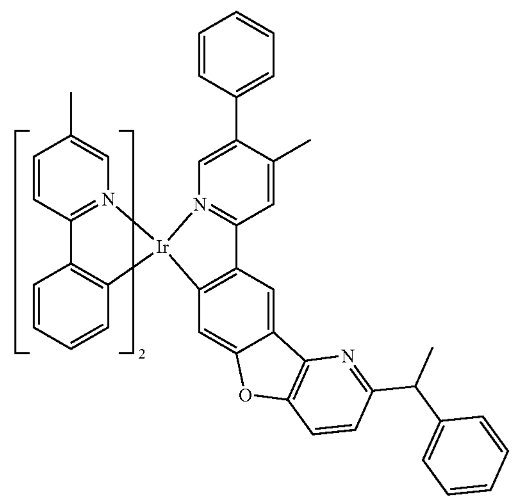
861
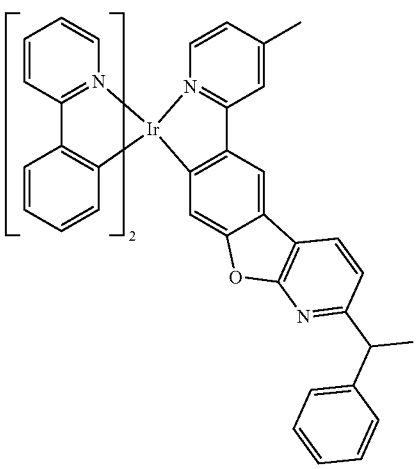
864
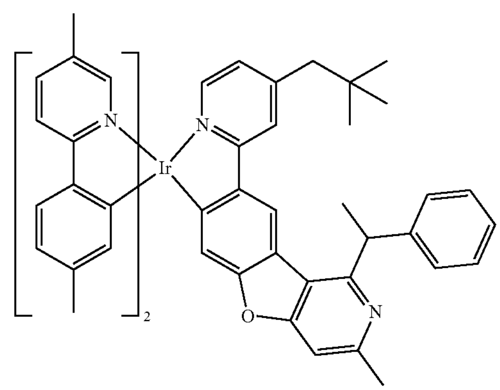
862
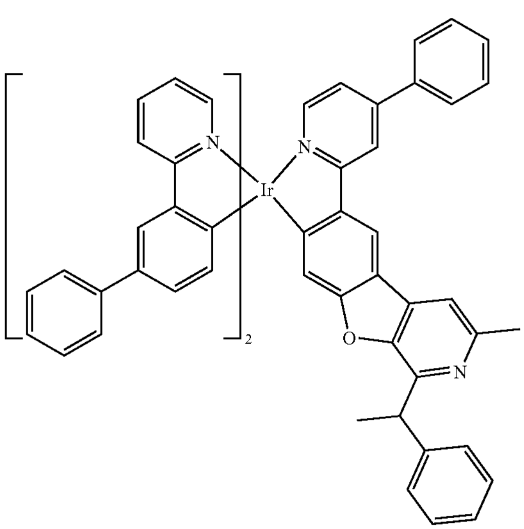
865
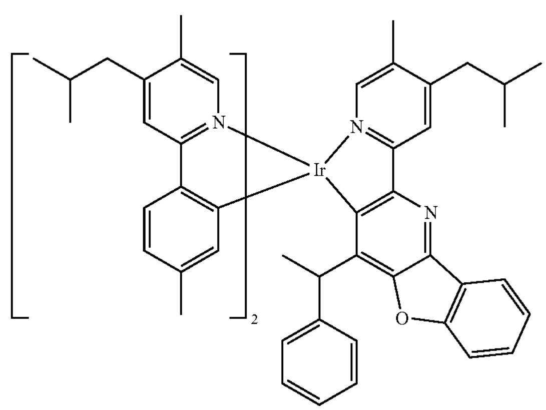

-continued
866
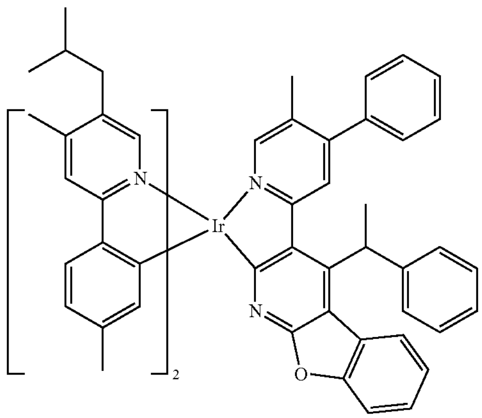
867
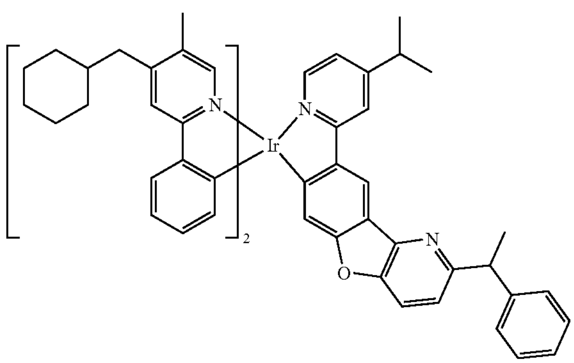
868
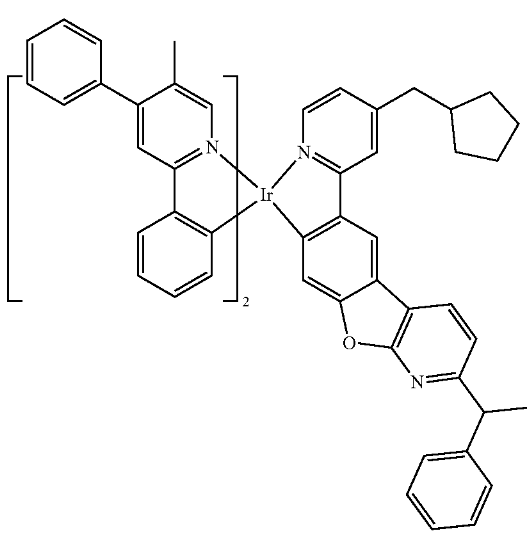
-continued
869
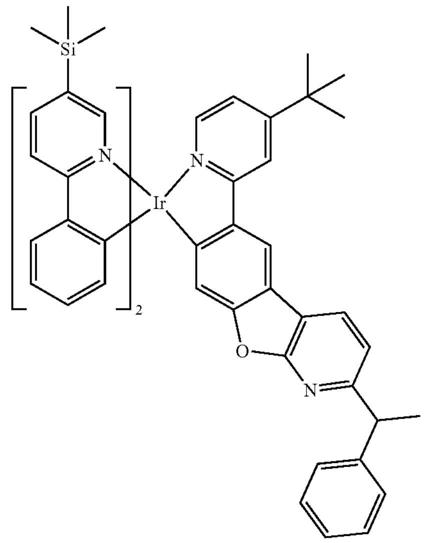
870
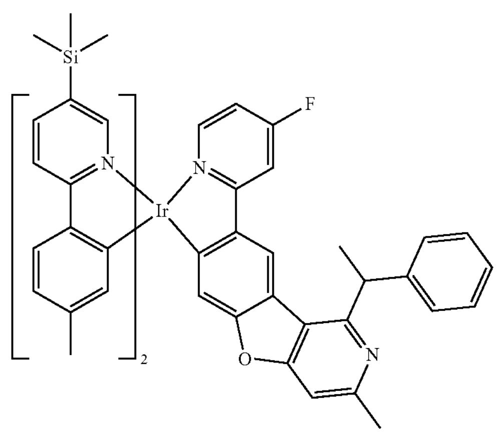
871
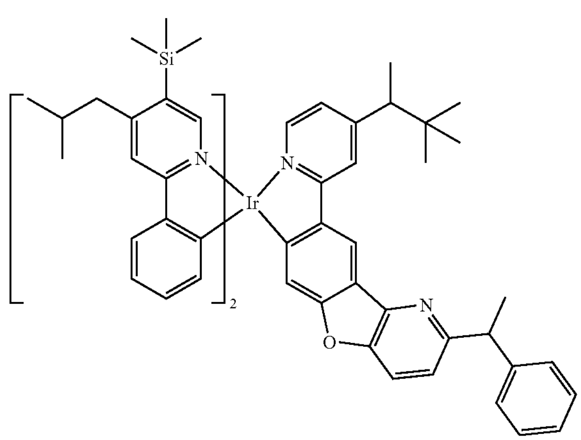

-continued
872
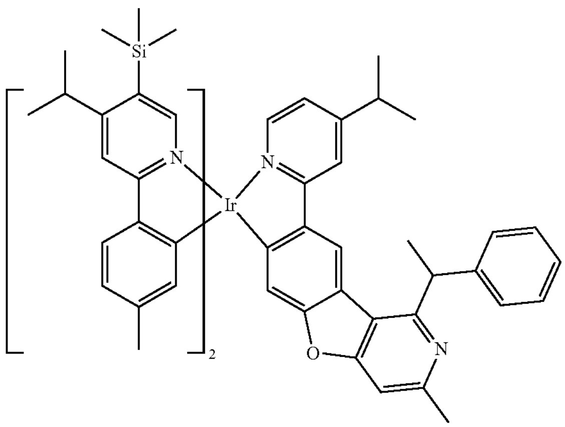
873
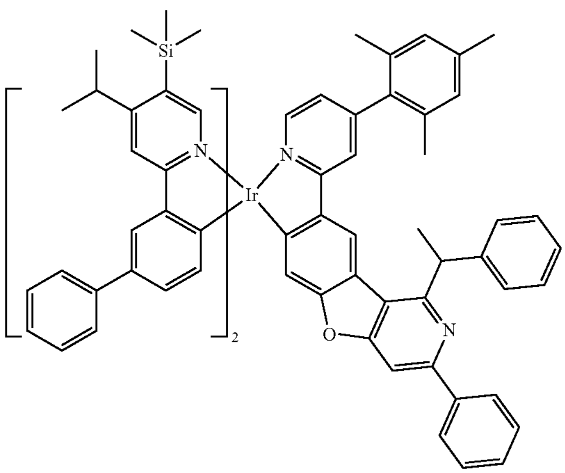
874
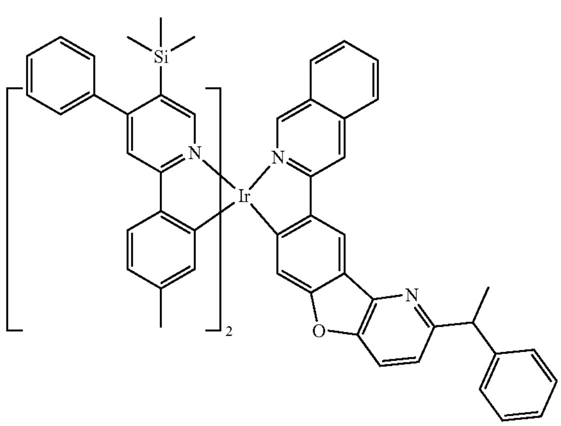
-continued
875
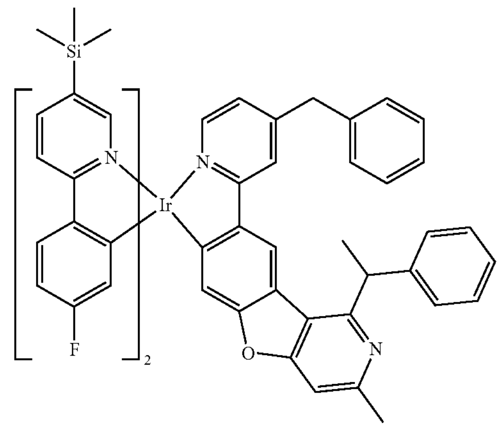
876
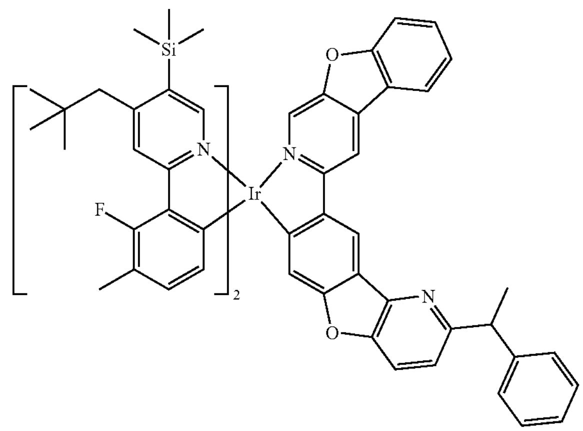
877
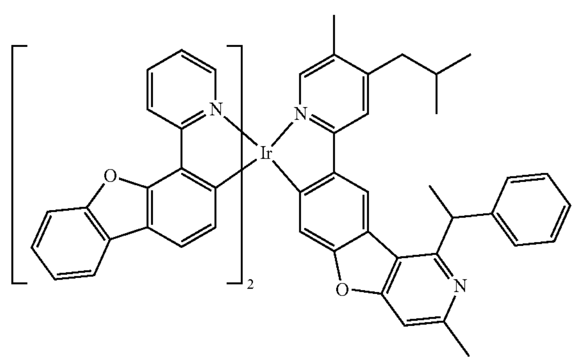
878
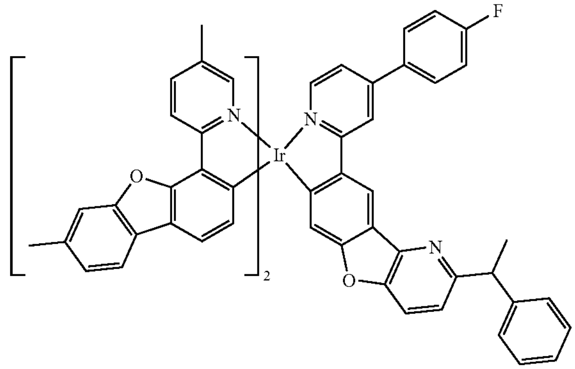

879
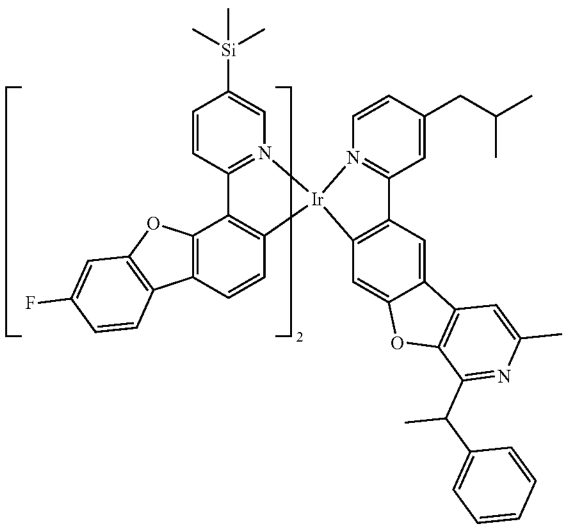
880
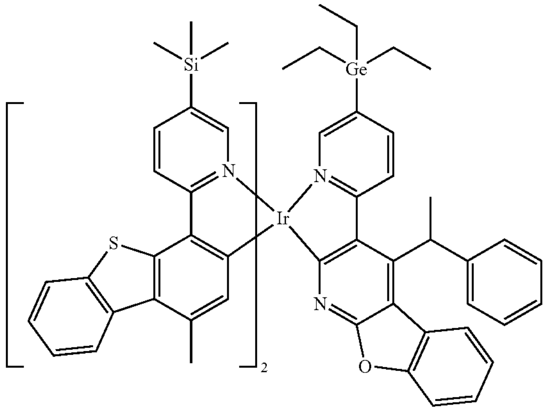
881
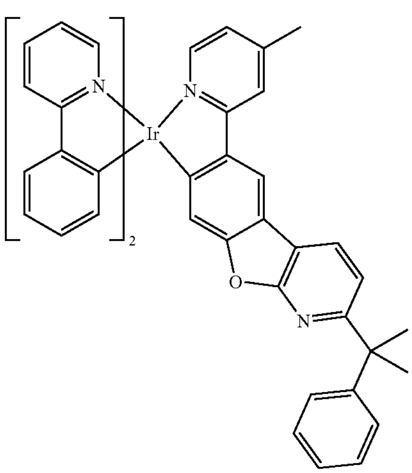
882
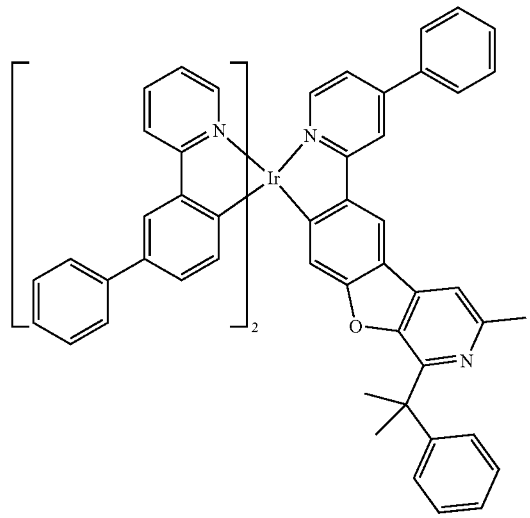
883
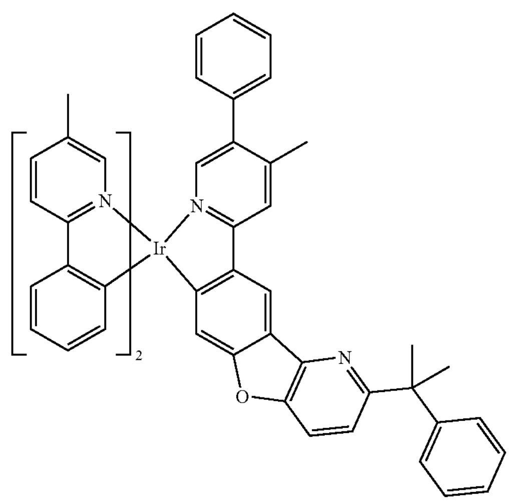
884
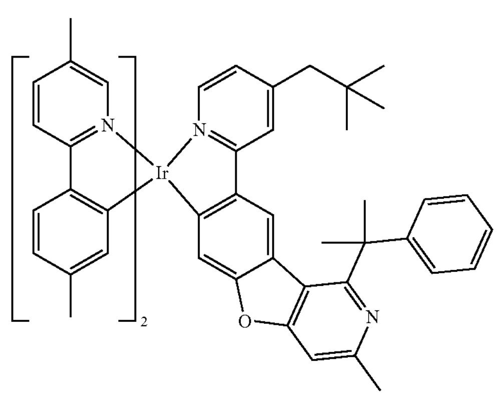

-continued
885
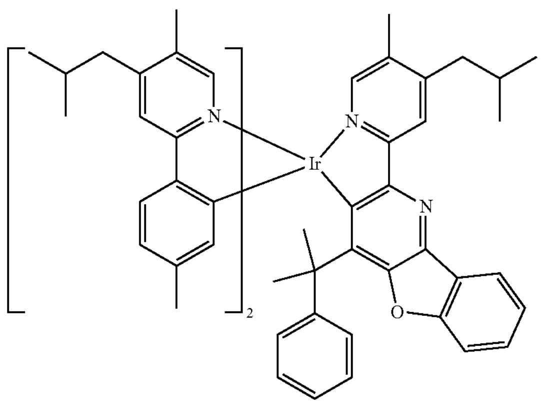
886
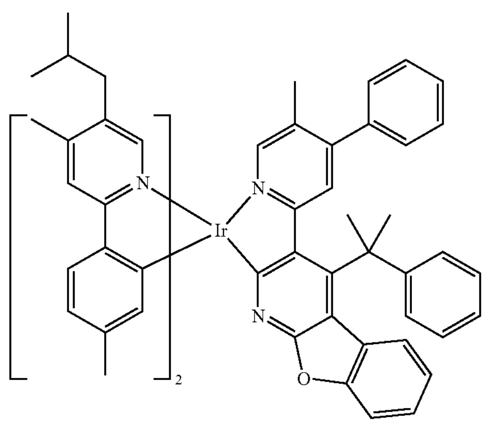
887
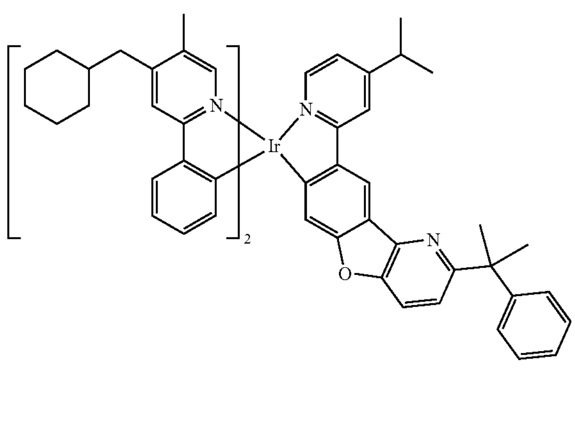
-continued
888
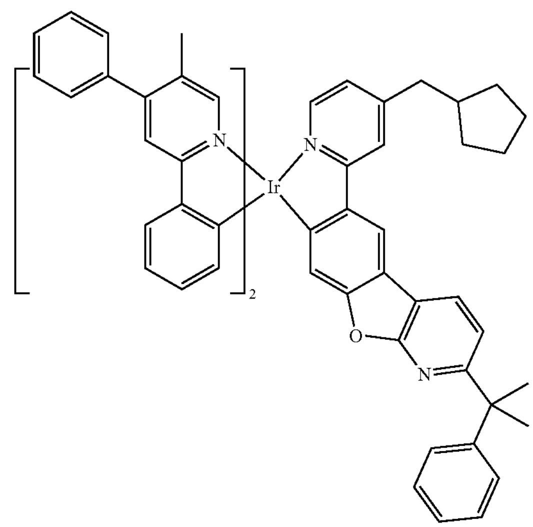
889
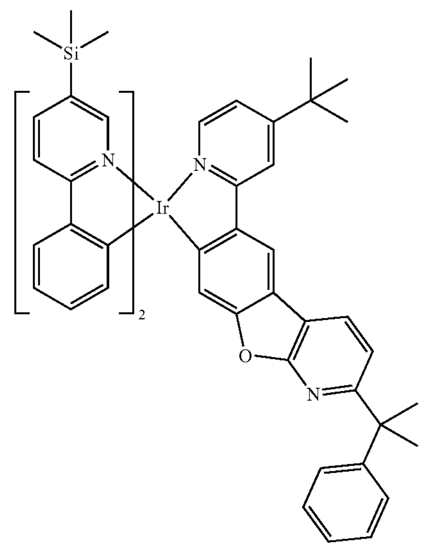
890
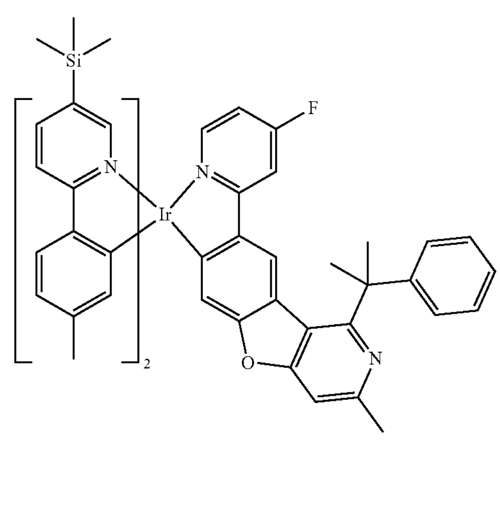

384
-continued
891
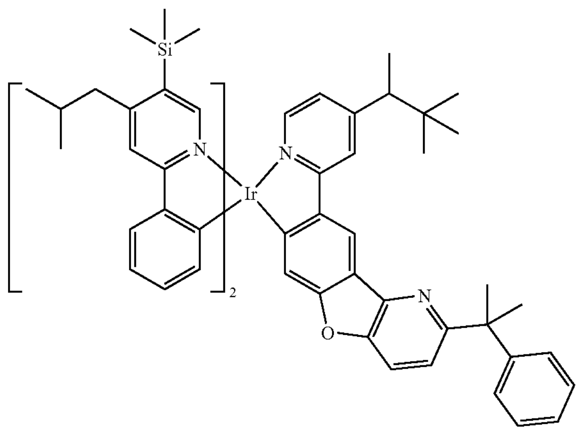
892
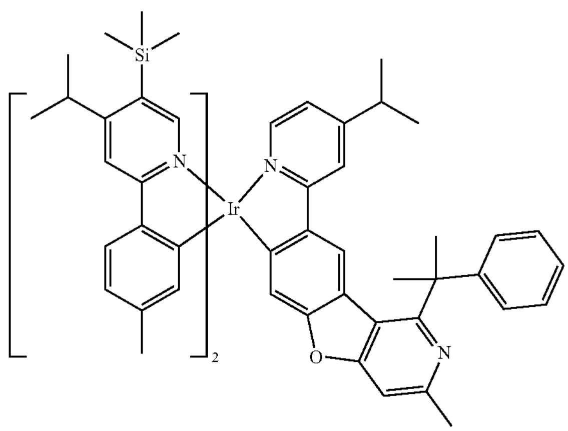
893
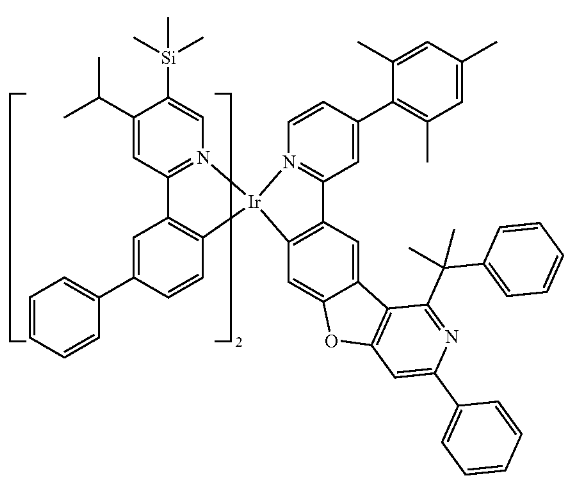
894
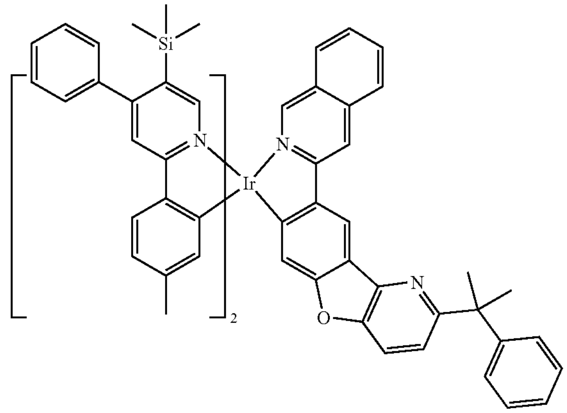
895
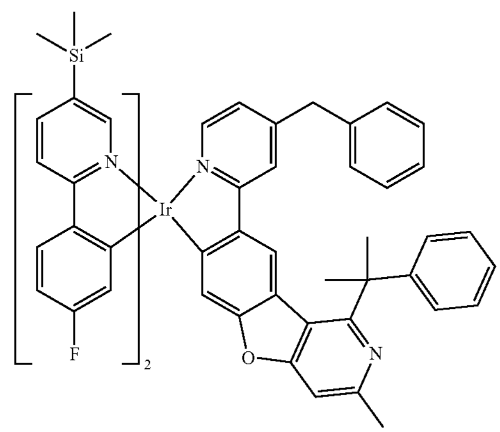
896
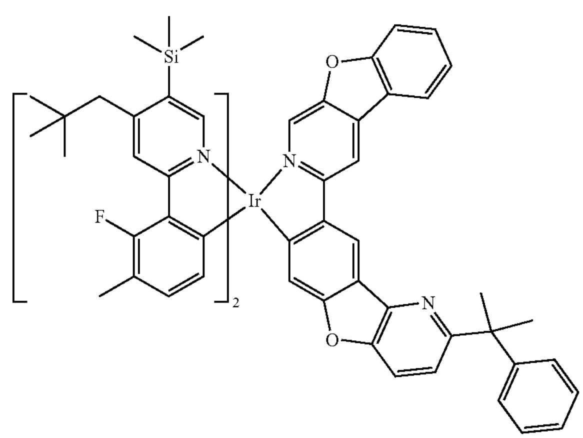

-continued
897
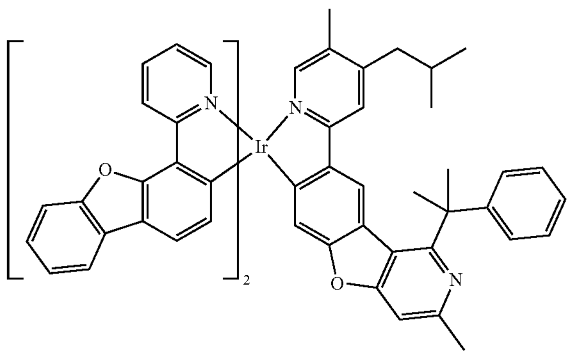
898
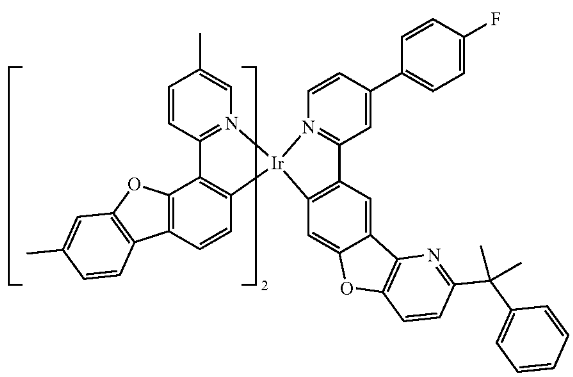
899
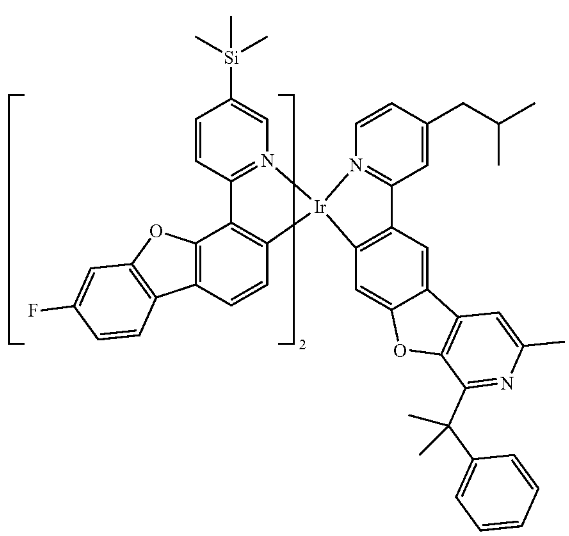
-continued
900
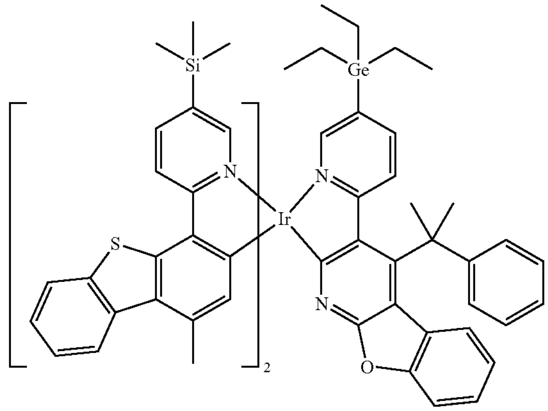
901
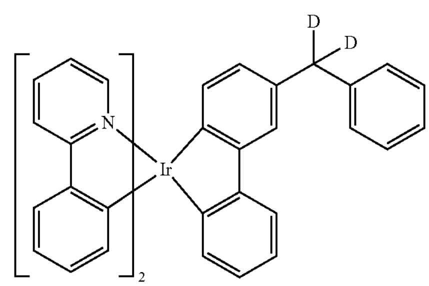
902
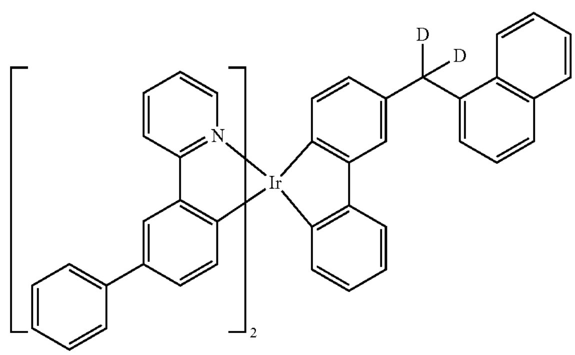
903
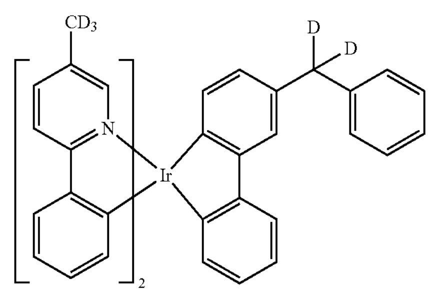

-continued
904
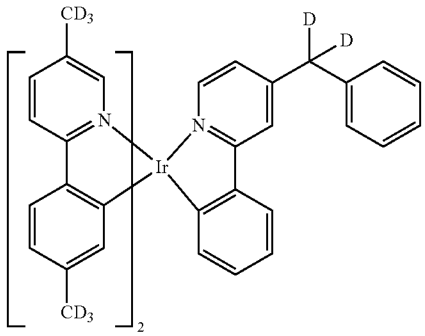
905
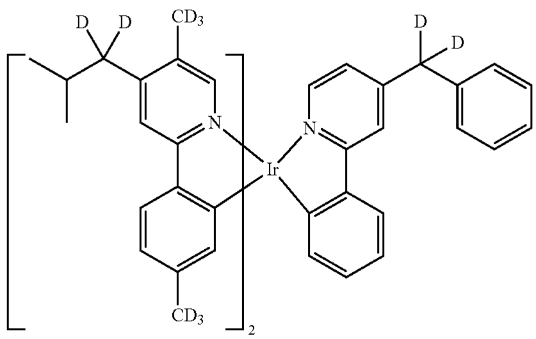
906
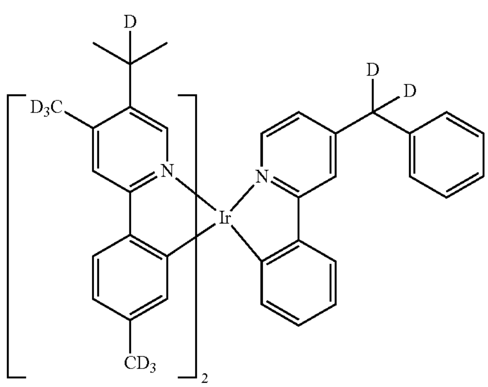
907
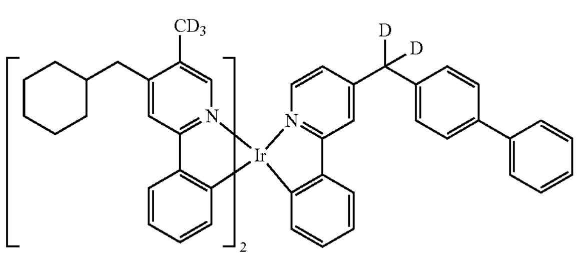
-continued
908
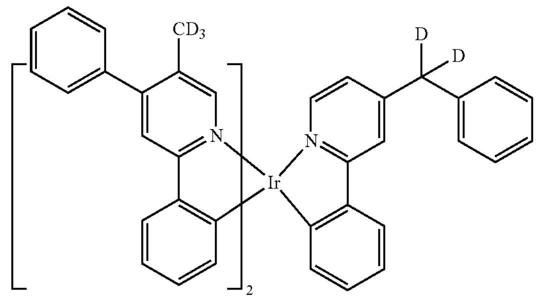
909
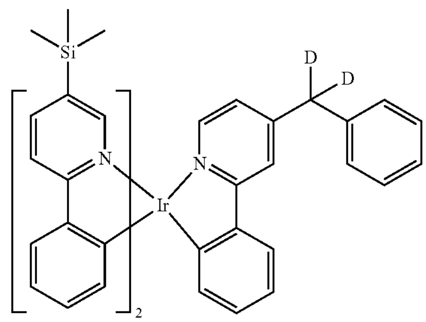
910
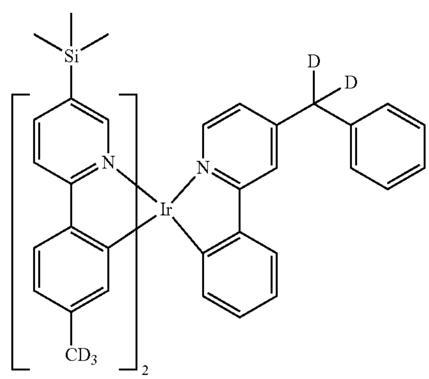
911
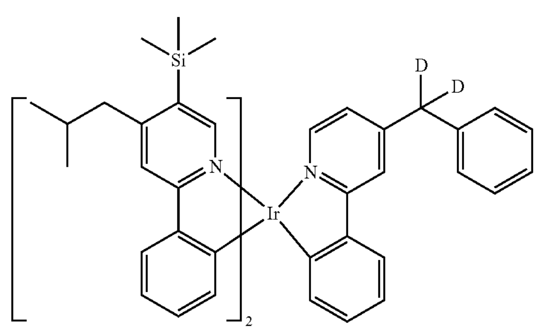

912
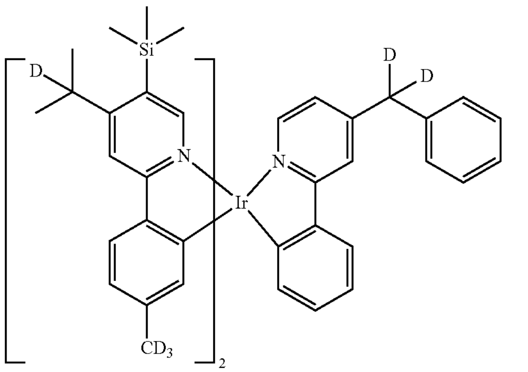
913
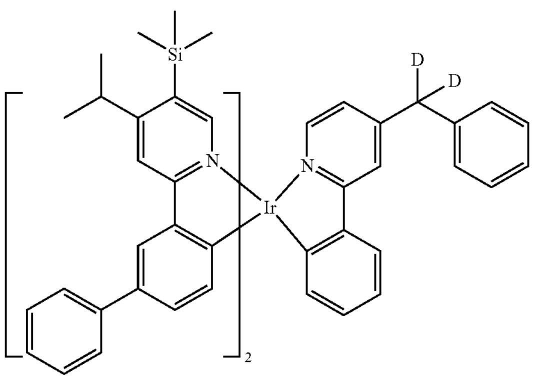
914
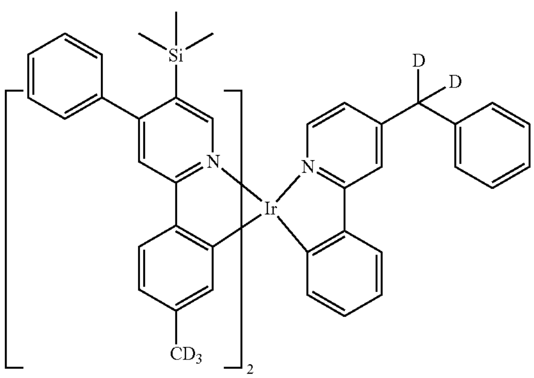
915
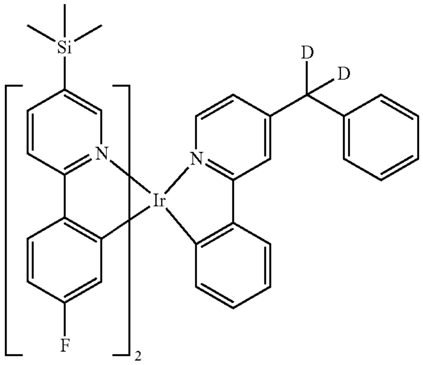
916
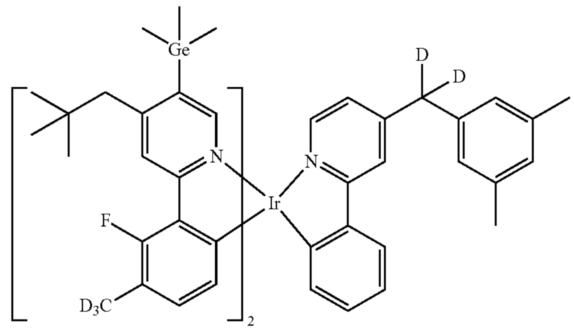
917
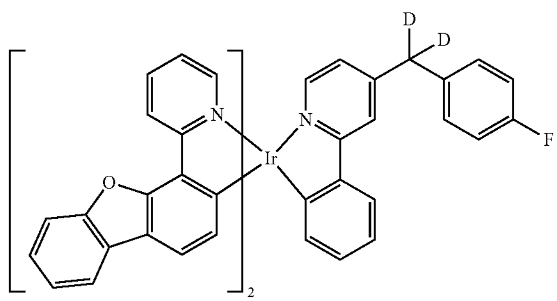
918
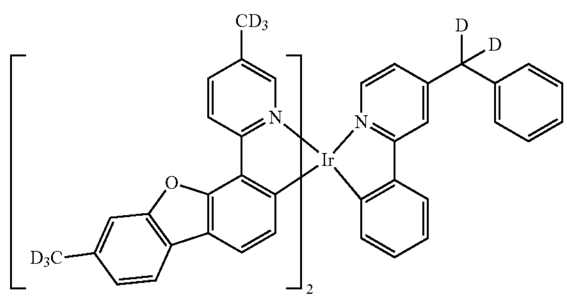
919
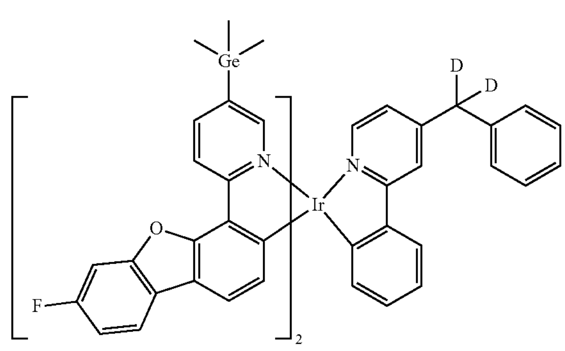

-continued
920
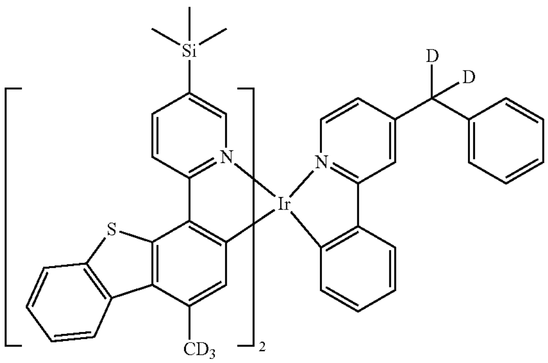
921
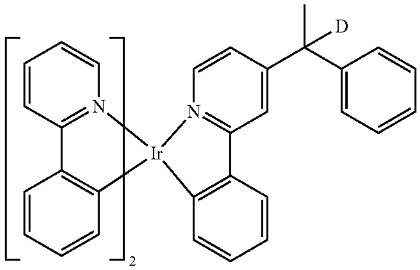
922
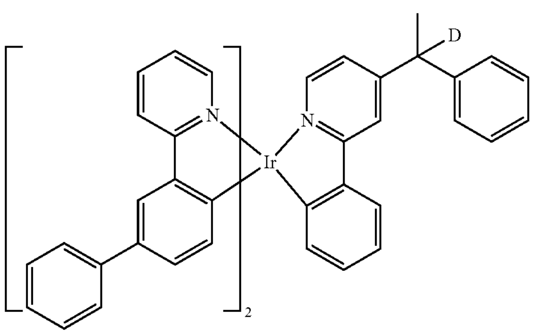
923
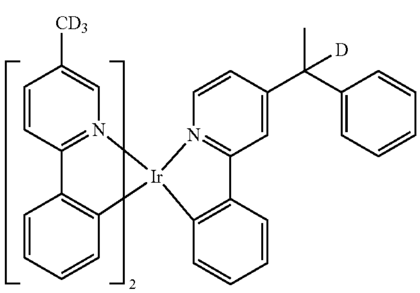
924
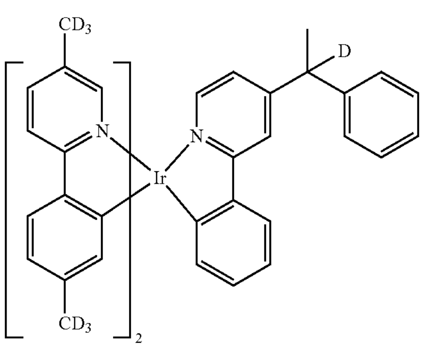
-continued
925
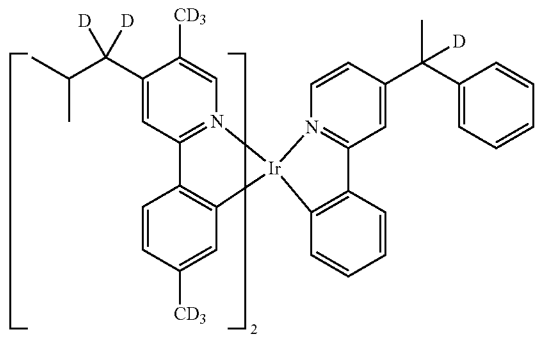
926
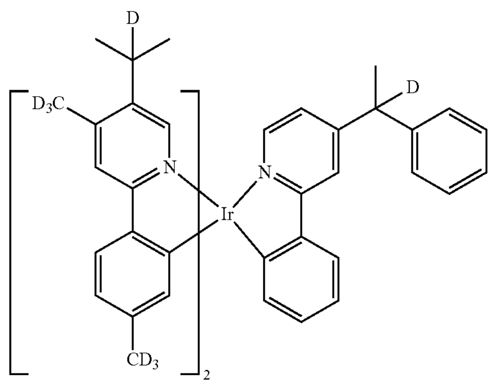
927
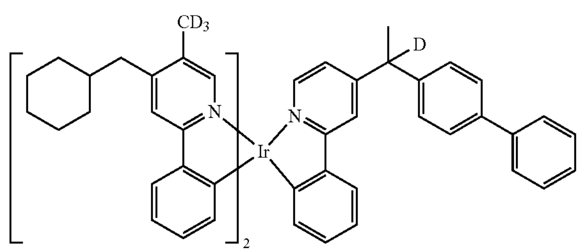
928
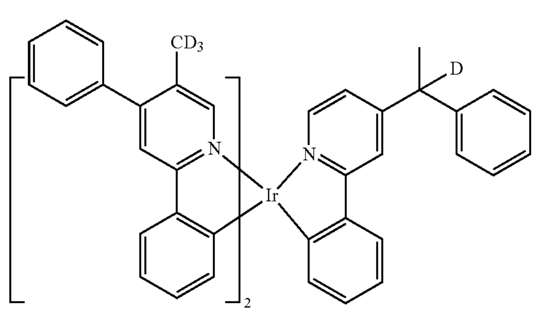

-continued
929
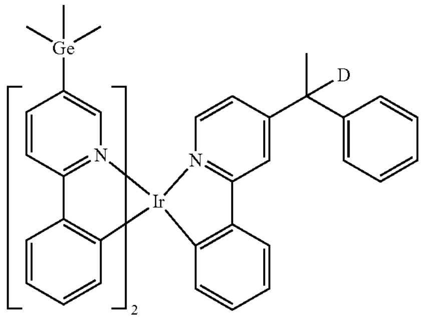
930
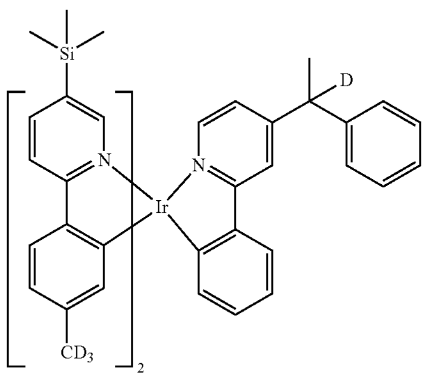
931
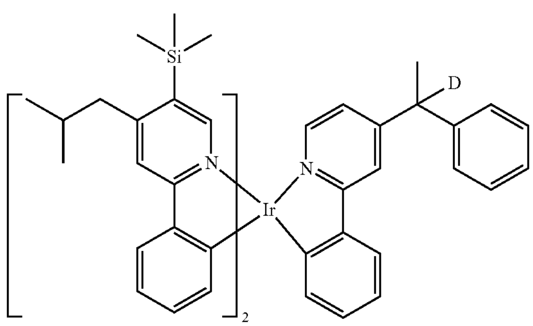
932
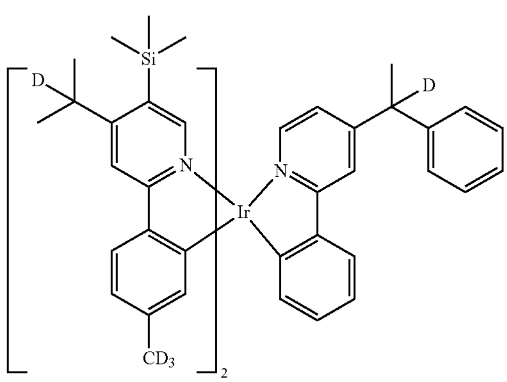
-continued
933
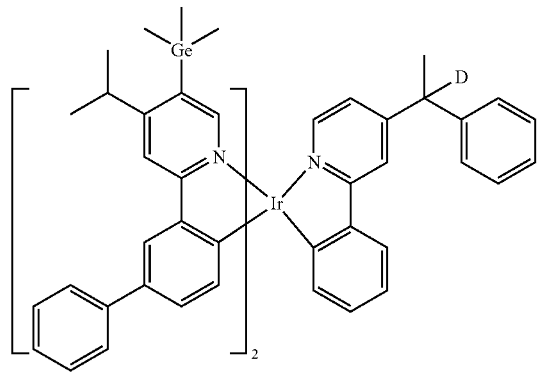
934
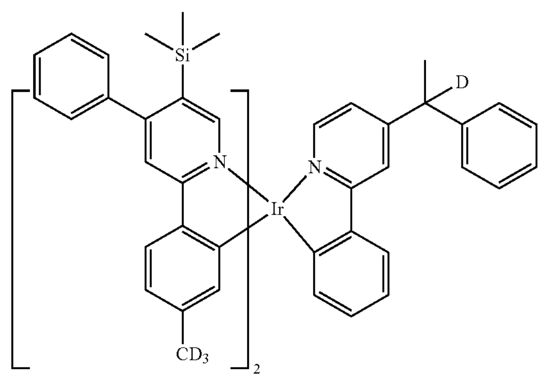
935
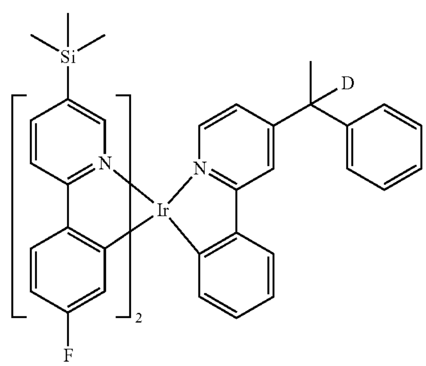
936
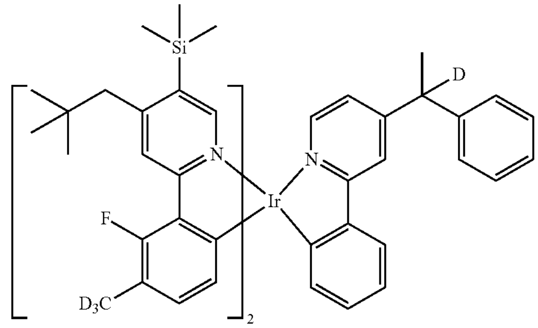

937
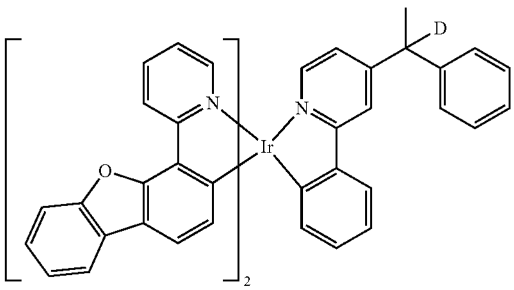
938
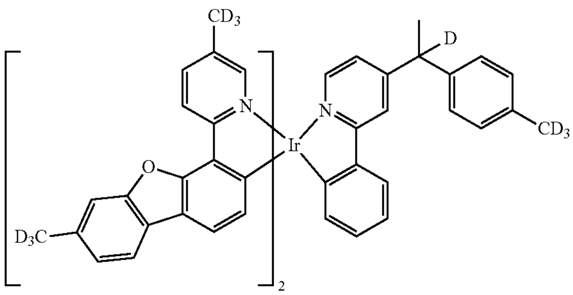
939
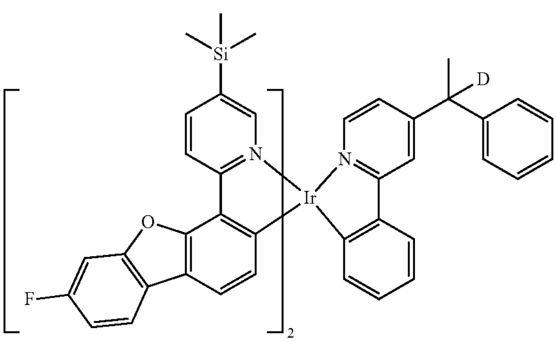
940
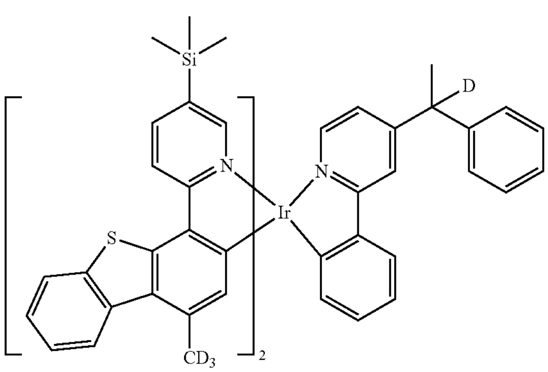
941
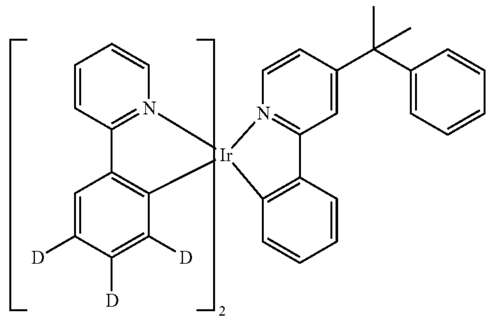
942
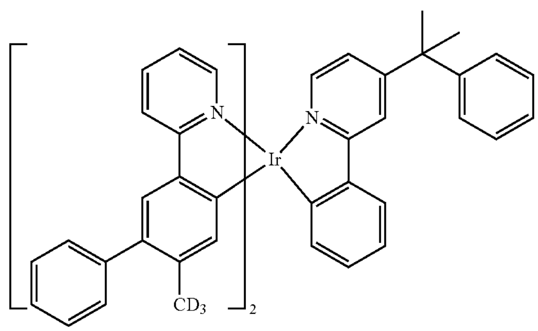
943
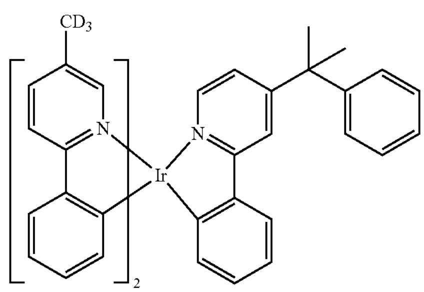
944
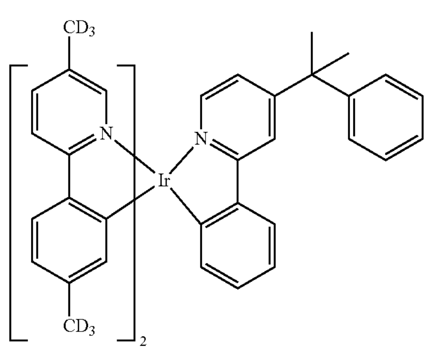

945
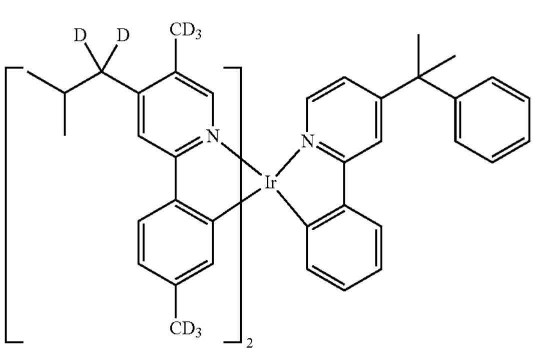
946
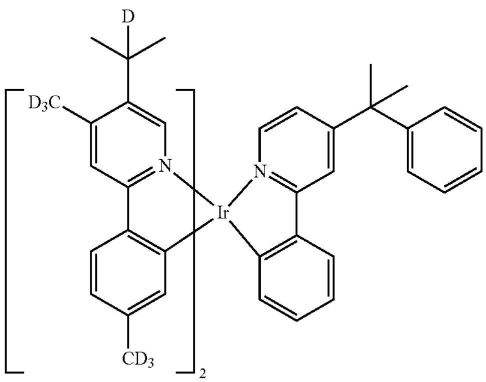
947
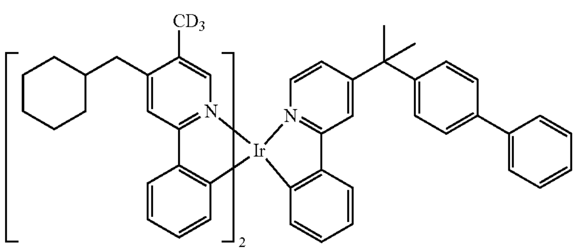
948
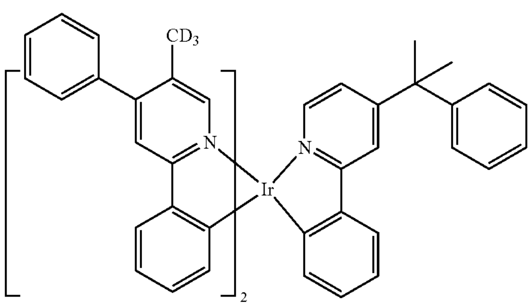
949
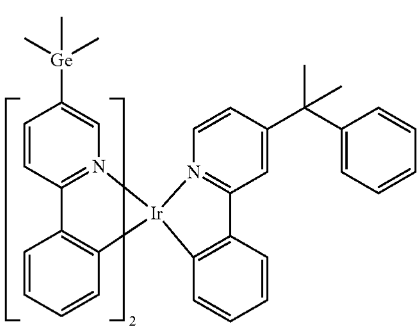
950
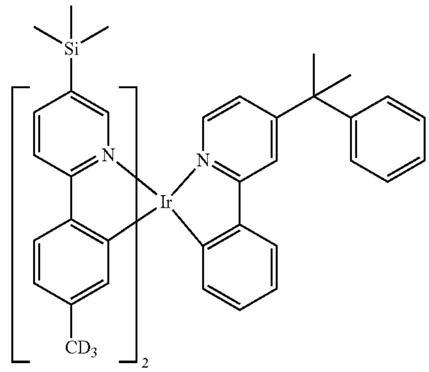
951
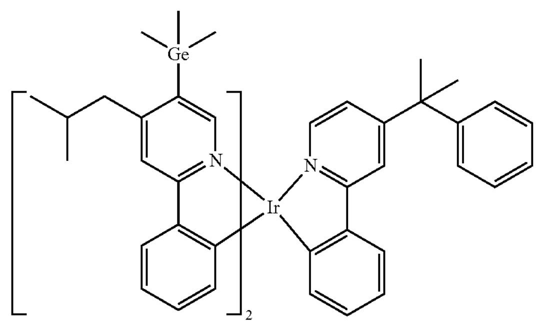
952
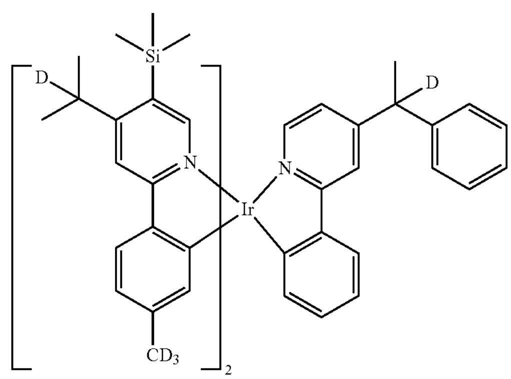
953
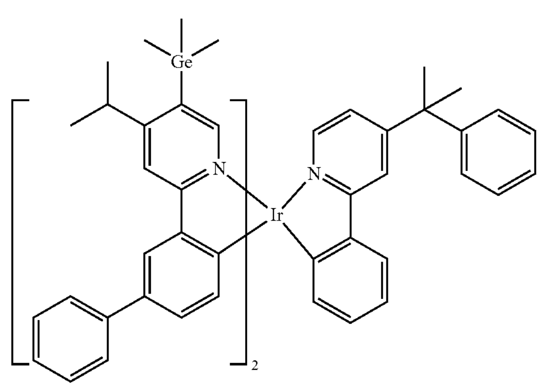

-continued
954
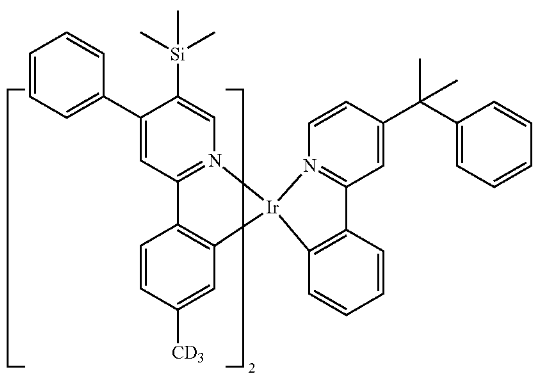
955
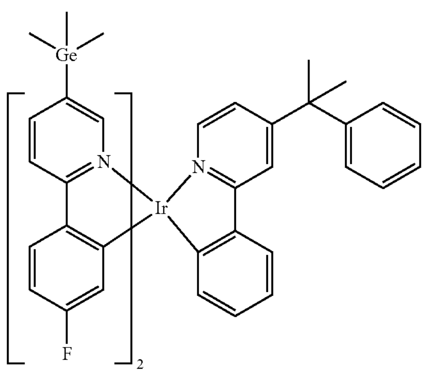
956
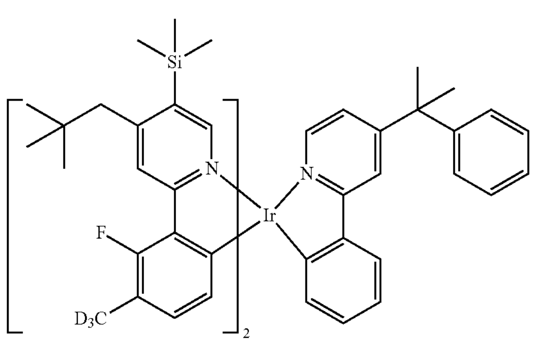
957
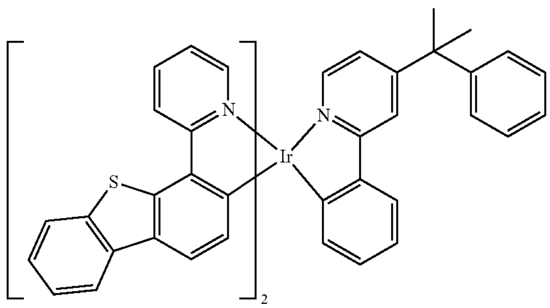
-continued
958
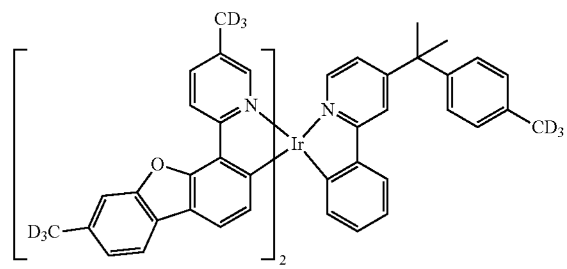
959
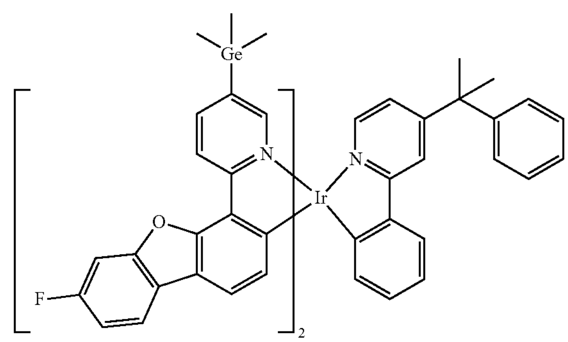
960
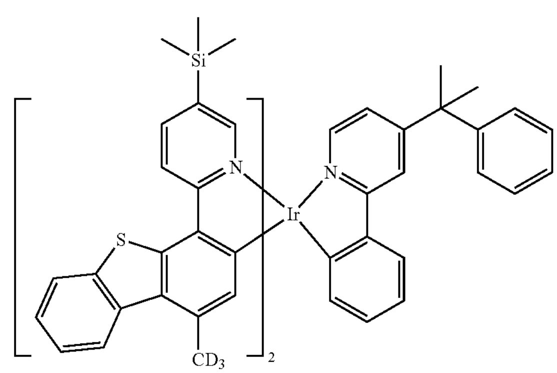
961
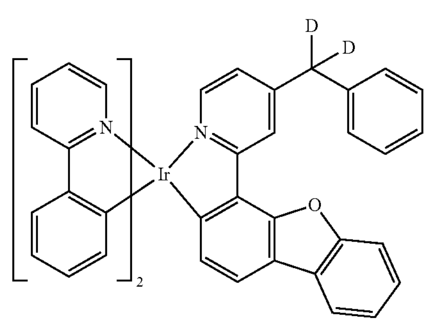

-continued
962
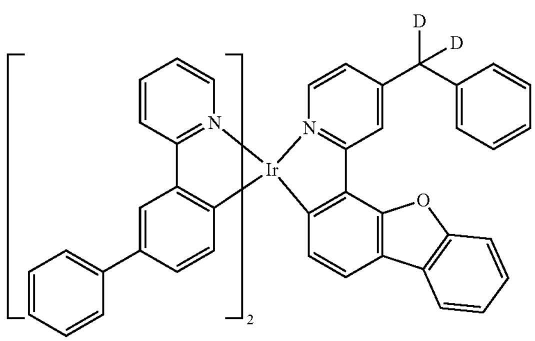
963
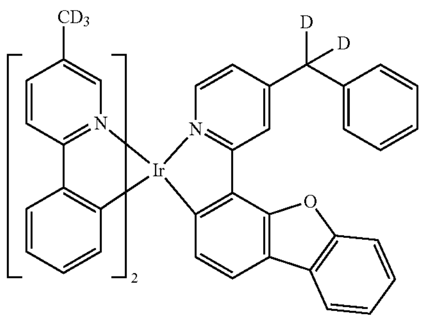
964
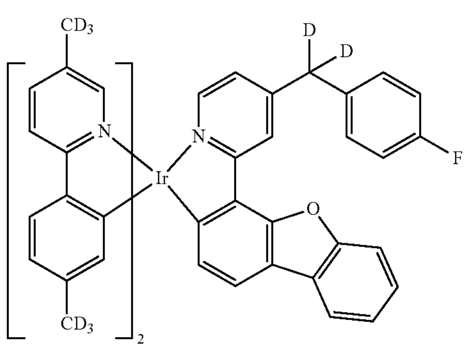
965
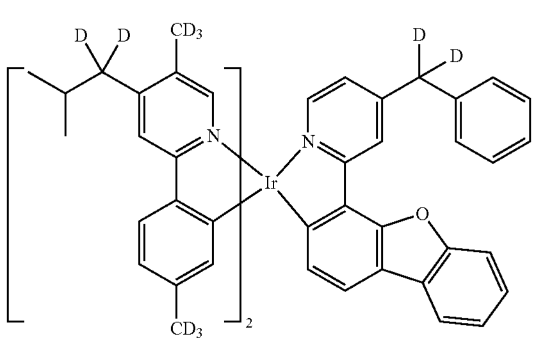
-continued
966
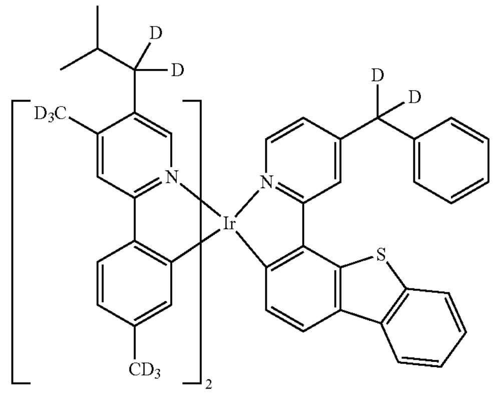
967
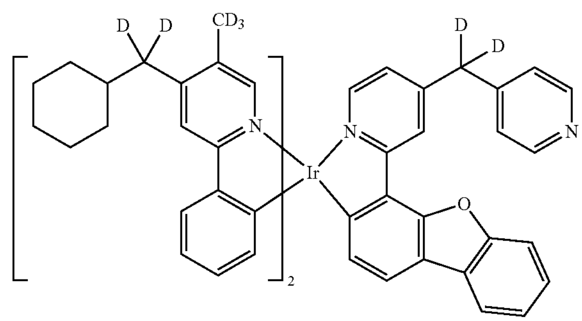
968
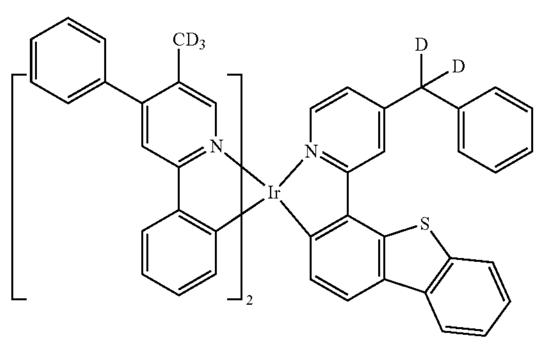
969
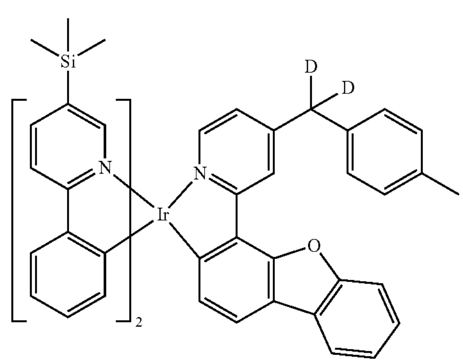

-continued
970
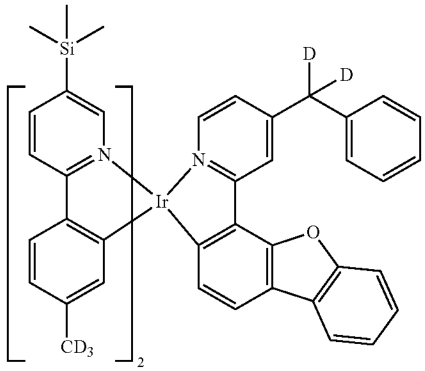
971
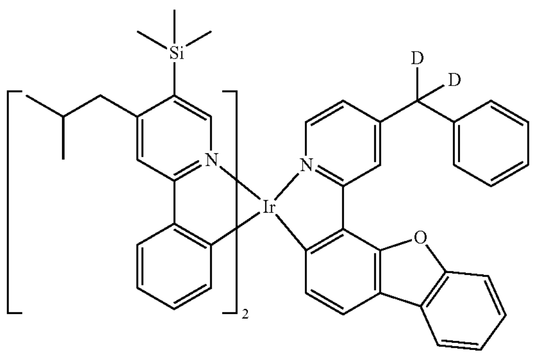
972
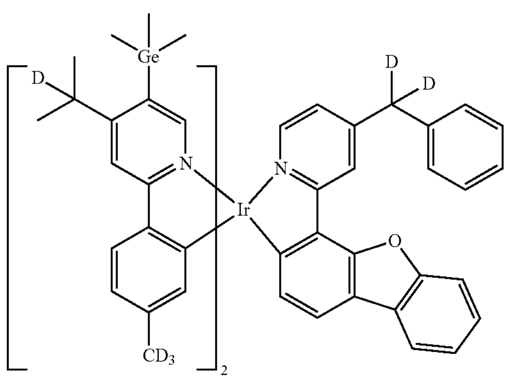
973
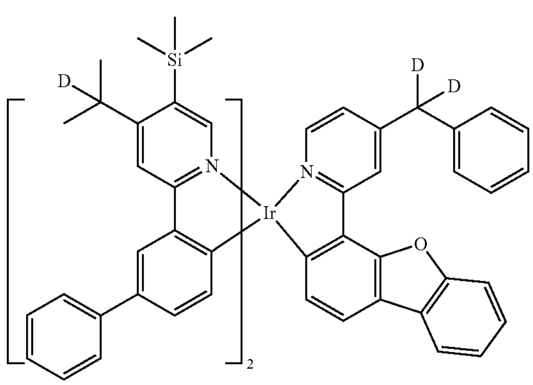
-continued
974
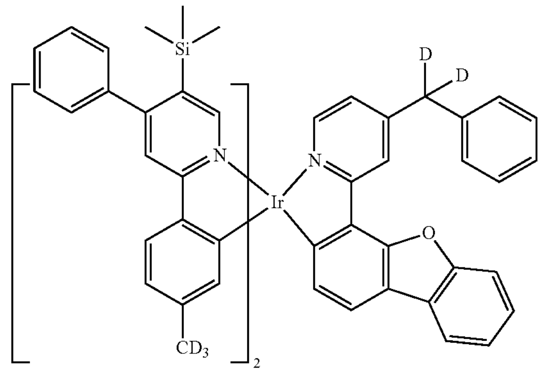
975
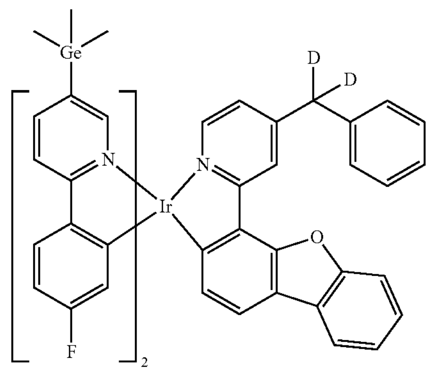
976
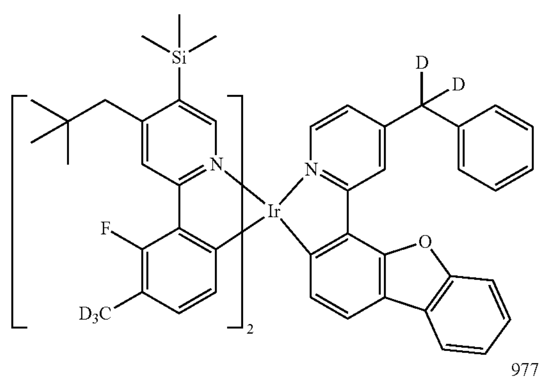
977
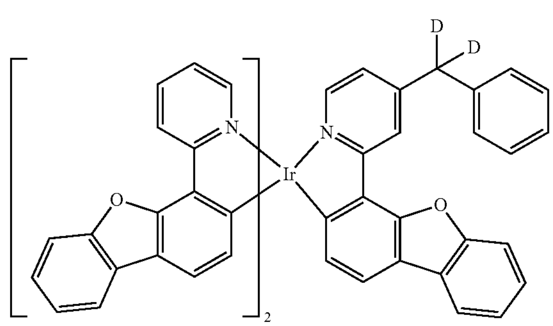

-continued
978
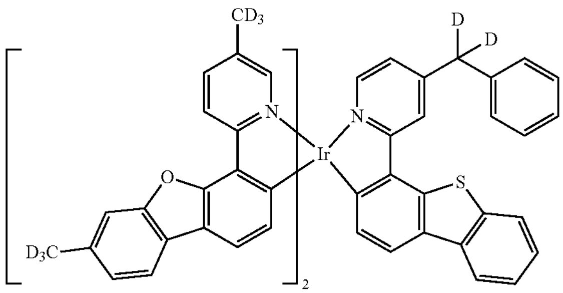
979
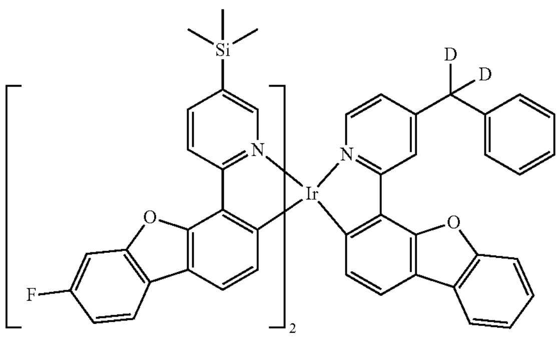
980
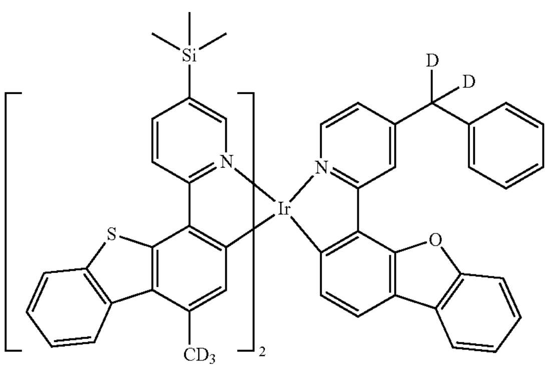
981
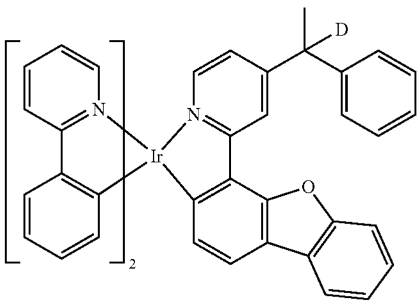
-continued
982
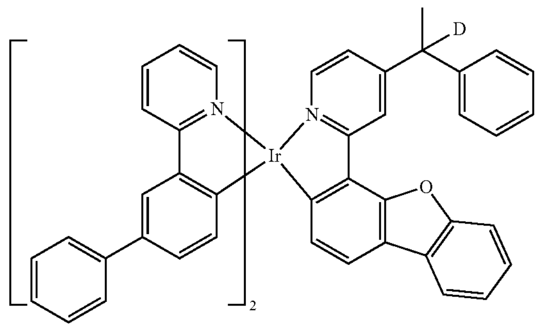
983
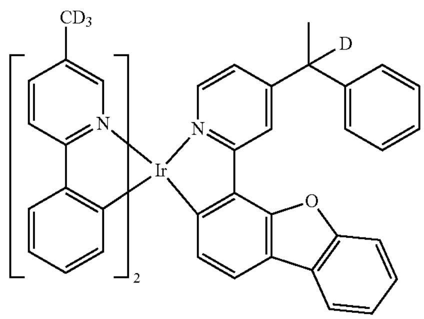
984
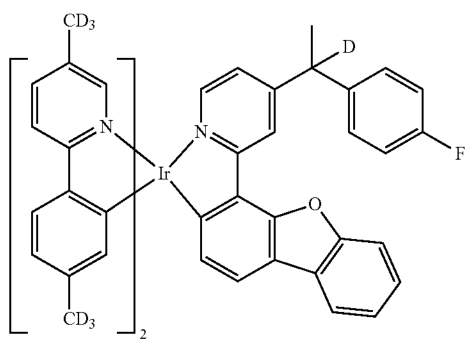
985
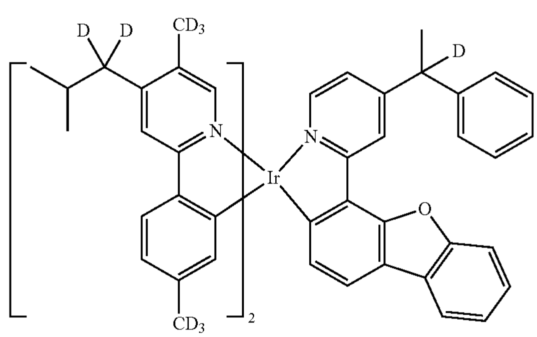

-continued
986
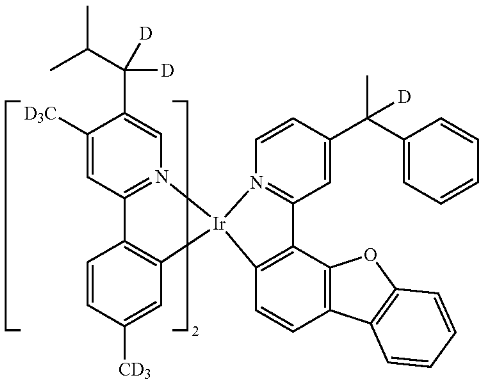
987
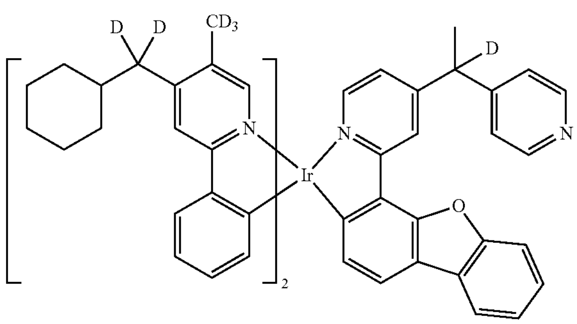
988
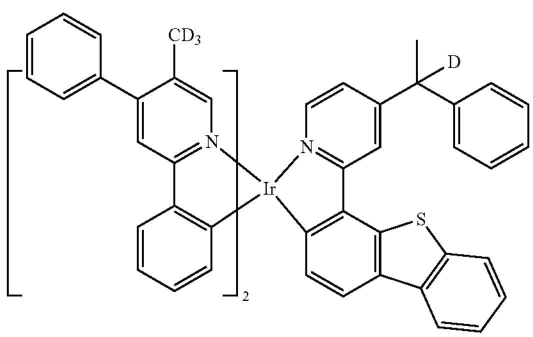
989
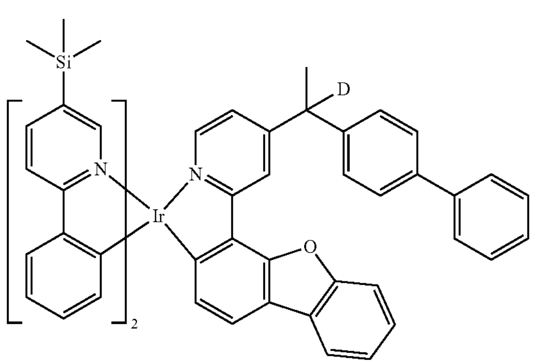
-continued
990
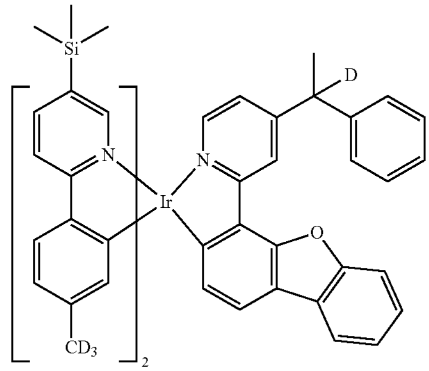
991
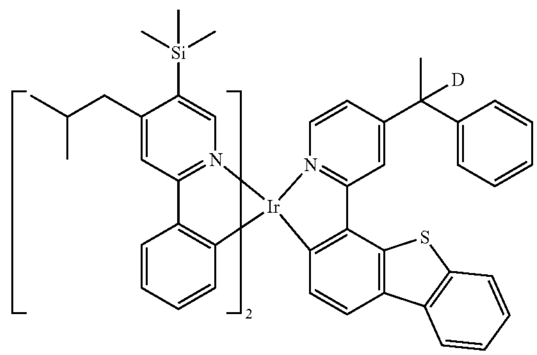
992
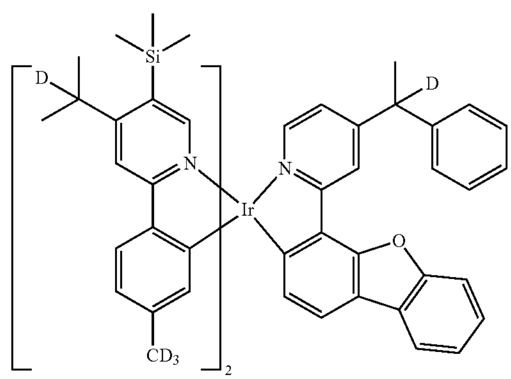
993
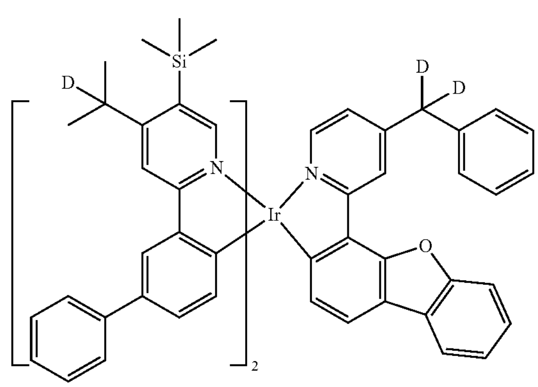

994
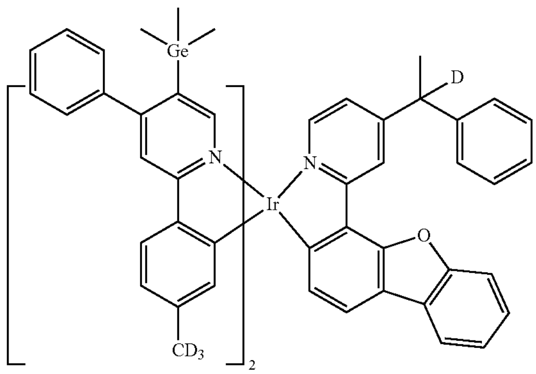
995
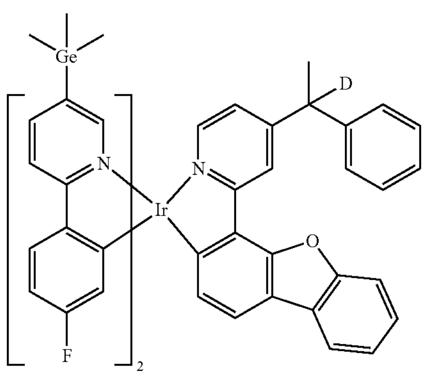
996
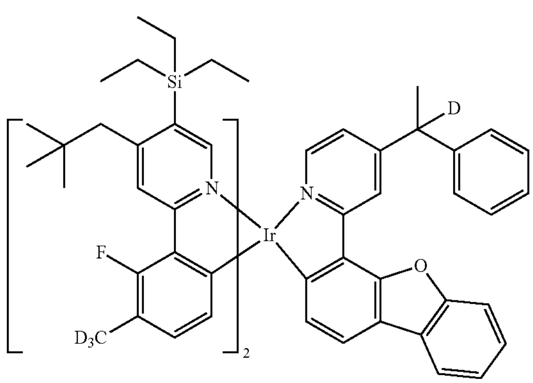
997
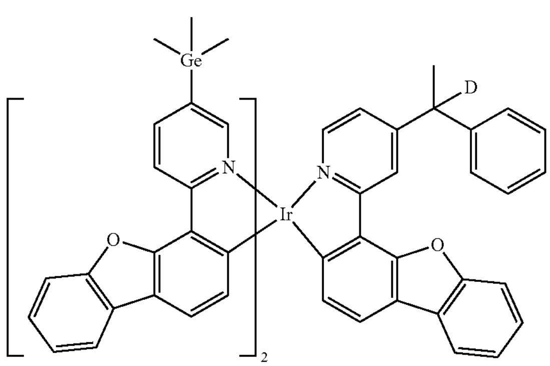
998
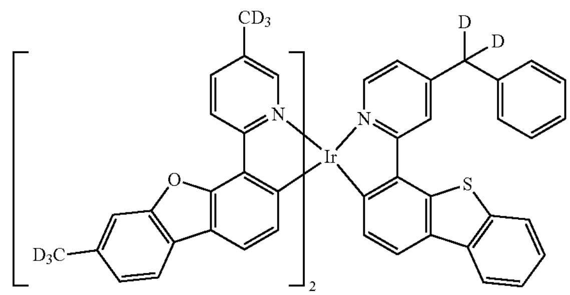
999
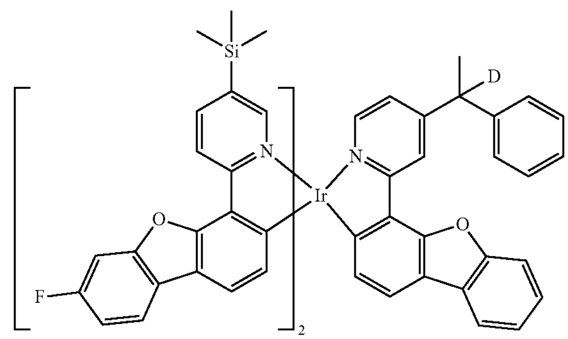
1000
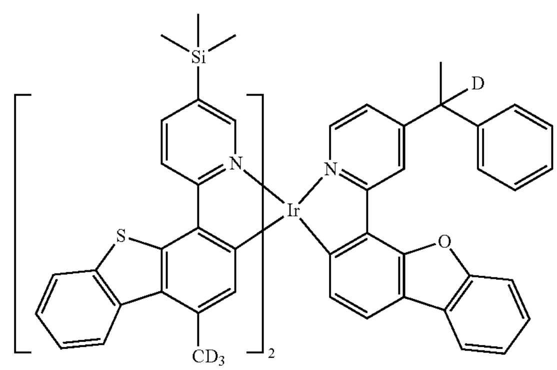
1001
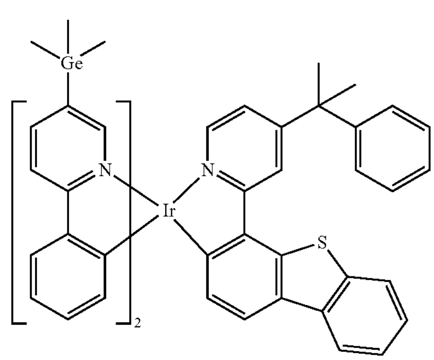

-continued
1002
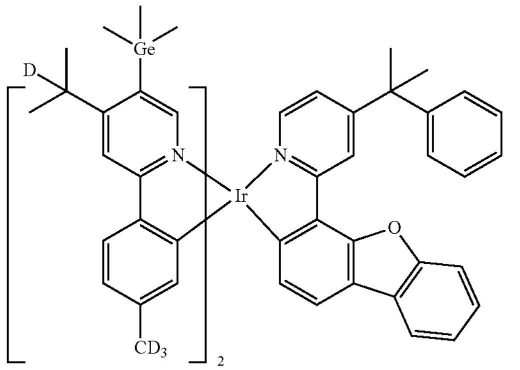
1003
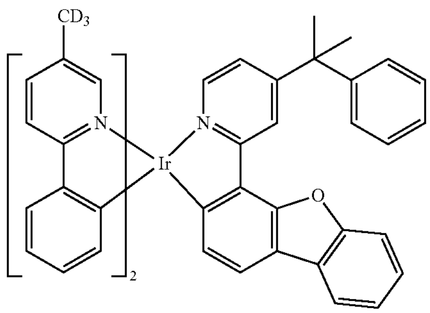
1004
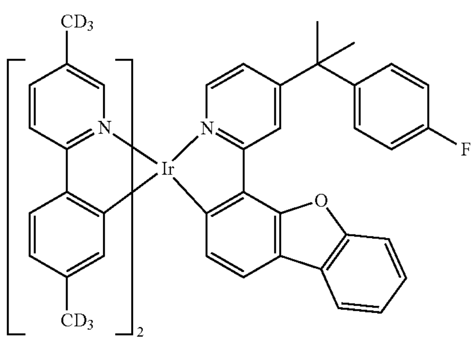
1005
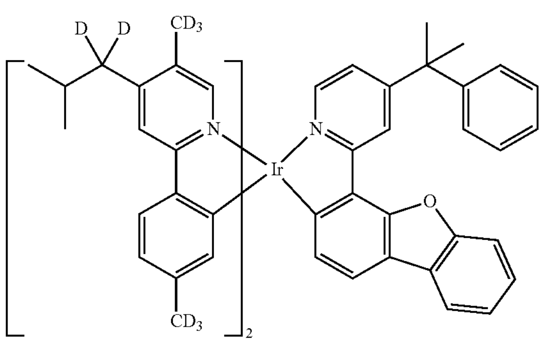
-continued
1006
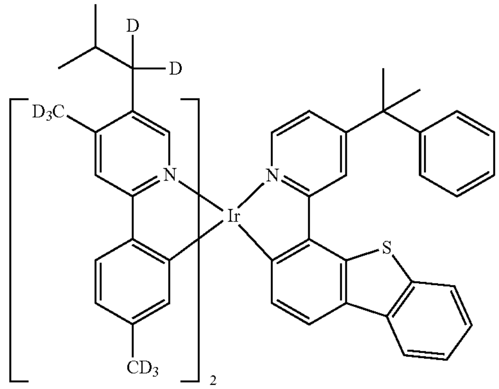
1007
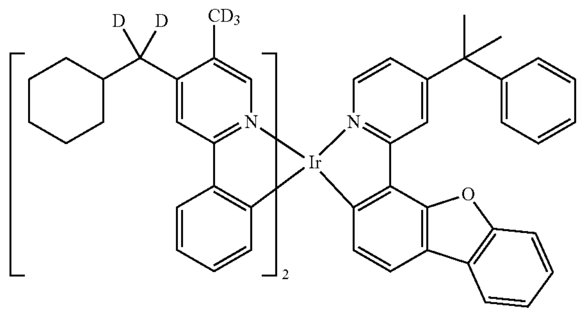
1008
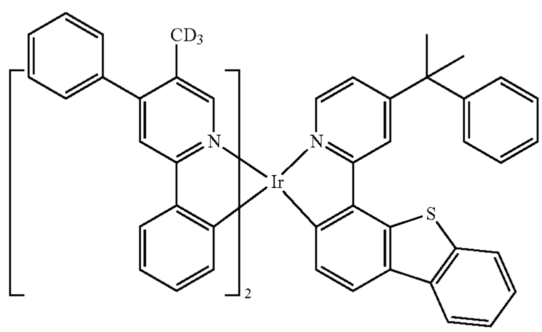
1009
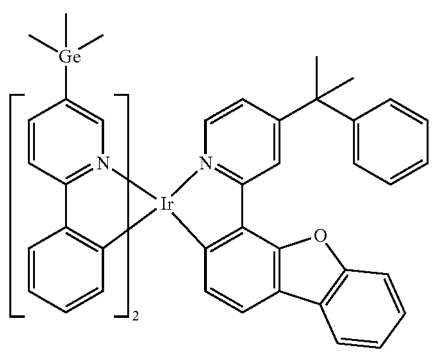

1010
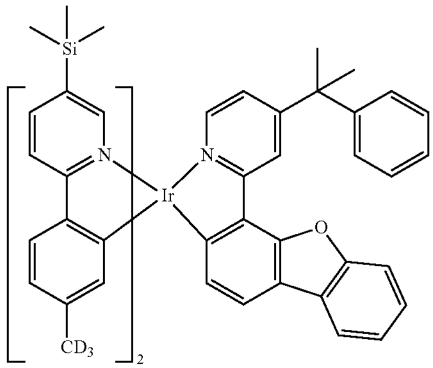
1011
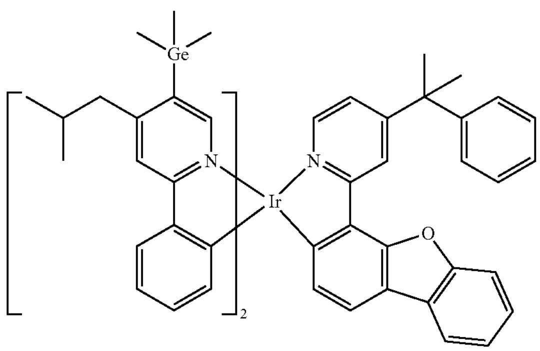
1012
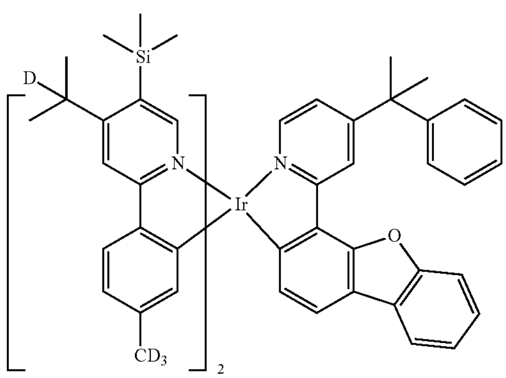
1013
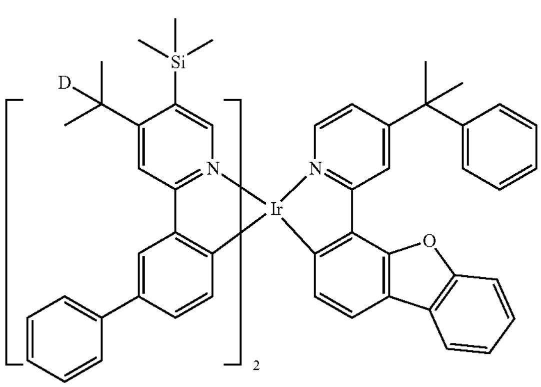
1014
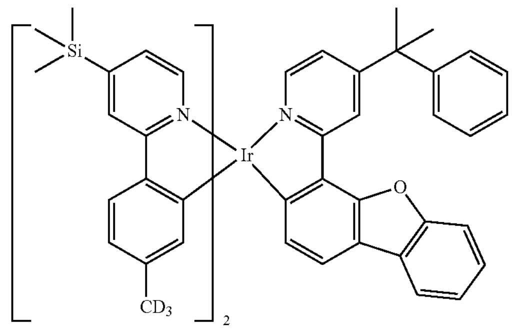
1015
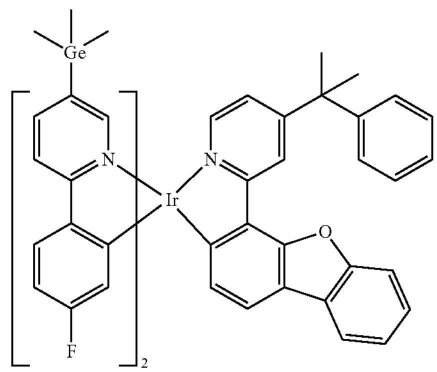
1016
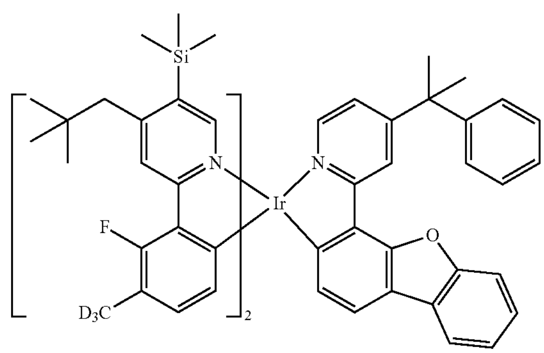
1017
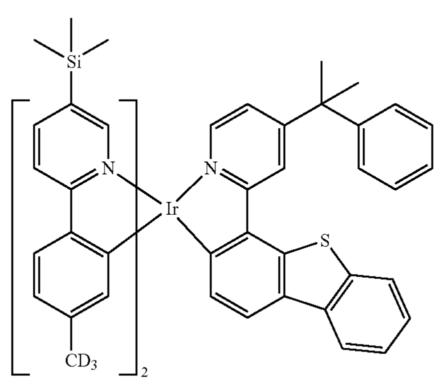

1018
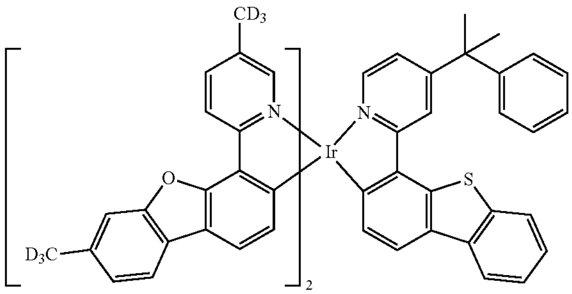
1019
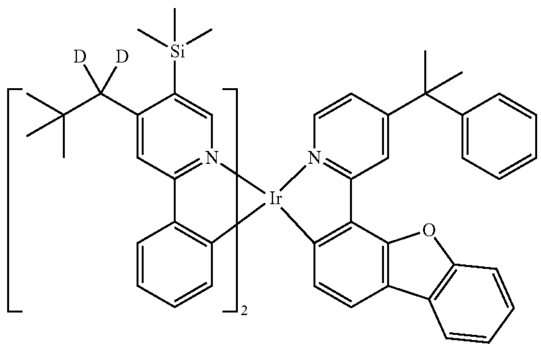
1020
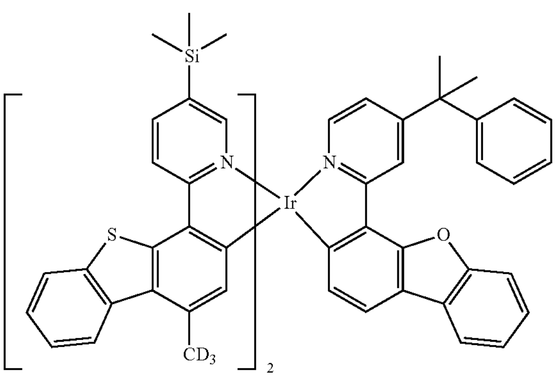
1021
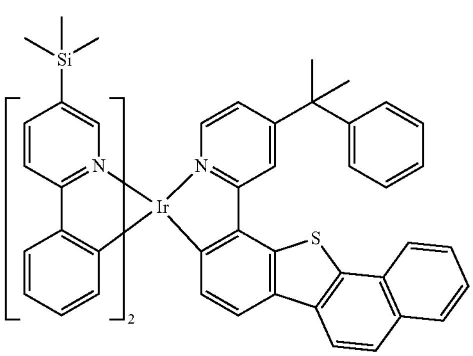
1022
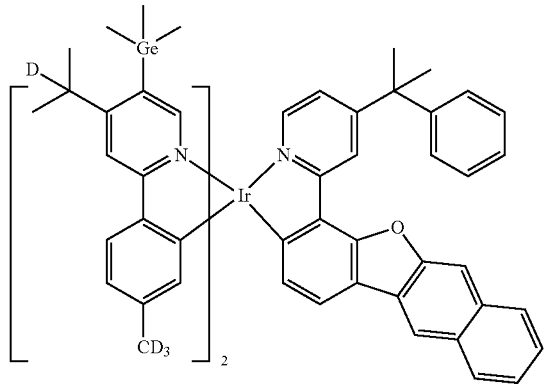
1023
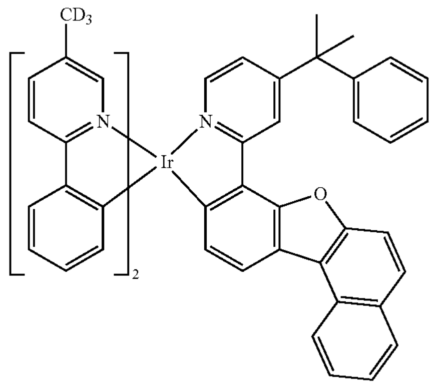
1024
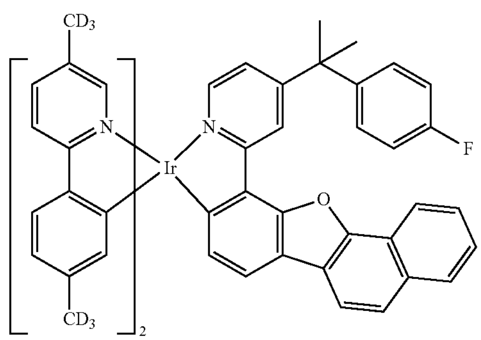
1025
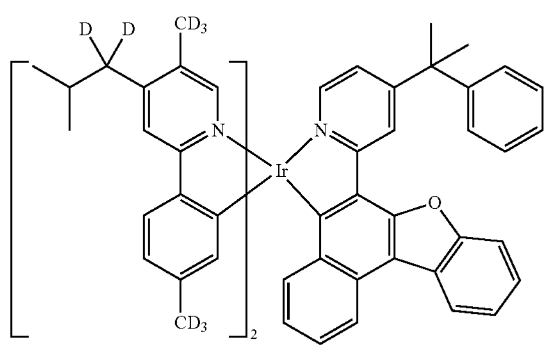

-continued
1026
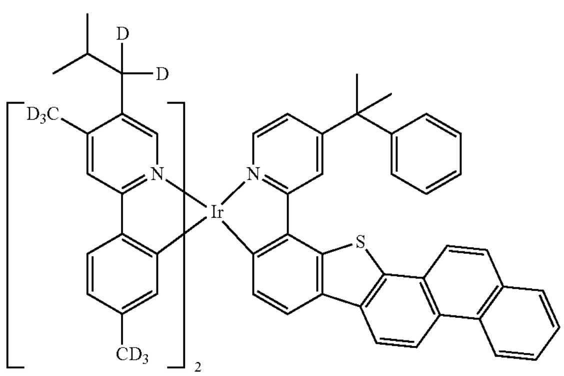
1027
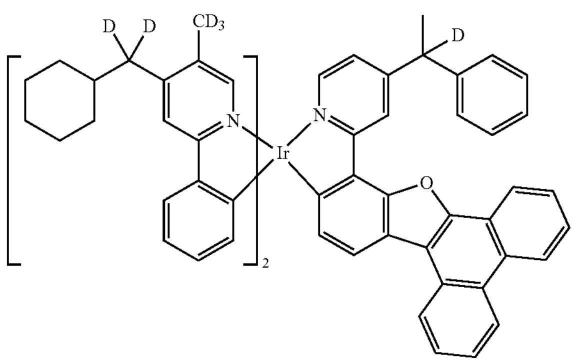
1028
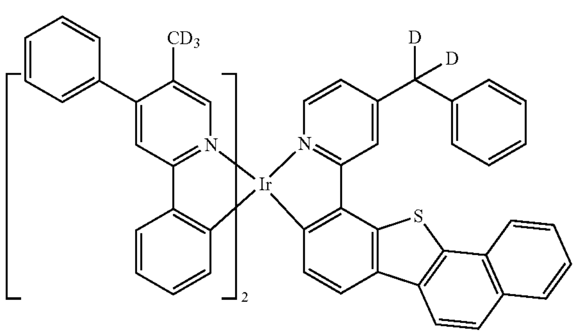
1029
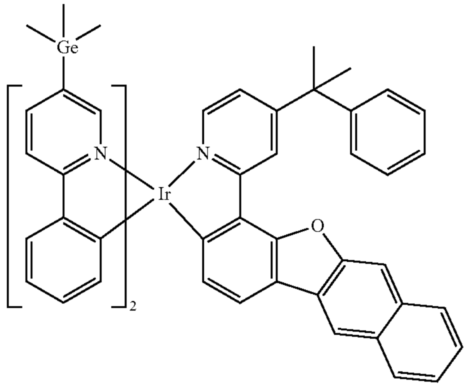
-continued
1030
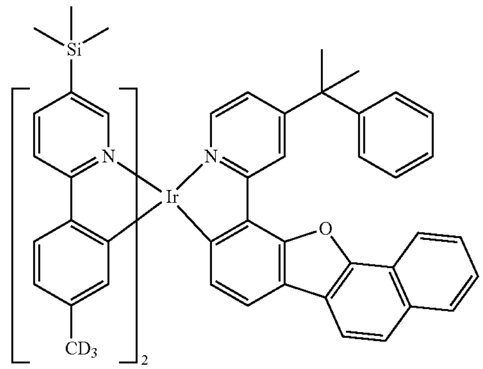
1031
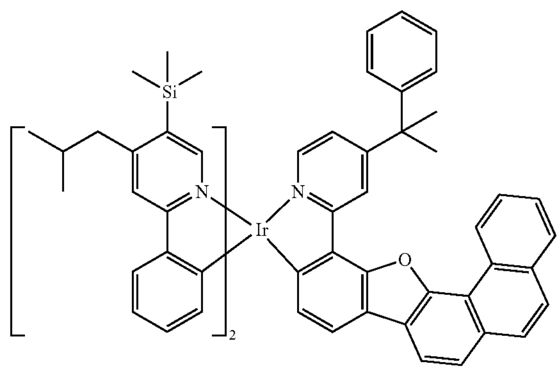
1032
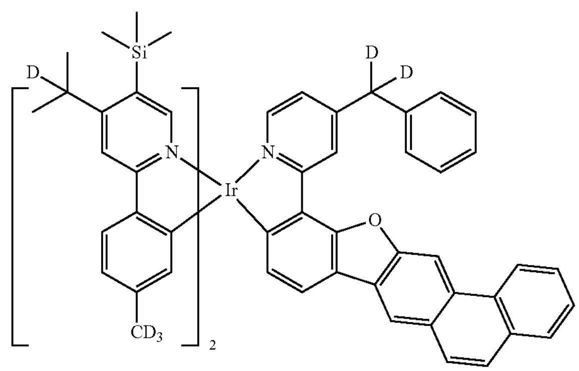
1033
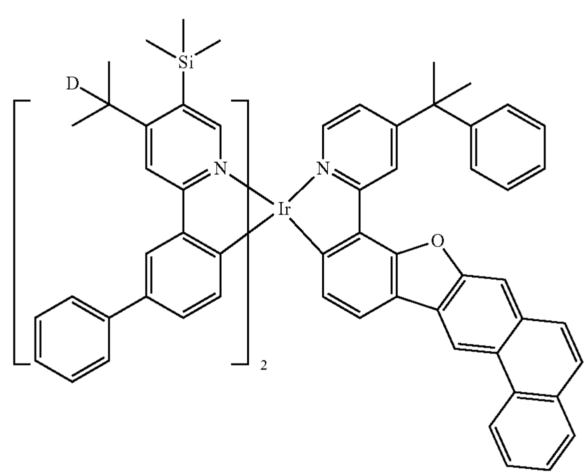

-continued
1034
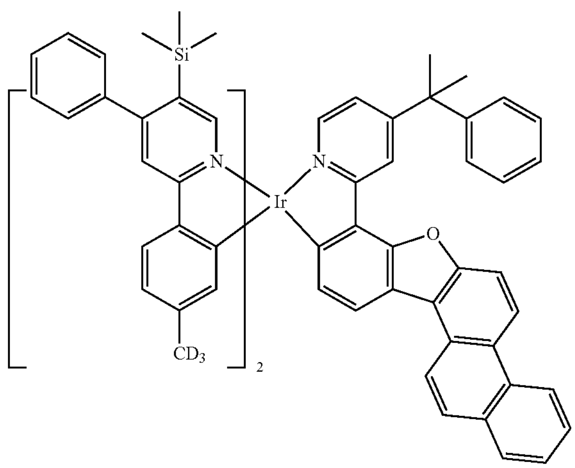
1035
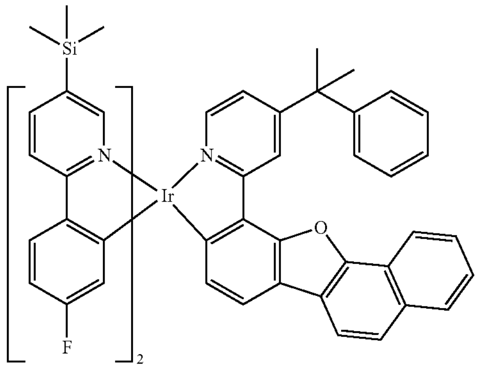
1036
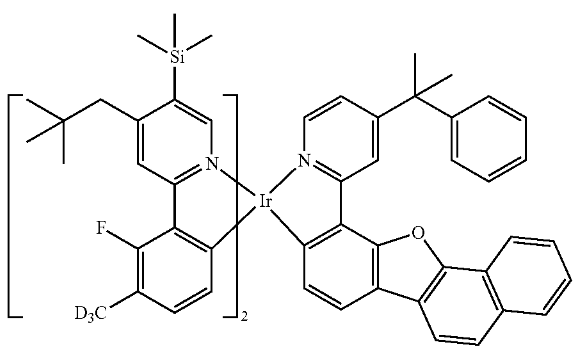
1037
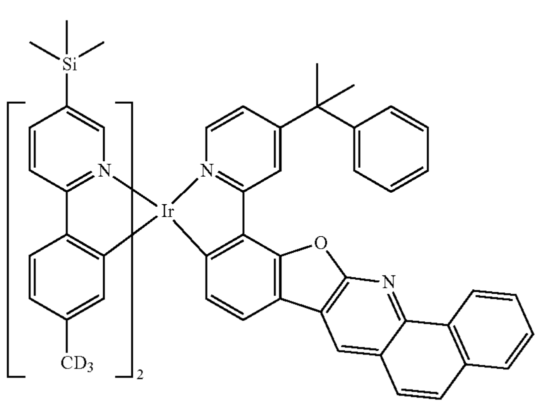
-continued
1038
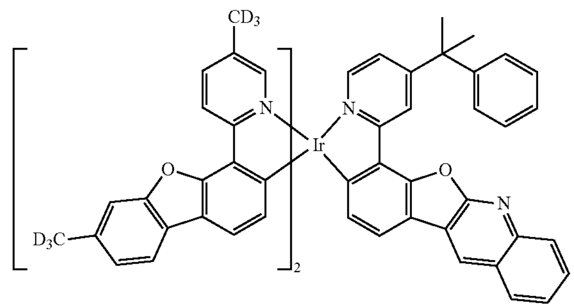
1039
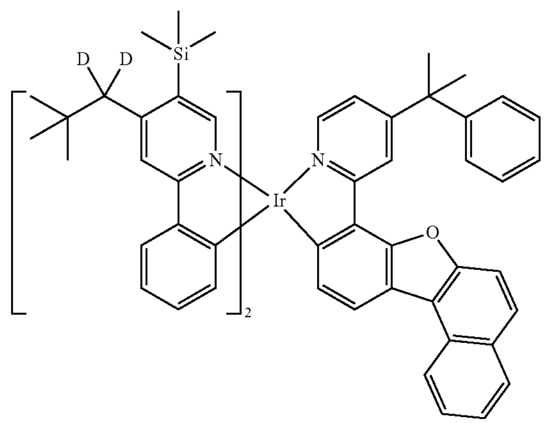
1040
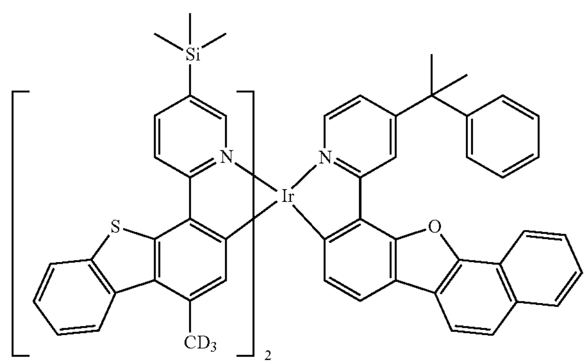
1041
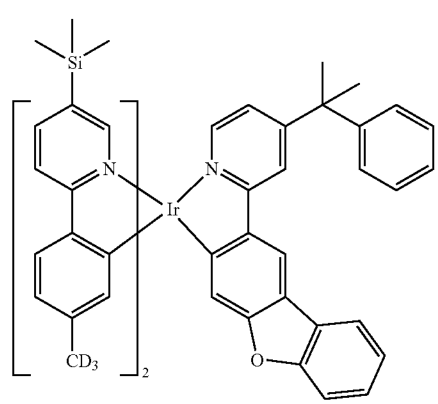

1042
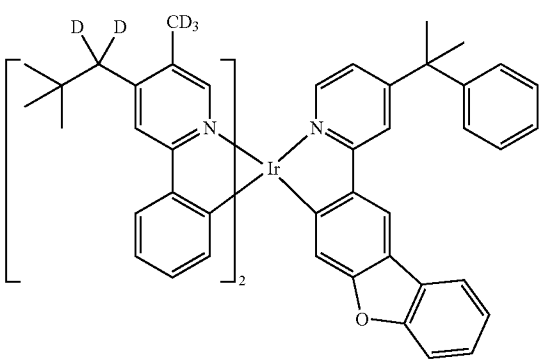
1043
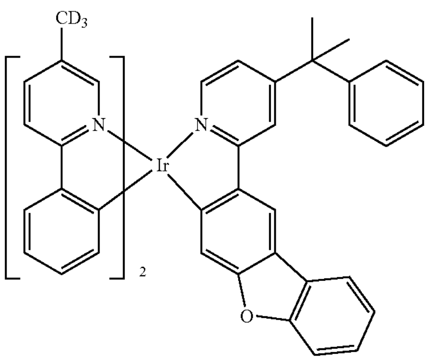
1044
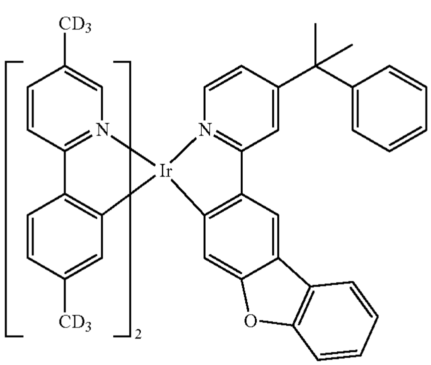
1045
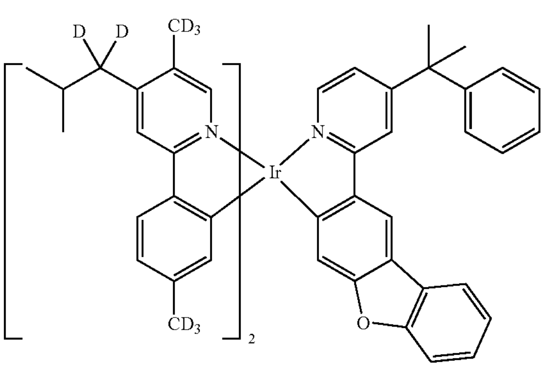
1046
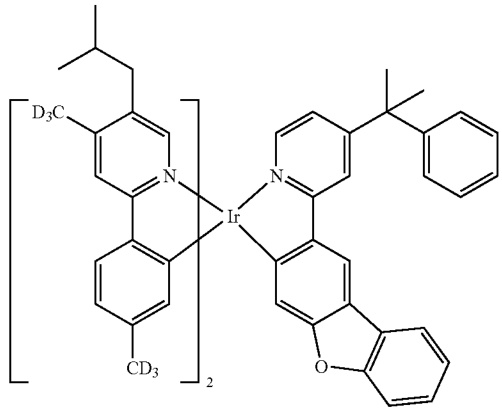
1047
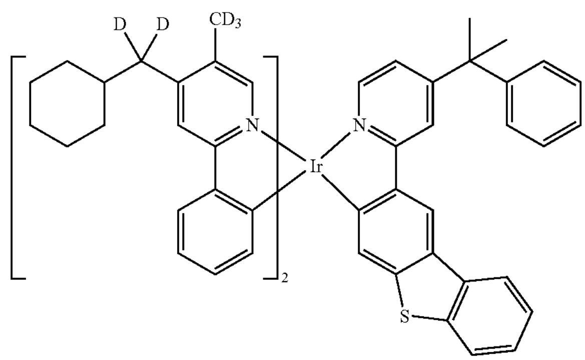
1048
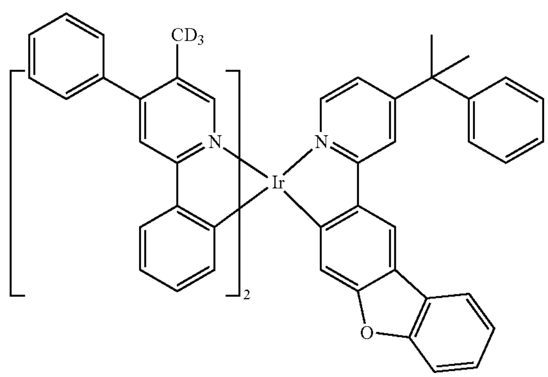
1049
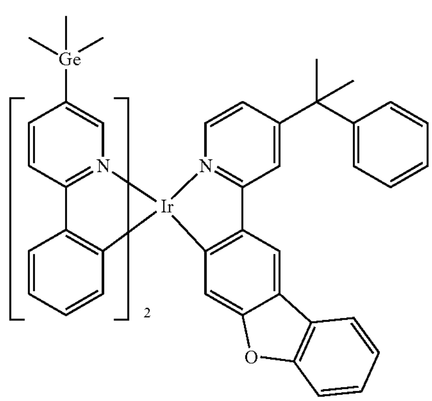

-continued
1050
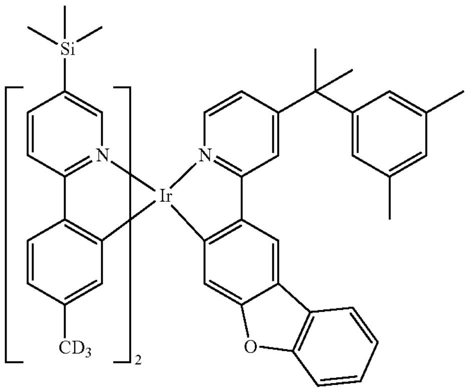
1051
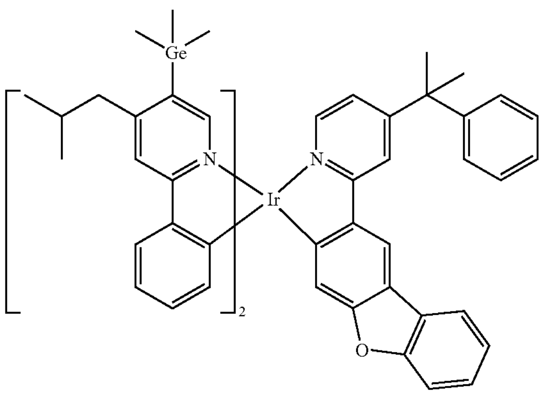
1052
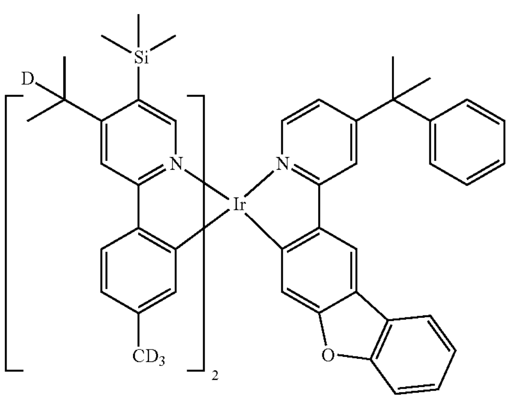
1053
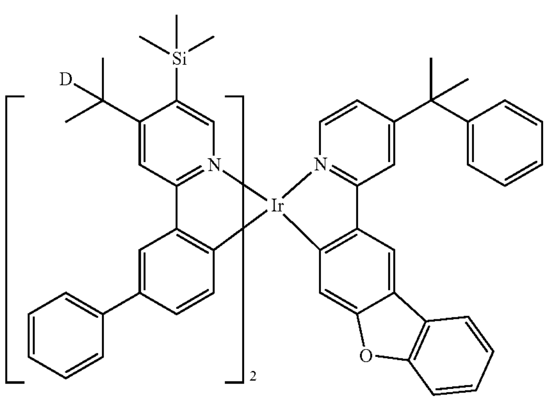
-continued
1054
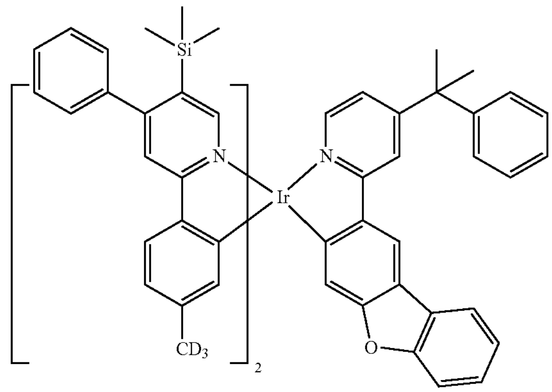
1055
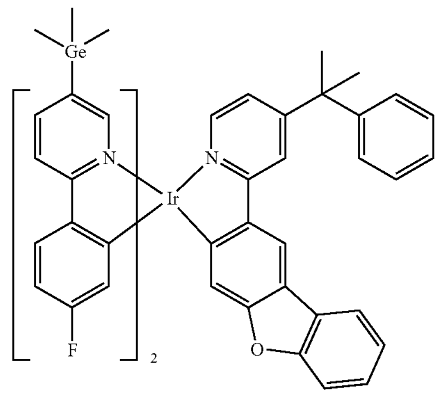
1056
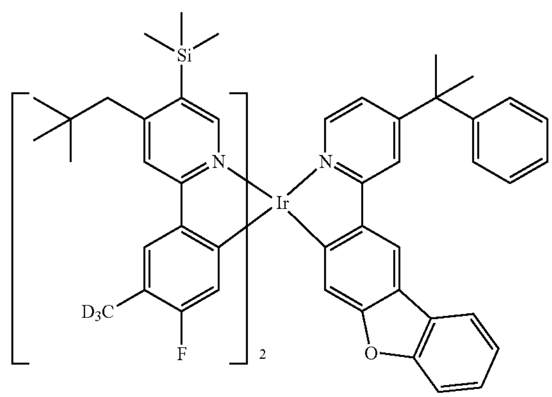
1057
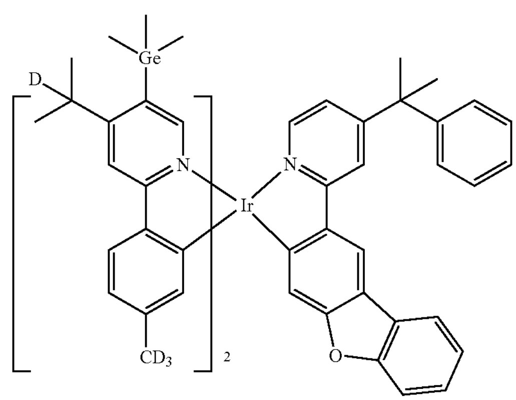

-continued
1058
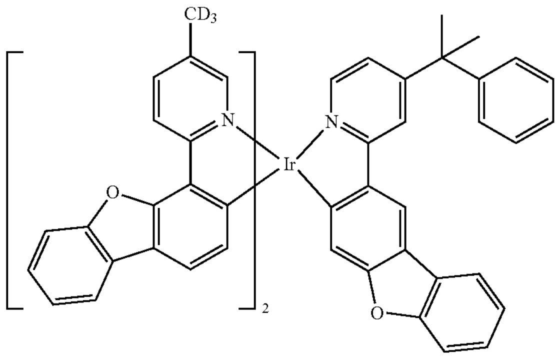
1059
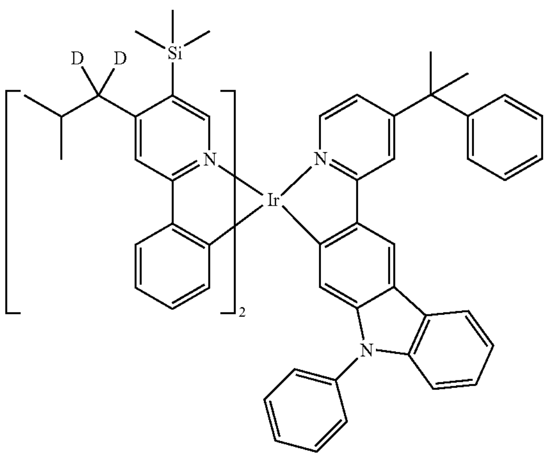
1060
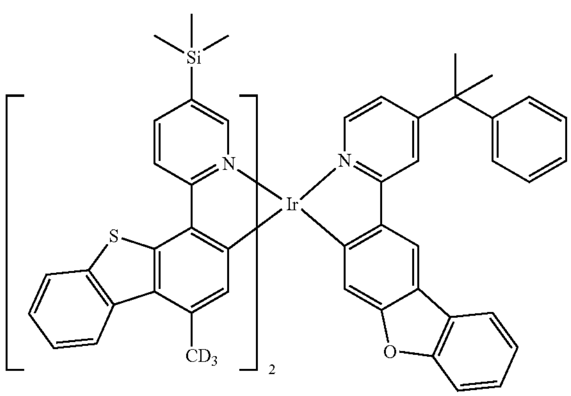
1061
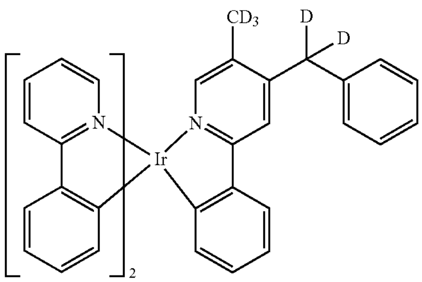
-continued
1062
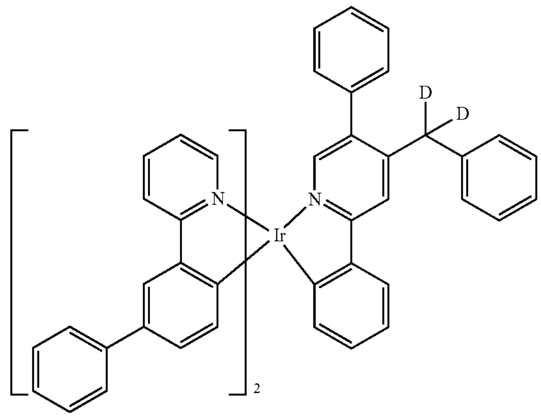
1063
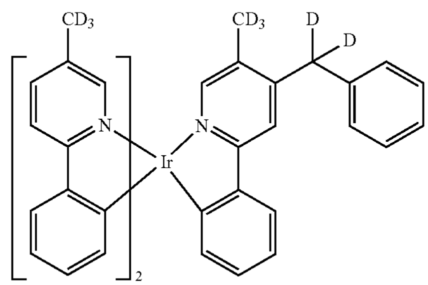
1064
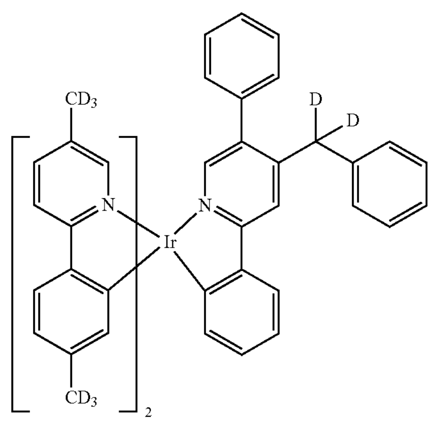
1065
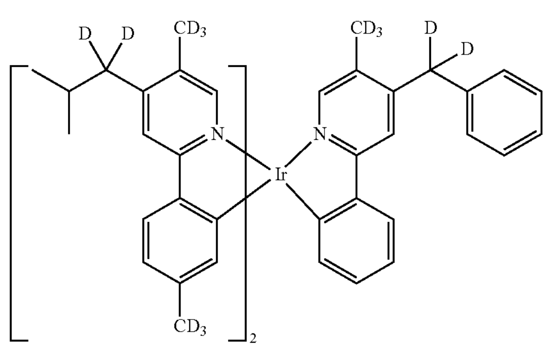

1066
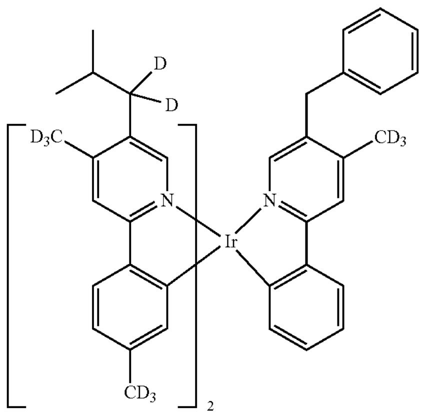
1067
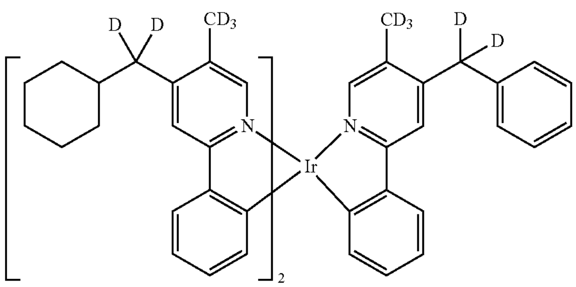
1068
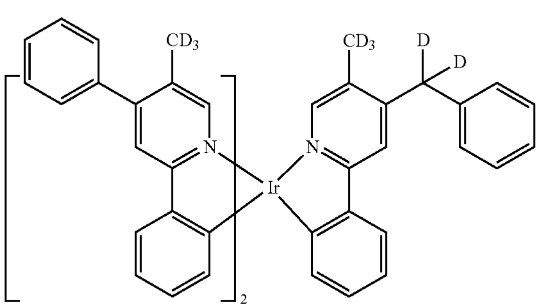
1069
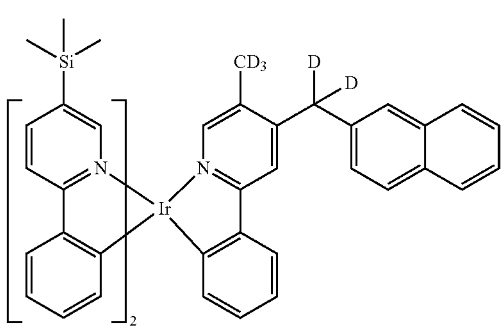
1070
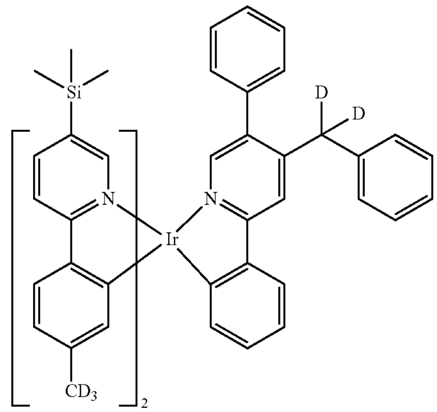
1071
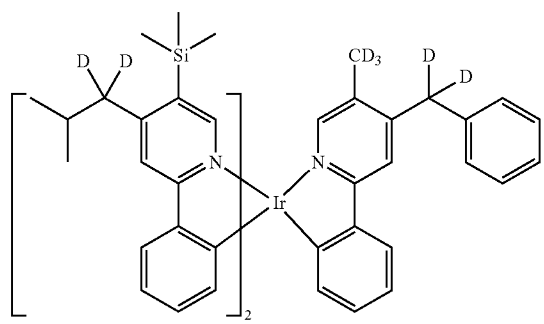
1072
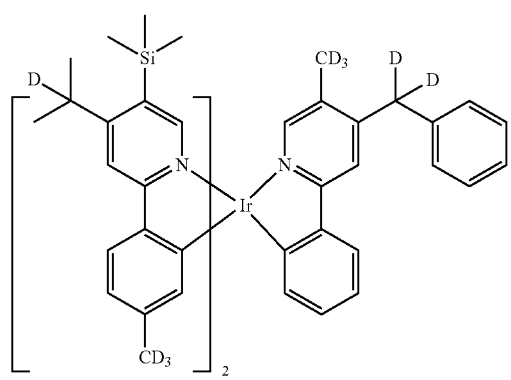
1073
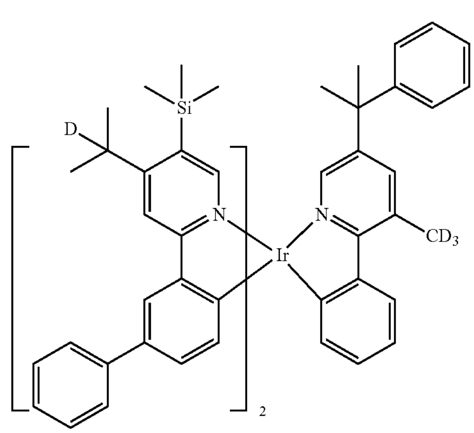

1074
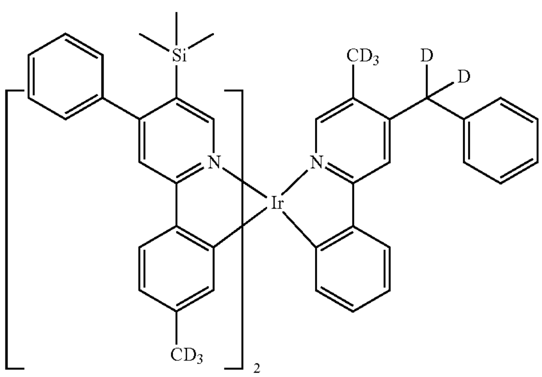
1075
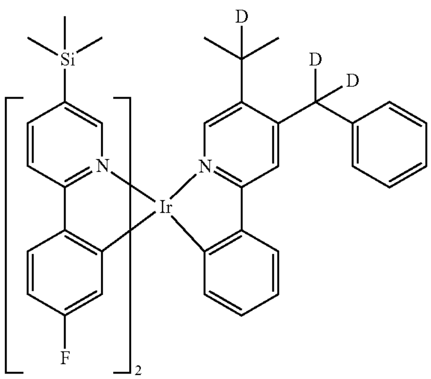
1076
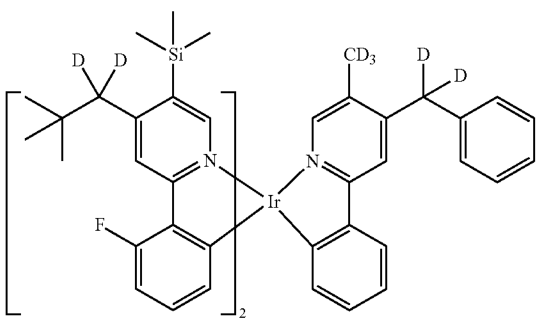
1077
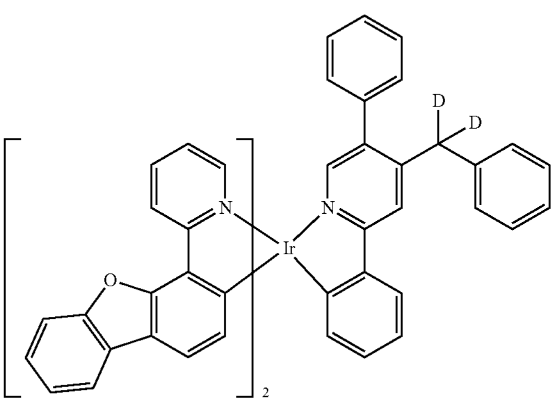
1078
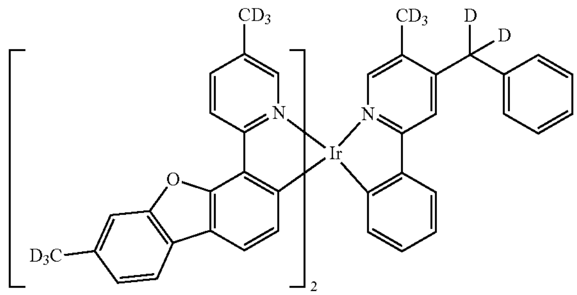
1079
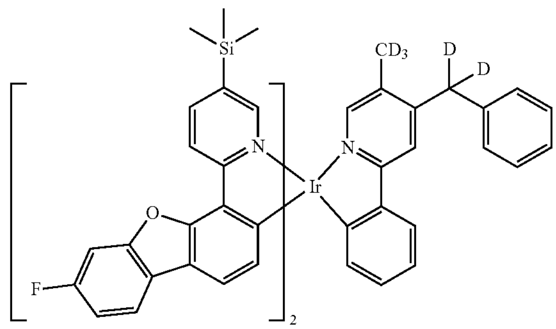
1080
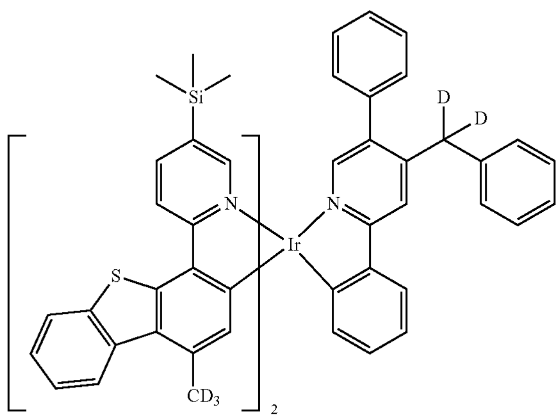
1081
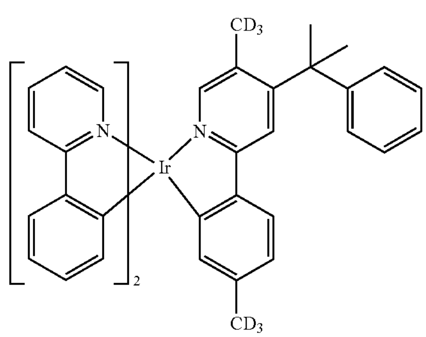

-continued
1082
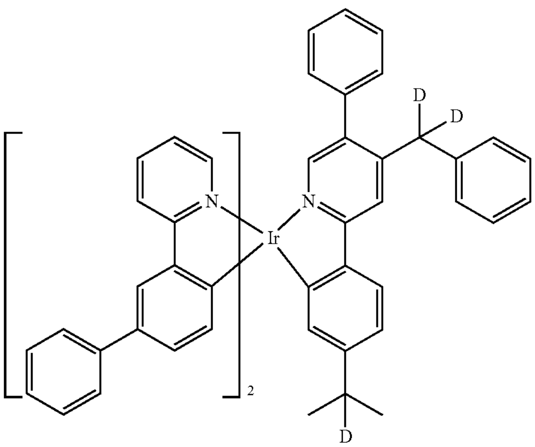
1083
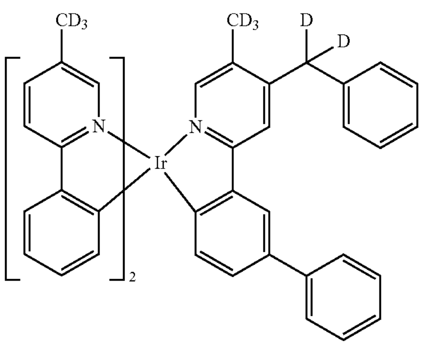
1084
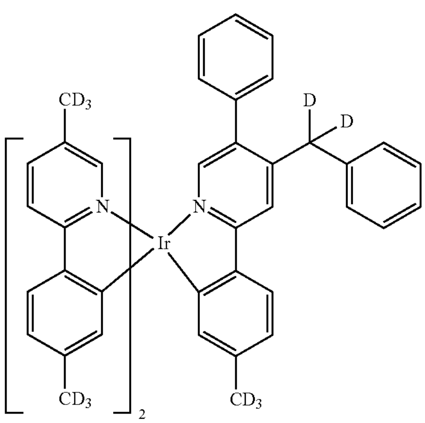
1085
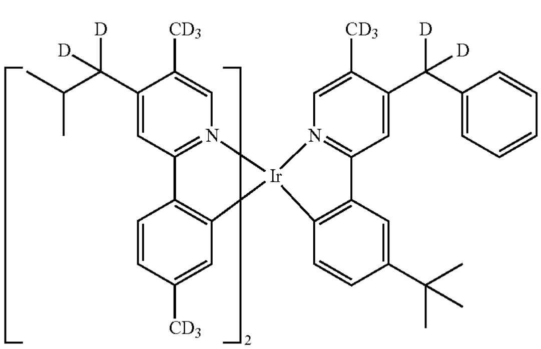
-continued
1086
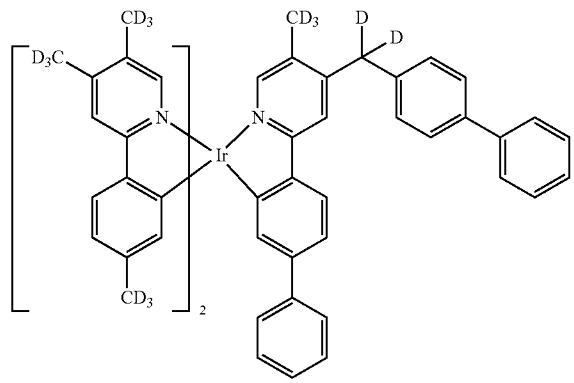
1087
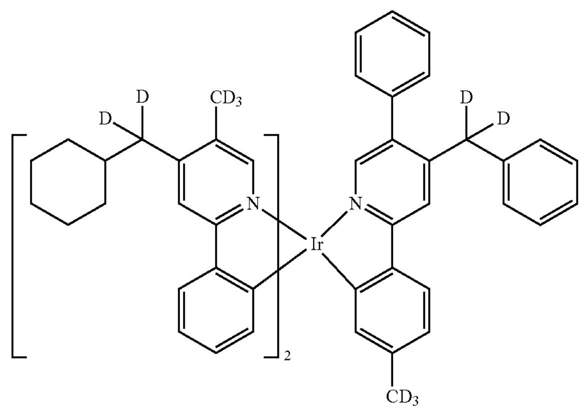
1088
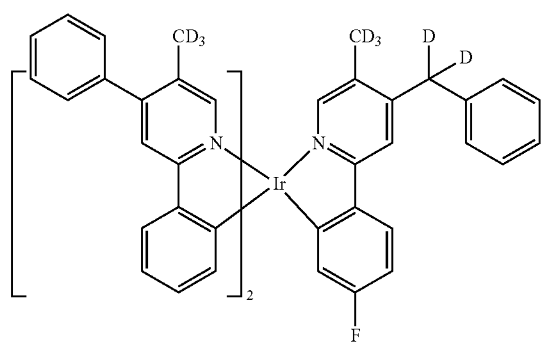
1089
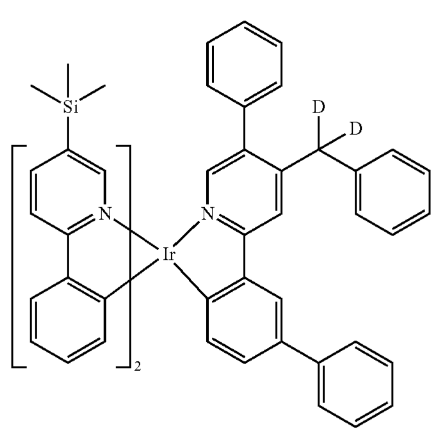

1090
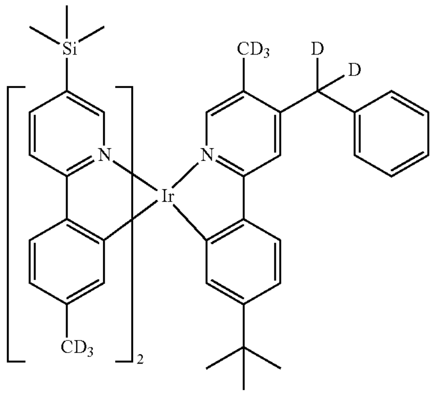
1091
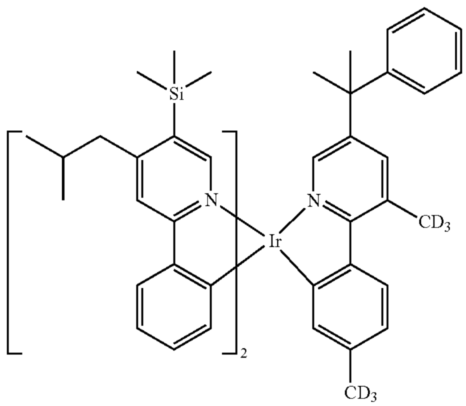
1092
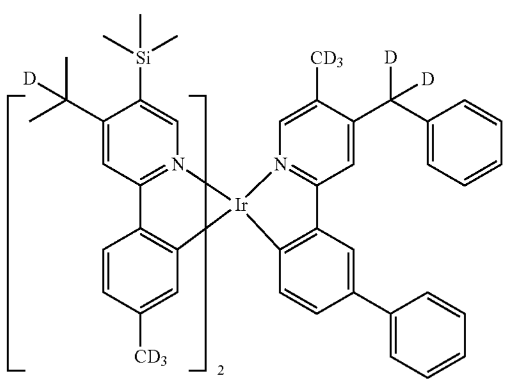
1093
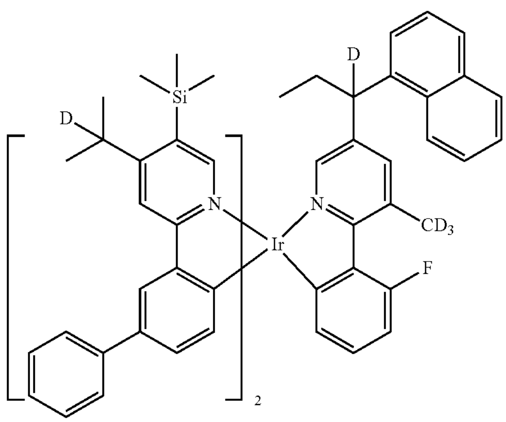
1094
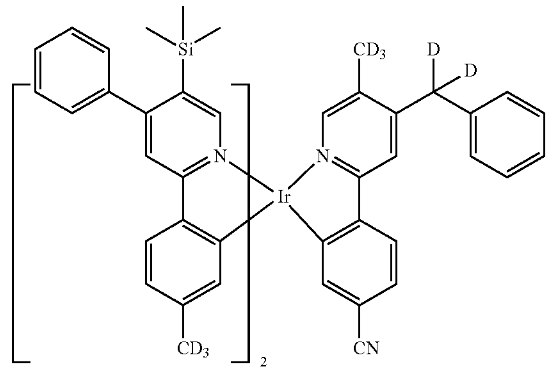
1095
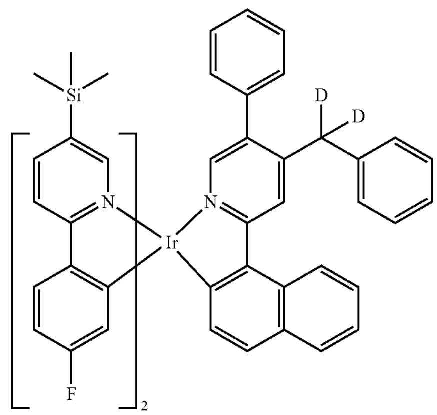
1096
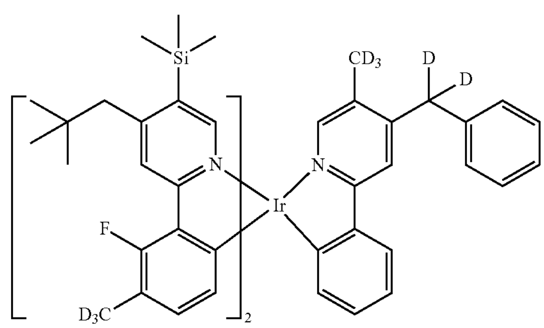
1097
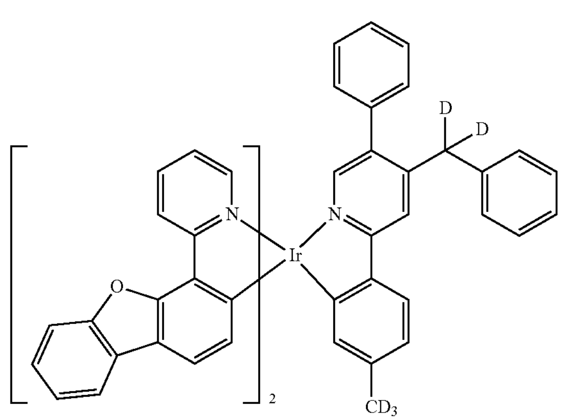

1098
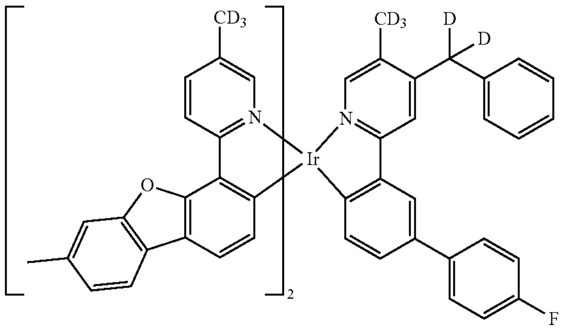
1099
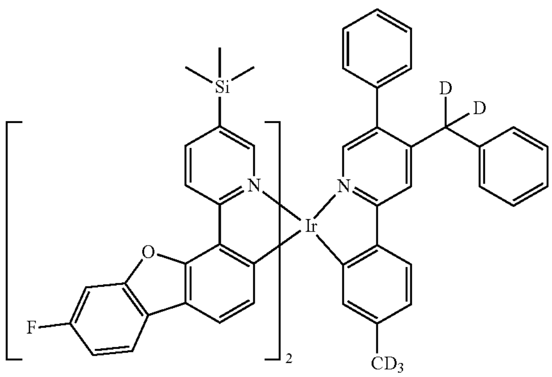
1100
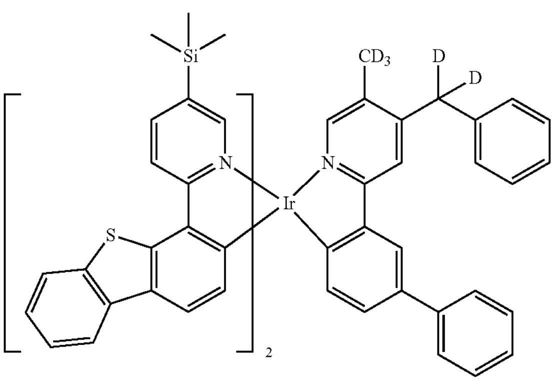
1101
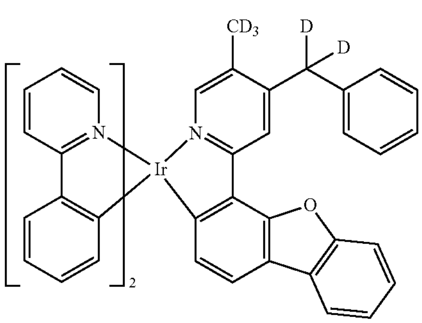
1102
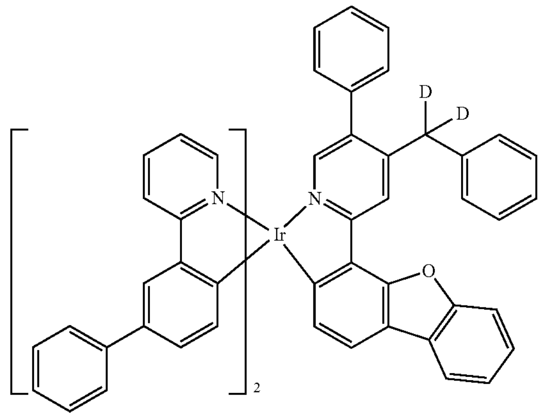
1103
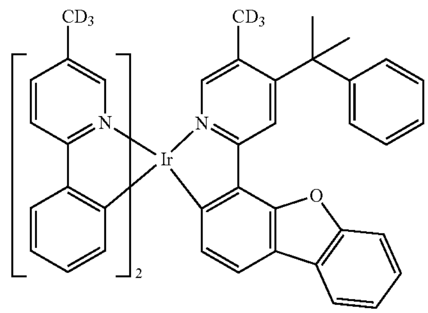
1104
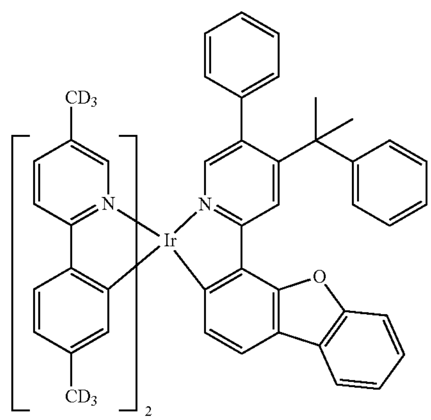
1105
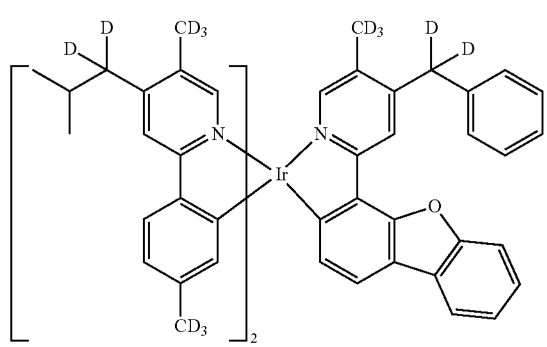

-continued
1106
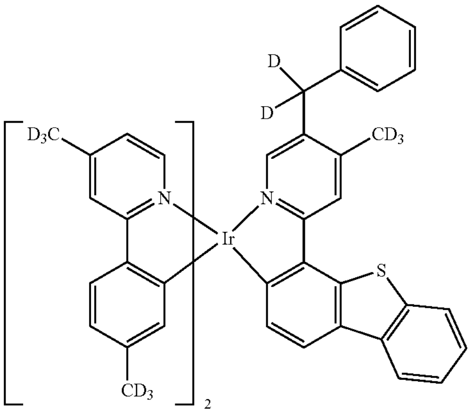
1107
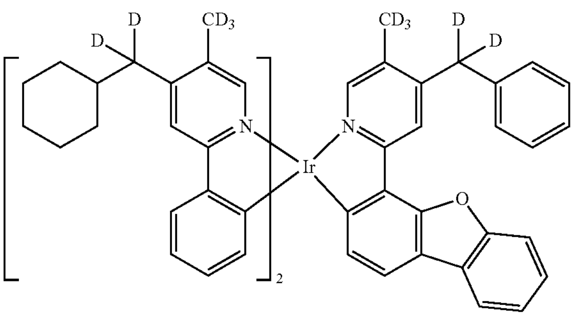
1108
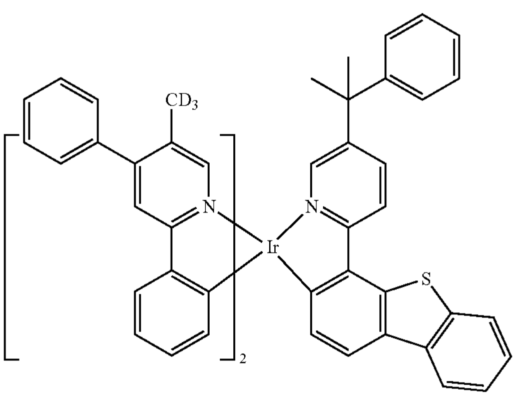
1109
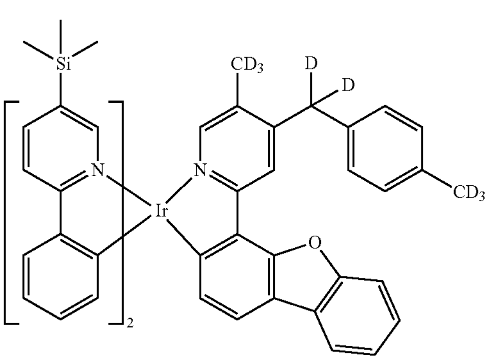
-continued
1110
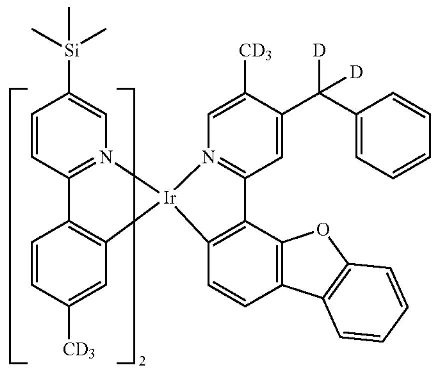
1111
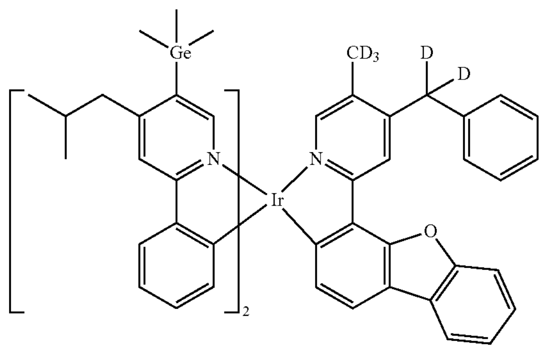
1112
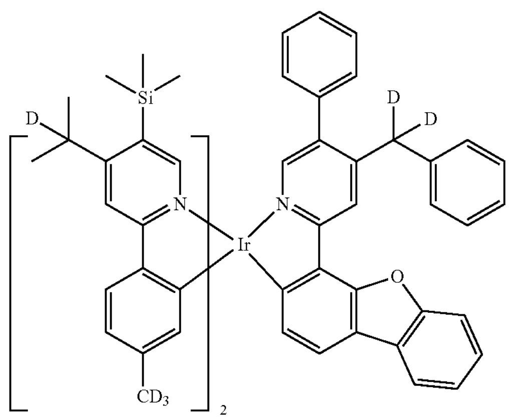
1113
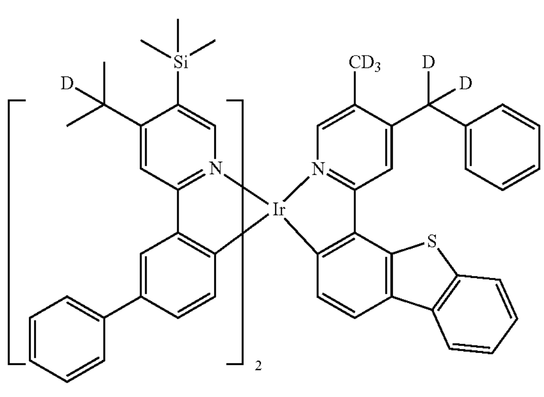

1114
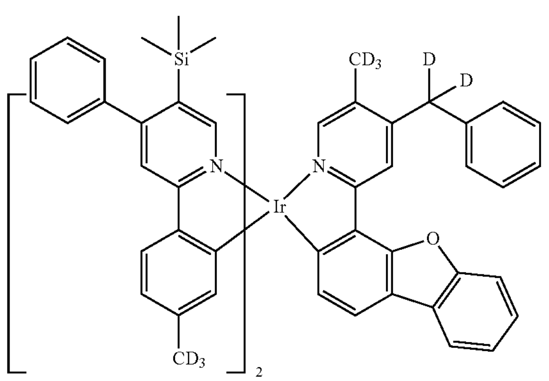
1115
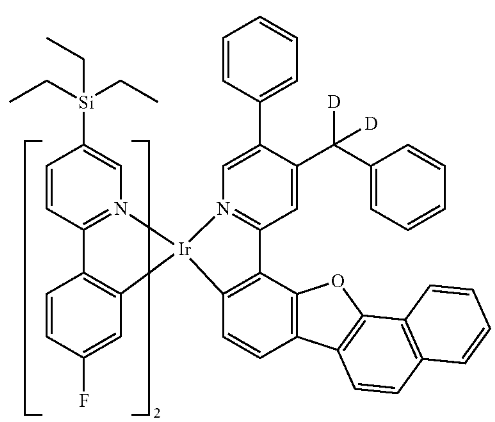
1116
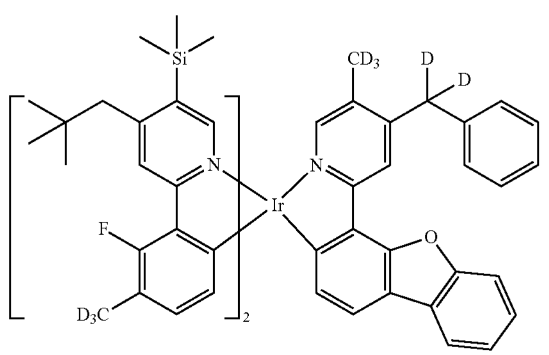
1117
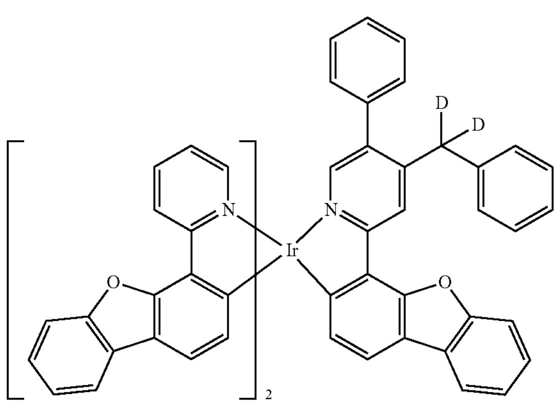
1118
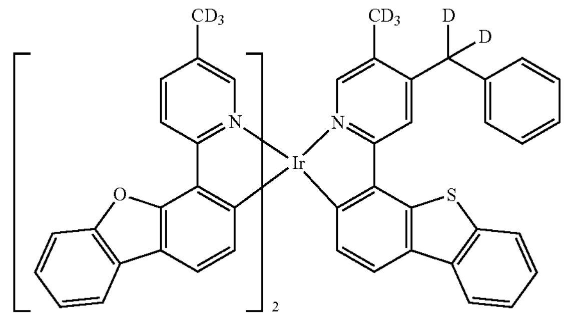
1119
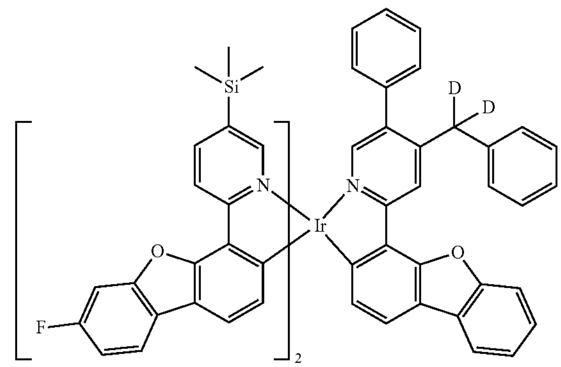
1120
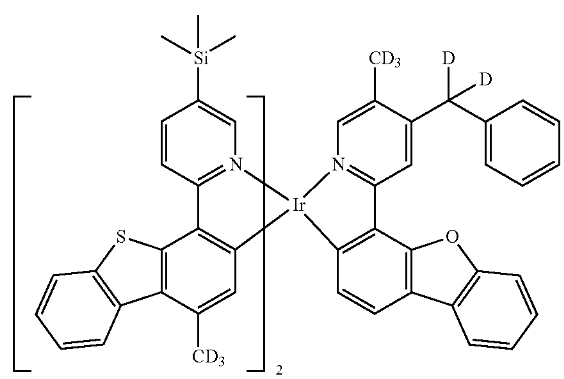
1121
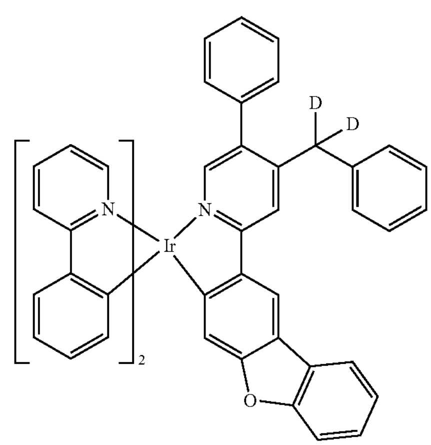

-continued
1122
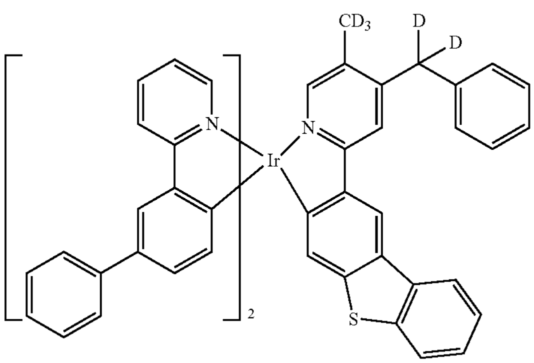
1123
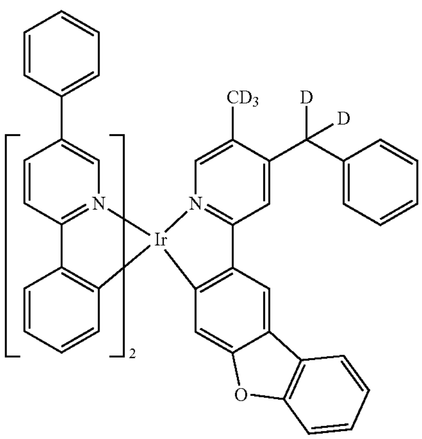
1124
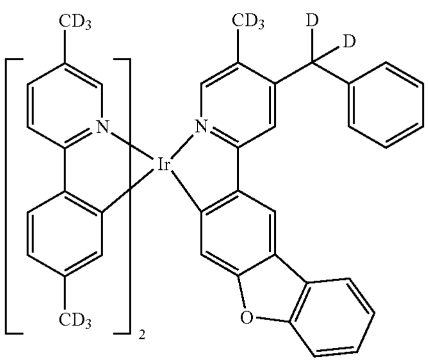
1125
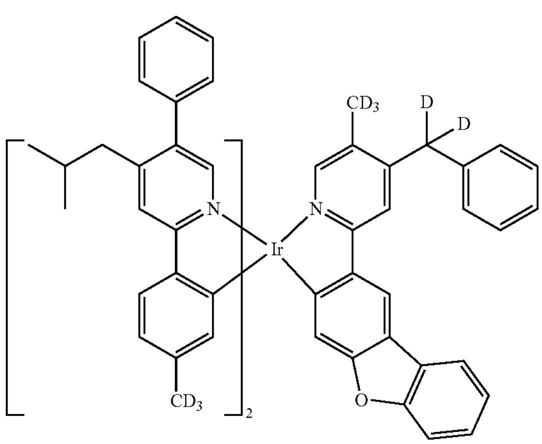
-continued
1126
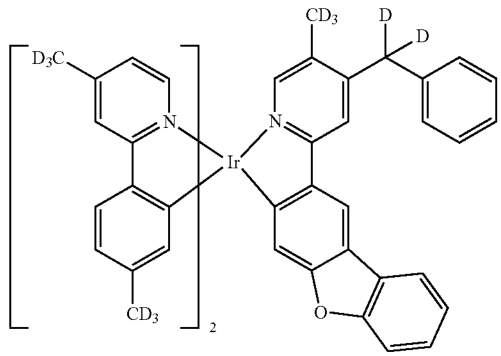
1127
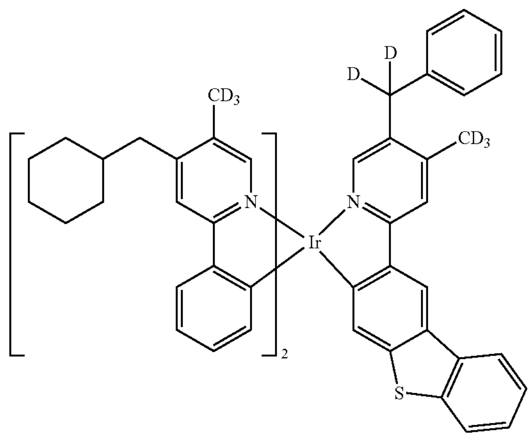
1128
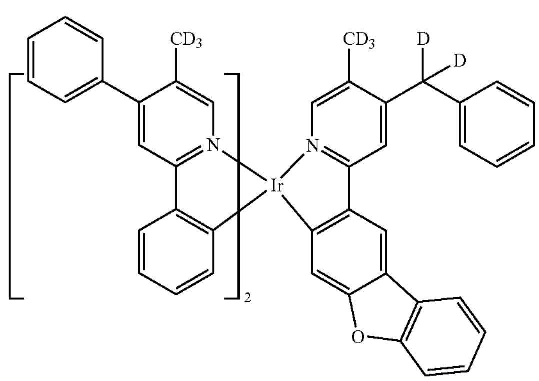
1129
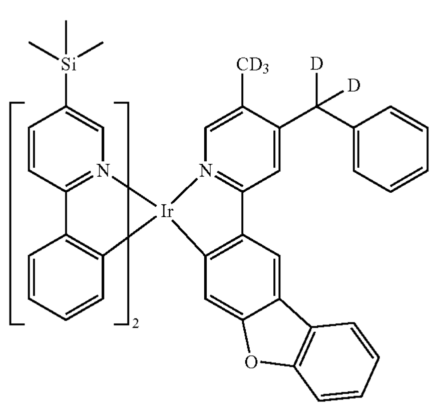

-continued
1130
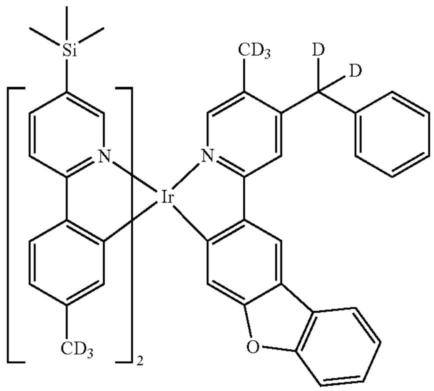
1131
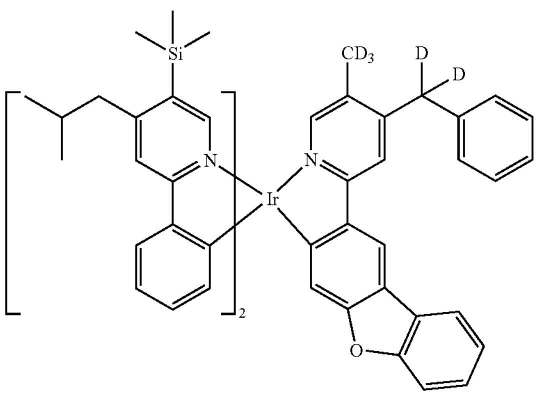
1132
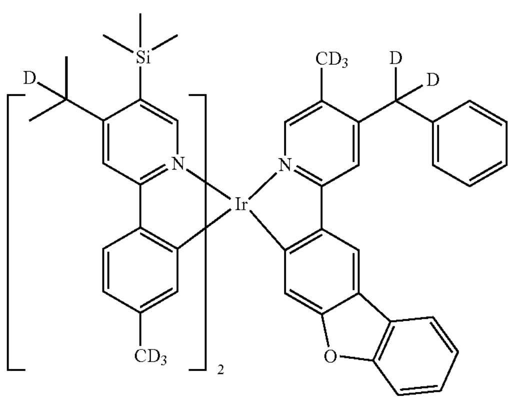
1133
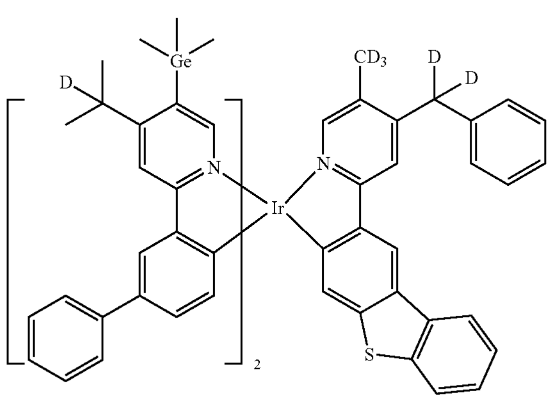
-continued
1134
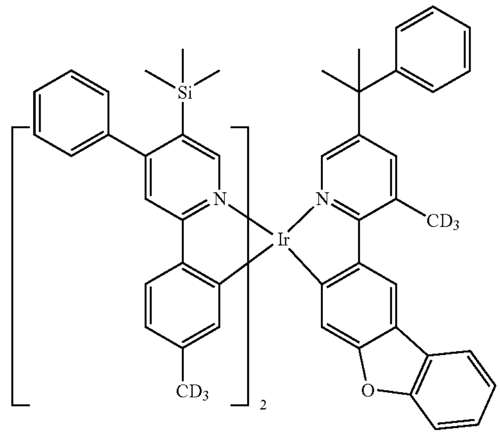
1135
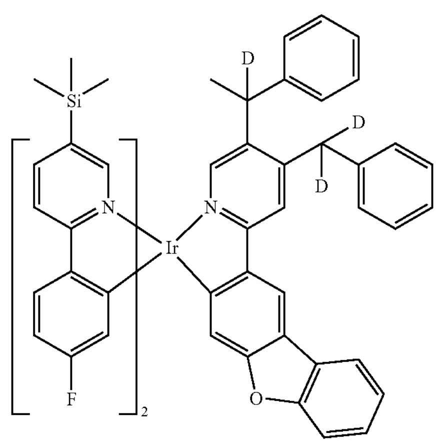
1136
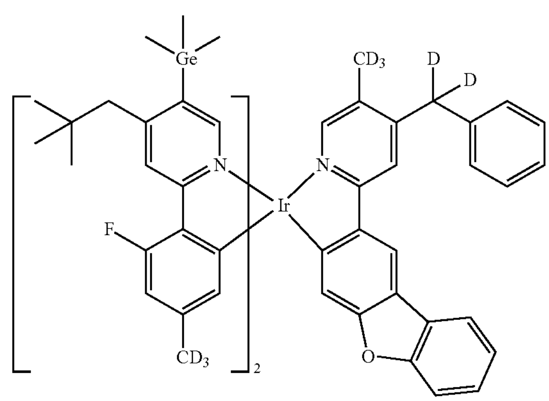

1137
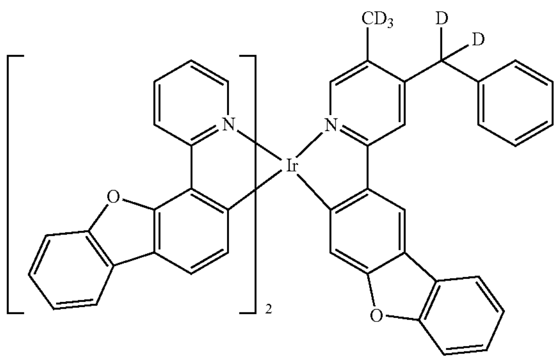
1138
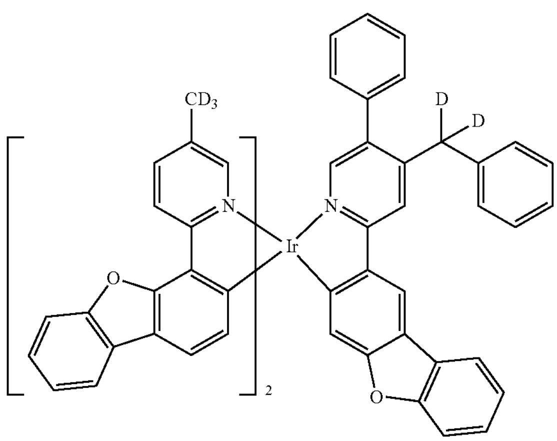
1139
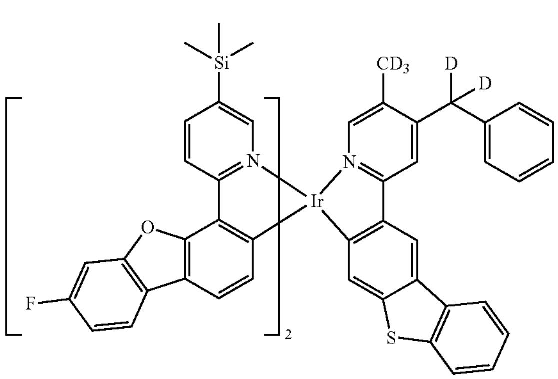
1140
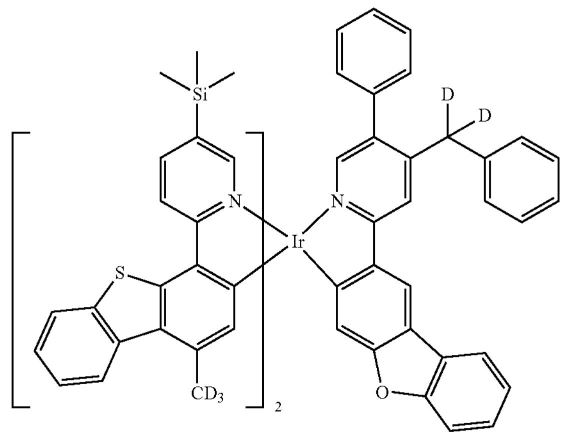
1141
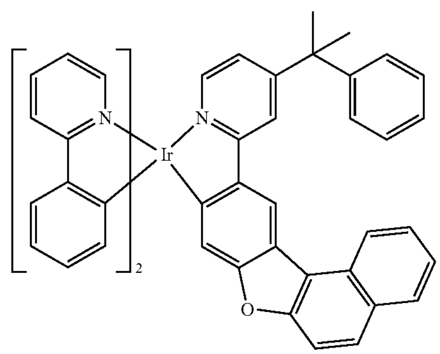
1142
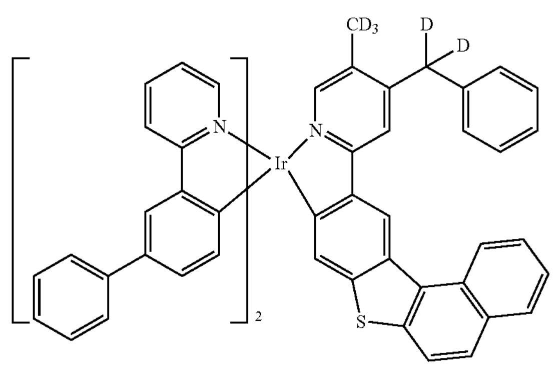
1143
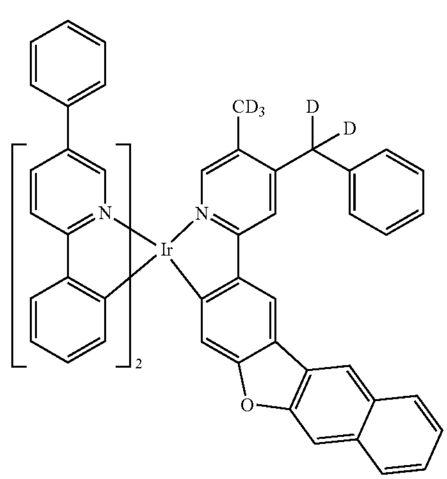

-continued
1144
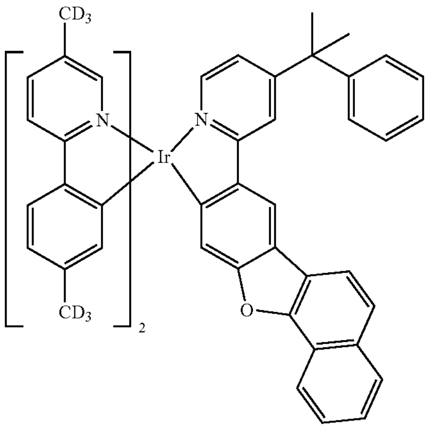
1145
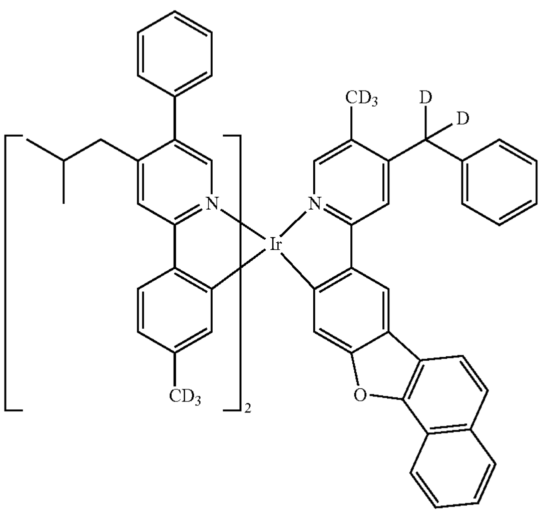
1146
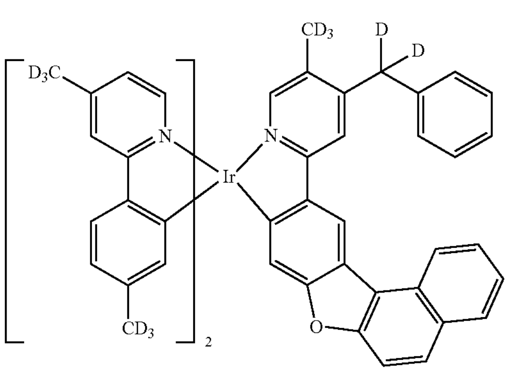
-continued
1147
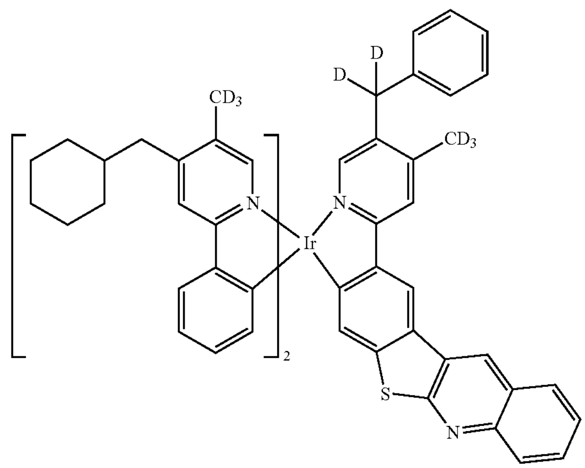
1148
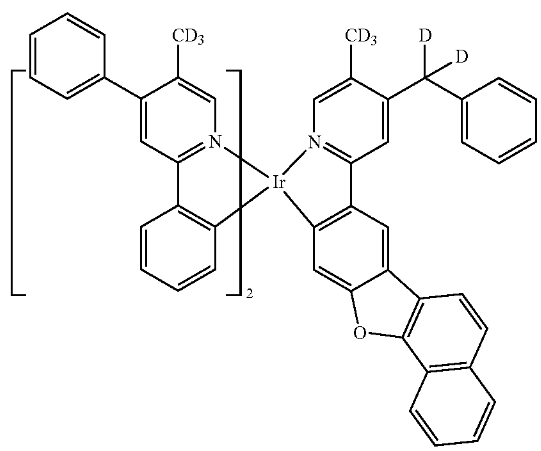
1149
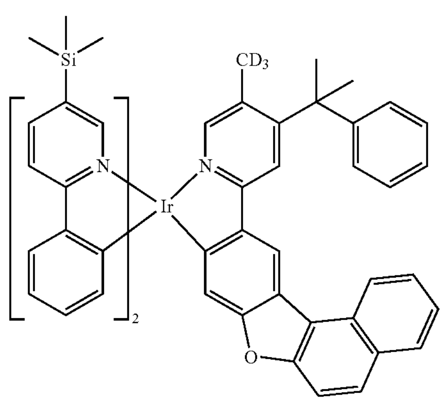

-continued
1150
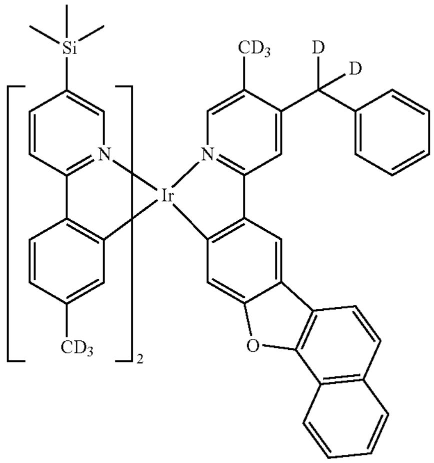
1151
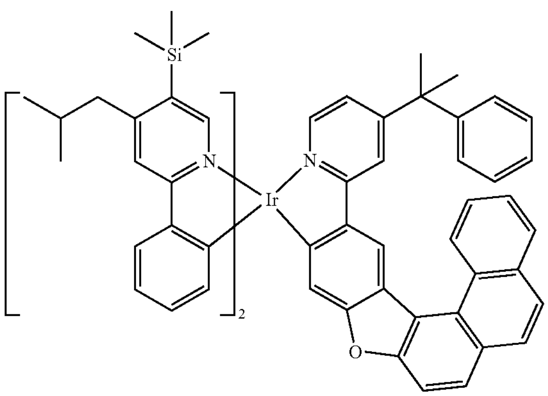
1152
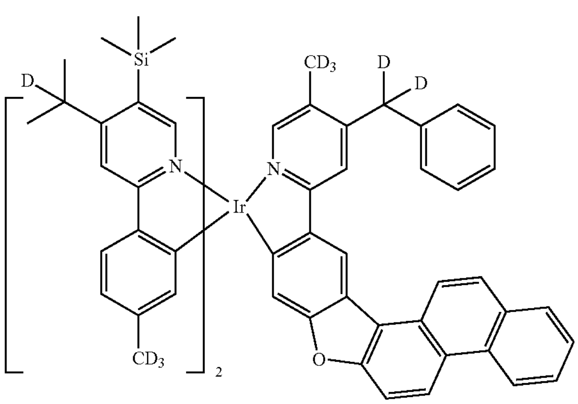
-continued
1153
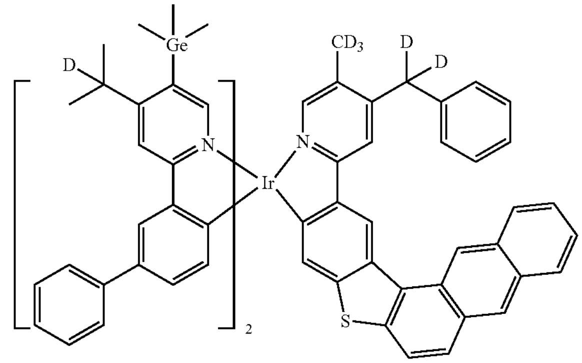
1154
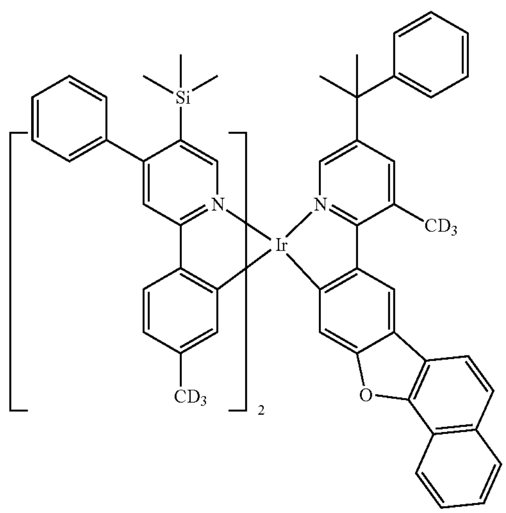
1155
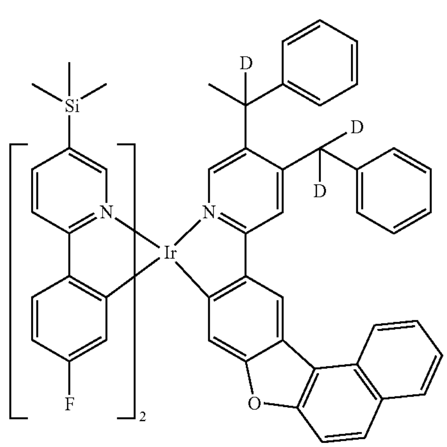

-continued
1156
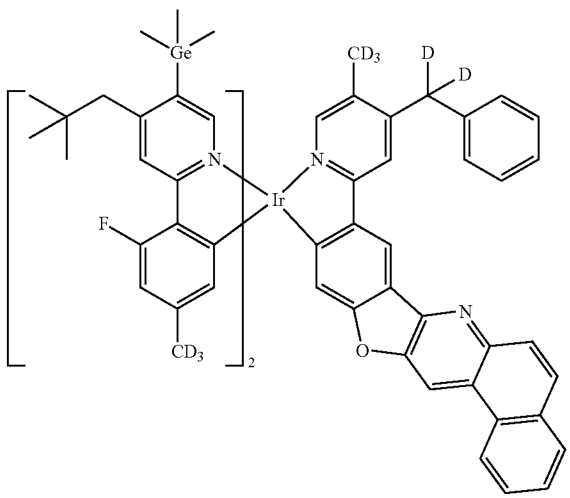
1157
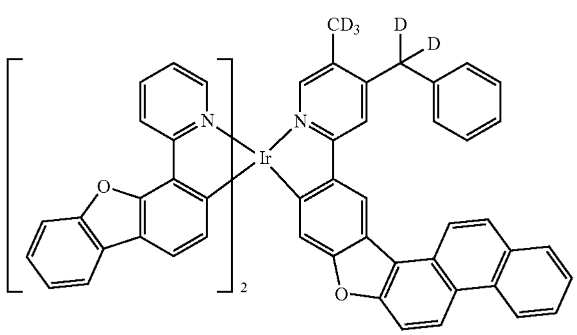
1158
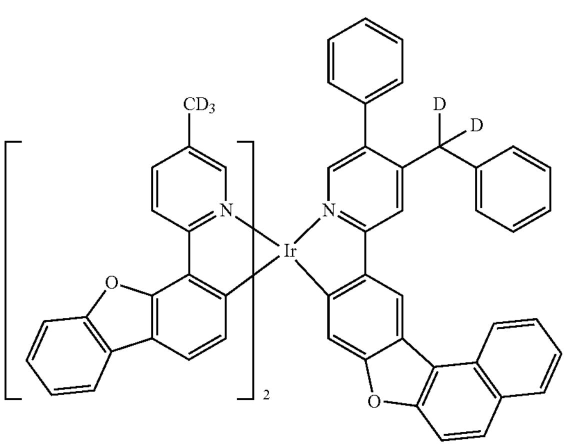
-continued
1159
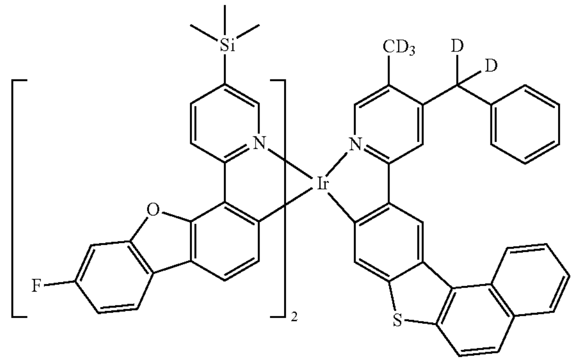
1160
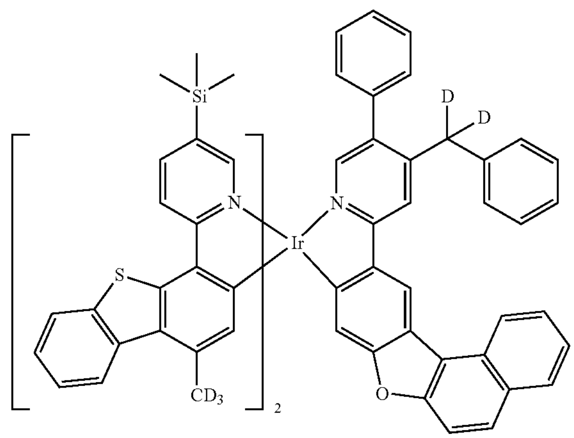
1161
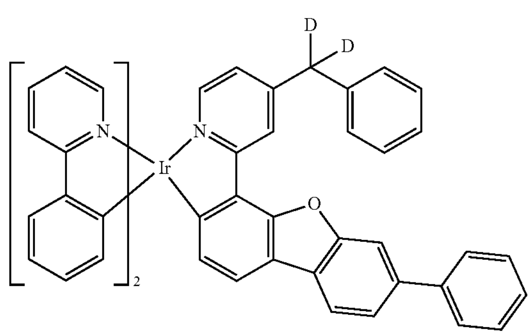
1162
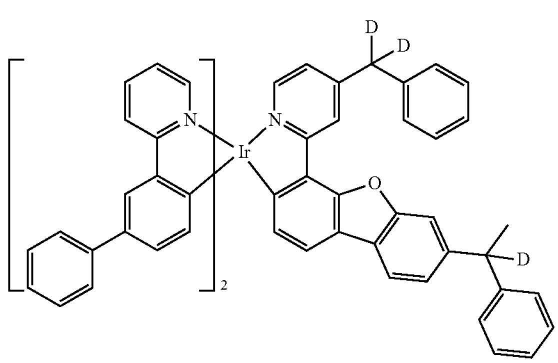

1163
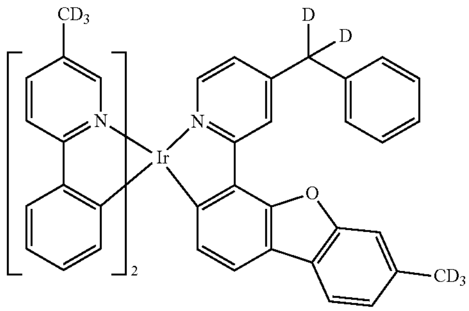
1164
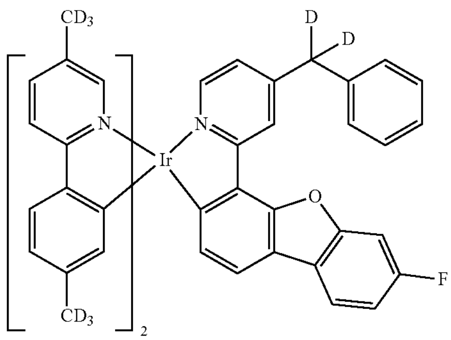
1165
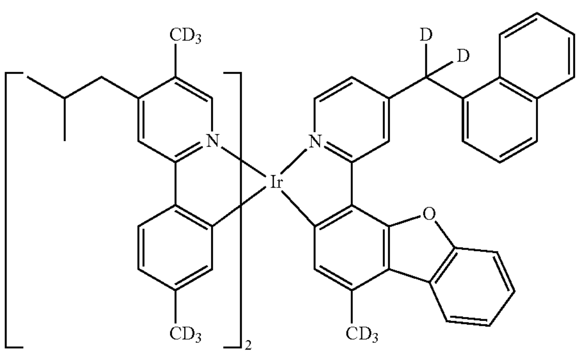
1166
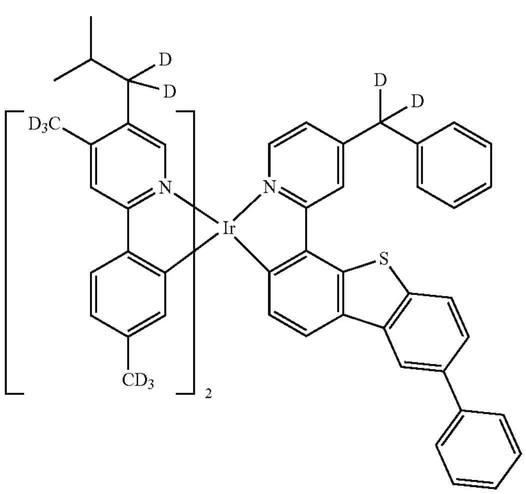
1167
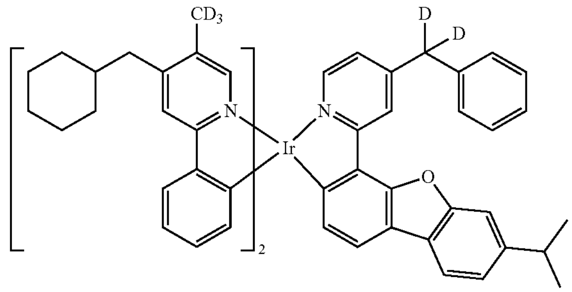
1168
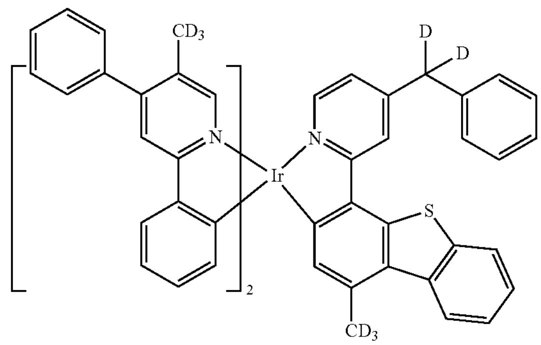
1169
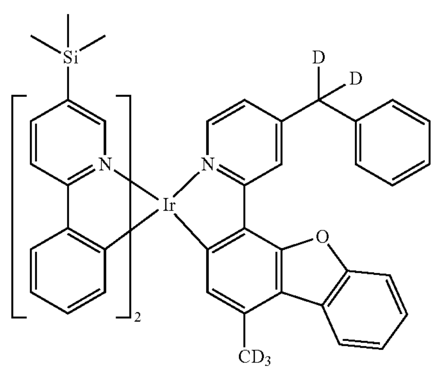
1170
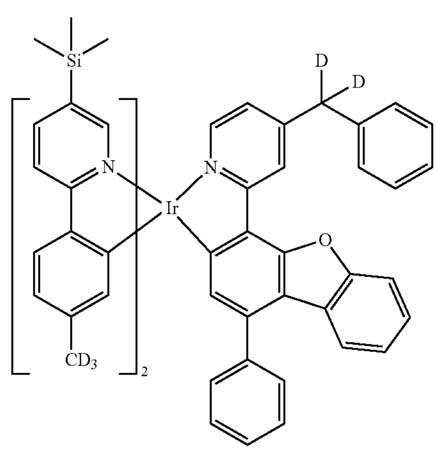

1171
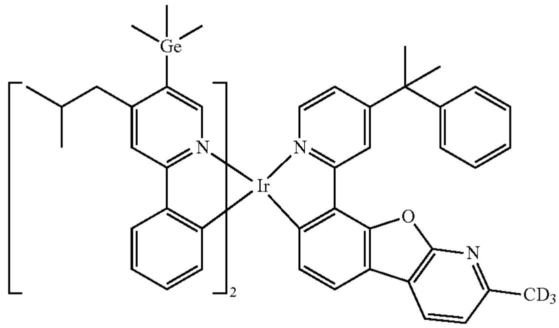
1172
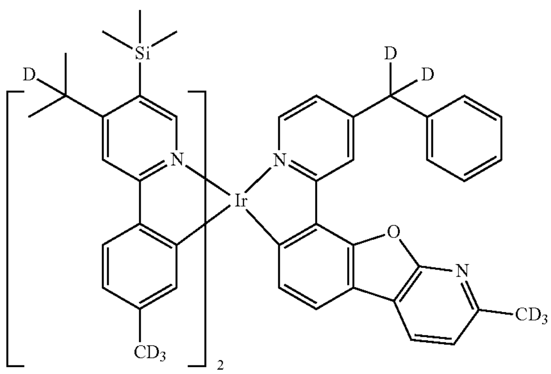
1173
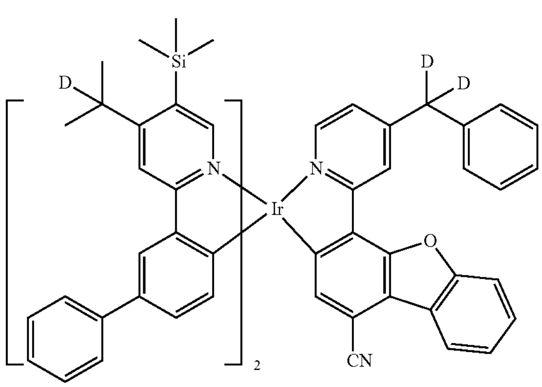
1174
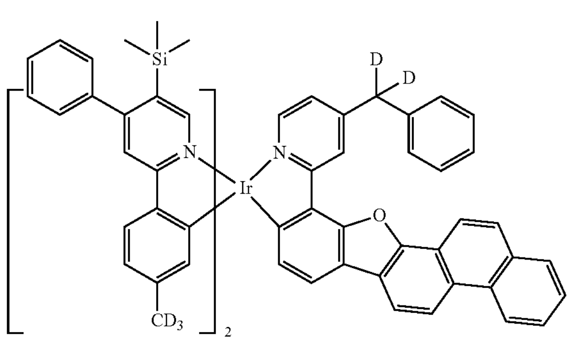
1175
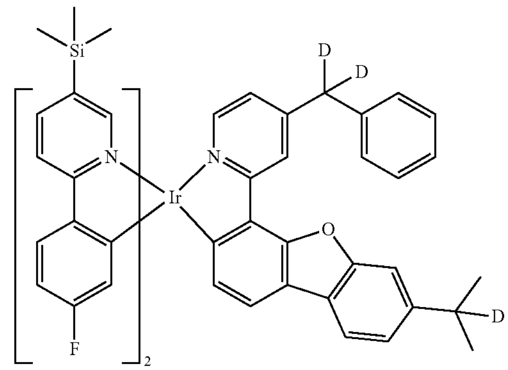
1176
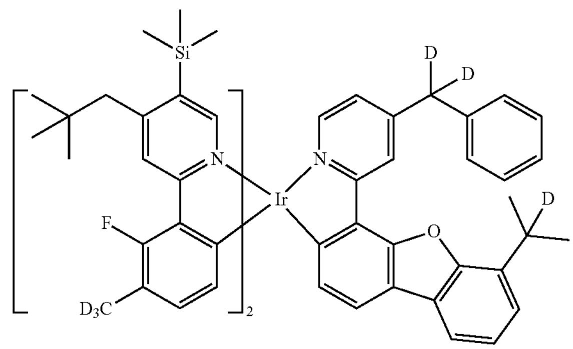
1177
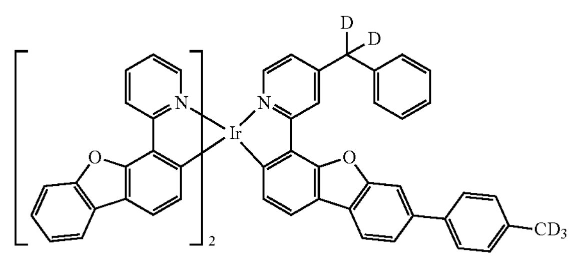
1178
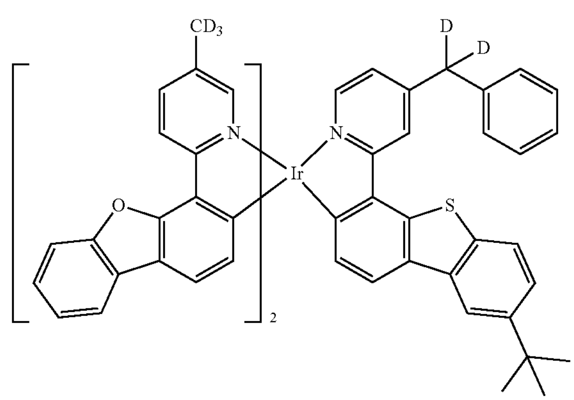

-continued
1179
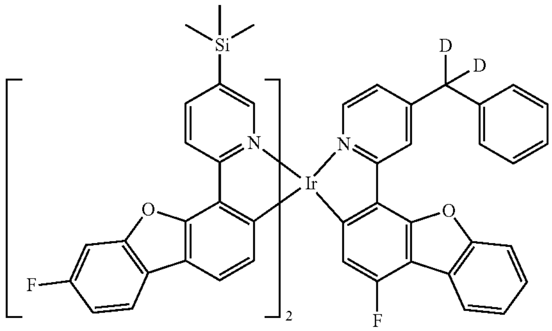
1180
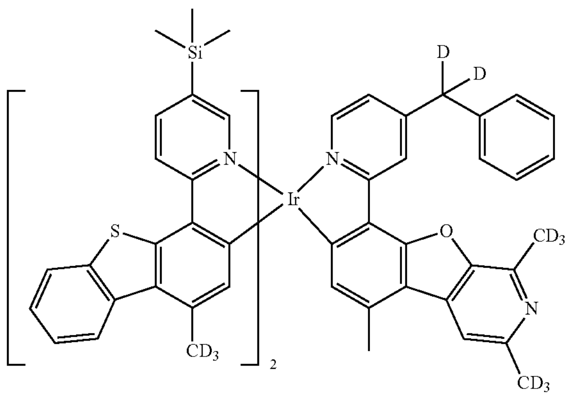
1181
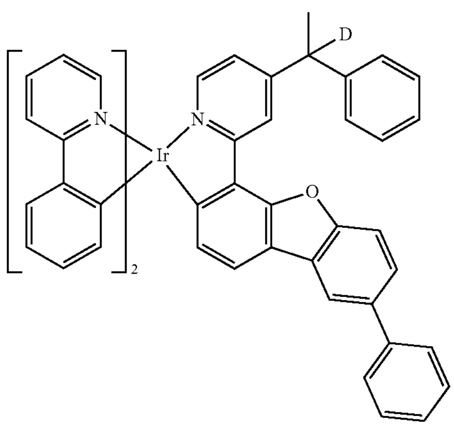
1182
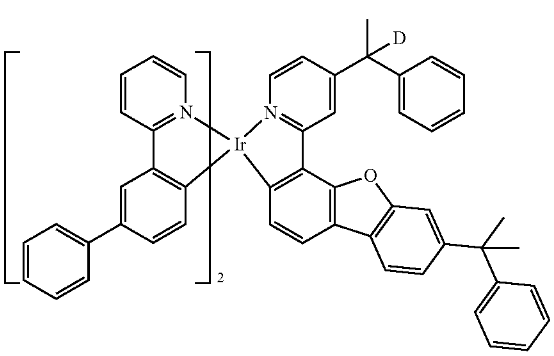
-continued
1183
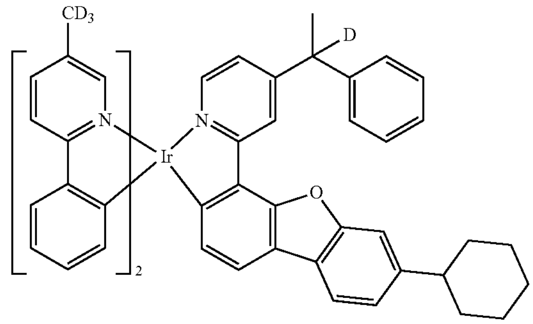
1184
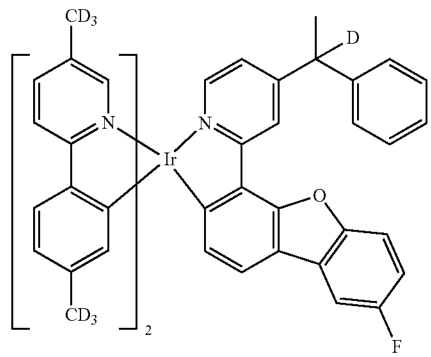
1185
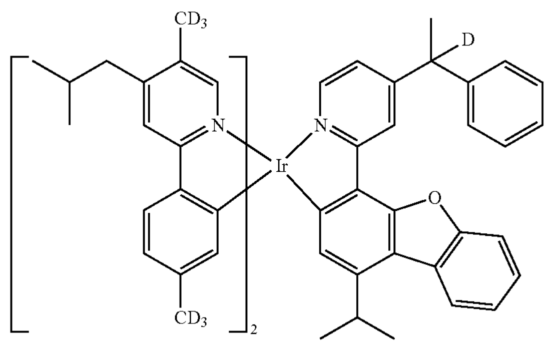
1186
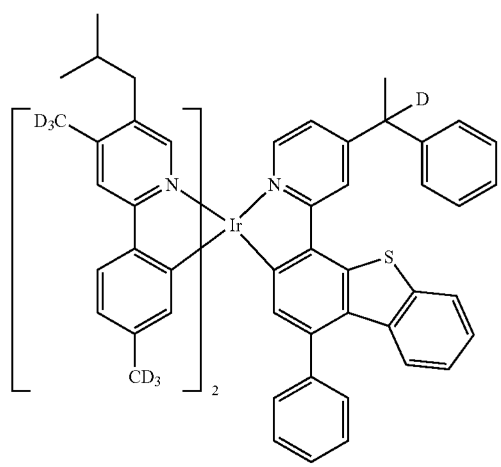

-continued
1187
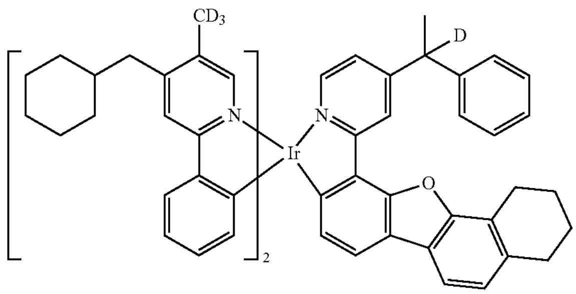
1188
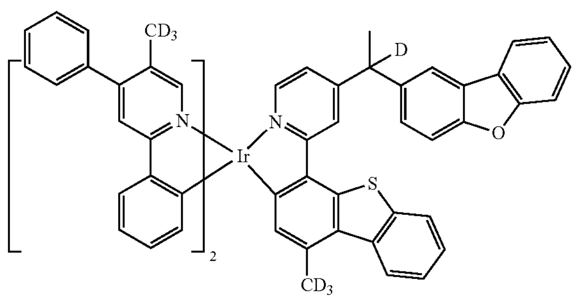
1189
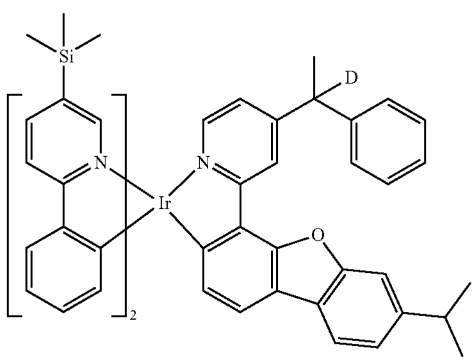
1190
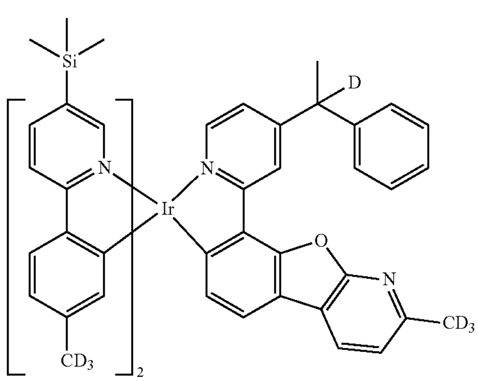
-continued
1191
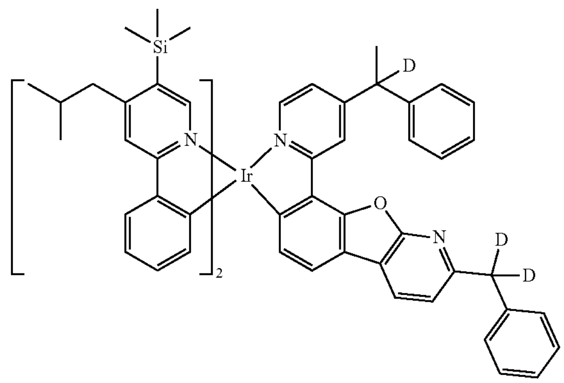
1192
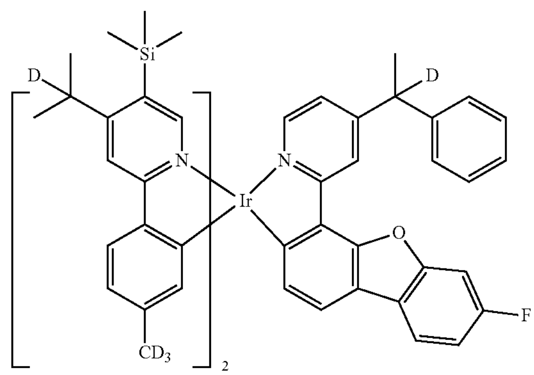
1193
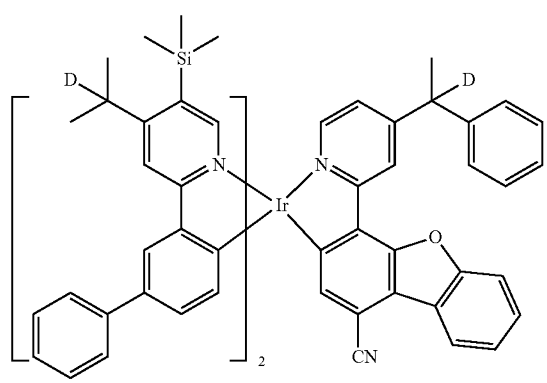
1194
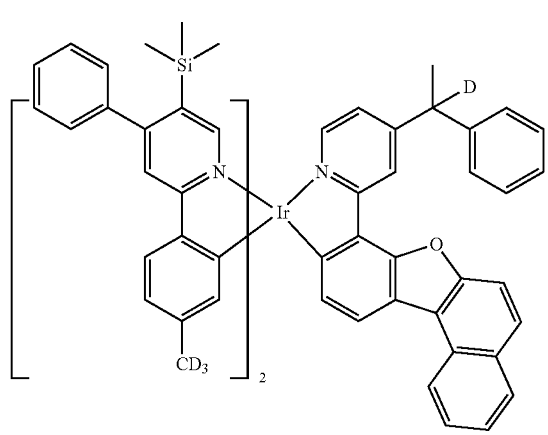

1195
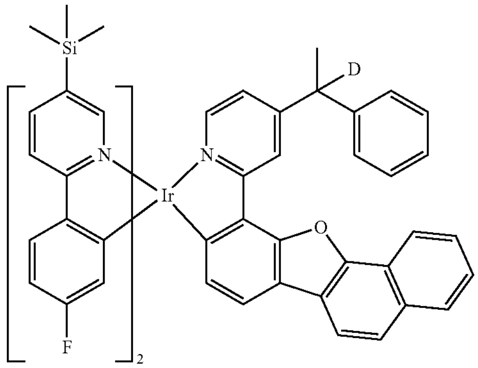
1196
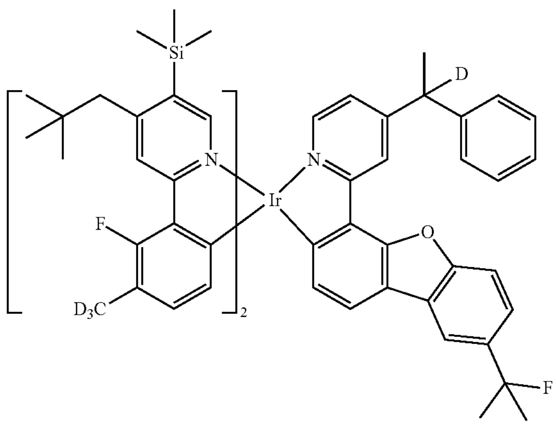
1197
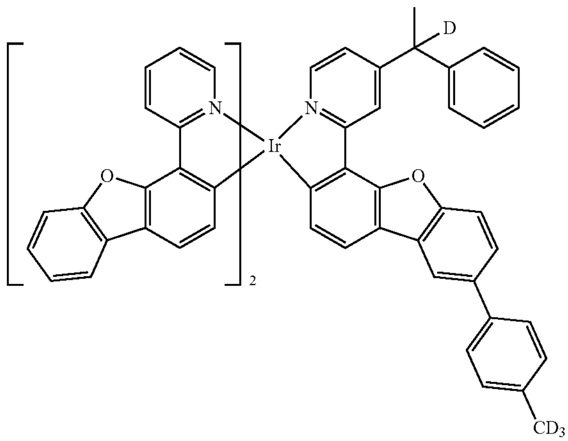
1198
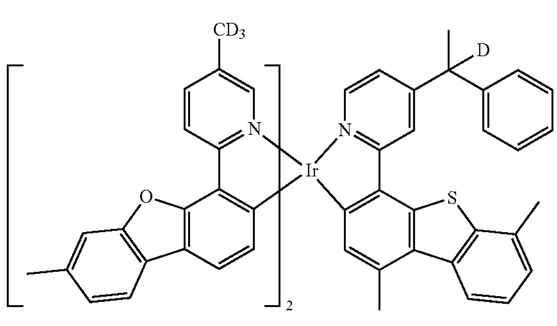
1199
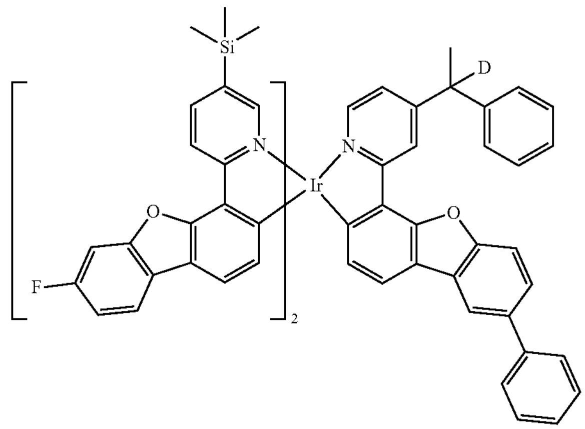
1200
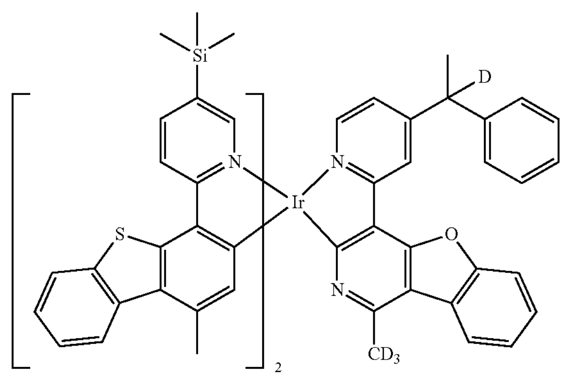
1201
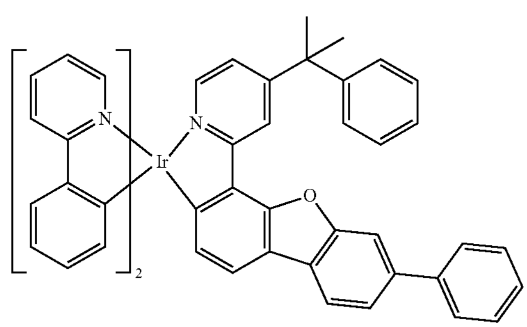
1202
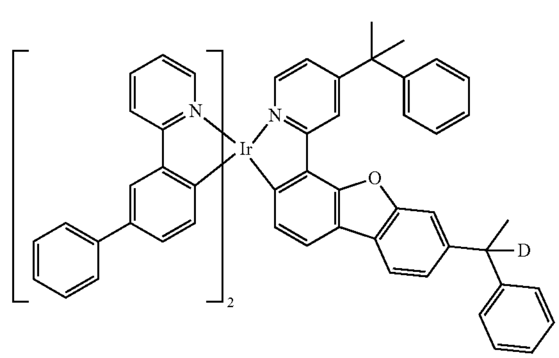

-continued
1203
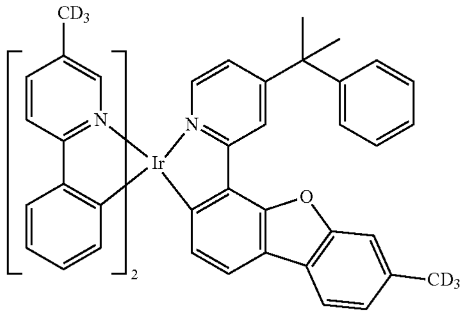
1204
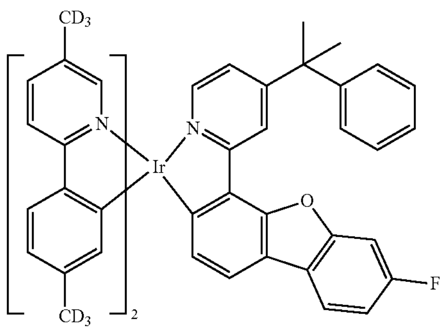
1205
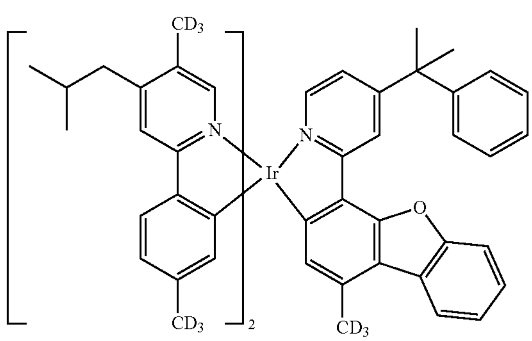
1206
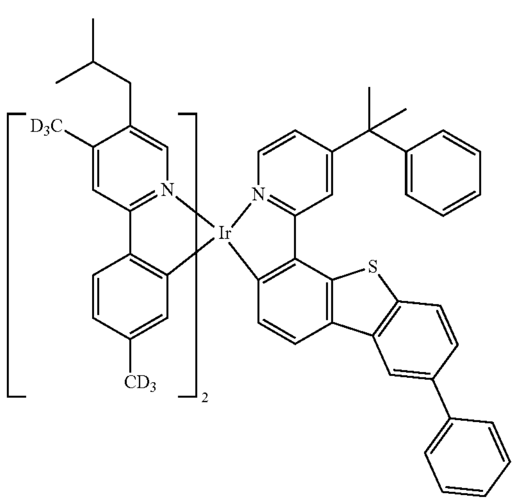
-continued
1207
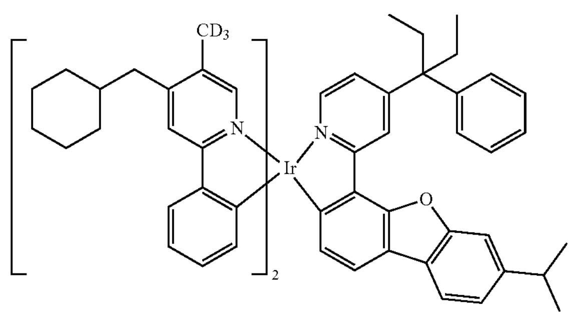
1208
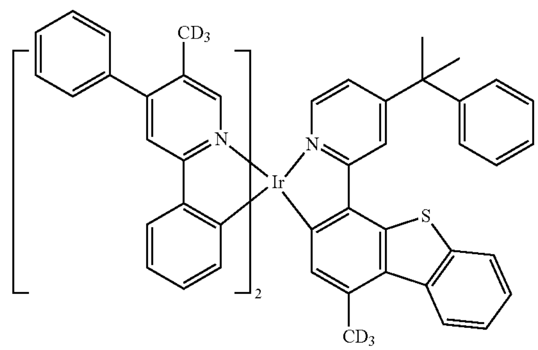
1209
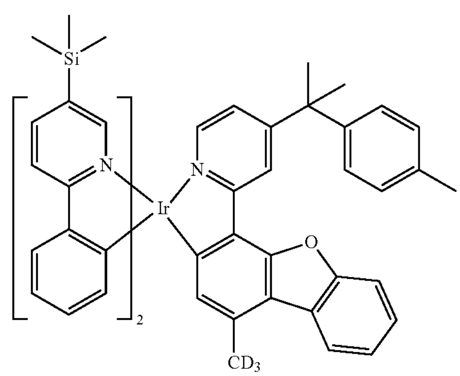
1210
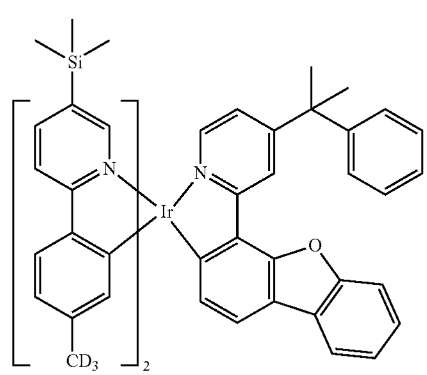

-continued
1211
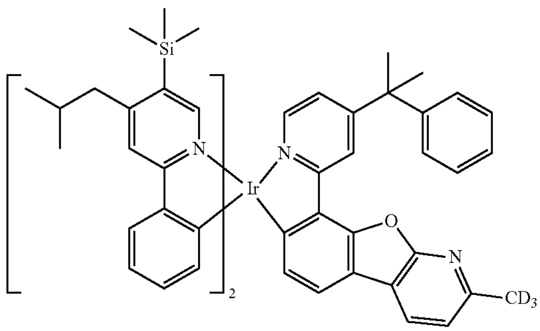
1212
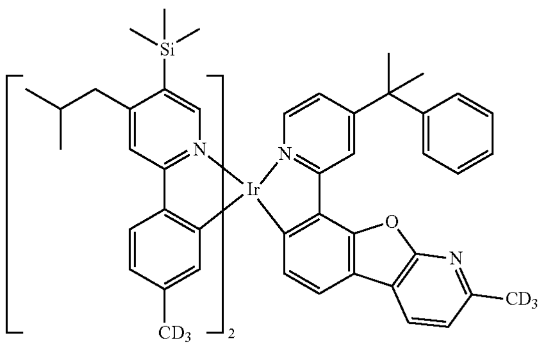
1213
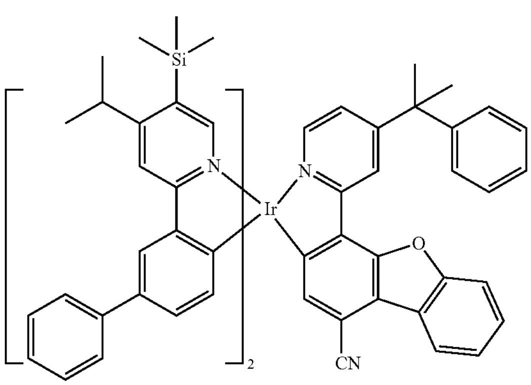
1214
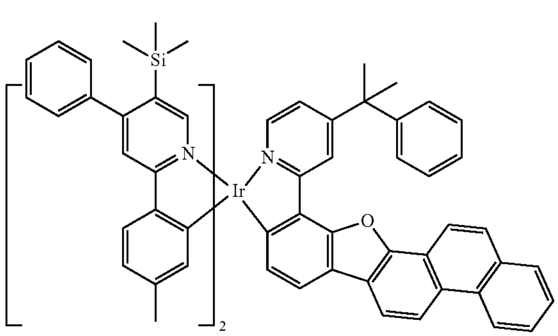
-continued
1215
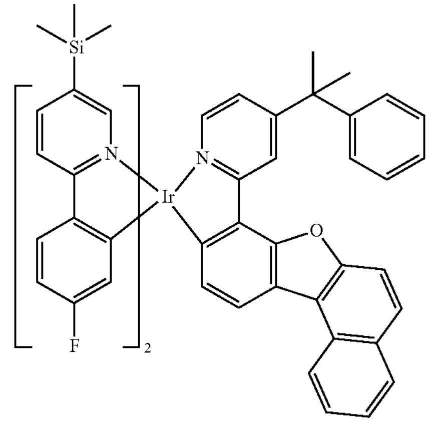
1216
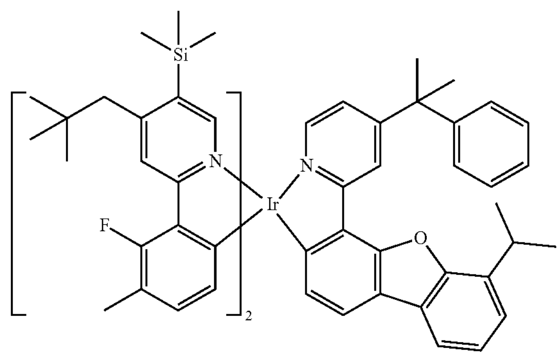
1217
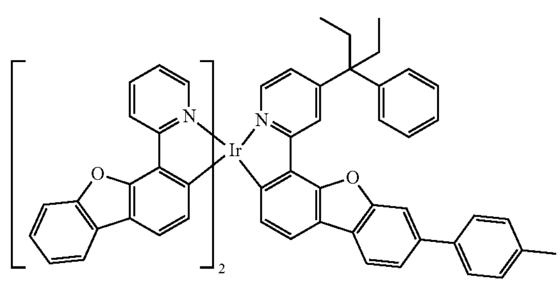
1218
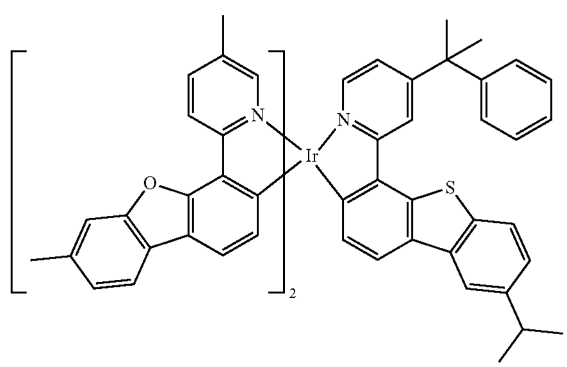

1219
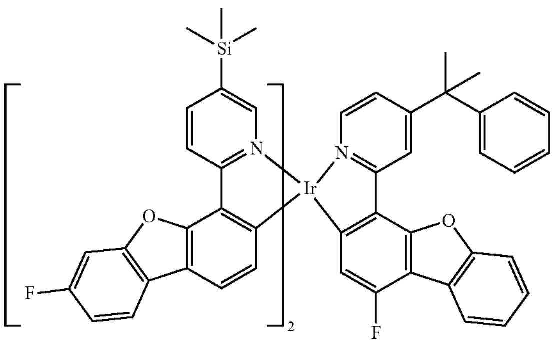
1220
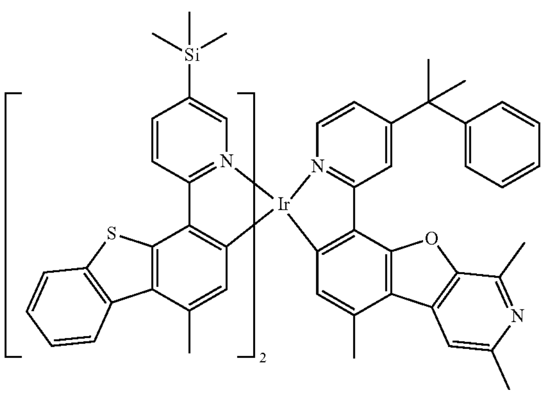
1221
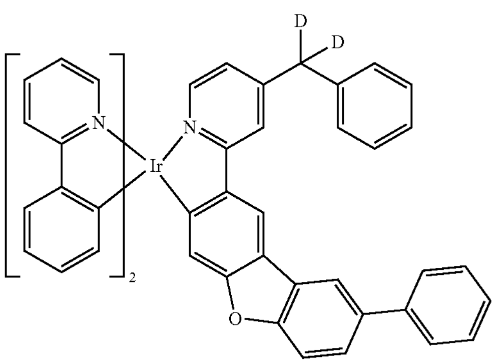
1222
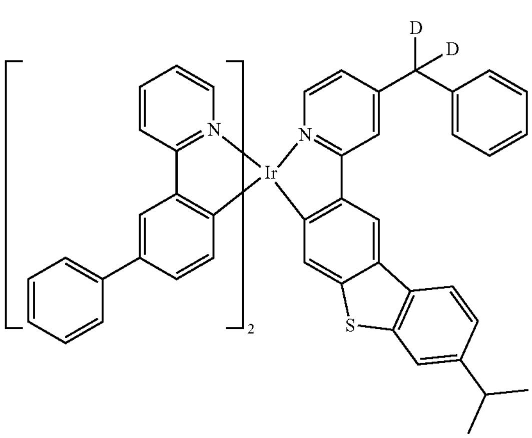
1223
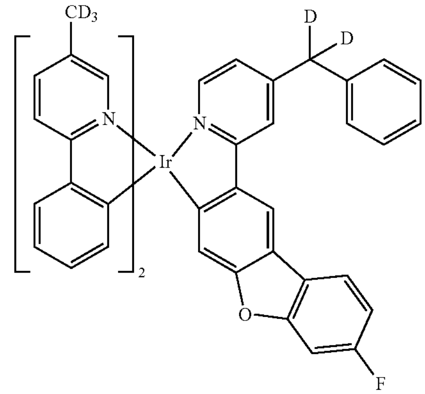
1224
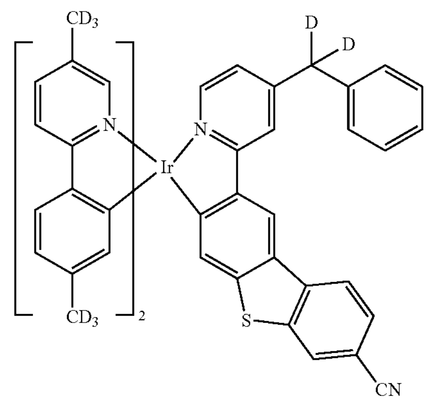
1225
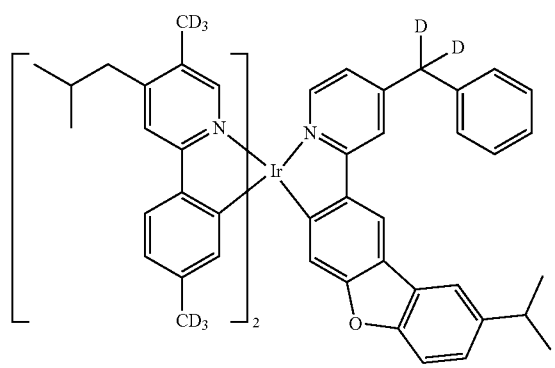
1226
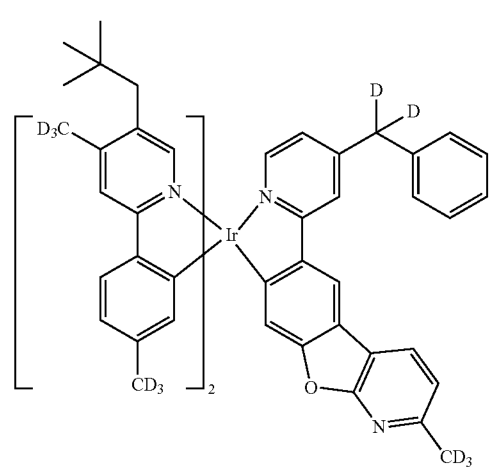

-continued
1227
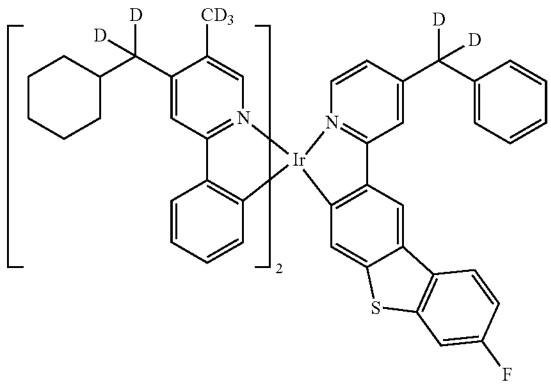
1228
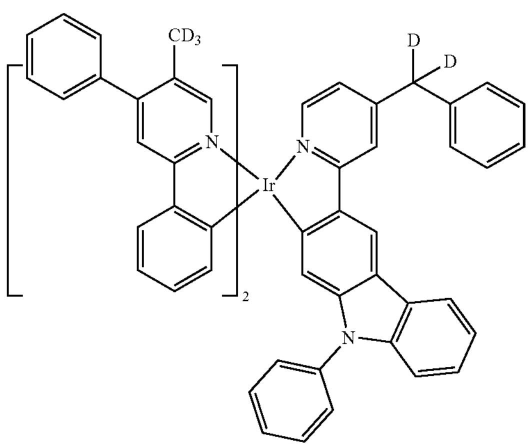
1229
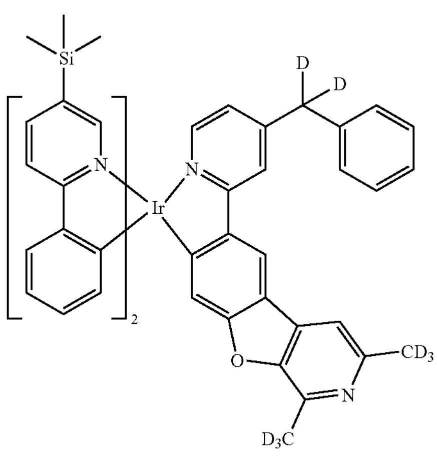
-continued
1230
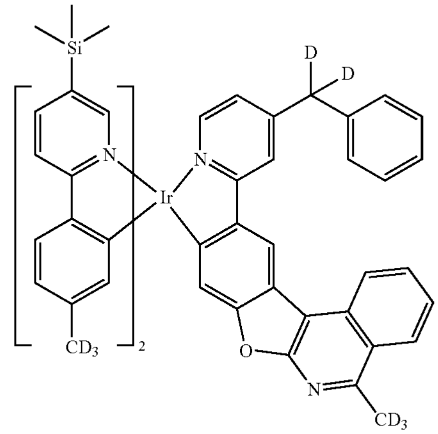
1231
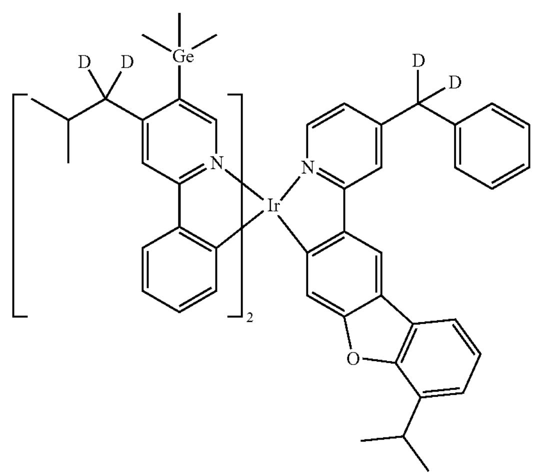
1232
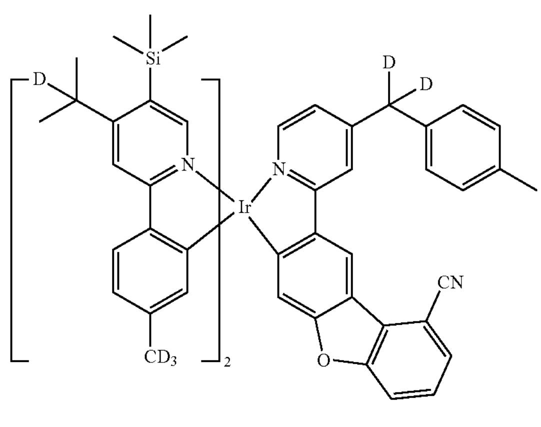

1233
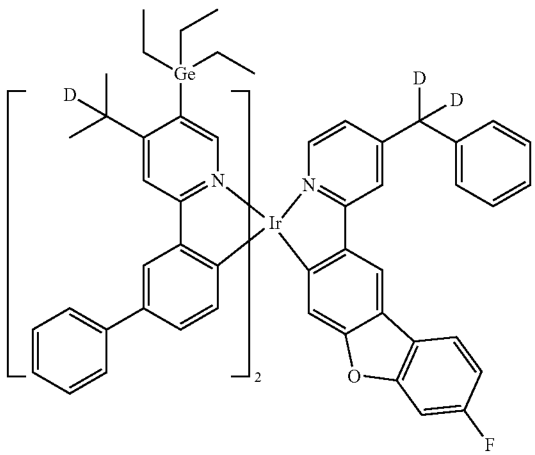
1234
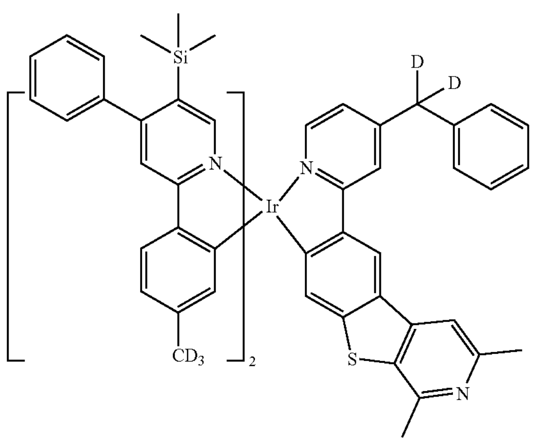
1235
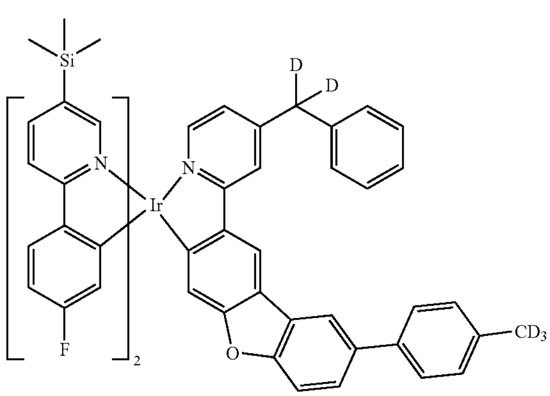
1236
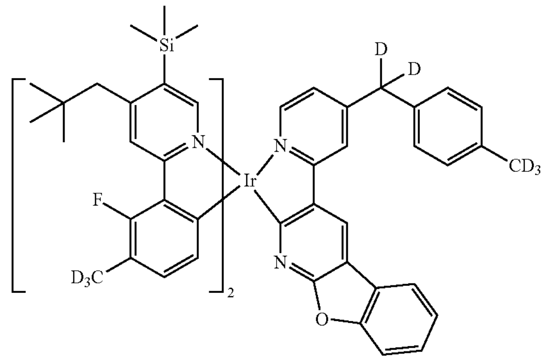
1237
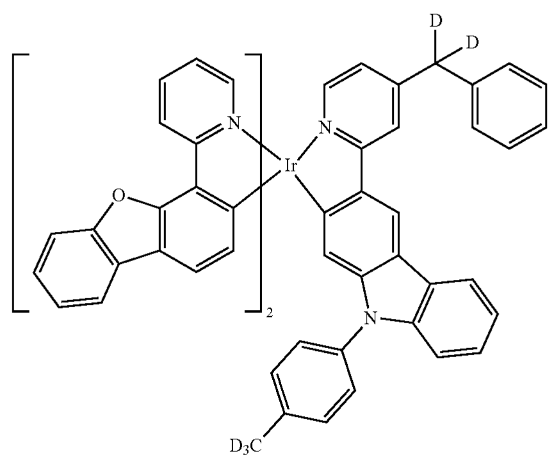
1238
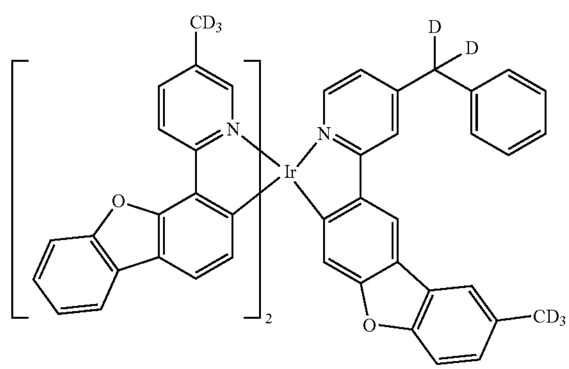

-continued
1239
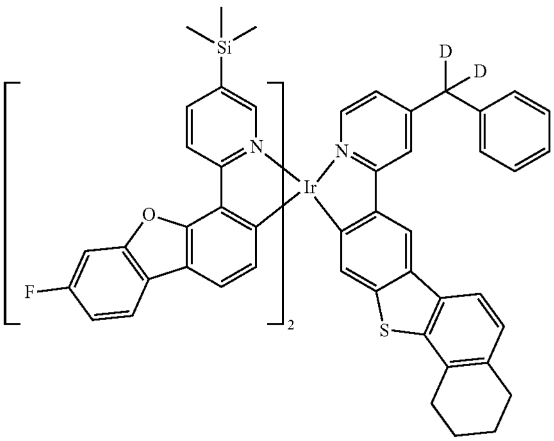
1240
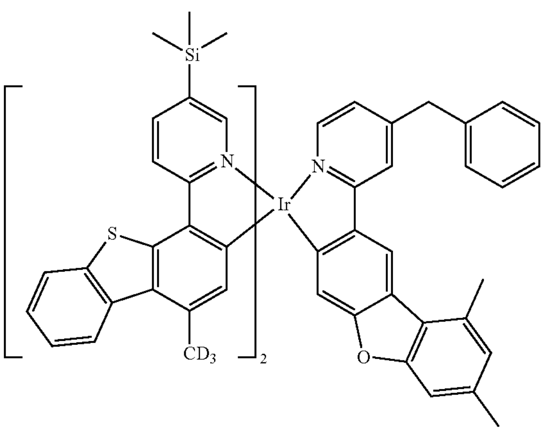
1241
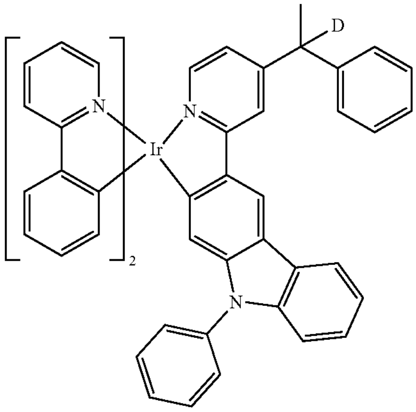
-continued
1242
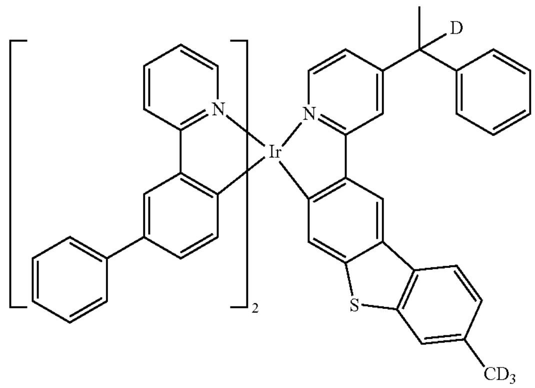
1243
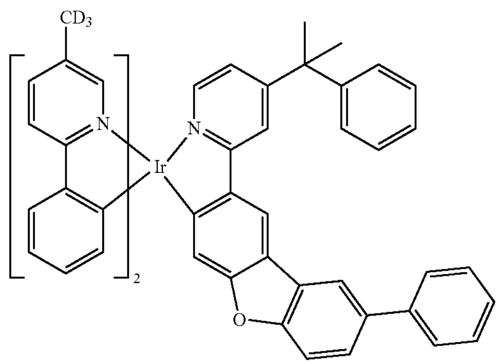
1244
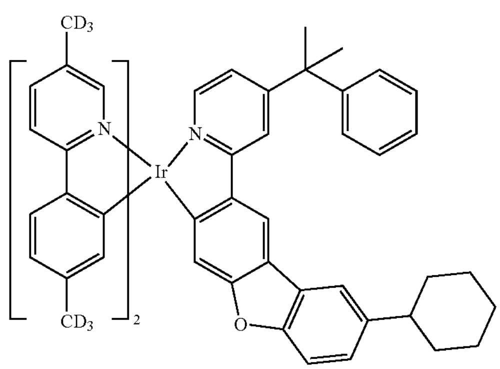
1245
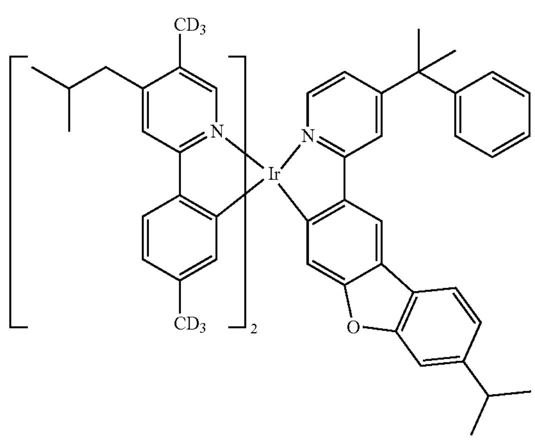

-continued
1246
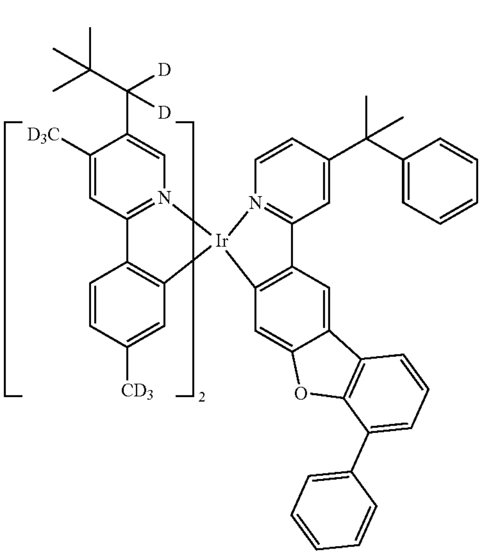
1247
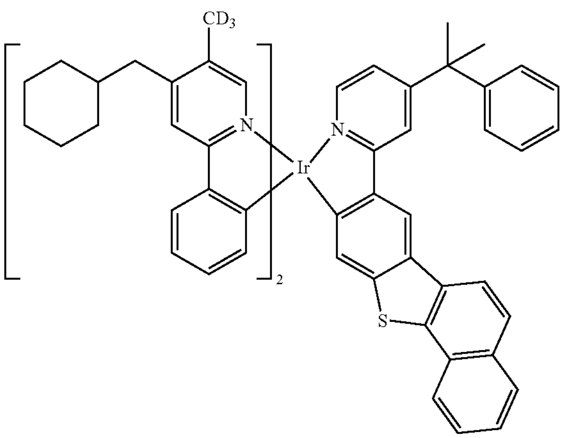
1248
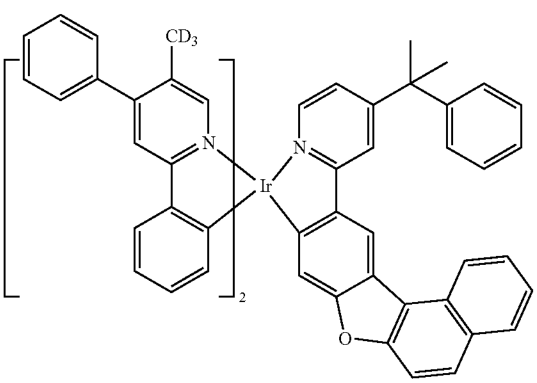
-continued
1249
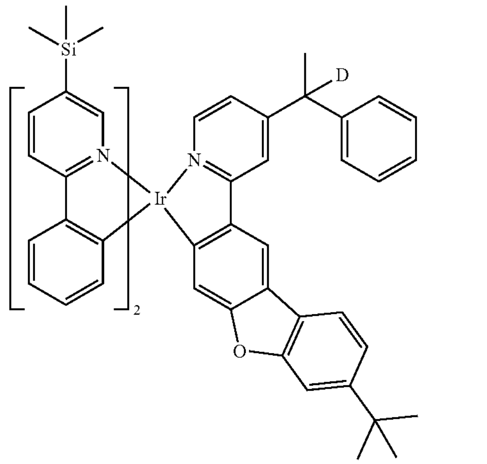
1250
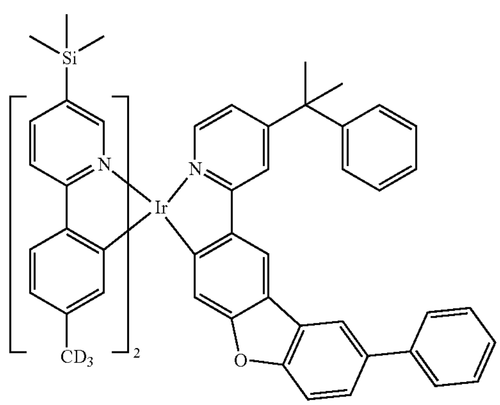
1251
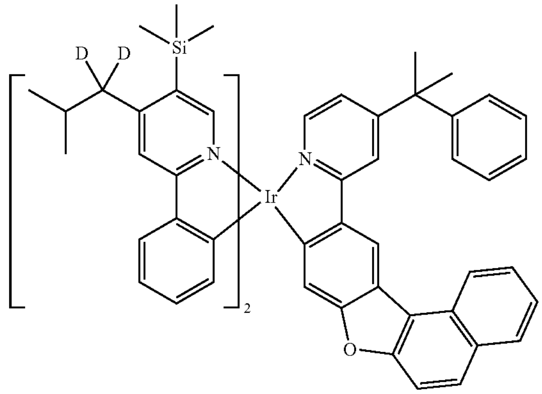

-continued
1252
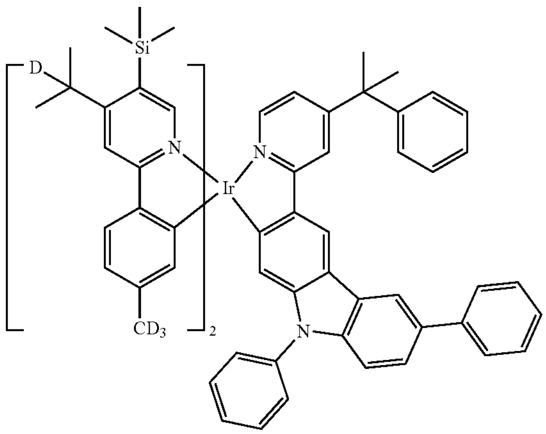
1253
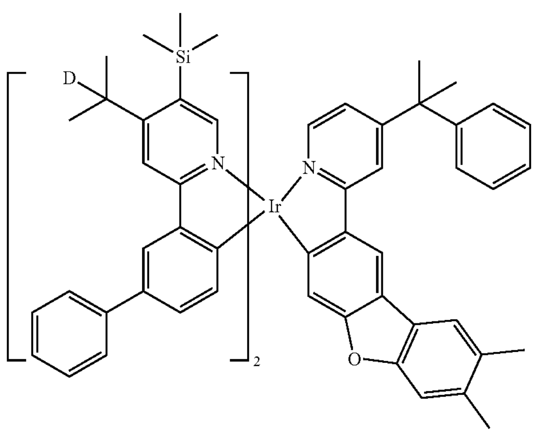
1254
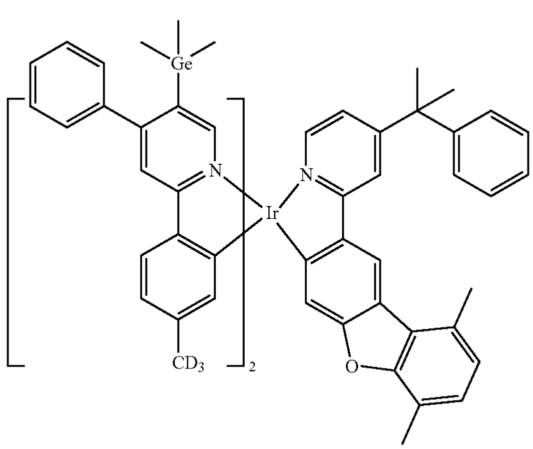
-continued
1255
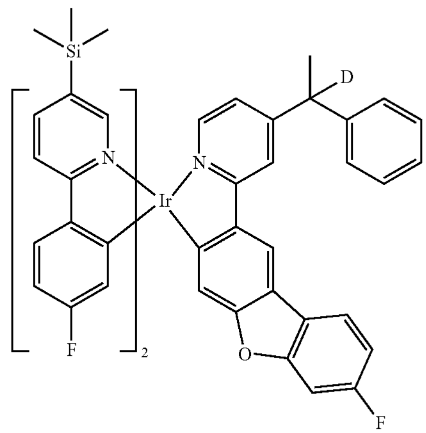
1256
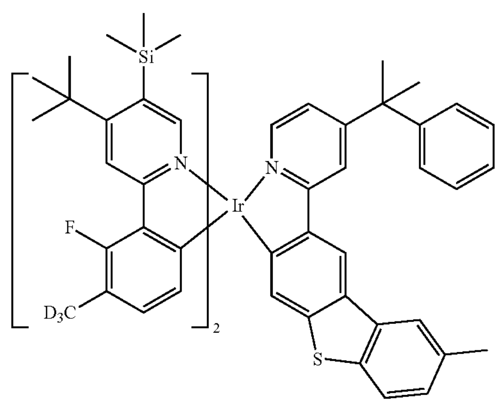
1257
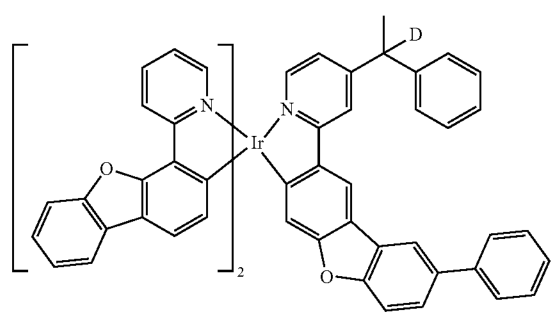
1258
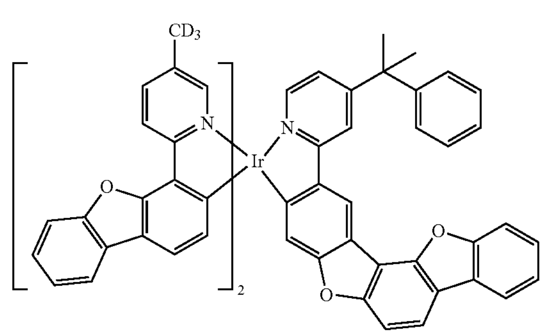

1259
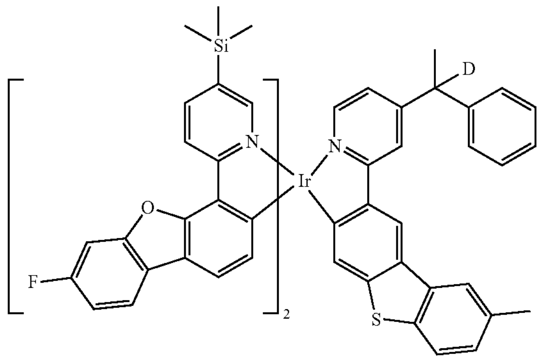
1260
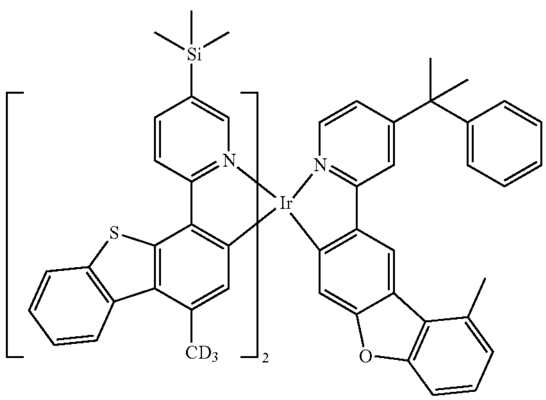
1261
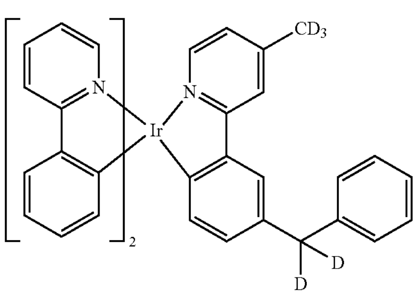
1262
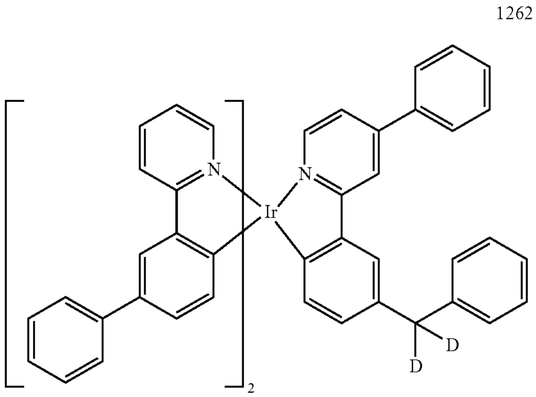
1263
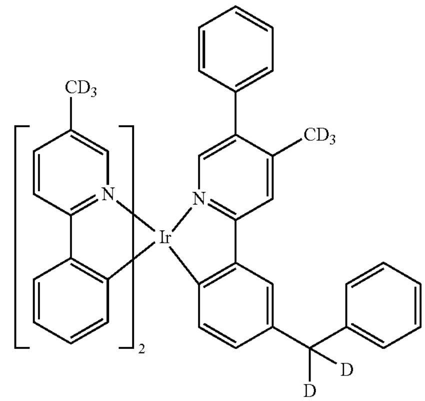
1264
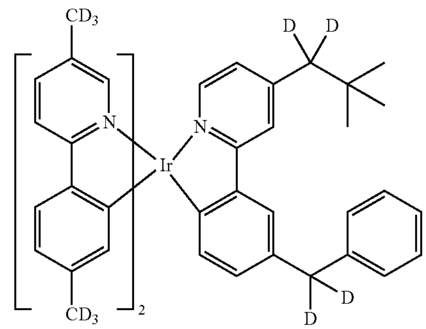
1265
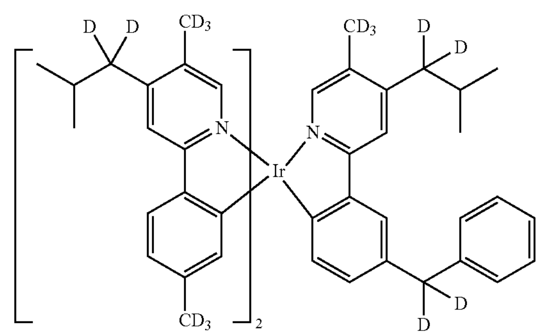
1266
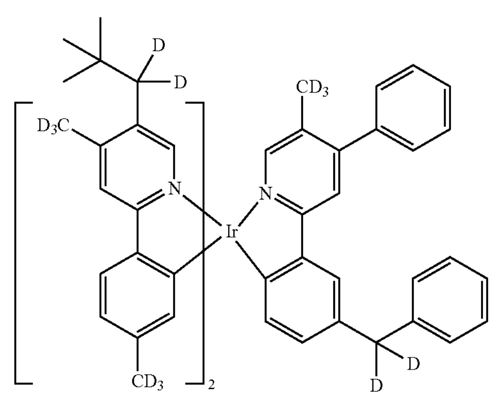

1267
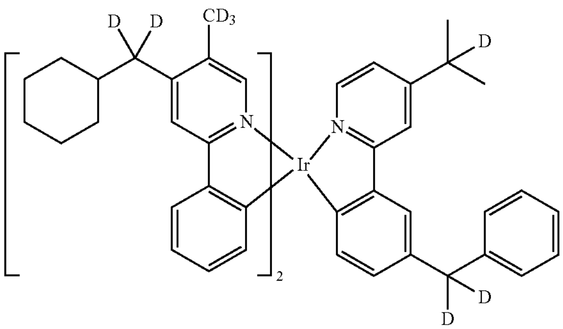
1268
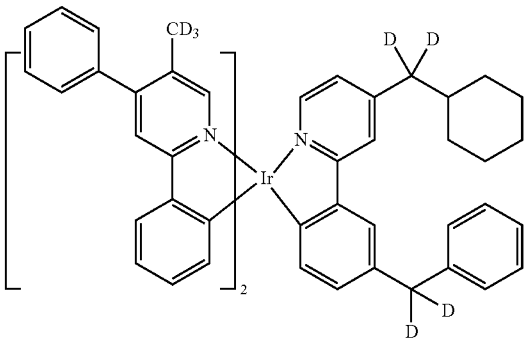
1269
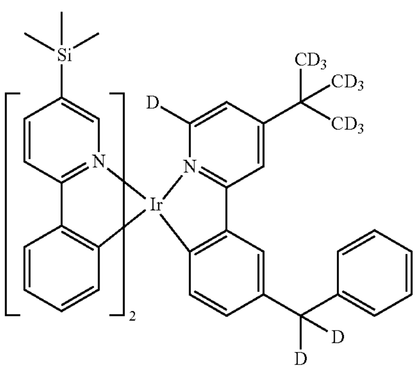
1270
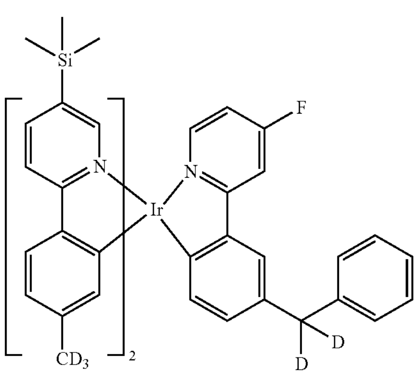
1271
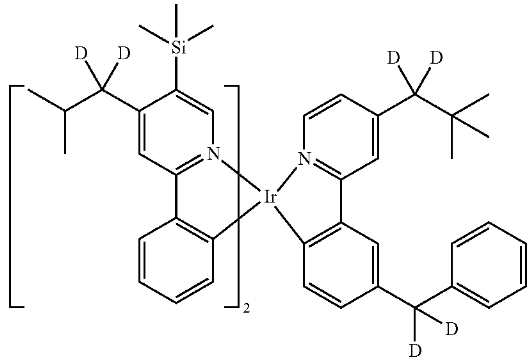
1272
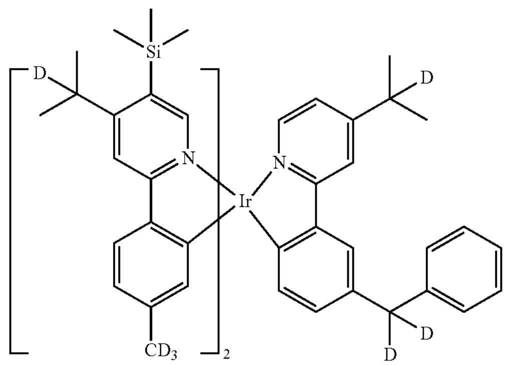
1273
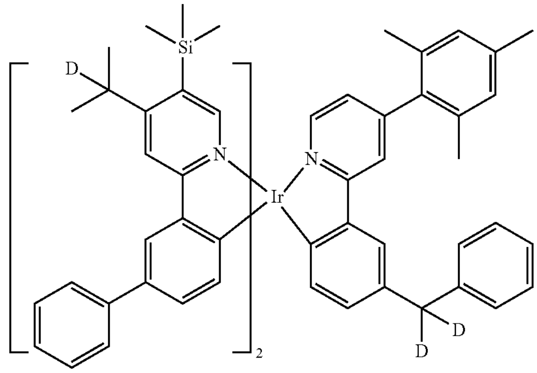
1274
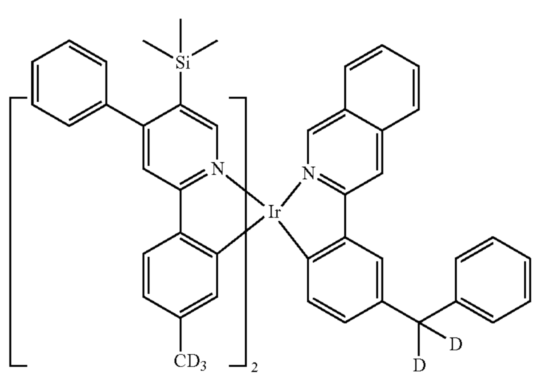

-continued
1275
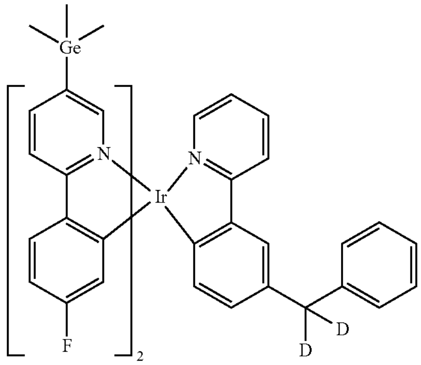
1276
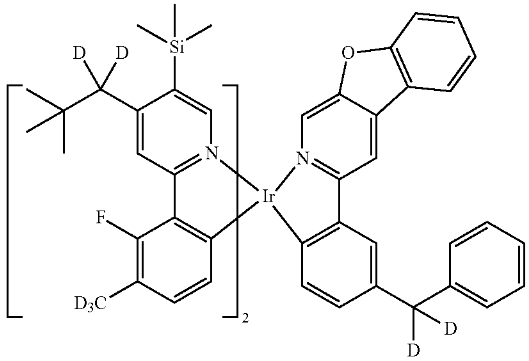
1277
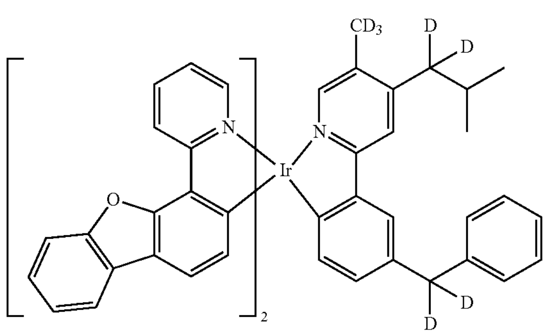
1278
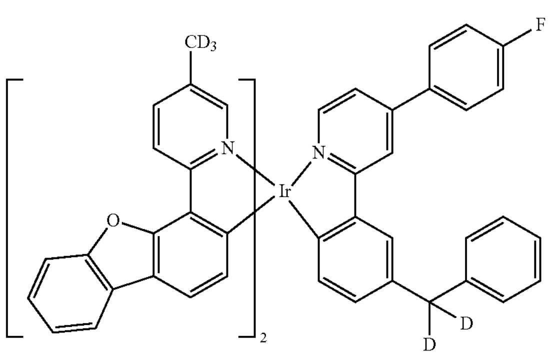
-continued
1279
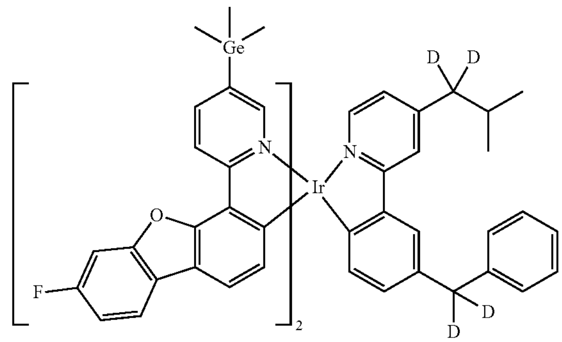
1280
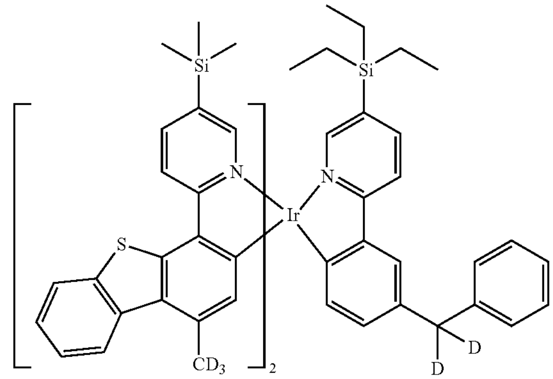
1281
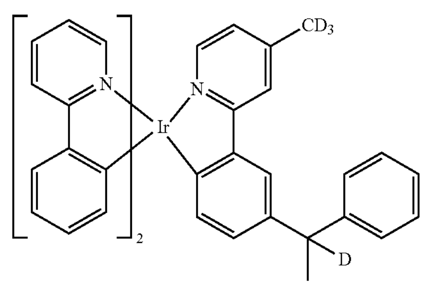
1282
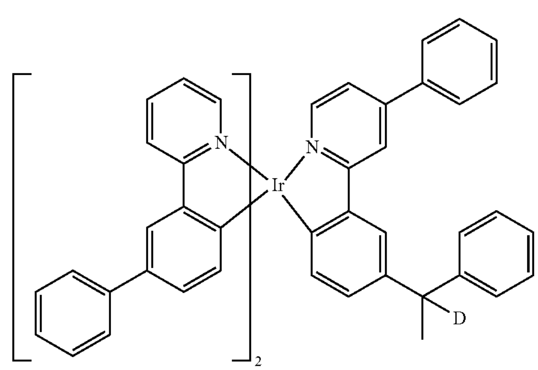

-continued
1283
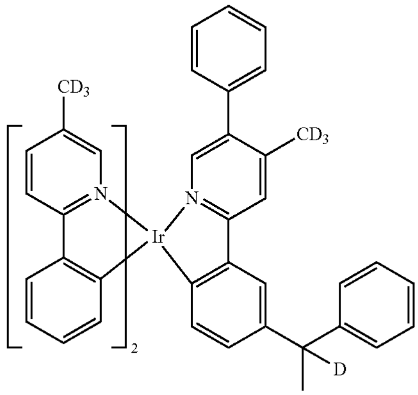
1284
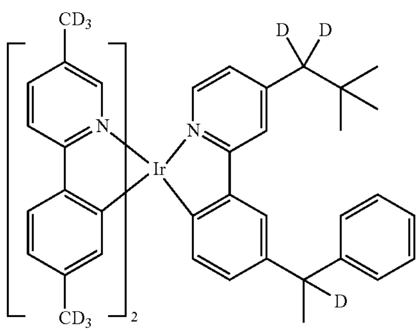
1285
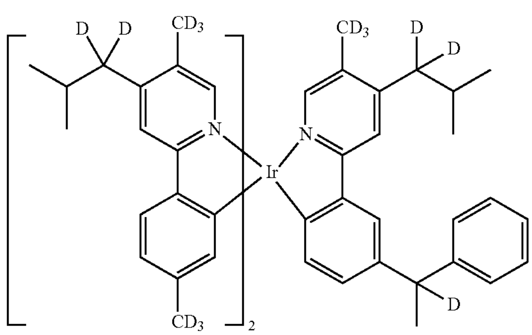
1286
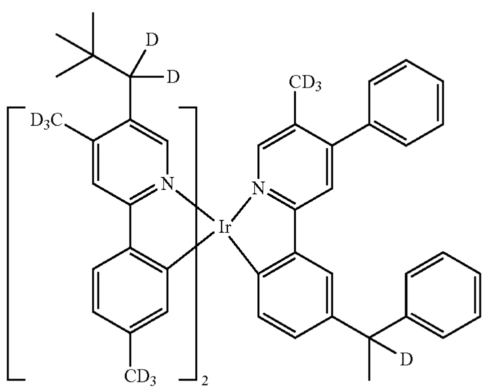
-continued
1287
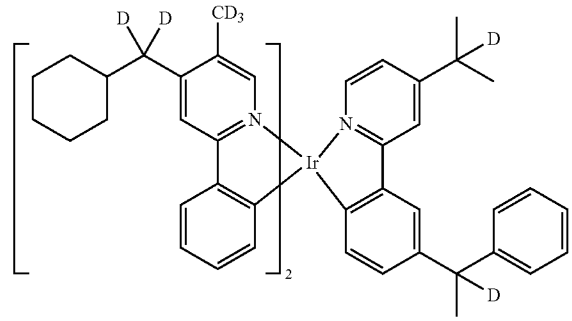
1288
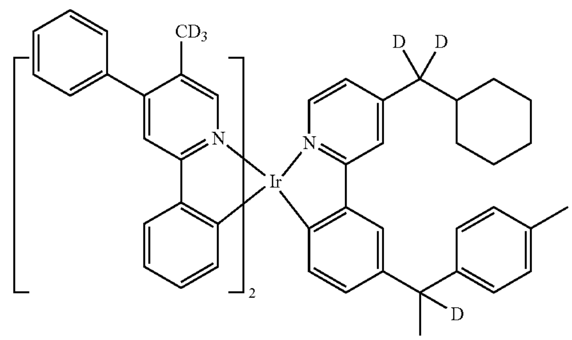
1289
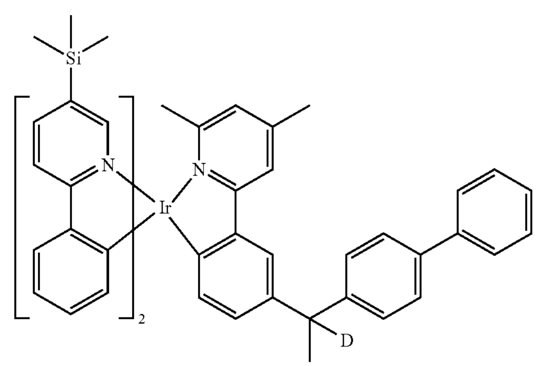
1290
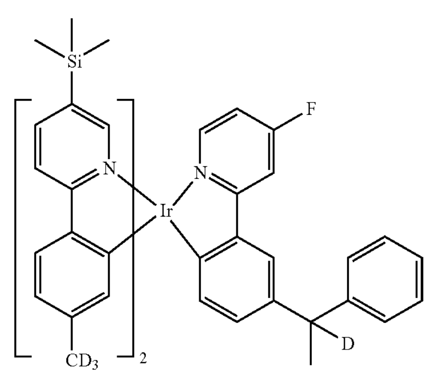

-continued
1291
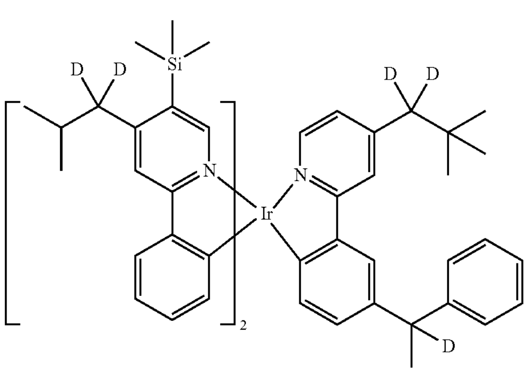
1292
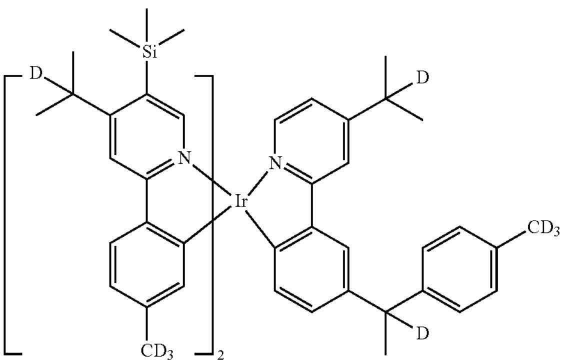
1293
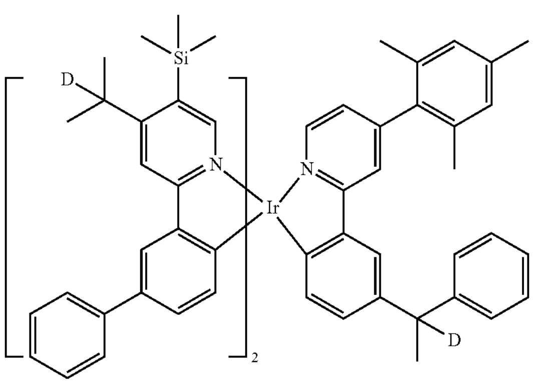
1294
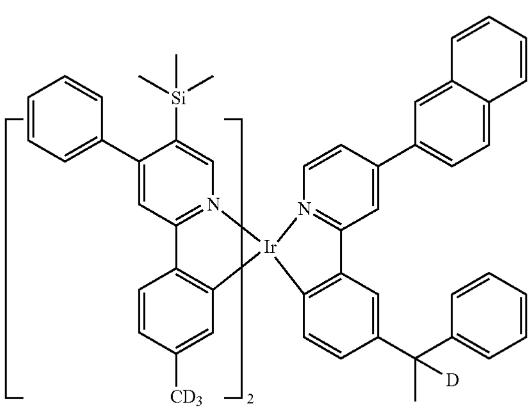
-continued
1295
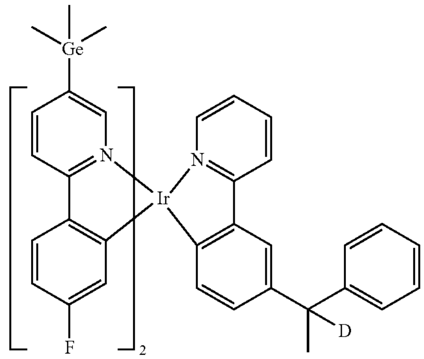
1296
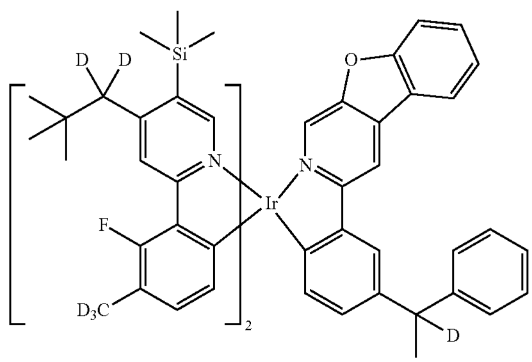
1297
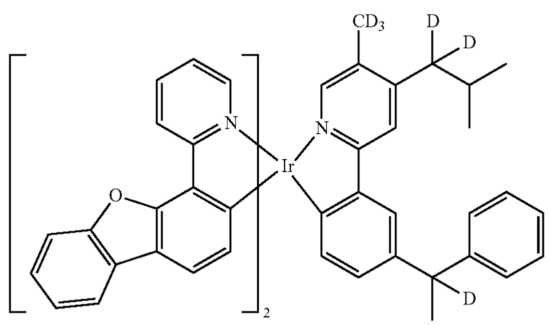
1298
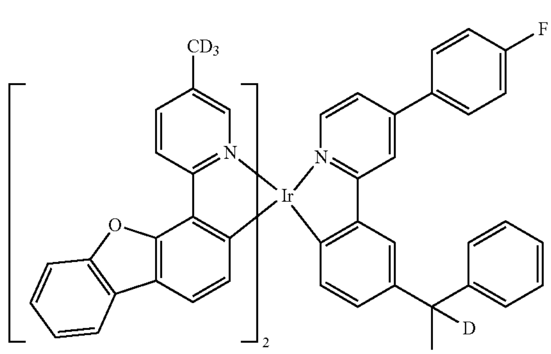

-continued
1299
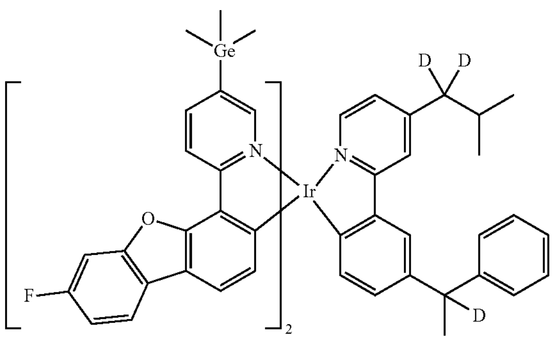
1300
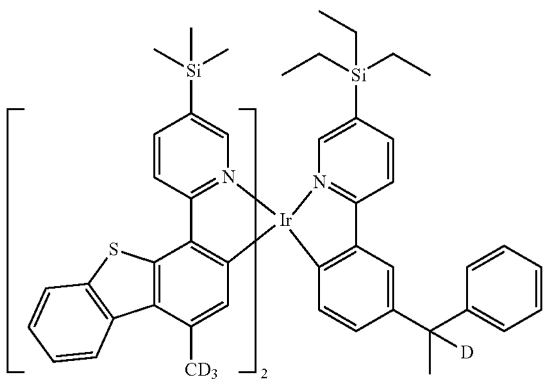
1301
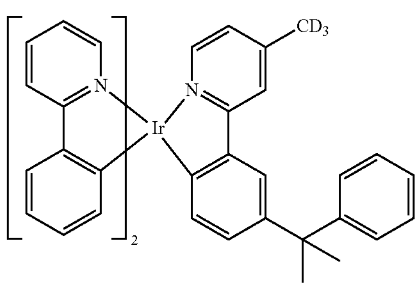
1302
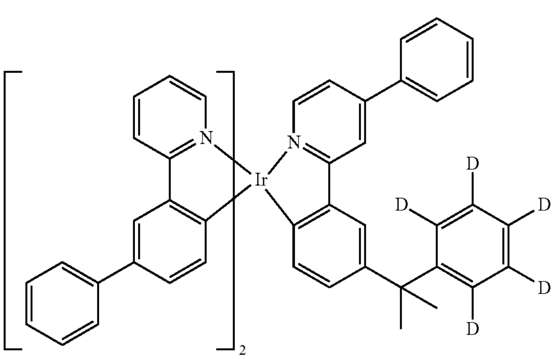
-continued
1303
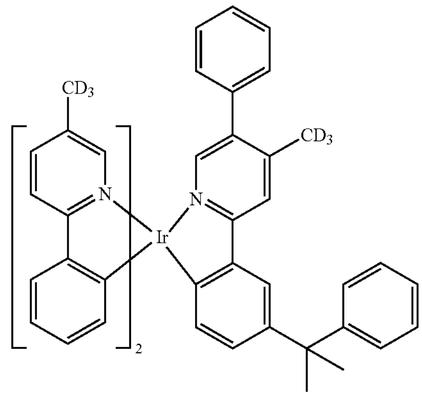
1304
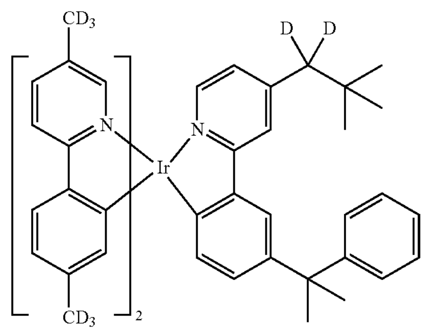
1305
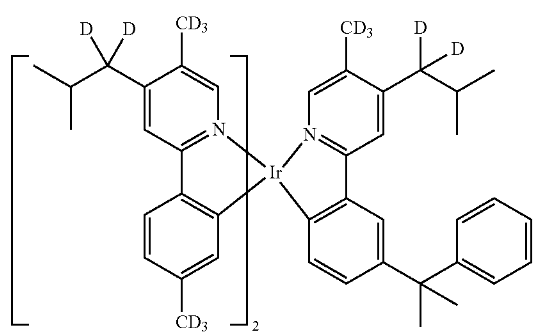
1306
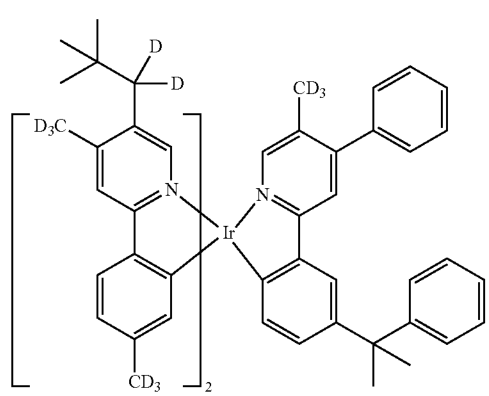

1307
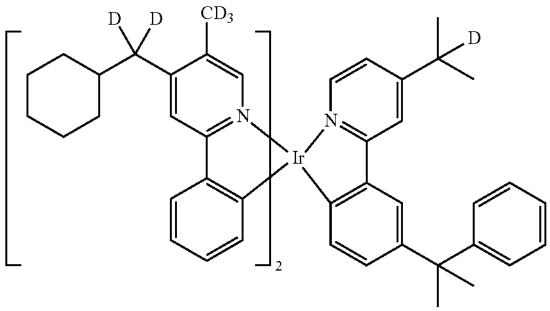
1308
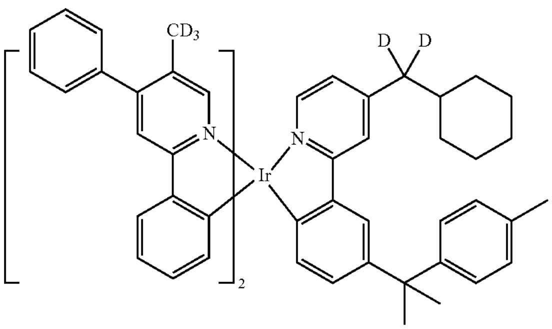
1309
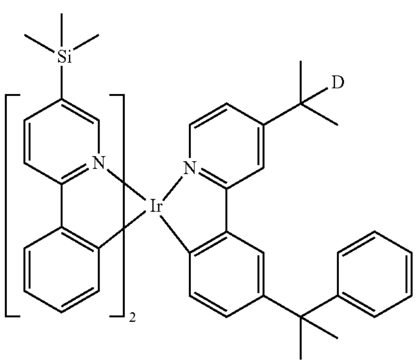
1310
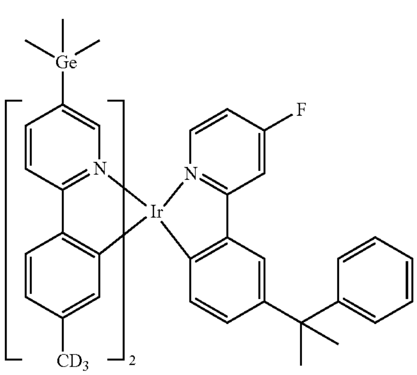
1311
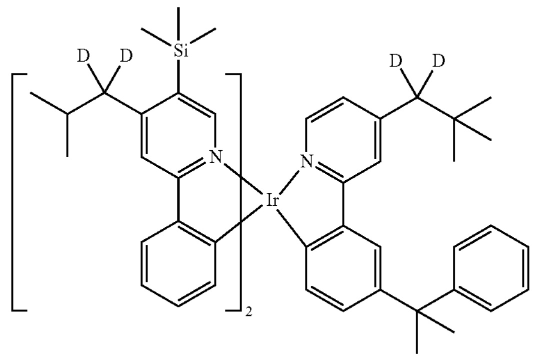
1312
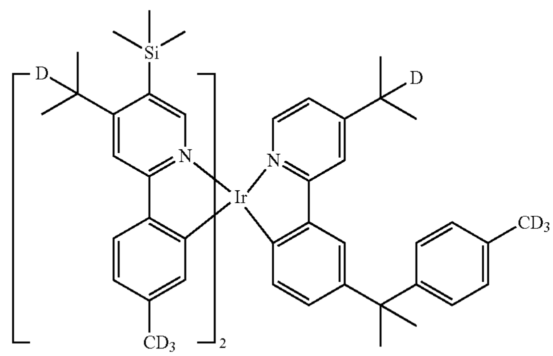
1313
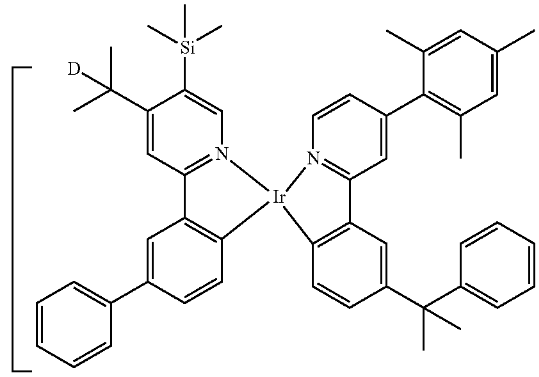
1314
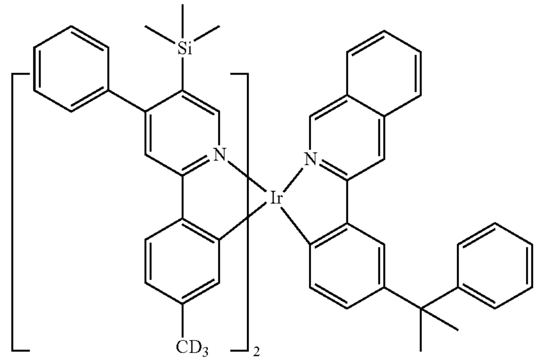

-continued
1315
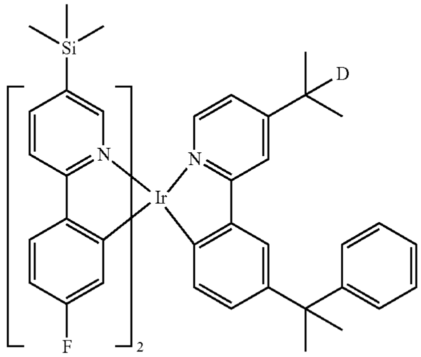
1316
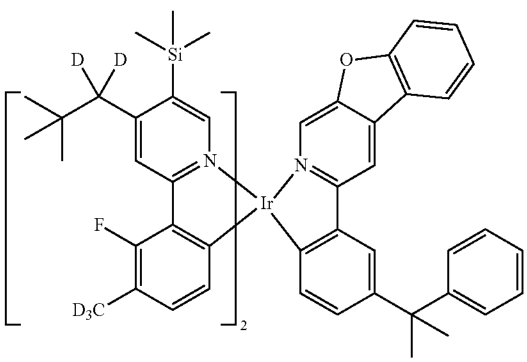
1317
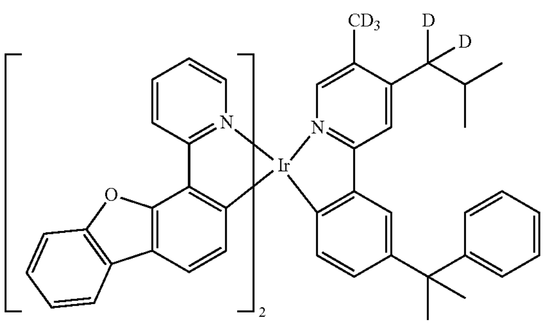
1318
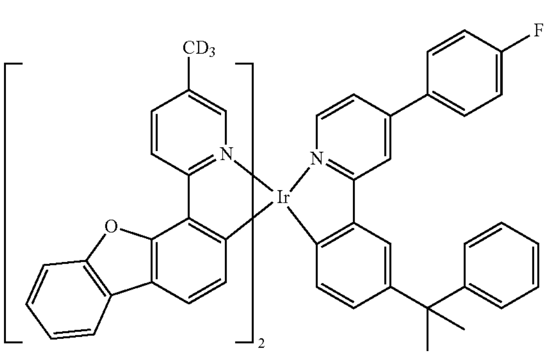
-continued
1319
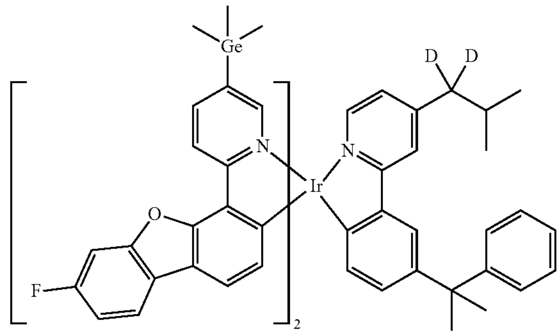
1320
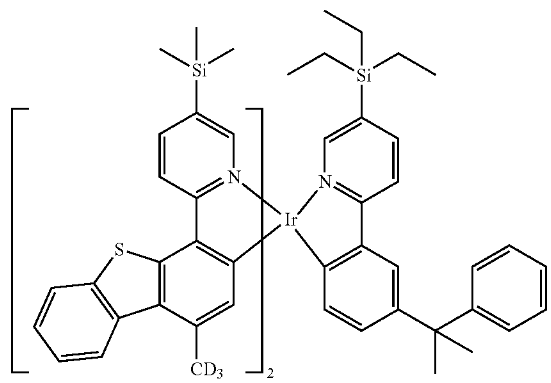
1321
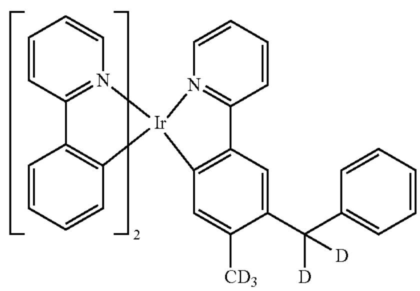
1322
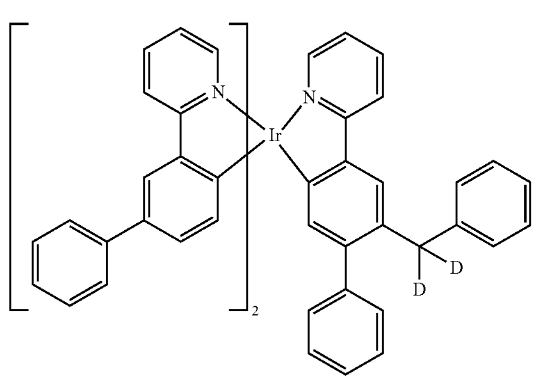

-continued
1323
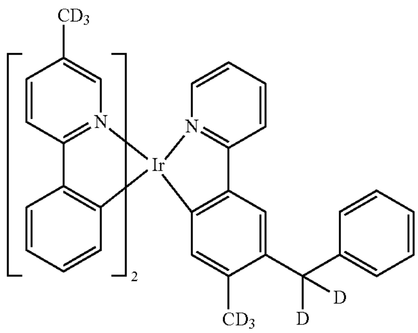
1324
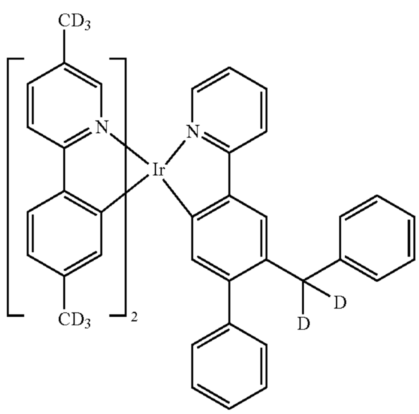
1325
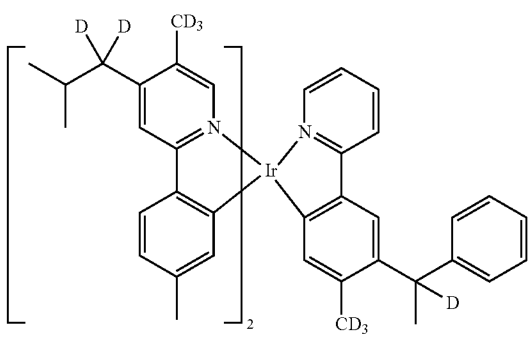
1326
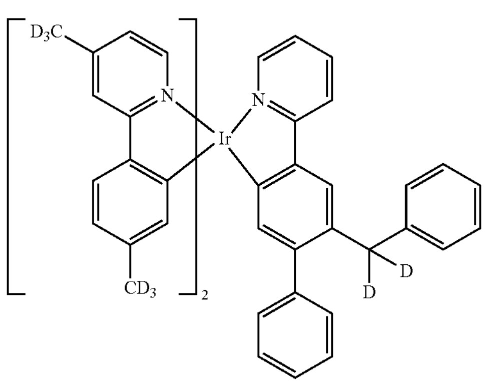
-continued
1327
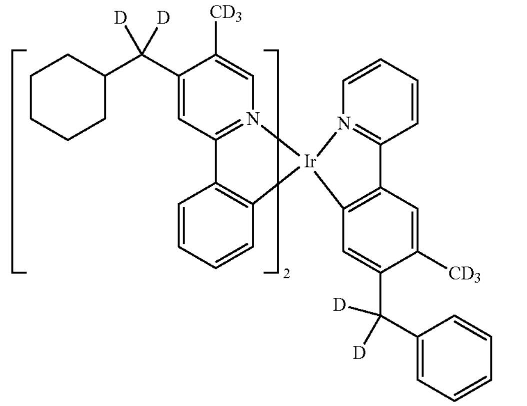
1328
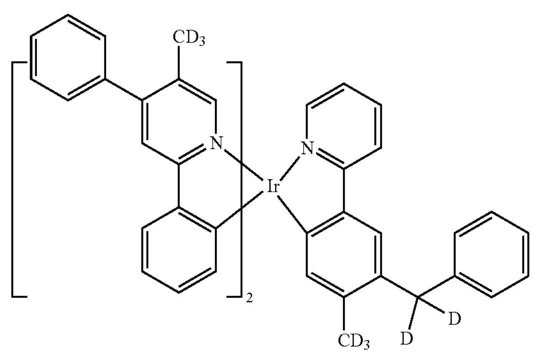
1329
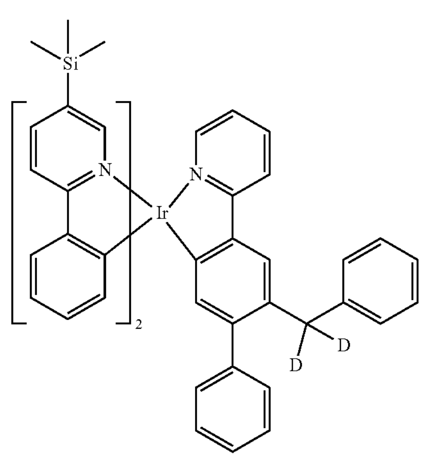

-continued
1330
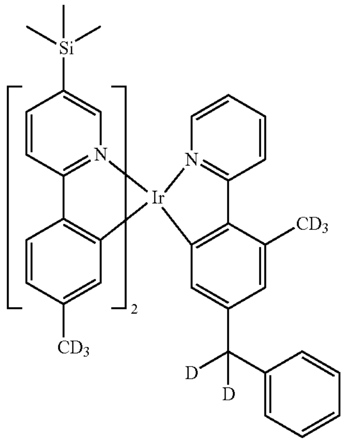
1331
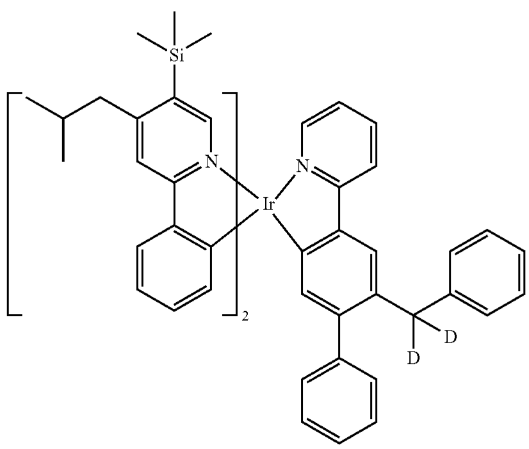
1332
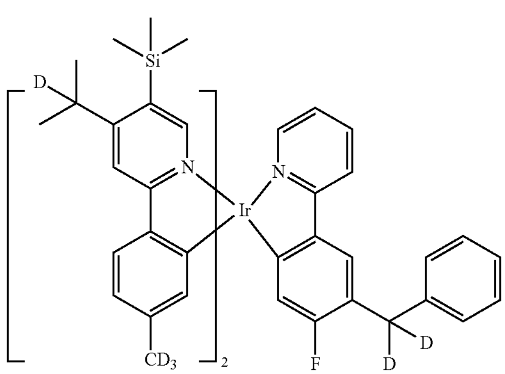
-continued
1333
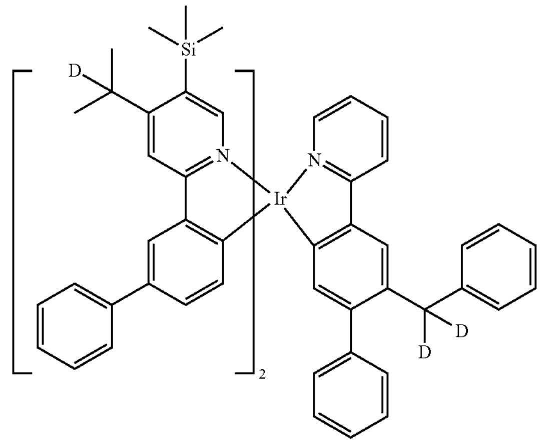
1334
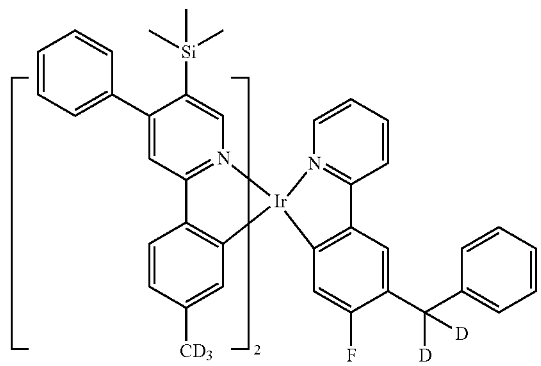
1335
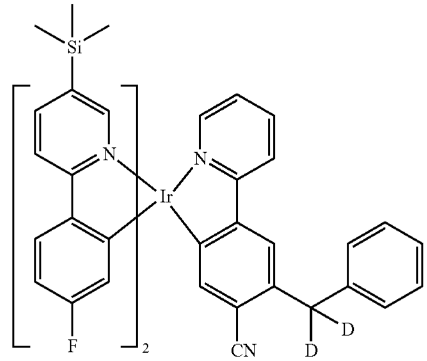
1336
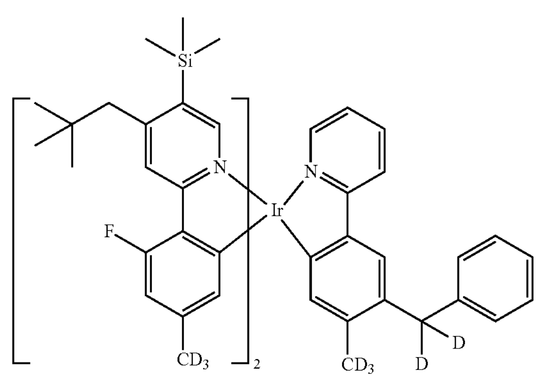

1337
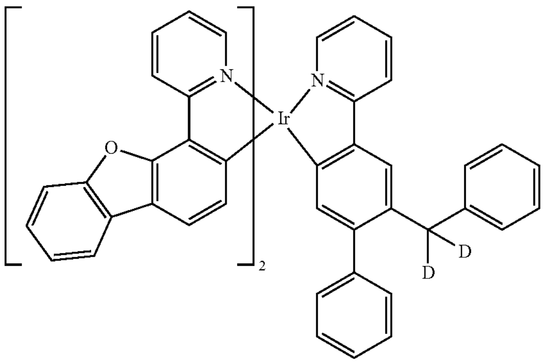
1338
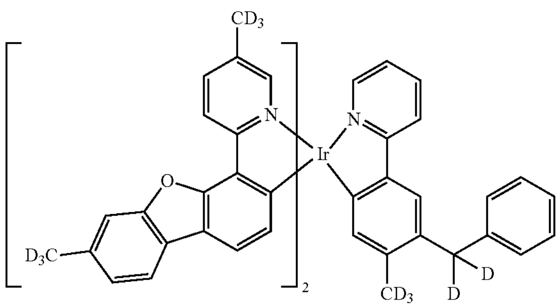
1339
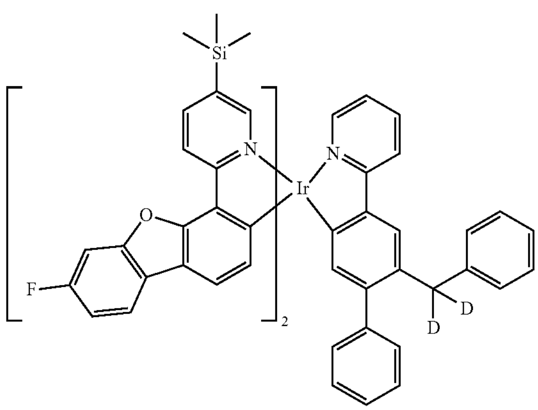
1340
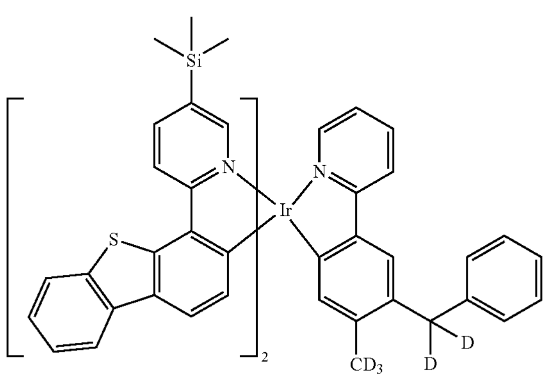
1341
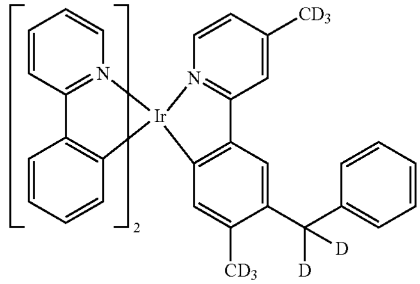
1342
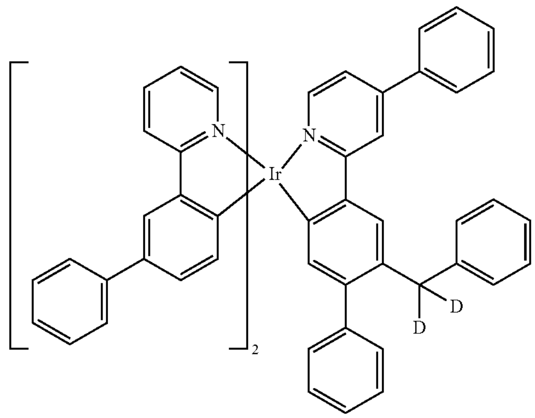
1343
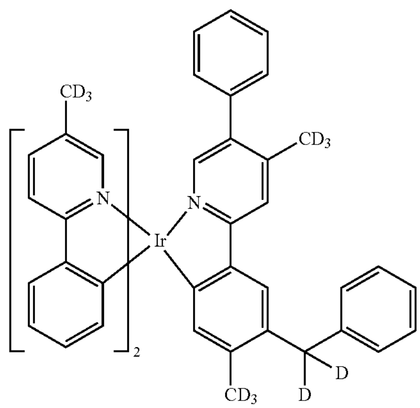
1344
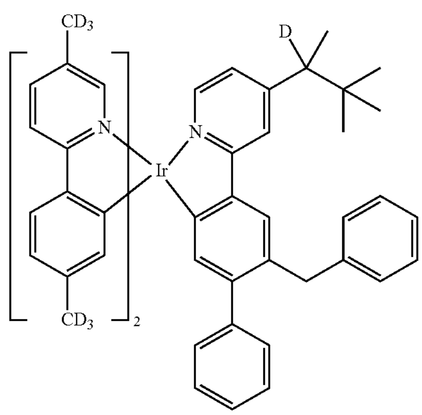

1345
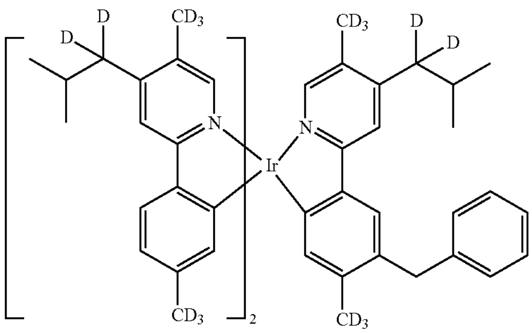
1346
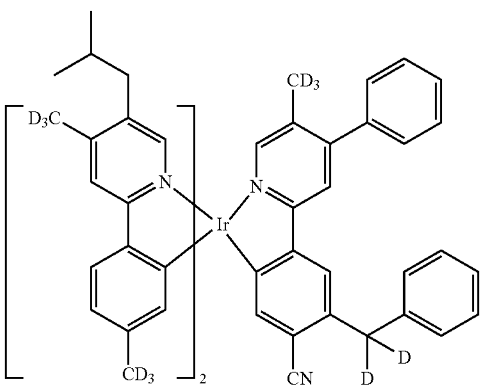
1347
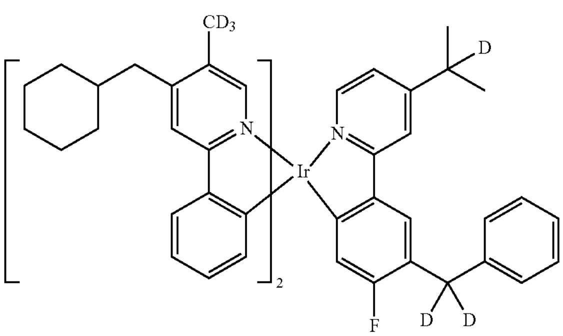
1348
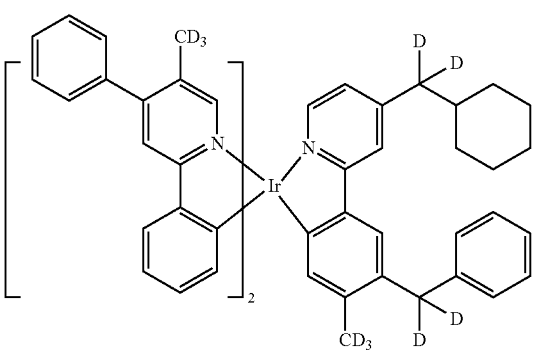
1349
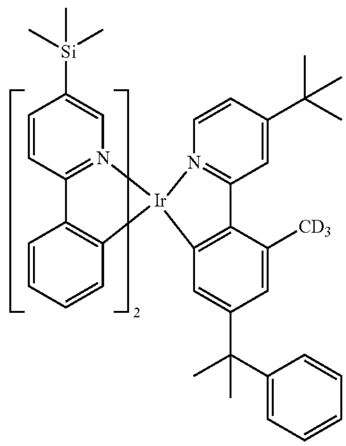
1350
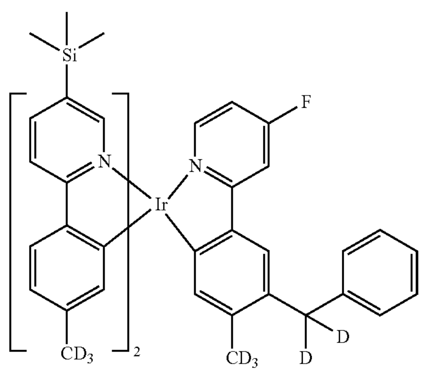
1351
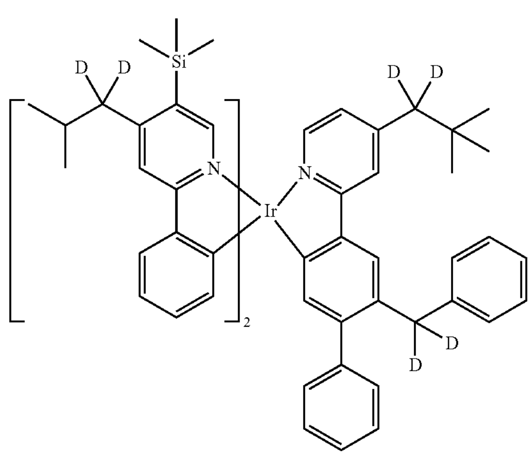

-continued
1352
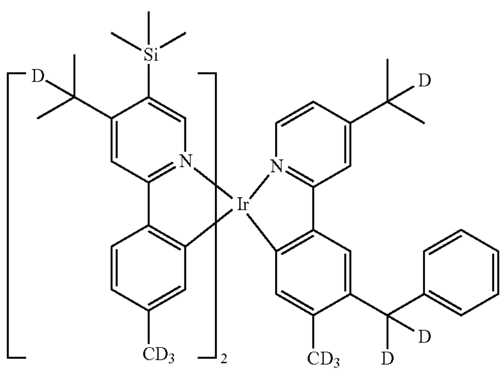
1353
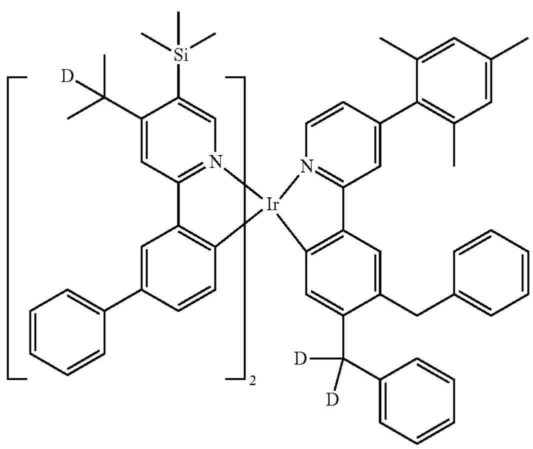
1354
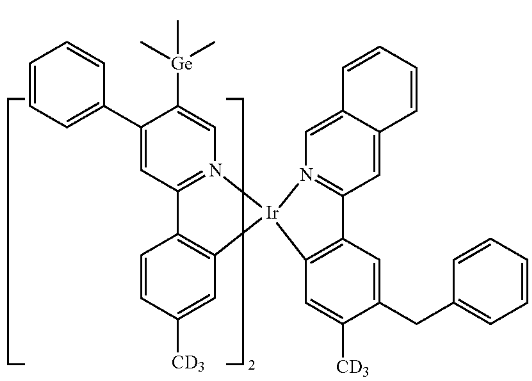
-continued
1355
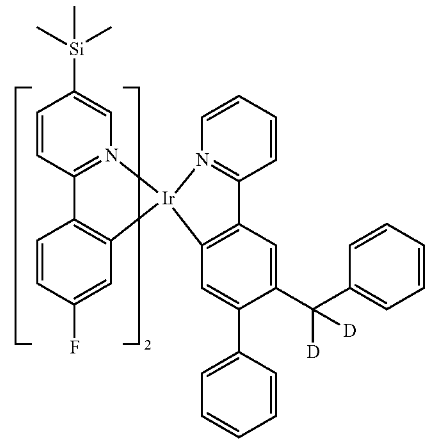
1356
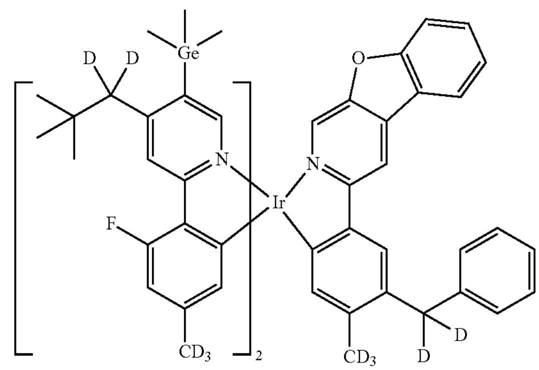
1357
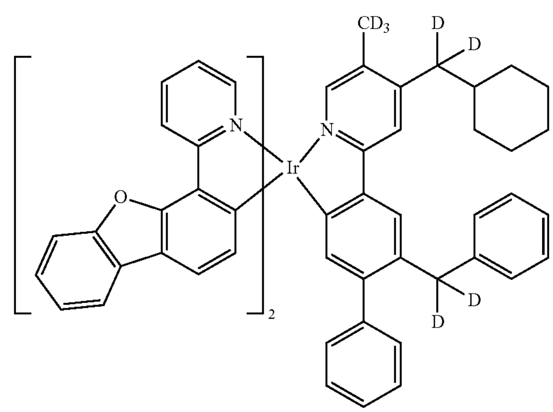
1358
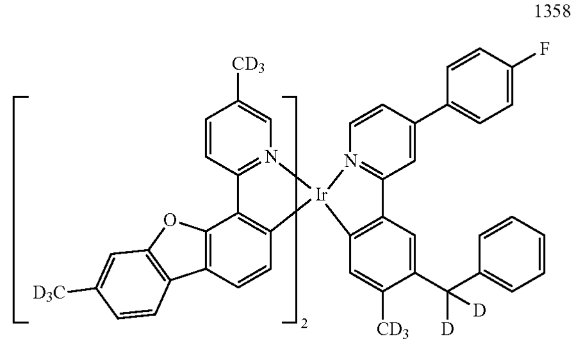

-continued
1359
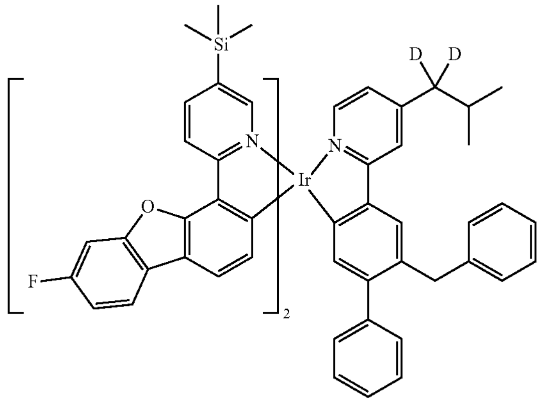
1360
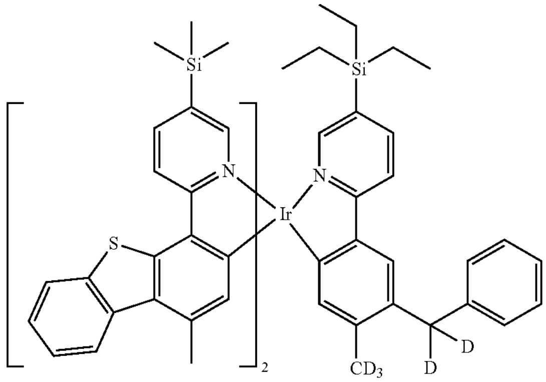
1361
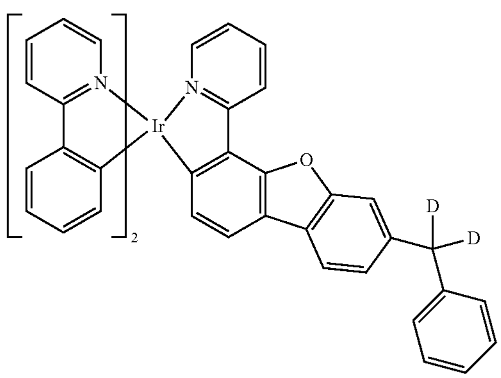
1362
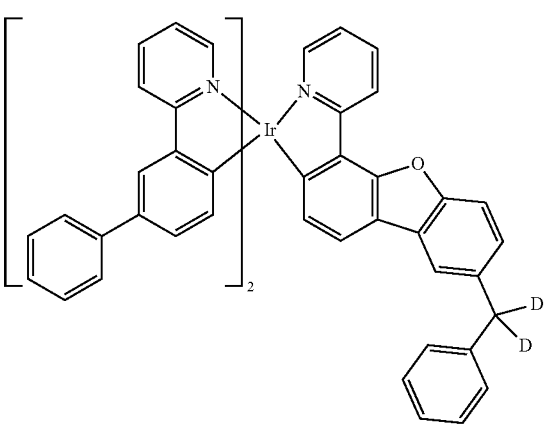
-continued
1363
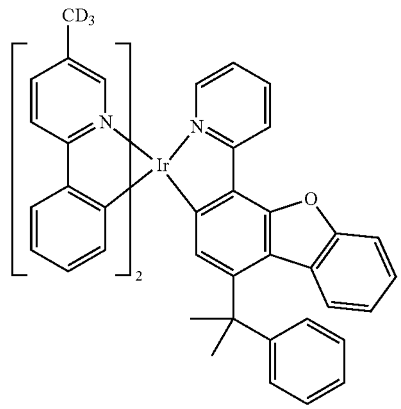
1364
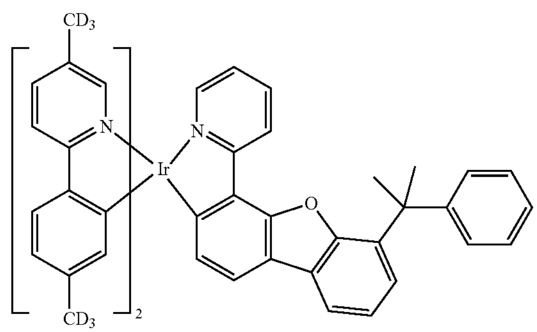
1365
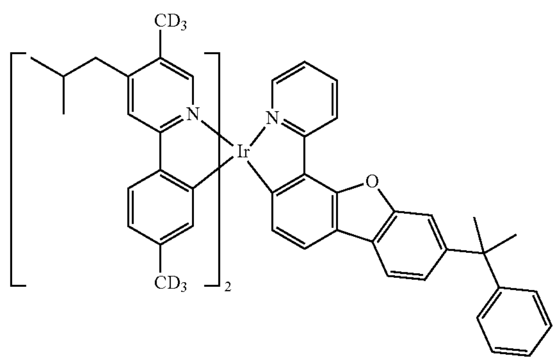
1366
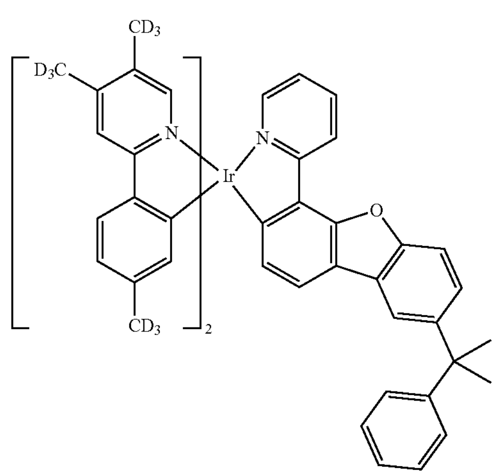

-continued
1367
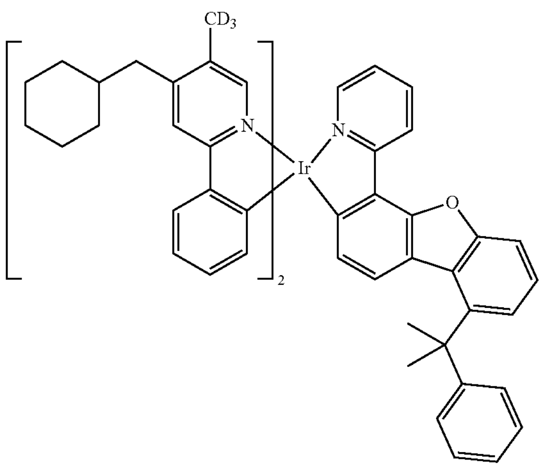
1368
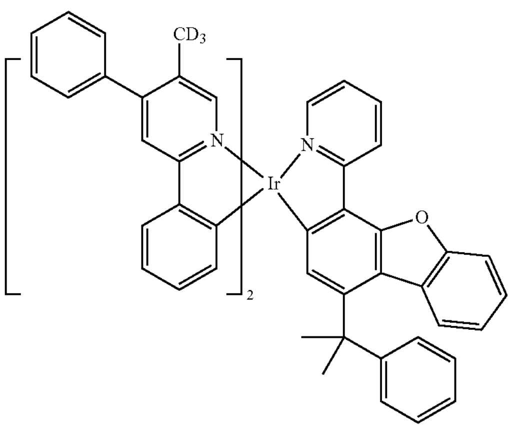
1369
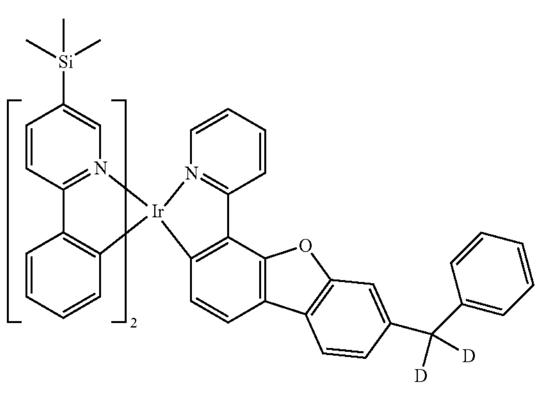
-continued
1370
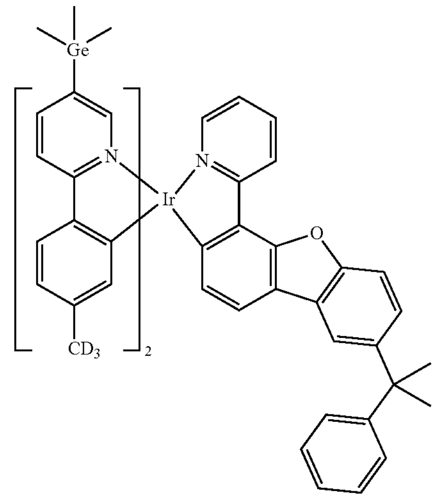
1371
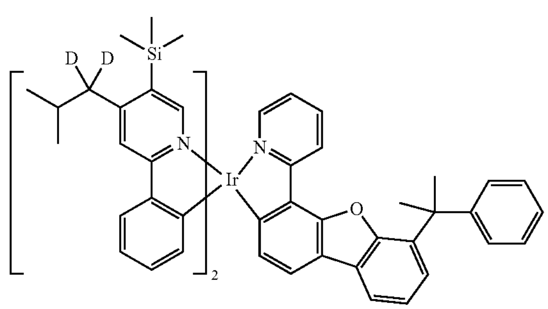
1372
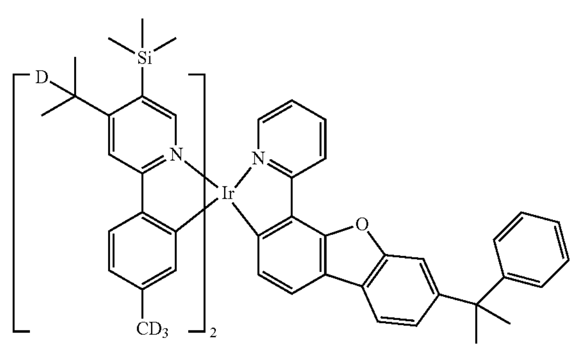

1373
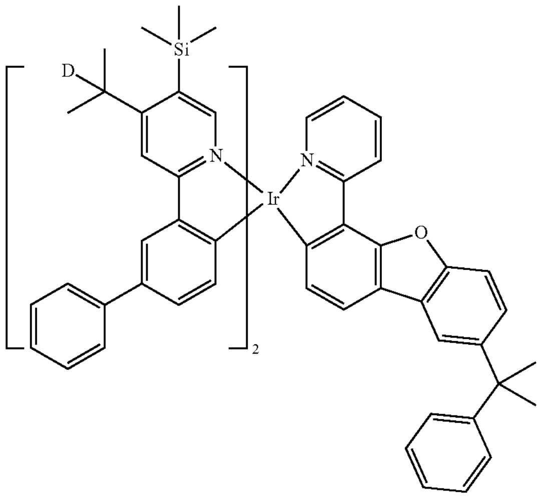
1374
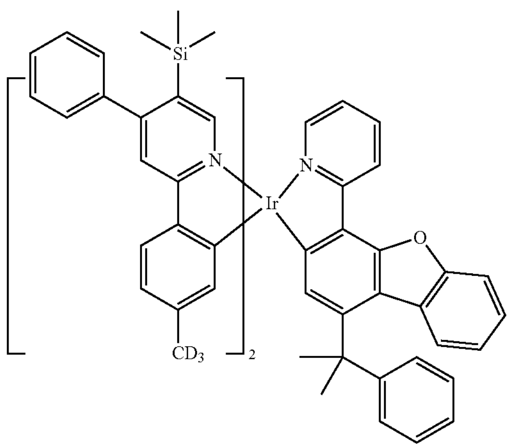
1375
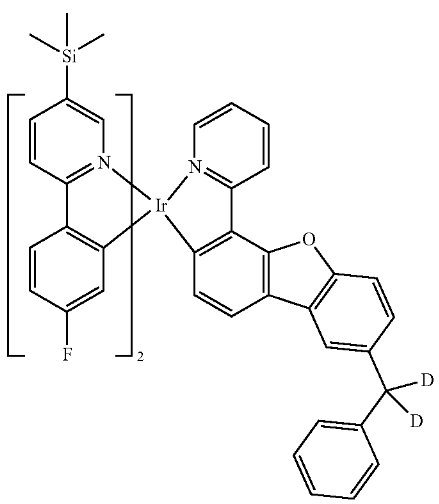
1376
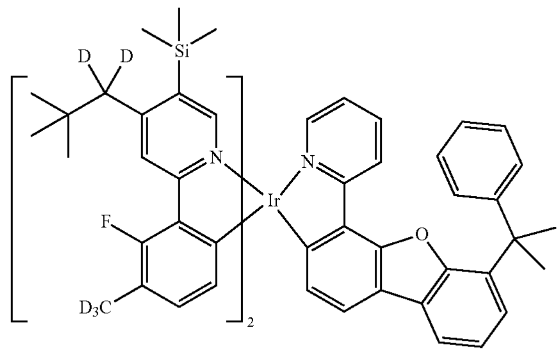
1377
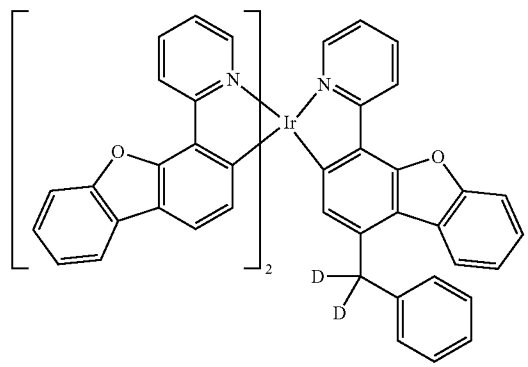
1378
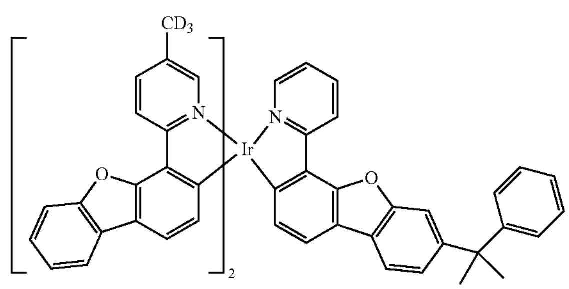
1379
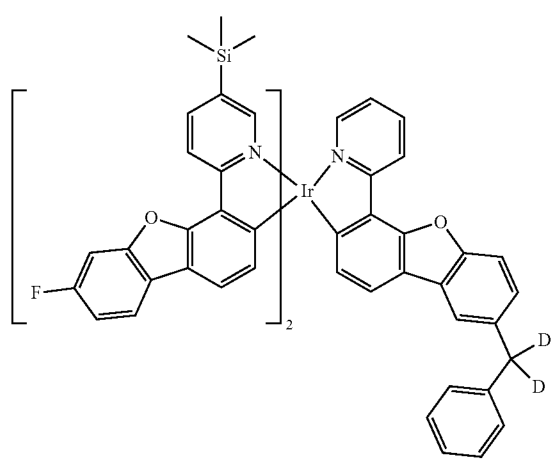

1380
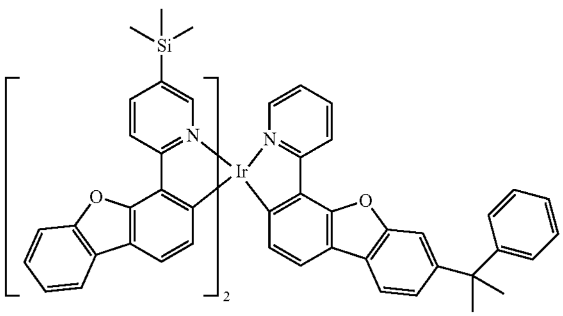
1381
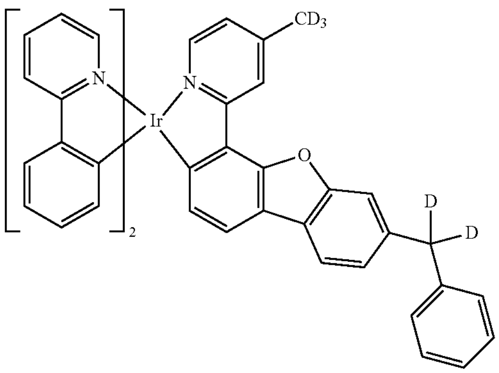
1382
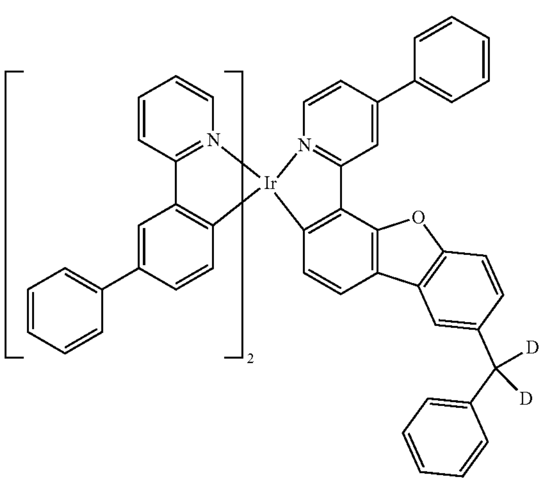
1383
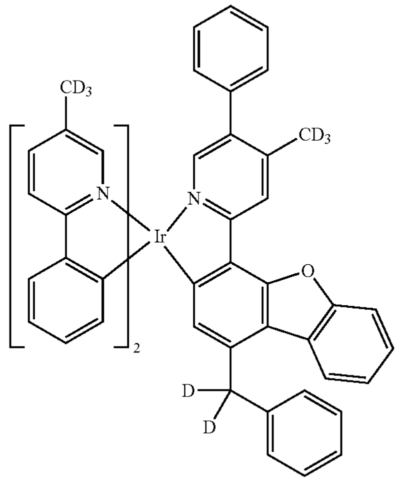
1384
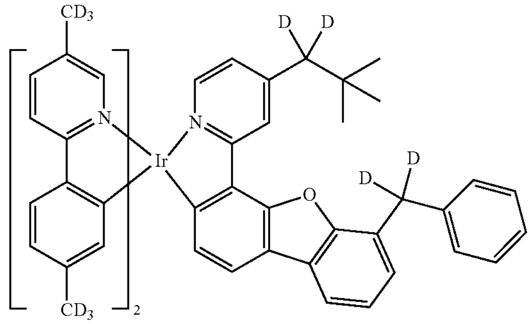
1385
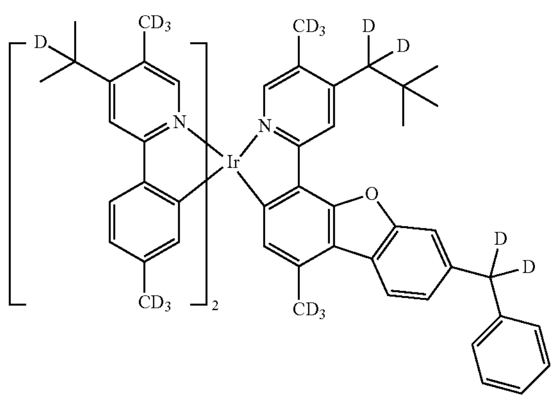

-continued
1386
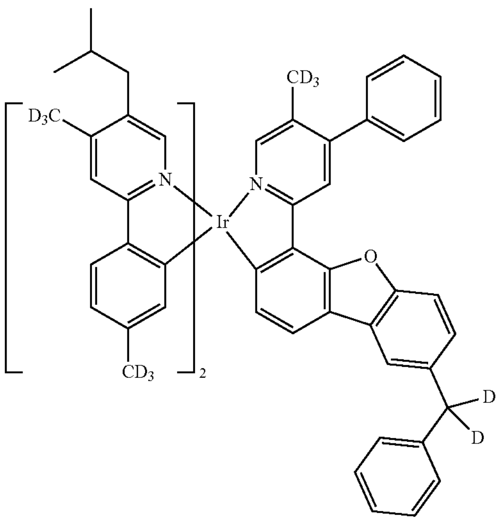
1387
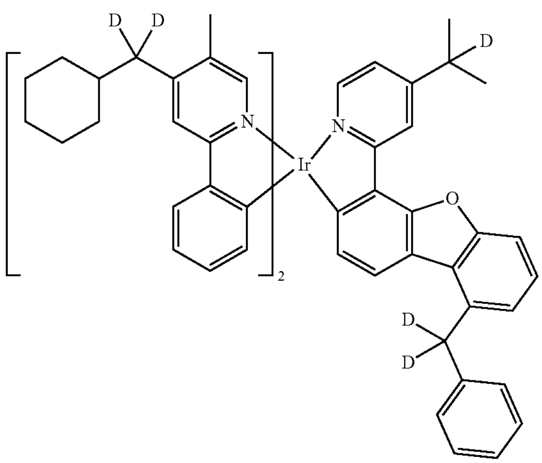
1388
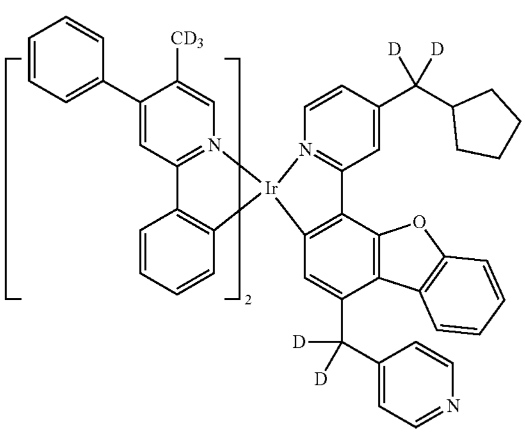
-continued
1389
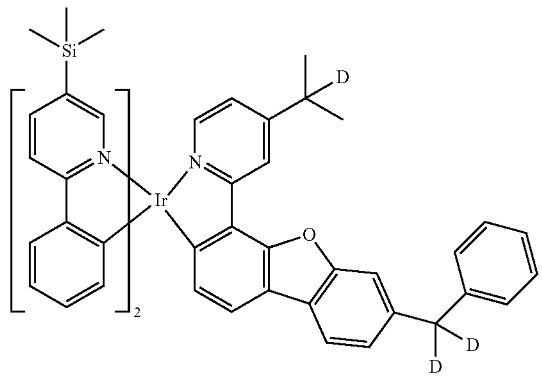
1390
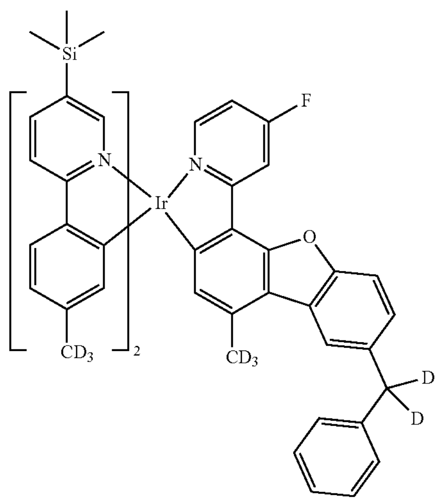
1391
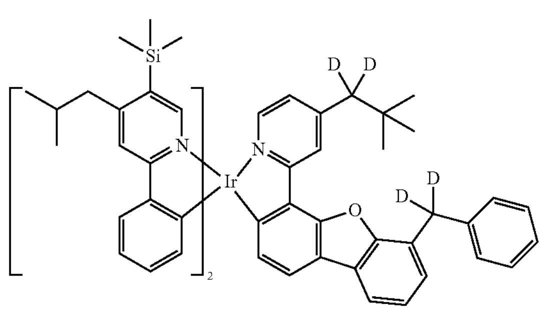
1392
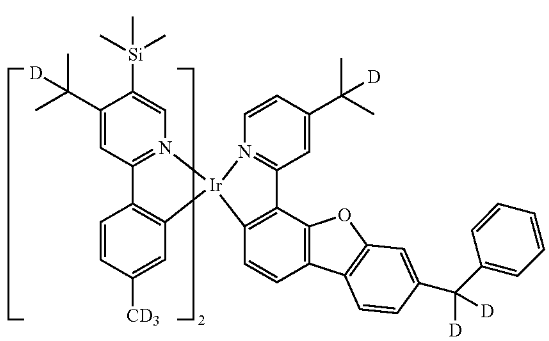

-continued
1393
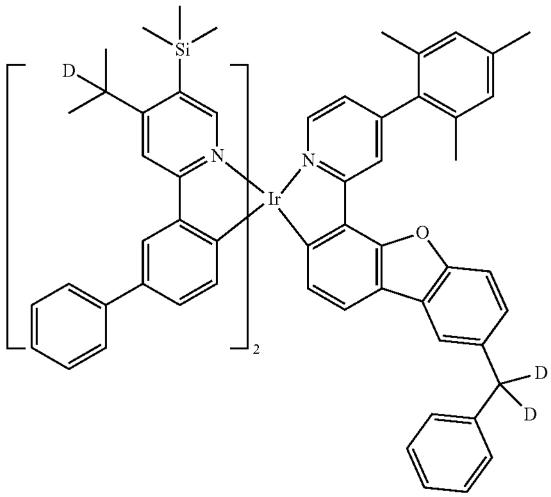
1394
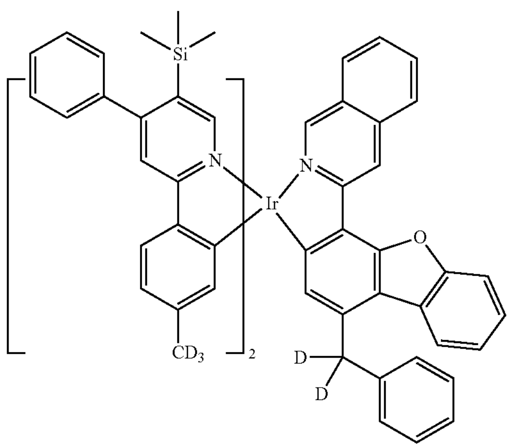
1395
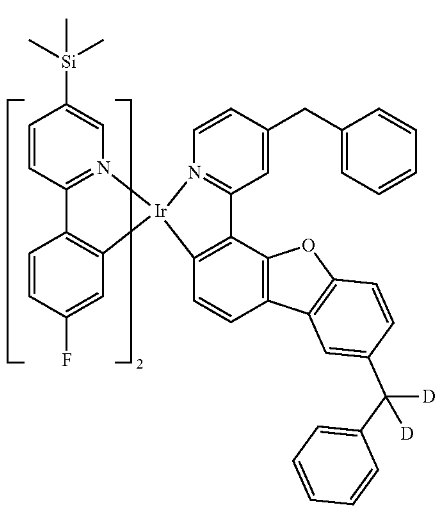
-continued
1396
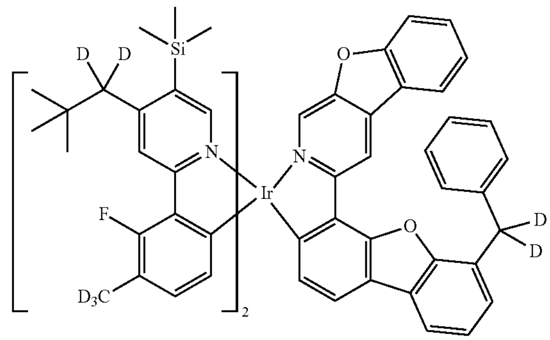
1397
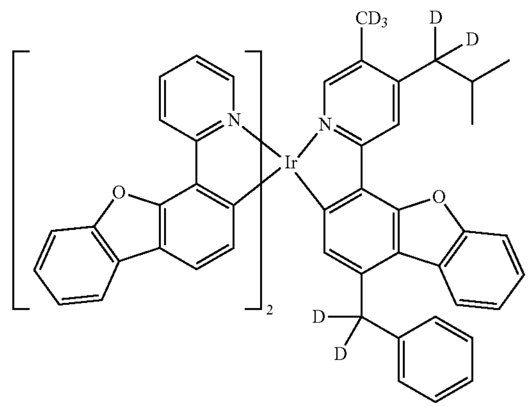
1398
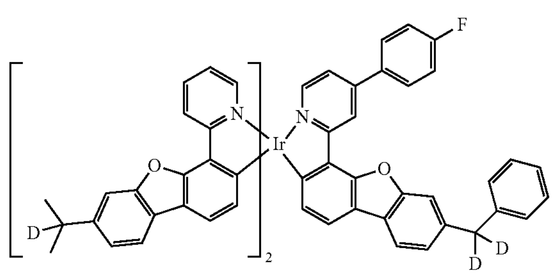
1399
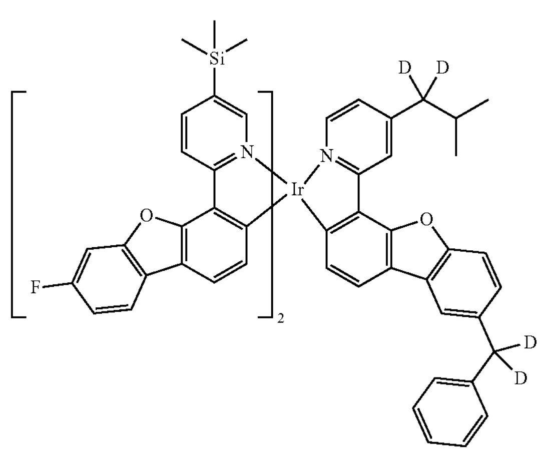

-continued
1400
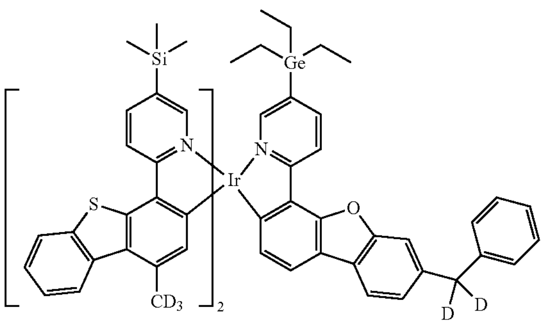
1401
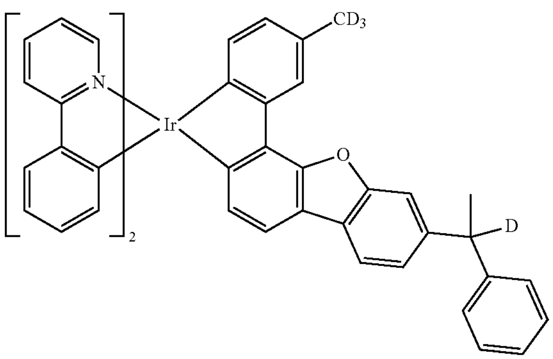
1402
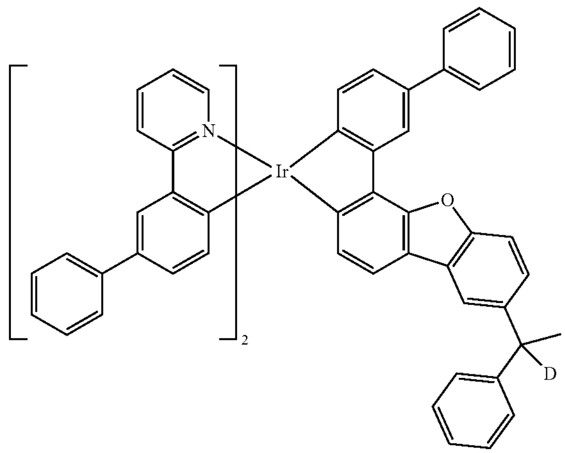
1403
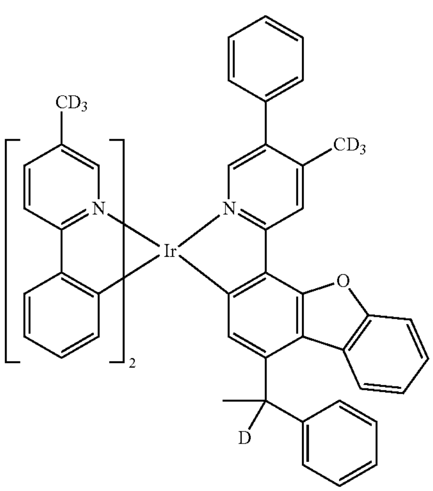
1404
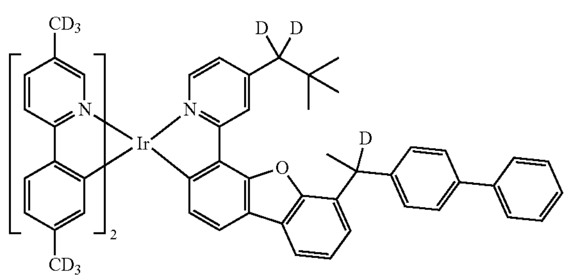

-continued
1405
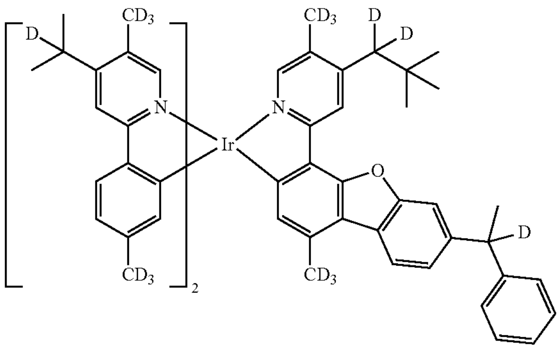
1406
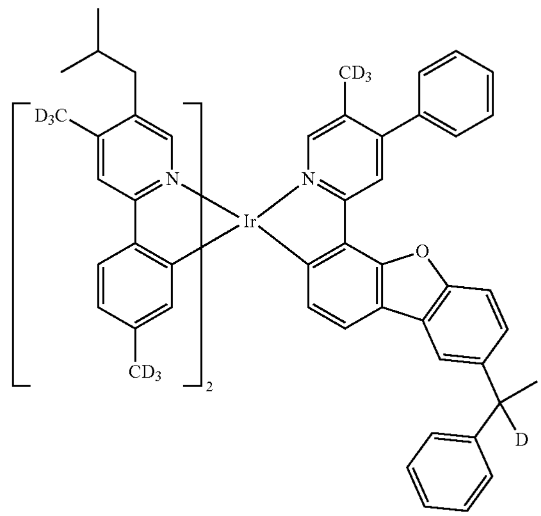
1407
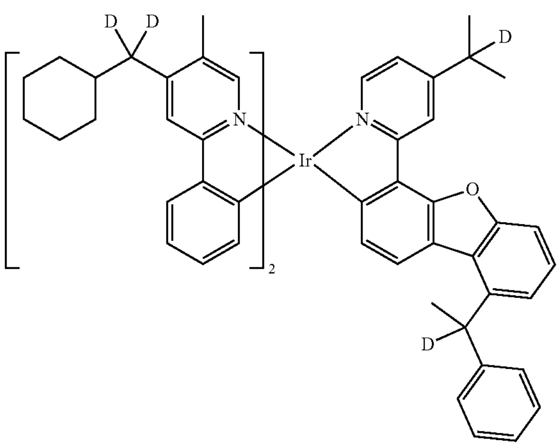
1408
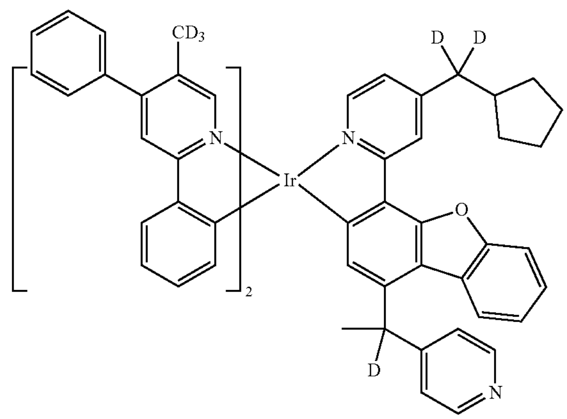
1409
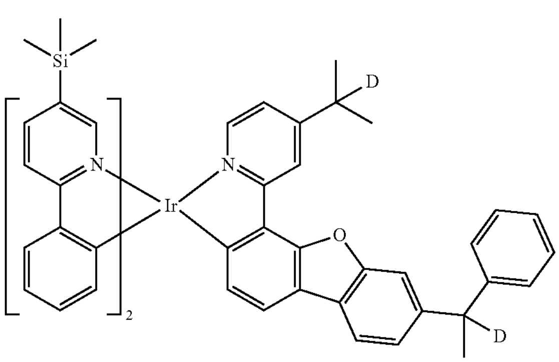
1410
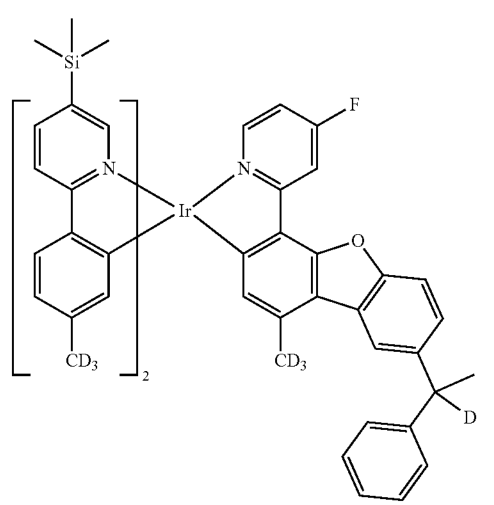

-continued
1411
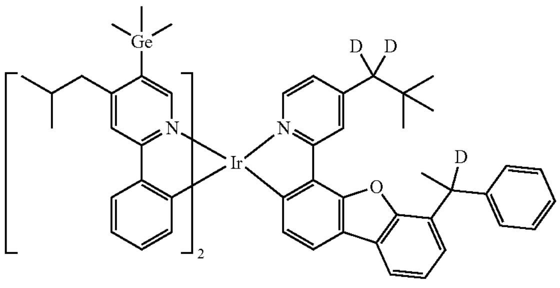
1412
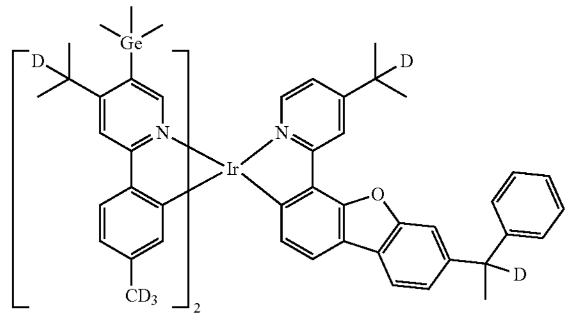
1413
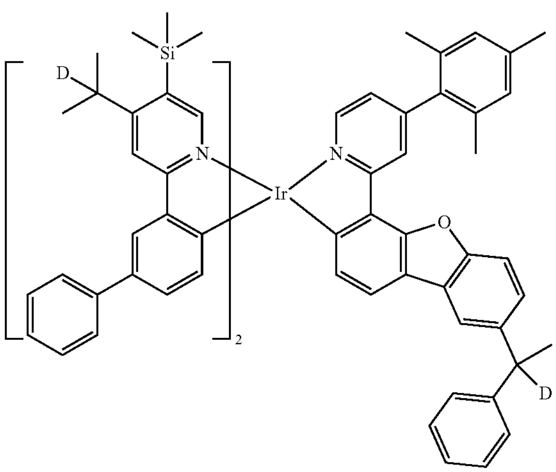
1414
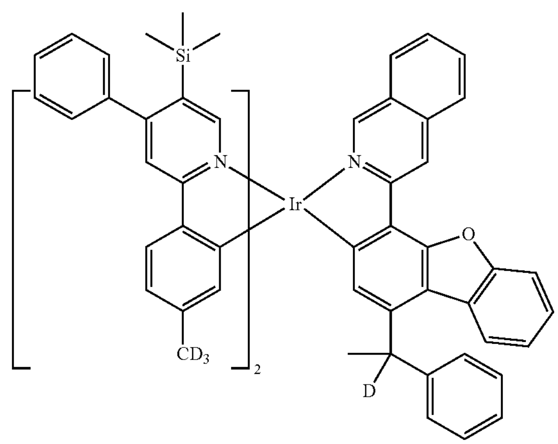
1415
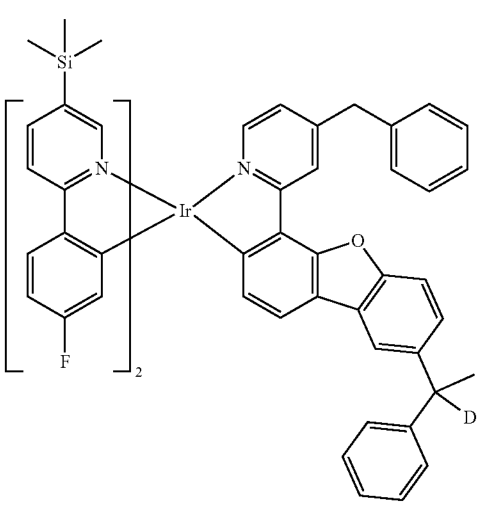
1416
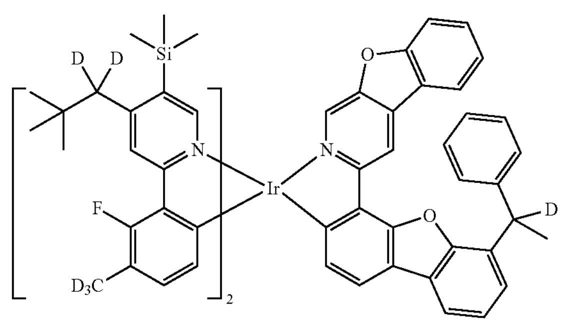

-continued
1417
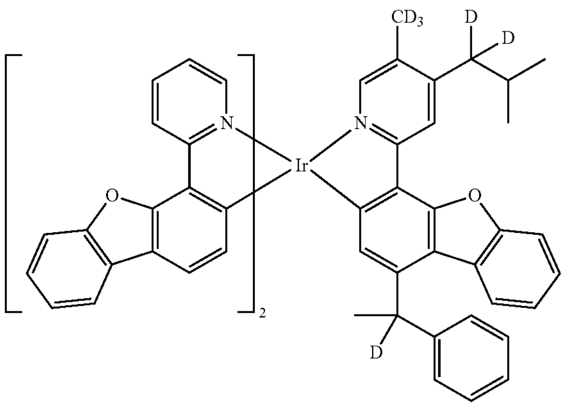
1418
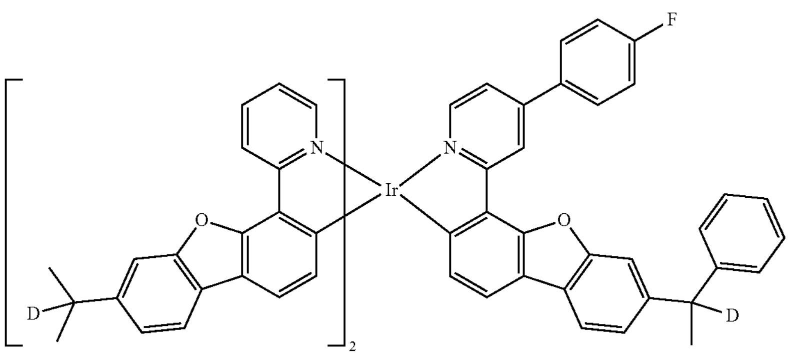
1419
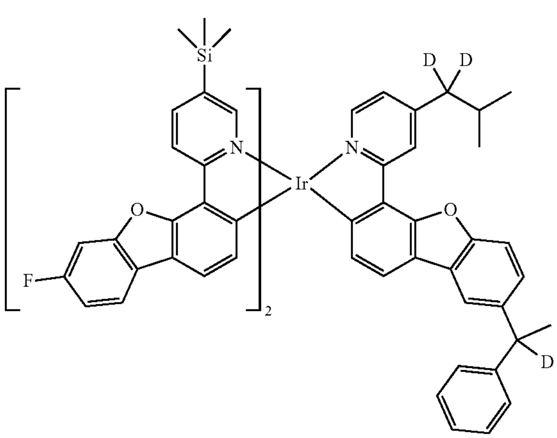
1420
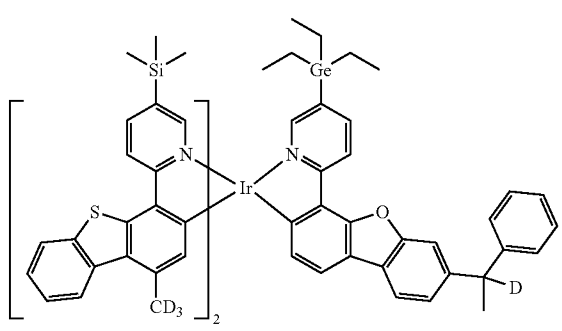

-continued
1421
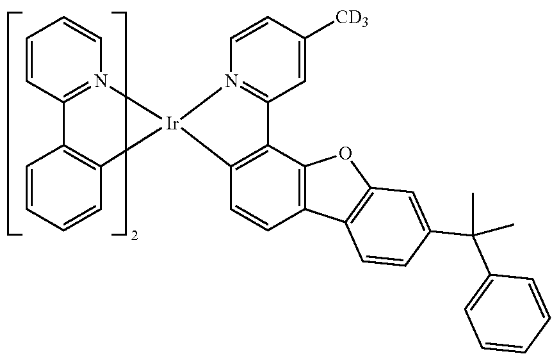
1422
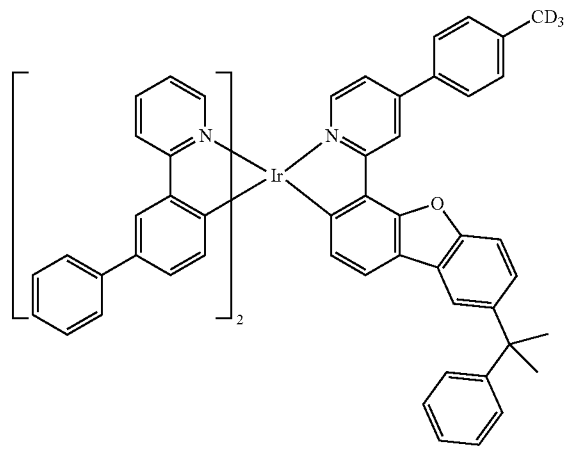
1423
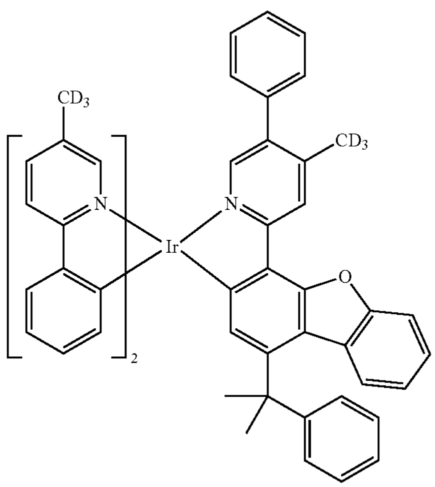
1424
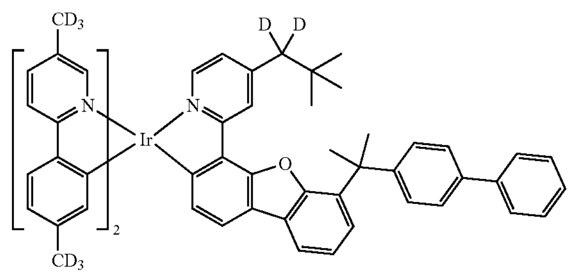
1425
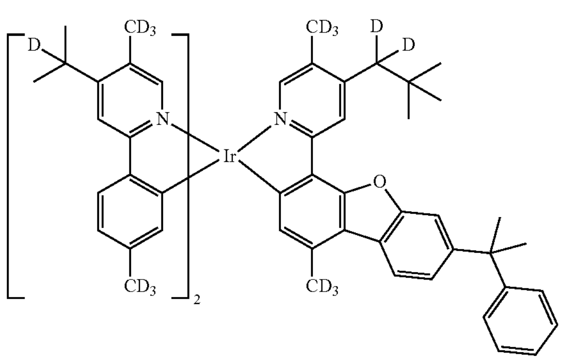
1426
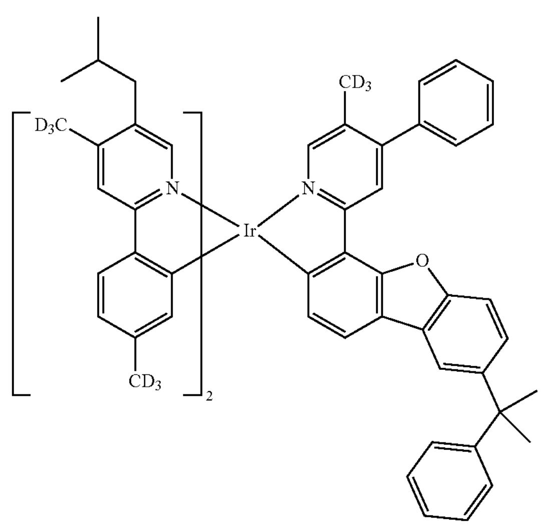

-continued
1427
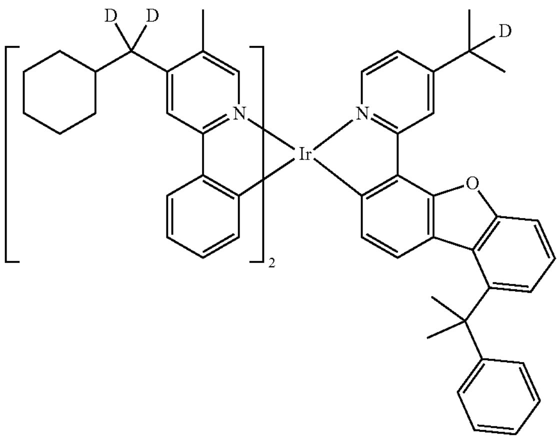
1428
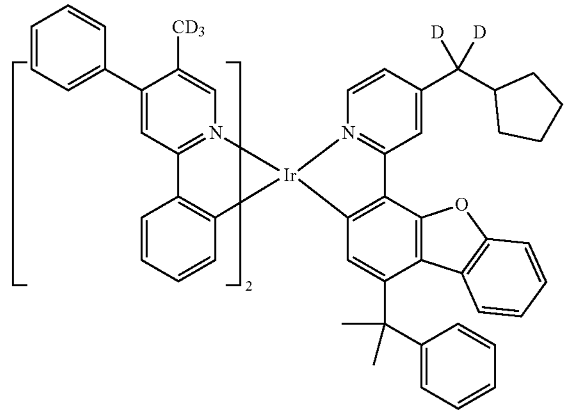
1429
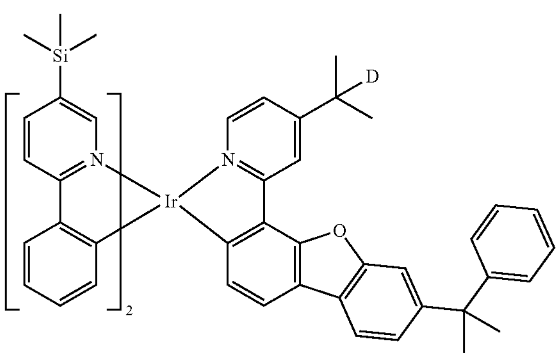
1430
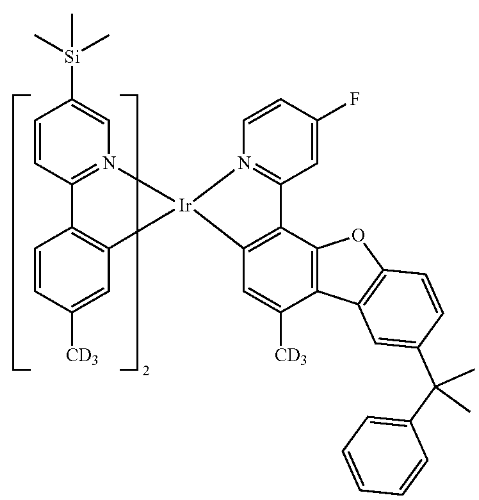
1431
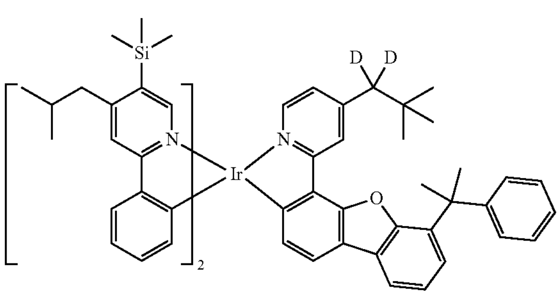
1432
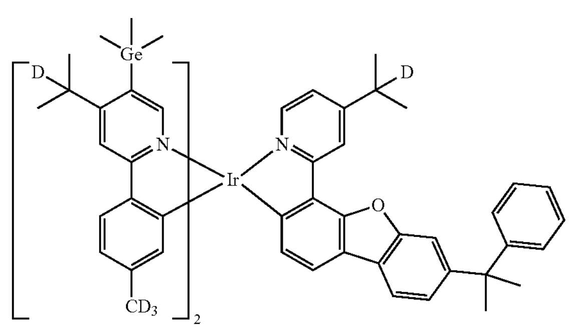

-continued
1433
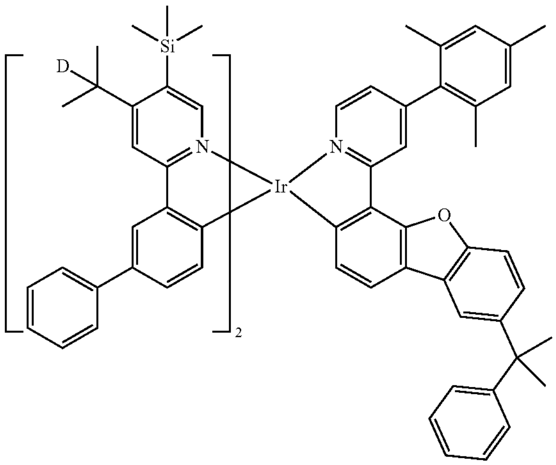
1434
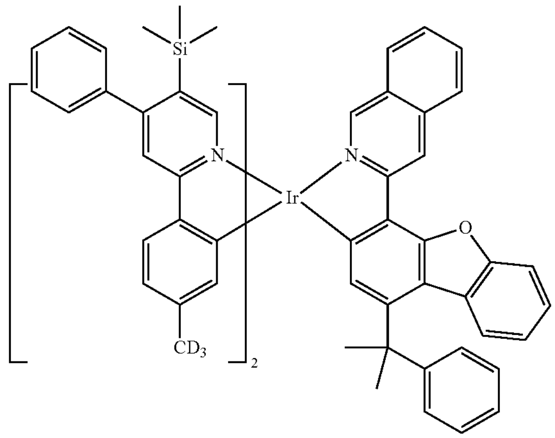
1435
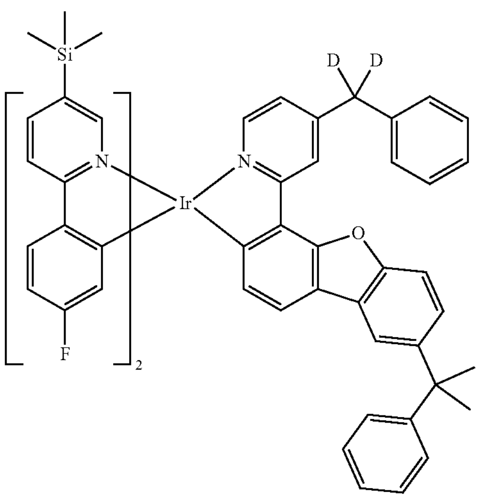
1436
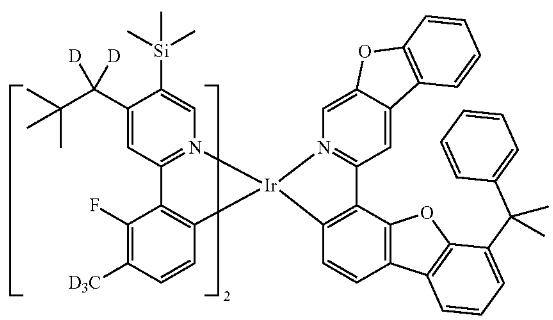
1437
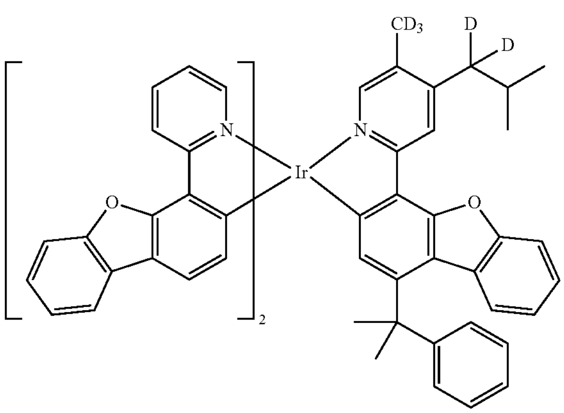

-continued
1438
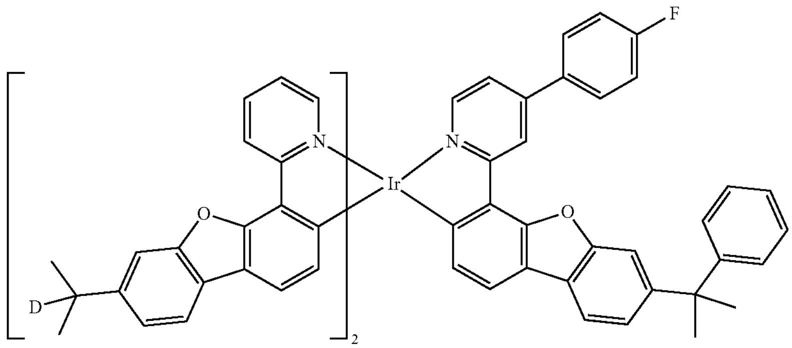
1439
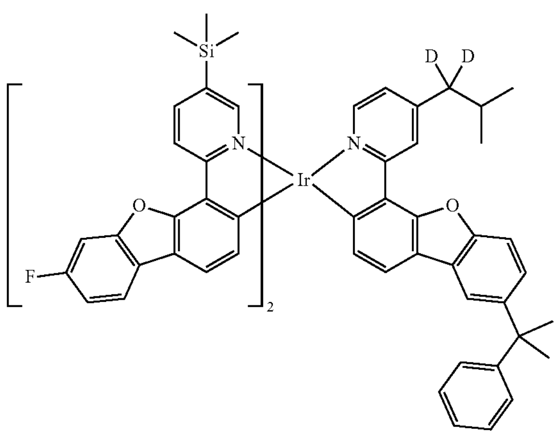
1440
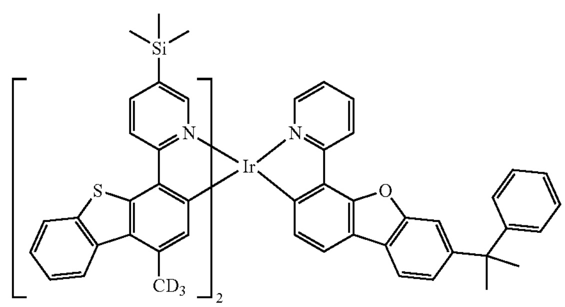
1441
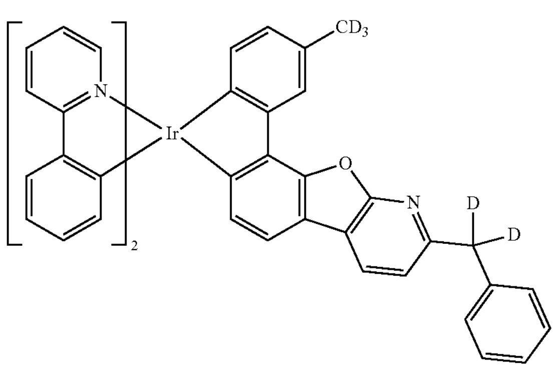
1442
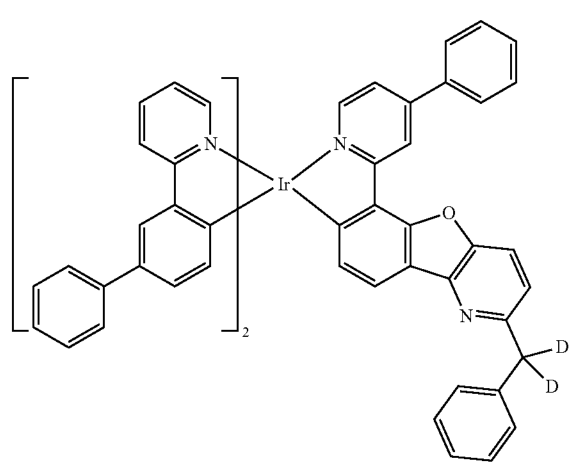

-continued
1443
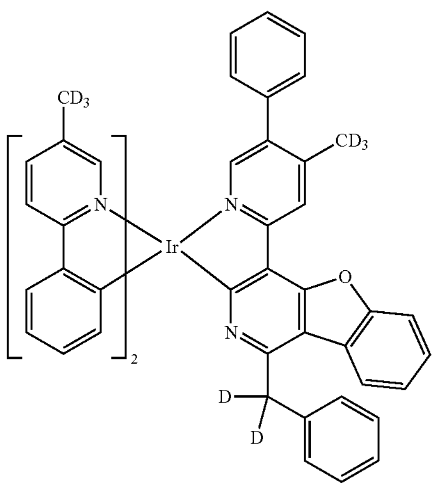
1444
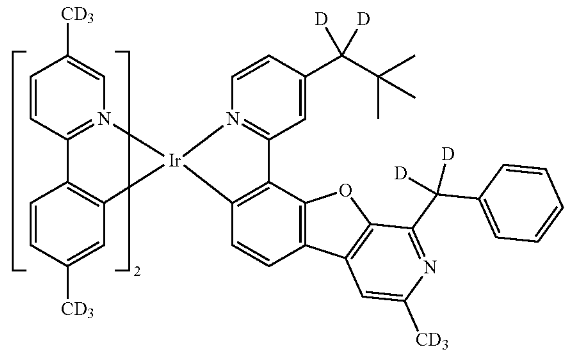
1445
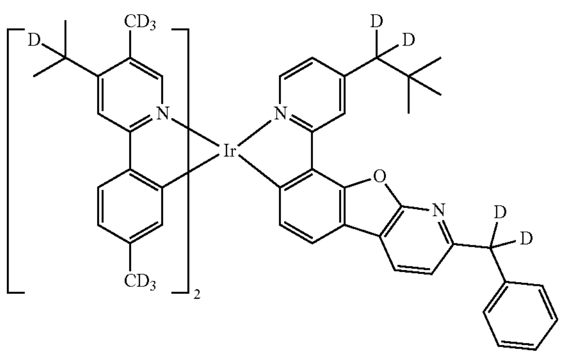
1446
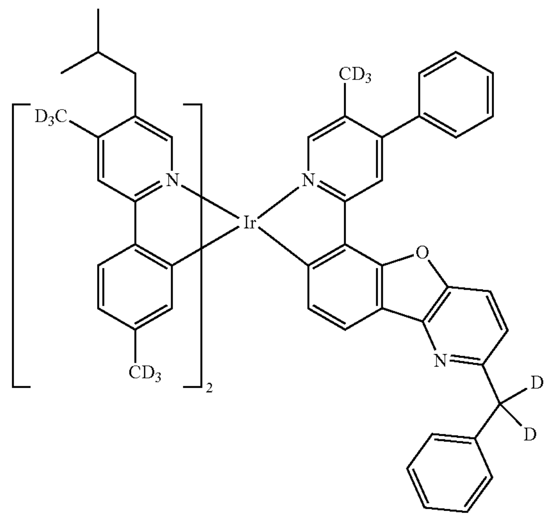
1447
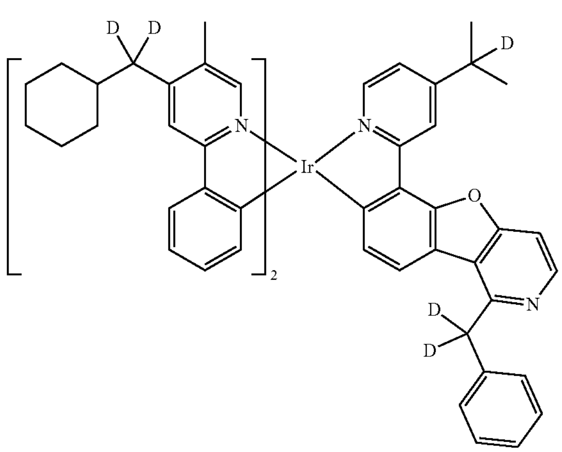
1448
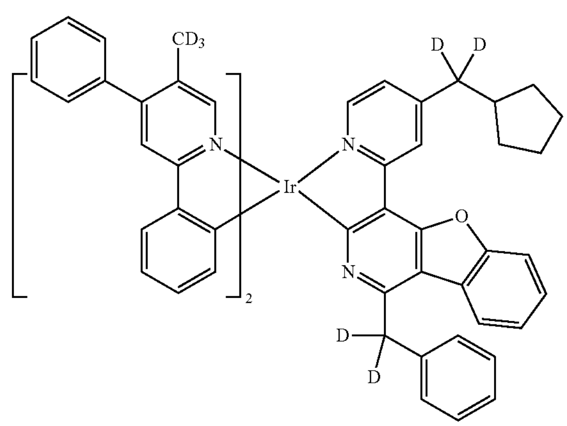

-continued
1449
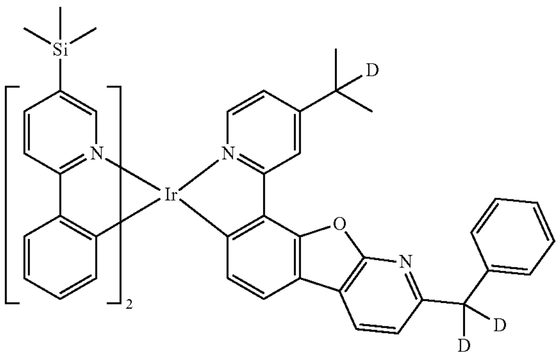
1450
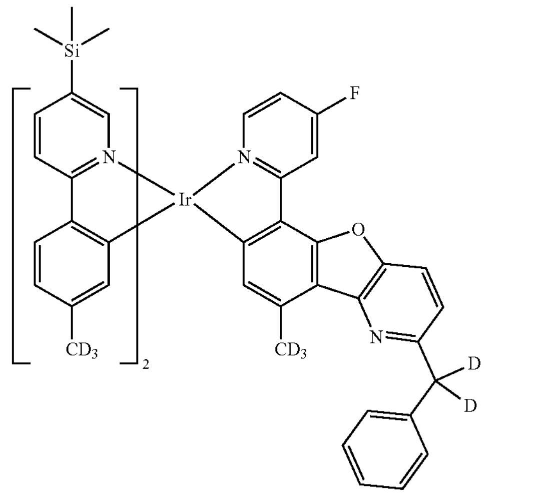
1451
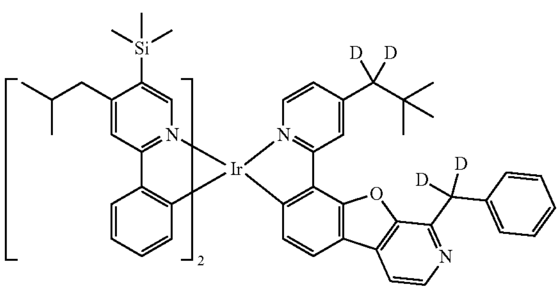
1452
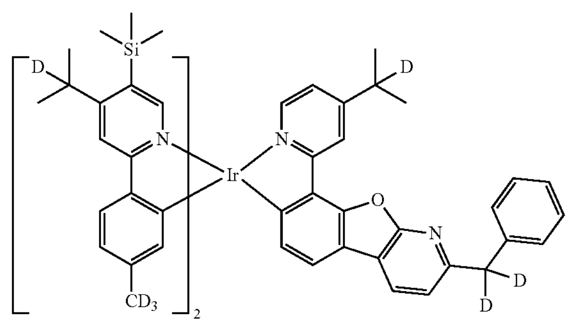
1453
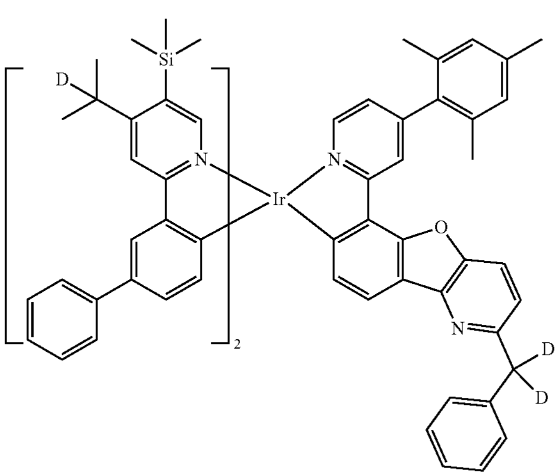
1454
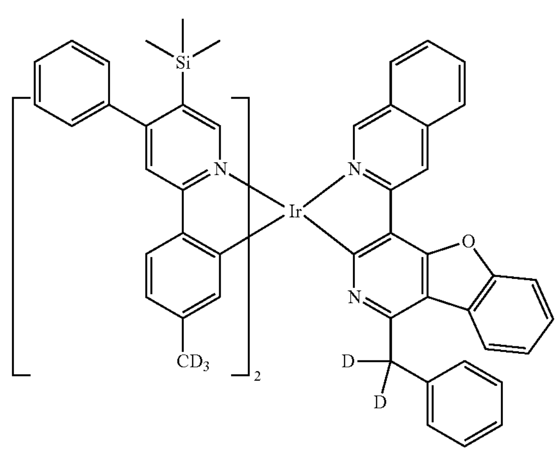

-continued
1455
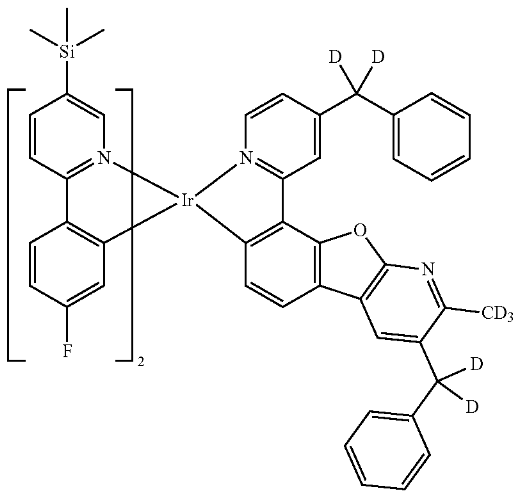
1456
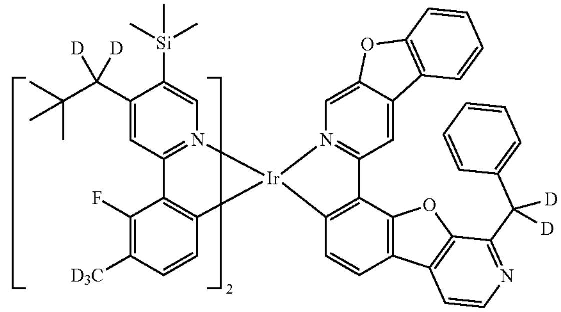
1457
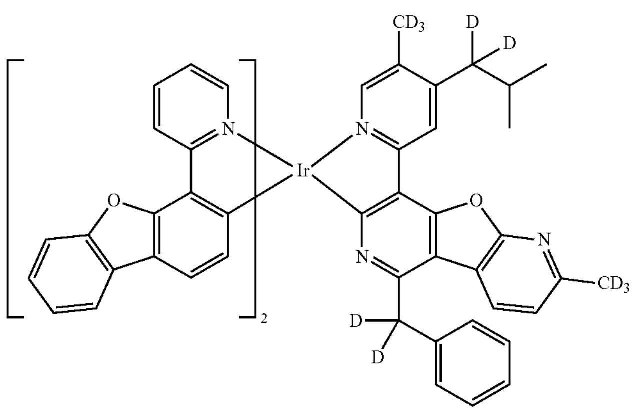
1458
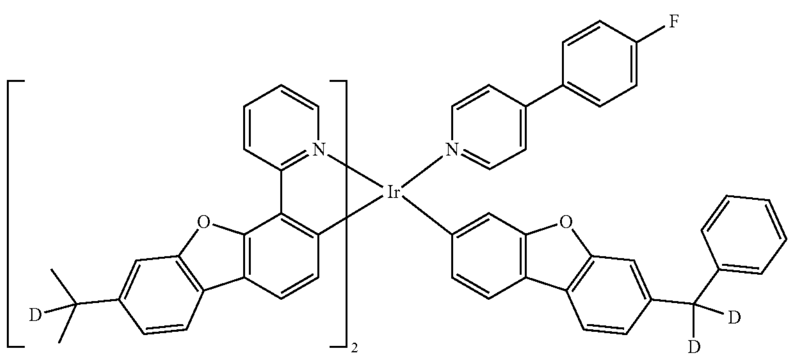

-continued
1459
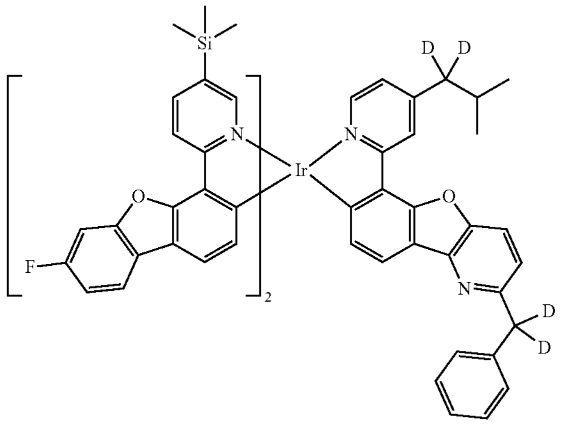
1460
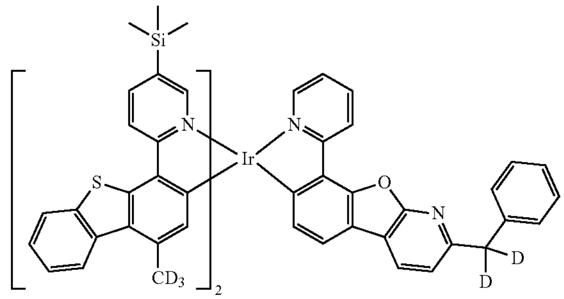
1461
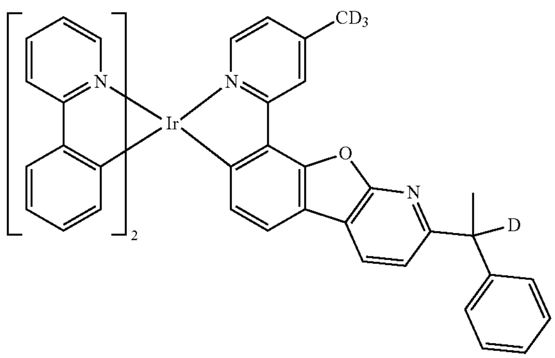
1462
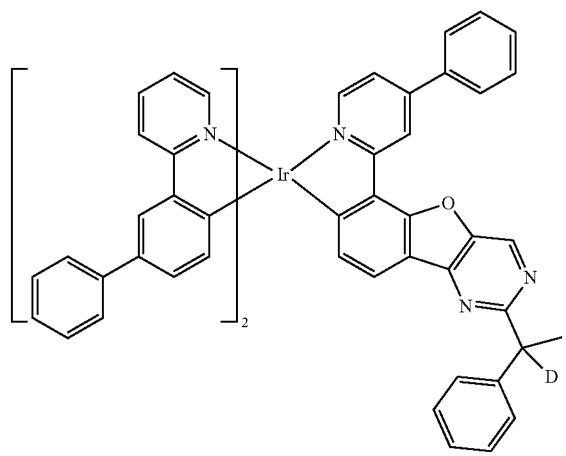
1463
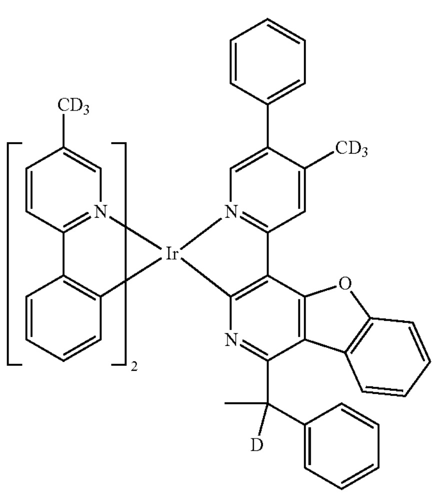
1464
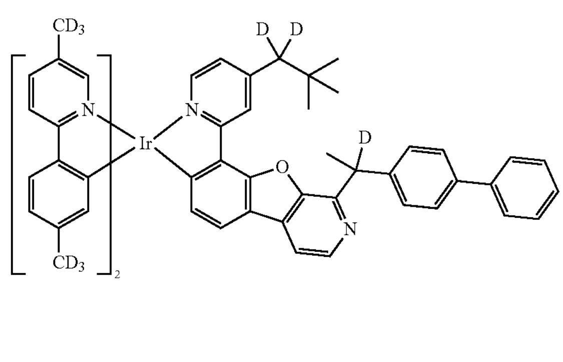

-continued
1465
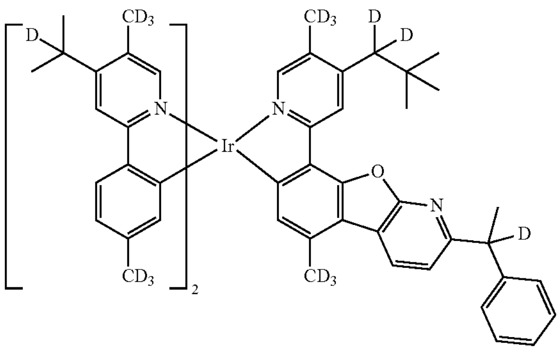
1466
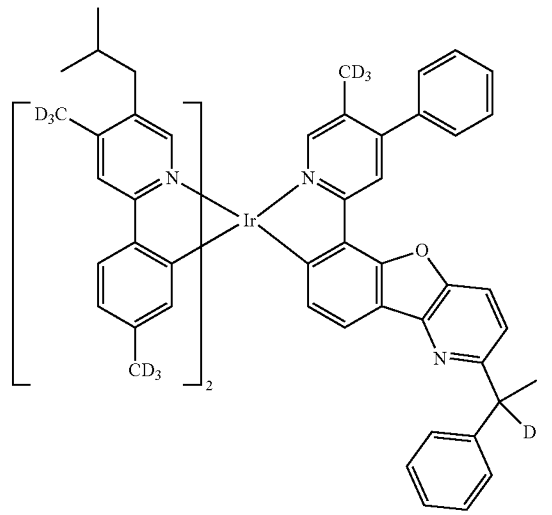
1467
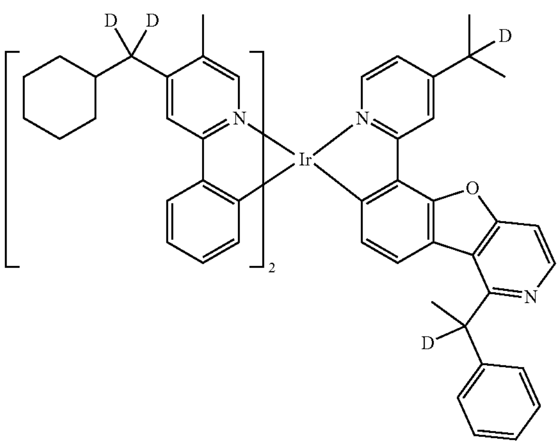
1468
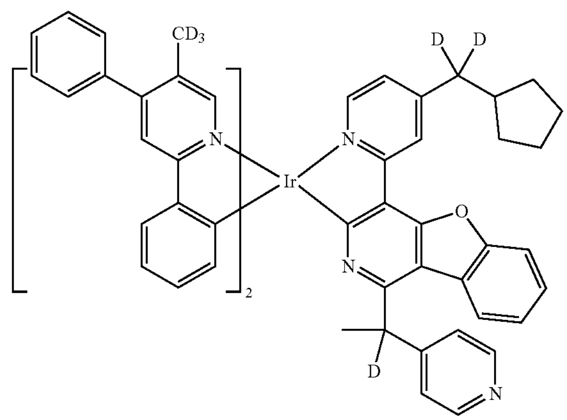
1469
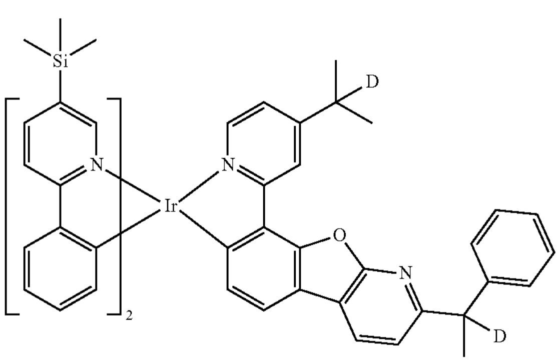
1470
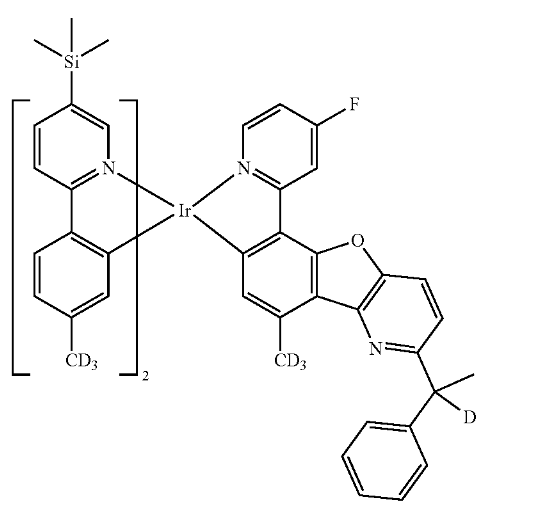

-continued
1471
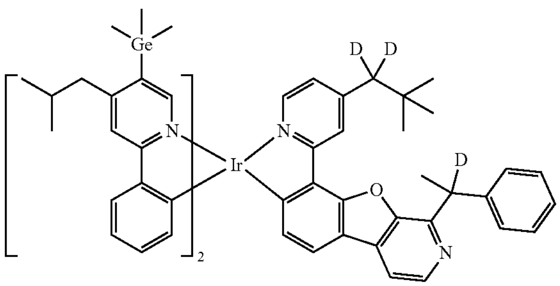
1472
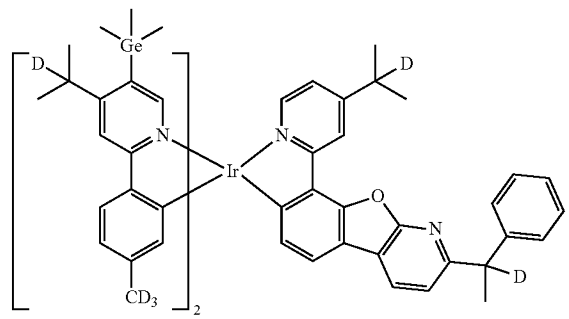
1473
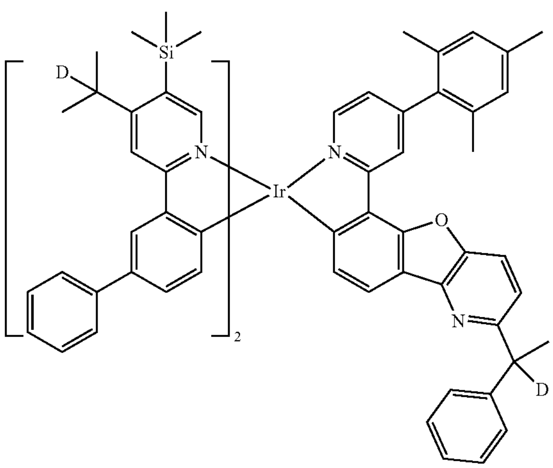
1474
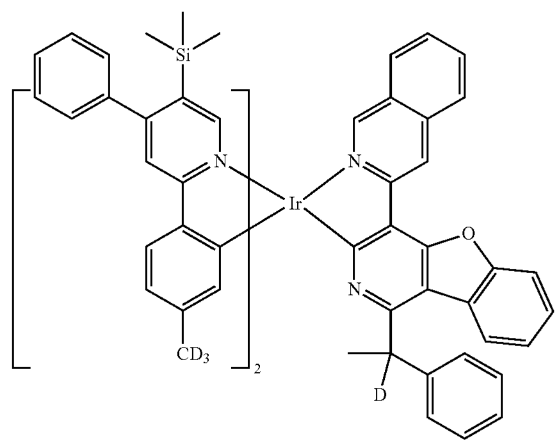
1475
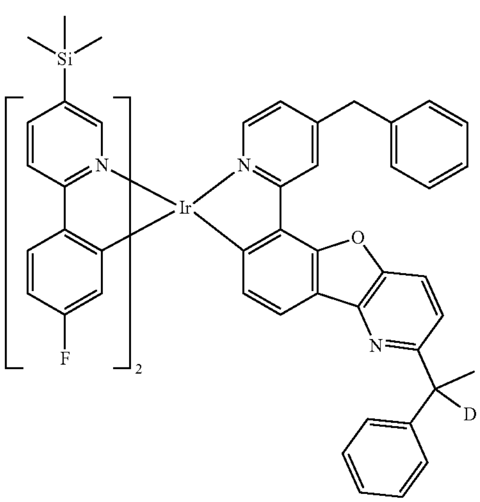
1476
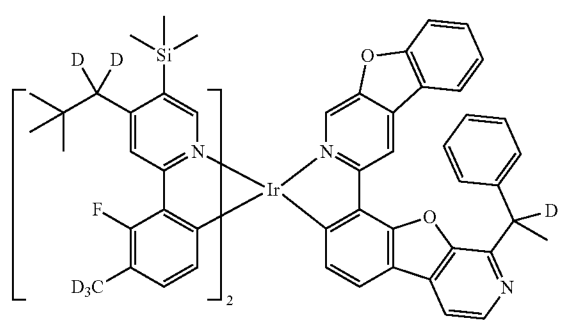

-continued
1477
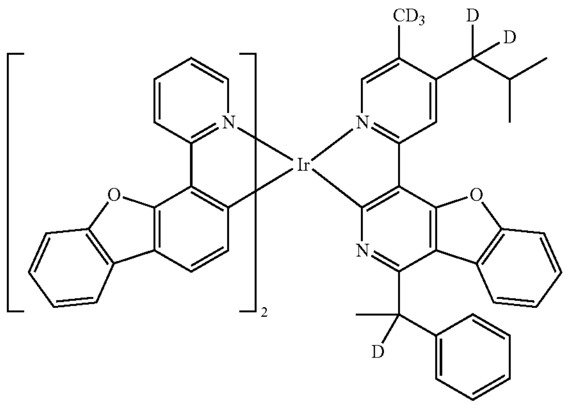
1478
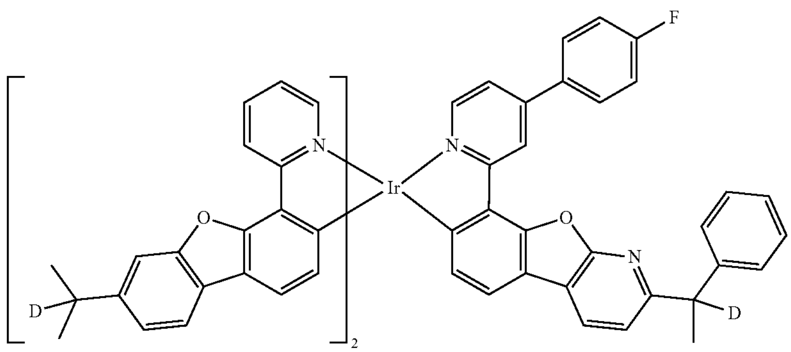
1479
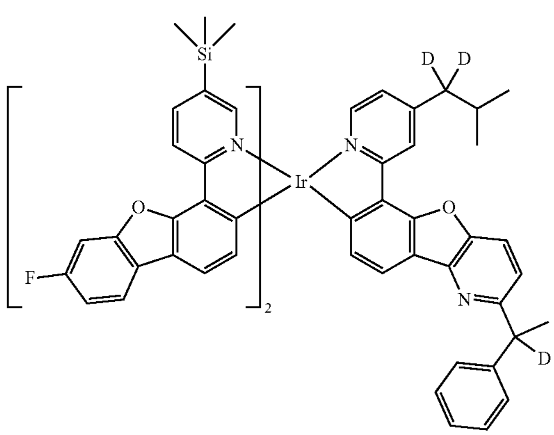
1480
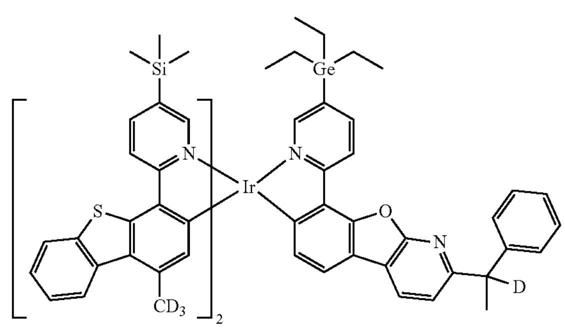

-continued
1481
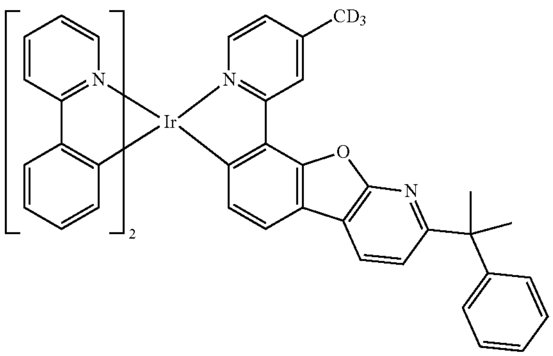
1482
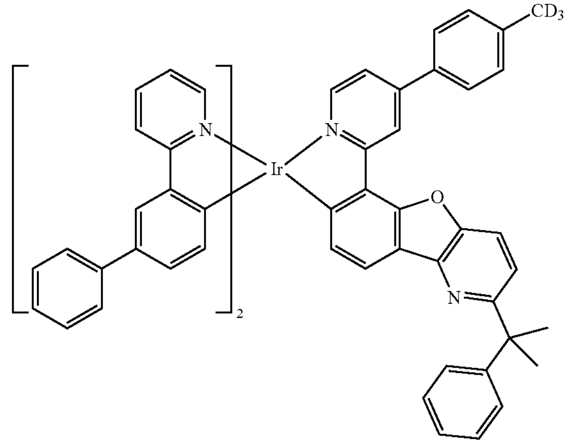
1483
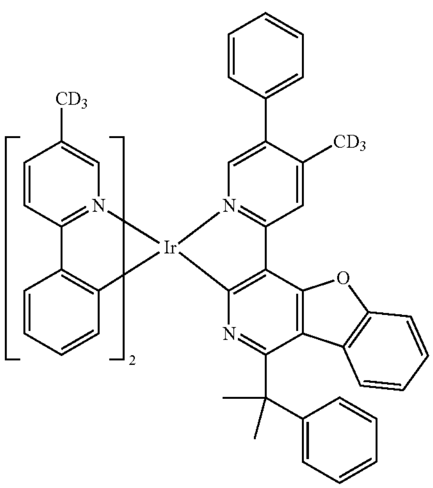
1484
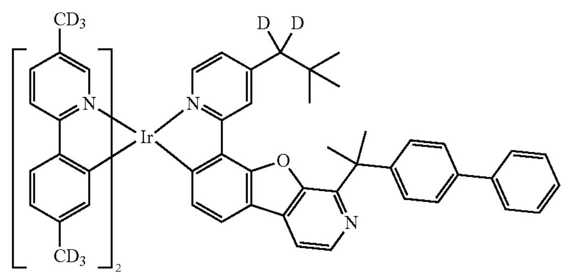
1485
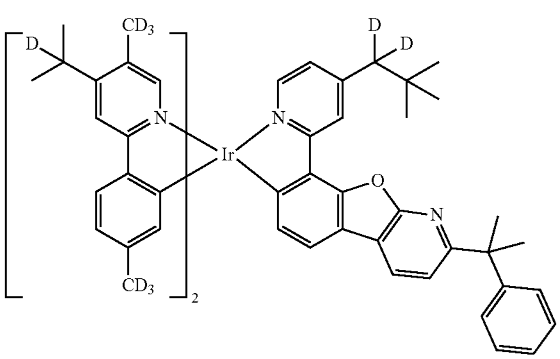
1486
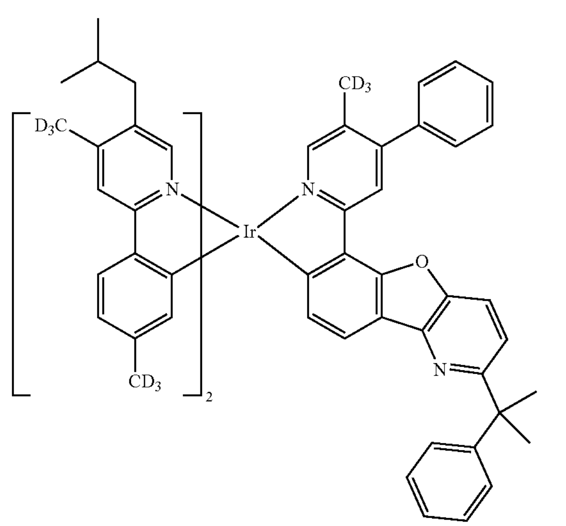

-continued
1487
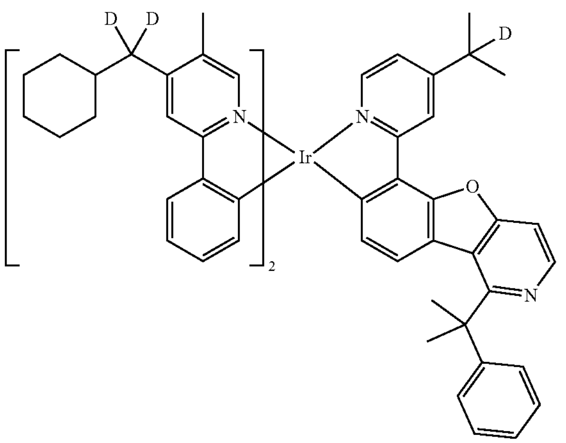
1488
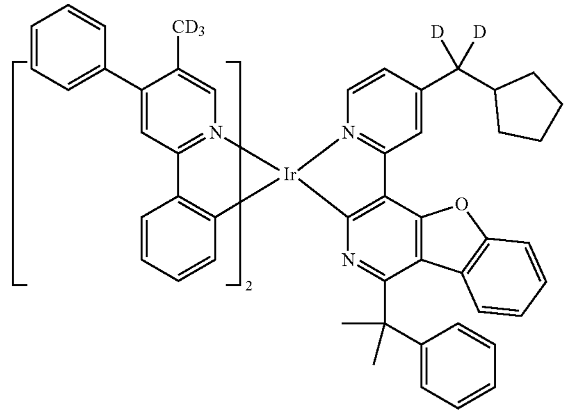
1489
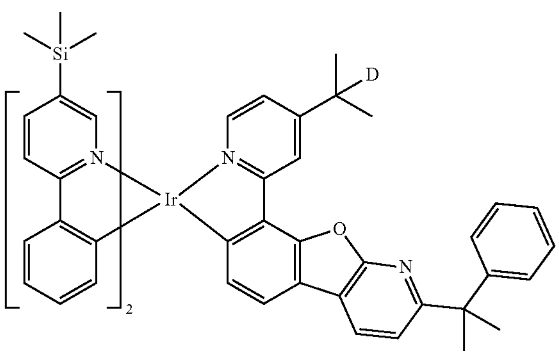
1490
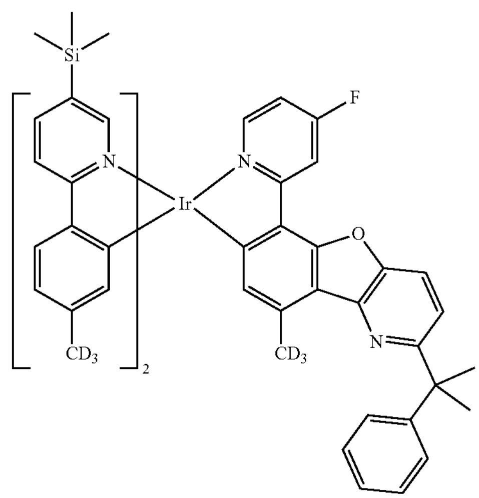
1491
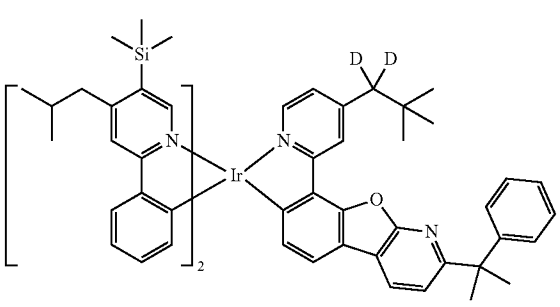
1492
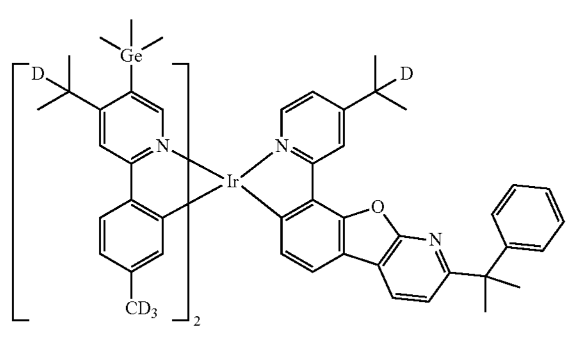

-continued
1493
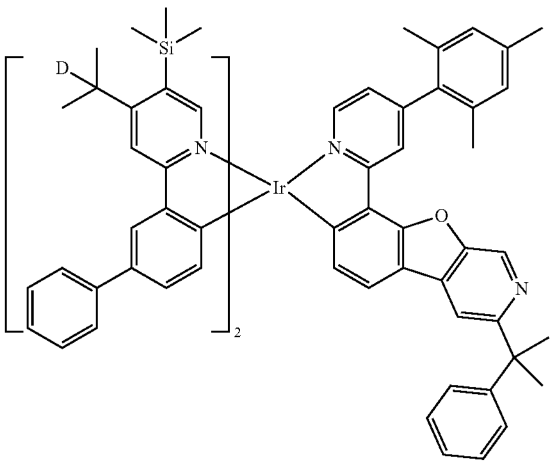
1494
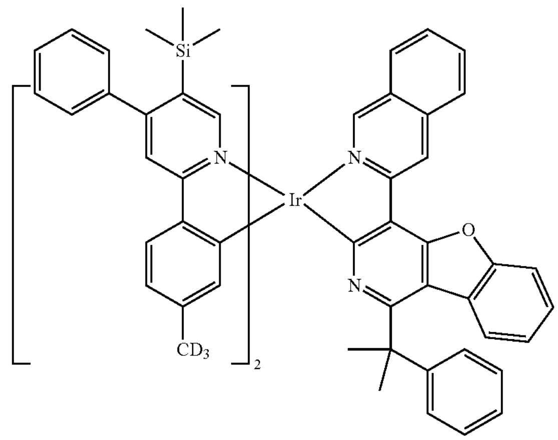
1495
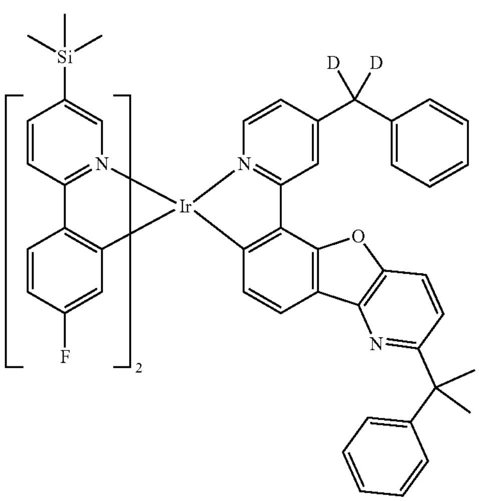
1496
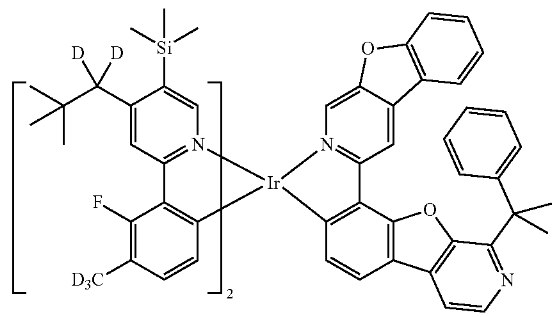
1497
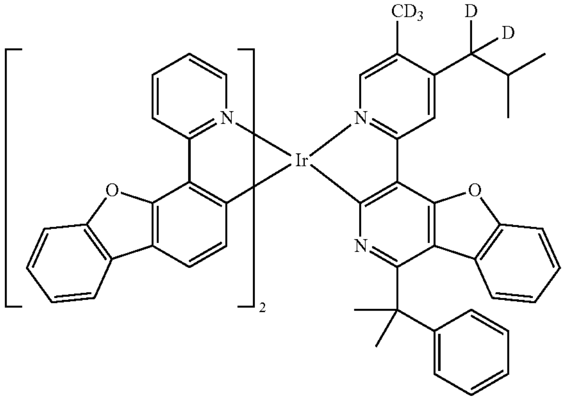

-continued
1498
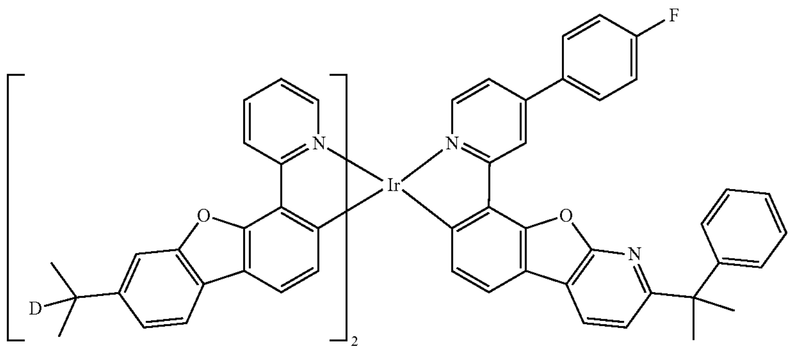
1499
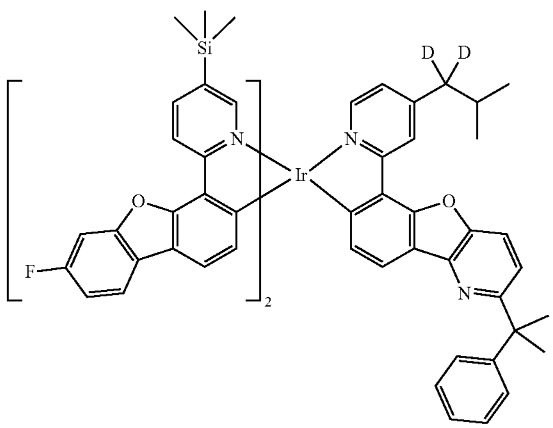
1500
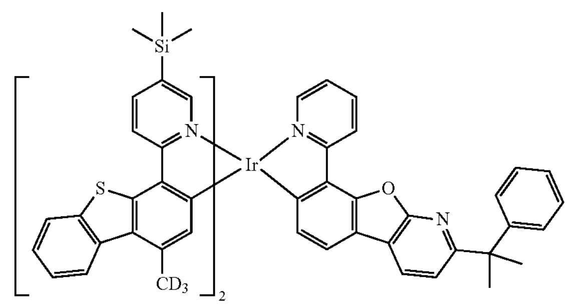
1501
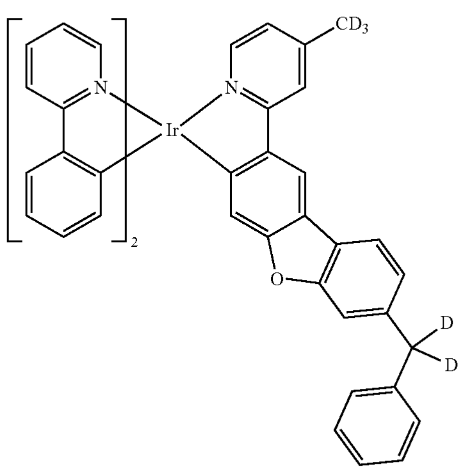
1502
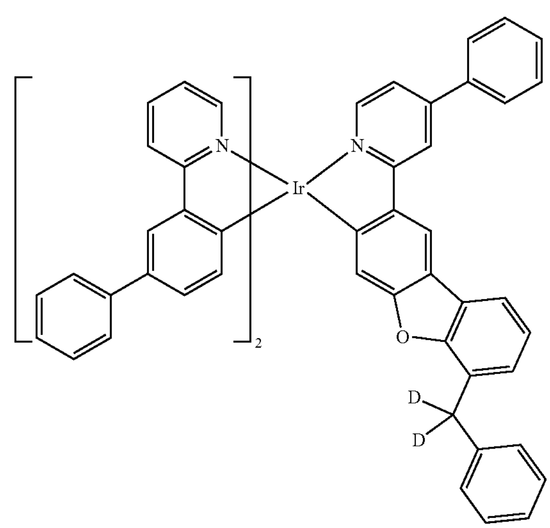

-continued
1503
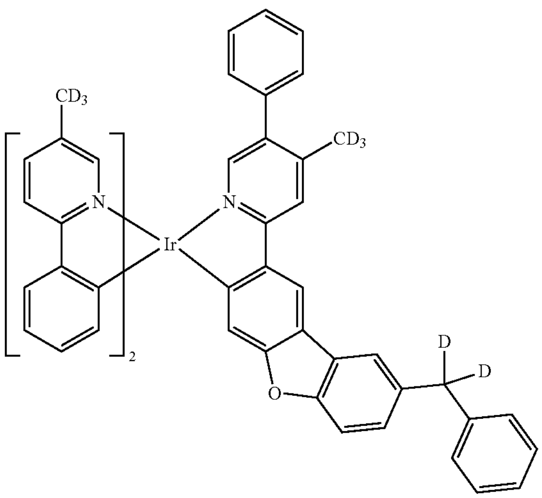
1504
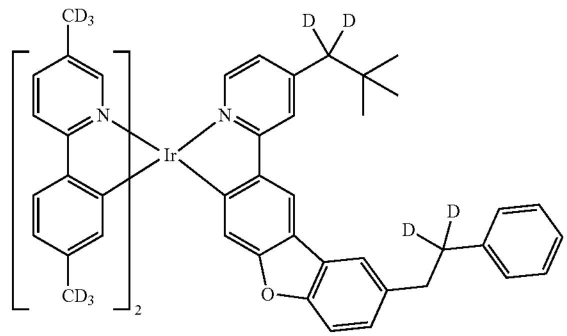
1505
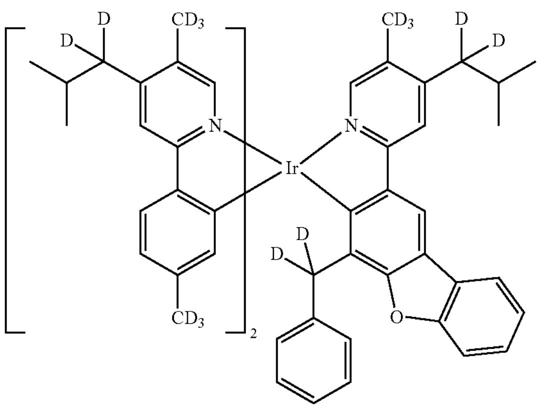
1506
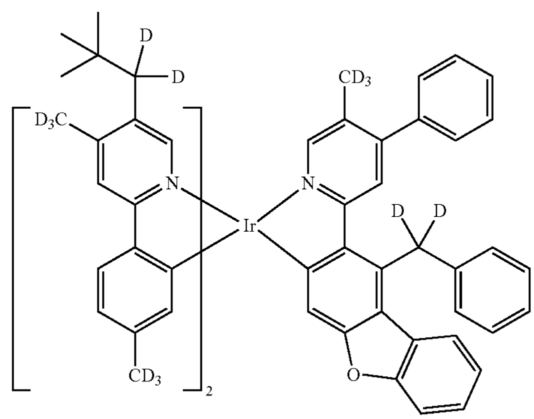
1507
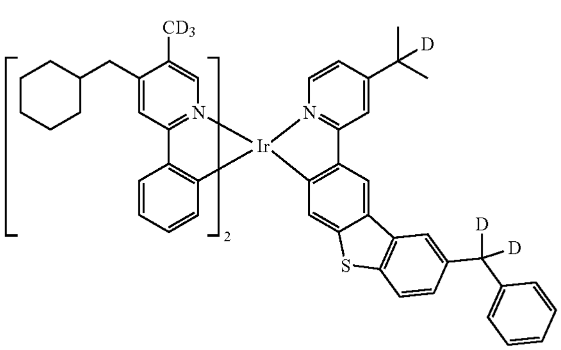
1508
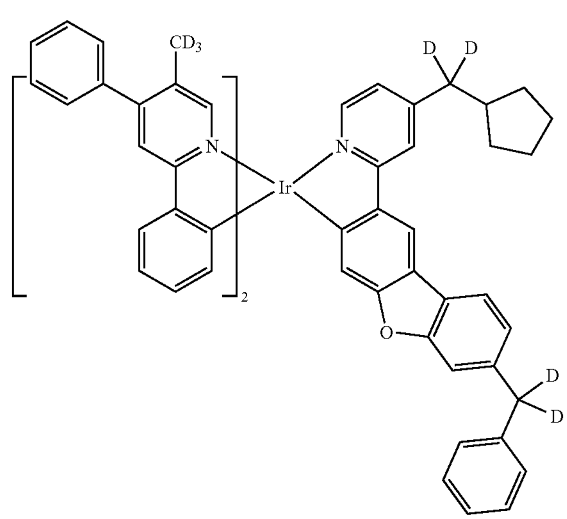

-continued
1509
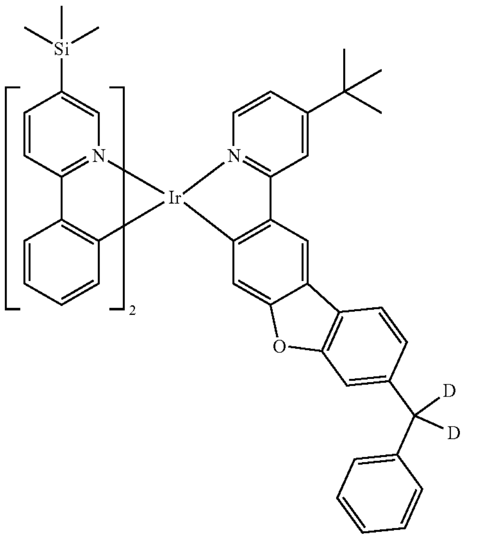
1510
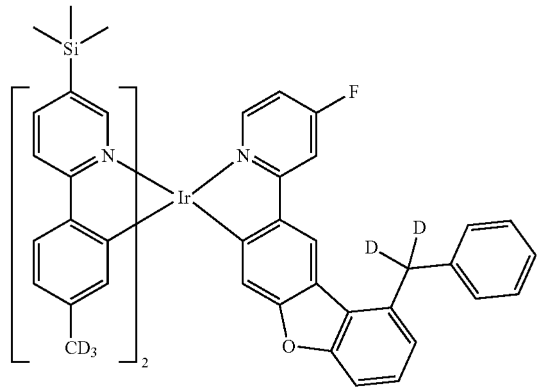
1511
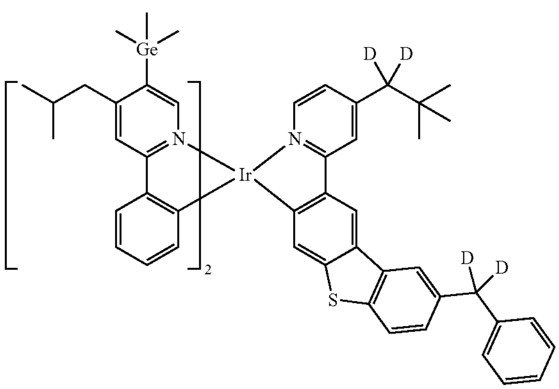
1512
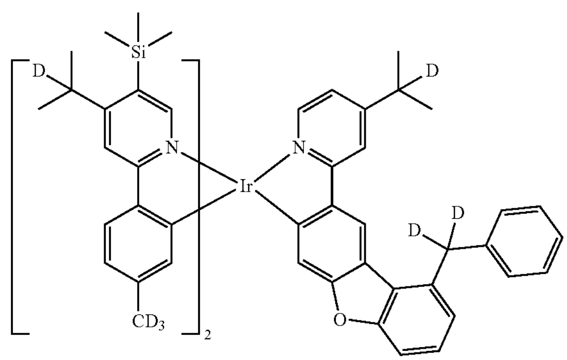
1513
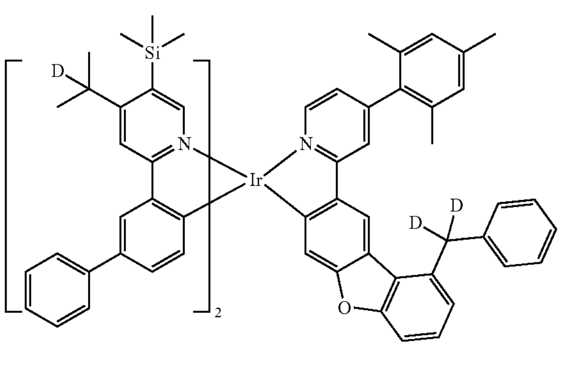
1514
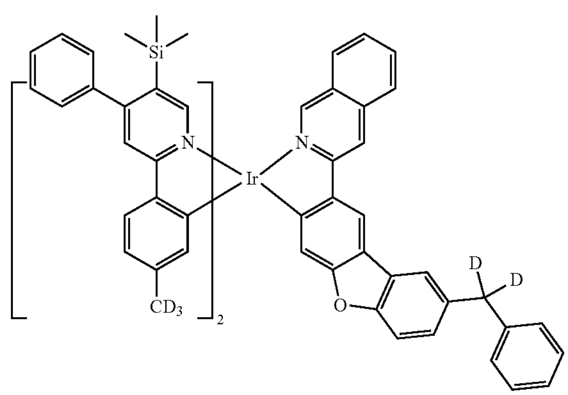

-continued
1515
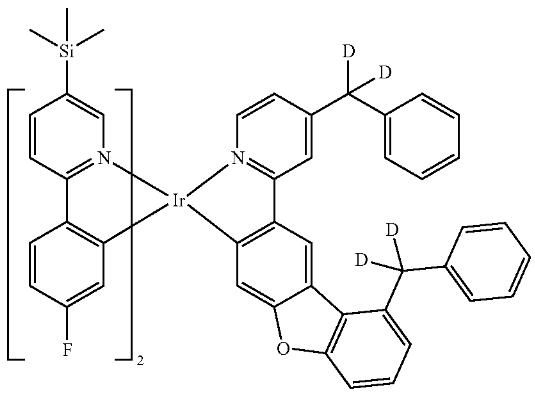
1516
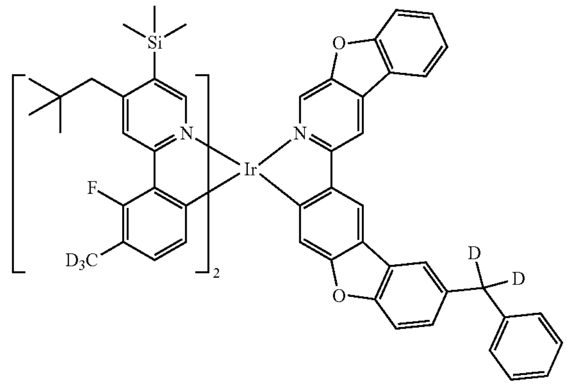
1517
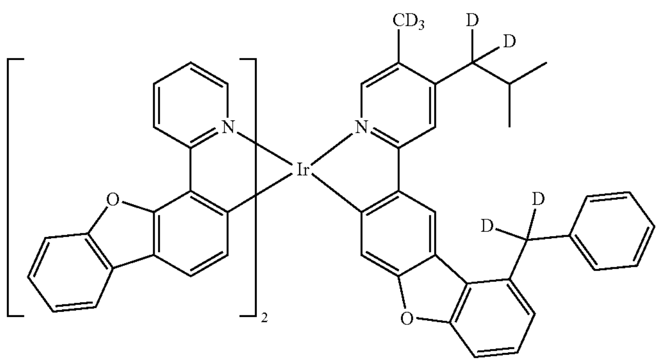
1518
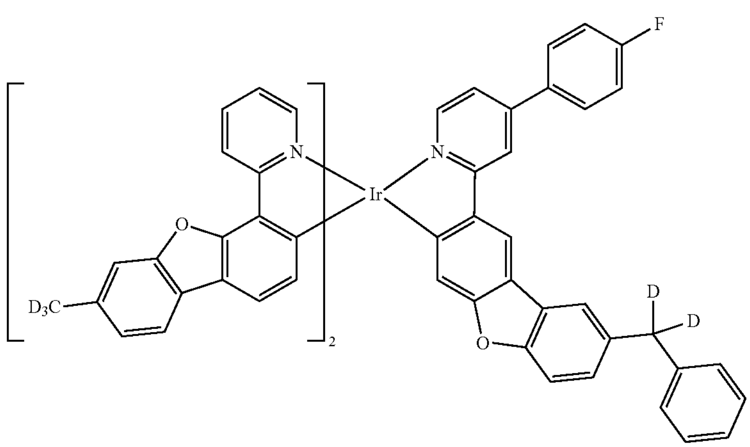

-continued
1519
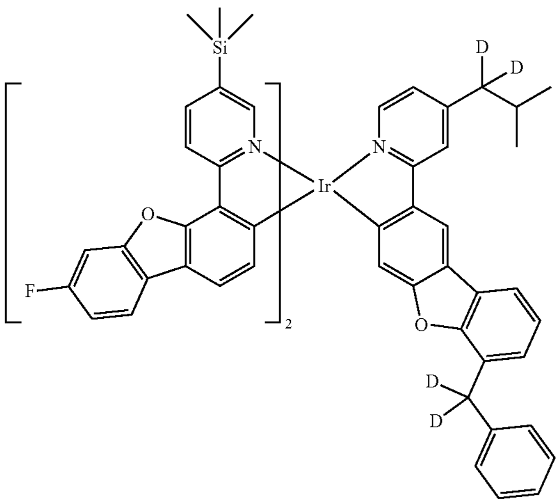
1520
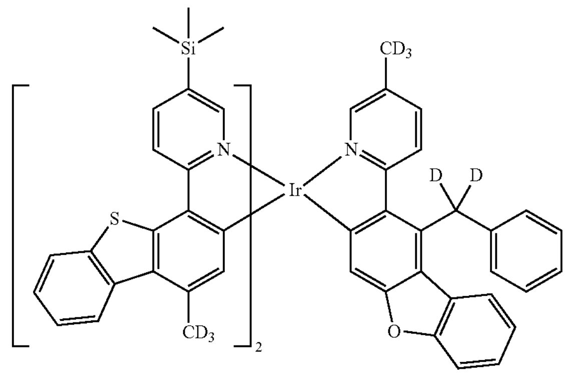
1521
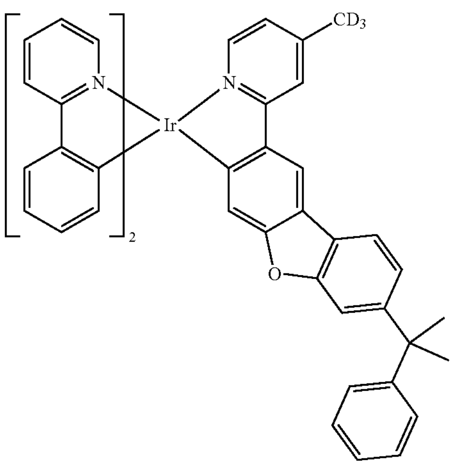
1522
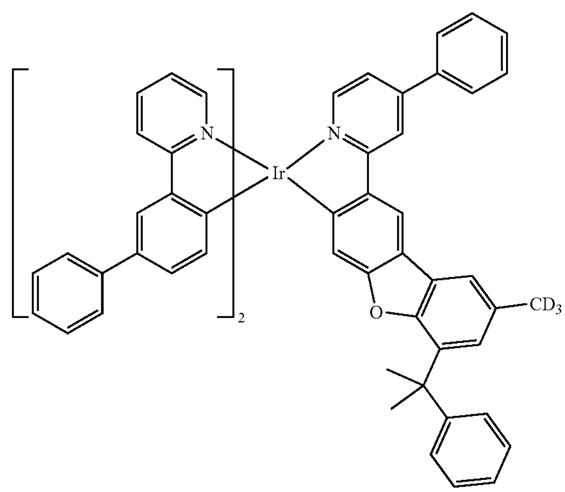
1523
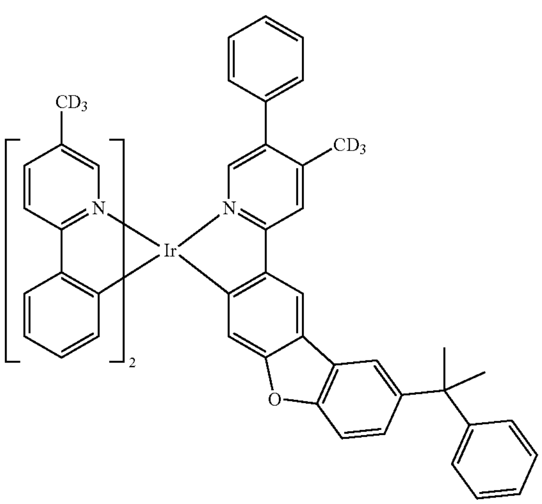
1524
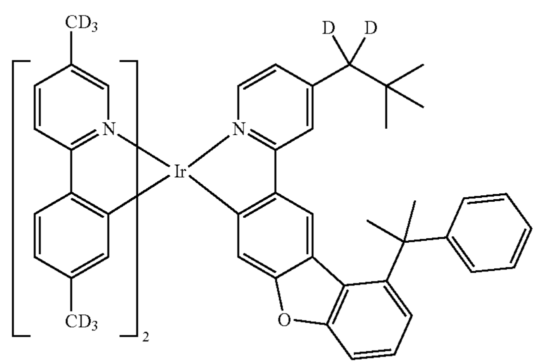

-continued
1525
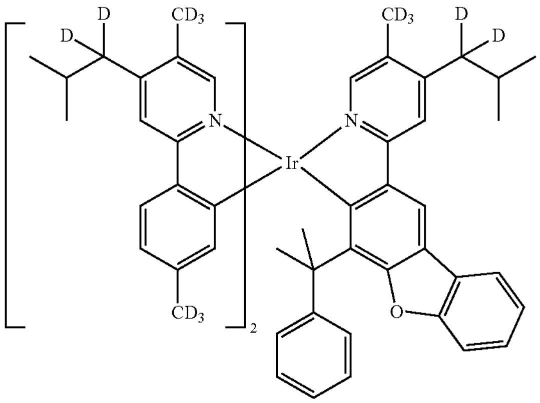
1526
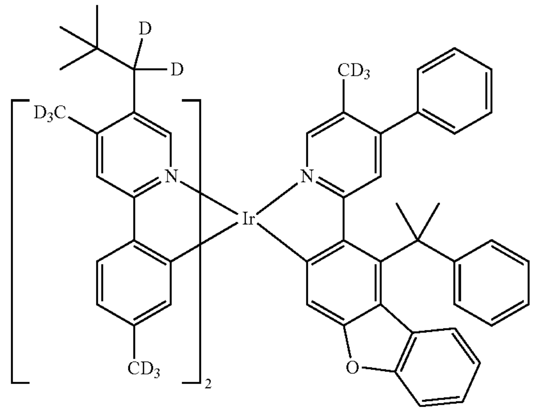
1527
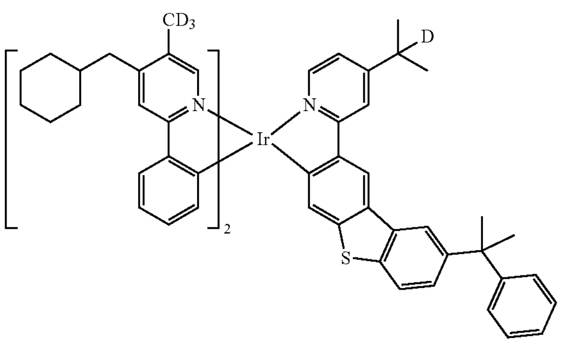
1528
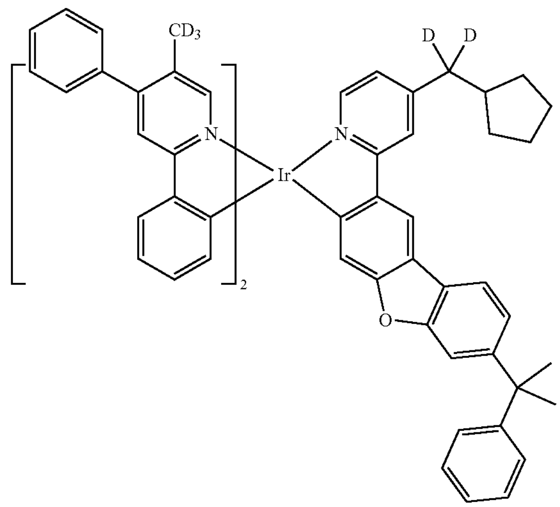
1529
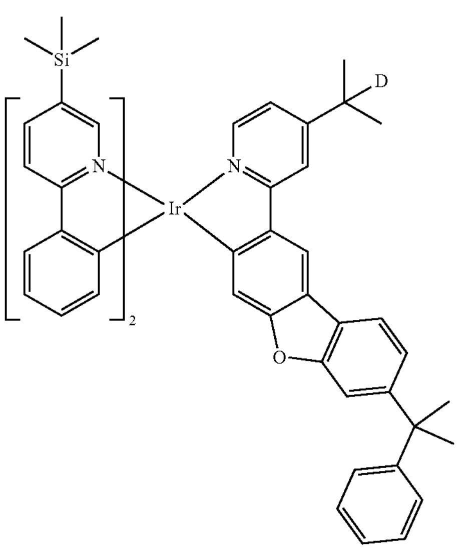
1530
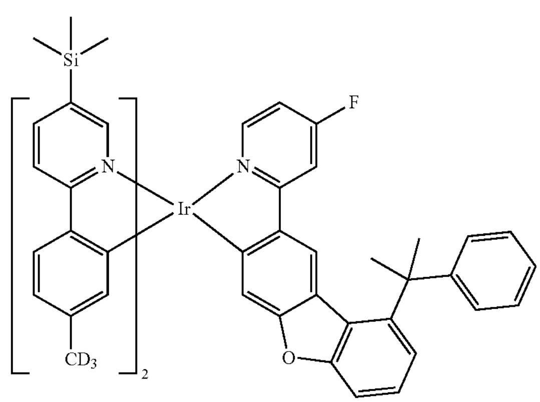

-continued
1531
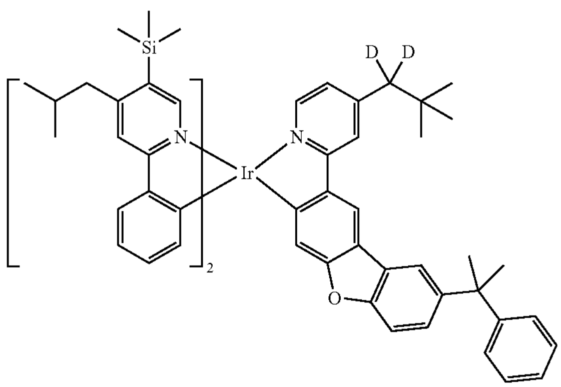
1532
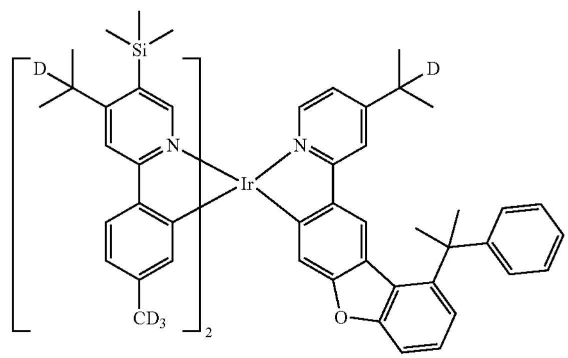
1553
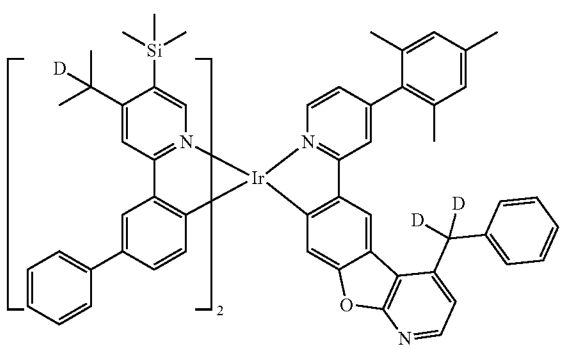
1554
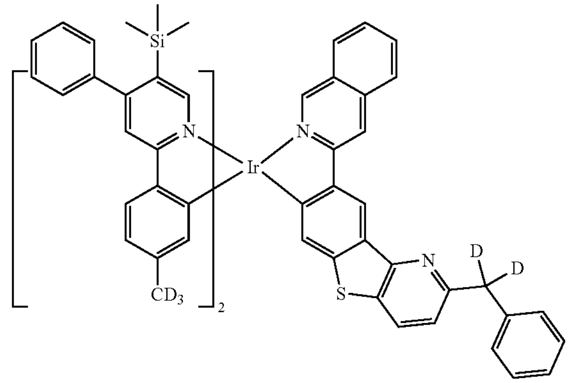
1555
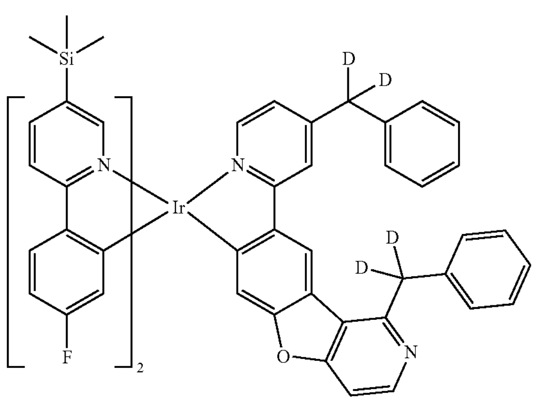
1556
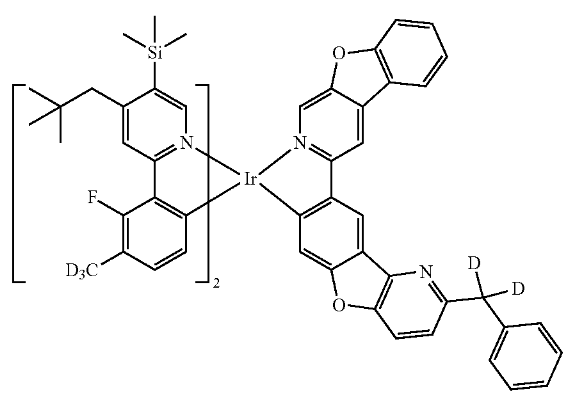
1557
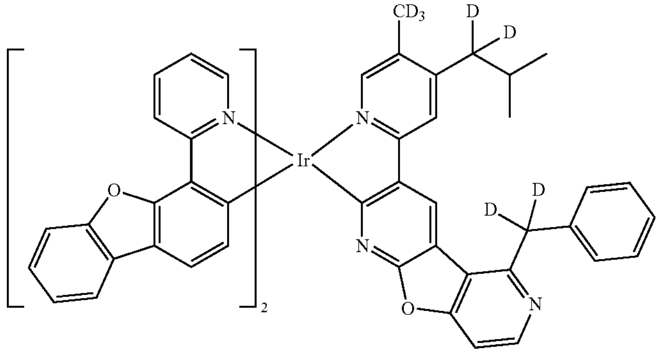

-continued
1558
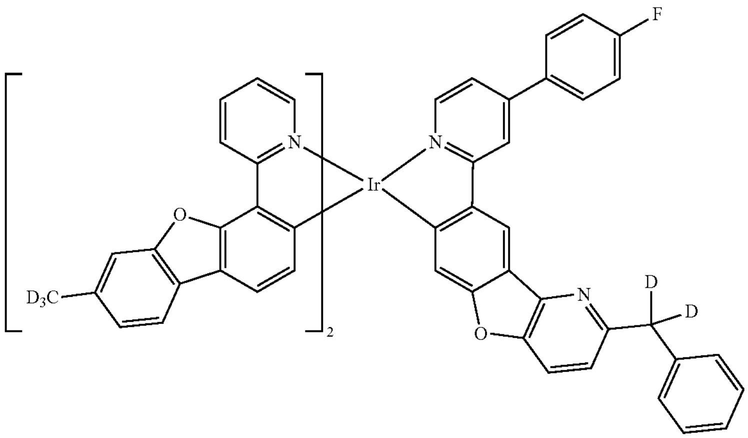
1559
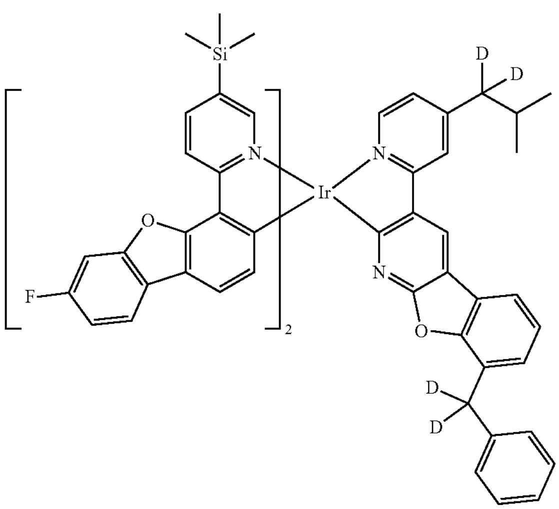
1560
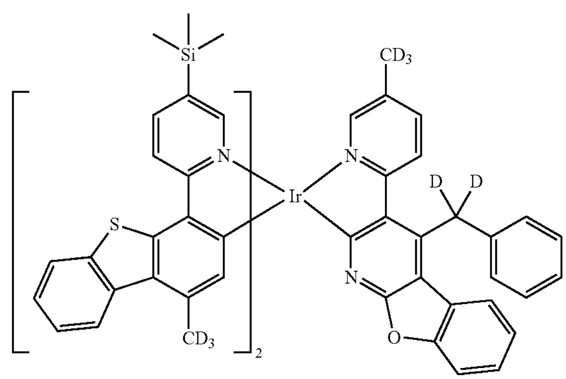
1541
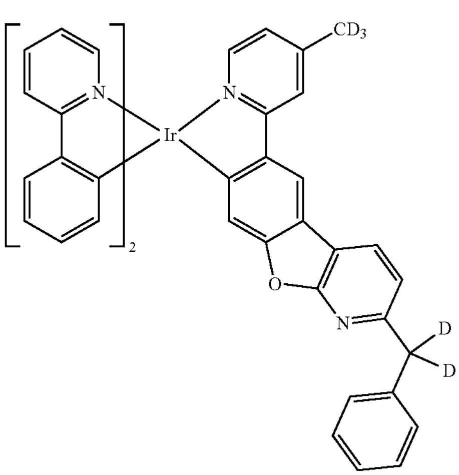
1542
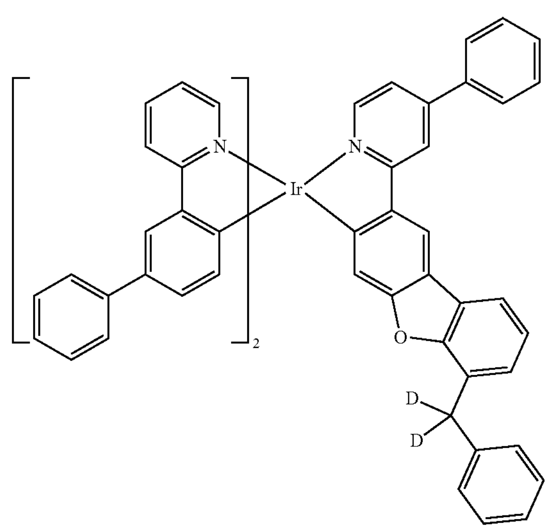

-continued
1543
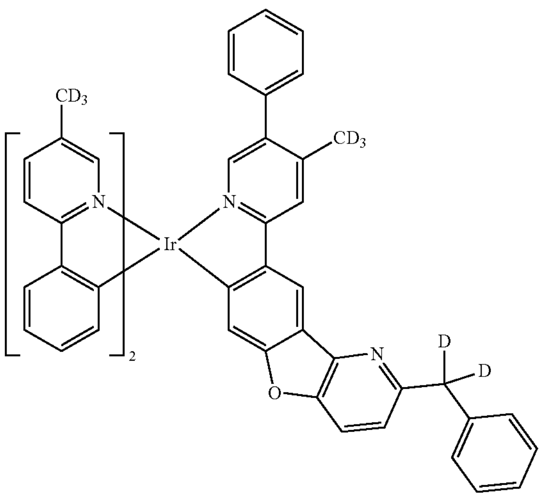
1544
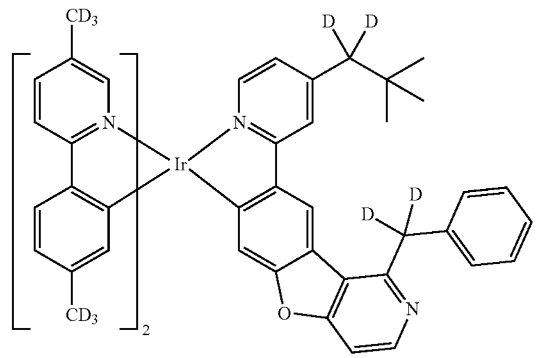
1545
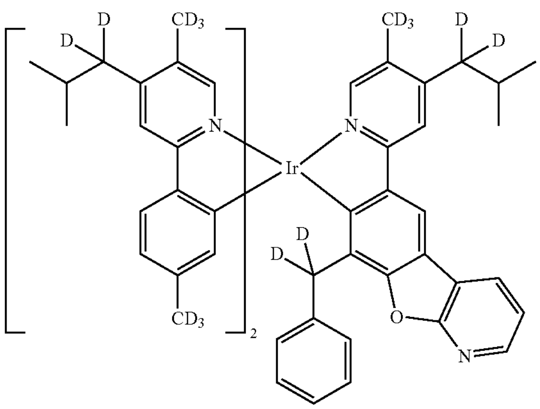
1546
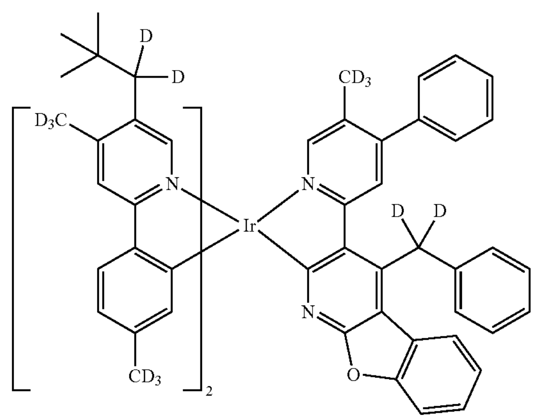
1547
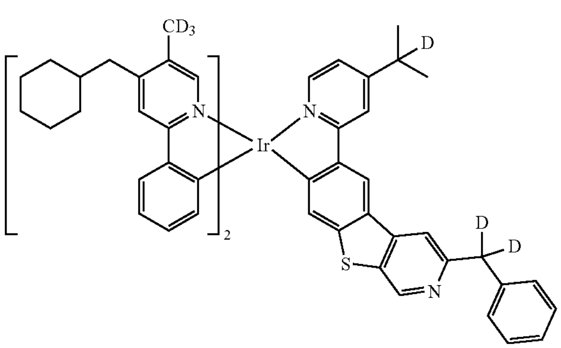
1548
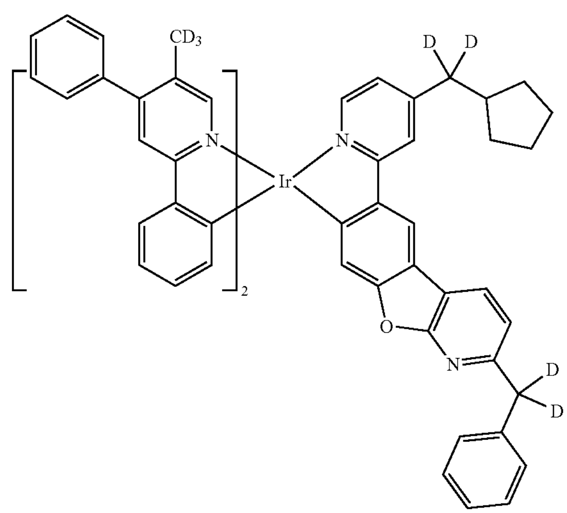

-continued
1549
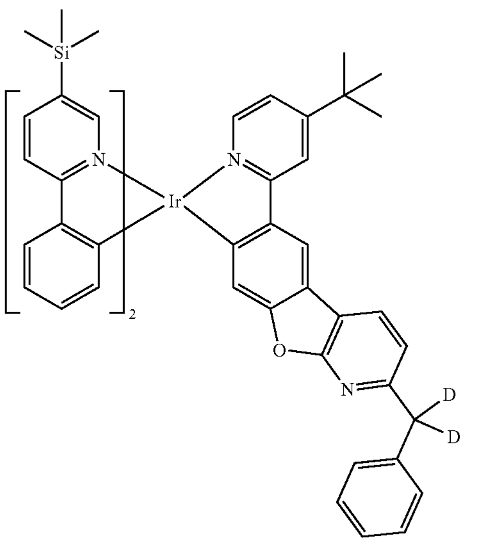
1550
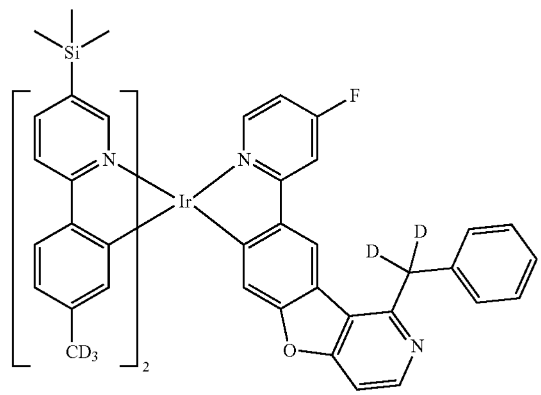
1551
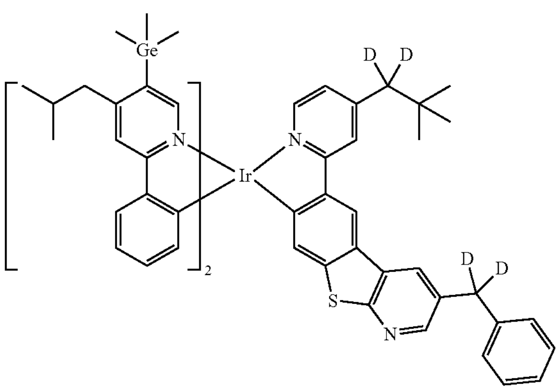
1552
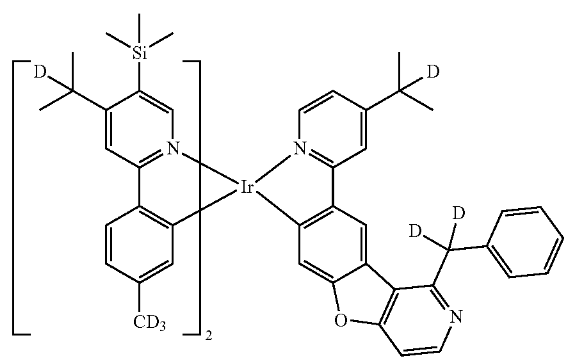
1553
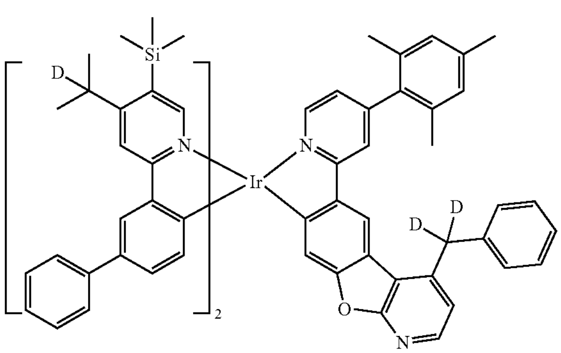
1554
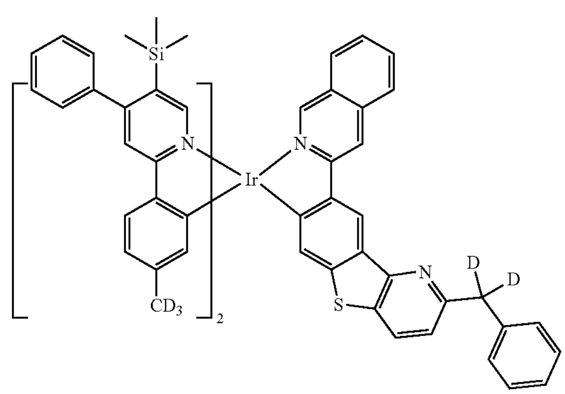

-continued
1555
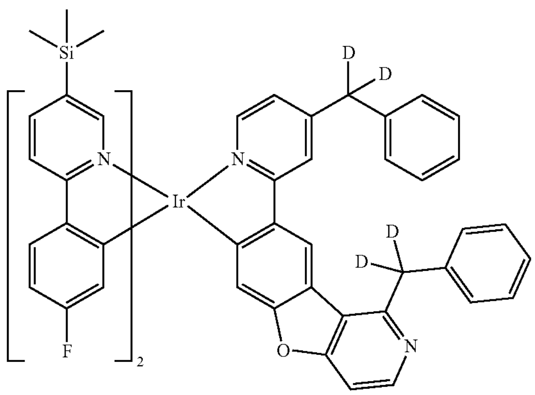
1556
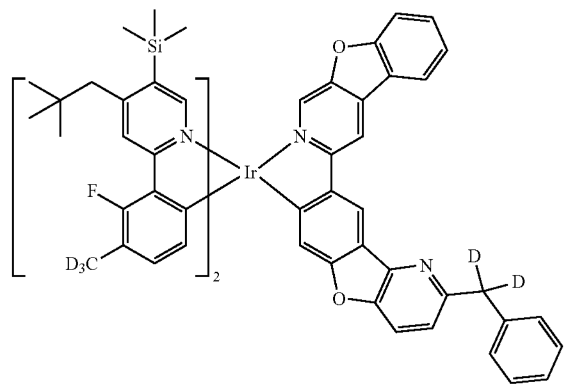
1557
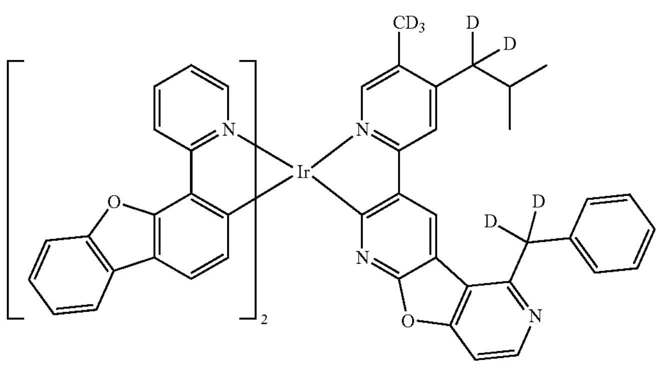
1558
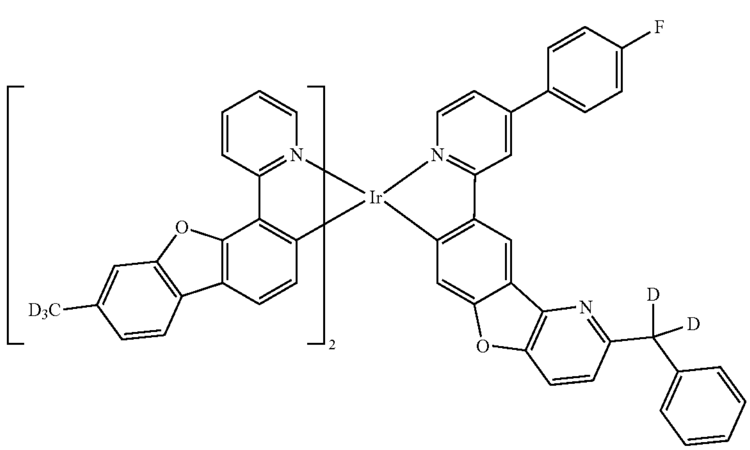

-continued
1559
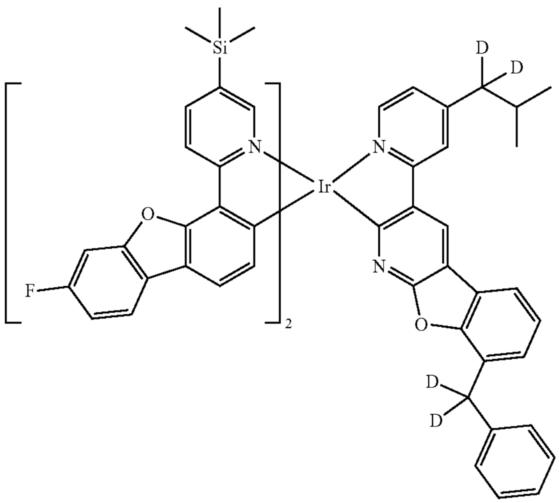
1560
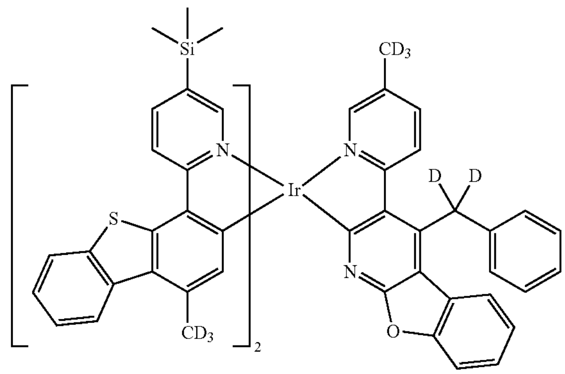
1561
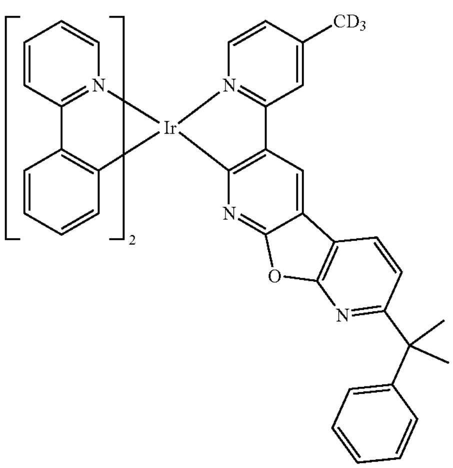
1562
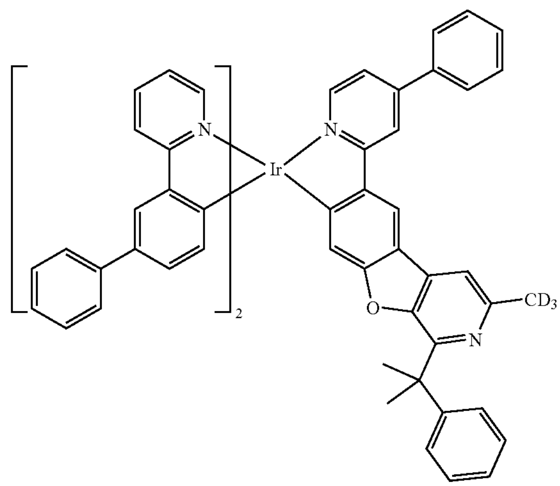
1563
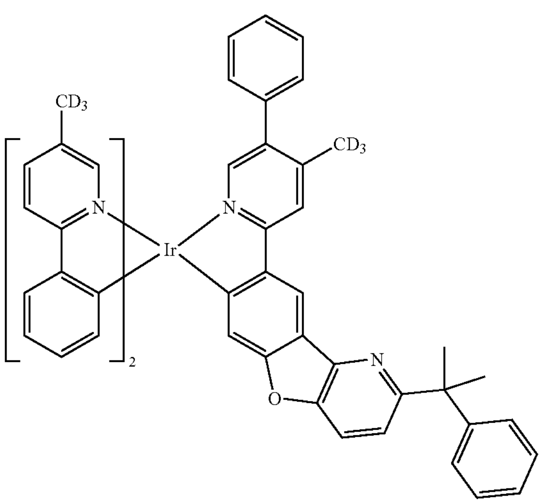
1564
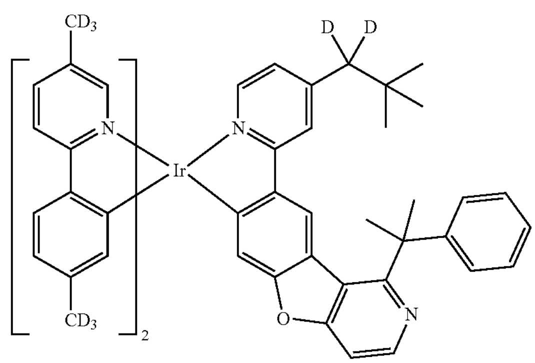

-continued
1565
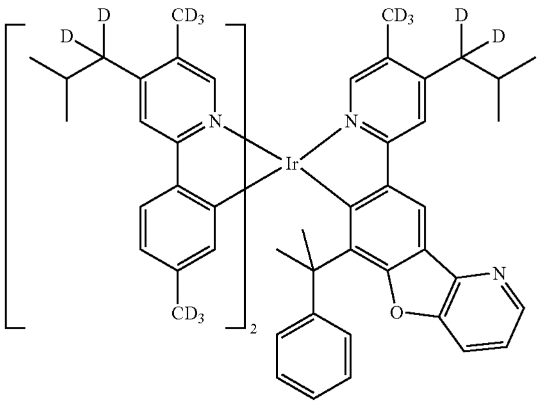
1566
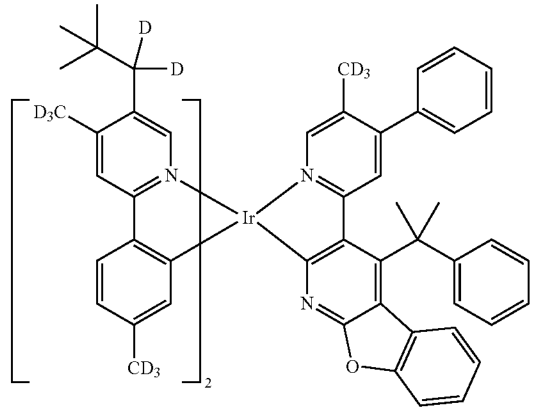
1567
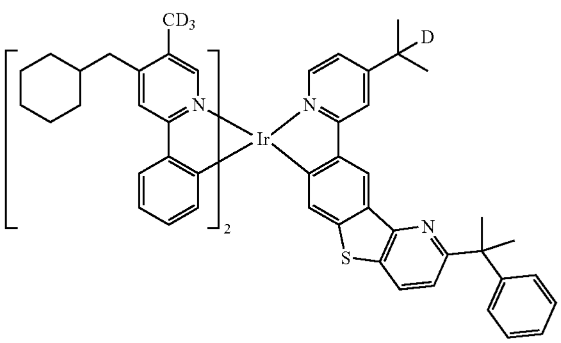
1568
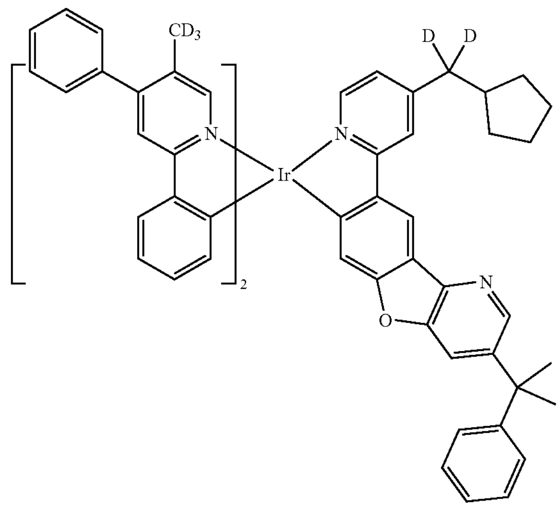
1569
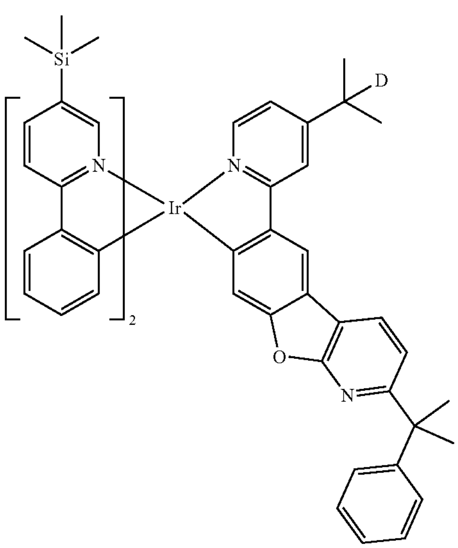
1570
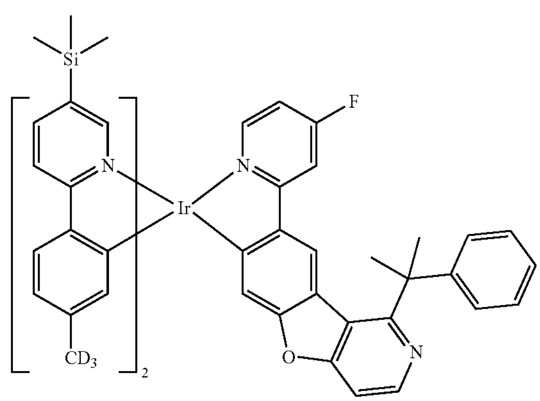

-continued
1571
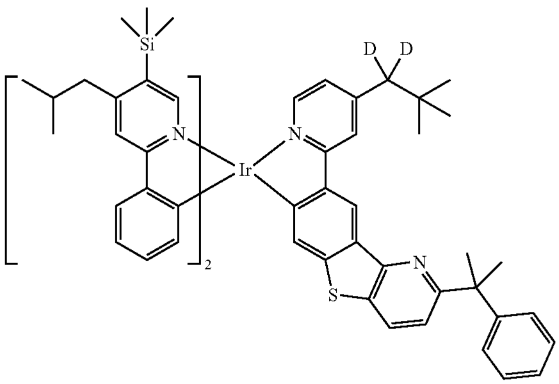
1572
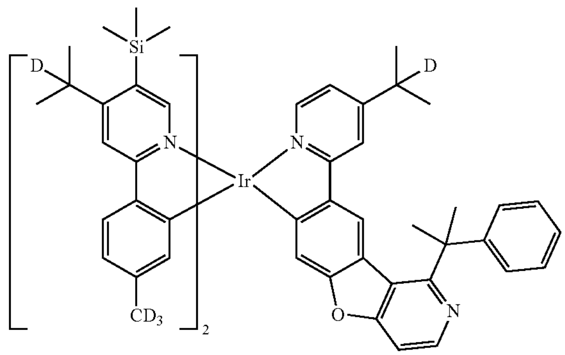
1573
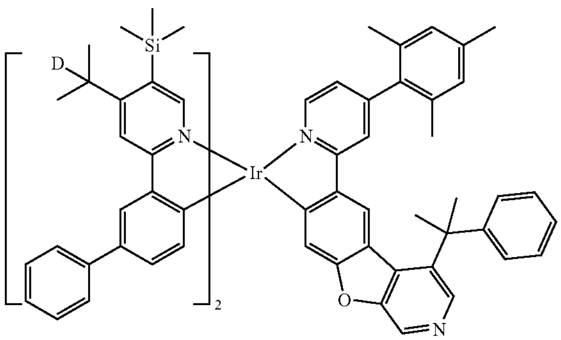
1574
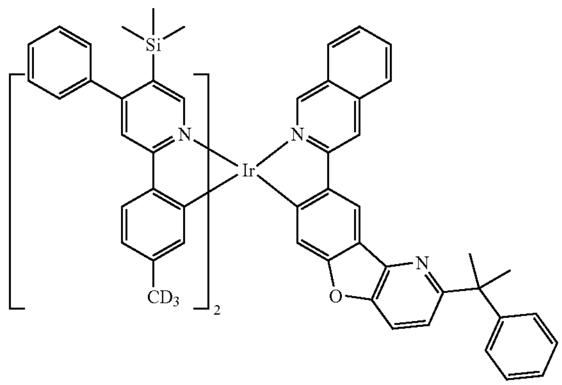
1575
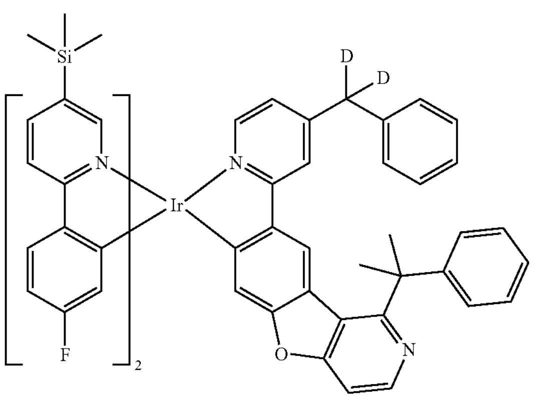
1576
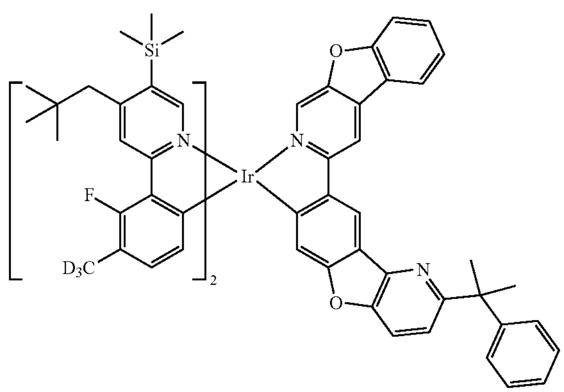
1577
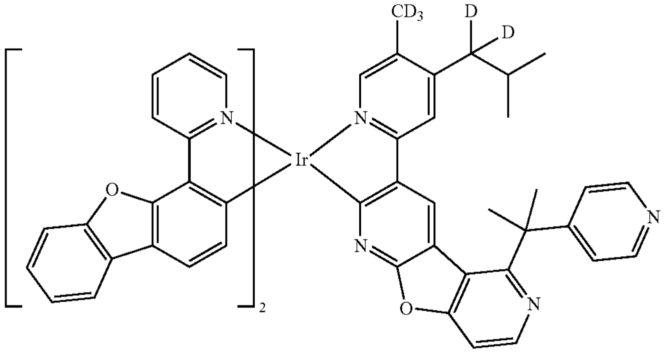

-continued
1578
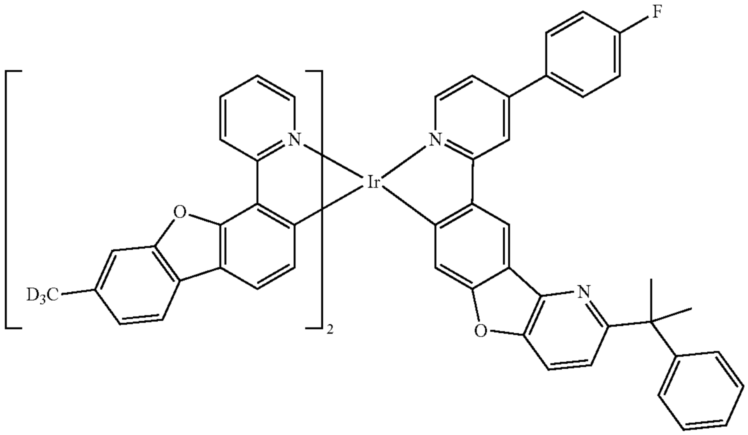
1579
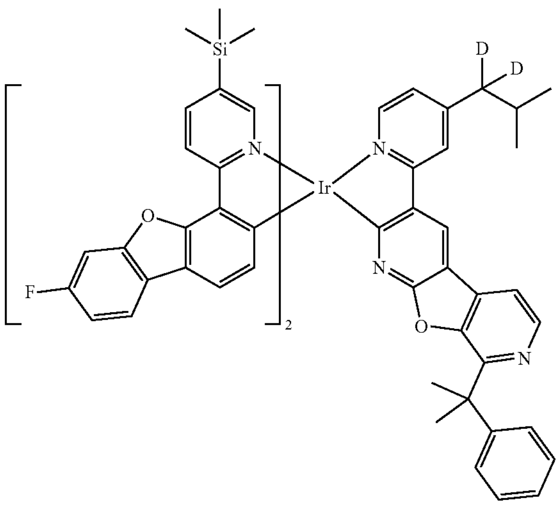
1580
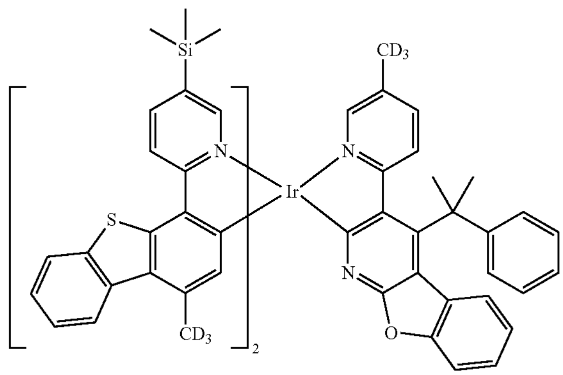
1581
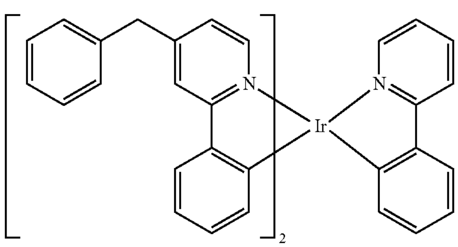
1582
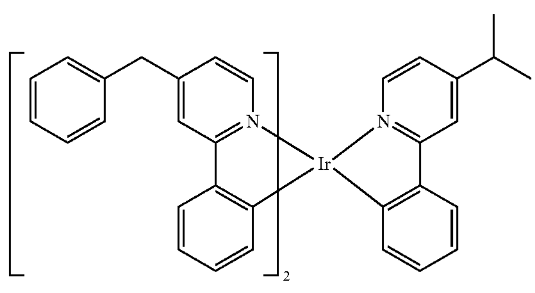
1583
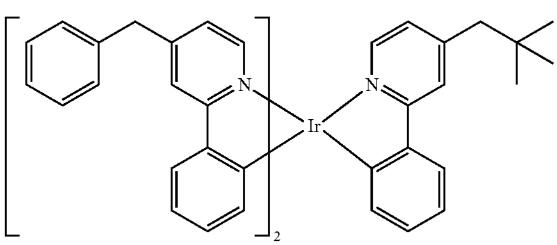
1584
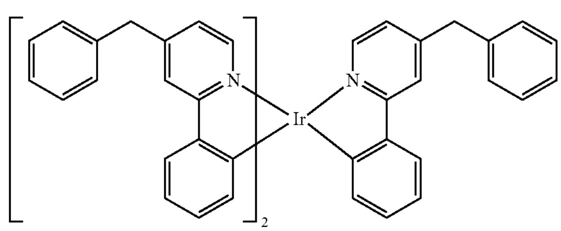

-continued
1585
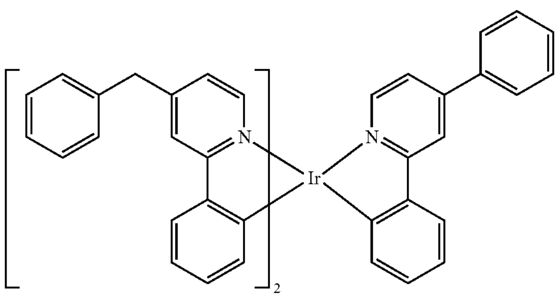
1586
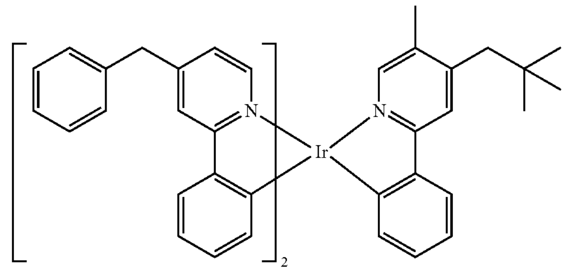
1587
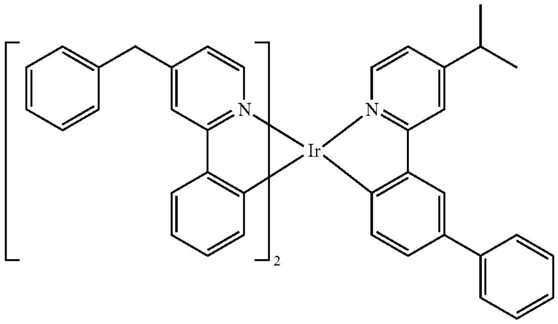
1588
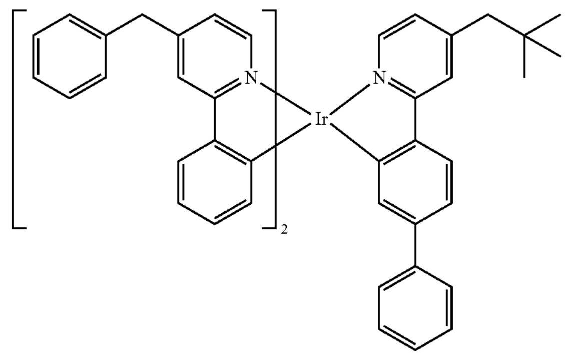
1589
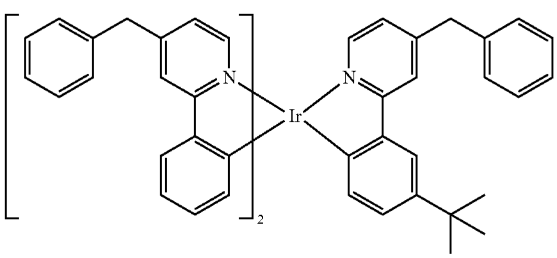
1590
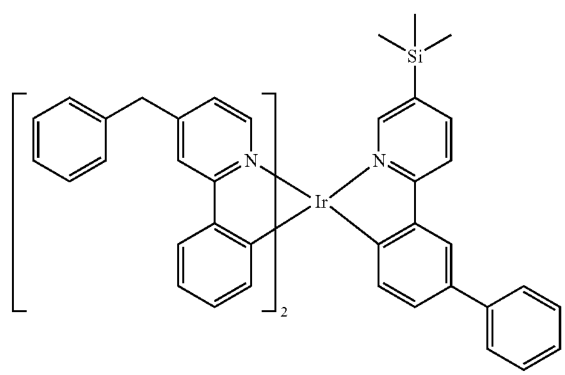
1591
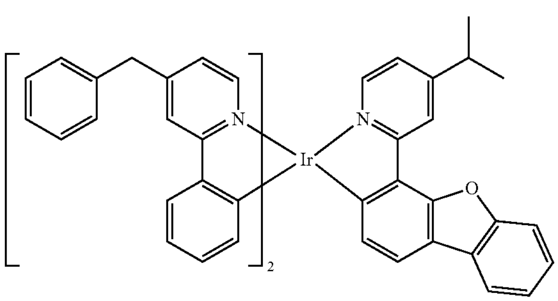
1592
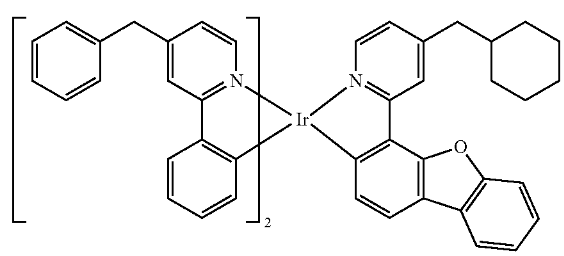

-continued
1593
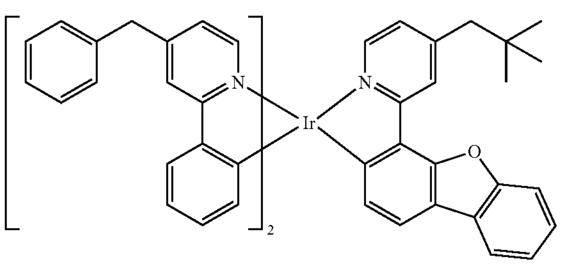
1594
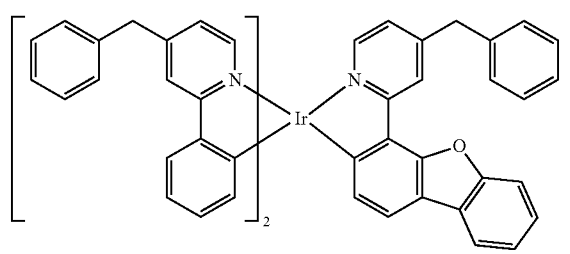
1595
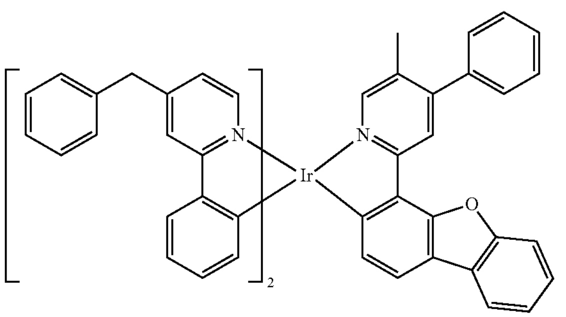
1596
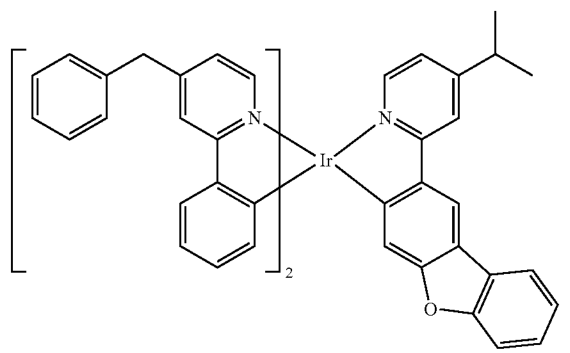
1597
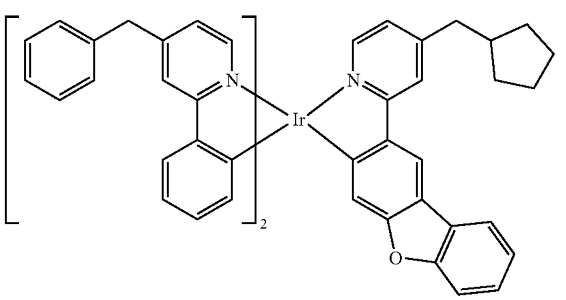
1598
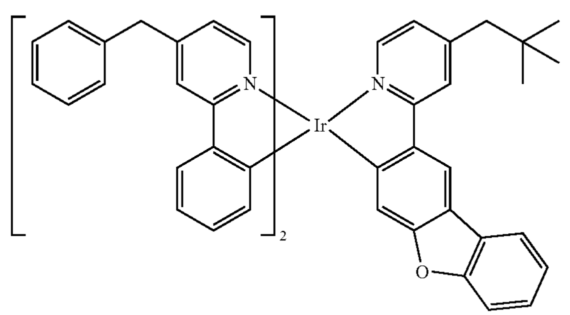
1599
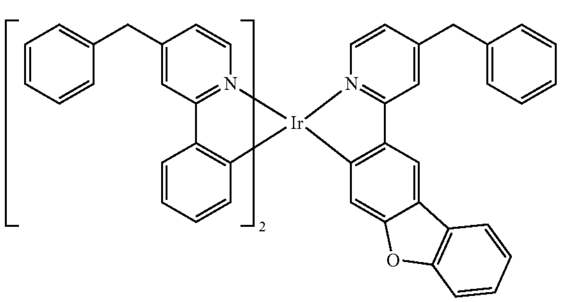
1600
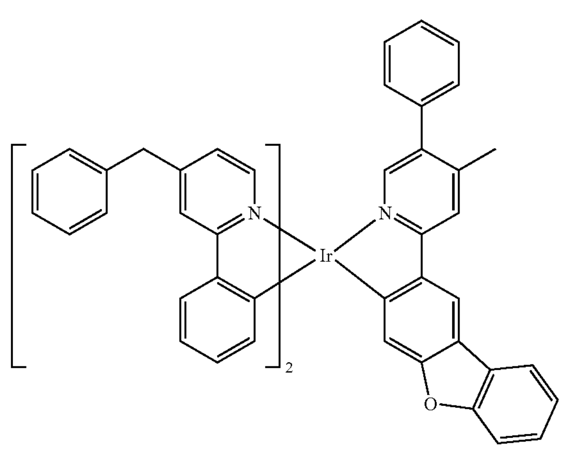

-continued
1601
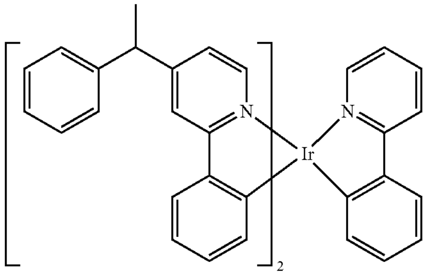
1602
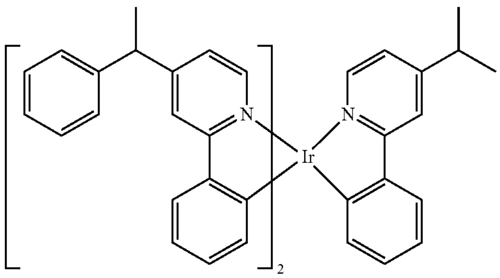
1603
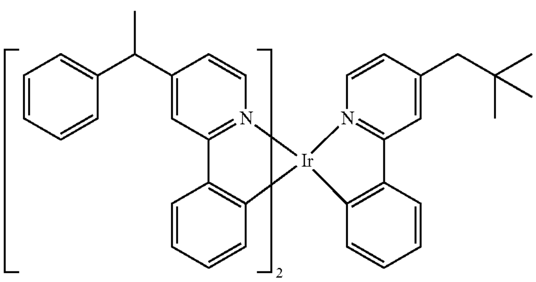
1604
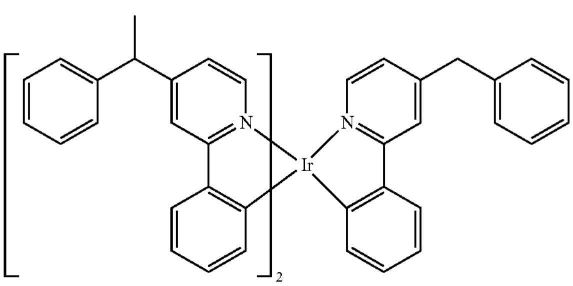
1605
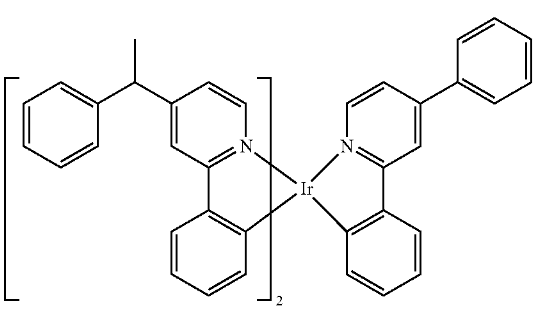
1606
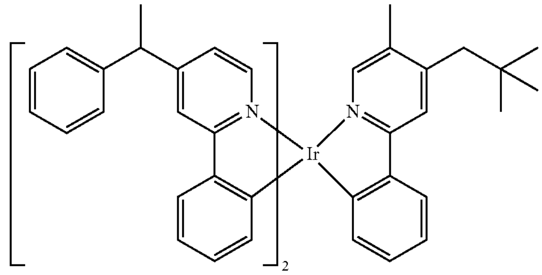
1607
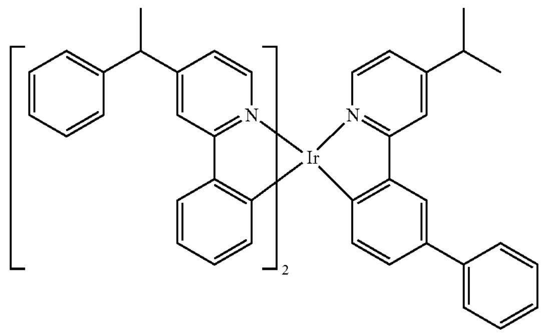
1608
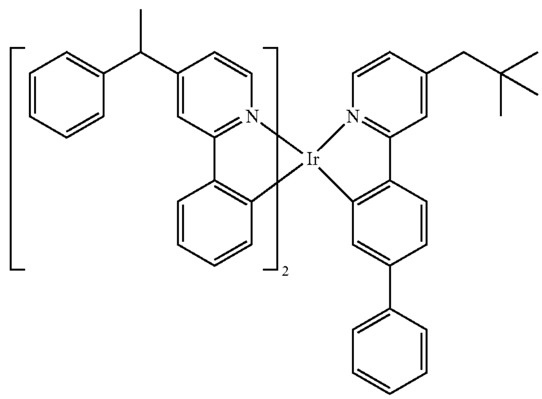
1609
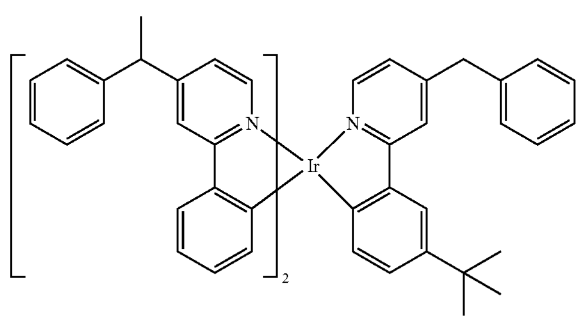

-continued
1610
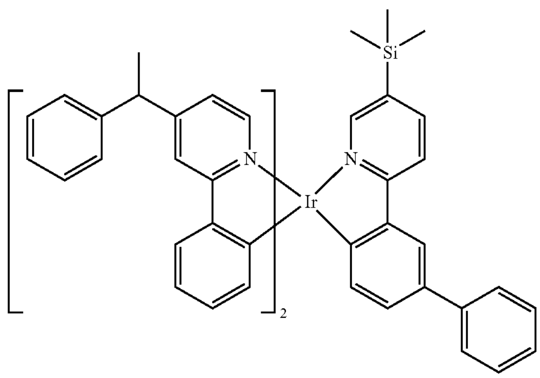
1611
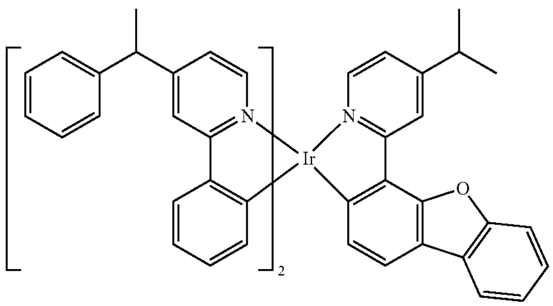
1612
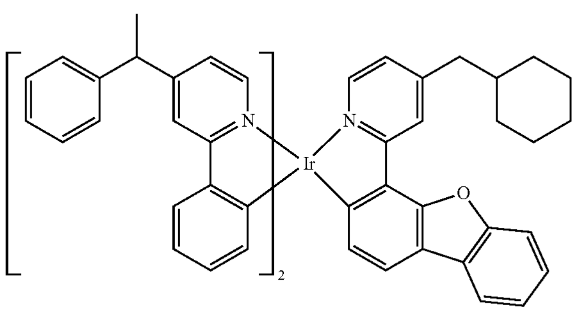
1613
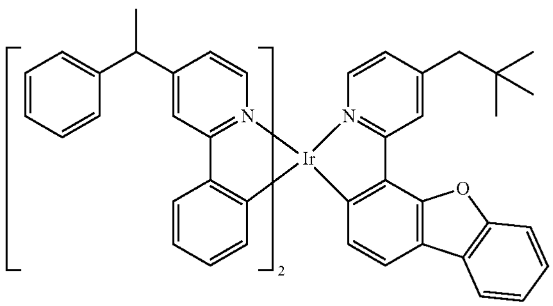
-continued
1614
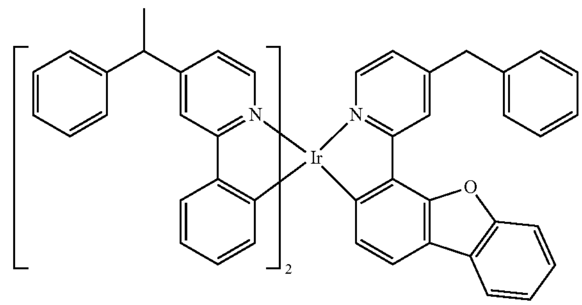
1615
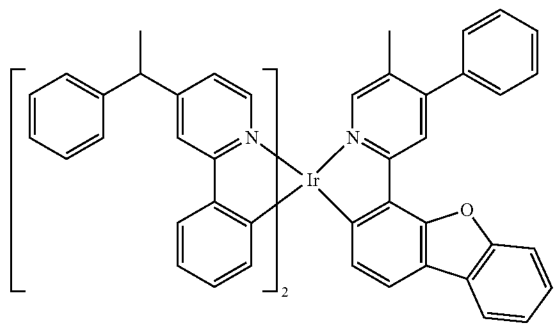
1616
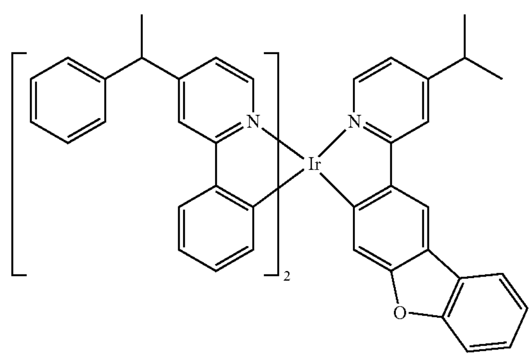
1617
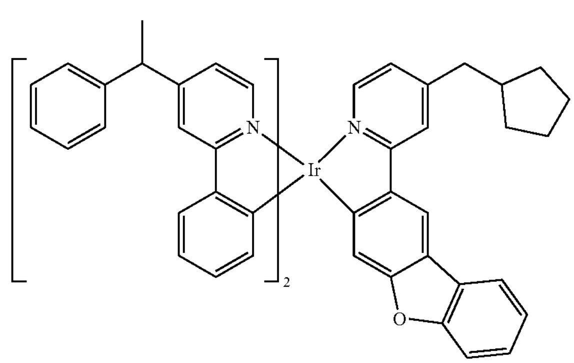

-continued
1618
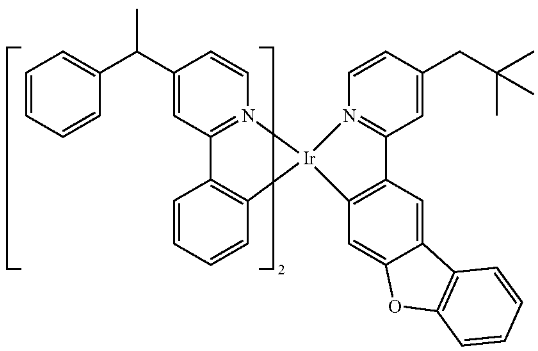
1619
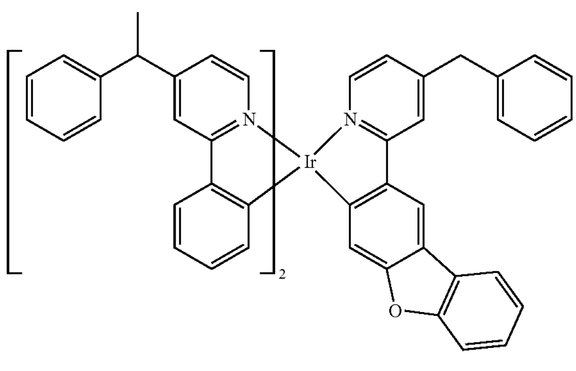
1620
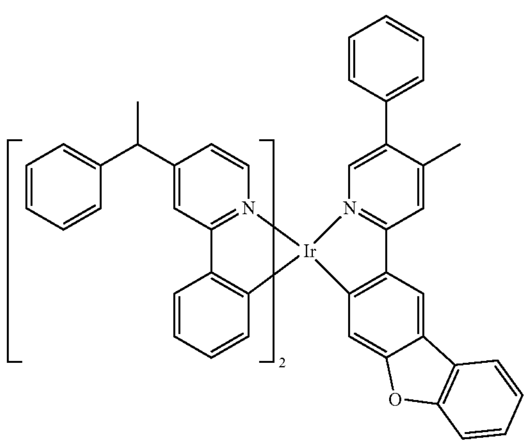
1621
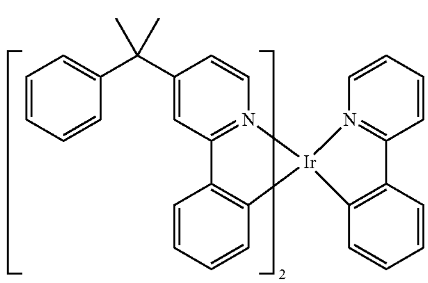
-continued
1622
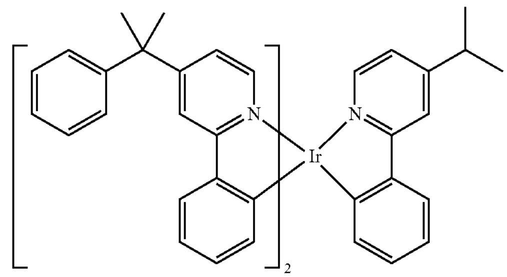
1623
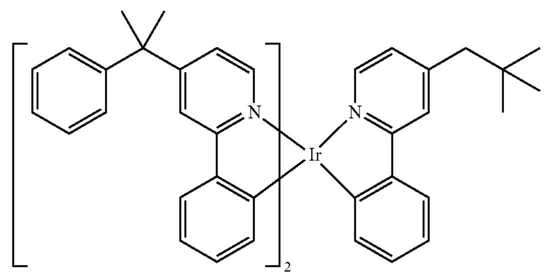
1624
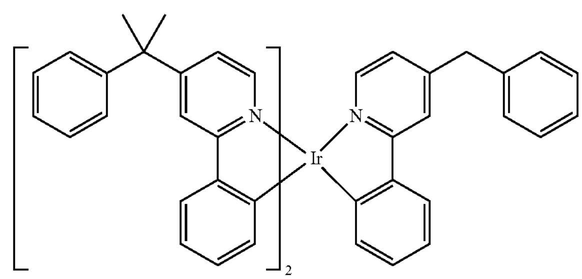
1625
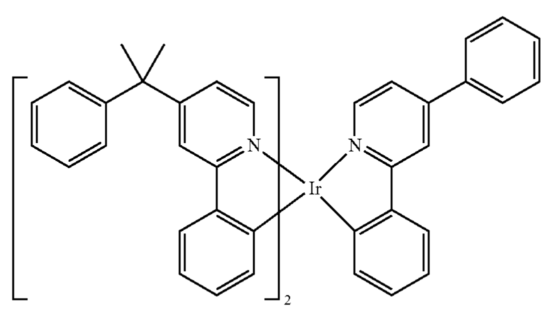
1626
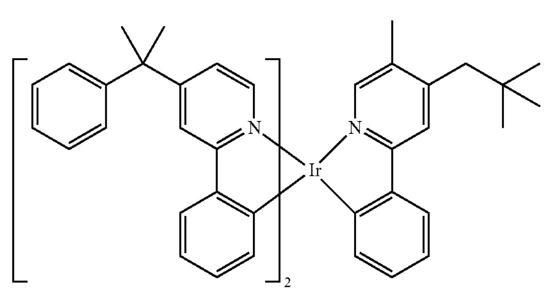

-continued
1627
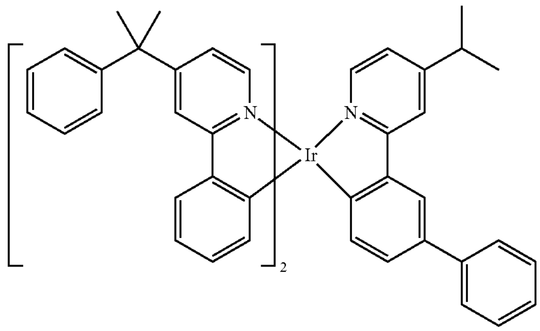
1628
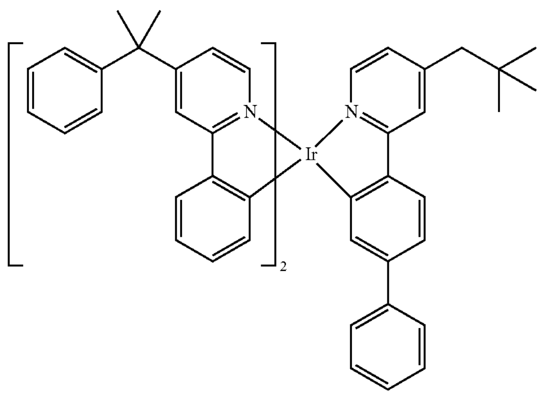
1629
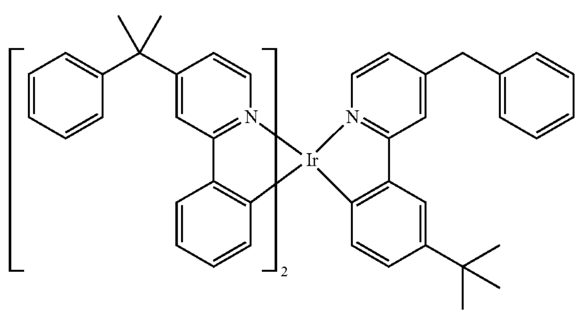
1630
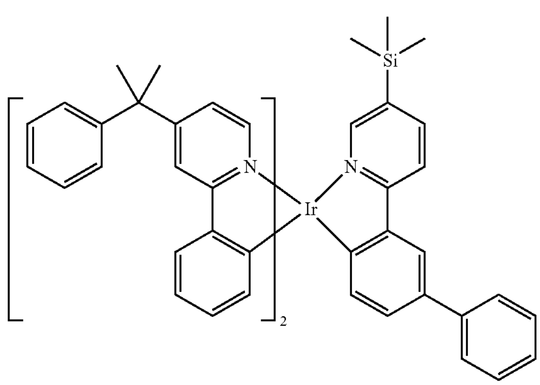
-continued
1631
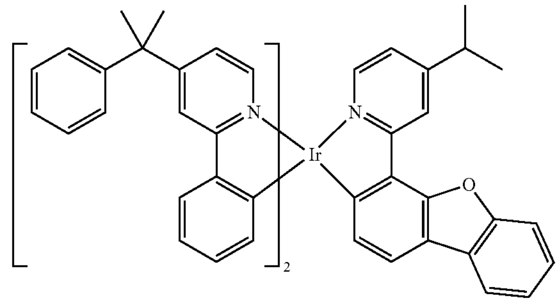
1632
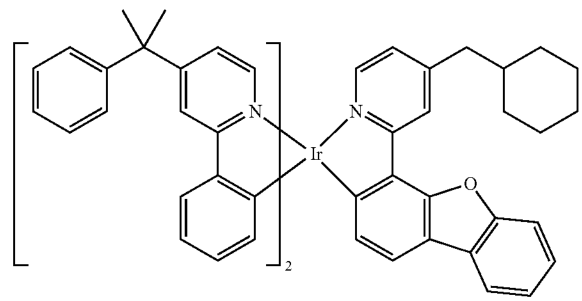
1633
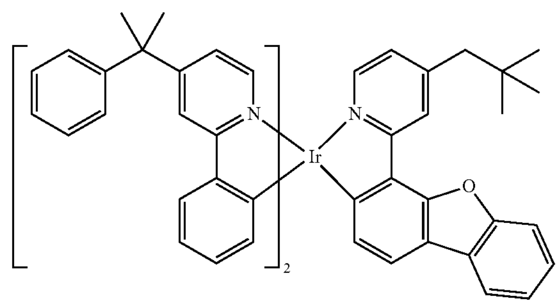
1634
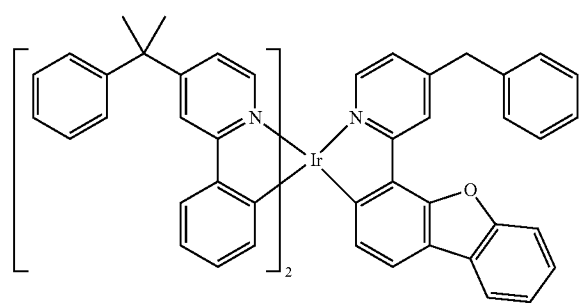
1635
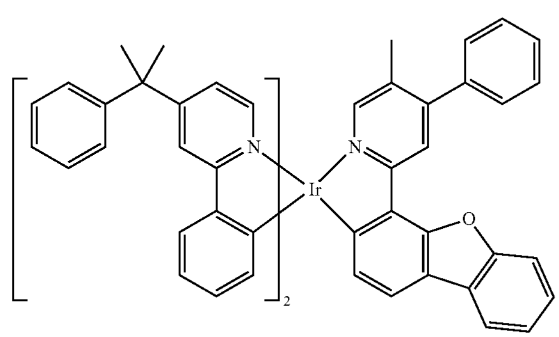

-continued
1636
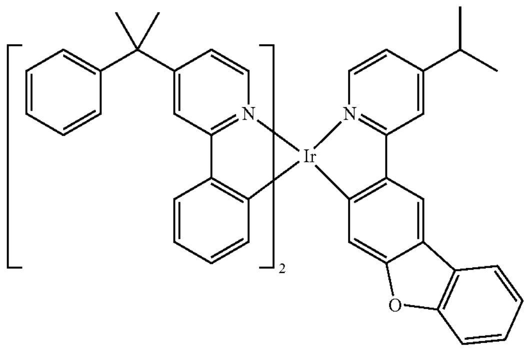
1637
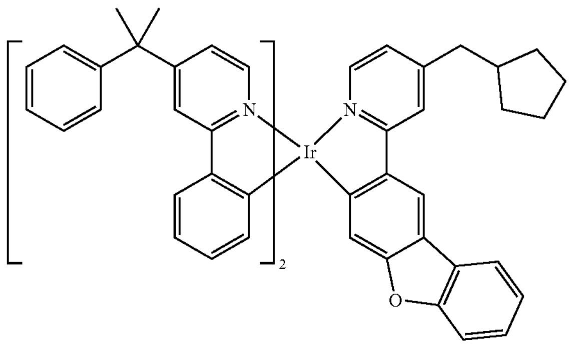
1638
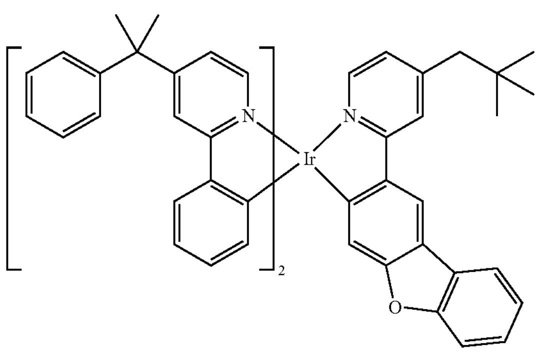
1639
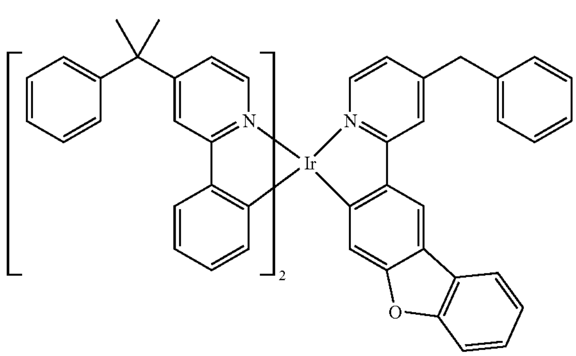
-continued
1640
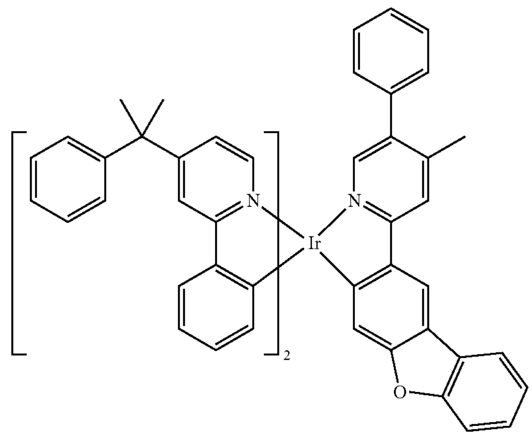
1641
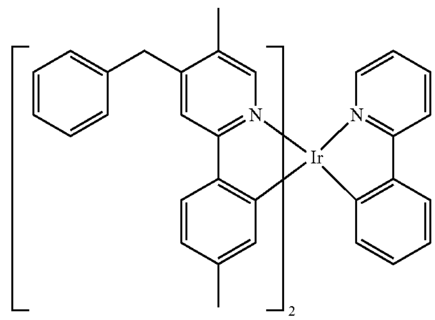
1642
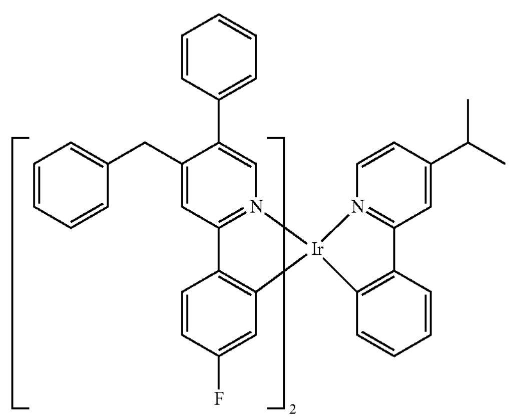
1643
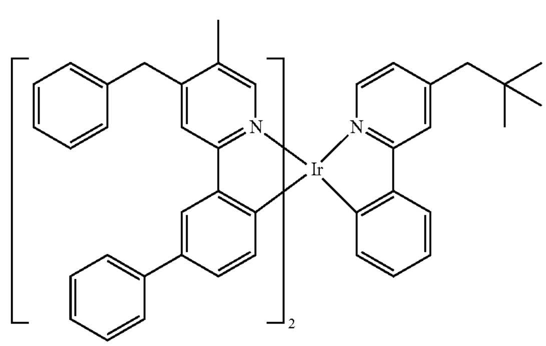

-continued
1644
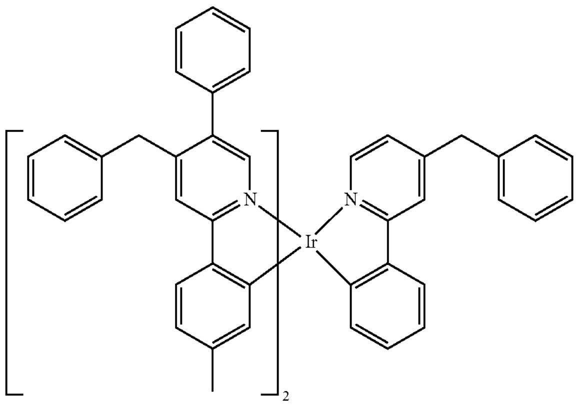
1645
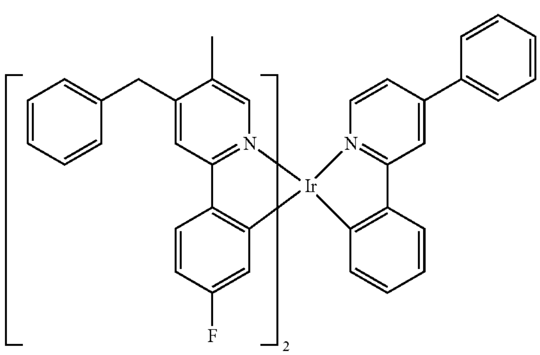
1646
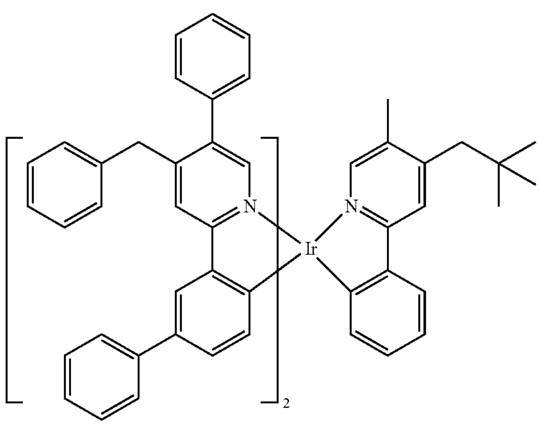
1647
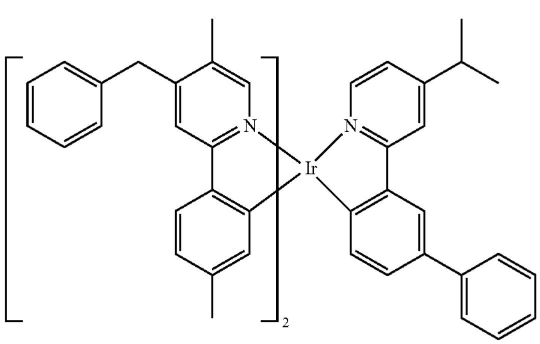
-continued
1648
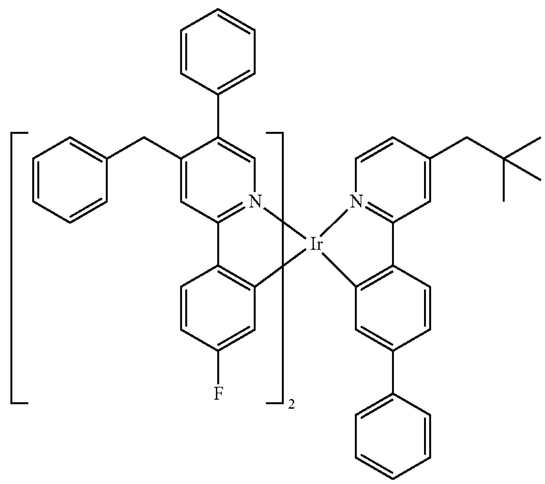
1649
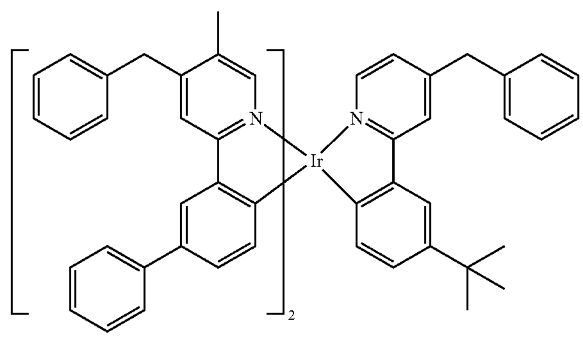
1650
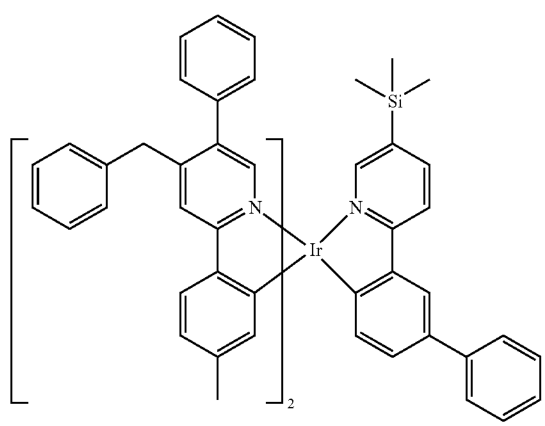
1651
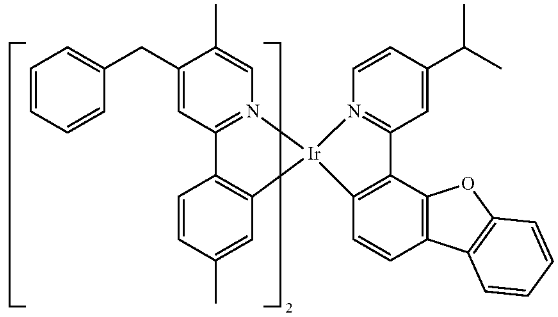

1652
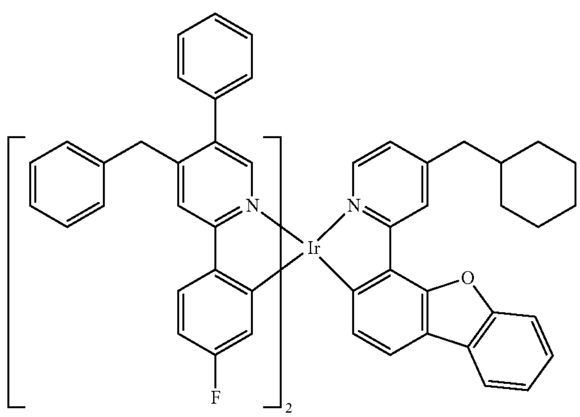
1653
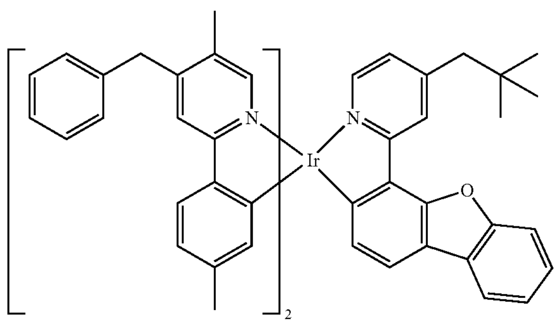
1654
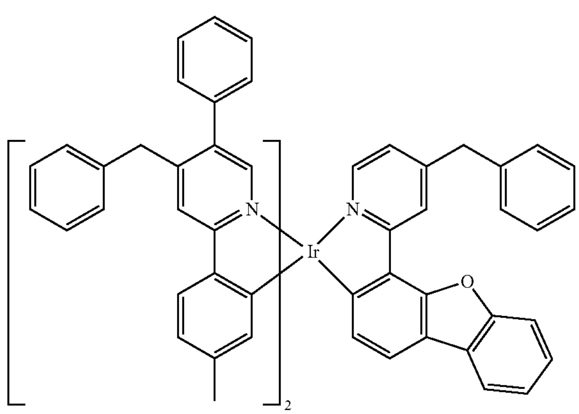
1655
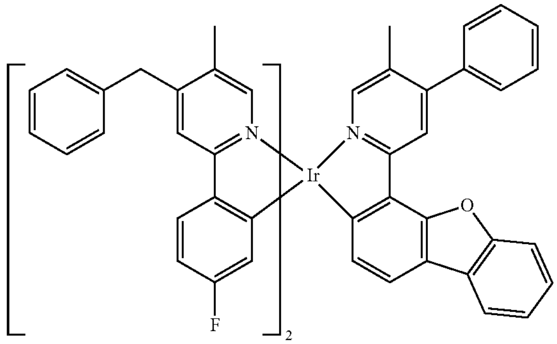
1656
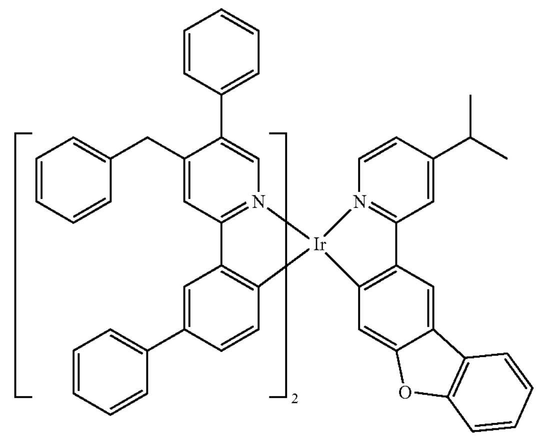
1657
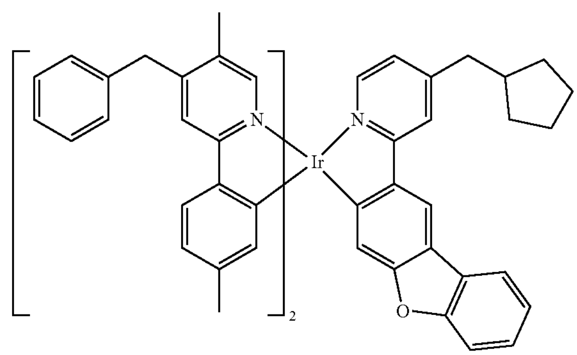
1658
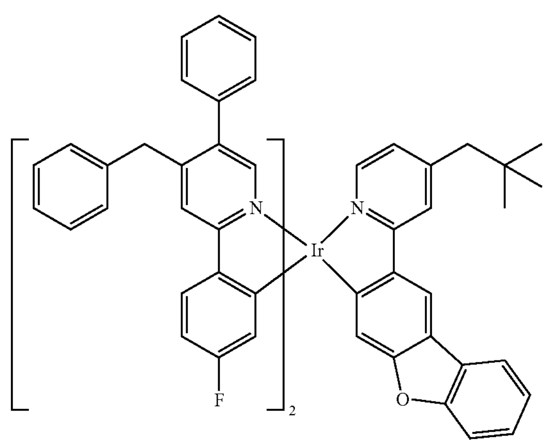
1659
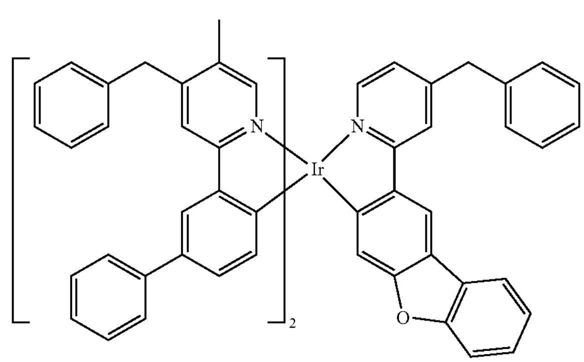

1660
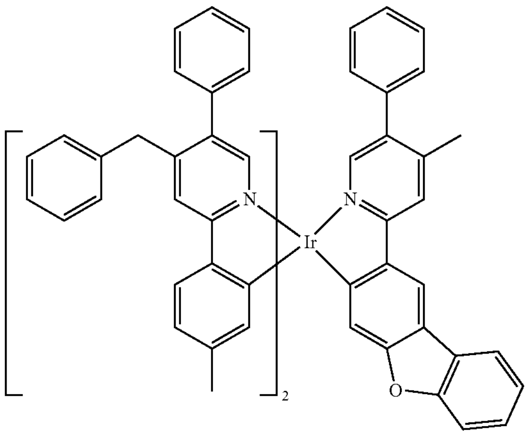
1661
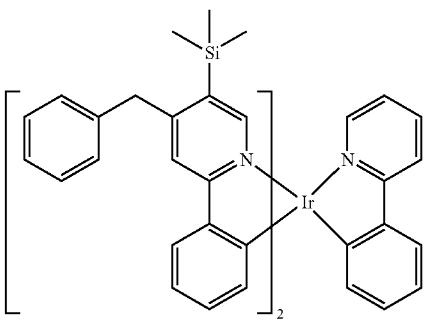
1662
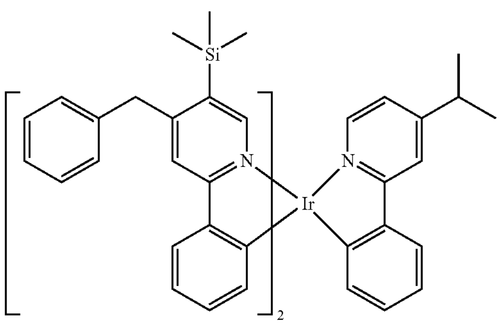
1663
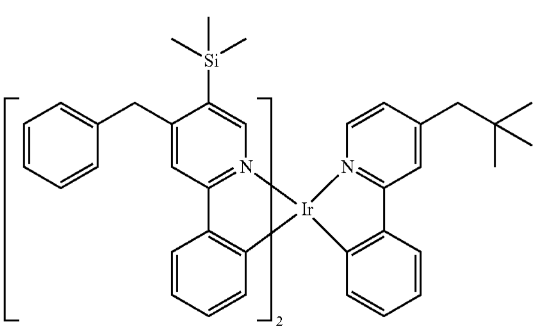
1664
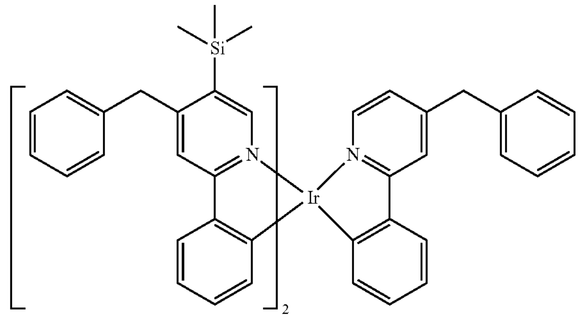
1665
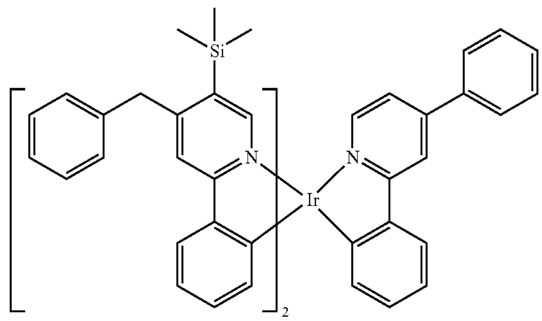
1666
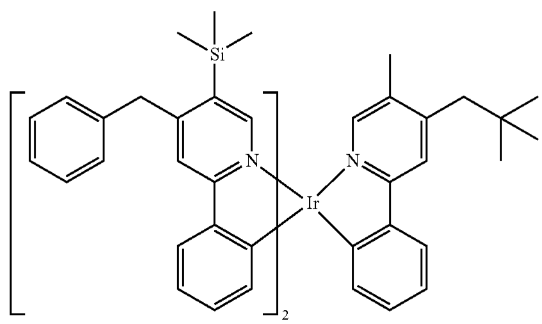
1667
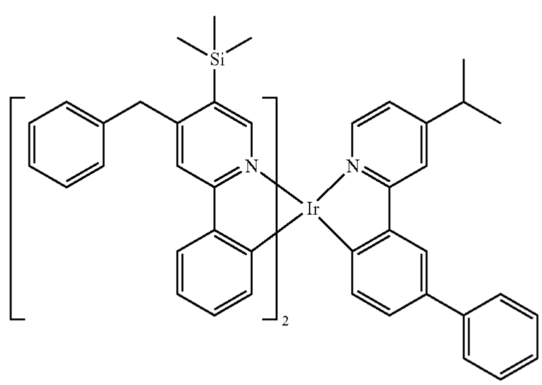

1668
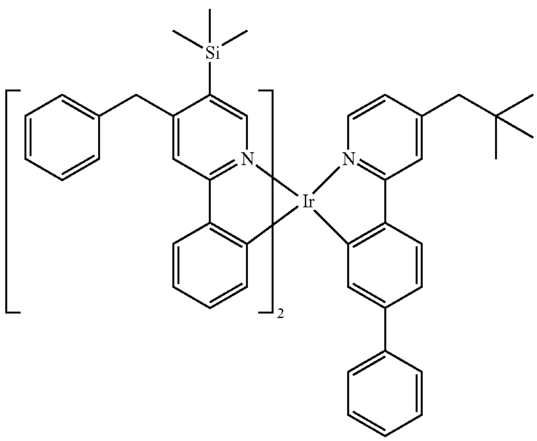
1669
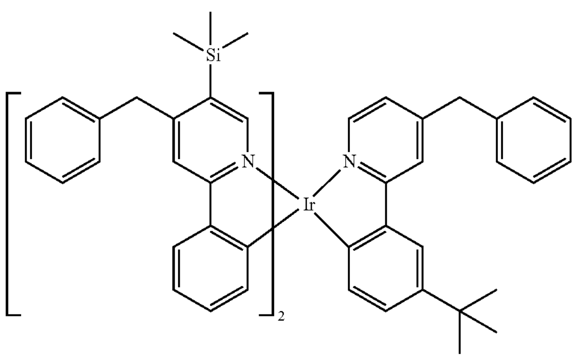
1670
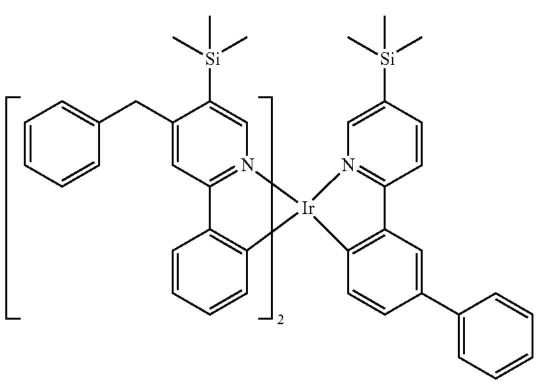
1671
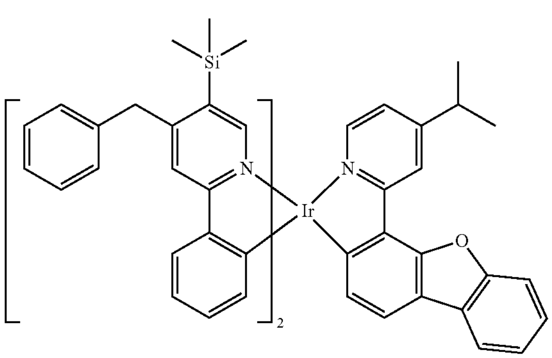
1672
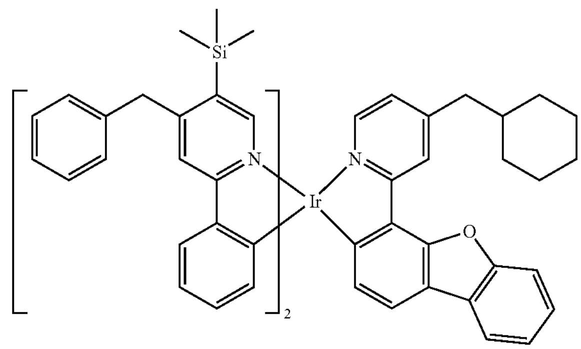
1673
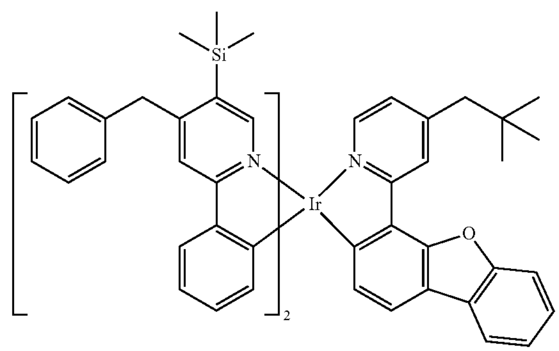
1674
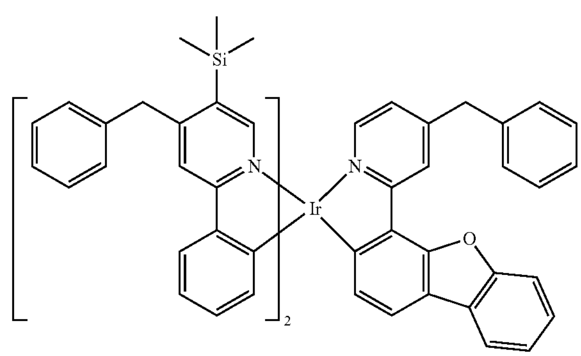
1675
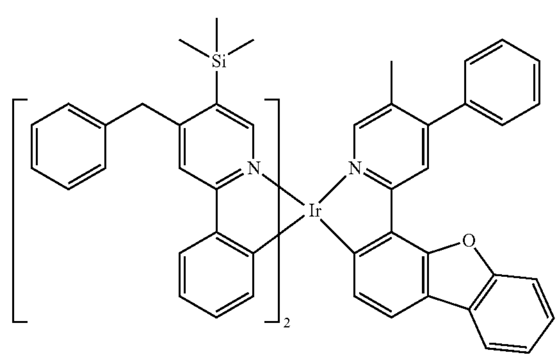

1676
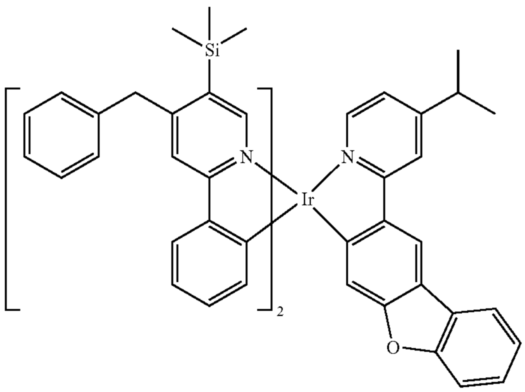
1677
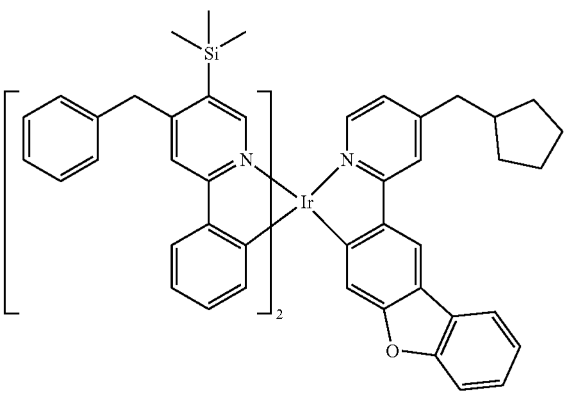
1678
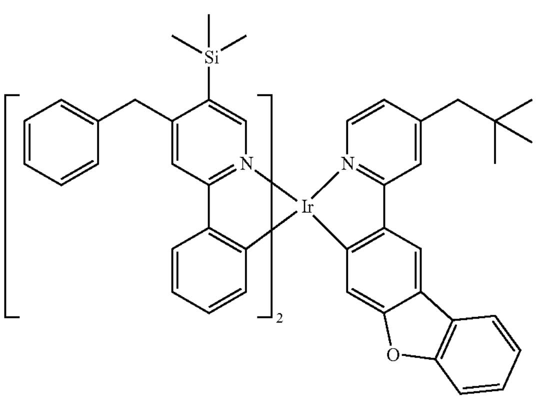
1679
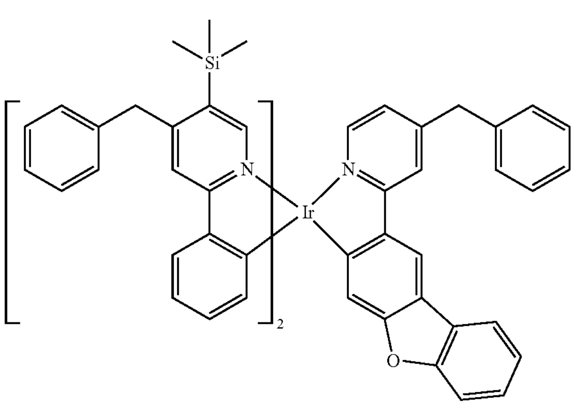
1680
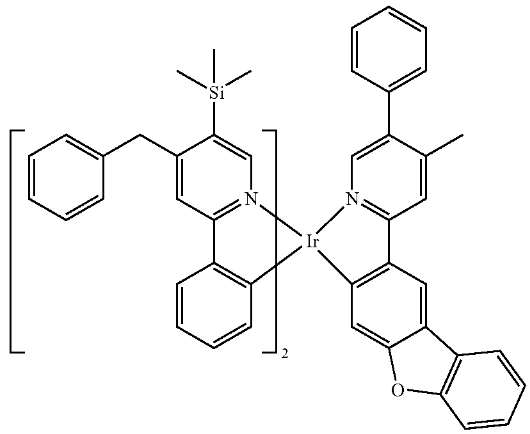
1681
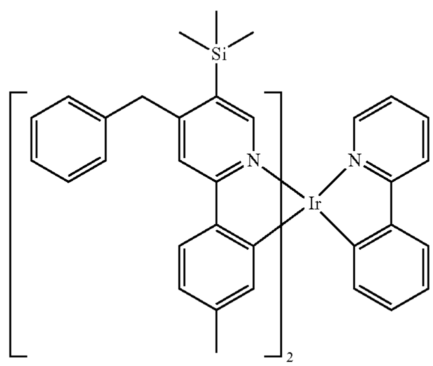
1682
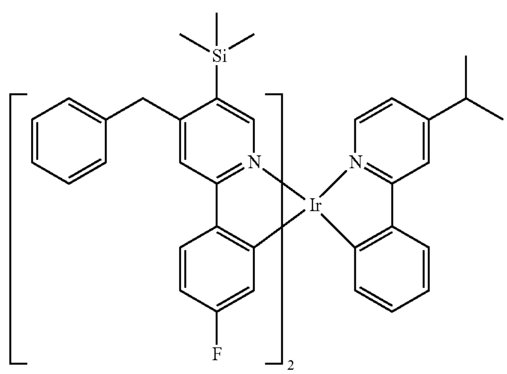
1683
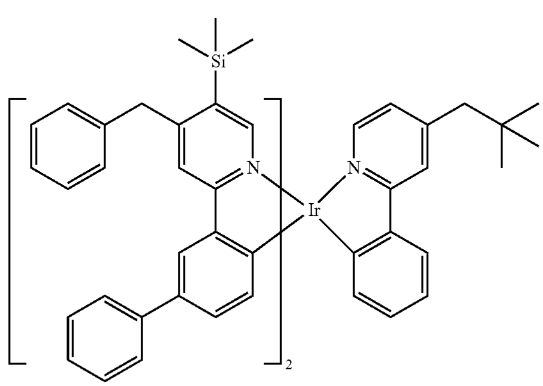

-continued
1684
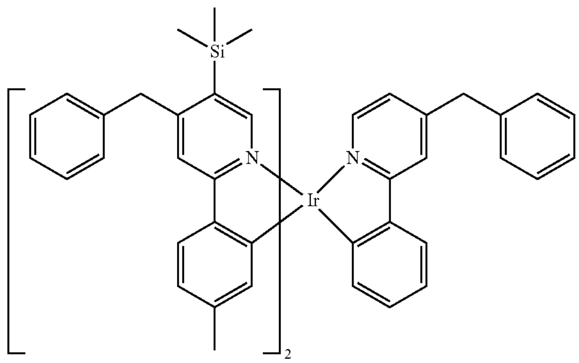
1685
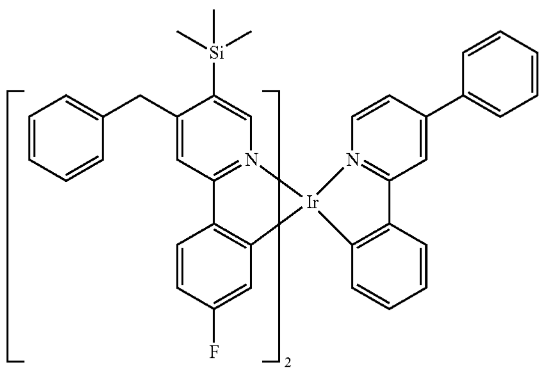
1686
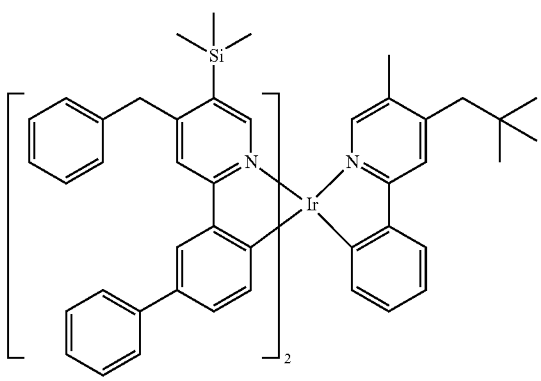
1687
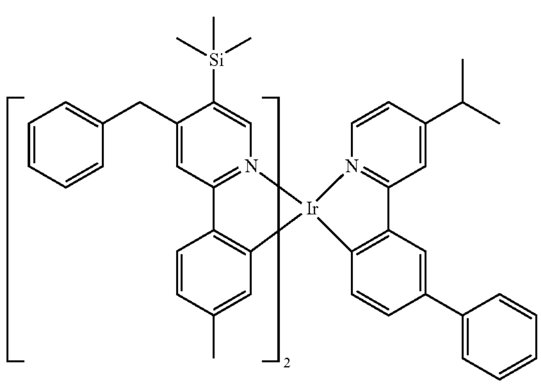
-continued
1688
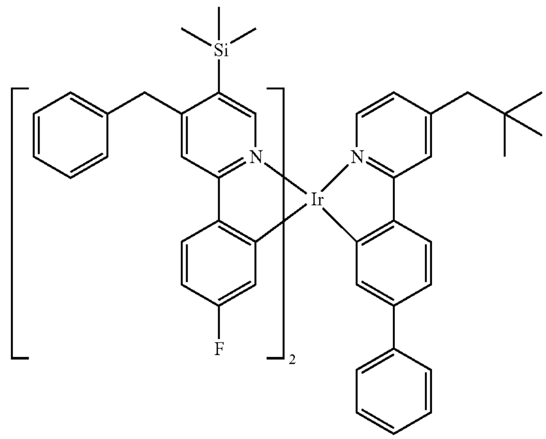
1689
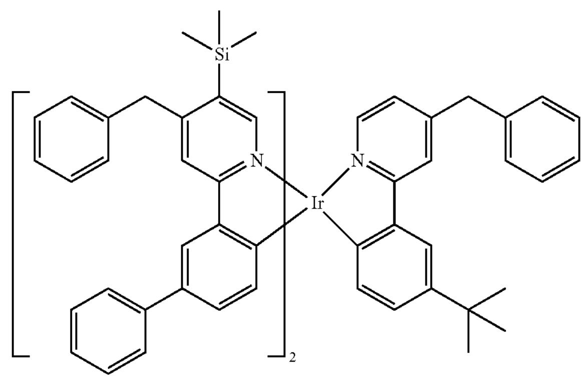
1690
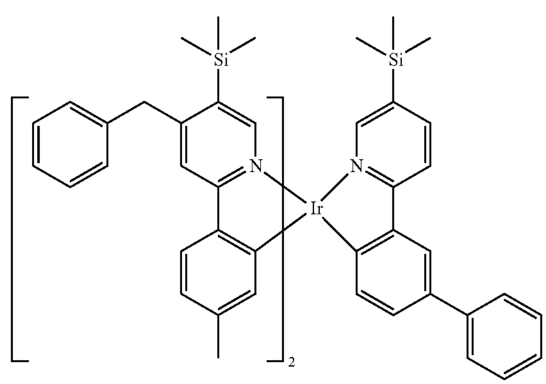
1691
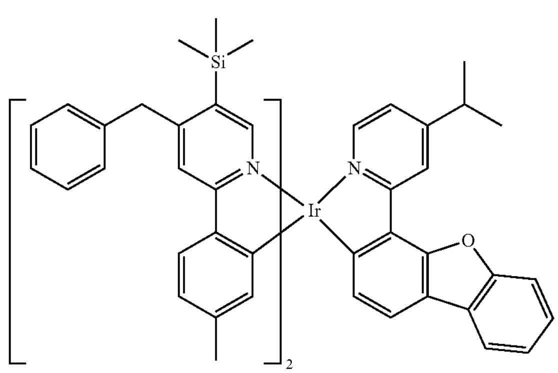

-continued
1692
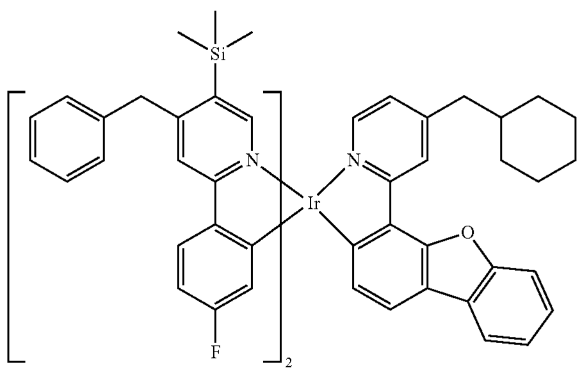
1693
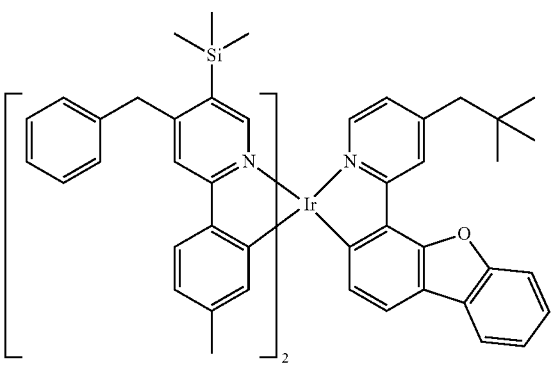
1694
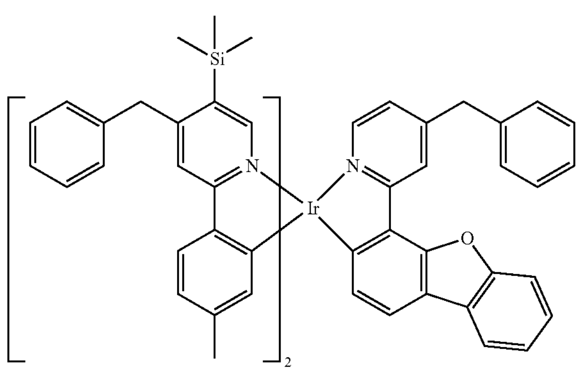
1695
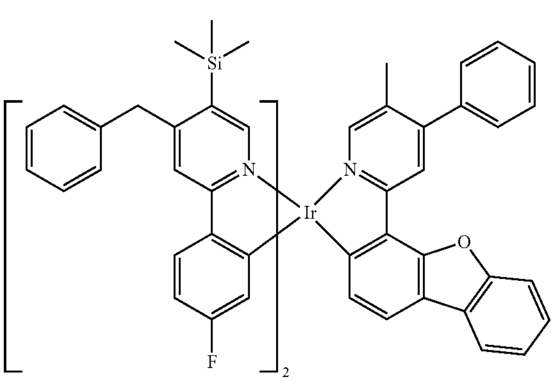
-continued
1696
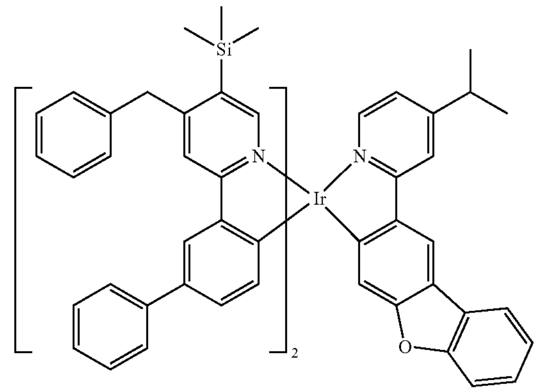
1697
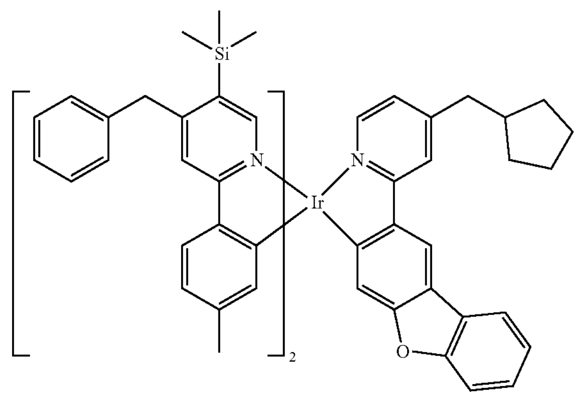
1698
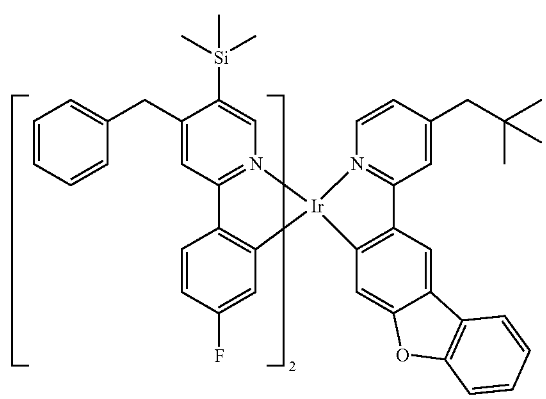
1699
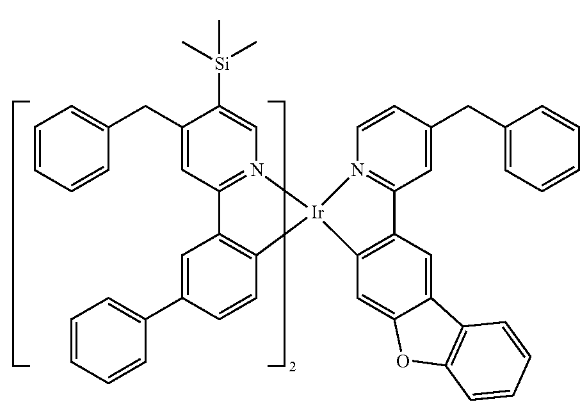

1700
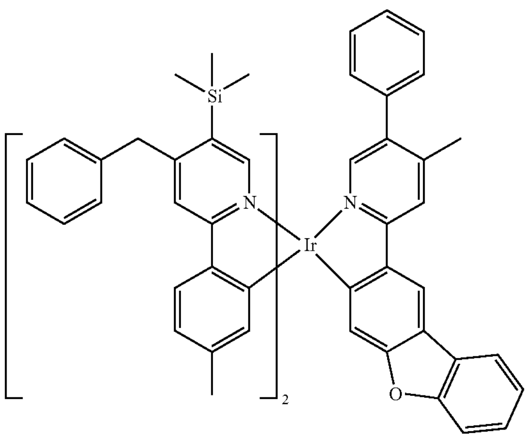
1701
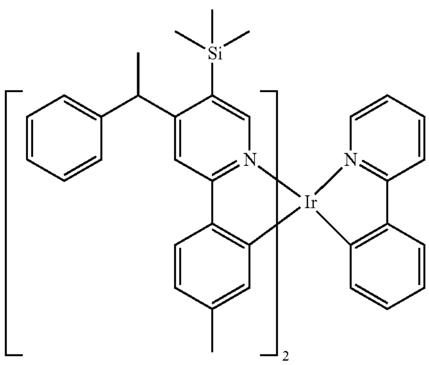
1702
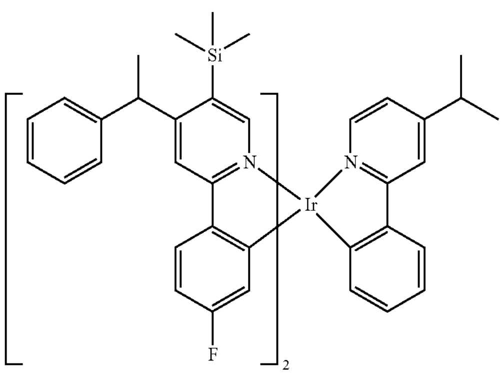
1703
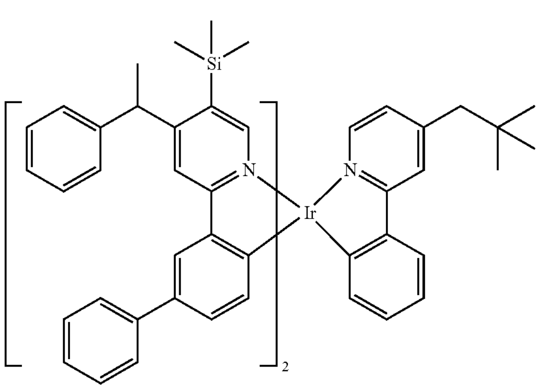
1704
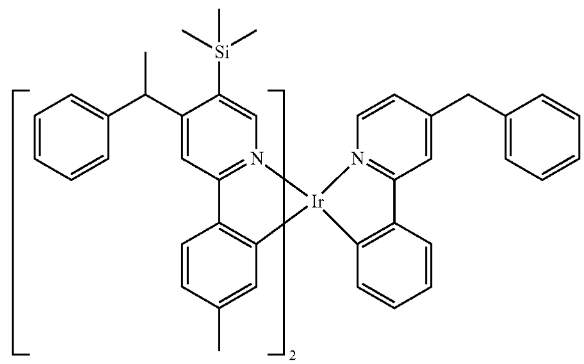
1705
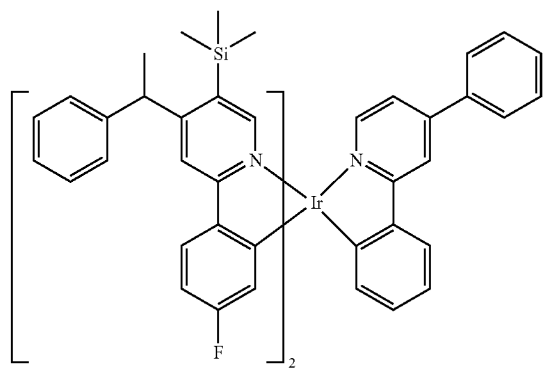
1706
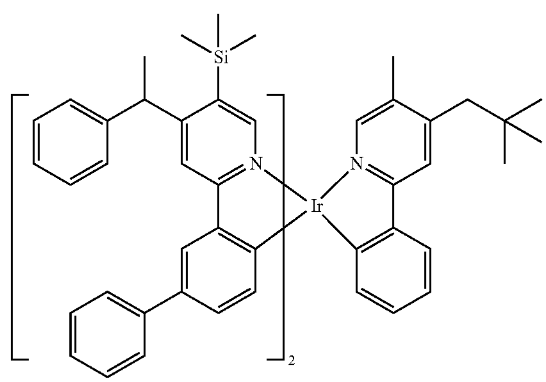
1707
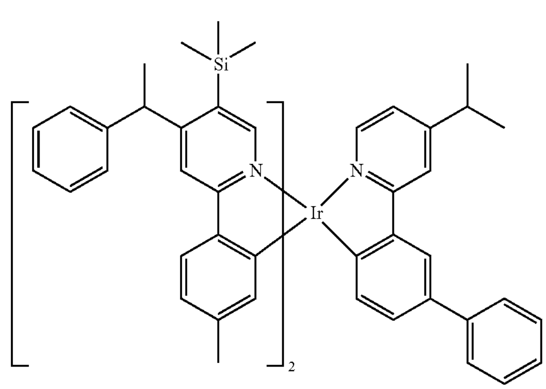

1708
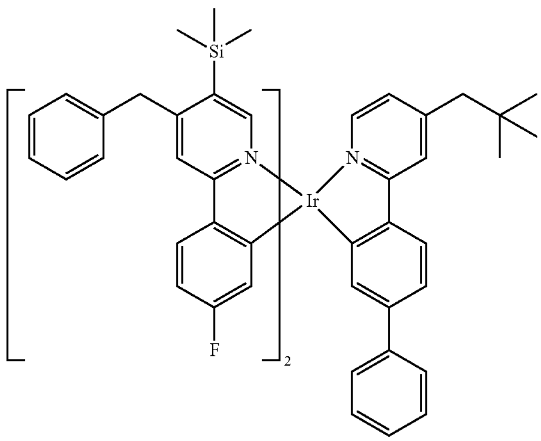
1709
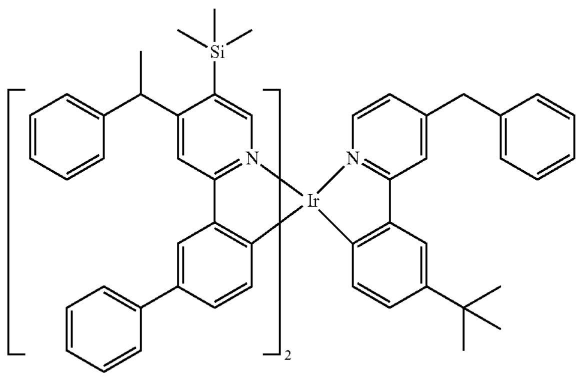
1710
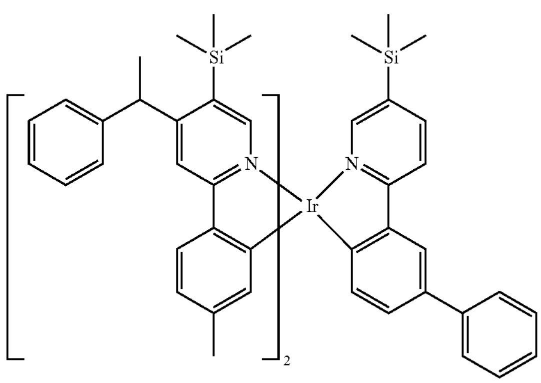
1711
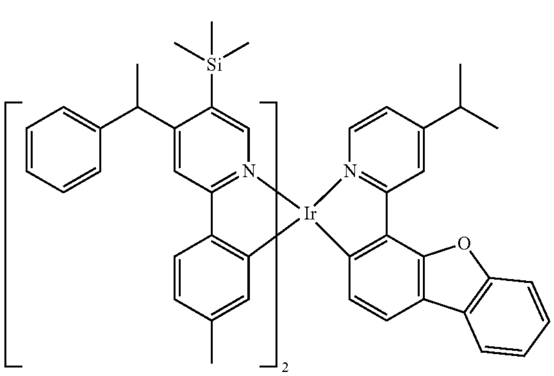
1712
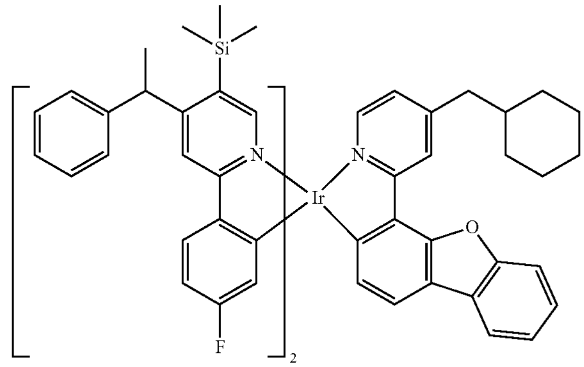
1713
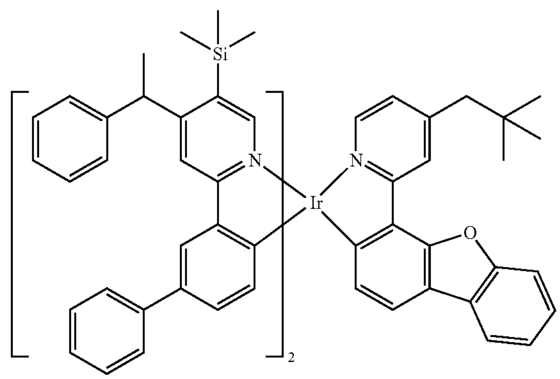
1714
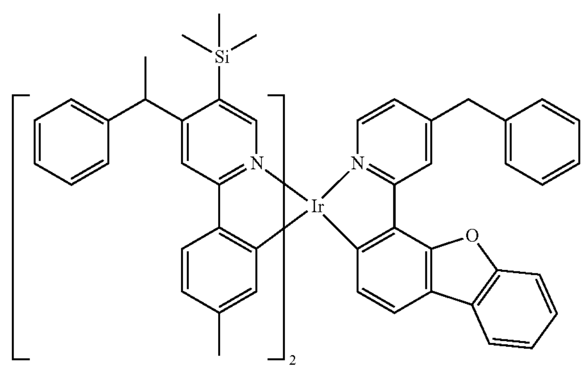
1715
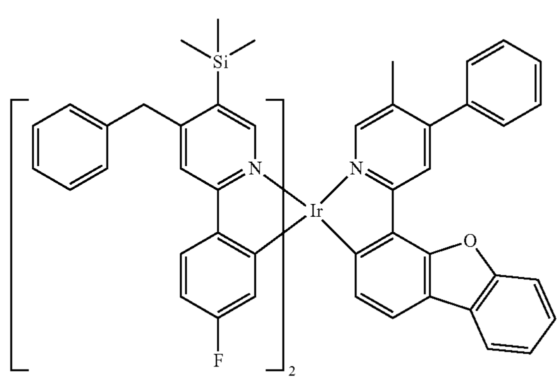

-continued
1716
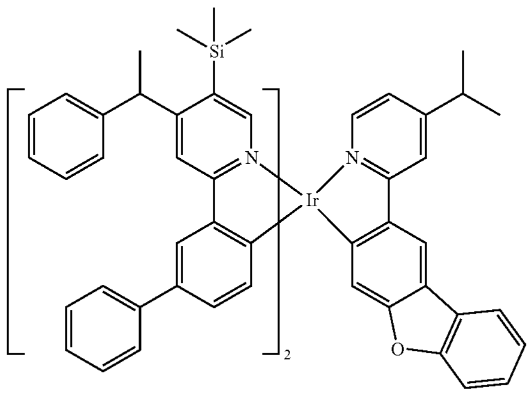
1717
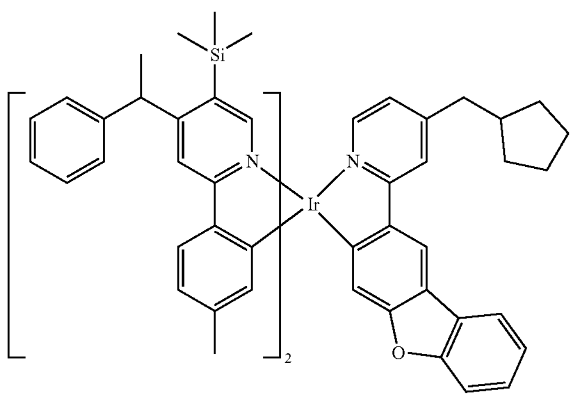
1718
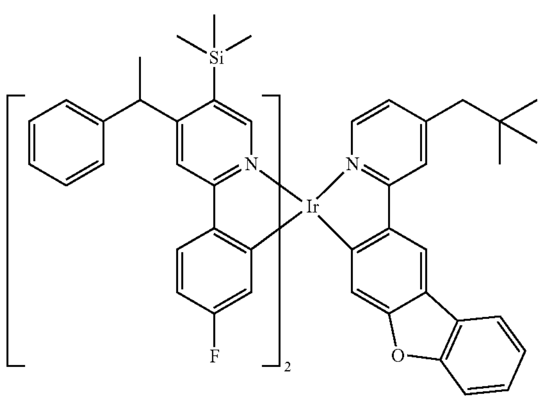
1719
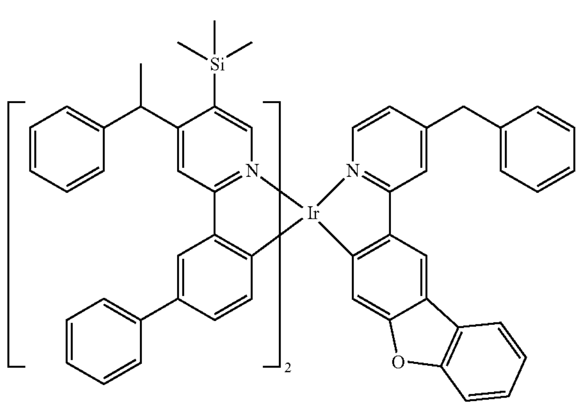
-continued
1720
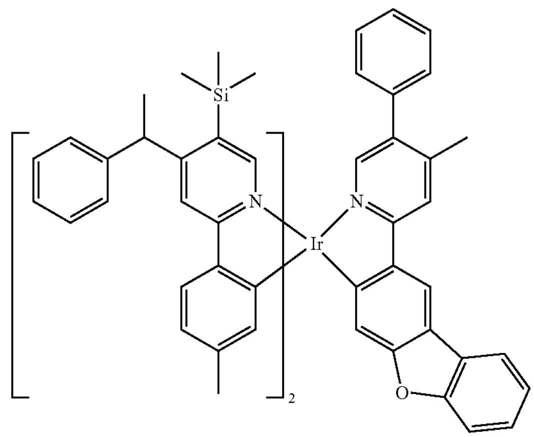
1721
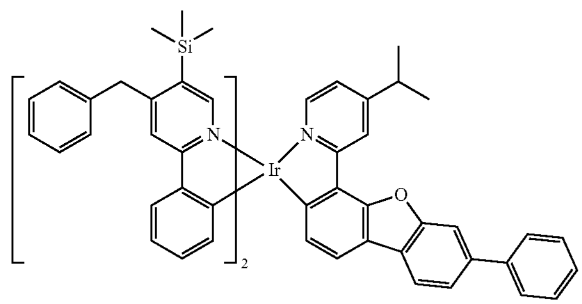
1722
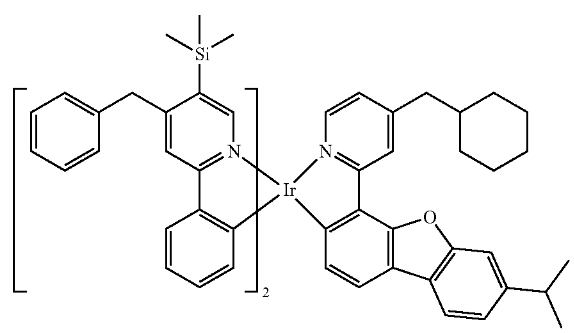
1723
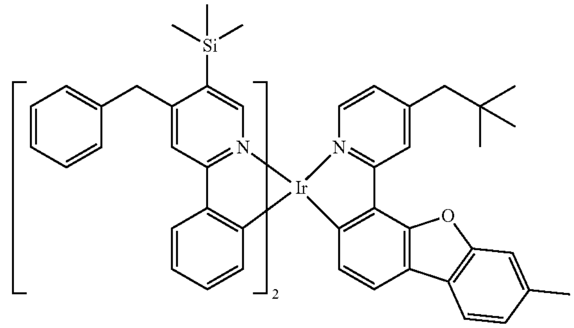

-continued
1724
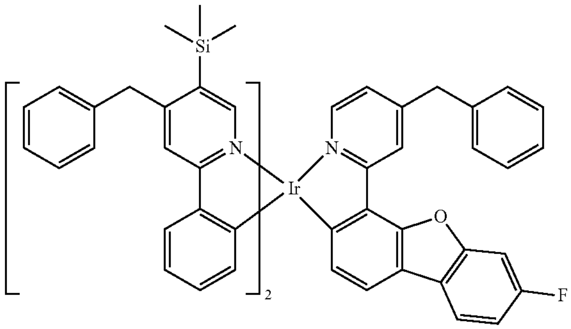
1725
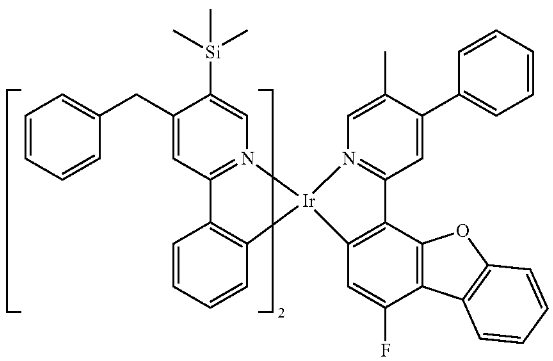
1726
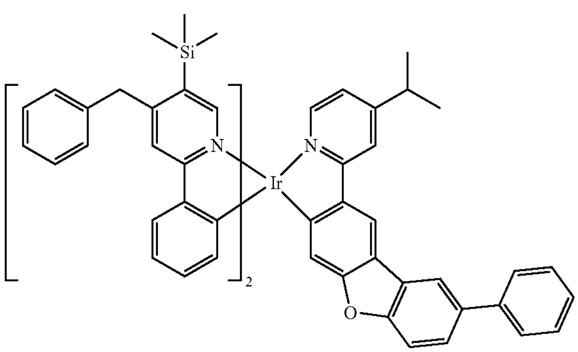
1727
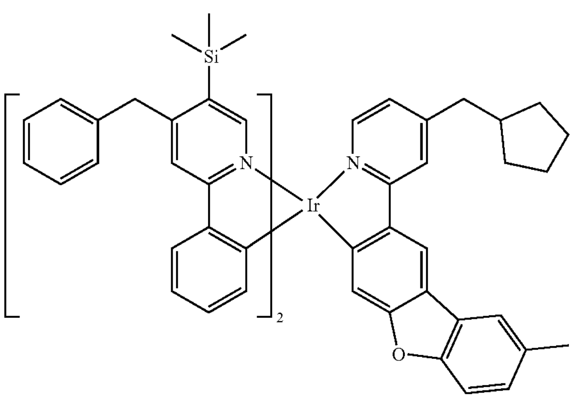
-continued
1728
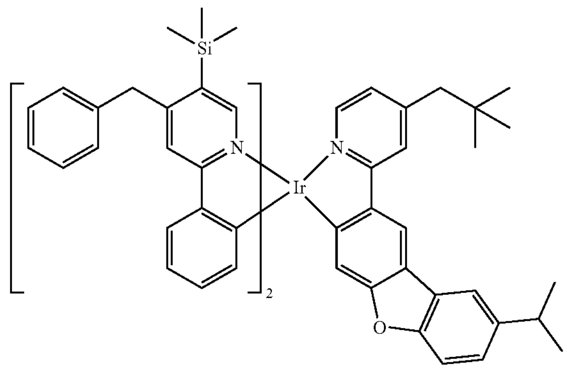
1729
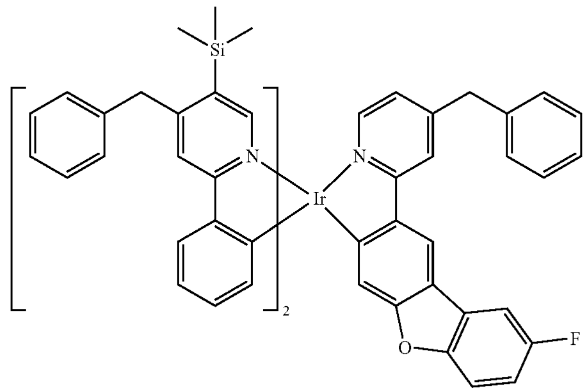
1730
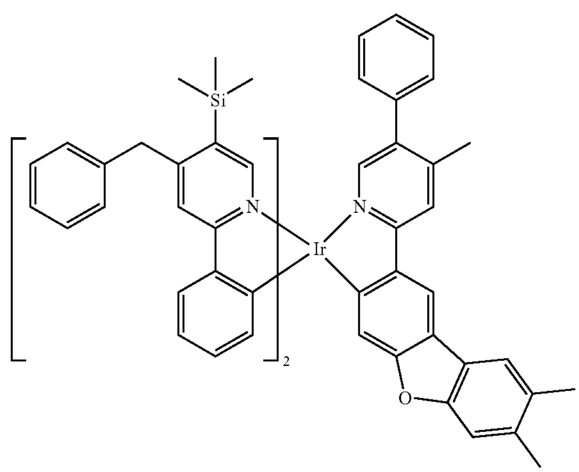
1731
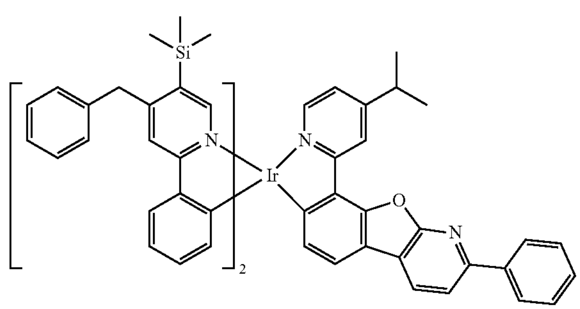

-continued
1732
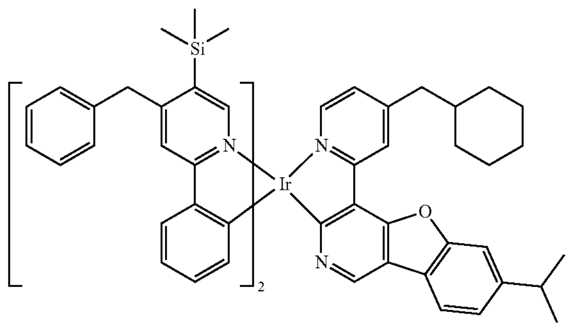
1733
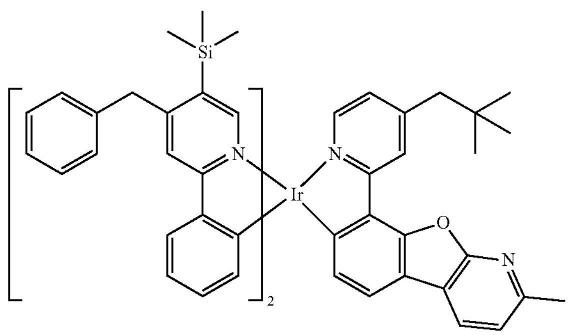
1734
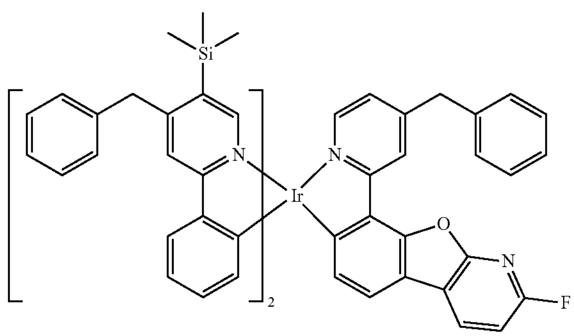
1735
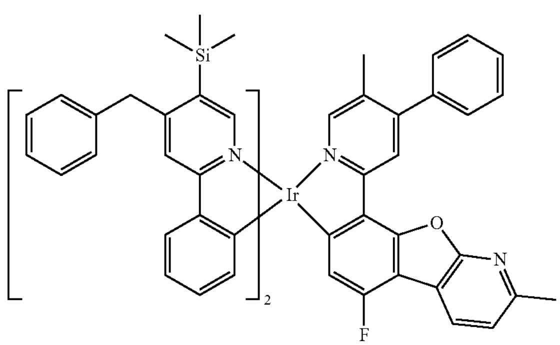
-continued
1736
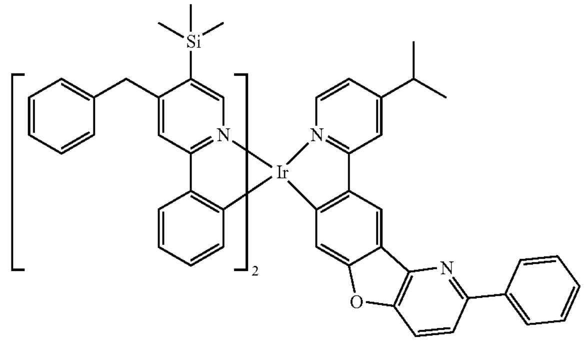
1737
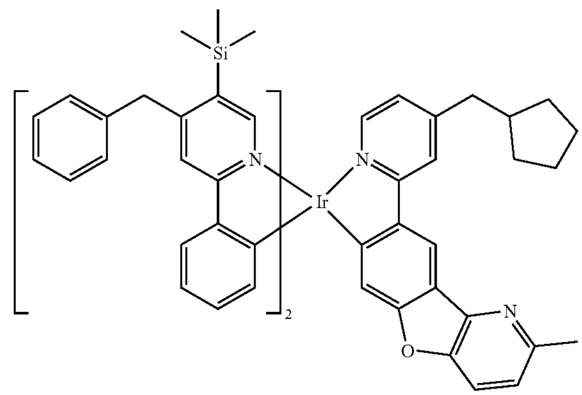
1738
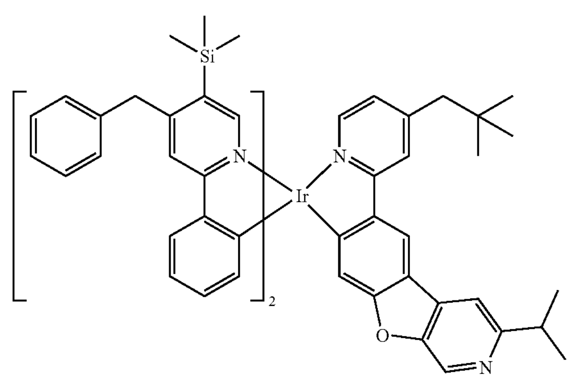
1739
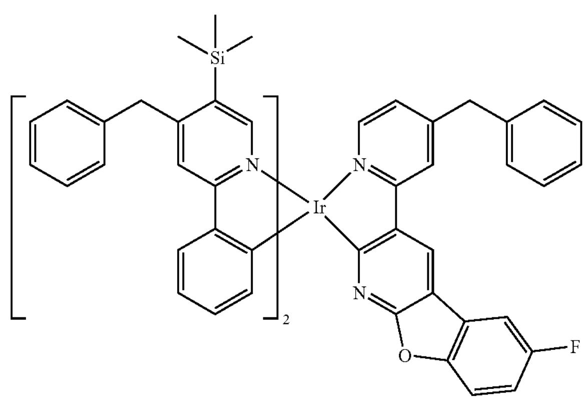

1740
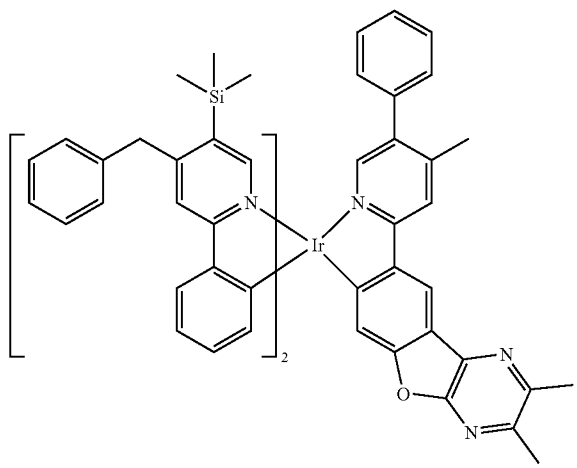
1741
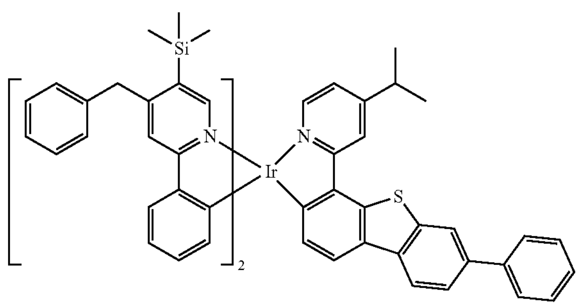
1742
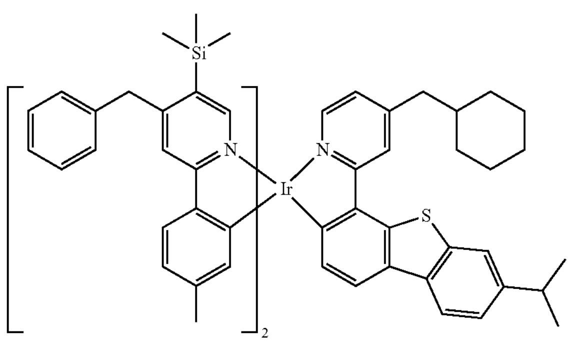
1743
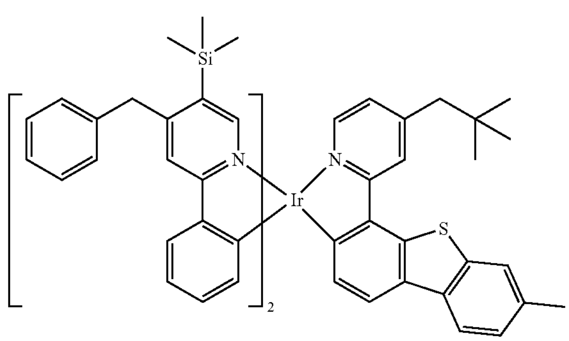
1744
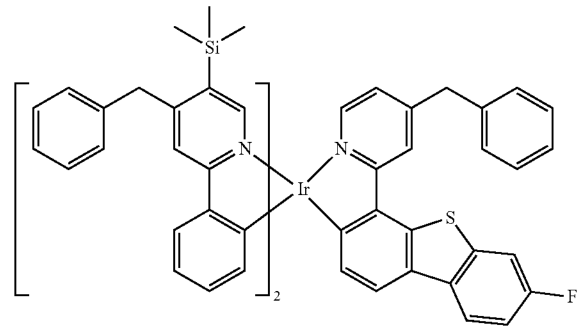
1745
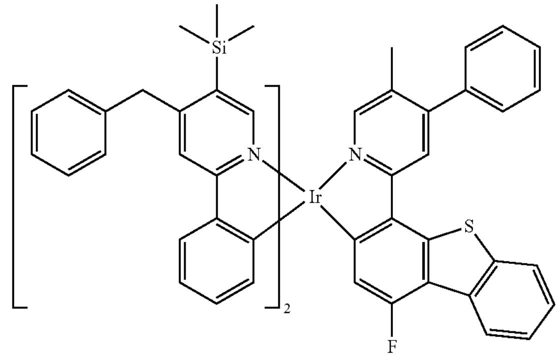
1746
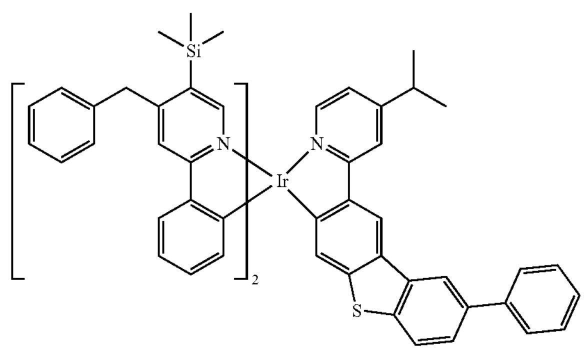
1747
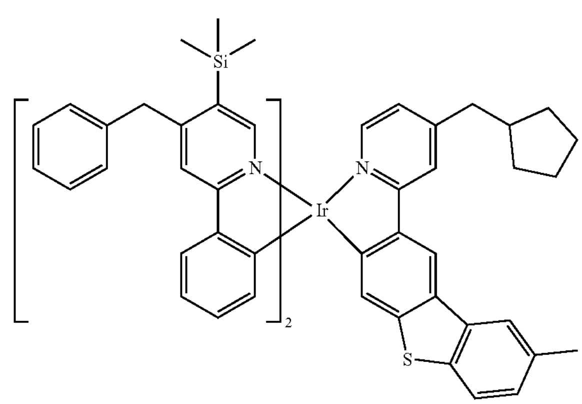

1748
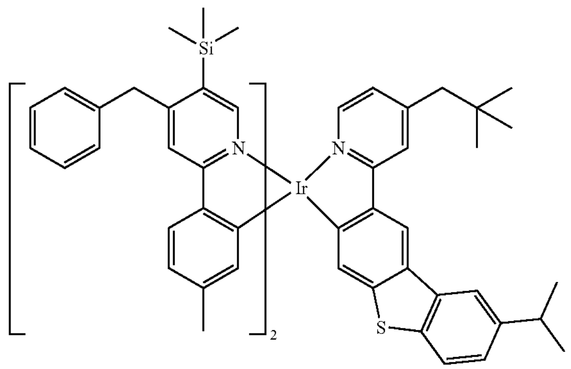
1749
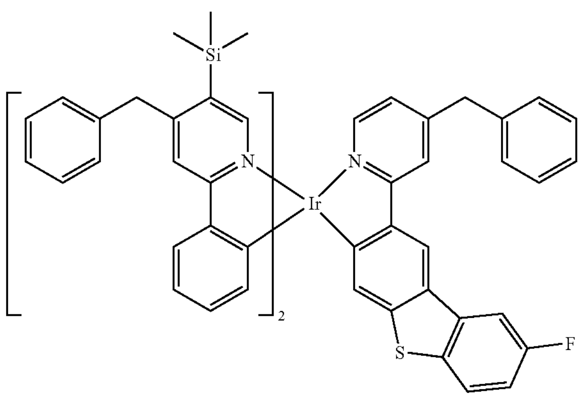
1750
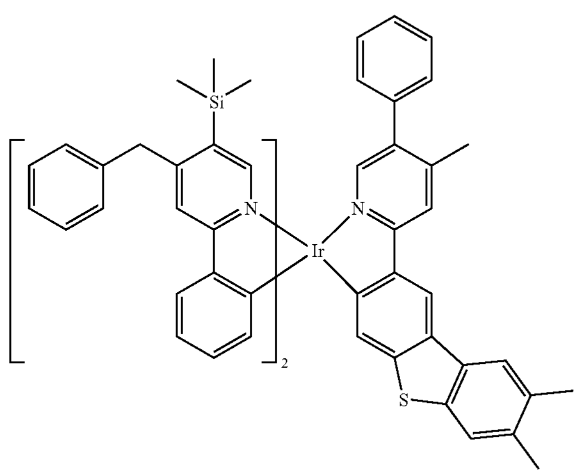
1751
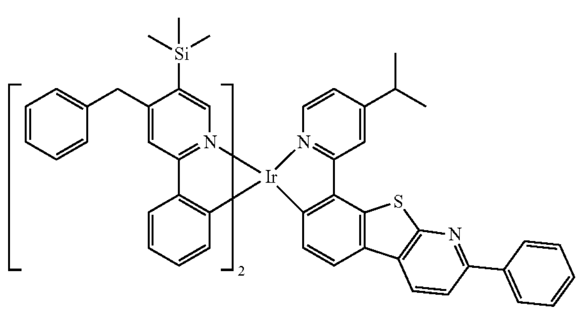
1752
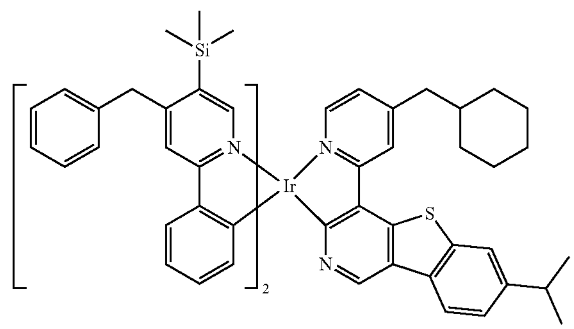
1753
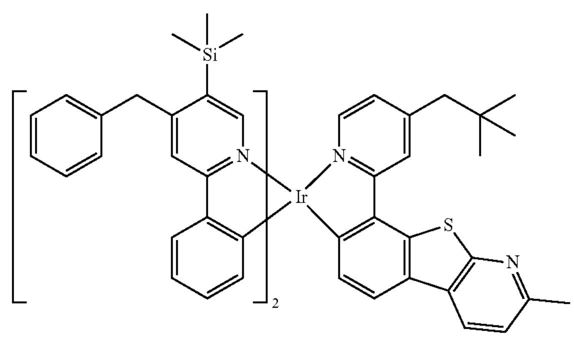
1754
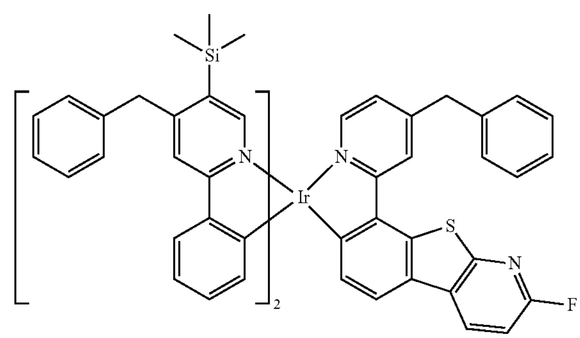
1755
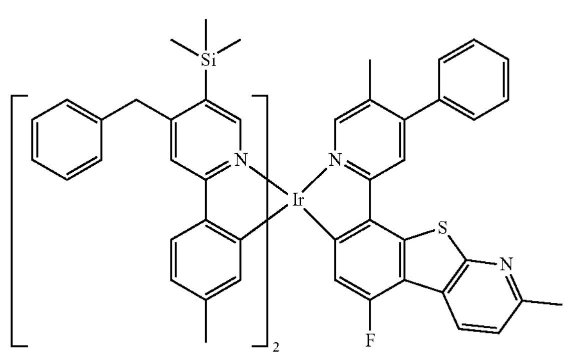

1756
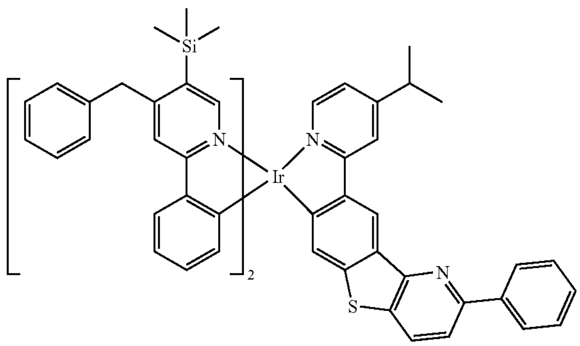
1757
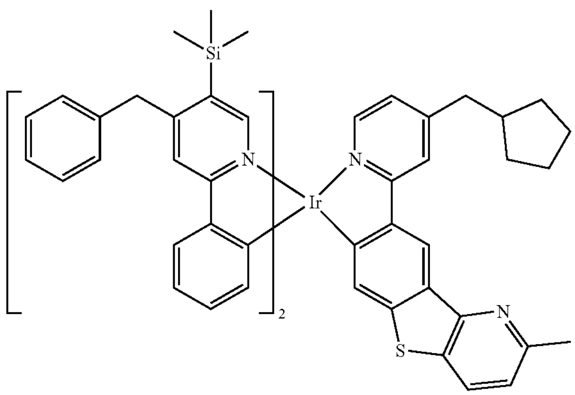
1758
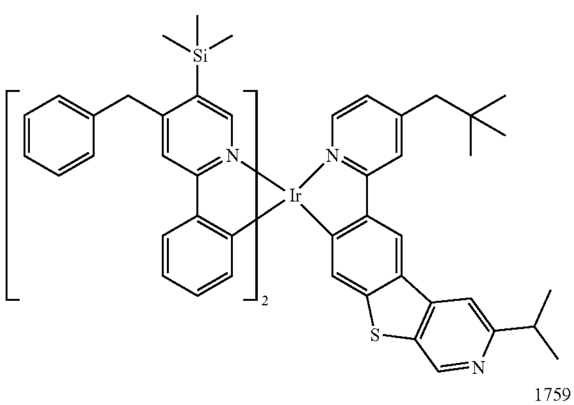
1759
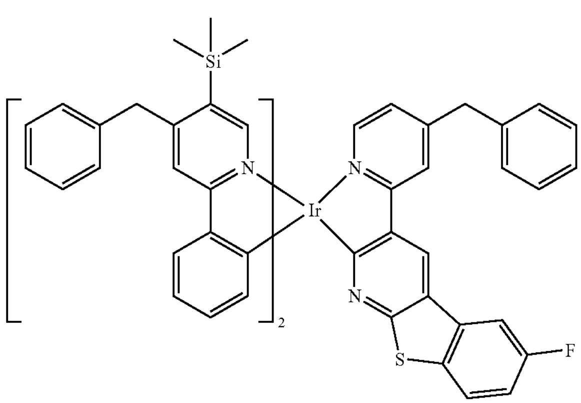
1760
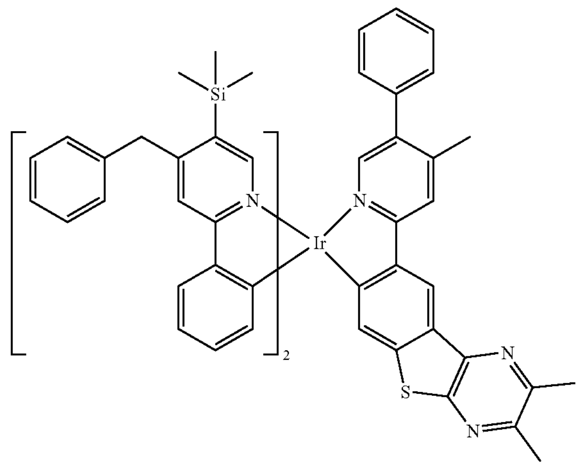
1761
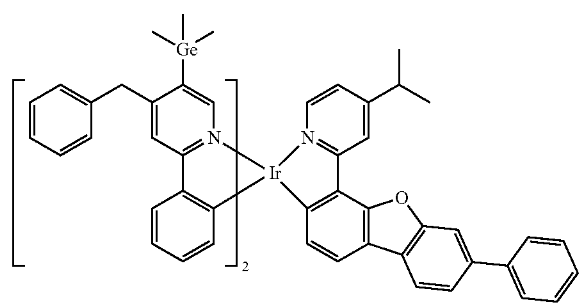
1762
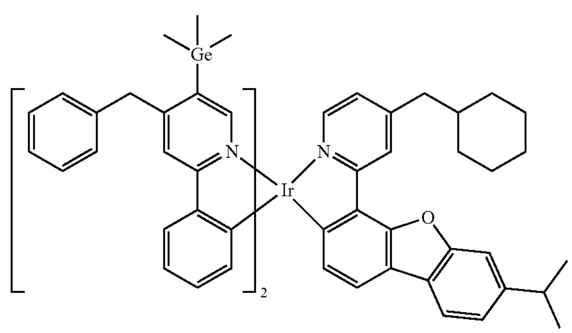
1763
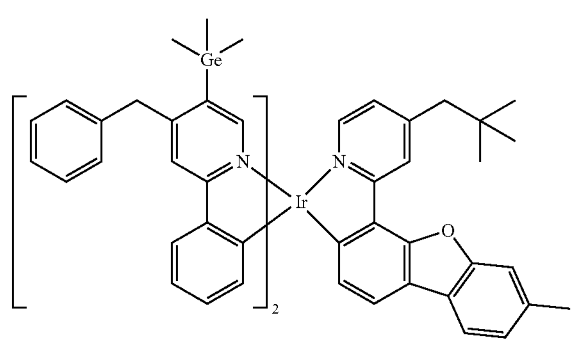

1764
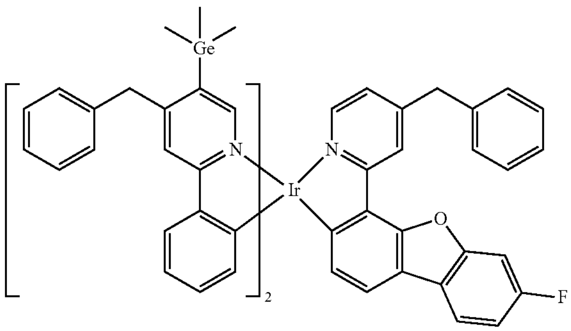
1765
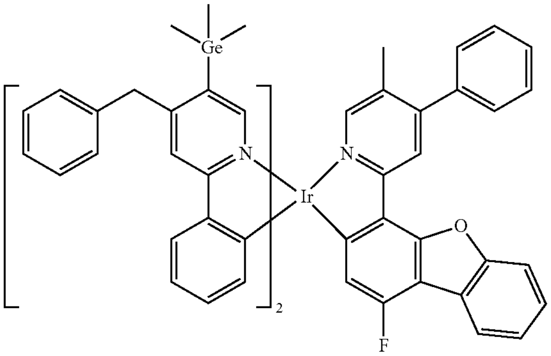
1766
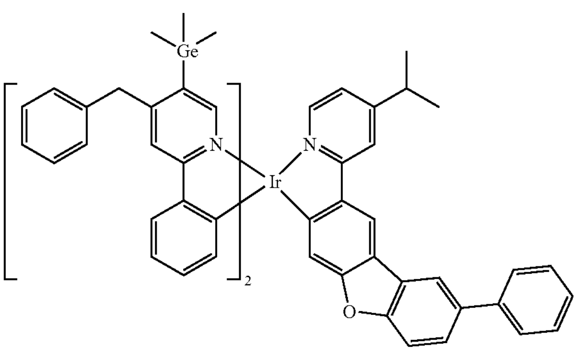
1767
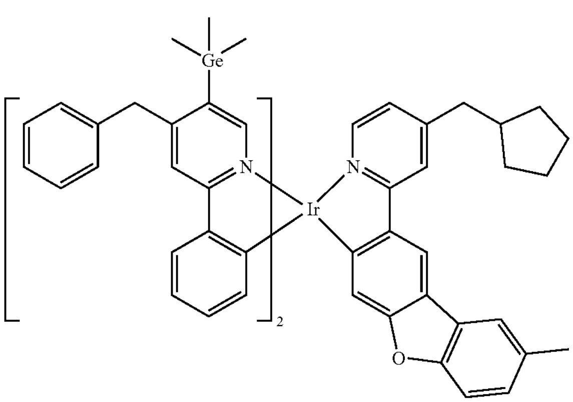
1768
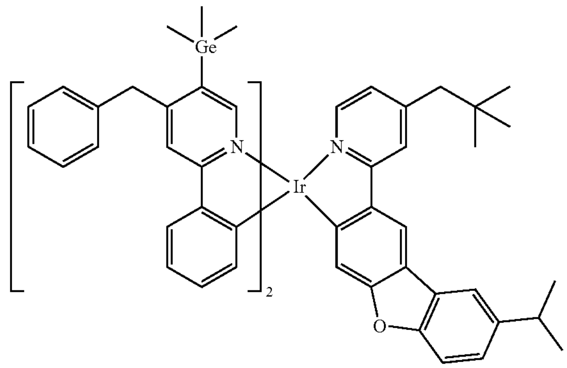
1769
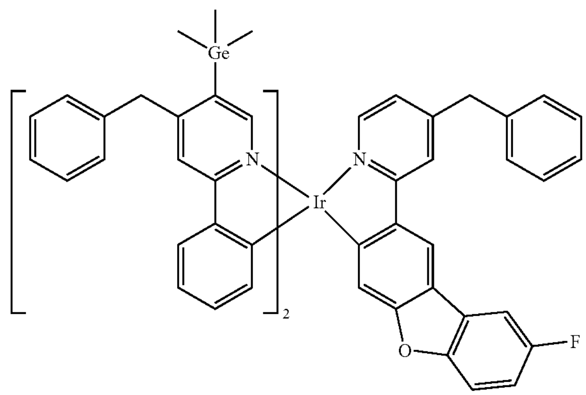
1770
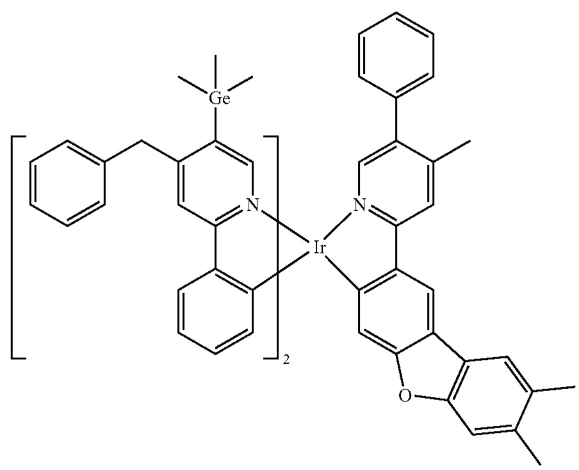
1771
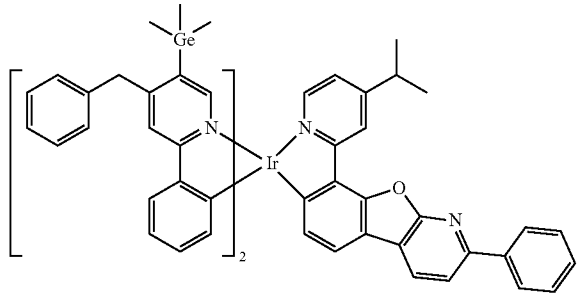

-continued
1772
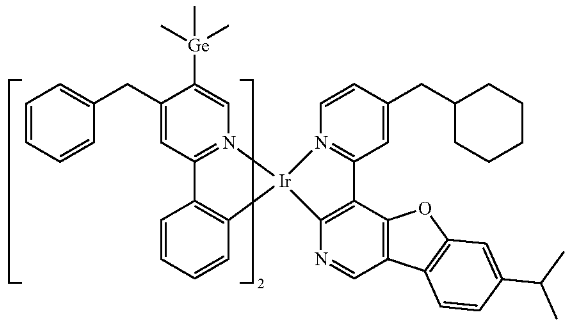
1773
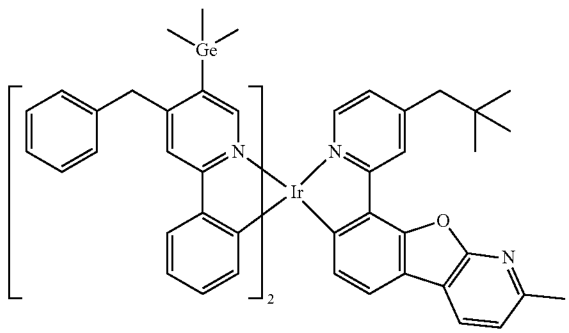
1774
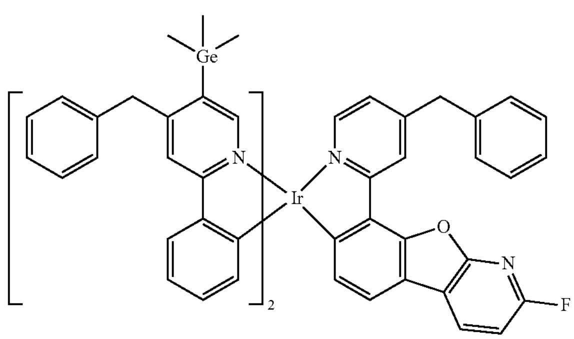
1775
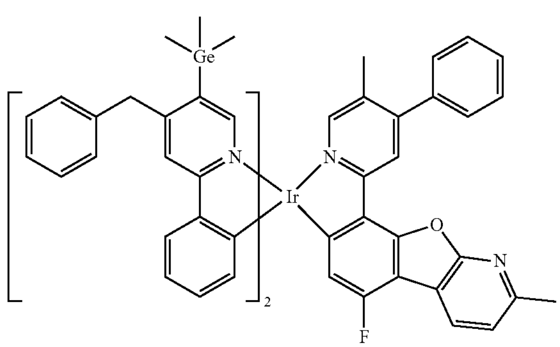
-continued
1776
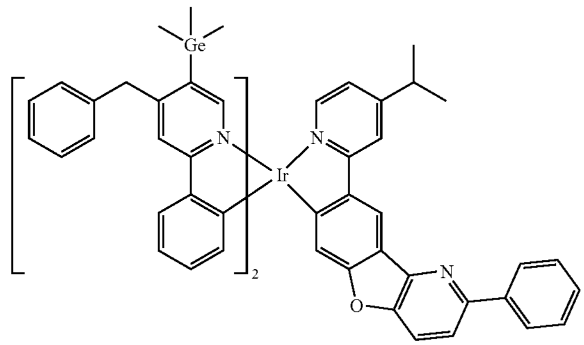
1777
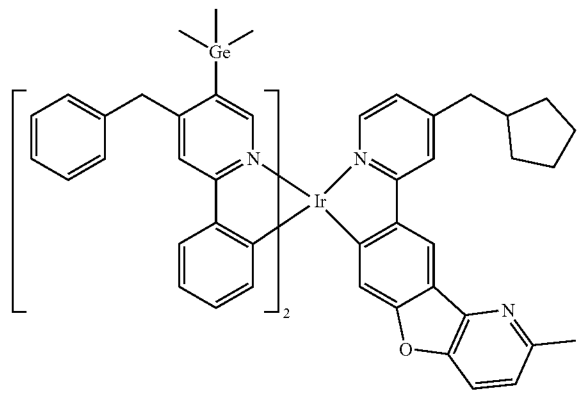
1778
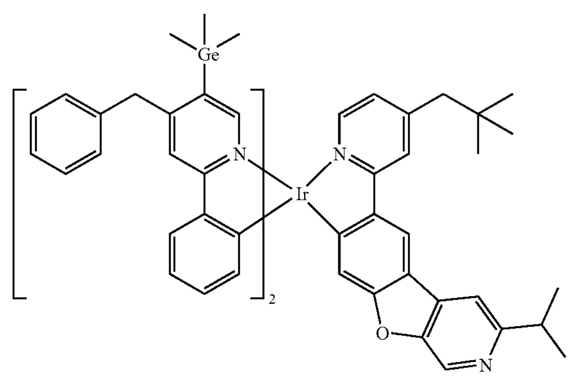
1779
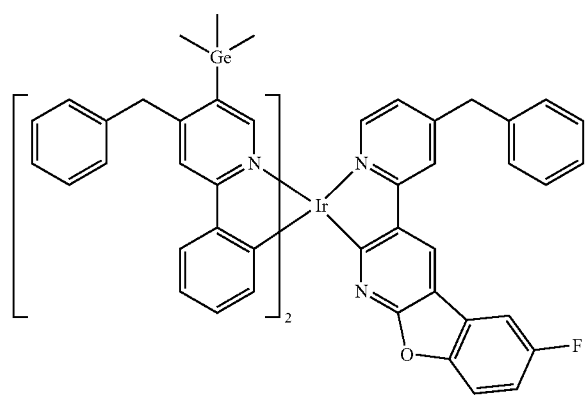

-continued
1780
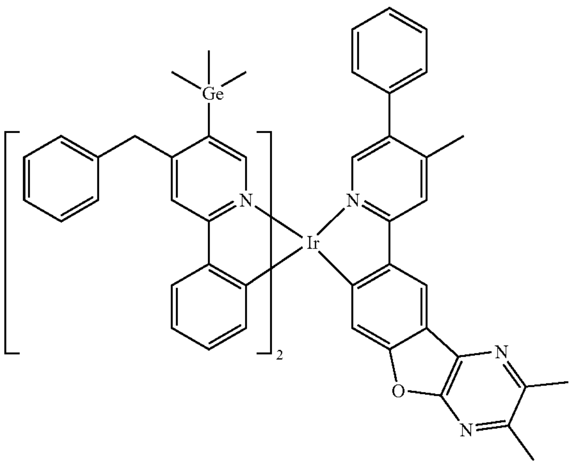
1781
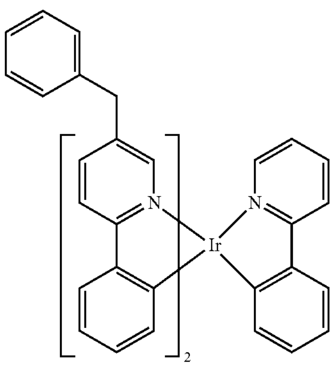
1782
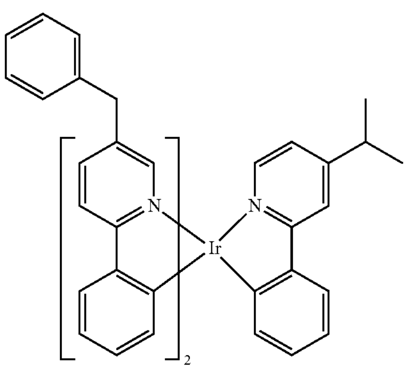
1783
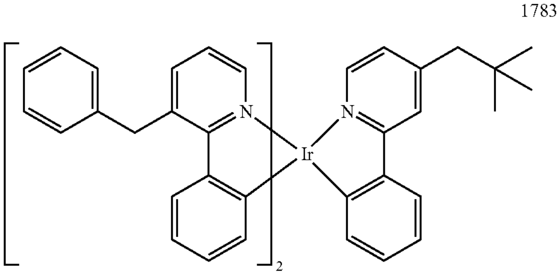
-continued
1784
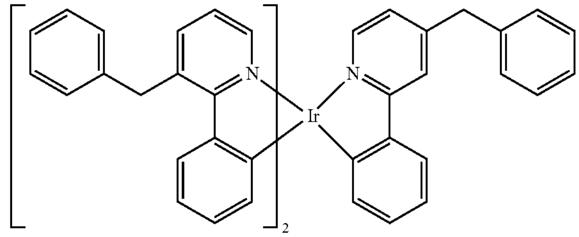
1785
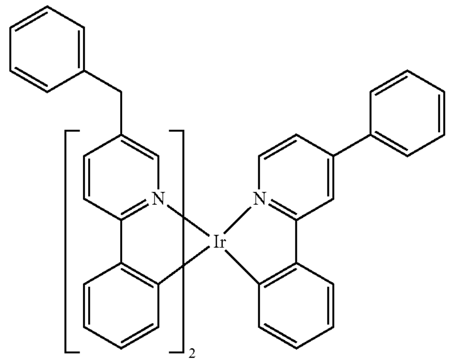
1786
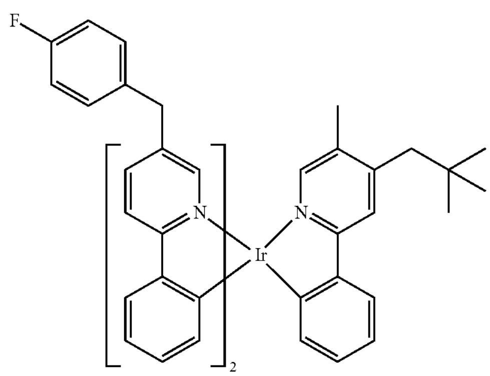
1787
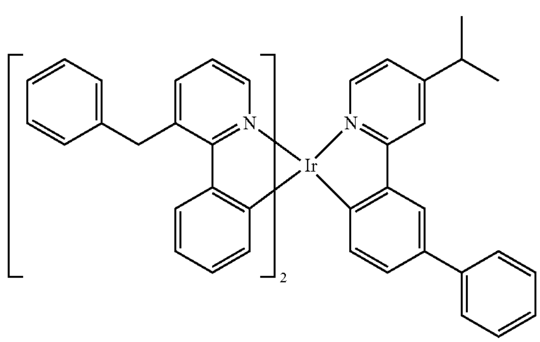

-continued
1788
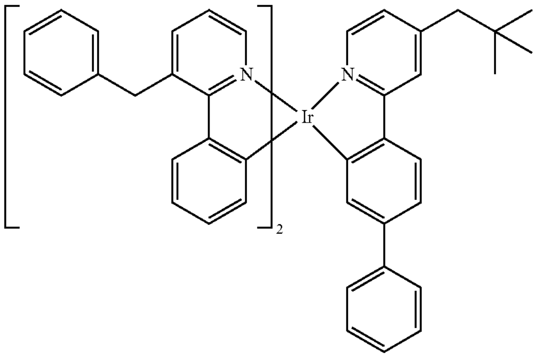
1789
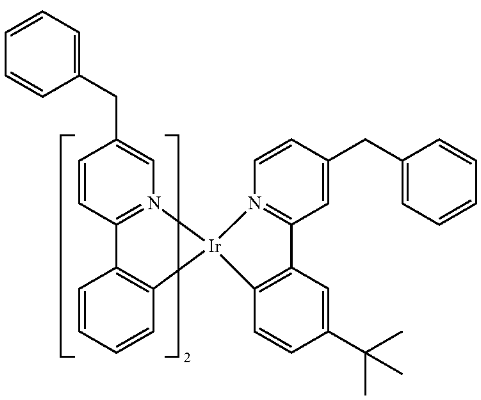
1790
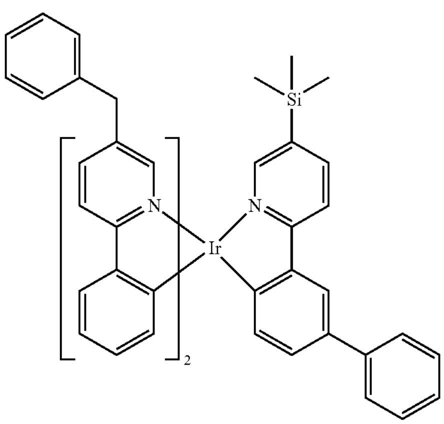
1791
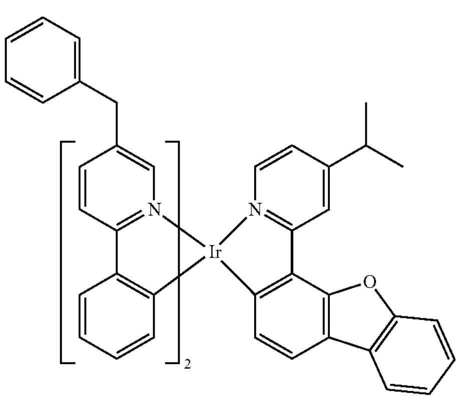
-continued
1792
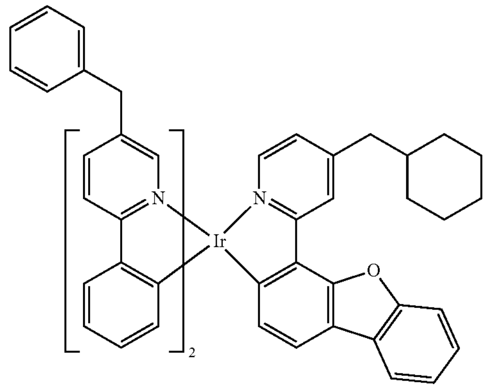
1793
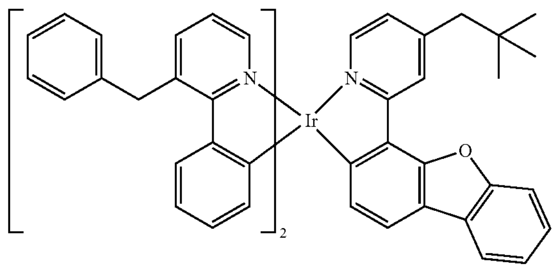
1794
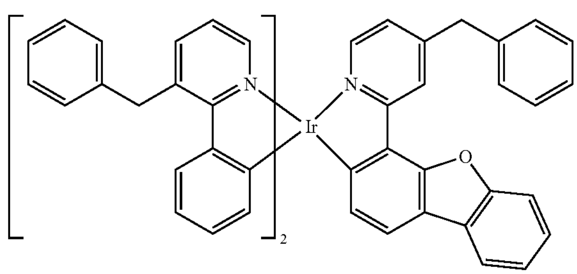
1795
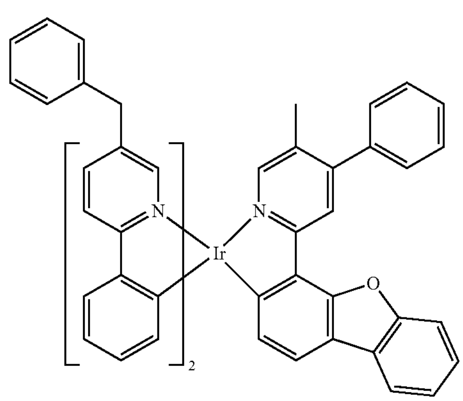

-continued
1796
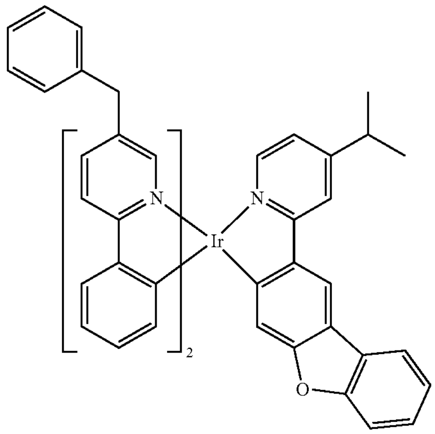
1797
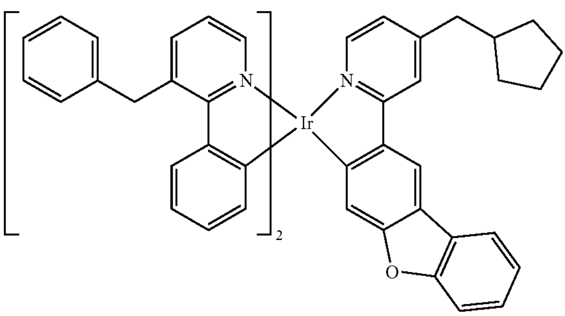
1798
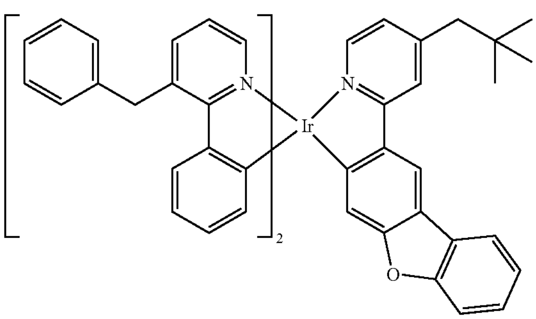
1799
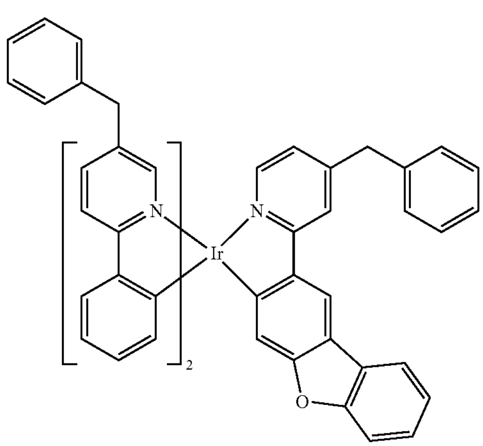
-continued
1800
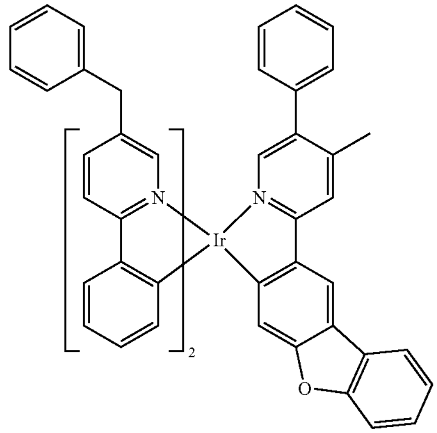
1801
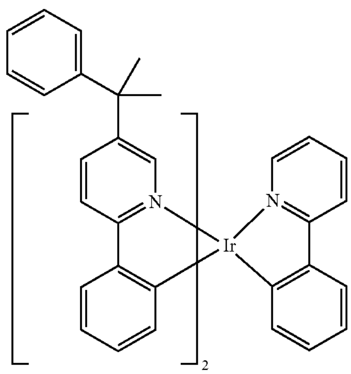
1802
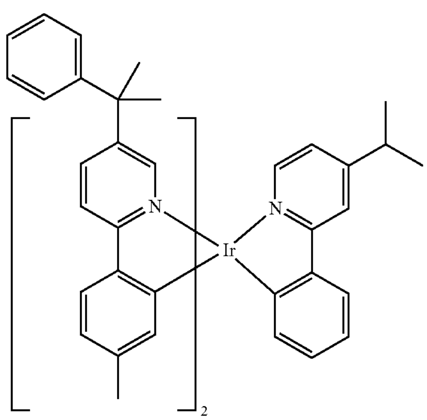
1803
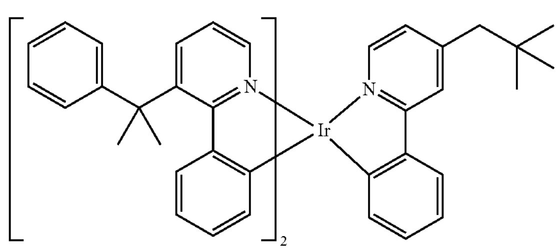

-continued
1804
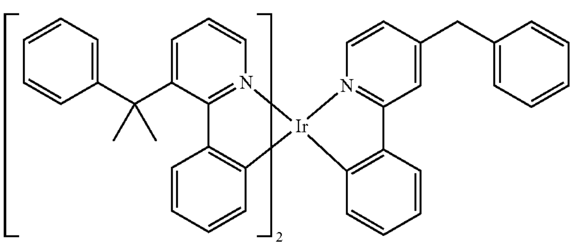
1805
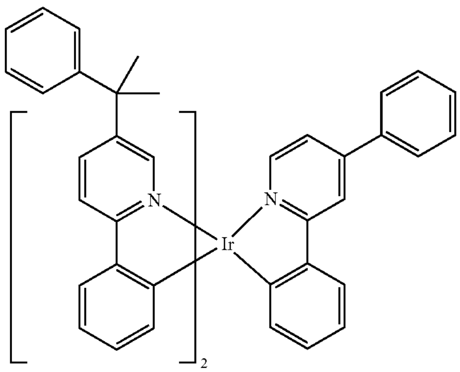
1806
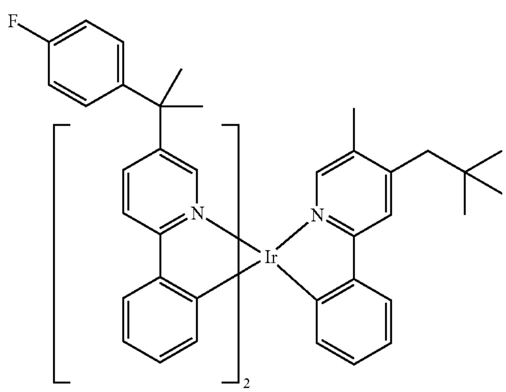
1807
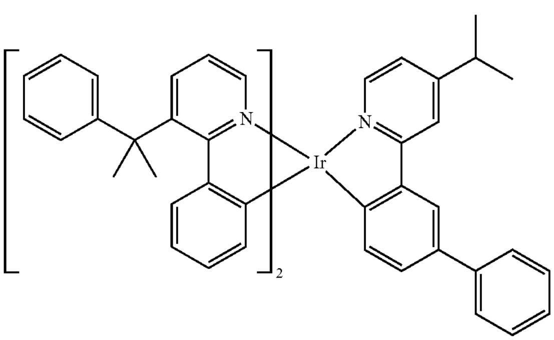
-continued
1808
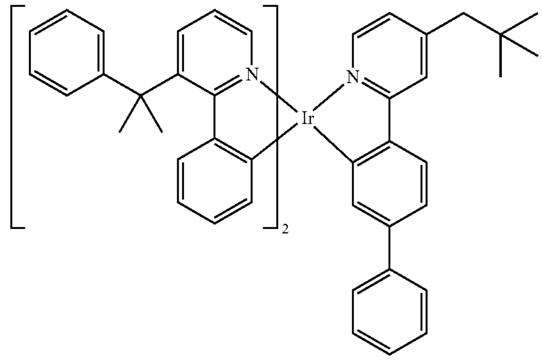
1809
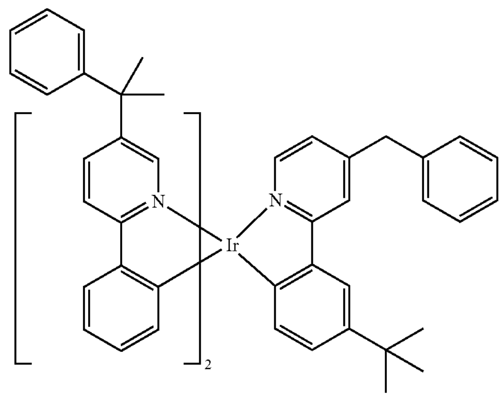
1810
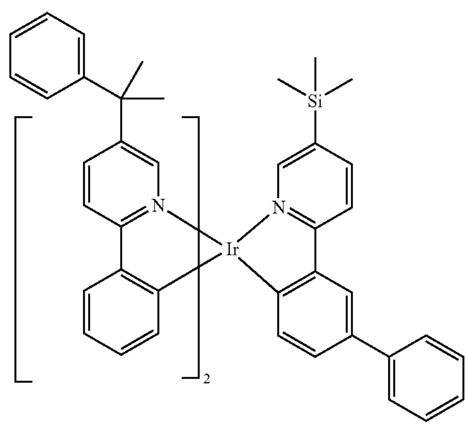
1811
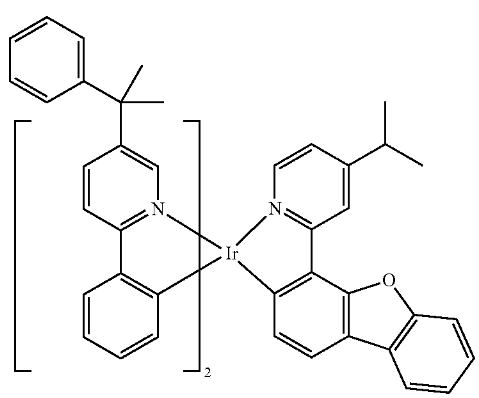

1812
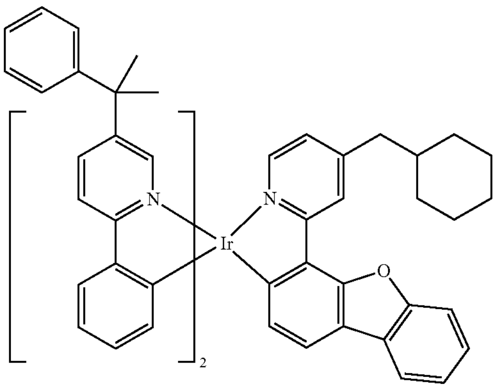
1813
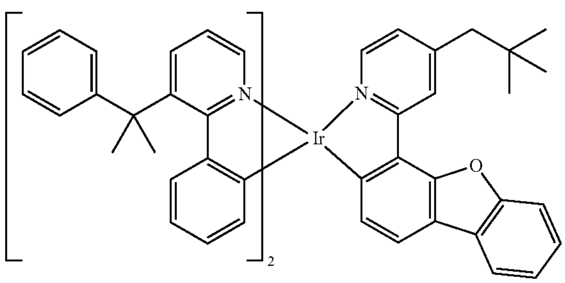
1814
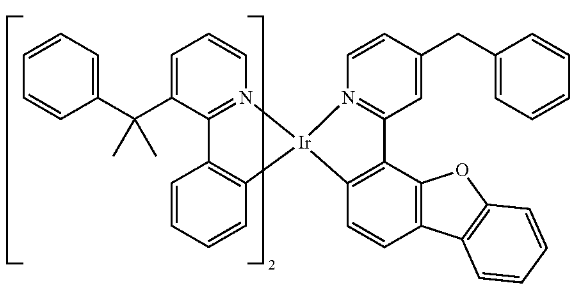
1815
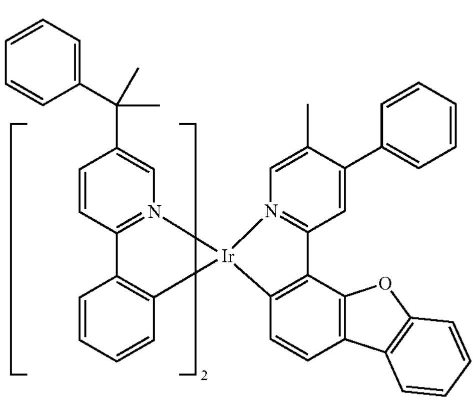
1816
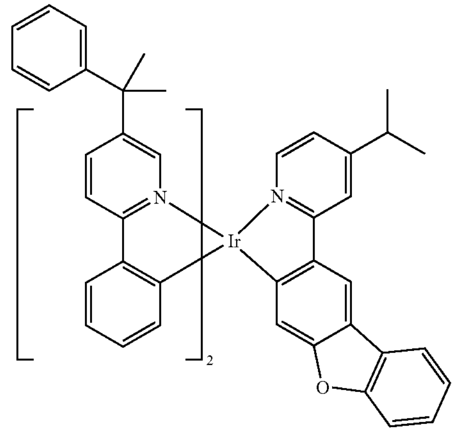
1817
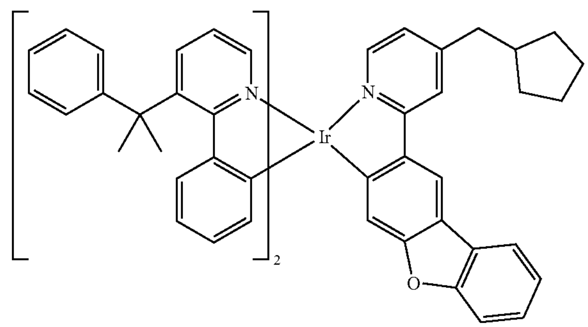
1818
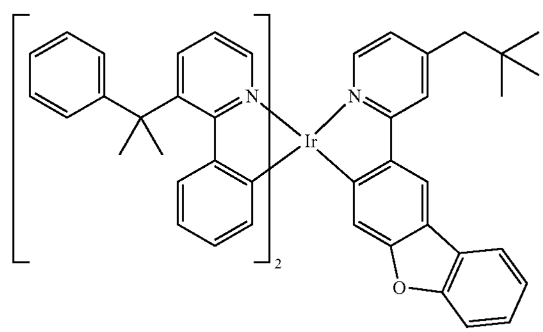
1819
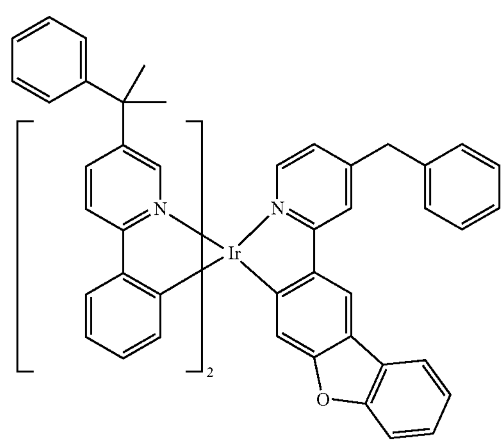

-continued
1820
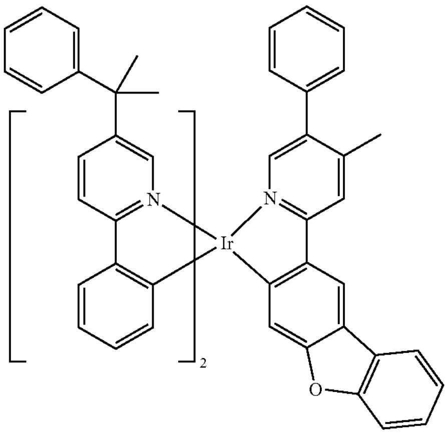
1821
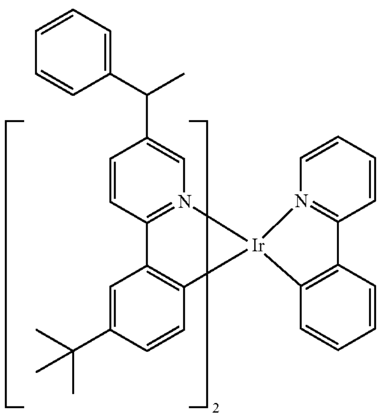
1822
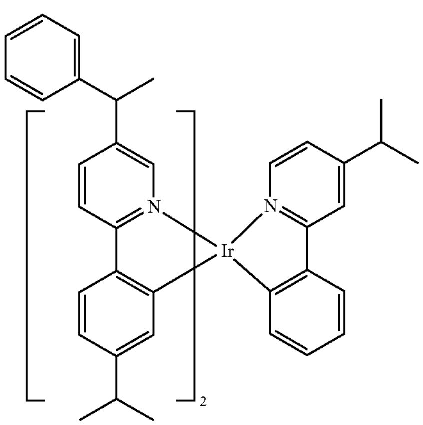
1823
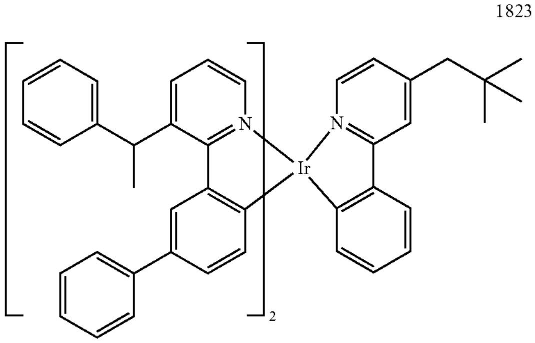
-continued
1824
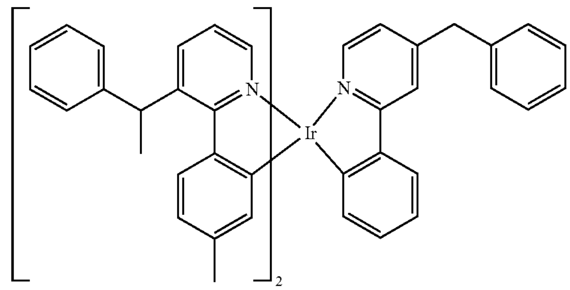
1825
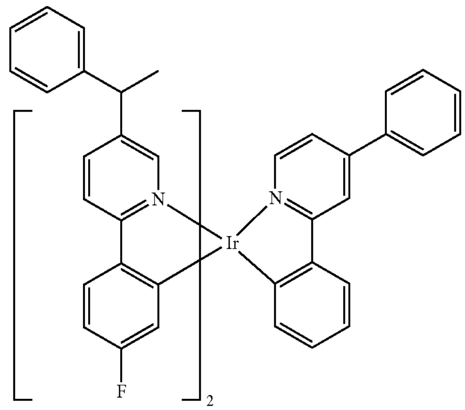
1826
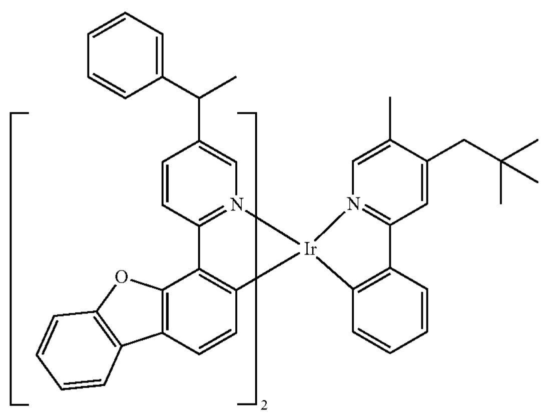
1827
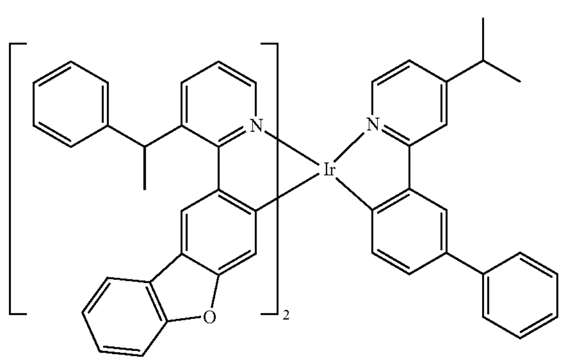

-continued
1828
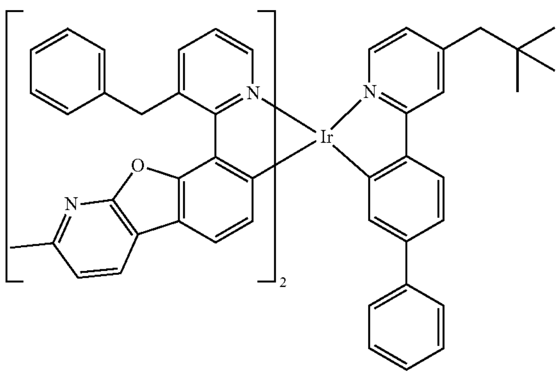
1829
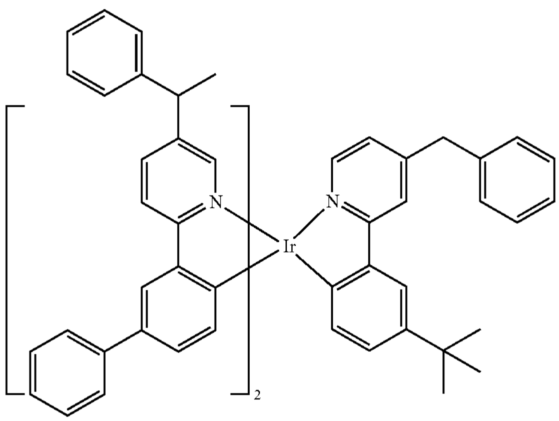
1830
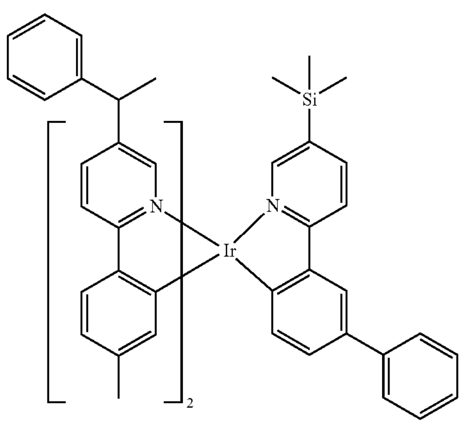
1831
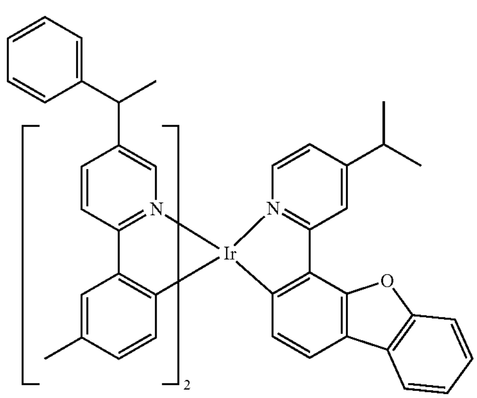
-continued
1832
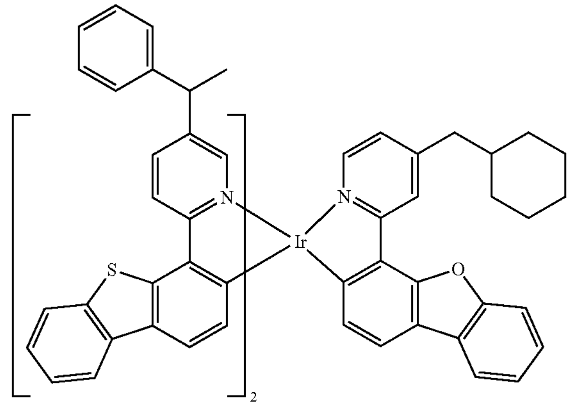
1833
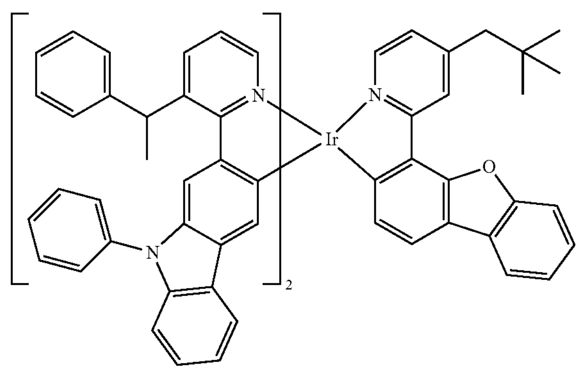
1834
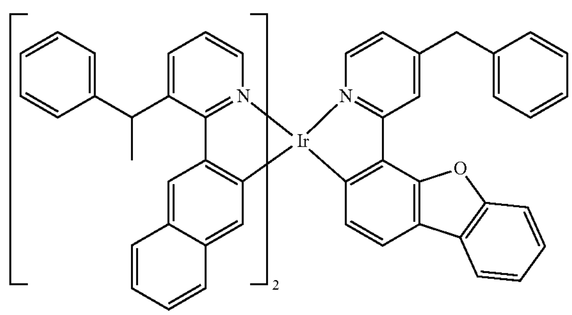
1835
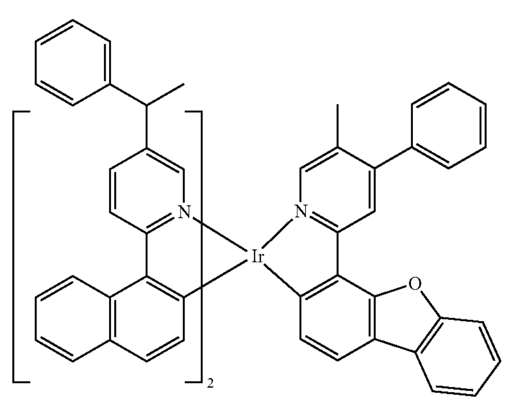

-continued
1836
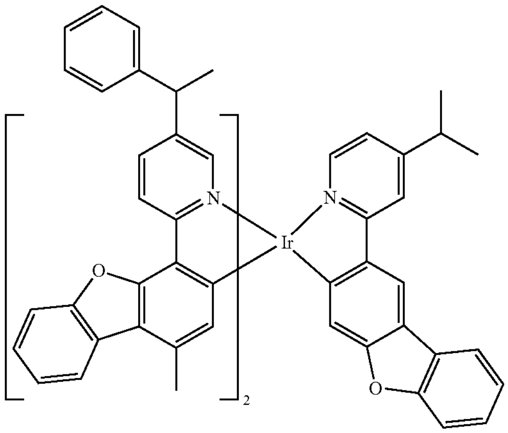
1837
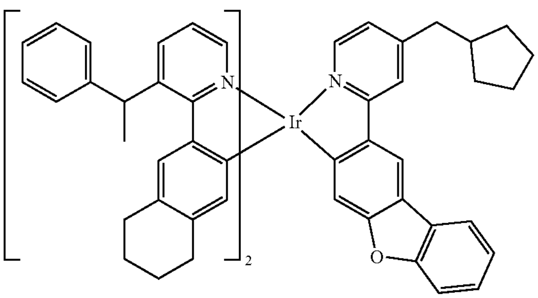
1838
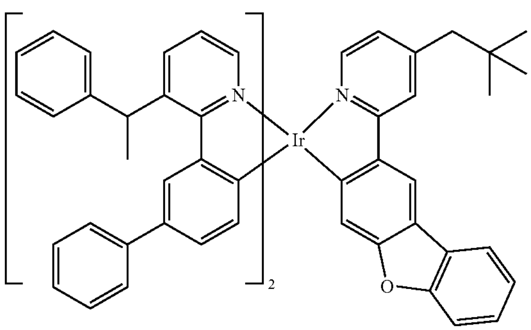
1839
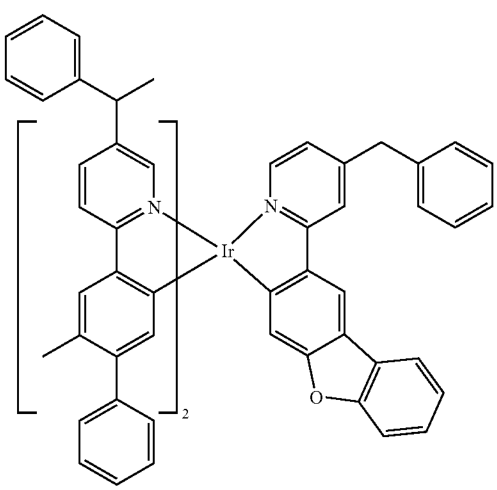
-continued
1840
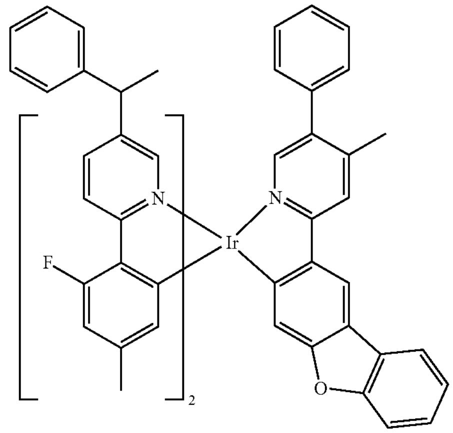
1841
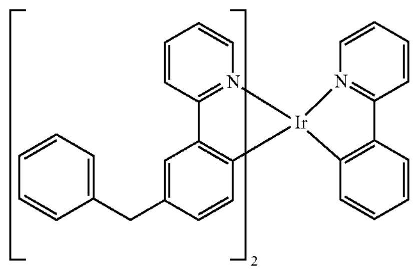
1842
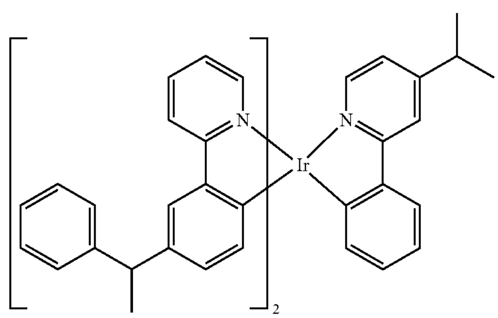
1843
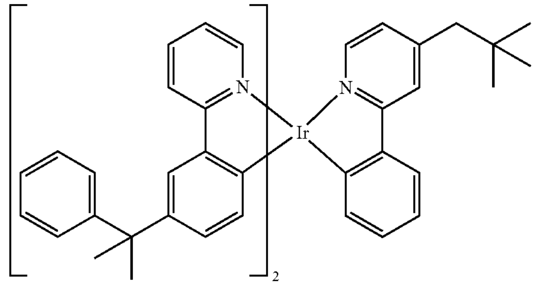

1844
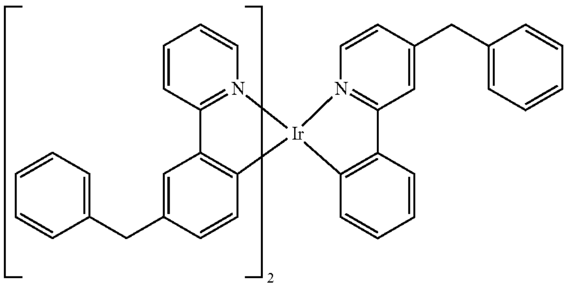
1845
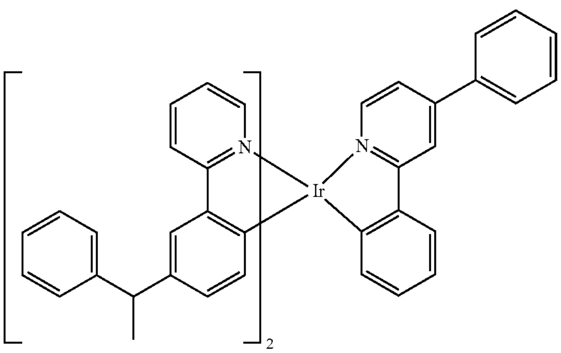
1846
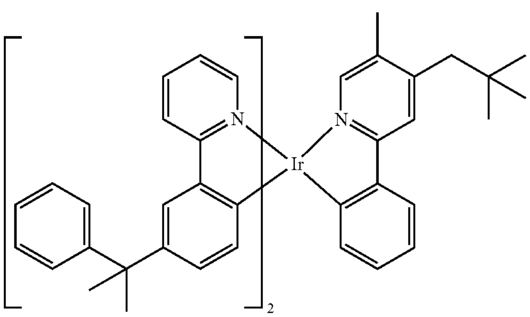
1847
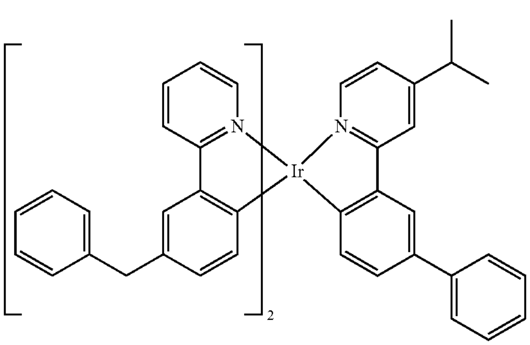
1848
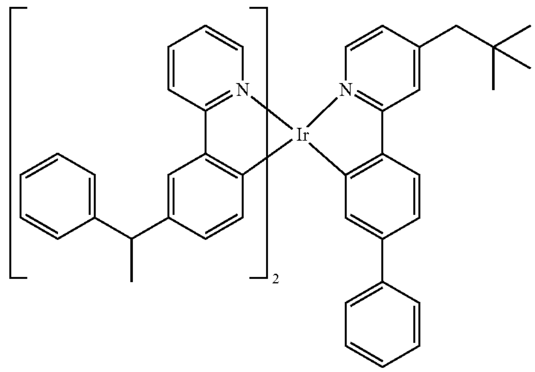
1849
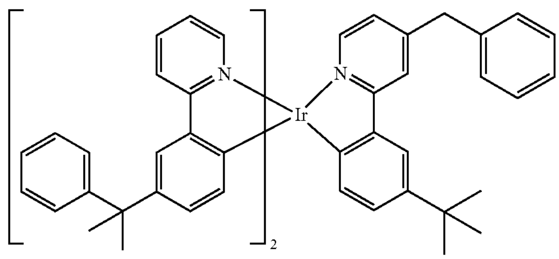
1850
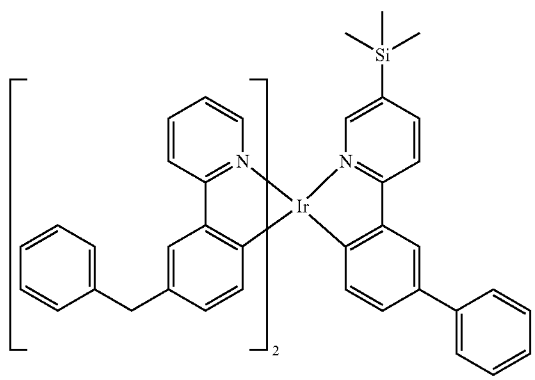
1851
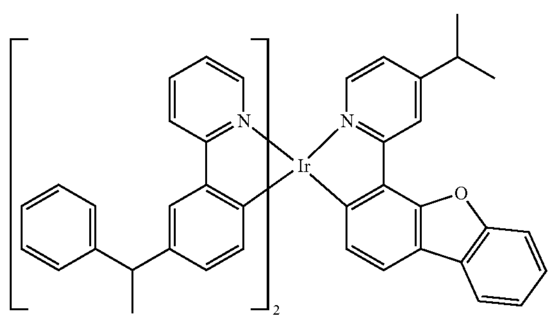

1852
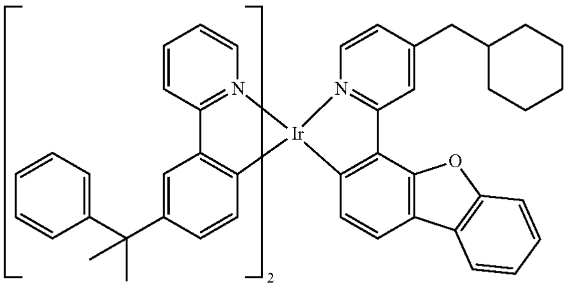
1853
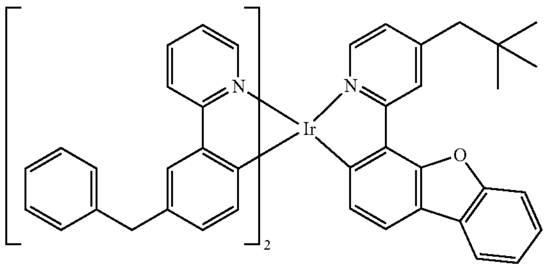
1854
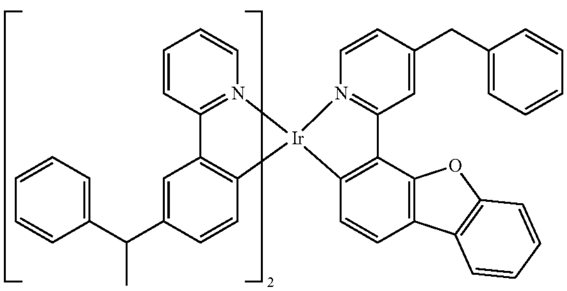
1855
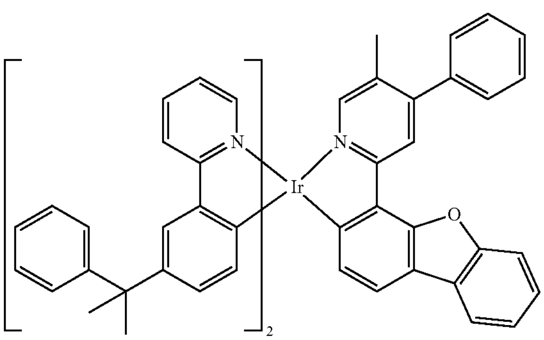
1856
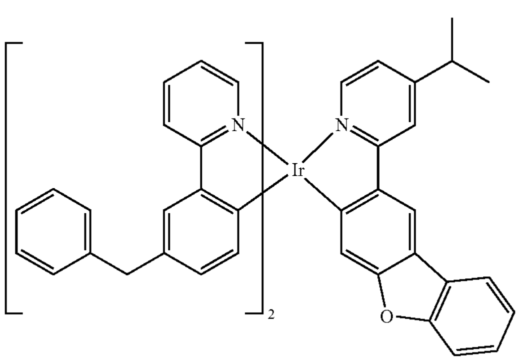
1857
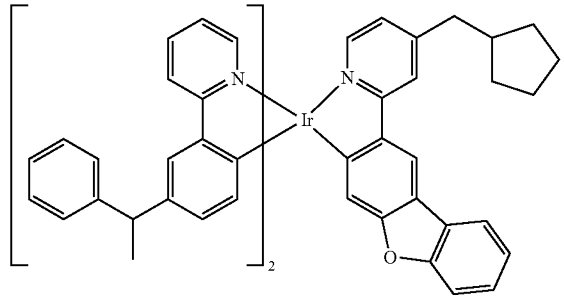
1858
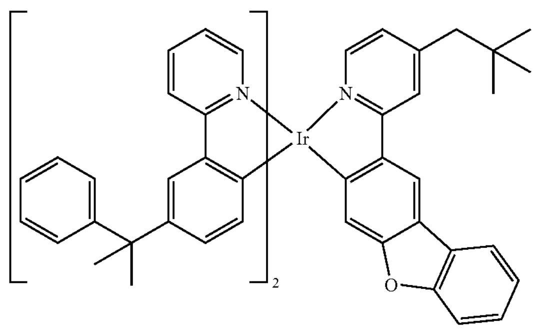
1859
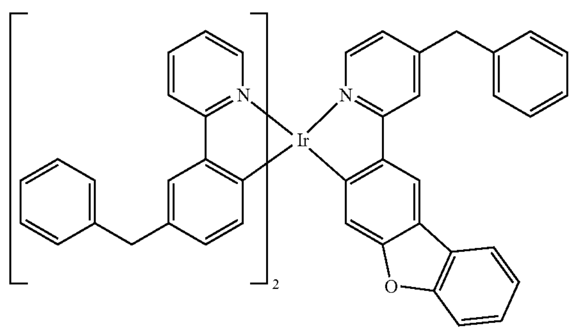
1860
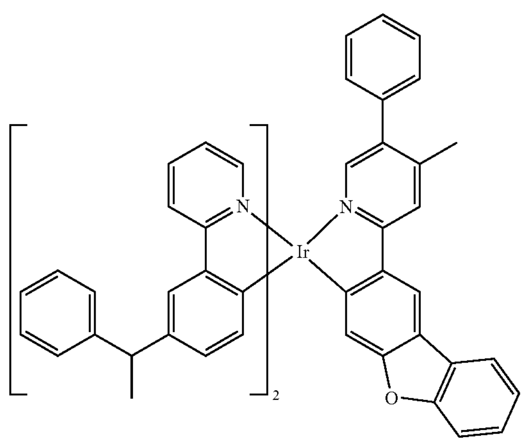

-continued
1861
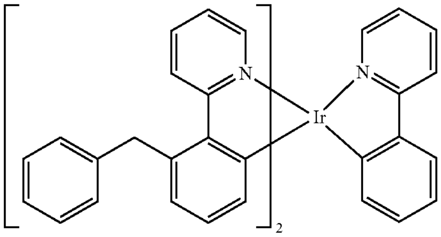
1862
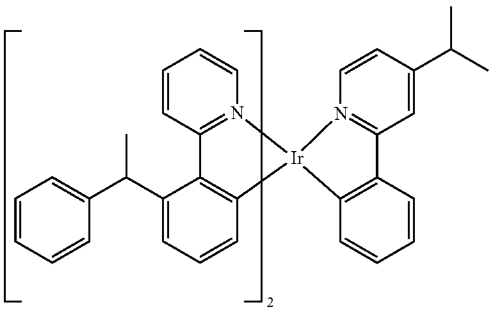
1863
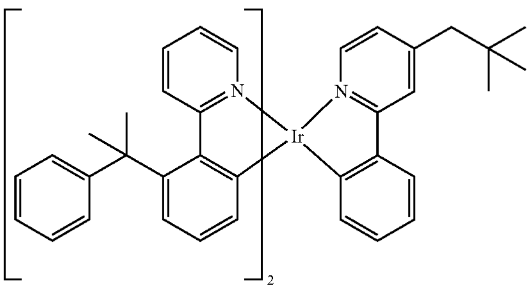
1864
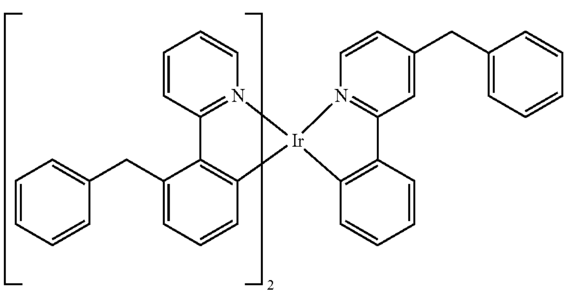
1865
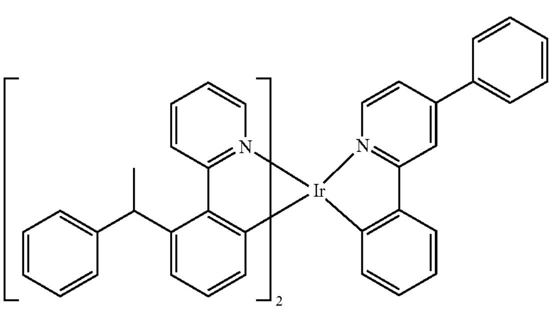
-continued
1866
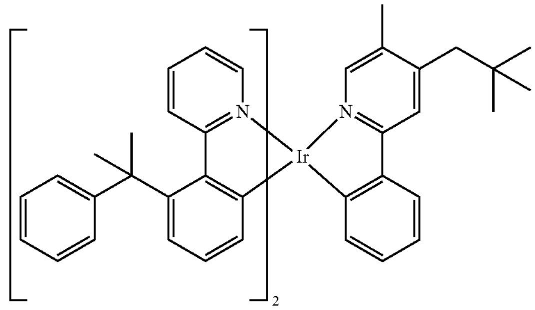
1867
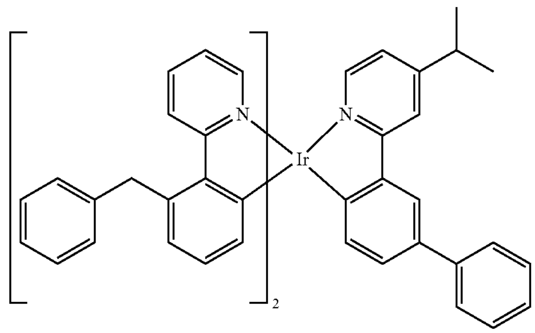
1868
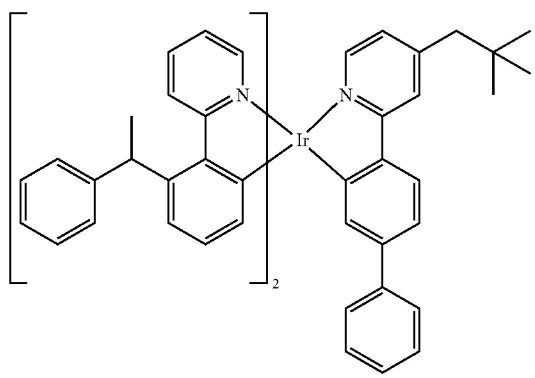
1869
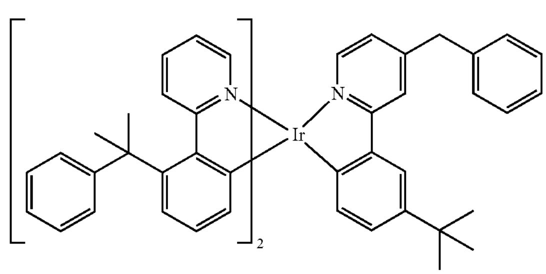

1870
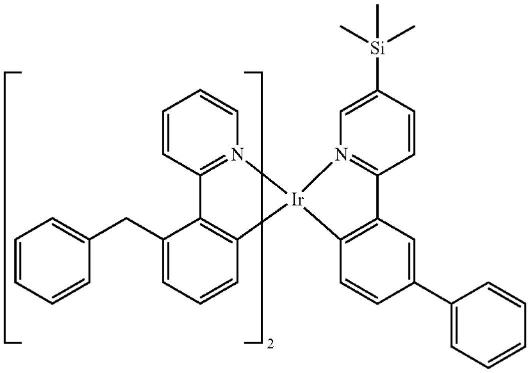
1871
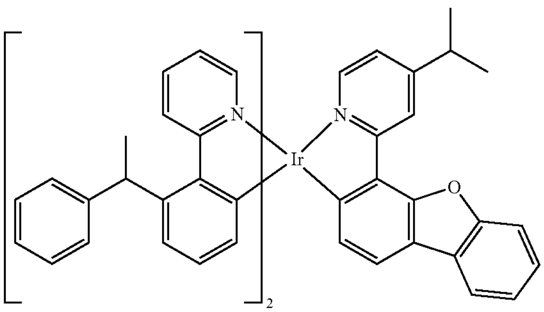
1872
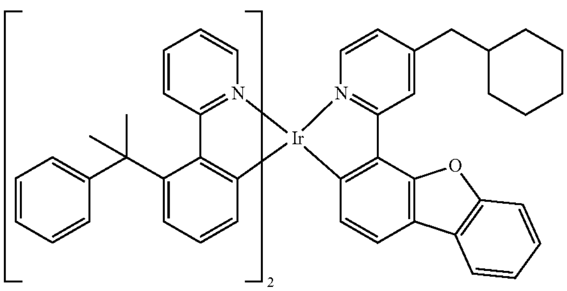
1873
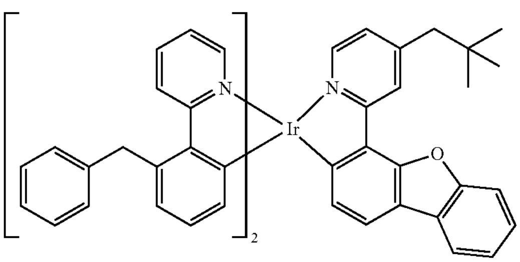
1874
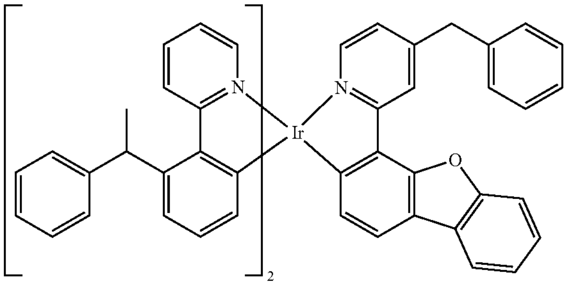
1875
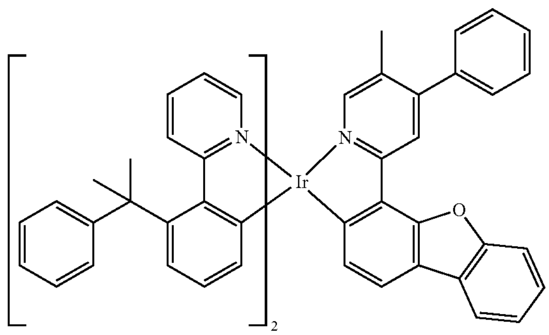
1876
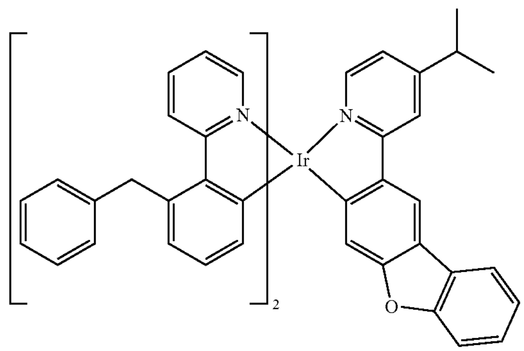
1877
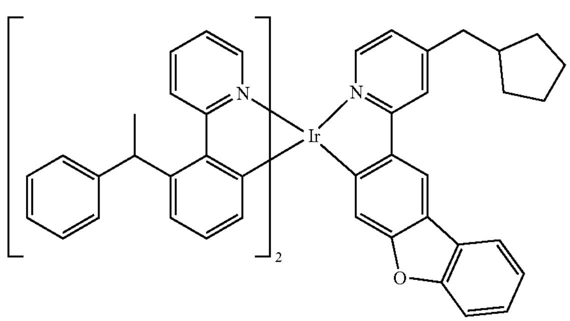
1878
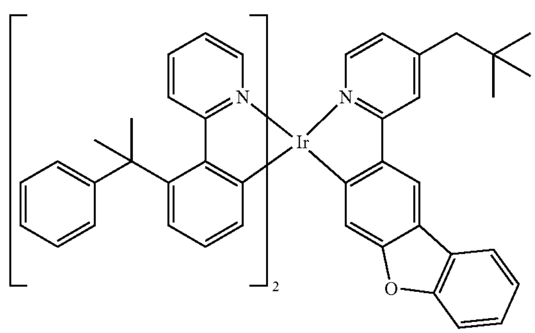

-continued
1879
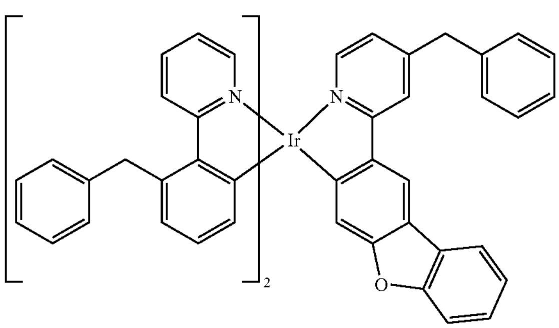
1880
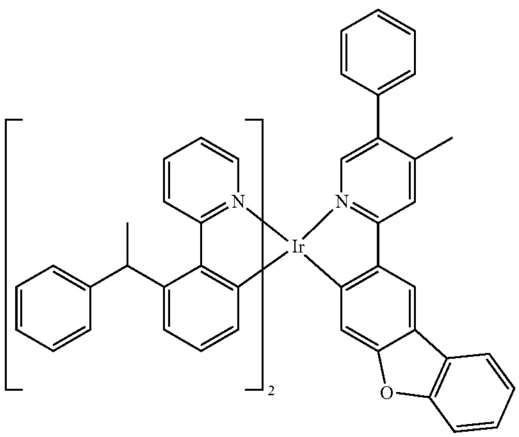
1881
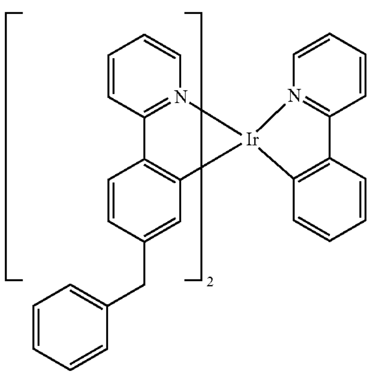
1882
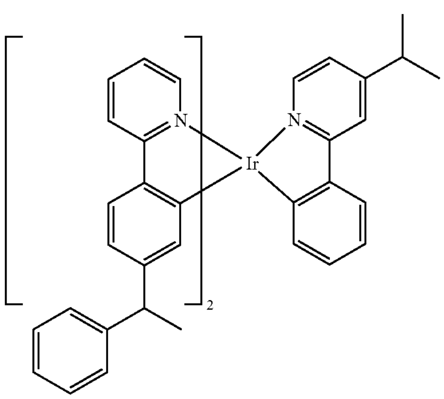
-continued
1883
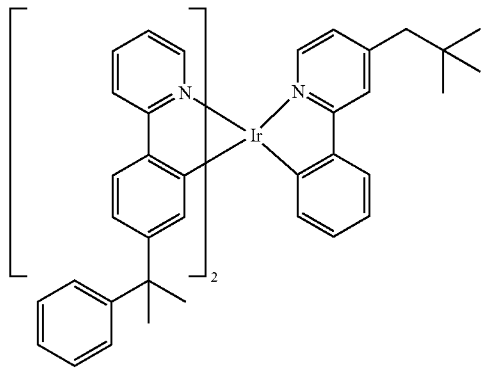
1884
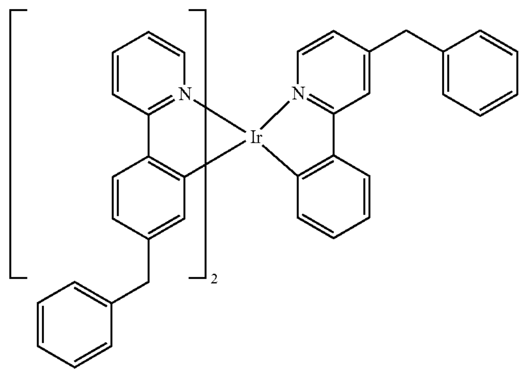
1885
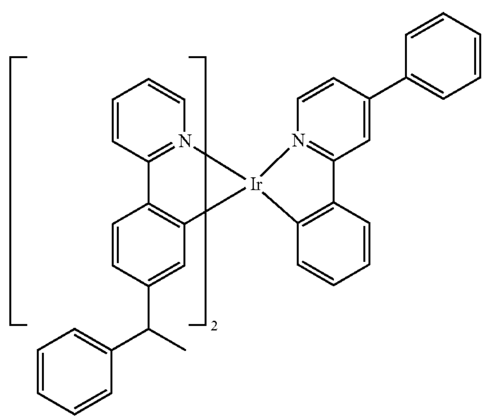
1886
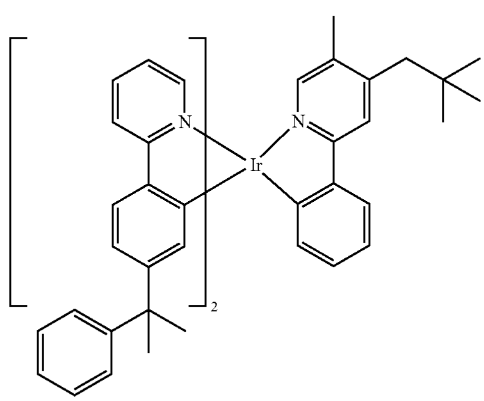

-continued
1887
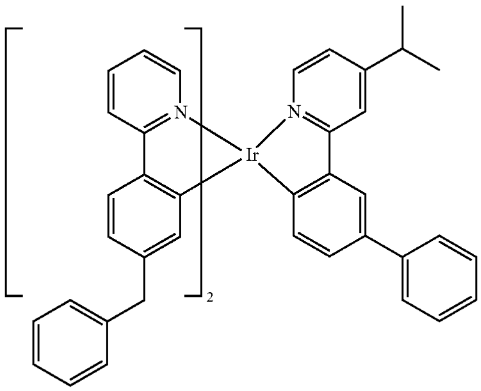
1888
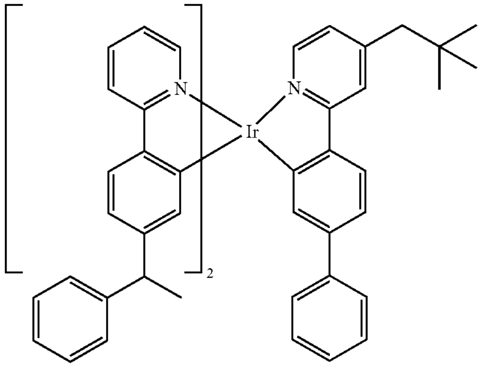
1889
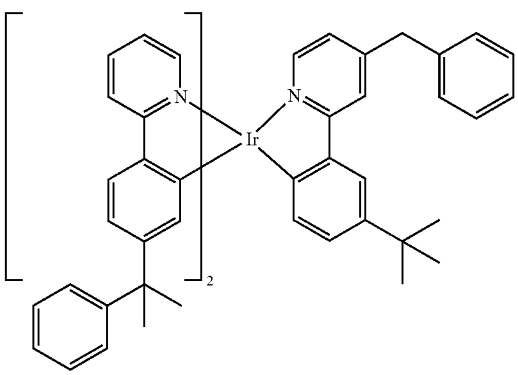
1890
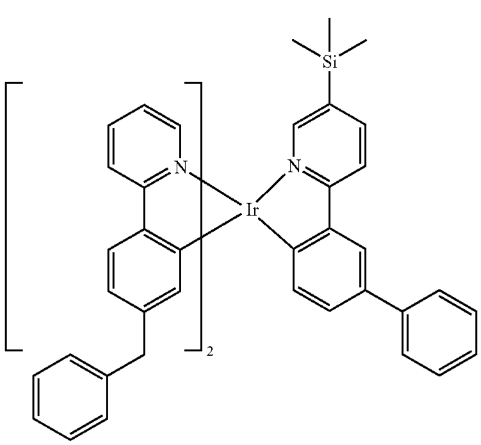
-continued
1891
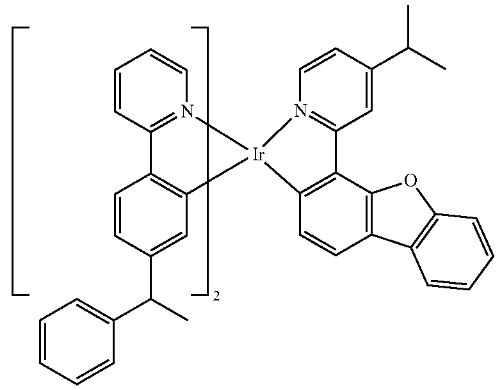
1892
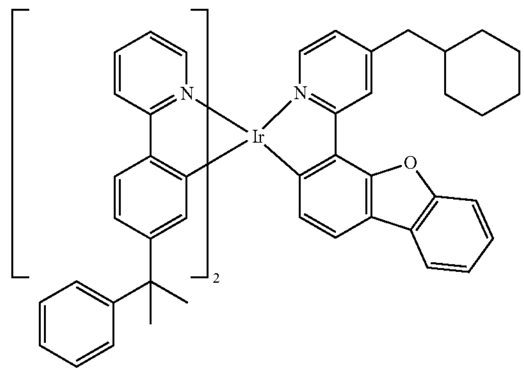
1893
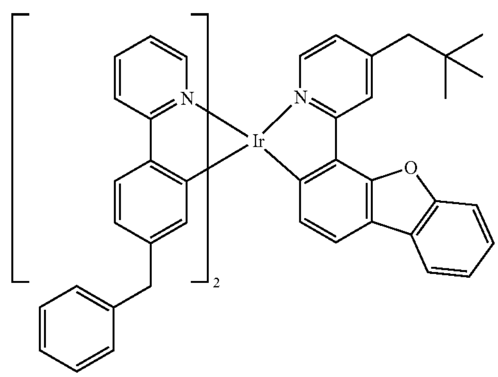
1894
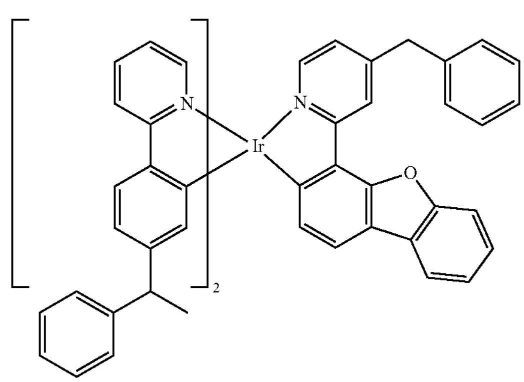

-continued
1895
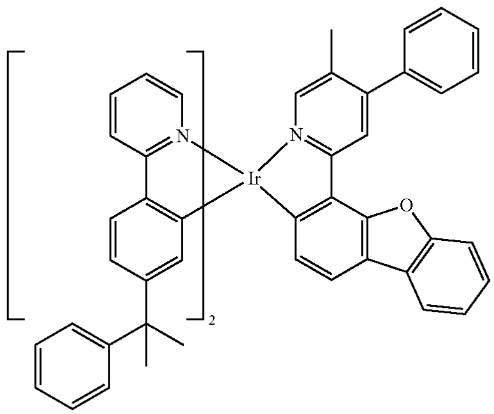
1896
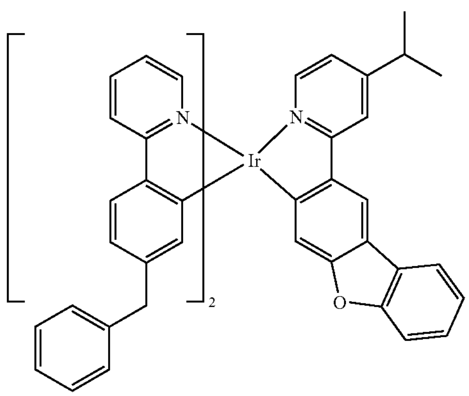
1897
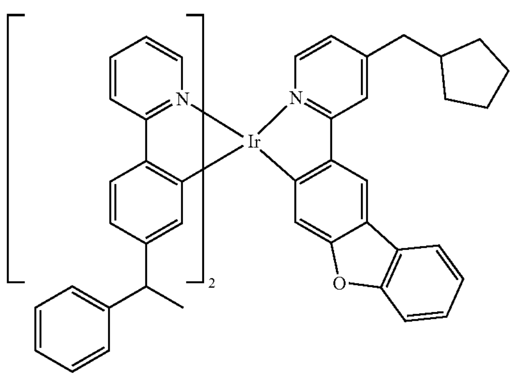
1898
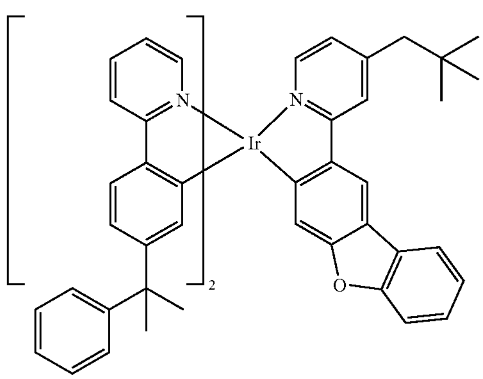
-continued
1899
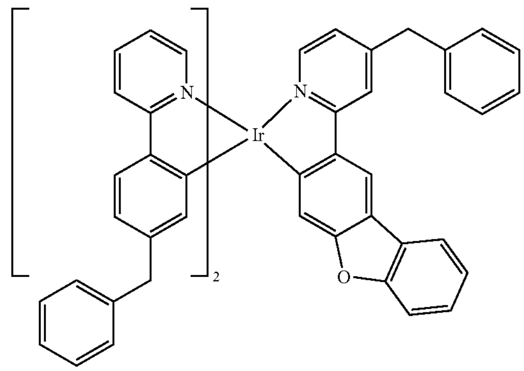
1900
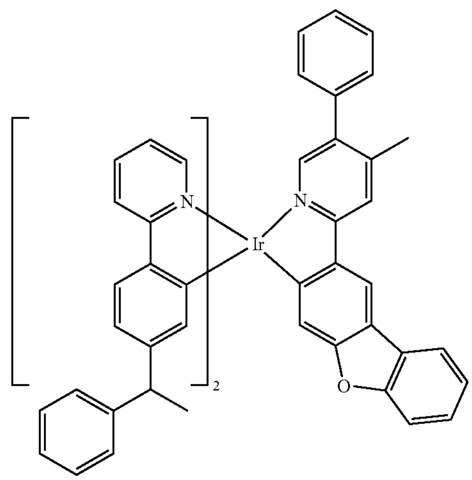
1901
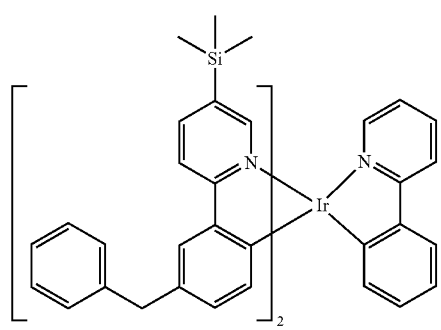
1902
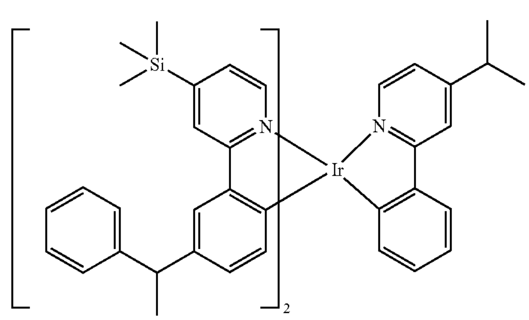

-continued
1903
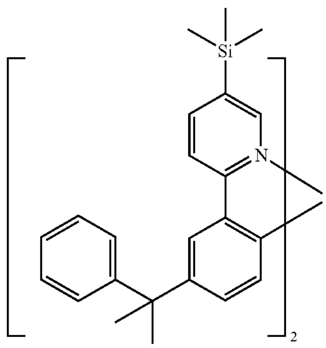
1904
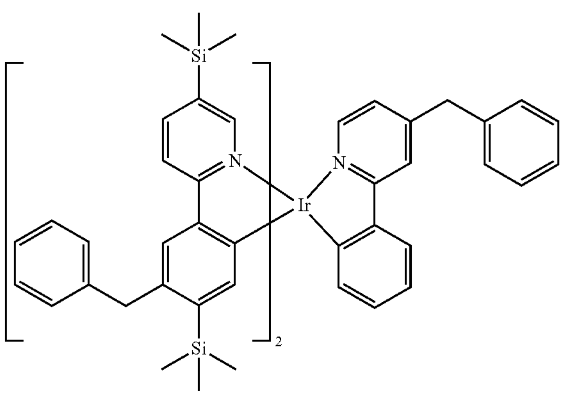
1905
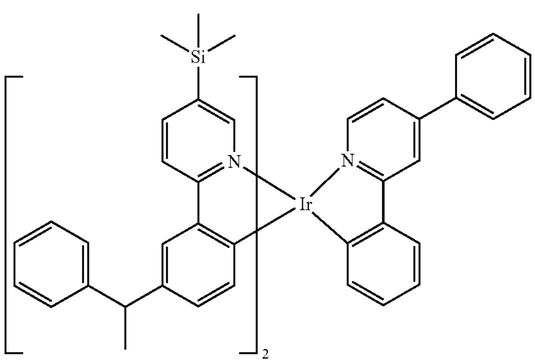
1906
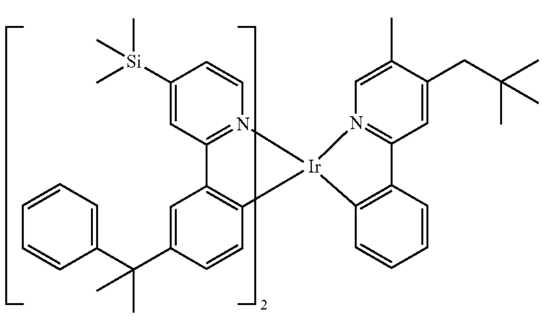
-continued
1907
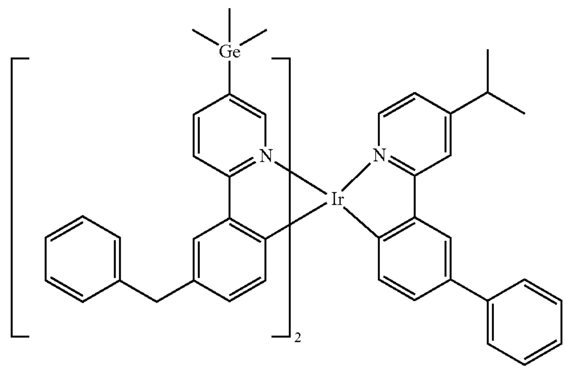
1908
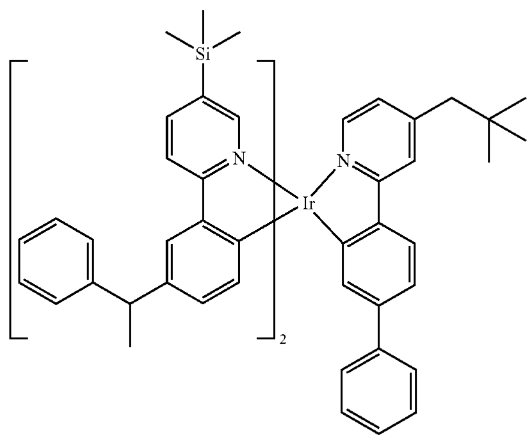
1909
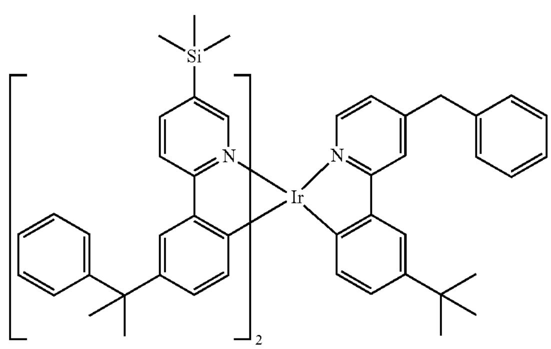
1910
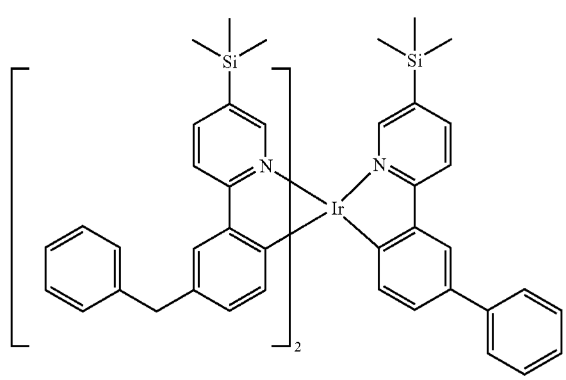

1911
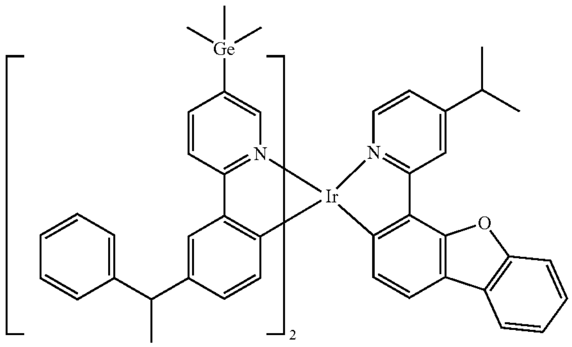
1912
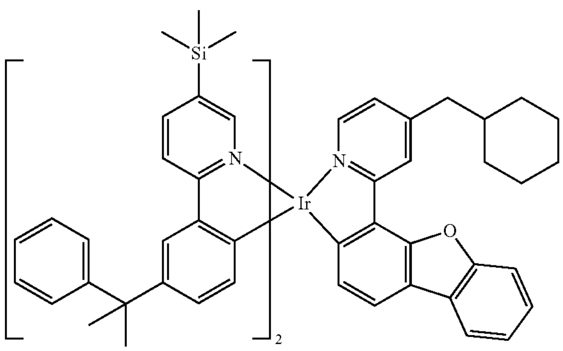
1913
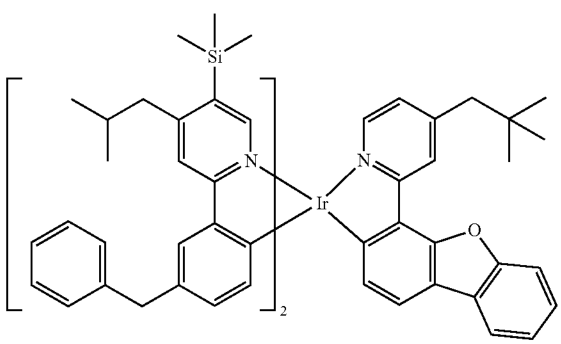
1914
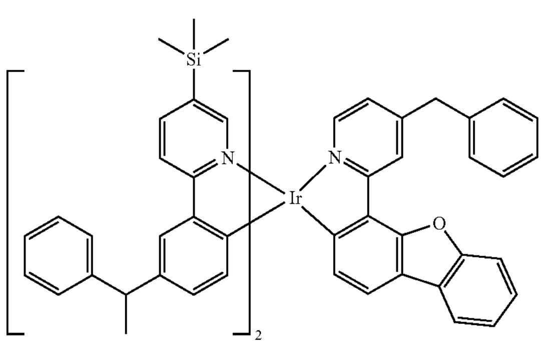
1915
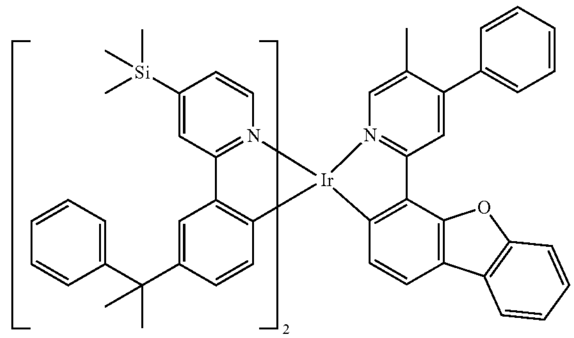
1916
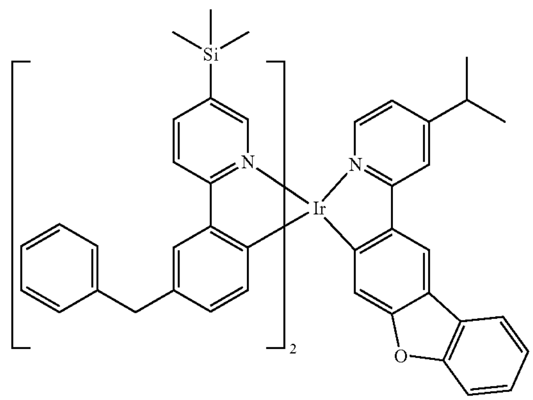
1917
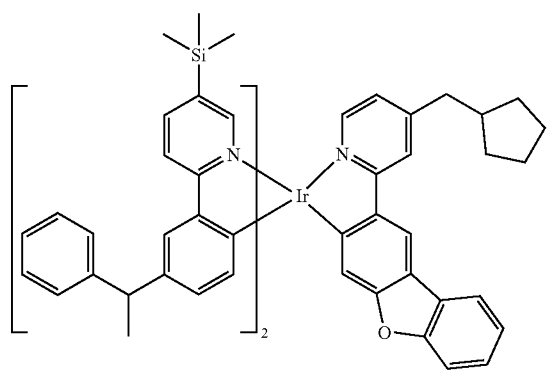
1918
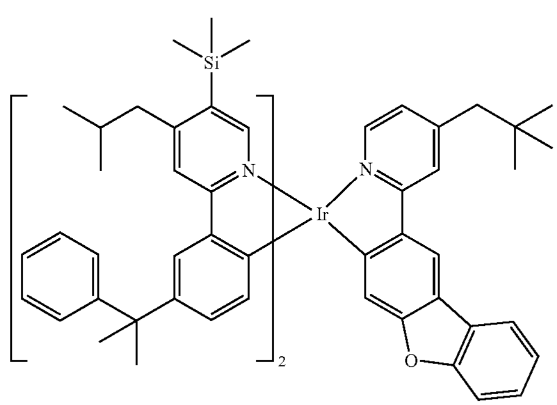

-continued
1919
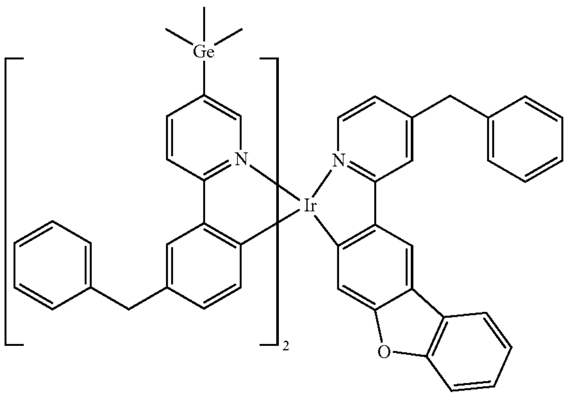
1920
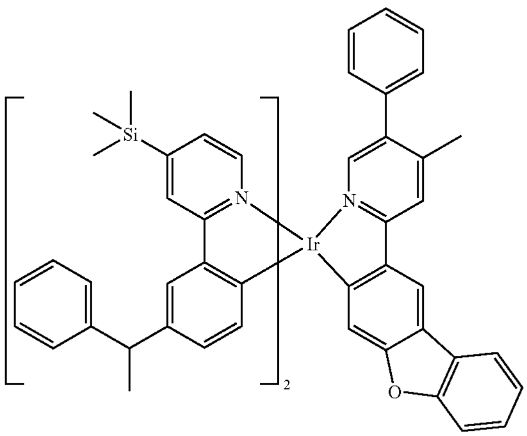
1921
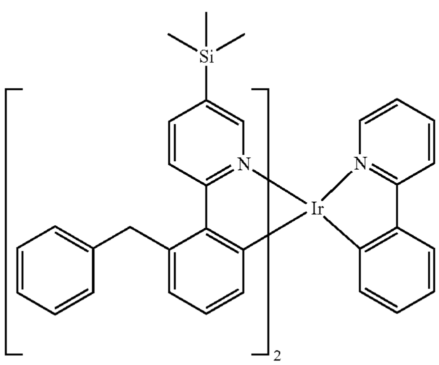
1922
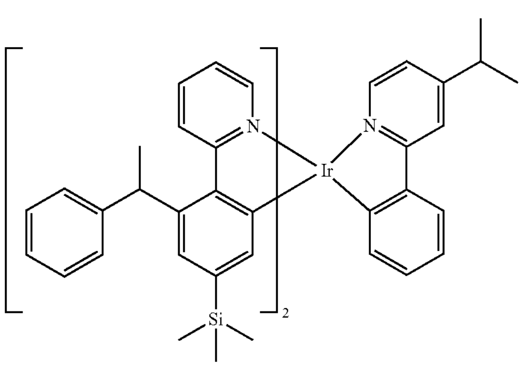
-continued
1923
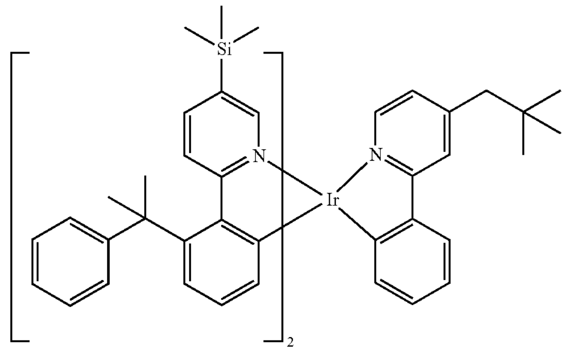
1924
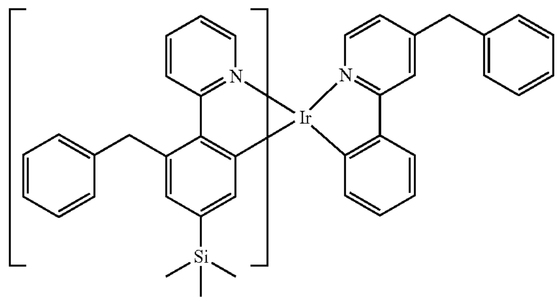
1925
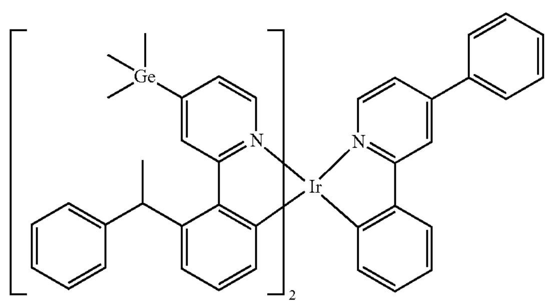
1926
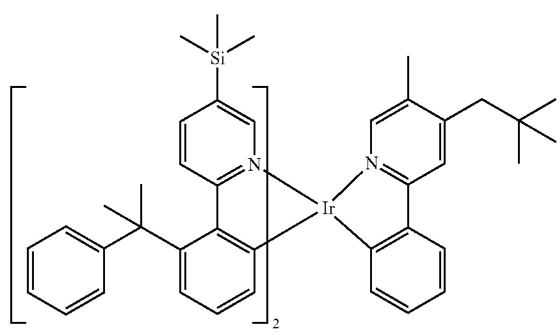

-continued
1927
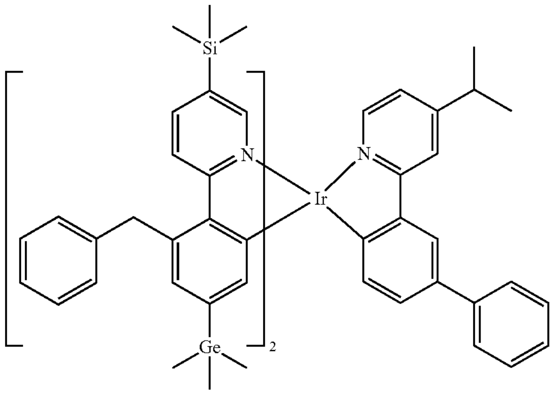
1928
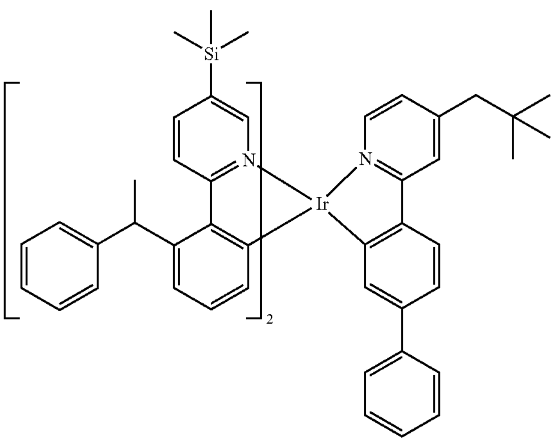
1929
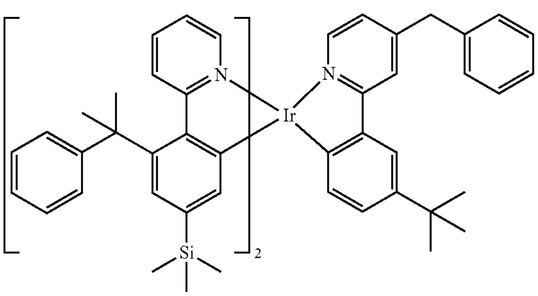
1930
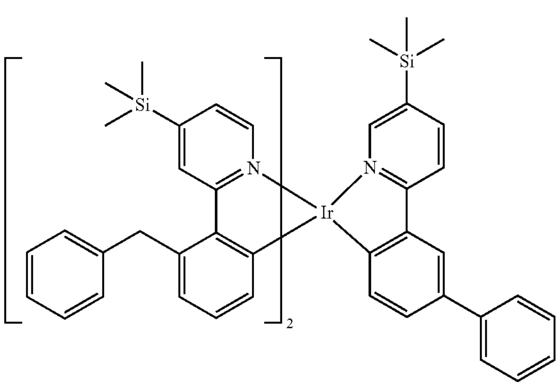
-continued
1931
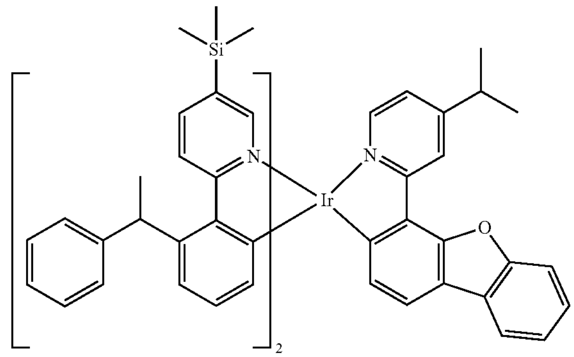
1932
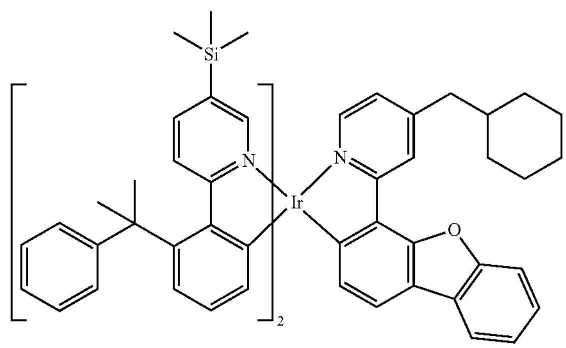
1933
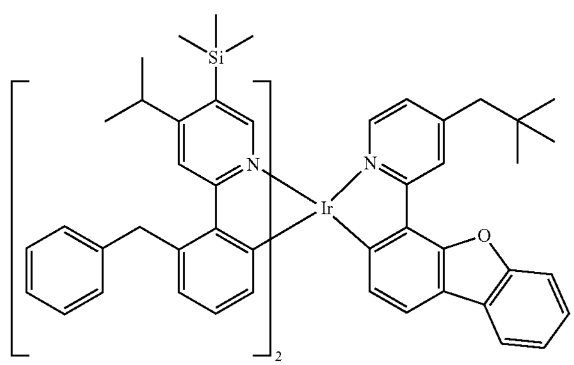
1934
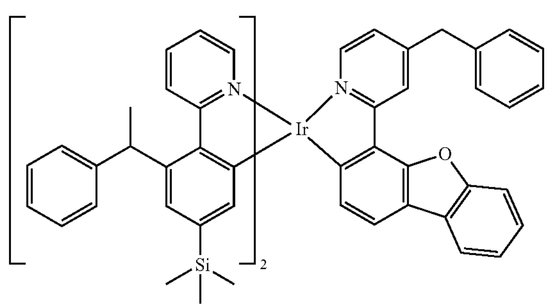

-continued
1935
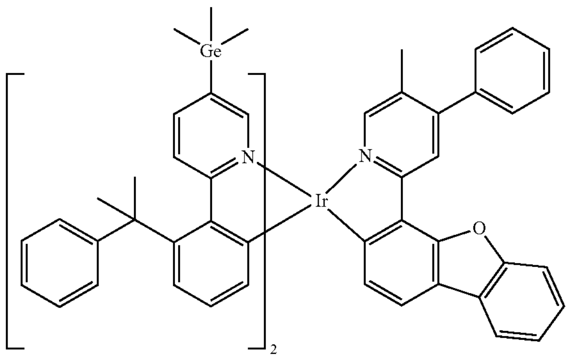
1936
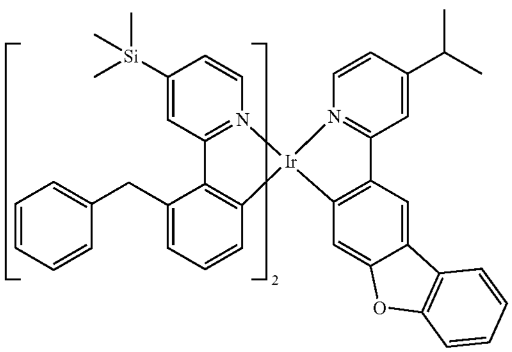
1937
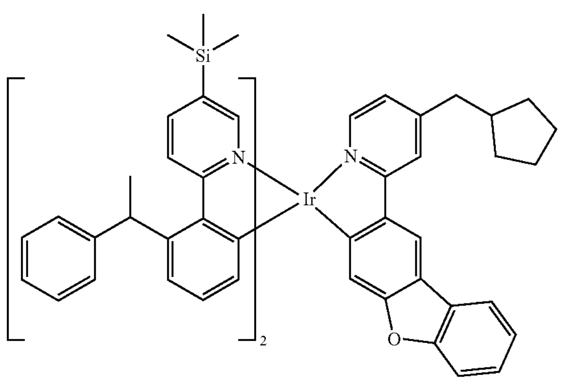
1938
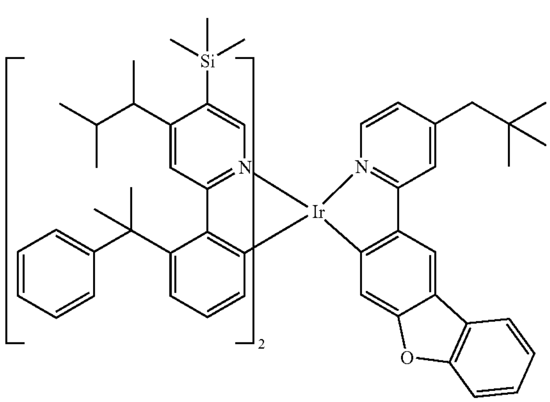
-continued
1939
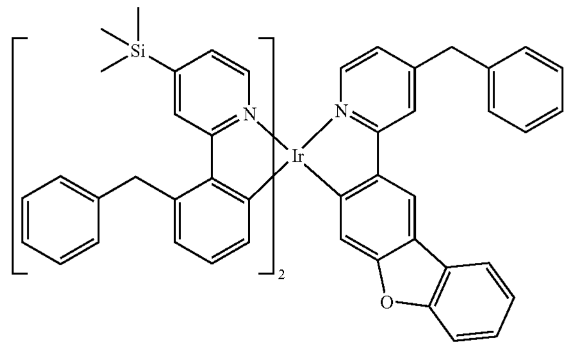
1940
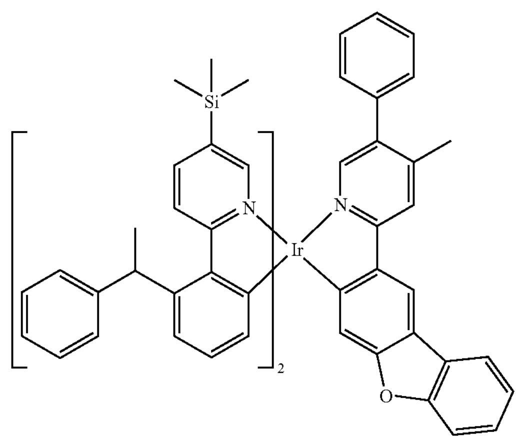
1941
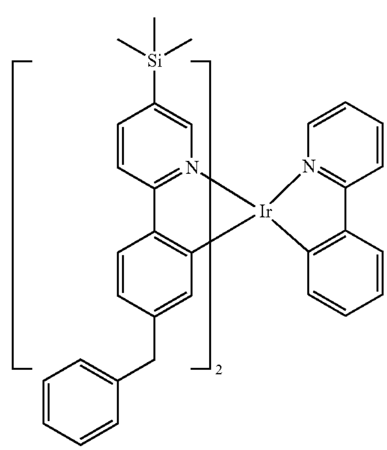

-continued
1942
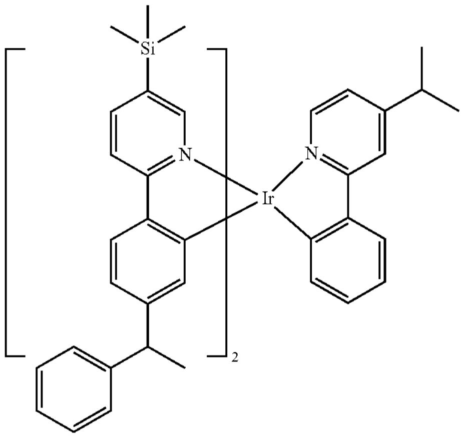
1943
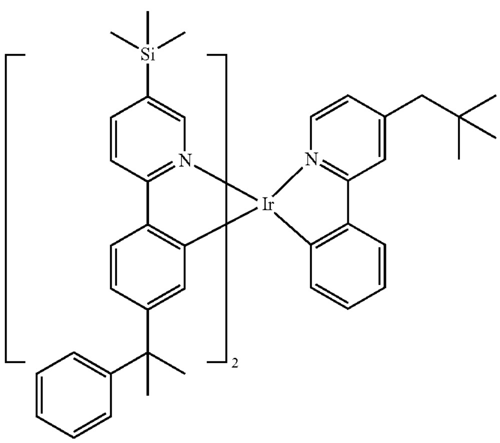
1944
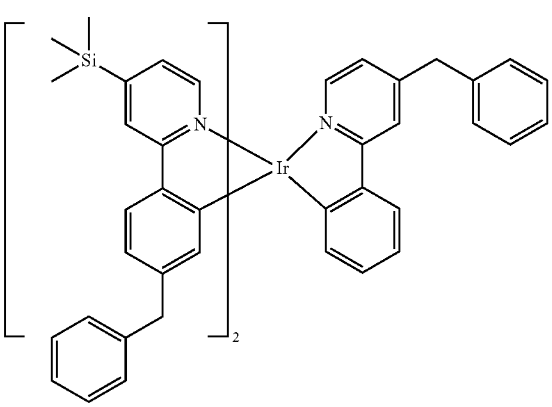
-continued
1945
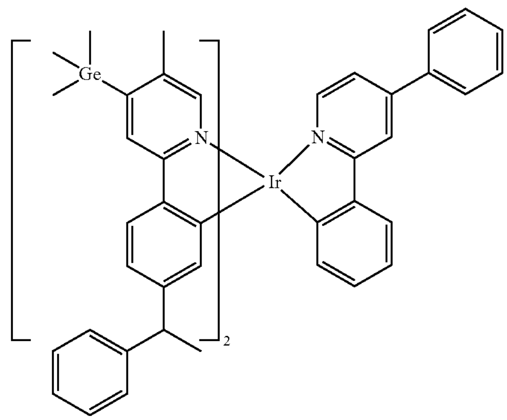
1946
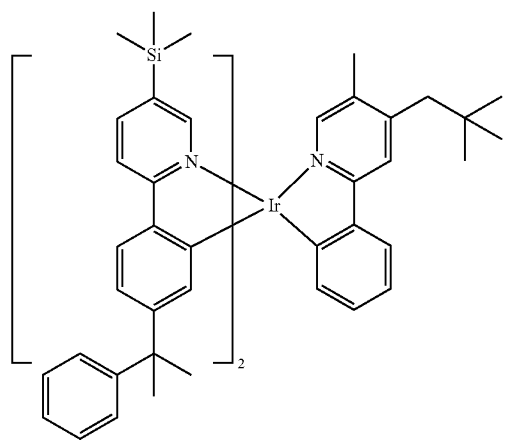
1947
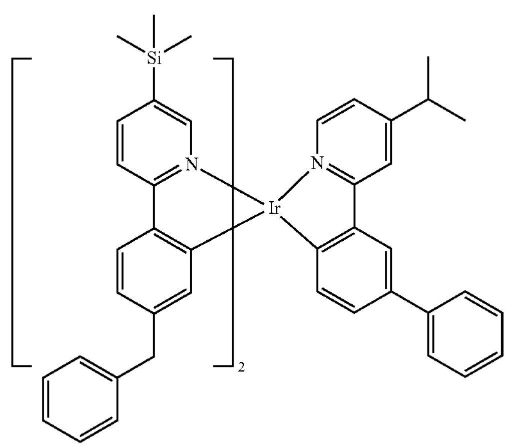

-continued
1948
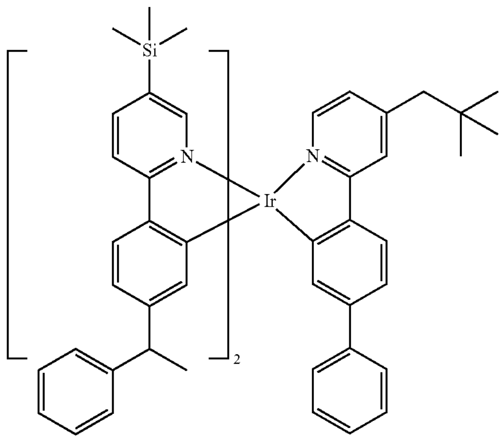
1949
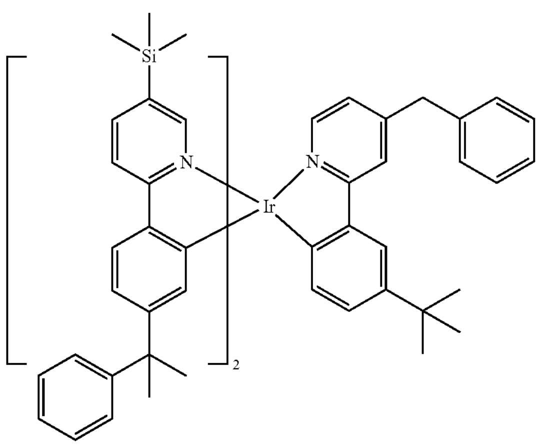
1950
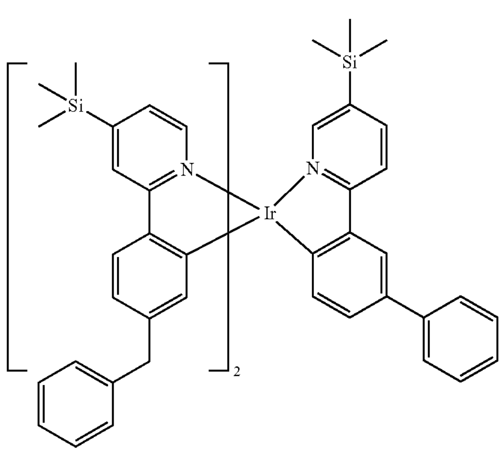
-continued
1951
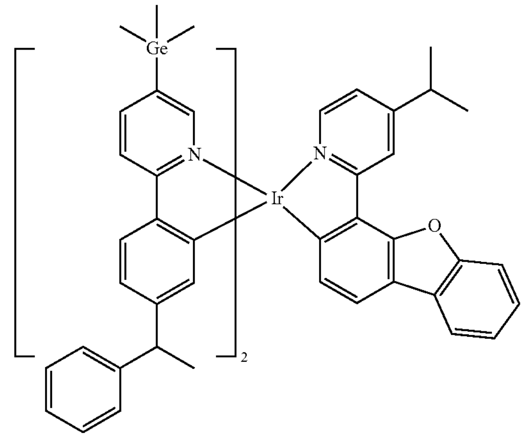
1952
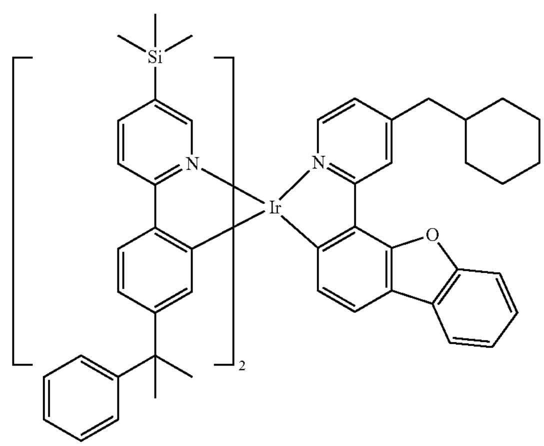
1953
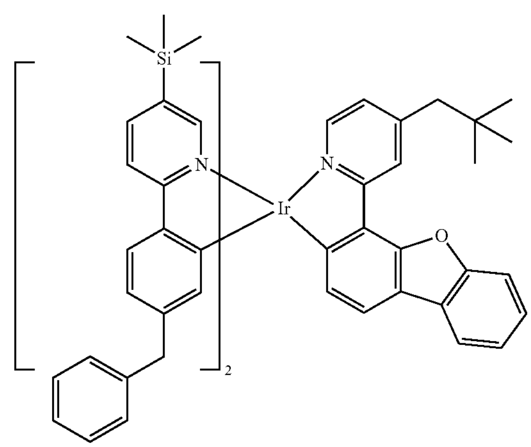

-continued
1954
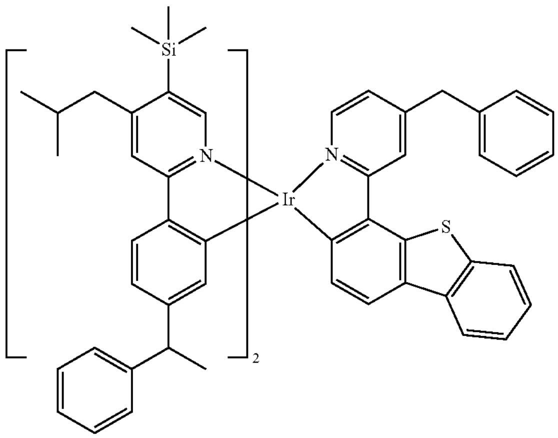
1955
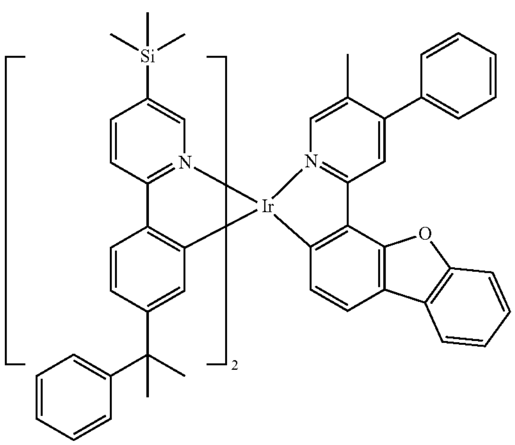
1956
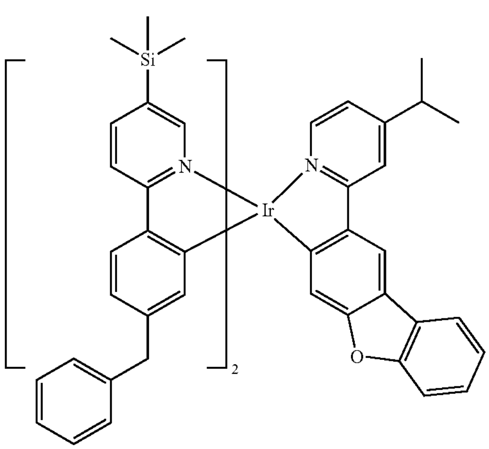
-continued
1956
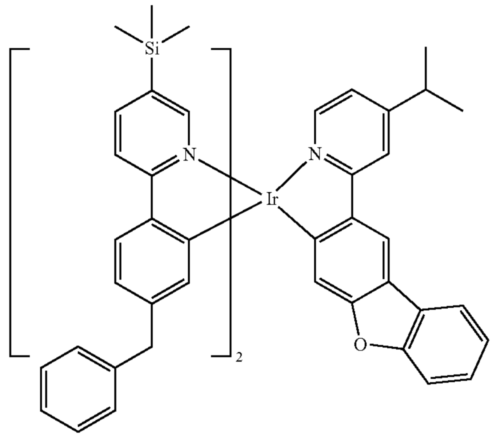
1957
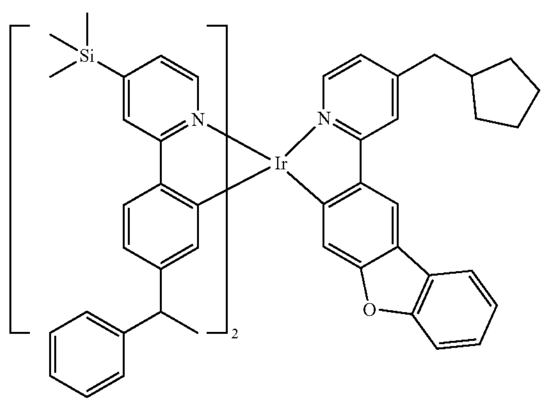
1958
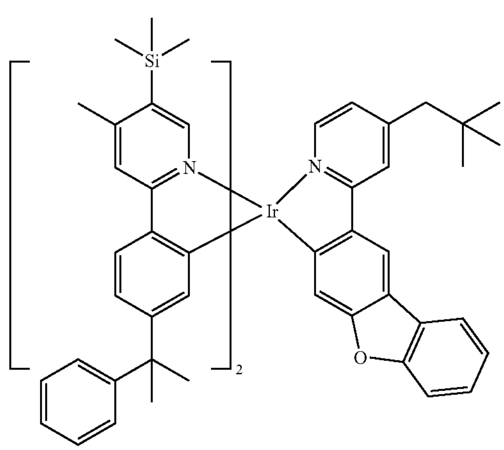

-continued
1959
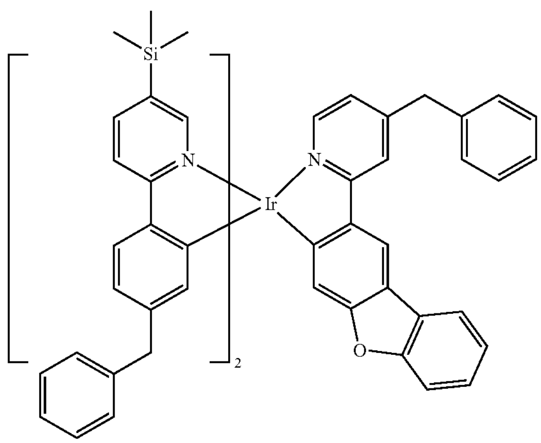
1960
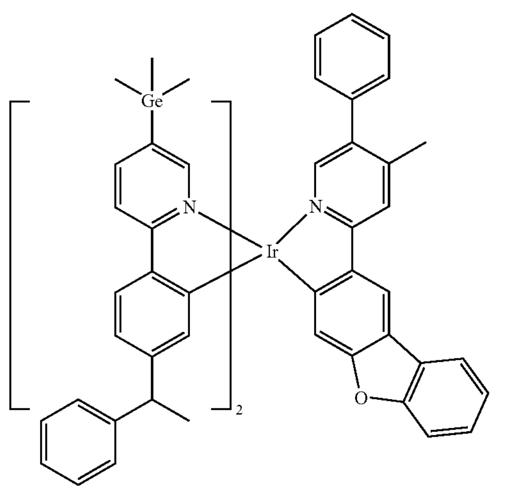
1961
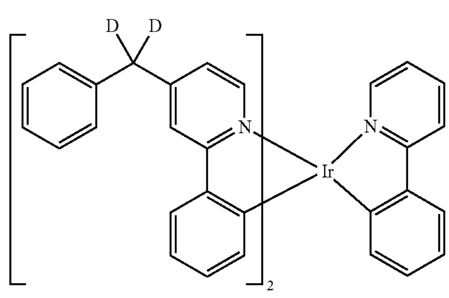
1962
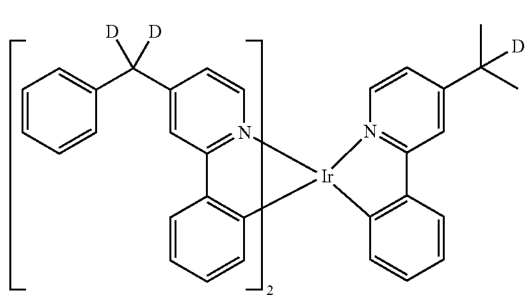
-continued
1963
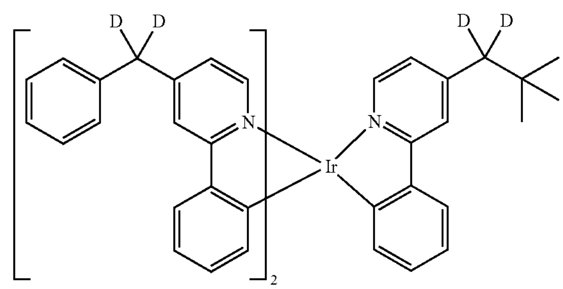
1964
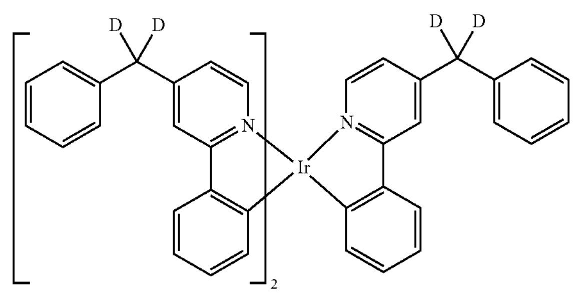
1965
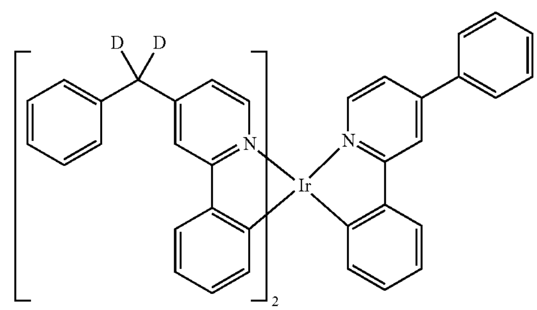
1966
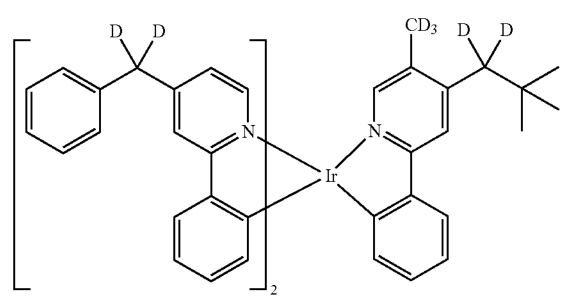
1967
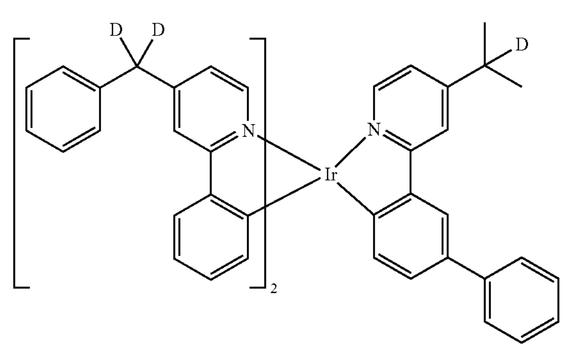

-continued
1968
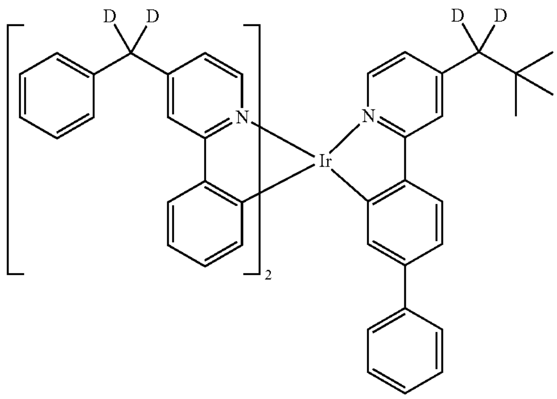
1969
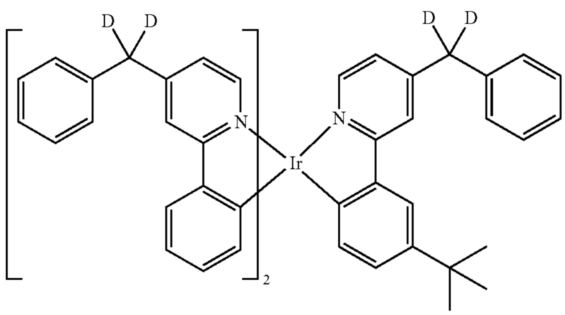
1970
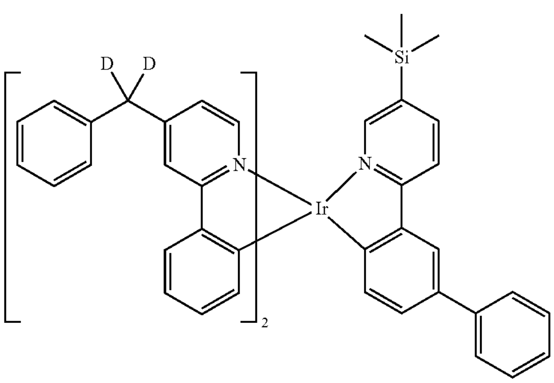
1971
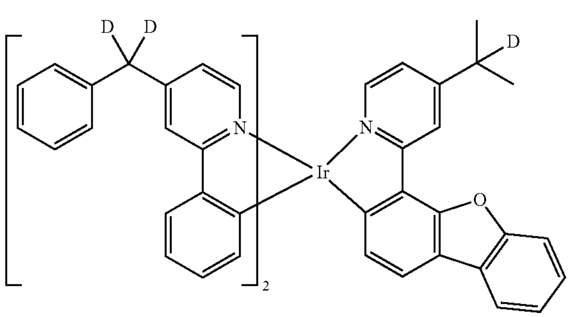
-continued
1972
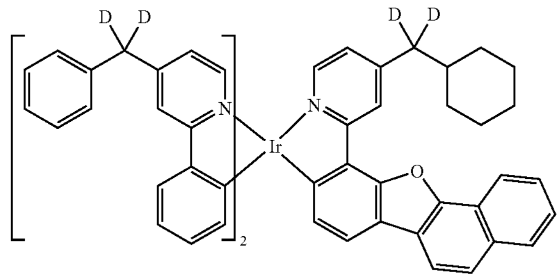
1973
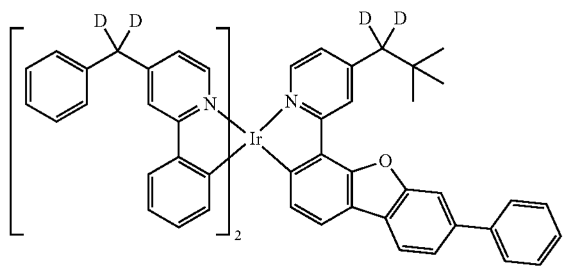
1974
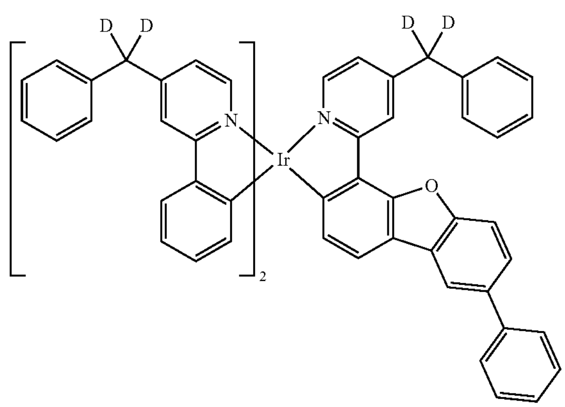
1975
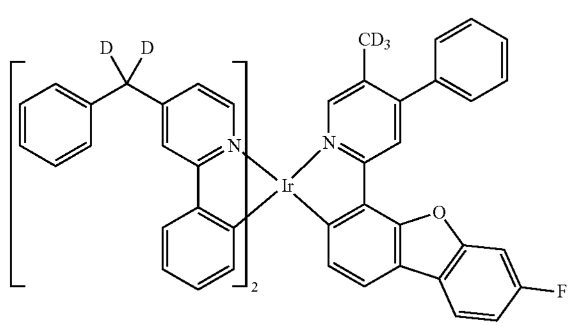

-continued
1976
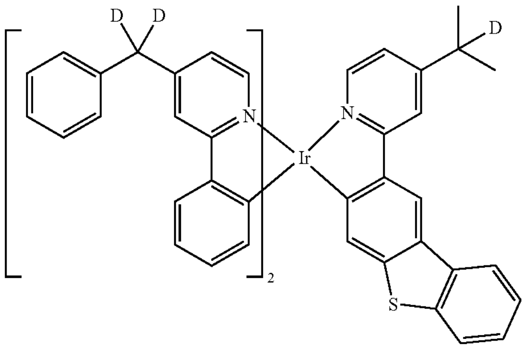
1977
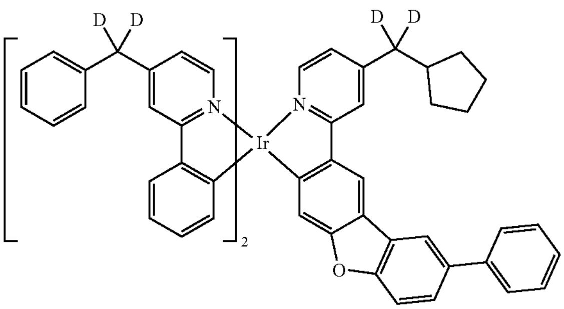
1978
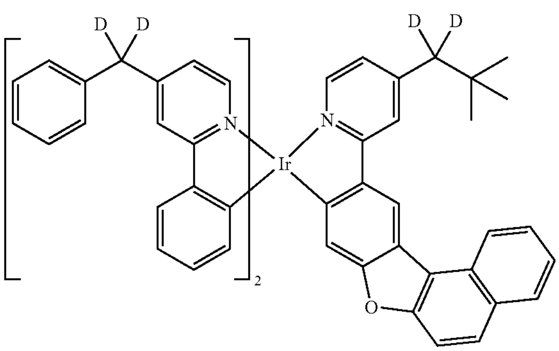
1979
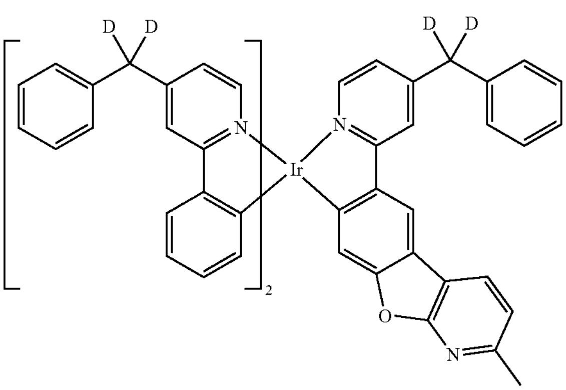
-continued
1980
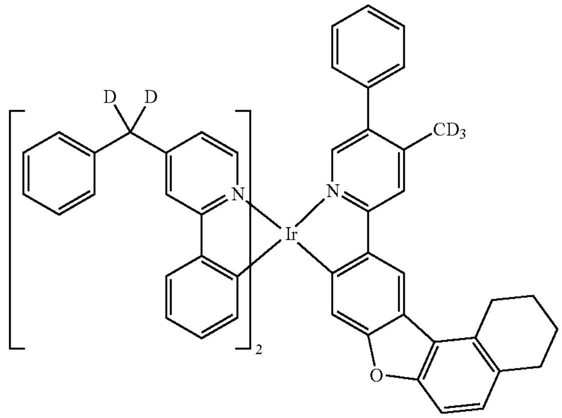
1981
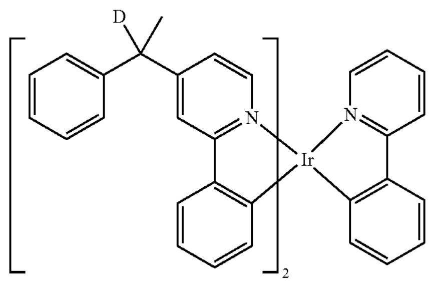
1982
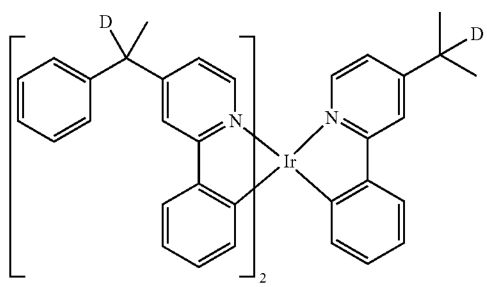
1983
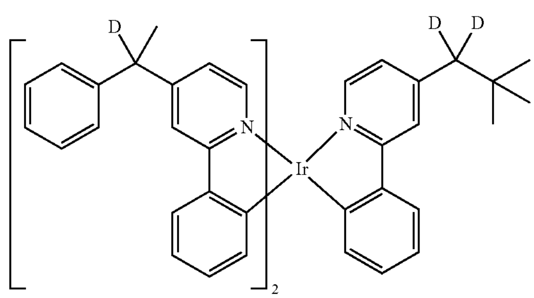
1984
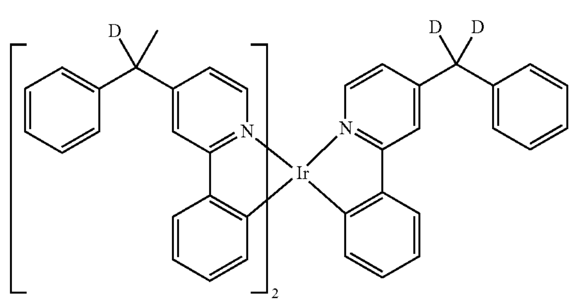

-continued
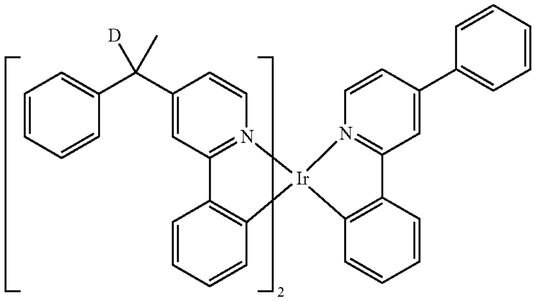
1985
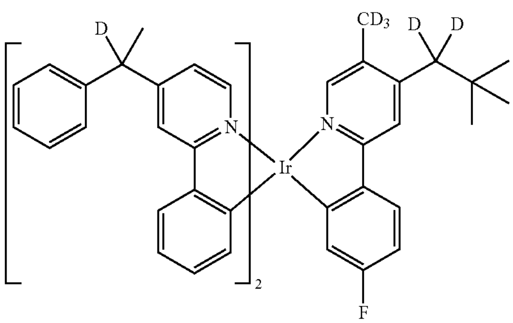
1986
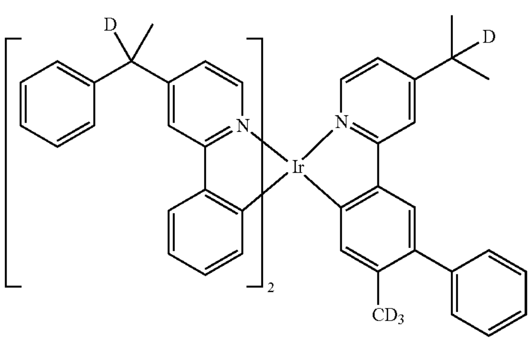
1987
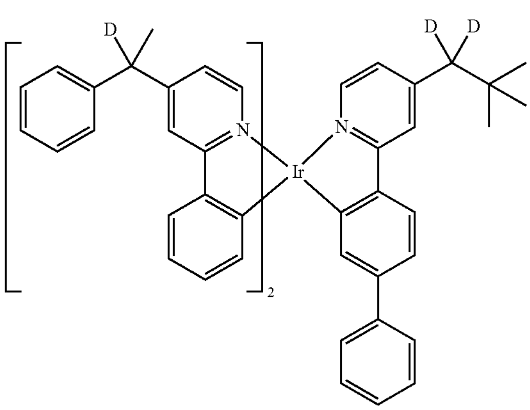
1988
-continued
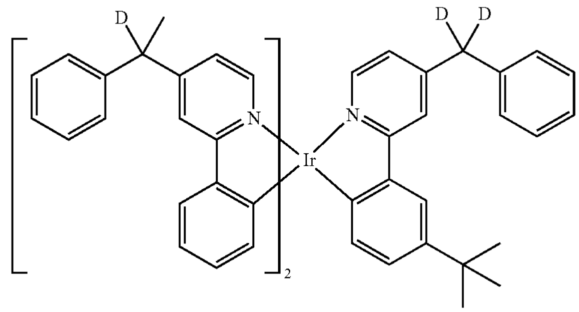
1989
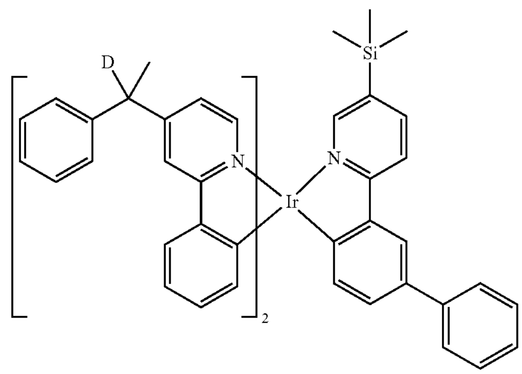
1990
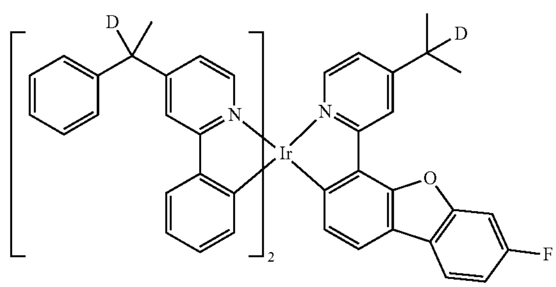
1991
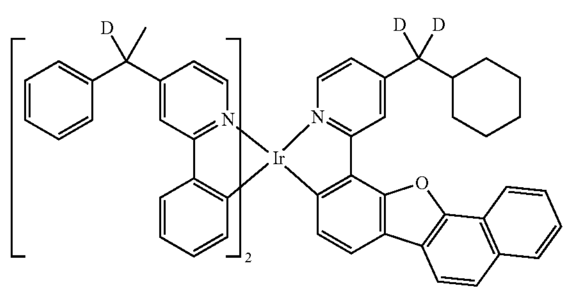
1992
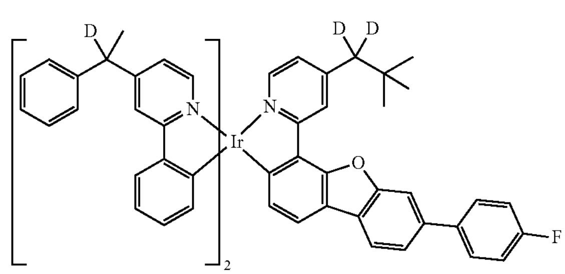
1993

-continued
1994
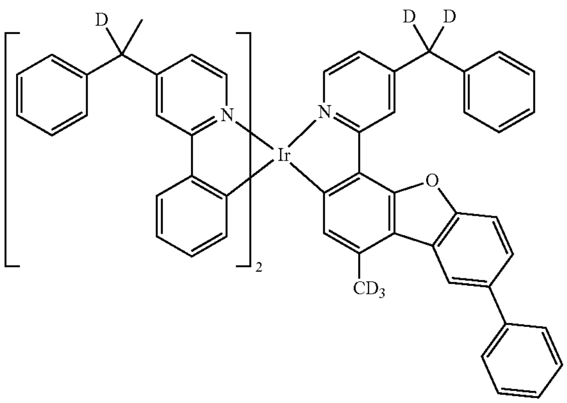
1995
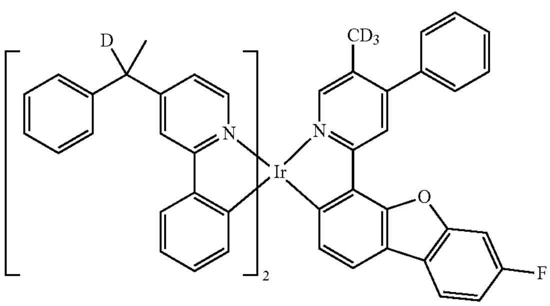
1996
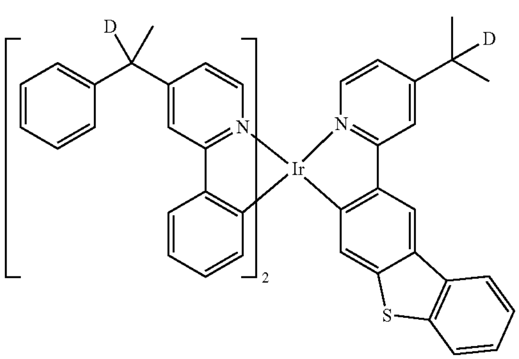
1997
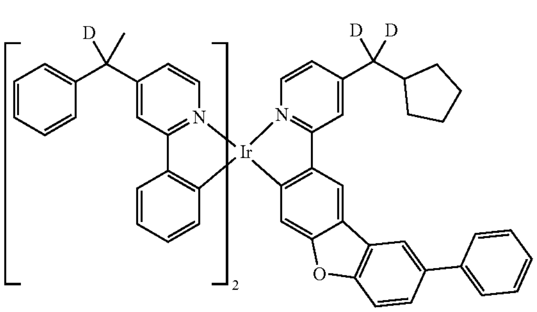
-continued
1998
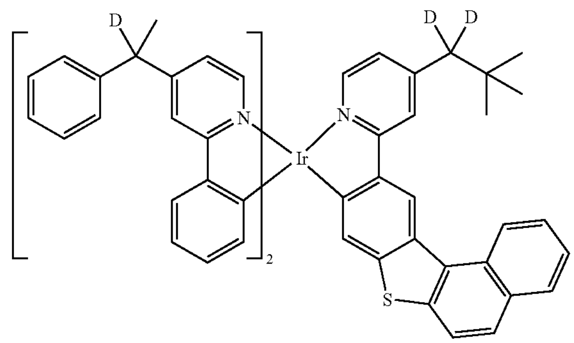
1999
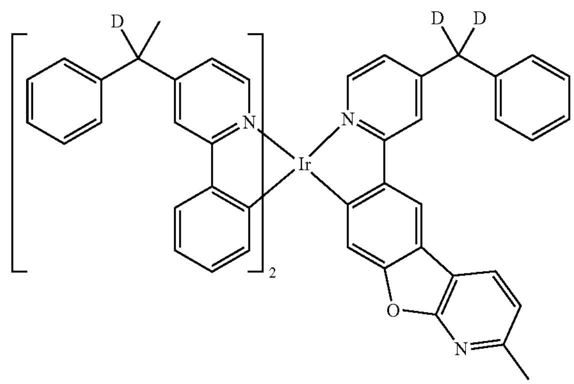
2000
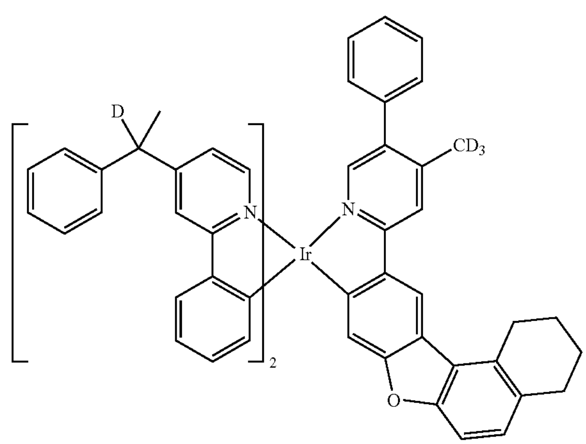
2001
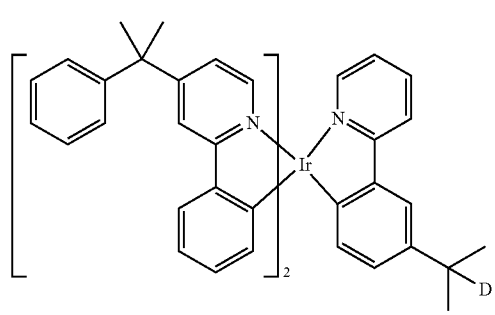

-continued
2002
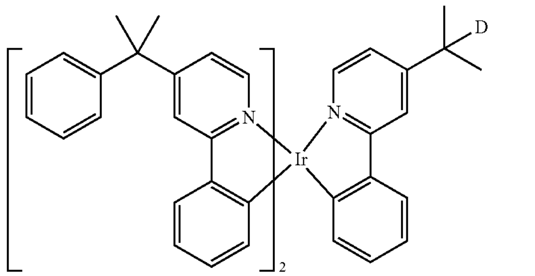
2003
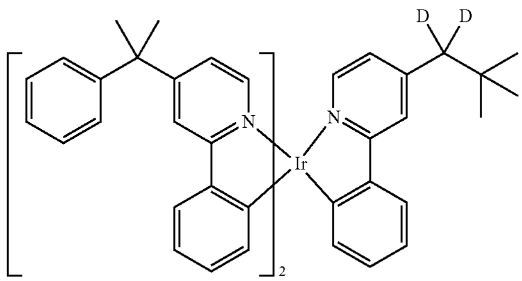
2004
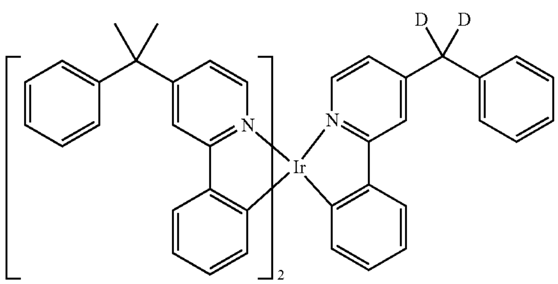
2005
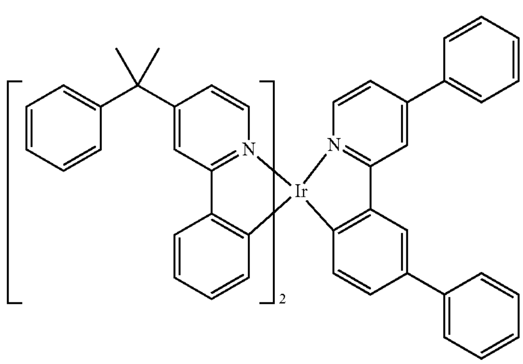
2006
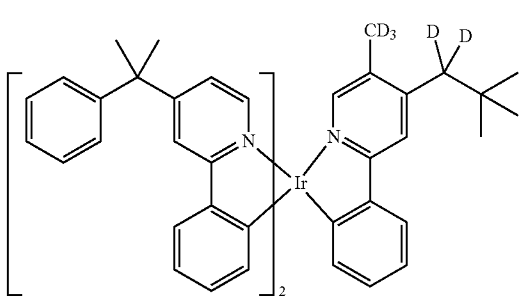
-continued
2007
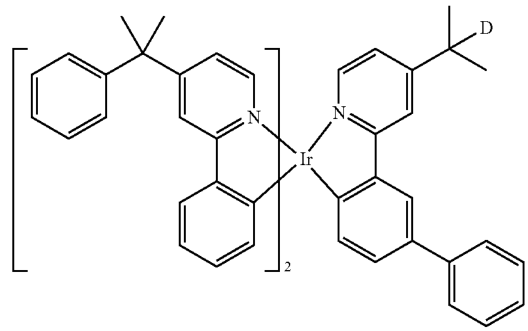
2008
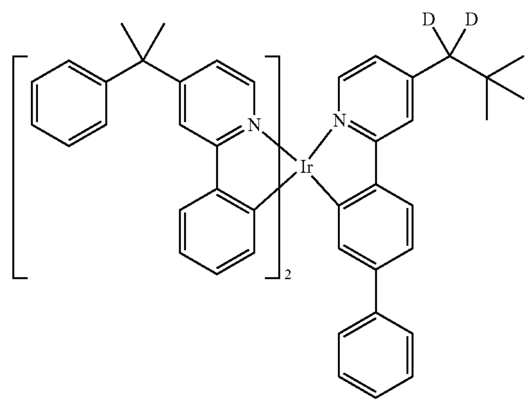
2009
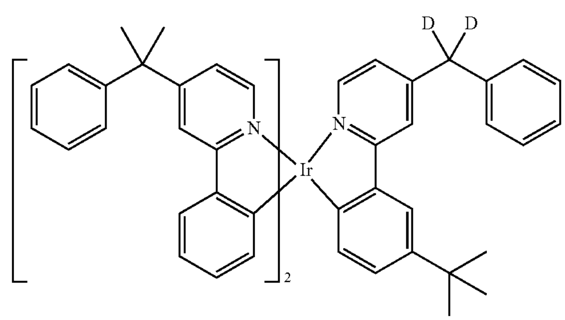
2010
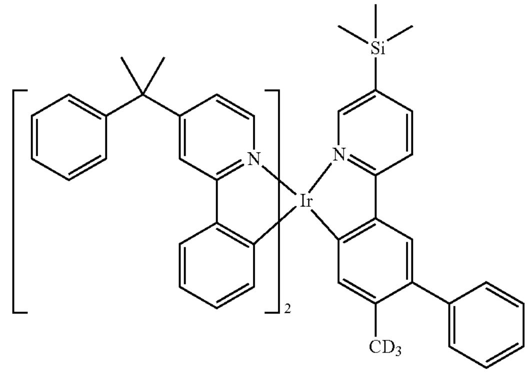

-continued
2011
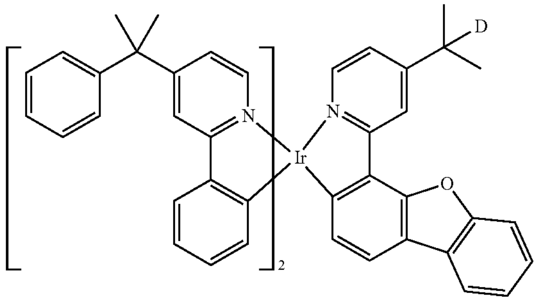
2012
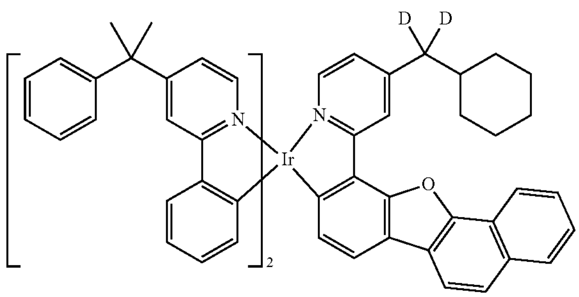
2013
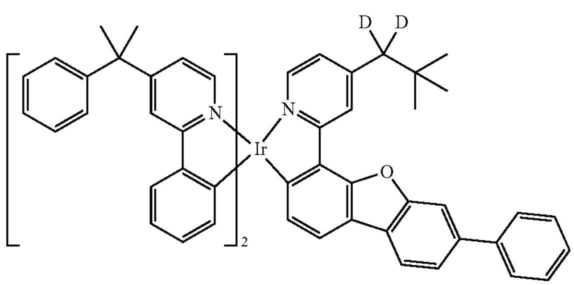
2014
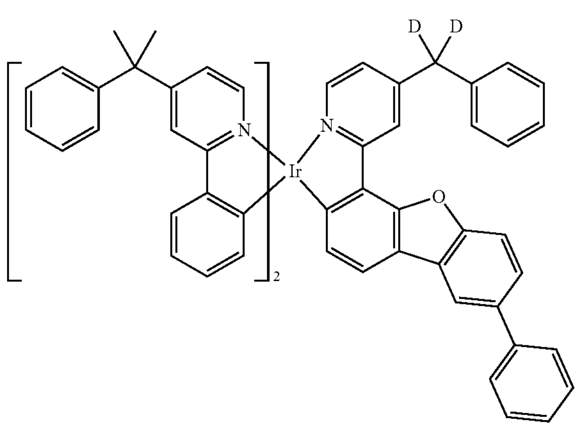
-continued
2015
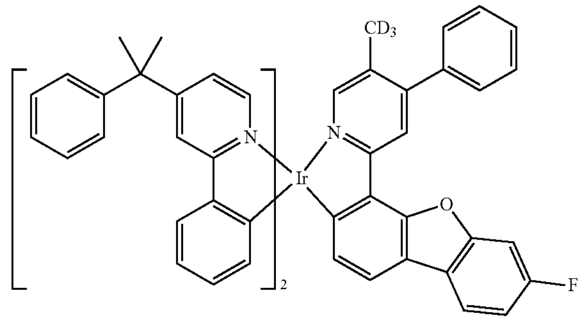
2016
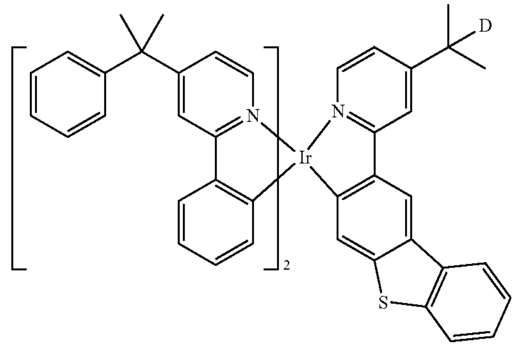
2017
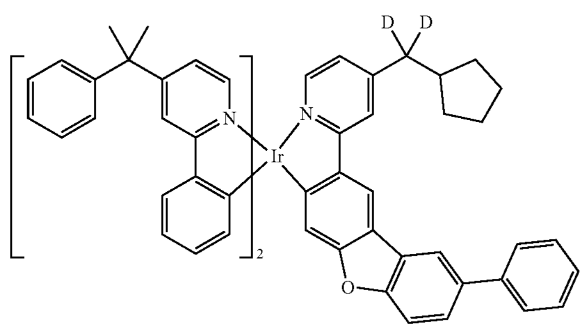
2018
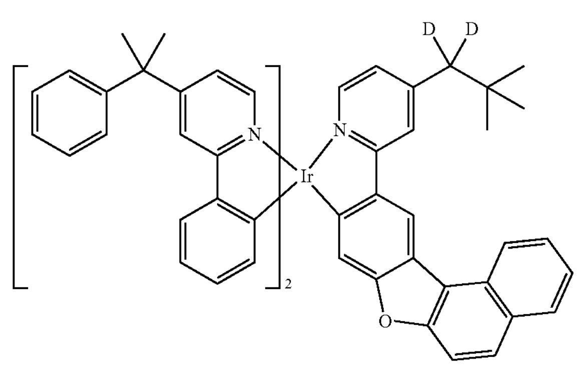

-continued
2019
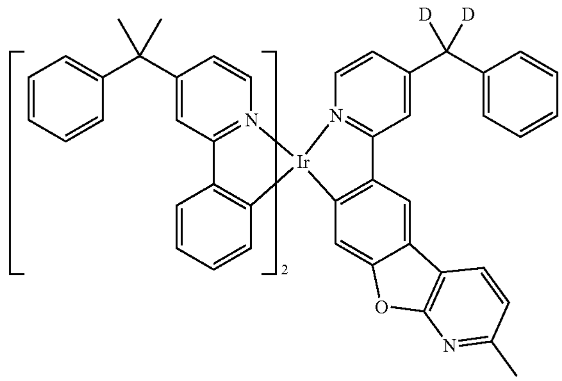
2020
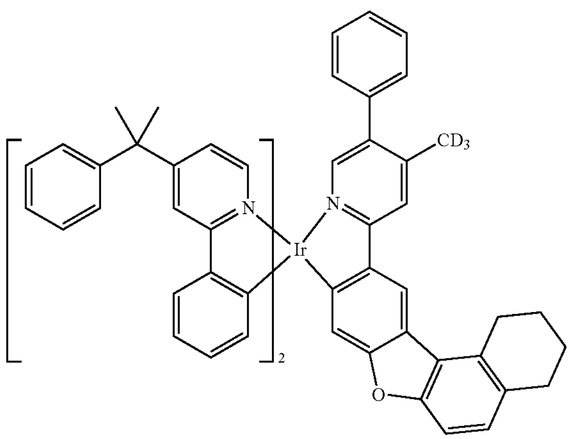
2021
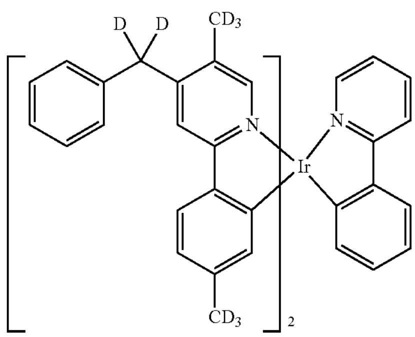
2022
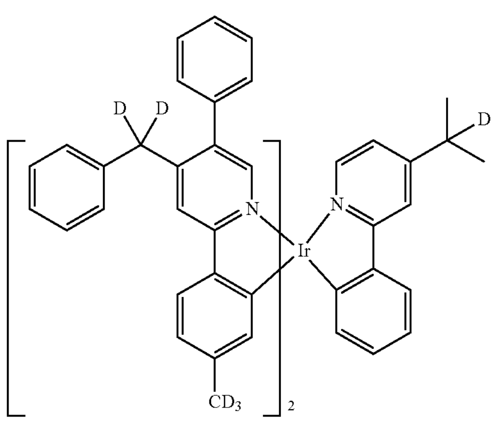
-continued
2023
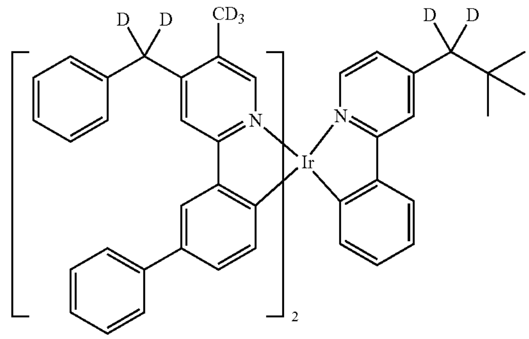
2024
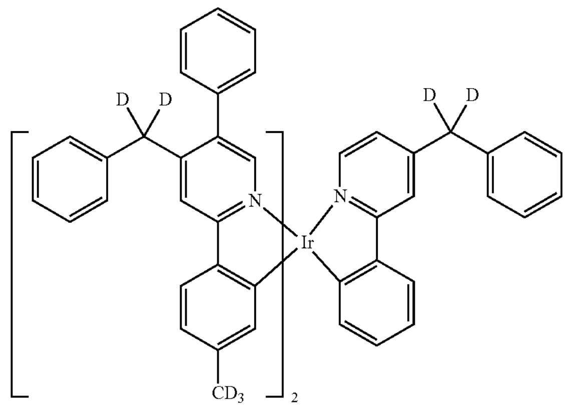
2025
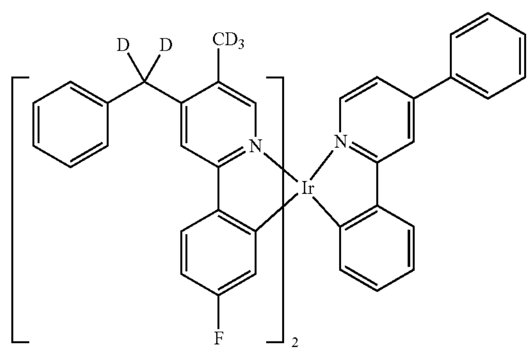
2026
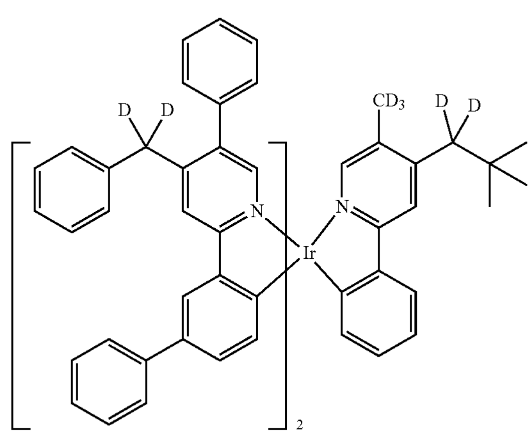

-continued
2027
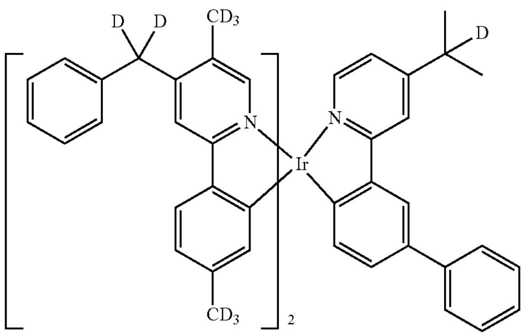
2028
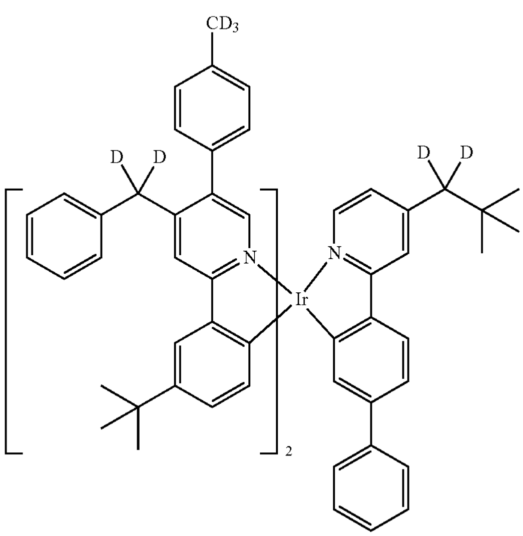
2029
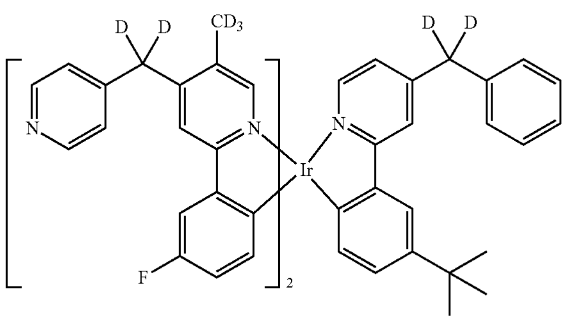
-continued
2030
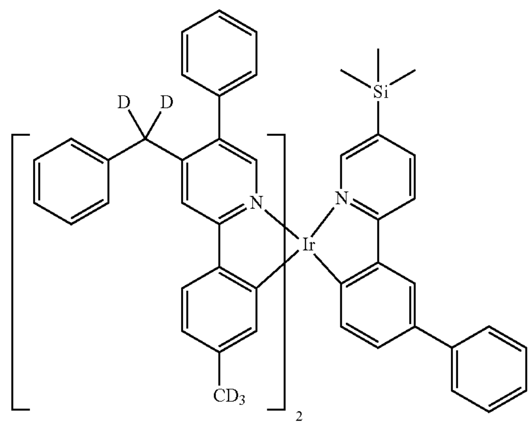
2031
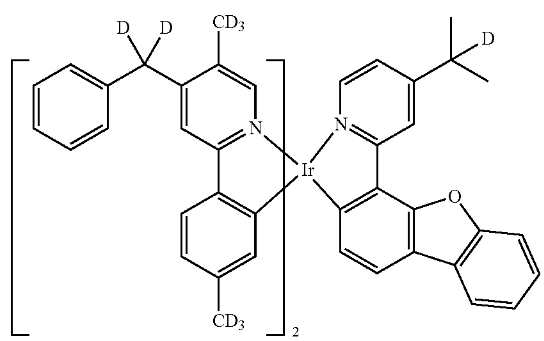
2032
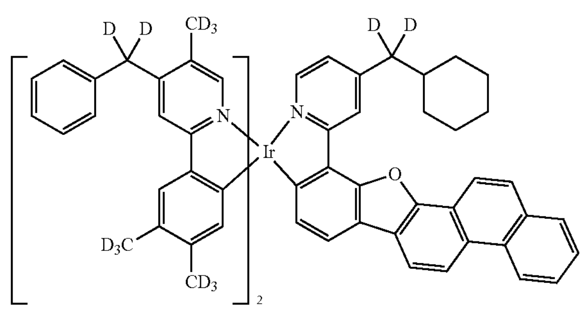
2033
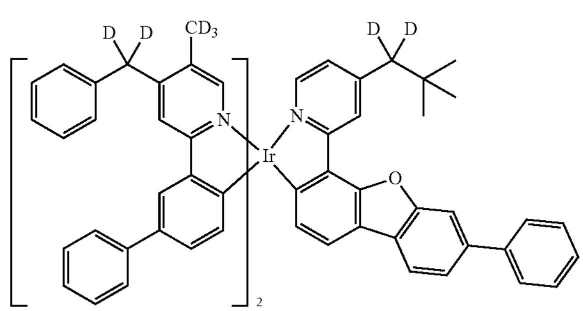

2034
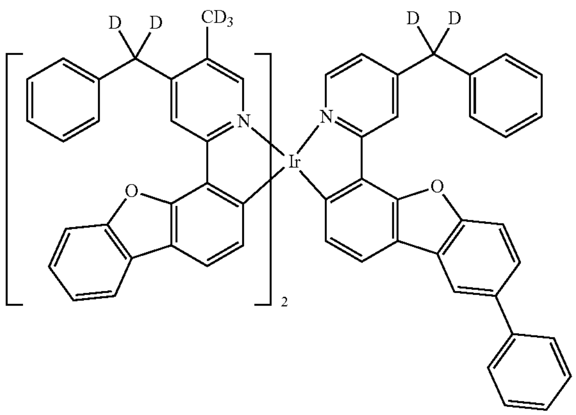
2035
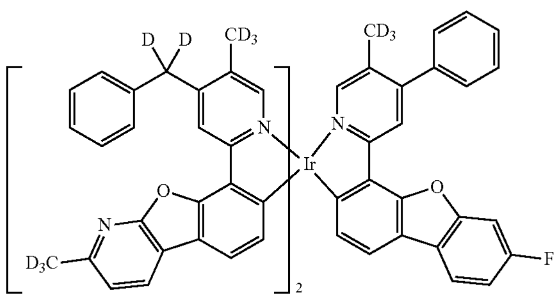
2036
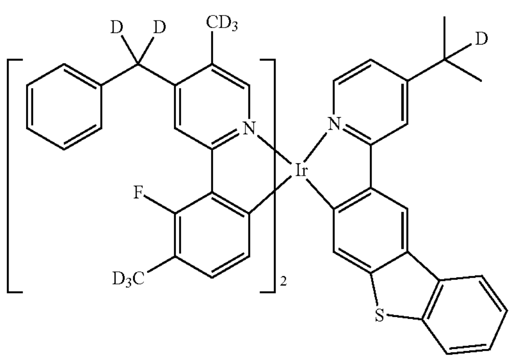
2037
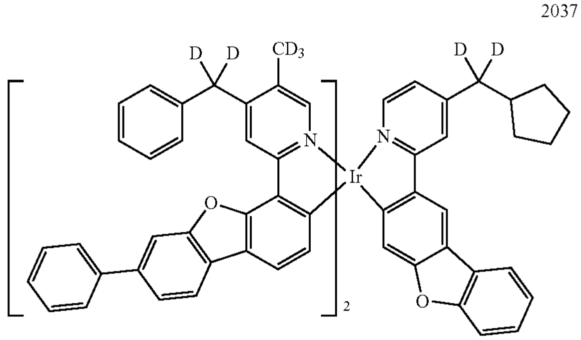
2038
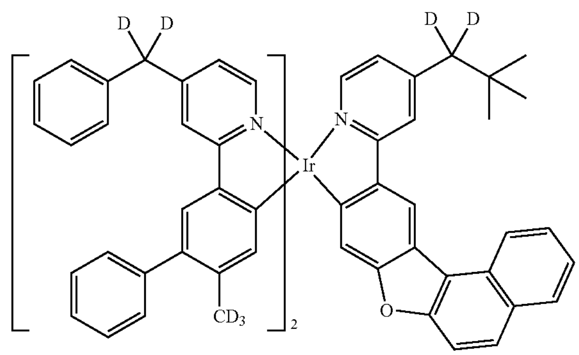
2039
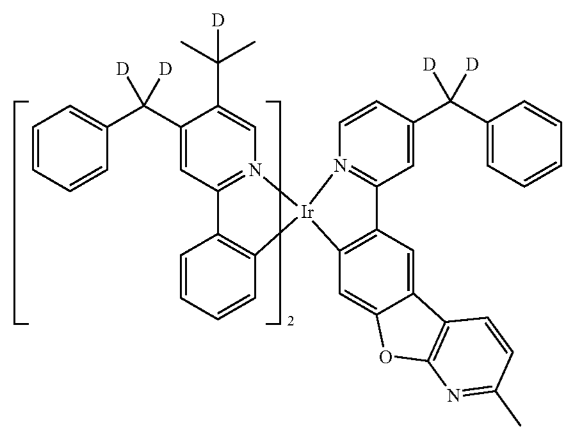
2040
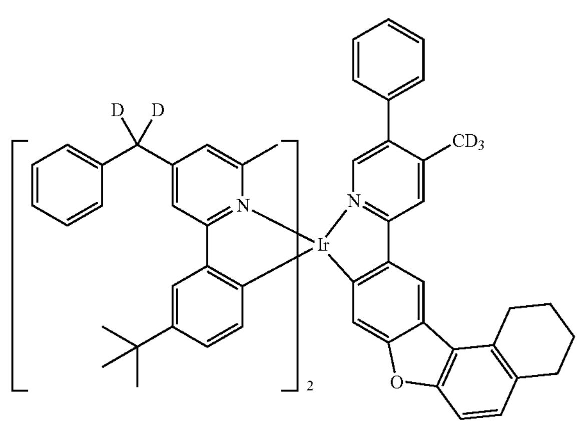
2041
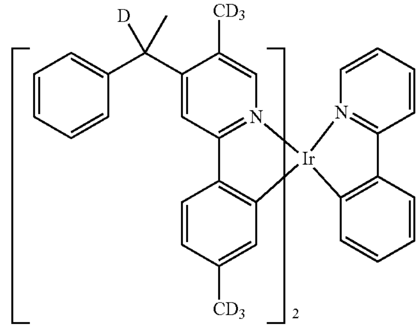

-continued
2042
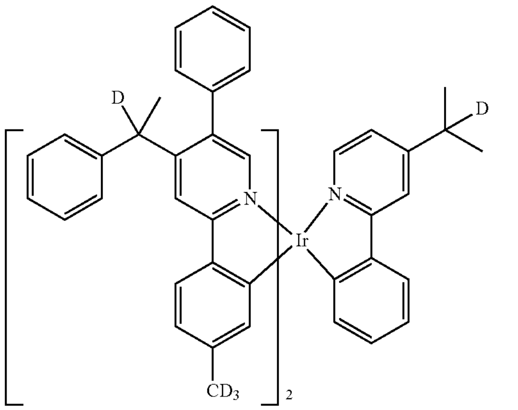
2043
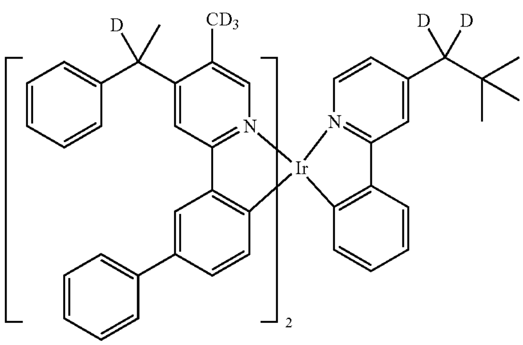
2044
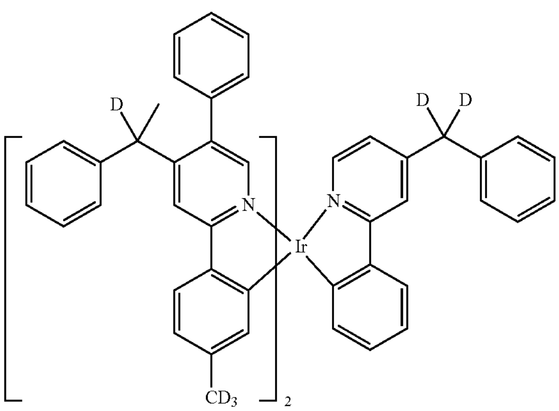
2045
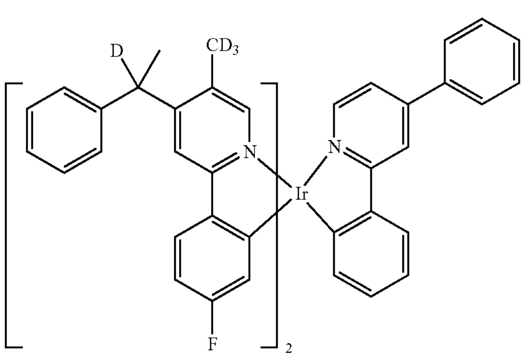
-continued
2046
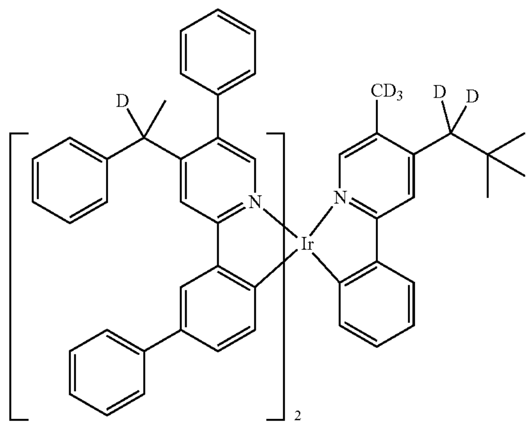
2047
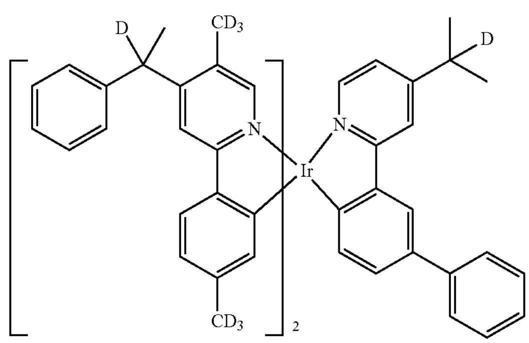
2048
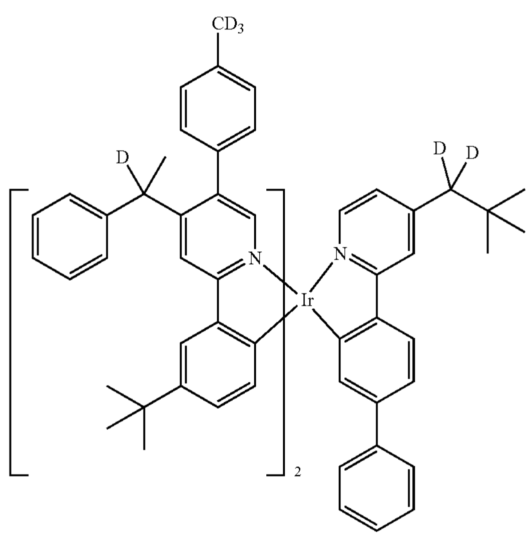

-continued
2049
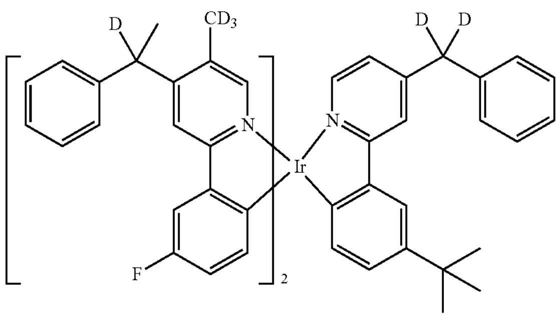
2050
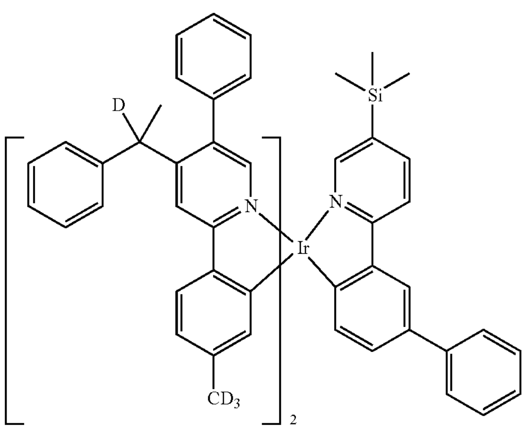
2051
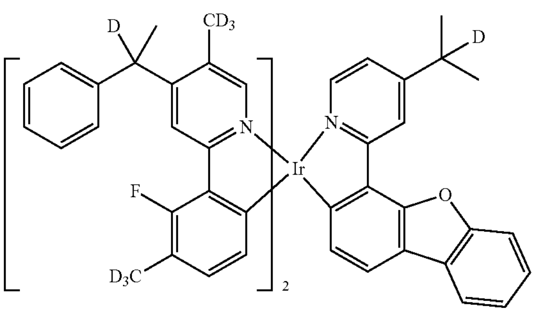
2052
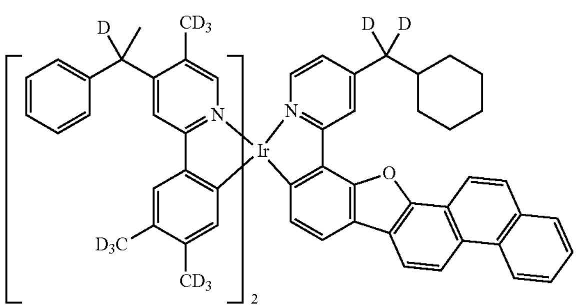
-continued
2053
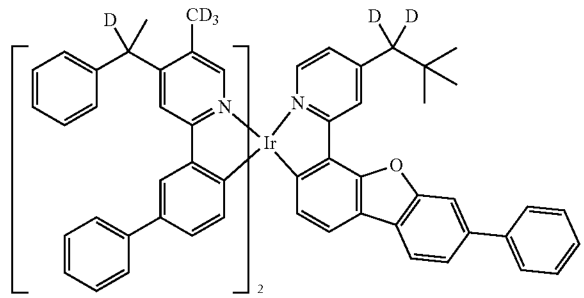
2054
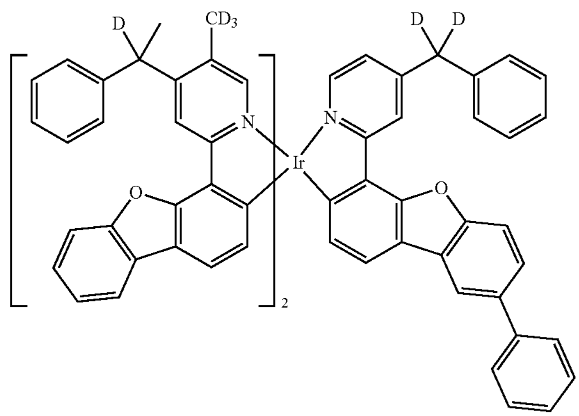
2055
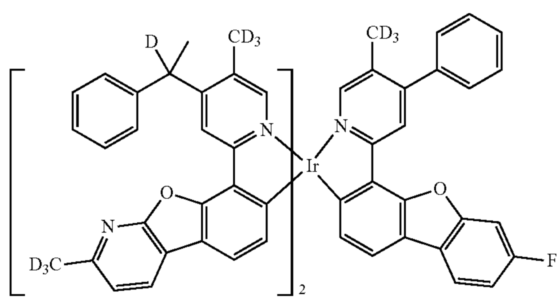
2056
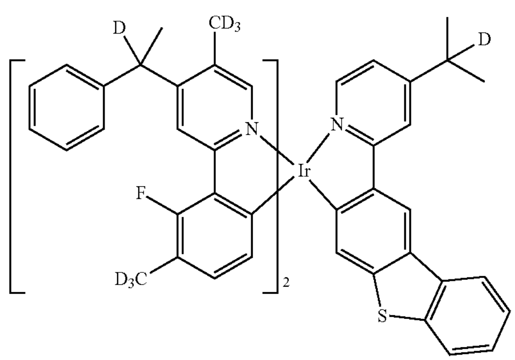

-continued
2057
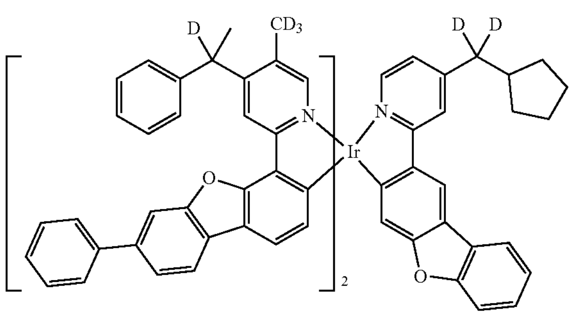
2058
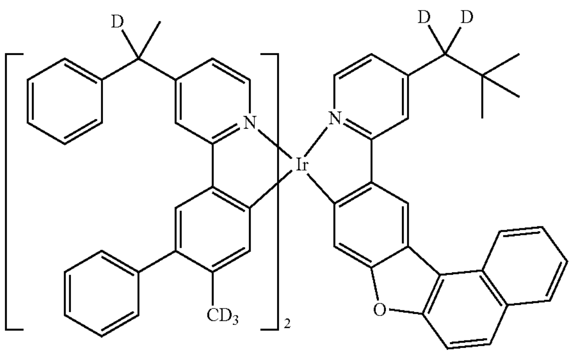
2059
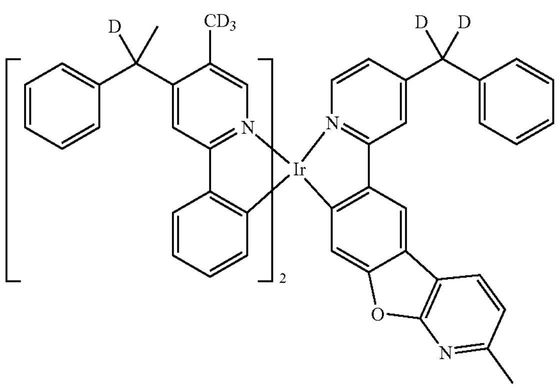
2060
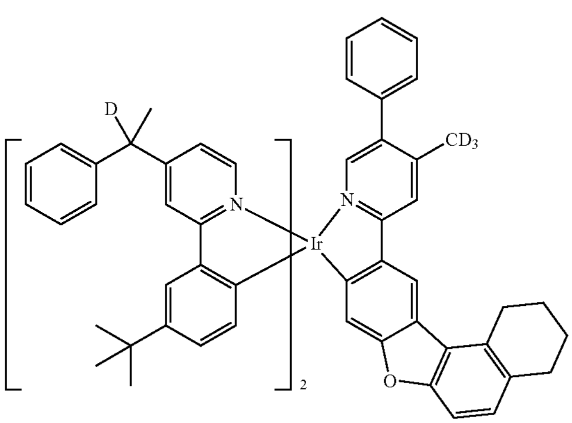
-continued
2061
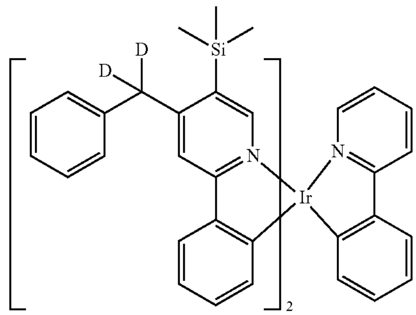
2062
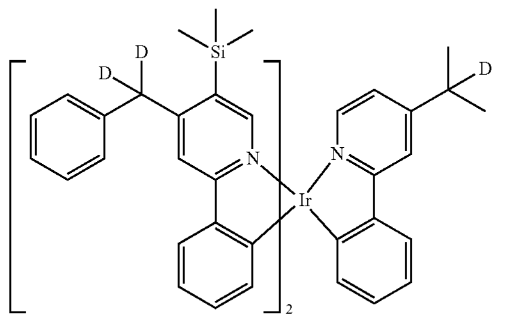
2063
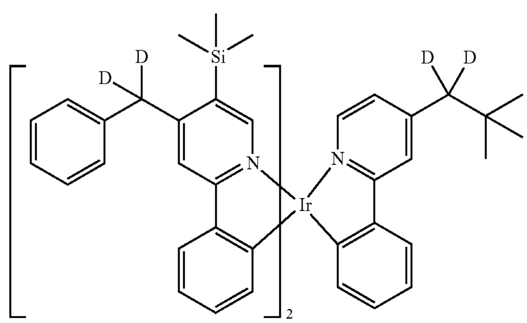
2064
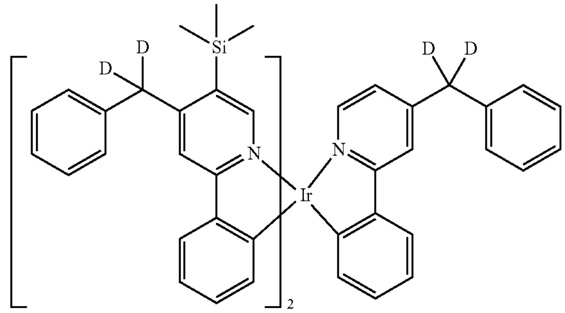

-continued
2065
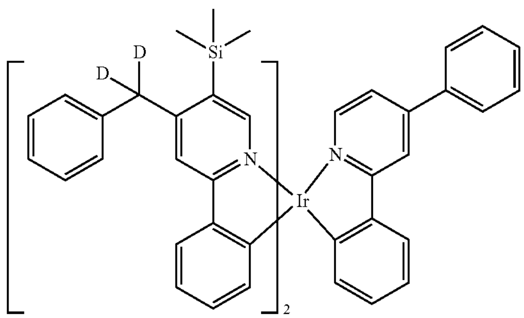
2066
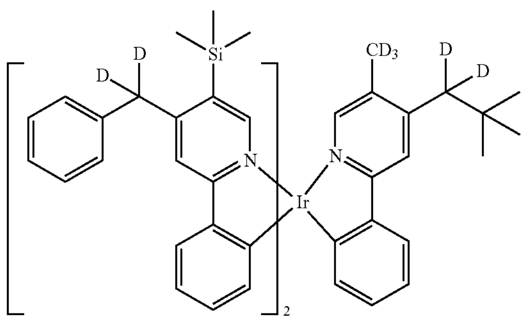
2067
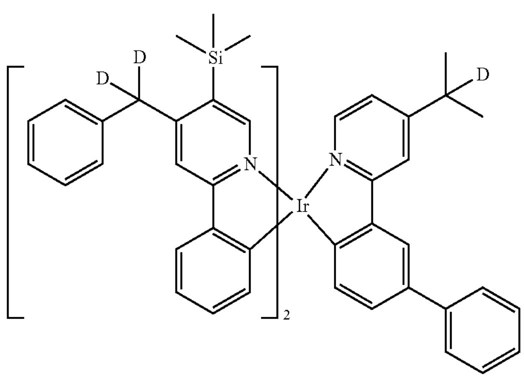
2068
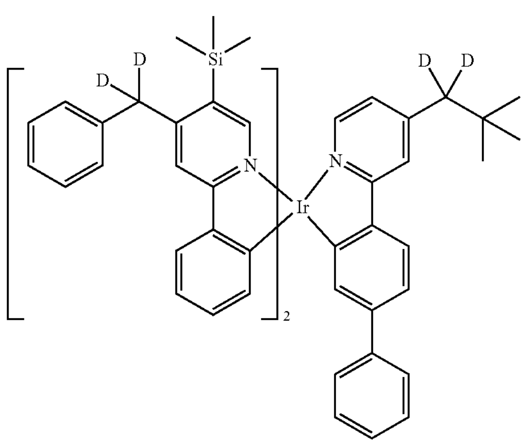
-continued
2069
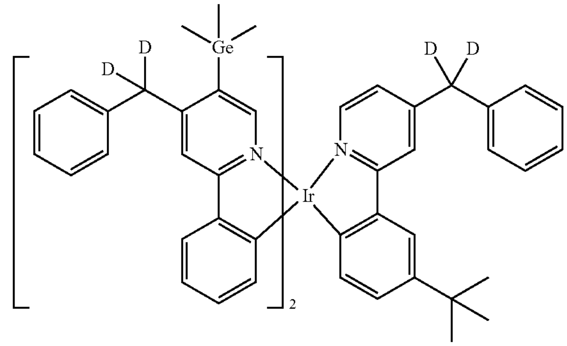
2070
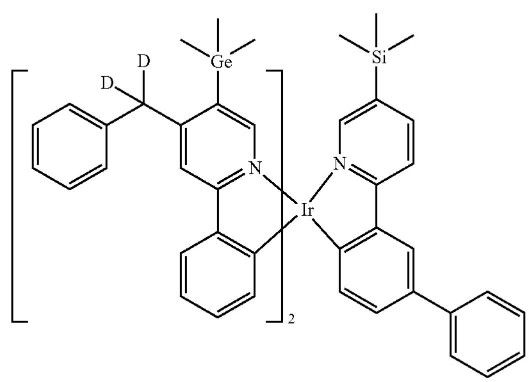
2071
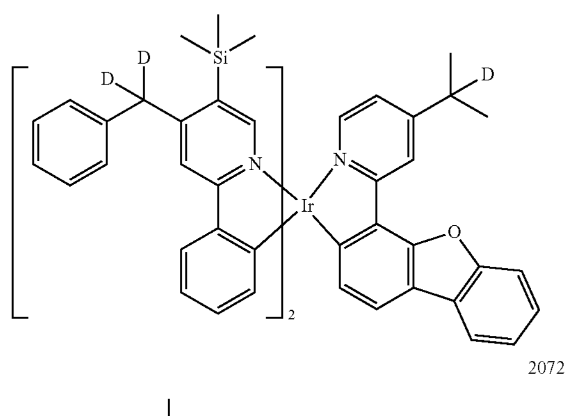
2072
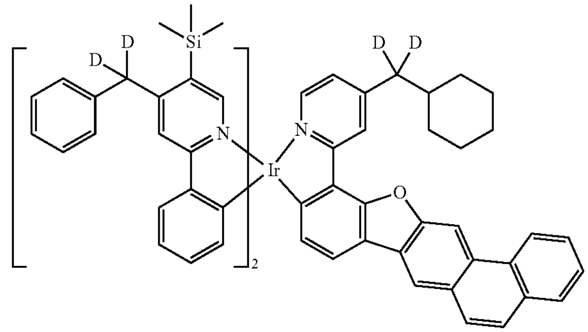

2073
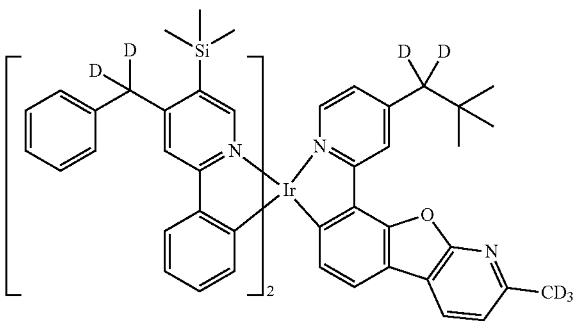
2074
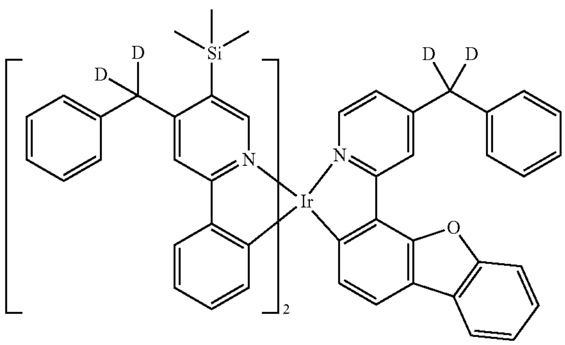
2075
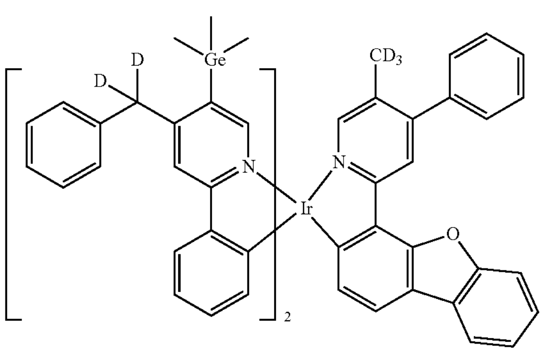
2076
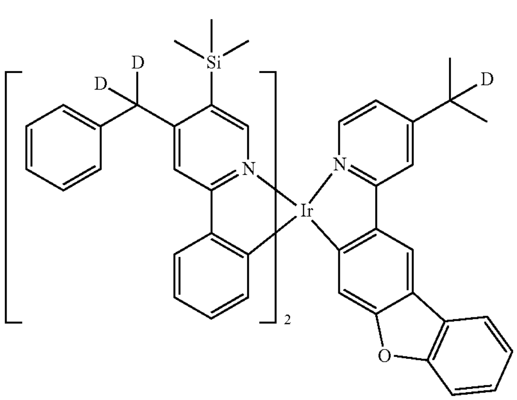
2077
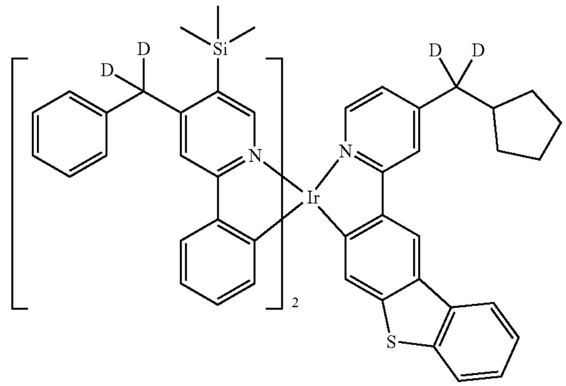
2078
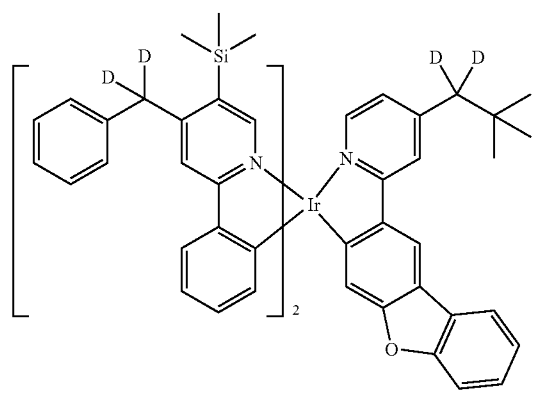
2079
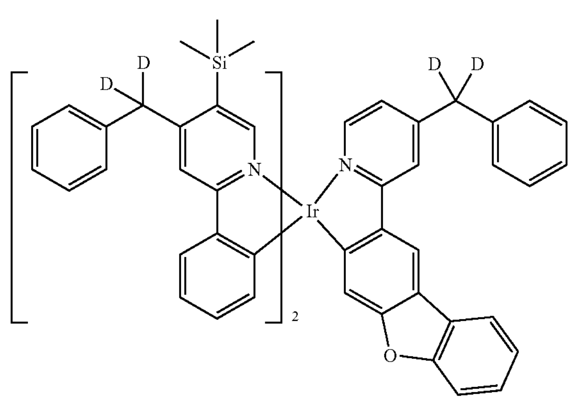

2080
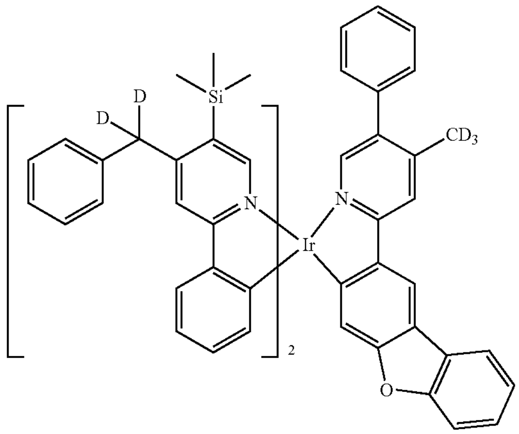
2081
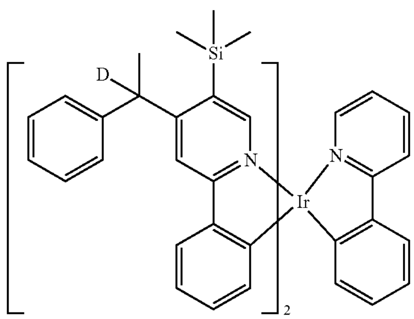
2082
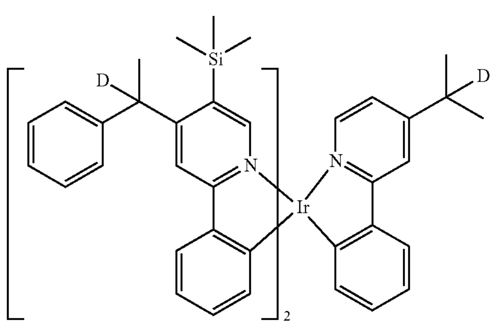
2083
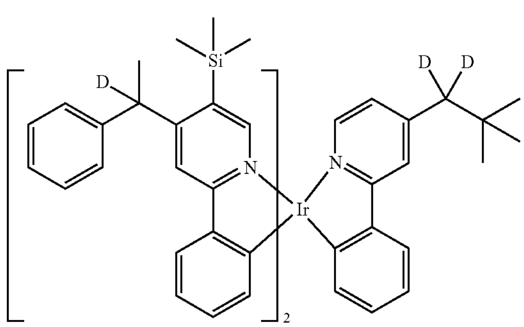
2084
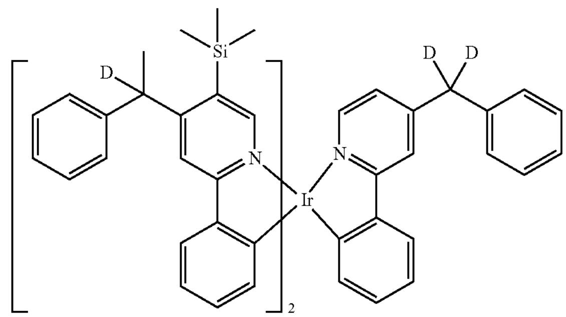
2085
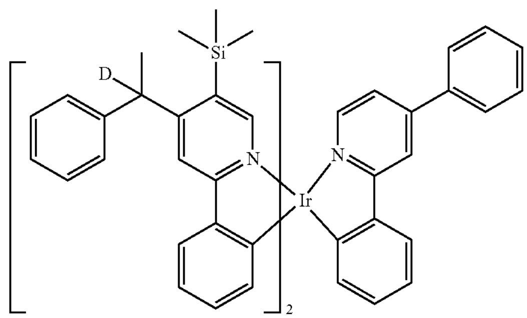
2086
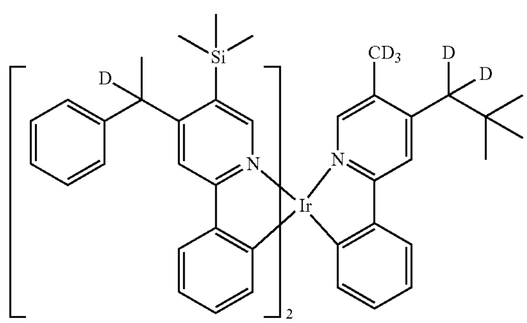
2087
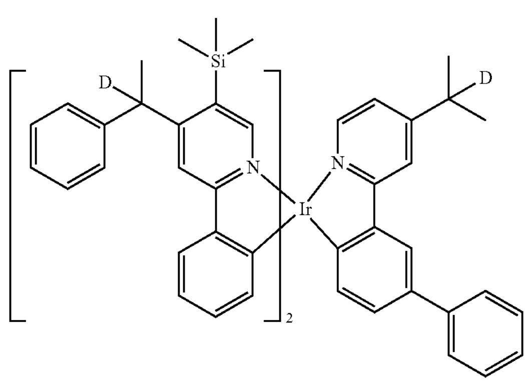

-continued
2088
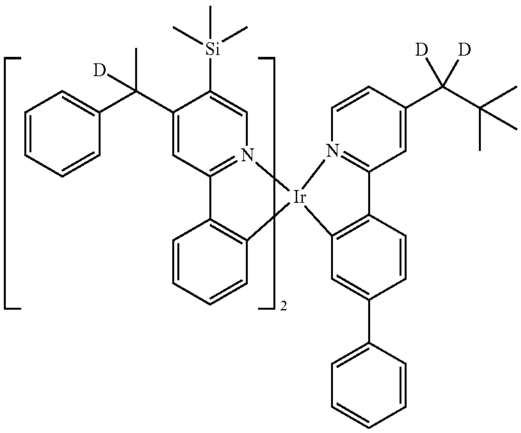
2089
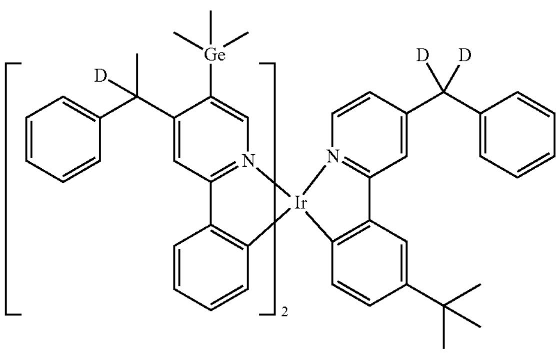
2090
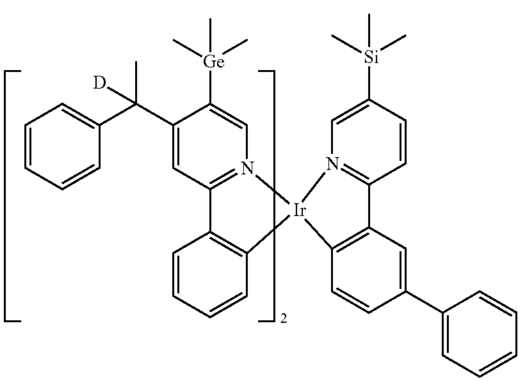
2091
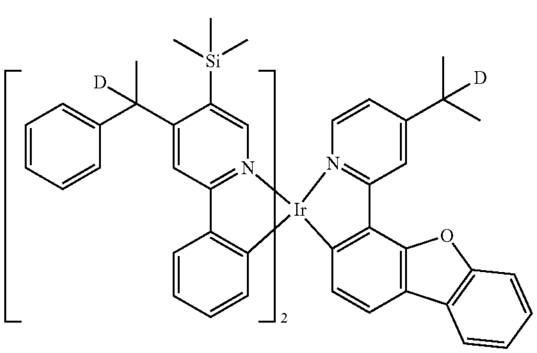
-continued
2092
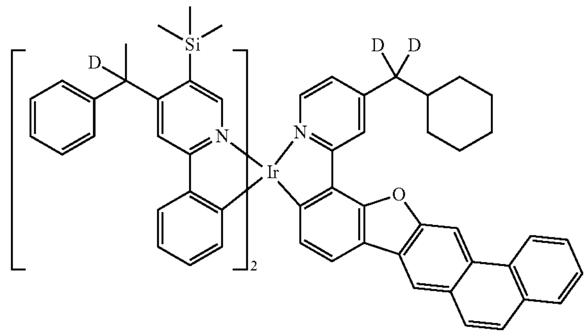
2093
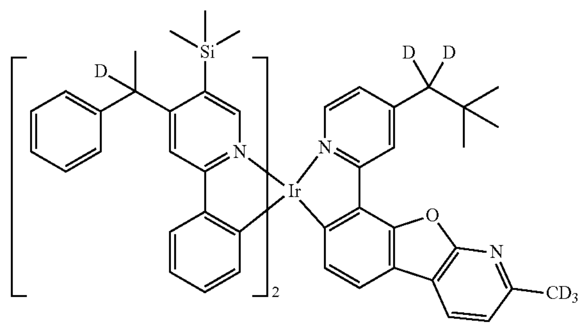
2094
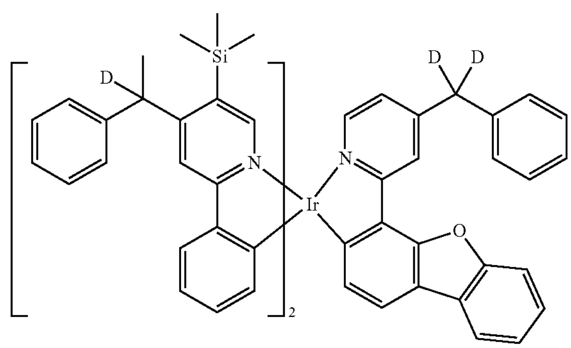
2095
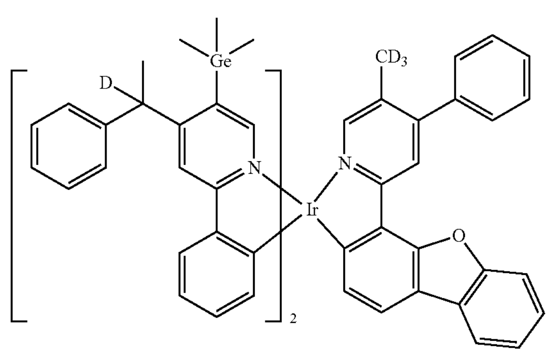

-continued
2096
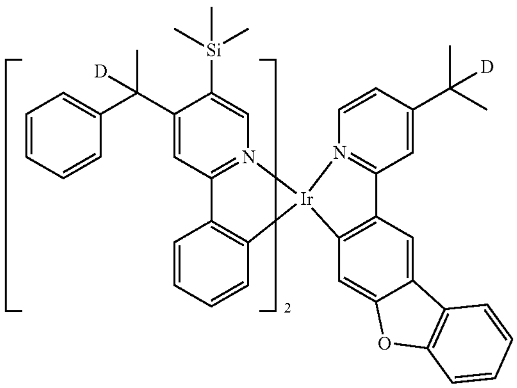
2097
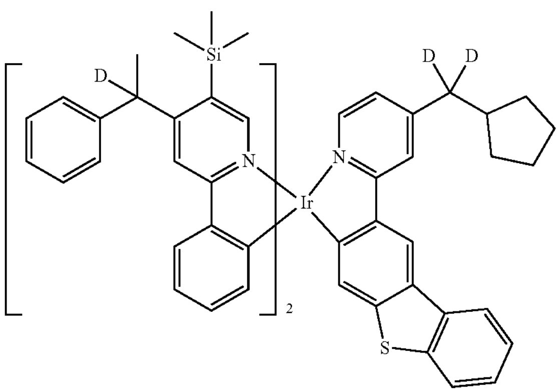
2098
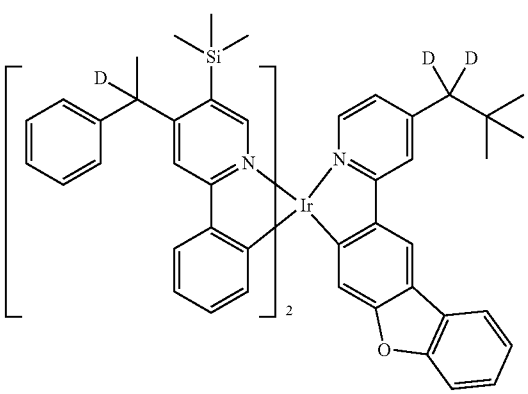
2099
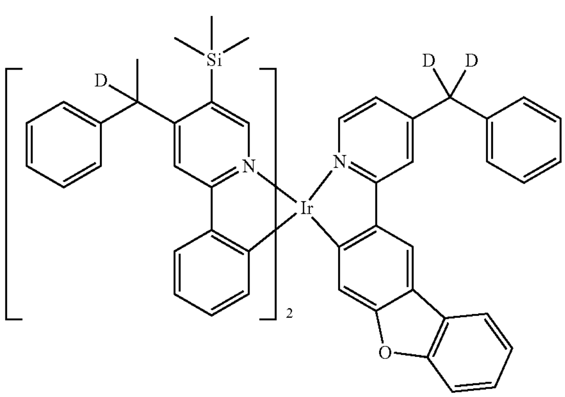
-continued
2100
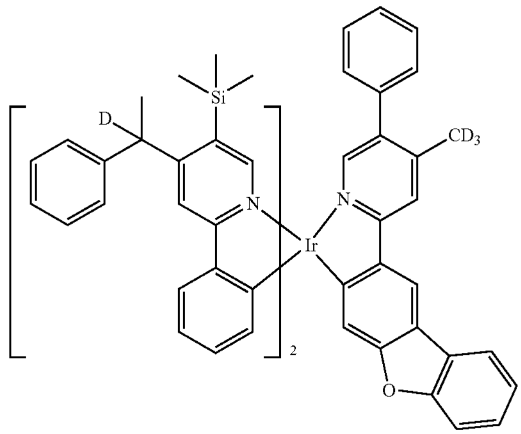
2101
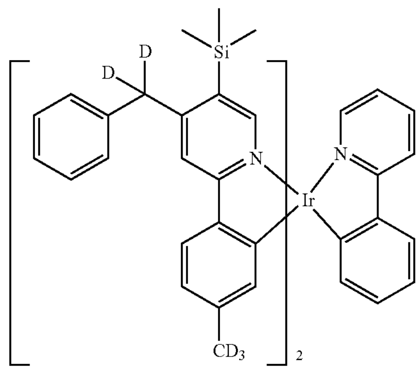
2102
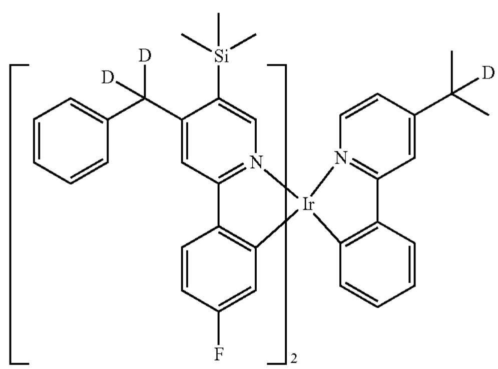
2103
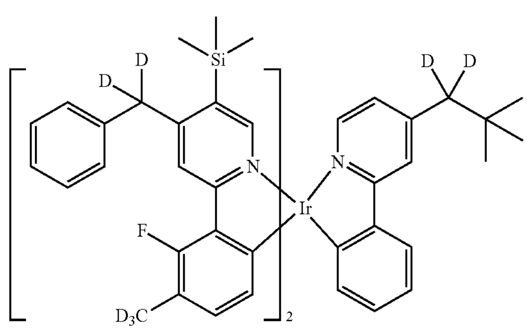

-continued
2104
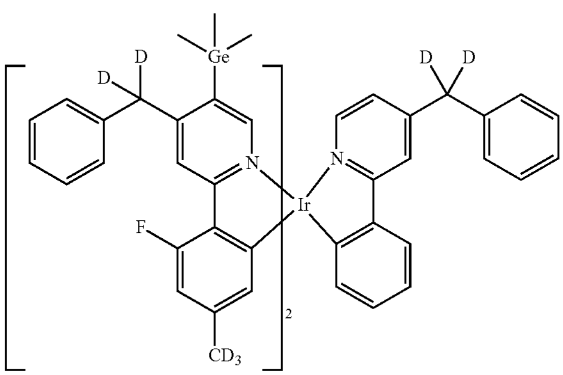
2105
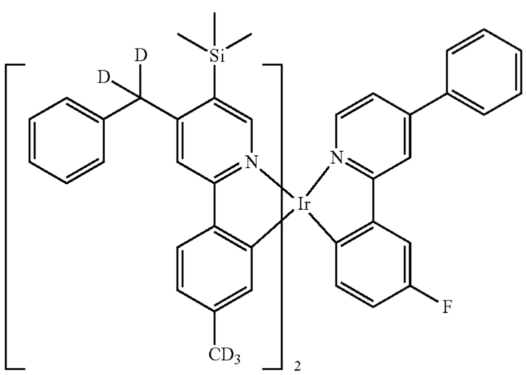
2106
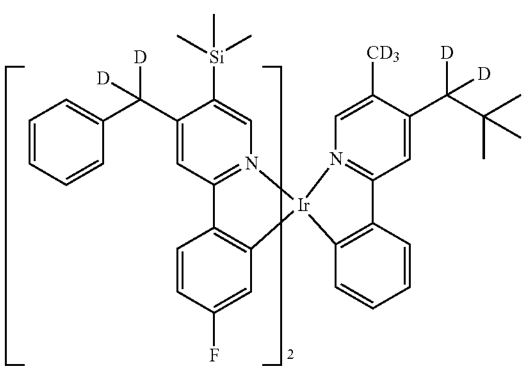
2107
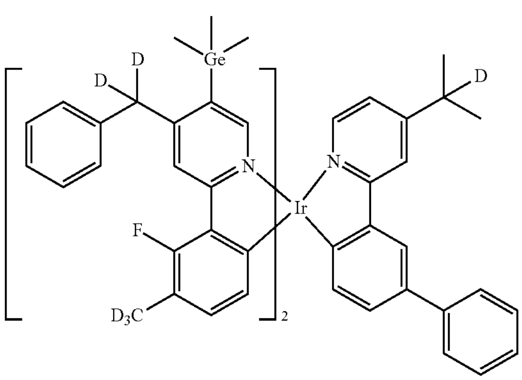
-continued
2108
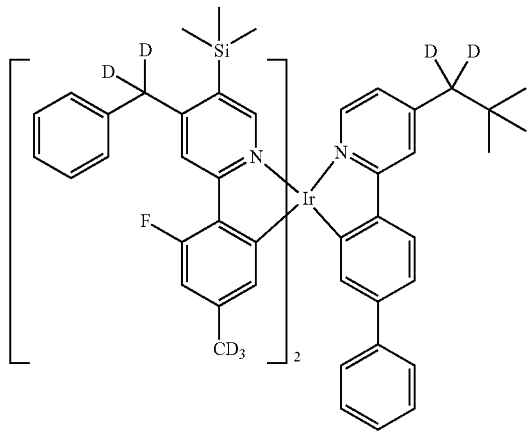
2109
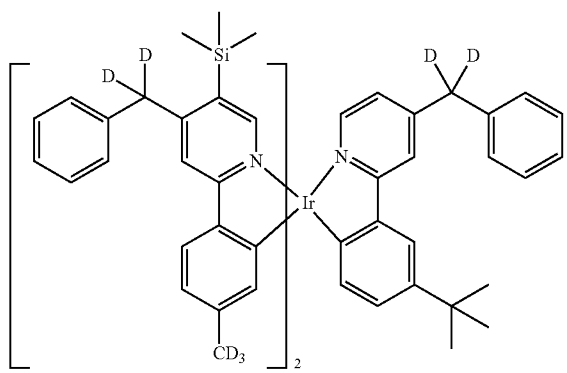
2110
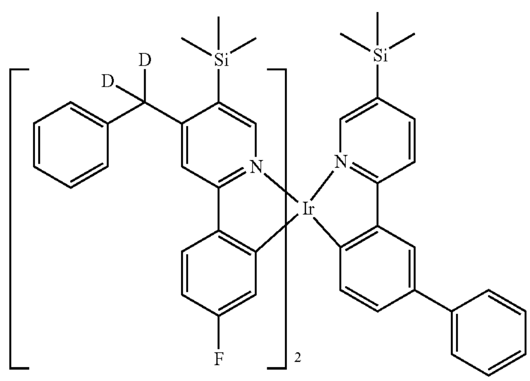
2111
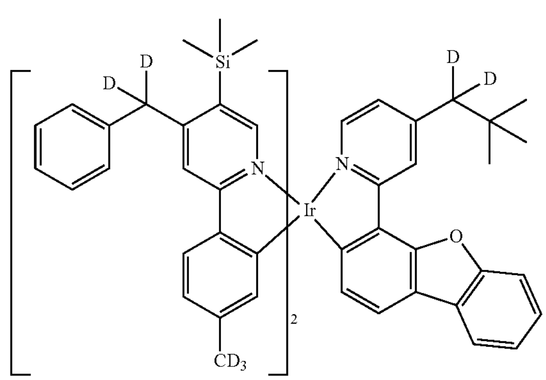

2112
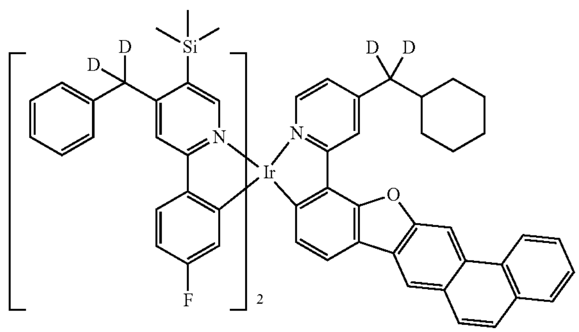
2113
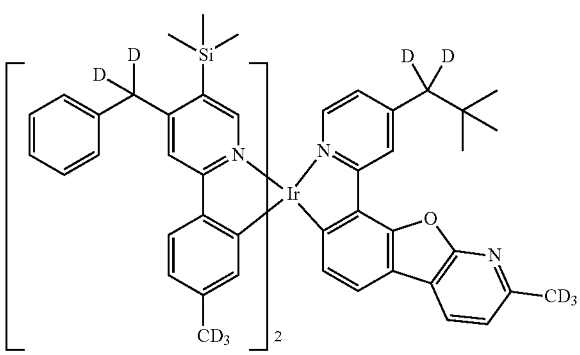
2114
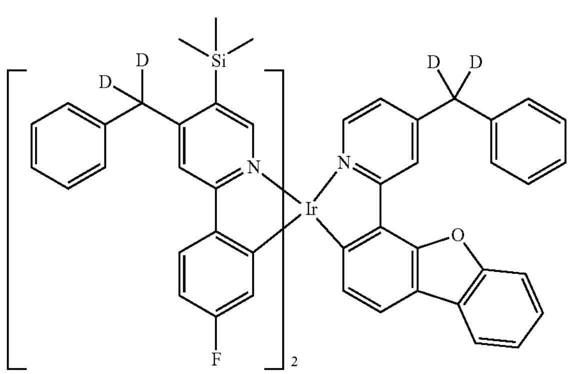
2115
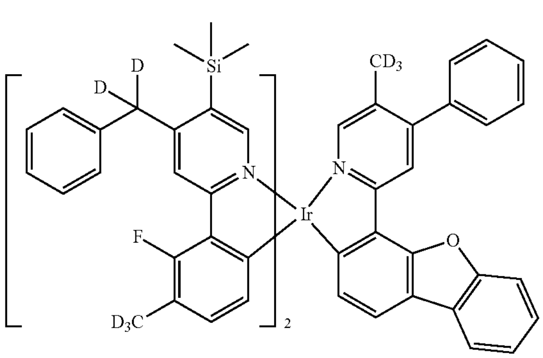
2116
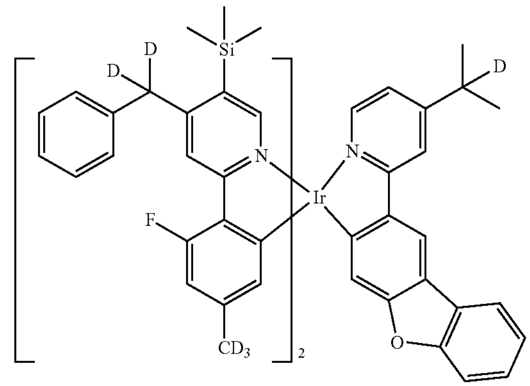
2117
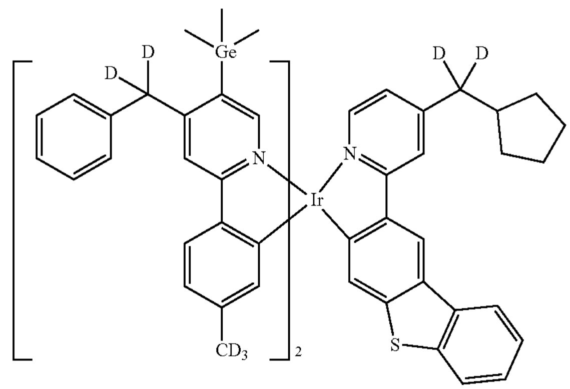
2118
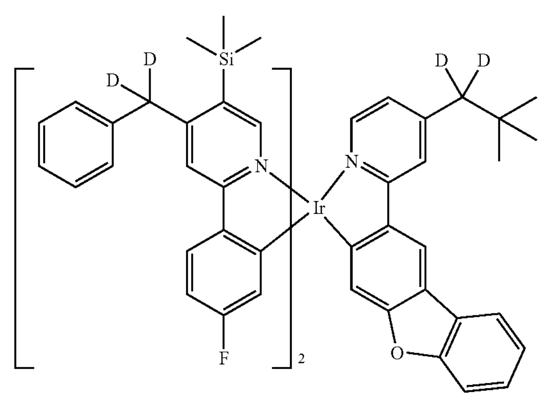

-continued
2119
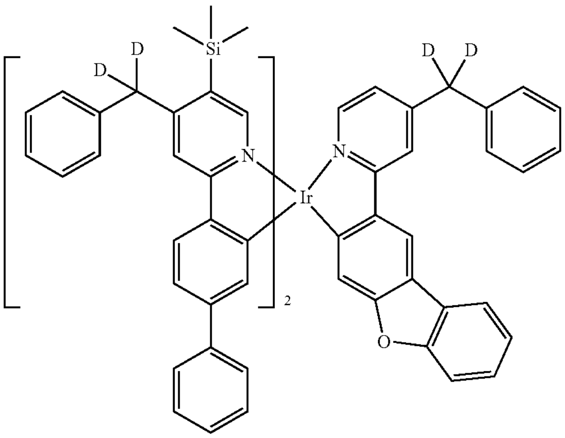
2120
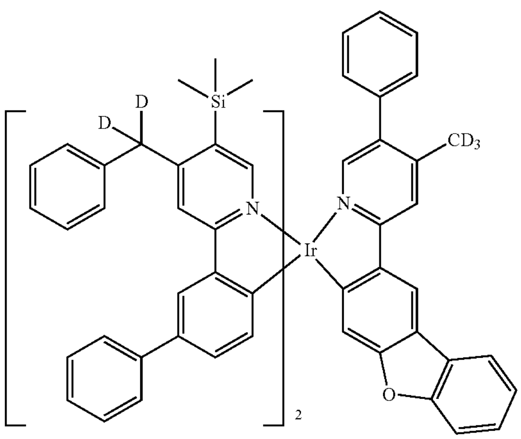
2121
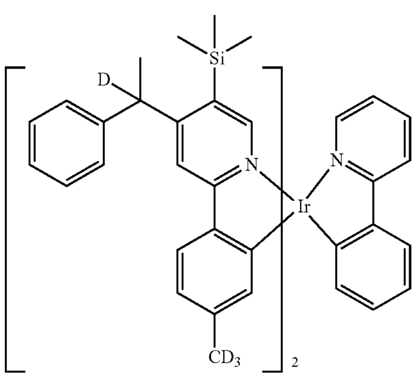
-continued
2122
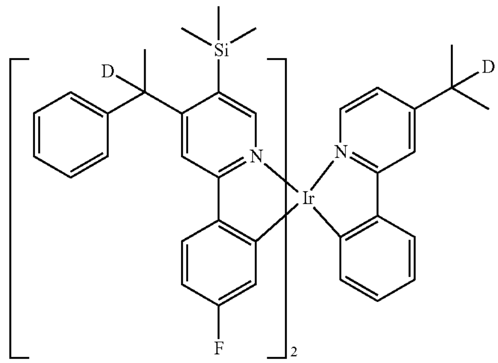
2123
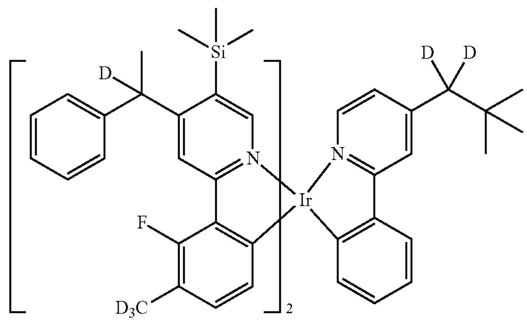
2124
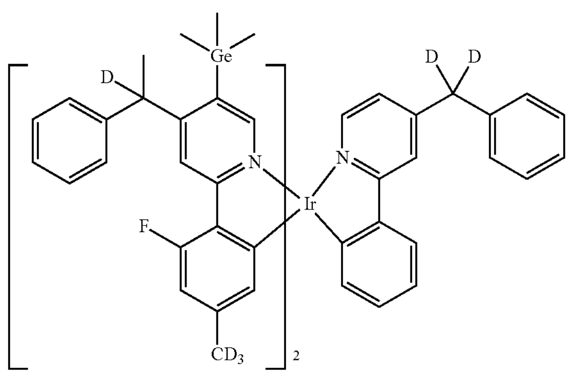
2125
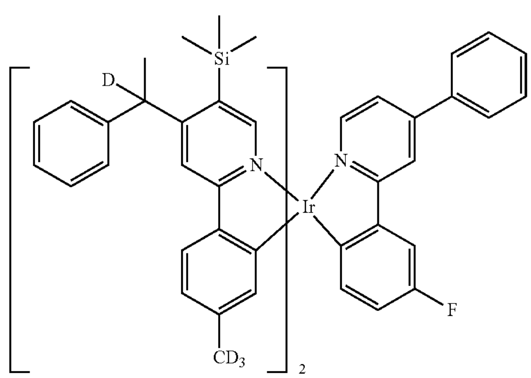

-continued
2126
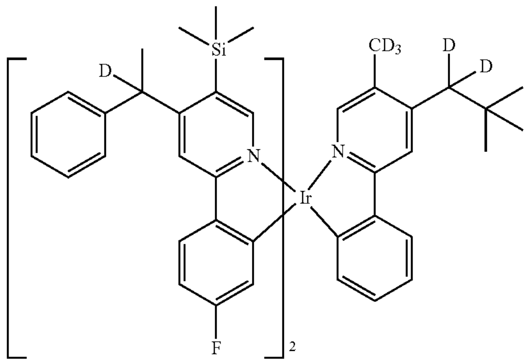
2127
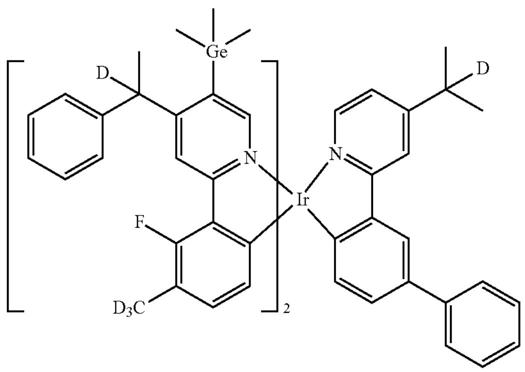
2128
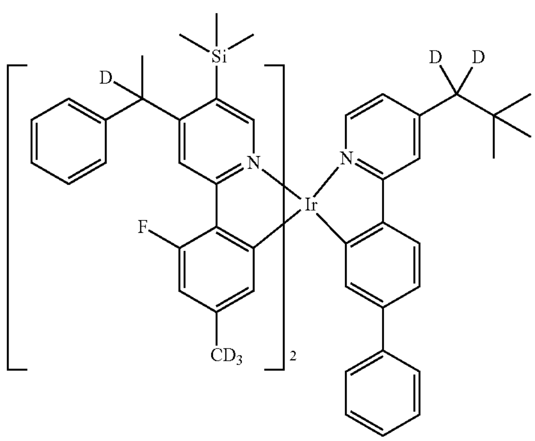
2129
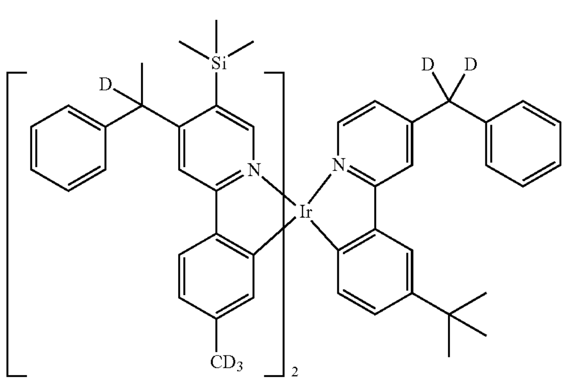
-continued
2130
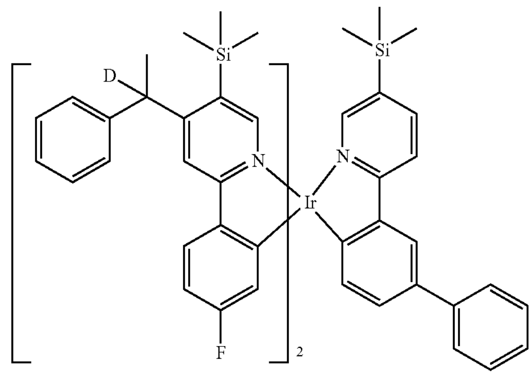
2131
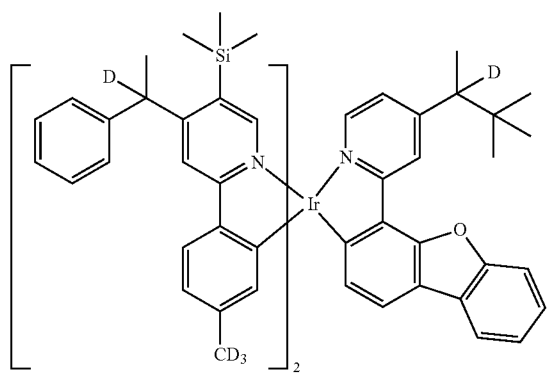
2132
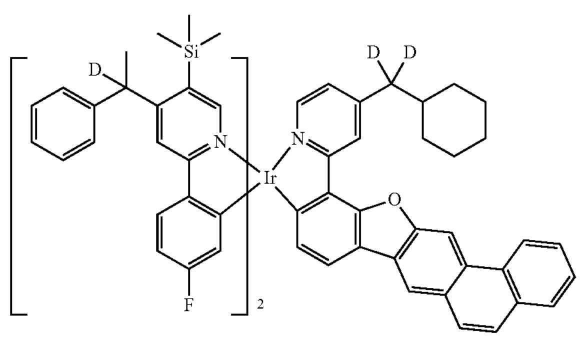
2133
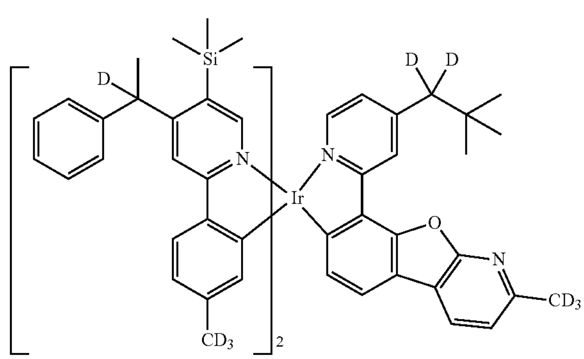

-continued
2134
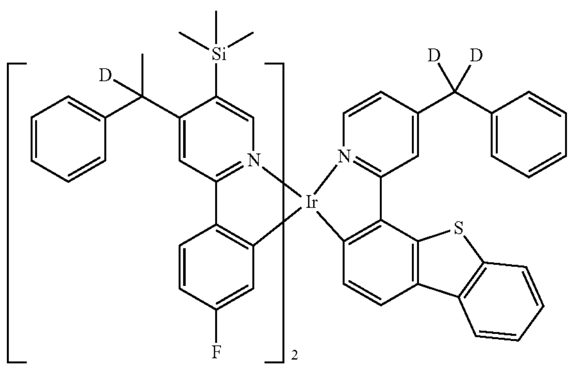
2135
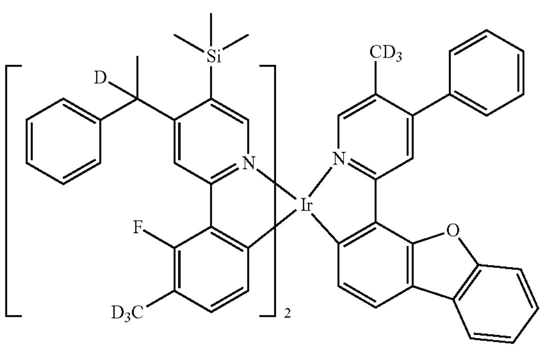
2136
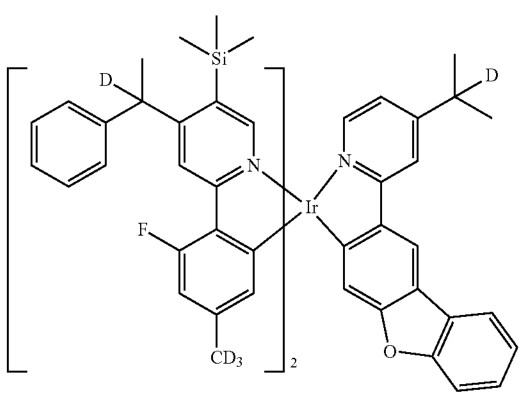
2137
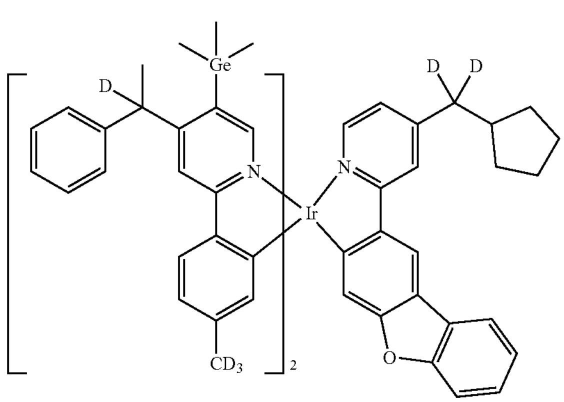
-continued
2138
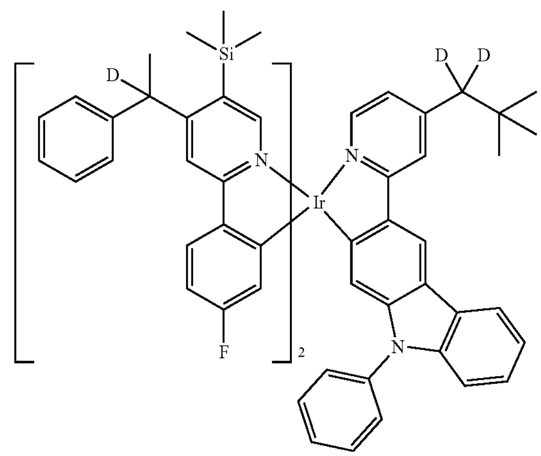
2139
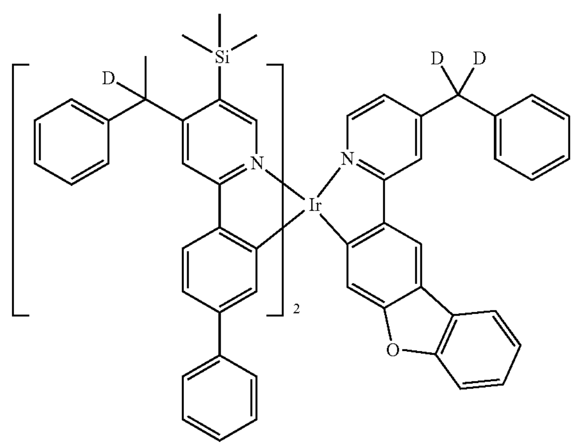
2140
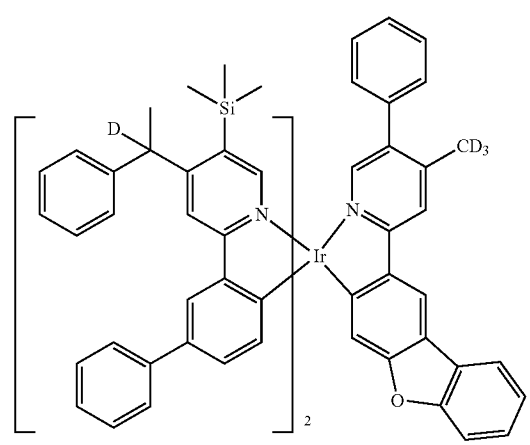

2141
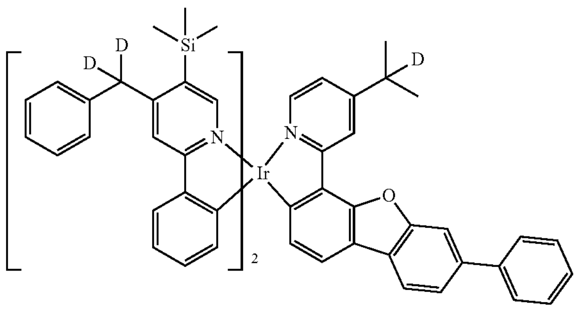
2142
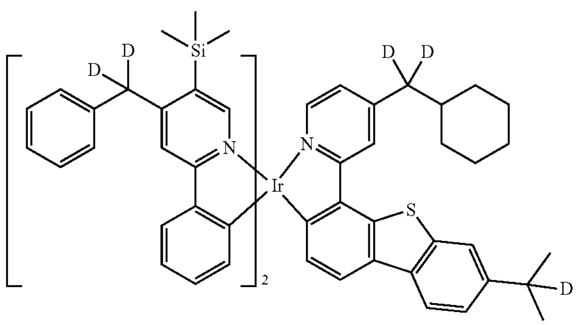
2143
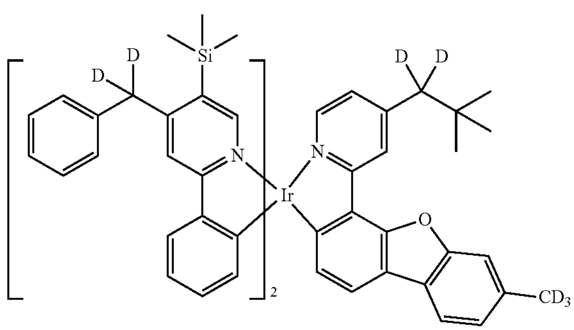
2144
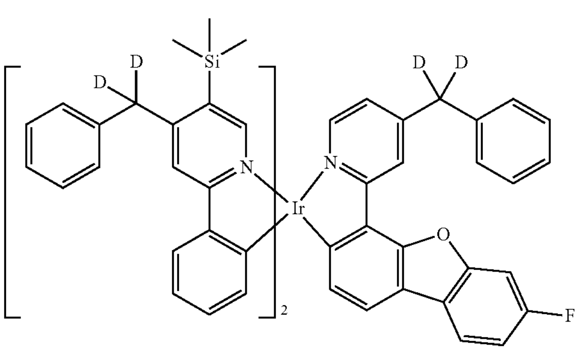
2145
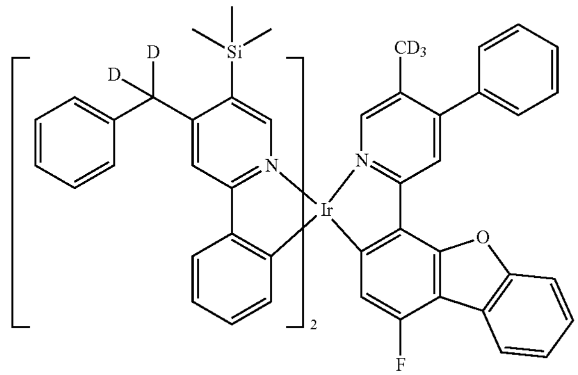
2146
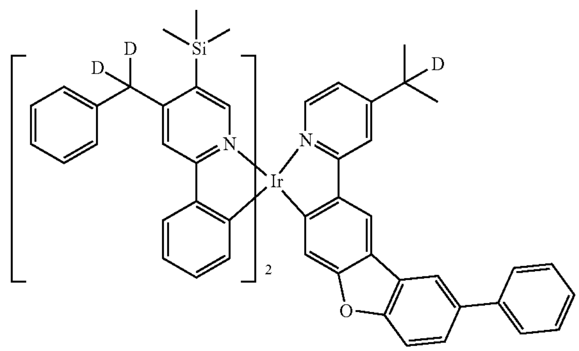
2147
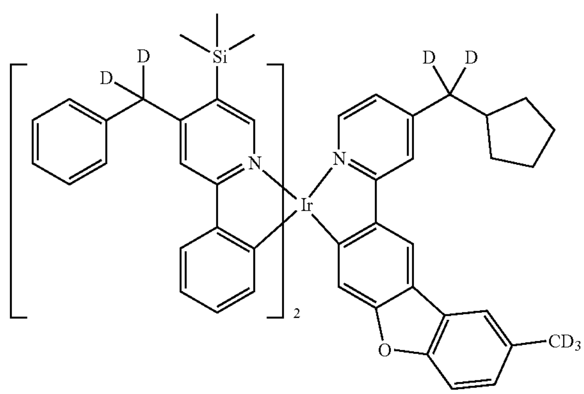
2148
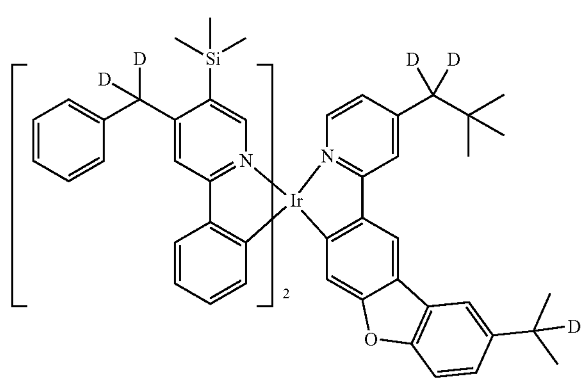

-continued
2149
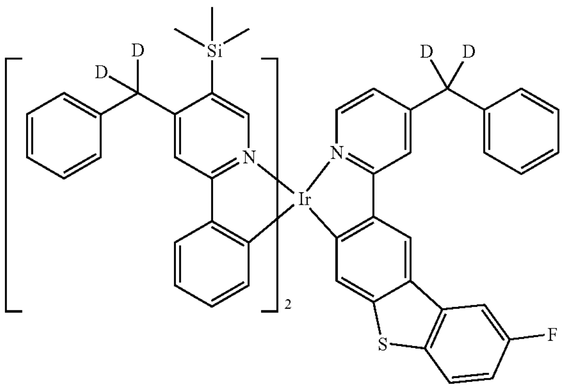
2150
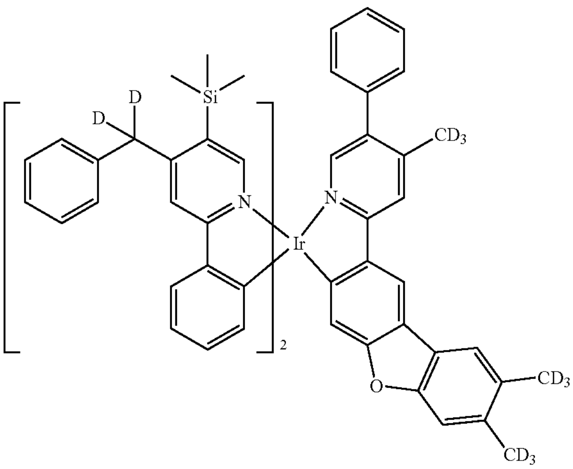
2151
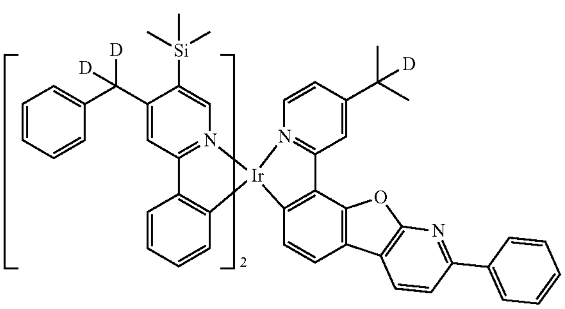
2152
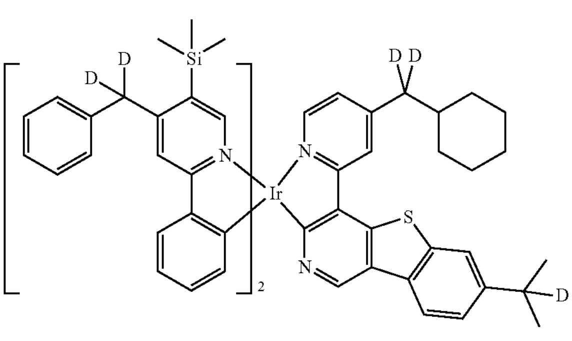
-continued
2153
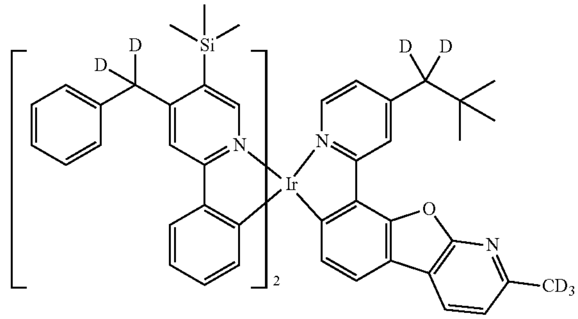
2154
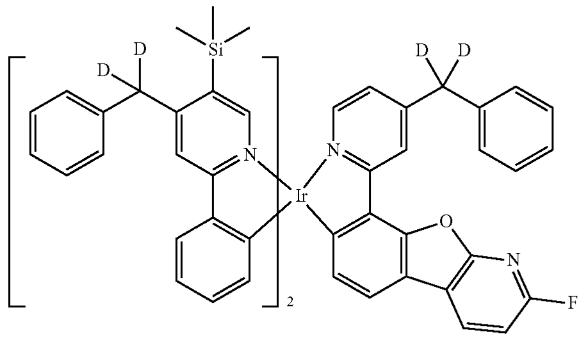
2155
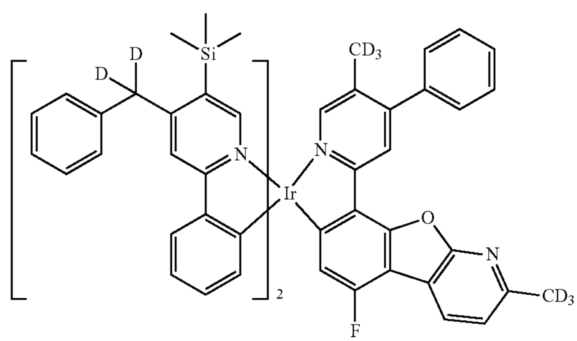
2156
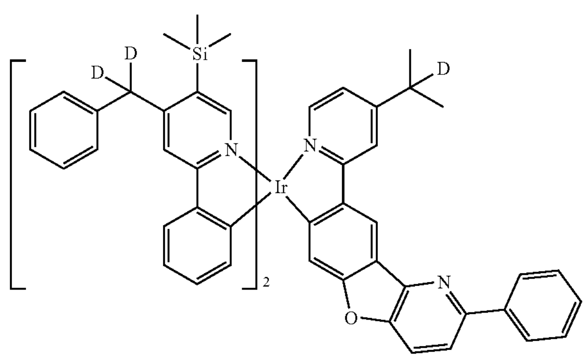

-continued
2157
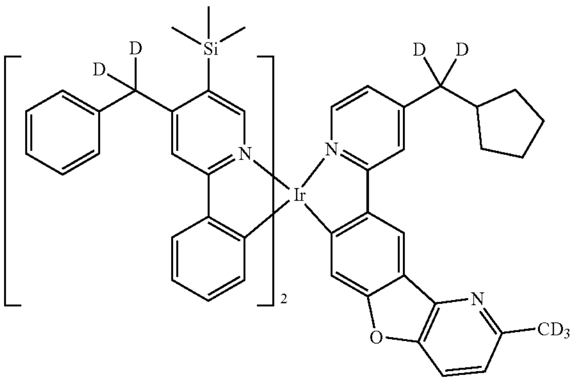
2158
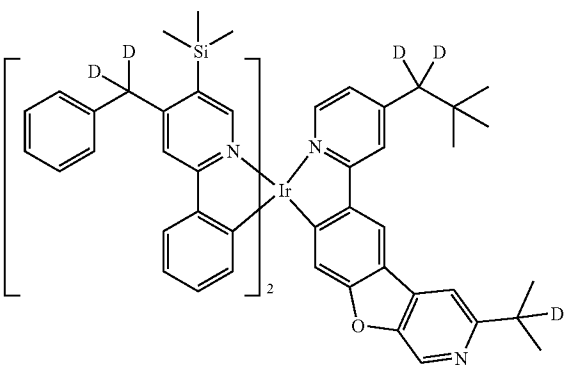
2159
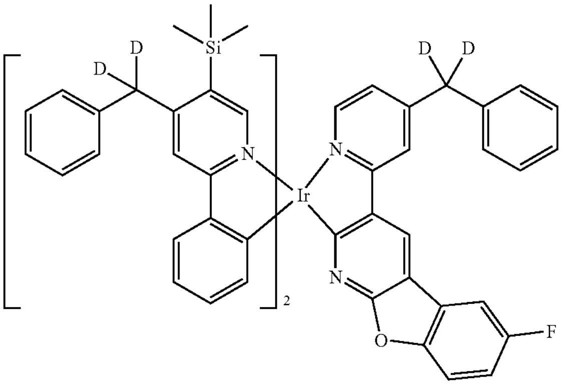
-continued
2160
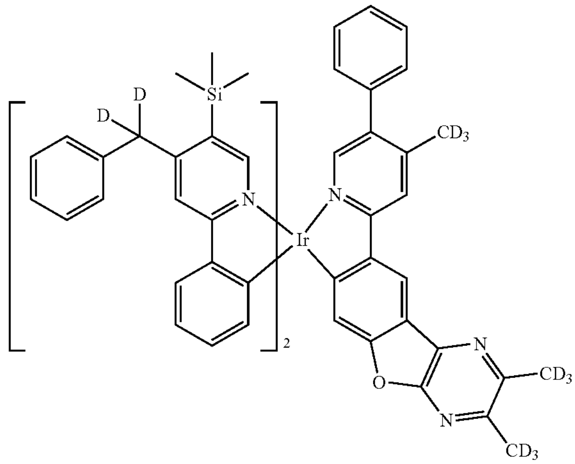
2161
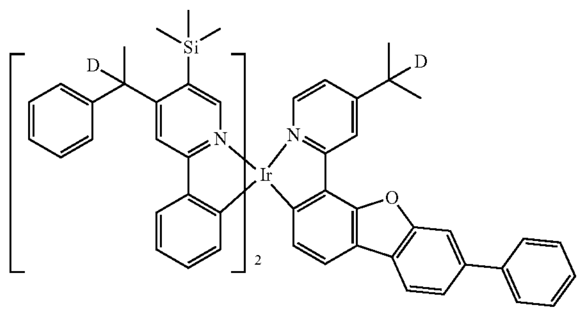
2162
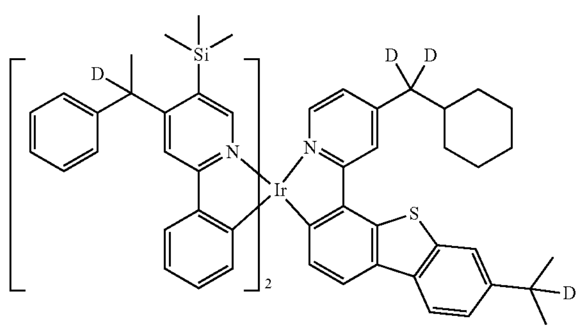
2163
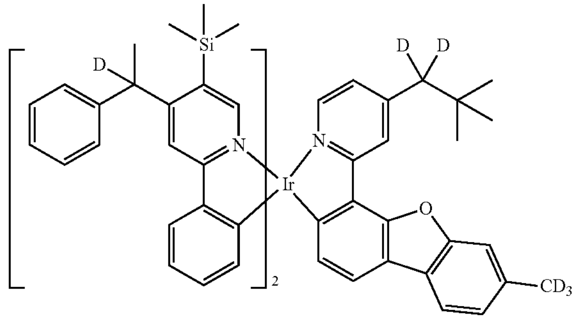

2164
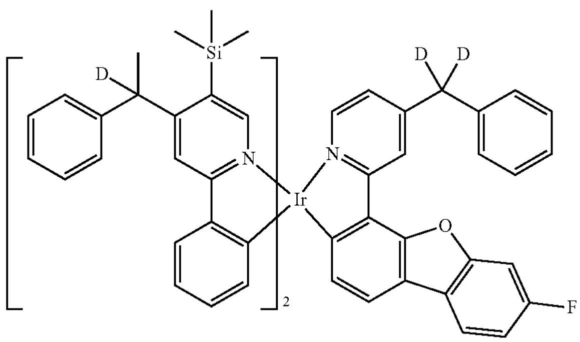
2165
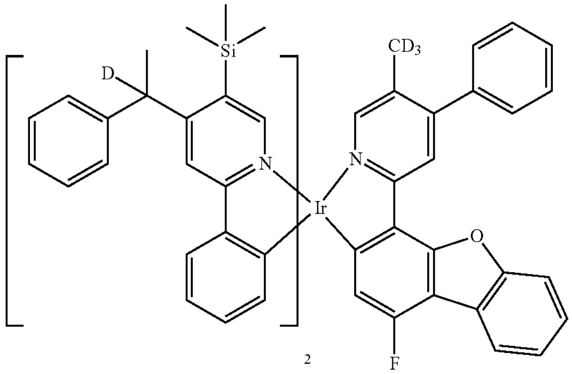
2166
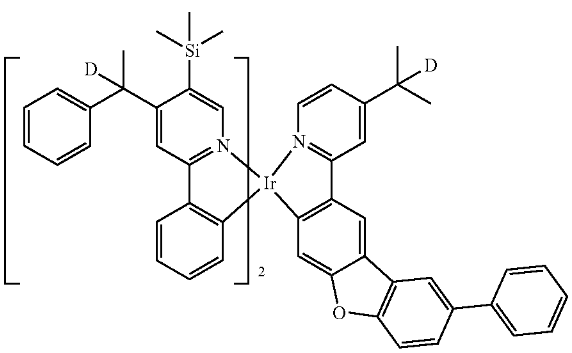
2167
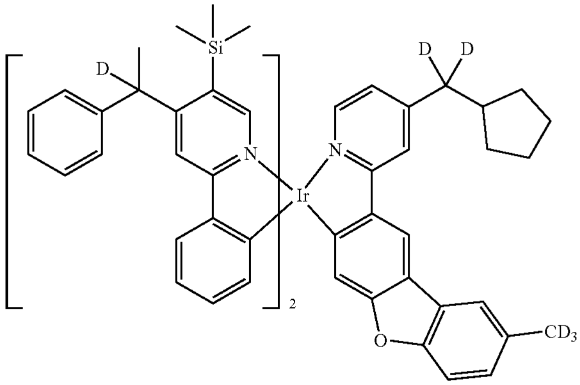
2168
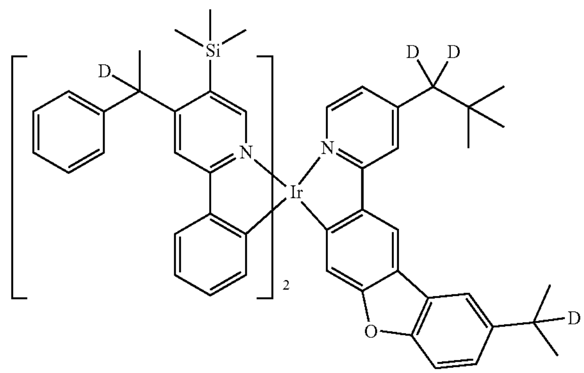
2169
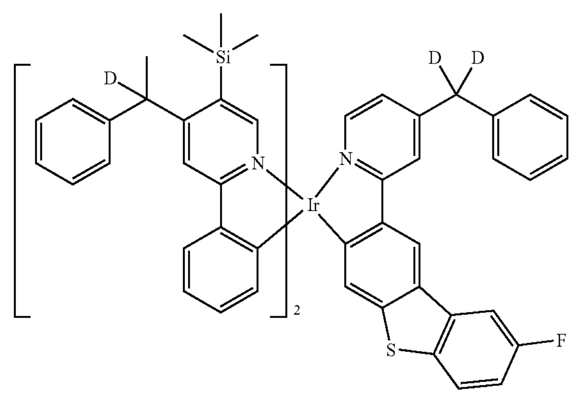
2170
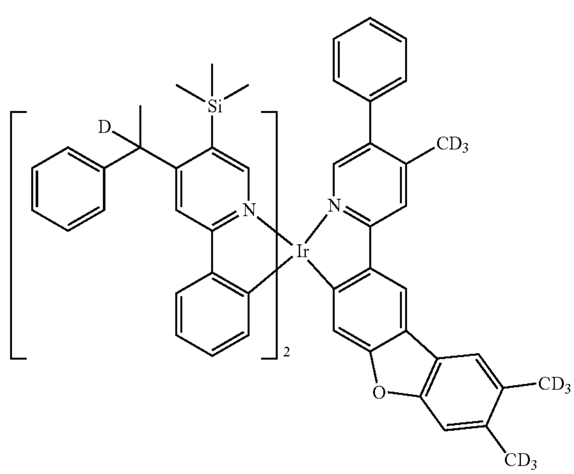
2171
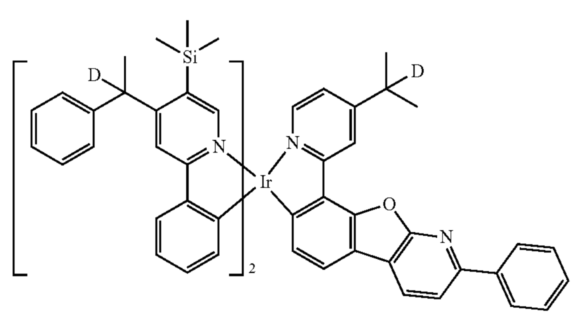

-continued
2172
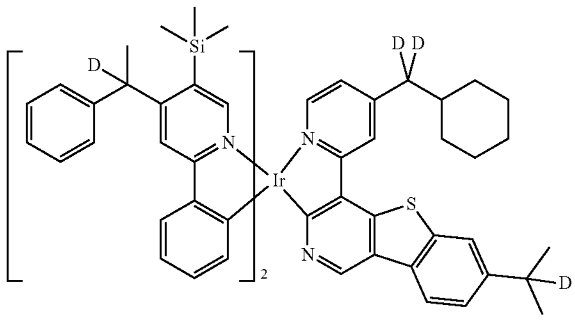
2173
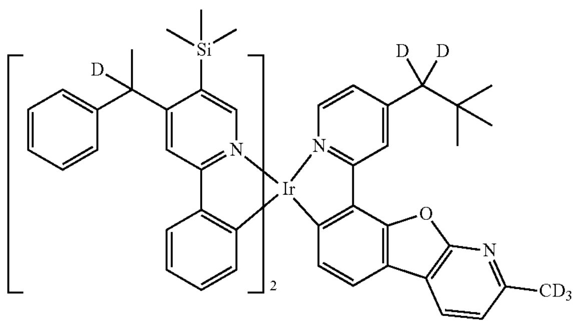
2174
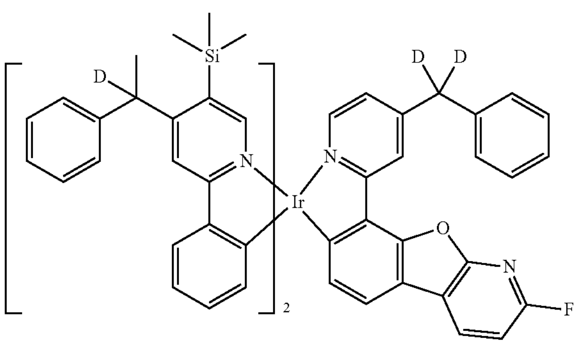
2175
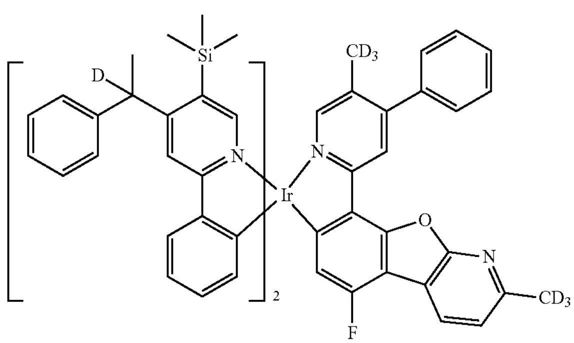
-continued
2176
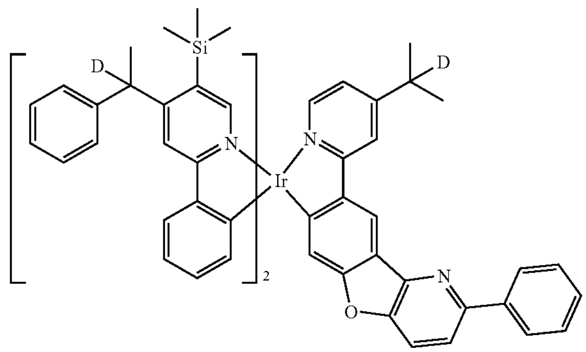
2177
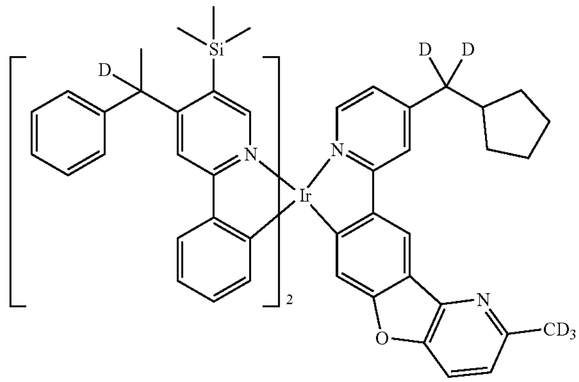
2178
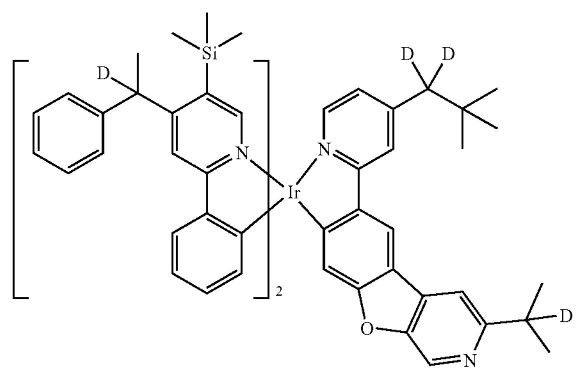
2179
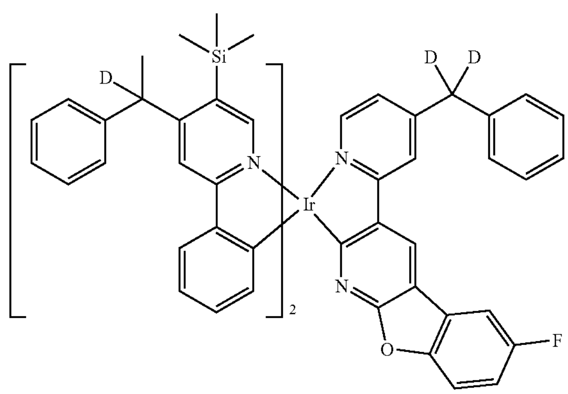

-continued
2180
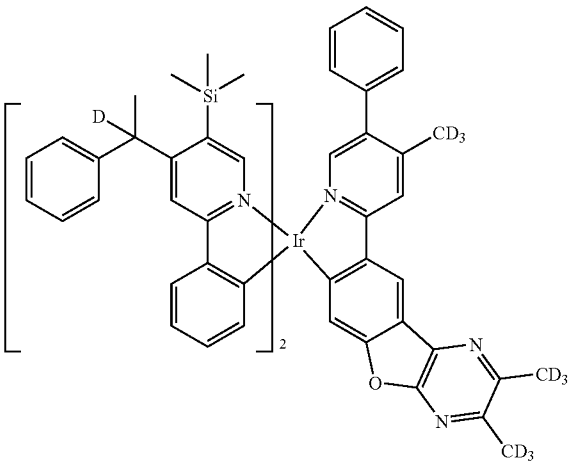
2181
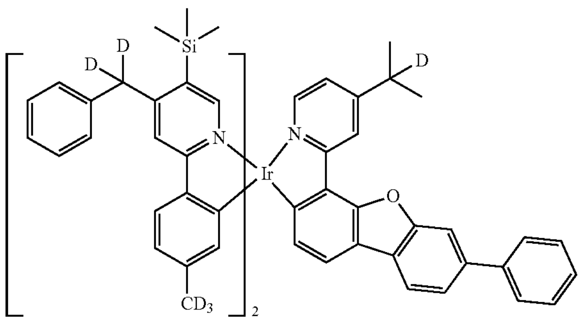
2182
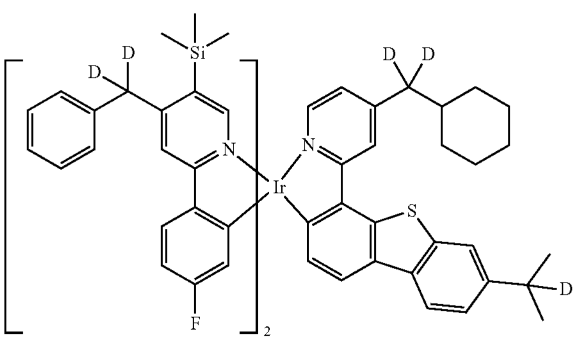
2183
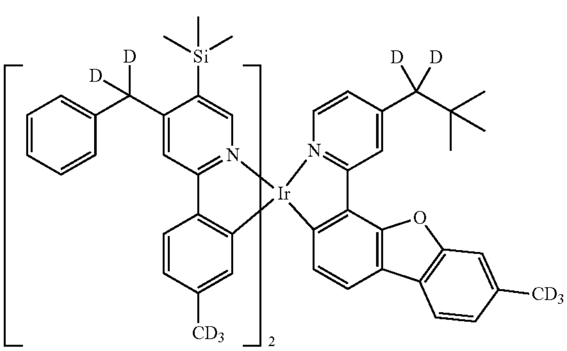
-continued
2184
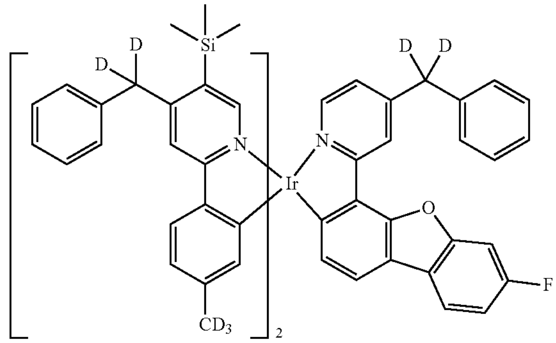
2185
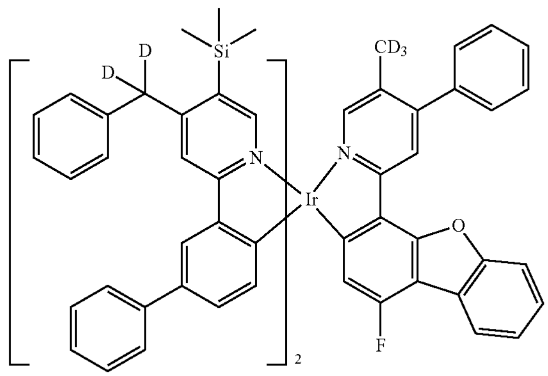
2186
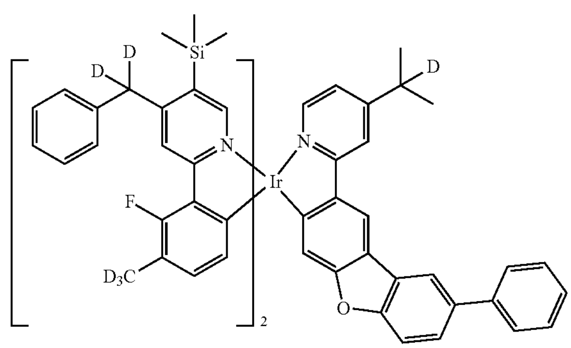
2187
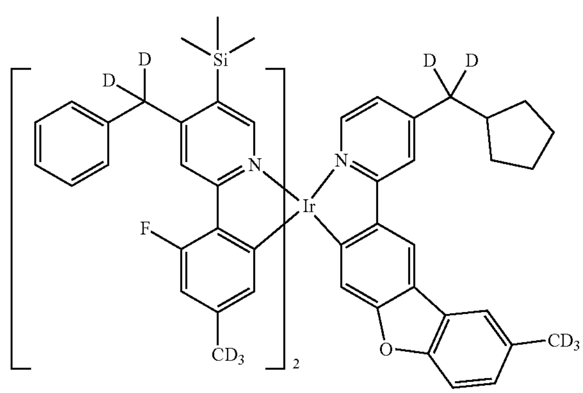

2188
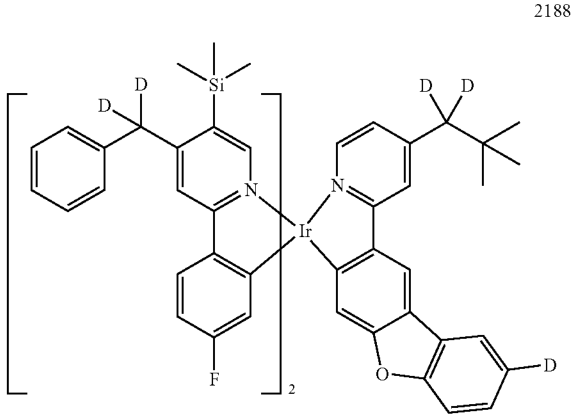
2189
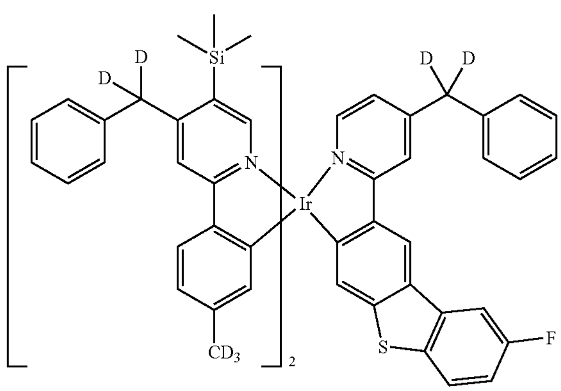
2190
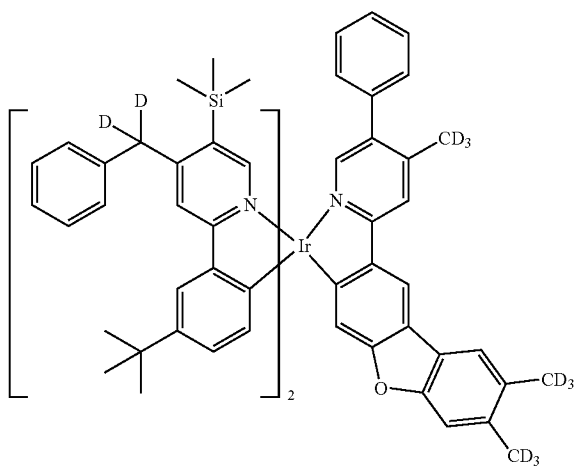
2191
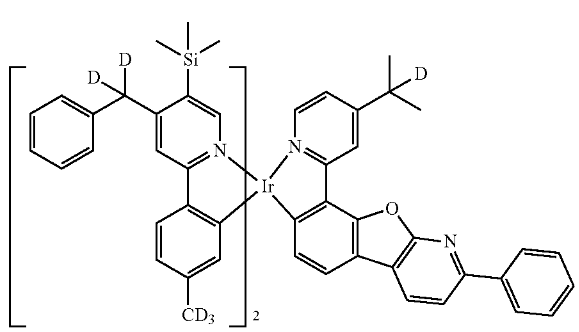
2192
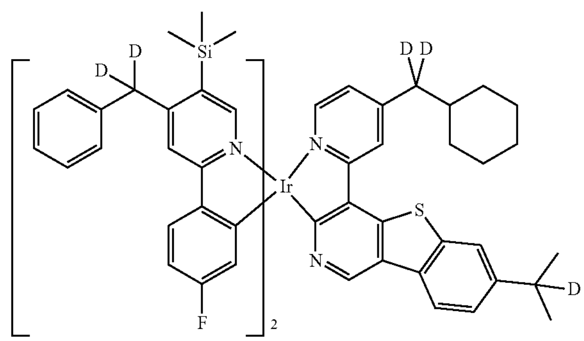
2193
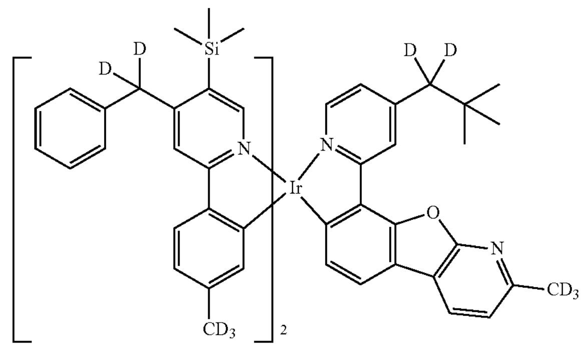
2194
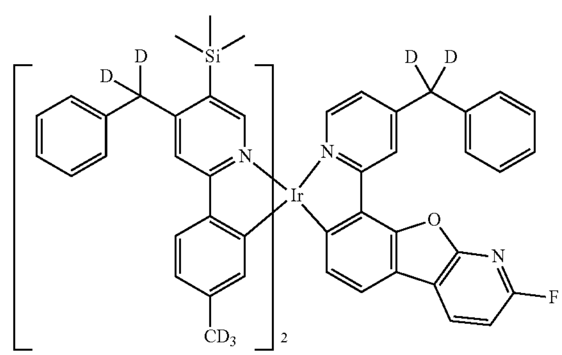
2195
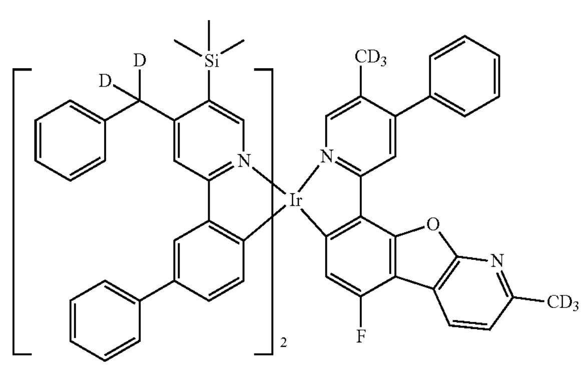

-continued
2196
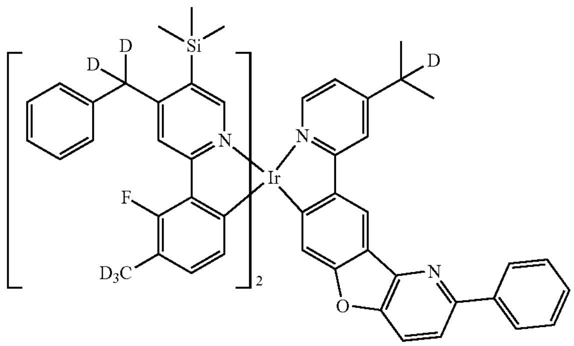
2197
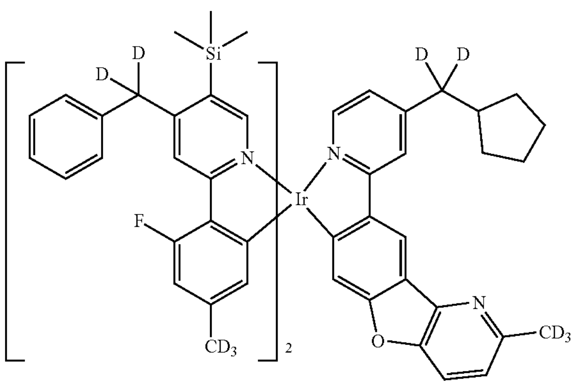
2198
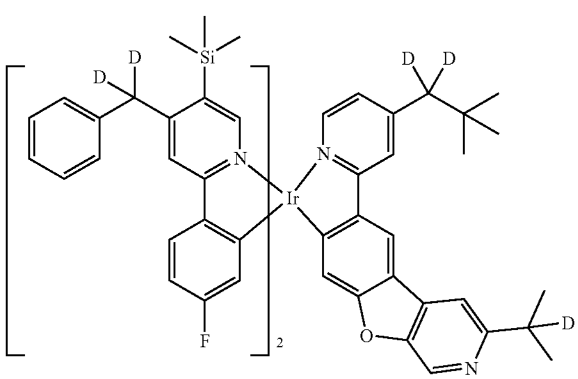
2199
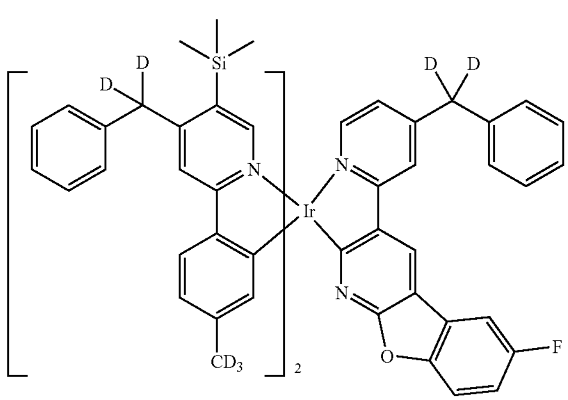
-continued
2200
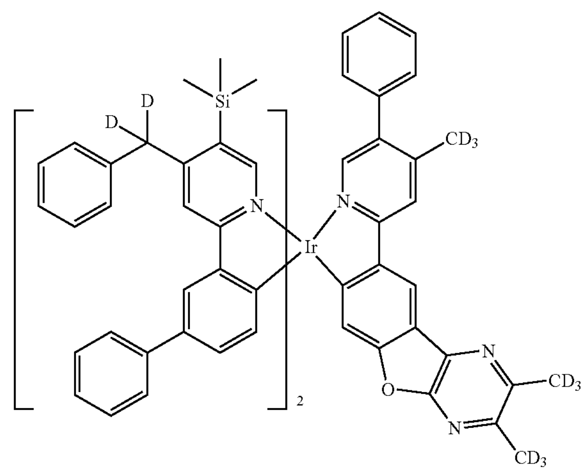
2201
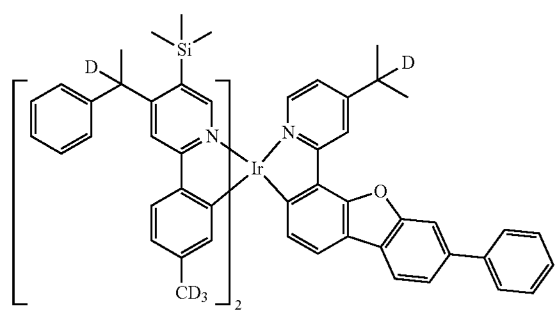
2202
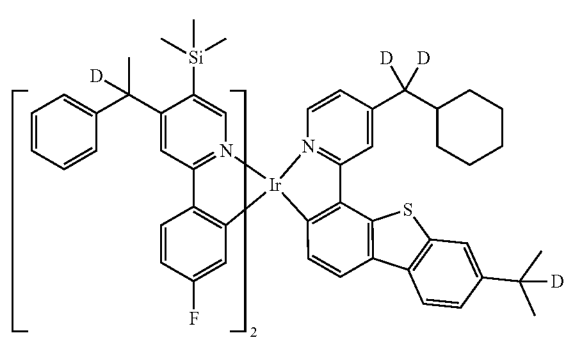
2203
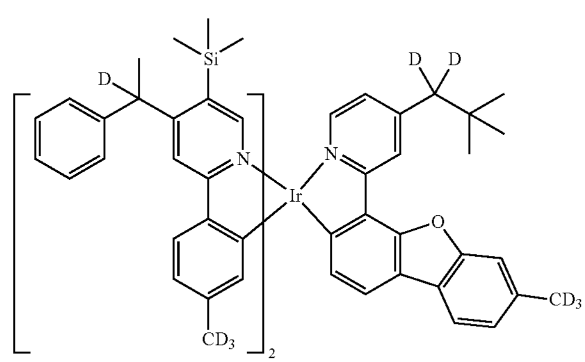

-continued
2204
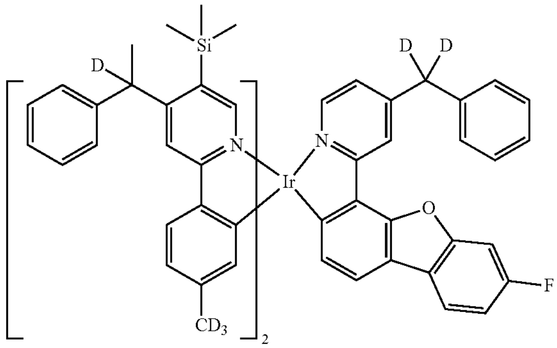
2205
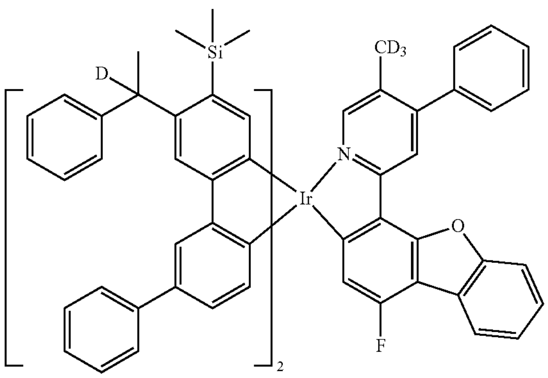
2206
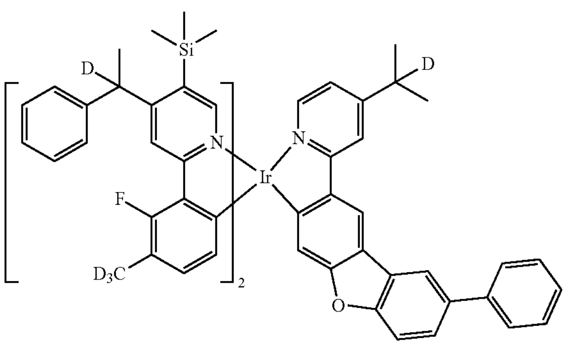
2207
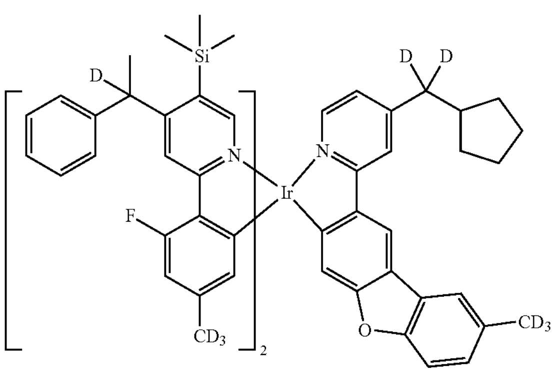
-continued
2208
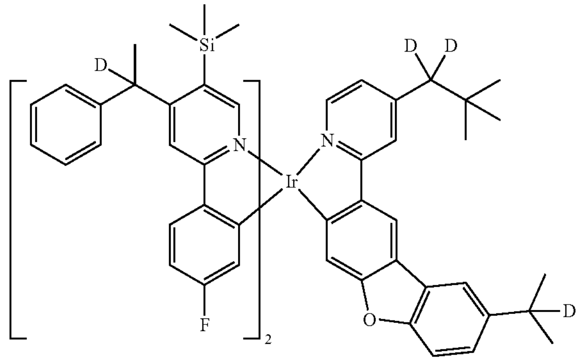
2209
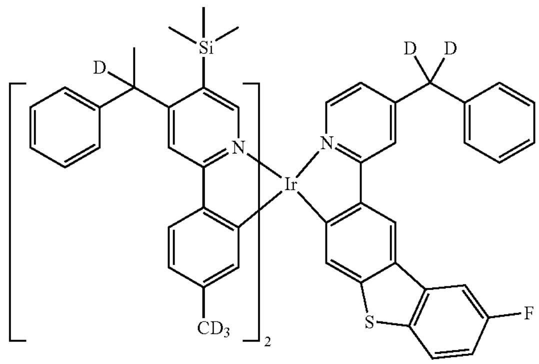
2210
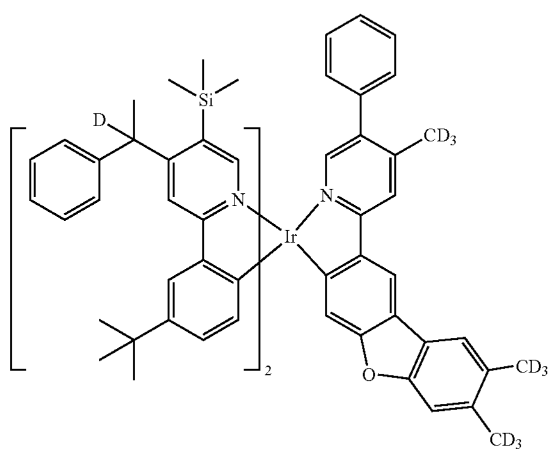
2211
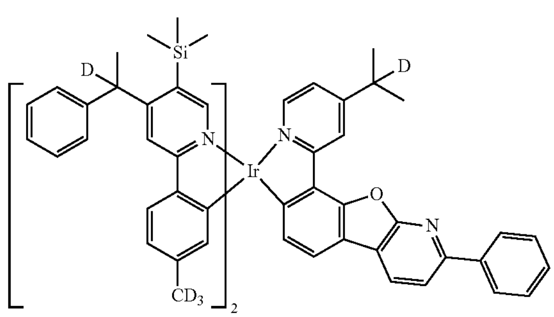

-continued
2212
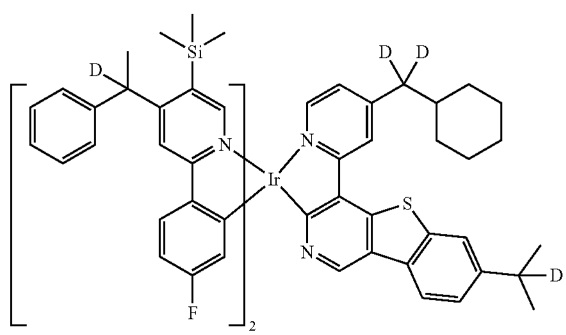
2213
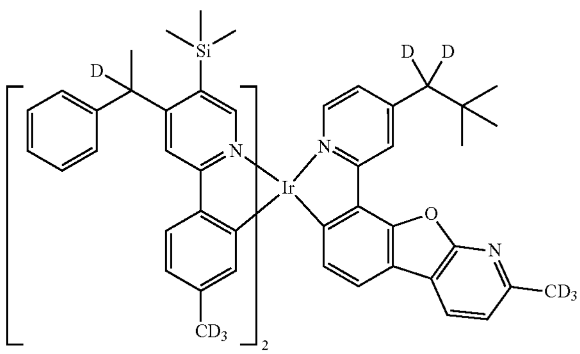
2214
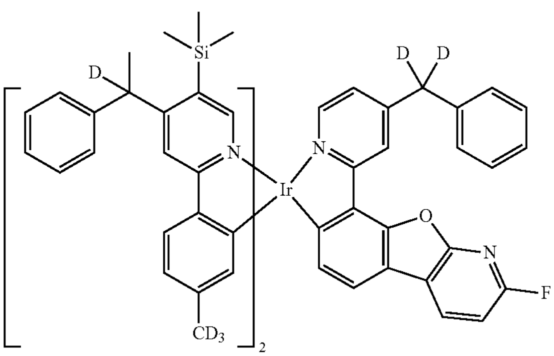
2215
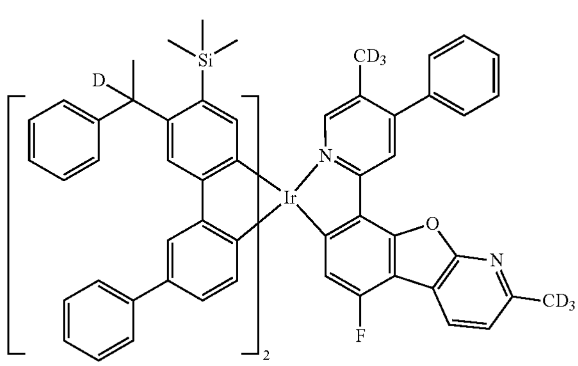
-continued
2216
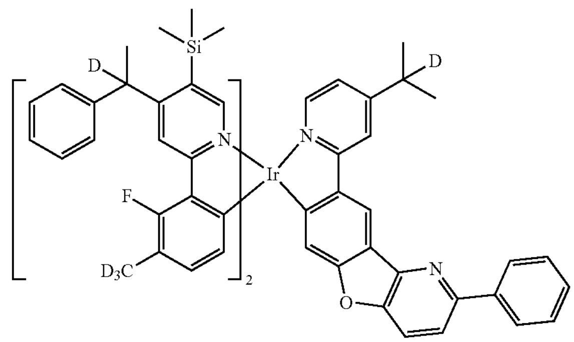
2217
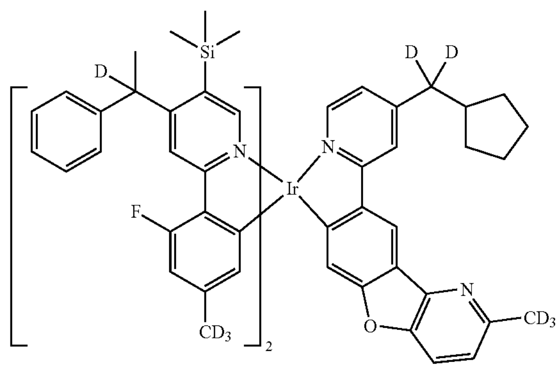
2218
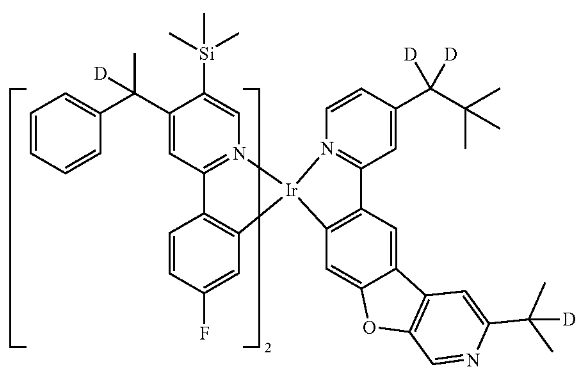
2219
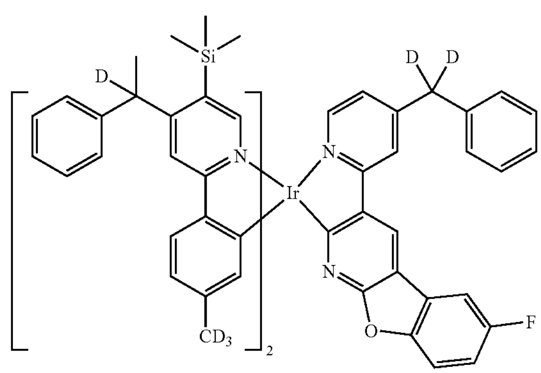

-continued
2220
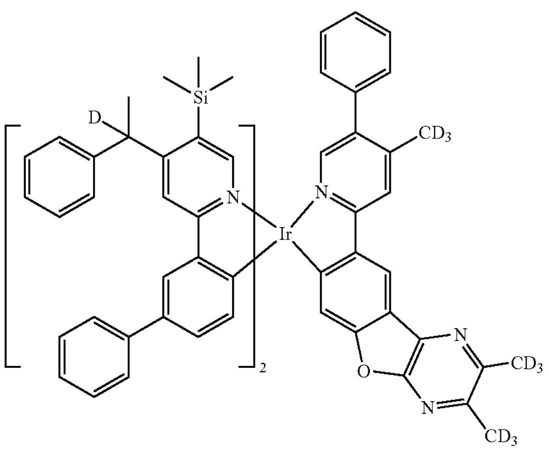
2221
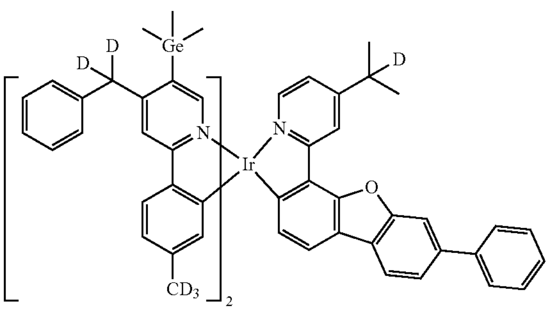
2222
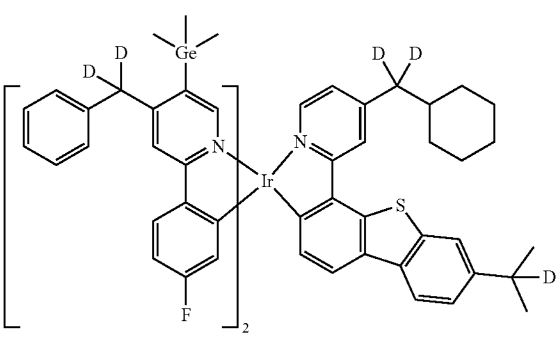
2223
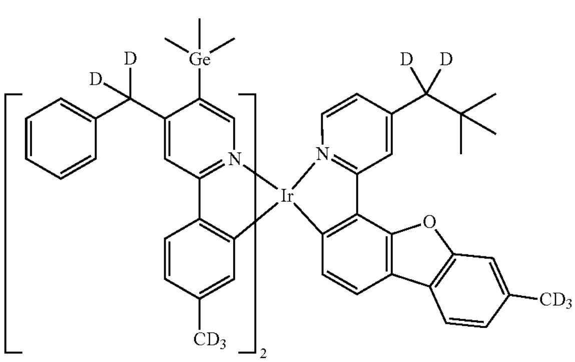
-continued
2224
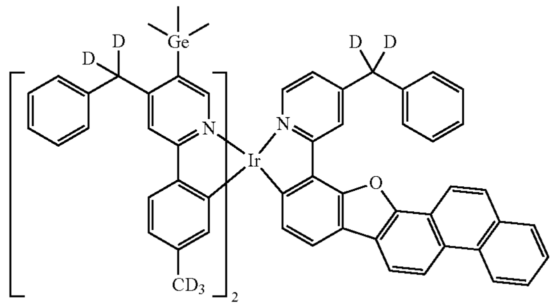
2225
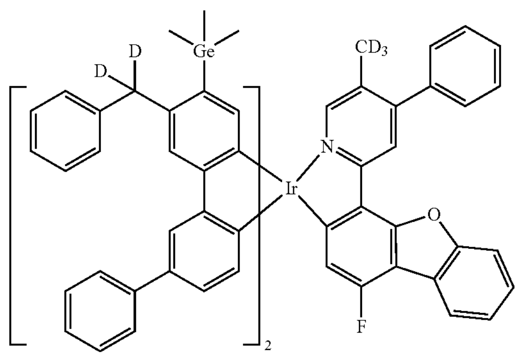
2226
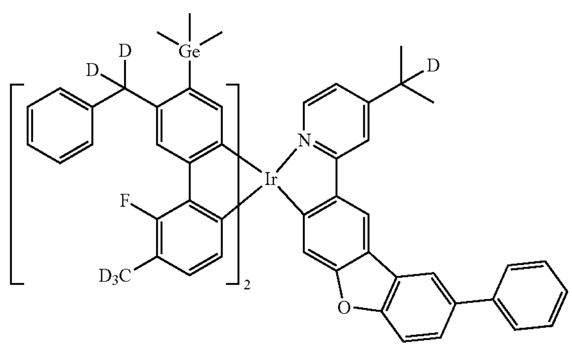
2227
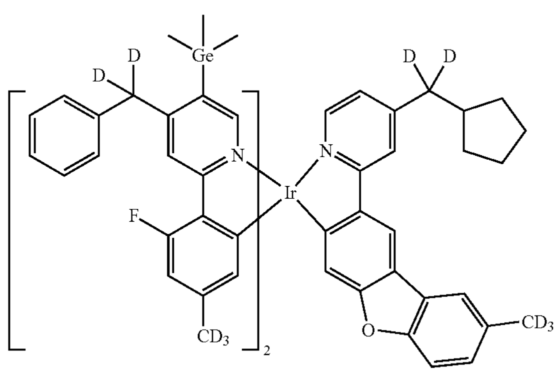

-continued
2228
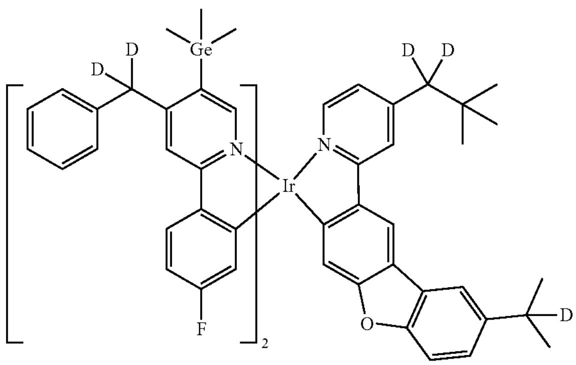
2229
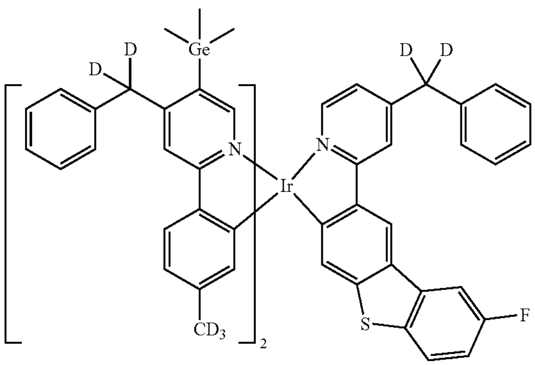
2230
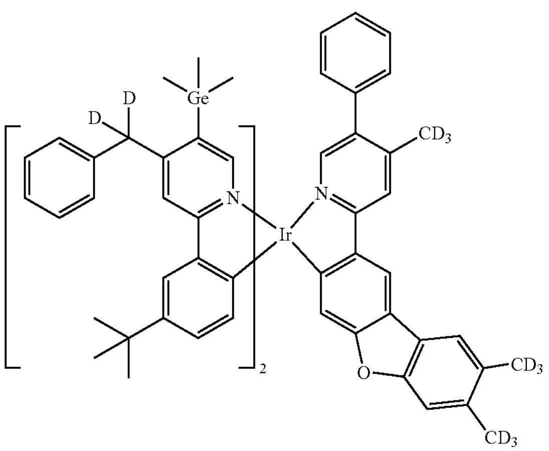
2231
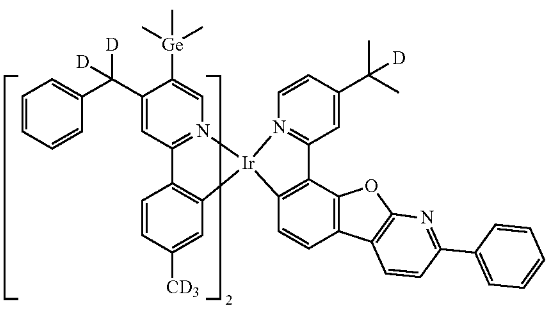
-continued
2232
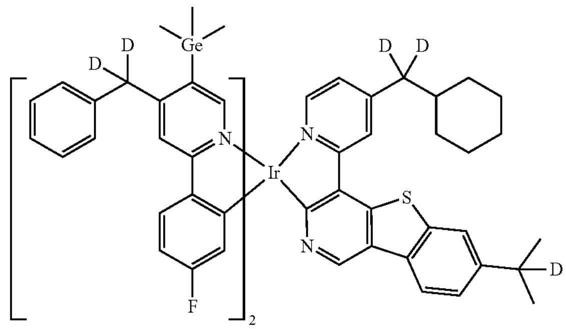
2233
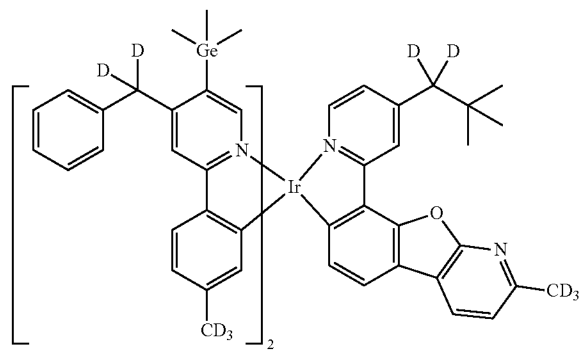
2234
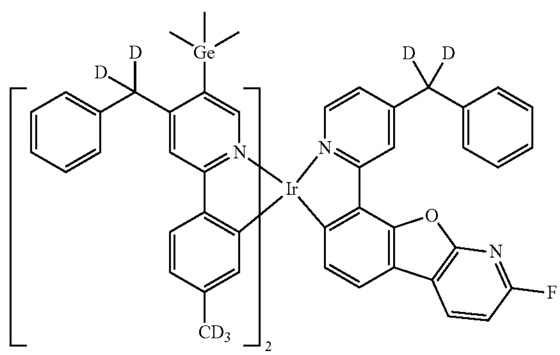
2235
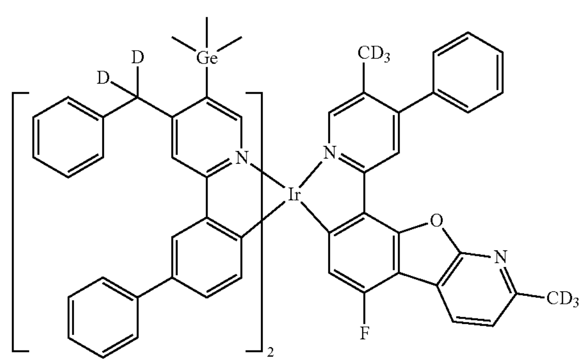

-continued
2236
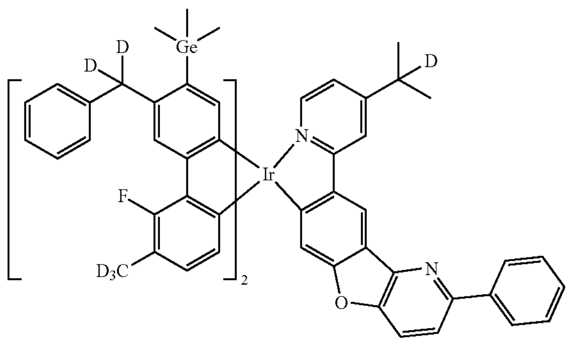
2237
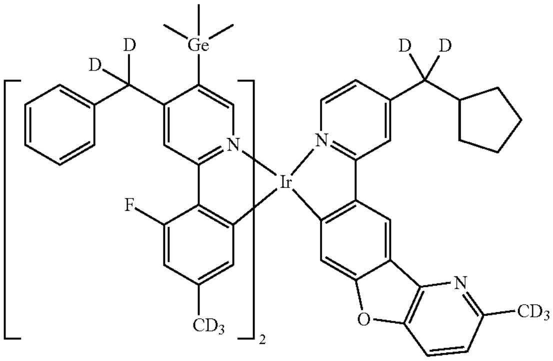
2238
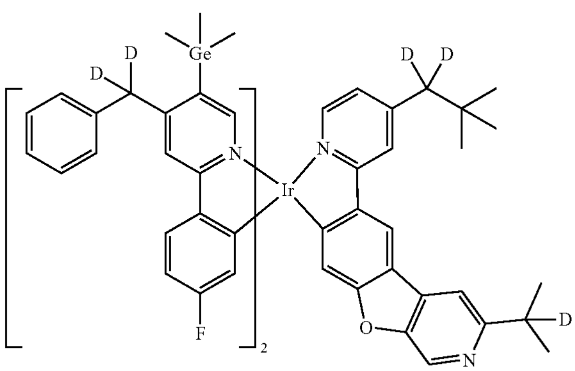
2239
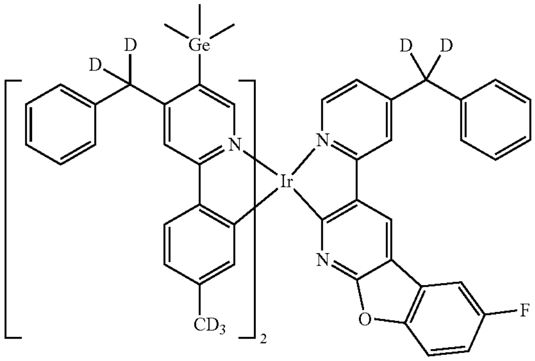
-continued
2240
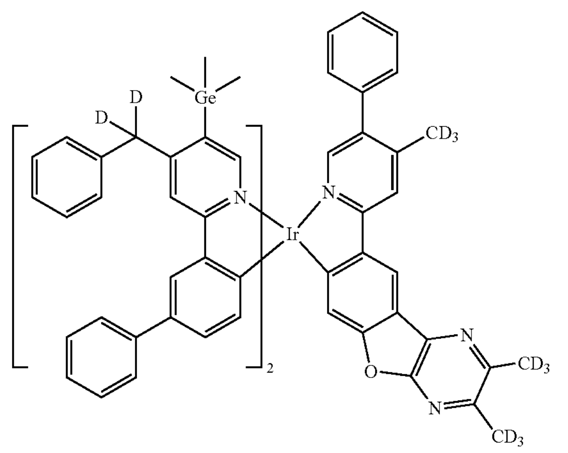
2241
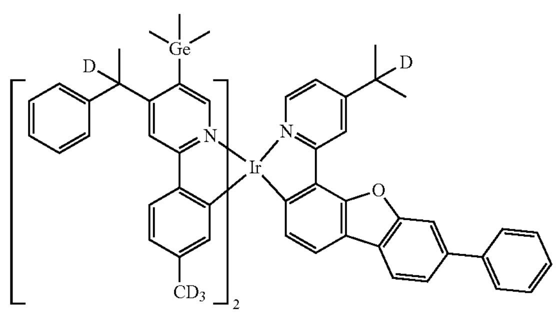
2242
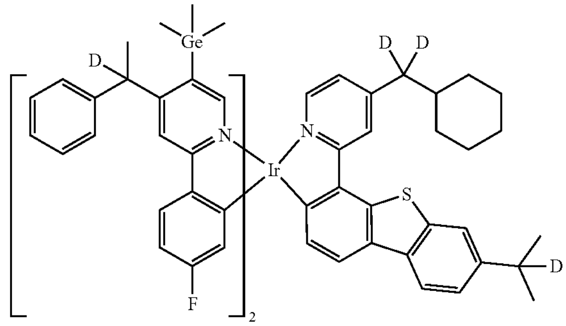
2243
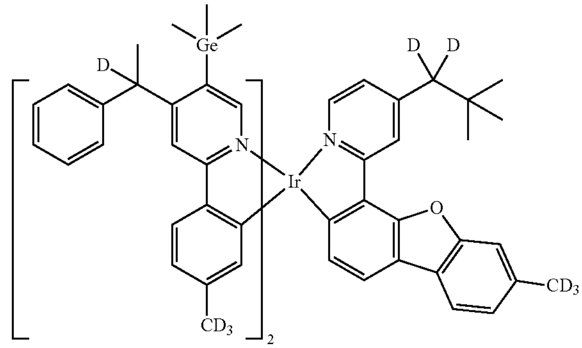

-continued
2244
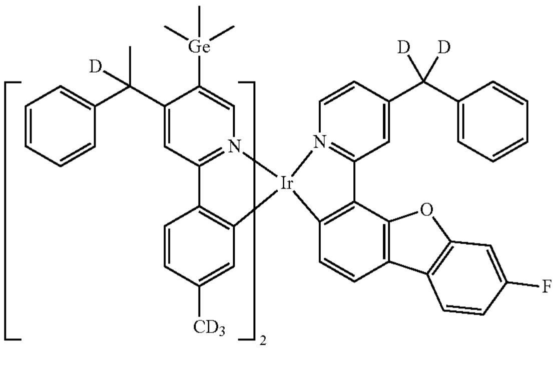
2245
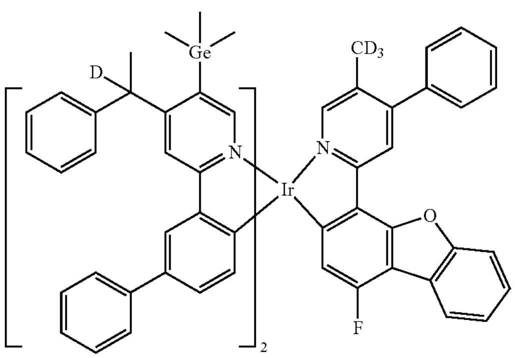
2246
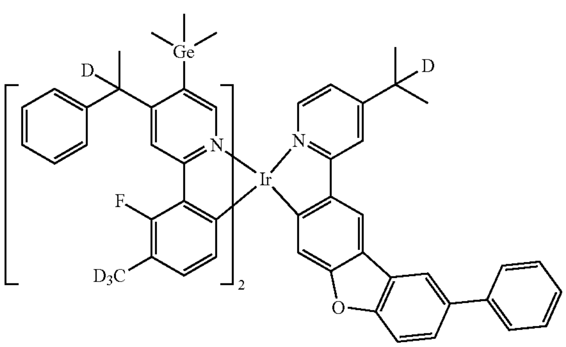
2247
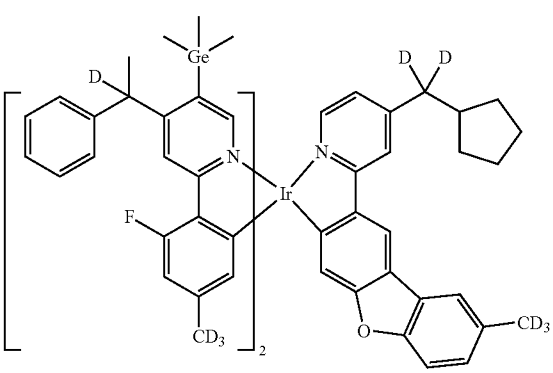
-continued
2248
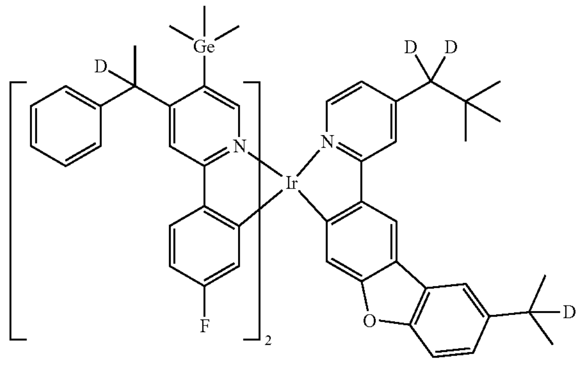
2249
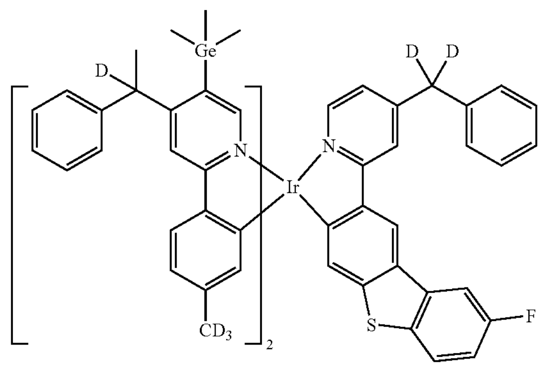
2250
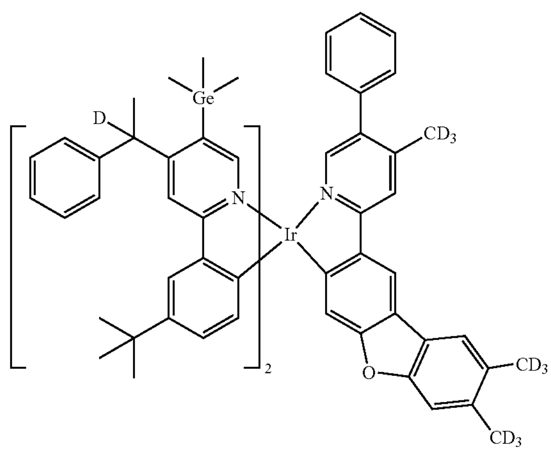
2251
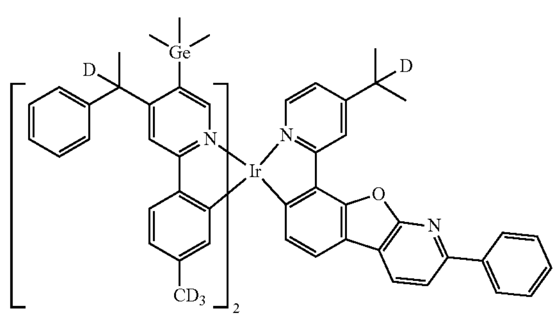

-continued
2252
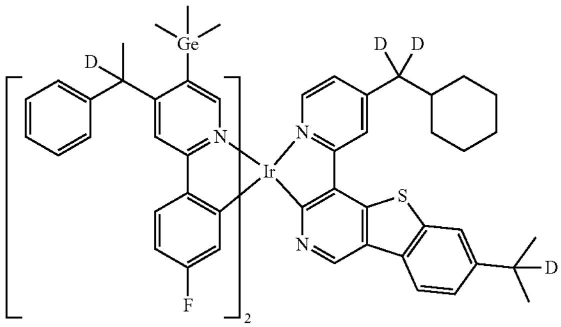
2253
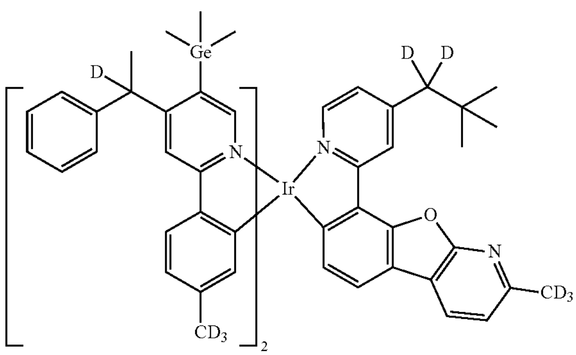
2254
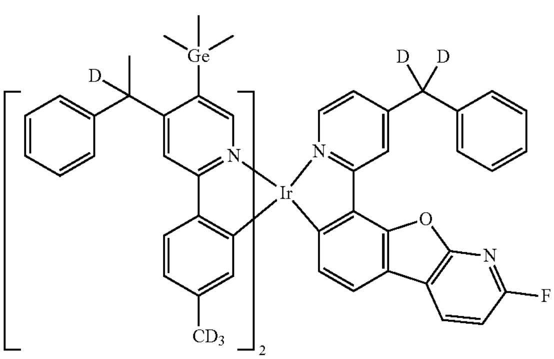
2255
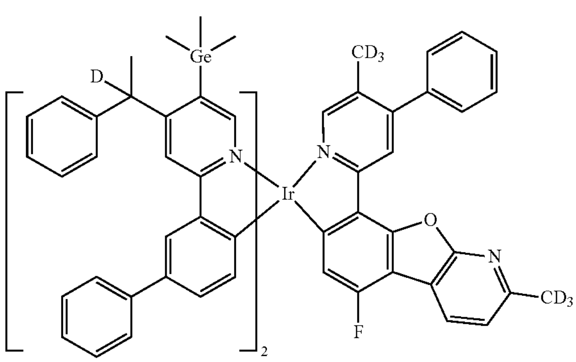
-continued
2256
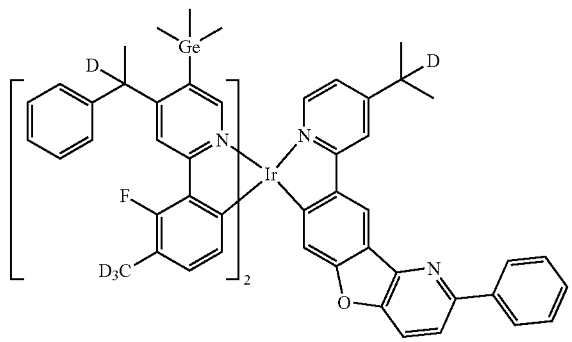
2257
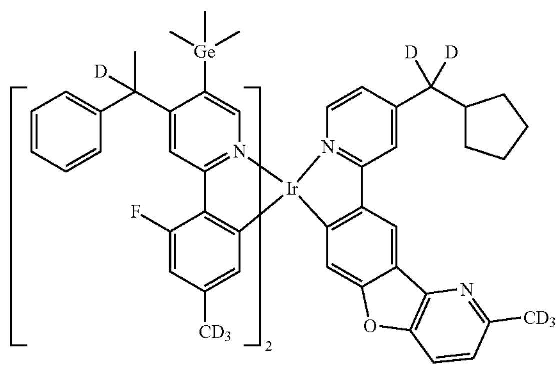
2258
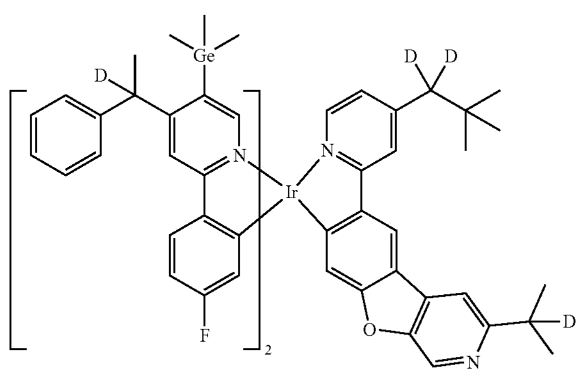
2259
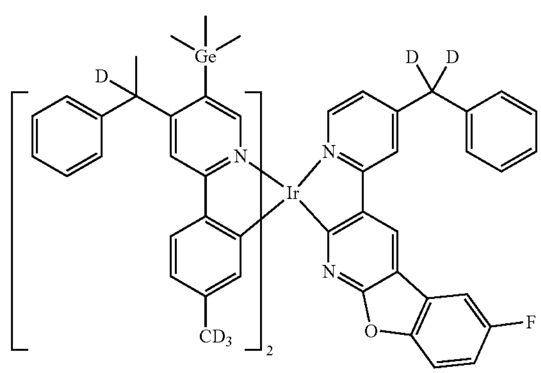

-continued
2260
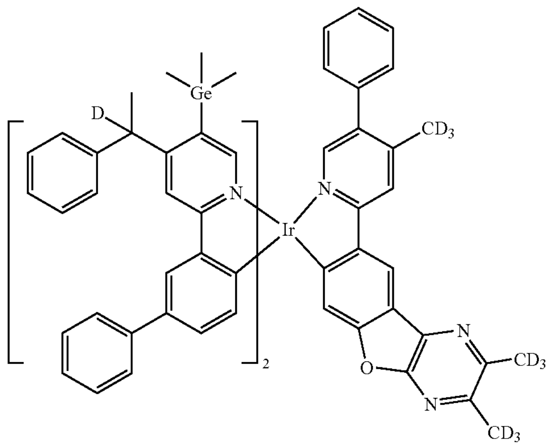
2261
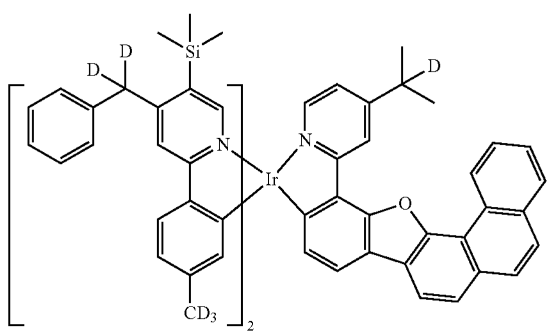
2262
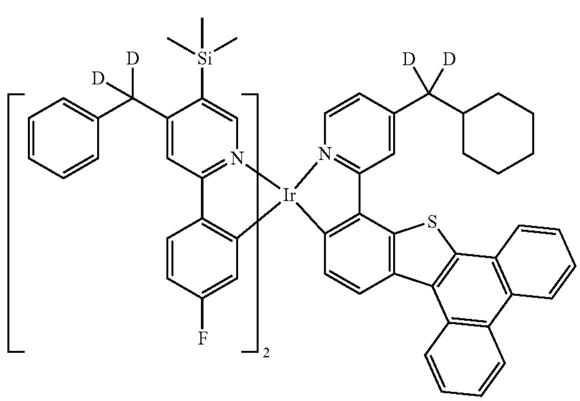
2263
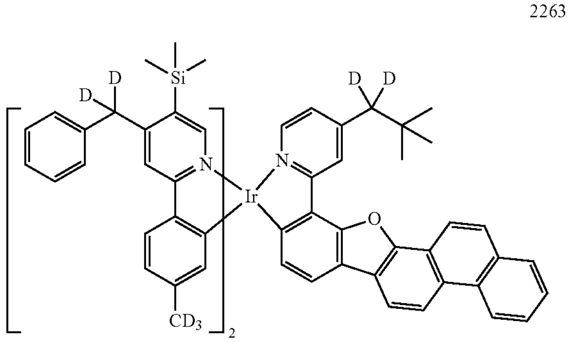
-continued
2264
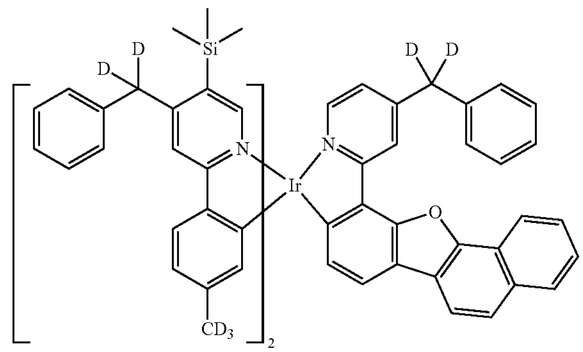
2265
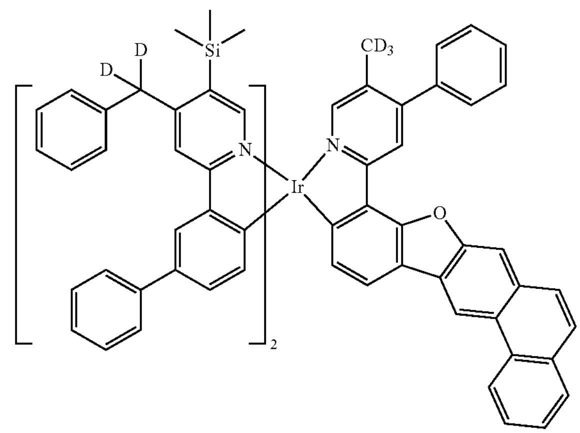
2266
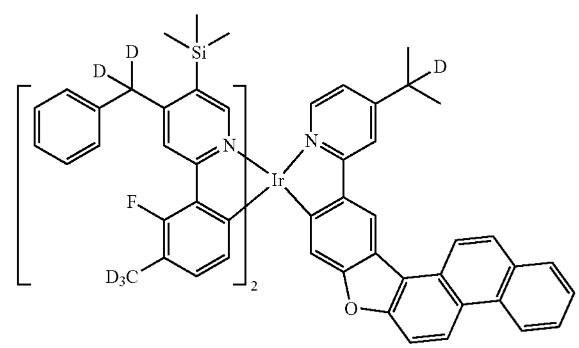
2267
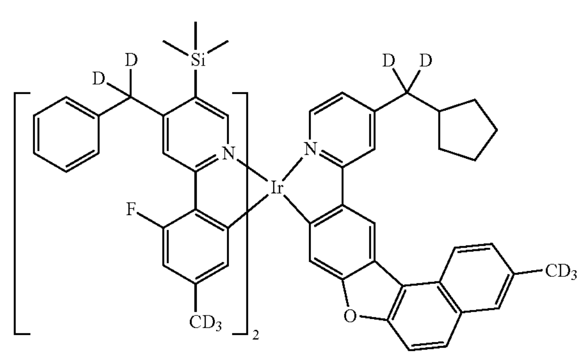

-continued
2268
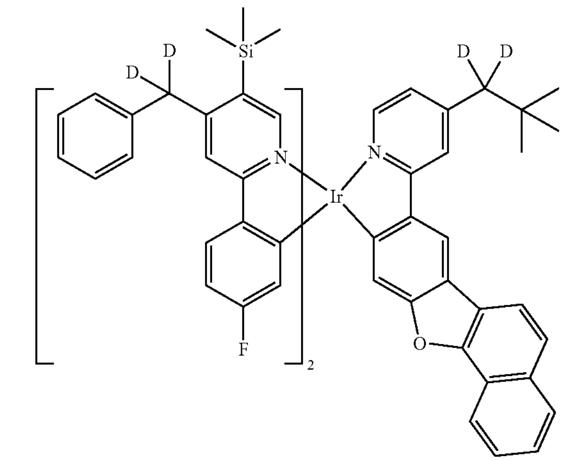
2269
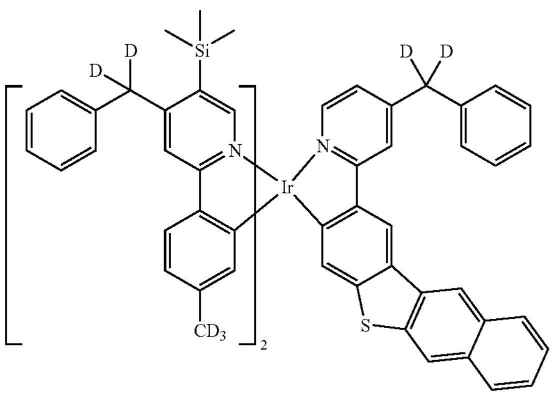
2270
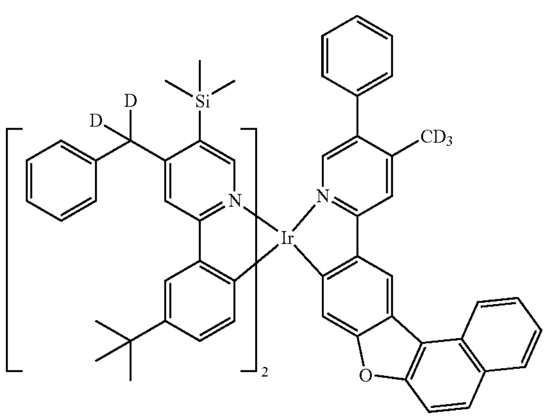
2271
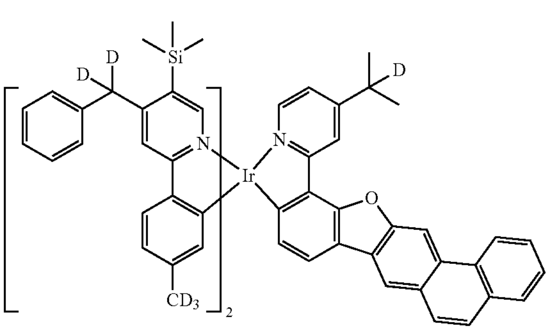
-continued
2272
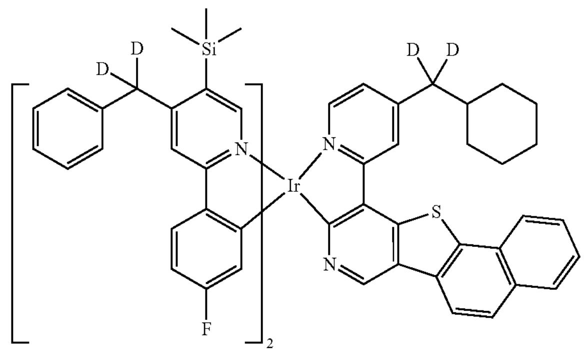
2273
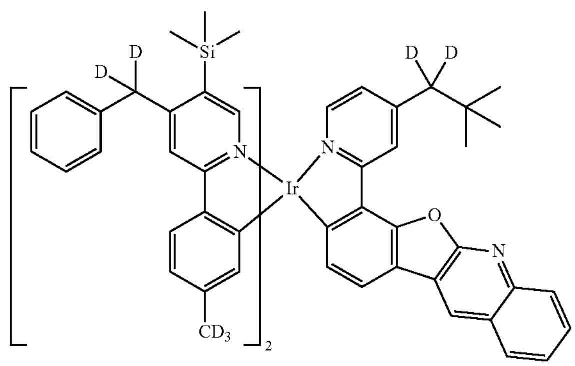
2274
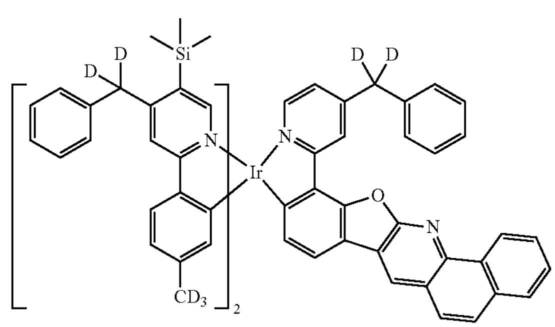
2275
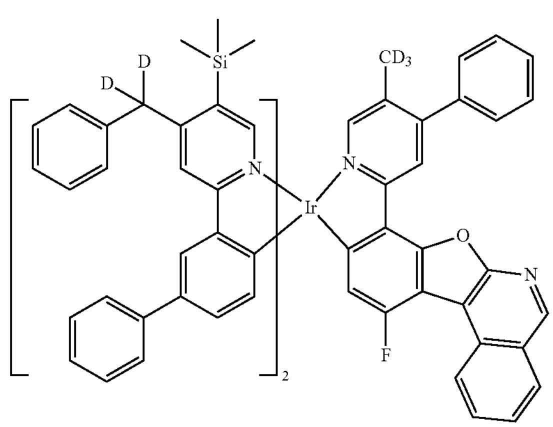

-continued
2276
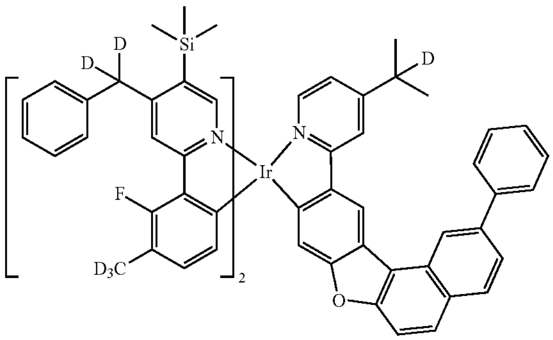
2277
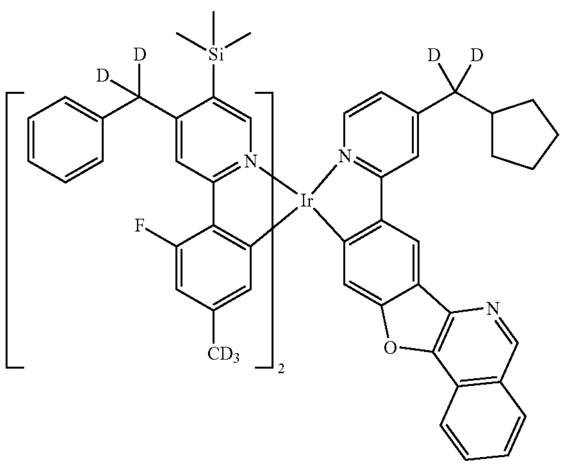
2278
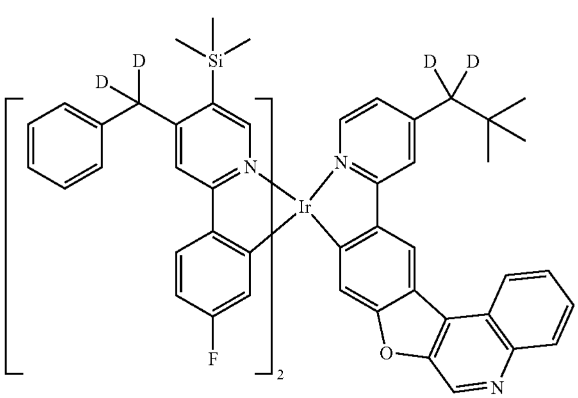
-continued
2279
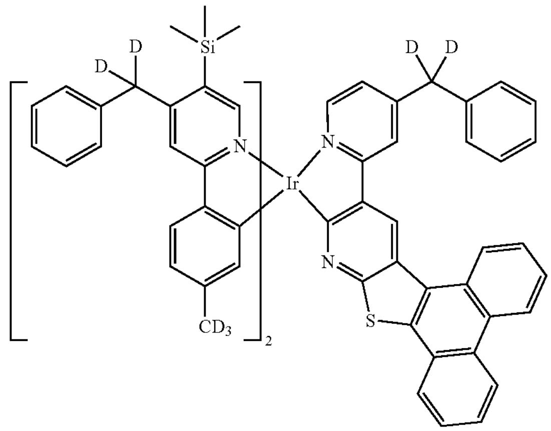
2280
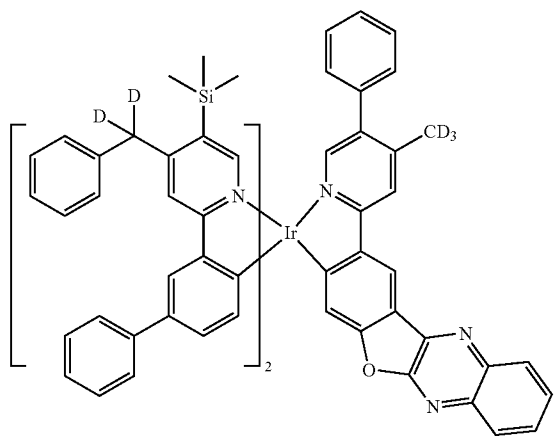
2281
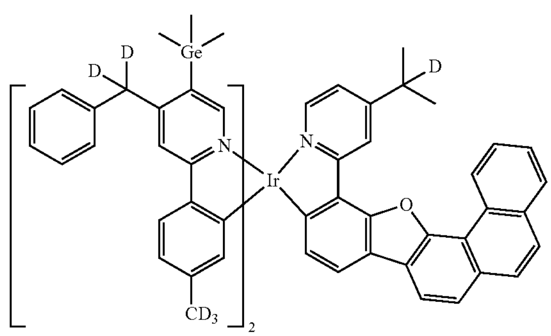

-continued
2282
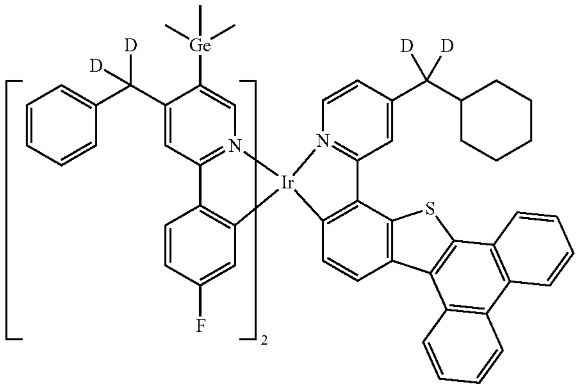
2283
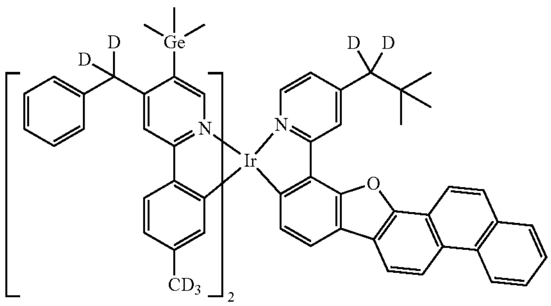
2284
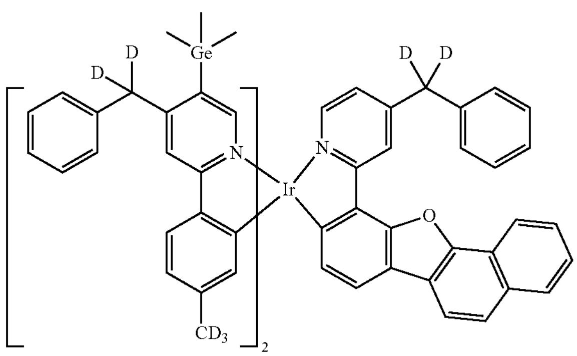
2285
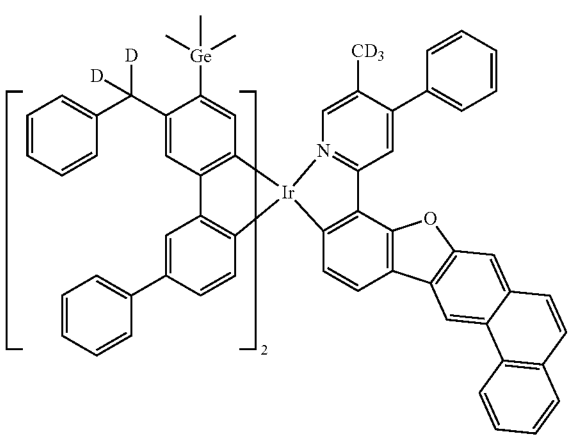
-continued
2286
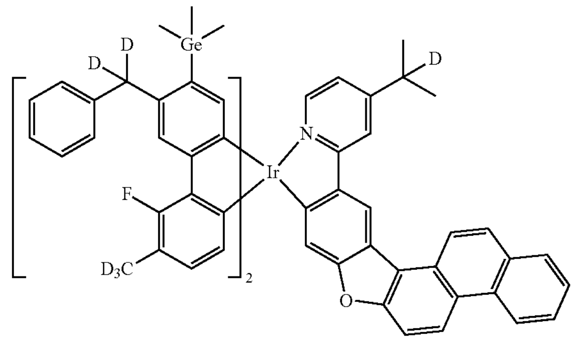
2287
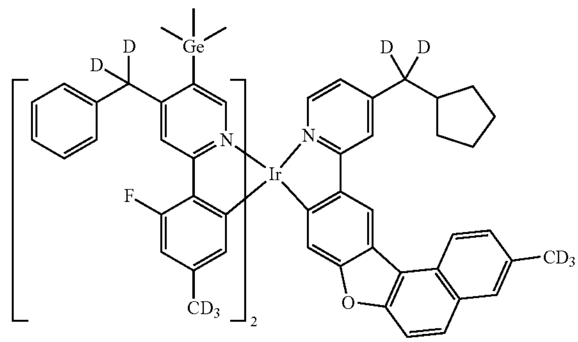
2288
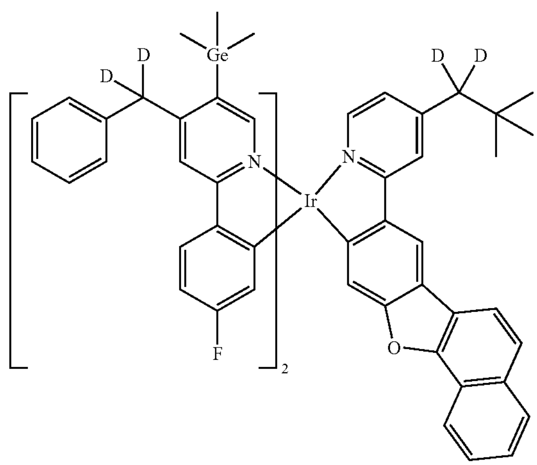
2289
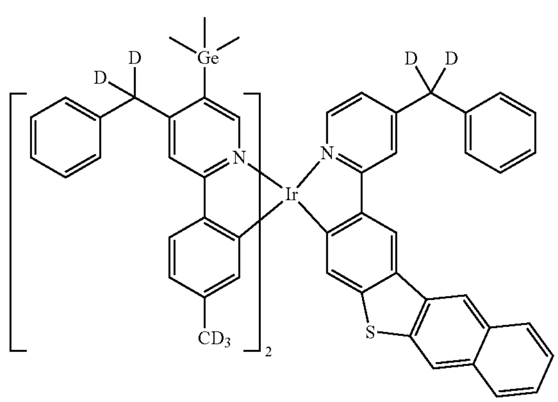

-continued
2290
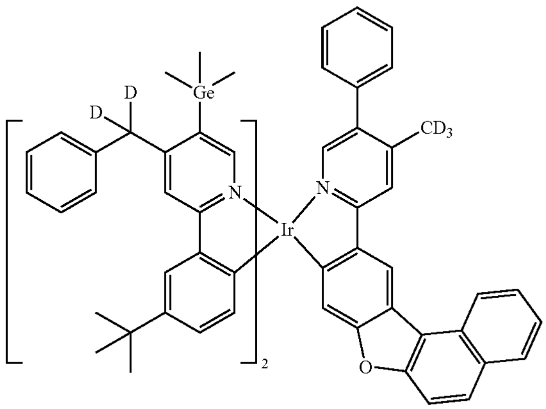
2291
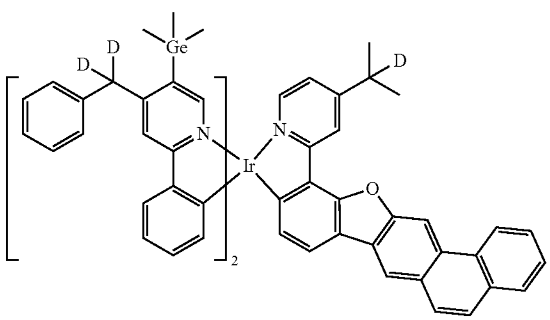
2292
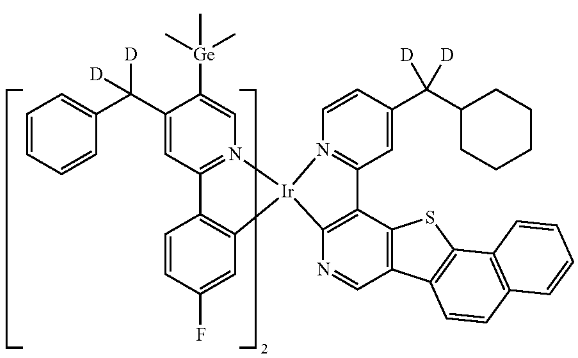
2293
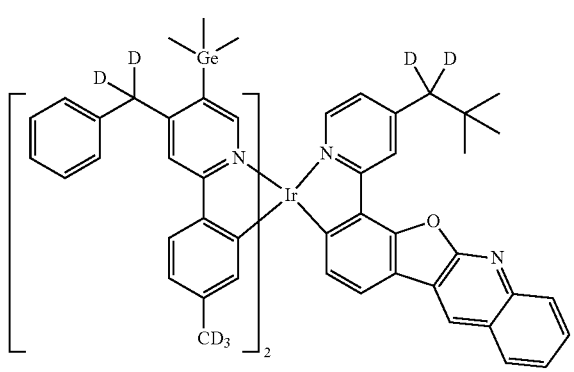
-continued
2294
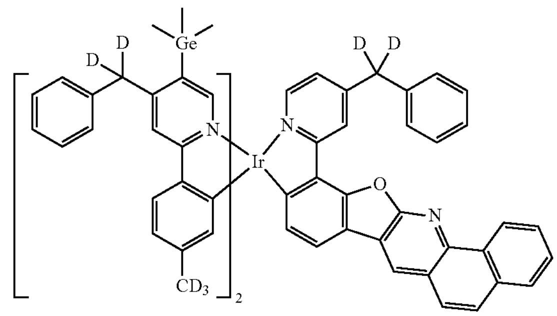
2295
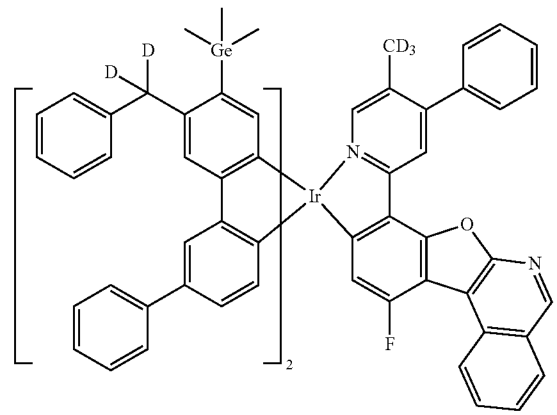
2296
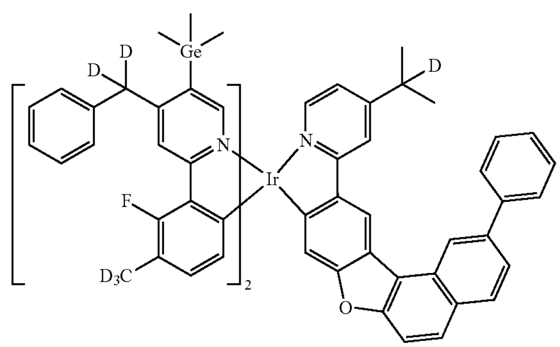
2297
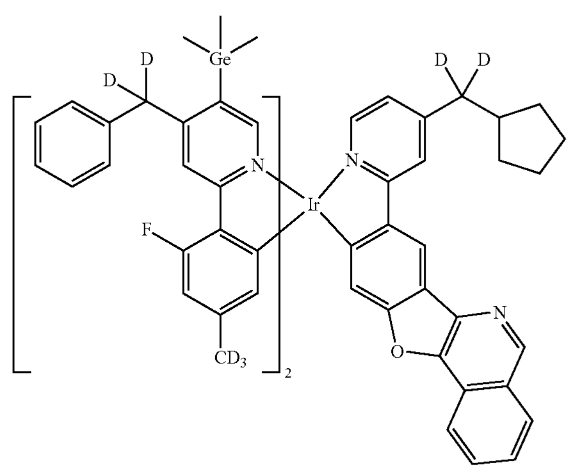

2298
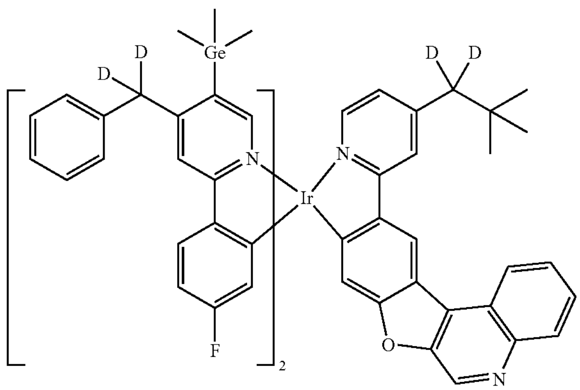
2299
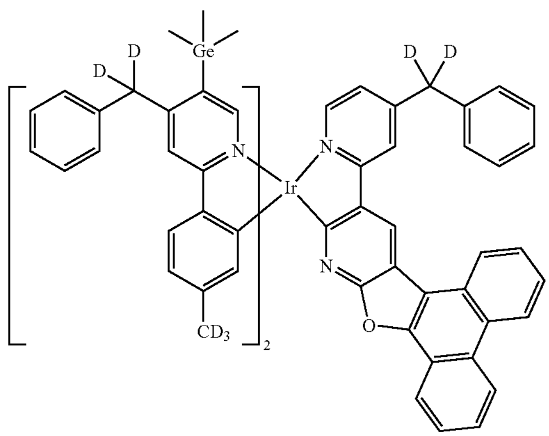
2300
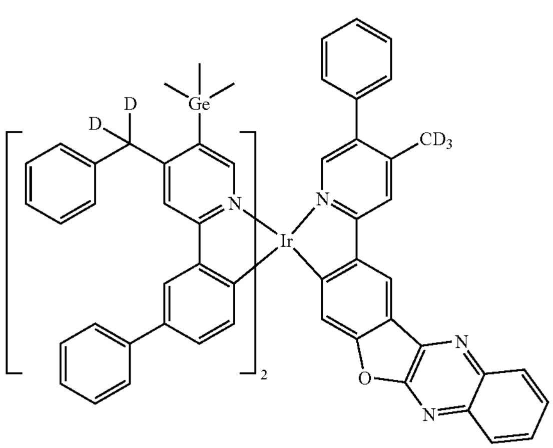
2301
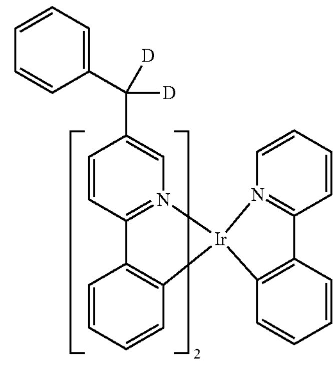
2302
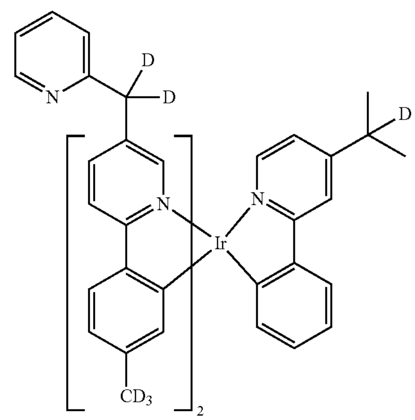
2303
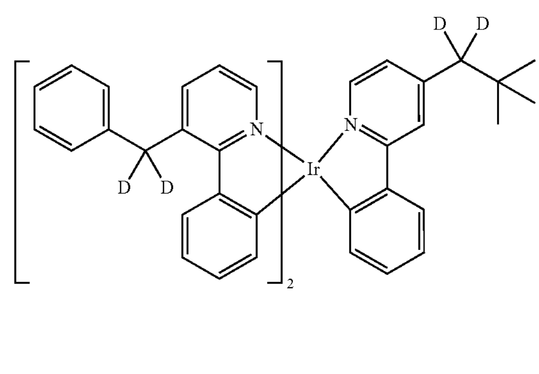
2304
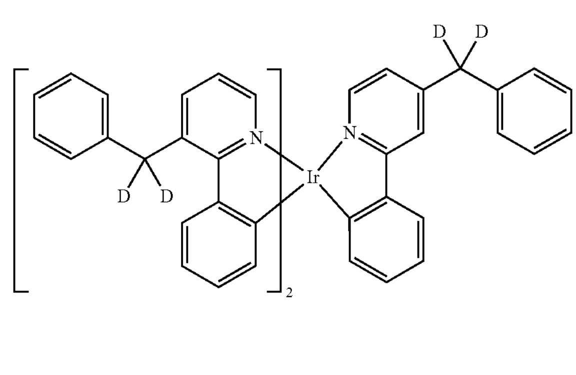

-continued
2305
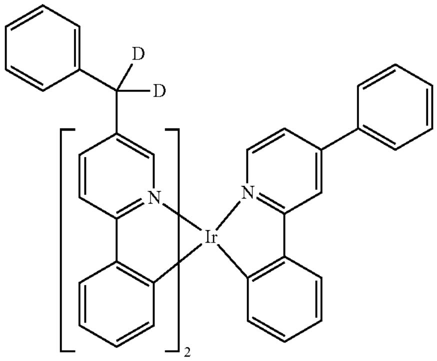
2306
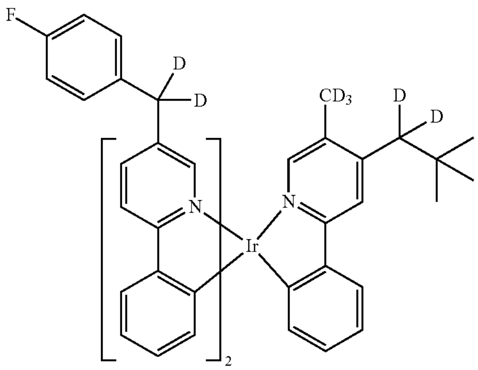
2307
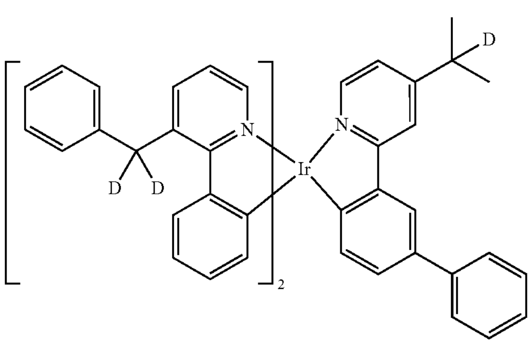
2308
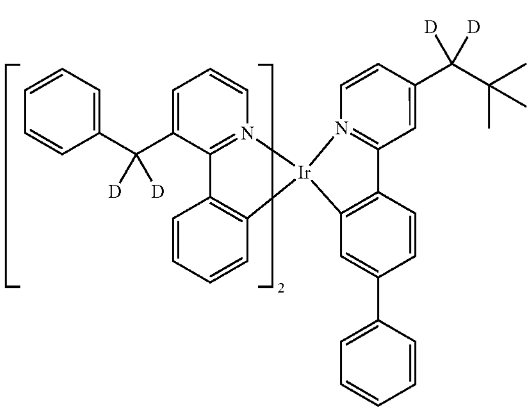
-continued
2309
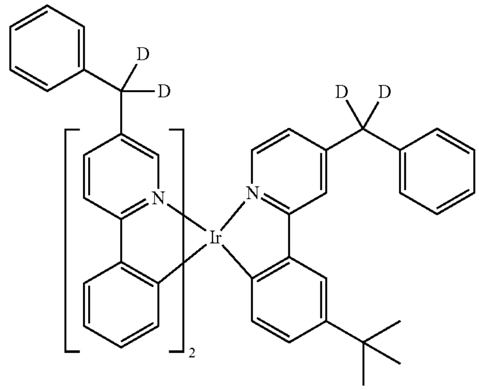
2310
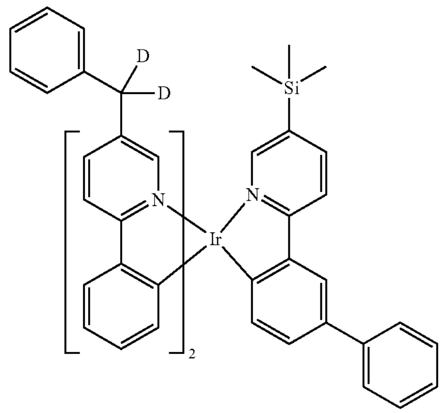
2311
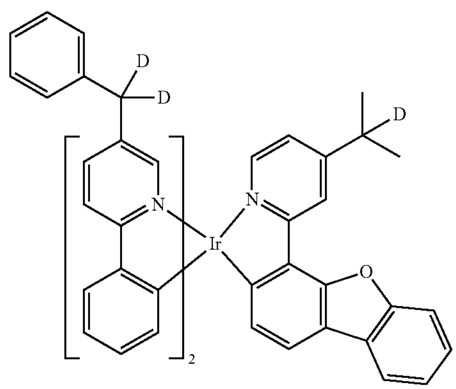
2312
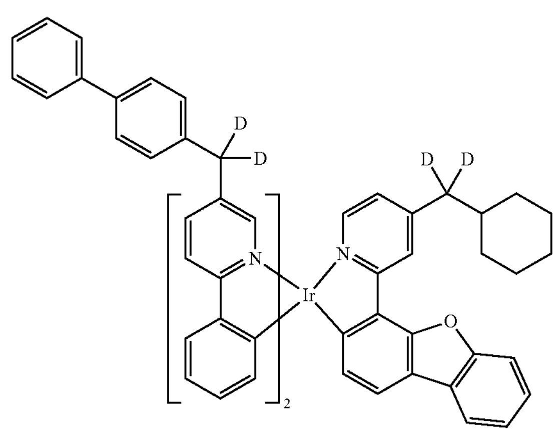

-continued
2313
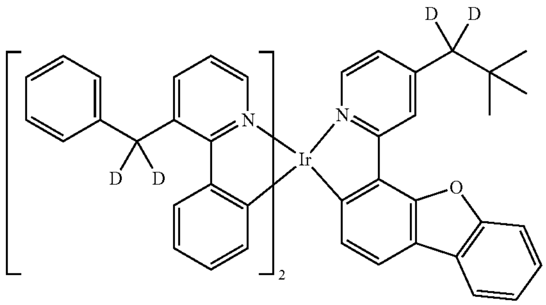
2314
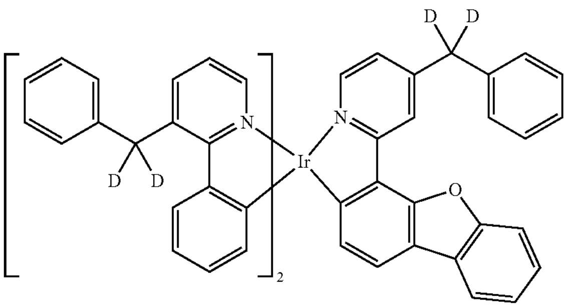
2315
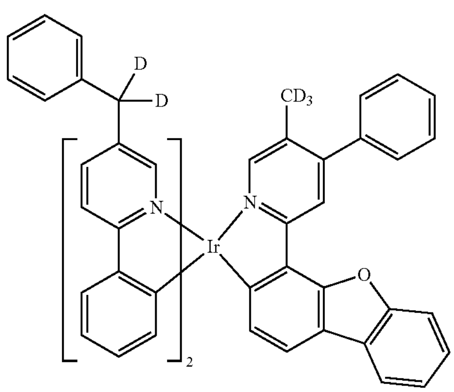
2316
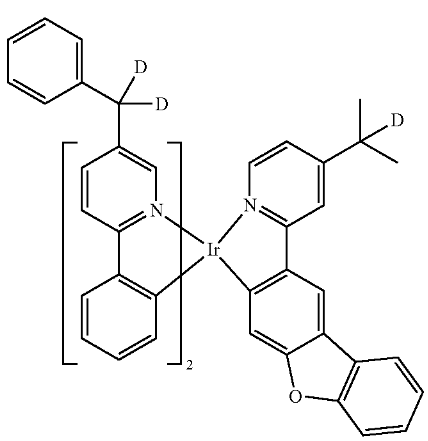
-continued
2317
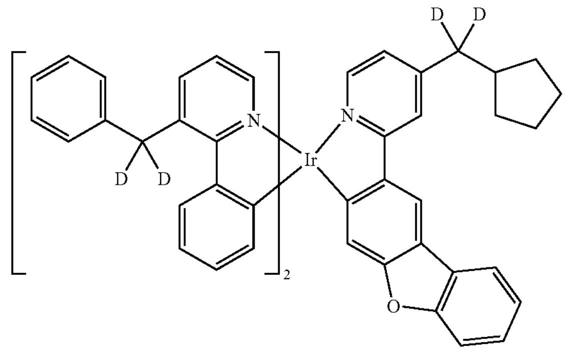
2318
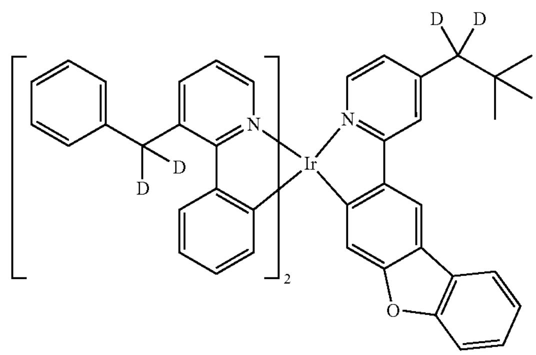
2319
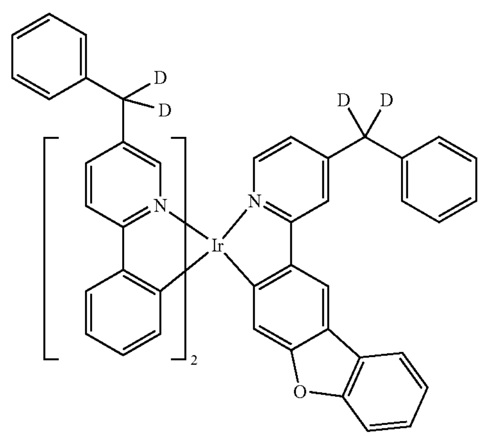
2320
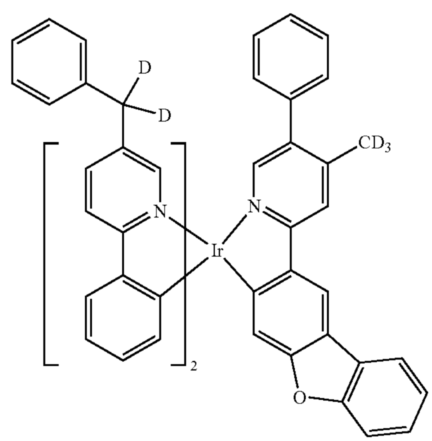

-continued
2321
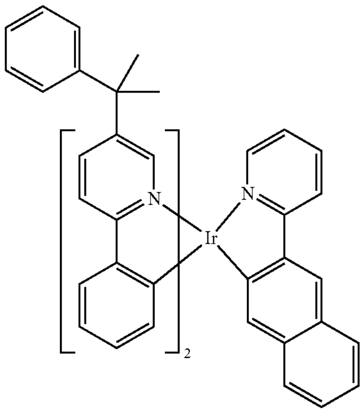
2322
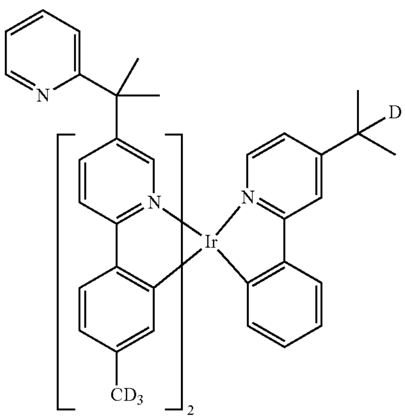
2323
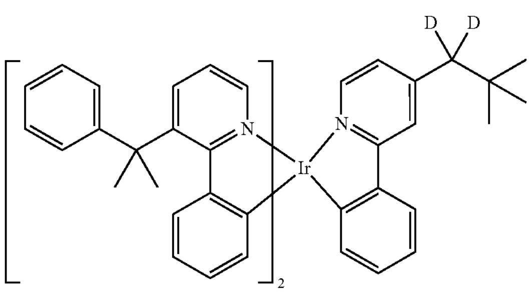
2324
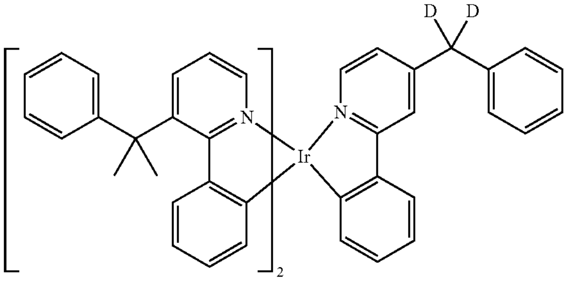
2325
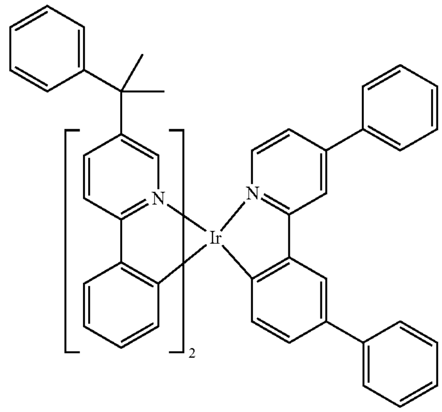
2326
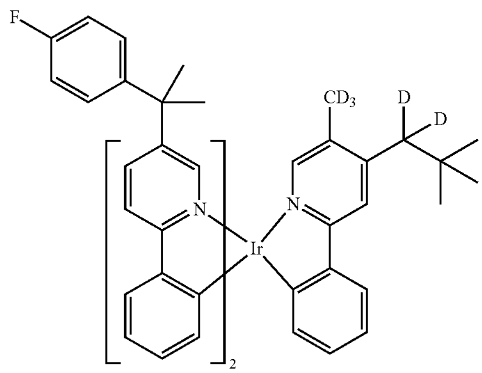
2327
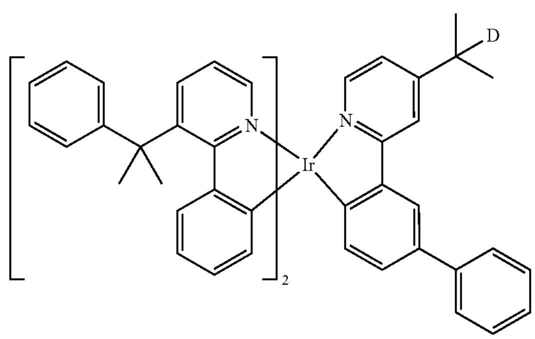
2328
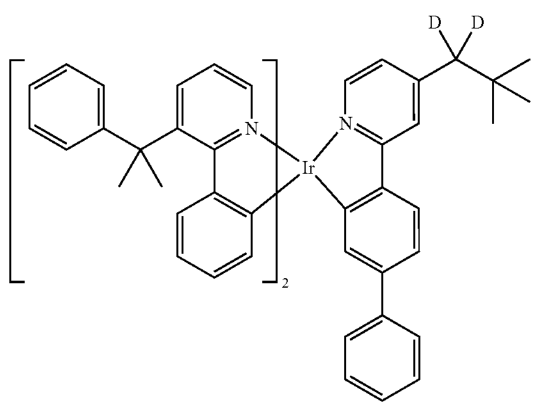

-continued
2329
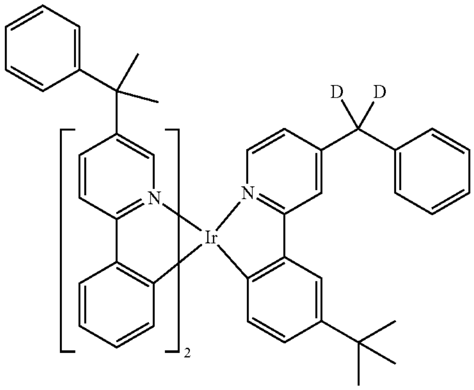
2330
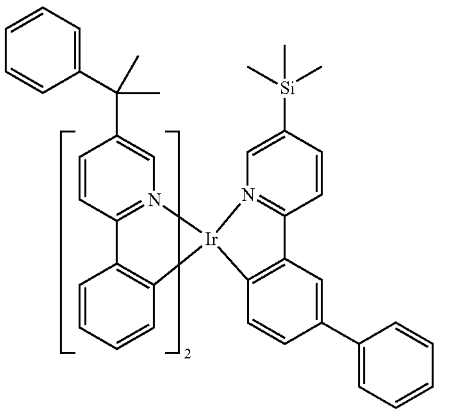
2331
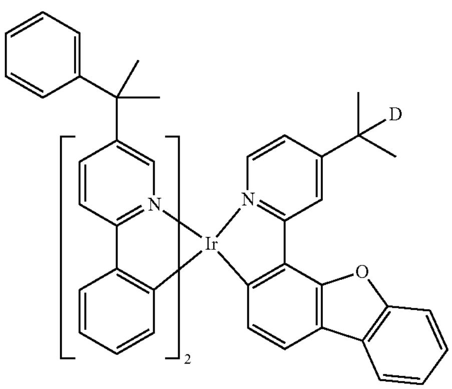
2332
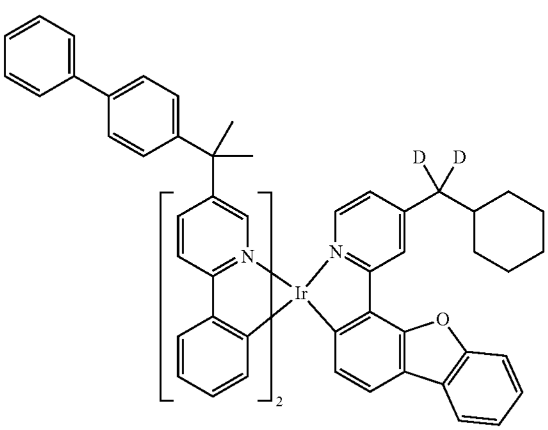
-continued
2333
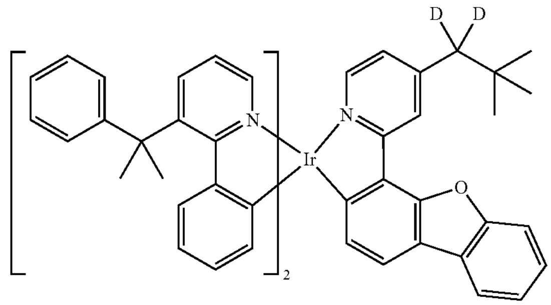
2334
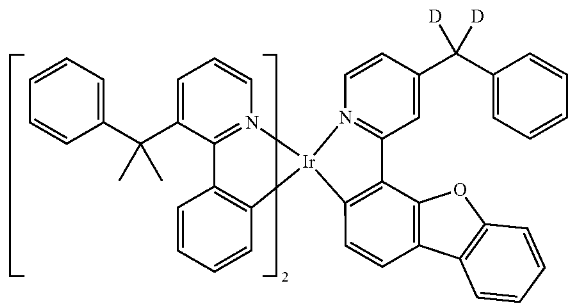
2335
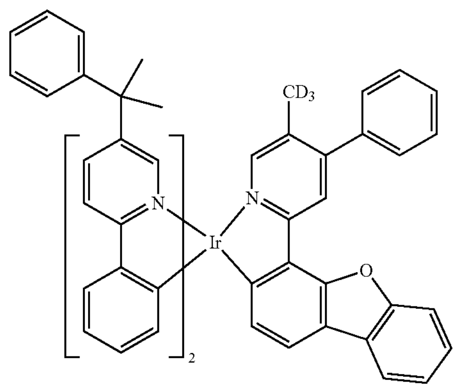
2336
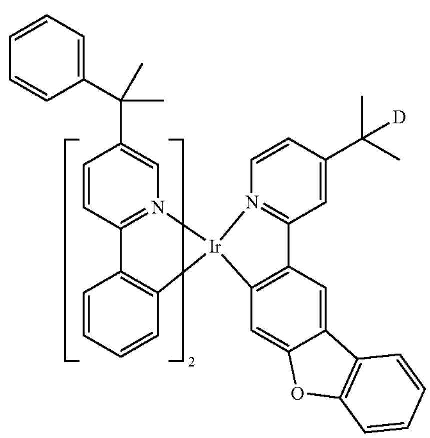

-continued
2337
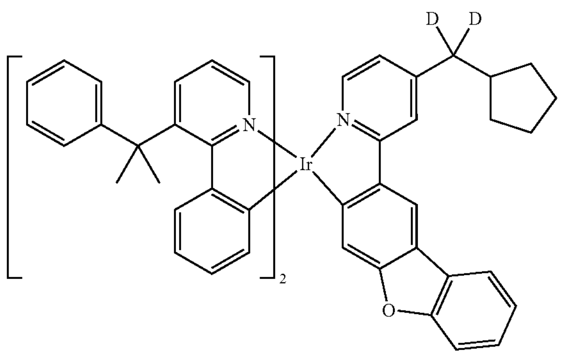
2338
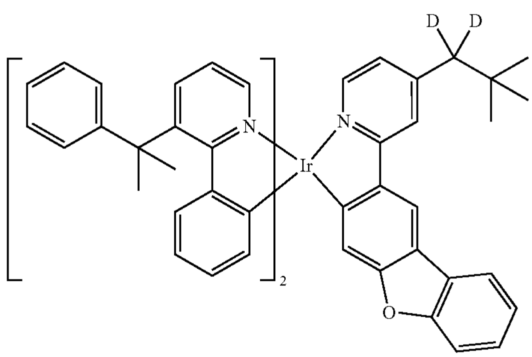
2339
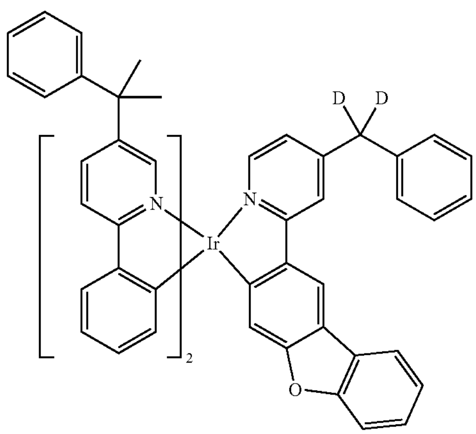
2340
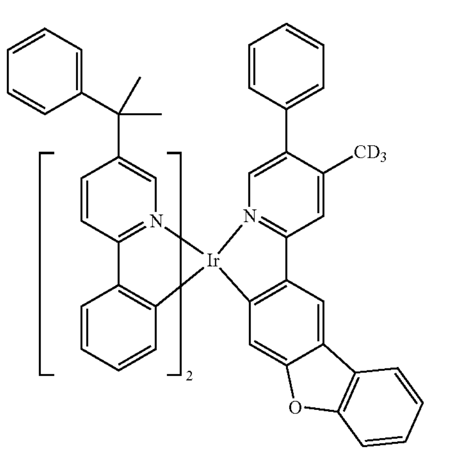
-continued
2341
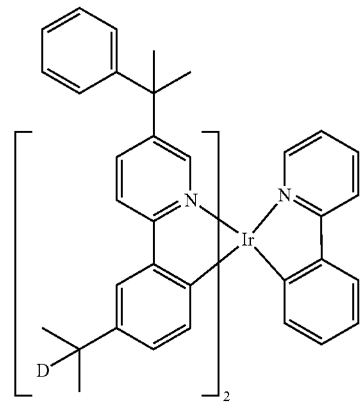
2342
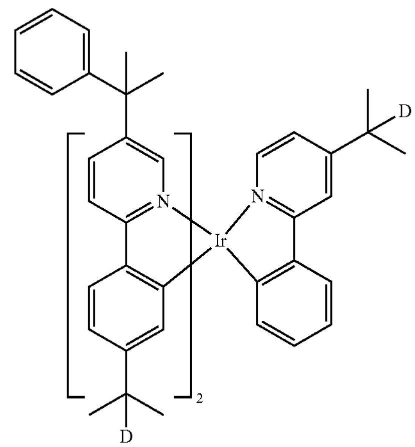
2343
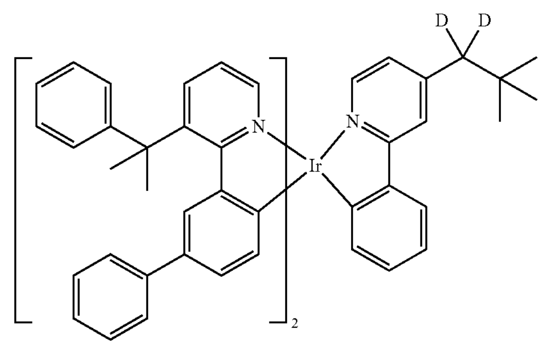
2344
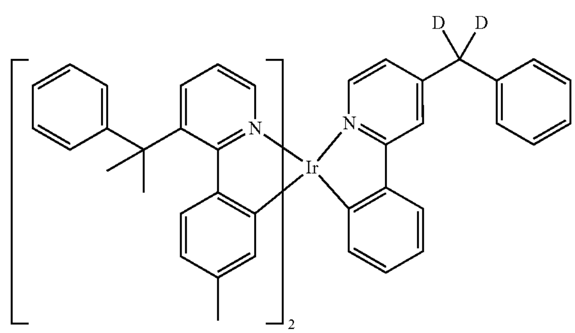

-continued
2345
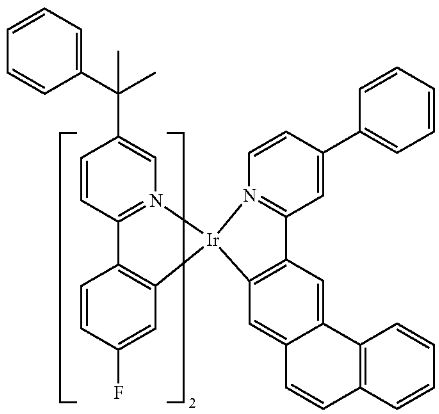
2346
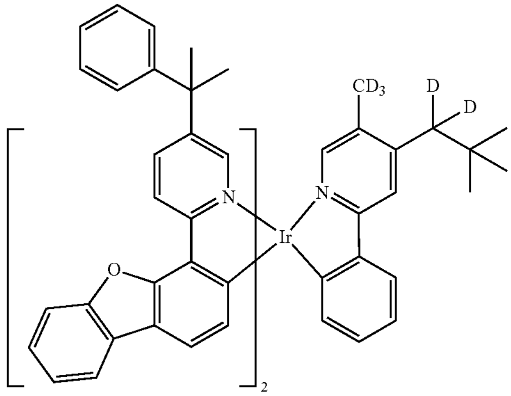
2347
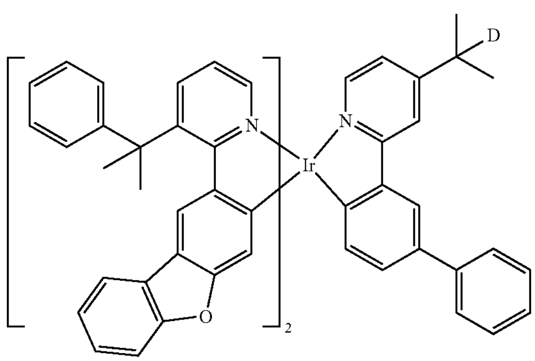
2348
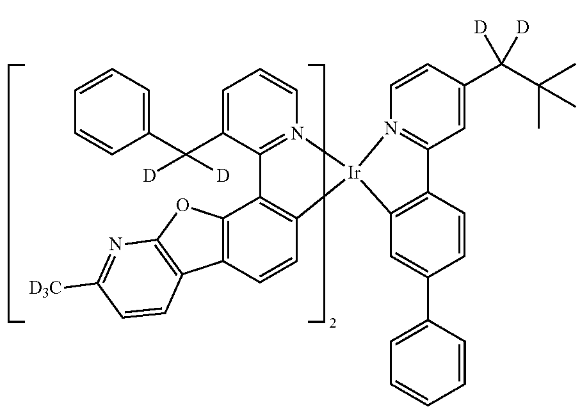
-continued
2349
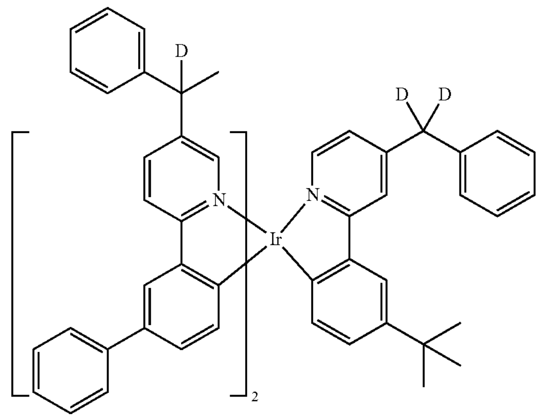
2350
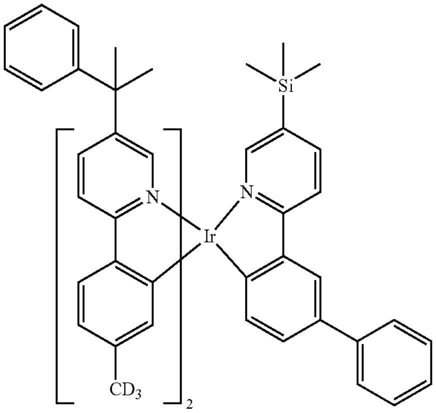
2351
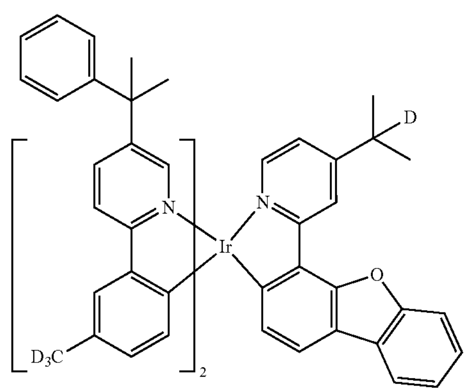
2352
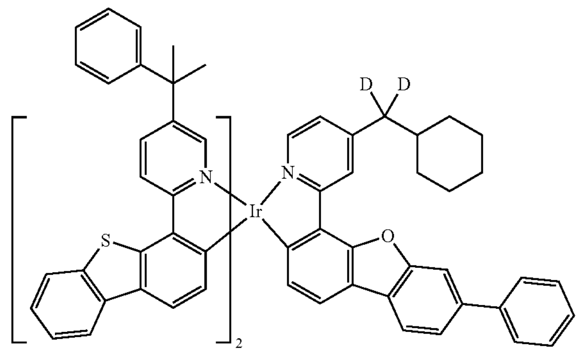

-continued
2353
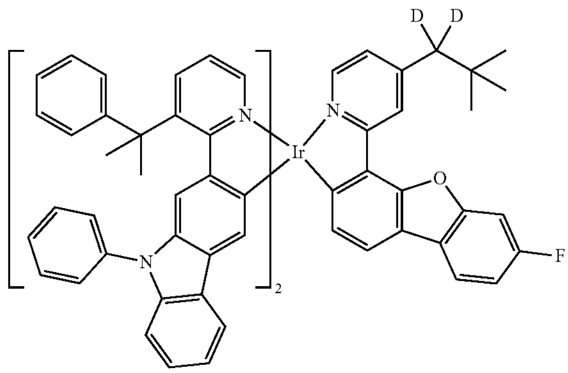
2354
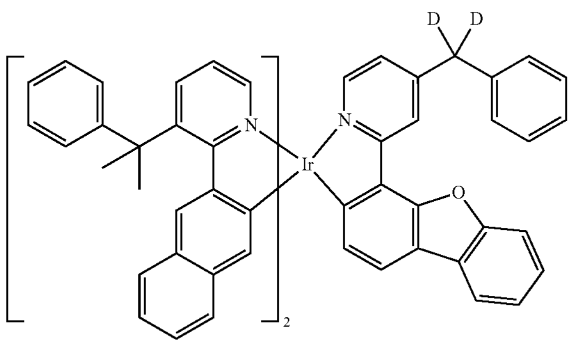
2355
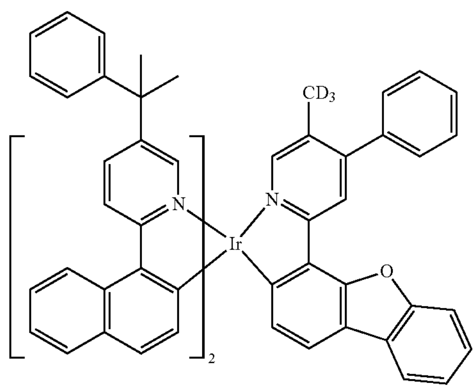
2356
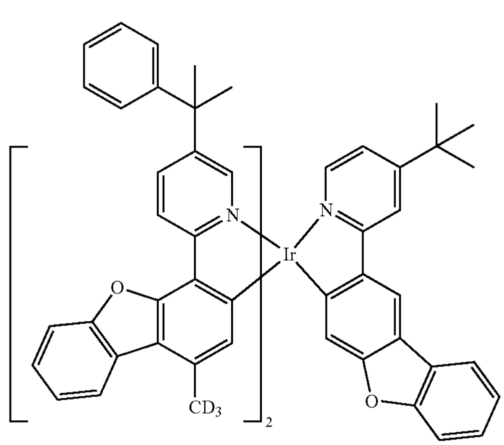
-continued
2357
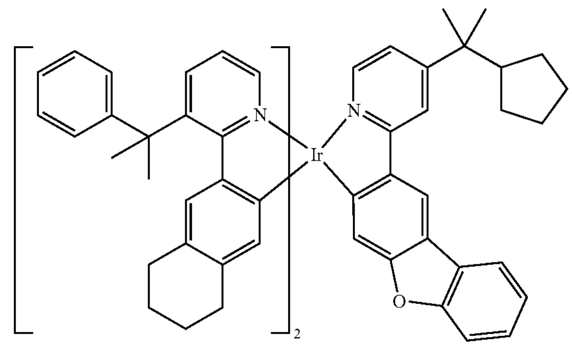
2358
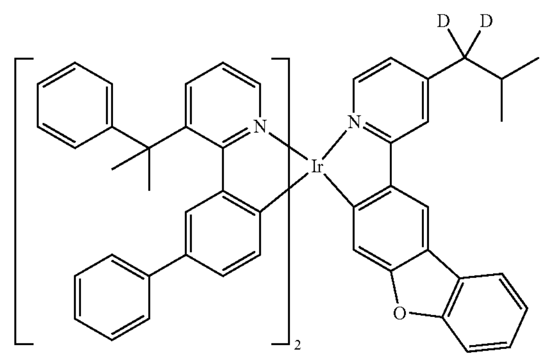
2359
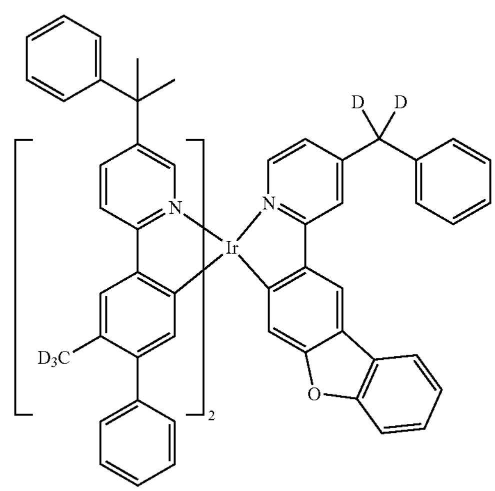

-continued
2360
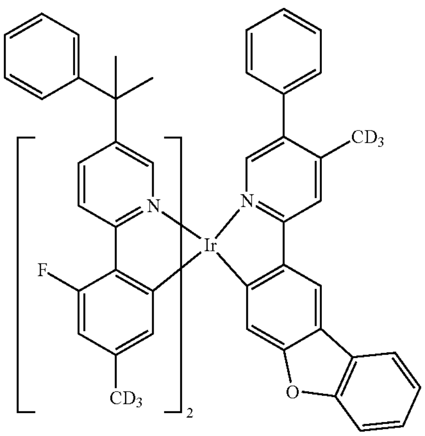
2361
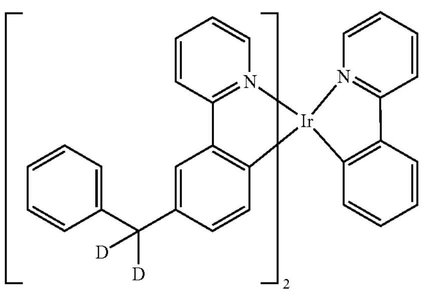
2362
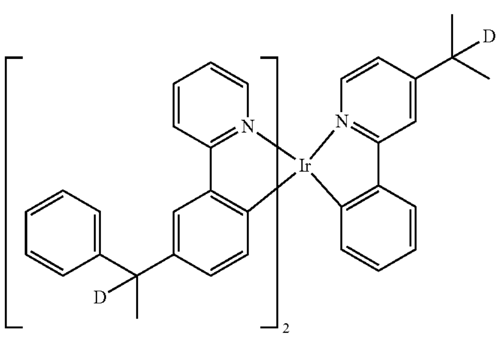
2363
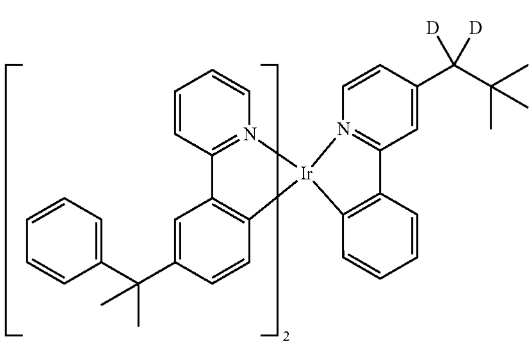
-continued
2364
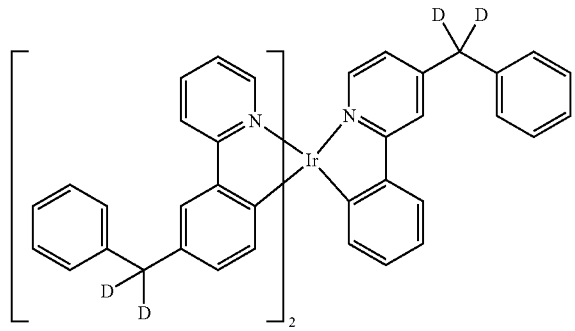
2365
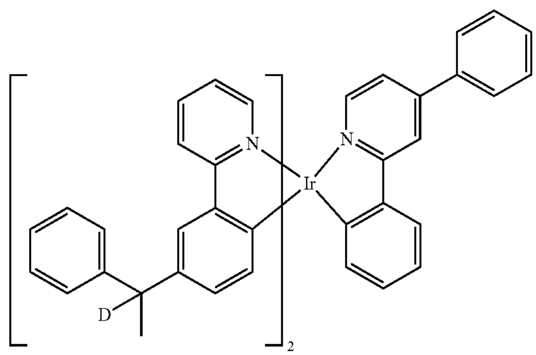
2366
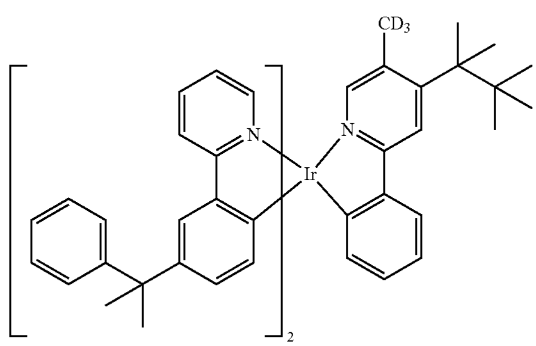
2367
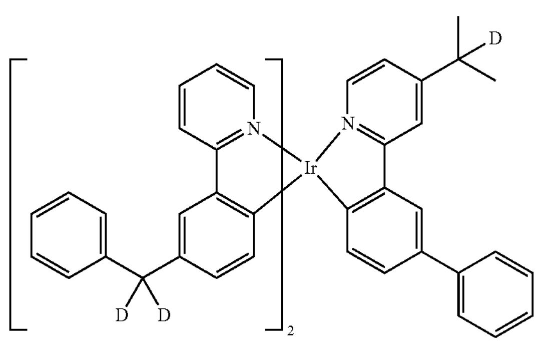

-continued
2368
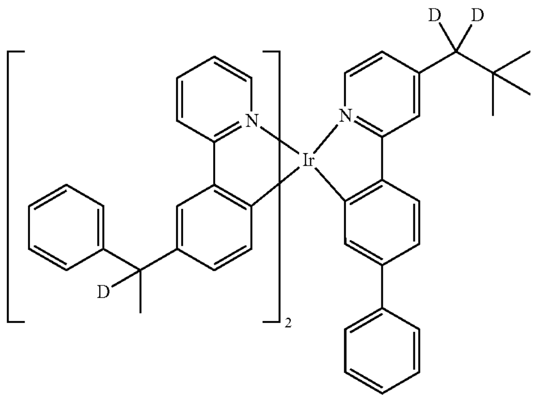
2369
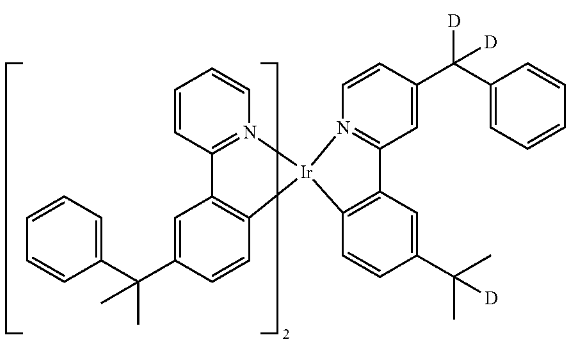
2370
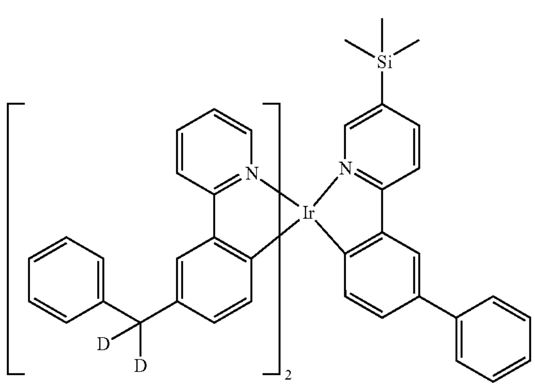
2371
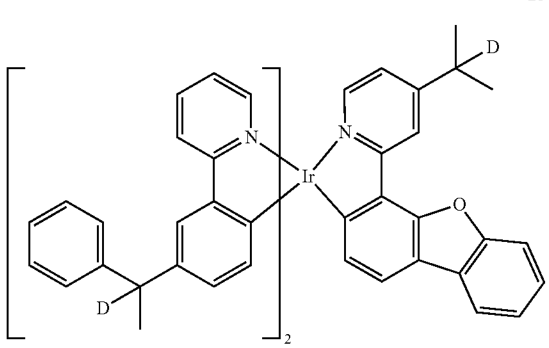
-continued
2372
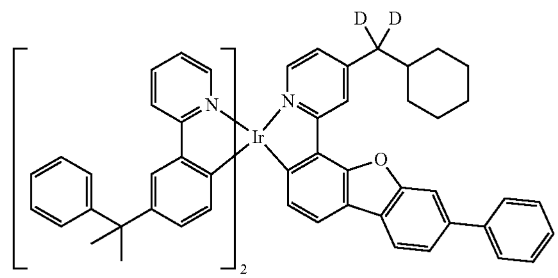
2373
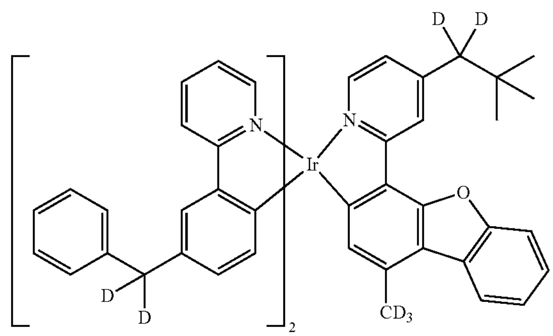
2374
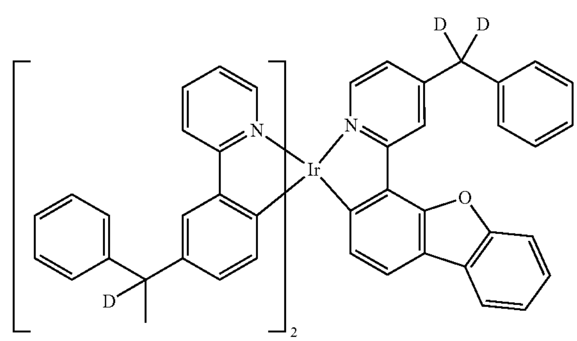
2375
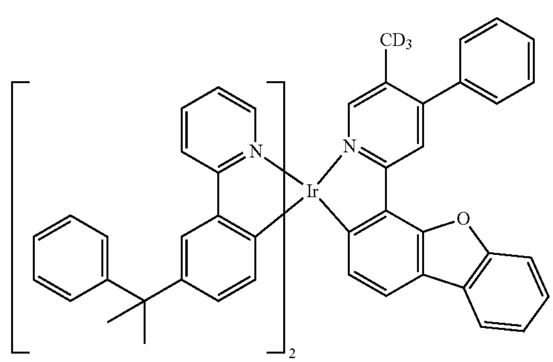

-continued
2376
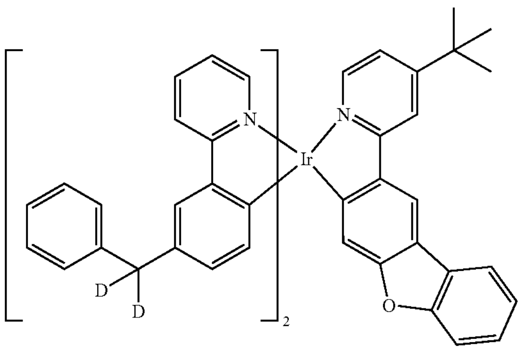
2377
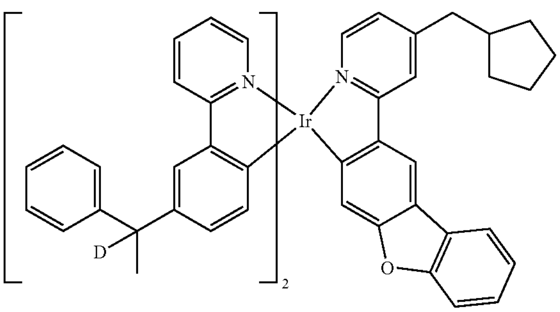
2378
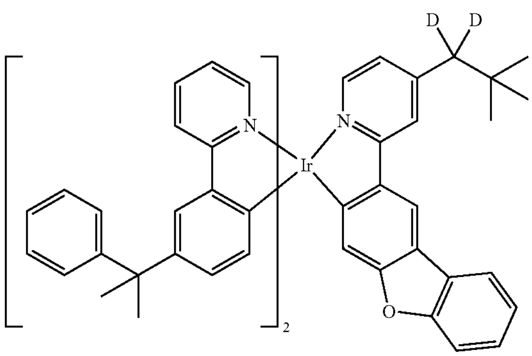
2379
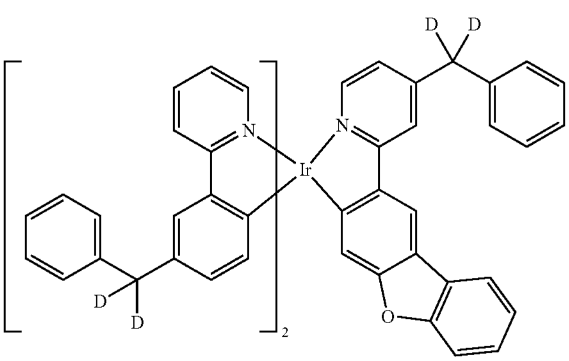
-continued
2380
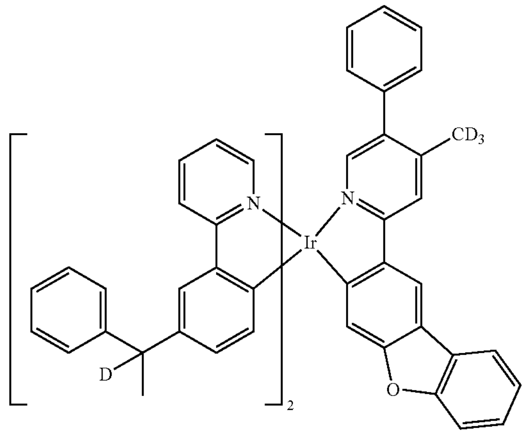
2381
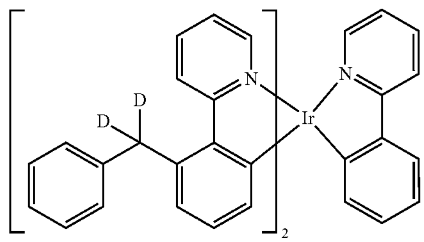
2382
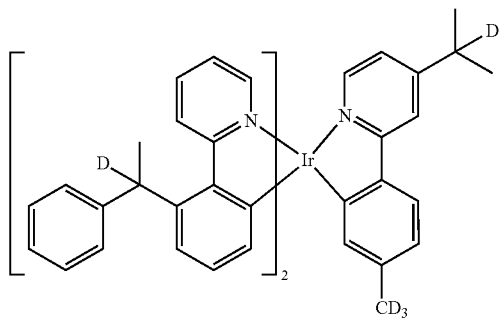
2383
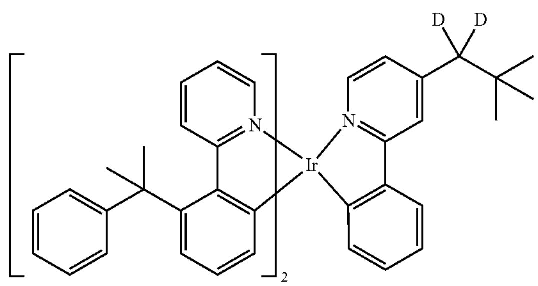
2384
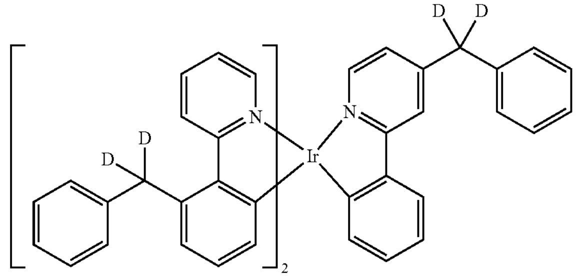

2385
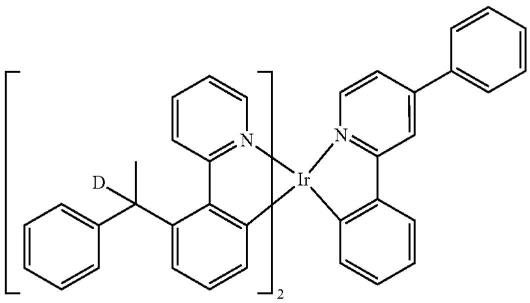
2386
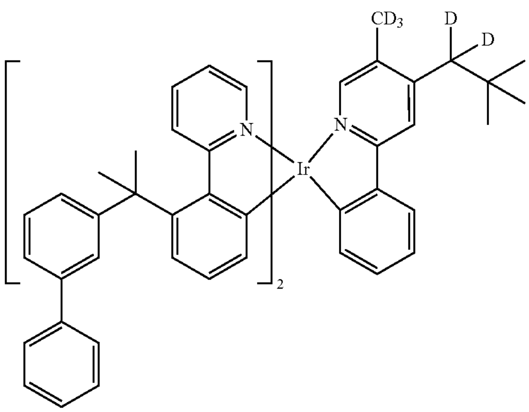
2387
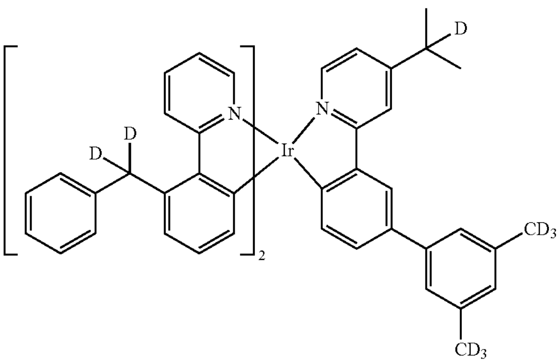
2388
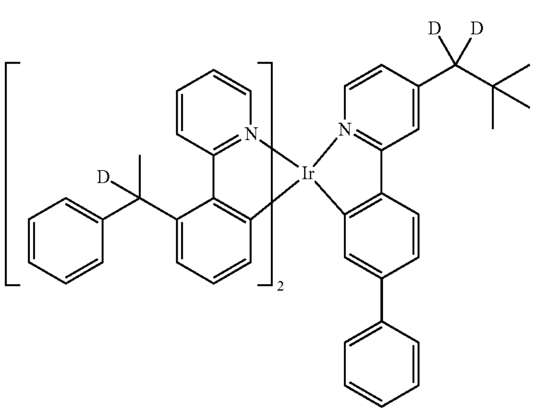
2389
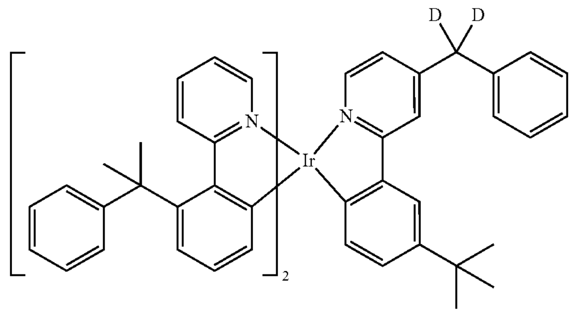
2390
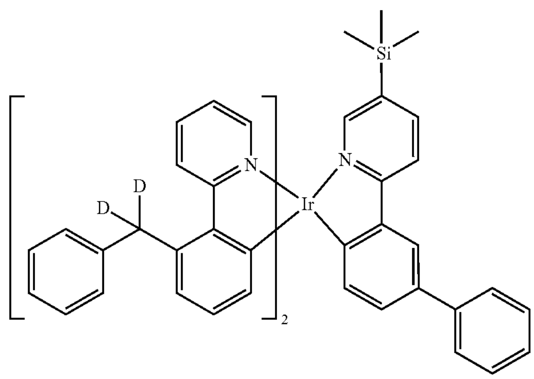
2391
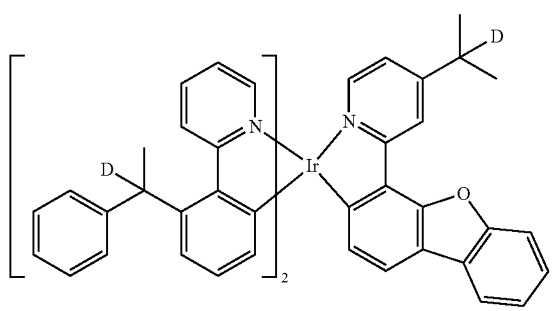
2392
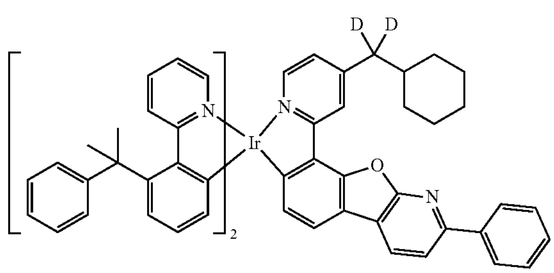
2393
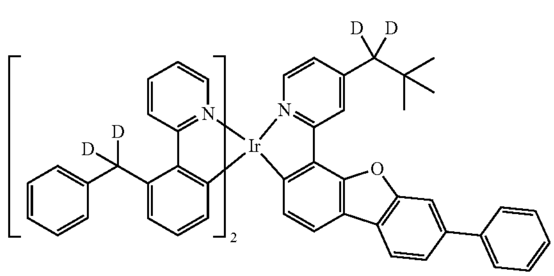

-continued
2394
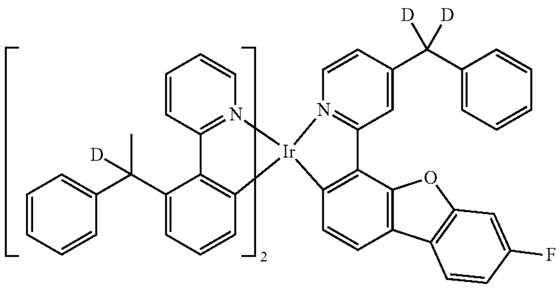
2395
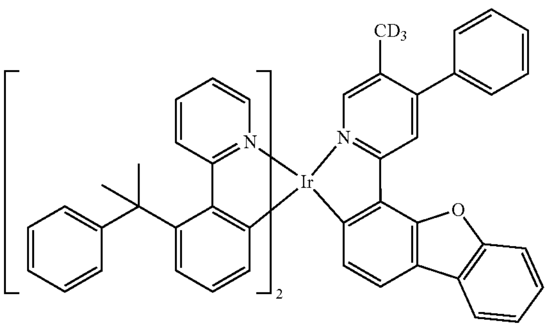
2396
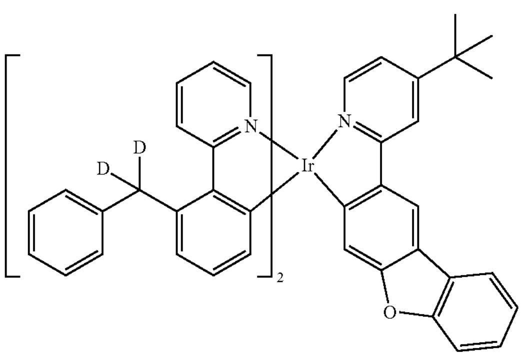
2397
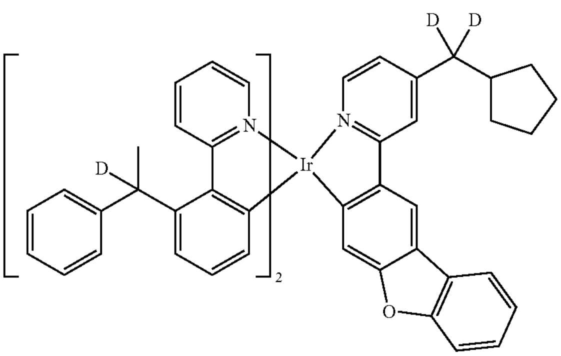
-continued
2398
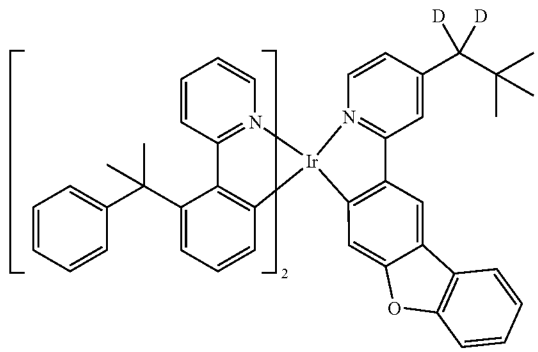
2399
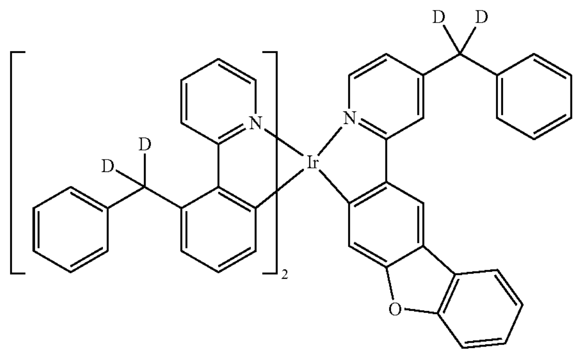
2400
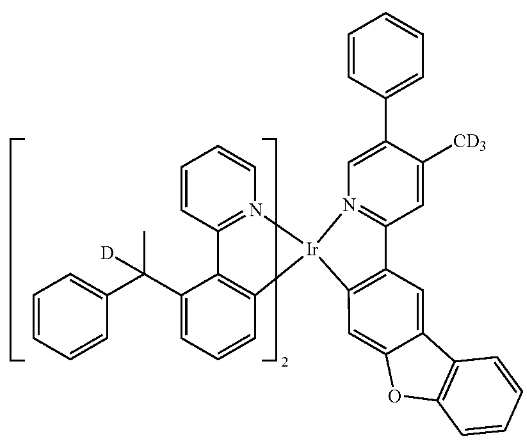
2401
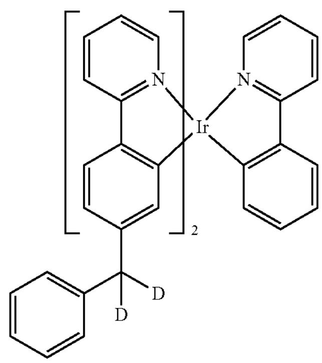

-continued
2402
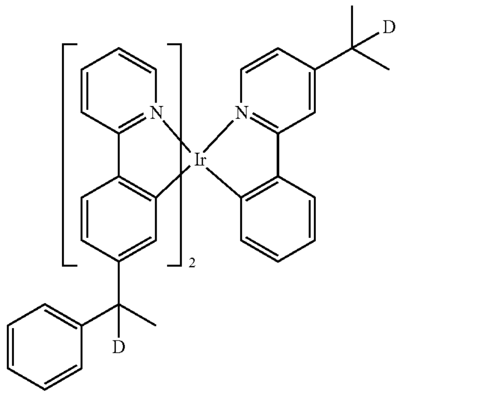
2403
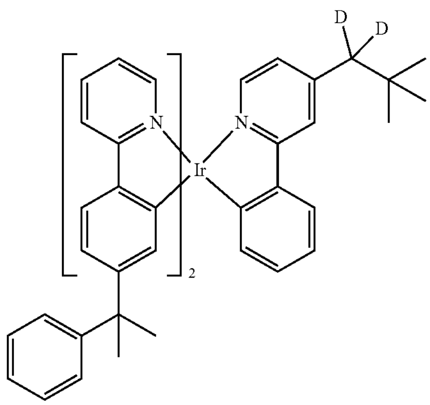
2404
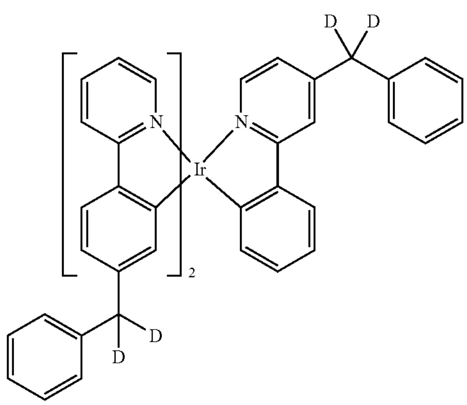
2405
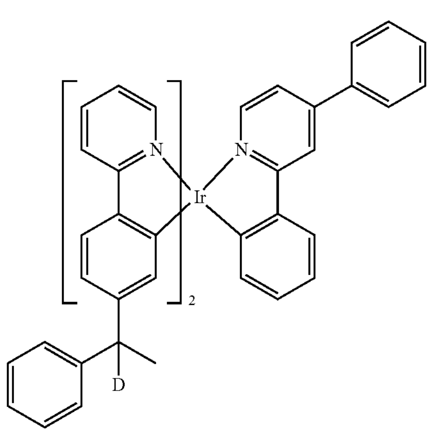
-continued
2406
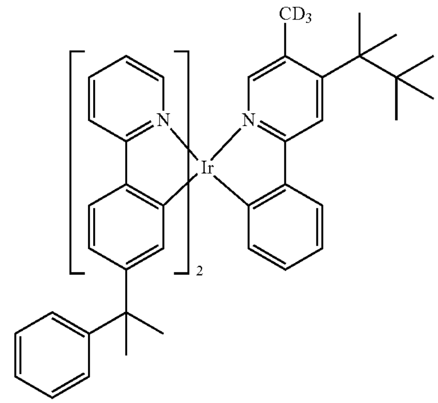
2407
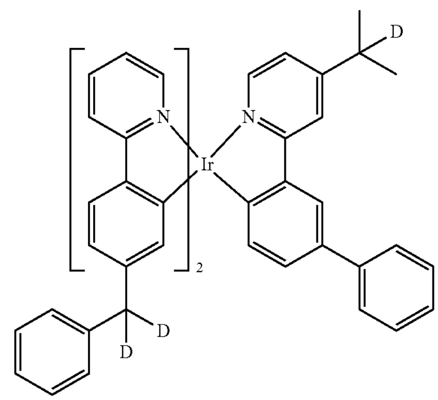
2408
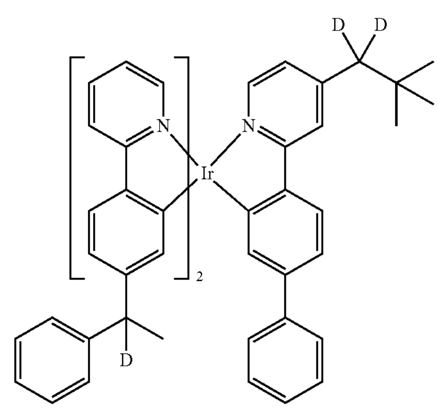
2409
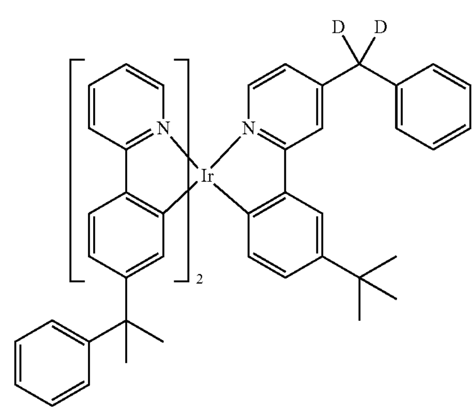

-continued
2410
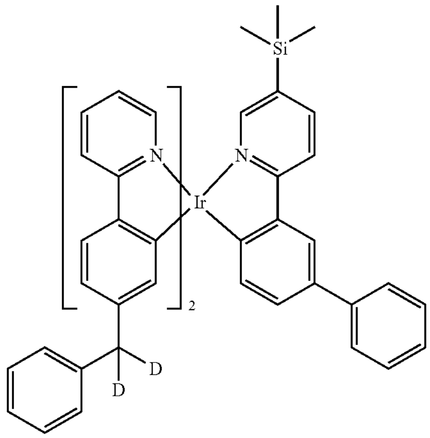
2411
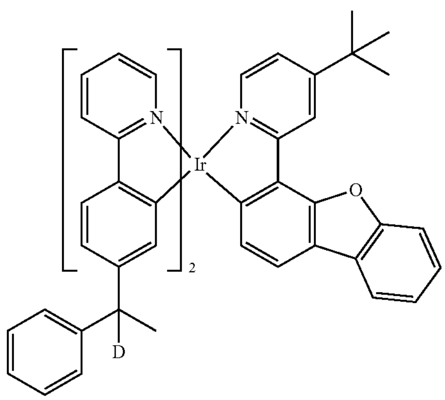
2412
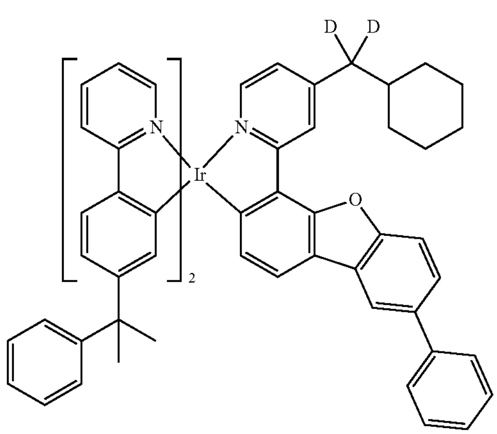
-continued
2413
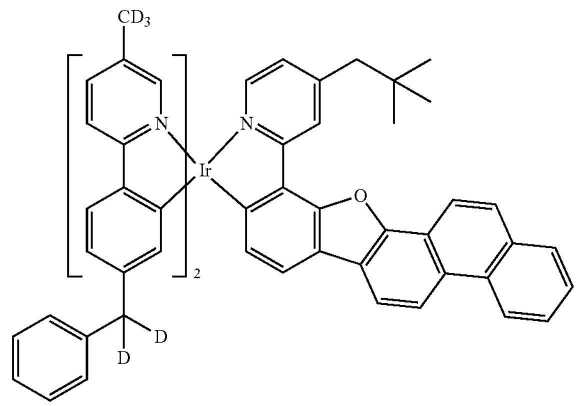
2414
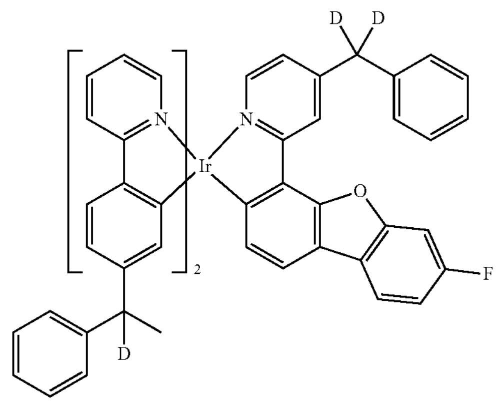
2415
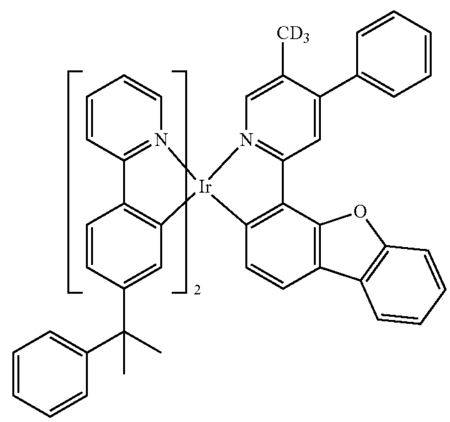
2416
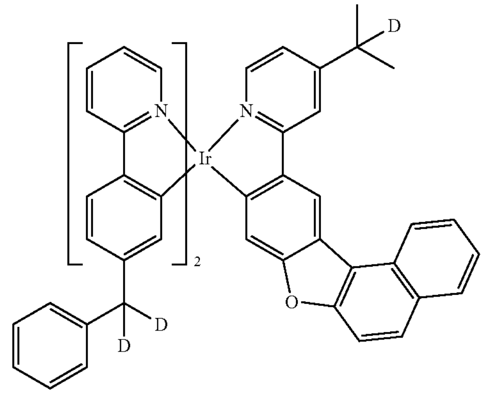

-continued
2417
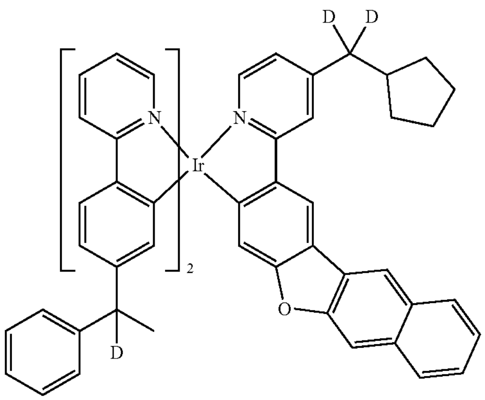
2418
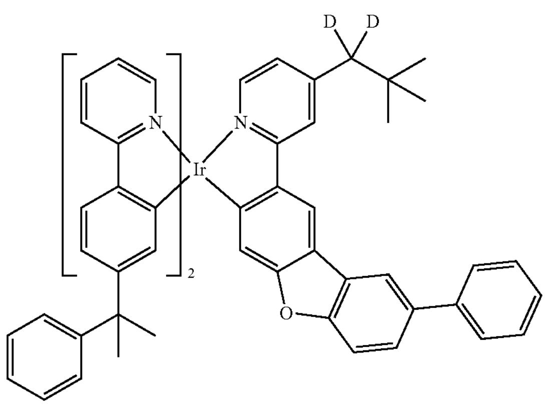
2419
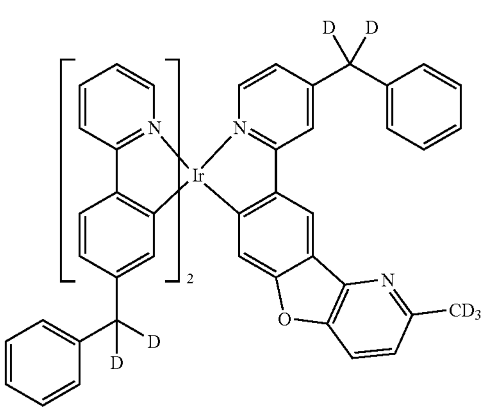
-continued
2420
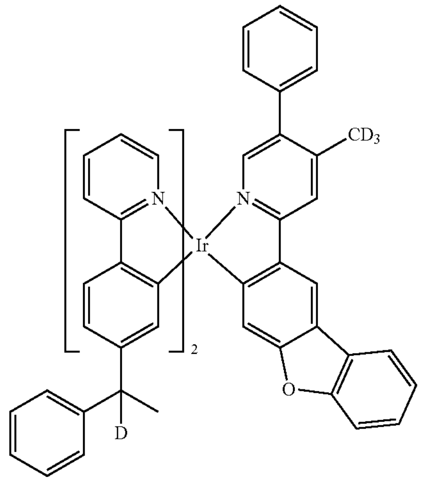
2421
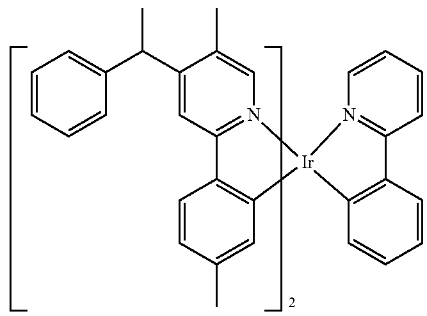
2422
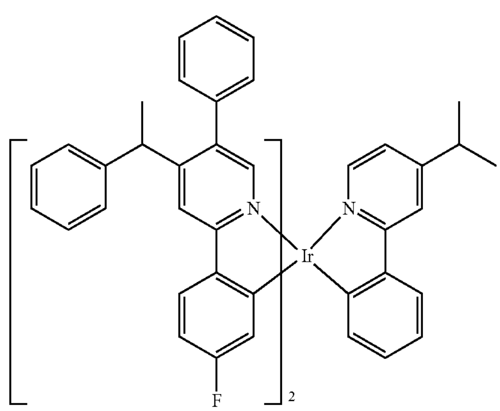
2423
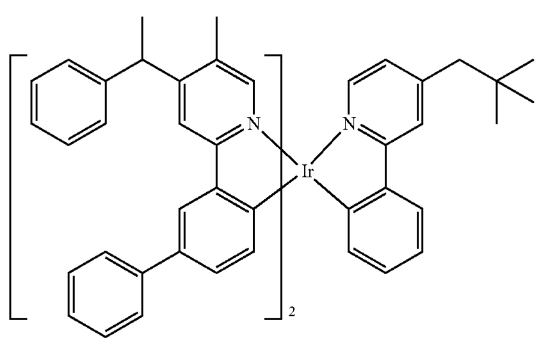

-continued
2424
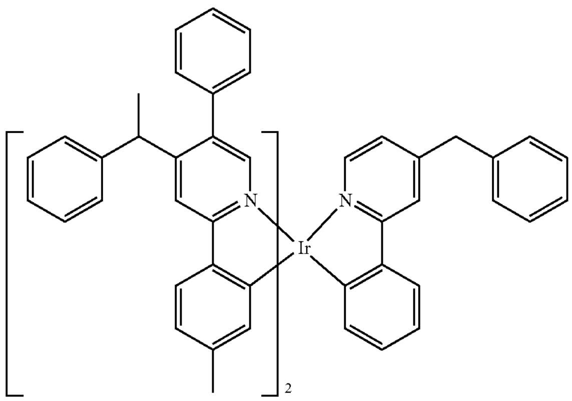
2425
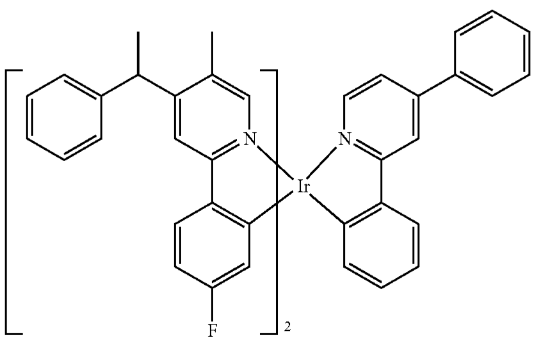
2426
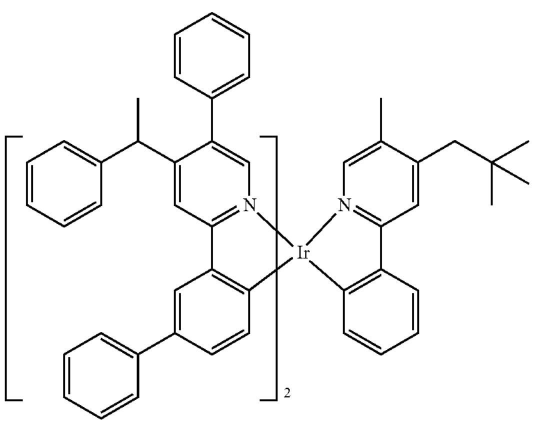
2427
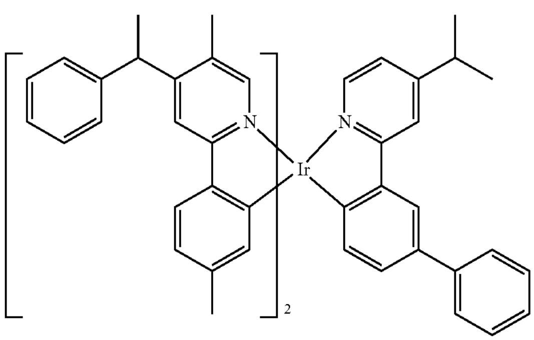
-continued
2428
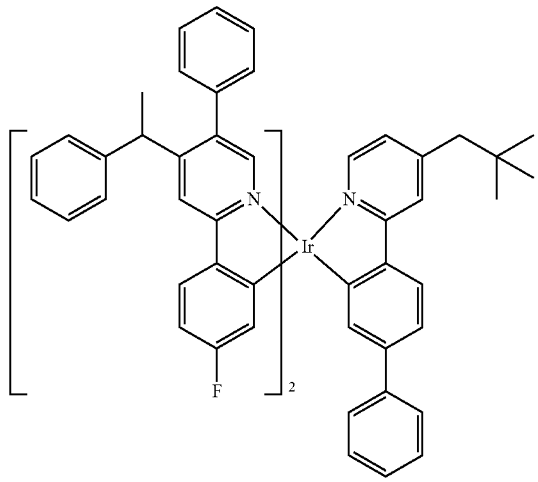
2429
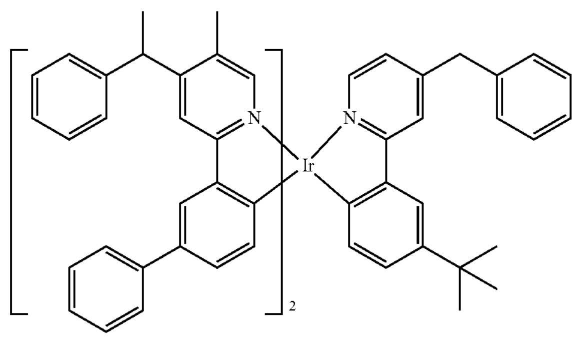
2430
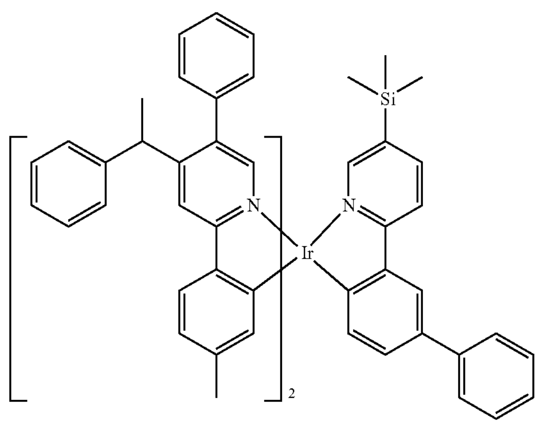
2431
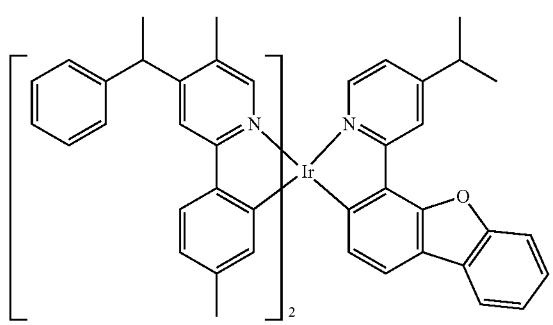

-continued
2432
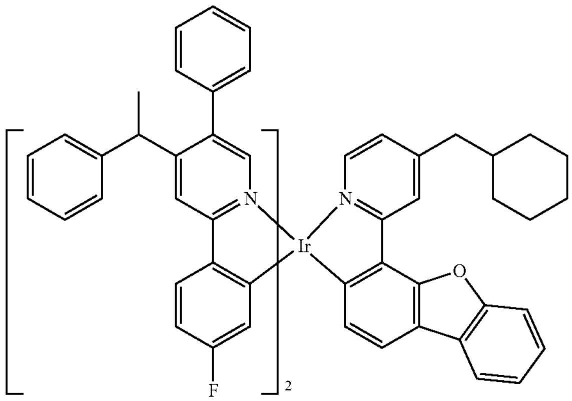
2433
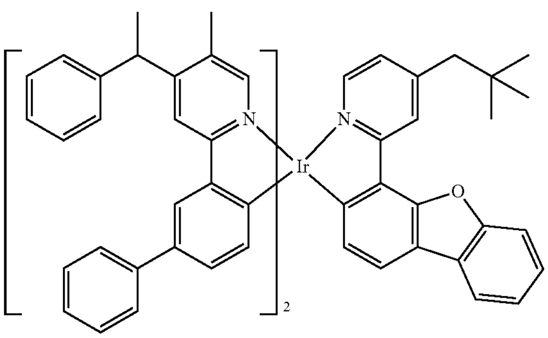
2434
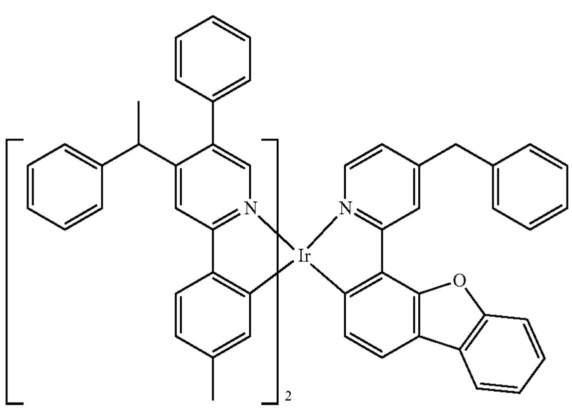
2435
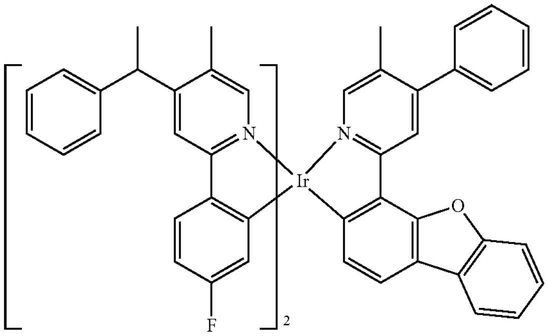
-continued
2436
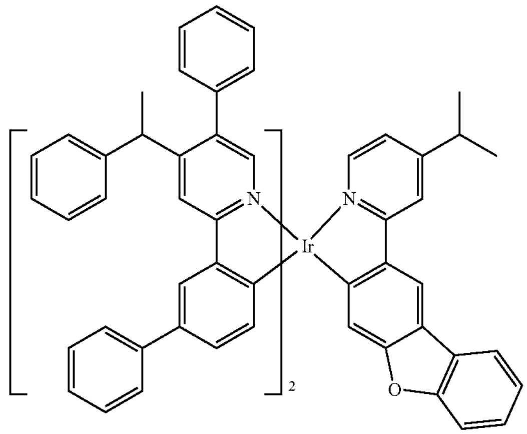
2437
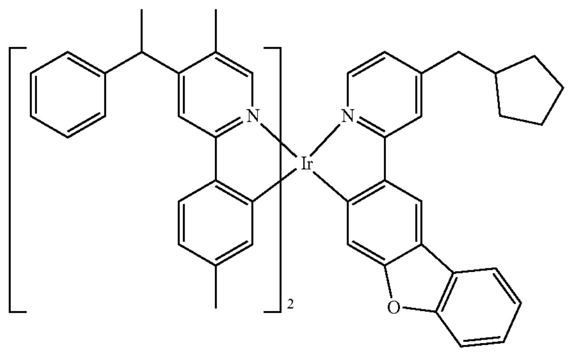
2438
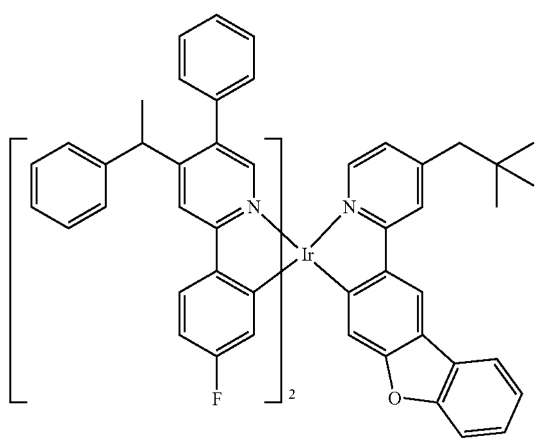
2439
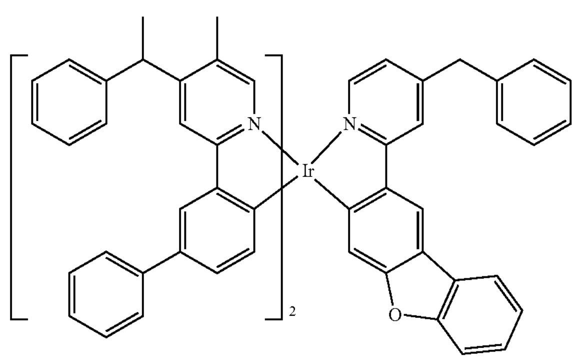

-continued
2440
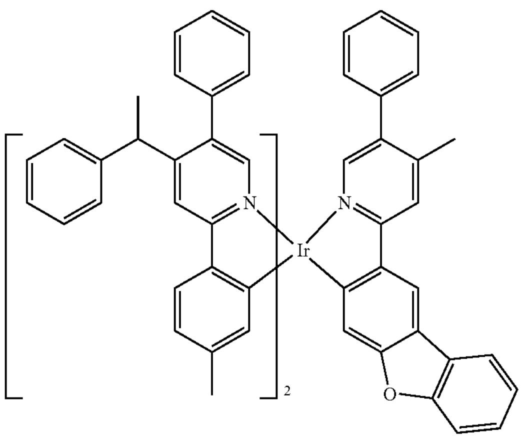
2441
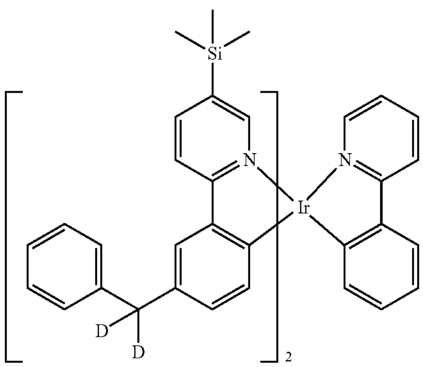
2442
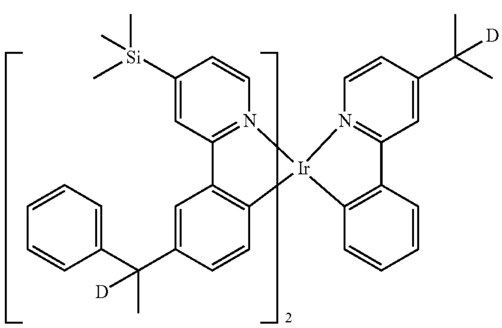
2443
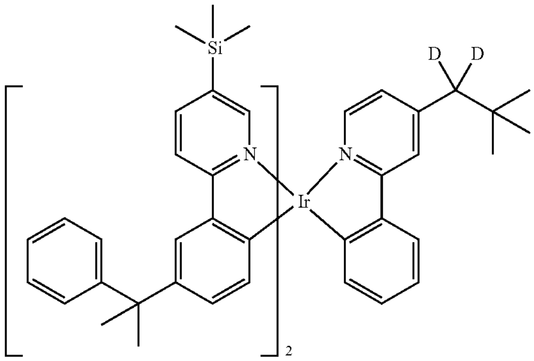
-continued
2444
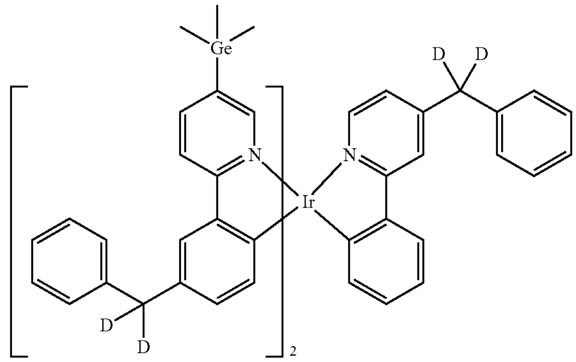
2445
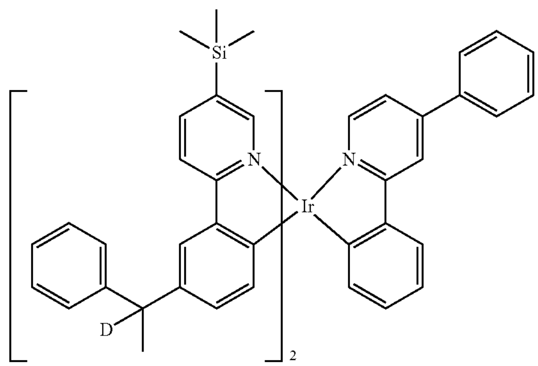
2446
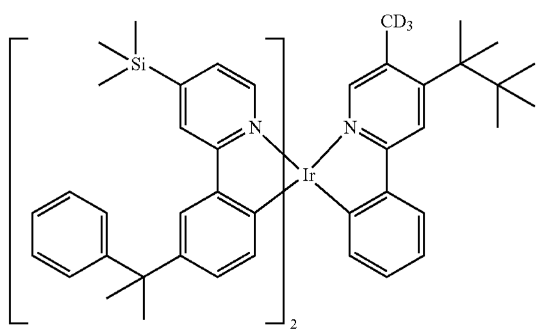
2447
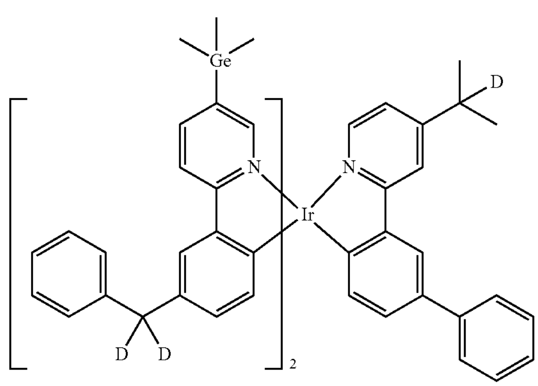

-continued
2448
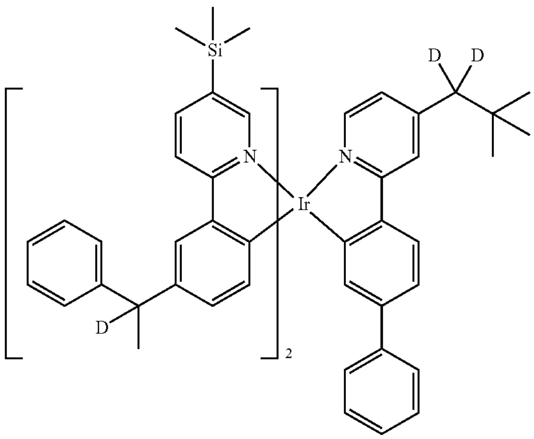
2449
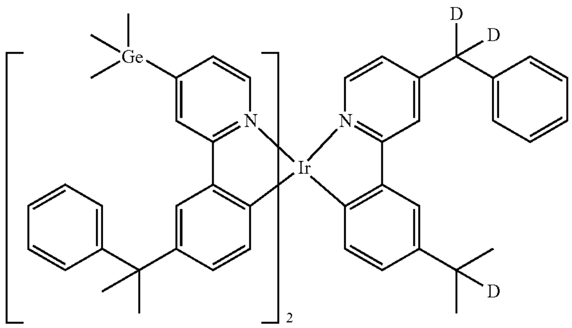
2450
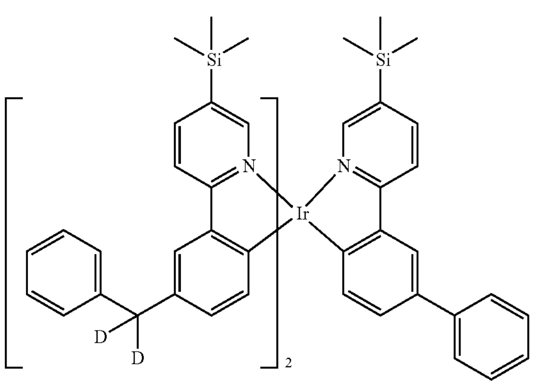
2451
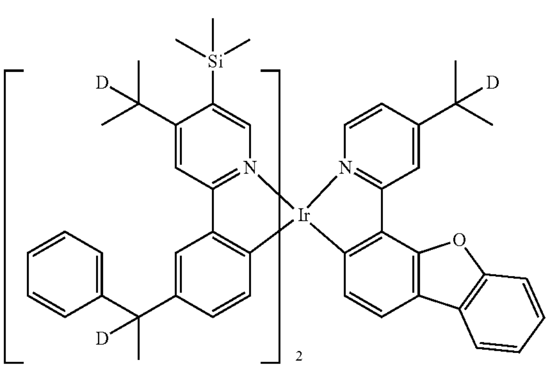
-continued
2452
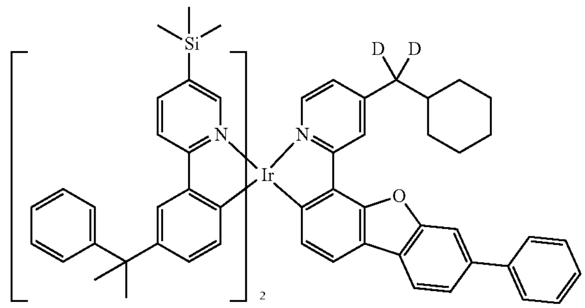
2453
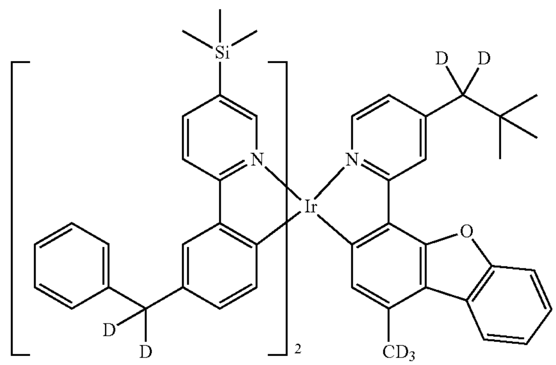
2454
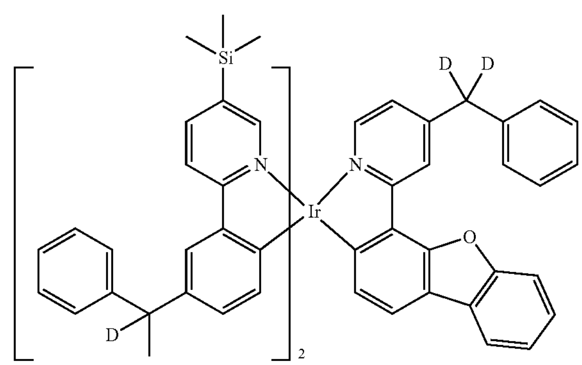
2455
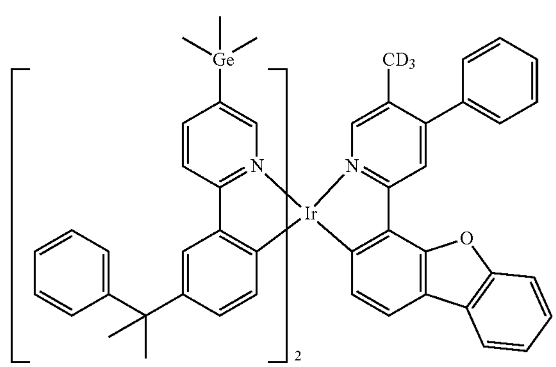

-continued
2456
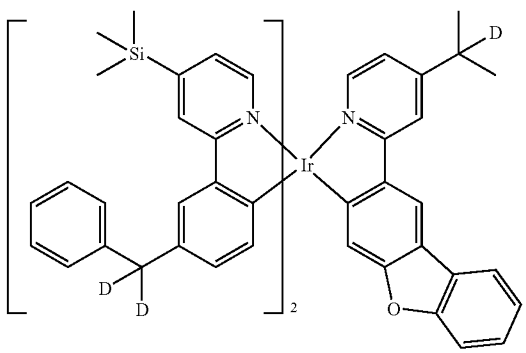
2457
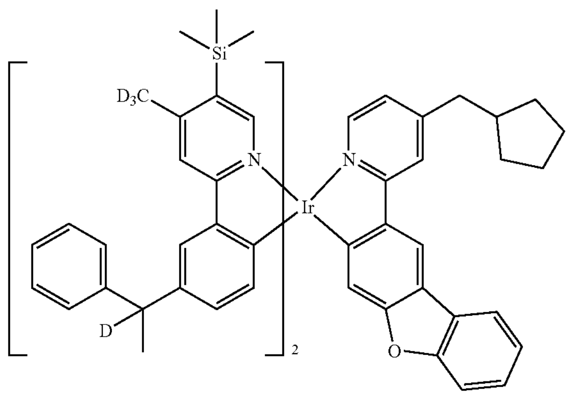
2458
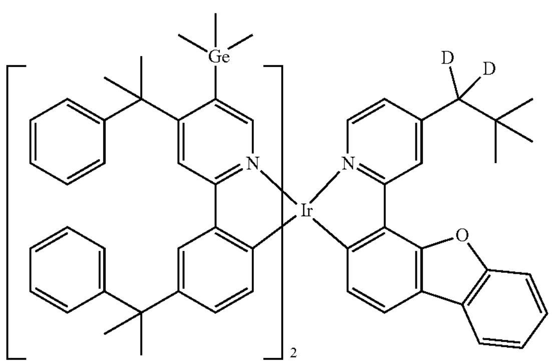
2459
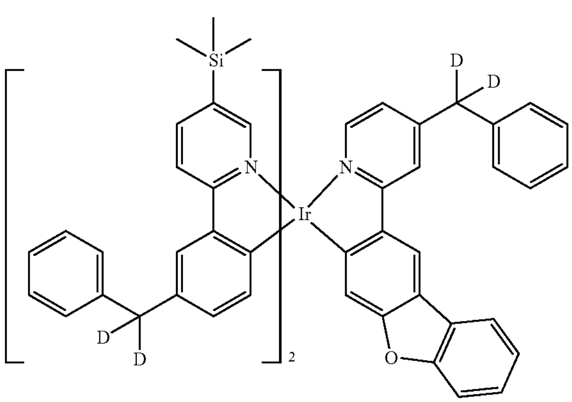
-continued
2460
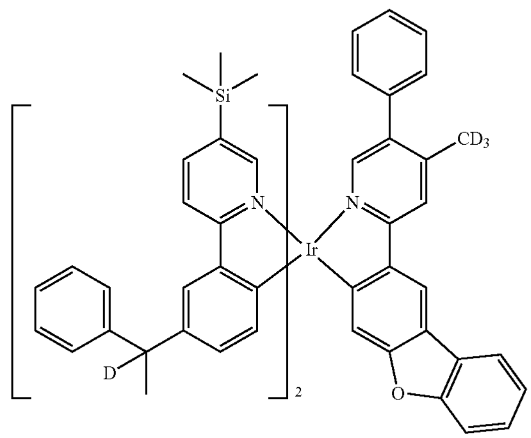
2461
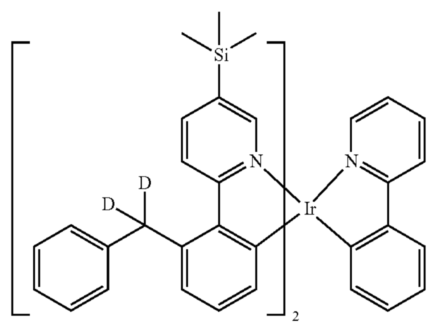
2462
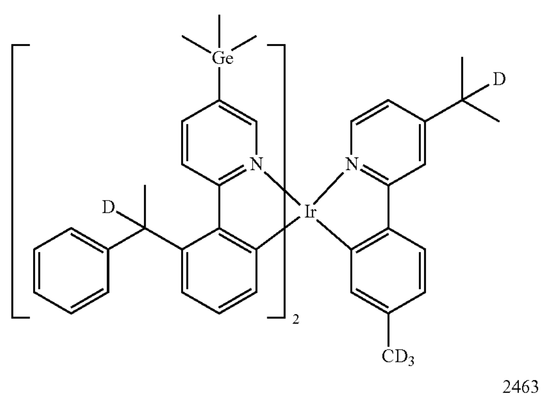
2463
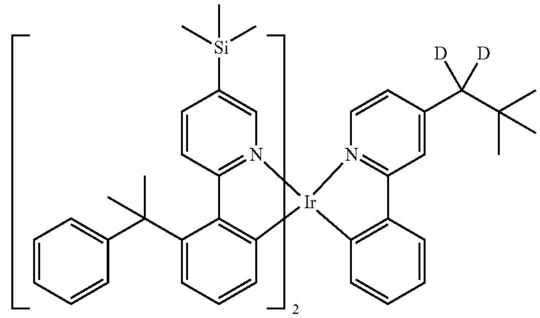

-continued
2464
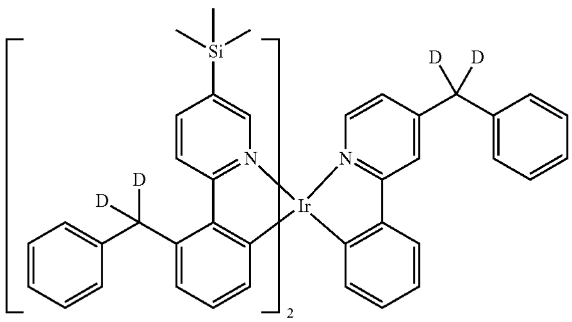
2465
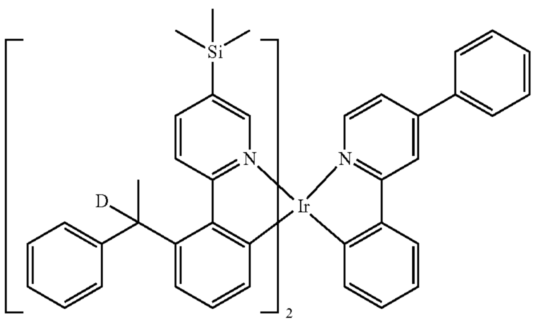
2466
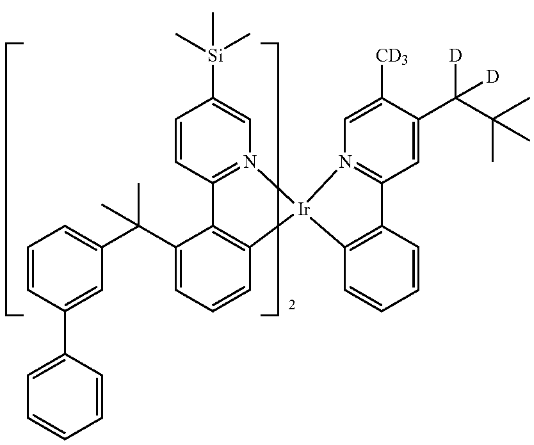
2467
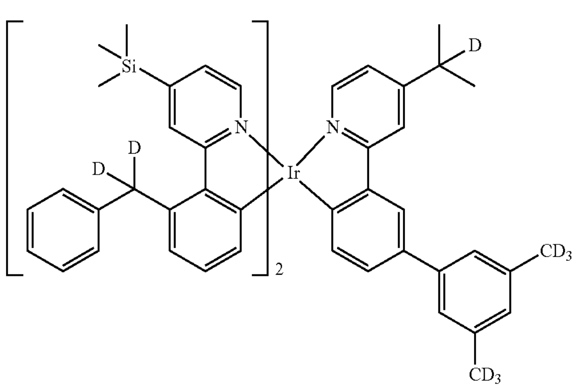
-continued
2468
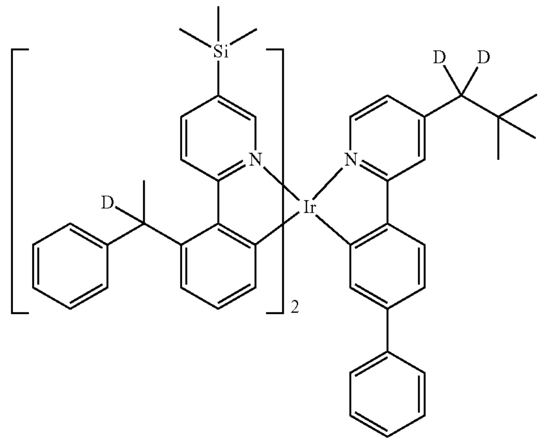
2469
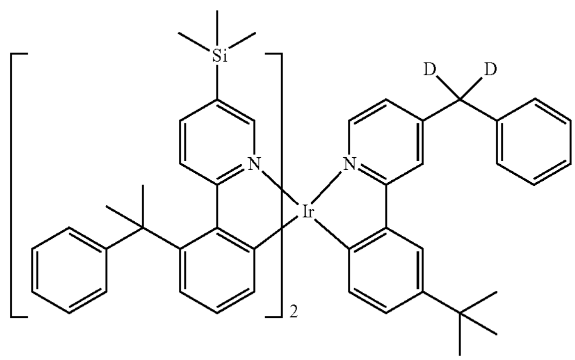
2470
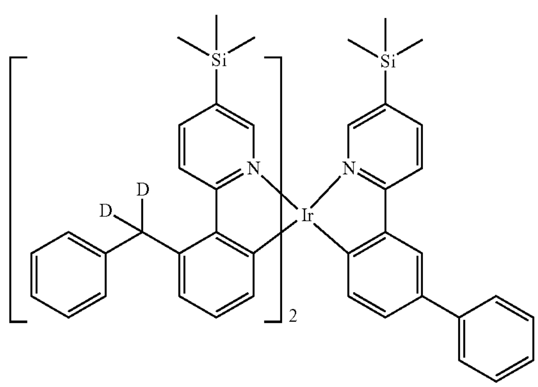
2471
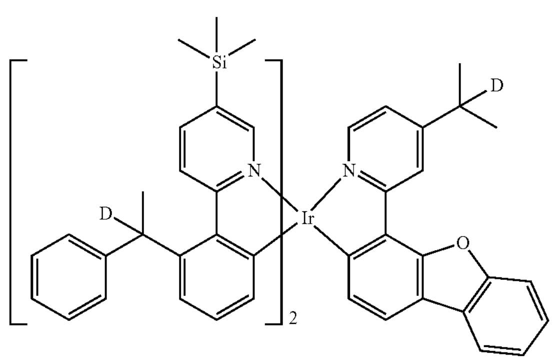

2472
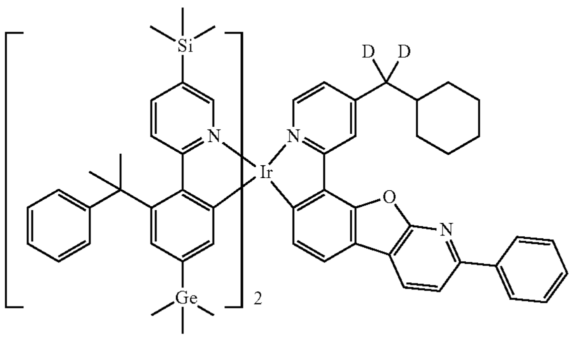
2473
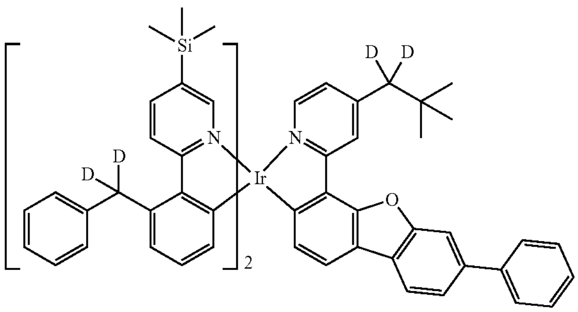
2474
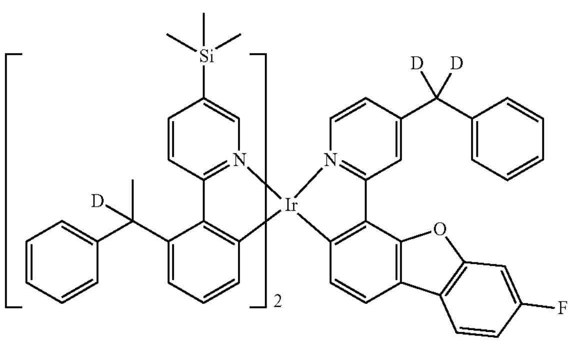
2475
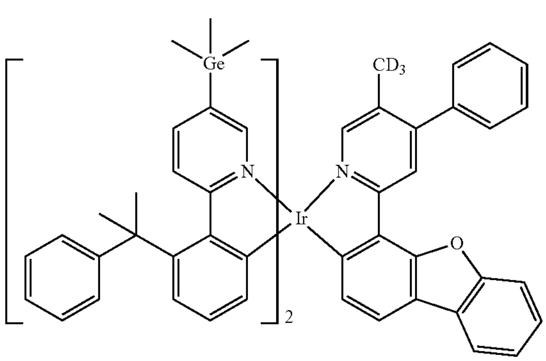
2476
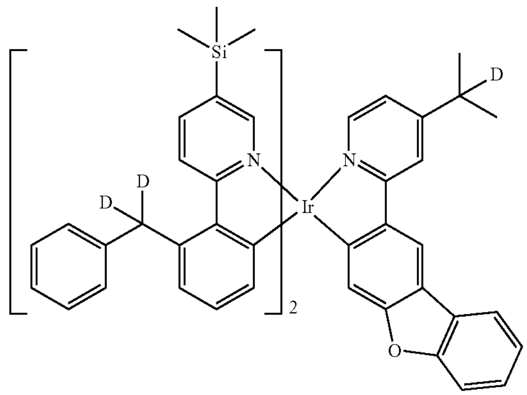
2477
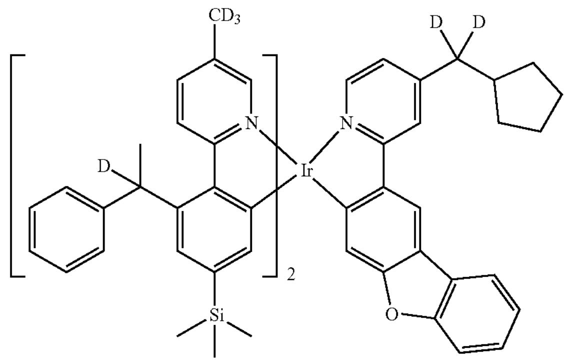
2478
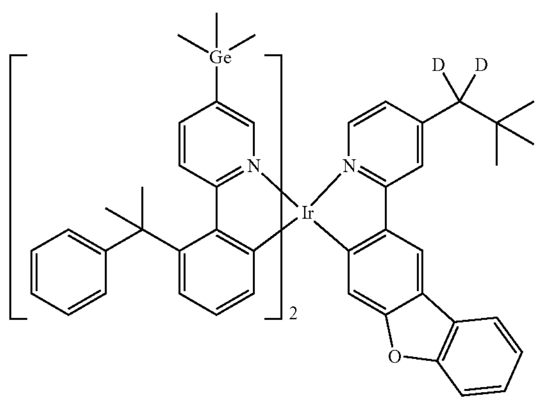
2479
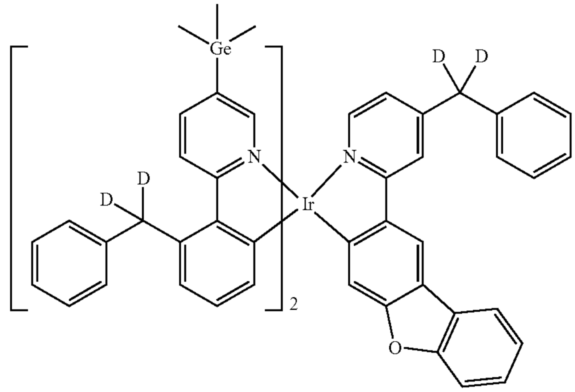

2480
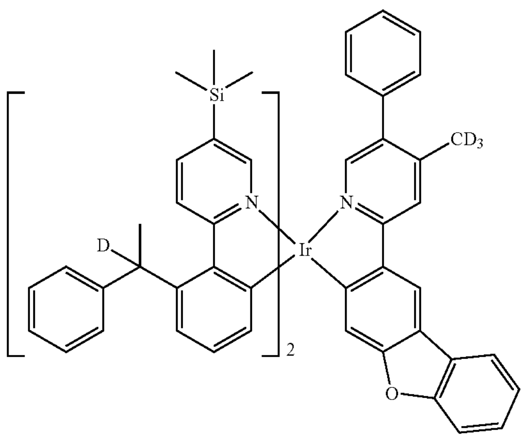
2481
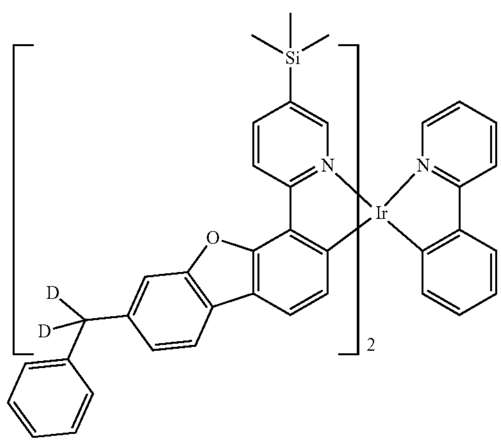
2482
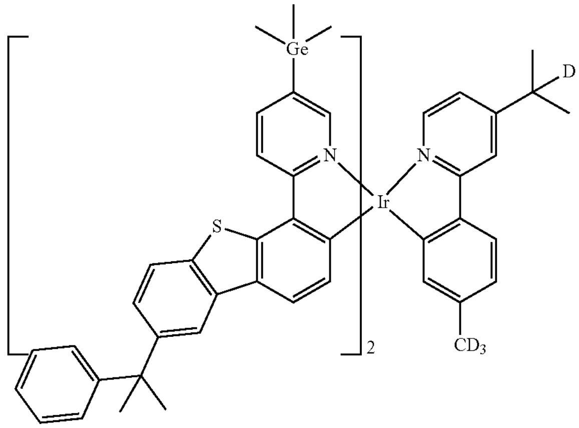
2483
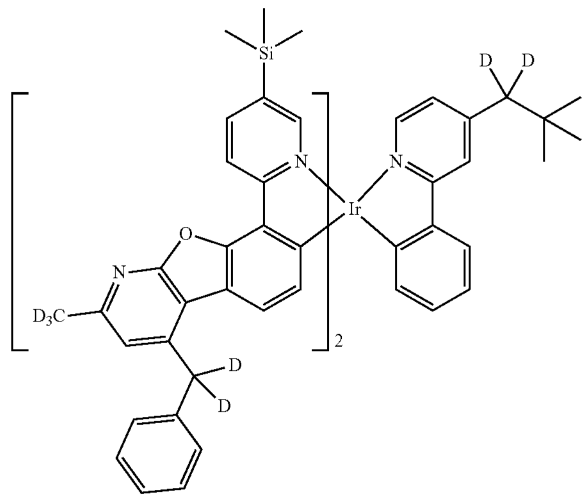
2484
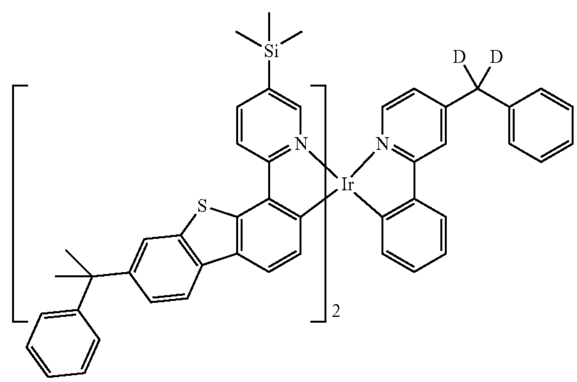
2485
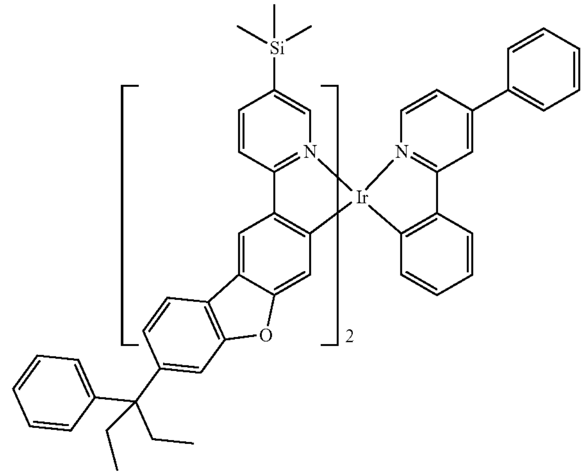

2486
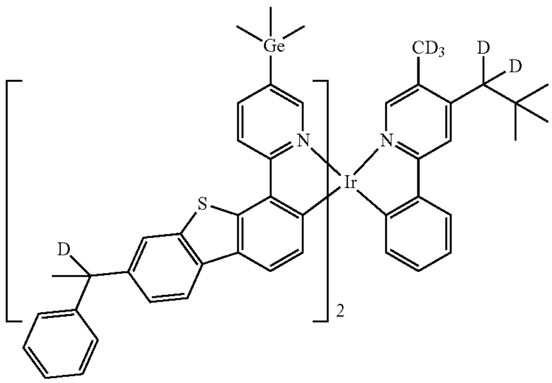
2487
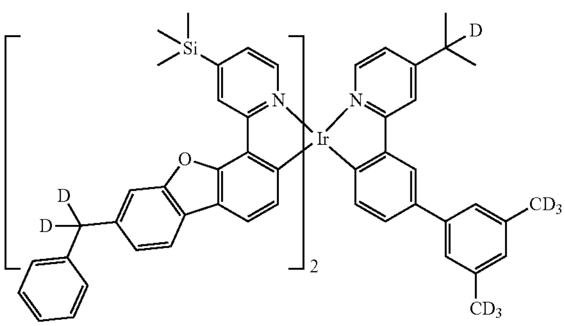
2488
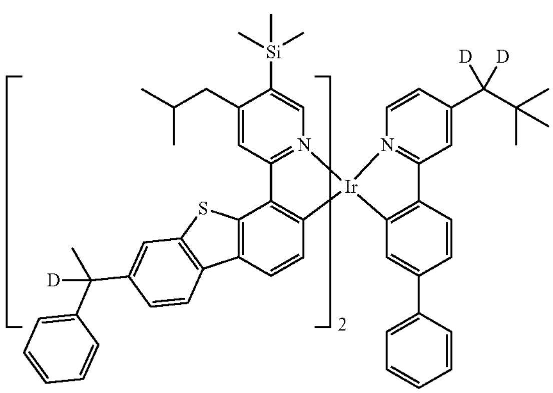
2489
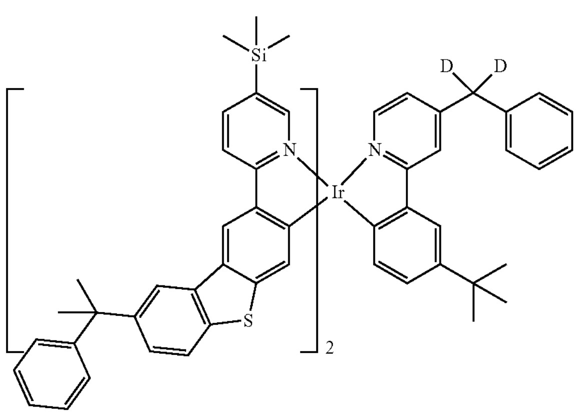
2490
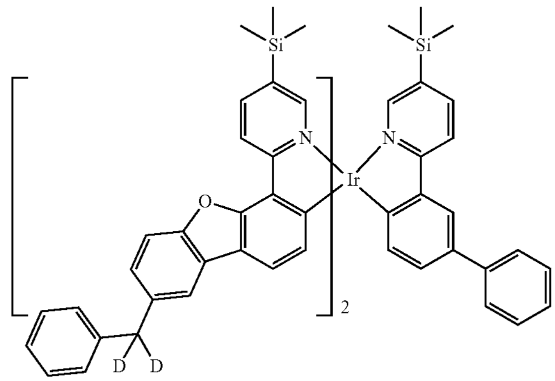
2491
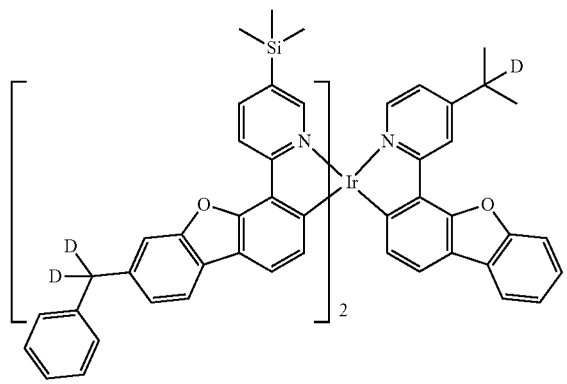
2492
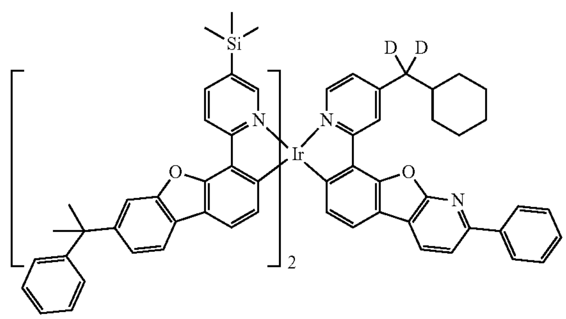
2493
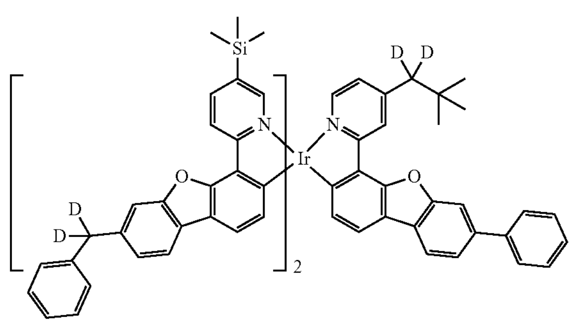

-continued
2494
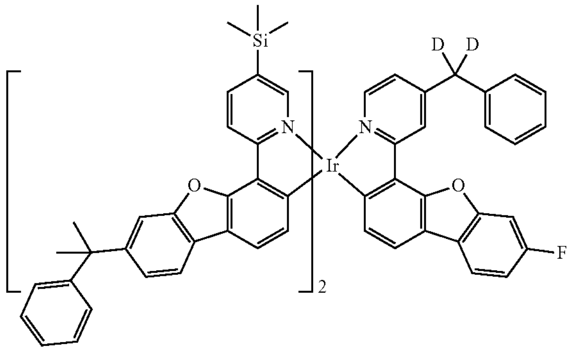
2495
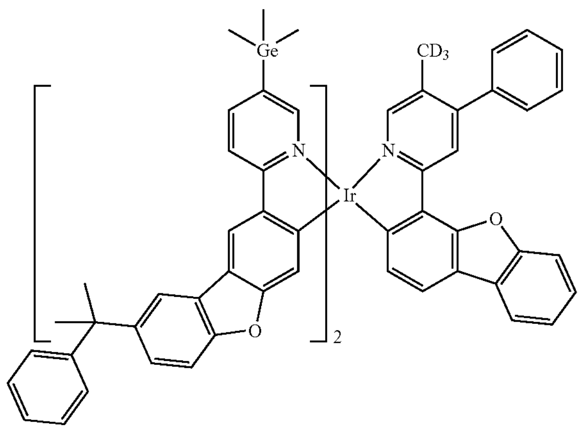
2496
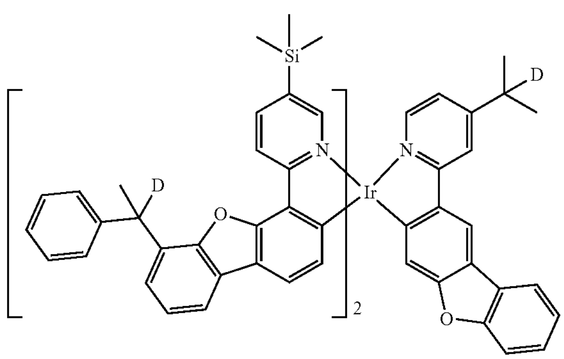
2497
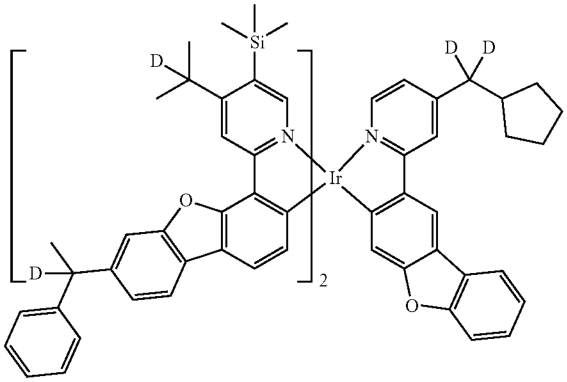
-continued
2498
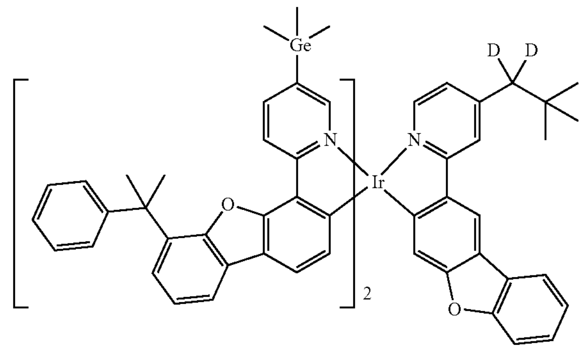
2499
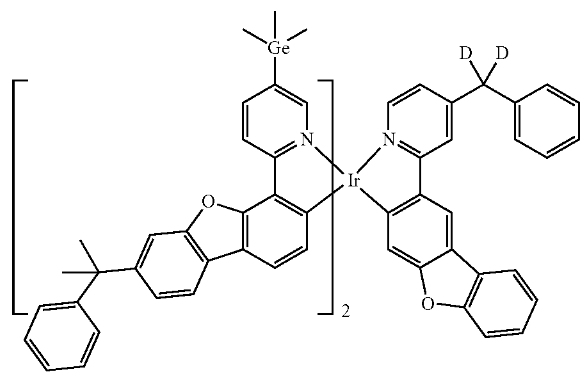
2500
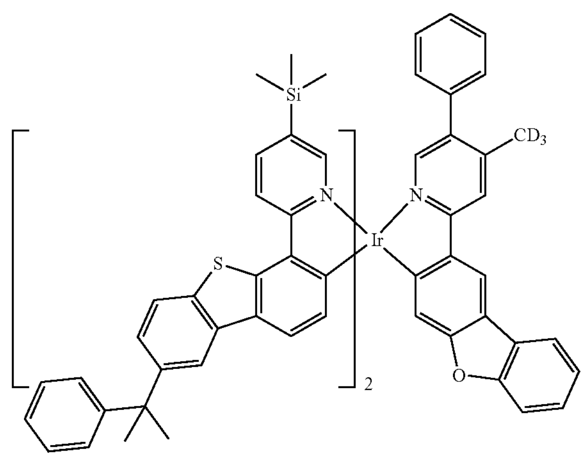
2501
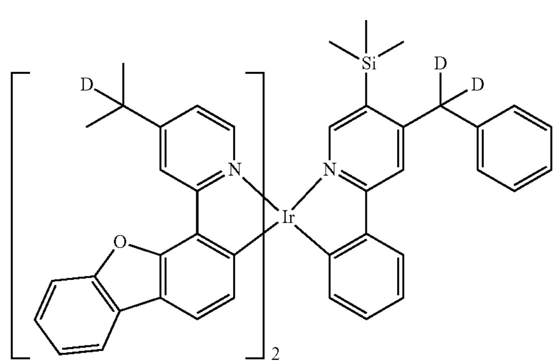

-continued
2502
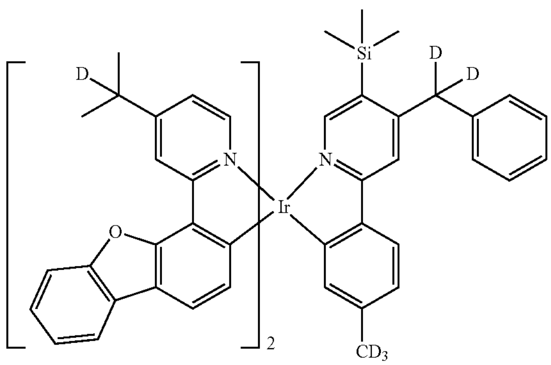
2503
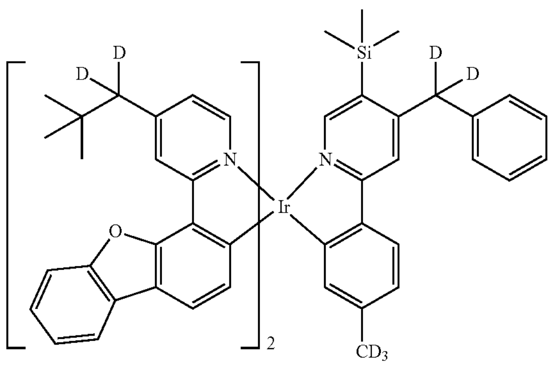
2504
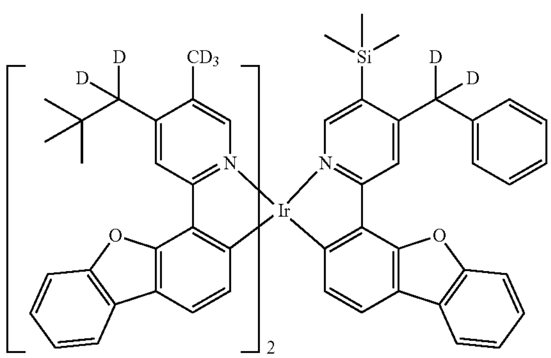
2505
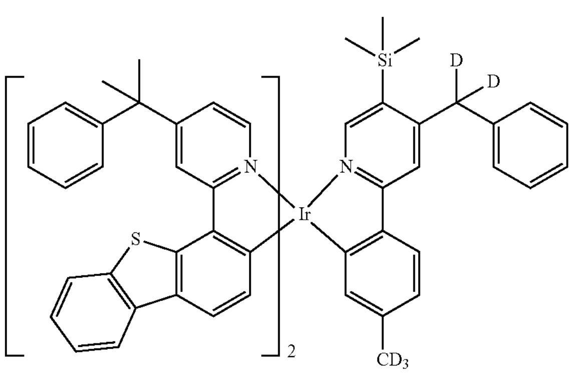
-continued
2506
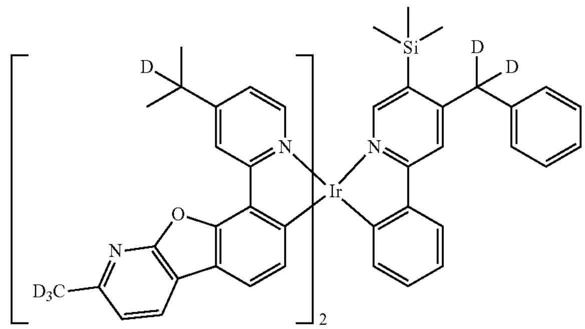
2507
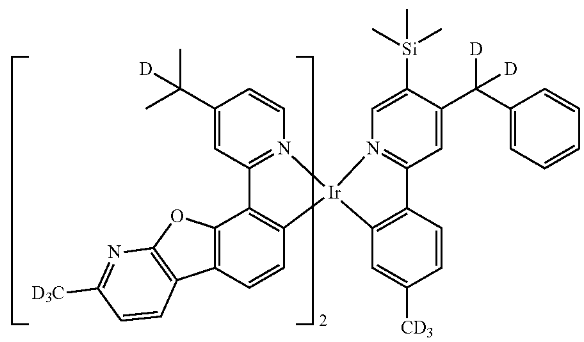
2508
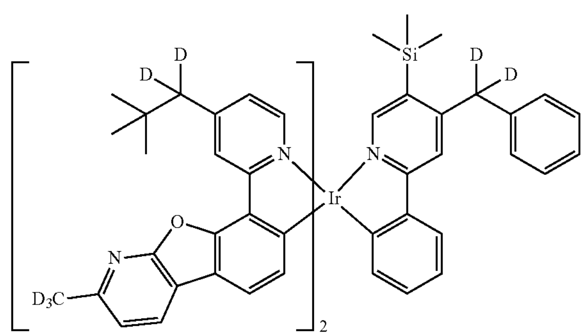
2509
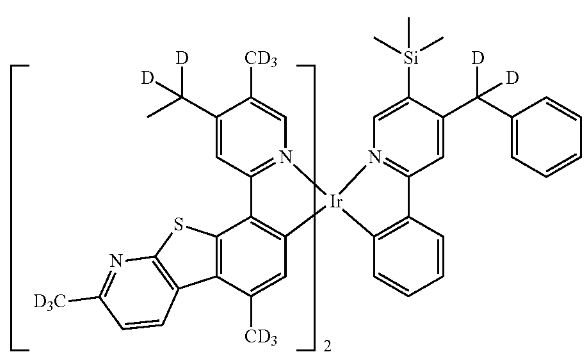

-continued
2510
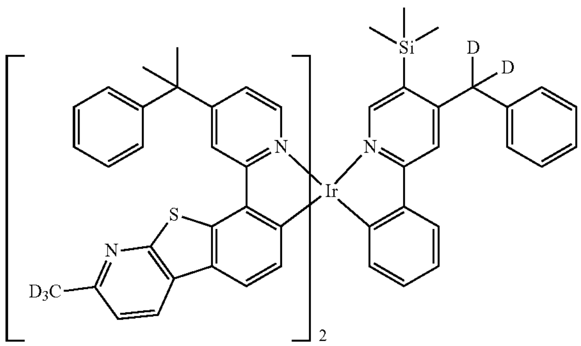
2511
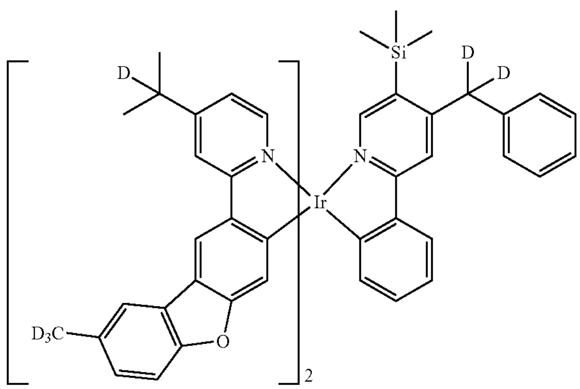
2512
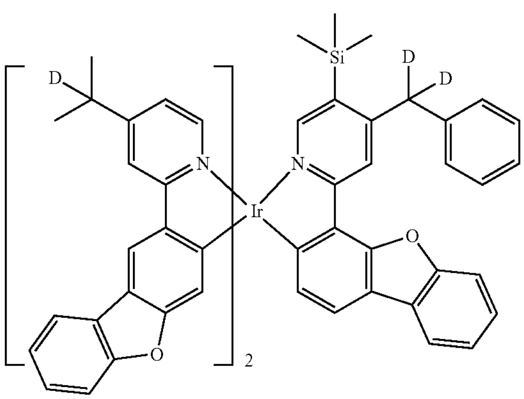
2513
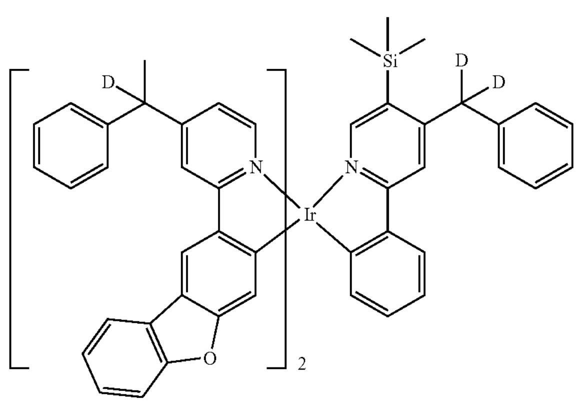
-continued
2514
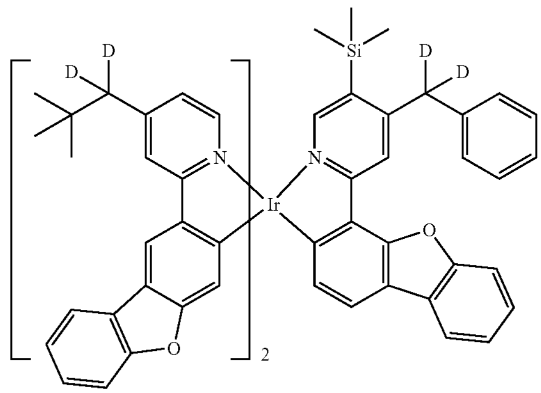
2515
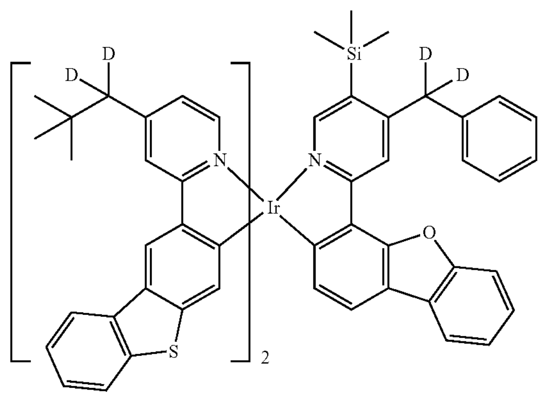
2516
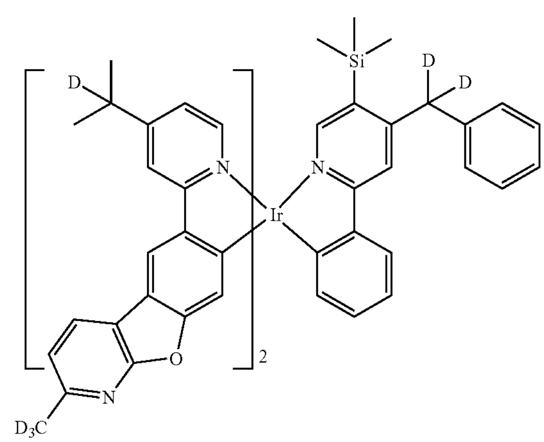

-continued
2517
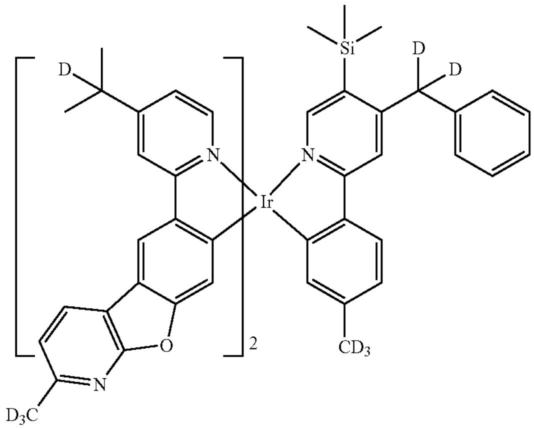
2518
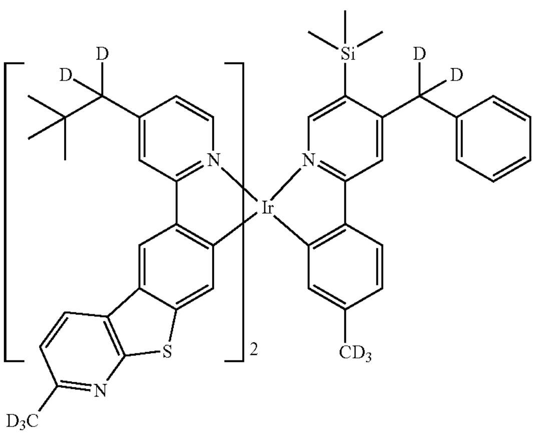
2519
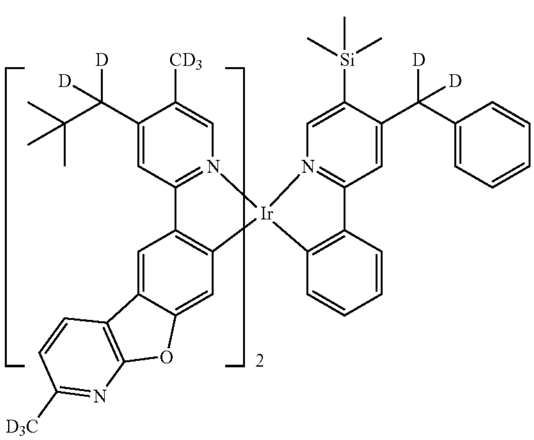
-continued
2520
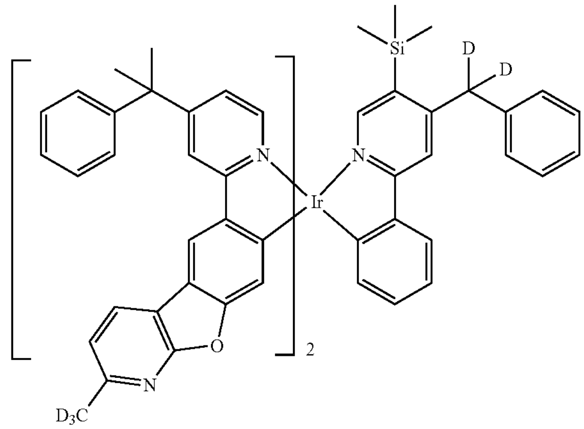
2521
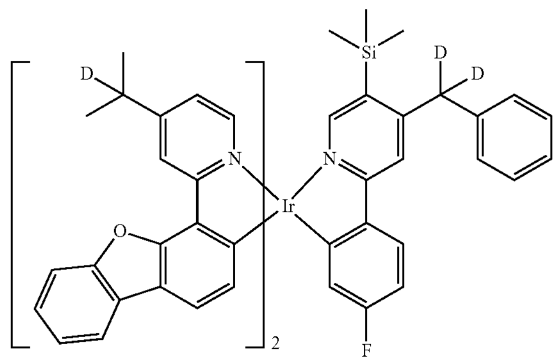
2522
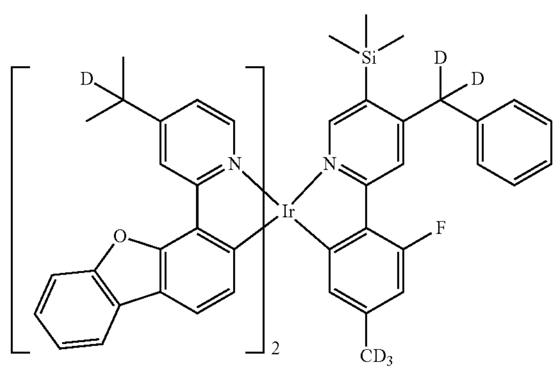
2523
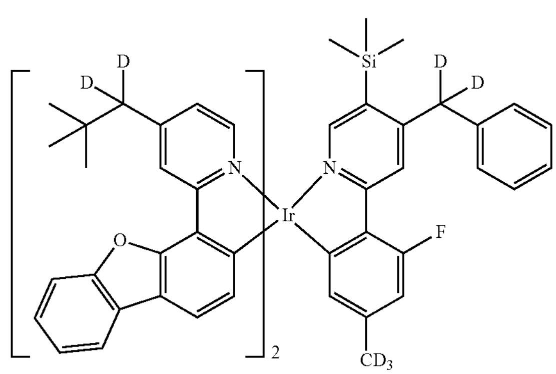

-continued
2524
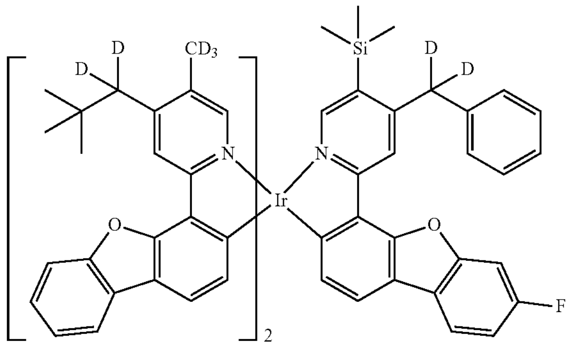
2525
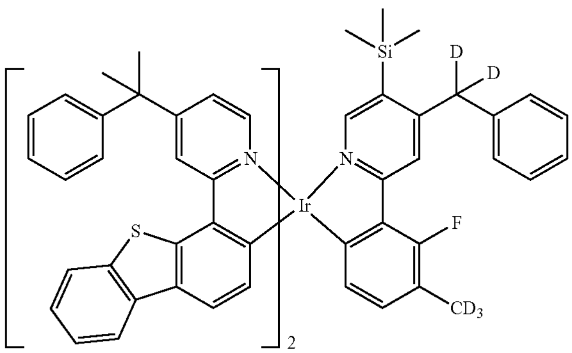
2526
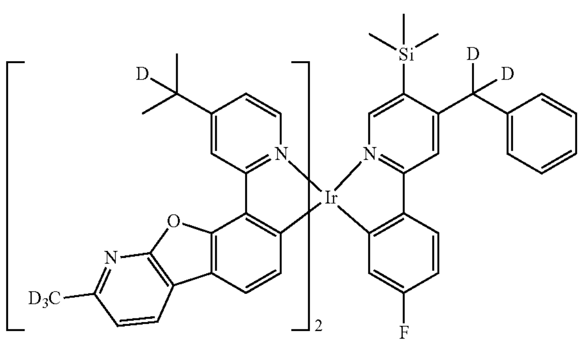
2527
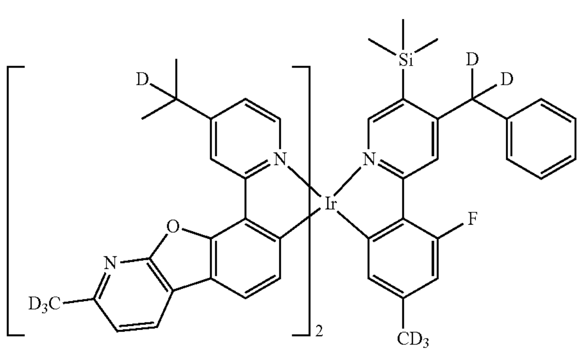
-continued
2528
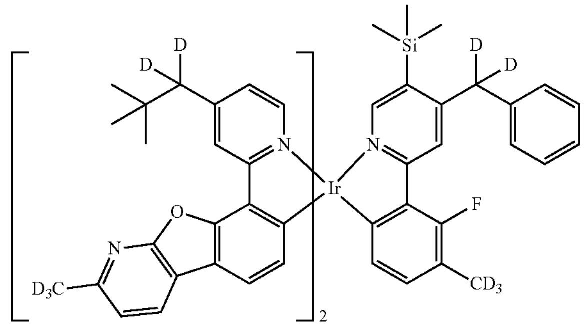
2529
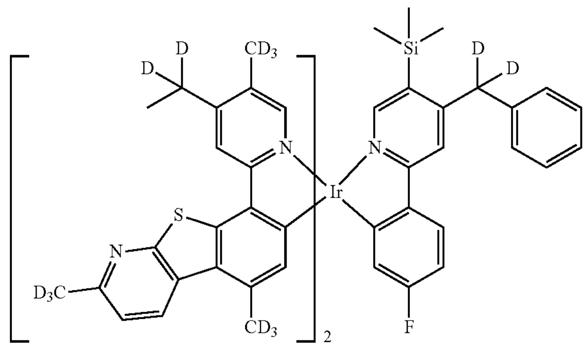
2530
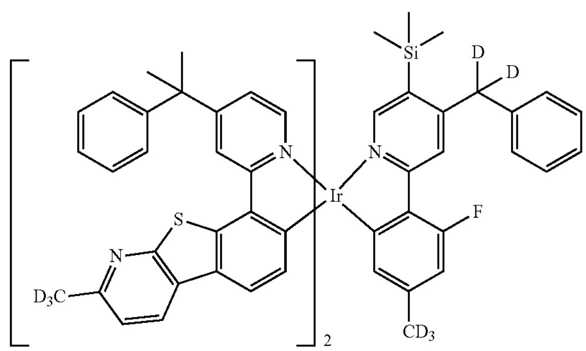
2531
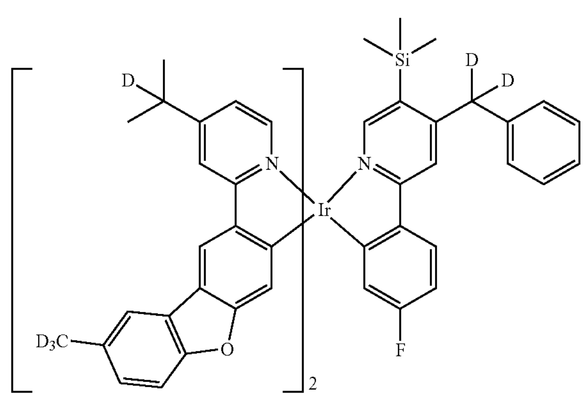

-continued
2532
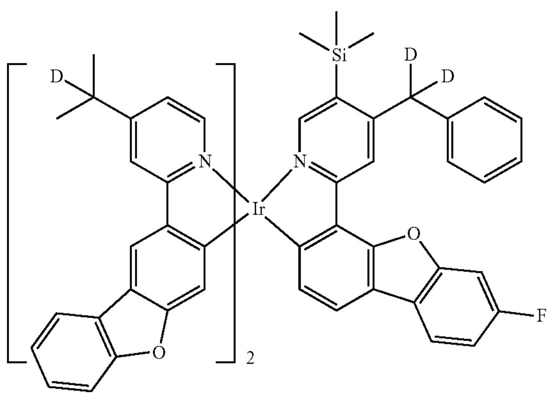
2533
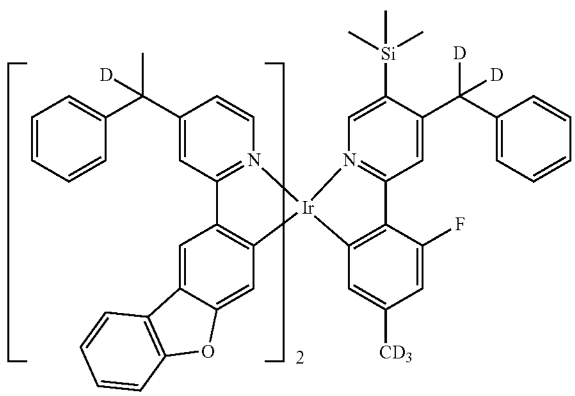
2534
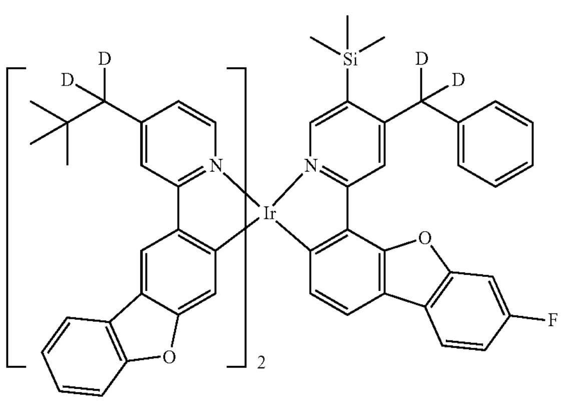
2535
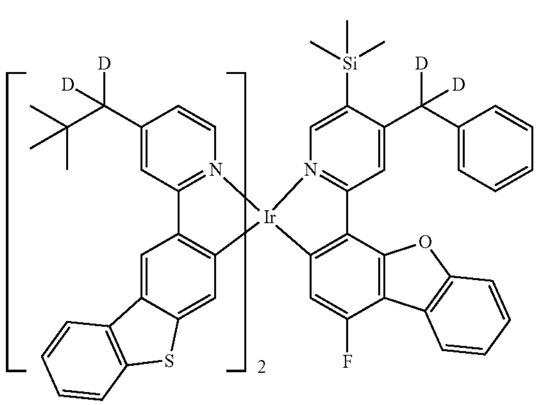
-continued
2536
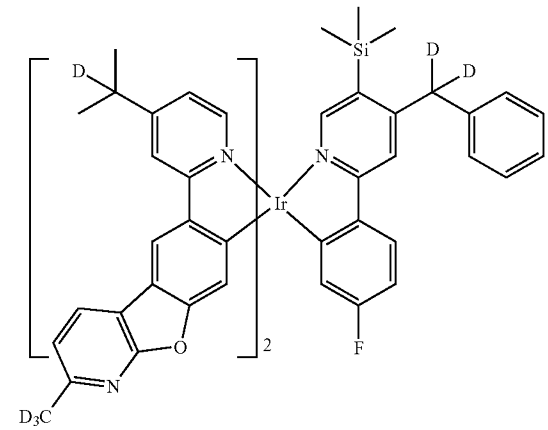
2537
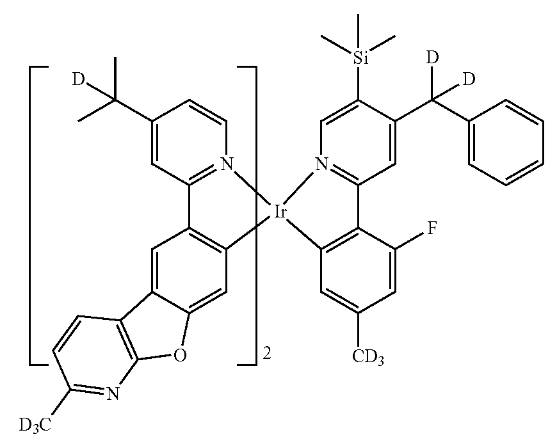
2538
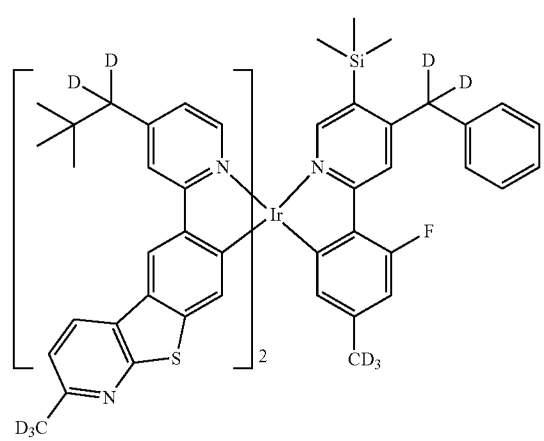

-continued
2539
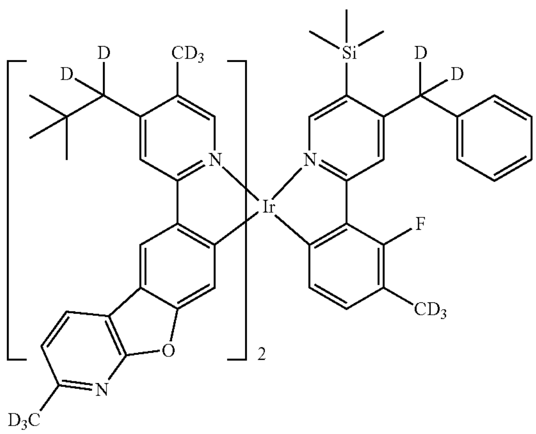
2540
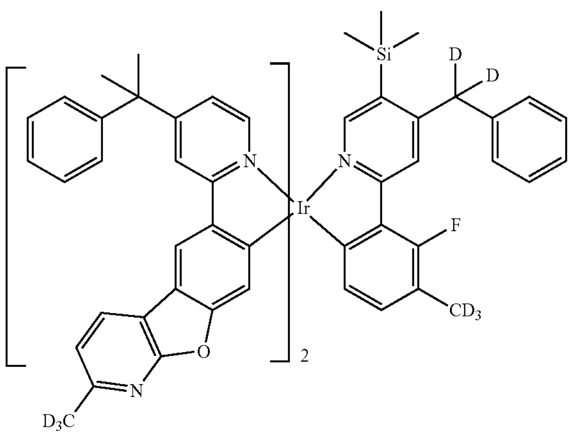
2541
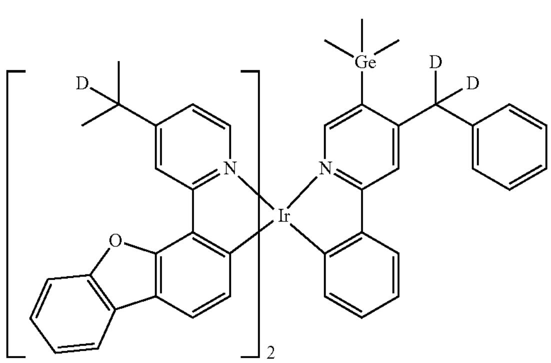
-continued
2542
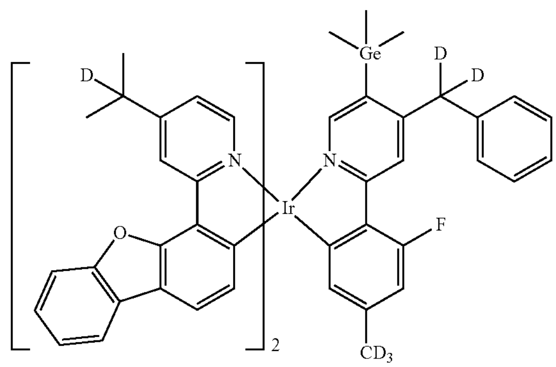
2543
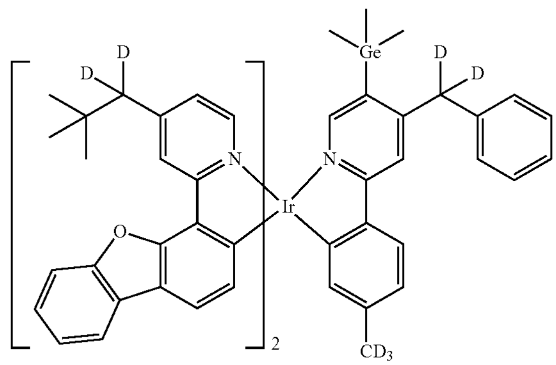
2544
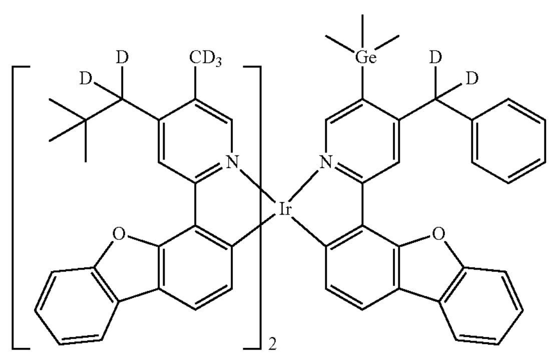
2545
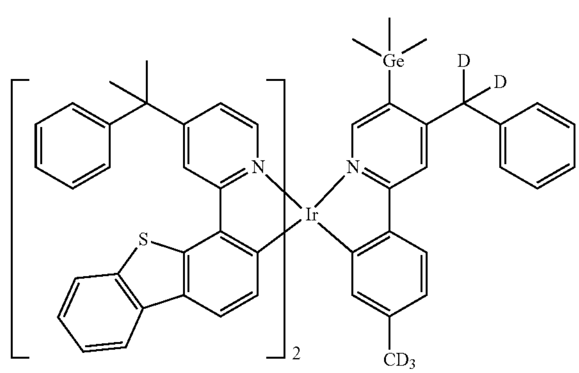

-continued
2546
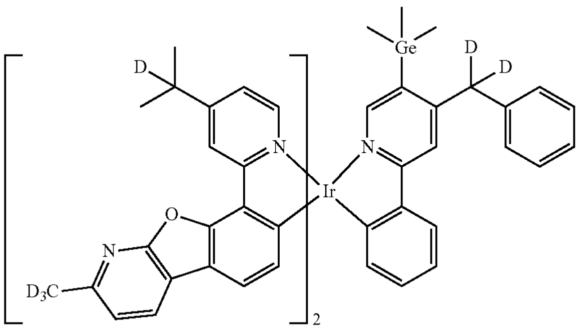
2547
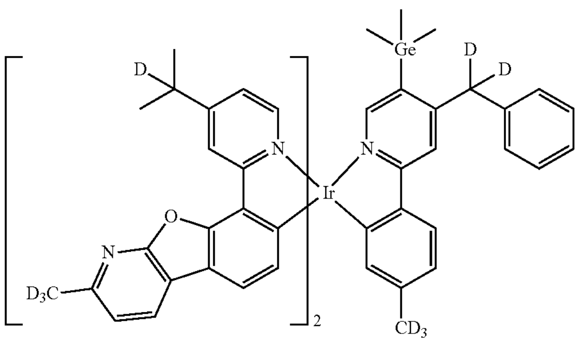
2548
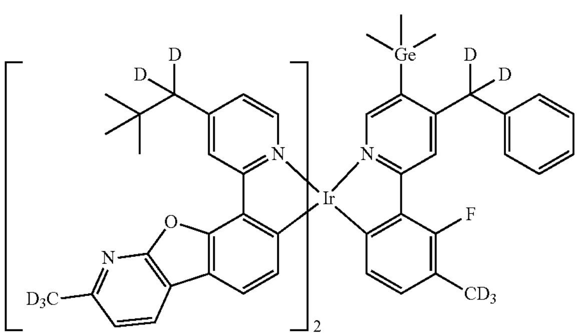
2549
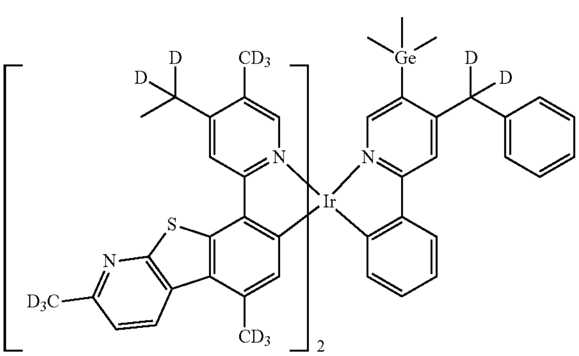
-continued
2550
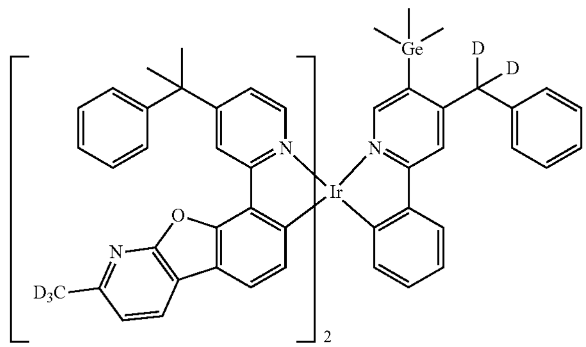
2551
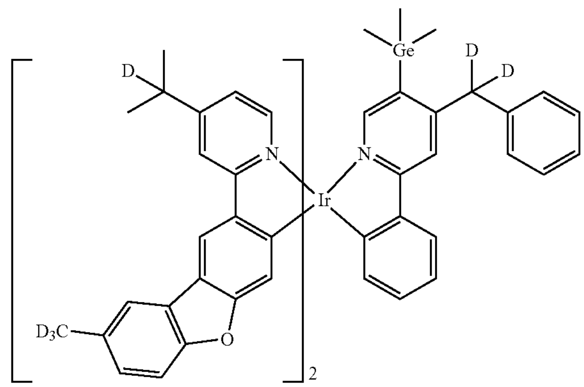
2552
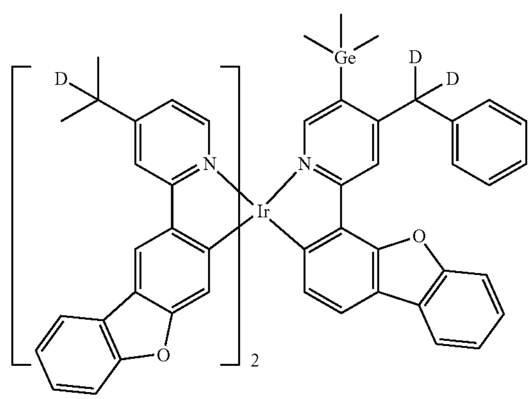
2553
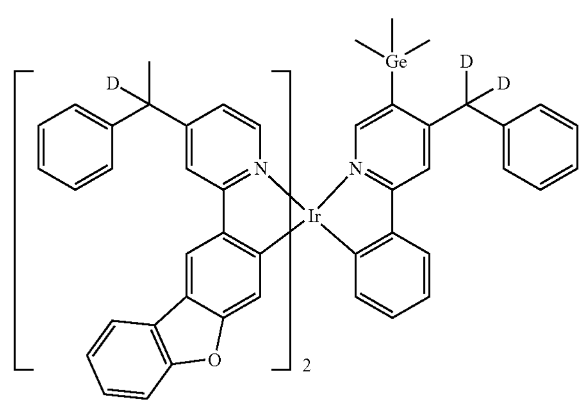

-continued
2554
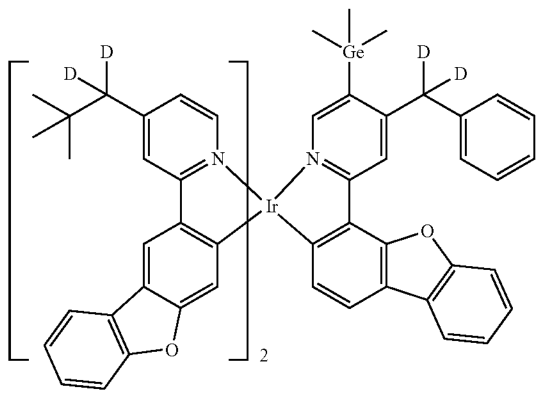
2555
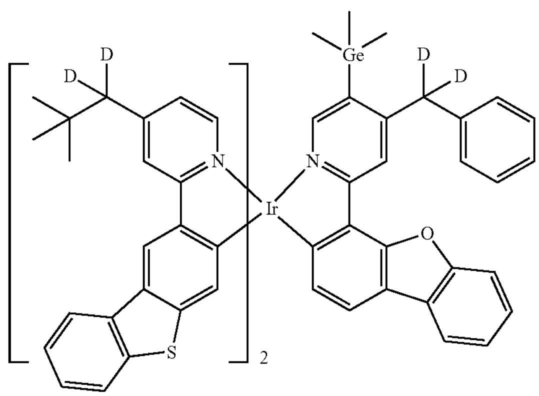
2556
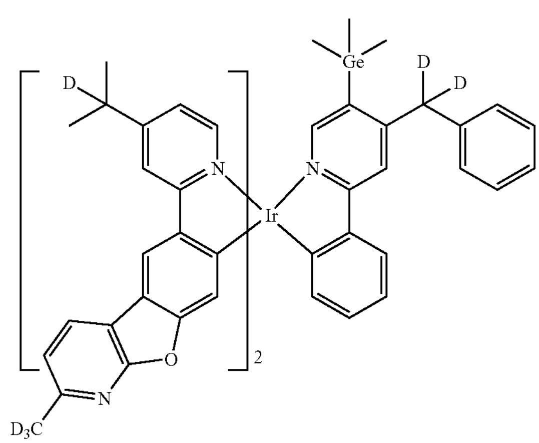
-continued
2557
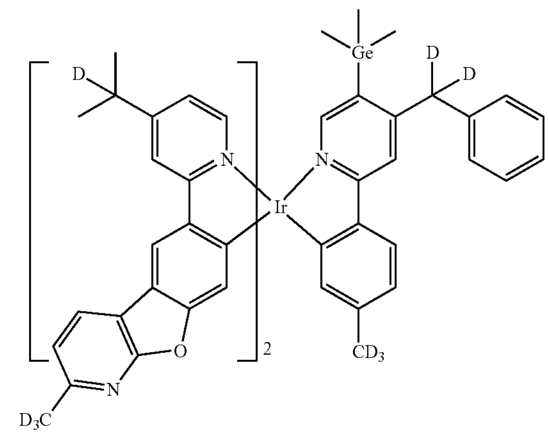
2558
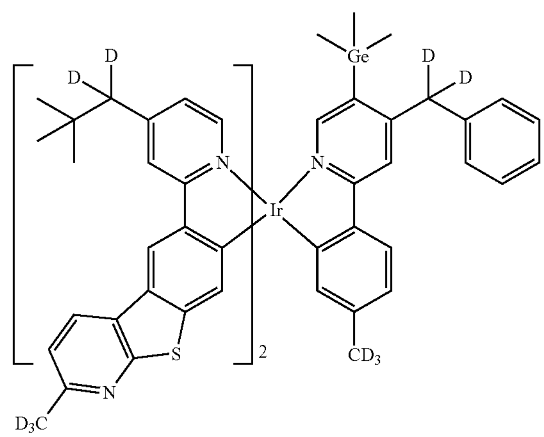
2559
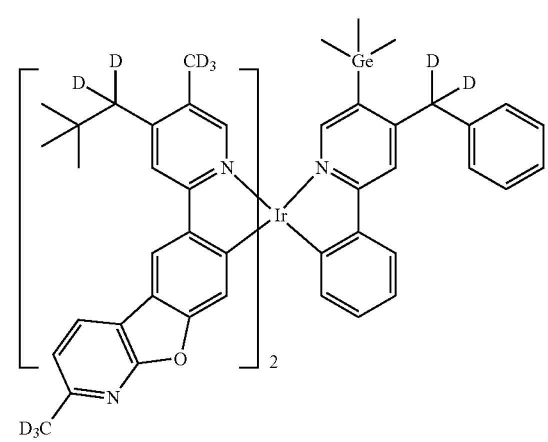

-continued

2560

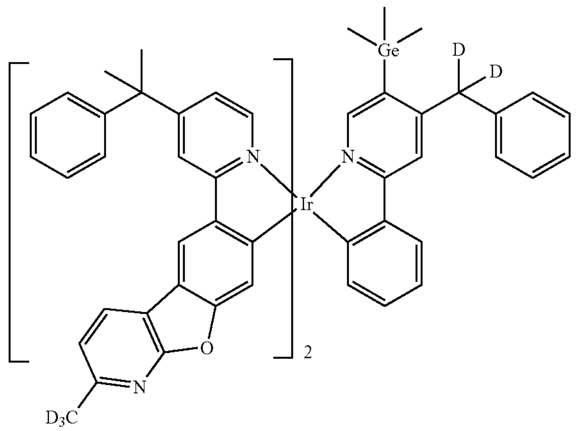

In Formula 1, $L_1$ may be a ligand represented by Formula 2, and n1 may be 1, 2, or 3, wherein, when n1 is 3, two or more of three $L_1$ groups may be different from each other. In addition, n2 which indicates the number of $L_2$ groups in Formula 1 may 0, 1, 2, 3 or 4. Here, $L_1$ and $L_2$ may be different from each other. That is, the organometallic compound represented by Formula 1 may be a heteroleptic complex including at least one ligand represented by Formula 2.

Furthermore, $Z_1$ and $Z_2$ in Formula 2 may each be a group represented by Formula 3, $Q_{51}$ to $Q_{53}$ in Formula 3 may each be bonded to a carbon atom, $Q_{53}$ in Formula 3 may be a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, and the sum of b1 and b2, which indicate the number of $Z_1$ groups and the number of $Z_2$ groups, respectively, may be 1 or more. That is, the ligand represented by Formula 2 may include at least one group represented by Formula 3.

Accordingly, the organometallic compound represented by Formula 1 may have excellent thermal and/or electrical stability, and improved orientation characteristics, so that an electronic device, such as an organic light-emitting device, including the organometallic compound represented by Formula 1 may have excellent luminescence efficiency and/or lifespan characteristics.

The highest occupied molecular orbital (HOMO) energy level, lowest unoccupied molecular orbital (LUMO) energy level, Si energy level, and $T_1$ energy level of some compounds of the organometallic compound represented by Formula 1 are evaluated using the Gaussian 09 program with the molecular structure optimization obtained by B3LYP-based density functional theory (DFT), and results thereof are shown in Table 1. The energy levels are in electron volts (eV).

TABLE 1

| Compound No. | HOMO (eV) | LUMO (eV) | $S_1$ (eV) | $T_1$ (eV) |
|---|---|---|---|---|
| 361 | −4.777 | −1.201 | 2.872 | 2.514 |
| 716 | −4.705 | −1.172 | 2.848 | 2.497 |
| 771 | −4.791 | −1.220 | 2.878 | 2.533 |

TABLE 1-continued

| Compound No. | HOMO (eV) | LUMO (eV) | $S_1$ (eV) | $T_1$ (eV) |
|---|---|---|---|---|
| 1653 | −4.664 | −1.078 | 2.861 | 2.519 |
| 1693 | −4.700 | −1.100 | 2.875 | 2.520 |

From Table 1, it is confirmed that the organometallic compound represented by Formula 1 has such electric characteristics that are suitable for use as a dopant for an electronic device, for example, an organic light-emitting device.

Synthesis methods of the organometallic compound represented by Formula 1 may be recognizable by one of ordinary skill in the art by referring to Synthesis Examples provided below.

Accordingly, the organometallic compound represented by Formula 1 may be suitable for use as a material for forming an organic layer of an organic light-emitting device, for example, a dopant in an emission layer of an organic layer. Thus, another aspect of the present disclosure provides an organic light-emitting device including: a first electrode; a second electrode; and an organic layer arranged between the first electrode and the second electrode and including an emission layer, wherein the organic layer includes at least one organometallic compound represented by Formula 1.

The organic light-emitting device may have, due to the inclusion of an organic layer including the organometallic compound represented by Formula 1, high external quantum efficiency and long lifespan characteristics.

The organometallic compound of Formula 1 may be used between a pair of electrodes of the organic light-emitting device. For example, the organometallic compound represented by Formula 1 may be included in the emission layer. In this regard, the organometallic compound may function as a dopant, and the emission layer may further include a host (wherein, an amount of the organometallic compound represented by Formula 1 is smaller than that of the host). The emission layer may emit, for example, green light or blue light.

The expression "(an organic layer) includes at least one of organometallic compound" as used herein may include a case in which "(an organic layer) includes identical organometallic compounds represented by Formula 1" and a case in which "(an organic layer) includes two or more different organometallic compounds represented by Formula 1".

In one or more embodiments, the organic layer may include, as the organometallic compound, only Compound 1. In this embodiment, Compound 1 may be included in the emission layer of the organic light-emitting device. In one or more embodiments, the organic layer may include, as the organometallic compound, Compound 1, and Compound 2. In this embodiment, Compound 1 and Compound 2 may exist in an identical layer (for example, Compound 1 and Compound 2 all may exist in an emission layer).

In one or more embodiments, the first electrode may be an anode, which is a hole injection electrode, and the second electrode may be a cathode, which is an electron injection electrode. In one or more embodiments, the first electrode may be a cathode, which is an electron injection electrode, and the second electrode may be an anode, which is a hole injection electrode.

For example, in the organic light-emitting device, the first electrode may be an anode, and the second electrode may be a cathode, and the organic layer may further include a hole transport region disposed between the first electrode and the emission layer and an electron transport region disposed between the emission layer and the second electrode, wherein and the hole transport region may include a hole injection layer, a hole transport layer, an electron blocking layer, a buffer layer, or a combination thereof, and the electron transport region may include a hole blocking layer, an electron transport layer, an electron injection layer, or a combination thereof.

The term "organic layer" as used herein refers to a single layer and/or a plurality of layers between the first electrode and the second electrode of the organic light-emitting device. The "organic layer" may include, in addition to an organic compound, an organometallic complex including metal.

FIG. is a schematic cross-sectional view of an organic light-emitting device 10 according to one or more embodiments. Hereinafter, a structure of an organic light-emitting device according to an embodiment of the present disclosure and a method of manufacturing an organic light-emitting device according to one or more embodiments of the present disclosure will be described in connection with the FIGURE. The organic light-emitting device 10 includes a first electrode 11, an organic layer 15, and a second electrode 19, which are sequentially stacked.

A substrate may be additionally arranged under the first electrode 11 or above the second electrode 19. For use as the substrate, any substrate that is used in organic light-emitting devices available in the art may be used, and the substrate may be a glass substrate or a transparent plastic substrate, each having excellent mechanical strength, thermal stability, transparency, surface smoothness, ease of handling, and water resistance.

The first electrode 11 may be, for example, formed by depositing or sputtering a material for forming the first electrode 11 on the substrate. The first electrode 11 may be an anode. The material for forming the first electrode 11 may include materials with a high work function to facilitate hole injection. The first electrode 11 may be a reflective electrode, a semi-transmissive electrode, or a transmissive electrode. In one or more embodiments, the material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO.

The organic layer 15 is arranged on the first electrode 11.

The organic layer 15 may include: a hole transport region; an emission layer; and an electron transport region.

The hole transport region may be disposed between the first electrode 11 and the emission layer.

The hole transport region may include a hole injection layer, a hole transport layer, an electron blocking layer, a buffer layer, or a combination thereof.

The hole transport region may include only either a hole injection layer or a hole transport layer. For example, the hole transport region may have a hole injection layer/hole transport layer structure or a hole injection layer/hole transport layer/electron blocking layer structure, wherein, for each structure, each layer is sequentially stacked on the first electrode 11.

When the hole transport region includes a hole injection layer, the hole injection layer may be formed on the first electrode 11 by using one or more suitable methods, for example, vacuum deposition, spin coating, casting, and/or Langmuir-Blodgett (LB) deposition.

When the hole injection layer is formed by vacuum deposition, the deposition conditions may vary according to a material that is used to form the hole injection layer, and the structure and thermal characteristics of the hole injection layer. For example, the deposition conditions may include a deposition temperature in a range of about 100° C. to about 500° C., a vacuum pressure in a range about $10^{-8}$ torr to about $10^{-3}$ torr, and a deposition rate in a range of about 0.01 Å/sec to about 100 Å/sec.

When the hole injection layer is formed using spin coating, the coating conditions may vary according to a material that is used to form the hole injection layer, and the structure and thermal characteristics of the hole injection layer. For example, the coating speed may be in a range of about 2,000 rpm to about 5,000 rpm, and the temperature at which a heat treatment is performed to remove a solvent after coating may be in a range of about 80° C. to about 200° C.

Conditions for forming a hole transport layer and an electron blocking layer may be understood by referring to conditions for forming the hole injection layer.

The hole transport region may include m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, a compound represented by Formula 202, or a combination thereof:

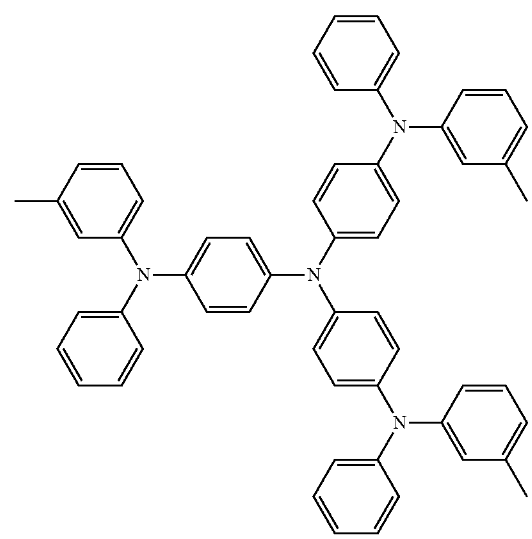

m-MTDATA

-continued
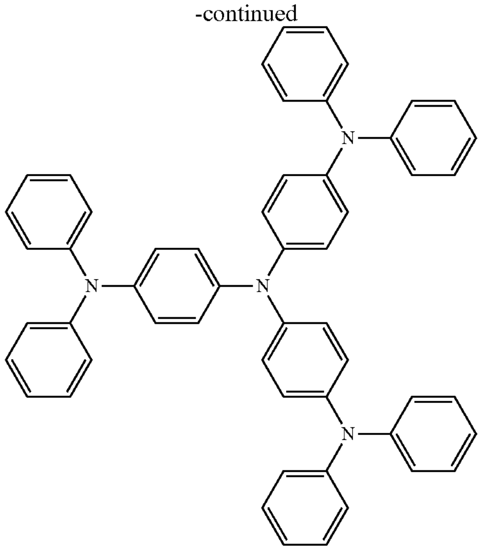
TDATA
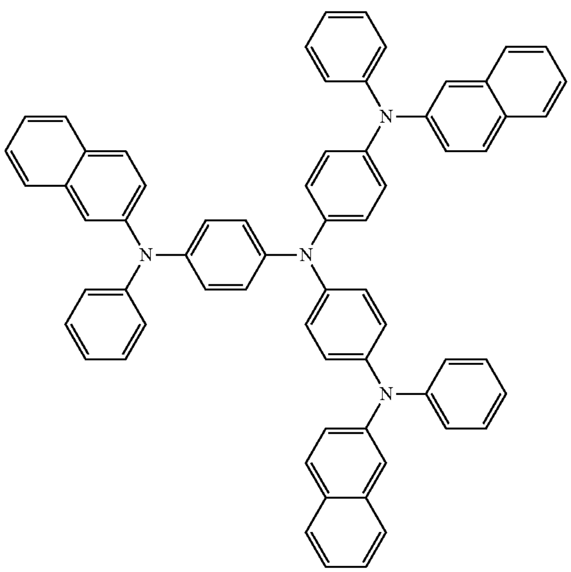
2-TNATA
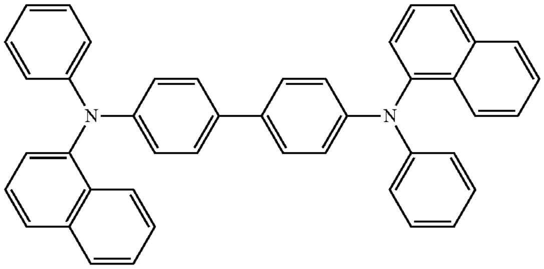
NPB
-continued
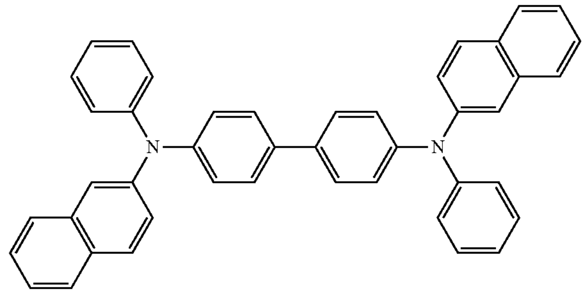
β-NPB
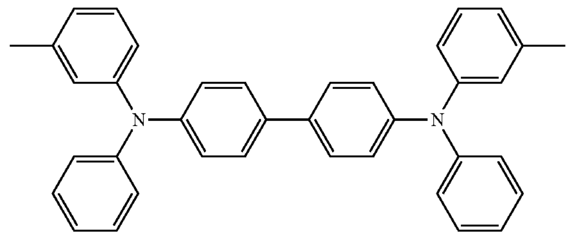
TPD
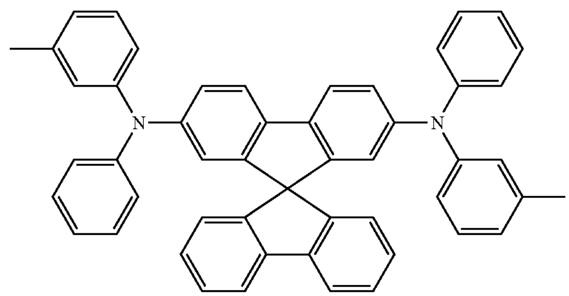
Spiro-TPD
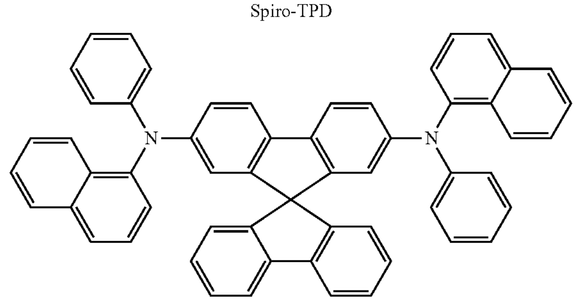
Spiro-NPB
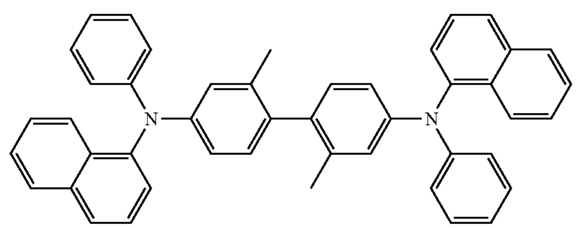
methylated NPB -continued

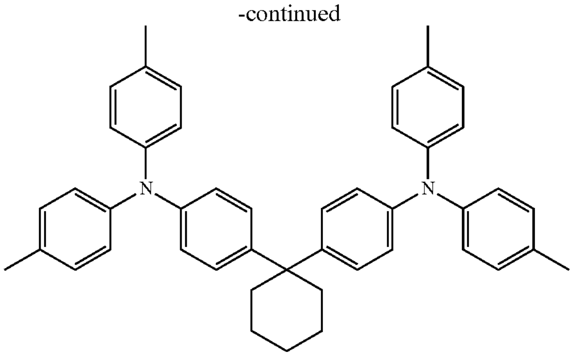

TAPC

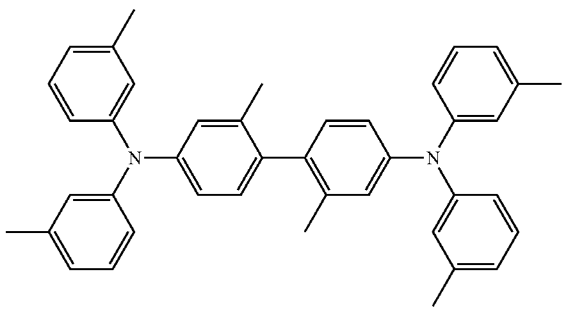

HMTPD

Formula 201

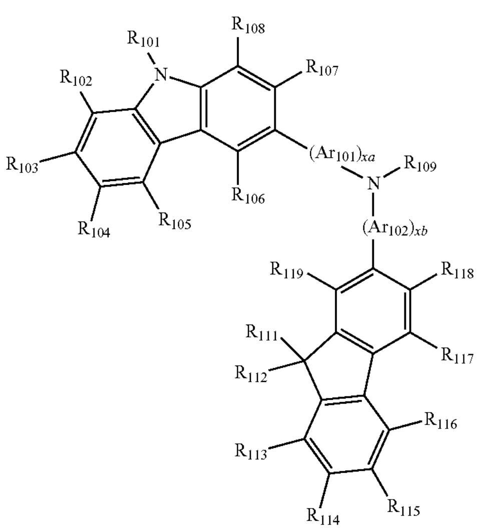

Formula 202

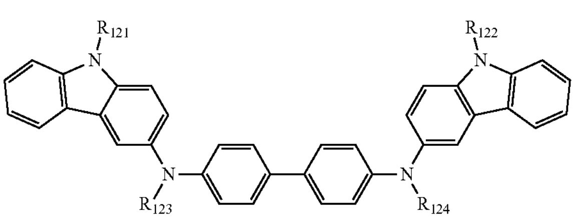

wherein, in Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or a combination thereof.

In Formula 201, xa and xb may each independently be an integer from 0 to 5, or 0, 1, or 2. For example, xa may be 1, and xb may be 0.

In Formulae 201 and 202, $R_{101}$ to $R_{108}$, $R_{111}$ to $R_{119}$, and $R_{121}$ to $R_{124}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, etc.), or a $C_1$-$C_{10}$ alkoxy group (for example, a methoxy group, an ethoxy group, a propoxy group, a butoxy group, a pentoxy group, etc.);

a $C_1$-$C_{10}$ alkyl group or a $C_1$-$C_{10}$ alkoxy group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof; or a $C_1$-$C_{10}$ alkyl group or a $C_1$-$C_{10}$ alkoxy group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof.

In Formula 201, $R_{109}$ may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or a combination thereof.

In one or more embodiments, the compound represented by Formula 201 may be represented by Formula 201A:

Formula 201A
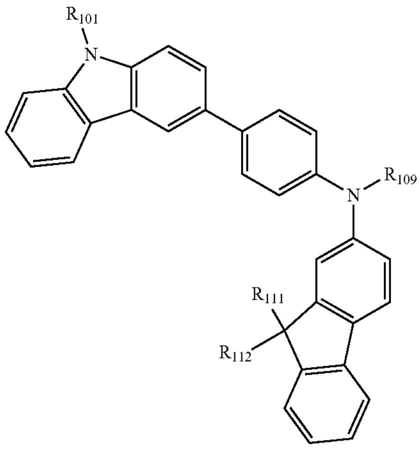
wherein $R_{101}$, $R_{111}$, $R_{112}$, and $R_{109}$ in Formula 201A may be understood by referring to the description provided herein.
For example, the hole transport region may include one of Compounds HT1 to HT20 or a combination thereof:
HT1
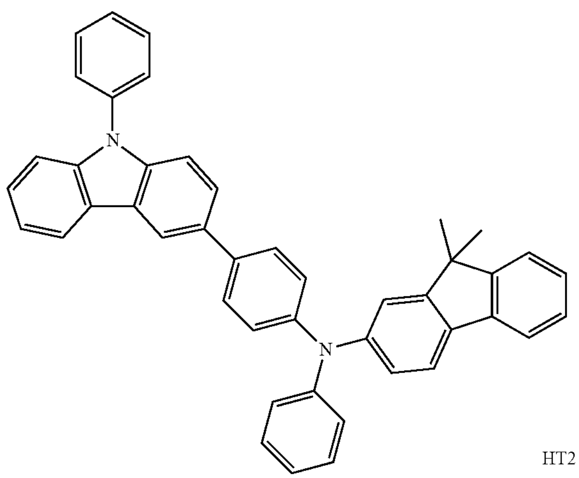
HT2
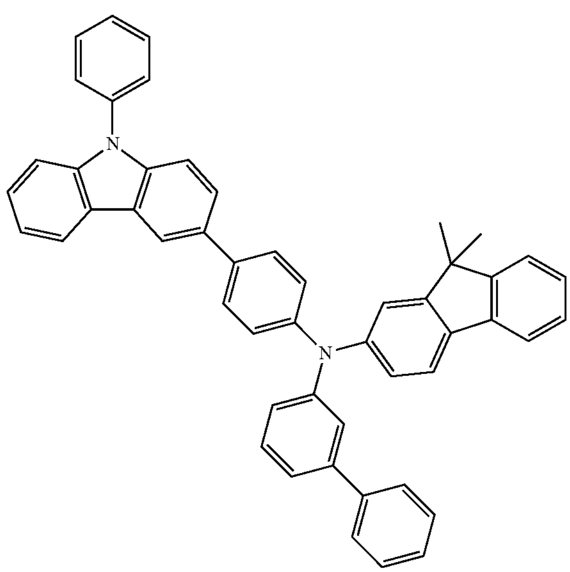
-continued
HT3
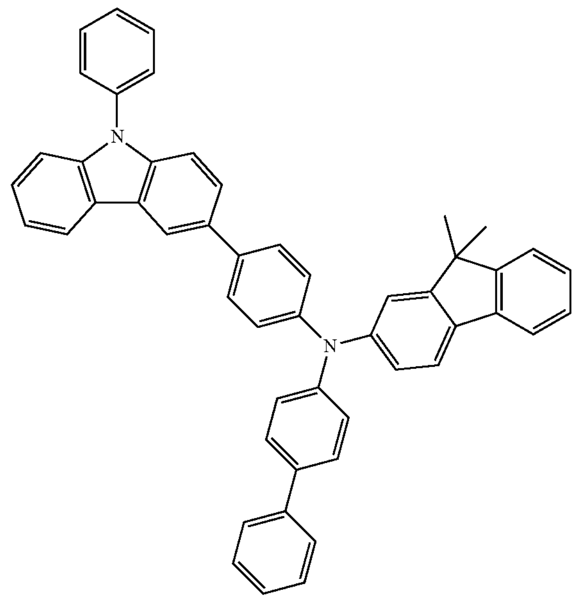
HT4
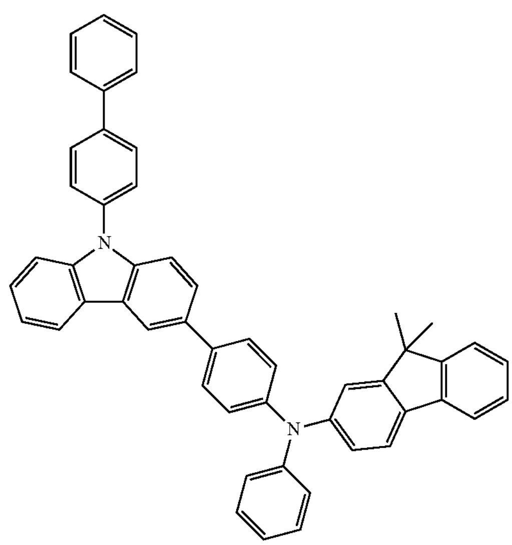

-continued
HT5
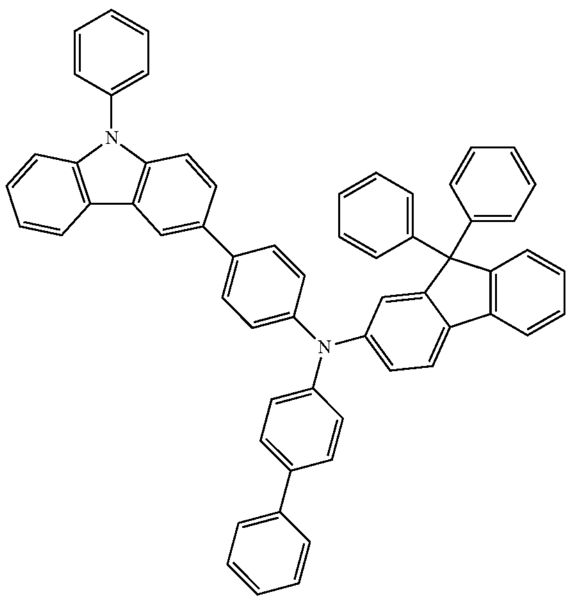
HT6
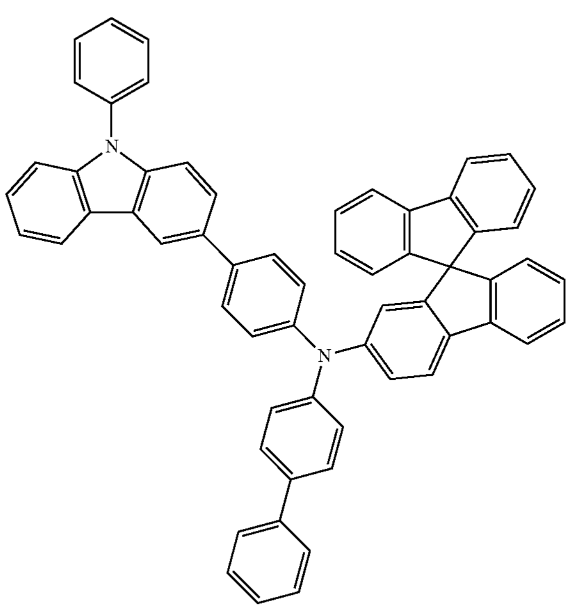
-continued
HT7
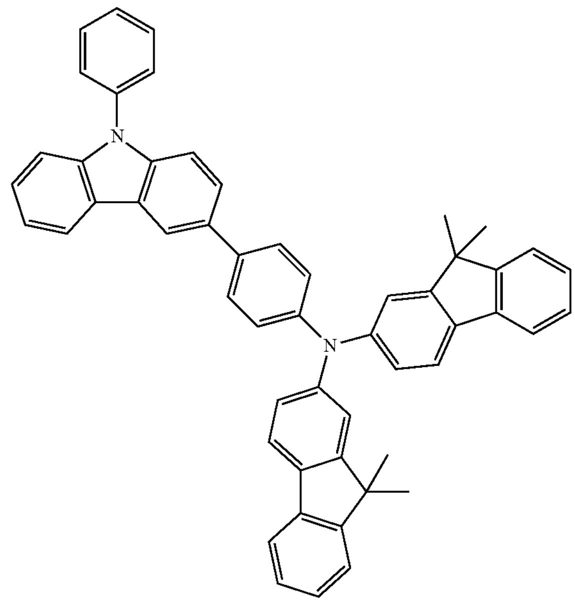
HT8
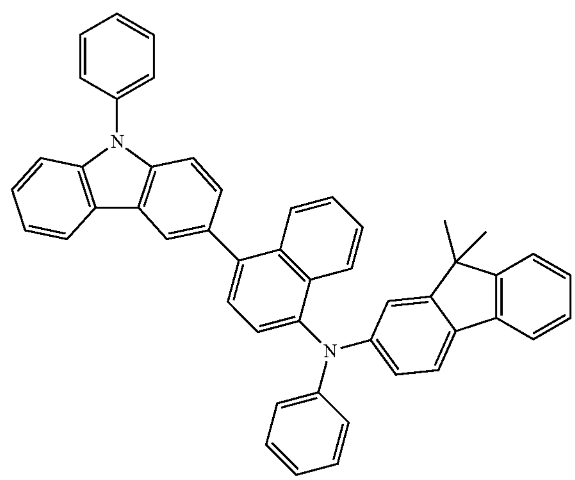
HT9
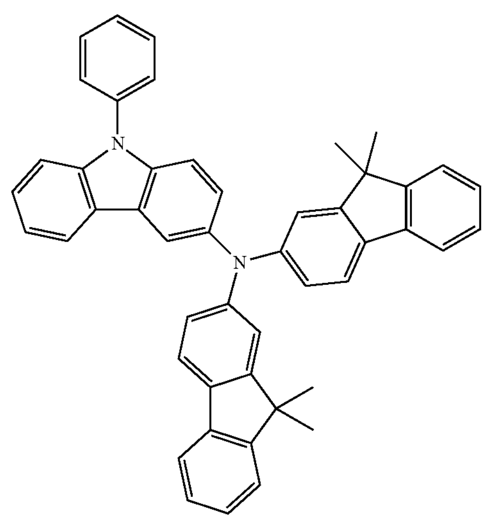

-continued
HT10
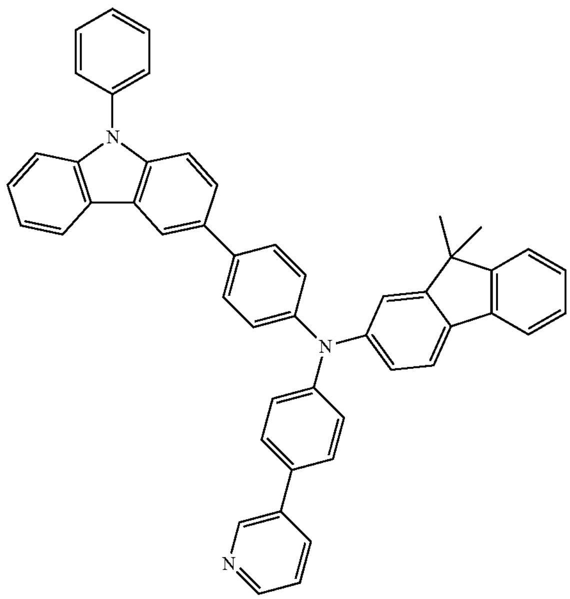
HT11
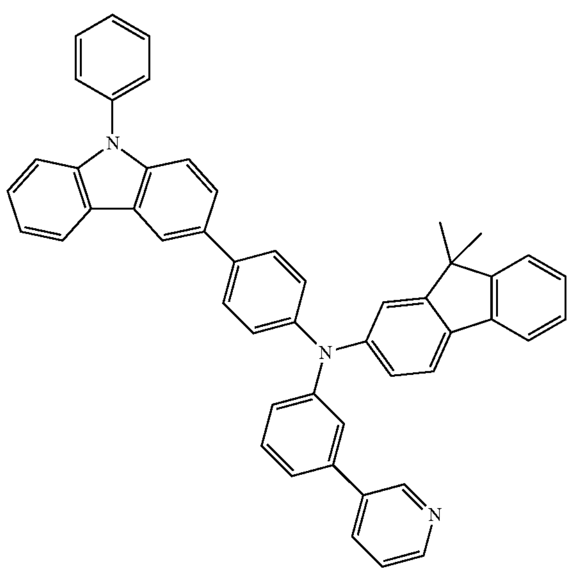
-continued
HT12
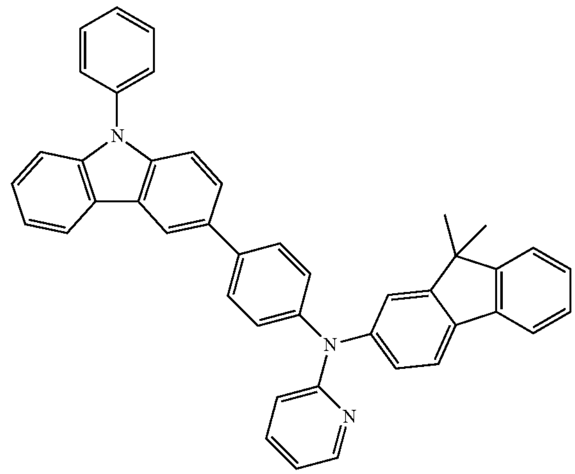
HT13
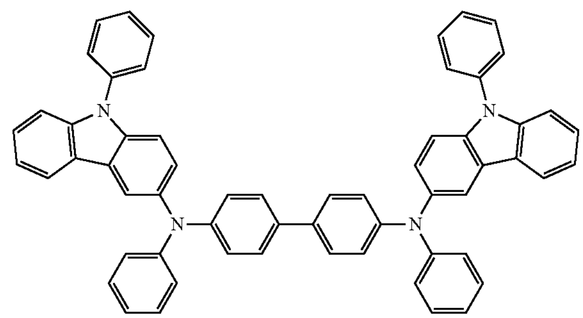
HT14
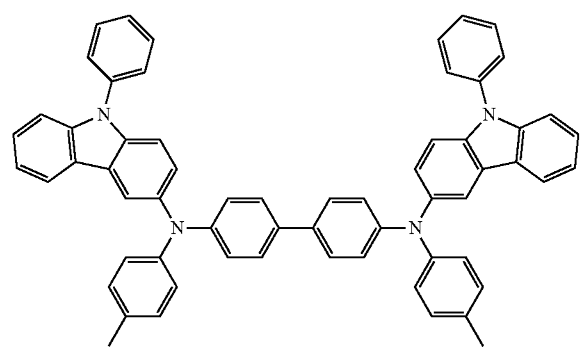
HT15
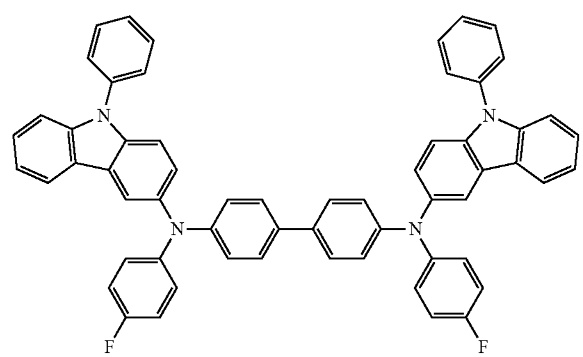

-continued

HT16

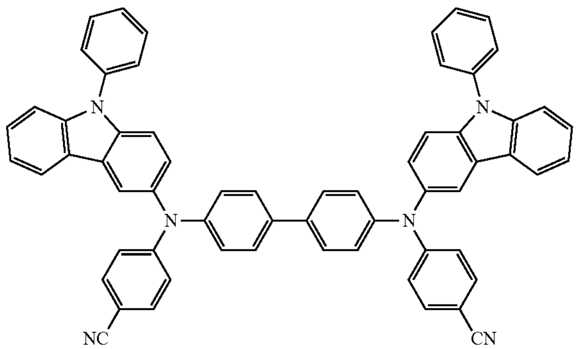

HT17

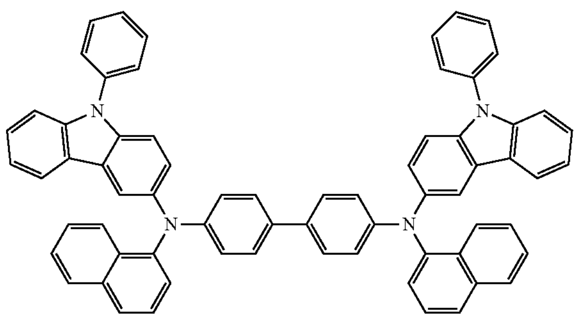

HT18

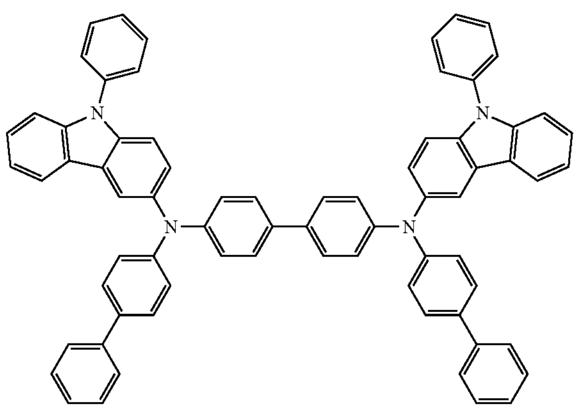

HT19

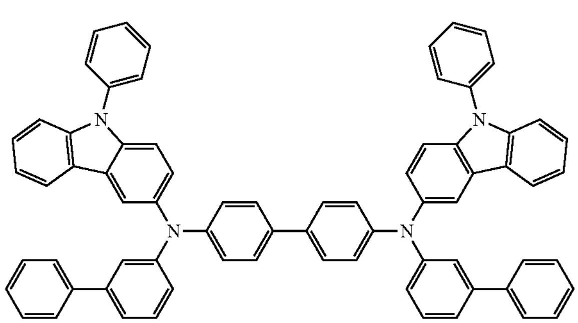

-continued

HT20

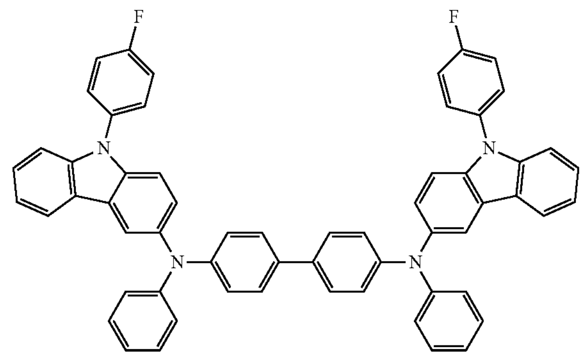

A thickness of the hole transport region may be in a range of about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may include a quinone derivative, a metal oxide, a cyano group-containing compound, or a combination thereof. For example, the p-dopant may be: a quinone derivative, such as tetracyanoquinodimethane (TCNQ), 2,3,5,6-tetrafluoro-tetracyano-1,4-benzoquinonedimethane (F4-TCNQ), or F6-TCNNQ; a metal oxide, such as tungsten oxide and molybdenum oxide; a cyano group-containing compound, such as Compound HT-D1; or a combination thereof.

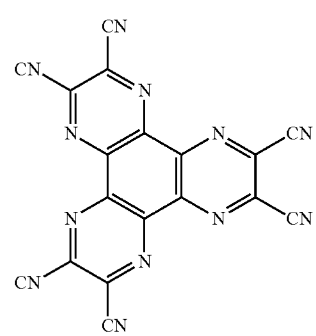

HT-D1

-continued

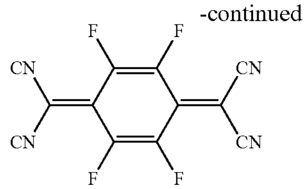

F4-TCNQ

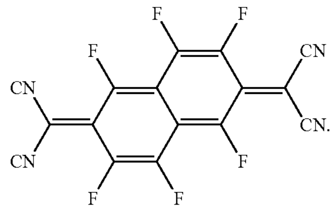

F6-TCNNQ

The hole transport region may further include a buffer layer.

The buffer layer may compensate for an optical resonance distance according to a wavelength of light emitted from the emission layer, and thus, efficiency of a formed organic light-emitting device may be improved.

Meanwhile, when the hole transport region includes an electron blocking layer, a material for forming the electron blocking layer may include a material that is used in the hole transport region as described above, a host material described below, or a combination thereof. For example, when the hole transport region includes an electron blocking layer, a material for forming the electron blocking layer may include mCP described below.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the hole transport layer.

The emission layer may include a host and a dopant, and the dopant may include the organometallic compound represented by Formula 1 as described herein.

The host may include TPBi, TBADN, ADN (also referred to as "DNA"), CBP, CDBP, TCP, mCP, Compound H50, Compound H51, Compound H52, or a combination thereof:

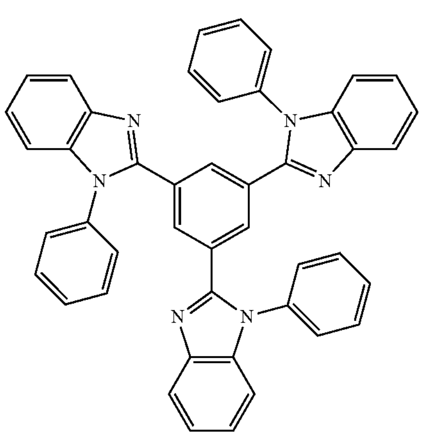

TPBi

-continued

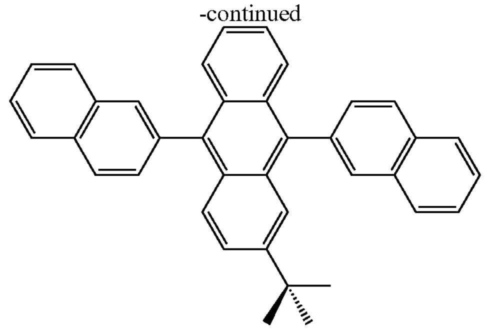

TBADN

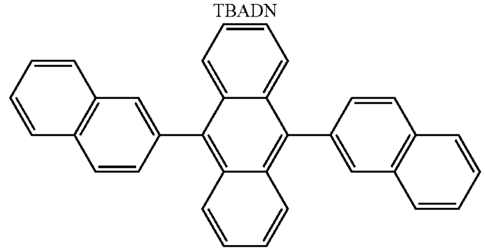

ADN

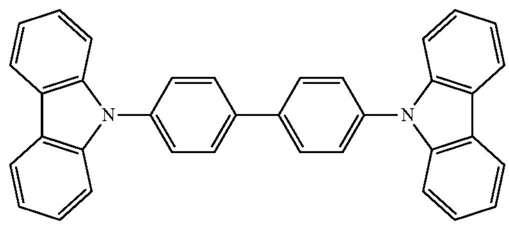

CBP

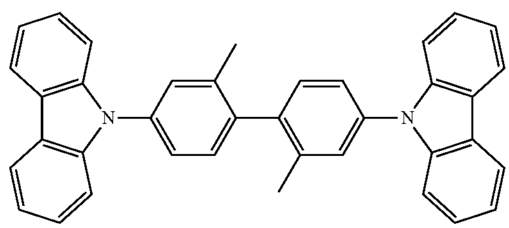

CDBP

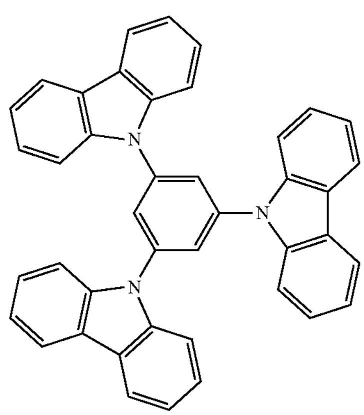

TCP

-continued

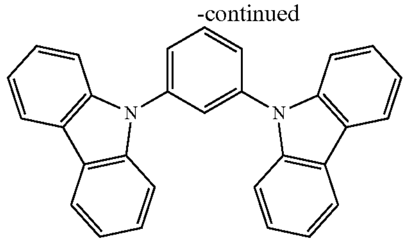

mCP

H50

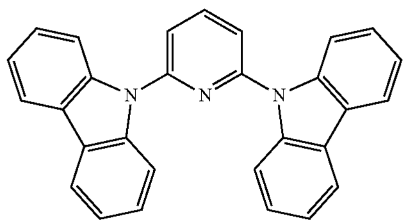

H51

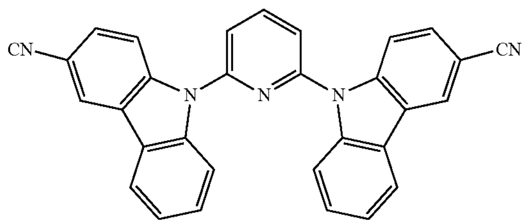

H52

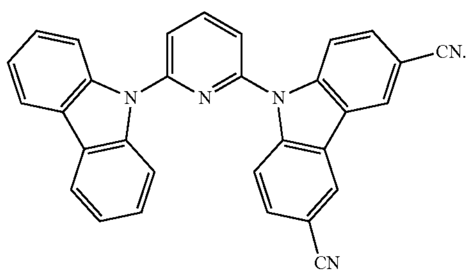

In one or more embodiments, an amount of the host in the emission layer may be greater than an amount of the at least one organometallic compound in the emission layer, based on weight.

When the organic light-emitting device is a full-color organic light-emitting device, the emission layer may be patterned into a red emission layer, a green emission layer, and/or a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host.

A thickness of the emission layer may be in a range of about 100 Å to about 1,000 Å, for example, about 200 Å to about 600 Å. When the thickness of the emission layer is within these ranges, excellent light-emission characteristics may be obtained without a substantial increase in driving voltage.

Then, an electron transport region is arranged on the emission layer.

The electron transport region may include a hole blocking layer, an electron transport layer, an electron injection layer, or a combination thereof.

For example, the electron transport region may have a hole blocking layer/electron transport layer/electron injection layer structure, or an electron transport layer/electron injection layer structure. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, BCP, Bphen, BAIq, or a combination thereof:

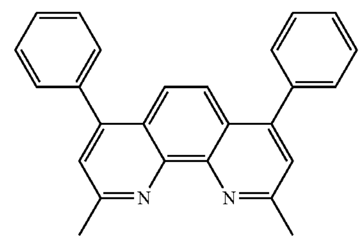

BCP

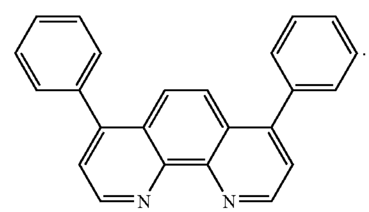

Bphen

A thickness of the hole blocking layer may be in a range of about 20 Å to about 1,000 Å, for example, about 30 Å to about 600 Å. When a thickness of the hole blocking layer is within these ranges, excellent hole blocking characteristics may be obtained without a substantial increase in driving voltage.

In one or more embodiments, the electron transport layer may include BCP, Bphen, TPBi, $Alq_3$, BAIq, TAZ, NTAZ, or a combination thereof:

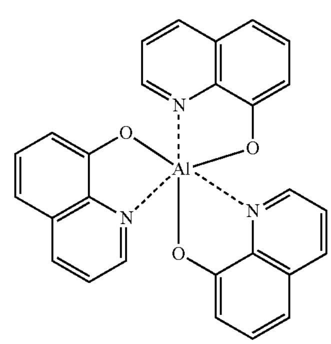

$Alq_3$

-continued
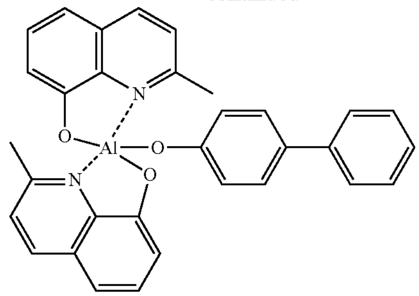
BAlq
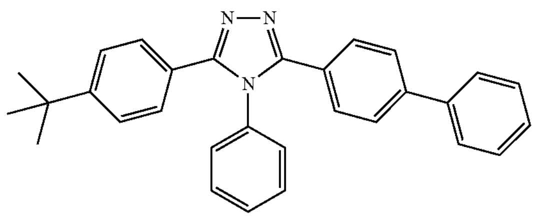
TAZ
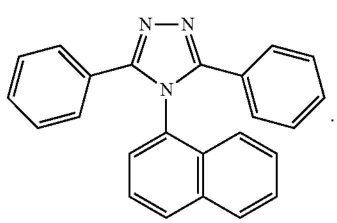
NTAZ
In one or more embodiments, the electron transport layer may include one of Compounds ET1 to ET25, or a combination thereof:
ET1
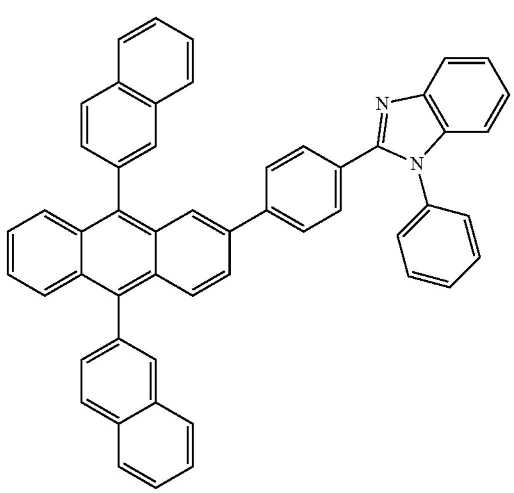
-continued
ET2
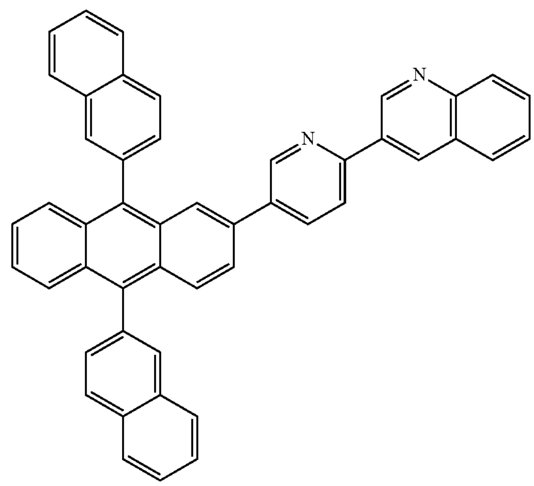
ET3
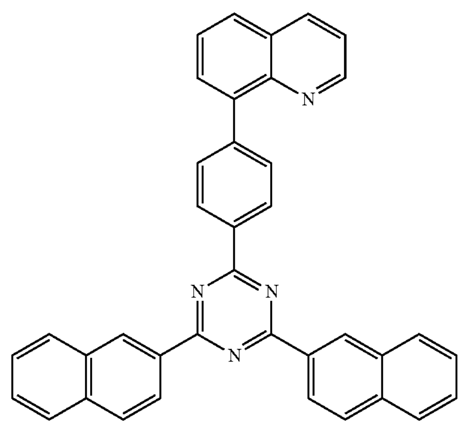
ET4
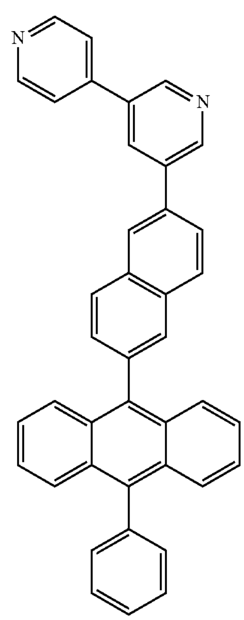

-continued
ET5
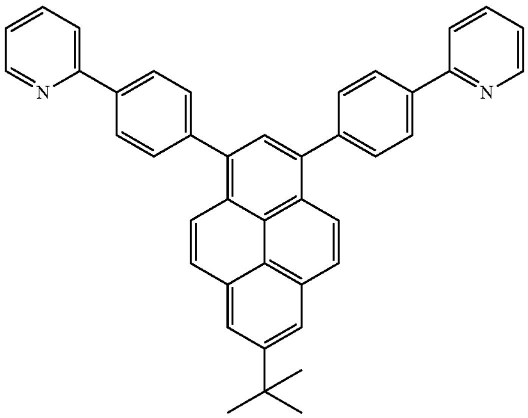
ET6
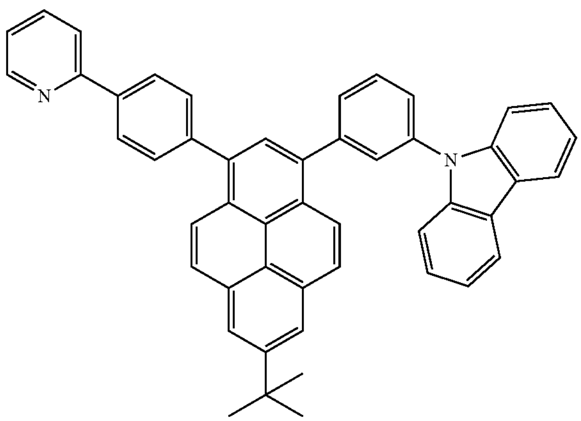
ET7
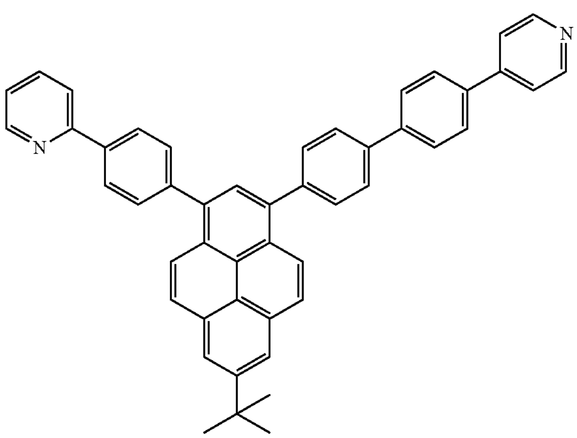
-continued
ET8
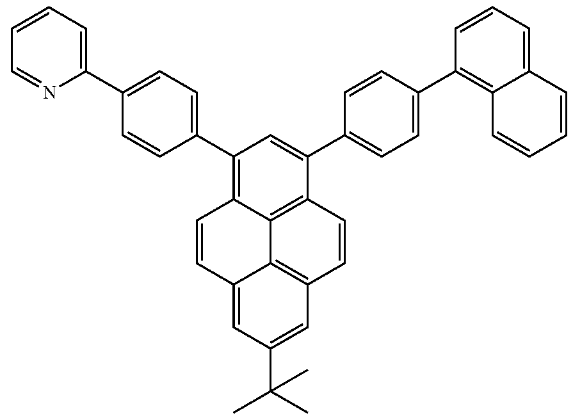
ET9
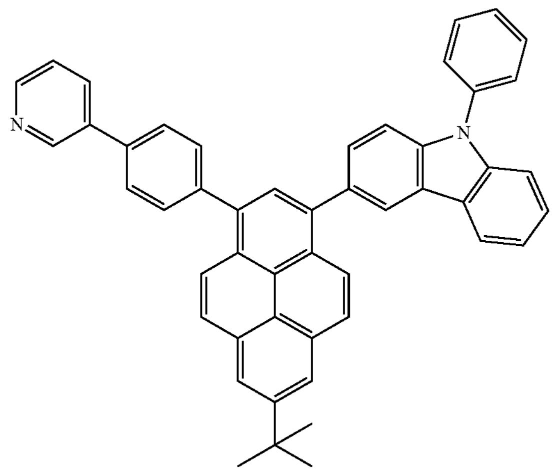
ET10
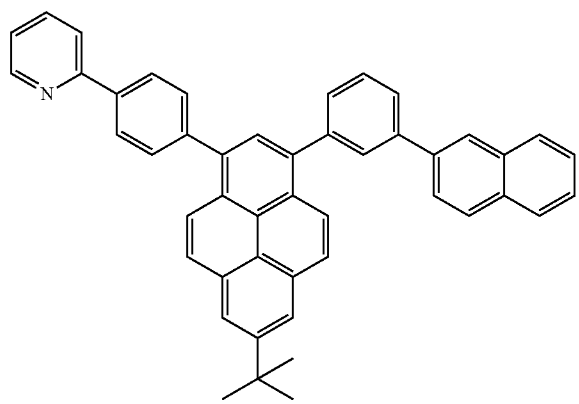
ET11
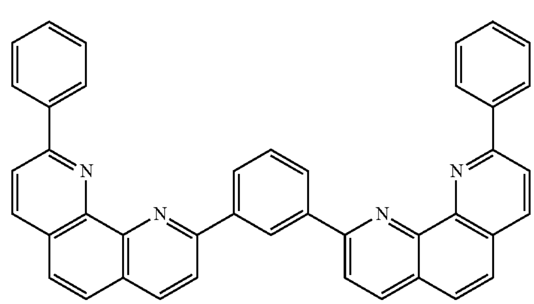

-continued
ET12
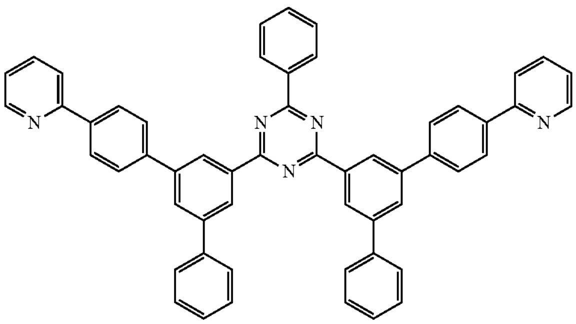
ET13
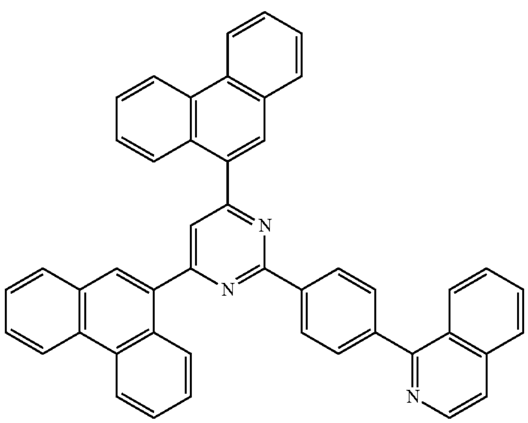
ET14
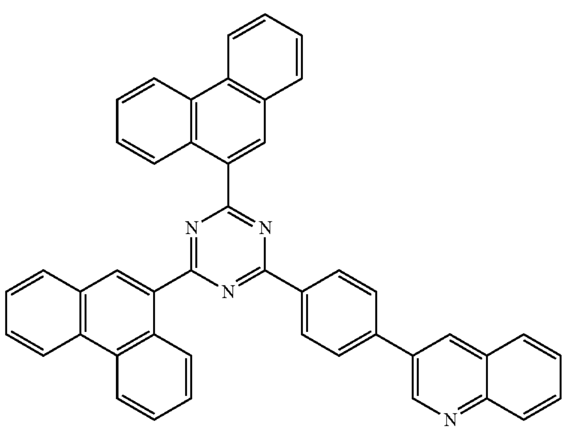
ET15
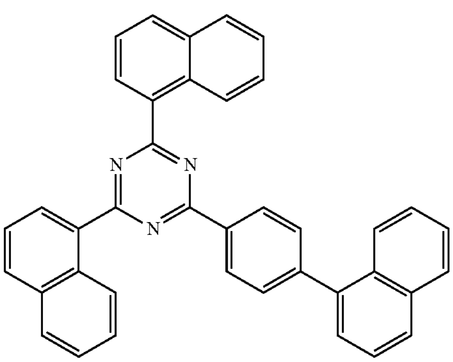
-continued
ET16
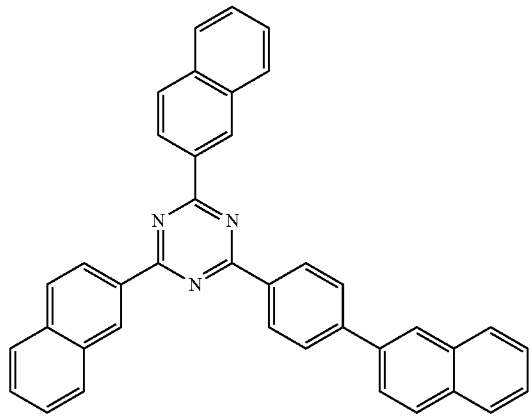
ET17
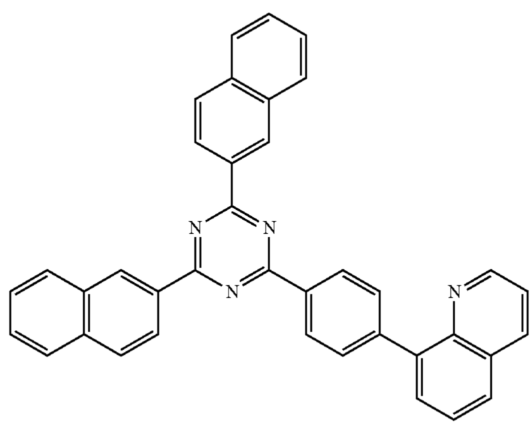
ET18
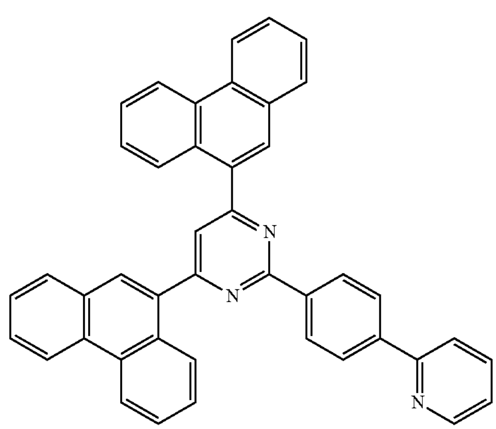

ET19
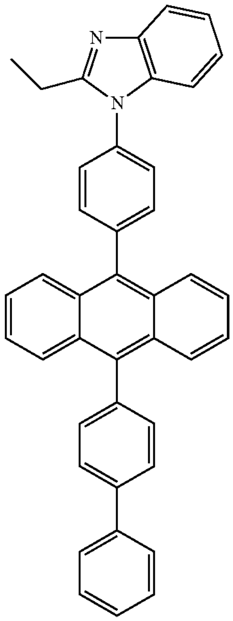
ET20
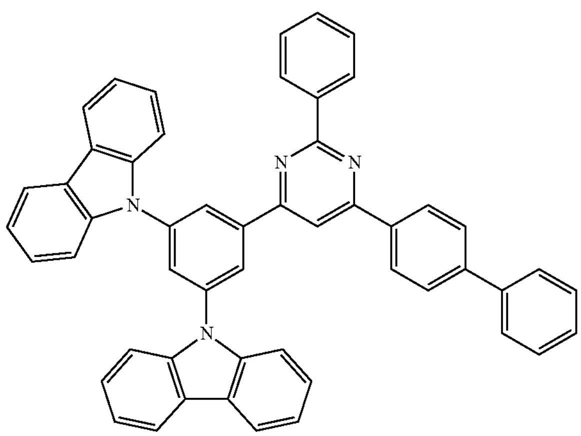
ET21
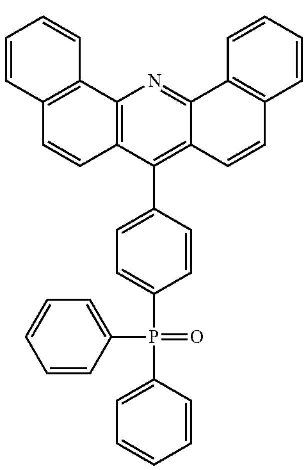
ET22
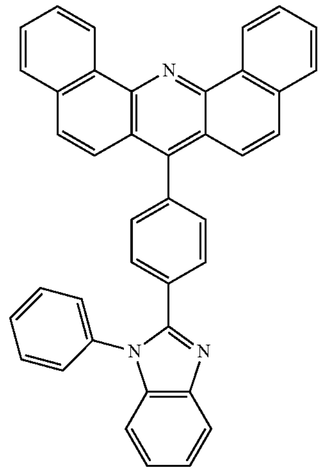
ET23
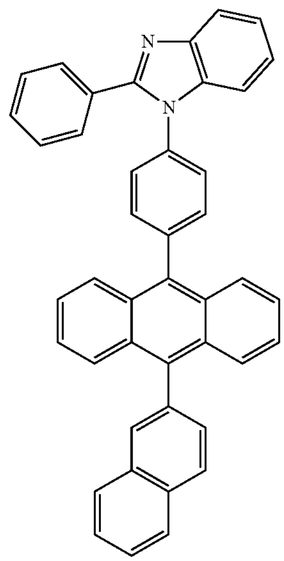
ET24
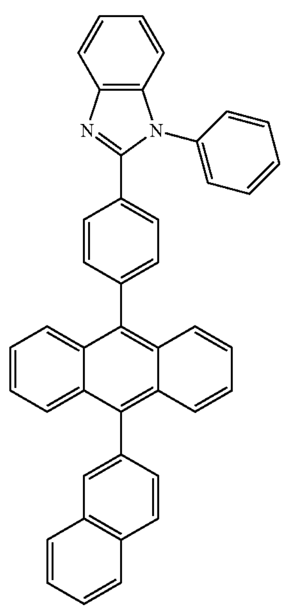

-continued

ET25

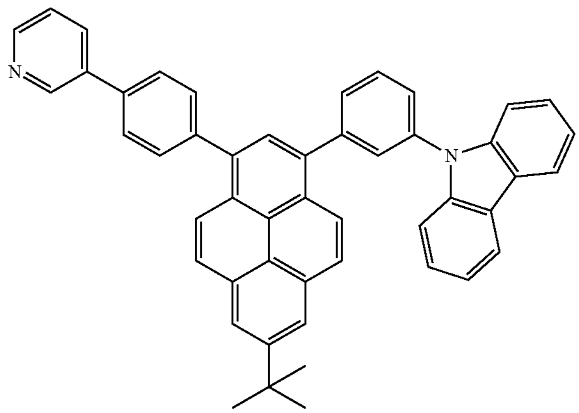

A thickness of the electron transport layer may be in a range of about 100 Å to about 1,000 Å, for example, about 150 Å to about 500 Å. When the thickness of the electron transport layer is within these ranges, satisfactory electron transport characteristics may be obtained without a substantial increase in driving voltage.

The electron transport layer may further include, in addition to the materials described above, a metal-containing material.

The metal-containing material may include a Li complex. The Li complex may include, for example, Compound ET-D1 or ET-D2:

ET-D1

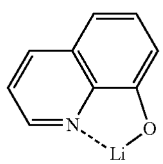

ET-D2

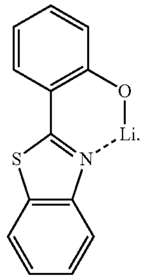

The electron transport region may include an electron injection layer that facilitates the flow of electrons from the second electrode 19 thereinto.

The electron injection layer may include LiF, NaCl, CsF, $Li_2O$, BaO, or a combination thereof.

A thickness of the electron injection layer may be in a range of about 1 Å to about 100 Å, and, for example, about 3 Å to about 90 Å. When the thickness of the electron injection layer is within these ranges, satisfactory electron injection characteristics may be obtained without a substantial increase in driving voltage.

The second electrode 19 is arranged on the organic layer 15. The second electrode 19 may be a cathode. A material for forming the second electrode 19 may include metal, an alloy, an electrically conductive compound, or a combination thereof, which have a relatively low work function. For example, the material for forming the second electrode 19 may include lithium (Li), magnesium (Mg), aluminum (Al), aluminum-lithium (Al—Li), calcium (Ca), magnesium-indium (Mg—In), or magnesium-silver (Mg—Ag). To manufacture a top-emission type light-emitting device, a transmissive electrode formed using ITO or IZO may be used as the second electrode 19.

Hereinbefore, one or more embodiments of the organic light-emitting device have been described with reference to the FIGURE, but embodiments of the present disclosure are not limited thereto.

According to another aspect, the organic light-emitting device may be included in an electronic apparatus. Thus, another aspect of the present disclosure provides an electronic apparatus including the organic light-emitting device. The electronic apparatus may include, for example, a display, an illumination, a sensor, a mobile phone, and the like.

Another aspect of the present disclosure provides a diagnostic composition including at least one organometallic compound represented by Formula 1.

The organometallic compound represented by Formula 1 may provide high luminescence efficiency. Accordingly, the diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbons monovalent group having 1 to 60 carbon atoms, and the term "$C_1$-$C_{60}$ alkylene group" as used here refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each unsubstituted or substituted with a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or a combination thereof. For example, Formula 9-33 is a branched $C_6$ alkyl group, for example, a tert-butyl group that is substituted with two methyl groups.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof are a methoxy group, an ethoxy group, a propoxy group, a butoxy group, and a pentoxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof are an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof are an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon cyclic group having 3 to 10 carbon atoms, and the term "$C_3$-$C_{10}$ cycloalkylene group" as used herein refers to a divalent group having the same structure as the $C_3$-$C_{10}$ cycloalkyl group.

Examples of the term $C_3$-$C_{10}$ cycloalkyl group are a cyclopropyl group, a cyclobutyl group, a cyclopentyl group, a cyclohexyl group, a cycloheptyl group, a cyclooctyl group, an adamantanyl group, a bicyclo[1.1.1]pentyl group, a bicyclo[2.1.1]hexyl group, a bicyclo[2.2.1]heptyl(norbornanyl) group, and, a bicyclo[2.2.2]octyl group.

The term "$C_1$-$C_{10}$ heterocycloalkyl group" as used herein refers to a monocyclic group that includes at least one hetero atom selected from N, O, P, Si, S, Se, B, and Ge as a ring-forming atom and 1 to 10 carbon atoms, and the term "$C_1$-$C_{10}$ heterocycloalkylene group" as used herein refers to a divalent group having the same structure as the $C_1$-$C_{10}$ heterocycloalkyl group.

Examples of the $C_1$-$C_{10}$ heterocycloalkyl group are a silolanyl group, a silinanyl group, tetrahydrofuranyl group, a tetrahydro-2H-pyranyl group, and a tetrahydrothiophenyl group.

The term "$C_3$-$C_{10}$ cycloalkenyl group" as used herein refers to a monovalent cyclic group that has 3 to 10 carbon atoms and at least one carbon-carbon double bond in the ring thereof and no aromaticity, and examples thereof are a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one hetero atom selected from N, O, P, Si, S, Se, B, and Ge as a ring-forming atom, 1 to 10 carbon atoms, and at least one carbon-carbon double bond in its ring. Examples of the $C_1$-$C_{10}$ heterocycloalkenyl group are a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the two or more rings may be fused to each other.

The term "$C_7$-$C_0$ alkylaryl group" as used herein refers to a $C_6$-$C_{60}$ aryl group substituted with at least one $C_1$-$C_{60}$ alkyl group.

The term "$C_1$-$C_6$ heteroaryl group" as used herein refers to a monovalent group having at least one hetero atom selected from N, O, P, Si, S, Se, B, and Ge as a ring-forming atom and a cyclic aromatic system having 1 to 60 carbon atoms, and the term "$C_1$-$C_{60}$ heteroarylene group" as used herein refers to a divalent group having at least one hetero atom selected from N, O, P, Si, S, Se, B, and Ge as a ring-forming atom and a carbocyclic aromatic system having 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_6$-$C_{60}$ heteroaryl group and the $C_6$-$C_{60}$ heteroarylene group each include two or more rings, the two or more rings may be fused to each other.

The term "$C_2$-$C_{60}$ alkylheteroaryl group" as used herein refers to a $C_1$-$C_{60}$ heteroaryl group substituted with at least one $C_1$-$C_{60}$ alkyl group.

The term "$C_6$-$C_{60}$ aryloxy group" as used herein indicates —$OA_{102}$ (wherein $A_{102}$ is the $C_6$-$C_{60}$ aryl group), the term "$C_6$-$C_{60}$ arylthio group" as used herein indicates —$SA_{103}$ (wherein $A_{103}$ is the $C_6$-$C_{60}$ aryl group), and the term "$C_1$-$C_{60}$ alkylthio group" indicates —$SA_{104}$ (wherein $A_{104}$ is the $C_1$-$C_{60}$ alkyl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. An example of the monovalent non-aromatic condensed polycyclic group is a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, a heteroatom selected from N, O, P, Si, S, Se, B, and Ge, other than carbon atoms, as a ring-forming atom, and no aromaticity in its entire molecular structure. An example of the monovalent non-aromatic condensed heteropolycyclic group is a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

Examples of the "$C_5$-$C_{30}$carbocyclic group (unsubstituted or substituted with at least one $R_{10a}$)" are an adamantane group, a norbornene group, a bicyclo[1.1.1]pentane group, a bicyclo[2.1.1]hexane group, a bicyclo[2.2.1]heptane(norbornane) group, a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, and a fluorene group, each unsubstituted or substituted with at least one $R_{10a}$ as defined herein.

The term "$C_1$-$C_{30}$ heterocyclic group" as used herein refers to a saturated or unsaturated cyclic group having, as a ring-forming atom, at least one heteroatom selected from N, O, P, Si, Se, Ge, B, and S other than 1 to 30 carbon atoms. The $C_1$-$C_{60}$ heterocyclic group may be a monocyclic group or a polycyclic group.

Examples of the "$C_1$-$C_{30}$ heterocyclic group (unsubstituted or substituted with at least one $R_{10a}$)" are a thiophene group, a furan group, a pyrrole group, a silole group, borole group, a phosphole group, a selenophene group, a germole group, a benzothiophene group, a benzofuran group, an indole group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group, each unsubstituted or substituted with at least one $R_{10a}$ as disclosed herein.

Examples of the terms "$C_5$-$C_{30}$ carbocyclic group" and "$C_1$-$C_{30}$ heterocyclic group" as used herein may include i) a first ring, ii) a second ring, iii) a condensed cyclic group in which two or more first rings are condensed with each other, iv) a condensed cyclic group in which two or more second rings are condensed with each other, or v) a condensed cyclic group in which at least one first ring is condensed with at least one second ring, the first ring may be a cyclopentane group, a cyclopentadiene group, a furan group, a thiophene group, a pyrrole group, a silole group, a germole group, a borole group, a selenophene group, a phosphole group, an oxazole group, an oxadiazole group, an oxatriazole group, a thiazole group, a thiadiazole group, a thiatriazole group, a pyrazole group, an imidazole group, a triazole group, a tetrazole group, an azasilole group, an azagermole group, an azaborole group, an azaselenophene group, or an azaphosphole group, and the second ring may be an adamantane group, a norbornane group (a bicyclo[2.2.1]heptane group), a norbornene group, a bicyclo[1.1.1]pentane group, a bicyclo[2.1.1]hexane group, a bicyclo[2.2.2]octane group, a cyclohexane group, a cyclohexene group, a benzene group, a pyridine group, a pyrimidine group, a pyrazine group, a pyridazine group, or a triazine group.

The terms "fluorinated $C_1$-$C_{60}$ alkyl group (or a fluorinated $C_1$-$C_{20}$ alkyl group or the like)", "fluorinated $C_3$-$C_{10}$ cycloalkyl group", "fluorinated $C_1$-$C_{10}$ heterocycloalkyl group," and "fluorinated phenyl group" respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one fluoro group (—F). For example, the "fluorinated $C_1$ alkyl group (that is, the fluorinated methyl group)" may include —$CF_3$, —$CF_2H$, and —$CFH_2$. The "fluorinated $C_1$-$C_{60}$ alkyl group (or, a fluorinated $C_1$-$C_{20}$ alkyl group, or the like)", "the fluorinated $C_3$-$C_{10}$ cycloalkyl group", "the fluorinated $C_1$-$C_{10}$ heterocycloalkyl group", or "the fluorinated a phenyl group" may be i) a fully fluorinated $C_1$-$C_{60}$ alkyl group (or, a fully fluorinated $C_1$-$C_{20}$ alkyl group or the like), a fully fluorinated $C_3$-$C_{10}$ cycloalkyl group, a fully fluorinated $C_1$-$C_{10}$ heterocycloalkyl group, or a fully fluorinated phenyl group, wherein, in each group, all hydrogens included therein are each substituted with a fluoro group, or ii) a partially fluorinated $C_1$-$C_{60}$ alkyl group (or, a partially fluorinated $C_1$-$C_{20}$ alkyl group or the like), a partially fluorinated $C_3$-$C_{10}$ cycloalkyl group, a partially fluorinated $C_1$-$C_{10}$ heterocycloalkyl group, or a partially fluorinated phenyl group, wherein, in each group, all hydrogens included therein are not substituted with a fluoro group.

The terms "deuterated $C_1$-$C_{60}$ alkyl group (or a deuterated $C_1$-$C_{20}$ alkyl group or the like)", "deuterated $C_3$-$C_{10}$ cycloalkyl group", "deuterated $C_1$-$C_{10}$ heterocycloalkyl group," and "deuterated phenyl group" respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one deuterium. For example, the "deuterated $C_1$ alkyl group (that is, the deuterated methyl group)" may include —$CD_3$, —$CD_2H$, and —$CDH_2$, and examples of the "deuterated $C_3$-$C_{10}$ cycloalkyl group" are Formula 10-501 and the like. The "deuterated $C_1$-$C_{60}$ alkyl group (or the deuterated $C_1$-$C_{20}$ alkyl group or the like)", "the deuterated $C_3$-$C_{10}$ cycloalkyl group", "the deuterated $C_1$-$C_{10}$ heterocycloalkyl group", or "the deuterated phenyl group" may be i) a fully deuterated $C_1$-$C_{60}$ alkyl group (or a fully deuterated $C_1$-$C_{20}$ alkyl group or the like), a fully deuterated $C_3$-$C_{10}$ cycloalkyl group, a fully deuterated $C_1$-$C_{10}$ heterocycloalkyl group, or a fully deuterated phenyl group, in which, in each group, all hydrogens included therein are each substituted with deuterium, or ii) a partially deuterated $C_1$-$C_{60}$ alkyl group (or, a partially deuterated $C_1$-$C_{20}$ alkyl group or the like), a partially deuterated $C_3$-$C_{10}$ cycloalkyl group, a partially deuterated $C_1$-$C_{10}$ heterocycloalkyl group, or a partially deuterated phenyl group, in which, in each group, all hydrogens included therein are not substituted with deuterium.

The term "($C_1$-$C_{20}$ alkyl) 'X' group" as used herein refers to a 'X' group that is substituted with at least one $C_1$-$C_{20}$ alkyl group. For example, the term "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the term "($C_1$-$C_{20}$ alkyl)phenyl group" as used herein refers to a phenyl group substituted with at least one $C_1$-$C_{20}$ alkyl group. An example of a ($C_1$ alkyl)phenyl group is a toluyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene 5,5-dioxide group" respectively refer to heterocyclic groups having the same backbones as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group," in which, in each group, at least one carbon selected from ring-forming carbon atoms is substituted with a nitrogen atom.

Substituents of the substituted $C_5$-$C_{30}$carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_0$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group may each independently be:

- deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group,
- a $C_1$-$C_{60}$ alkyl group, a $C_2$-$C_{60}$ alkenyl group, a $C_2$-$C_{60}$ alkynyl group, a $C_1$-$C_0$ alkoxy group, or a $C_1$-$C_{60}$ alkylthio group, each substituted with deuterium, —F, —CI, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—B(Q_{16})(Q_{17})$, $—P(=O)(Q_{18})(Q_{19})$, $—P(Q_{18})(Q_{19})$, or a combination thereof;
- a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_0$ alkyl aryl group, a $C_6$-$C_{60}$ aryloxy group, a $C_6$-$C_{60}$ arylthio group, a $C_1$-$C_0$ heteroaryl group, a $C_2$-$C_{60}$ alkyl heteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—B(Q_{26})(Q_{27})$, $—P(=O)(Q_{28})(Q_{29})$, $—P(Q_{28})(Q_{29})$, or a combination thereof;
- $—N(Q_{31})(Q_{32})$, $—Si(Q_{33})(Q_{34})(Q_{35})$, $—B(Q_{36})(Q_{37})$, $—P(=O)(Q_{38})(Q_{39})$, or $—P(Q_{38})(Q_{39})$; or a combination thereof, In the present specification, $Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; $—C_1$; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, —F, a cyano group, a $C_1$-$C_{60}$ alkyl group, a $C_6$-$C_{60}$ aryl group, a deuterated $C_6$-$C_{60}$ aryl group, a fluorinated $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group or a $C_1$-$C_{60}$ heteroaryl group, each unsubstituted or substituted with deuterium, —F, a cyano group, a $C_1$-$C_{60}$ alkyl group, a deuterated $C_1$-$C_{60}$ alkyl group, a fluorinated $C_1$-$C_{60}$ alkyl group, a $C_1$-$C_{60}$ aryl group, a deuterated $C_6$-$C_{60}$ aryl group, a fluorinated $C_6$-$C_{60}$ aryl group, or a combination thereof; a $C_6$-$C_{60}$ aryloxy group; a $C_6$-$C_{60}$ arylthio group; a monovalent non-aromatic condensed polycyclic group; or a monovalent non-aromatic condensed heteropolycyclic group.

For example, $Q_1$ to $Q_9$, $Q_{11}$ to $Q_{19}$, $Q_{21}$ to $Q_{29}$, and $Q_{31}$ to $Q_{39}$ may each ay each independently be:

- $—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or
- an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, 3-pentyl group, a sec-isopentyl group, a phenyl group, a biphenyl group, or a naphthyl group, each unsubstituted or substituted with deuterium, a $C_1$-$C_{20}$ alkyl group, a phenyl group, or a combination thereof.

Hereinafter, a compound and an organic light-emitting device according to one or more embodiments are described in further detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1 (Compound 171)

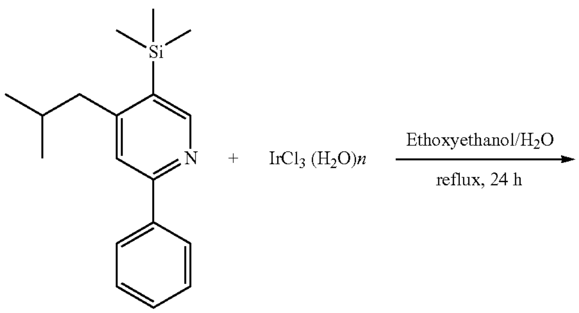

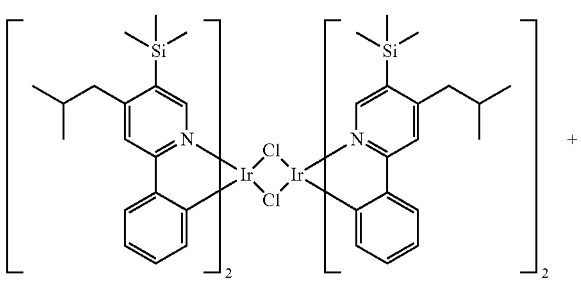

171A

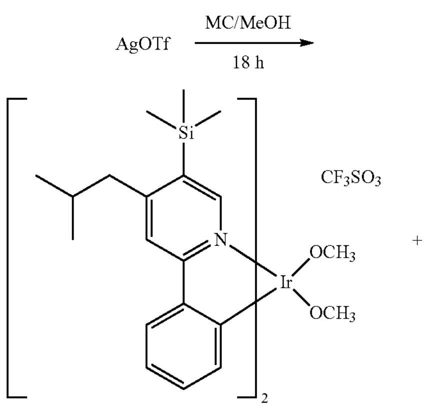

171B

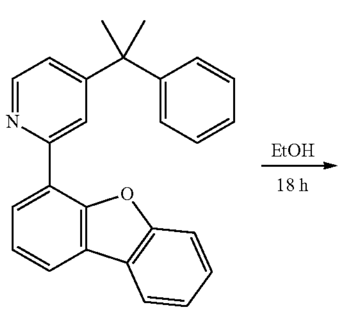

-continued

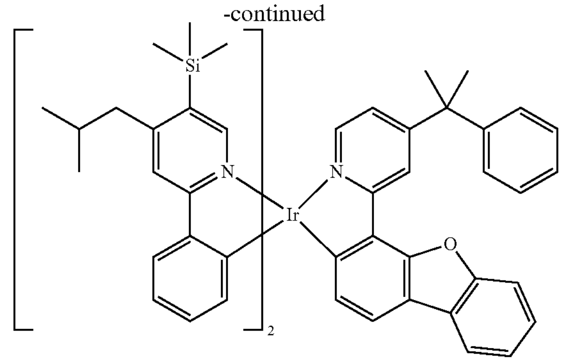

171

Synthesis of Compound 171A 4-isobutyl-2-phenyl-5-(trimethylsilyl)pyridine) (7.9 grams (g), 27.8 millimoles (mmol)) and iridium chloride hydrate ($IrCl_3 \cdot (H_2O)_n$) (4.4 g, 12.6 mmol) were mixed with 120 mL of ethoxyethanol and 40 mL of deionized water, and the mixture was stirred at reflux for 24 hours. Then, the reaction temperature was reduced to room temperature. The resulting solid produced therefrom was separated by filtration, sufficiently washed with water/methanol/hexane in the stated order, and dried in a vacuum oven, so as to obtain 7.6 g (yield of 76%) of Compound 171A.

Synthesis of Compound 171B

Compound 171A (3.3 g, 2.1 mmol) was mixed with 90 mL of methylene chloride, and a mixture containing AgOTf (silver triflate) (1.1 g, 4.1 mmol) and 30 mL of methanol was added thereto. Afterwards, the resultant mixture was stirred at room temperature for 18 hours while blocking the light with aluminum foil. The resultant was filtered using Celite to remove a solid formed therefrom and filtered under reduced pressure to thereby obtain a solid (Compound 171B). The solid was used in the next reaction without further purification.

Synthesis of Compound 171

Compound 171B (4.0 g, 4.1 mmol) and 2-(dibenzo[b,d]furan-4-yl)-4-(2-phenylpropan-2-yl)pyridine (1.6 g, 4.5 mmol) were mixed with 40 mL of ethanol, and the mixture was stirred at reflux for 18 hours. Then, the reaction temperature was lowered. Solvent was removed from the resultant mixture thus obtained under reduced pressure and subjected to column chromatography (eluent: methylene chloride (MC) and hexane), so as to obtain 1.5 g (yield of 33%) of Compound 171. The compound was identified by Mass and HPLC.

High resolution mass spectrometry—(Matrix Assisted Laser Desorption Ionization) (HRMS(MALDI)) calcd. for $C_{62}H_{68}IrN_3OSi_2$: m/z 1119.4530 Found: 1119.4523.

Synthesis Example 2 (Compound 1032)

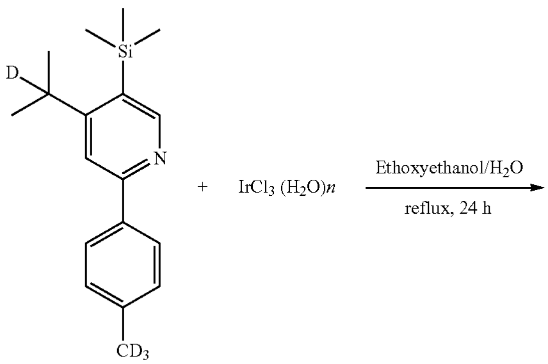

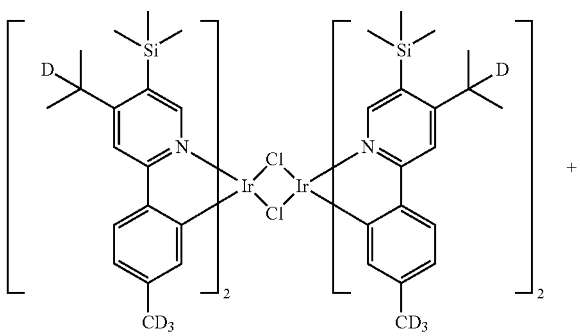

1032A

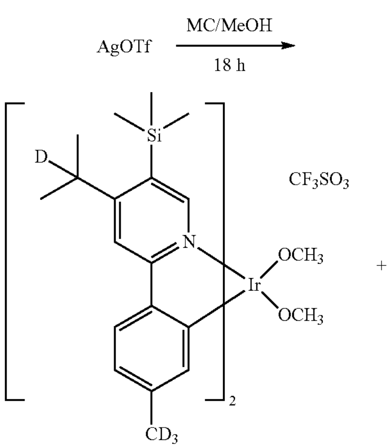

1032B

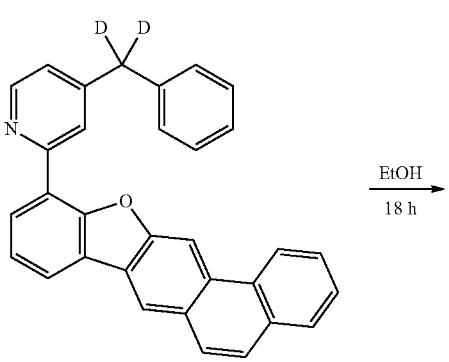

-continued

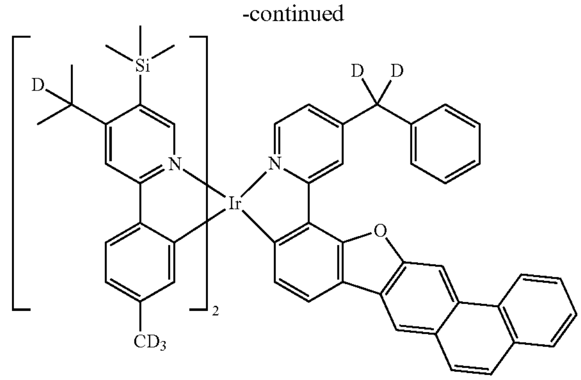

1032

Synthesis of Compound 1032A 6.9 g (yield of 69%) of Compound 1032A was obtained in the same manner as used to obtain Compound 171A of Synthesis Example 1, except that 2-(4-(methyl-d3)phenyl)-4-(propan-2-yl-2-d)-5-(trimethylsilyl)pyridine was used instead of 4-isobutyl-2-phenyl-5-(trimethylsilyl)pyridine.

Synthesis of Compound 1032B

Compound 1032B was obtained in the same manner as used to obtain Compound 171B of Synthesis Example 1, except that Compound 1032A was used instead of Compound 171A. Compound 1032B thus obtained was used in the next reaction without further purification.

Synthesis of Compound 1032

0.9 g (yield of 27%) of Compound 1032 was obtained in the same manner as used to obtain Compound 171 of Synthesis Example 1, except that Compound 1032B was used instead of Compound 171B and that 2-(phenanthro[3,2-b]benzofuran-11-yl)-4-(phenylmethyl-d2)pyridine was used instead of 2-(dibenzo[b,d]furan-4-yl)-4-(2-phenylpropan-2-yl)pyridine. The compound was identified by mass spectrometry (MS) and high-pressure liquid chromatography (HPLC).

HRMS(MALDI) calcd for $C_{68}H_{58}D_{10}IrN_3OSi_2$: m/z 1201.5158 Found: 1201.5164.

Synthesis Example 3 (Compound 1485)

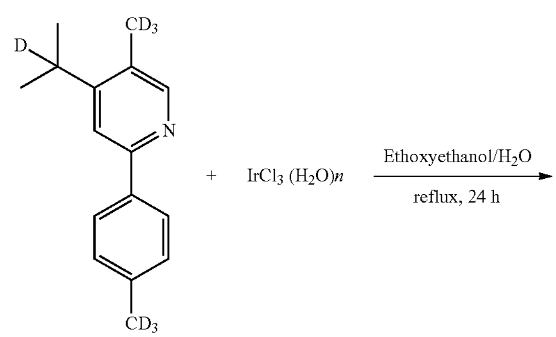

-continued

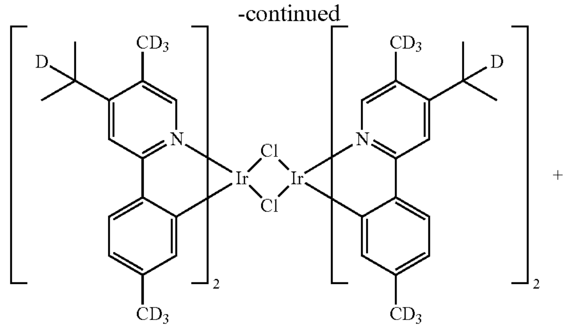

1485A

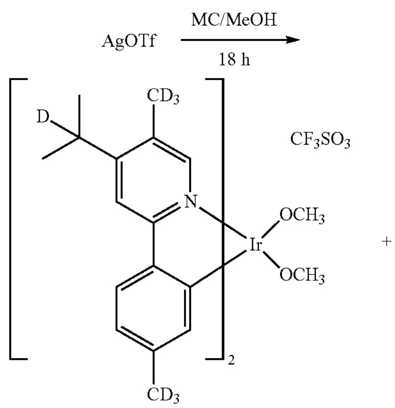

1485B

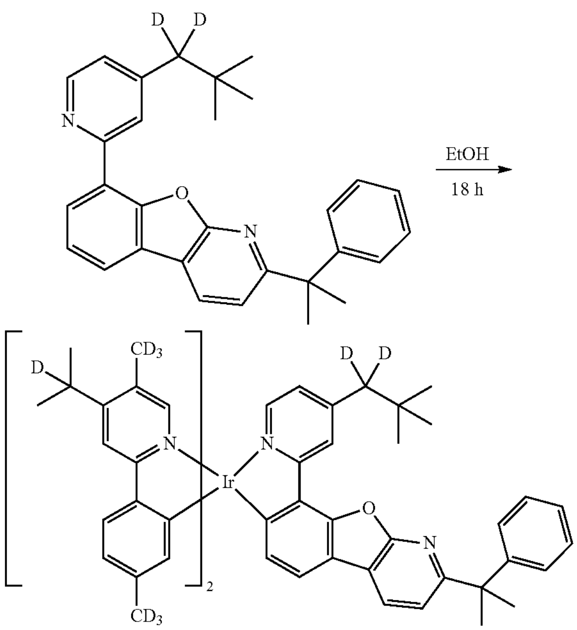

1485

Synthesis of Compound 1485A 8.1 g (yield of 81%) of Compound 1485A was obtained in the same manner as used to obtain Compound 171A of Synthesis Example 1, except that 5-(methyl-d3)-2-(4-(methyl-d3)phenyl)-4-(propan-2-yl-2-d)pyridine was used instead of 4-isobutyl-2-phenyl-5-(trimethylsilyl)pyridine.

Synthesis of Compound 1485B

Compound 1485B was obtained in the same manner as used to obtain Compound 171B of Synthesis Example 1, except that Compound 1485A was used instead of Compound 171A. Compound 1485B thus obtained was used in the next reaction without further purification.

Synthesis of Compound 1485

1.2 g (yield of 36%) of Compound 1485 was obtained in the same manner as used to obtain Compound 171 of Synthesis Example 1, except that Compound 1485B was used instead of Compound 171B and that 8-(4-(2,2-dimethylpropyl-1,1-d2)pyridin-2-yl)-2-(2-phenylpropan-2-yl)benzofuro[2,3-b]pyridine was used instead of 2-(dibenzo[b,d]furan-4-yl)-4-(2-phenylpropan-2-yl)pyridine. The compound was identified by MS and HPLC.

HRMS(MALDI) calcd for $C_{62}H_{49}D_{16}IrN_4O$: m/z 1090.5792 Found: 1090.5788.

Synthesis Example 4 (Compound 2051)

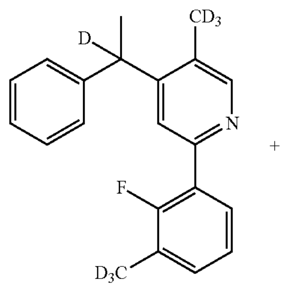

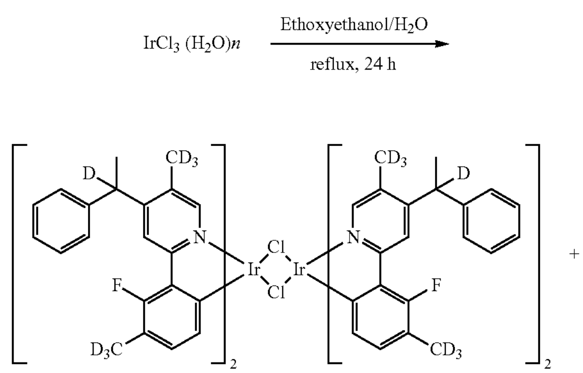

2051A

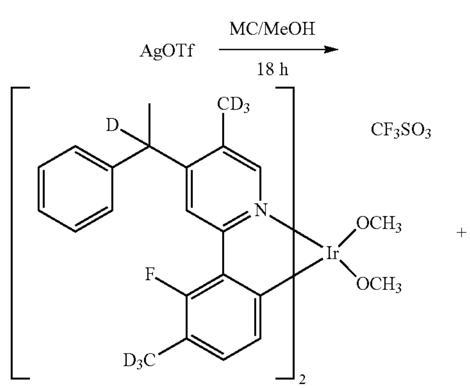

2051B

-continued

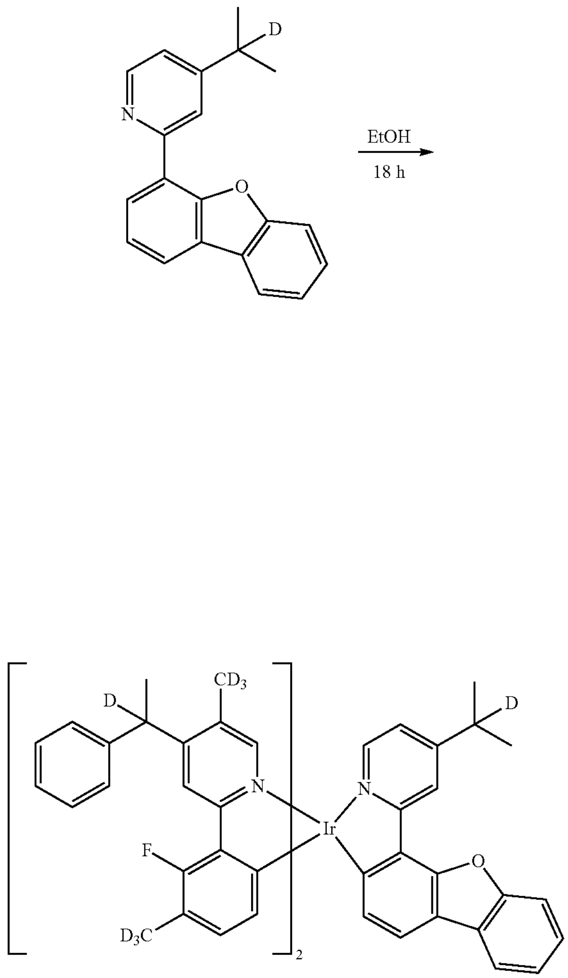

2051

Synthesis of Compound 2051A 6.6 g (yield of 66%) of Compound 2051A was obtained in the same manner as used to obtain Compound 171A of Synthesis Example 1, except that 2-(2-fluoro-3-(methyl-d3)phenyl)-5-(methyl-d3)-4-(1-phenylethyl-1-d)pyridine was used instead of 4-isobutyl-2-phenyl-5-(trimethylsilyl)pyridine.

Synthesis of Compound 2051B

Compound 2051B was obtained in the same manner as used to obtain Compound 171B of Synthesis Example 1, except that Compound 2051A was used instead of Compound 171A. Compound 2051B thus obtained was used in the next reaction without further purification.

Synthesis of Compound 2051

1.3 g (yield of 29%) of Compound 2051 was obtained in the same manner as used to obtain Compound 171 of Synthesis Example 1, except that Compound 2051B was used instead of Compound 171B and that 2-(dibenzo[b,d]furan-4-yl)-4-(propan-2-yl-2-d)pyridine was used instead of 2-(dibenzo[b,d]furan-4-yl)-4-(2-phenylpropan-2-yl)pyridine. The compound was identified by Mass and HPLC.

HRMS(MALDI) calcd for $C_{62}H_{39}D_{15}F_2IrN_3O$: m/z 1102.4806 Found: 1102.4801.

Synthesis Example 5 (Compound 2111)

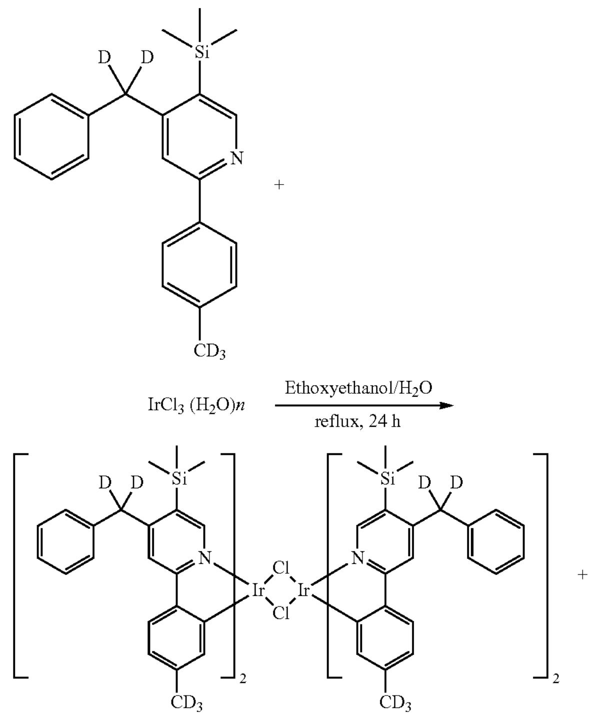

2111A

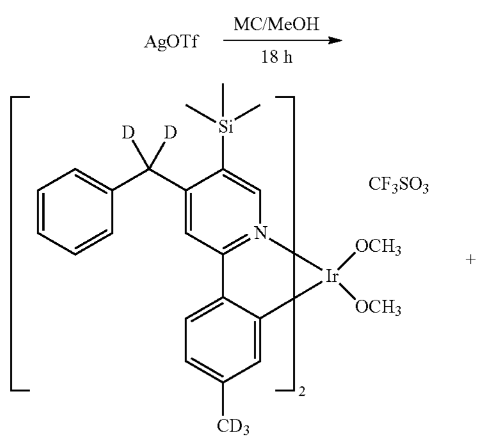

2111B

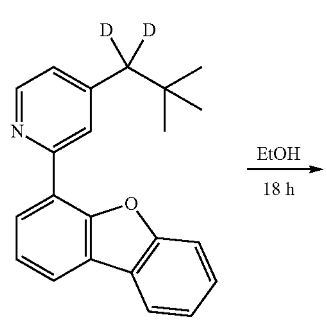

-continued

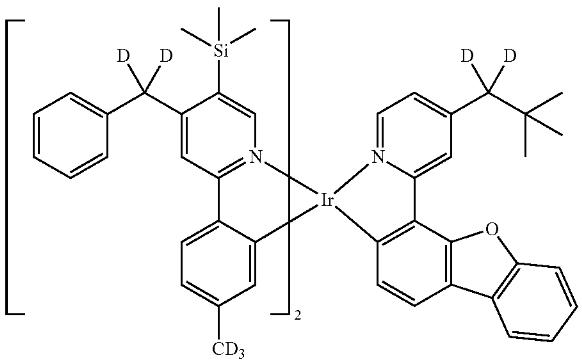

2111

Synthesis of Compound 2111A 7.9 g (yield of 79%) of Compound 2111A was obtained in the same manner as used to obtain Compound 171A of Synthesis Example 1, except that 2-(4-(methyl-d3)phenyl)-4-(phenylmethyl-d2)-5-(trimethylsilyl)pyridine was used instead of 4-isobutyl-2-phenyl-5-(trimethylsilyl)pyridine.

Synthesis of Compound 2111B

Compound 2111B was obtained in the same manner as used to obtain Compound 171B of Synthesis Example 1, except that Compound 2111A was used instead of Compound 171A. Compound 2111B thus obtained was used in the next reaction without further purification.

Synthesis of Compound 2111

1.5 g (yield of 40%) of Compound 2111 was obtained in the same manner as used to obtain Compound 171 of Synthesis Example 1, except that Compound 2111B was used instead of Compound 171B and that 2-(dibenzo[b,d]furan-4-yl)-4-(2,2-dimethylpropyl-1,1-d2)pyridine was used instead of 2-(dibenzo[b,d]furan-4-yl)-4-(2-phenylpropan-2-yl)pyridine. The compound was identified by Mass and HPLC.

HRMS(MALDI) calcd for $C_{66}H_{56}D_{12}IrN_3OSi_2$: m/z 1179.5283 Found: 1179.5288.

Synthesis Example 6 (Compound 2543)

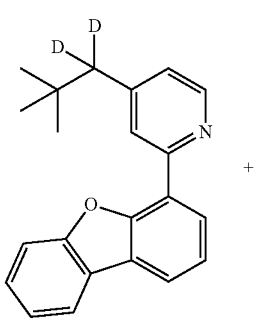

+

$IrCl_3$ $(H_2O)n$ Ethoxyethanol/$H_2O$ reflux, 24 h

-continued

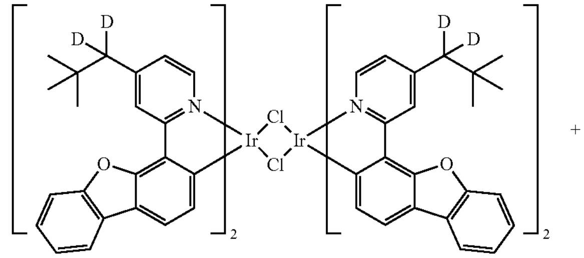

2543A

AgOTf MC/MeOH 18 h

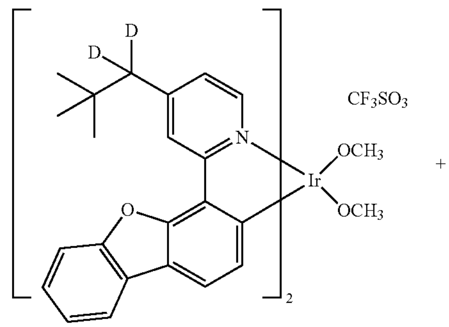

2543B

+

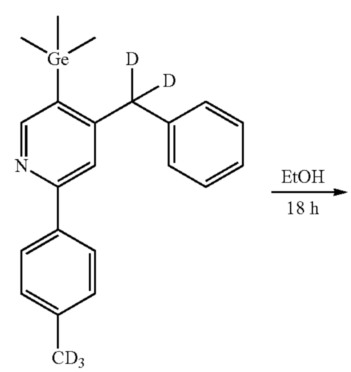

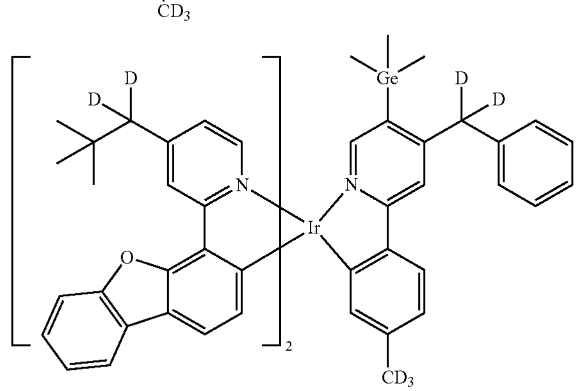

2543

Synthesis of Compound 2543A 5.4 g (yield of 54%) of Compound 2543A was obtained in the same manner as used to obtain Compound 171A of Synthesis Example 1, except that 2-(dibenzo[b,d]furan-4-yl)-4-(2,2-dimethylpropyl-1,1-d2)pyridine was used instead of 4-isobutyl-2-phenyl-5-(trimethylsilyl)pyridine.

Synthesis of Compound 2543B

Compound 2543B was obtained in the same manner as used to obtain Compound 171B of Synthesis Example 1, except that Compound 2543A was used instead of Compound 171A. Compound 2543B thus obtained was used in the next reaction without further purification.

Synthesis of Compound 2543

0.9 g (yield of 23%) of Compound 2543 was obtained in the same manner as used to obtain Compound 171 of Synthesis Example 1, except that Compound 2543B was used instead of Compound 171B and that 2-(4-(methyl-d3)phenyl)-4-(phenylmethyl-d2)-5-(trimethylgermyl)pyridine was used instead of 2-(dibenzo[b,d]furan-4-yl)-4-(2-phenylpropan-2-yl)pyridine. The compound was identified by Mass and HPLC.

HRMS(MALDI) calcd for $C_{66}H_{55}D_9GeIrN_3O_2$: m/z 1206.4404 Found: 1206.4414.

Example 1

A glass substrate with ITO/Ag/ITO as an anode deposited thereon to a thickness of 70 Å/1,000 Å/70 Å was cut to a size of 50 millimeters (mm)×50 mm×0.5 mm, sonicated with isopropyl alcohol and pure water each for 5 minutes, and then cleaned by exposure to ultraviolet rays and ozone for 30 minutes. Then, the resultant glass substrate was loaded onto a vacuum deposition apparatus.

2-TNATA was vacuum-deposited on the anode to form a hole injection layer having a thickness of 600 Å, and 4,4'-bis[N-(1-naphthyl)-N-phenylamino] biphenyl (hereinafter referred to as NPB) was vacuum-deposited on the hole injection layer to form a hole transport layer having a thickness of 1,350 Å.

Subsequently, CBP (host) and Compound 171 (dopant) were co-deposited at a weight ratio of 98:2 on the hole transport layer to form an emission layer having a thickness of 400 Å.

Afterwards, BCP was vacuum-deposited on the emission layer to form a hole blocking layer having a thickness of 50 Å, $Alq_3$ was vacuum-deposited on the hole blocking layer to form an electron transport layer having a thickness of 350 Å, LiF was vacuum-deposited on the electron transport layer to form an electron injection layer having a thickness of 10 Å, and Mg and Ag were co-deposited at a weight ratio of 90:10 on the electron injection layer to form a cathode having a thickness of 120 Å, thereby completing an organic light-emitting device.

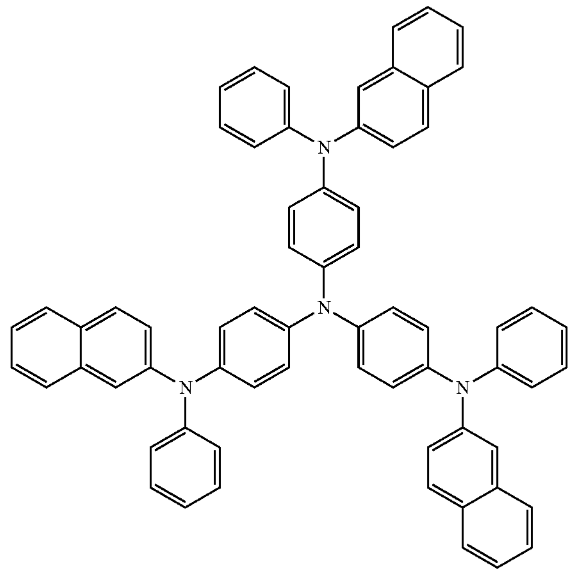

2-TNATA

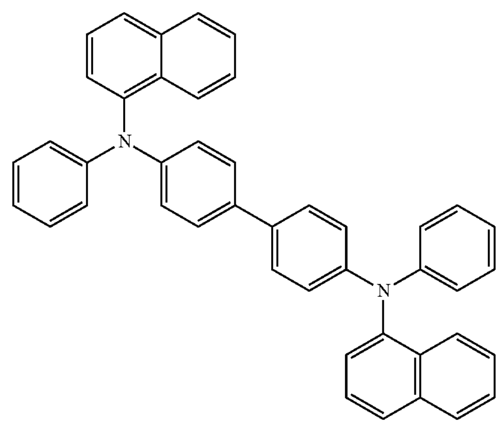

NPB

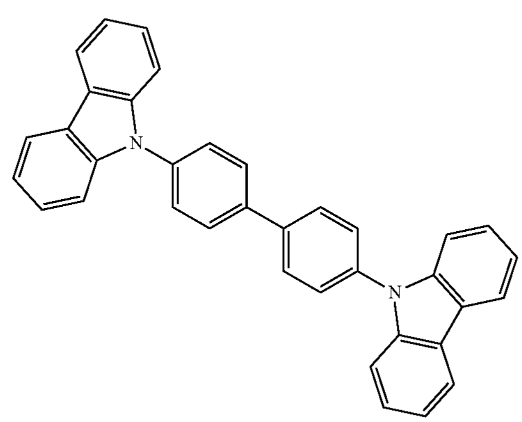

CBP

-continued

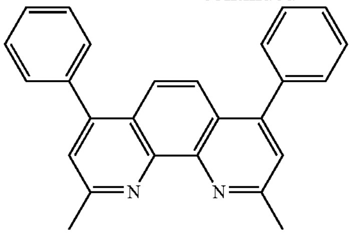

BCP

Examples 2 to 6 and Comparative Examples A to C

Organic light-emitting devices were manufactured in the same manner as in Example 1, except that compounds shown in Table 2 were each used instead of Compound 171 as a dopant in forming an emission layer.

Evaluation Example 1: Characterization of Organic Light-Emitting Device

Regarding each of the organic light-emitting devices of Examples 1 to 6 and Comparative Examples A to C, the driving voltage, maximum value (%) of external quantum efficiency (EQE), and lifespan ($LT_{97}$)(hr.) were evaluated, and results thereof are shown in Table 2. This evaluation was performed using a current-voltage meter (Keithley 2400) and a luminance meter (Minolta Cs-1000A), and the lifespan ($LT_{97}$)(at 16,000 candela per square meter (cd/$m^2$) was evaluated by measuring, as a relative value (%), the amount of time that elapsed until luminance was reduced to 97% of the initial luminance of 100%. The compounds were provided as a dopant in an emission layer.

TABLE 2

| | Compound No. | Max EQE (%) | $LT_{97}$ (%) (at 16,000 cd/$m^2$) |
|---|---|---|---|
| Example 1 | 171 | 25.9 | 100 |
| Example 2 | 1032 | 27.4 | 207 |
| Example 3 | 1485 | 26.8 | 113 |
| Example 4 | 2051 | 26.2 | 108 |
| Example 5 | 2111 | 26.5 | 154 |
| Example 6 | 2543 | 27.1 | 193 |
| Comparative Example A | A | 23.4 | 19 |
| Comparative Example B | B | 22.8 | 35 |
| Comparative Example C | C | 21.6 | 23 |

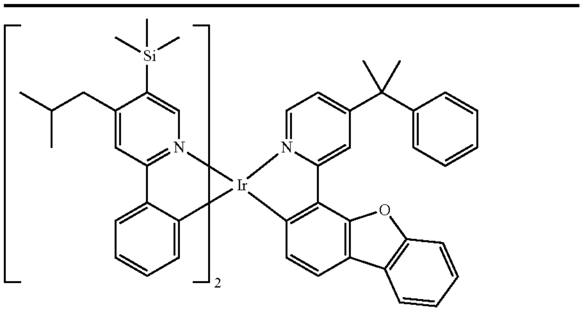

171

TABLE 2-continued

| | Compound No. | Max EQE (%) | $LT_{97}$ (%) (at 16,000 cd/$m^2$) |
|---|---|---|---|

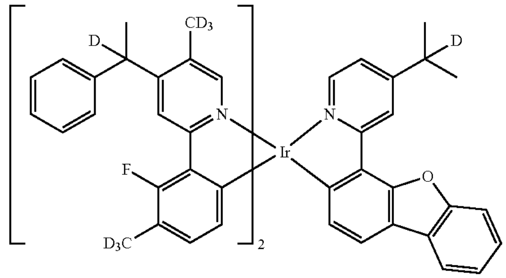

2051

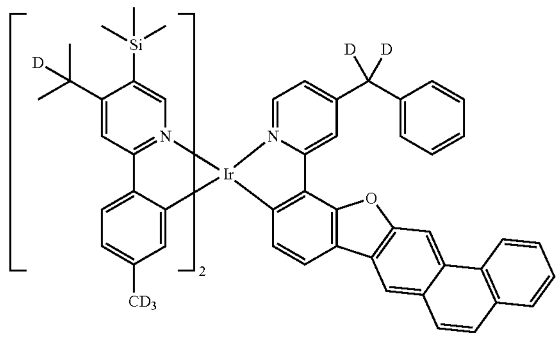

1032

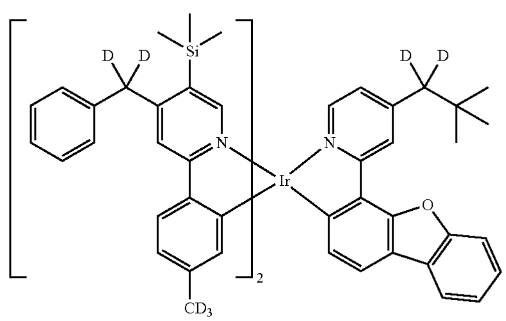

2111

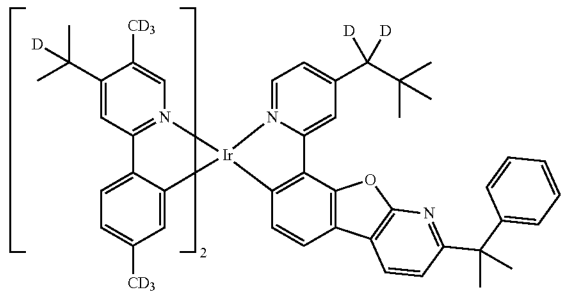

1485

TABLE 2-continued

| Compound No. | Max EQE (%) | $LT_{97}$ (%) (at 16,000 cd/m$^2$) |
|---|---|---|

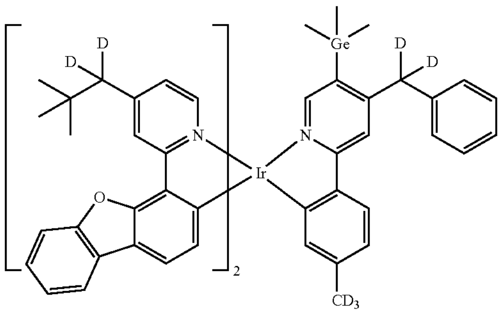

2543

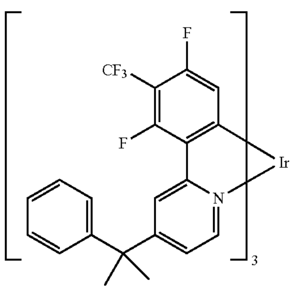

A

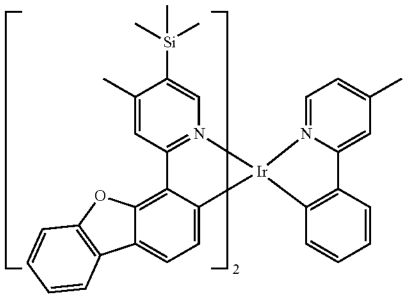

B

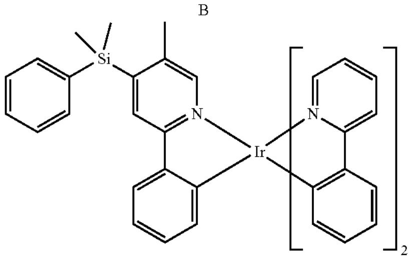

C

Referring to Table 2, it was confirmed that the organic light-emitting devices of Example 1 to 6 had improved EQE and improved lifespan characteristics compared to the organic light-emitting devices of Comparative Examples A to C.

According to the one or more embodiments, an organometallic compound may have excellent electrical characteristics and heat resistance, so that an electronic device, such as an organic light-emitting device, including the organometallic compound may have excellent EQE and excellent lifespan characteristics. Therefore, the use of the organometallic compound may enable the embodiment of a high-quality organic light-emitting device and an electron device including the same.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the FIGURES, it will be understood by those of ordinary skill in the art that various changes in form and details may be made therein without departing from the spirit and scope of the present disclosure as defined by the following claims.

What is claimed is:

1. An organometallic compound represented by Formula 1:

$$M(L_1)_{n1}(L_2)_{n2} \qquad \text{Formula 1}$$

wherein, in Formula 1,

M is a transition metal, $L_1$ is a ligand represented by Formula 2, n1 is 1 or 2, wherein, when n1 is 2, the two $L_1$ groups are identical to or different from each other, $L_2$ is a ligand represented by Formula 4D, n2 is 1 or 2, wherein, when n2 is 2 the two $L_2$ groups are identical to or different from each other, and $L_1$ and $L_2$ are different from each other, Formula 2

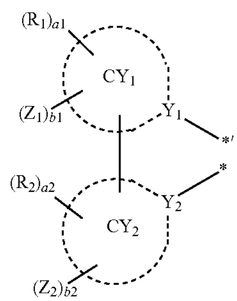

4D

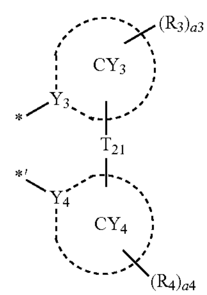

wherein, in Formulae 2 and 4D, $Y_1$ and $Y_3$ are N, $Y_2$ and $Y_4$ are C, $T_{21}$ is a single bond, ring $CY_2$ and ring $CY_4$ are each independently a $C_5$-$C_{30}$ carbocyclic group or a $C_1$-$C_{30}$ heterocyclic group, ring $CY_1$ and ring $CY_3$ are each independently a $C_1$-$C_{30}$ heterocyclic group, $R_1$ to $R_4$ are each independently hydrogen, deuterium, —F, —Cl, —Br, —I, —$SF_5$, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(═O)($Q_8$)($Q_9$), or —P($Q_8$)($Q_9$), a1 to a4 are each independently an integer from 0 to 20, b1 and b2 are each independently an integer from 0 to 20, wherein the sum of b1 and b2 is 1 or greater, $Z_1$ and $Z_2$ are each independently a group represented by Formula 3, Formula 3

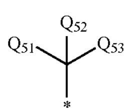

wherein, in Formula 3, $Q_{51}$ and $Q_{52}$ are each independently hydrogen, deuterium, —F, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, at least one of $Q_{51}$ and $Q_{52}$ in Formula 3 is each independently deuterium, a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, $Q_{53}$ is a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, two or more of a plurality of $R_1$ groups are optionally linked together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $R_2$ groups are optionally linked together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ is the same as described in connection with $R_1$, * and *' in Formulae 2 and 4D each indicate a binding site to M in Formula 1,

* in Formula 3 indicates a binding site to a neighboring atom, in Formulae 2, 4D, and 3, substituents of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group are each independently:

deuterium, —F, —Cl, —Br, —I, —$CD_3$, —$CD_2H$, —$CDH_2$, —$CF_3$, —$CF_2H$, —$CFH_2$, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, or a $C_2$-$C_{60}$ alkynyl group;

a $C_1$-$C_{60}$ alkyl group, a $C_2$-$C_{60}$ alkenyl group, or a $C_2$-$C_{60}$ alkynyl group, each substituted with deuterium, —F, —Cl, —Br, —I, —$CD_3$, —$CD_2H$, —$CDH_2$, —$CF_3$, —$CF_2H$, —$CFH_2$, a hydroxyl group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(═O)($Q_{18}$)($Q_{19}$), —P($Q_{18}$)($Q_{19}$), or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(═O)($Q_{28}$)($Q_{29}$), —P($Q_{28}$)($Q_{29}$), or a combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(═O)($Q_{38}$)($Q_{39}$), or —P($Q_{38}$)($Q_{39}$);

or a combination thereof, and $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, —F, a $C_1$-$C_{60}$ alkyl group, a $C_6$-$C_{60}$ aryl group, a deuterated $C_6$-$C_{60}$ aryl group, a fluorinated $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group or a $C_1$-$C_{60}$ heteroaryl group, each unsubstituted or substituted with deuterium, —F, a $C_1$-$C_{60}$ alkyl group, a deuterated $C_1$-$C_{60}$ alkyl group, a fluorinated $C_1$-$C_{60}$ alkyl group, a $C_6$-$C_{60}$ aryl group, a deuterated $C_6$-$C_{60}$ aryl group, a fluorinated $C_6$-$C_{60}$ aryl group, or a combination thereof; a $C_6$-$C_{60}$ aryloxy group; a $C_6$-$C_{60}$ arylthio group; a monovalent non-aromatic condensed polycyclic group; or a monovalent non-aromatic condensed heteropolycyclic group.

2. The organometallic compound of claim 1, wherein ring $CY_1$ in Formula 2 is a pyridine group, a pyrimidine group, a pyrazine group, a pyridazine group, a triazine group, a quinoline group, an isoquinoline group, a quinoxaline group, a quinazoline group, a benzoquinoline group, a benzoisoquinoline group, a benzoquinoxaline group, a benzoquinazoline group, a phenanthroline group, a phenanthridine group, a 5,6,7,8-tetrahydroisoquinoline group, a 5,6,7,8-tetrahydroquinoline group, an azafluorene group, an azacarbazole group, an azadibenzofuran group, an azadibenzothiophene group, or an azadibenzosilole group.

3. The organometallic compound of claim 1, wherein ring $CY_2$ in Formula 2 is a benzene group, a naphthalene group, an anthracene group, a phenanthrene group, a triphenylene group, a pyrene group, a chrysene group, a 1,2,3,4-tetrahydronaphthalene group, or a group represented by Formula 2B:

2B

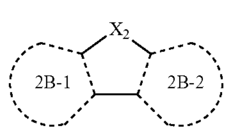

wherein, in Formula 2B, $X_2$ is O, S, Se, or a moiety comprising N, C, or Si, ring 2B-1 and ring 2B-2 are each independently a benzene group, a naphthalene group, an anthracene group, a phenanthrene group, a triphenylene group, a pyrene group, a chrysene group, a 1,2,3,4-tetrahydronaphthalene group, a pyridine group, a pyrimidine group, a pyrazine group, a pyridazine group, a triazine group, a quinoline group, an isoquinoline group, a quinoxaline group, a quinazoline group, a benzoquinoline group, a benzoisoquinoline group, a benzoquinoxaline group, a benzoquinazoline group, a phenanthroline group, a phenanthridine group, a 5,6,7,8-tetrahydroisoquinoline group, a 5,6,7,8-tetrahydroquinoline group, an indene group, an indole group, a benzofuran group, a benzothiophene group, a benzosilole group, a fluorene group, a carbazole group, a dibenzofuran group, a dibenzothiophene group, a dibenzosilole group, an azaindene group, an azaindole group, an azabenzofuran group, an azabenzothiophene group, an azabenzosilole group, an azafluorene group, an azacarbazole group, an azadibenzofuran group, an azadibenzothiophene group, or an azadibenzosilole group.

4. The organometallic compound of claim 1, wherein $R_1$ to $R_4$ in Formulae 2 and 4D are each independently:

hydrogen, deuterium, or —F;

a $C_1$-$C_{20}$ alkyl group unsubstituted or substituted with deuterium, —F, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, or a combination thereof;

a $C_3$-$C_{10}$ cycloalkyl group, a $C_1$-$C_{10}$ heterocycloalkyl group, a phenyl group, a biphenyl group, a naphthyl group, or a pyridinyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl) biphenyl group, a naphthyl group, a deuterated naphthyl group, a fluorinated naphthyl group, a ($C_1$-$C_{20}$ alkyl) naphthyl group, a pyridinyl group, a deuterated pyridinyl group, a fluorinated pyridinyl group, a ($C_1$-$C_{20}$ alkyl) pyridinyl group, or a combination thereof; or —Si($Q_3$)($Q_4$)($Q_5$) or —Ge($Q_3$)($Q_4$)($Q_5$), wherein, $Q_3$ to $Q_5$ are each independently:

deuterium;

a $C_1$-$C_{60}$ alkyl group unsubstituted or substituted with deuterium, —F, a $C_1$-$C_{60}$ alkyl group, a $C_6$-$C_{60}$ aryl group, a deuterated $C_6$-$C_{60}$ aryl group, a fluorinated $C_6$-$C_{60}$ aryl group, or a combination thereof, or a $C_6$-$C_{60}$ aryl group or a $C_1$-$C_{60}$ heteroaryl group, each unsubstituted or substituted with deuterium, —F, a $C_1$-$C_{60}$ alkyl group, a deuterated $C_1$-$C_{60}$ alkyl group, a fluorinated $C_1$-$C_{60}$ alkyl group, a $C_6$-Coo aryl group, a deuterated $C_6$-$C_{60}$ aryl group, a fluorinated $C_6$-$C_{60}$ aryl group, or a combination thereof.

5. The organometallic compound of claim 1, wherein at least one $R_1$ in the number of a1 in Formula 2 is: deuterium; —F; a $C_1$-$C_{20}$ alkyl group or a $C_3$-$C_{10}$ cycloalkyl group, each unsubstituted or substituted with deuterium, —F, $C_1$-$C_{10}$ alkyl group, or a combination thereof; a group represented by —Si($Q_3$)($Q_4$)($Q_5$); or a group represented by —Ge($Q_3$)($Q_4$)($Q_5$).

6. The organometallic compound of claim 1, wherein i) b1 is 1 or 2, and b2 is 0;

ii) b1 is 0, and b2 is 1 or 2; or iii) b1 and b2 are each 1.

7. The organometallic compound of claim 1, wherein at least one of $Q_{51}$ and $Q_{52}$ in Formula 3 is each independently:

deuterium; or a $C_1$-$C_{20}$ alkyl group unsubstituted or substituted with deuterium, —F, or a combination thereof.

8. The organometallic compound of claim 1, wherein $Q_{53}$ in Formula 3 is a phenyl group, a biphenyl group, a naphthyl group, or a pyridinyl group, each unsubstituted or substituted with deuterium, —F, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl) phenyl group, a biphenyl group, a deuterated biphenyl group, a fluorinated biphenyl group, a ($C_1$-$C_{20}$ alkyl) biphenyl group, a naphthyl group, a deuterated naphthyl group, a fluorinated naphthyl group, a ($C_1$-$C_{20}$ alkyl) naphthyl group, a pyridinyl group, a deuterated pyridinyl group, a fluorinated pyridinyl group, a ($C_1$-$C_{20}$ alkyl)pyridinyl group, or a combination thereof.

9. The organometallic compound of claim 1, wherein in Formula 2, a group represented by

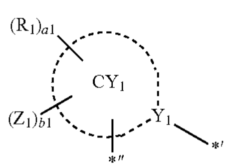

is a group represented by one of Formulae CY1(1) to CY1(16) and CY1(1)Z to CY1(38)Z:

CY1(1)

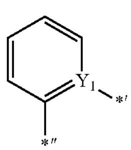

CY1(2)

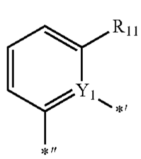

-continued

CY1(3)

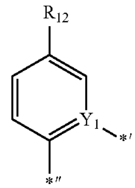

CY1(4)

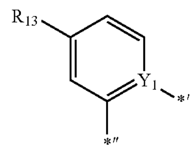

CY1(5)

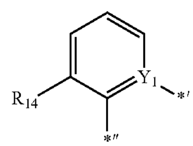

CY1(6)

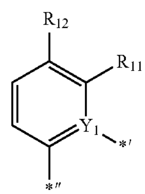

CY1(7)

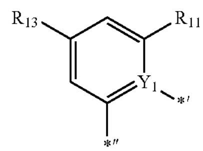

CY1(8)

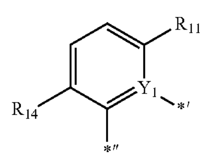

CY1(9)

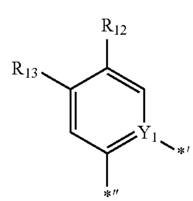

CY1(10)

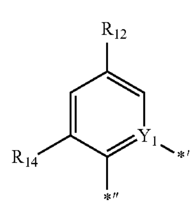

CY1(11)

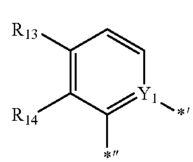

-continued
CY1(12)
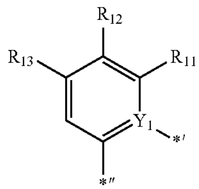
CY1(13)
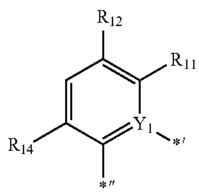
CY1(14)
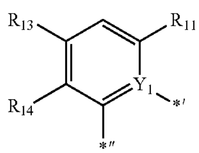
CY1(15)
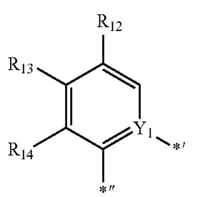
CY1(16)
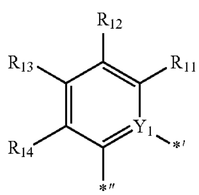
CY1(1)Z
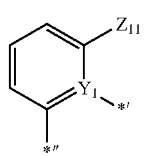
CY1(2)Z
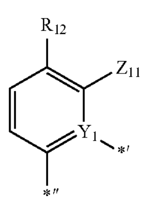
CY1(3)Z
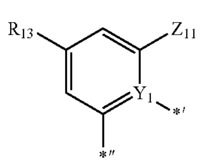
CY1(4)Z
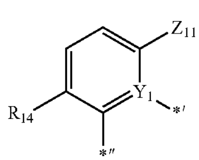
-continued
CY1(5)Z
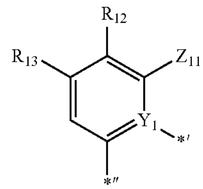
CY1(6)Z
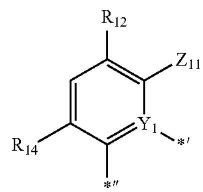
CY1(7)Z
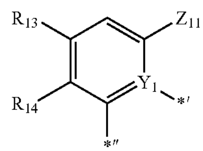
CY1(8)Z
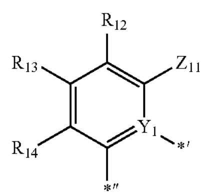
CY1(9)Z
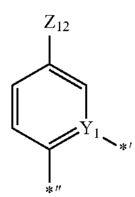
CY1(10)Z
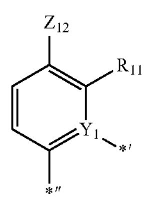
CY1(11)Z
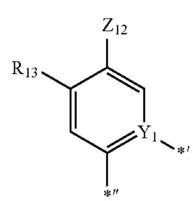
CY1(12)Z
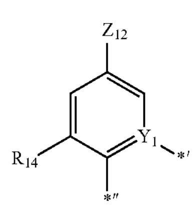

-continued
CY1(13)Z
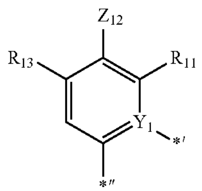
CY1(14)Z
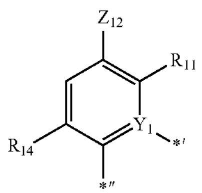
CY1(15)Z
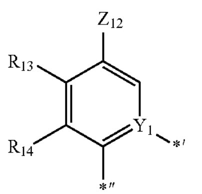
CY1(16)Z
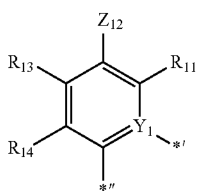
CY1(17)Z
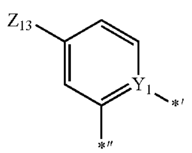
CY1(18)Z
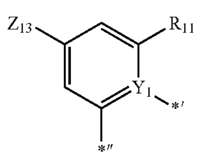
CY1(19)Z
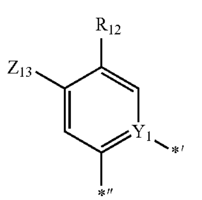
CY1(20)Z
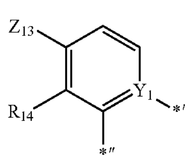
-continued
CY1(21)Z
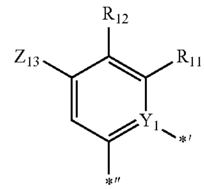
CY1(22)Z
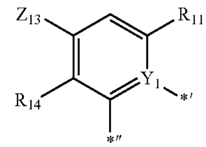
CY1(23)Z
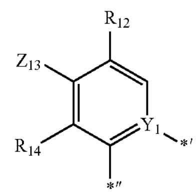
CY1(24)Z
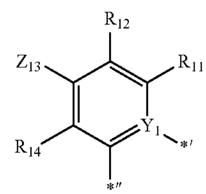
CY1(25)Z
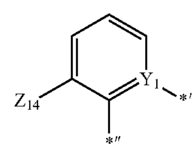
CY1(26)Z
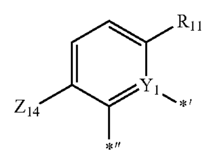
CY1(27)Z
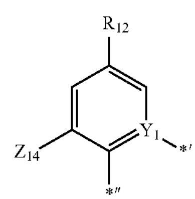
CY1(28)Z
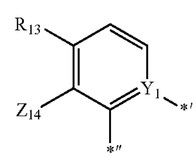
CY1(29)Z
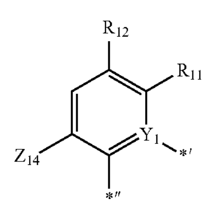

-continued

CY1(30)Z

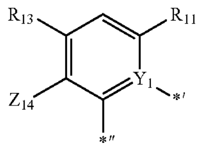

CY1(31)Z

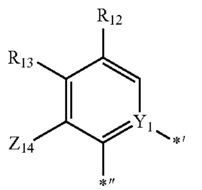

CY1(32)Z

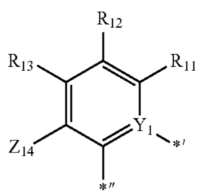

CY1(33)Z

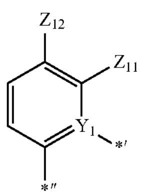

CY1(34)Z

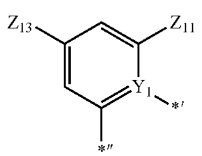

CY1(35)Z

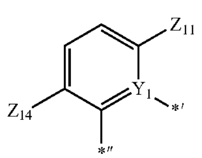

CY1(36)Z

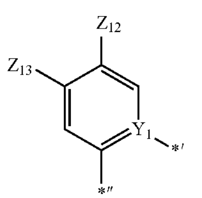

CY1(37)Z

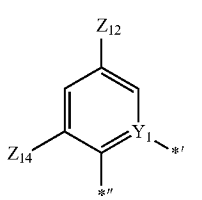

CY1(38)Z

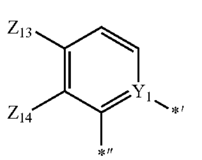

wherein, in Formulae CY1(1) to CY1(16) and CY1(1) Z to CY1(38) Z, $Y_1$ is the same as described in claim 1, $R_{11}$ to $R_{14}$ are each the same as described in connection with $R_1$ in claim 1, provided that each of $R_{11}$ to $R_{14}$ is not hydrogen, $Z_{11}$ to $Z_{14}$ are each the same as described in connection with $Z_1$ in claim 1,

*' indicates a binding site to M in Formula 1, and

*" indicates a binding site to ring $CY_2$ in Formula 2.

10. The organometallic compound of claim 1, wherein in Formula 2, a group represented by

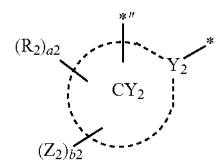

is a group represented by one of Formulae CY2(1) to CY2(96) and CY2(1)Z to CY2(54)Z:

CY2(1)

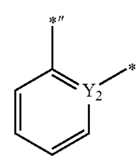

CY2(2)

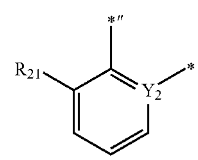

CY2(3)

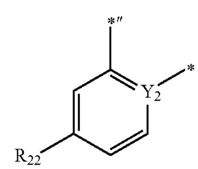

CY2(4)

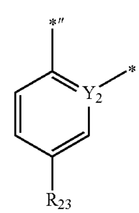

CY2(5)

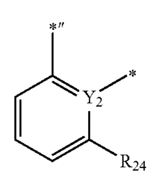

-continued
CY2(6)
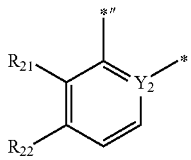
CY2(7)
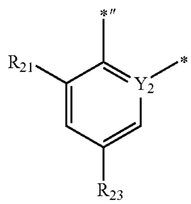
CY2(8)
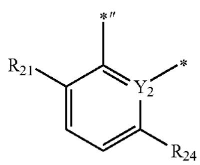
CY2(9)
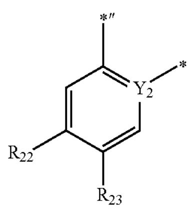
CY2(10)
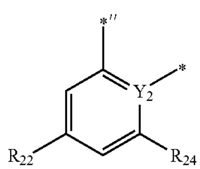
CY2(11)
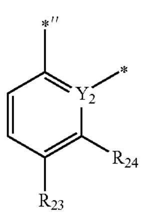
CY2(12)
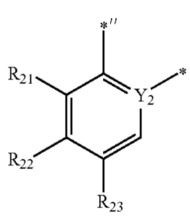
CY2(13)
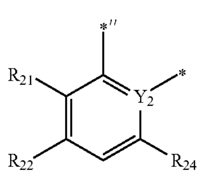
-continued
CY2(14)
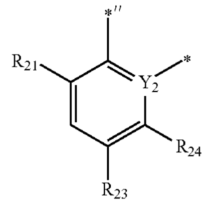
CY2(15)
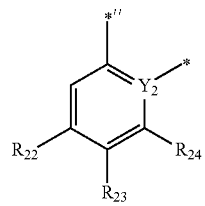
CY2(16)
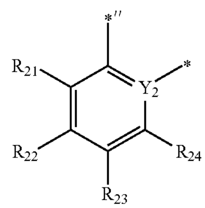
CY2(17)
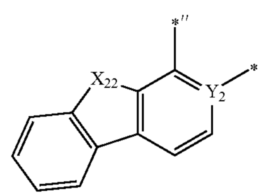
CY2(18)
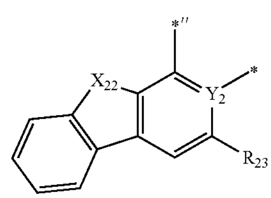
CY2(19)
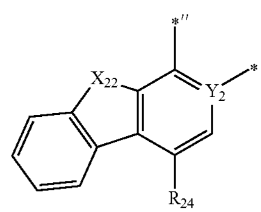
CY2(20)
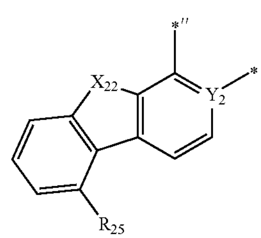

-continued
CY2(21)
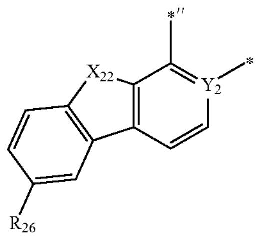
CY2(22)
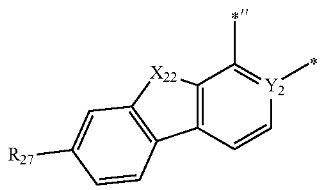
CY2(23)
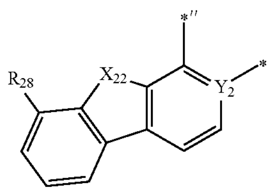
CY2(24)
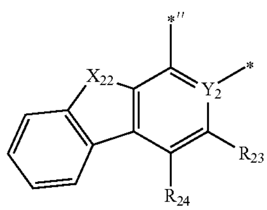
CY2(25)
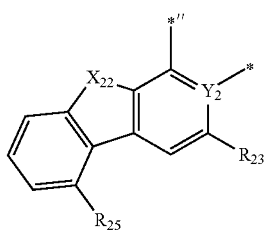
CY2(26)
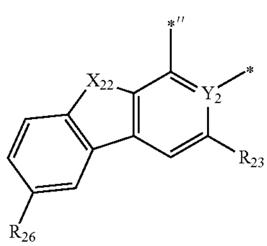
CY2(27)
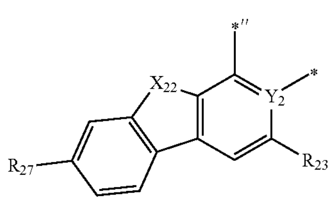
-continued
CY2(28)
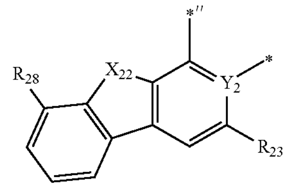
CY2(29)
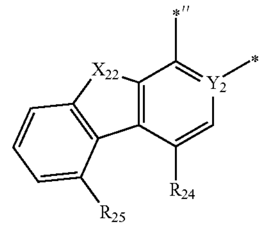
CY2(30)
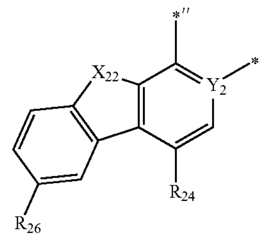
CY2(31)
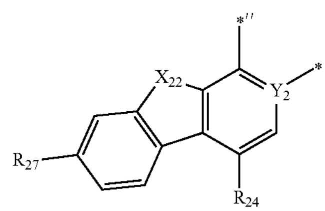
CY2(32)
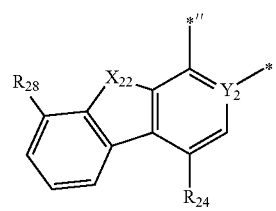
CY2(33)
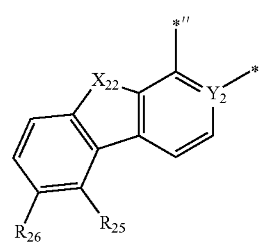
CY2(34)
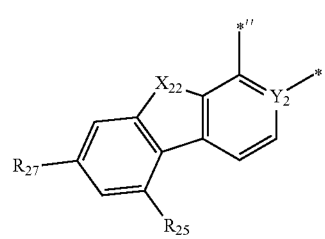

-continued
CY2(35)
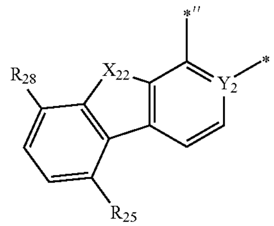
CY2(36)
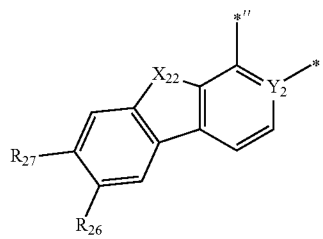
CY2(37)
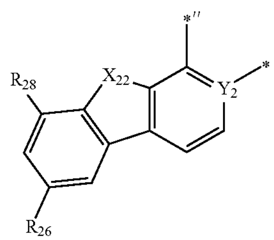
CY2(38)
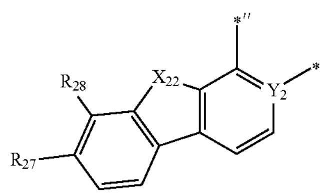
CY2(39)
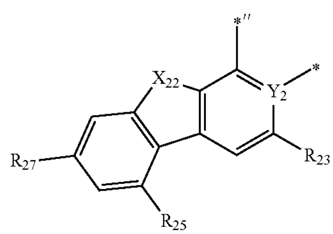
CY2(40)
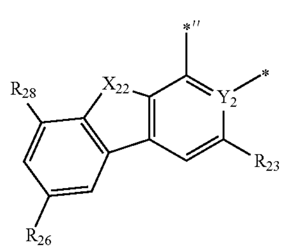
-continued
CY2(41)
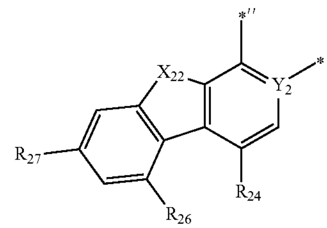
CY2(42)
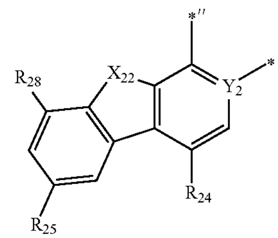
CY2(43)
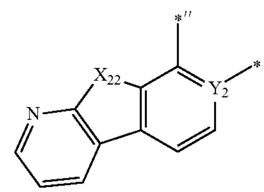
CY2(44)
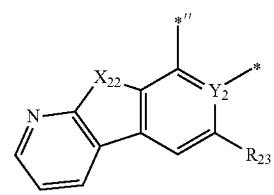
CY2(45)
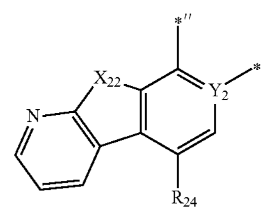
CY2(46)
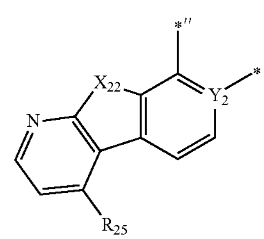
CY2(47)
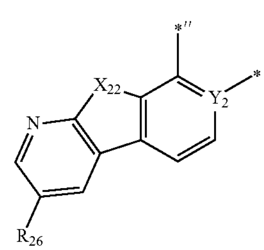

-continued
CY2(48)
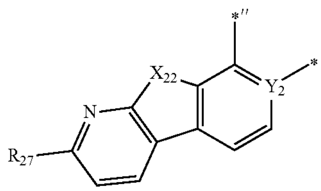
CY2(49)
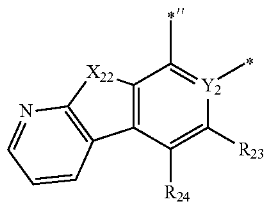
CY2(50)
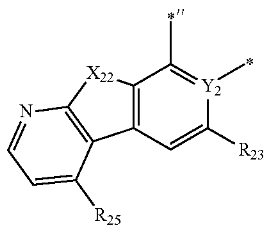
CY2(51)
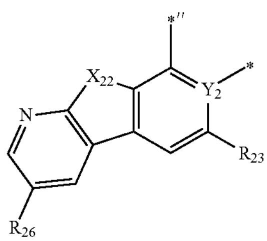
CY2(52)
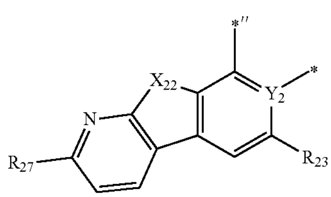
CY2(53)
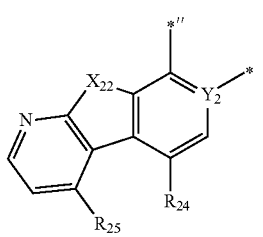
CY2(54)
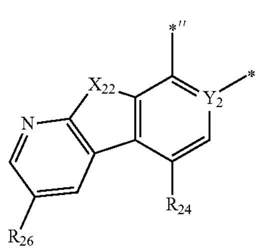
-continued
CY2(55)
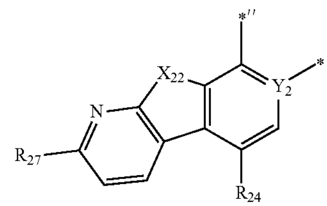
CY2(56)
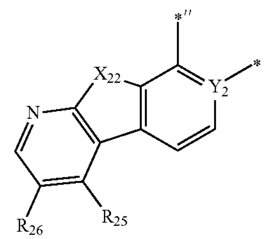
CY2(57)
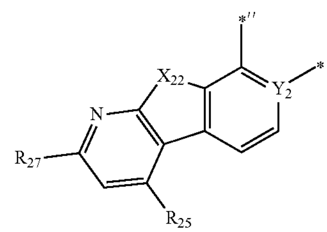
CY2(58)
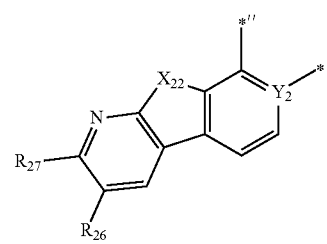
CY2(59)
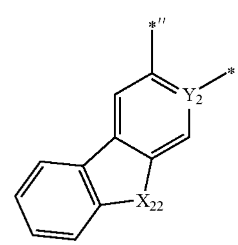
CY2(60)
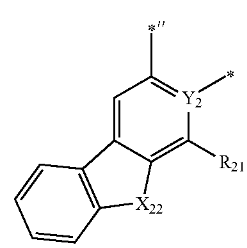

-continued
CY2(61)
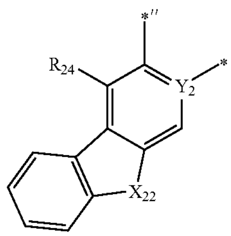
CY2(62)
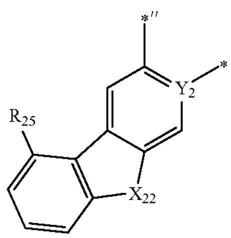
CY2(63)
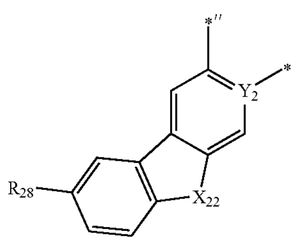
CY2(64)
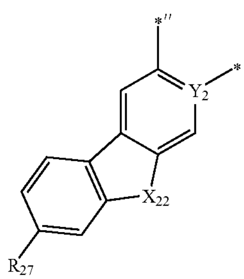
CY2(65)
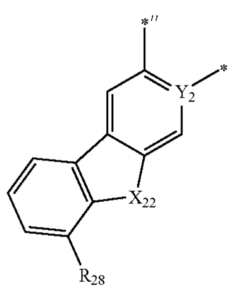
CY2(66)
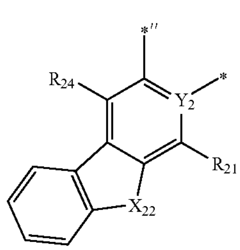
-continued
CY2(67)
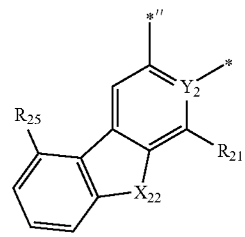
CY2(68)
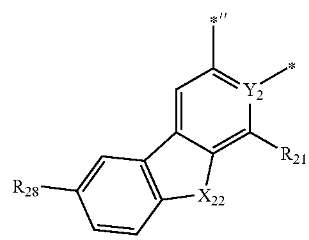
CY2(69)
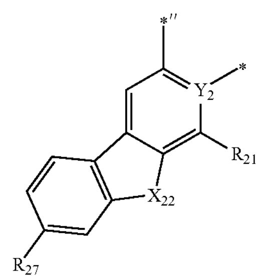
CY2(70)
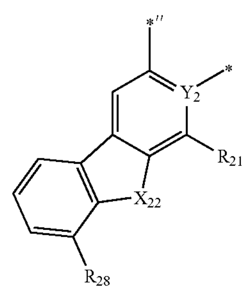
CY2(71)
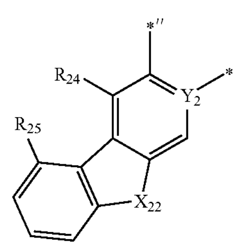
CY2(72)
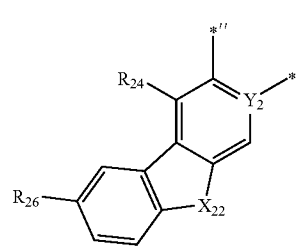

-continued
CY2(73)
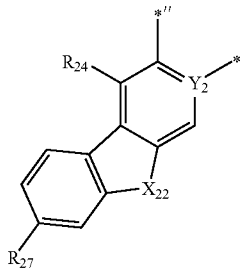
CY2(74)
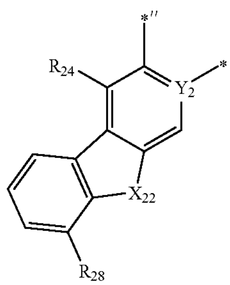
CY2(75)
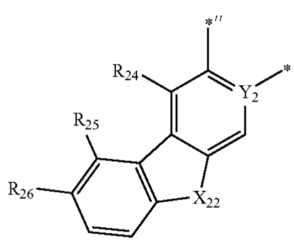
CY2(76)
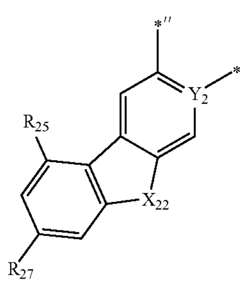
CY2(77)
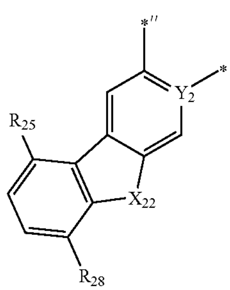
-continued
CY2(78)
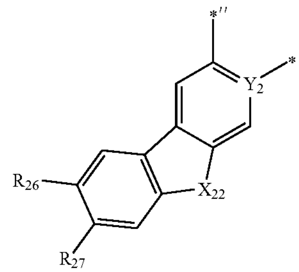
CY2(79)
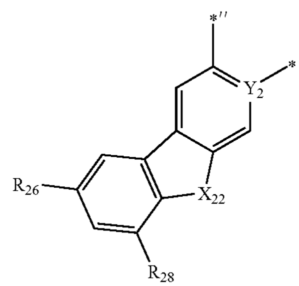
CY2(80)
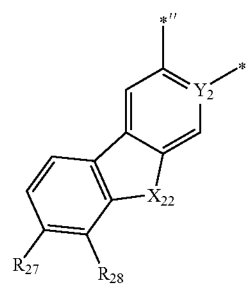
CY2(81)
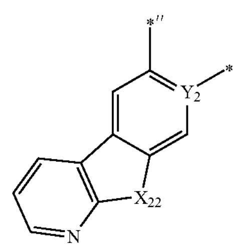
CY2(82)
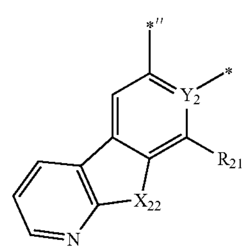
CY2(83)
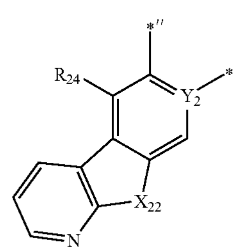

-continued
CY2(84)
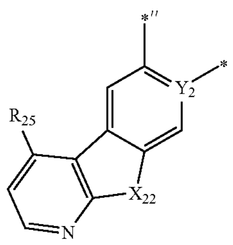
CY2(85)
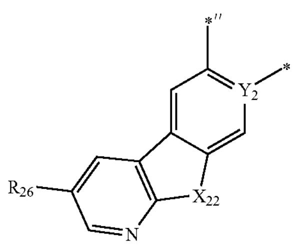
CY2(86)
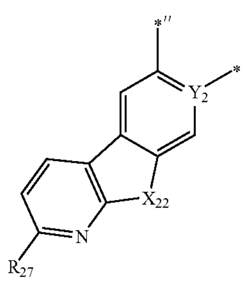
CY2(87)
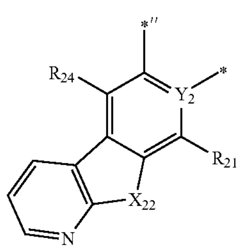
CY2(88)
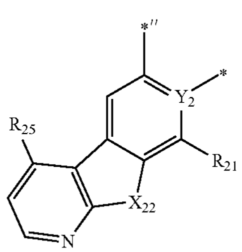
CY2(89)
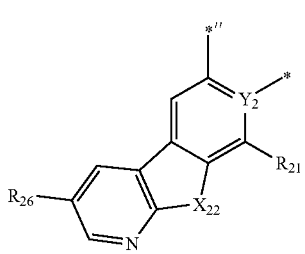
-continued
CY2(90)
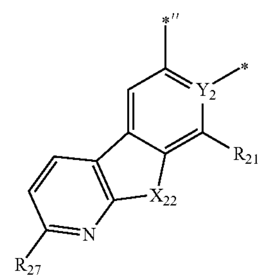
CY2(91)
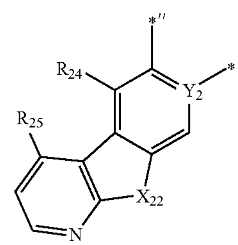
CY2(92)
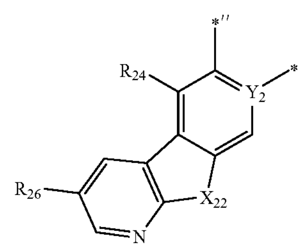
CY2(93)
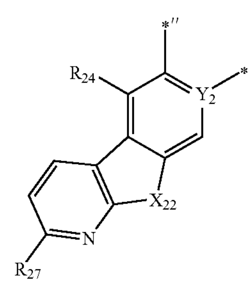
CY2(94)
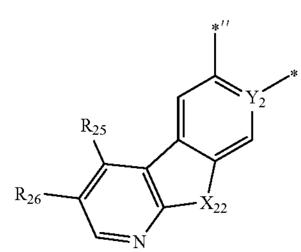
CY2(95)
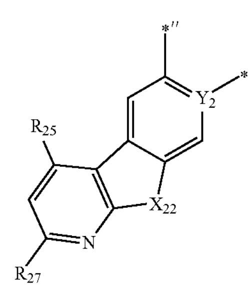

-continued
CY2(96)
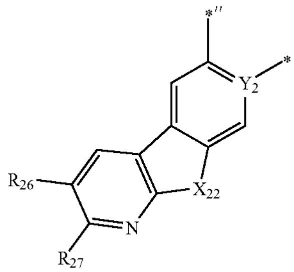
CY2(1)Z
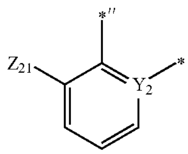
CY2(2)Z
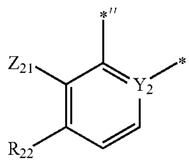
CY2(3)Z
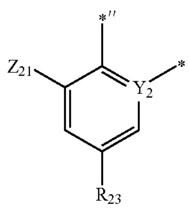
CY2(4)Z
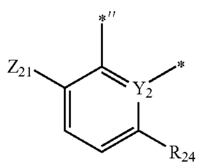
CY2(5)Z
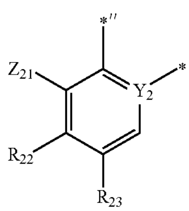
CY2(6)Z
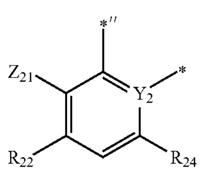
CY2(7)Z
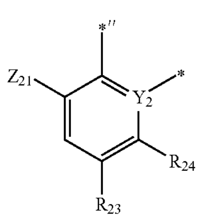
-continued
CY2(8)Z
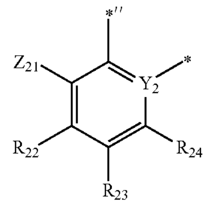
CY2(9)Z
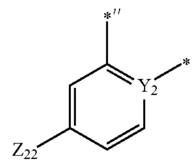
CY2(10)Z
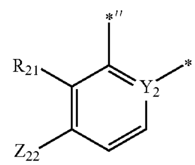
CY2(11)Z
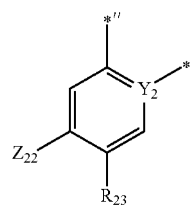
CY2(12)Z
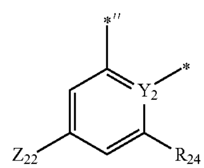
CY2(13)Z
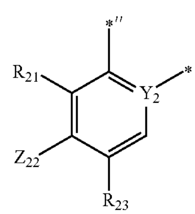
CY2(14)Z
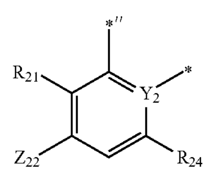
CY2(15)Z
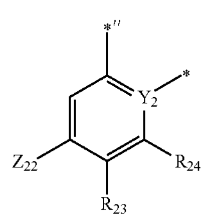

CY2(16)Z
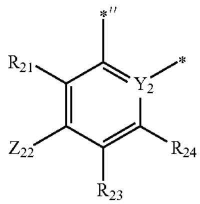
CY2(17)Z
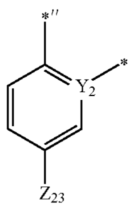
CY2(18)Z
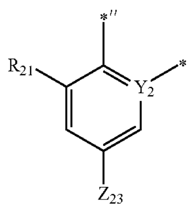
CY2(19)Z
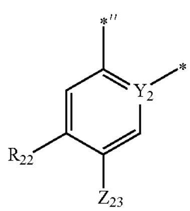
CY2(20)Z
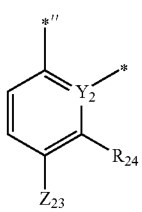
CY2(21)Z
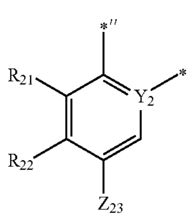
CY2(22)Z
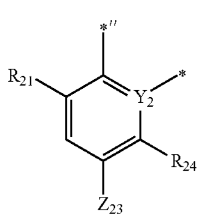
CY2(23)Z
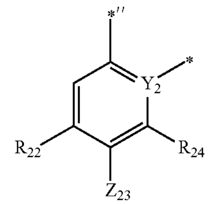
CY2(24)Z
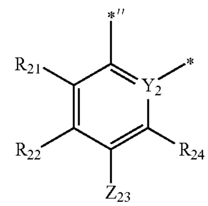
CY2(25)Z
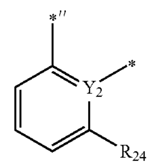
CY2(26)Z
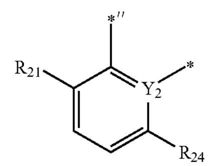
CY2(27)Z
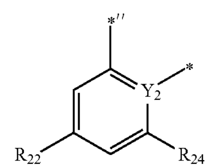
CY2(28)Z
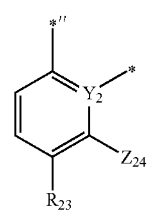
CY2(29)Z
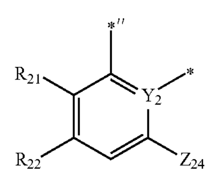
CY2(30)Z
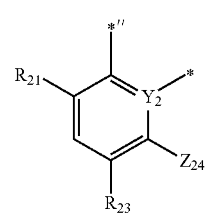

-continued
CY2(31)Z
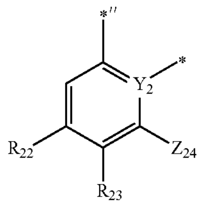
CY2(32)Z
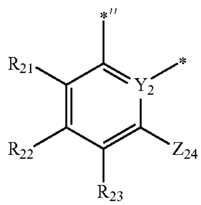
CY2(33)Z
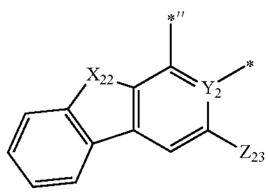
CY2(34)Z
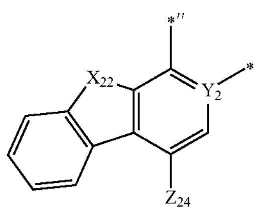
CY2(35)Z
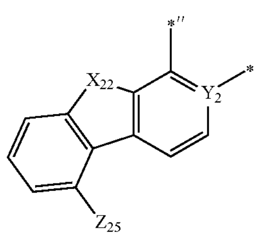
CY2(36)Z
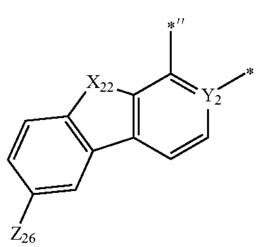
CY2(37)Z
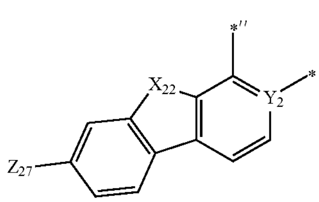
-continued
CY2(38)Z
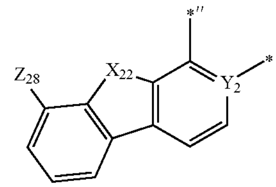
CY2(39)Z
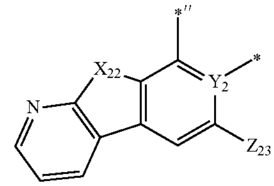
CY2(40)Z
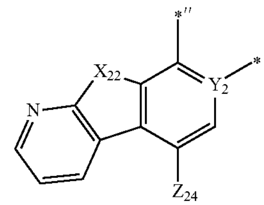
CY2(41)Z
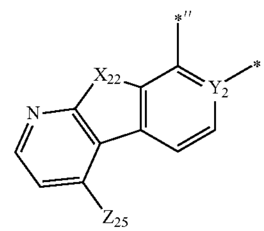
CY2(42)Z
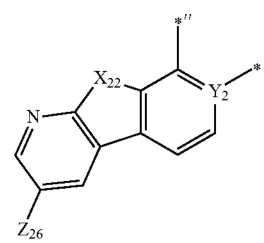
CY2(43)Z
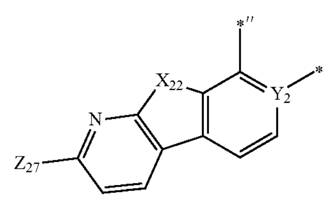
CY2(44)Z
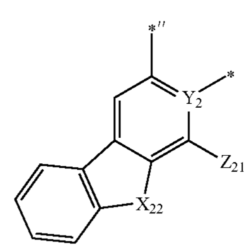

-continued

CY2(45)Z

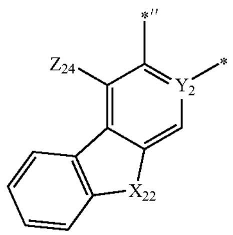

CY2(46)Z

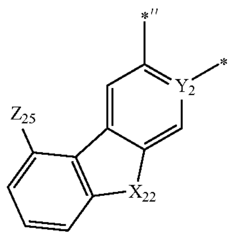

CY2(47)Z

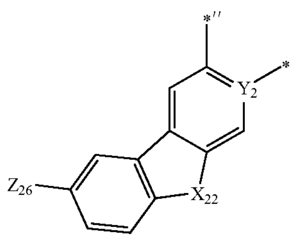

CY2(48)Z

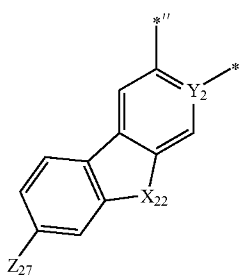

CY2(49)Z

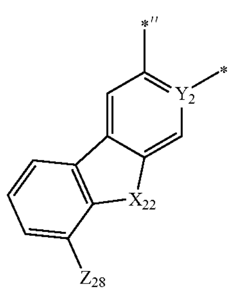

CY2(50)Z

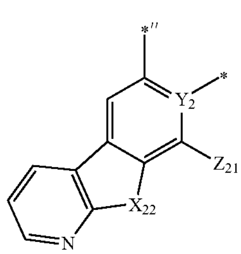

-continued

CY2(51)Z

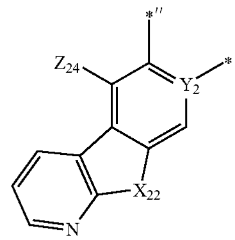

CY2(52)Z

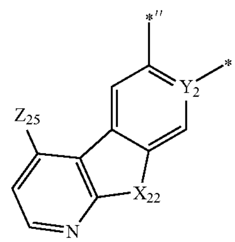

CY2(53)Z

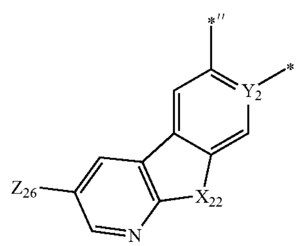

CY2(54)Z

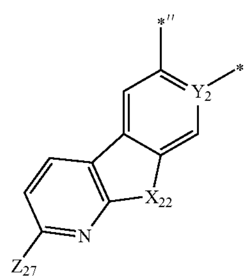

wherein, in Formulae CY2(1) to CY2(96) and CY2(1)Z to CY2(54)Z, $Y_2$ is the same as described in claim 1, $X_{22}$ is $C(R_{29a})(R_{29b})$, $N(R_{29a})$, O, S, Se, or $Si(R_{29a})(R_{29b})$, $R_{21}$ to $R_{28}$, $R_{29a}$, and $R_{29b}$ are each the same as described in connection with $R_2$ in claim 1, provided that each of $R_{21}$ to $R_{28}$ is not hydrogen, $Z_{21}$ to $Z_{28}$ are each the same as described in connection with $Z_2$ in claim 1,

* indicates a binding site to M in Formula 1, and

*" indicates a binding site to ring $CY_1$ in Formula 2.

11. The organometallic compound of claim 1, wherein in Formula 4D, a group represented by

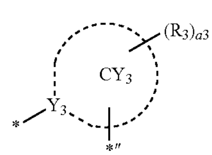

is a group represented by one of Formulae CY3(1) to CY3(16):

-continued

CY3(1)

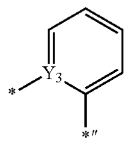

CY3(2)

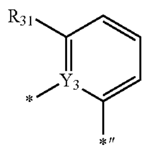

CY3(3)

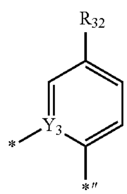

CY3(4)

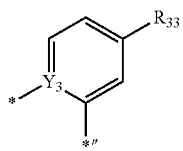

CY3(5)

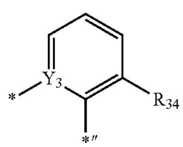

CY3(6)

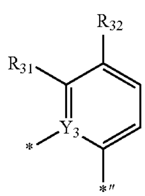

CY3(7)

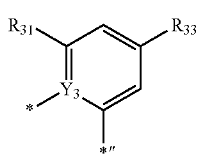

CY3(8)

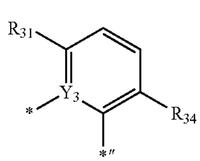

CY3(9)

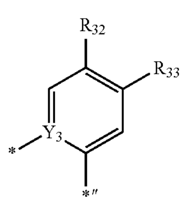

CY3(10)

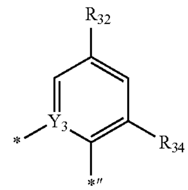

CY3(11)

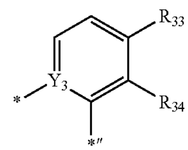

CY3(12)

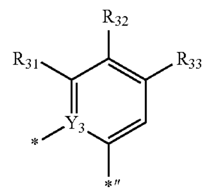

CY3(13)

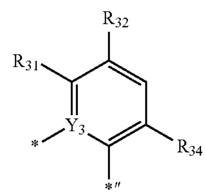

CY3(14)

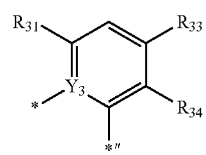

CY3(15)

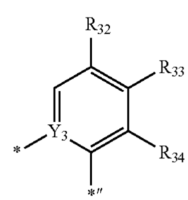

CY3(16)

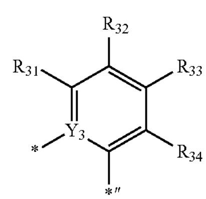

wherein, in Formulae CY3(1) to CY3(16), $Y_3$ is the same as described in claim 1, $R_{31}$ to $R_{34}$ are each the same as described in connection with $R_3$ in claim 1, provided that each of $R_{31}$ to $R_{34}$ is not hydrogen,

* indicates a binding site to M in Formula 1, and

*" indicates a binding site to $T_{21}$ in Formula 4D.

12. The organometallic compound of claim 1, wherein in Formula 4D, a group represented by

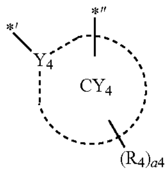
is a group represented by one of Formulae CY4(1) to CY4(96):
CY4(1)
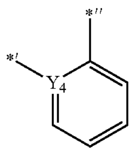
CY4(2)
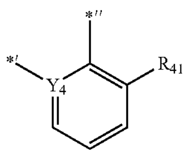
CY4(3)
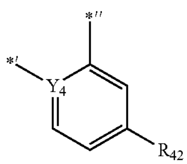
CY4(4)
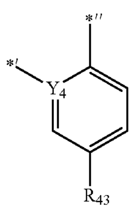
CY4(5)
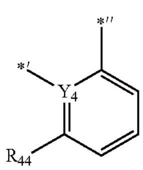
CY4(6)
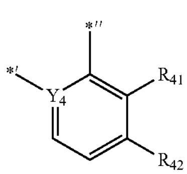
CY4(7)
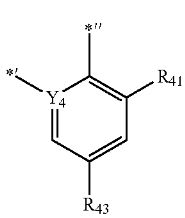
-continued
CY4(8)
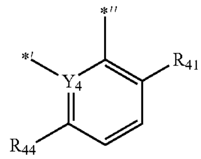
CY4(9)
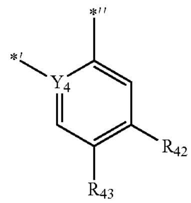
CY4(10)
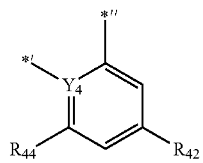
CY4(11)
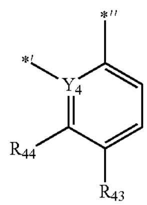
CY4(12)
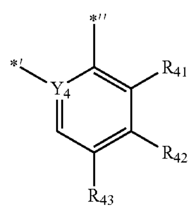
CY4(13)
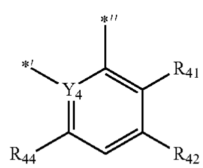
CY4(14)
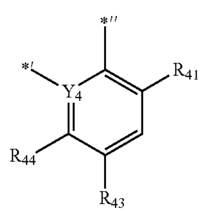
CY4(15)
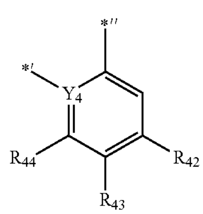

-continued
CY4(16)
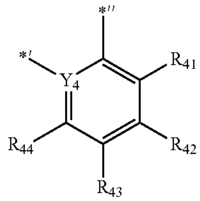
CY4(17)
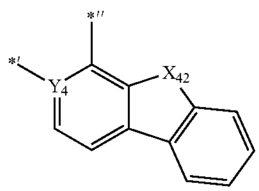
CY4(18)
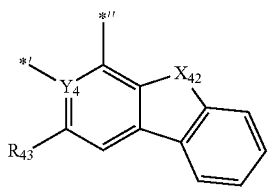
CY4(19)
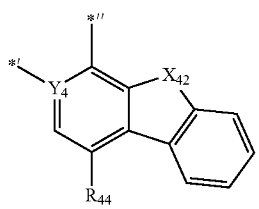
CY4(20)
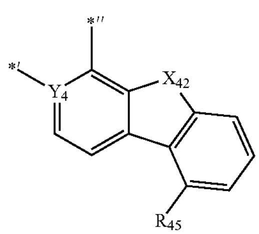
CY4(21)
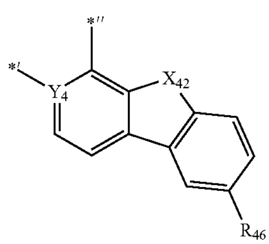
CY4(22)
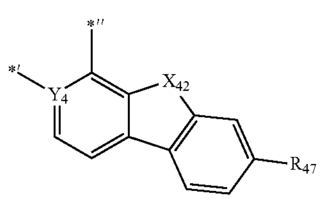
-continued
CY4(23)
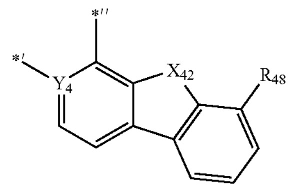
CY4(24)
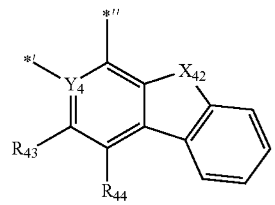
CY4(25)
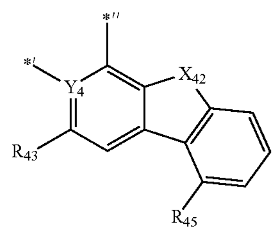
CY4(26)
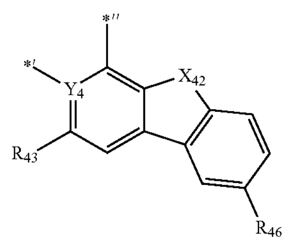
CY4(27)
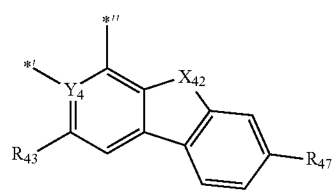
CY4(28)
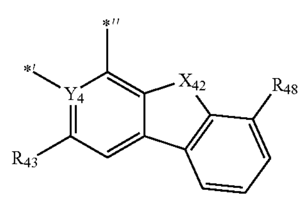
CY4(29)
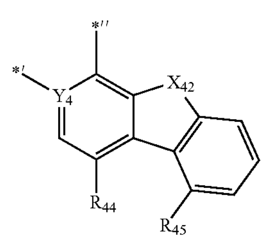

-continued
CY4(30)
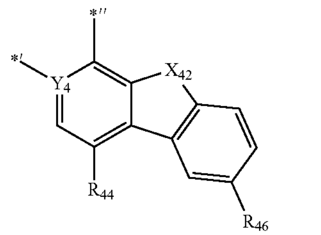
CY4(31)
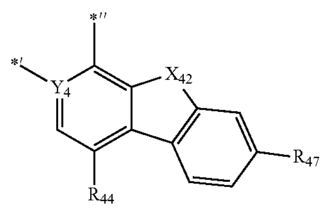
CY4(32)
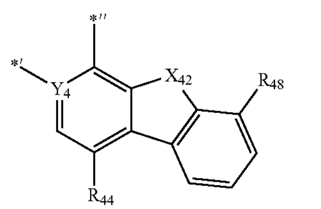
CY4(33)
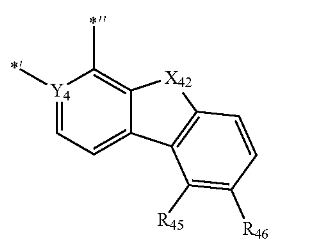
CY4(34)
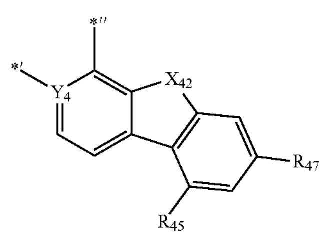
CY4(35)
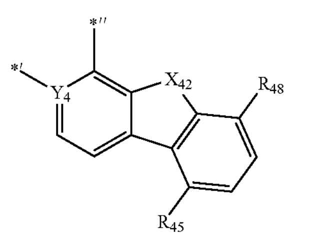
-continued
CY4(36)
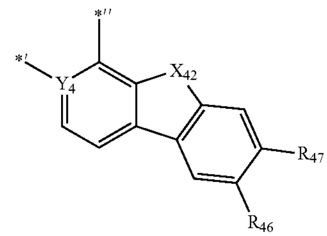
CY4(37)
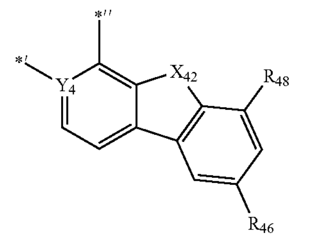
CY4(38)
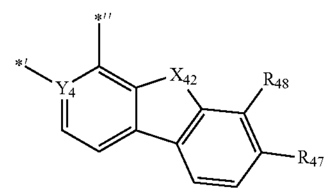
CY4(39)
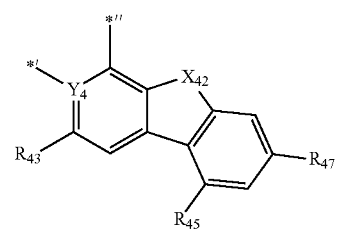
CY4(40)
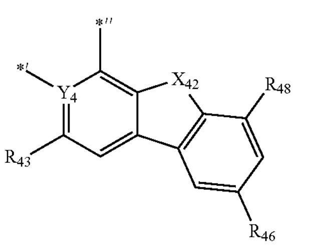
CY4(41)
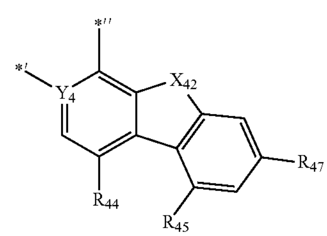

-continued
CY4(42)
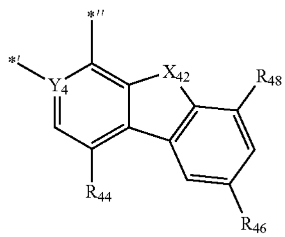
CY4(43)
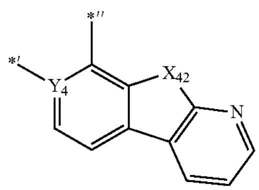
CY4(44)
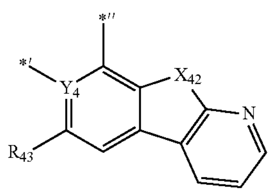
CY4(45)
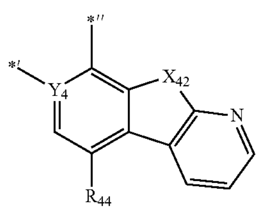
CY4(46)
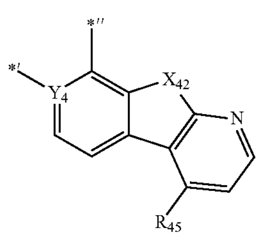
CY4(47)
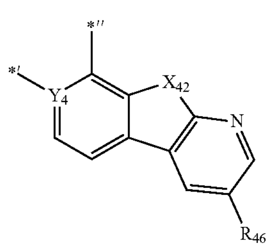
CY4(48)
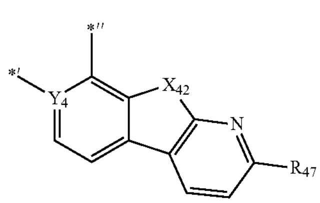
-continued
CY4(49)
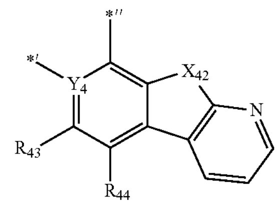
CY4(50)
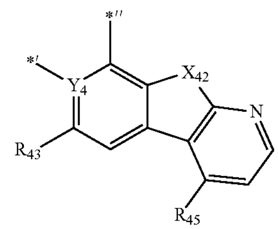
CY4(51)
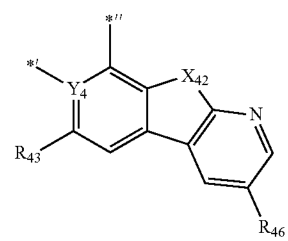
CY4(52)
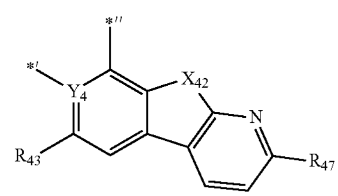
CY4(53)
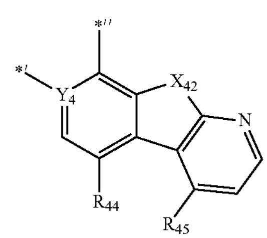
CY4(54)
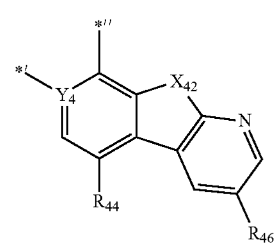
CY4(55)
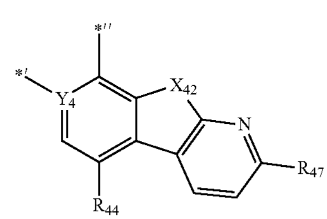

-continued
CY4(56)
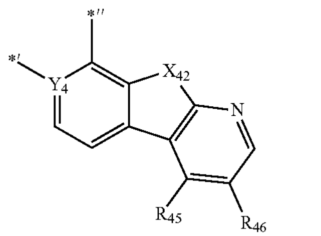
CY4(57)
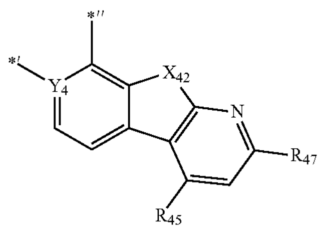
CY4(58)
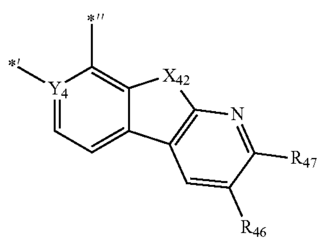
CY4(59)
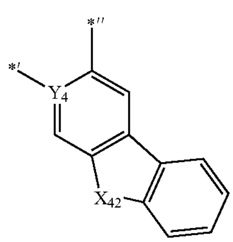
CY4(60)
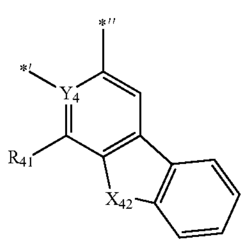
CY4(61)
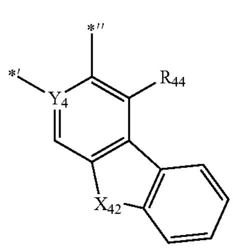
-continued
CY4(62)
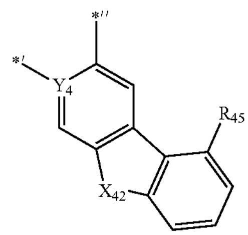
CY4(63)
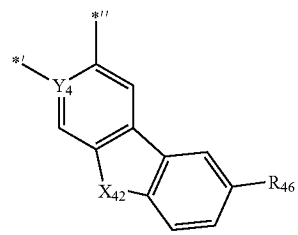
CY4(64)
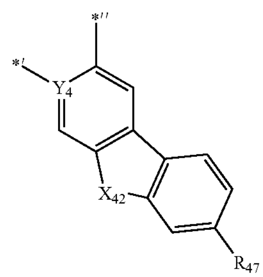
CY4(65)
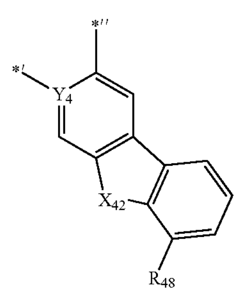
CY4(66)
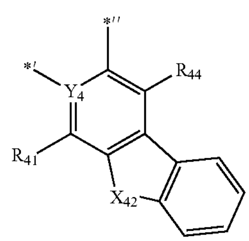
CY4(67)
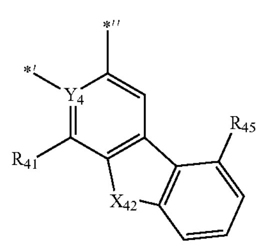

-continued
CY4(68)
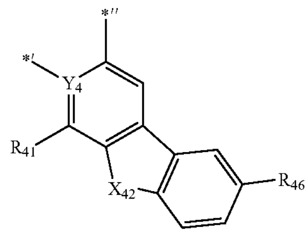
CY4(69)
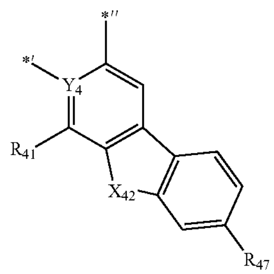
CY4(70)
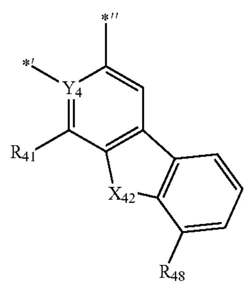
CY4(71)
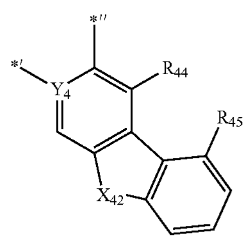
CY4(72)
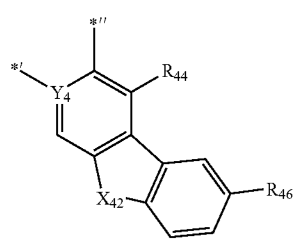
CY4(73)
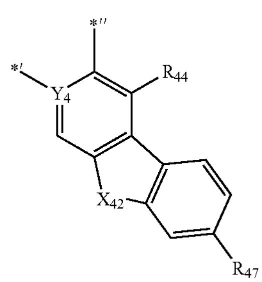
-continued
CY4(74)
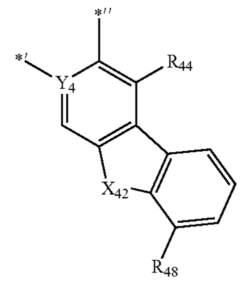
CY4(75)
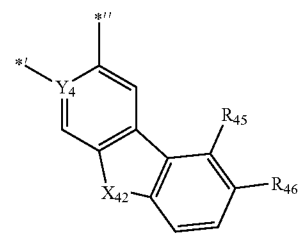
CY4(76)
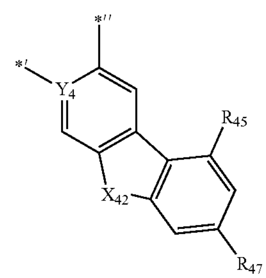
CY4(77)
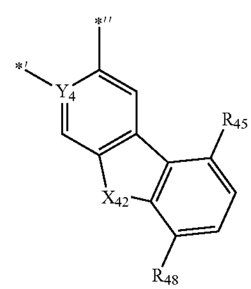
CY4(78)
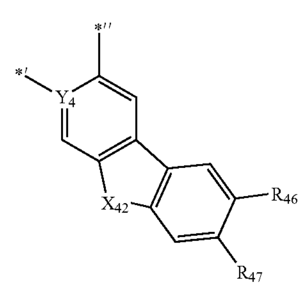

-continued
CY4(79)
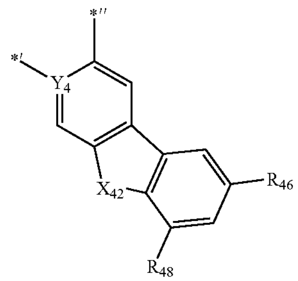
CY4(80)
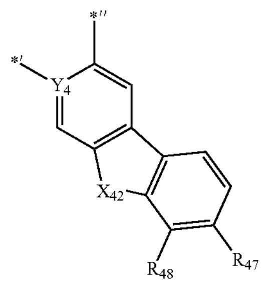
CY4(81)
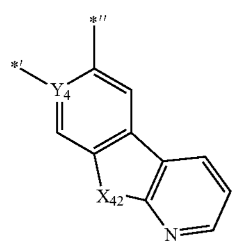
CY4(82)
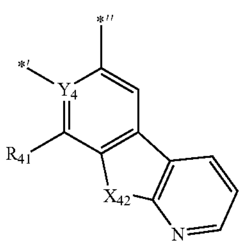
CY4(83)
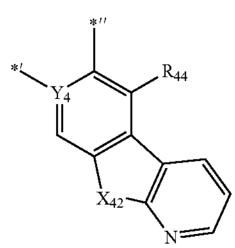
CY4(84)
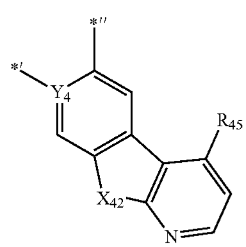
-continued
CY4(85)
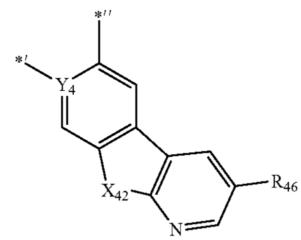
CY4(86)
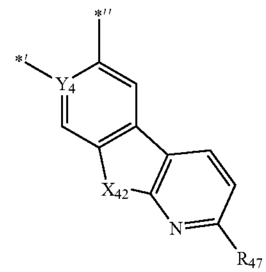
CY4(87)
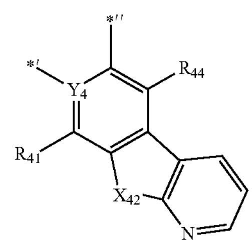
CY4(88)
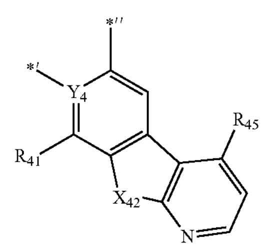
CY4(89)
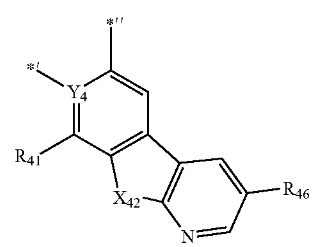
CY4(90)
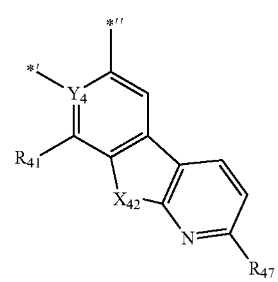

-continued

CY4(91)

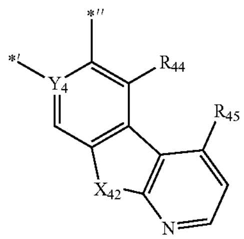

CY4(92)

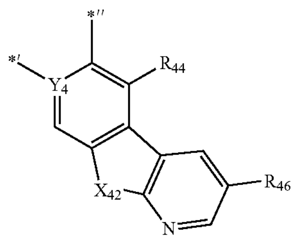

CY4(93)

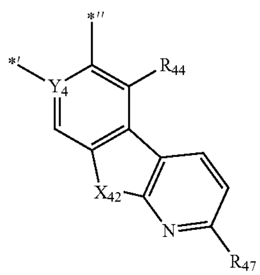

CY4(94)

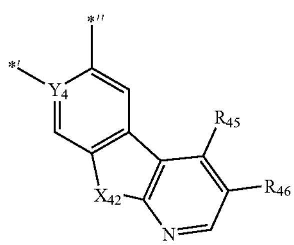

CY4(95)

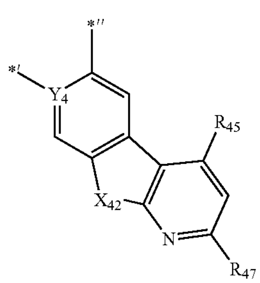

CY4(96)

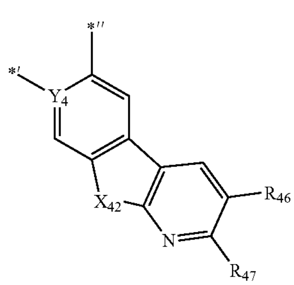

wherein, in Formulae CY4(1) to CY4(96), $Y_4$ is the same as described in claim 1, $X_{42}$ is $C(R_{49a})(R_{49b})$, $N(R_{49a})$, O, S, Se, or $Si(R_{49a})(R_{49b})$, $R_{41}$ to $R_{48}$, $R_{49a}$, and $R_{49b}$ are each the same as described in connection with $R_4$ in claim 1, provided that each of $R_{41}$ to $R_{48}$ is not hydrogen,

*' indicates a binding site to M in Formula 1, and

*" indicates a binding site to a binding site to $T_{21}$ in Formula 4D.

13. An organic light-emitting device, comprising:

a first electrode;

a second electrode; and an organic layer disposed between the first electrode and the second electrode and comprising an emission layer, wherein the organic layer comprises at least one organometallic compound of claim 1.

14. The organic light-emitting device of claim 13, wherein the first electrode is an anode, the second electrode is a cathode, the organic layer further comprises a hole transport region disposed between the first electrode and the emission layer, and an electron transport region disposed between the emission layer and the second electrode, the hole transport region comprises a hole injection layer, a hole transport layer, an electron blocking layer, a buffer layer, or a combination thereof, and the electron transport region comprises a hole blocking layer, an electron transport layer, an electron injection layer, or a combination thereof.

15. The organic light-emitting device of claim 13, wherein the emission layer comprises the at least one organometallic compound.

16. The organic light-emitting device of claim 15, wherein the at least one organometallic compound emits green light.

17. The organic light-emitting device of claim 15, wherein the emission layer further comprises a host, and an amount of the host in the emission layer is greater than an amount of the at least one organometallic compound in the emission layer, based on weight.

18. An electronic apparatus, comprising the organic light-emitting device of claim 13.

19. The organometallic compound of claim 1, wherein a1 is not zero and at least one $R_1$ in the number of a1 in Formula 2 is: deuterium; —F; a $C_1$-$C_{20}$ alkyl group unsubstituted or substituted with deuterium, —F, $C_1$-$C_{10}$ alkyl group, or a combination thereof, or a group represented by $—Si(Q_3)(Q_4)(Q_5)$ or $Ge(Q_3)(Q_4)(Q_5)$;

wherein ring $CY_2$ in Formula 2 is a 1,2,3,4-tetrahydronaphthalene group or a group represented by Formula 2B:

2B

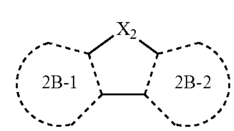

wherein, in Formula 2B, $X_2$ is O, S, Se, or a moiety comprising N, C, or Si, ring 2B-1 and ring 2B-2 are each independently a benzene group, a naphthalene group, an anthracene group, a phenanthrene group, a triphenylene group, a pyrene group, a chrysene group, a 1,2,3,4-tetrahydronaphthalene group, a pyridine group, a pyrimidine group, a pyrazine group, a pyridazine group, a triazine group, a quinoline group, an isoquinoline group, a quinoxaline group, a quinazoline group, a benzoquinoline group, a benzoisoquinoline group, a benzoquinoxaline group, a benzoquinazoline group, a phenanthroline group, a phenanthridine group, a 5,6,7,8-tetrahydroisoquinoline group, a 5,6,7,8-tetrahydroquinoline group, an indene group, an indole group, a benzofuran group, a benzothiophene group, a benzosilole group, a fluorene group, a carbazole group, a dibenzofuran group, a dibenzothiophene group, a dibenzosilole group, an azaindene group, an azaindole group, an azabenzofuran group, an azabenzothiophene group, an azabenzosilole group, an azafluorene group, an azacarbazole group, an azadibenzofuran group, an azadibenzothiophene group, or an azadibenzosilole group wherein in Formula 4D, a group represented by

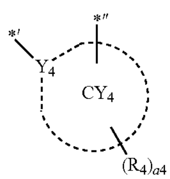

is a group represented by one of Formulae CY4(18) to CY4(96):

CY4(18)

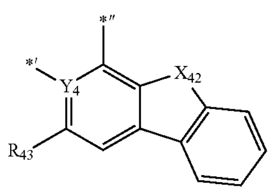

CY4(19)

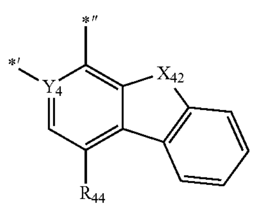

CY4(20)

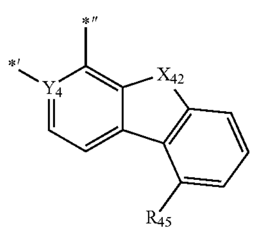

CY4(21)

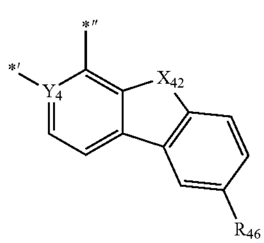

-continued

CY4(22)

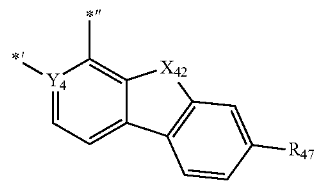

CY4(23)

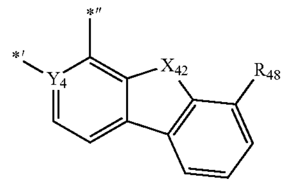

CY4(24)

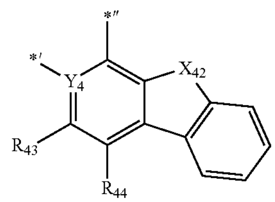

CY4(25)

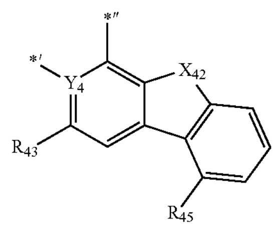

CY4(26)

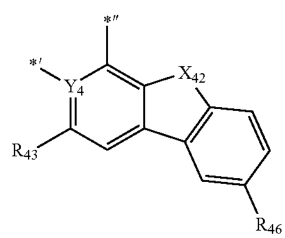

CY4(27)

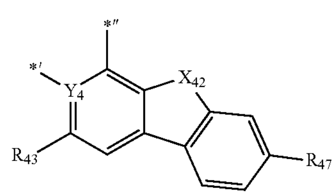

CY4(28)

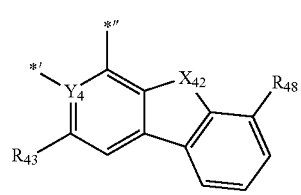

-continued
CY4(29)
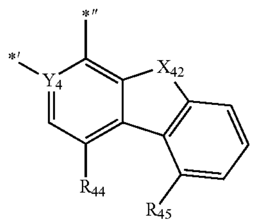
CY4(30)
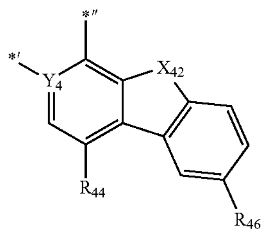
CY4(31)
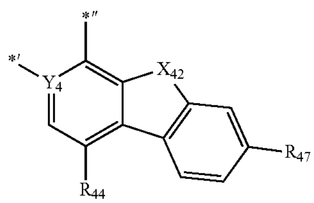
CY4(32)
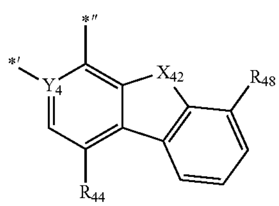
CY4(33)
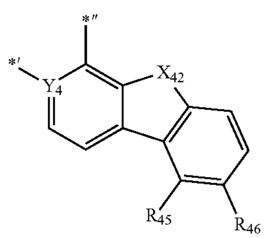
CY4(34)
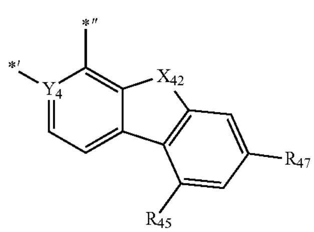
CY4(35)
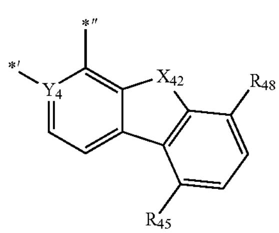
-continued
CY4(36)
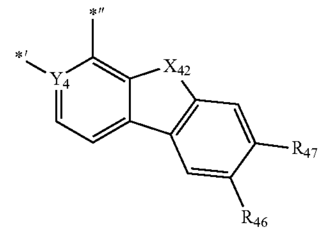
CY4(37)
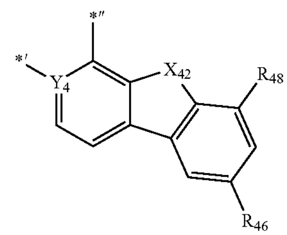
CY4(38)
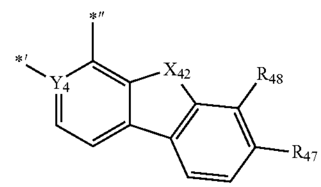
CY4(39)
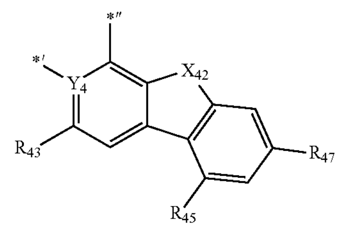
CY4(40)
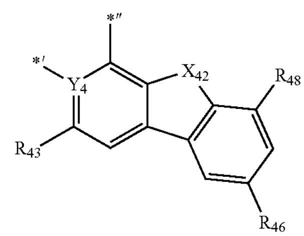
CY4(41)
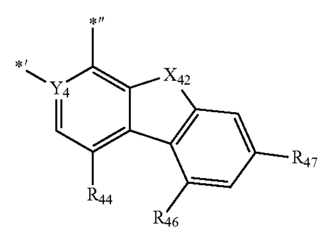
CY4(42)
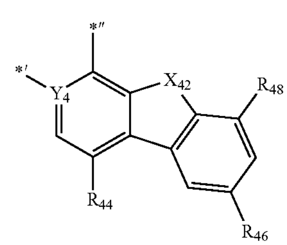

-continued
CY4(43)
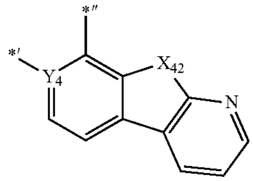
CY4(44)
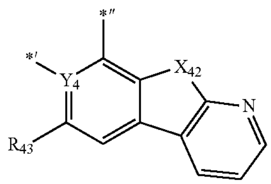
CY4(45)
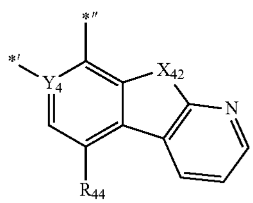
CY4(46)
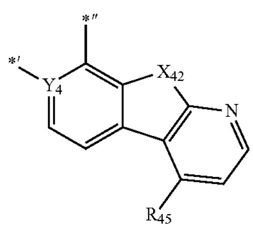
CY4(47)
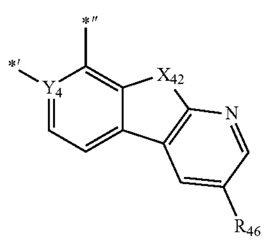
CY4(48)
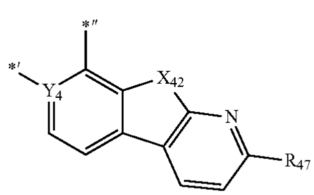
CY4(49)
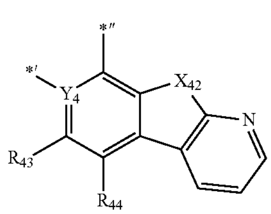
-continued
CY4(50)
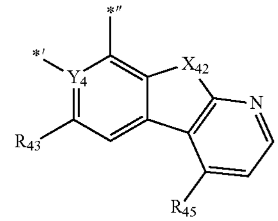
CY4(51)
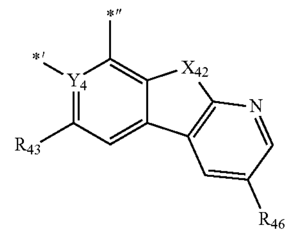
CY4(52)
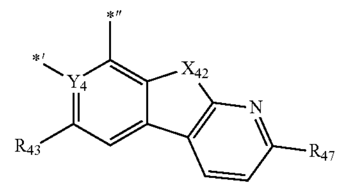
CY4(53)
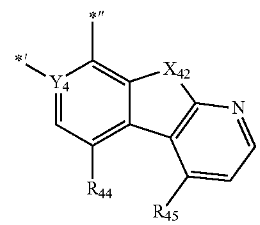
CY4(54)
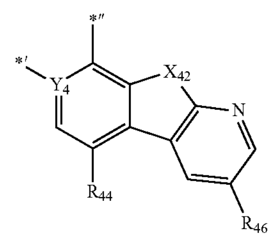
CY4(55)
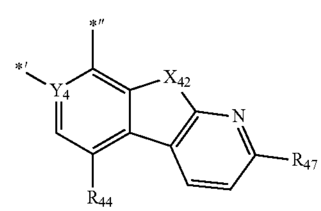
CY4(56)
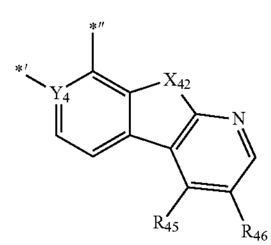

-continued
CY4(57)
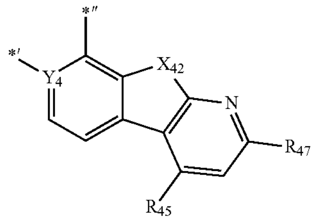
CY4(58)
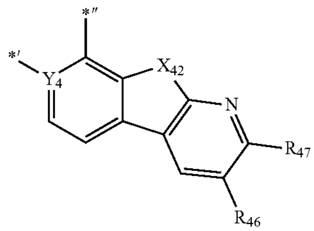
CY4(59)
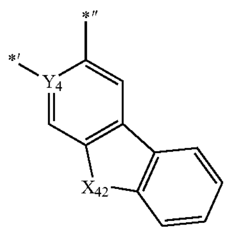
CY(60)
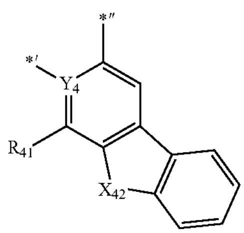
CY4(61)
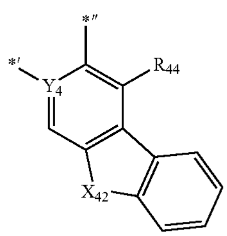
CY4(62)
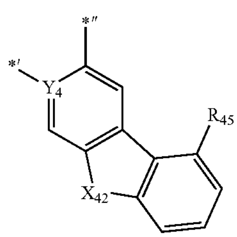
CY4(63)
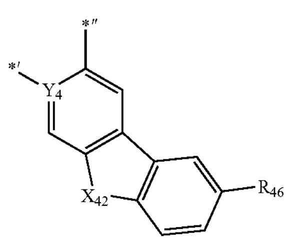
-continued
CY4(64)
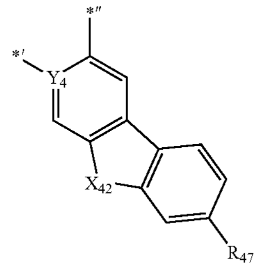
CY4(65)
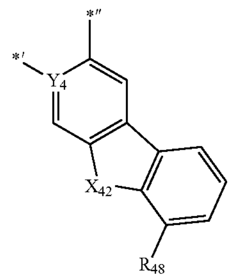
CY4(66)
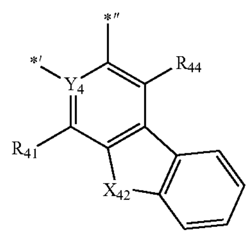
CY4(67)
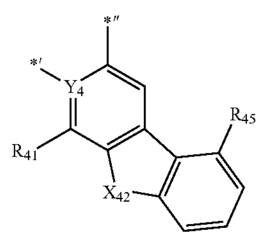
CY4(68)
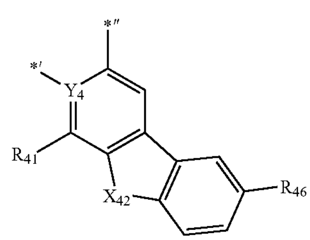
CY4(69)
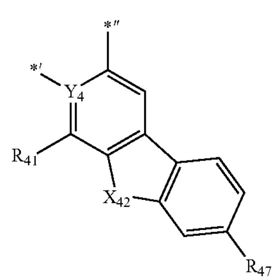

-continued
CY4(70)
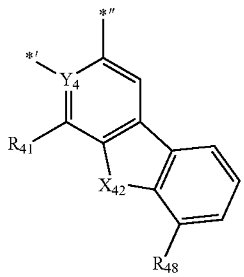
CY4(71)
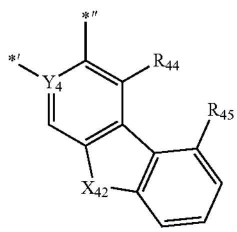
CY4(72)
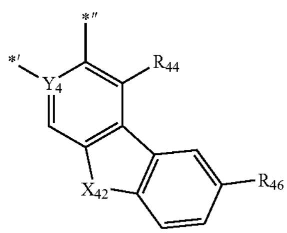
CY4(73)
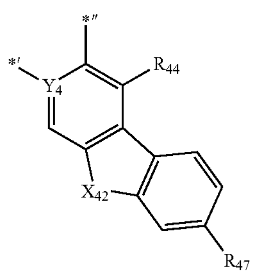
CY4(74)
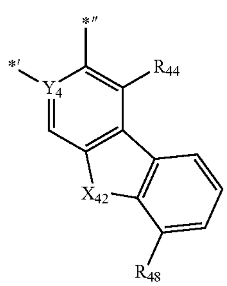
CY4(75)
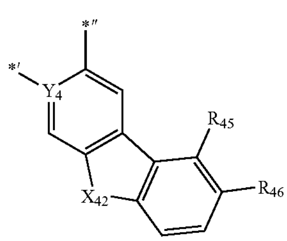
-continued
CY4(76)
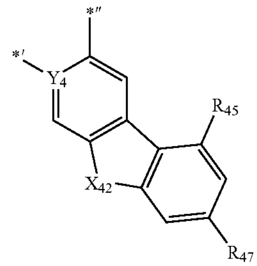
CY4(77)
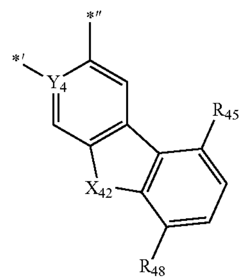
CY4(78)
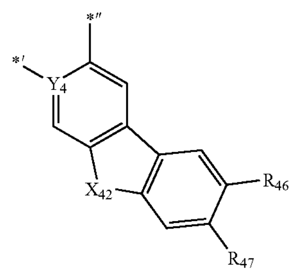
CY4(79)
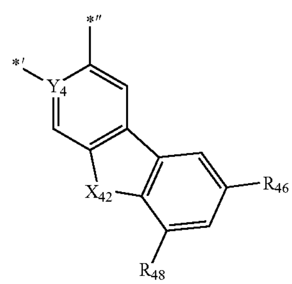
CY4(80)
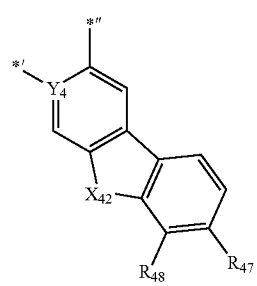
CY4(81)
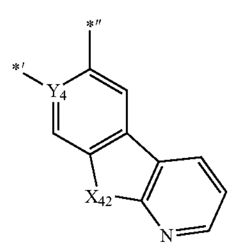

-continued
CY4(82)
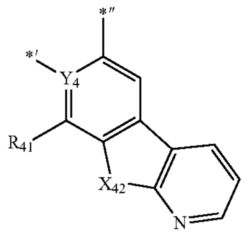
CY4(83)
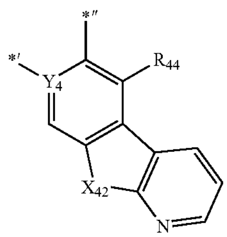
CY4(84)
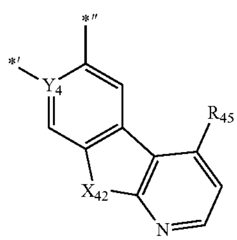
CY4(85)
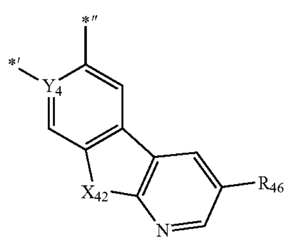
CY4(86)
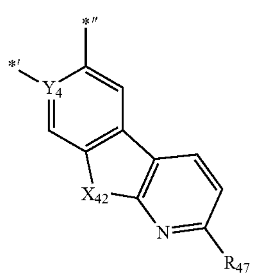
CY4(87)
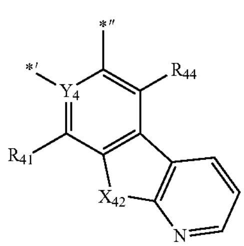
-continued
CY4(88)
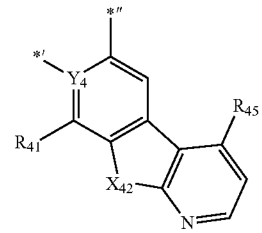
CY4(89)
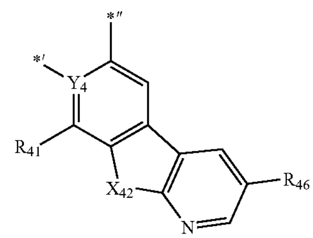
CY4(90)
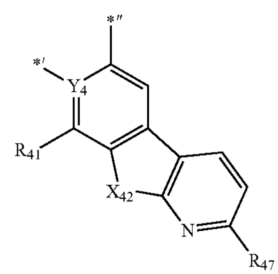
CY4(91)
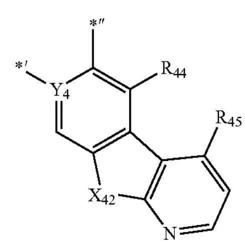
CY4(92)
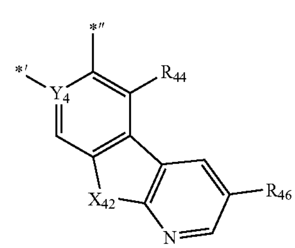

-continued

CY4(93)

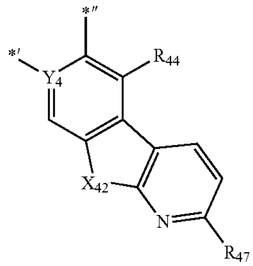

CY4(94)

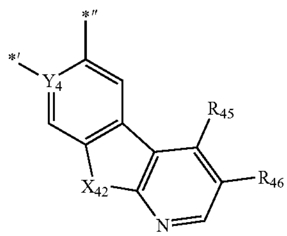

CY4(95)

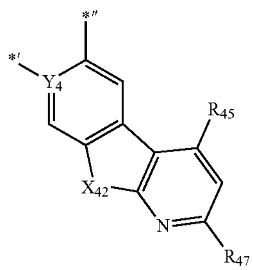

-continued

CY4(96)

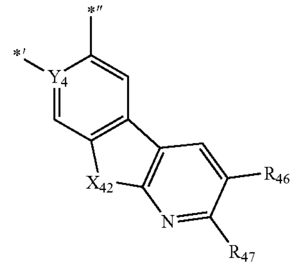

wherein, in Formulae CY4(18) to CY4(96), $X_{42}$ is $C(R_{49a})(R_{49b})$, $N(R_{49a})$, O, S, Se, or $Si(R_{49a})(R_{49b})$, $R_{41}$ to $R_{48}$, $R_{49a}$, and $R_{49b}$ are each the same as described in connection with $R_4$ in claim 1, provided that each of $R_{41}$ to $R_{48}$ is not hydrogen,

*' indicates a binding site to M in Formula 1, and

*" indicates a binding site to a binding site to $T_{21}$ in Formula 4D.

20. The organometallic compound of claim 19, wherein at least one of $Q_{51}$ and $Q_{52}$ in Formula 3 is each independently:

deuterium; or a $C_1$-$C_{20}$ alkyl group unsubstituted or substituted with deuterium, —F, or a combination thereof.

* * * * *